US008162059B2

(12) United States Patent
Nguyen et al.

(10) Patent No.: US 8,162,059 B2
(45) Date of Patent: Apr. 24, 2012

(54) INDUCTION HEATERS USED TO HEAT SUBSURFACE FORMATIONS

(75) Inventors: Scott Vinh Nguyen, Houston, TX (US); Ronald M. Bass, Houston, TX (US)

(73) Assignee: Shell Oil Company, Houston, TX (US)

( * ) Notice: Subject to any disclaimer, the term of this patent is extended or adjusted under 35 U.S.C. 154(b) by 639 days.

(21) Appl. No.: 12/250,357

(22) Filed: Oct. 13, 2008

(65) Prior Publication Data

US 2009/0194287 A1 Aug. 6, 2009

Related U.S. Application Data

(60) Provisional application No. 60/999,839, filed on Oct. 19, 2007, provisional application No. 61/046,329, filed on Apr. 18, 2008.

(51) Int. Cl.
*E21B 43/24* (2006.01)

(52) U.S. Cl. ........................... 166/302; 166/60; 392/301

(58) Field of Classification Search .................. 392/301, 392/304; 166/302, 60
See application file for complete search history.

(56) References Cited

U.S. PATENT DOCUMENTS

| | | | |
|---|---|---|---|
| 48,994 | A | 7/1865 | Parry |
| 94,813 | A | 9/1885 | Dickey |
| 326,439 | A | 9/1885 | McEachen |
| 0,345,586 | A | 7/1886 | Hall |
| 760,304 | A | 5/1904 | Butler |
| 1,269,747 | A | 6/1918 | Rogers |
| 1,342,741 | A | 6/1920 | Day |
| 1,457,479 | A | 6/1923 | Wolcott |
| 1,510,655 | A | 6/1924 | Clark |
| 1,634,236 | A | 6/1927 | Ranney |
| 1,646,599 | A | 10/1927 | Schaefer |
| 1,666,488 | A | 4/1928 | Crawshaw |
| 1,681,523 | A | 8/1928 | Downey et al. |
| 1,913,395 | A | 6/1933 | Karrick |
| 2,011,710 | A | 8/1935 | Davis |
| 2,244,255 | A | 6/1941 | Looman |
| 2,244,256 | A | 6/1941 | Looman |
| 2,319,702 | A | 5/1943 | Moon |
| 2,365,591 | A | 12/1944 | Ranney |
| 2,381,256 | A | 8/1945 | Callaway |
| 2,390,770 | A | 12/1945 | Barton et al. |
| 2,423,674 | A | 7/1947 | Agren |

(Continued)

FOREIGN PATENT DOCUMENTS

CA 899987 5/1972

(Continued)

OTHER PUBLICATIONS

Some Effects of Pressure on Oil-Shale Retorting, Society of Petroleum Engineers Journal, J.H. Bae, Sep. 1969; pp. 287-292.

(Continued)

*Primary Examiner* — John Kreck

(57) ABSTRACT

A heating system for a subsurface formation includes an elongated electrical conductor located in the subsurface formation. The electrical conductor extends between at least a first electrical contact and a second electrical contact. A ferromagnetic conductor at least partially surrounds and at least partially extends lengthwise around the electrical conductor. The electrical conductor, when energized with time-varying electrical current, induces sufficient electrical current flow in the ferromagnetic conductor such that the ferromagnetic conductor resistively heats to a temperature of at least about 300° C.

45 Claims, 205 Drawing Sheets

U.S. PATENT DOCUMENTS 2,444,755 A 7/1948 Steffen
2,466,945 A 4/1949 Greene
2,472,445 A 6/1949 Sprong
2,481,051 A 9/1949 Uren
2,484,063 A 10/1949 Ackley
2,497,868 A 2/1951 Dalin
2,548,360 A 4/1951 Germain
2,593,477 A 4/1952 Newman et al.
2,595,979 A 5/1952 Pevere et al.
2,623,596 A 12/1952 Whorton et al.
2,630,306 A 3/1953 Evans
2,630,307 A 3/1953 Martin
2,634,961 A 4/1953 Ljungstrom
2,642,943 A 6/1953 Smith et al.
2,670,802 A 3/1954 Ackley
2,685,930 A 8/1954 Albaugh
2,695,163 A 11/1954 Pearce et al.
2,703,621 A 3/1955 Ford
2,714,930 A 8/1955 Carpenter
2,732,195 A 1/1956 Ljungstrom
2,734,579 A 2/1956 Elkins
2,743,906 A 5/1956 Coyle
2,757,739 A 8/1956 Douglas et al.
2,771,954 A 11/1956 Jenks et al.
2,777,679 A 1/1957 Ljungstrom
2,780,449 A 2/1957 Fisher et al.
2,780,450 A 2/1957 Ljungstrom
2,786,660 A 3/1957 Alleman
2,789,805 A 4/1957 Ljungstrom
2,793,696 A 5/1957 Morse
2,794,504 A 6/1957 Carpenter
2,799,341 A 7/1957 Maly
2,801,089 A 7/1957 Scott, Jr.
2,803,305 A 8/1957 Behning et al.
2,804,149 A 8/1957 Kile
2,819,761 A 1/1958 Popham et al.
2,825,408 A 3/1958 Watson
2,841,375 A 7/1958 Salomonsson
2,857,002 A 10/1958 Pevere et al.
2,647,306 A 12/1958 Stewart et al.
2,862,558 A 12/1958 Dixon
2,889,882 A 6/1959 Schleicher
2,890,754 A 6/1959 Hoffstrom et al.
2,890,755 A 6/1959 Eurenius et al.
2,902,270 A 9/1959 Salomonsson et al.
2,906,337 A 9/1959 Henning
2,906,340 A 9/1959 Herzog
2,914,309 A 11/1959 Salomonsson
2,923,535 A 2/1960 Ljungstrom
2,932,352 A 4/1960 Stegemeier
2,939,689 A 6/1960 Ljungstrom
2,942,223 A 6/1960 Lennox et al.
2,952,449 A 9/1960 Bays
2,954,826 A 10/1960 Sievers
2,958,519 A 11/1960 Hurley
2,969,226 A 1/1961 Huntington
2,970,826 A 2/1961 Woodruff
2,974,937 A 3/1961 Kiel
2,991,046 A 7/1961 Yahn
2,994,376 A 8/1961 Crawford et al.
2,997,105 A 8/1961 Campion et al.
2,998,457 A 8/1961 Paulsen
3,004,601 A 10/1961 Bodine
3,004,603 A 10/1961 Rogers et al.
3,007,521 A 11/1961 Trantham et al.
3,010,513 A 11/1961 Gerner
3,010,516 A 11/1961 Schleicher
3,016,053 A 1/1962 Medovick
3,017,168 A 1/1962 Carr
3,026,940 A 3/1962 Spitz
3,032,102 A 5/1962 Parker
3,036,632 A 5/1962 Koch et al.
3,044,545 A 7/1962 Tooke
3,048,221 A 8/1962 Tek
3,050,123 A 8/1962 Scott
3,051,235 A 8/1962 Banks
3,057,404 A 10/1962 Berstrom
3,058,730 A 10/1962 Bays
3,061,009 A 10/1962 Shirley
3,062,282 A 11/1962 Schleicher
3,095,031 A 6/1963 Eurenius et al.
3,097,690 A 7/1963 Terwilliger et al.
3,105,545 A 10/1963 Prats et al.
3,106,244 A 10/1963 Parker
3,110,345 A 11/1963 Reed et al.
3,113,619 A 12/1963 Reichle
3,113,620 A 12/1963 Hemminger
3,113,623 A 12/1963 Krueger
3,114,417 A 12/1963 McCarthy
3,116,792 A 1/1964 Purre
3,120,264 A 2/1964 Barron
3,127,935 A 4/1964 Poettmann et al.
3,127,936 A 4/1964 Eurenius
3,131,763 A 5/1964 Kunetka et al.
3,132,692 A 5/1964 Marx et al.
3,137,347 A 6/1964 Parker
3,138,203 A 6/1964 Weiss et al.
3,139,928 A 7/1964 Broussard
3,142,336 A 7/1964 Doscher
3,149,670 A 9/1964 Grant
3,149,672 A 9/1964 Orkiszewski et al.
3,150,715 A 9/1964 Dietz
3,163,745 A 12/1964 Boston
3,164,207 A 1/1965 Thessen et al.
3,165,154 A 1/1965 Santourian
3,170,842 A 2/1965 Kehler
3,181,613 A 5/1965 Krueger
3,182,721 A 5/1965 Hardy
3,183,675 A 5/1965 Schroeder
3,191,679 A 6/1965 Miller
3,205,942 A 9/1965 Sandberg
3,205,944 A 9/1965 Walton
3,205,946 A 9/1965 Prats et al.
3,207,220 A 9/1965 Williams
3,208,531 A 9/1965 Tamplen
3,209,825 A 10/1965 Alexander et al.
3,221,505 A 12/1965 Goodwin et al.
3,221,811 A 12/1965 Prats
3,233,668 A 2/1966 Hamilton et al.
3,237,689 A 3/1966 Justheim
3,241,611 A 3/1966 Dougan
3,246,695 A 4/1966 Robinson
3,250,327 A 5/1966 Crider
3,262,741 A 7/1966 Edmonds et al.
3,267,680 A 8/1966 Schlumberger
3,272,261 A 9/1966 Morse
3,273,640 A 9/1966 Huntington
3,275,076 A 9/1966 Sharp
3,278,234 A 10/1966 Helvenston et al.
3,284,281 A 11/1966 Thomas
3,285,335 A 11/1966 Reistle, Jr.
3,288,648 A 11/1966 Jones
3,294,167 A 12/1966 Vogel
3,302,707 A 2/1967 Slusser
3,310,109 A 3/1967 Marx et al.
3,316,344 A 4/1967 Kidd et al.
3,316,962 A 5/1967 Lange
3,332,480 A 7/1967 Parrish
3,338,306 A 8/1967 Cook
3,342,258 A 9/1967 Prats
3,342,267 A 9/1967 Cotter et al.
3,349,845 A 10/1967 Holbert et al.
3,352,355 A 11/1967 Putman
3,358,756 A 12/1967 Vogel
3,362,751 A 1/1968 Tinlin
3,372,754 A 3/1968 McDonald
3,379,248 A 4/1968 Strange
3,380,913 A 4/1968 Henderson
3,386,508 A 6/1968 Bielstein et al.
3,389,975 A 6/1968 Van Nostrand
3,399,623 A 9/1968 Creed
3,410,977 A 11/1968 Ando
3,412,011 A 11/1968 Lindsay
3,434,541 A 3/1969 Cook et al.
3,438,439 A 4/1969 Froning
3,455,383 A 7/1969 Prats et al.
3,465,819 A 9/1969 Dixon

| | | | |
|---|---|---|---|
| 3,477,058 | A | 11/1969 | Vedder et al. |
| 3,485,300 | A | 12/1969 | Engle |
| 3,492,463 | A | 1/1970 | Wringer et al. |
| 3,501,201 | A | 3/1970 | Closmann et al. |
| 3,502,372 | A | 3/1970 | Prats |
| 3,513,913 | A | 5/1970 | Bruist |
| 3,515,837 | A | 6/1970 | Ando |
| 3,526,095 | A | 9/1970 | Peck |
| 3,528,501 | A | 9/1970 | Parker |
| 3,529,682 | A | 9/1970 | Coyne et al. |
| 3,537,528 | A | 11/1970 | Herce et al. |
| 3,542,131 | A | 11/1970 | Walton et al. |
| 3,547,192 | A | 12/1970 | Claridge et al. |
| 3,547,193 | A | 12/1970 | Gill |
| 3,554,285 | A | 1/1971 | Meldau |
| 3,562,401 | A | 2/1971 | Long |
| 3,565,171 | A | 2/1971 | Closmann |
| 3,578,080 | A | 5/1971 | Closmann |
| 3,580,987 | A | 5/1971 | Priaroggia |
| 3,593,789 | A | 7/1971 | Prats |
| 3,595,082 | A | 7/1971 | Miller et al. |
| 3,599,714 | A | 8/1971 | Messman et al. |
| 3,605,890 | A | 9/1971 | Holm |
| 3,614,387 | A | 10/1971 | Wrob et al. |
| 3,614,986 | A | 10/1971 | Gill |
| 3,617,471 | A | 11/1971 | Schlinger et al. |
| 3,618,663 | A | 11/1971 | Needham |
| 3,629,551 | A | 12/1971 | Ando |
| 3,661,423 | A | 5/1972 | Garret |
| 3,672,196 | A | 6/1972 | Levacher et al. |
| 3,675,715 | A | 7/1972 | Speller, Jr. |
| 3,679,812 | A | 7/1972 | Owens |
| 3,680,633 | A | 8/1972 | Bennett |
| 3,700,280 | A | 10/1972 | Papadopoulos et al. |
| 3,702,886 | A | 11/1972 | Argauer et al. |
| 3,709,979 | A | 1/1973 | Chu |
| 3,757,860 | A | 9/1973 | Pritchett |
| 3,759,328 | A | 9/1973 | Ueber et al. |
| 3,759,574 | A | 9/1973 | Beard |
| 3,761,599 | A | 9/1973 | Beatty |
| 3,766,982 | A | 10/1973 | Justheim |
| 3,770,398 | A | 11/1973 | Abraham et al. |
| 3,770,614 | A | 11/1973 | Graven |
| 3,779,602 | A | 12/1973 | Beard et al. |
| 3,794,113 | A | 2/1974 | Strange et al. |
| 3,794,116 | A | 2/1974 | Higgins |
| 3,804,169 | A | 4/1974 | Closmann |
| 3,804,172 | A | 4/1974 | Closmann et al. |
| 3,809,159 | A | 5/1974 | Young et al. |
| 3,812,913 | A | 5/1974 | Hardy et al. |
| 3,832,449 | A | 8/1974 | Rosinski et al. |
| 3,853,185 | A | 12/1974 | Dahl et al. |
| 3,881,551 | A | 5/1975 | Terry et al. |
| 3,882,941 | A | 5/1975 | Pelofsky |
| 3,892,270 | A | 7/1975 | Lindquist |
| 3,893,918 | A | 7/1975 | Favret, Jr. |
| 3,894,769 | A | 7/1975 | Tham et al. |
| 3,896,260 | A | 7/1975 | Plummer |
| 3,907,045 | A | 9/1975 | Dahl et al. |
| 3,922,148 | A | 11/1975 | Child |
| 3,924,680 | A | 12/1975 | Terry |
| 3,933,447 | A | 1/1976 | Pasini, III et al. |
| 3,941,421 | A | 3/1976 | Burton, III et al. |
| 3,943,160 | A | 3/1976 | Farmer, III et al. |
| 3,946,812 | A | 3/1976 | Gale et al. |
| 3,947,683 | A | 3/1976 | Schultz et al. |
| 3,948,319 | A | 4/1976 | Pritchett |
| 3,948,755 | A | 4/1976 | McCollum et al. |
| 3,948,758 | A | 4/1976 | Bonacci et al. |
| 3,950,029 | A | 4/1976 | Timmins |
| 3,952,802 | A | 4/1976 | Terry |
| 3,954,140 | A | 5/1976 | Hendrick |
| 3,973,628 | A | 8/1976 | Colgate |
| 3,986,349 | A | 10/1976 | Egan |
| 3,986,556 | A | 10/1976 | Haynes |
| 3,986,557 | A | 10/1976 | Striegler et al. |
| 3,987,851 | A | 10/1976 | Tham |
| 3,992,474 | A | 11/1976 | Sobel |
| 3,993,132 | A | 11/1976 | Cram et al. |
| 3,994,340 | A | 11/1976 | Anderson et al. |
| 3,994,341 | A | 11/1976 | Anderson et al. |
| 3,999,607 | A | 12/1976 | Pennington et al. |
| 4,005,752 | A | 2/1977 | Cha |
| 4,006,778 | A | 2/1977 | Redford et al. |
| 4,008,762 | A | 2/1977 | Fisher et al. |
| 4,010,800 | A | 3/1977 | Terry |
| 4,014,575 | A | 3/1977 | French et al. |
| 4,016,239 | A | 4/1977 | Fenton |
| 4,016,245 | A | 4/1977 | Plank et al. |
| 4,018,280 | A | 4/1977 | Daviduk et al. |
| 4,019,575 | A | 4/1977 | Pisio et al. |
| 4,026,357 | A | 5/1977 | Redford |
| 4,029,360 | A | 6/1977 | French |
| 4,031,956 | A | 6/1977 | Terry |
| 4,037,655 | A | 7/1977 | Carpenter |
| 4,037,658 | A | 7/1977 | Anderson |
| 4,042,026 | A | 8/1977 | Pusch et al. |
| 4,043,393 | A | 8/1977 | Fisher et al. |
| 4,048,637 | A | 9/1977 | Jacomini |
| 4,049,053 | A | 9/1977 | Fisher et al. |
| 4,057,293 | A | 11/1977 | Garrett |
| 4,059,308 | A | 11/1977 | Pearson et al. |
| 4,064,943 | A | 12/1977 | Cavin |
| 4,065,183 | A | 12/1977 | Hill et al. |
| 4,067,390 | A | 1/1978 | Camacho et al. |
| 4,069,868 | A | 1/1978 | Terry |
| 4,076,761 | A | 2/1978 | Chang et al. |
| 4,076,842 | A | 2/1978 | Plank et al. |
| 4,077,471 | A | 3/1978 | Shupe et al. |
| 4,083,604 | A | 4/1978 | Bohn et al. |
| 4,084,637 | A | 4/1978 | Todd |
| 4,085,803 | A | 4/1978 | Butler |
| 4,087,130 | A | 5/1978 | Garrett |
| 4,089,372 | A | 5/1978 | Terry |
| 4,089,373 | A | 5/1978 | Reynolds et al. |
| 4,089,374 | A | 5/1978 | Terry |
| 4,091,869 | A | 5/1978 | Hoyer |
| 4,093,025 | A | 6/1978 | Terry |
| 4,093,026 | A | 6/1978 | Ridley |
| 4,096,163 | A | 6/1978 | Chang et al. |
| 4,099,567 | A | 7/1978 | Terry |
| 4,114,688 | A | 9/1978 | Terry |
| 4,119,349 | A | 10/1978 | Albulescu et al. |
| 4,125,159 | A | 11/1978 | Vann |
| 4,130,575 | A | 12/1978 | Jorn et al. |
| 4,133,825 | A | 1/1979 | Stroud et al. |
| 4,138,442 | A | 2/1979 | Chang et al. |
| 4,140,180 | A | 2/1979 | Bridges et al. |
| 4,140,181 | A | 2/1979 | Ridley et al. |
| 4,144,935 | A | 3/1979 | Bridges et al. |
| 4,148,359 | A | 4/1979 | Laumbach et al. |
| 4,151,877 | A | 5/1979 | French |
| RE30,019 | E | 6/1979 | Lindquist |
| 4,158,467 | A | 6/1979 | Larson et al. |
| 4,162,707 | A | 7/1979 | Yan |
| 4,169,506 | A | 10/1979 | Berry |
| 4,183,405 | A | 1/1980 | Magnie |
| 4,184,548 | A | 1/1980 | Ginsburgh et al. |
| 4,185,692 | A | 1/1980 | Terry |
| 4,186,801 | A | 2/1980 | Madgavkar et al. |
| 4,193,451 | A | 3/1980 | Dauphine |
| 4,197,911 | A | 4/1980 | Anada |
| 4,199,024 | A | 4/1980 | Rose et al. |
| 4,199,025 | A | 4/1980 | Carpenter |
| 4,216,079 | A | 8/1980 | Newcombe |
| 4,228,853 | A | 10/1980 | Harvey et al. |
| 4,228,854 | A | 10/1980 | Sacuta |
| 4,232,902 | A | 11/1980 | Cuevas |
| 4,234,230 | A | 11/1980 | Weichman |
| 4,243,101 | A | 1/1981 | Grupping |
| 4,243,511 | A | 1/1981 | Allred |
| 4,248,306 | A | 2/1981 | Van Huisen et al. |
| 4,250,230 | A | 2/1981 | Terry |
| 4,250,962 | A | 2/1981 | Madgavkar et al. |
| 4,252,191 | A | 2/1981 | Pusch et al. |
| 4,254,297 | A | 3/1981 | Frenken et al. |
| 4,256,945 | A | 3/1981 | Carter et al. |
| 4,258,955 | A | 3/1981 | Habib, Jr. |

4,260,192 A 4/1981 Shafer
4,265,307 A 5/1981 Elkins
4,273,188 A 6/1981 Vogel et al.
4,274,487 A 6/1981 Hollingsworth et al.
4,277,416 A 7/1981 Grant
4,280,046 A 7/1981 Shimotori et al.
4,282,587 A 8/1981 Silverman
4,285,547 A 8/1981 Weichman
RE30,738 E 9/1981 Bridges et al.
4,289,354 A 9/1981 Zakiewicz
4,290,650 A 9/1981 Thompson
4,299,086 A 11/1981 Madgavkar et al.
4,299,285 A 11/1981 Tsai et al.
4,303,126 A 12/1981 Blevins
4,305,463 A 12/1981 Zakiewicz
4,306,621 A 12/1981 Boyd et al.
4,310,440 A 1/1982 Wilson et al.
4,311,340 A 1/1982 Lyons et al.
4,324,292 A 4/1982 Jacobs et al.
4,344,483 A 8/1982 Fisher et al.
4,353,418 A 10/1982 Hoekstra et al.
4,359,687 A 11/1982 Vinegar et al.
4,363,361 A 12/1982 Madgavkar et al.
4,366,668 A 1/1983 Madgavkar et al.
4,368,114 A 1/1983 Chester et al.
4,368,452 A 1/1983 Kerr, Jr.
4,370,518 A 1/1983 Guzy
4,378,048 A 3/1983 Madgavkar et al.
4,380,930 A 4/1983 Podhrasky et al.
4,381,641 A 5/1983 Madgavkar et al.
4,382,469 A 5/1983 Bell et al.
4,384,613 A 5/1983 Owen et al.
4,384,614 A 5/1983 Justheim
4,385,661 A 5/1983 Fox
4,390,067 A 6/1983 Wilman
4,390,973 A 6/1983 Rietsch
4,396,062 A 8/1983 Iskander
4,397,732 A 8/1983 Hoover et al.
4,398,151 A 8/1983 Vinegar et al.
4,399,866 A 8/1983 Dearth
4,401,099 A 8/1983 Collier
4,401,162 A 8/1983 Osborne
4,401,163 A 8/1983 Elkins
4,407,973 A 10/1983 van Dijk et al.
4,409,090 A 10/1983 Hanson et al.
4,410,042 A 10/1983 Shu
4,412,124 A 10/1983 Kobayashi
4,412,585 A 11/1983 Bouck
4,415,034 A 11/1983 Bouck
4,417,782 A 11/1983 Clarke et al.
4,418,752 A 12/1983 Boyer et al.
4,423,311 A 12/1983 Varney, Sr.
4,425,967 A 1/1984 Hoekstra, deceased
4,428,700 A 1/1984 Lennemann
4,429,745 A 2/1984 Cook
4,437,519 A 3/1984 Cha et al.
4,439,307 A 3/1984 Jaquay et al.
4,440,224 A 4/1984 Kreinin et al.
4,440,871 A 4/1984 Lok et al.
4,442,896 A 4/1984 Reale et al.
4,444,255 A 4/1984 Geoffrey et al.
4,444,258 A 4/1984 Kalmar
4,445,574 A 5/1984 Vann
4,446,917 A 5/1984 Todd
4,448,251 A 5/1984 Stine
4,452,491 A 6/1984 Seglin et al.
4,455,215 A 6/1984 Jarrott et al.
4,456,065 A 6/1984 Heim et al.
4,457,365 A 7/1984 Kasevich et al.
4,457,374 A 7/1984 Hoekstra et al.
4,458,757 A 7/1984 Bock et al.
4,458,767 A 7/1984 Hoehn, Jr.
4,470,459 A 9/1984 Copeland et al.
4,474,236 A 10/1984 Kellett
4,474,238 A 10/1984 Gentry et al.
4,479,541 A 10/1984 Wang
4,485,868 A 12/1984 Sresty et al.
4,485,869 A 12/1984 Sresty et al.
4,487,257 A 12/1984 Dauphine
4,489,782 A 12/1984 Perkins
4,491,179 A 1/1985 Pirson et al.
4,498,531 A 2/1985 Vrolyk
4,498,535 A 2/1985 Bridges
4,499,209 A 2/1985 Hoek et al.
4,500,651 A 2/1985 Lok et al.
4,501,326 A 2/1985 Edmunds
4,501,445 A 2/1985 Gregoli
4,508,170 A 4/1985 Littmann
4,513,816 A 4/1985 Hubert
4,518,548 A 5/1985 Yarbrough
4,520,229 A 5/1985 Luzzi et al.
4,524,826 A 6/1985 Savage
4,524,827 A 6/1985 Bridges et al.
4,530,401 A 7/1985 Hartman et al.
4,537,252 A 8/1985 Puri
4,538,682 A 9/1985 McManus et al.
4,540,882 A 9/1985 Vinegar et al.
4,542,648 A 9/1985 Vinegar et al.
4,544,478 A 10/1985 Kelley
4,545,435 A 10/1985 Bridges et al.
4,549,073 A 10/1985 Tamura et al.
4,549,396 A 10/1985 Garwood et al.
4,551,226 A 11/1985 Ferm
4,552,214 A 11/1985 Forgac et al.
4,570,715 A 2/1986 Van Meurs et al.
4,571,491 A 2/1986 Vinegar et al.
4,572,299 A 2/1986 Van Egmond et al.
4,573,530 A 3/1986 Audeh et al.
4,576,231 A 3/1986 Dowling et al.
4,577,503 A 3/1986 Imaino et al.
4,577,690 A 3/1986 Medlin
4,577,691 A 3/1986 Huang et al.
4,583,046 A 4/1986 Vinegar et al.
4,583,242 A 4/1986 Vinegar et al.
4,585,066 A 4/1986 Moore et al.
4,592,423 A 6/1986 Savage et al.
4,597,441 A 7/1986 Ware et al.
4,597,444 A 7/1986 Hutchinson
4,598,392 A 7/1986 Pann
4,598,770 A 7/1986 Shu et al.
4,598,772 A 7/1986 Holmes
4,605,489 A 8/1986 Madgavkar
4,605,680 A 8/1986 Beuther et al.
4,608,818 A 9/1986 Goebel et al.
4,609,041 A 9/1986 Magda
4,613,754 A 9/1986 Vinegar et al.
4,616,705 A 10/1986 Stegemeier et al.
4,623,401 A 11/1986 Derbyshire et al.
4,623,444 A 11/1986 Che et al.
4,626,665 A 12/1986 Fort, III
4,634,187 A 1/1987 Huff et al.
4,635,197 A 1/1987 Vinegar et al.
4,637,464 A 1/1987 Forgac et al.
4,639,712 A 1/1987 Kobayashi et al.
4,640,352 A 2/1987 Van Meurs et al.
4,640,353 A 2/1987 Schuh
4,644,283 A 2/1987 Vinegar et al.
4,645,906 A 2/1987 Yagnik et al.
4,651,825 A 3/1987 Wilson
4,658,215 A 4/1987 Vinegar et al.
4,662,437 A 5/1987 Renfro et al.
4,662,438 A 5/1987 Taflove et al.
4,662,439 A 5/1987 Puri
4,662,443 A 5/1987 Puri et al.
4,663,711 A 5/1987 Vinegar et al.
4,669,542 A 6/1987 Venkatesan
4,671,102 A 6/1987 Vinegar et al.
4,682,652 A 7/1987 Huang et al.
4,686,029 A 8/1987 Pellet et al.
4,691,771 A 9/1987 Ware et al.
4,694,907 A 9/1987 Stahl et al.
4,695,713 A 9/1987 Krumme
4,698,149 A 10/1987 Mitchell
4,698,583 A 10/1987 Sandberg
4,701,587 A 10/1987 Carter et al.
4,704,514 A 11/1987 Van Edmond et al.
4,706,751 A 11/1987 Gondouin
4,716,960 A 1/1988 Eastlund et al.

4,717,814 A 1/1988 Krumme
4,719,423 A 1/1988 Vinegar et al.
4,728,892 A 3/1988 Vinegar et al.
4,730,162 A 3/1988 Vinegar et al.
4,733,057 A 3/1988 Stanzel et al.
4,734,115 A 3/1988 Howard et al.
4,743,854 A 5/1988 Vinegar et al.
4,744,245 A 5/1988 White
4,752,673 A 6/1988 Krumme
4,756,367 A 7/1988 Puri et al.
4,762,425 A 8/1988 Shakkottai et al.
4,766,958 A 8/1988 Faecke
4,769,602 A 9/1988 Vinegar et al.
4,769,606 A 9/1988 Vinegar et al.
4,772,634 A 9/1988 Farooque
4,776,638 A 10/1988 Hahn
4,785,163 A 11/1988 Sandberg
4,787,452 A 11/1988 Jennings, Jr.
4,793,409 A 12/1988 Bridges et al.
4,794,226 A 12/1988 Derbyshire
4,808,925 A 2/1989 Baird
4,814,587 A 3/1989 Carter
4,815,791 A 3/1989 Schmidt et al.
4,817,711 A 4/1989 Jeambey
4,818,370 A 4/1989 Gregoli et al.
4,821,798 A 4/1989 Bridges et al.
4,823,890 A 4/1989 Lang
4,827,761 A 5/1989 Vinegar et al.
4,828,031 A 5/1989 Davis
4,840,720 A 6/1989 Reid
4,848,460 A 7/1989 Johnson, Jr. et al.
4,848,924 A 7/1989 Nuspl et al.
4,849,611 A 7/1989 Whitney et al.
4,852,648 A 8/1989 Akkerman et al.
4,856,341 A 8/1989 Vinegar et al.
4,856,587 A 8/1989 Nielson
4,860,544 A 8/1989 Krieg et al.
4,866,983 A 9/1989 Vinegar et al.
4,883,582 A 11/1989 McCants
4,884,455 A 12/1989 Vinegar et al.
4,885,080 A 12/1989 Brown et al.
4,886,118 A 12/1989 Van Meurs et al.
4,893,504 A 1/1990 OMeara, Jr. et al.
4,895,206 A 1/1990 Price
4,912,971 A 4/1990 Jeambey
4,913,065 A 4/1990 Hemsath
4,926,941 A 5/1990 Glandt et al.
4,927,857 A 5/1990 McShea, III et al.
4,928,765 A 5/1990 Nielson
4,940,095 A 7/1990 Newman
4,974,425 A 12/1990 Krieg et al.
4,982,786 A 1/1991 Jennings, Jr.
4,983,319 A 1/1991 Gregoli et al.
4,984,594 A 1/1991 Vinegar et al.
4,985,313 A 1/1991 Penneck et al.
4,987,368 A 1/1991 Vinegar
4,994,093 A 2/1991 Wetzel et al.
5,008,085 A 4/1991 Bain et al.
5,011,329 A 4/1991 Nelson et al.
5,020,596 A 6/1991 Hemsath
5,027,896 A 7/1991 Anderson
5,040,601 A 8/1991 Karlsson et al.
5,041,210 A 8/1991 Merrill, Jr. et al.
5,042,579 A 8/1991 Glandt et al.
5,046,559 A 9/1991 Glandt
5,050,386 A 9/1991 Krieg et al.
5,054,551 A 10/1991 Duerksen
5,059,303 A 10/1991 Taylor et al.
5,060,287 A 10/1991 Van Egmond
5,060,726 A 10/1991 Glandt et al.
5,064,006 A 11/1991 Waters et al.
5,065,501 A 11/1991 Henschen et al.
5,065,818 A 11/1991 Van Egmond
5,066,852 A 11/1991 Willbanks
5,070,533 A 12/1991 Bridges et al.
5,073,625 A 12/1991 Derbyshire
5,082,054 A 1/1992 Kiamanesh
5,082,055 A 1/1992 Hemsath
5,085,276 A 2/1992 Rivas et al.
5,093,002 A 3/1992 Pasternak
5,097,903 A 3/1992 Wilensky
5,099,918 A 3/1992 Bridges et al.
5,102,551 A 4/1992 Pasternak
5,103,909 A 4/1992 Morgenthaler et al.
5,103,920 A 4/1992 Patton
5,126,037 A 6/1992 Showalter
5,133,406 A 7/1992 Puri
5,145,003 A 9/1992 Duerksen
5,150,118 A 9/1992 Finkle et al.
5,152,341 A 10/1992 Kaservich
5,168,927 A 12/1992 Stegemeier et al.
5,173,213 A 12/1992 Miller et al.
5,182,427 A 1/1993 McGaffigan
5,182,792 A * 1/1993 Goncalves ..................... 166/60
5,189,283 A 2/1993 Carl, Jr. et al.
5,190,405 A 3/1993 Vinegar et al.
5,199,490 A 4/1993 Surles et al.
5,201,219 A 4/1993 Bandurski et al.
5,207,273 A 5/1993 Cates et al.
5,209,987 A 5/1993 Penneck et al.
5,211,230 A 5/1993 Ostapovich et al.
5,217,075 A 6/1993 Wittrisch
5,217,076 A 6/1993 Masek
5,226,961 A 7/1993 Nahm et al.
5,229,583 A 7/1993 van Egmond et al.
5,236,039 A 8/1993 Edelstein et al.
5,245,161 A 9/1993 Okamoto
5,255,742 A 10/1993 Mikus
5,261,490 A 11/1993 Ebinuma
5,275,726 A 1/1994 Feimer et al.
5,282,957 A 2/1994 Wright et al.
5,284,206 A 2/1994 Surles et al.
5,285,071 A 2/1994 LaCount
5,285,846 A 2/1994 Mohn
5,289,882 A 3/1994 Moore
5,295,763 A 3/1994 Stenborg et al.
5,297,626 A 3/1994 Vinegar et al.
5,305,239 A 4/1994 Kinra
5,305,829 A 4/1994 Kumar
5,306,640 A 4/1994 Vinegar et al.
5,316,492 A 5/1994 Schaareman
5,316,664 A 5/1994 Gregoli et al.
5,318,116 A 6/1994 Vinegar et al.
5,318,709 A 6/1994 Wuest et al.
5,325,918 A 7/1994 Berryman et al.
5,332,036 A 7/1994 Shirley et al.
5,339,897 A 8/1994 Leaute
5,339,904 A 8/1994 Jennings, Jr.
5,340,467 A 8/1994 Gregoli et al.
5,349,859 A 9/1994 Kleppe
5,360,067 A 11/1994 Meo, III
5,363,094 A 11/1994 Staron et al.
5,366,012 A 11/1994 Lohbeck
5,377,756 A 1/1995 Northrop et al.
5,388,640 A 2/1995 Puri et al.
5,388,641 A 2/1995 Yee et al.
5,388,642 A 2/1995 Puri et al.
5,388,643 A 2/1995 Yee et al.
5,388,645 A 2/1995 Puri et al.
5,391,291 A 2/1995 Winquist et al.
5,392,854 A 2/1995 Vinegar et al.
5,400,430 A 3/1995 Nenniger
5,404,952 A 4/1995 Vinegar et al.
5,409,071 A 4/1995 Wellington et al.
5,411,086 A 5/1995 Burcham et al.
5,411,089 A 5/1995 Vinegar et al.
5,411,104 A 5/1995 Stanley
5,415,231 A 5/1995 Northrop et al.
5,431,224 A 7/1995 Laali
5,433,271 A 7/1995 Vinegar et al.
5,435,666 A 7/1995 Hassett et al.
5,437,506 A 8/1995 Gray
5,439,054 A 8/1995 Chaback et al.
5,454,666 A 10/1995 Chaback et al.
5,456,315 A 10/1995 Kisman et al.
5,458,774 A 10/1995 Mannapperuma
5,468,372 A 11/1995 Seamans et al.
5,483,414 A 1/1996 Turtiainen

| | | | |
|---|---|---|---|
| 5,491,969 | A | 2/1996 | Cohn et al. |
| 5,497,087 | A | 3/1996 | Vinegar et al. |
| 5,498,960 | A | 3/1996 | Vinegar et al. |
| 5,512,732 | A | 4/1996 | Yagnik et al. |
| 5,517,593 | A | 5/1996 | Nenniger et al. |
| 5,525,322 | A | 6/1996 | Willms |
| 5,541,517 | A | 7/1996 | Hartmann et al. |
| 5,545,803 | A | 8/1996 | Heath et al. |
| 5,553,189 | A | 9/1996 | Stegemeier et al. |
| 5,553,478 | A | 9/1996 | Di Troia |
| 5,554,453 | A | 9/1996 | Steinfeld et al. |
| 5,566,755 | A | 10/1996 | Seidle et al. |
| 5,566,756 | A | 10/1996 | Chaback et al. |
| 5,571,403 | A | 11/1996 | Scott et al. |
| 5,579,575 | A | 12/1996 | Lamome et al. |
| 5,589,775 | A | 12/1996 | Kuckes |
| 5,619,611 | A | 4/1997 | Loschen et al. |
| 5,621,844 | A | 4/1997 | Bridges |
| 5,621,845 | A | 4/1997 | Bridges et al. |
| 5,624,188 | A | 4/1997 | West |
| 5,632,336 | A | 5/1997 | Notz et al. |
| 5,648,305 | A | 7/1997 | Mansfield et al. |
| 5,652,389 | A | 7/1997 | Schaps et al. |
| 5,654,261 | A | 8/1997 | Smith |
| 5,656,239 | A | 8/1997 | Stegemeier et al. |
| 5,667,009 | A | 9/1997 | Moore |
| 5,688,736 | A | 11/1997 | Seamans et al. |
| RE35,696 | E | 12/1997 | Mikus |
| 5,713,415 | A | 2/1998 | Bridges |
| 5,723,423 | A | 3/1998 | Van Slyke |
| 5,744,025 | A | 4/1998 | Boon et al. |
| 5,751,895 | A | 5/1998 | Bridges |
| 5,759,022 | A | 6/1998 | Koppang et al. |
| 5,760,307 | A | 6/1998 | Latimer et al. |
| 5,769,569 | A | 6/1998 | Hosseini |
| 5,777,229 | A | 7/1998 | Geier et al. |
| 5,782,301 | A | 7/1998 | Neuroth et al. |
| 5,788,376 | A | 8/1998 | Sultan et al. |
| 5,801,332 | A | 9/1998 | Berger et al. |
| 5,802,870 | A | 9/1998 | Arnold et al. |
| 5,823,256 | A | 10/1998 | Moore |
| 5,826,655 | A | 10/1998 | Snow et al. |
| 5,828,797 | A | 10/1998 | Minott et al. |
| 5,854,472 | A | 12/1998 | Wildi |
| 5,861,137 | A | 1/1999 | Edlund |
| 5,862,858 | A | 1/1999 | Wellington et al. |
| 5,868,202 | A | 2/1999 | Hsu |
| 5,879,110 | A | 3/1999 | Carter |
| 5,899,269 | A | 5/1999 | Wellington et al. |
| 5,899,958 | A | 5/1999 | Dowell et al. |
| 5,911,898 | A | 6/1999 | Jacobs et al. |
| 5,923,170 | A | 7/1999 | Kuckes |
| 5,926,437 | A | 7/1999 | Ortiz |
| 5,935,421 | A | 8/1999 | Brons et al. |
| 5,958,365 | A | 9/1999 | Liu |
| 5,968,349 | A | 10/1999 | Duyvesteyn et al. |
| 5,984,010 | A | 11/1999 | Elias et al. |
| 5,984,582 | A | 11/1999 | Schwert |
| 5,985,138 | A | 11/1999 | Humphreys |
| 5,997,214 | A | 12/1999 | de Rouffignac et al. |
| 6,015,015 | A | 1/2000 | Luft et al. |
| 6,016,867 | A | 1/2000 | Gregoli et al. |
| 6,016,868 | A | 1/2000 | Gregoli et al. |
| 6,019,172 | A | 2/2000 | Wellington et al. |
| 6,022,834 | A | 2/2000 | Hsu et al. |
| 6,023,554 | A | 2/2000 | Vinegar et al. |
| 6,026,914 | A | 2/2000 | Adams et al. |
| 6,035,701 | A | 3/2000 | Lowry et al. |
| 6,039,121 | A | 3/2000 | Kisman |
| 6,049,508 | A | 4/2000 | Deflandre |
| 6,056,057 | A | 5/2000 | Vinegar et al. |
| 6,065,538 | A | 5/2000 | Reimers et al. |
| 6,078,868 | A | 6/2000 | Dubinsky |
| 6,079,499 | A | 6/2000 | Mikus et al. |
| 6,084,826 | A | 7/2000 | Leggett, III |
| 6,085,512 | A | 7/2000 | Agee et al. |
| 6,088,294 | A | 7/2000 | Leggett, III et al. |
| 6,094,048 | A | 7/2000 | Vinegar et al. |
| 6,099,208 | A | 8/2000 | McAlister |
| 6,102,122 | A | 8/2000 | de Rouffignac |
| 6,102,137 | A | 8/2000 | Ward et al. |
| 6,102,622 | A | 8/2000 | Vinegar et al. |
| 6,110,358 | A | 8/2000 | Aldous et al. |
| 6,112,808 | A | 9/2000 | Isted |
| 6,152,987 | A | 11/2000 | Ma et al. |
| 6,155,117 | A | 12/2000 | Stevens et al. |
| 6,172,124 | B1 | 1/2001 | Wolflick et al. |
| 6,173,775 | B1 | 1/2001 | Elias et al. |
| 6,192,748 | B1 | 2/2001 | Miller |
| 6,193,010 | B1 | 2/2001 | Minto |
| 6,196,350 | B1 | 3/2001 | Minto |
| 6,209,640 | B1 | 4/2001 | Reimers et al. |
| 6,218,333 | B1 | 4/2001 | Gabrielov et al. |
| 6,257,334 | B1 | 7/2001 | Cyr et al. |
| 6,269,310 | B1 | 7/2001 | Washbourne |
| 6,269,881 | B1 | 8/2001 | Chou et al. |
| 6,283,230 | B1 | 9/2001 | Peters |
| 6,288,372 | B1 | 9/2001 | Sandberg et al. |
| 6,290,841 | B1 | 9/2001 | Gabrielov et al. |
| 6,313,431 | B1 | 11/2001 | Schneider et al. |
| 6,328,104 | B1 | 12/2001 | Graue |
| 6,353,706 | B1 | 3/2002 | Bridges |
| 6,354,373 | B1 | 3/2002 | Vercaemer et al. |
| 6,357,526 | B1 | 3/2002 | Abdel-Halim et al. |
| 6,388,947 | B1 | 5/2002 | Washbourne et al. |
| 6,412,559 | B1 | 7/2002 | Gunter et al. |
| 6,417,268 | B1 | 7/2002 | Zhang et al. |
| 6,422,318 | B1 | 7/2002 | Rider |
| 6,427,124 | B1 | 7/2002 | Dubinsky et al. |
| 6,439,308 | B1 | 8/2002 | Wang |
| 6,467,543 | B1 | 10/2002 | Talwani et al. |
| 6,485,232 | B1 | 11/2002 | Vinegar et al. |
| 6,499,536 | B1 | 12/2002 | Ellingsen |
| 6,516,891 | B1 | 2/2003 | Dallas |
| 6,540,018 | B1 | 4/2003 | Vinegar |
| 6,581,684 | B2 | 6/2003 | Wellington et al. |
| 6,584,406 | B1 | 6/2003 | Harmon et al. |
| 6,585,046 | B2 | 7/2003 | Neuroth et al. |
| 6,588,266 | B2 | 7/2003 | Tubel et al. |
| 6,588,503 | B2 | 7/2003 | Karanikas et al. |
| 6,588,504 | B2 | 7/2003 | Wellington et al. |
| 6,591,906 | B2 | 7/2003 | Wellington et al. |
| 6,591,907 | B2 | 7/2003 | Zhang et al. |
| 6,605,566 | B2 | 8/2003 | Le Peltier et al. |
| 6,607,033 | B2 | 8/2003 | Wellington et al. |
| 6,609,570 | B2 | 8/2003 | Wellington et al. |
| 6,609,761 | B1 | 8/2003 | Ramey et al. |
| 6,679,332 | B2 | 1/2004 | Vinegar et al. |
| 6,684,948 | B1 | 2/2004 | Savage |
| 6,688,387 | B1 | 2/2004 | Wellington et al. |
| 6,698,515 | B2 | 3/2004 | Karanikas et al. |
| 6,702,016 | B2 | 3/2004 | de Rouffignac et al. |
| 6,708,758 | B2 | 3/2004 | de Rouffignac et al. |
| 6,712,135 | B2 | 3/2004 | Wellington et al. |
| 6,712,136 | B2 | 3/2004 | de Rouffignac et al. |
| 6,712,137 | B2 | 3/2004 | Vinegar et al. |
| 6,715,546 | B2 | 4/2004 | Vinegar et al. |
| 6,715,547 | B2 | 4/2004 | Vinegar et al. |
| 6,715,548 | B2 | 4/2004 | Wellington et al. |
| 6,715,550 | B2 | 4/2004 | Vinegar et al. |
| 6,719,047 | B2 | 4/2004 | Fowler et al. |
| 6,722,429 | B2 | 4/2004 | de Rouffignac et al. |
| 6,722,430 | B2 | 4/2004 | Vinegar et al. |
| 6,722,431 | B2 | 4/2004 | Karanikas et al. |
| 6,725,920 | B2 | 4/2004 | Zhang et al. |
| 6,725,928 | B2 | 4/2004 | Vinegar et al. |
| 6,729,395 | B2 | 5/2004 | Shahin, Jr. et al. |
| 6,729,396 | B2 | 5/2004 | Vinegar et al. |
| 6,729,397 | B2 | 5/2004 | Zhang et al. |
| 6,729,401 | B2 | 5/2004 | Vinegar et al. |
| 6,732,794 | B2 | 5/2004 | Wellington et al. |
| 6,732,795 | B2 | 5/2004 | de Rouffignac et al. |
| 6,732,796 | B2 | 5/2004 | Vinegar et al. |
| 6,736,215 | B2 | 5/2004 | Maher et al. |
| 6,739,393 | B2 | 5/2004 | Vinegar et al. |
| 6,739,394 | B2 | 5/2004 | Vinegar et al. |
| 6,742,587 | B2 | 6/2004 | Vinegar et al. |
| 6,742,588 | B2 | 6/2004 | Wellington et al. |

| | | | |
|---|---|---|---|
| 6,742,589 | B2 | 6/2004 | Berchenko et al. |
| 6,742,593 | B2 | 6/2004 | Vinegar et al. |
| 6,745,831 | B2 | 6/2004 | de Rouffignac et al. |
| 6,745,832 | B2 | 6/2004 | Wellington et al. |
| 6,745,837 | B2 | 6/2004 | Wellington et al. |
| 6,749,021 | B2 | 6/2004 | Vinegar et al. |
| 6,752,210 | B2 | 6/2004 | de Rouffignac et al. |
| 6,755,251 | B2 | 6/2004 | Thomas et al. |
| 6,758,268 | B2 | 7/2004 | Vinegar et al. |
| 6,759,364 | B2 | 7/2004 | Bhan et al. |
| 6,761,216 | B2 | 7/2004 | Vinegar et al. |
| 6,763,886 | B2 | 7/2004 | Schoeling et al. |
| 6,766,817 | B2 | 7/2004 | da Silva |
| 6,769,483 | B2 | 8/2004 | de Rouffignac et al. |
| 6,769,485 | B2 | 8/2004 | Vinegar et al. |
| 6,782,947 | B2 | 8/2004 | de Rouffignac et al. |
| 6,789,625 | B2 | 9/2004 | de Rouffignac et al. |
| 6,805,194 | B2 | 10/2004 | Davidson et al. |
| 6,805,195 | B2 | 10/2004 | Vinegar et al. |
| 6,820,688 | B2 | 11/2004 | Vinegar et al. |
| 6,821,501 | B2 | 11/2004 | Matzakos et al. |
| 6,854,534 | B2 | 2/2005 | Livingstone |
| 6,854,929 | B2 | 2/2005 | Vinegar et al. |
| 6,866,097 | B2 | 3/2005 | Vinegar et al. |
| 6,871,707 | B2 | 3/2005 | Karanikas et al. |
| 6,877,554 | B2 | 4/2005 | Stegemeier et al. |
| 6,877,555 | B2 | 4/2005 | Karanikas et al. |
| 6,880,633 | B2 | 4/2005 | Wellington et al. |
| 6,880,635 | B2 | 4/2005 | Vinegar et al. |
| 6,889,769 | B2 | 5/2005 | Wellington et al. |
| 6,896,053 | B2 | 5/2005 | Berchenko et al. |
| 6,902,003 | B2 | 6/2005 | Maher et al. |
| 6,902,004 | B2 | 6/2005 | de Rouffignac et al. |
| 6,910,536 | B2 | 6/2005 | Wellington et al. |
| 6,910,537 | B2 | 6/2005 | Brown et al. |
| 6,913,078 | B2 | 7/2005 | Shahin, Jr. et al. |
| 6,913,079 | B2 | 7/2005 | Tubel |
| 6,915,850 | B2 | 7/2005 | Vinegar et al. |
| 6,918,404 | B2 | 7/2005 | da Silva |
| 6,918,442 | B2 | 7/2005 | Wellington et al. |
| 6,918,443 | B2 | 7/2005 | Wellington et al. |
| 6,918,444 | B2 | 7/2005 | Passey |
| 6,923,257 | B2 | 8/2005 | Wellington et al. |
| 6,923,258 | B2 | 8/2005 | Wellington et al. |
| 6,929,067 | B2 | 8/2005 | Vinegar et al. |
| 6,932,155 | B2 | 8/2005 | Vinegar et al. |
| 6,942,032 | B2 | 9/2005 | La Rovere et al. |
| 6,942,037 | B1 | 9/2005 | Arnold |
| 6,948,562 | B2 | 9/2005 | Wellington et al. |
| 6,948,563 | B2 | 9/2005 | Wellington et al. |
| 6,951,247 | B2 | 10/2005 | de Rouffignac et al. |
| 6,951,250 | B2 | 10/2005 | Reddy et al. |
| 6,953,087 | B2 | 10/2005 | de Rouffignac et al. |
| 6,958,704 | B2 | 10/2005 | Vinegar et al. |
| 6,959,761 | B2 | 11/2005 | Berchenko et al. |
| 6,964,300 | B2 | 11/2005 | Vinegar et al. |
| 6,966,372 | B2 | 11/2005 | Wellington et al. |
| 6,966,374 | B2 | 11/2005 | Vinegar et al. |
| 6,969,123 | B2 | 11/2005 | Vinegar et al. |
| 6,973,967 | B2 | 12/2005 | Stegemeier et al. |
| 6,981,548 | B2 | 1/2006 | Wellington et al. |
| 6,981,553 | B2 | 1/2006 | Stegemeier et al. |
| 6,991,032 | B2 | 1/2006 | Berchenko et al. |
| 6,991,033 | B2 | 1/2006 | Wellington et al. |
| 6,991,036 | B2 | 1/2006 | Sumnu-Dindoruk et al. |
| 6,991,045 | B2 | 1/2006 | Vinegar et al. |
| 6,994,160 | B2 | 2/2006 | Wellington et al. |
| 6,994,168 | B2 | 2/2006 | Wellington et al. |
| 6,994,169 | B2 | 2/2006 | Zhang et al. |
| 6,997,255 | B2 | 2/2006 | Wellington et al. |
| 6,997,518 | B2 | 2/2006 | Vinegar et al. |
| 7,004,247 | B2 | 2/2006 | Cole et al. |
| 7,004,251 | B2 | 2/2006 | Ward et al. |
| 7,011,154 | B2 | 3/2006 | Maher et al. |
| RE39,077 | E | 4/2006 | Eaton |
| 7,032,660 | B2 | 4/2006 | Vinegar et al. |
| 7,032,809 | B1 | 4/2006 | Hopkins |
| 7,036,583 | B2 | 5/2006 | de Rouffignac et al. |
| 7,040,397 | B2 | 5/2006 | de Rouffignac et al. |
| 7,040,398 | B2 | 5/2006 | Wellington et al. |
| 7,040,399 | B2 | 5/2006 | Wellington et al. |
| 7,040,400 | B2 | 5/2006 | de Rouffignac et al. |
| 7,051,807 | B2 | 5/2006 | Vinegar et al. |
| 7,051,808 | B1 | 5/2006 | Vinegar et al. |
| 7,055,600 | B2 | 6/2006 | Messier et al. |
| 7,055,602 | B2 | 6/2006 | Shpakoff et al. |
| 7,063,145 | B2 | 6/2006 | Veenstra et al. |
| 7,066,254 | B2 | 6/2006 | Vinegar et al. |
| 7,066,257 | B2 | 6/2006 | Wellington et al. |
| 7,066,586 | B2 | 6/2006 | da Silva |
| 7,073,578 | B2 | 7/2006 | Vinegar et al. |
| 7,077,198 | B2 | 7/2006 | Vinegar et al. |
| 7,077,199 | B2 | 7/2006 | Vinegar et al. |
| RE39,244 | E | 8/2006 | Eaton |
| 7,086,465 | B2 | 8/2006 | Wellington et al. |
| 7,086,468 | B2 | 8/2006 | de Rouffignac et al. |
| 7,090,013 | B2 | 8/2006 | Wellington et al. |
| 7,096,941 | B2 | 8/2006 | de Rouffignac et al. |
| 7,096,942 | B1 | 8/2006 | de Rouffignac et al. |
| 7,096,953 | B2 | 8/2006 | de Rouffignac et al. |
| 7,100,994 | B2 | 9/2006 | Vinegar et al. |
| 7,104,319 | B2 | 9/2006 | Vinegar et al. |
| 7,114,566 | B2 | 10/2006 | Vinegar et al. |
| 7,114,880 | B2 | 10/2006 | Carter |
| 7,121,341 | B2 | 10/2006 | Vinegar et al. |
| 7,121,342 | B2 | 10/2006 | Vinegar et al. |
| 7,128,150 | B2 | 10/2006 | Thomas et al. |
| 7,128,153 | B2 | 10/2006 | Vinegar et al. |
| 7,147,057 | B2 | 12/2006 | Steele et al. |
| 7,147,059 | B2 | 12/2006 | Hirsch et al. |
| 7,153,373 | B2 | 12/2006 | Maziasz et al. |
| 7,156,176 | B2 | 1/2007 | Vinegar et al. |
| 7,165,615 | B2 | 1/2007 | Vinegar et al. |
| 7,170,424 | B2 | 1/2007 | Vinegar et al. |
| 7,204,327 | B2 | 4/2007 | Livingstone |
| 7,219,734 | B2 | 5/2007 | Bai et al. |
| 7,225,866 | B2 | 6/2007 | Berchenko et al. |
| 7,258,752 | B2 | 8/2007 | Maziasz et al. |
| 7,259,688 | B2 | 8/2007 | Hirsch et al. |
| 7,320,364 | B2 | 1/2008 | Fairbanks |
| 7,331,385 | B2 | 2/2008 | Symington et al. |
| 7,337,841 | B2 | 3/2008 | Ravi |
| 7,353,872 | B2 | 4/2008 | Sandberg et al. |
| 7,357,180 | B2 | 4/2008 | Vinegar et al. |
| 7,360,588 | B2 | 4/2008 | Vinegar et al. |
| 7,370,704 | B2 | 5/2008 | Harris |
| 7,383,877 | B2 | 6/2008 | Vinegar et al. |
| 7,424,915 | B2 | 9/2008 | Vinegar et al. |
| 7,426,959 | B2 | 9/2008 | Wang et al. |
| 7,431,076 | B2 | 10/2008 | Sandberg et al. |
| 7,435,037 | B2 | 10/2008 | McKinzie, II |
| 7,461,691 | B2 | 12/2008 | Vinegar et al. |
| 7,481,274 | B2 | 1/2009 | Vinegar et al. |
| 7,490,665 | B2 | 2/2009 | Sandberg et al. |
| 7,500,528 | B2 | 3/2009 | McKinzie et al. |
| 7,510,000 | B2 | 3/2009 | Pastor-Sanz et al. |
| 7,527,094 | B2 | 5/2009 | McKinzie et al. |
| 7,533,719 | B2 | 5/2009 | Hinson et al. |
| 7,540,324 | B2 | 6/2009 | de Rouffignac et al. |
| 7,546,873 | B2 | 6/2009 | Kim |
| 7,549,470 | B2 | 6/2009 | Vinegar et al. |
| 7,556,095 | B2 | 7/2009 | Vinegar |
| 7,556,096 | B2 | 7/2009 | Vinegar et al. |
| 7,559,367 | B2 | 7/2009 | Vinegar et al. |
| 7,559,368 | B2 | 7/2009 | Vinegar et al. |
| 7,562,706 | B2 | 7/2009 | Li et al. |
| 7,562,707 | B2 | 7/2009 | Miller |
| 7,575,052 | B2 | 8/2009 | Sandberg et al. |
| 7,575,053 | B2 | 8/2009 | Vinegar et al. |
| 7,581,589 | B2 | 9/2009 | Roes et al. |
| 7,591,310 | B2 | 9/2009 | Minderhoud et al. |
| 7,597,147 | B2 | 10/2009 | Vitek et al. |
| 7,604,052 | B2 | 10/2009 | Roes et al. |
| 7,610,962 | B2 | 11/2009 | Fowler |
| 7,631,689 | B2 | 12/2009 | Vinegar et al. |
| 7,631,690 | B2 | 12/2009 | Vinegar et al. |
| 7,635,023 | B2 | 12/2009 | Goldberg et al. |
| 7,635,024 | B2 | 12/2009 | Karanikas et al. |

7,635,025 B2 12/2009 Vinegar et al.
7,644,765 B2 1/2010 Stegemeier et al.
7,673,681 B2 3/2010 Vinegar et al.
7,673,786 B2 3/2010 Menotti
7,677,310 B2 3/2010 Vinegar et al.
7,677,314 B2 3/2010 Hsu
7,681,647 B2 3/2010 Mudunuri et al.
7,683,296 B2 3/2010 Brady et al.
7,703,513 B2 4/2010 Vinegar et al.
7,717,171 B2 5/2010 Stegemeier et al.
7,730,936 B2 6/2010 Hernandez-Solis et al.
7,730,945 B2 6/2010 Pieterson et al.
7,730,946 B2 6/2010 Vinegar et al.
7,730,947 B2 6/2010 Stegemeier et al.
7,735,935 B2 6/2010 Vinegar et al.
7,785,427 B2 8/2010 Maziasz et al.
7,793,722 B2 9/2010 Vinegar et al.
7,798,220 B2 9/2010 Vinegar et al.
7,798,221 B2 9/2010 Vinegar et al.
7,831,133 B2 11/2010 Vinegar et al.
7,831,134 B2 11/2010 Vinegar et al.
7,832,484 B2 11/2010 Nguyen et al.
7,841,401 B2 11/2010 Kuhlman et al.
7,841,408 B2 11/2010 Vinegar
7,841,425 B2 11/2010 Mansure et al.
7,845,411 B2 12/2010 Vinegar et al.
7,849,922 B2 12/2010 Vinegar et al.
7,860,377 B2 12/2010 Vinegar et al.
7,866,385 B2 1/2011 Lambirth
7,866,386 B2 1/2011 Beer
7,866,388 B2 1/2011 Bravo
7,912,358 B2 3/2011 Stone et al.
7,931,086 B2 4/2011 Nguyen et al.
7,942,197 B2 5/2011 Fairbanks et al.
7,942,203 B2 5/2011 Vinegar et al.
7,950,453 B2 5/2011 Farmayan et al.
2002/0027001 A1 3/2002 Wellington et al.
2002/0028070 A1 3/2002 Holen
2002/0033253 A1 3/2002 de Rouffignac et al.
2002/0036085 A1 3/2002 Bass et al.
2002/0036089 A1 3/2002 Vinegar et al.
2002/0038069 A1 3/2002 Wellington et al.
2002/0040779 A1 4/2002 Wellington et al.
2002/0040780 A1 4/2002 Wellington et al.
2002/0053431 A1 5/2002 Wellington et al.
2002/0076212 A1 6/2002 Zhang et al.
2002/0112890 A1 8/2002 Wentworth et al.
2002/0112987 A1 8/2002 Hou et al.
2002/0153141 A1 10/2002 Hartman et al.
2003/0029617 A1 2/2003 Brown et al.
2003/0066642 A1 4/2003 Wellington et al.
2003/0079877 A1 5/2003 Wellington et al.
2003/0085034 A1 5/2003 Wellington et al.
2003/0131989 A1 7/2003 Zakiewicz
2003/0146002 A1 8/2003 Vinegar et al.
2003/0157380 A1 8/2003 Assarabowski et al.
2003/0196789 A1 10/2003 Wellington et al.
2003/0201098 A1 10/2003 Karanikas et al.
2004/0035582 A1 2/2004 Zupanick
2004/0140096 A1 7/2004 Sandberg et al.
2004/0144540 A1 7/2004 Sandberg et al.
2004/0146288 A1 7/2004 Vinegar et al.
2004/0177966 A1* 9/2004 Vinegar et al. ................ 166/302
2005/0006097 A1 1/2005 Sandberg et al.
2005/0006128 A1 1/2005 Mita et al.
2005/0065392 A1 3/2005 Peterson et al.
2005/0133405 A1 6/2005 Wellington et al.
2005/0133414 A1 6/2005 Bhan et al.
2005/0269089 A1 12/2005 Sandberg et al.
2005/0269090 A1 12/2005 Vinegar et al.
2005/0269091 A1 12/2005 Pastor-Sanz et al.
2005/0269093 A1 12/2005 Sandberg et al.
2005/0269313 A1 12/2005 Vinegar et al.
2006/0116430 A1 6/2006 Wentink
2006/0178546 A1 8/2006 Mo et al.
2006/0191820 A1 8/2006 Mo et al.
2006/0231465 A1 10/2006 Bhan et al.
2006/0289340 A1 12/2006 Brownscombe et al.
2006/0289536 A1 12/2006 Vinegar et al.
2007/0000810 A1 1/2007 Bhan et al.
2007/0044957 A1 3/2007 Watson et al.
2007/0045265 A1 3/2007 McKinzie et al.
2007/0045266 A1 3/2007 Sandberg et al.
2007/0045267 A1 3/2007 Vinegar et al.
2007/0045268 A1 3/2007 Vinegar et al.
2007/0095536 A1 5/2007 Vinegar et al.
2007/0095537 A1 5/2007 Vinegar et al.
2007/0108200 A1 5/2007 McKinzie et al.
2007/0108201 A1 5/2007 Vinegar et al.
2007/0119098 A1 5/2007 Diaz et al.
2007/0125533 A1 6/2007 Minderhoud et al.
2007/0127897 A1 6/2007 John et al.
2007/0131411 A1 6/2007 Vinegar et al.
2007/0131415 A1 6/2007 Vinegar et al.
2007/0131419 A1 6/2007 Roes et al.
2007/0131420 A1 6/2007 Mo et al.
2007/0131427 A1 6/2007 Li et al.
2007/0131428 A1 6/2007 den Boestert et al.
2007/0133959 A1 6/2007 Vinegar et al.
2007/0133960 A1 6/2007 Vinegar et al.
2007/0137856 A1 6/2007 McKinzie et al.
2007/0137857 A1 6/2007 Vinegar et al.
2007/0144732 A1 6/2007 Kim et al.
2007/0173122 A1 7/2007 Matsuoka
2007/0221377 A1 9/2007 Vinegar et al.
2007/0246994 A1 10/2007 Kaminsky et al.
2007/0284108 A1 12/2007 Roes et al.
2007/0289733 A1 12/2007 Hinson et al.
2008/0017370 A1 1/2008 Vinegar et al.
2008/0017380 A1 1/2008 Vinegar et al.
2008/0017416 A1 1/2008 Watson et al.
2008/0035346 A1 2/2008 Nair et al.
2008/0035347 A1 2/2008 Brady et al.
2008/0035348 A1 2/2008 Vitek et al.
2008/0035705 A1 2/2008 Menotti
2008/0038144 A1 2/2008 Maziasz et al.
2008/0073104 A1 3/2008 Barberree et al.
2008/0078551 A1 4/2008 De Vault et al.
2008/0078552 A1 4/2008 Donnelly et al.
2008/0107577 A1 5/2008 Vinegar et al.
2008/0128134 A1 6/2008 Mudunuri et al.
2008/0135244 A1 6/2008 Miller et al.
2008/0135253 A1 6/2008 Vinegar et al.
2008/0135254 A1 6/2008 Vinegar et al.
2008/0142216 A1 6/2008 Vinegar et al.
2008/0142217 A1 6/2008 Pietersen et al.
2008/0173442 A1 7/2008 Vinegar et al.
2008/0173444 A1 7/2008 Stone et al.
2008/0173449 A1 7/2008 Fowler
2008/0174115 A1 7/2008 Lambirth
2008/0185147 A1 8/2008 Vinegar et al.
2008/0217003 A1 9/2008 Kuhlman et al.
2008/0217004 A1 9/2008 de Rouffinac et al.
2008/0217015 A1 9/2008 Vinegar et al.
2008/0217016 A1 9/2008 Stegemeier et al.
2008/0217321 A1 9/2008 Vinegar et al.
2008/0236831 A1 10/2008 Hsu et al.
2008/0277113 A1 11/2008 Stegemeier et al.
2008/0283241 A1 11/2008 Kaminsky et al.
2008/0283246 A1 11/2008 Karanikas et al.
2009/0014180 A1 1/2009 Stegemeier et al.
2009/0014181 A1 1/2009 Vinegar et al.
2009/0090158 A1 4/2009 Davidson et al.
2009/0095478 A1 4/2009 Karanikas et al.
2009/0095479 A1 4/2009 Karanikas et al.
2009/0120646 A1 5/2009 Kim et al.
2009/0126929 A1 5/2009 Vinegar
2009/0189617 A1 7/2009 Burns et al.
2009/0194269 A1 8/2009 Vinegar
2009/0194286 A1 8/2009 Mason
2009/0194329 A1 8/2009 Guimerans et al.
2009/0194333 A1 8/2009 MacDonald
2009/0194524 A1 8/2009 Kim et al.
2009/0200022 A1 8/2009 Bravo et al.
2009/0200023 A1 8/2009 Costello et al.
2009/0200031 A1 8/2009 Miller et al.
2009/0200290 A1 8/2009 Cardinal et al.
2009/0200854 A1 8/2009 Vinegar

| | | | |
|---|---|---|---|
| 2009/0260824 | A1 | 10/2009 | Burns et al. |
| 2009/0272526 | A1 | 11/2009 | Burns et al. |
| 2009/0301724 | A1 | 12/2009 | Roes et al. |
| 2009/0321417 | A1 | 12/2009 | Burns et al. |
| 2010/0071903 | A1 | 3/2010 | Prince-Wright et al. |
| 2010/0071904 | A1 | 3/2010 | Burns et al. |
| 2010/0089584 | A1 | 4/2010 | Burns |
| 2010/0089586 | A1 | 4/2010 | Stanecki |
| 2010/0096137 | A1 | 4/2010 | Nguyen et al. |
| 2010/0206570 | A1 | 8/2010 | Ocampos et al. |
| 2010/0258265 | A1 | 10/2010 | Karanikas et al. |
| 2010/0258290 | A1 | 10/2010 | Bass |
| 2010/0258291 | A1 | 10/2010 | de St. Remey et al. |
| 2010/0288497 | A1 | 11/2010 | Burnham et al. |

FOREIGN PATENT DOCUMENTS

| | | |
|---|---|---|
| CA | 1168283 | 5/1984 |
| CA | 1196594 | 11/1985 |
| CA | 1253555 | 5/1989 |
| CA | 1288043 | 8/1991 |
| CA | 2015460 | 10/1991 |
| EP | 107927 | 5/1984 |
| EP | 130671 | 9/1985 |
| EP | 0940558 | 9/1999 |
| GB | 156396 | 1/1921 |
| GB | 674082 | 7/1950 |
| GB | 1010023 | 11/1965 |
| GB | 1204405 | 9/1970 |
| GB | 1454324 | 11/1976 |
| JP | 2000340350 | 12/2000 |
| SE | 121737 | 5/1948 |
| SE | 123136 | 11/1948 |
| SE | 123137 | 11/1948 |
| SE | 123138 | 11/1948 |
| SE | 126674 | 11/1949 |
| SU | 1836876 | 12/1990 |
| WO | 9506093 | 3/1995 |
| WO | 97/07321 | 2/1997 |
| WO | 97/23924 | 7/1997 |
| WO | 9901640 | 1/1999 |
| WO | 00/19061 | 4/2000 |
| WO | 0181505 | 11/2001 |
| WO | 2007098370 | 8/2007 |
| WO | 2008033536 | 3/2008 |
| WO | 2008048448 | 4/2008 |
| WO | 2008150531 | 12/2008 |

OTHER PUBLICATIONS

New in situ shale-oil recovery process uses hot natural gas; The Oil & Gas Journal; May 16, 1966, p. 151.

Evaluation of Downhole Electric Impedance Heating Systems for Paraffin Control in Oil Wells; Industry Applications Society 37th Annual Petroleum and Chemical Industry Conference; The Institute of Electrical and Electronics Engineers Inc., Bosch et al., Sep. 1990, pp. 223-227.

New System Stops Paraffin Build-up; Petroleum Engineer, Eastlund et al., Jan. 1989, (3 pages).

Oil Shale Retorting: Effects of Particle Size and Heating Rate on Oil Evolution and Intraparticle Oil Degradation; Campbell et al. In Situ 2(1), 1978, pp. 1-47.

The Potential for In Situ Retorting of Oil Shale in the Piceance Creek Basin of Northwestern Colorado; Dougan et al., Quarterly of the Colorado School of Mines, pp. 57-72.

Retoring Oil Shale Underground-Problems & Possibilities; B.F. Grant, Qtly of Colorado School of Mines, pp. 39-46.

Molecular Mechanism of Oil Shale Pyrolysis in Nitrogen and Hydrogen Atmospheres, Hershkowitz et al.; Geochemistry and Chemistry of Oil Shales, American Chemical Society, May 1983 pp. 301-316.

The Characteristics of a Low Temperature in Situ Shale Oil; George Richard Hill & Paul Dougan, Quarterly of the Colorado School of Mines, 1967; pp. 75-90.

Direct Production of a Low Pour Point High Gravity Shale Oil; Hill et al., I & EC Product Research and Development, 6(1), Mar. 1967; pp. 52-59.

Refining of Swedish Shale Oil, L. Lundquist, pp. 621-627.

The Benefits of In Situ Upgrading Reactions to the Integrated Operations of the Orinoco Heavy-Oil Fields and Downstream Facilities, Myron Kuhlman, Society of Petroleum Engineers, Jun. 2000; pp. 1-14.

Monitoring Oil Shale Retorts by Off-Gas Alkene/Alkane Ratios, John H. Raley, Fuel, vol. 59, Jun. 1980, pp. 419-424.

The Shale Oil Question, Old and New Viewpoints, A Lecture in the Engineering Science Academy, Dr. Fredrik Ljungstrom, Feb. 23, 1950, published in Teknisk Trdskrift, Jan. 1951 p. 33-40.

Underground Shale Oil Pyrolysis According to the Ljungstroem Method; Svenska Skifferolje Aktiebolaget (Swedish Shale Oil Corp. ), IVA, vol. 24, 1953, No. 3, pp. 118-123.

Kinetics of Low-Temperature Pyrolysis of Oil Shale by the IITRI RF Process, Sresty et al.; 15th Oil Shale Symposium, Colorado School of Mines, Apr. 1982 pp. 1-13.

Bureau of Mines Oil-Shale Research, H.M. Thorne, Quarterly of the Colorado School of Mines, pp. 77-90.

Application of a Microretort to Problems in Shale Pyrolysis, A. W. Weitkamp & L.C. Gutberlet, Ind. Eng. Chem. Process Des. Develop. vol. 9, No. 3, 1970, pp. 386-395.

Oil Shale, Yen et al., Developments in Petroleum Science 5, 1976, pp. 187-189, 197-198.

The Composition of Green River Shale Oils, Glenn L. Cook, et al., United Nations Symposium on the Development and Utilization of Oil Shale Resources, 1968, pp. 1-23.

High-Pressure Pyrolysis of Green River Oil Shale, Burnham et al., Geochemistry and Chemistry of Oil Shales, American Chemical Society, 1983, pp. 335-351.

Geochemistry and Pyrolysis of Oil Shales, Tissot et al., Geochemistry and Chemistry of Oil Shales, American Chemical Society, 1983, pp. 1-11.

A Possible Mechanism of Alkene/Alkane Production, Burnham et al., Oil Shale, Tar Sands, and Related Materials, American Chemical Society, 1981, pp. 79-92.

The Ljungstroem In-Situ Method of Shale Oil Recovery, G. Salomonsson, Oil Shale and Cannel Coal, vol. 2, Proceedings of the Second Oil Shale and Cannel Coal Conference, Institute of Petroleum, 1951, London, pp. 260-280.

Developments in Technology for Green River Oil Shale, G.U. Dinneen, United Nations Symposium on the Development and Utilization of Oil Shale Resources, Laramie Petroleum Research Center, Bureau of Mines, 1968, pp. 1-20.

The Thermal and Structural Properties of a Hanna Basin Coal, R.E. Glass, Transactions of the ASME, vol. 106, Jun. 1984, pp. 266-271.

On the Mechanism of Kerogen Pyrolysis, Alan K. Burnham & James A. Happe, Jan. 10, 1984 (17 pages).

Comparison of Methods for Measuring Kerogen Pyrolysis Rates and Fitting Kinetic Parameters, Burnham et al., Mar. 23, 1987, (29 pages).

Further Comparison of Methods for Measuring Kerogen Pyrolysis Rates and Fitting Kinetic Parameters, Burnham et al., Sep. 1987, (16 pages).

Shale Oil Cracking Kinetics and Diagnostics, Bissell et al., Nov. 1983, (27 pages).

Mathematical Modeling of Modified In Situ and Aboveground Oil Shale Retorting, Robert L. Braun, Jan. 1981 (45 pages).

Progress Report on Computer Model for In Situ Oil Shale Retorting, R.L. Braun & R.C.Y. Chin, Jul. 14, 1977 (34 pages).

Chemical Kinetics and Oil Shale Process Design, Alan K. Burnham, Jul. 1993 (16 pages).

Reaction Kinetics and Diagnostics for Oil Shale Retorting, Alan K. Burnham, Oct. 19, 1981 (32 pages).

Reaction Kinetics Between Steam and Oil Shale Char, A.K. Burnham, Oct. 1978 (8 pages).

General Kinetic Model of Oil Shale Pyrolysis, Alan K. Burnham & Robert L. Braun, Dec. 1984 (25 pages).

Reaction Kinetics Between CO2 and Oil Shale Char, A.K. Burnham, Mar. 22, 1978 (18 pages).

Reaction Kinetics Between CO2 and Oil Shale Residual Carbon. I. Effect of Heating Rate on Reactivity, Alan K. Burnham, Jul. 11, 1978 (22 pages).

High-Pressure Pyrolysis of Colorado Oil Shale, Alan K. Burnham & Mary F. Singleton, Oct. 1982 (23 pages).

A Possible Mechanism of Alkene/Alkane Production in Oil Shale Retorting, A.K. Burnham, R.L. Ward, Nov. 26, 1980 (20 pages).
Enthalpy Relations for Eastern Oil Shale, David W. Camp, Nov. 1987 (13 pages).
Oil Shale Retorting: Part 3 A Correlation of Shale Oil 1-Alkene/n-Alkane Ratios With Yield, Coburn et al., Aug. 1, 1977 (18 pages).
The Composition of Green River Shale Oil, Glen L. Cook, et al., 1968 (12 pages).
Thermal Degradation of Green River Kerogen at 150o to 350o C Rate of Production Formation, J.J. Cummins & W.E. Robinson, 1972 (18 pages).
Retorting of Green River Oil Shale Under High-Pressure Hydrogen Atmospheres, LaRue et al., Jun. 1977 (38 pages).
Retorting and Combustion Processes in Surface Oil-Shale Retorts, A.E. Lewis & R.L. Braun, May 2, 1980 (12 pages).
Oil Shale Retorting Processes: A Technical Overview, Lewis et al., Mar. 1984 (18 pages).
Study of Gas Evolution During Oil Shale Pyrolysis by TQMS, Oh et al., Feb. 1988 (10 pages).
The Permittivity and Electrical Conductivity of Oil Shale, A.J. Piwinskii & A. Duba, Apr. 28, 1975 (12 pages).
Oil Degradation During Oil Shale Retorting, J.H. Raley & R.L. Braun, May 24, 1976 (14 pages).
Kinetic Analysis of California Oil Shale by Programmed Temperature Microphyrolysis, John G. Reynolds & Alan K. Burnham, Dec. 9, 1991 (14 pages).
Analysis of Oil Shale and Petroleum Source Rock Pyrolysis by Triple Quadrupole Mass Spectrometry: Comparisons of Gas Evolution at the Heating Rate of 10oC/Min., Reynolds et al. Oct. 5, 1990 (57 pages).
Fluidized-Bed Pyrolysis of Oil Shale, J.H. Richardson & E.B. Huss, Oct. 1981 (27 pages).
Retorting Kinetics for Oil Shale From Fluidized-Bed Pyrolysis, Richardson et al., Dec. 1981 (30 pages).
Recent Experimental Developments in Retorting Oil Shale at the Lawrence Livermore Laboratory, Albert J. Rothman, Aug. 1978 (32 pages).
The Lawrence Livermore Laboratory Oil Shale Retorts, Sandholtz et al. Sep. 18, 1978 (30 pages).
Operating Laboratory Oil Shale Retorts in an In-Situ Mode, W. A. Sandholtz et al., Aug. 18, 1977 (16 pages).
Some Relationships of Thermal Effects to Rubble-Bed Structure and Gas-Flow Patterns in Oil Shale Retorts, W. A. Sandholtz, Mar. 1980 (19 pages).
Assay Products from Green River Oil Shale, Singleton et al., Feb. 18, 1986 (213 pages).
Biomarkers in Oil Shale: Occurrence and Applications, Singleton et al., Oct. 1982 (28 pages).
Occurrence of Biomarkers in Green River Shale Oil, Singleton et al., Mar. 1983 (29 pages).
An Instrumentation Proposal for Retorts in the Demonstration Phase of Oil Shale Development, Clyde J. Sisemore, Apr. 19, 1977, (34 pages).
Pyrolysis Kinetics for Green River Oil Shale From the Saline Zone, Burnham et al., Feb. 1982 (33 pages).
SO2 Emissions from the Oxidation of Retorted Oil Shale, Taylor et al., Nov. 1981 (9 pages).
Nitric Oxide (NO) Reduction by Retorted Oil Shale, R.W. Taylor & C.J. Morris, Oct. 1983 (16 pages).
Coproduction of Oil and Electric Power from Colorado Oil Shale, P. Henrik Wallman, Sep. 24, 1991 (20 pages).
13C NMR Studies of Shale Oil, Raymond L. Ward & Alan K. Burnham, Aug. 1982 (22 pages).
Identification by 13C NMR of Carbon Types in Shale Oil and their Relationship to Pyrolysis Conditions, Raymond L. Ward & Alan K. Burnham, Sep. 1983 (27 pages).
A Laboratory Study of Green River Oil Shale Retorting Under Pressure in a Nitrogen Atmosphere, Wise et al., Sep. 1976 (24 pages).
Quantitative Analysis and Evolution of Sulfur-Containing Gases from Oil Shale Pyrolysis by Triple Quadrupole Mass Spectrometry, Wong et al., Nov. 1983 (34 pages).
Quantitative Analysis & Kinetics of Trace Sulfur Gas Species from Oil Shale Pyrolysis by Triple Quadrupole Mass Spectrometry (TQMS), Wong et al., Jul. 5-7, 1983 (34 pages).
Application of Self-Adaptive Detector System on a Triple Quadrupole MS/MS to High Expolsives and Sulfur-Containing Pyrolysis Gases from Oil Shale, Carla M. Wong & Richard W. Crawford, Oct. 1983 (17 pages).
An Evaluation of Triple Quadrupole MS/MS for On-Line Gas Analyses of Trace Sulfur Compounds from Oil Shale Processing, Wong et al., Jan. 1985 (30 pages).
General Model of Oil Shale Pyrolysis, Alan K. Burnham & Robert L. Braun, Nov. 1983 (22 pages).
Proposed Field Test of the Lins Mehtod Thermal Oil Recovery Process in Athabasca McMurray Tar Sands McMurray, Alberta; Husky Oil Company cody, Wyoming.
In Situ Measurement of Some Thermoporoelastic Parameters of a Granite, Berchenko et al., Poromechanics, A Tribute to Maurice Biot, 1998, p. 545-550.
Tar and Pitch, G. Collin and H. Hoeke. Ullmann's Encyclopedia of Industrial Chemistry, vol. A 26, 1995, p. 91-127.
Cortez et al., UK Patent Application GB 2,068,014 A, Date of Publication: Aug. 5, 1981.
Wellington et al., U.S. Appl. No. 60/273,354, filed Mar. 5, 2001.
Geology for Petroleum Exploration, Drilling, and Production. Hyne, Norman J. McGraw-Hill Book Company, 1984, p. 264.
Burnham, Alan, K. "Oil Shale Retorting Dependence of timing and composition on temperature and heating rate", Jan. 27, 1995, (23 pages).
Campbell, et al., "Kinetics of oil generation from Colorado Oil Shale" IPC Business Press, Fuel, 1978, (3 pages).
Rangel-German et al., "Electrical-Heating-Assisted Recovery for Heavy Oil", pp. 1-43.
Kovscek, Anthony R., "Reservoir Engineering analysis of Novel Thermal Oil Recovery Techniques applicable to Alaskan North Slope Heavy Oils", pp. 1-6.
Bosch et al. "Evaluation of Downhole Electric Impedance Heating Systems for Paraffin Control in Oil Wells," IEEE Transactions on Industrial Applications, 1991, vol. 28; pp. 190-194.
"McGee et al. ""Electrical Heating with Horizontal Wells, the heat Transfer Problem,"" International Conference on Horizontal Well Tehcnology, Calgary, Alberta Canada, 1996; 14 pages".
Hill et al., "The Characteristics of a Low Temperature in situ Shale Oil" American Institute of Mining, Metallurgical & Petroleum Engineers, 1967 (pp. 75-90).
De Rouffignac, E. In Situ Resistive Heating of Oil Shale for Oil Production—A Summary of the Swedish Data, (4 pages).
SSAB report, "A Brief Description of the Ljungstrom Method for Shale Oil Production," 1950, (12 pages).
Salomonsson G., SSAB report, The Lungstrom In Situ—Method for Shale Oil Recovery, 1950 (28 pages).
"Swedish shale oil—Production method in Sweden," Organisation for European Economic Co-operation, 1952, (70 pages).
SSAB report, "Kvarn Torp" 1958, (36 pages).
SSAB report, "Kvarn Torp" 1951 (35 pages).
SSAB report, "Summary study of the shale oil works at Narkes Kvarntorp" (15 pages).
Vogel et al. "An Analog Computer for Studying Heat Transfrer during a Thermal Recovery Process," AIME Petroleum Transactions, 1955 (pp. 205-212).
"Skiferolja Genom Uppvarmning Av Skifferberget," Faxin Department och Namder, 1941, (3 pages).
"Aggregleringens orsaker och ransoneringen grunder", Av director E.F.Cederlund I Statens livesmedelskonmmission (1page).
Ronnby, E. "KVARNTORP—Sveriges Storsta skifferoljeindustri," 1943, (9 pages).
SAAB report, "The Swedish Shale Oil Industry," 1948 (8 pages).
Gejrot et al., "The Shale Oil Industry in Sweden," Carlo Colombo Publishers—Rome, Proceedings of the Fourth World Petroleum Congress, 1955 (8 pages).
Hedback, T. J., The Swedish Shale as Raw Material for Production of Power, Oil and Gas, XIth Sectional Meeting World Power Conference, 1957 (9 pages).

SAAB, “Santa Cruz, California, Field Test of the Lins Method for the Recovery of Oil from Sand”, 1955 vol. 1, (141 pages) English.
SAAB, “Santa Cruz, California, Field Test of the Lins Method for the Recovery of Oil from Sand-Figures”, 1955 vol. 2, (146 pages) English.
“Santa Cruz, California, Field Test of the Lins Method for the Recovery of Oil from Sand-Memorandum re: tests”, 1955 vol. 3, (256 pages) English.
Helander, R.E., “Santa Cruz, California, Field Test of Carbon Steel Burner Casings for the Lins Method of Oil Recovery”, 1959 (38 pages) English.
Helander et al., Santa Cruz, California, Field Test of Fluidized Bed Burners for the Lins Method of Oil Recovery 1959, (86 pages) English.
SSAB report, “Bradford Residual Oil, Athabasa Ft. McMurray” 1951, (207 pages), partial translation.
“Lins Burner Test Results—English” 1959-1960.
SSAB report, “Assessment of Future Mining Alternatives of Shale and Dolomite,” 1962, (59 pages) Swedish.
SSAB report. “Kartong 2 Shale: Ljungstromsanlaggningen” (104 pages) Swedish.
SAAB, “Photos”, (18 pages).
SAAB report, “Swedish Geological Survey Report, Plan to Delineate Oil shale Resource in Narkes Area (near Kvarntorp),” 1941 (13 pages). Swedish.
SAAB report, “Recovery Efficiency,” 1941, (61 pages). Swedish.
SAAB report, “Geologic Work Conducted to Assess Possibility of Expanding Shale Mining Area in Kvarntorp; Drilling Results, Seismic Results,” 1942 (79 pages). Swedish.
SSAB report, “Ojematinigar vid Norrtorp,” 1945 (141 pages).
SSAB report, “Inhopplingschema, Norrtorp II 20/3-17/8”, 1945 (50 pages). Swedish.
SSAB report, “Secondary Recovery after LINS,” 1945 (78 pages).
SSAB report, “Maps and Diagrams, Geology,” 1947 (137 pages). Swedish.
SSAB report, Styrehseprotoholl, 1943 (10 pages). Swedish.
SSAB report, “Early Shale Retorting Trials” 1951-1952, (134 pages). Swedish.
SSAB report, “Analysis of Lujunstrom Oil and its Use as Liquid Fuel,” Thesis by E. Pals, 1949 (83 pages). Swedish.
SSAB report, “Environmental Sulphur and Effect on Vegetation,” 1951 (50 pages). Swedish.
SSAB report, “Tar Sands”, vol. 135 1953 (20 pages, pp. 12-15 translated). Swedish.
SSAB report, “Assessment of Skanes Area (Southern Sweden) Shales as Fuel Source,” 1954 (54 pages). Swedish.
SSAB report, “From as Utre Dn Text Geology Reserves,” 1960 (93 pages). Swedish.
SSAB report, “Kvarntorps—Environmental Area Asessment,” 1981 (50 pages). Swedish.
“IEEE Recommended Practice for Electrical Impedance, Induction, and Skin Effect Heating of Pipelines and Vessels,” IEEE Std. 844-200, 2000; 6 pages.
Raad et al., “Converter-Fed Subsea Motor Drives”, Industry Applications, IEEE Transactions on vol. 32, Issue 5, Sep.-Oct. 1996 pp. 1069-1079.
Boggs, “The Case for Frequency Domain PD Testing in the Context of Distribution Cable”, Electrical Insulation Magazine, IEEE, vol. 19, Issue 4, Jul.-Aug. 2003, pp. 13-19.
Moreno, James B., et al., Sandia National Laboratories, “Methods and Energy Sources for Heating Subsurface Geological Formations, Task 1: Heat Delivery Systems,” Nov. 20, 2002, pp. 1-166.
PCT “International Search Report and Written Opinion” for International Application No. PCT/US08/79702, mailed, Dec. 11, 2008; 11 pages.
PCT “International Search Report and Written Opinion” for International Application No. PCT/US08/79704, mailed, Dec. 12, 2008; 10 pages.
PCT “International Search Report and Written Opinion” for International Application No. PCT/US08/79705, mailed, Dec. 12, 2008; 9 pages.
PCT “International Search Report and Written Opinion” for International Application No. PCT/US08/79707, mailed, Dec. 15, 2008; 8 pages.
PCT “International Search Report and Written Opinion” for International Application No. PCT/US08/79709, mailed, Dec. 12, 2008; 7 pages.
PCT “International Search Report and Written Opinion” for International Application No. PCT/US08/60740, mailed , Aug. 19, 2008; 7 pages.
PCT “International Search Report and Written Opinion” for International Application No. PCT/US08/60743, mailed , Aug. 18, 2008; 7 pages.
PCT “International Search Report and Written Opinion” for International Application No. PCT/US08/60746, mailed,Jul. 18, 2008; 7 pages.
PCT “International Search Report and Written Opinion” for International Application No. PCT/US08/60748, mailed, Aug. 22, 2008; 7 pages.
PCT “International Search Report and Written Opinion” for International Application No. PCT/US08/60750, mailed , Aug. 18, 2008; 7 pages.
PCT “International Search Report and Written Opinion” for International Application No. PCT/US08/60754, mailed, Aug. 21, 2008; 7 pages.
PCT “International Search Report and Written Opinion” for International Application No. PCT/US08/60757, mailed, Aug. 22, 2008; 7 pages.
PCT “International Search Report and Written Opinion” for International Application No. PCT/US07/81910, mailed , Aug. 7, 2008; 8 pages.
PCT “International Search Report and Written Opinion” for International Application No. PCT/US07/81904, mailed , Jun. 3, 2008; 9 pages.
PCT “International Search Report and Written Opinion” for International Application No. PCT/US07/81901, mailed , Jun. 3, 2008; 9 pages.
PCT “International Search Report and Written Opinion” for International Application No. PCT/US07/81890, mailed , Sep. 2, 2008; 11 pages.
PCT “International Search Report and Written Opinion” for International Application No. PCT/US07/67062, mailed , May 15, 2008.
U.S. Patent and Trademark Office, “Office Communication,” for U.S. Appl. No. 11/112,881 mailed Oct. 1, 2008.
U.S. Patent and Trademark Office, “Office Communication,” for U.S. Appl. No. 11/113,353 mailed Jul. 25, 2008.
U.S. Patent and Trademark Office, “Office Communication,” for U.S. Appl. No. 11/409,565 mailed Dec. 2 2008.
U.S. Patent and Trademark Office, “Office Communication,” for U.S. Appl. No. 10/693,820 mailed May 28, 2009.
U.S. Patent and Trademark Office, “Office Communication,” for U.S. Appl. No. 10/693,700 mailed May 28, 2009.
U.S. Patent and Trademark Office, “Office Communication,” for U.S. Appl. No. 10/693,840 mailed May 28, 2009.
U.S. Patent and Trademark Office, “Office Communication,” for U.S. Appl. No. 11/112,881 mailed May 28, 2009.
U.S. Patent and Trademark Office, “Office Communication,” for U.S. Appl. No. 11/584,801 mailed Oct. 27, 2009.
U.S. Patent and Trademark Office, Office Communication for U.S. Appl. No. 11/409,558; mailed Mar. 9, 2010.
U.S. Patent and Trademark Office, Office Communication for U.S. Appl. No. 11/409,565; mailed Mar. 5, 2010.
U.S. Patent and Trademark Office, “Office Communication,” for U.S. Appl. No. 12/106,060 mailed Apr. 27, 2010.
U.S. Patent and Trademark Office, “Office Communication,” for U.S. Appl. No. 11/409,562 mailed May 14, 2010.
U.S. Patent and Trademark Office, Office Communication for U.S. Appl. No. 12/106,139; mailed Jul. 21, 2010.
U.S. Patent and Trademark Office, Office Communication for U.S. Appl. No. 11/409,558; mailed Aug. 18, 2010.
U.S. Patent and Trademark Office, “Office Communication,” for U.S. Appl. No. 11/409,565 mailed Oct. 14, 2010.
U.S. Patent and Trademark Office, Office Communication for U.S. Appl. No. 12/106,078; mailed Oct. 14, 2010.

U.S. Patent and Trademark Office, Office Communication for U.S. Appl. No. 11/409,558; mailed Oct. 18, 2010.
U.S. Patent and Trademark Office, “Office Communication,” for U.S. Appl. No. 11/409,565 mailed Dec. 8, 2010.
U.S. Patent and Trademark Office, Office Communication for U.S. Appl. No. 12/106,139; mailed Jan. 19, 2011.
U.S. Patent and Trademark Office, Office Communication for U.S. Appl. No. 12/106,078; mailed Mar. 30, 2011.
U.S. Patent and Trademark Office, Office Communication for U.S. Appl. No. 12/250,357; mailed Mar. 14, 2011.
Australian Patent and Trademark Office, Examiner’s First Report for Australian Patent Application No. 2007309735, mailed Dec. 9, 2010.
New Zealand Intellectual Property Office, “Examination Report” for New Zealand Application No. 581359, mailed Nov. 23, 2010.
U.S. Patent and Trademark Office“ BPAI Decision” for U.S. Appl. No. 10/693,816 mailed Aug. 22, 2011, 7 pages.
U.S. Patent and Trademark Office, “Office Communication,” for U.S. Appl. No. 11/409,565 mailed Oct. 13, 2011.
U.S. Patent and Trademark Office, Office Communication for U.S. Appl. No. 12/106,139; mailed Oct. 6, 2011.
U.S. Patent and Trademark Office, Office Communication for U.S. Appl. No. 12/576,772; mailed Oct. 13, 2011.
U.S. Patent and Trademark Office“BPAI Decision” for U.S. Appl. No. 10/693,816 mailed Aug. 22, 2011, 7 pages.
U.S. Patent and Trademark Office, “Office Communication,” for U.S. Appl. No. 11/409,565 mailed Oct. 13, 2011.
U.S. Patent and Trademark Office, Office Communication for U.S. Appl. No. 12/106,139; mailed Oct. 6, 2011.
U.S. Patent and Trademark Office, Office Communication for U.S. Appl. No. 12/576,772; mailed Oct. 13, 2011.
U.S. Patent and Trademark Office, Office Communication for U.S. Appl. No. 12/893,642; mailed Nov. 9, 2011.

* cited by examiner

FIG. 367A
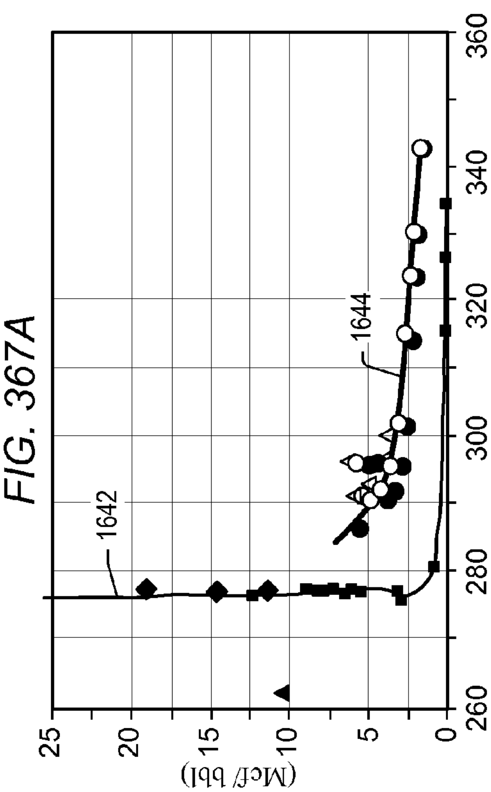
FIG. 367B
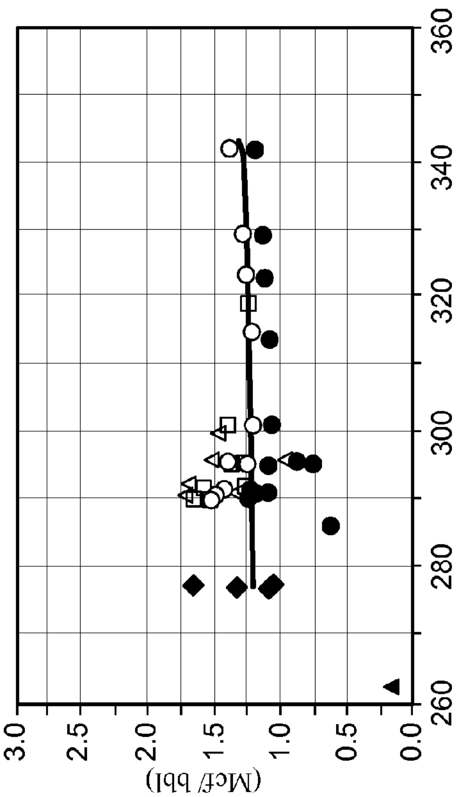
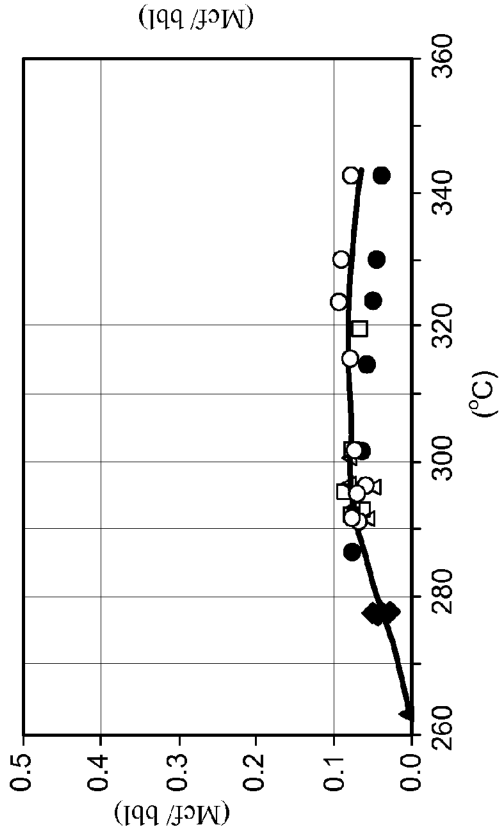
FIG. 367C
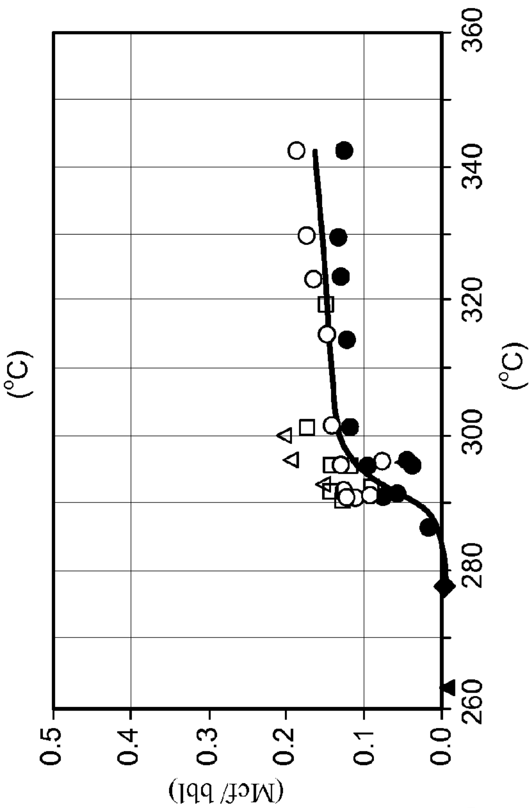
FIG. 367D

INDUCTION HEATERS USED TO HEAT SUBSURFACE FORMATIONS

PRIORITY CLAIM

This patent application claims priority to U.S. Provisional Patent No. 60/999,839 entitled "SYSTEMS AND PROCESSES FOR USE IN TREATING SUBSURFACE FORMATIONS" to Vinegar et al. filed on Oct. 19, 2007 and to U.S. Provisional Patent No. 61/046,329 entitled "METHODS, SYSTEMS AND PROCESSES FOR USE IN TREATING SUBSURFACE FORMATIONS" to Vinegar et al. filed on Apr. 18, 2008.

RELATED PATENTS

This patent application incorporates by reference in its entirety each of U.S. Pat. Nos. 6,688,387 to Wellington et al.; 6,991,036 to Sumnu-Dindoruk et al.; 6,698,515 to Karanikas et al.; 6,880,633 to Wellington et al.; 6,782,947 to de Rouffignac et al; 6,991,045 to Vinegar et al.; 7,073,578 to Vinegar et al.; 7,121,342 to Vinegar et al; and 7,320,364 to Fairbanks. This patent application incorporates by reference in its entirety each of U.S. Patent Application Publication 2007-0133960 to Vinegar et al., U.S. Patent Application Publication 2007-0221377 to Vinegar et al., U.S. Patent Application Publication 2008-0017380 to Vinegar et al, and U.S. Patent Application Publication 2008-0217015 to Vinegar et al. This patent application incorporates by reference in its entirety U.S. patent application Ser. No. 12/106,035 to Vinegar et al.

GOVERNMENT INTEREST

The Government has certain rights in the invention pursuant to Agreement Nos. SD 10634 and NFE 062050824 between Sandia National Laboratories (operating under Agreement DE-AC04-94AL85000Sa for the U.S. Department of Energy) and Shell Exploration and Production Company.

BACKGROUND

1. Field of the Invention

The present invention relates generally to methods and systems for production of hydrocarbons, hydrogen, and/or other products from various subsurface formations such as hydrocarbon containing formations.

2. Description of Related Art

Hydrocarbons obtained from subterranean formations are often used as energy resources, as feedstocks, and as consumer products. Concerns over depletion of available hydrocarbon resources and concerns over declining overall quality of produced hydrocarbons have led to development of processes for more efficient recovery, processing and/or use of available hydrocarbon resources. In situ processes may be used to remove hydrocarbon materials from subterranean formations. Chemical and/or physical properties of hydrocarbon material in a subterranean formation may need to be changed to allow hydrocarbon material to be more easily removed from the subterranean formation. The chemical and physical changes may include in situ reactions that produce removable fluids, composition changes, solubility changes, density changes, phase changes, and/or viscosity changes of the hydrocarbon material in the formation. A fluid may be, but is not limited to, a gas, a liquid, an emulsion, a slurry, and/or a stream of solid particles that has flow characteristics similar to liquid flow.

During some in situ processes, wax may be used to reduce vapors and/or to encapsulate contaminants in the ground. Wax may be used during remediation of wastes to encapsulate contaminated material. U.S. Pat. Nos. 7,114,880 to Carter, and 5,879,110 to Carter, each of which is incorporated herein by reference, describe methods for treatment of contaminants using wax during the remediation procedures.

In some embodiments, a casing or other pipe system may be placed or formed in a wellbore. U.S. Pat. No. 4,572,299 issued to Van Egmond et al., which is incorporated by reference as if fully set forth herein, describes spooling an electric heater into a well. In some embodiments, components of a piping system may be welded together. Quality of formed wells may be monitored by various techniques. In some embodiments, quality of welds may be inspected by a hybrid electromagnetic acoustic transmission technique known as EMAT. EMAT is described in U.S. Pat. Nos. 5,652,389 to Schaps et al.; 5,760,307 to Latimer et al.; 5,777,229 to Geier et al.; and 6,155,117 to Stevens et al., each of which is incorporated by reference as if fully set forth herein.

In some embodiments, an expandable tubular may be used in a wellbore. Expandable tubulars are described in U.S. Pat. Nos. 5,366,012 to Lohbeck, and 6,354,373 to Vercaemer et al., each of which is incorporated by reference as if fully set forth herein.

Heaters may be placed in wellbores to heat a formation during an in situ process. Examples of in situ processes utilizing downhole heaters are illustrated in U.S. Pat. Nos. 2,634,961 to Ljungstrom; 2,732,195 to Ljungstrom; 2,780,450 to Ljungstrom; 2,789,805 to Ljungstrom; 2,923,535 to Ljungstrom; and 4,886,118 to Van Meurs et al.; each of which is incorporated by reference as if fully set forth herein.

Application of heat to oil shale formations is described in U.S. Pat. Nos. 2,923,535 to Ljungstrom and 4,886,118 to Van Meurs et al. Heat may be applied to the oil shale formation to pyrolyze kerogen in the oil shale formation. The heat may also fracture the formation to increase permeability of the formation. The increased permeability may allow formation fluid to travel to a production well where the fluid is removed from the oil shale formation. In some processes disclosed by Ljungstrom, for example, an oxygen containing gaseous medium is introduced to a permeable stratum, preferably while still hot from a preheating step, to initiate combustion.

A heat source may be used to heat a subterranean formation. Electric heaters may be used to heat the subterranean formation by radiation and/or conduction. An electric heater may resistively heat an element. U.S. Pat. No. 2,548,360 to Germain, which is incorporated by reference as if fully set forth herein, describes an electric heating element placed in a viscous oil in a wellbore. The heater element heats and thins the oil to allow the oil to be pumped from the wellbore. U.S. Pat. No. 4,716,960 to Eastlund et al., which is incorporated by reference as if fully set forth herein, describes electrically heating tubing of a petroleum well by passing a relatively low voltage current through the tubing to prevent formation of solids. U.S. Pat. No. 5,065,818 to Van Egmond, which is incorporated by reference as if fully set forth herein, describes an electric heating element that is cemented into a well borehole without a casing surrounding the heating element.

U.S. Pat. No. 6,023,554 to Vinegar et al., which is incorporated by reference as if fully set forth herein, describes an electric heating element that is positioned in a casing. The heating element generates radiant energy that heats the casing. A granular solid fill material may be placed between the casing and the formation. The casing may conductively heat the fill material, which in turn conductively heats the formation.

U.S. Pat. No. 4,570,715 to Van Meurs et al., which is incorporated by reference as if fully set forth herein, describes an electric heating element. The heating element has an electrically conductive core, a surrounding layer of insulating material, and a surrounding metallic sheath. The conductive core may have a relatively low resistance at high temperatures. The insulating material may have electrical resistance, compressive strength, and heat conductivity properties that are relatively high at high temperatures. The insulating layer may inhibit arcing from the core to the metallic sheath. The metallic sheath may have tensile strength and creep resistance properties that are relatively high at high temperatures.

U.S. Pat. No. 5,060,287 to Van Egmond, which is incorporated by reference as if fully set forth herein, describes an electrical heating element having a copper-nickel alloy core.

Obtaining permeability in an oil shale formation between injection and production wells tends to be difficult because oil shale is often substantially impermeable. Many methods have attempted to link injection and production wells. These methods include: hydraulic fracturing such as methods investigated by Dow Chemical and Laramie Energy Research Center; electrical fracturing by methods investigated by Laramie Energy Research Center; acid leaching of limestone cavities by methods investigated by Dow Chemical; steam injection into permeable nahcolite zones to dissolve the nahcolite by methods investigated by Shell Oil and Equity Oil; fracturing with chemical explosives by methods investigated by Talley Energy Systems; fracturing with nuclear explosives by methods investigated by Project Bronco; and combinations of these methods. Many of these methods, however, have relatively high operating costs and lack sufficient injection capacity.

Large deposits of heavy hydrocarbons (heavy oil and/or tar) contained in relatively permeable formations (for example in tar sands) are found in North America, South America, Africa, and Asia. Tar can be surface-mined and upgraded to lighter hydrocarbons such as crude oil, naphtha, kerosene, and/or gas oil. Surface milling processes may further separate the bitumen from sand. The separated bitumen may be converted to light hydrocarbons using conventional refinery methods. Mining and upgrading tar sand is usually substantially more expensive than producing lighter hydrocarbons from conventional oil reservoirs.

In situ production of hydrocarbons from tar sand may be accomplished by heating and/or injecting a gas into the formation. U.S. Pat. Nos. 5,211,230 to Ostapovich et al. and 5,339,897 to Leaute, which are incorporated by reference as if fully set forth herein, describe a horizontal production well located in an oil-bearing reservoir. A vertical conduit may be used to inject an oxidant gas into the reservoir for in situ combustion.

U.S. Pat. No. 2,780,450 to Ljungstrom describes heating bituminous geological formations in situ to convert or crack a liquid tar-like substance into oils and gases.

U.S. Pat. No. 4,597,441 to Ware et al., which is incorporated by reference as if fully set forth herein, describes contacting oil, heat, and hydrogen simultaneously in a reservoir. Hydrogenation may enhance recovery of oil from the reservoir.

U.S. Pat. Nos. 5,046,559 to Glandt and 5,060,726 to Glandt et al., which are incorporated by reference as if fully set forth herein, describe preheating a portion of a tar sand formation between an injector well and a producer well. Steam may be injected from the injector well into the formation to produce hydrocarbons at the producer well.

As outlined above, there has been a significant amount of effort to develop methods and systems to economically produce hydrocarbons, hydrogen, and/or other products from hydrocarbon containing formations. At present, however, there are still many hydrocarbon containing formations from which hydrocarbons, hydrogen, and/or other products cannot be economically produced. Thus, there is still a need for improved methods and systems for production of hydrocarbons, hydrogen, and/or other products from various hydrocarbon containing formations.

SUMMARY

Embodiments described herein generally relate to systems, methods, and heaters for treating a subsurface formation. Embodiments described herein also generally relate to heaters that have novel components therein. Such heaters can be obtained by using the systems and methods described herein.

In certain embodiments, the invention provides one or more systems, methods, and/or heaters. In some embodiments, the systems, methods, and/or heaters are used for treating a subsurface formation.

In certain embodiments, a heating system for a subsurface formation includes an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor; wherein the electrical conductor, when energized with time-varying electrical current, induces sufficient electrical current flow in the ferromagnetic conductor such that the ferromagnetic conductor resistively heats to a temperature of at least about 300° C.

In certain embodiments, a heating system for a subsurface formation includes an elongated electrical conductor located in the subsurface formation, wherein the electrical conductor extends between at least a first electrical contact and a second electrical contact; and a ferromagnetic conductor, wherein the ferromagnetic conductor and the electrical conductor are configured in relation to each other such that electrical current does not flow from the electrical conductor to the ferromagnetic conductor, or vice versa, and wherein the ferromagnetic conductor at least partially surrounds and at least partially extends lengthwise around the electrical conductor; wherein the electrical conductor, when energized with time-varying electrical current, induces sufficient electrical current flow in the ferromagnetic conductor such that the ferromagnetic conductor resistively heats.

In certain embodiments, a heating system for a subsurface formation includes an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor; wherein the electrical conductor, when energized with time-varying electrical current, induces electrical current flow on the inside and outside surfaces of the ferromagnetic conductor such that the ferromagnetic conductor resistively heats.

In certain embodiments, a heating system for a subsurface formation includes an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor; wherein the electrical conductor, when energized with time-varying electrical current, induces sufficient electrical current flow in the ferromagnetic conductor such that the ferromagnetic conductor resistively heats; and wherein the ferromagnetic conductor is configured to have little or no induced current flow at temperatures at and above a selected temperature.

In certain embodiments, a system for heating a hydrocarbon containing formation includes a first elongated electrical conductor located in the subsurface formation, wherein the first electrical conductor extends between at least two electrical contacts; and a first ferromagnetic conductor, wherein the first ferromagnetic conductor at least partially surrounds and at least partially extends lengthwise around the first electrical conductor; wherein the first electrical conductor, when energized with time-varying electrical current, induces sufficient electrical current flow in the first ferromagnetic conductor such that the first ferromagnetic conductor resistively heats; a second elongated electrical conductor located in the subsurface formation, wherein the second electrical conductor extends between at least two electrical contacts; and a second ferromagnetic conductor, wherein the second ferromagnetic conductor at least partially surrounds and at least partially extends lengthwise around the second electrical conductor; wherein the second electrical conductor, when energized with time-varying electrical current, induces sufficient electrical current flow in the second ferromagnetic conductor such that the second ferromagnetic conductor resistively heats; and wherein the first and second ferromagnetic conductors are configured to provide heat to the formation such that heat from the ferromagnetic conductors is superpositioned in the formation.

In certain embodiments, a method for heating a hydrocarbon containing formation includes providing time-varying electrical current to an elongated electrical conductor located in the formation; inducing electrical current flow in a ferromagnetic conductor with the time-varying electrical current in the electrical conductor, wherein the ferromagnetic conductor at least partially surrounds and at least partially extends lengthwise around the electrical conductor; resistively heating the ferromagnetic conductor with the induced electrical current flow such that the ferromagnetic conductor resistively heats; allowing heat to transfer from the ferromagnetic conductor to at least a part of the formation; and mobilizing at least some hydrocarbons in the part of the formation.

In certain embodiments, a heating system for a subsurface formation includes a first wellbore extending into the subsurface formation; a second wellbore extending into the subsurface formation; and three or more heaters extending between the first wellbore and the second wellbore, at least one heater comprising: an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor; wherein the electrical conductor, when energized with time-varying electrical current, induces sufficient electrical current flow in the ferromagnetic conductor such that the ferromagnetic conductor resistively heats to a temperature of at least about 300° C.

In certain embodiments, a heating system for a subsurface formation includes a first wellbore extending into the subsurface formation; a second wellbore extending into the subsurface formation; a third wellbore extending into the subsurface formation; a first heater located in the first wellbore, a second heater located in the second wellbore, and a third heater located in the third wellbore, at least one heater comprising: an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor; wherein the electrical conductor, when energized with time-varying electrical current, induces sufficient electrical current flow in the ferromagnetic conductor such that the ferromagnetic conductor resistively heats to a temperature of at least about 300° C.

In certain embodiments, a heating system for a subsurface formation includes an elongated electrical conductor located in the subsurface formation, wherein the electrical conductor extends between at least a first electrical contact and a second electrical contact; an insulation layer at least partially surrounding the electrical conductor; and a ferromagnetic sheath at least partially surrounding the insulation layer, the ferromagnetic sheath and the electrical conductor being configured in relation to each other such that electrical current does not flow from the electrical conductor to the ferromagnetic sheath, or vice versa; wherein the electrical conductor, when energized with time-varying electrical current, induces sufficient electrical current flow in the ferromagnetic sheath such that the ferromagnetic sheath resistively heats.

In certain embodiments, a heating system for a subsurface formation includes a first electrical conductor located in the subsurface formation, wherein the first electrical conductor extends between at least a first electrical contact and a second electrical contact; a first insulation layer at least partially surrounding the first electrical conductor; a first ferromagnetic sheath at least partially surrounding the first insulation layer, the first ferromagnetic sheath and the first electrical conductor being configured in relation to each other such that electrical current does not flow from the first electrical conductor to the first ferromagnetic sheath, or vice versa; a second electrical conductor located in the subsurface formation, wherein the first electrical conductor extends between at least the first electrical contact and the second electrical contact; a second insulation layer at least partially surrounding the second electrical conductor; a second ferromagnetic sheath at least partially surrounding the second insulation layer, the second ferromagnetic sheath and the second electrical conductor being configured in relation to each other such that electrical current does not flow from the second electrical conductor to the second ferromagnetic sheath, or vice versa; and a third insulation layer located between the first ferromagnetic sheath and the second ferromagnetic sheath; wherein the first and second electrical conductors, when energized with time-varying electrical current, induce sufficient electrical current flow in the first and second ferromagnetic sheaths, respectively, such that the ferromagnetic sheaths resistively heat.

In certain embodiments, a heating system for a subsurface formation includes an electrical conductor extending into the subsurface formation; and a ferromagnetic conductor at least partially surrounding the electrical conductor in at least a portion of an overburden section of the formation, wherein the ferromagnetic conductor and the electrical conductor are configured in relation to each other such that electrical current does not flow from the electrical conductor to the ferromagnetic conductor, or vice versa, and wherein the ferromagnetic conductor comprises a plurality of straight, angled, or longitudinally spiral grooves or protrusions that increase the effective circumference of the ferromagnetic conduit; wherein the straight, angled, or longitudinally spiral grooves or protrusions are configured to inhibit or reduce induction resistance heating in the ferromagnetic conductor.

In certain embodiments, a heating system for a subsurface formation includes a ferromagnetic conductor extending into the subsurface formation, wherein the ferromagnetic conductor is configured to resistively heat when electrical current is applied to, or induced in, the ferromagnetic conductor; and a plurality of straight, angled, or spiral grooves or protrusions located on at least one surface of the ferromagnetic conductor, wherein the grooves or protrusions increase the effective resistance of the ferromagnetic conduit.

In further embodiments, features from specific embodiments may be combined with features from other embodiments. For example, features from one embodiment may be combined with features from any of the other embodiments.

In further embodiments, treating a subsurface formation is performed using any of the methods, systems, or heaters described herein.

In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings in which:

FIG. 124 depicts a representational top view of an embodiment of a surface pattern of heaters depicted in FIG. 123.

FIG. 125 depicts a cross-sectional representation of substantially u-shaped heaters in a hydrocarbon layer.

FIG. 126 depicts a side view representation of an embodiment of substantially vertical heaters coupled to a substantially horizontal wellbore.

FIG. 127 depicts an embodiment of pluralities of substantially horizontal heaters coupled to bus bars in a hydrocarbon layer.

FIG. 128 depicts an embodiment of pluralities of substantially horizontal heaters coupled to bus bars in a hydrocarbon layer.

FIG. 129 depicts an embodiment of a bus bar coupled to heaters with connectors.

FIG. 130 depicts an embodiment of a bus bar coupled to heaters with connectors and centralizers.

FIG. 131 depicts a representation of a connector coupling to a bus bar.

FIG. 132 depicts a perspective representation of a connector coupling to a bus bar.

FIG. 133 depicts an embodiment of three u-shaped heaters with common overburden sections coupled to a single three-phase transformer.

FIG. 134 depicts a top view representation of an embodiment of a heater and a drilling guide in a wellbore.

FIG. 135 depicts a top view representation of an embodiment of two heaters and a drilling guide in a wellbore.

Figure 136:
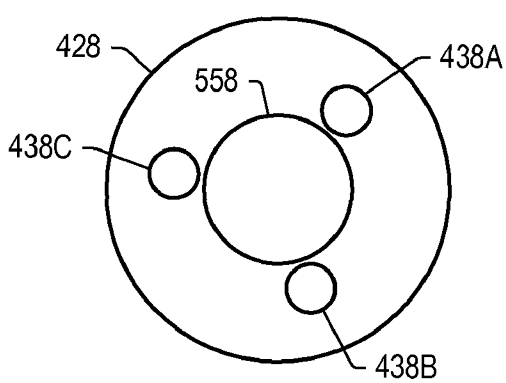

FIG. 136 depicts a top view representation of an embodiment of three heaters and a centralizer in a wellbore.

Figure 137:
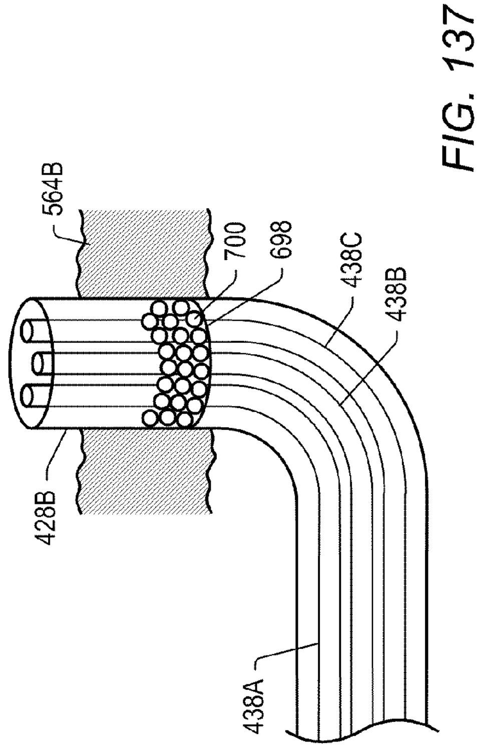

FIG. 137 depicts an embodiment for coupling ends of heaters in a wellbore.

Figure 138:
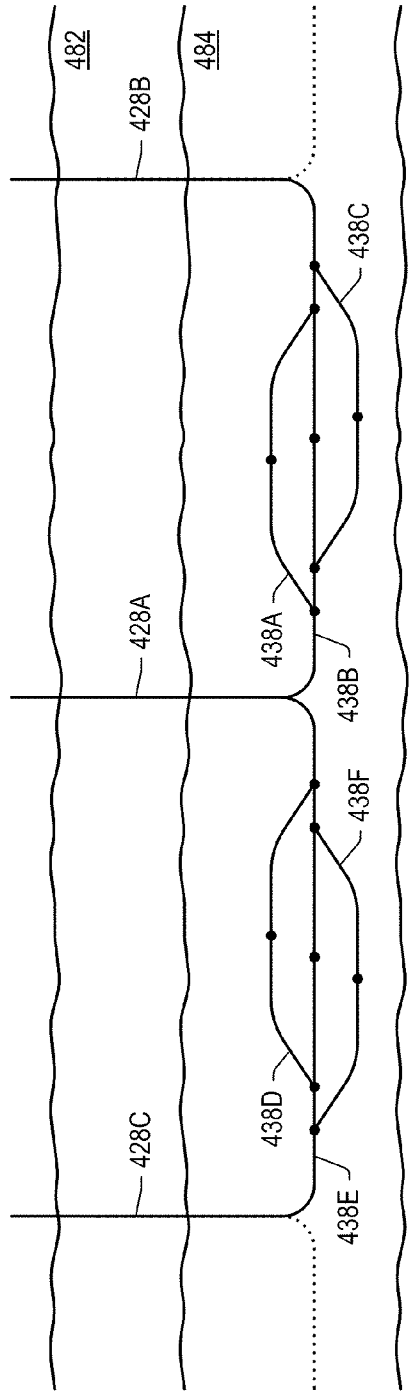

FIG. 138 depicts a schematic of an embodiment of multiple heaters extending in different directions from a wellbore.

Figure 139:
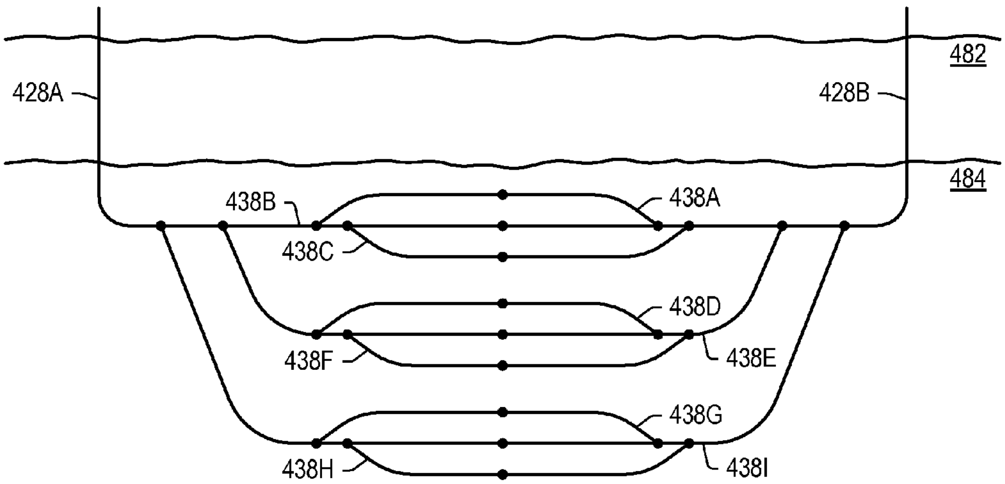

FIG. 139 depicts a schematic of an embodiment of multiple levels of heaters extending between two wellbores.

Figure 140:
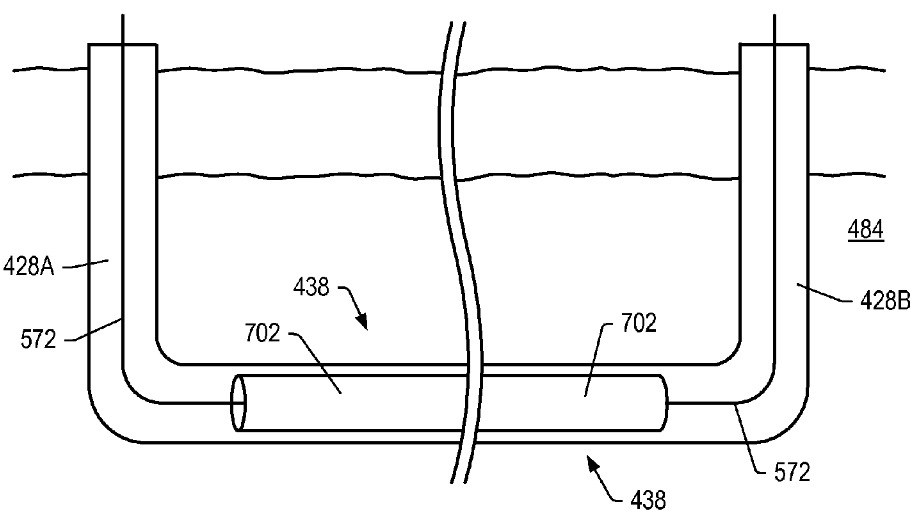

FIG. 140 depicts an embodiment of a u-shaped heater that has an inductively energized tubular.

Figure 141:
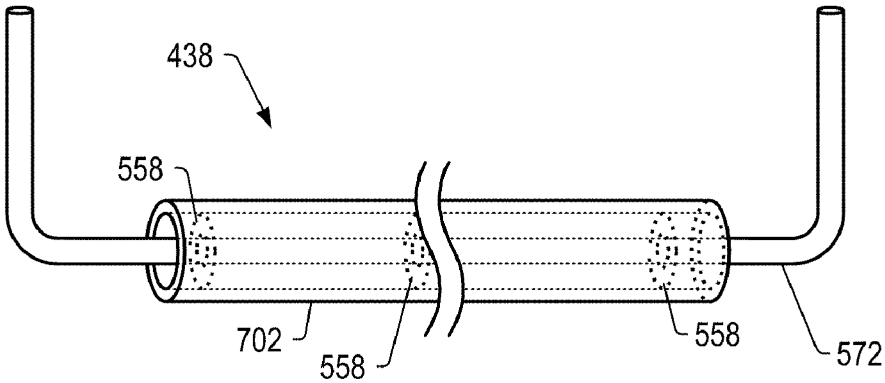

FIG. 141 depicts an embodiment of an electrical conductor centralized inside a tubular.

Figure 142:
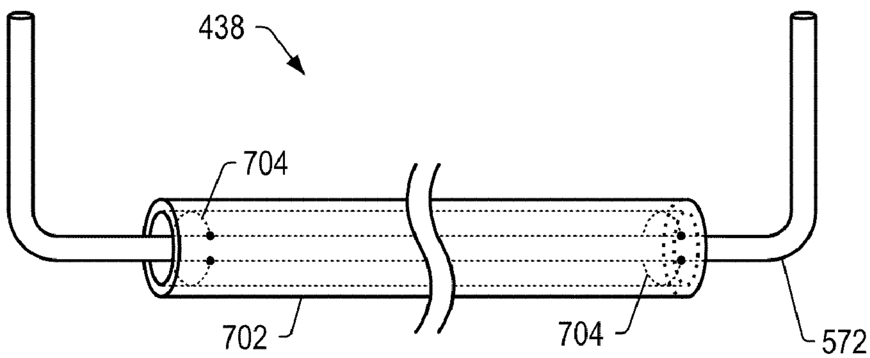

FIG. 142 depicts an embodiment of an induction heater with a sheath of an insulated conductor in electrical contact with a tubular.

Figure 143:
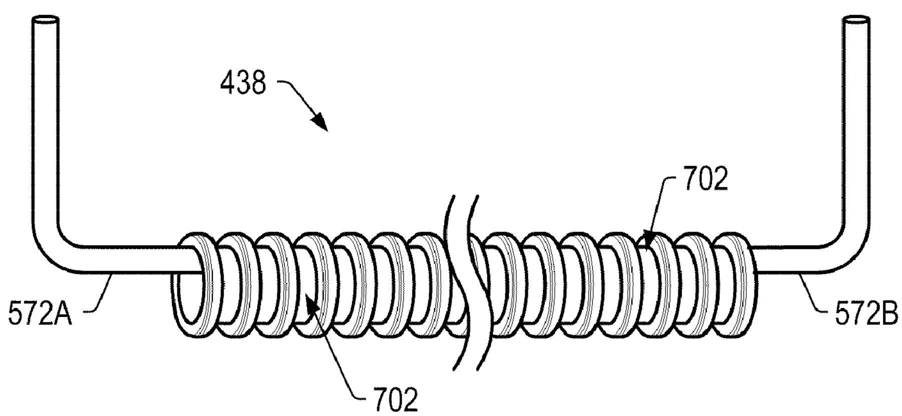

FIG. 143 depicts an embodiment of a resistive heater with a tubular having radial grooved surfaces.

Figure 144:
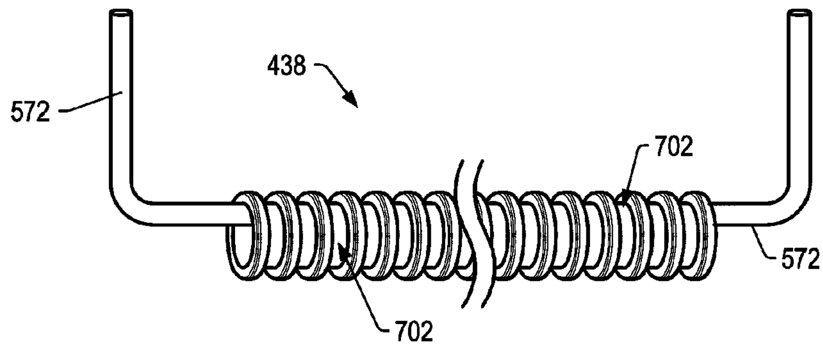

FIG. 144 depicts an embodiment of an induction heater with a tubular having radial grooved surfaces.

Figure 145:
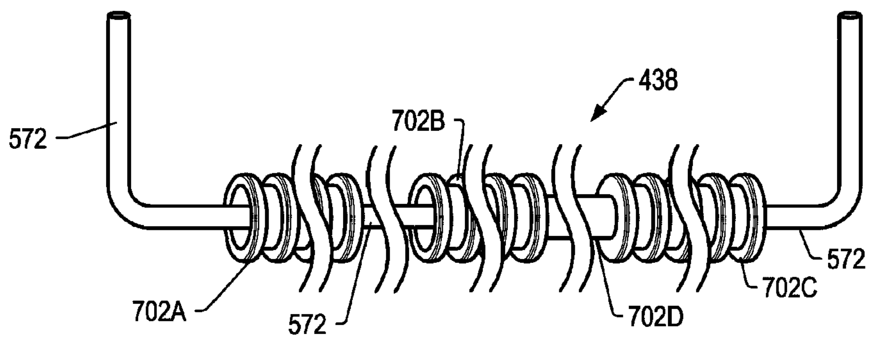

FIG. 145 depicts an embodiment of a heater divided into tubular sections to provide varying heat outputs along the length of the heater.

Figure 146:
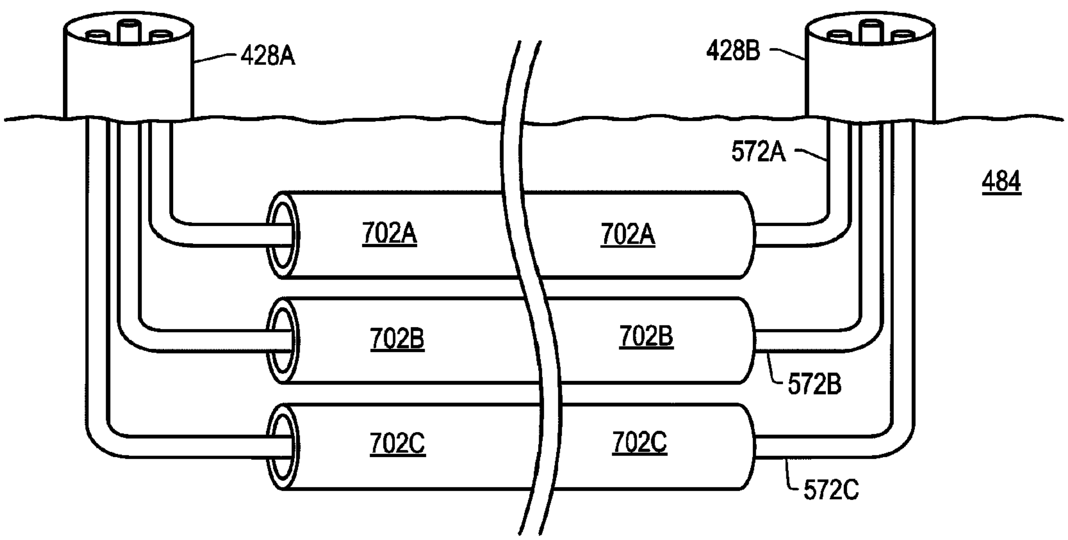

FIG. 146 depicts an embodiment of three electrical conductors entering the formation through a first common wellbore and exiting the formation through a second common wellbore with three tubulars surrounding the electrical conductors in the hydrocarbon layer.

Figure 147:
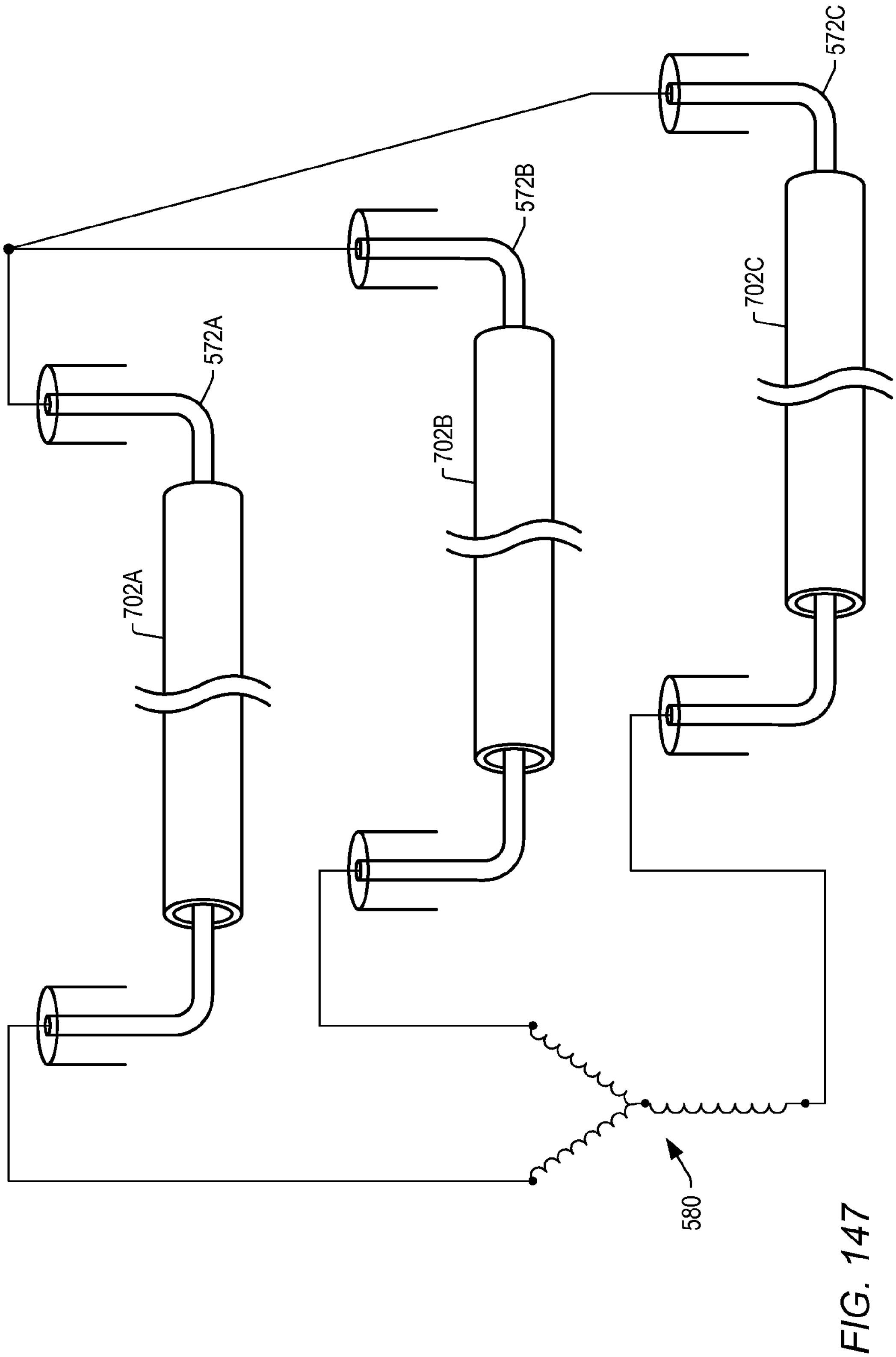

FIG. 147 depicts a representation of an embodiment of three electrical conductors and three tubulars in separate wellbores in the formation coupled to a transformer.

Figure 148:
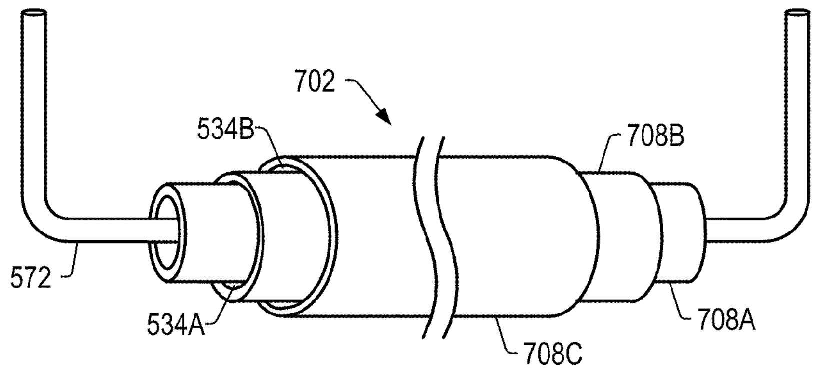

FIG. 148 depicts an embodiment of a multilayer induction tubular.

Figure 149:
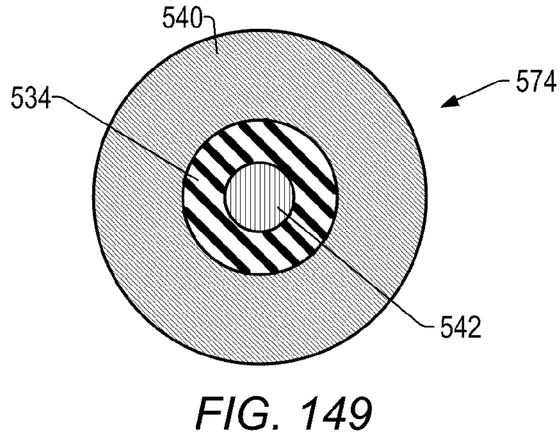

FIG. 149 depicts a cross-sectional end view of an embodiment of an insulated conductor that is used as an induction heater.

Figure 150:
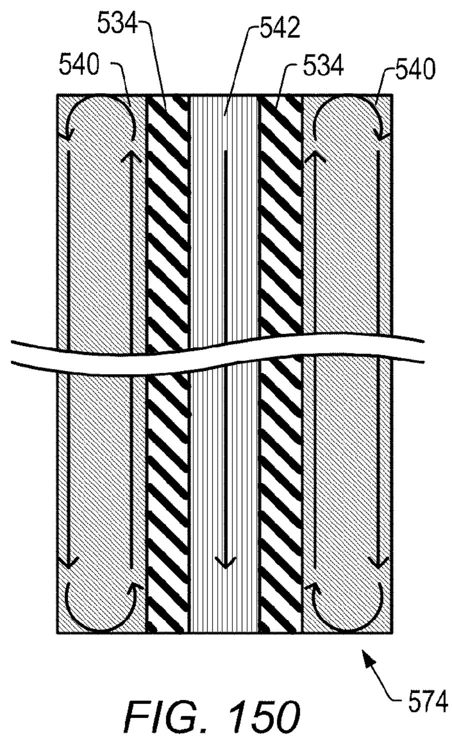

FIG. 150 depicts a cross-sectional side view of the embodiment depicted in FIG. 149.

Figure 151:
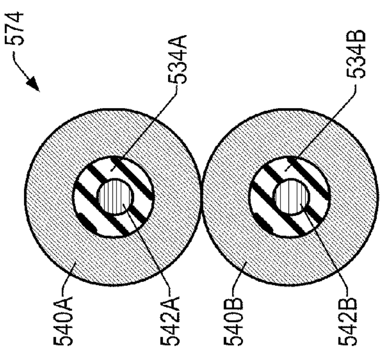

FIG. 151 depicts a cross-sectional end view of an embodiment of a two-leg insulated conductor that is used as an induction heater.

Figure 152:
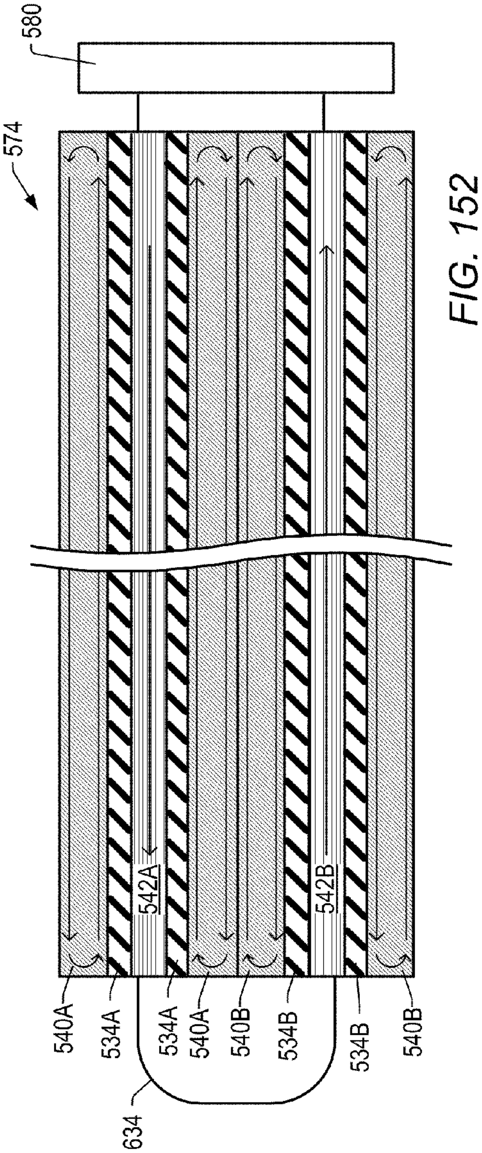

FIG. 152 depicts a cross-sectional side view of the embodiment depicted in FIG. 151.

Figure 153:
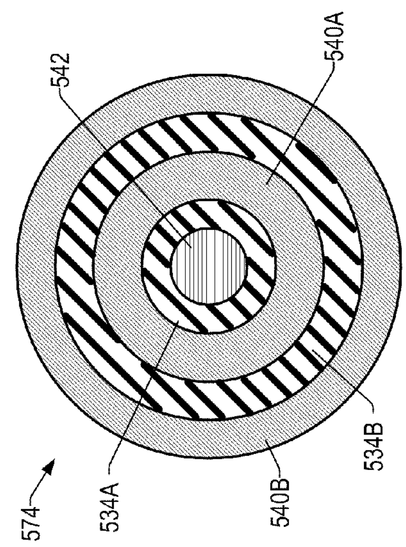

FIG. 153 depicts a cross-sectional end view of an embodiment of a multilayered insulated conductor that is used as an induction heater.

Figure 154:
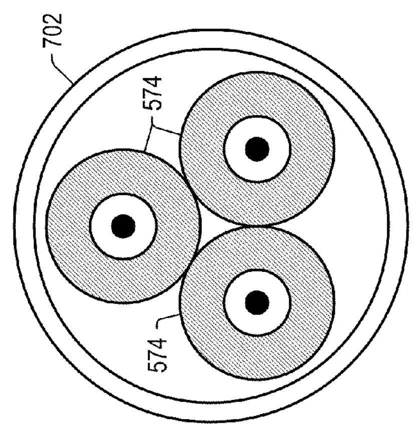

FIG. 154 depicts an end view representation of an embodiment of three insulated conductors located in a coiled tubing conduit and used as induction heaters.

Figure 155:
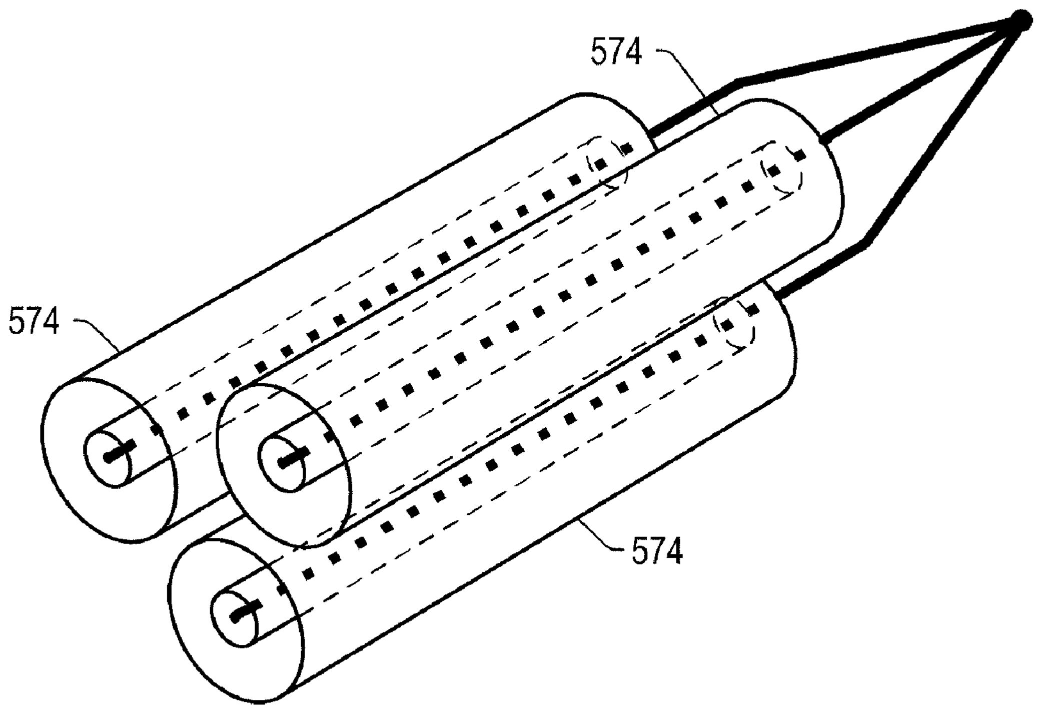

FIG. 155 depicts a representation of cores of insulated conductors coupled together at their ends.

Figure 156:
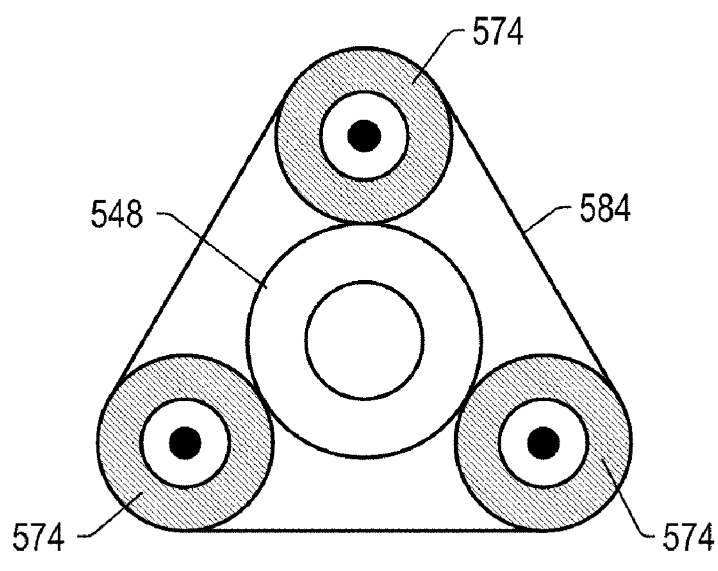

FIG. 156 depicts an end view representation of an embodiment of three insulated conductors strapped to a support member and used as induction heaters.

Figure 157:
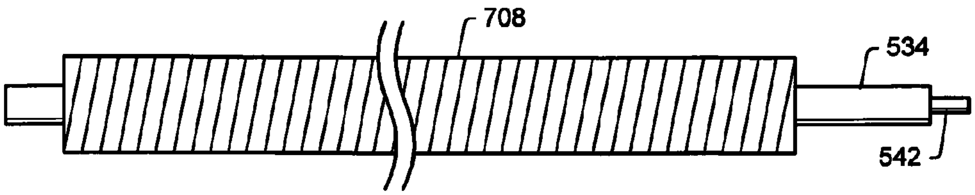

FIG. 157 depicts a representation of an embodiment of an induction heater with a core and an electrical insulator surrounded by a ferromagnetic layer.

Figure 158:
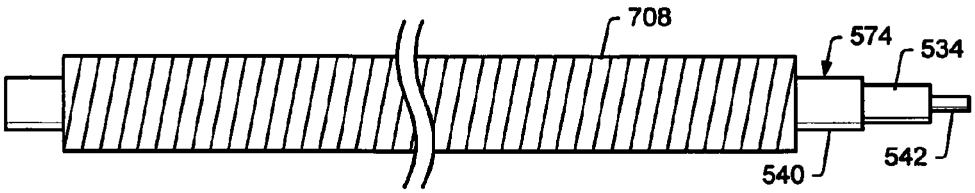

FIG. 158 depicts a representation of an embodiment of an insulated conductor surrounded by a ferromagnetic layer.

Figure 159:
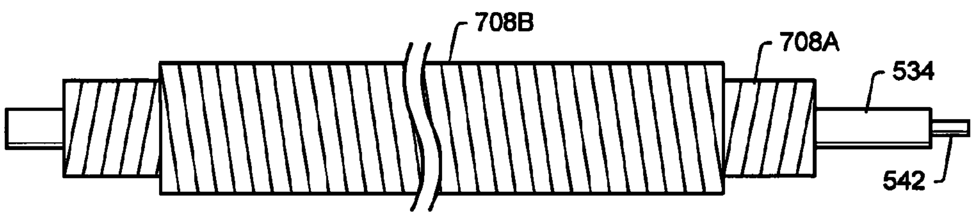

FIG. 159 depicts a representation of an embodiment of an induction heater with two ferromagnetic layers spirally wound onto a core and an electrical insulator.

Figure 160:
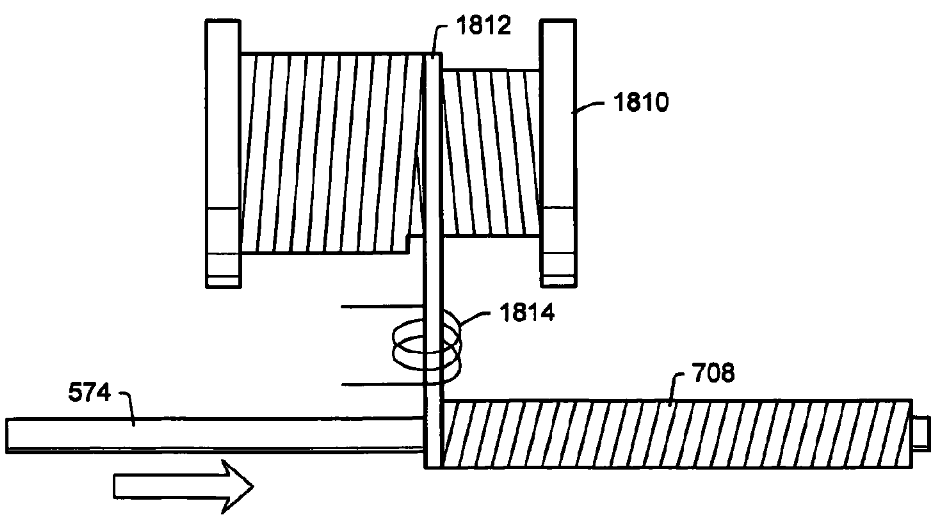

FIG. 160 depicts an embodiment for assembling a ferromagnetic layer onto an insulated conductor.

Figure 161:
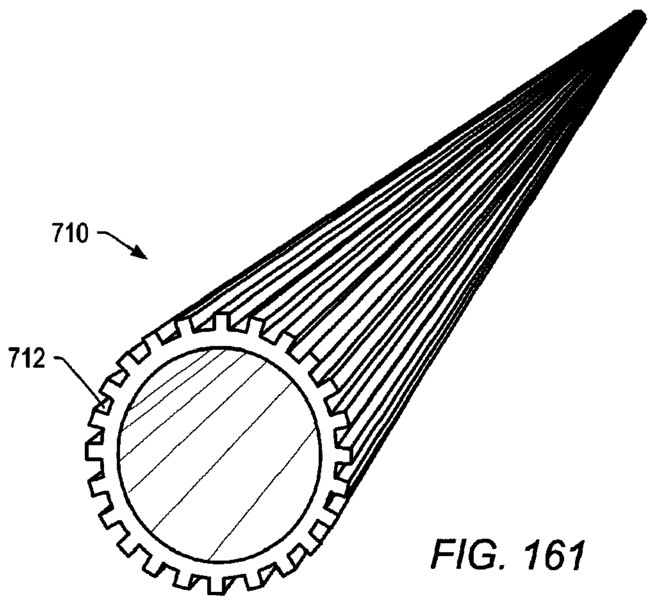

FIG. 161 depicts an embodiment of a casing having an axial grooved or corrugated surface.

Figure 162:
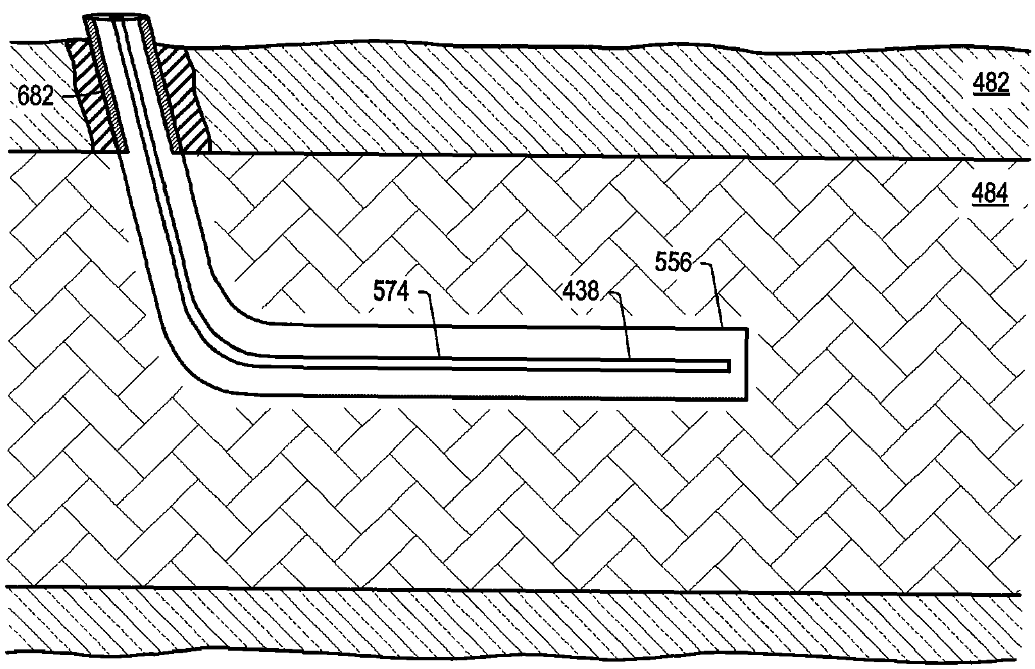

FIG. 162 depicts an embodiment of a single-ended, substantially horizontal insulated conductor heater that electrically isolates itself from the formation.

Figure 163A:
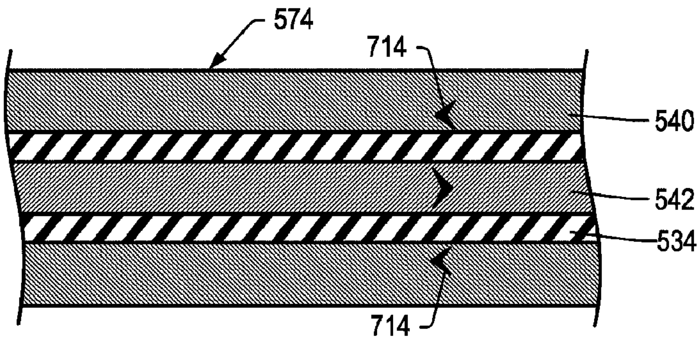
Figure 163B:
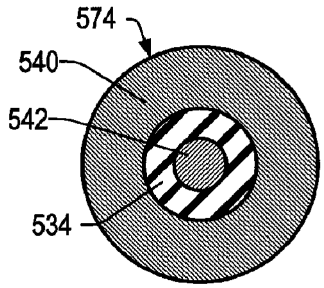

FIGS. 163A and 163B depict cross-sectional representations of an embodiment of an insulated conductor that is electrically isolated on the outside of the jacket.

Figure 164:
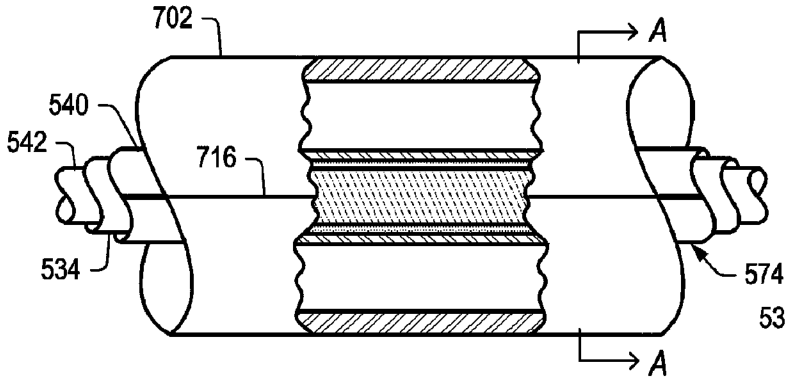

FIG. 164 depicts a side view representation with a cut out portion of an embodiment of an insulated conductor inside a tubular.

Figure 165:
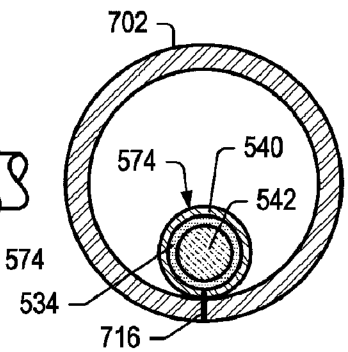

FIG. 165 depicts a cross-sectional representation of an embodiment of an insulated conductor inside a tubular taken substantially along line A-A of FIG. 164.

Figure 166:
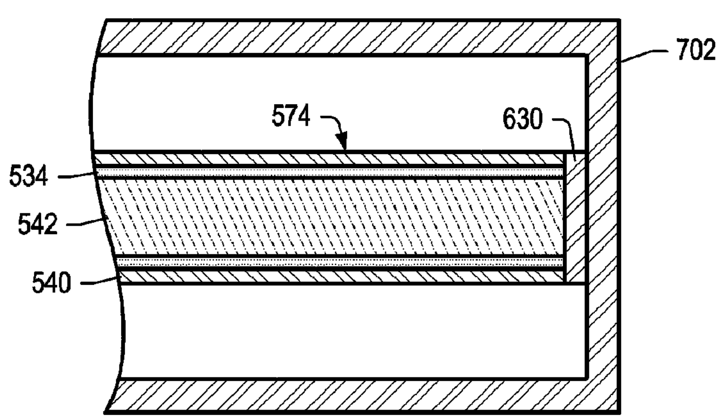

FIG. 166 depicts a cross-sectional representation of an embodiment of a distal end of an insulated conductor inside a tubular.

Figure 167:
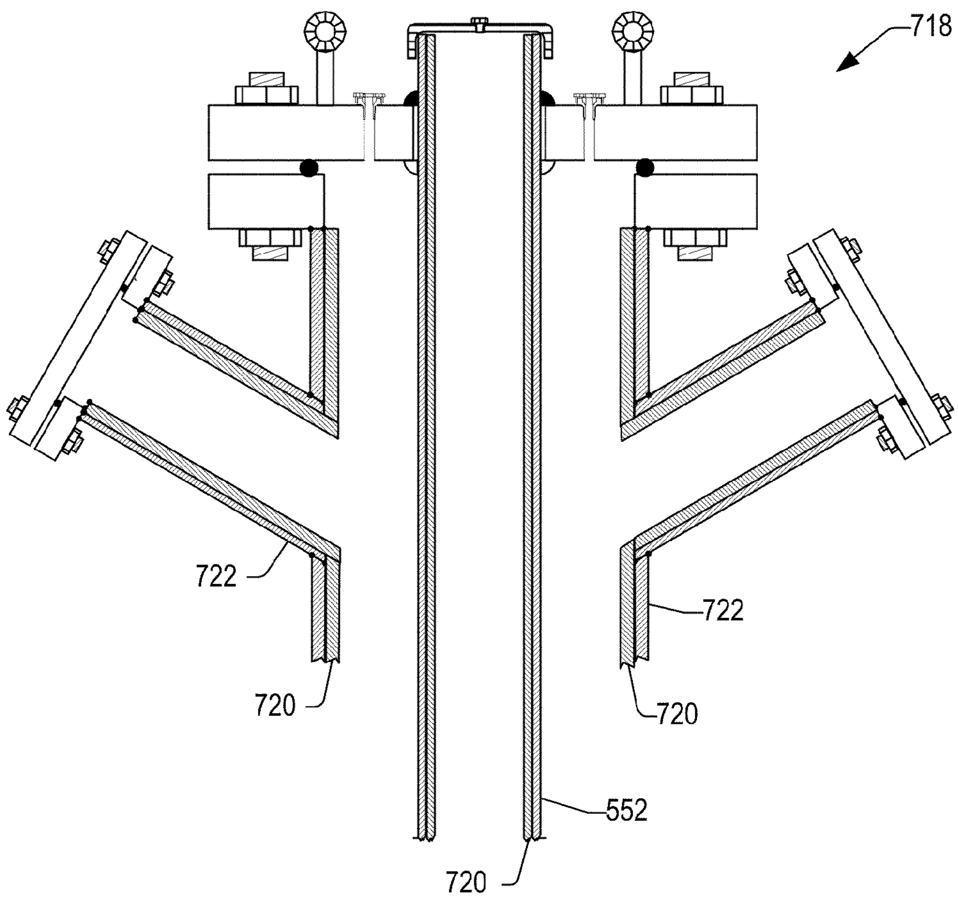

FIG. 167 depicts an embodiment of a wellhead.

Figure 168:
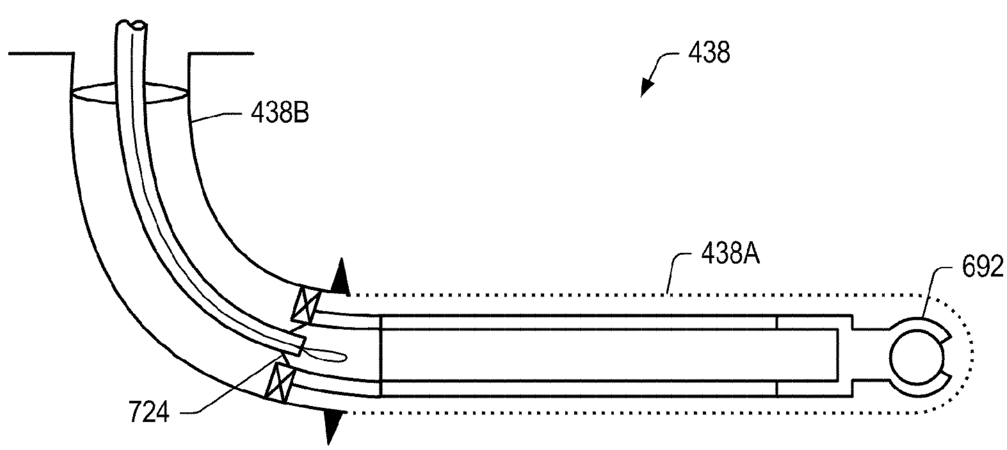

FIG. 168 depicts an embodiment of a heater that has been installed in two parts.

Figure 169:
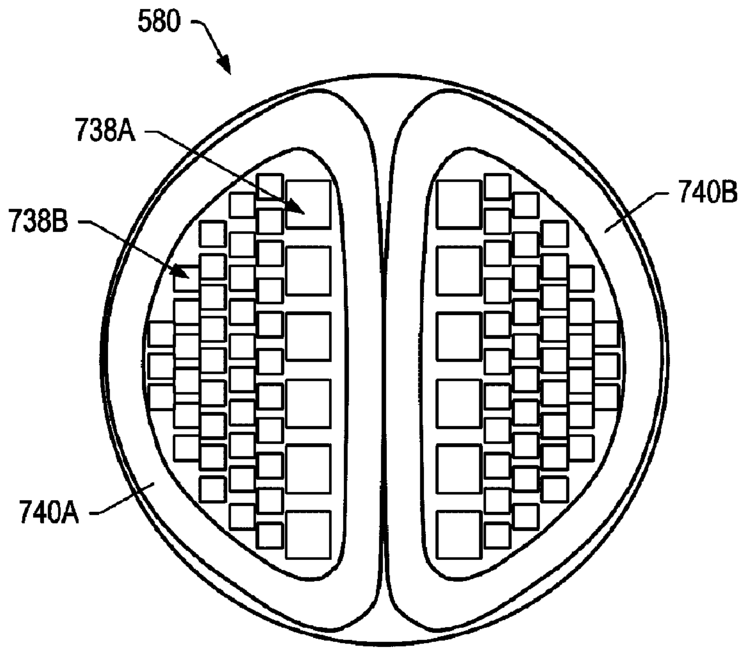

FIG. 169 depicts a top view representation of an embodiment of a transformer showing the windings and core of the transformer.

Figure 170:
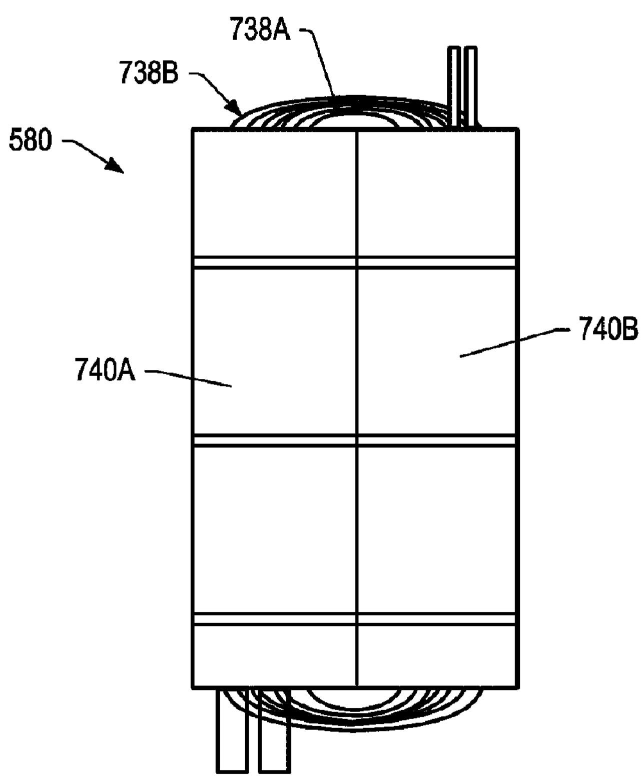

FIG. 170 depicts a side view representation of the embodiment of the transformer showing the windings, the core, and the power leads.

Figure 171:
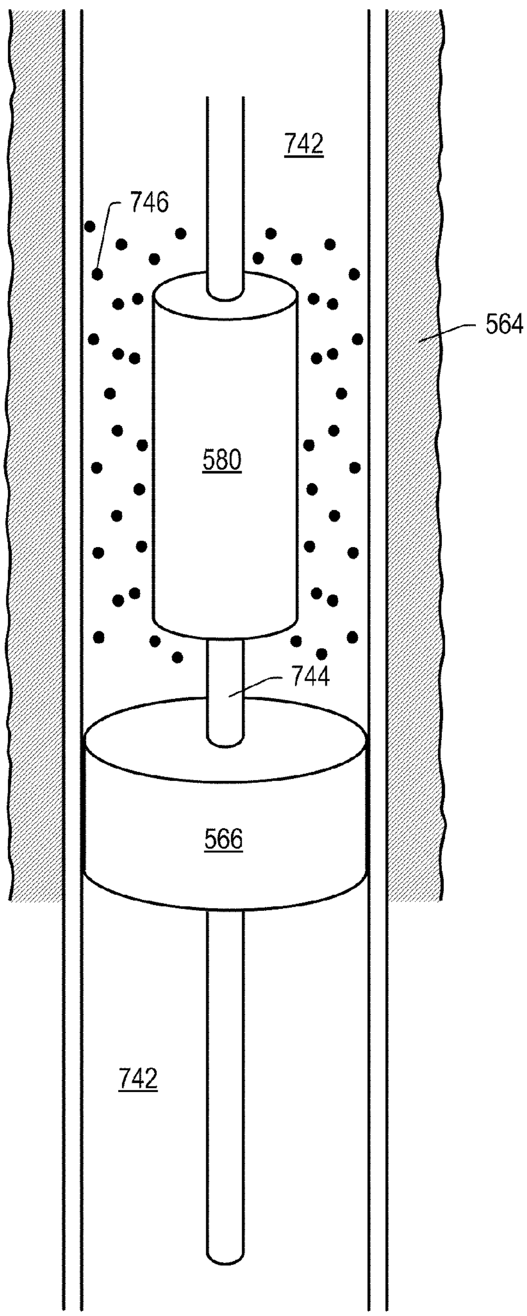

FIG. 171 depicts an embodiment of a transformer in a wellbore.

Figure 172:
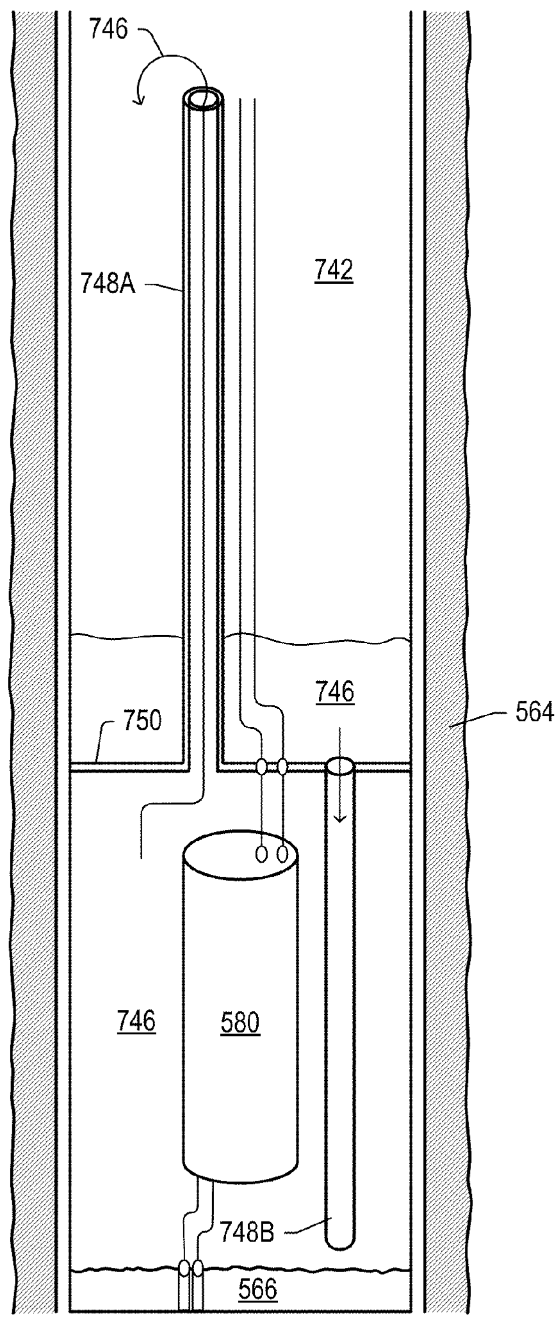

FIG. 172 depicts an embodiment of a transformer in a wellbore with heat pipes.

Figure 173:
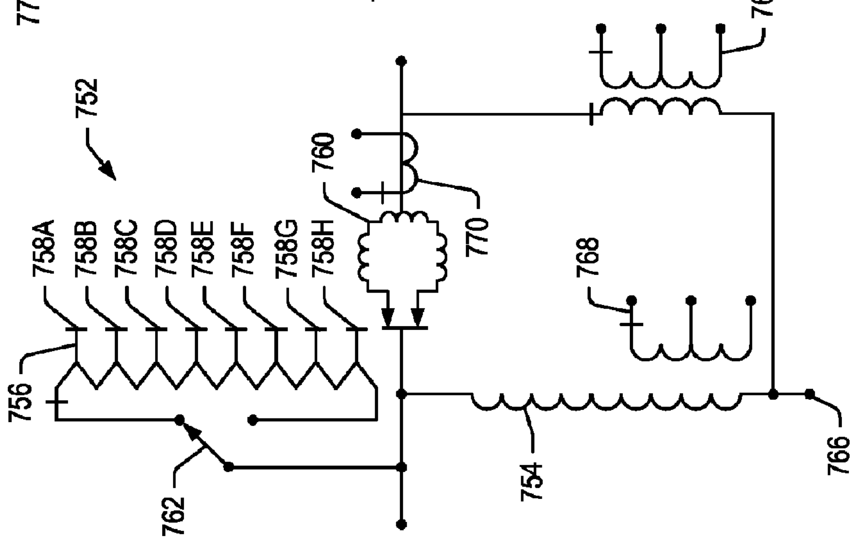

FIG. 173 depicts a schematic for a conventional design of a tap changing voltage regulator.

Figure 174:
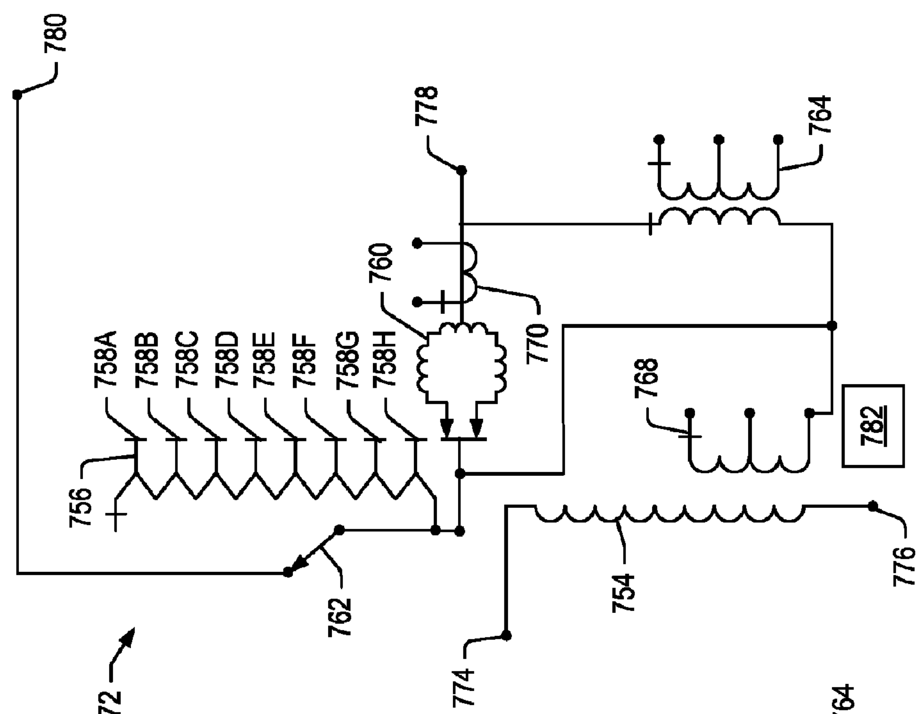

FIG. 174 depicts a schematic for a variable voltage, load tap changing transformer.

Figure 175:
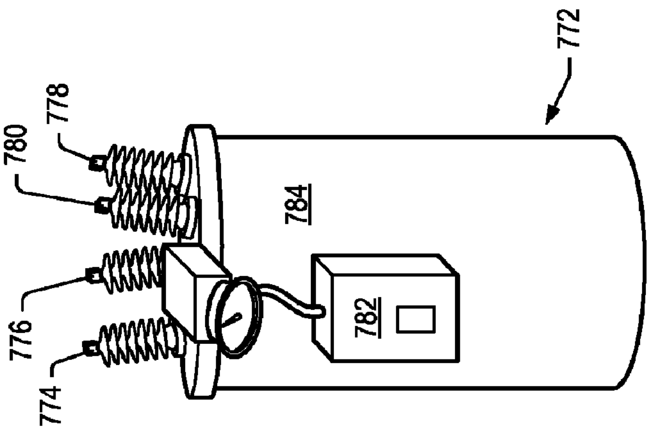

FIG. 175 depicts a representation of an embodiment of a transformer and a controller.

Figure 176:
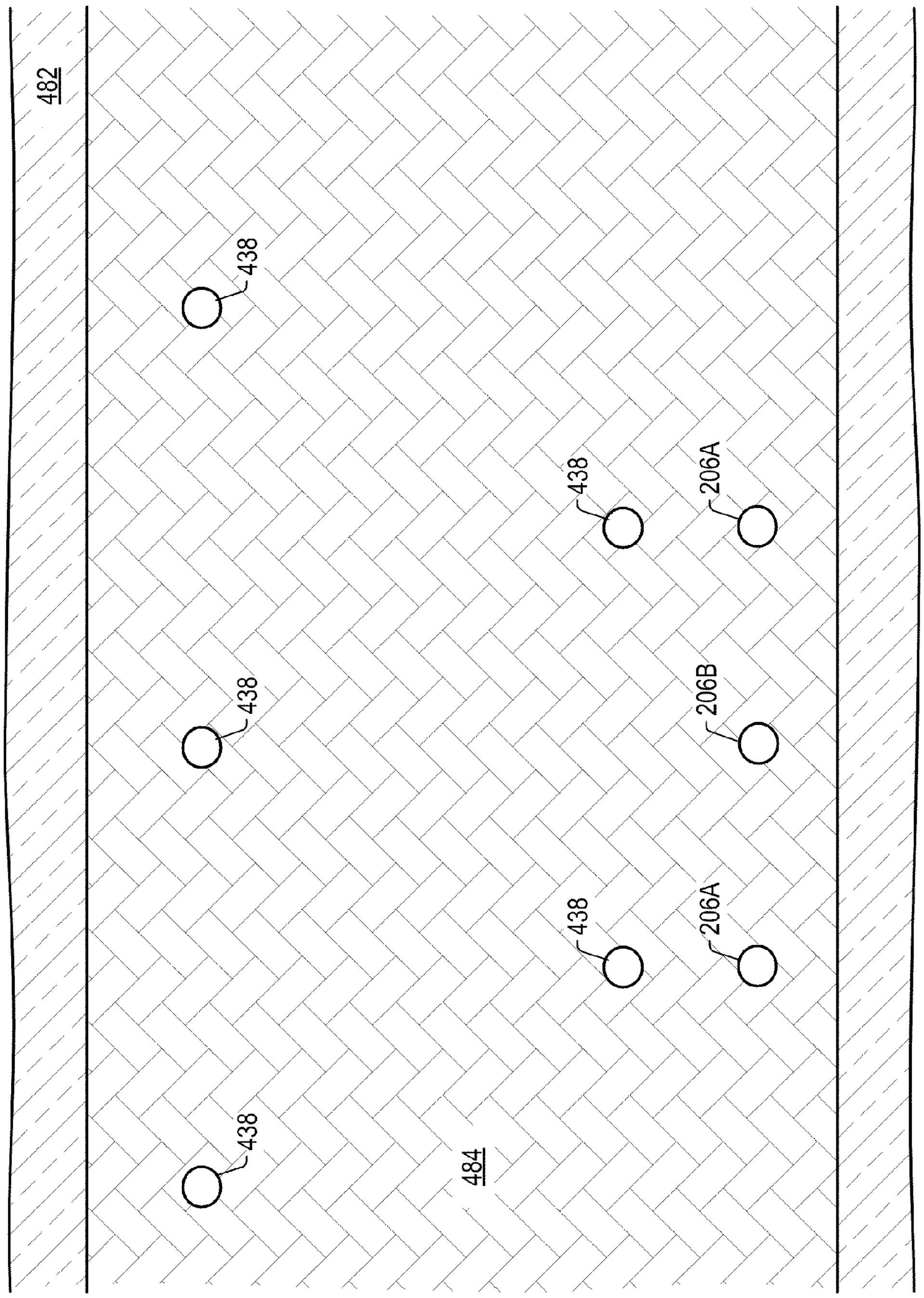

FIG. 176 depicts a side view representation of an embodiment for producing mobilized fluids from a tar sands formation with a relatively thin hydrocarbon layer.

Figure 177:
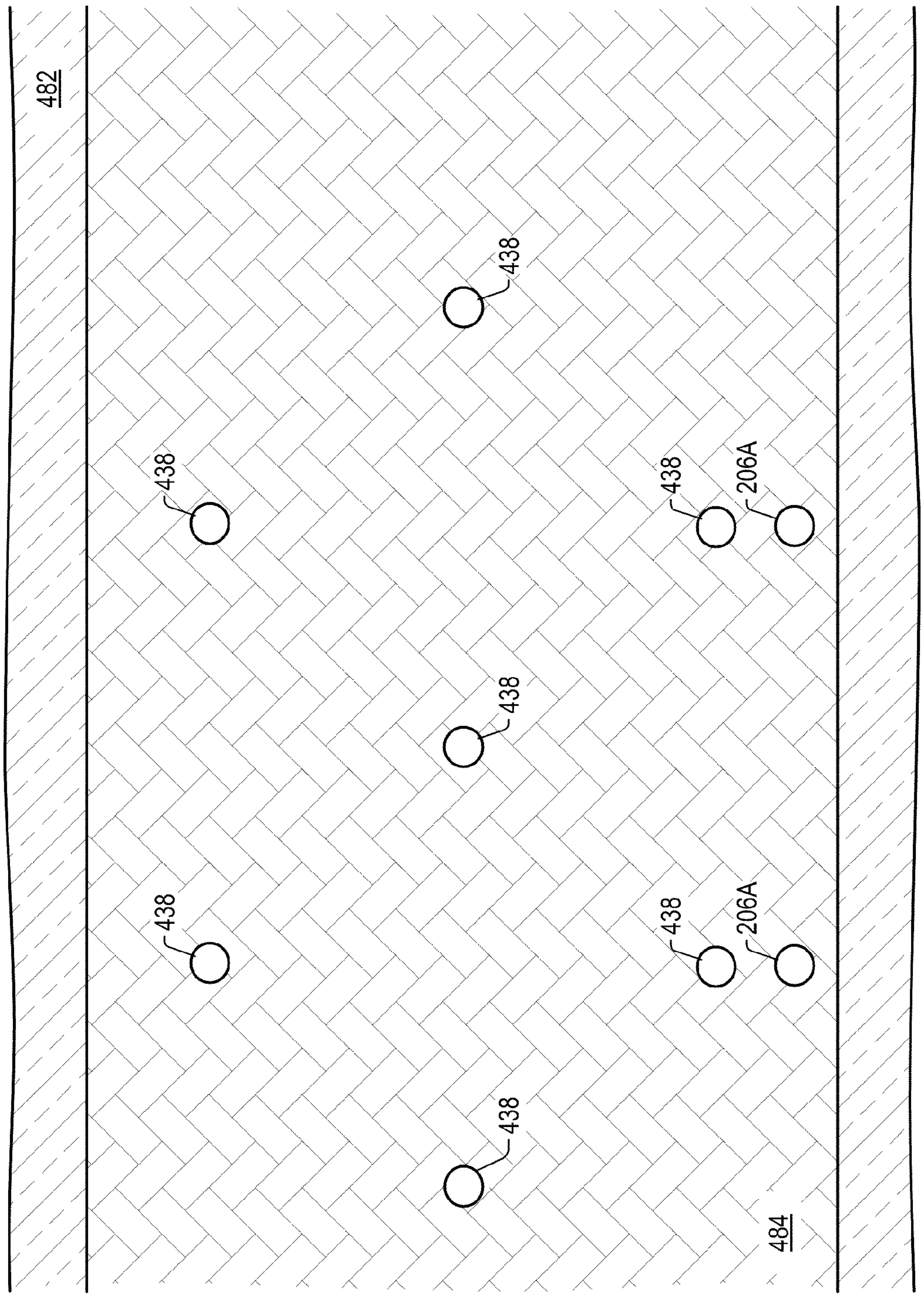

FIG. 177 depicts a side view representation of an embodiment for producing mobilized fluids from a tar sands formation with a hydrocarbon layer that is thicker than the hydrocarbon layer depicted in FIG. 176.

Figure 178:
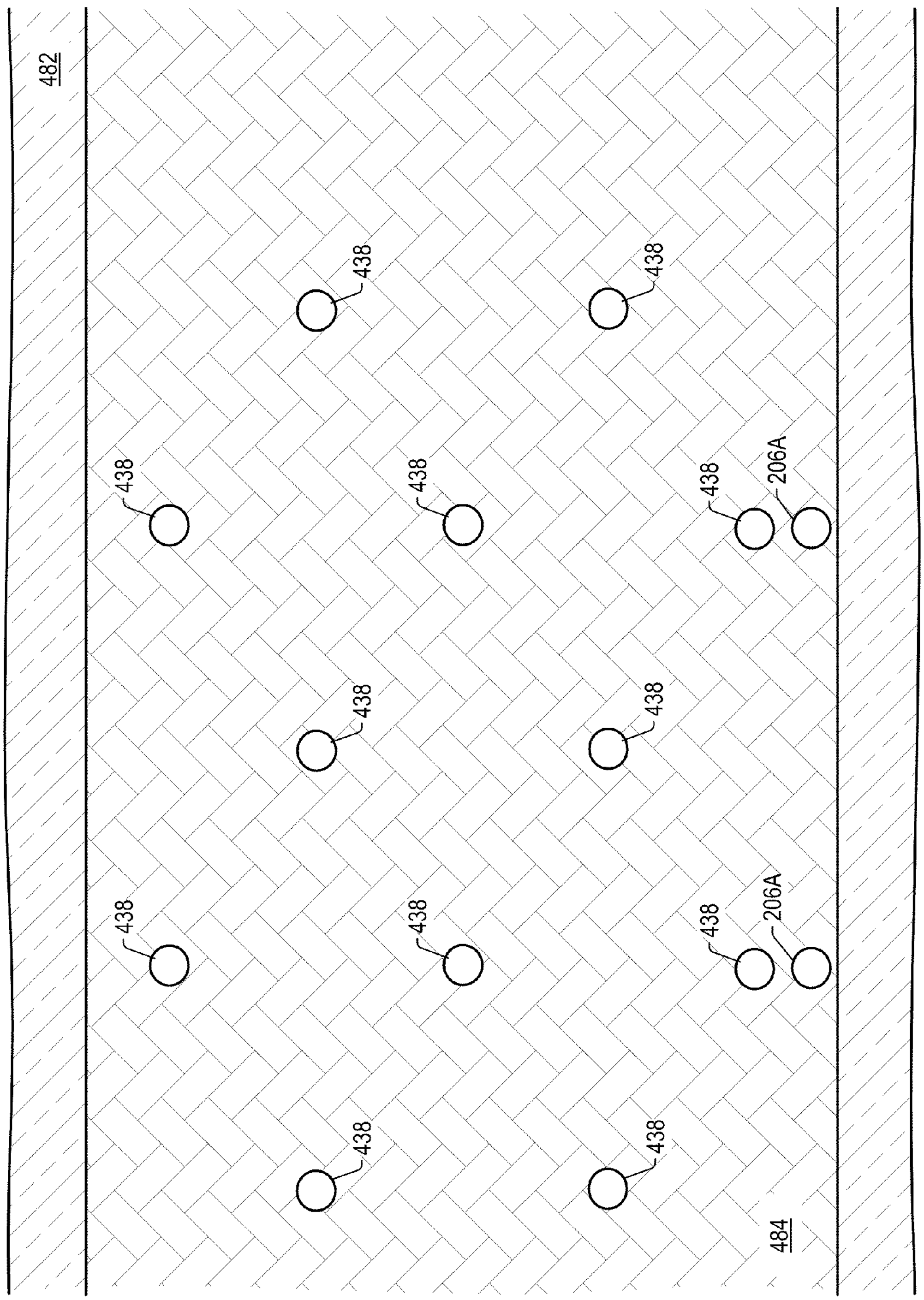

FIG. 178 depicts a side view representation of an embodiment for producing mobilized fluids from a tar sands formation with a hydrocarbon layer that is thicker than the hydrocarbon layer depicted in FIG. 177.

Figure 179:
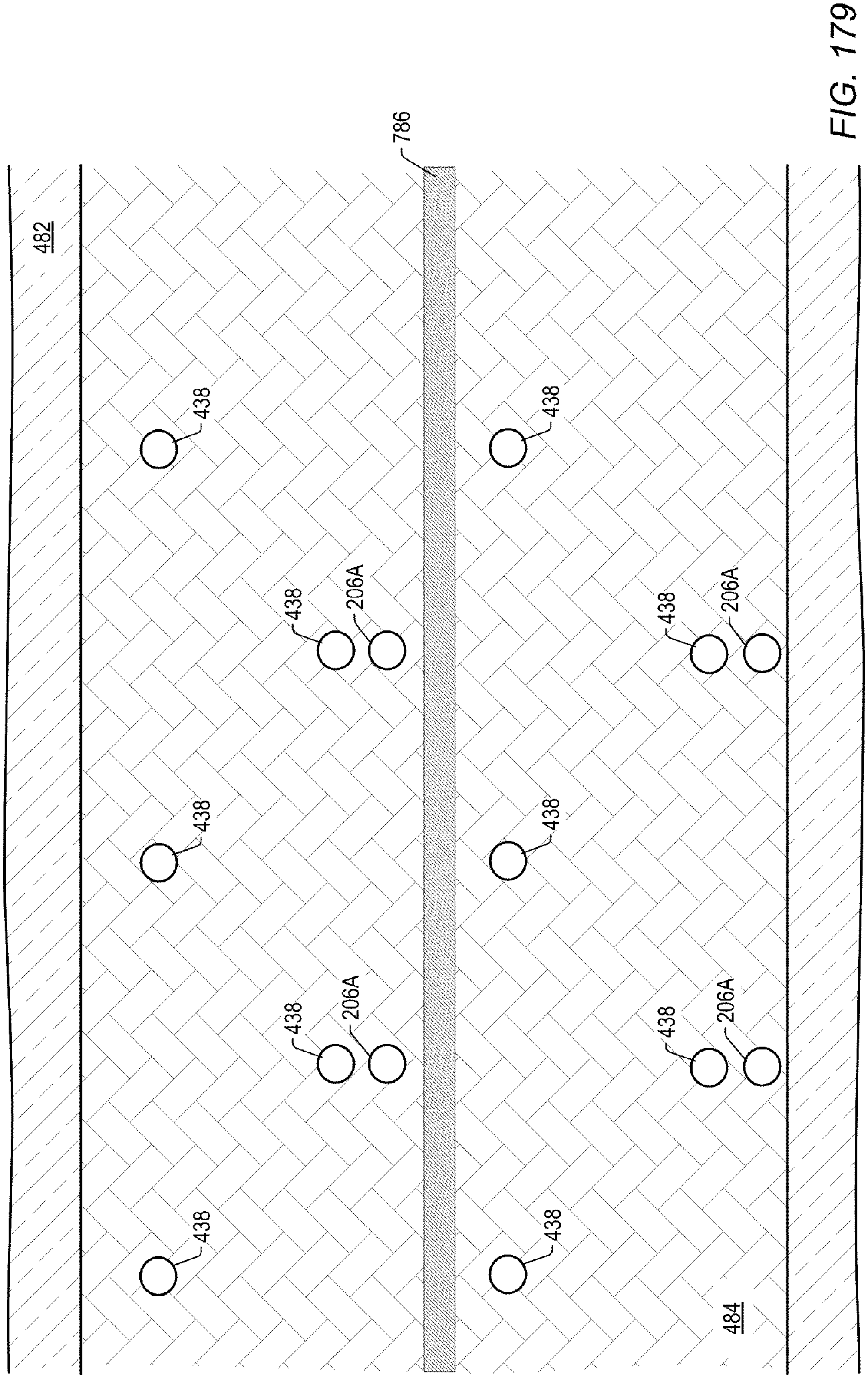

FIG. 179 depicts a side view representation of an embodiment for producing mobilized fluids from a tar sands formation with a hydrocarbon layer that has a shale break.

Figure 180:
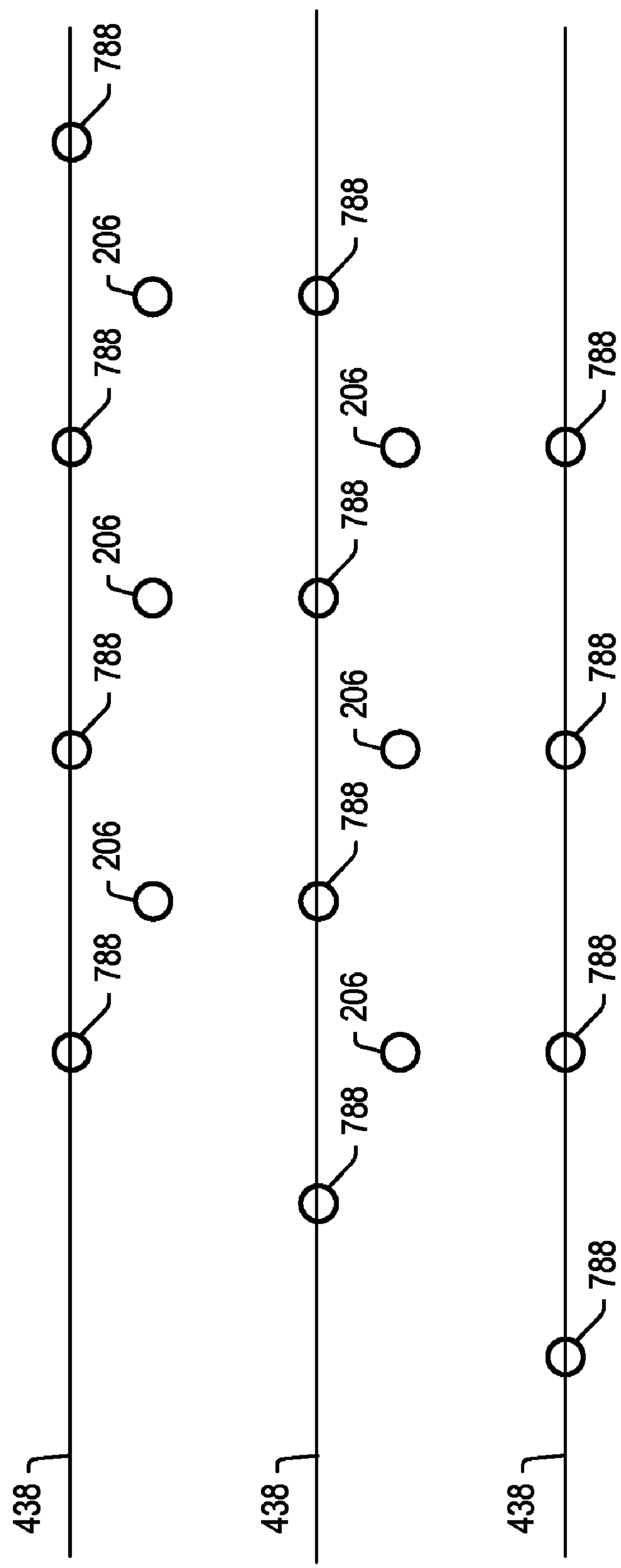

FIG. 180 depicts a top view representation of an embodiment for preheating using heaters for the drive process.

Figure 181:
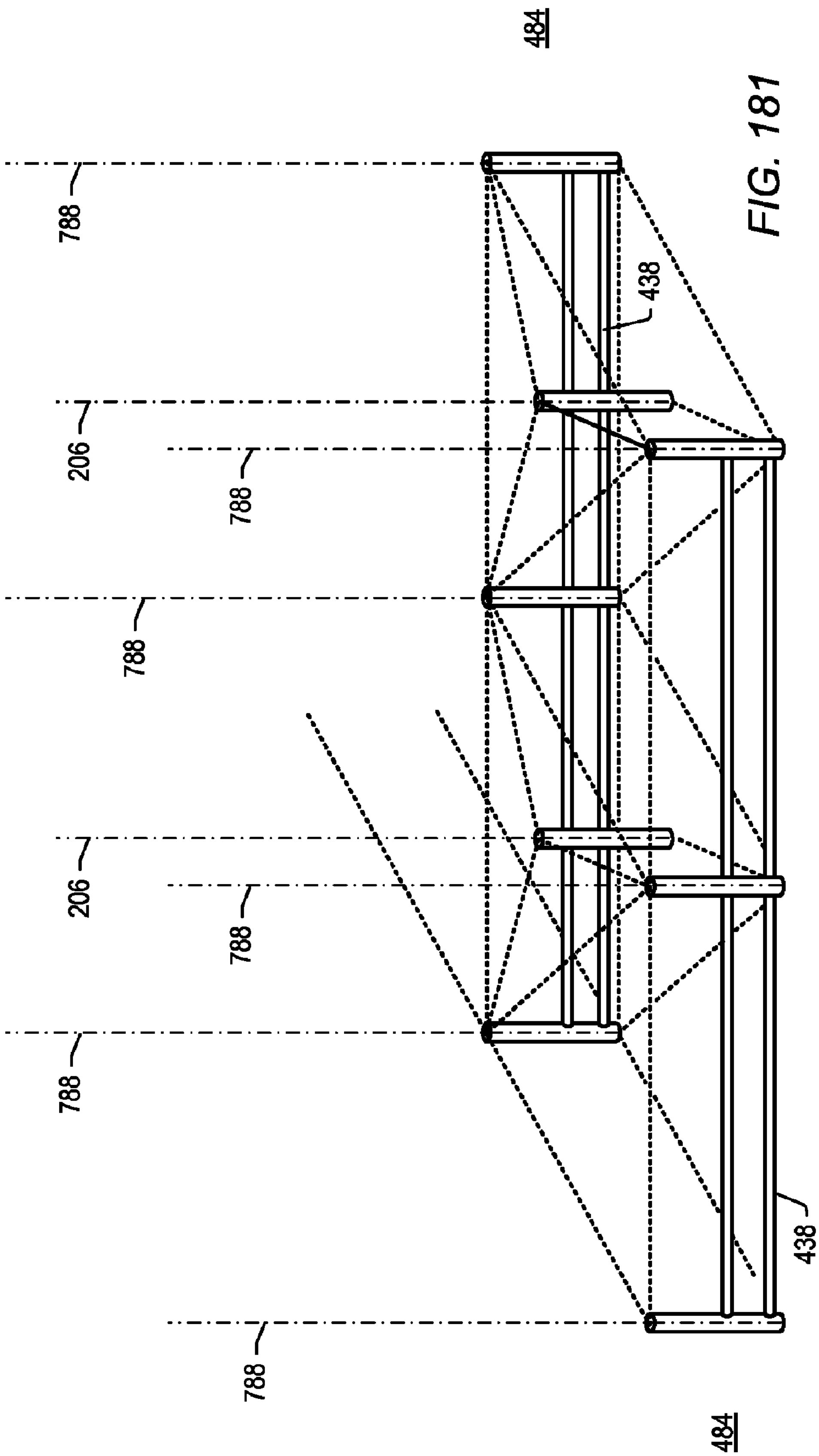

FIG. 181 depicts a perspective representation of an embodiment for preheating using heaters for the drive process.

Figure 182:
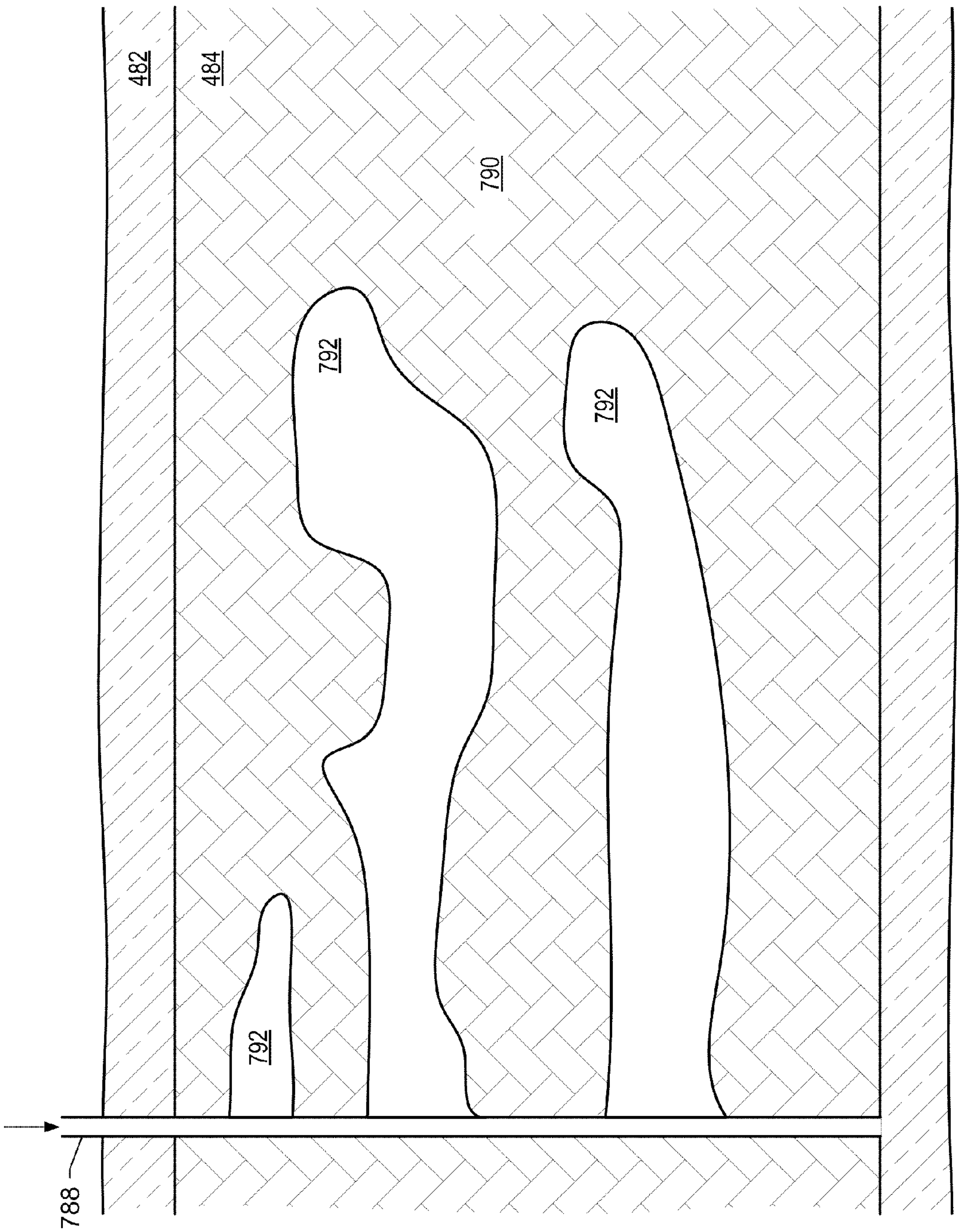

FIG. 182 depicts a side view representation of an embodiment of a tar sands formation subsequent to a steam injection process.

Figure 183:
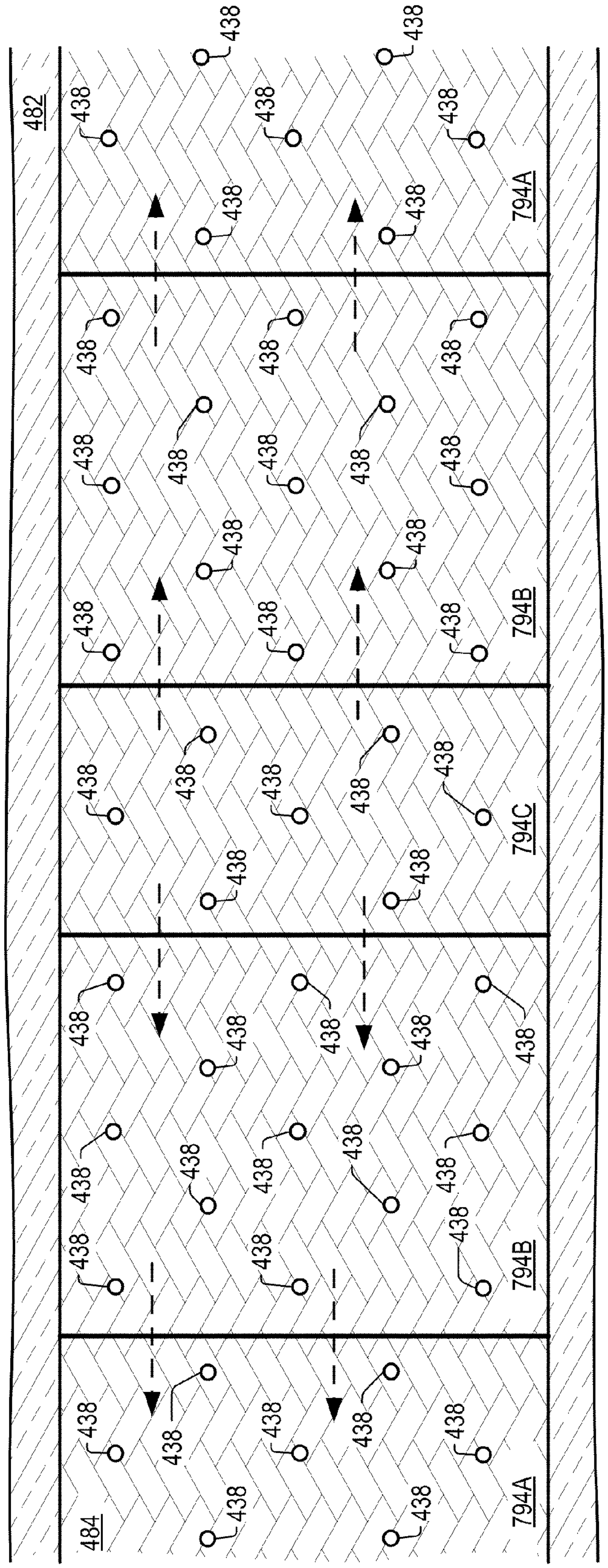

FIG. 183 depicts a side view representation of an embodiment using at least three treatment sections in a tar sands formation.

Figure 184:
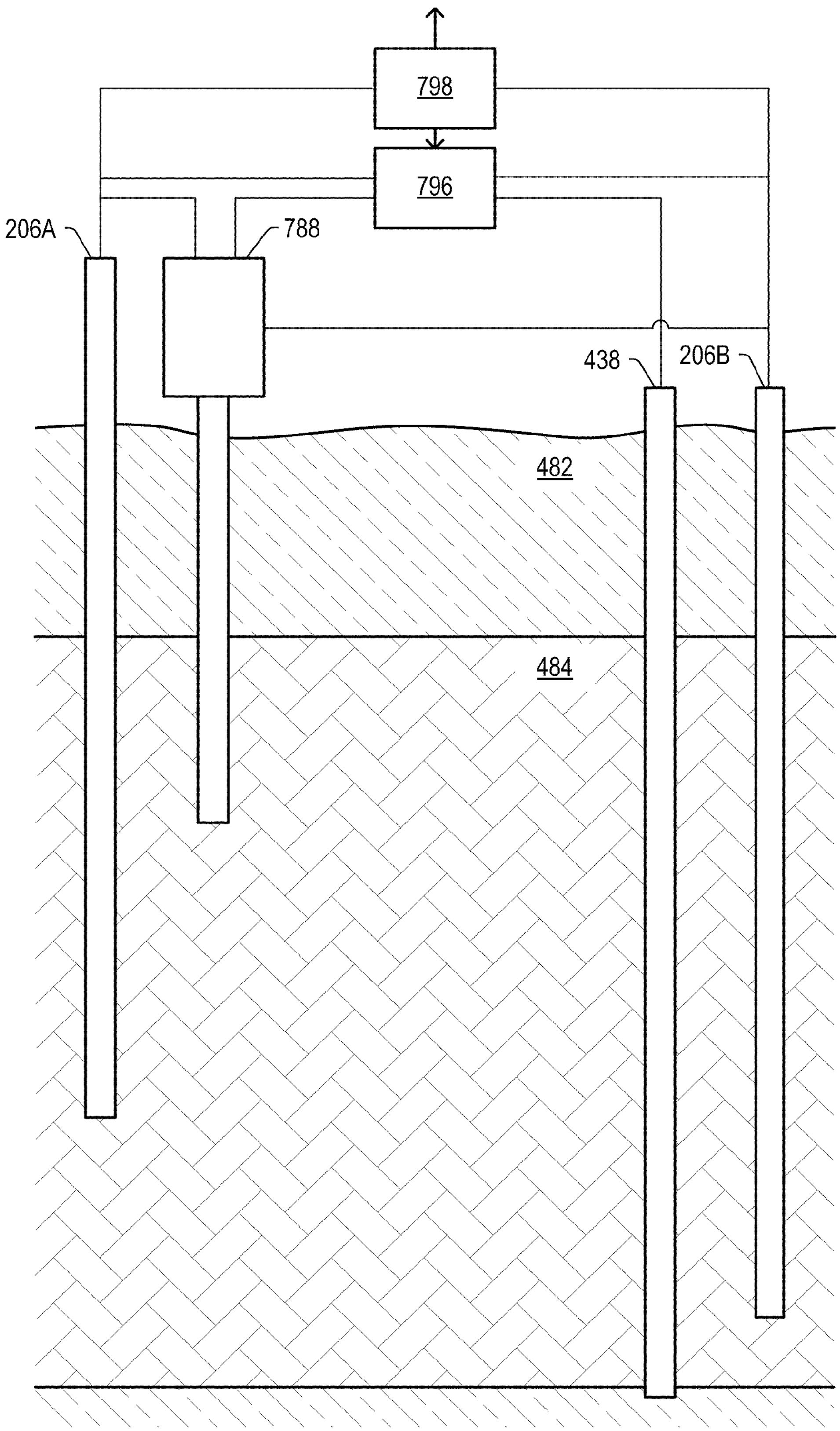

FIG. 184 depicts a representation of an embodiment for producing hydrocarbons from a tar sands formation.

Figure 185:
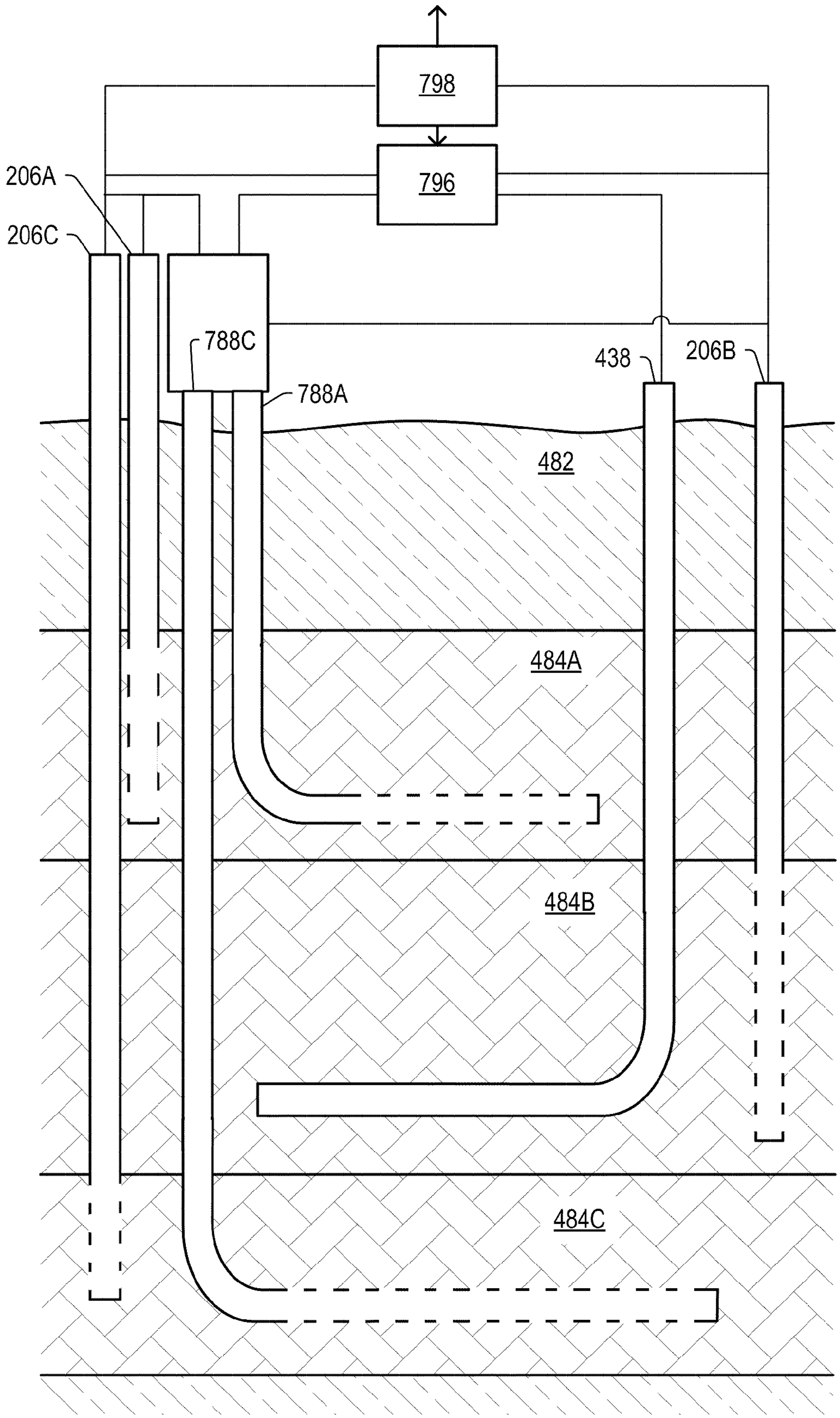

FIG. 185 depicts a representation of an embodiment for producing hydrocarbons from multiple layers in a tar sands formation.

Figure 186:
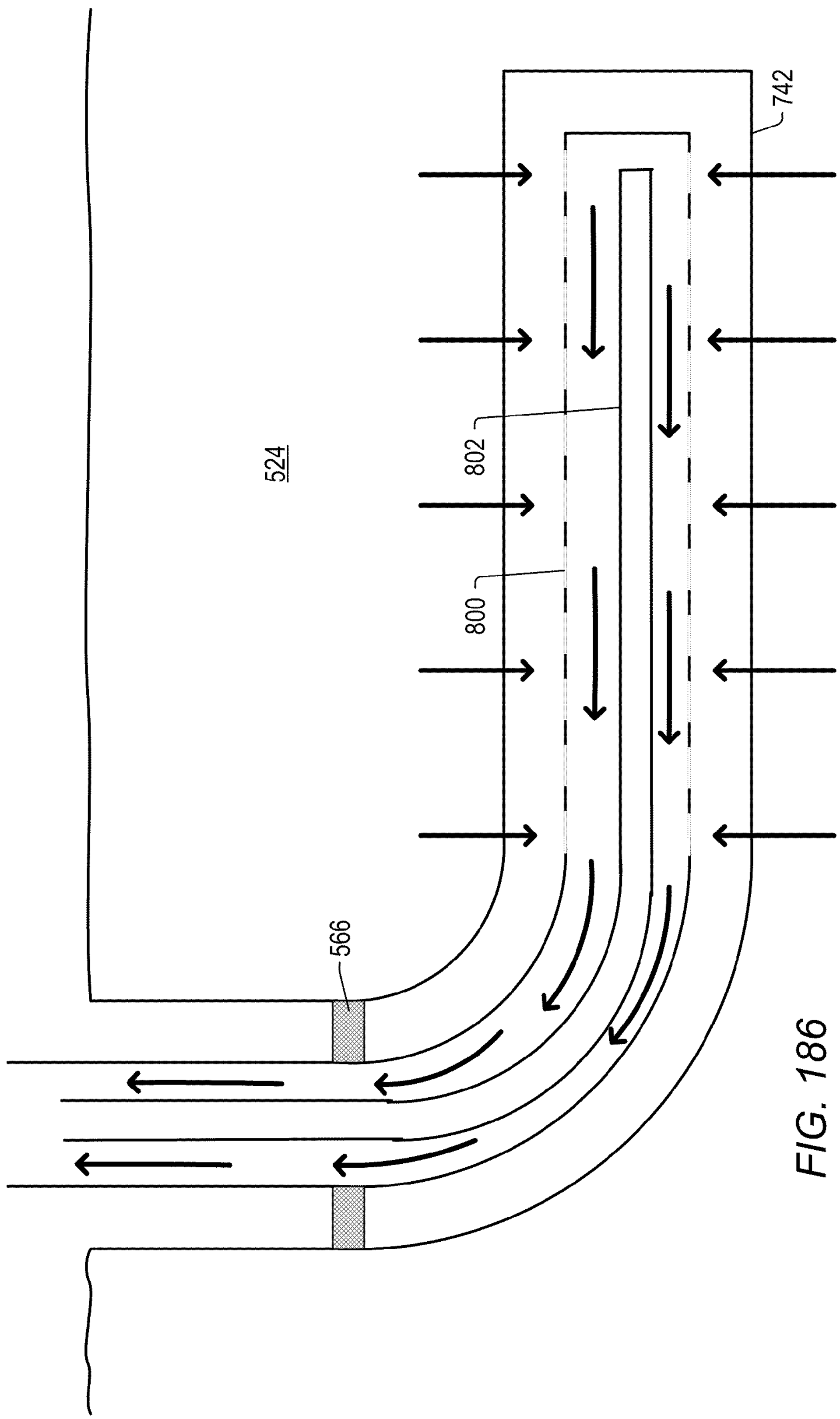

FIG. 186 depicts an embodiment for heating and producing from a formation with a temperature limited heater in a production wellbore.

Figure 187:
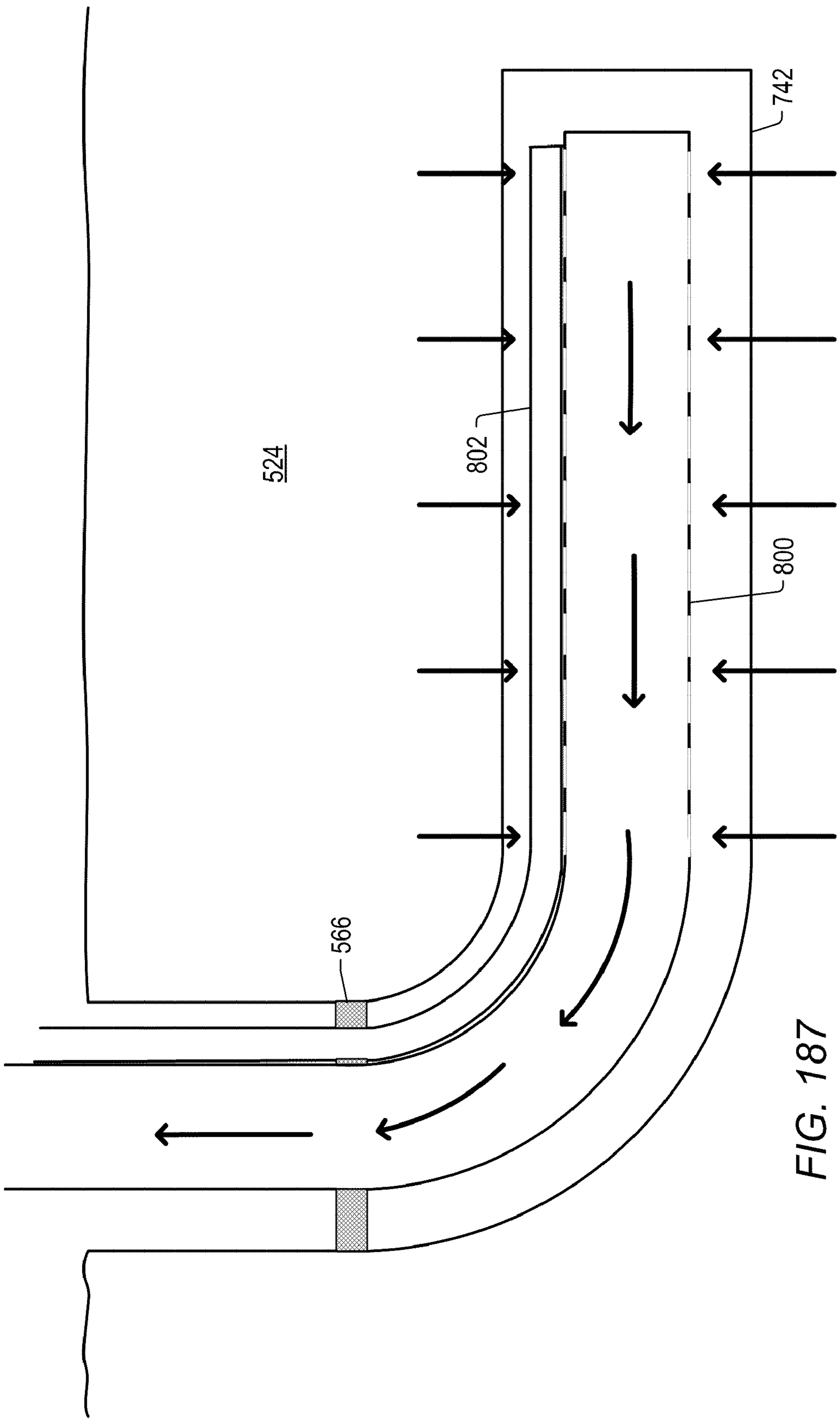

FIG. 187 depicts an embodiment for heating and producing from a formation with a temperature limited heater and a production wellbore.

Figure 188:
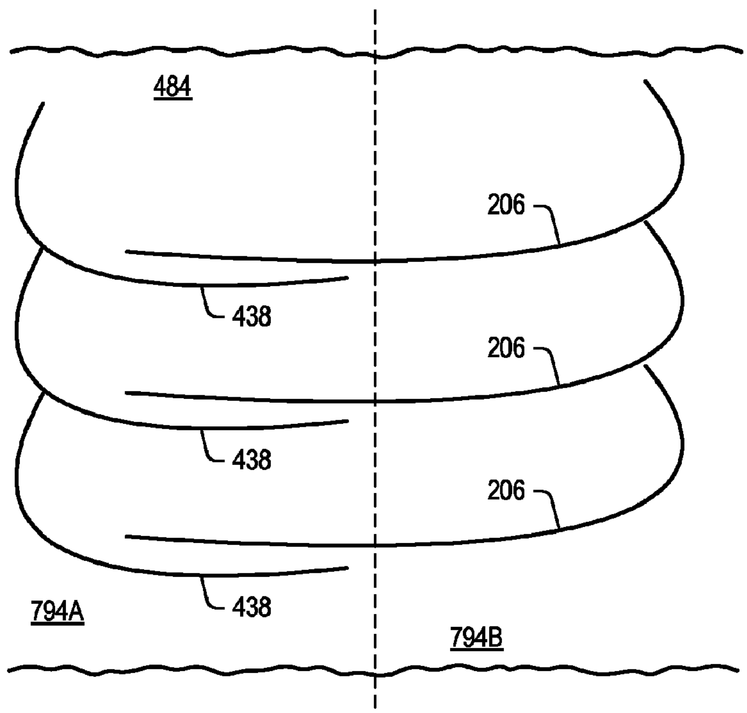

FIG. 188 depicts a schematic of an embodiment of a first stage of treating a tar sands formation with electrical heaters.

Figure 189:
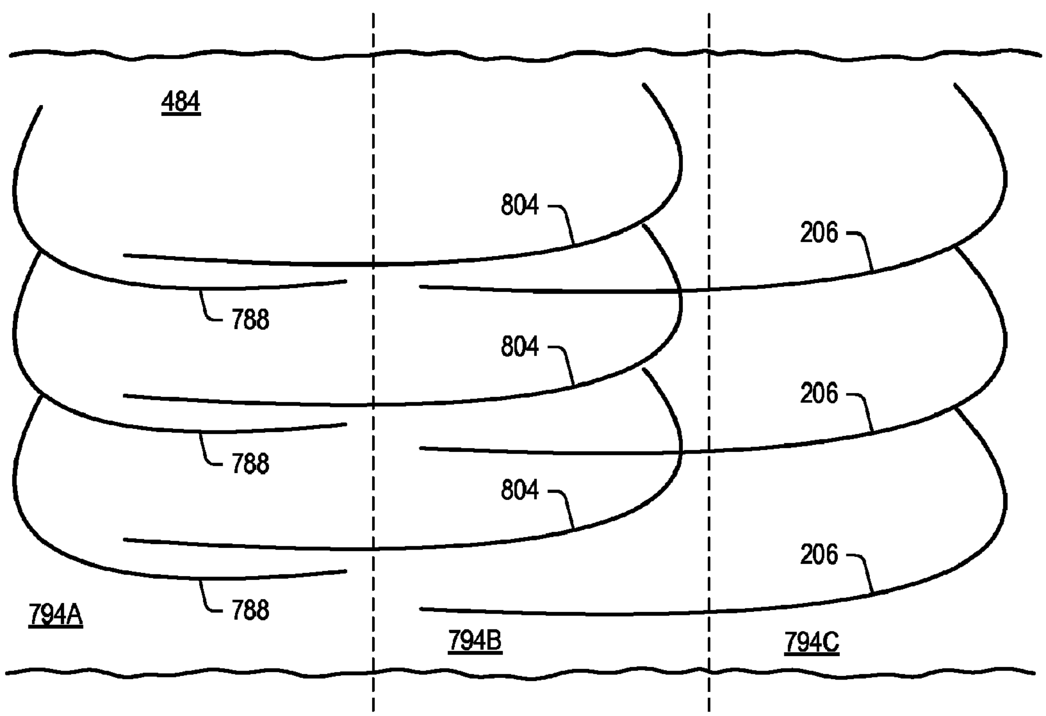

FIG. 189 depicts a schematic of an embodiment of a second stage of treating the tar sands formation with fluid injection and oxidation.

Figure 190:
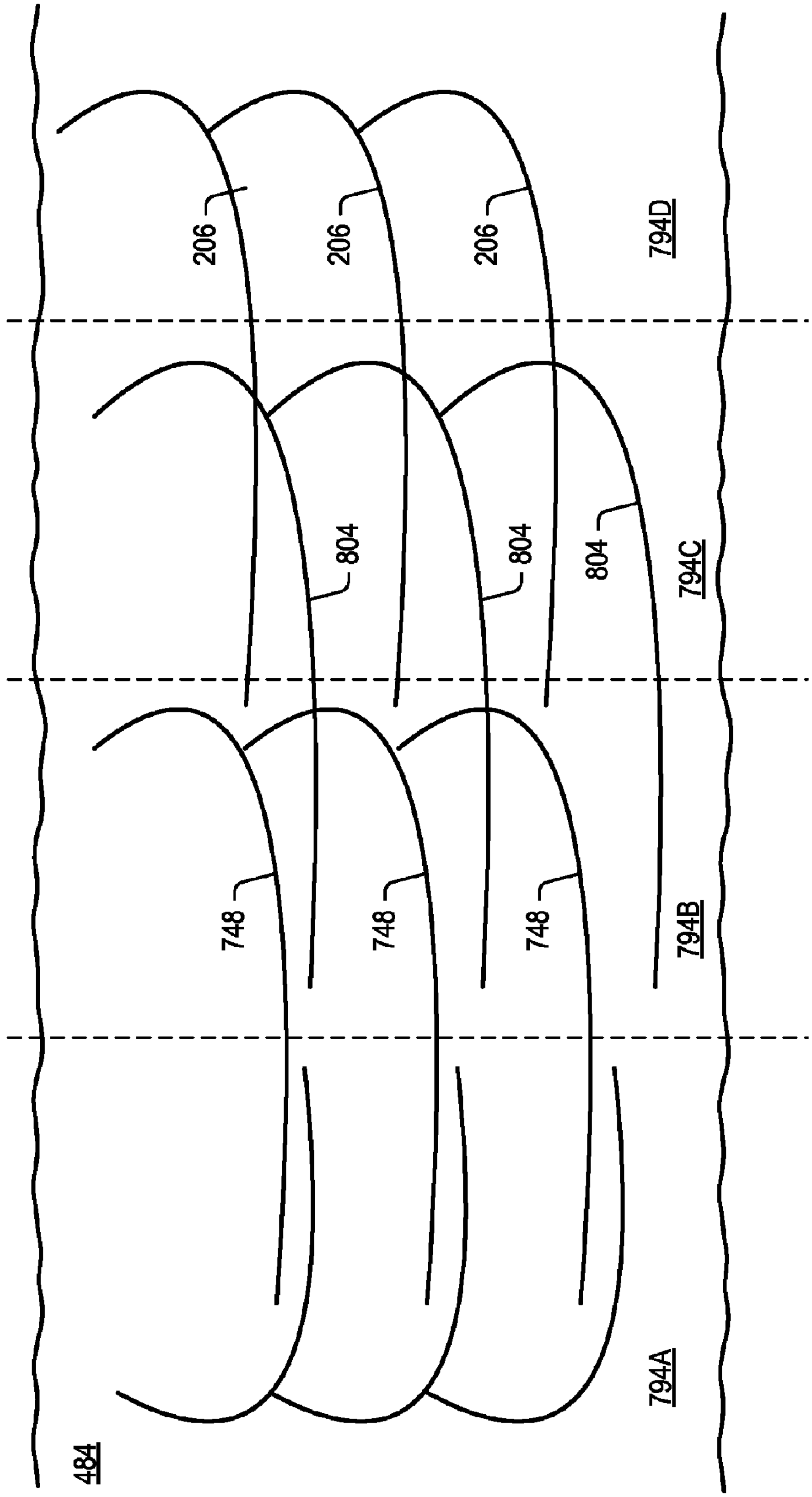

FIG. 190 depicts a schematic of an embodiment of a third stage of treating the tar sands formation with fluid injection and oxidation.

Figure 191:
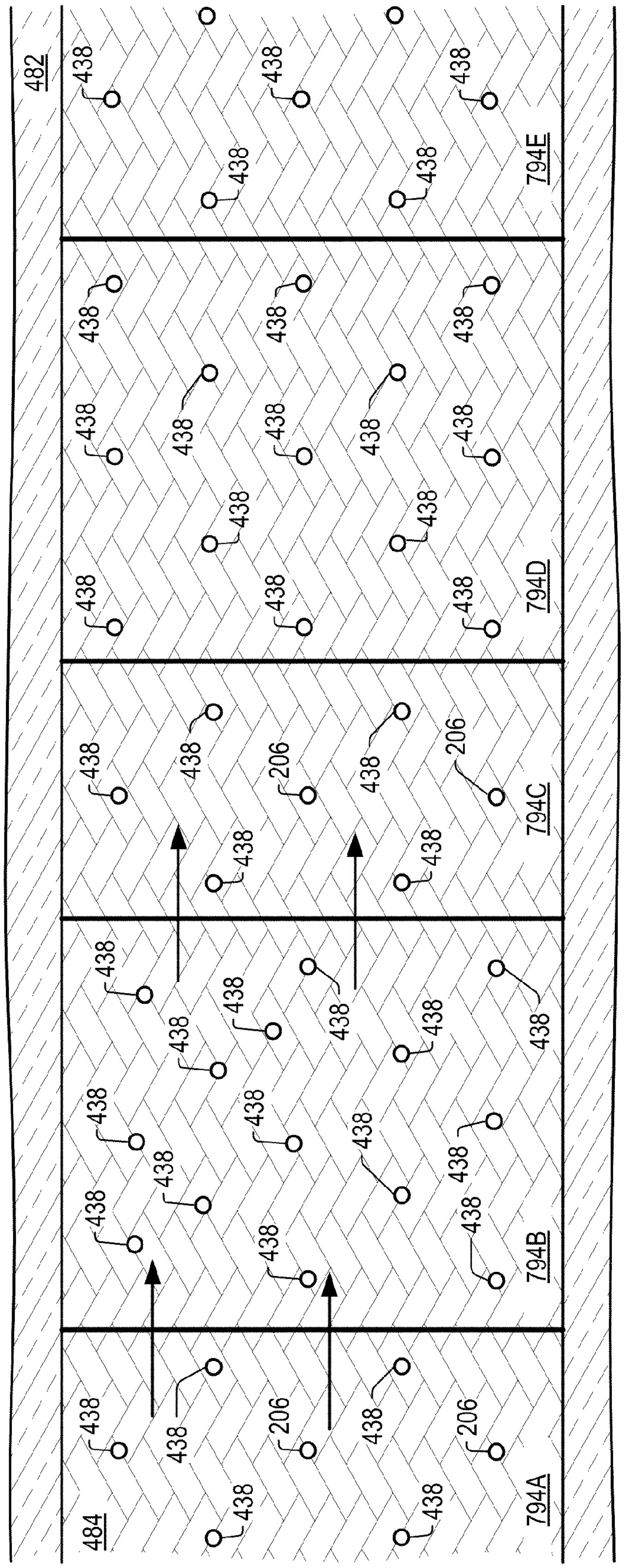

FIG. 191 depicts a side view representation of a first stage of an embodiment of treating portions in a subsurface formation with heaters, oxidation and/or fluid injection.

Figure 192:
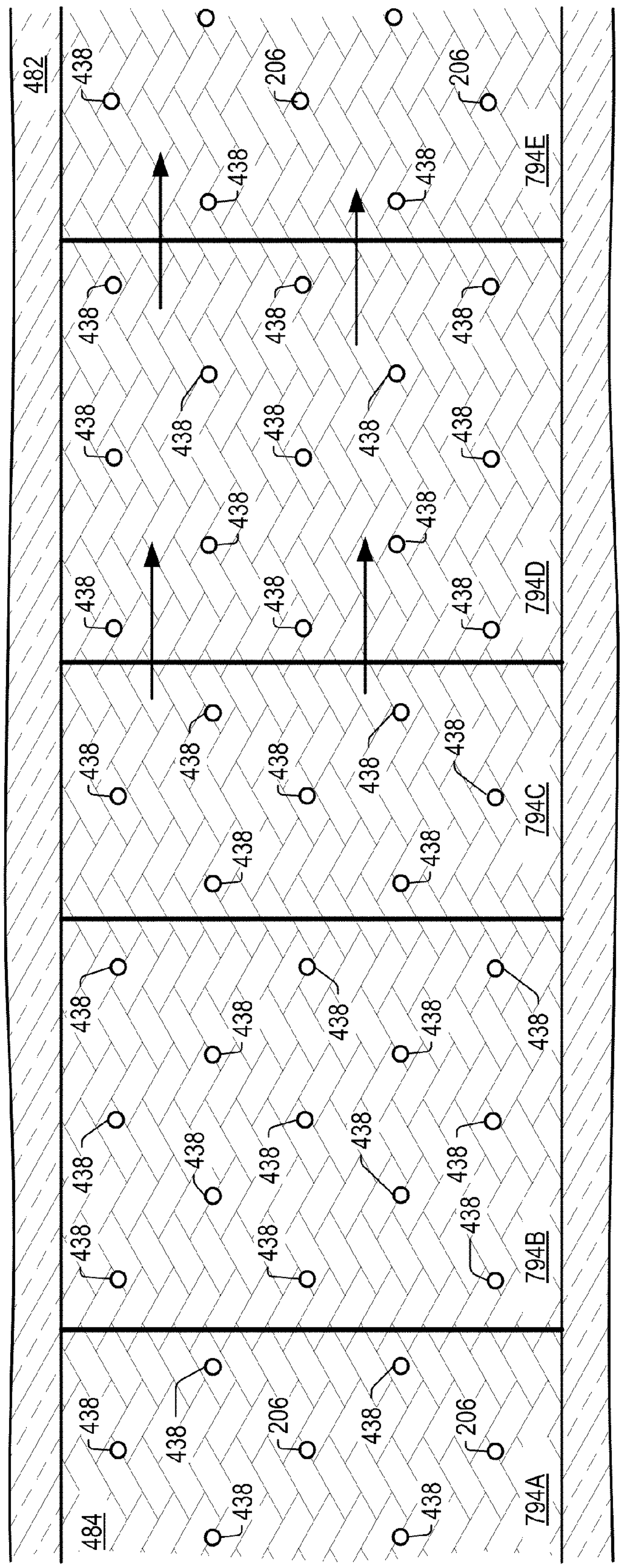

FIG. 192 depicts a side view representation of a second stage of an embodiment of treating portions in the subsurface formation with heaters, oxidation and/or fluid injection.

Figure 193:
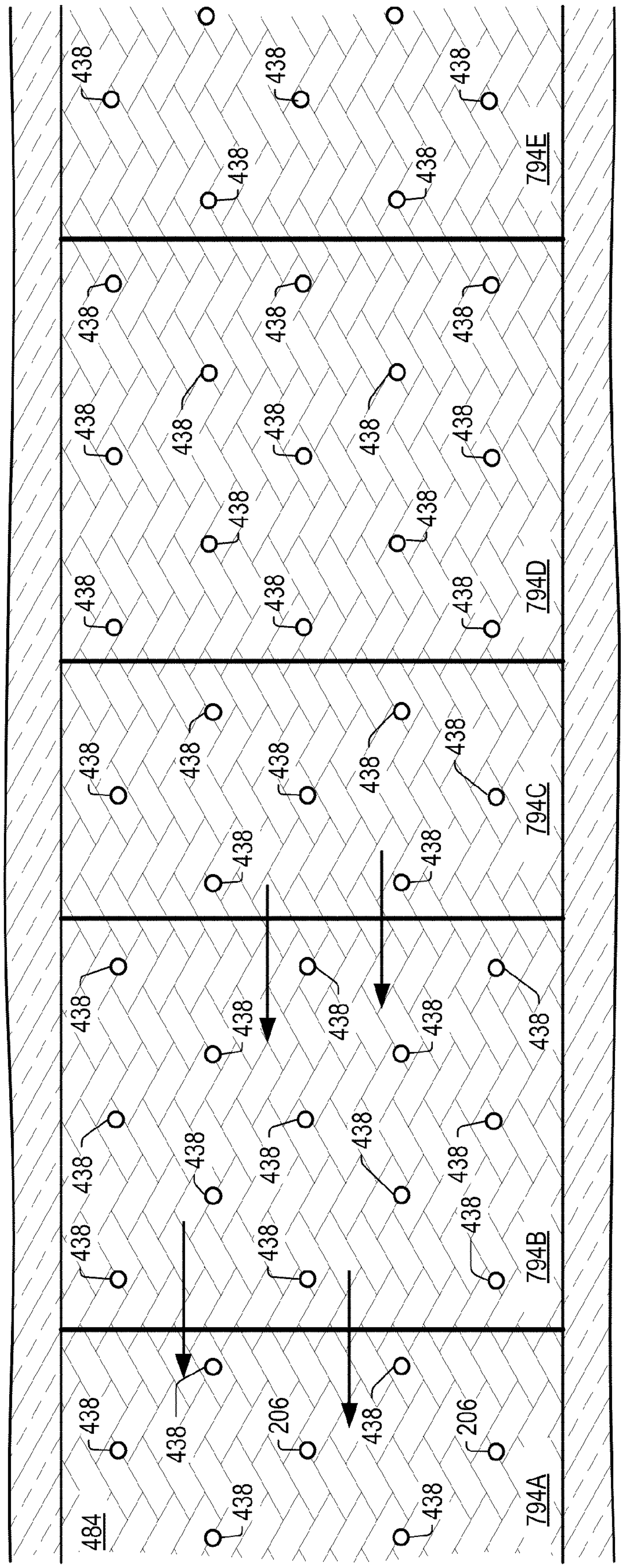

FIG. 193 depicts a side view representation of an embodiment of treating portions in subsurface formation with heaters, oxidation and/or fluid injection.

Figure 194:
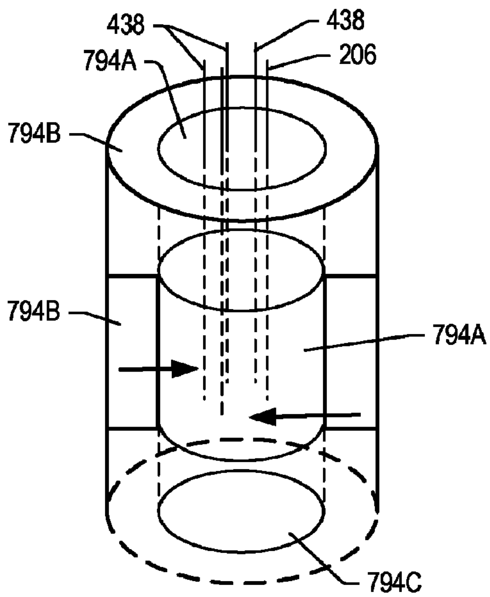

FIG. 194 depicts an embodiment of treating a subsurface formation using a cylindrical pattern.

Figure 195:
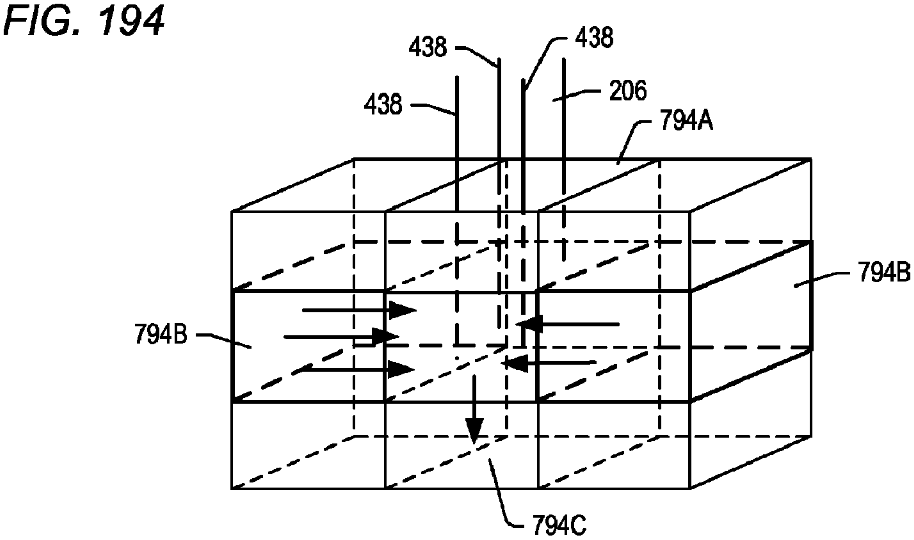

FIG. 195 depicts an embodiment of treating multiple portions of a subsurface formation in a rectangular pattern.

Figure 196:
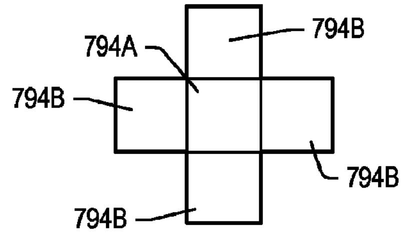

FIG. 196 is a schematic top view of the pattern depicted in FIG. 195.

Figure 197:
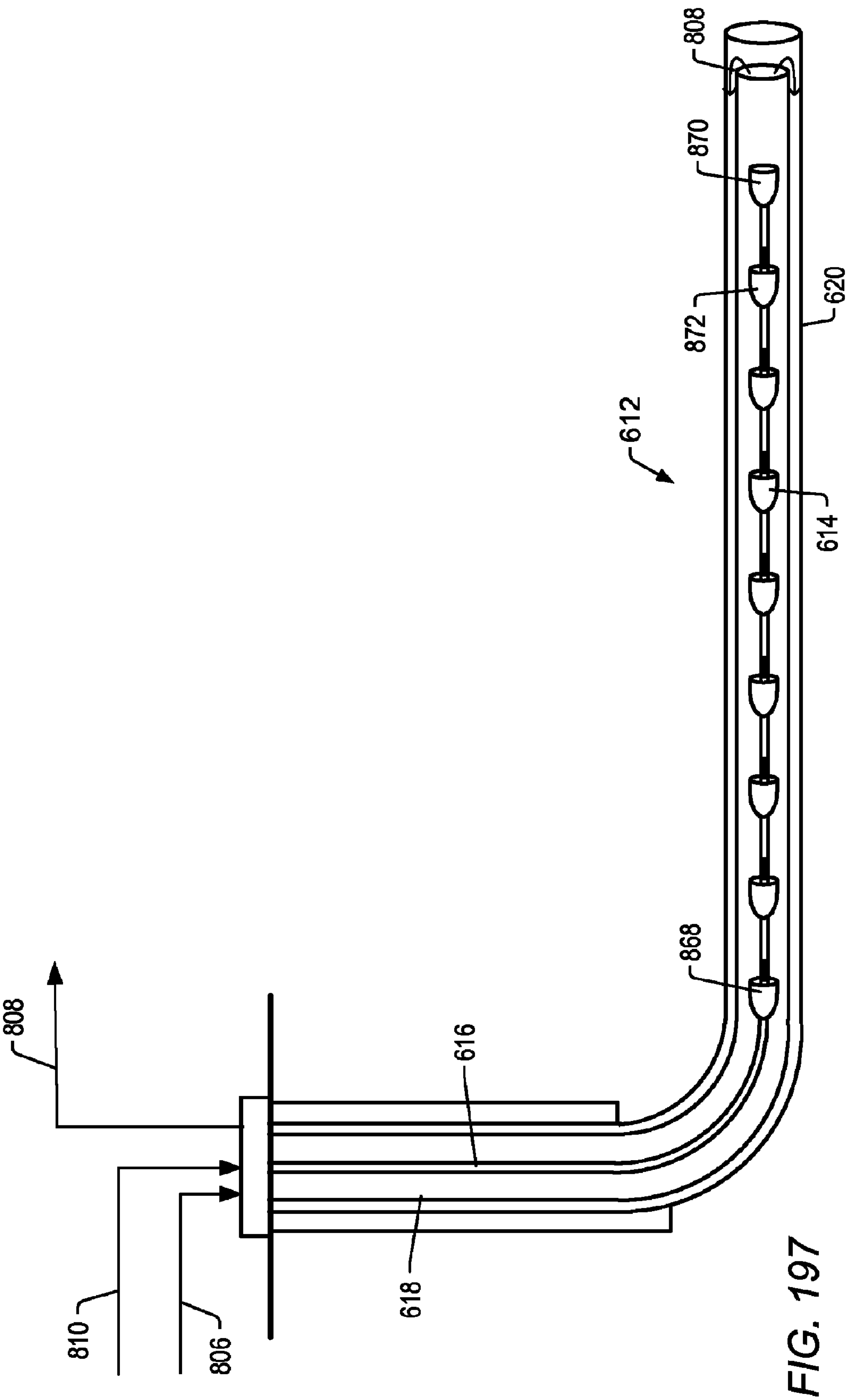

FIG. 197 depicts a schematic representation of an embodiment of a downhole oxidizer assembly.

Figure 198:
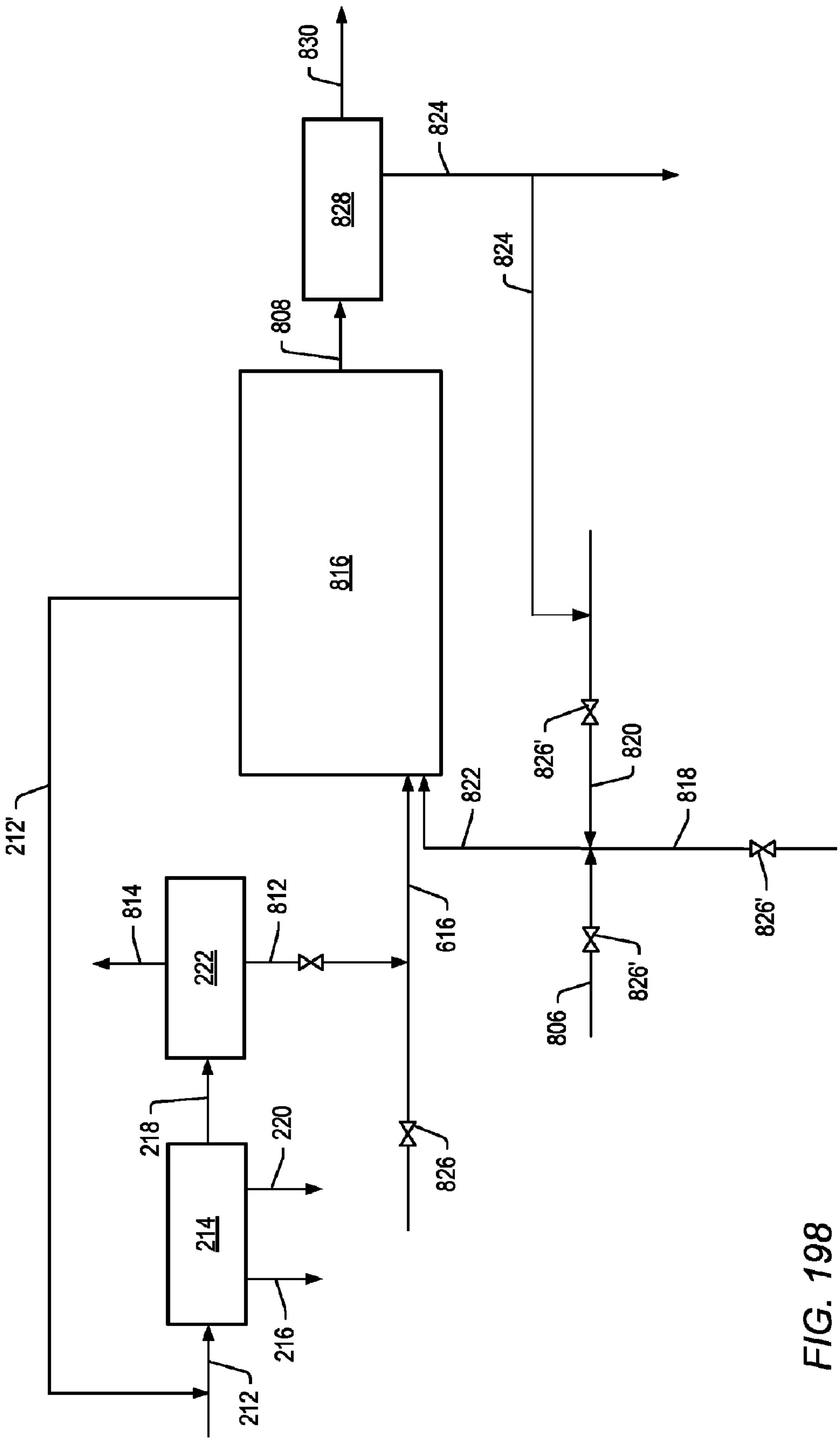

FIG. 198 depicts a schematic representation of an embodiment of a system for producing fuel for downhole oxidizer assemblies.

Figure 199:
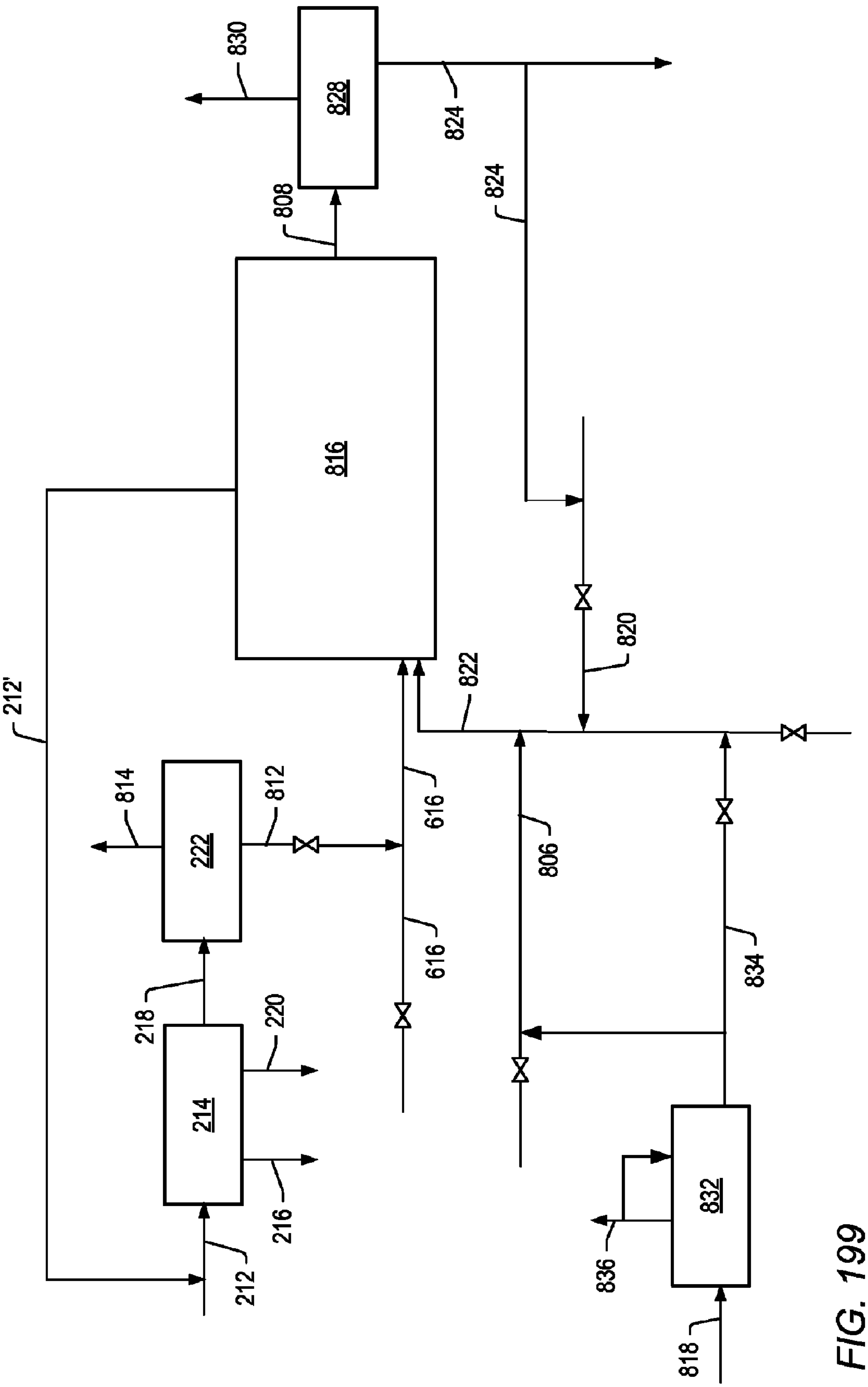

FIG. 199 depicts a schematic representation of an embodiment of a system for producing oxygen for use in downhole oxidizer assemblies.

Figure 200:
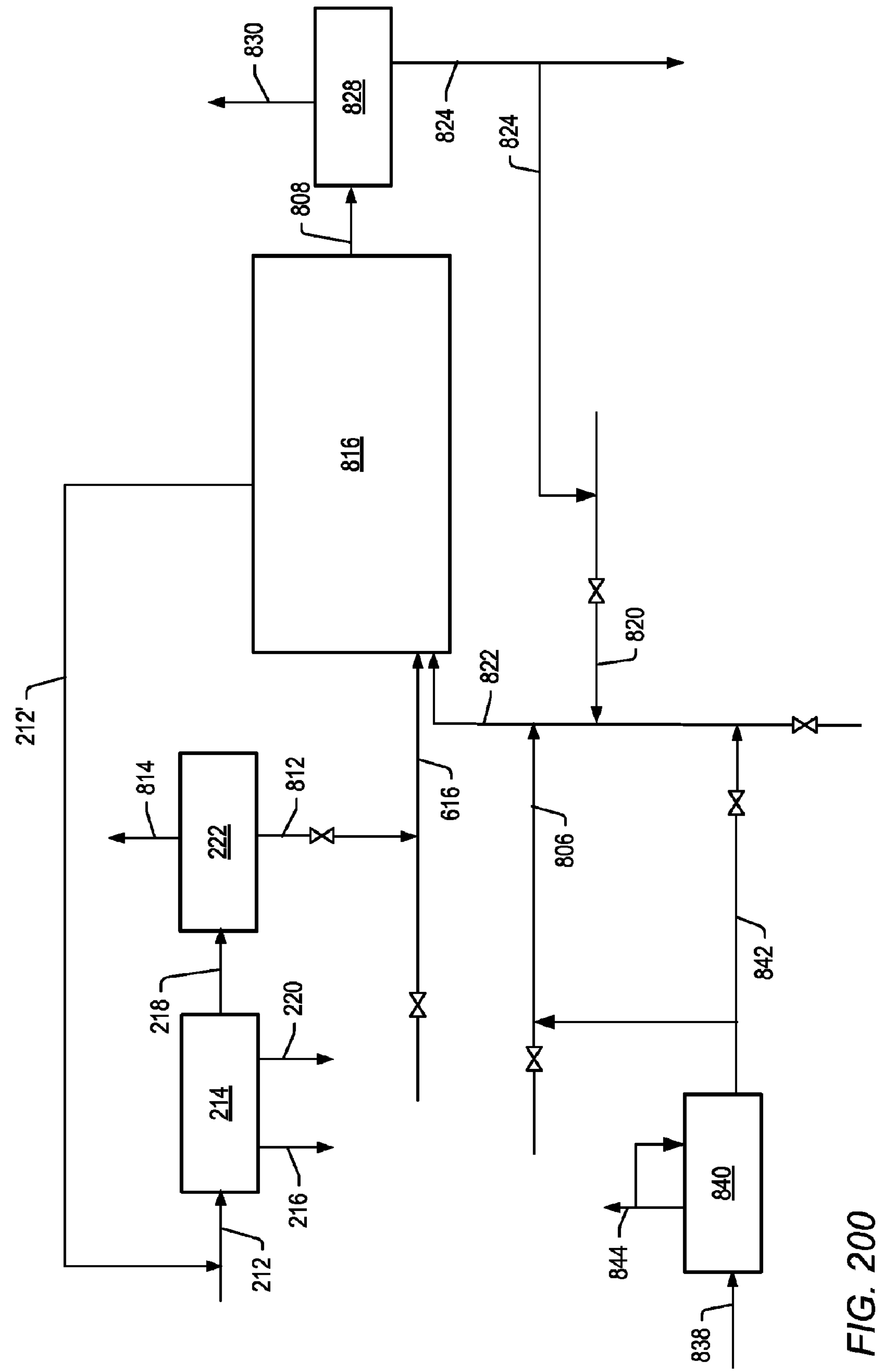

FIG. 200 depicts a schematic representation of an embodiment of a system for producing oxygen for use in downhole oxidizer assemblies.

Figure 201:
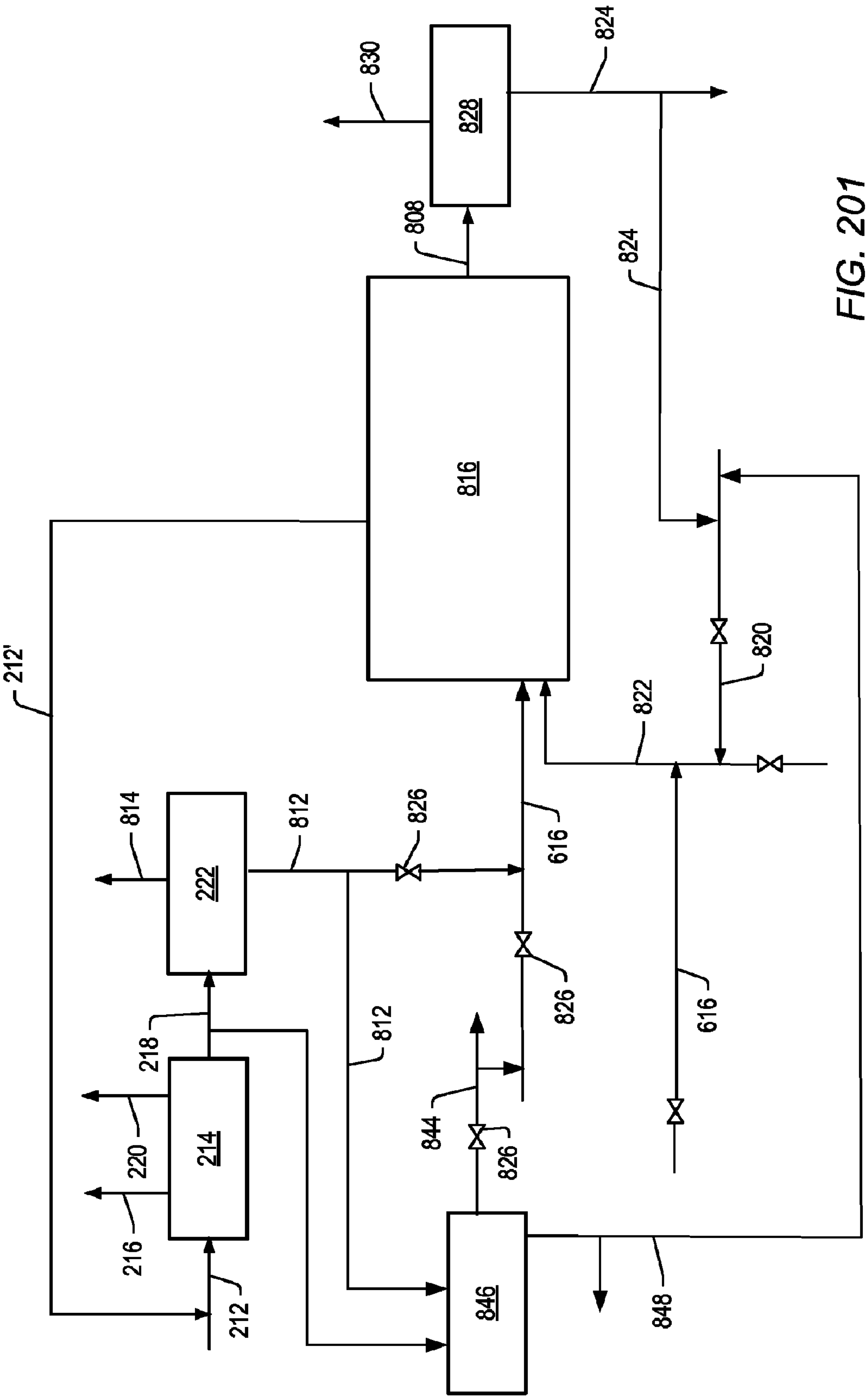

FIG. 201 depicts a schematic representation of an embodiment of a system for producing hydrogen for use in downhole oxidizer assemblies.

Figure 202:
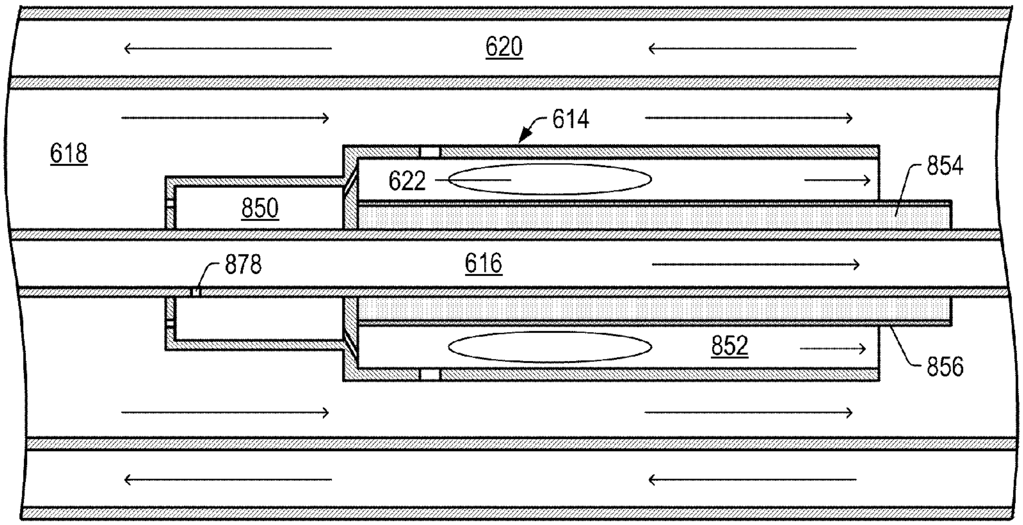

FIG. 202 depicts a cross-sectional representation of an embodiment of a downhole oxidizer including an insulating sleeve.

Figure 203:
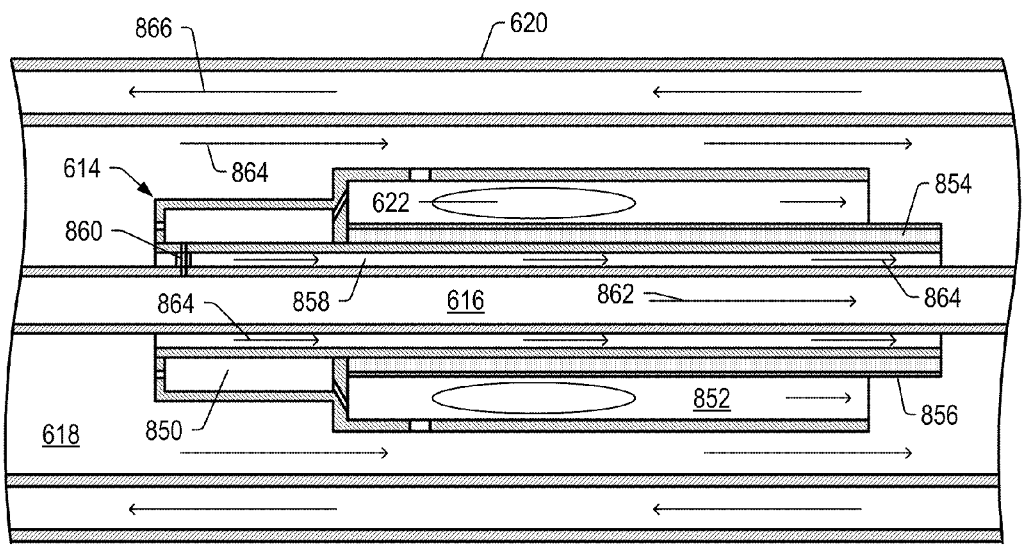

FIG. 203 depicts a cross-sectional representation of an embodiment of a downhole oxidizer with a gas cooled insulating sleeve.

Figure 204:
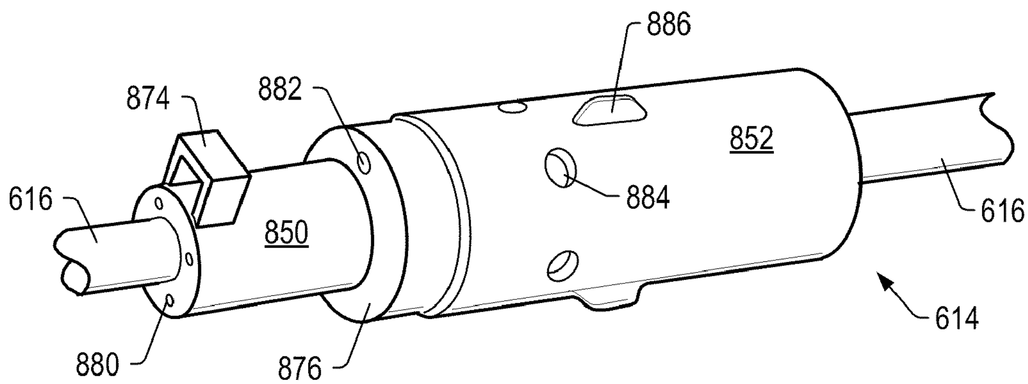

FIG. 204 depicts a perspective view of an embodiment of a portion of an oxidizer of a downhole oxidizer assembly.

Figure 205:
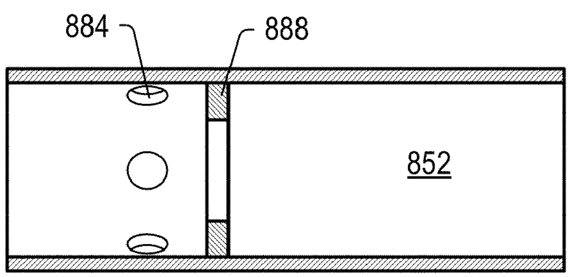

FIG. 205 depicts a cross-sectional representation of an embodiment of an oxidizer shield.

Figure 206:
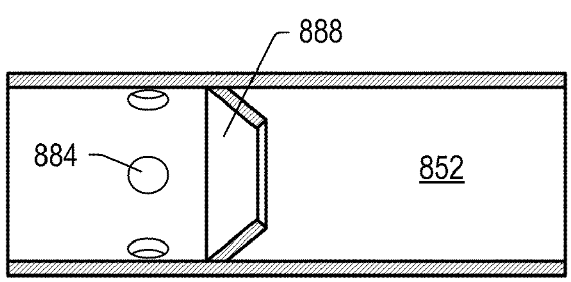

FIG. 206 depicts a cross-sectional representation of an embodiment of an oxidizer shield.

Figure 207:
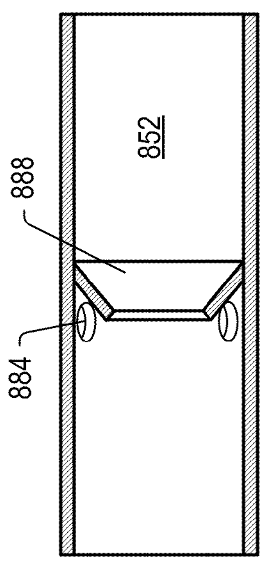

FIG. 207 depicts a cross-sectional representation of an embodiment of an oxidizer shield.

Figure 208:
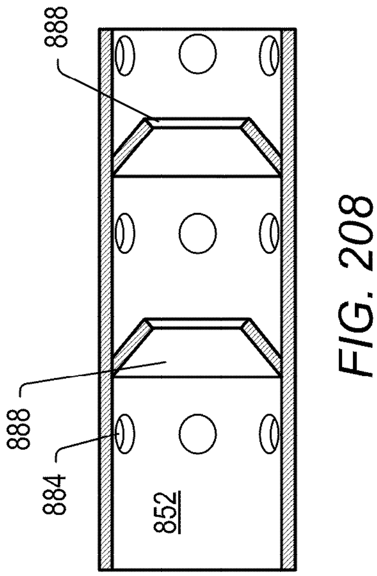

FIG. 208 depicts a cross-sectional representation of an embodiment of an oxidizer shield.

Figure 209:
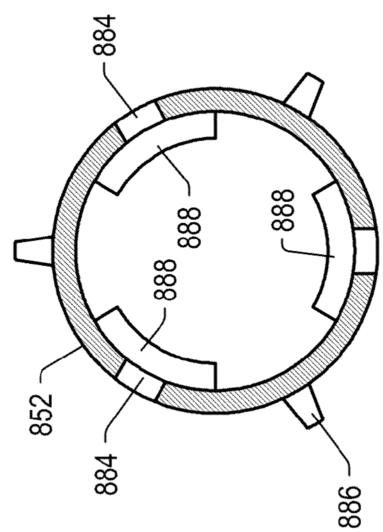

FIG. 209 depicts a cross-sectional representation of an embodiment of an oxidizer shield with multiple flame stabilizers.

Figure 210:
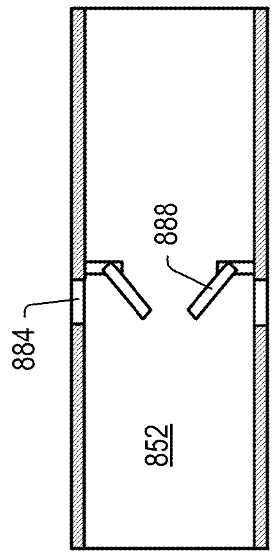

FIG. 210 depicts a cross-sectional representation of an embodiment of an oxidizer shield.

Figure 211:
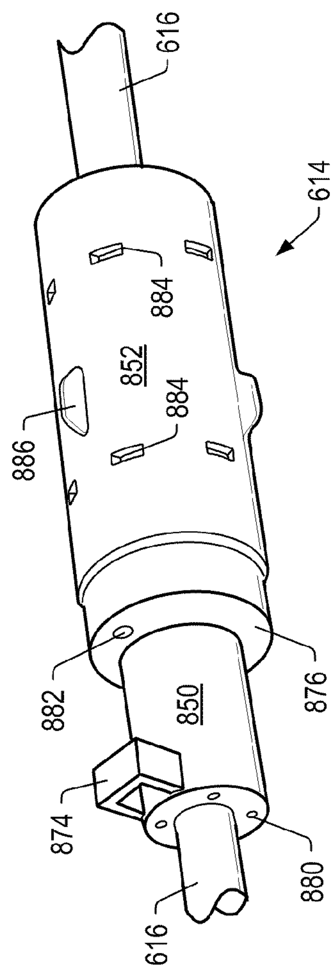

FIG. 211 depicts a perspective representation of an embodiment of a portion of an oxidizer of a downhole oxidizer assembly with louvered openings in the shield.

Figure 212:
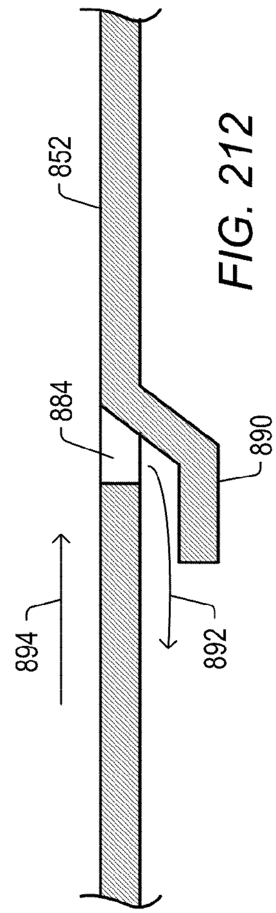

FIG. 212 depicts a cross-sectional representation of a portion of a shield with a louvered opening.

Figure 213:
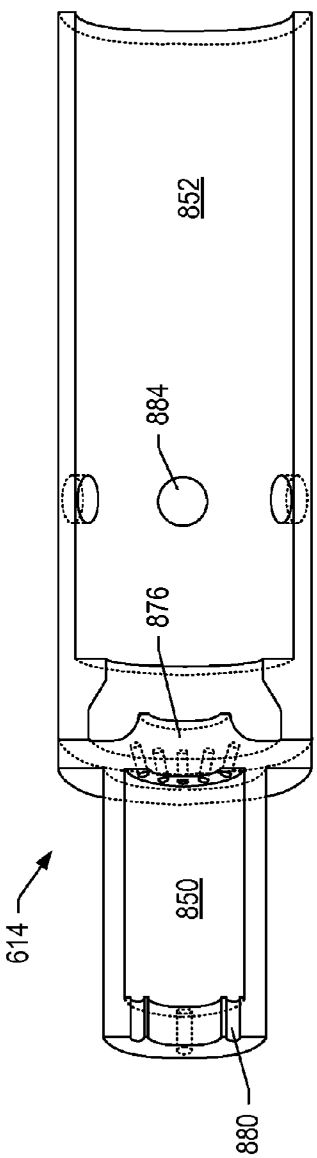

FIG. 213 depicts a perspective representation of an embodiment of a sectioned oxidizer.

Figure 214:
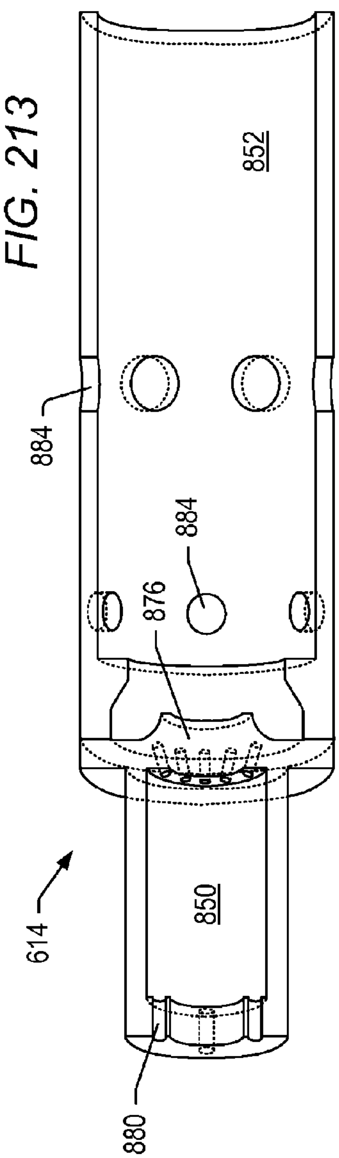

FIG. 214 depicts a perspective representation of an embodiment of a sectioned oxidizer.

Figure 215:
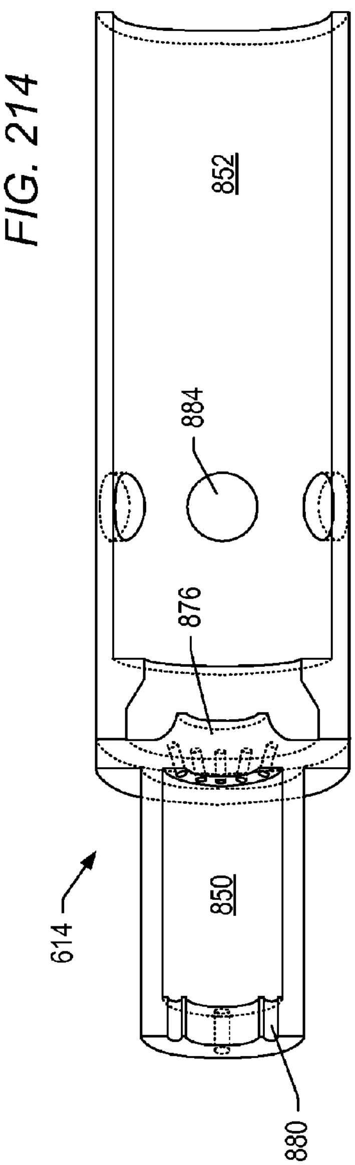

FIG. 215 depicts a perspective representation of an embodiment of a sectioned oxidizer.

Figure 216:
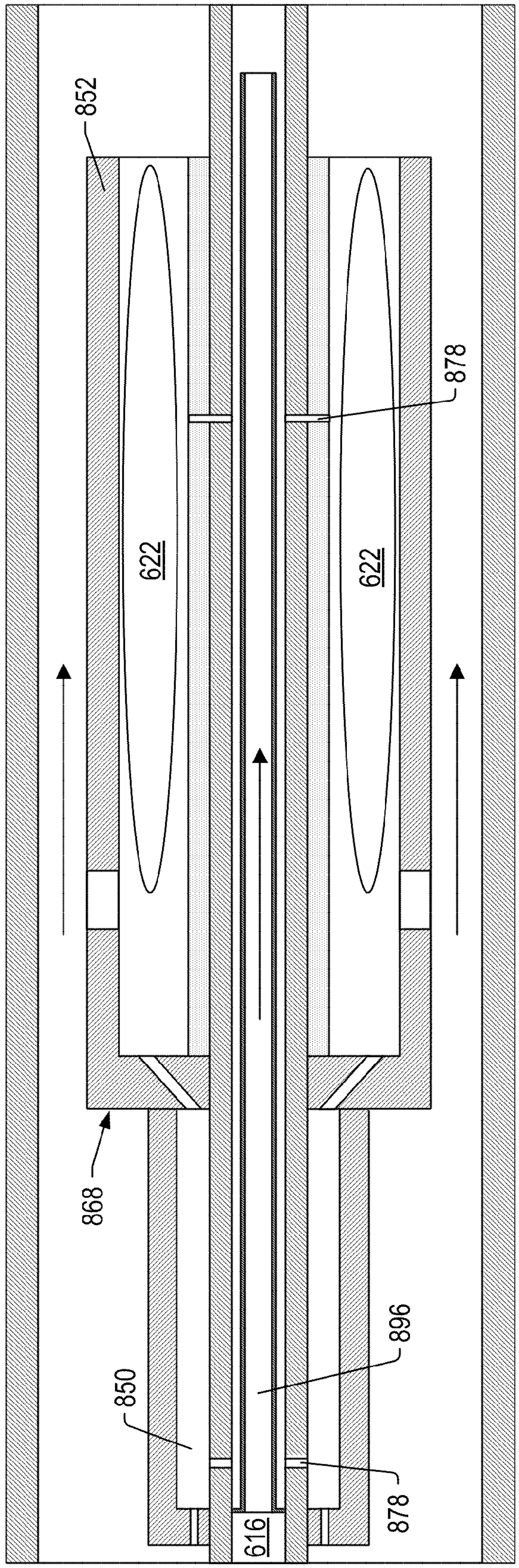

FIG. 216 depicts a cross-sectional representation of an embodiment of a first oxidizer of an oxidizer assembly.

Figure 217:
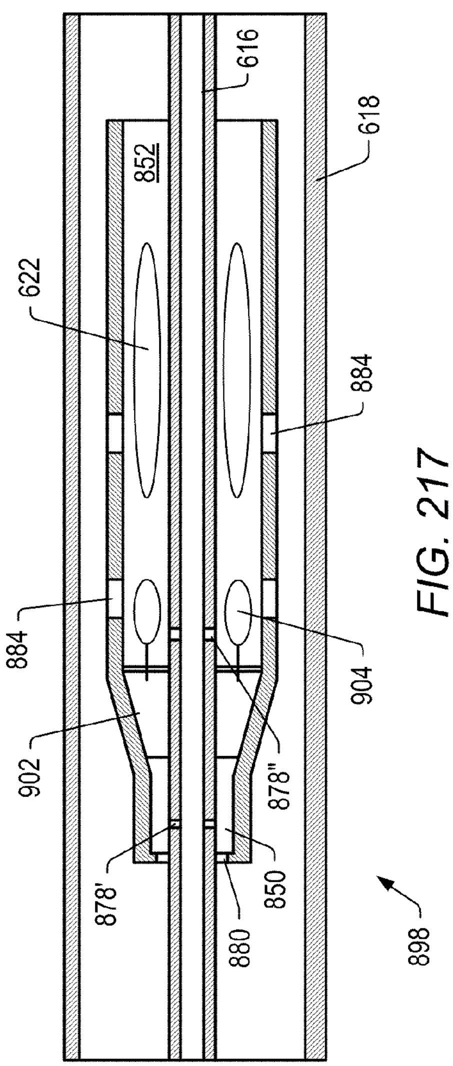

FIG. 217 depicts a cross-sectional representation of an embodiment of a catalytic burner.

Figure 218:
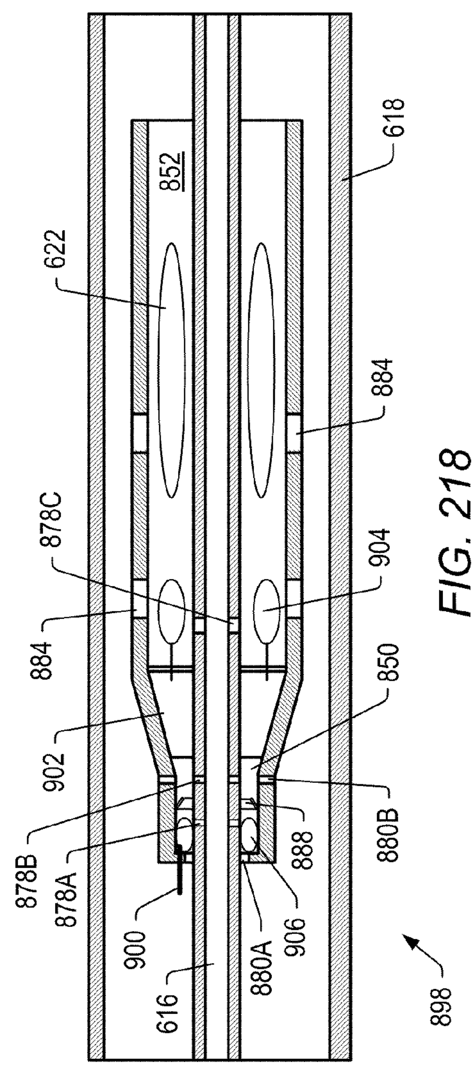

FIG. 218 depicts a cross-sectional representation of an embodiment of a catalytic burner with an igniter.

Figure 219:
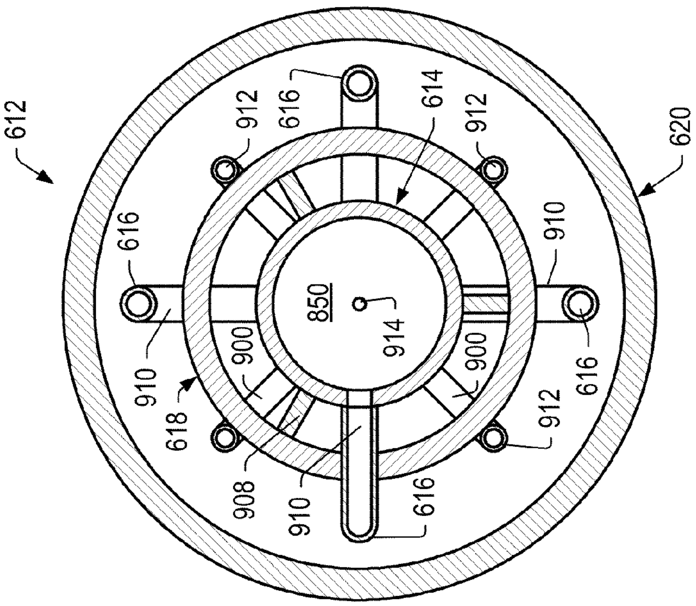

FIG. 219 depicts a cross-sectional representation of an oxidizer assembly.

Figure 220:
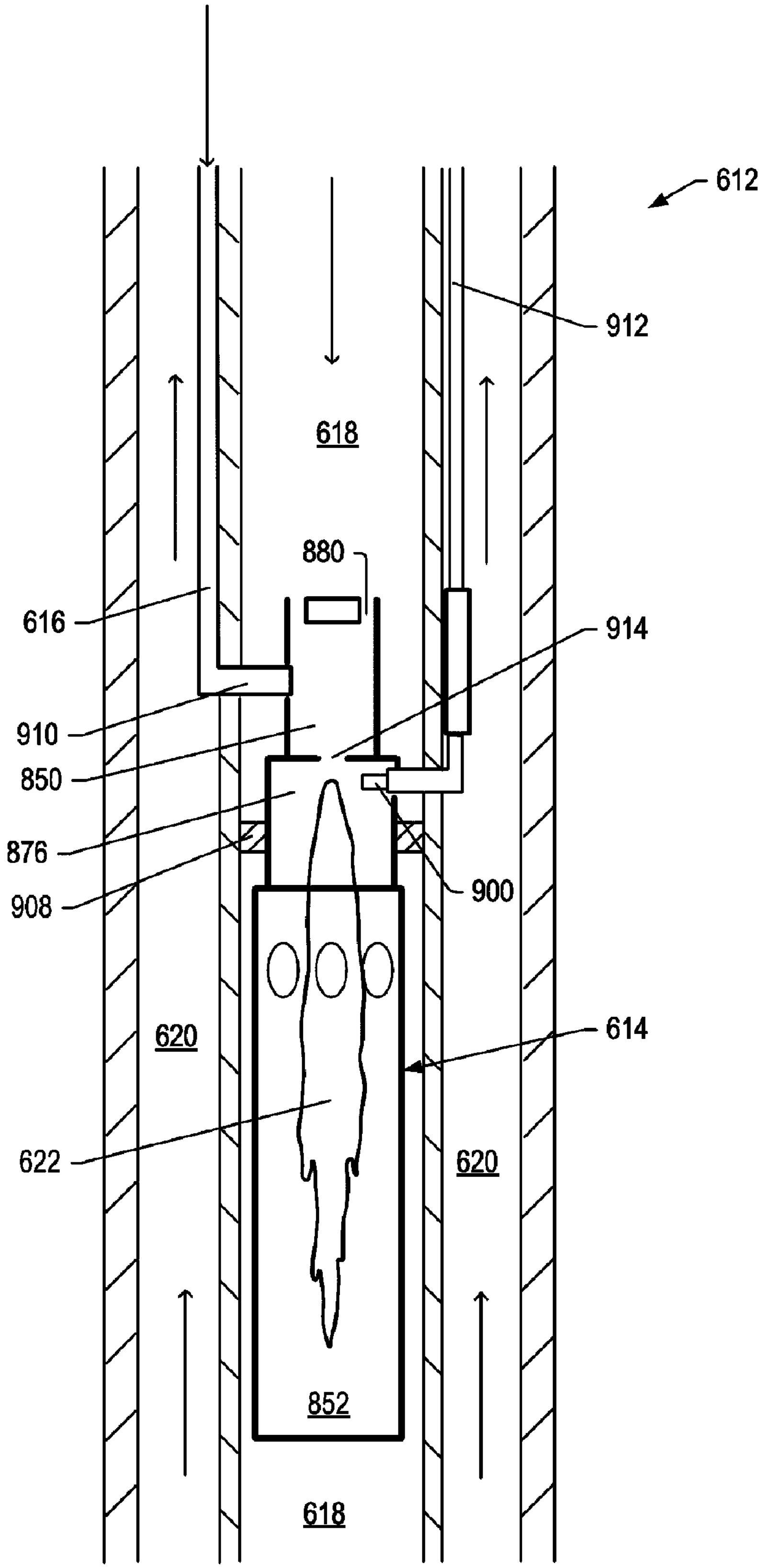

FIG. 220 depicts a cross-sectional representation of an oxidizer of an oxidizer assembly.

Figure 221:
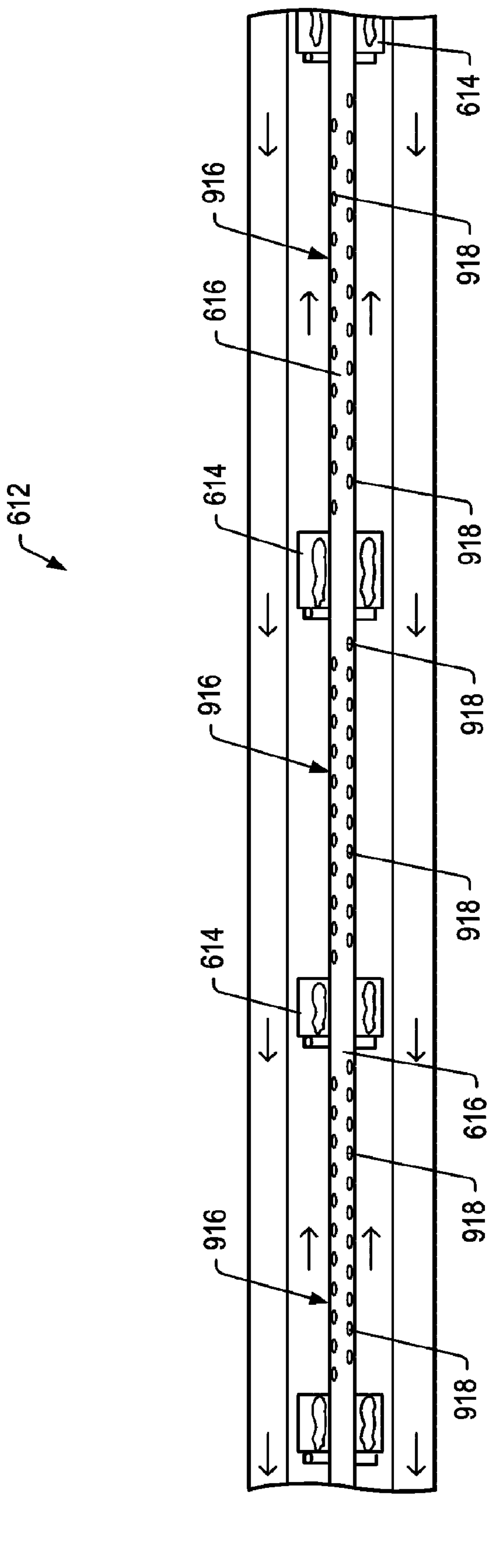

FIG. 221 depicts a schematic representation of an oxidizer assembly with flameless distributed combustors and oxidizers.

Figure 222:
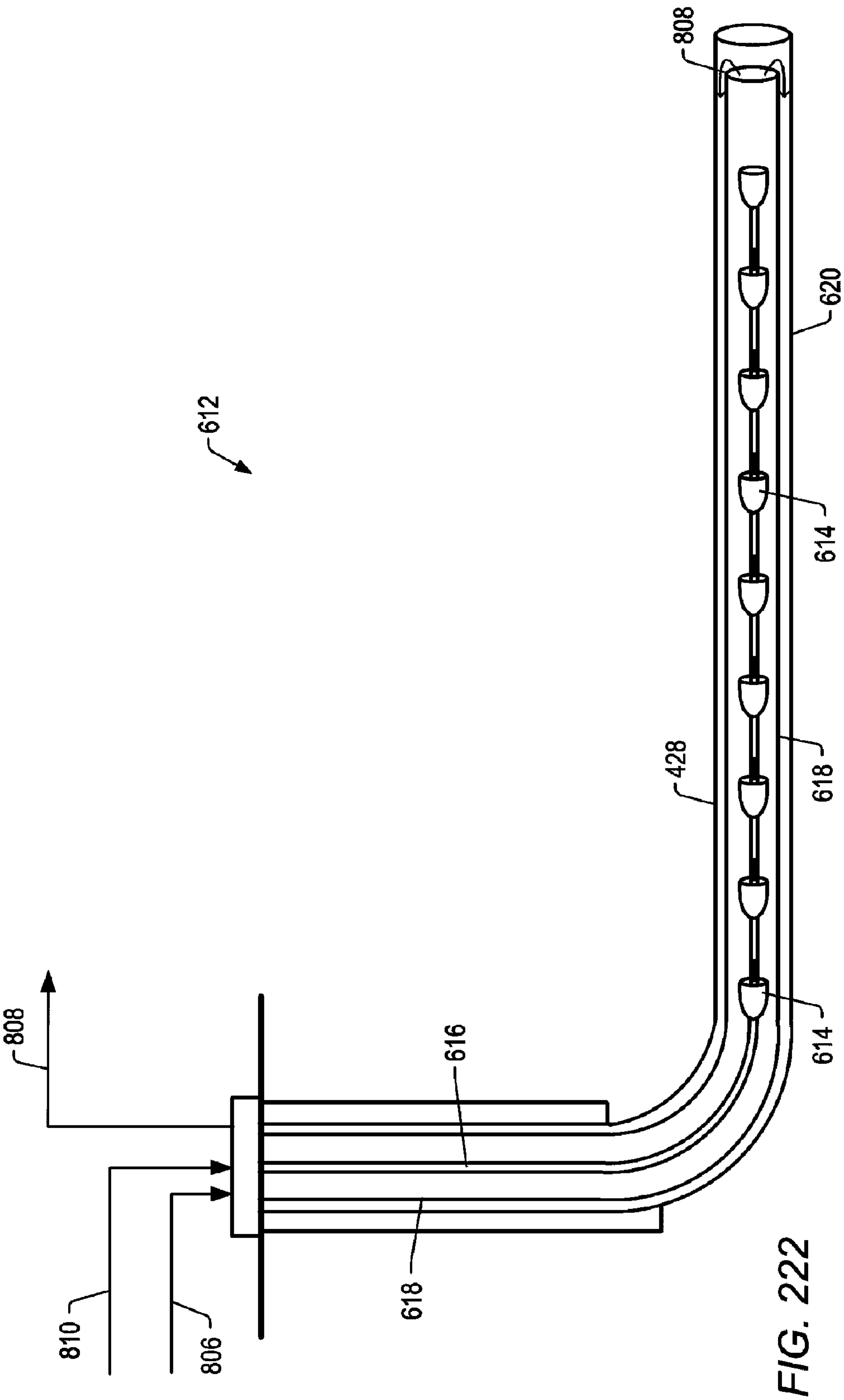

FIG. 222 depicts a schematic representation of an embodiment of a downhole oxidizer assembly.

Figure 223:
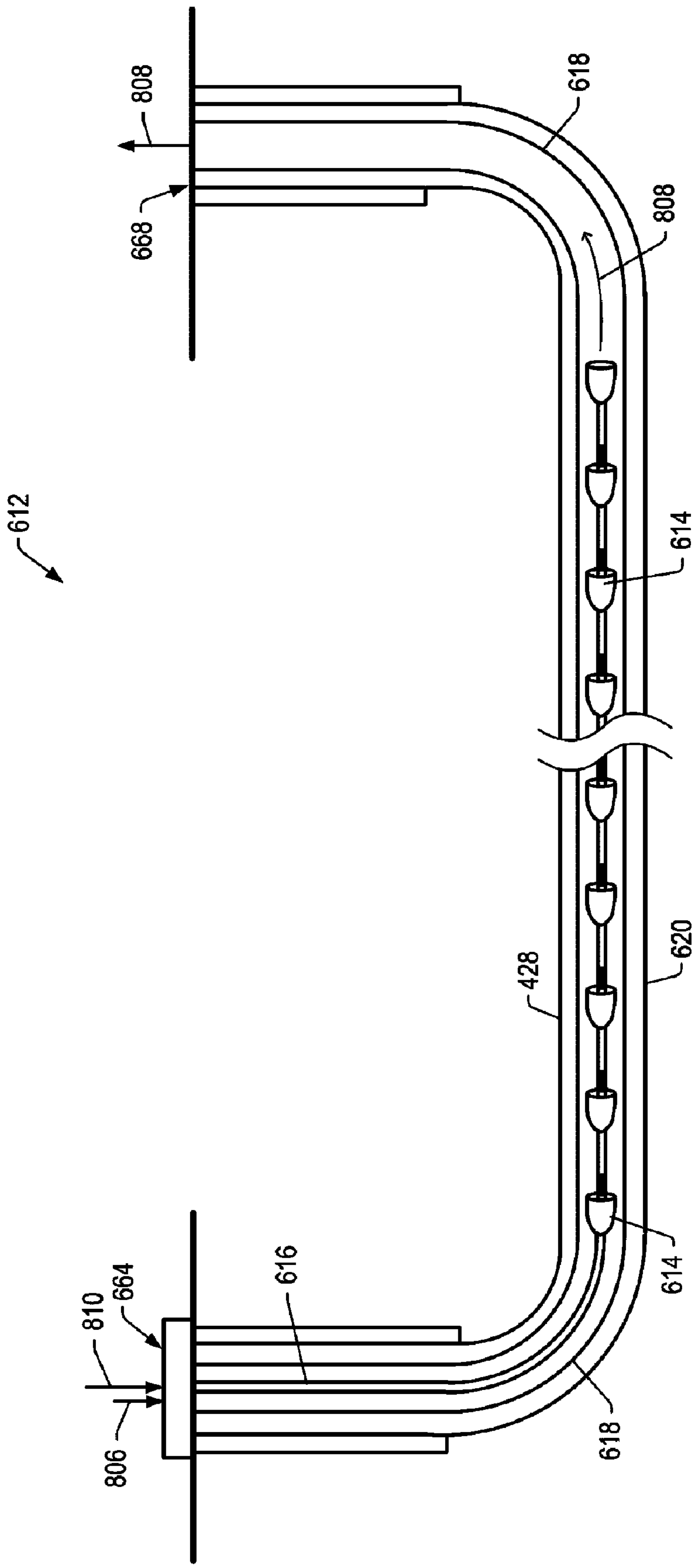

FIG. 223 depicts a schematic representation of an embodiment of a downhole oxidizer assembly.

Figure 224:
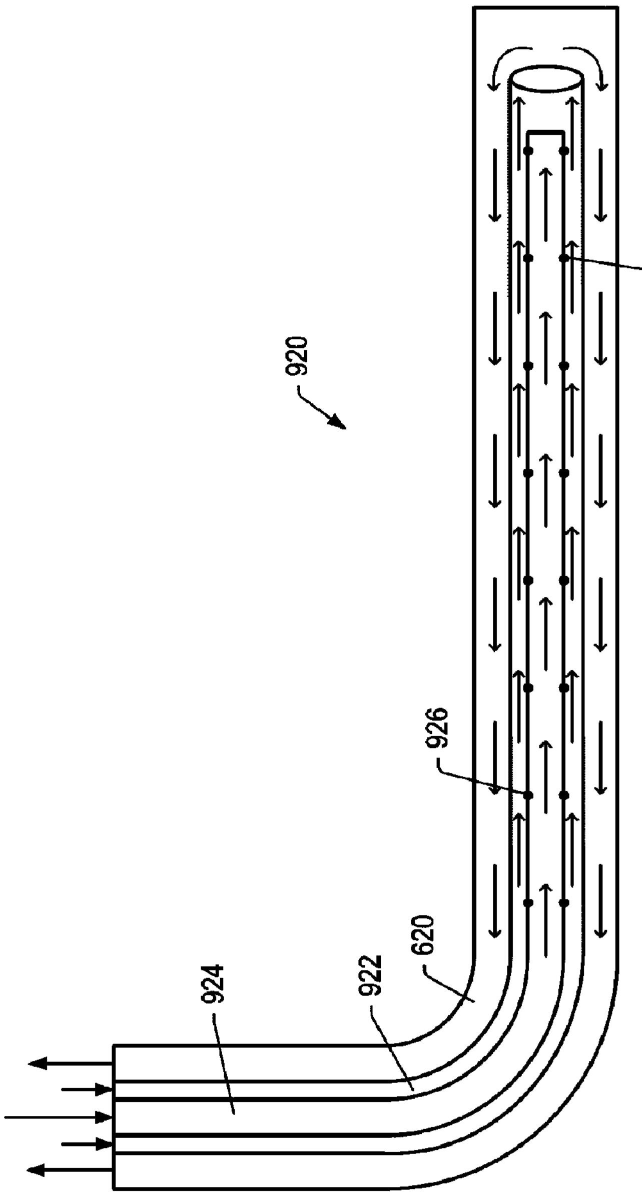

FIG. 224 depicts a schematic representation of an embodiment of a heater that uses coal as fuel.

Figure 225:
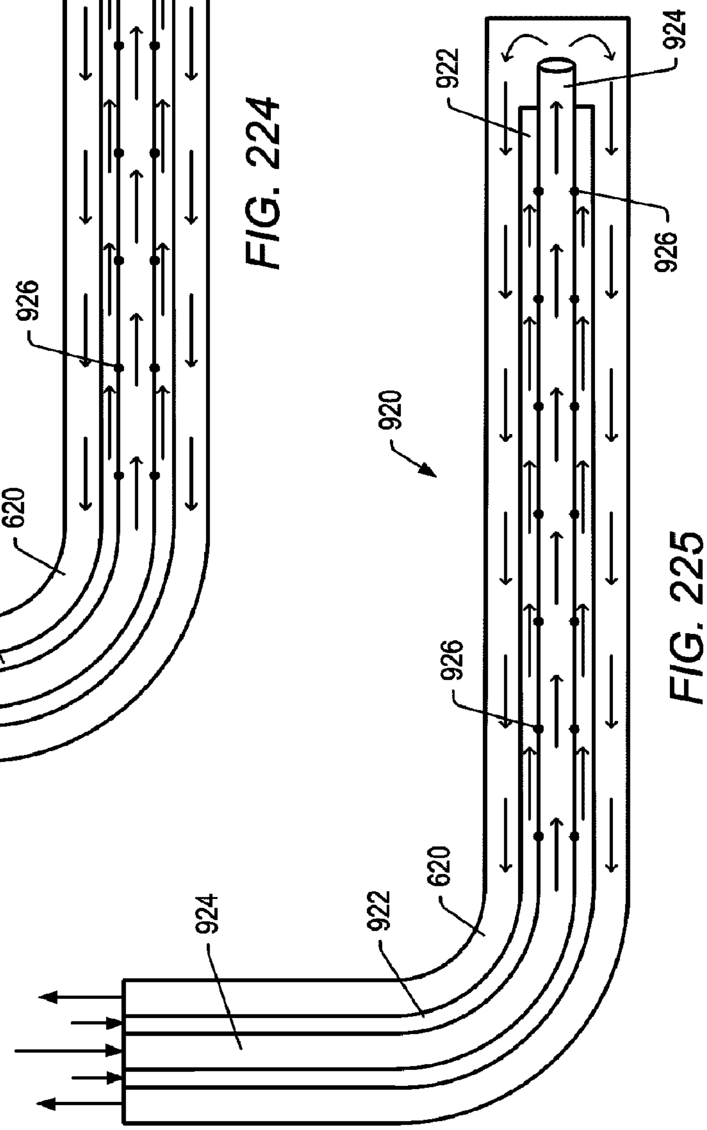

FIG. 225 depicts a schematic representation of an embodiment of a heater that uses coal as fuel.

Figure 226:
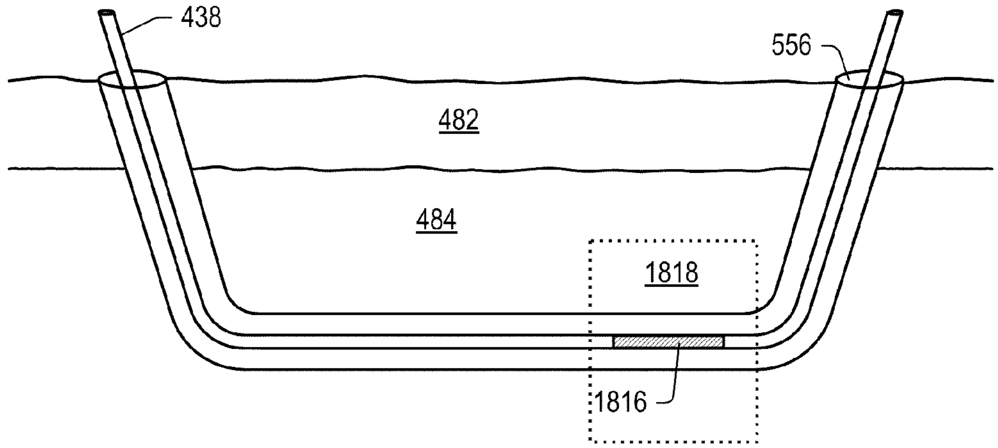

FIG. 226 depicts an embodiment of a heater with a heating section located in a u-shaped wellbore to create a first heated volume.

Figure 227:
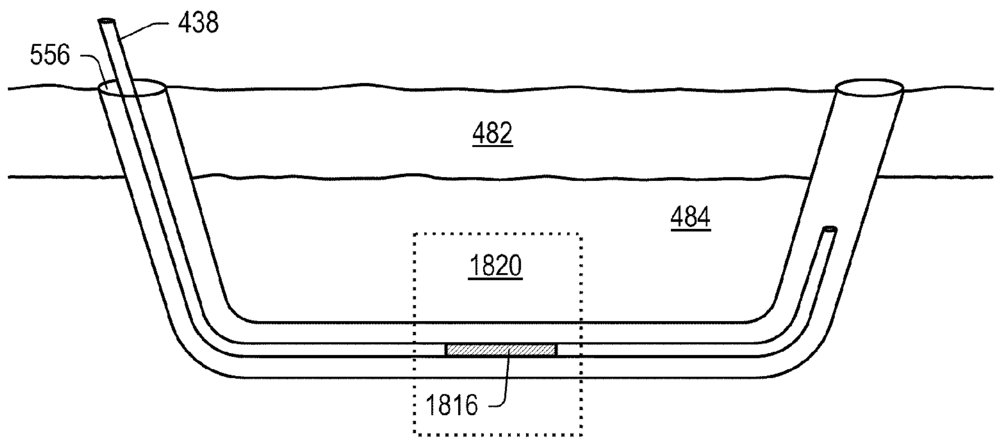

FIG. 227 depicts an embodiment of a heater with a heating section located in a u-shaped wellbore to create a second heated volume.

Figure 228:
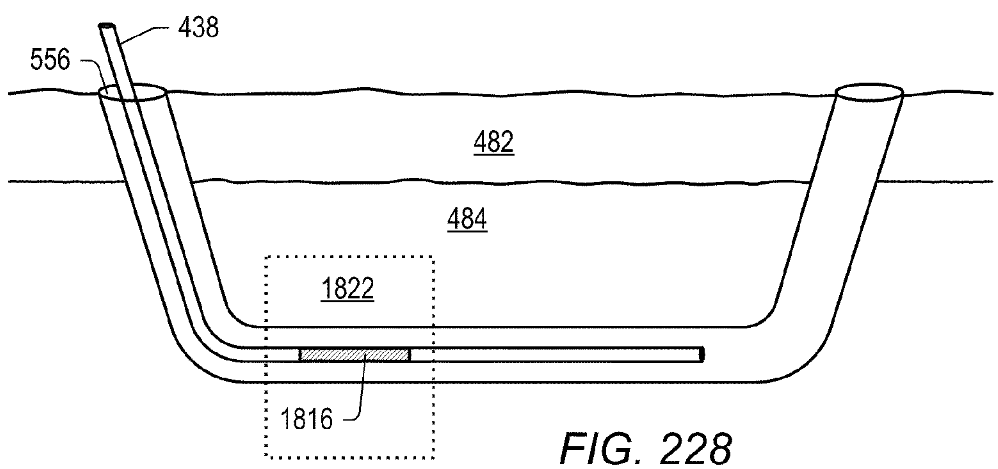

FIG. 228 depicts an embodiment of a heater with a heating section located in a u-shaped wellbore to create a third heated volume.

Figure 229:
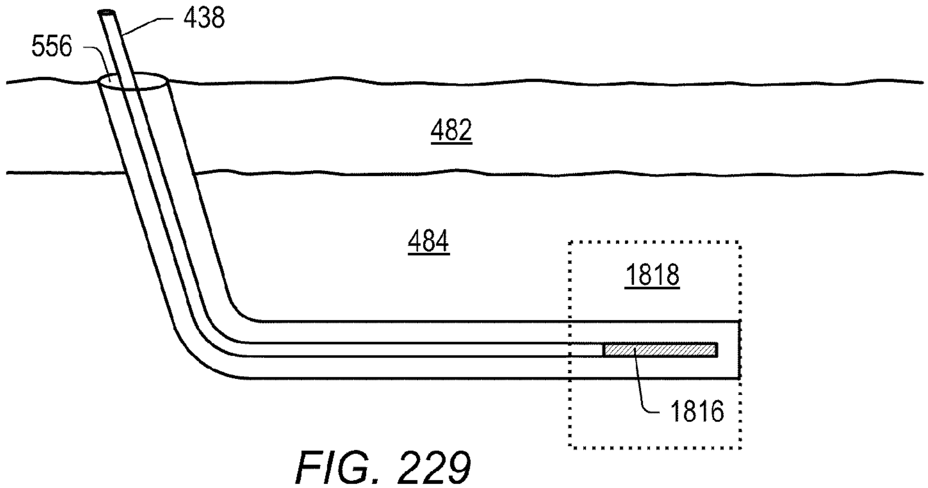

FIG. 229 depicts an embodiment of a heater with a heating section located in an L-shaped or J-shaped wellbore to create a first heated volume.

Figure 230:
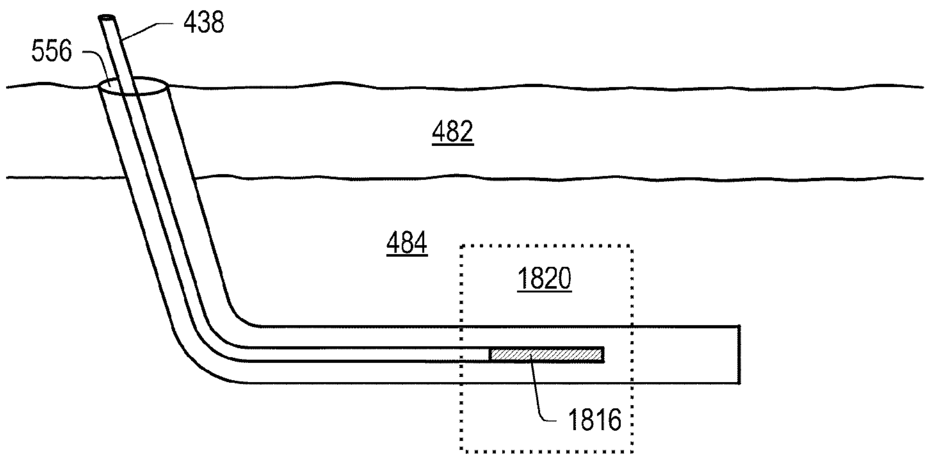

FIG. 230 depicts an embodiment of a heater with a heating section located in an L-shaped or J-shaped wellbore to create a second heated volume.

Figure 231:
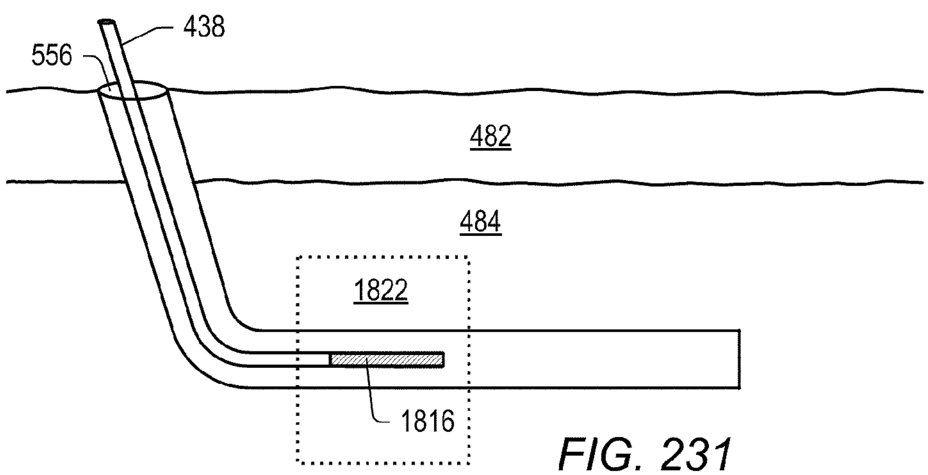

FIG. 231 depicts an embodiment of a heater with a heating section located in an L-shaped or J-shaped wellbore to create a third heated volume.

Figure 232:
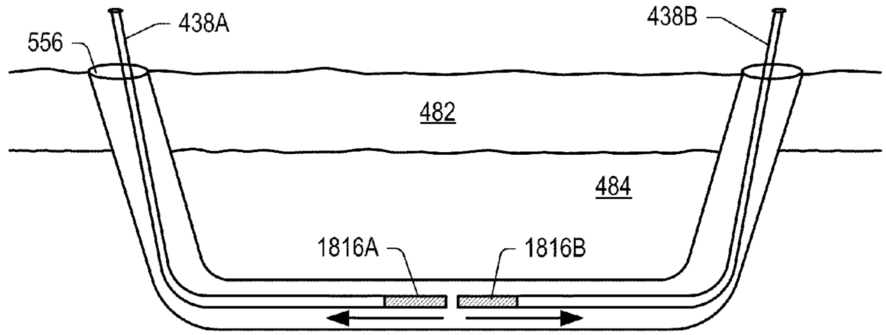

FIG. 232 depicts an embodiment of two heaters with heating sections located in a u-shaped wellbore to create two heated volumes.

Figure 233:
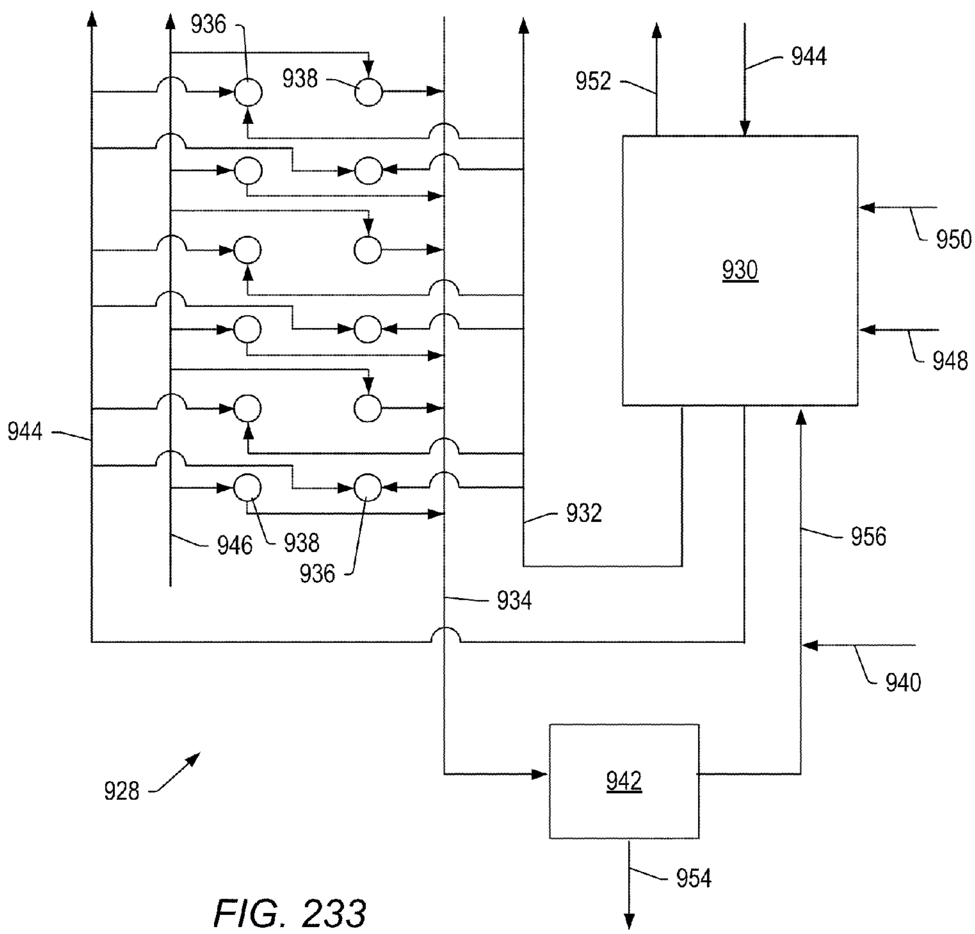

FIG. 233 depicts a schematic representation of an embodiment of a downhole fluid heating system.

Figure 234:
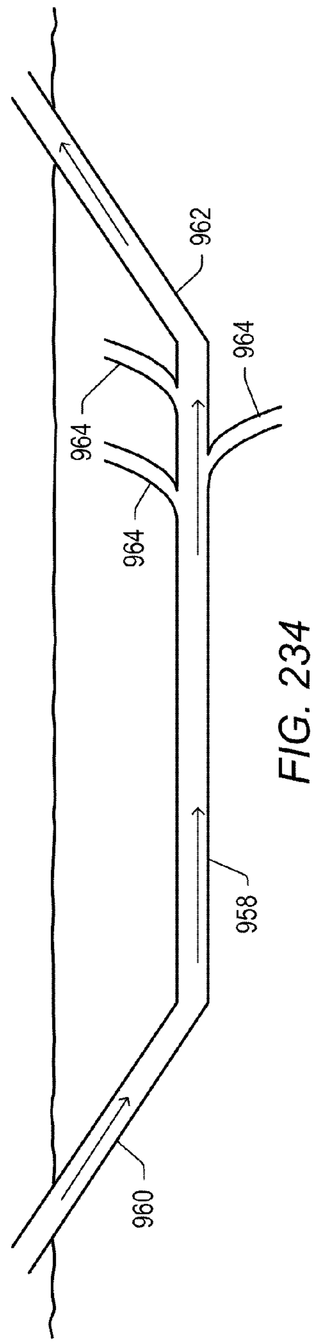

FIG. 234 depicts an embodiment of a wellbore for heating a formation using a burning fuel moving through the formation.

Figure 235:
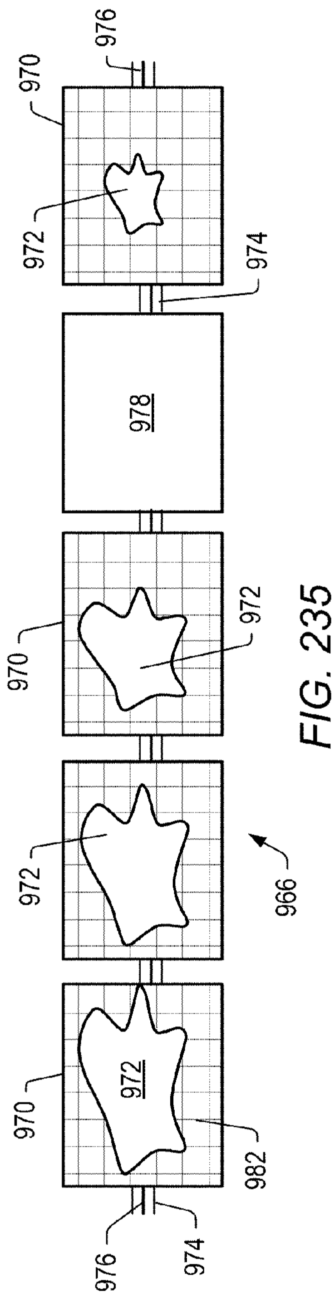

FIG. 235 depicts a top view representation of a portion of the fuel train used to heat the treatment area.

Figure 236:
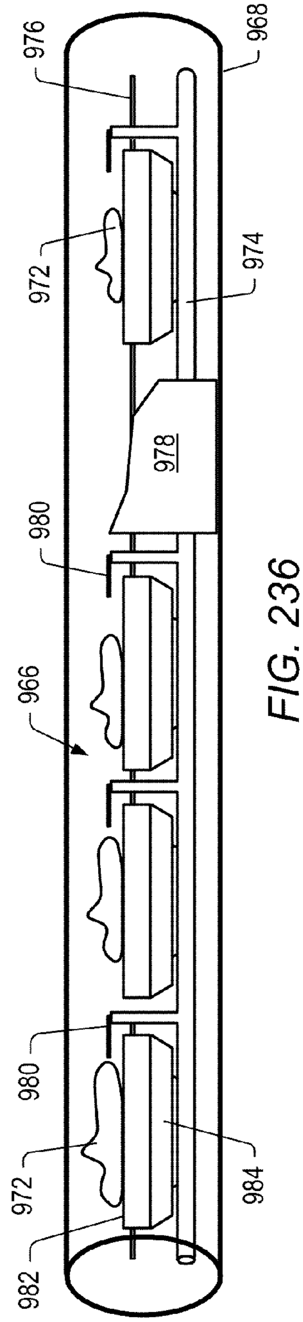

FIG. 236 depicts a side view representation of a portion of the fuel train used to heat the treatment area.

Figure 237:
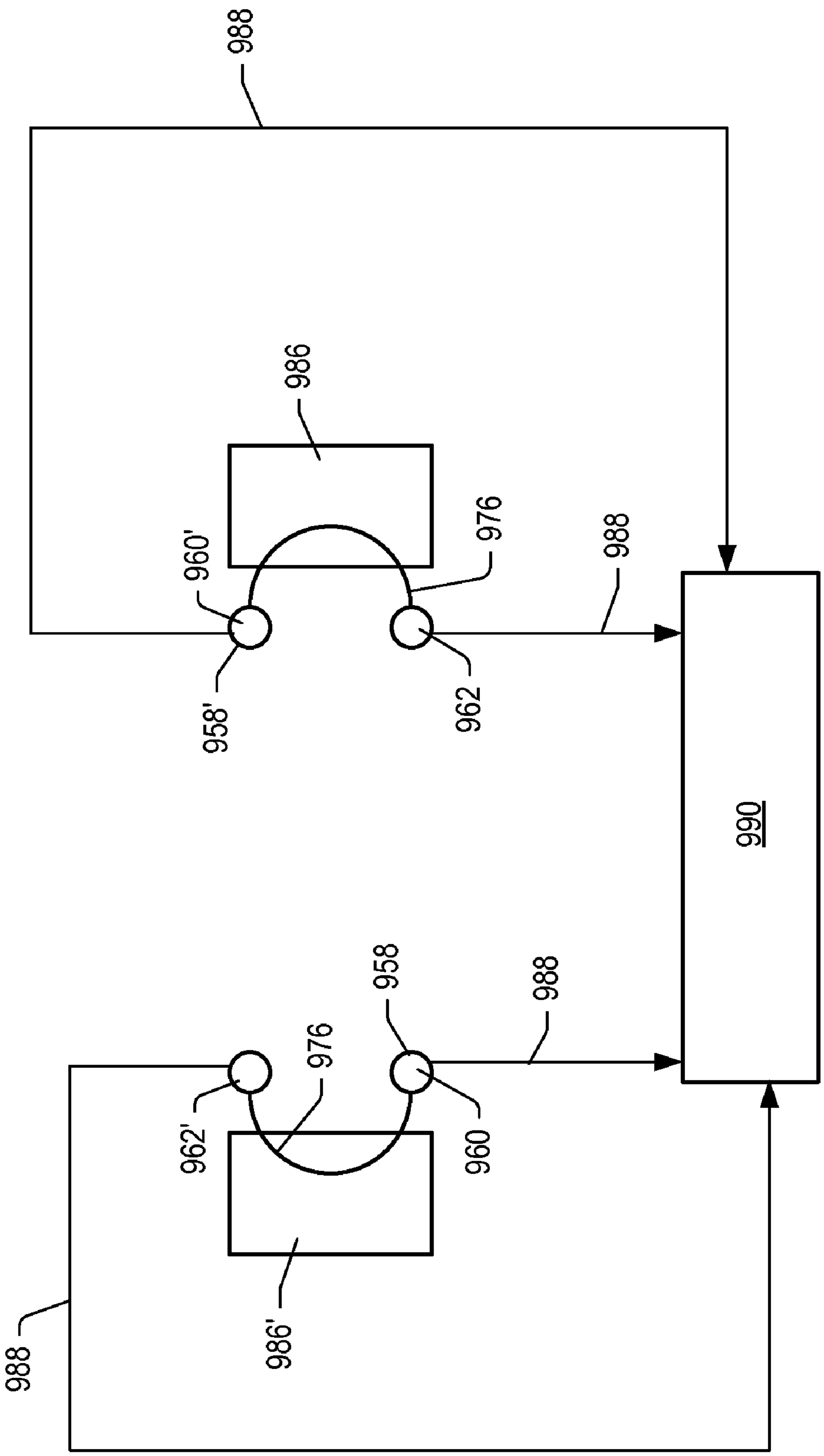

FIG. 237 depicts an aerial view representation of a system that heats the treatment area using burning fuel that is moved through the treatment area.

Figure 238:
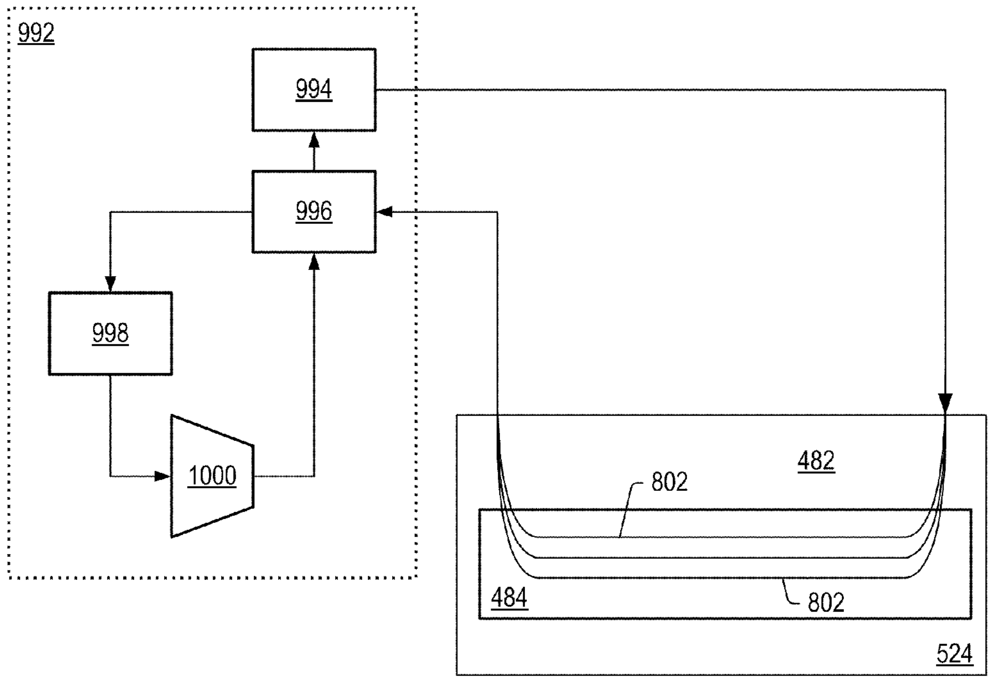

FIG. 238 depicts a schematic representation of a heat transfer fluid circulation system for heating a portion of a formation.

Figure 239:
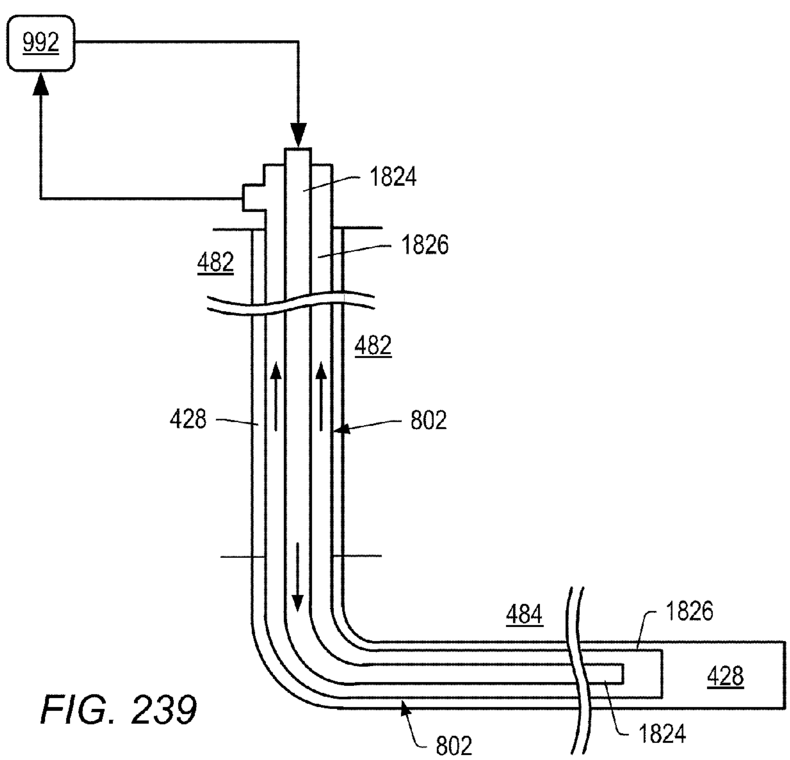

FIG. 239 depicts a schematic representation of an embodiment of an L-shaped heater for use with a heat transfer fluid circulation system for heating a portion of a formation.

Figure 240:
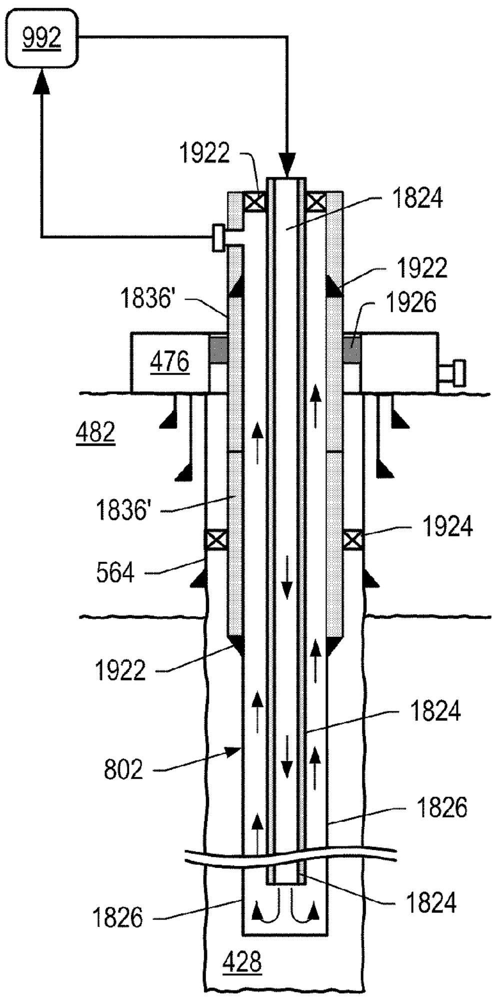

FIG. 240 depicts a schematic representation of an embodiment of a vertical heater for use with a heat transfer fluid circulation system for a heating a portion of a formation where thermal expansion of the heater is accommodated below the surface.

Figure 241:
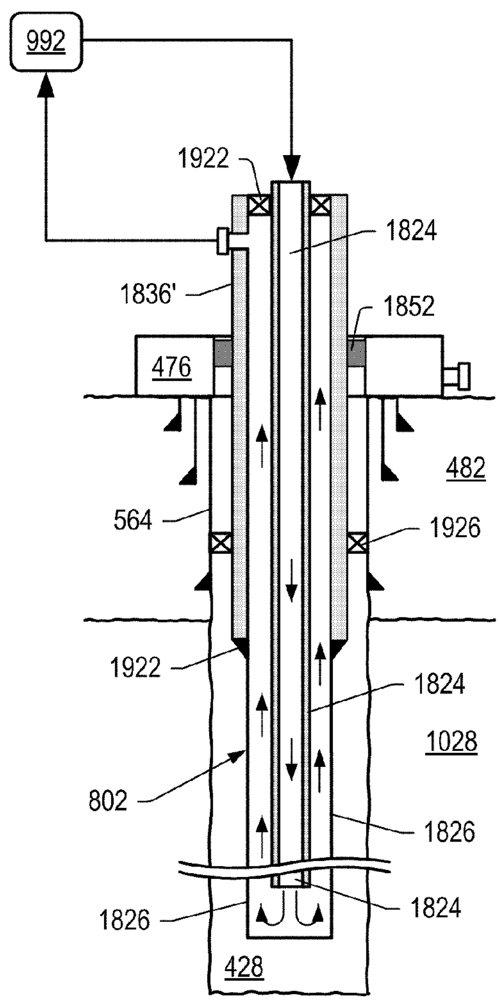

FIG. 241 depicts a schematic representation of an embodiment of a vertical heater for use with a heat transfer fluid circulation system for a heating a portion of a formation where thermal expansion of the heater is accommodated above and below the surface.

Figure 242:
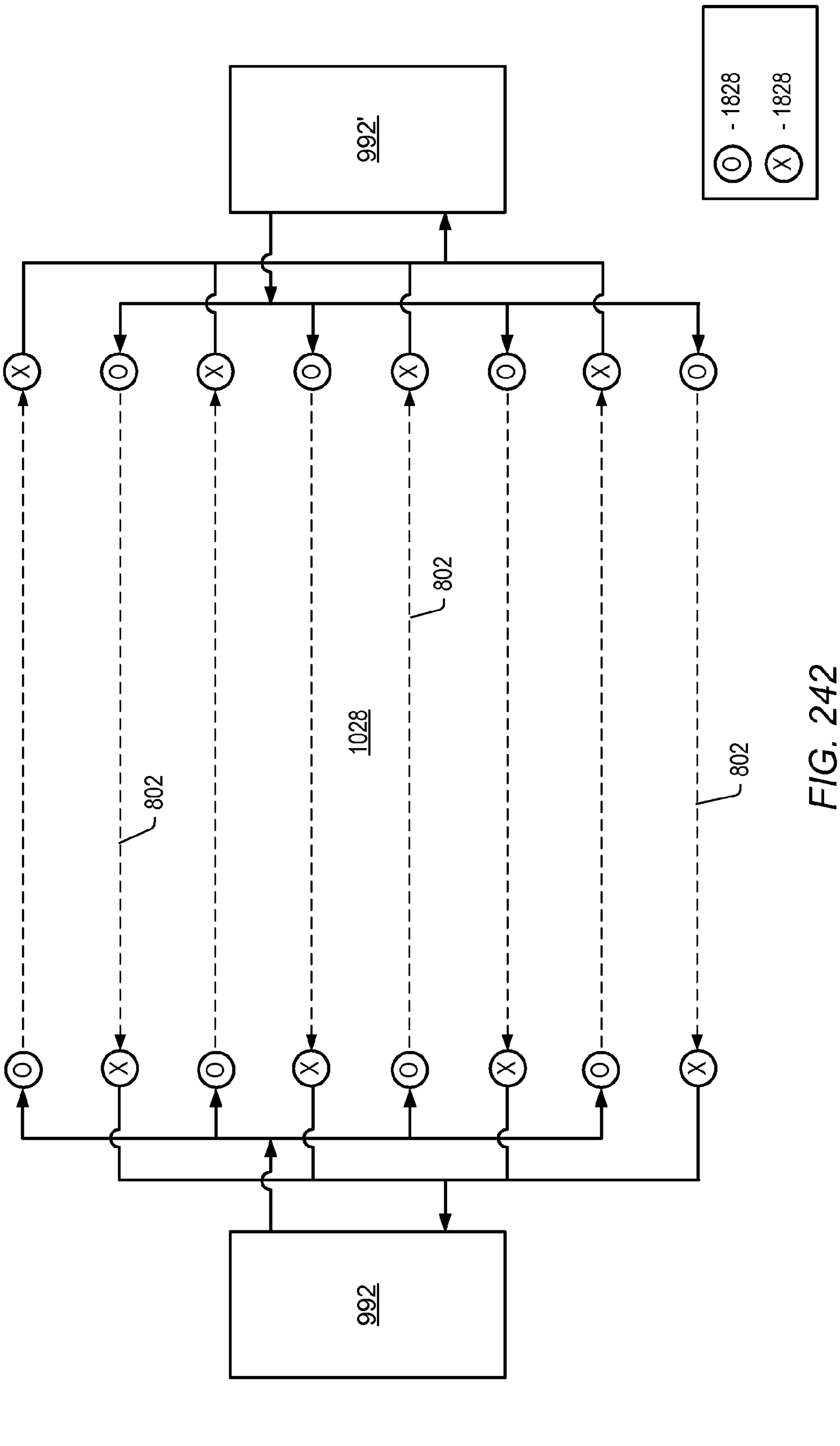

FIG. 242 depicts a schematic representation of a portion of formation that is treated using a corridor pattern system.

Figure 243:
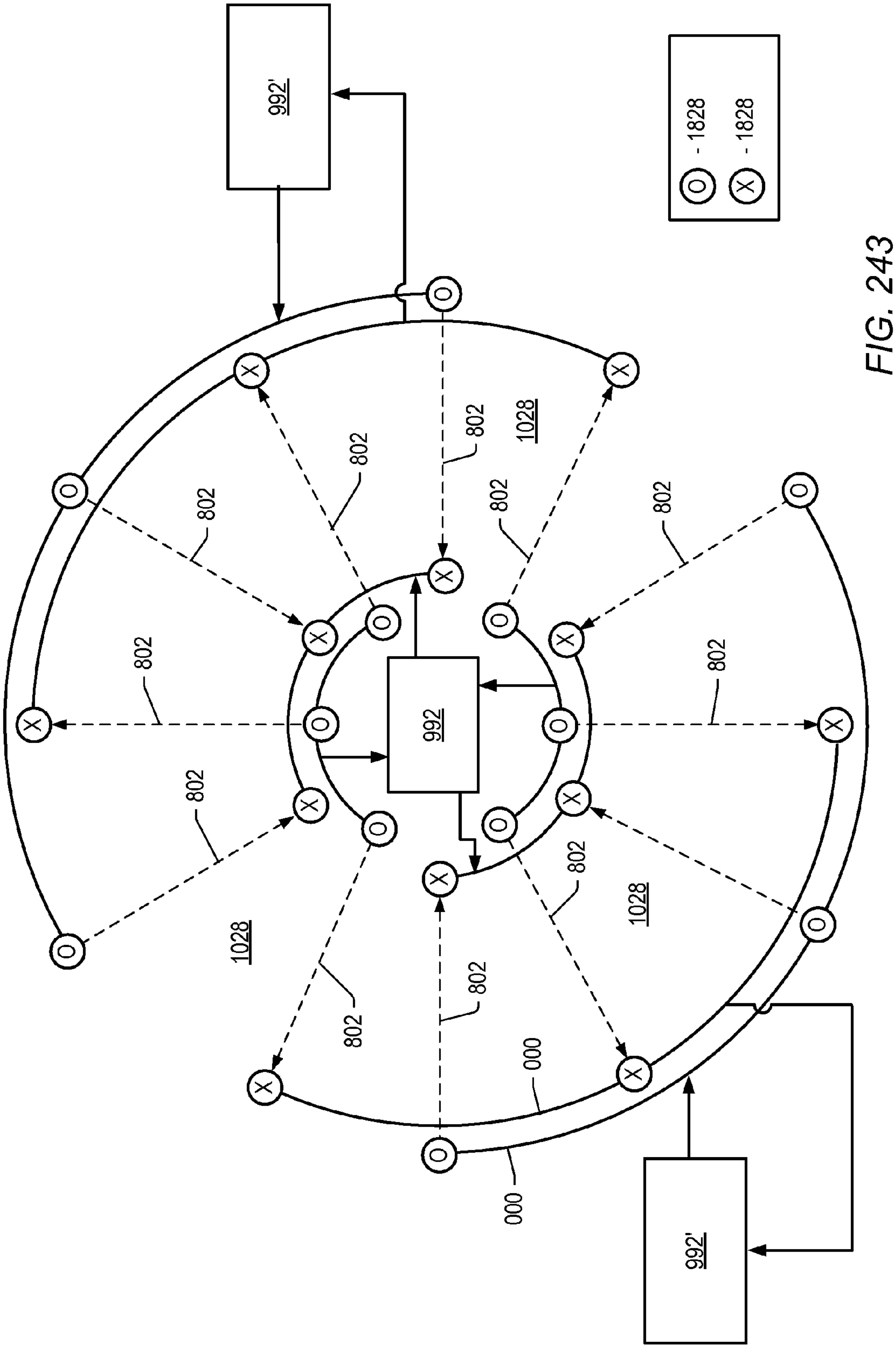

FIG. 243 depicts a schematic representation of a portion of formation that is treated using a radial pattern system.

Figure 244:
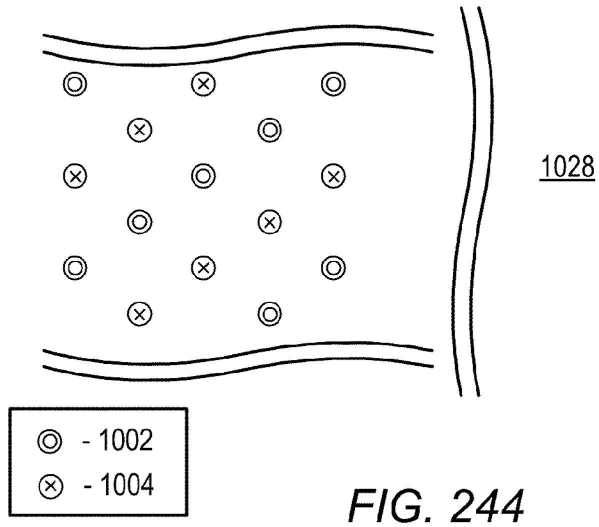

FIG. 244 depicts a plan view of wellbore entries and exits from a portion of a formation to be heated using a closed loop circulation system.

Figure 245:
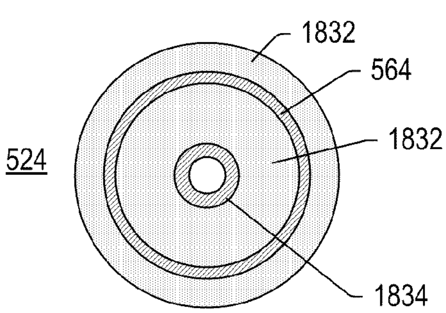

FIG. 245 depicts a cross-sectional view of an embodiment of overburden insulation that utilizes insulating cement.

Figure 246:
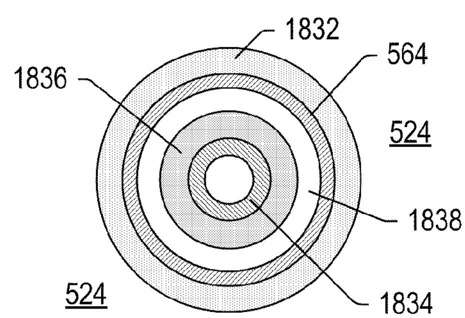

FIG. 246 depicts a cross-sectional view of an embodiment of overburden insulation that utilizes an insulating sleeve.

Figure 247:
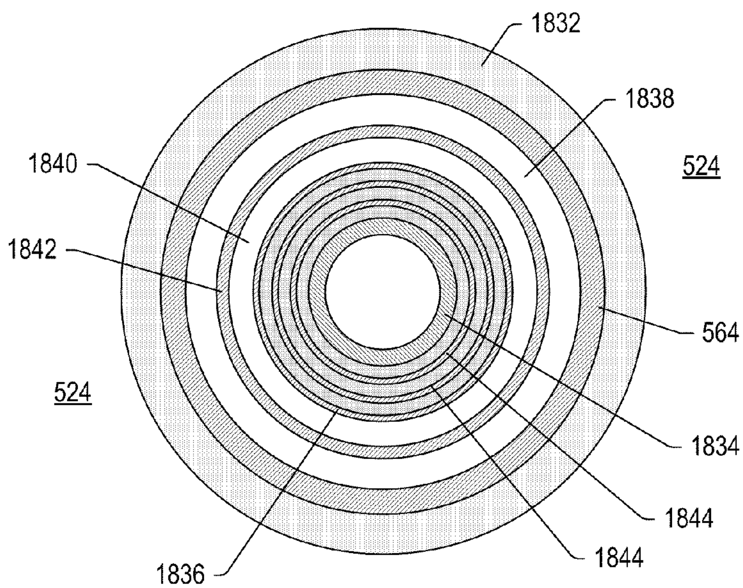

FIG. 247 depicts a cross-sectional view of an embodiment of overburden insulation that utilizes an insulating sleeve and a vacuum.

Figure 248:
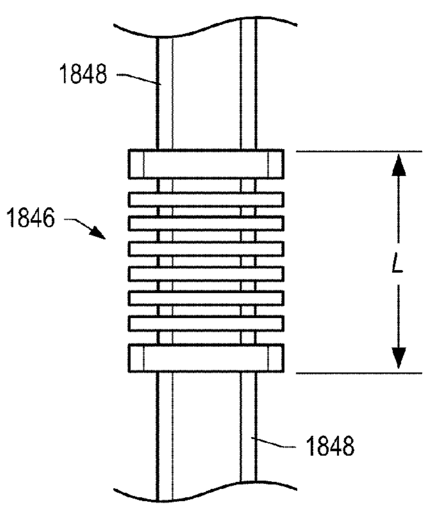

FIG. 248 depicts a representation of bellows used to accommodate thermal expansion.

Figure 249:
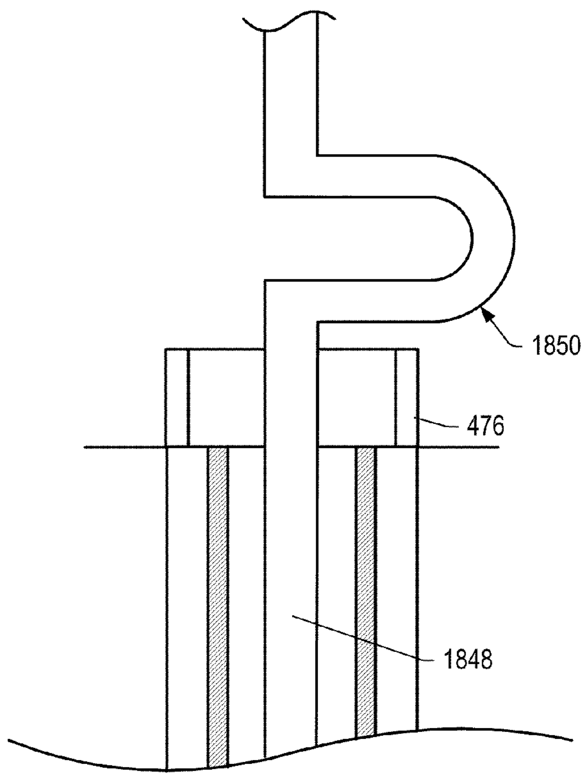

FIG. 249 depicts a representation of piping with an expansion loop for accommodating thermal expansion.

Figure 250:
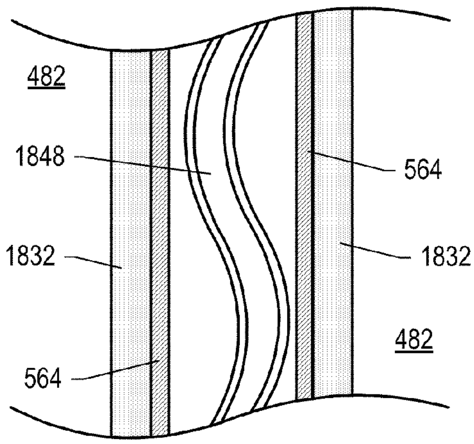

FIG. 250 depicts a representation of insulated piping in a large diameter casing in the overburden.

Figure 251:
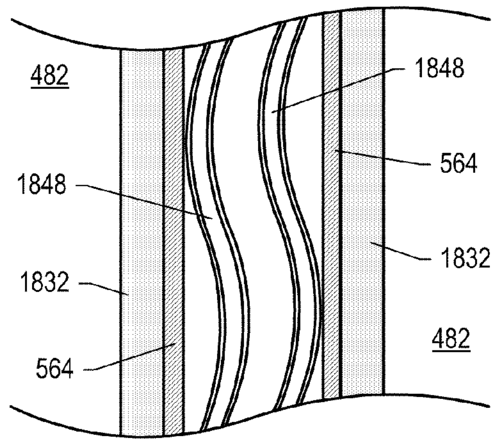

FIG. 251 depicts a representation of insulated piping in a large diameter casing in the overburden to accommodate thermal expansion.

Figure 252:
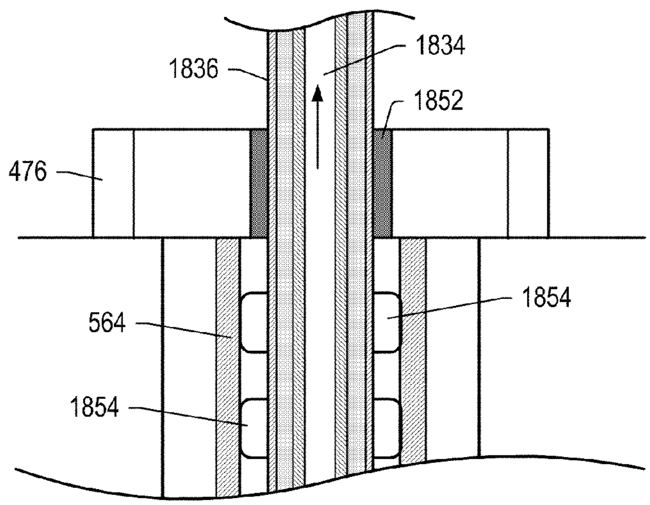

FIG. 252 depicts a representation of an embodiment of a wellhead with a sliding seal, stuffing box or other pressure control equipment that allows a portion of a heater to move relative to the wellhead.

Figure 253:
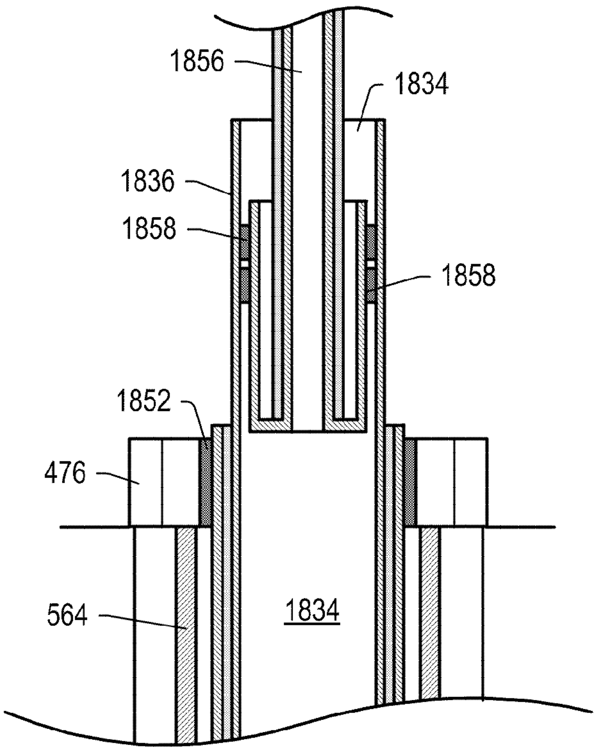

FIG. 253 depicts a representation of an embodiment of wellhead with a slip joint that interacts with a fixed conduit above the wellhead.

Figure 254:
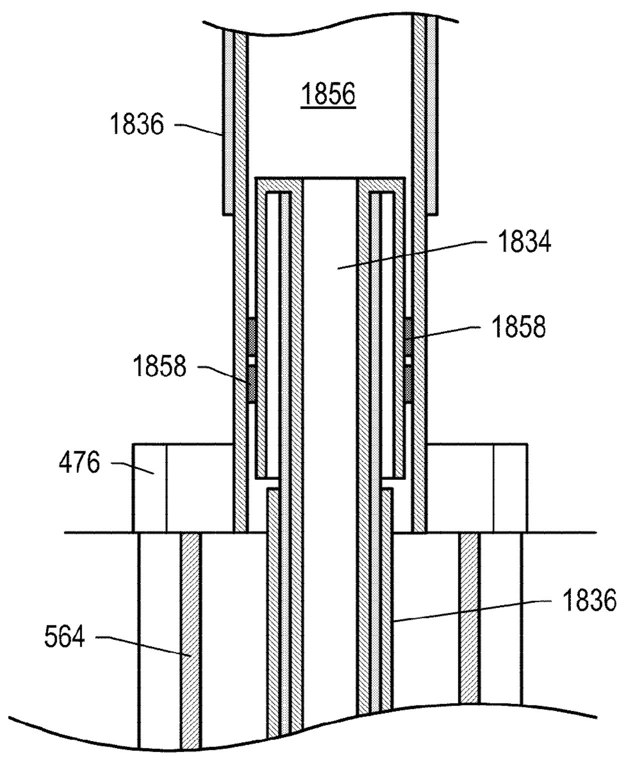

FIG. 254 depicts a representation of an embodiment of wellhead with a slip joint that interacts with a fixed conduit coupled to the wellhead.

Figure 255:
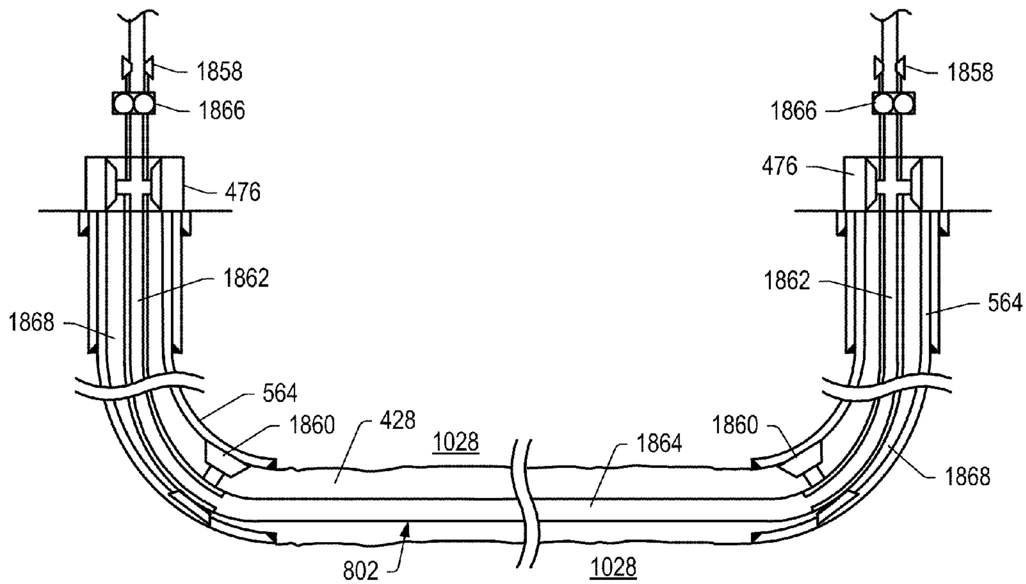

FIG. 255 depicts a representation of a u-shaped wellbore with hot heat transfer fluid circulation system heater positioned in the wellbore.

Figure 256:
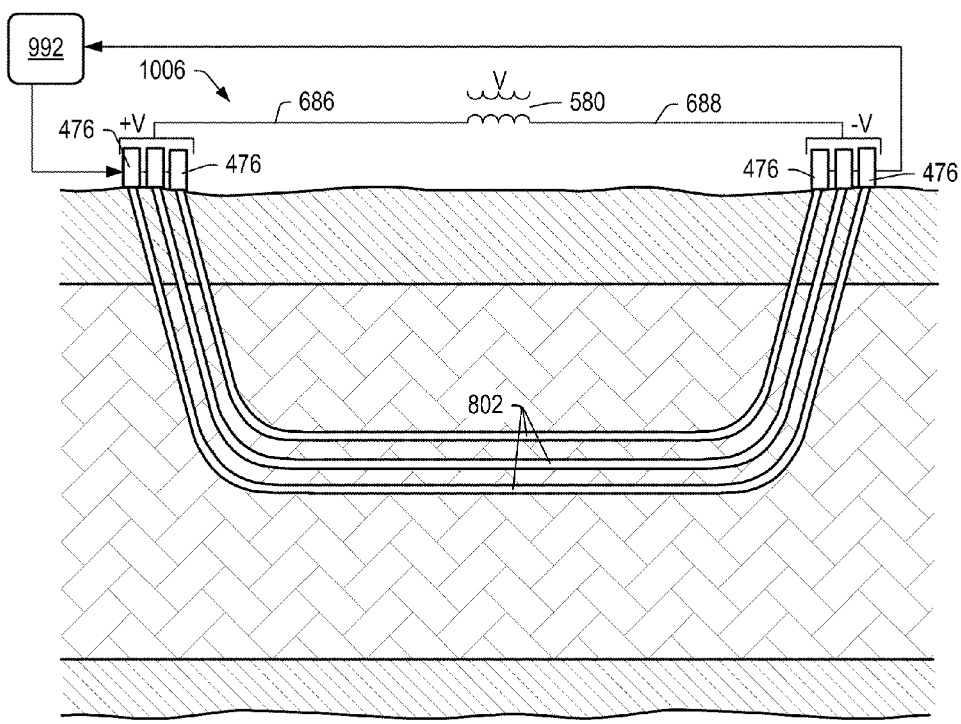

FIG. 256 depicts a side view representation of an embodiment of a system for heating the formation that can use a closed loop circulation system and/or electrical heating.

Figure 257:
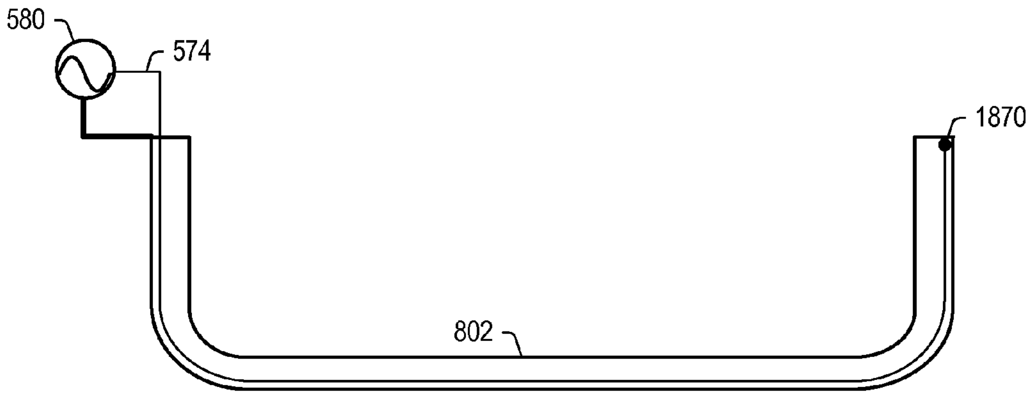

FIG. 257 depicts a representation of a heat transfer fluid conduit that may initially be resistively heated with the return current path provided by an insulated conductor.

Figure 258:
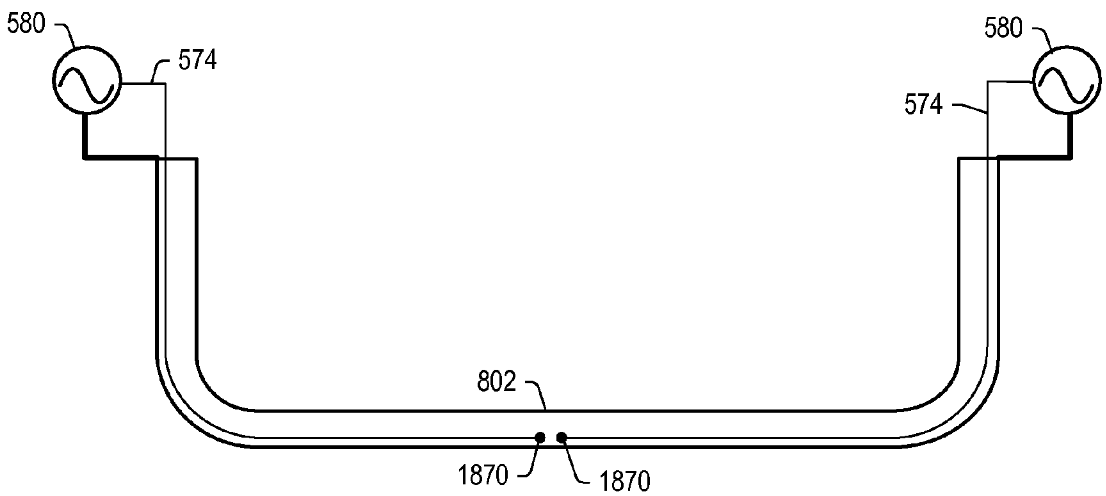

FIG. 258 depicts a representation of a heat transfer fluid conduit that may initially be resistively heated with the return current path provided by two insulated conductors.

Figure 259:
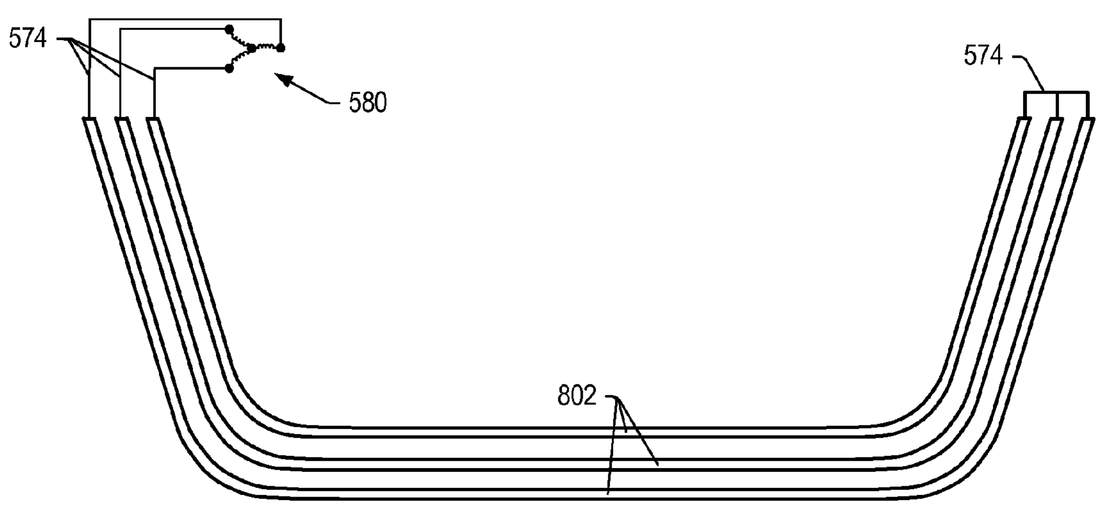

FIG. 259 depicts a representation of insulated conductors used to resistively heat heaters of a circulated fluid heating system.

Figure 260:
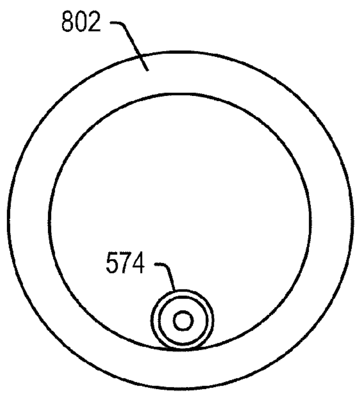

FIG. 260 depicts a representation of a heater of a heat transfer fluid circulation system with an insulated conductor heater positioned in the piping.

Figure 261:
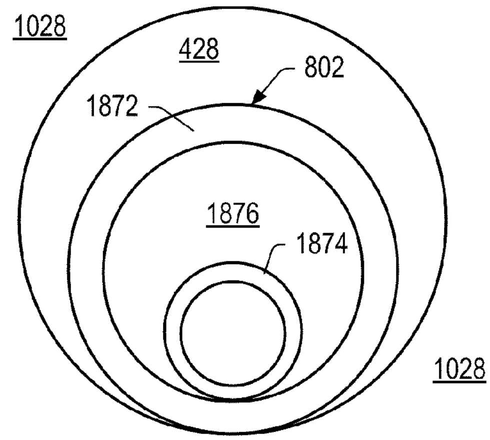

FIG. 261 depicts a cross-sectional view of an embodiment of a conduit-in-conduit heater for a heat transfer circulation heating system adjacent to the treatment area.

Figure 262:
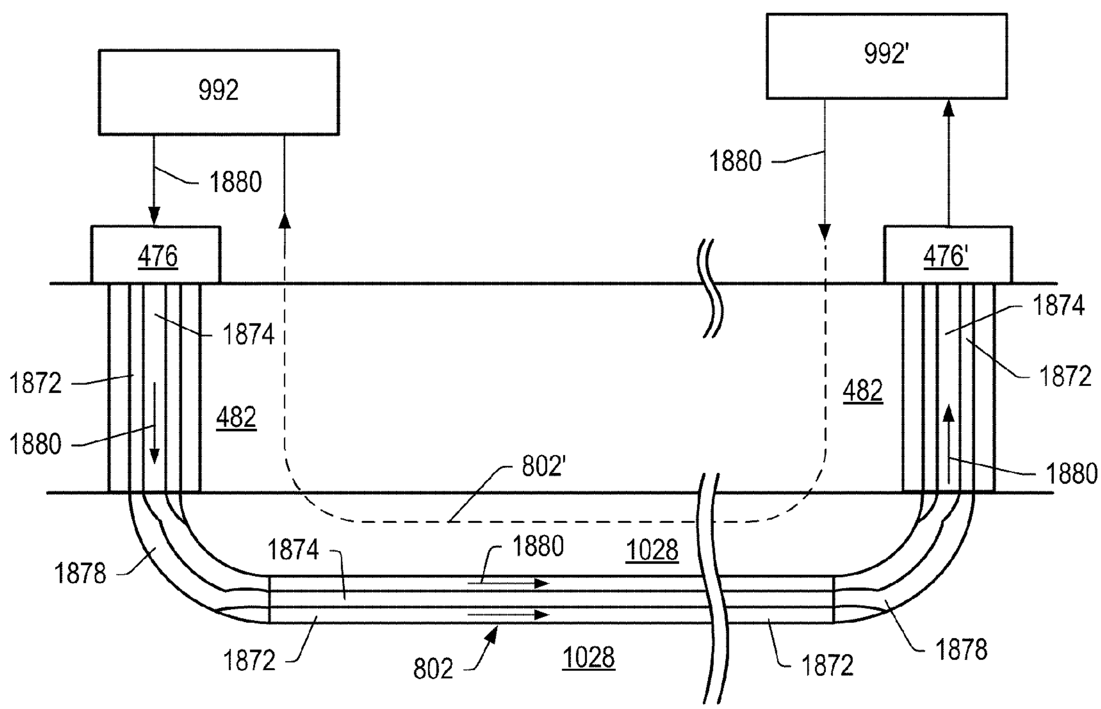

FIG. 262 depicts a schematic of an embodiment of conduit-in-conduit heaters of a fluid circulation heating system positioned in the formation.

Figure 263:
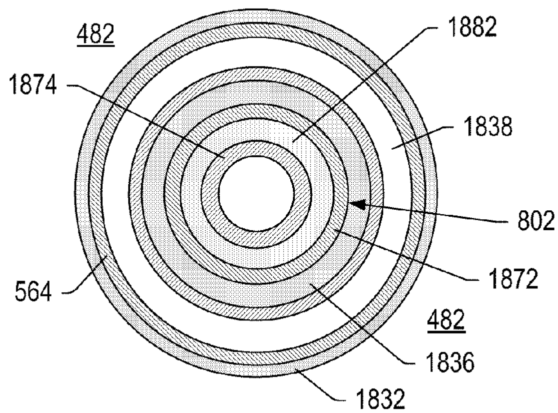

FIG. 263 depicts a cross-sectional view of an embodiment of a conduit-in-conduit heater adjacent to the overburden.

Figure 264:
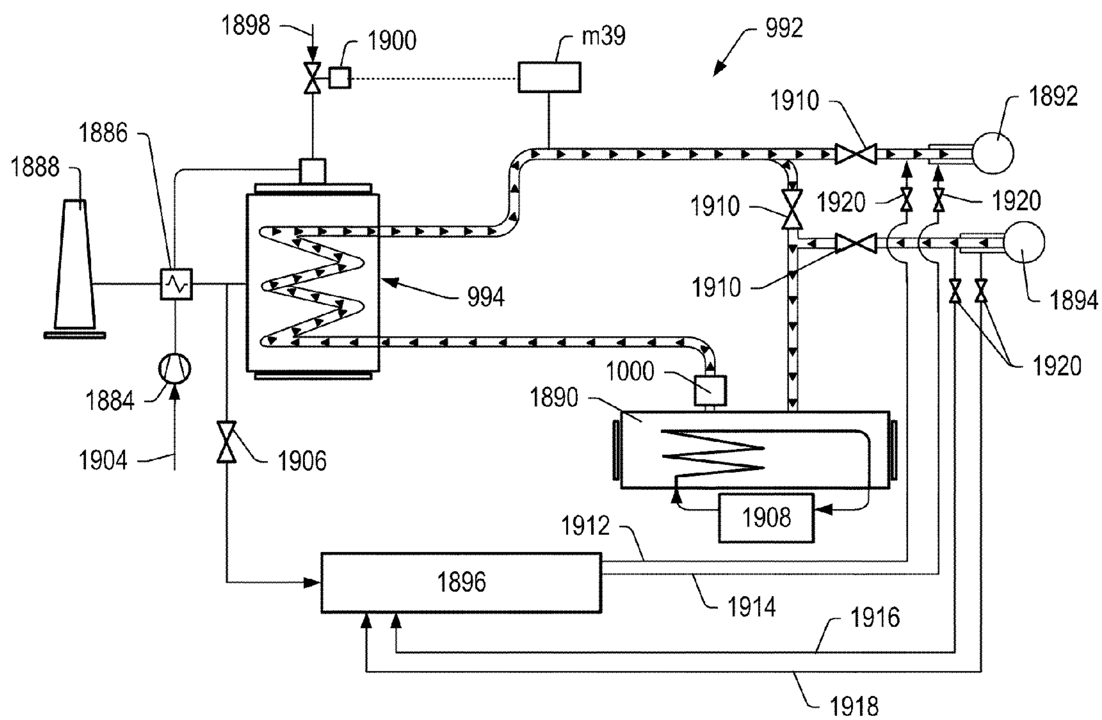

FIG. 264 depicts an embodiment of a circulation system for a liquid heat transfer fluid.

Figure 265:
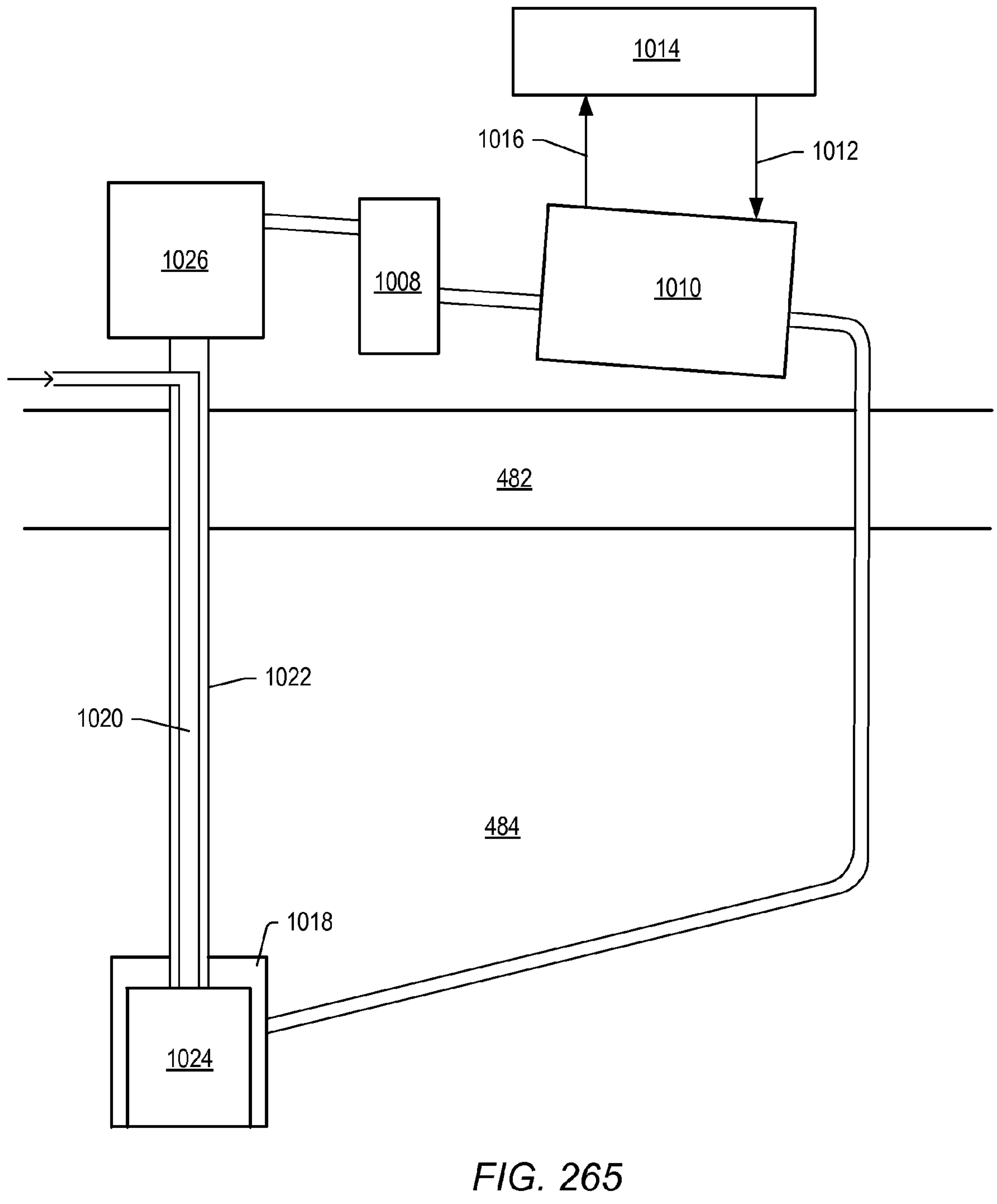

FIG. 265 depicts a schematic representation of an embodiment of a system for heating the formation using gas lift to return the heat transfer fluid to the surface.

Figure 266:
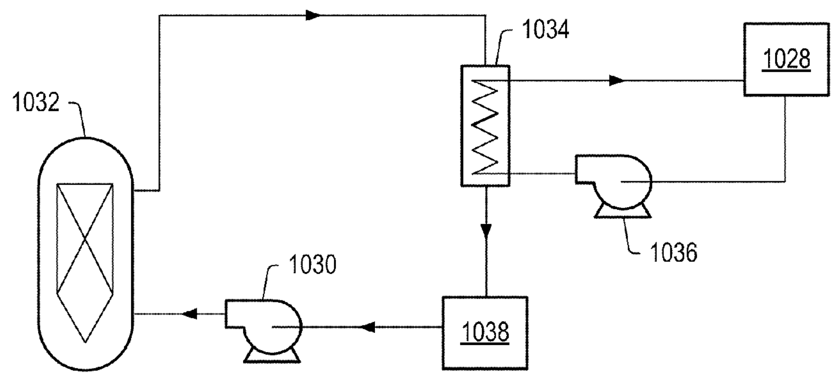

FIG. 266 depicts a schematic representation of an embodiment of an in situ heat treatment system that uses a nuclear reactor.

Figure 267:
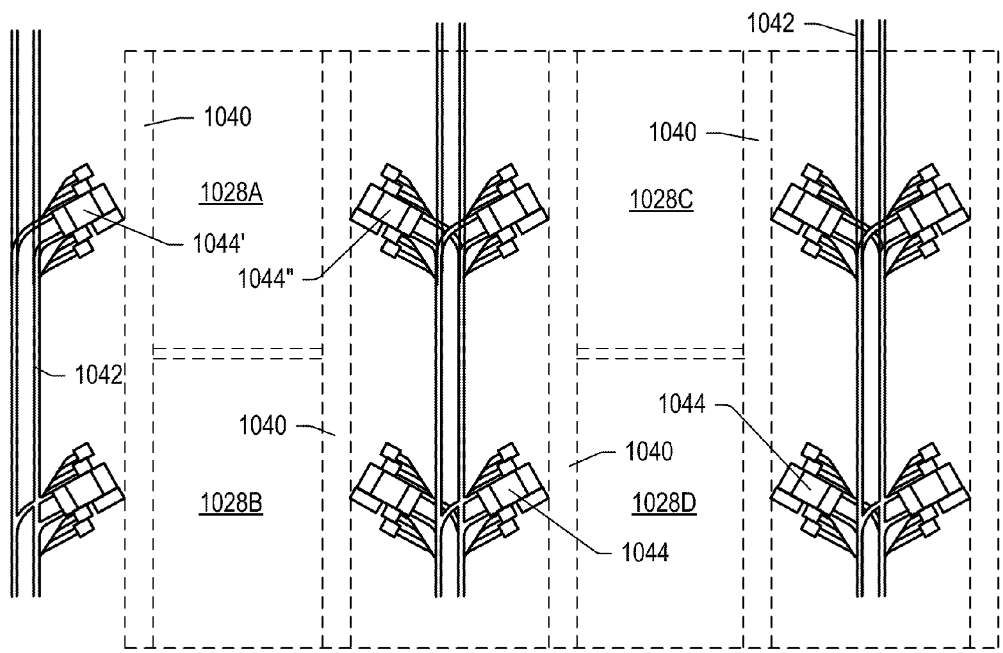

FIG. 267 depicts an elevational view of an in situ heat treatment system using pebble bed reactors.

Figure 268:
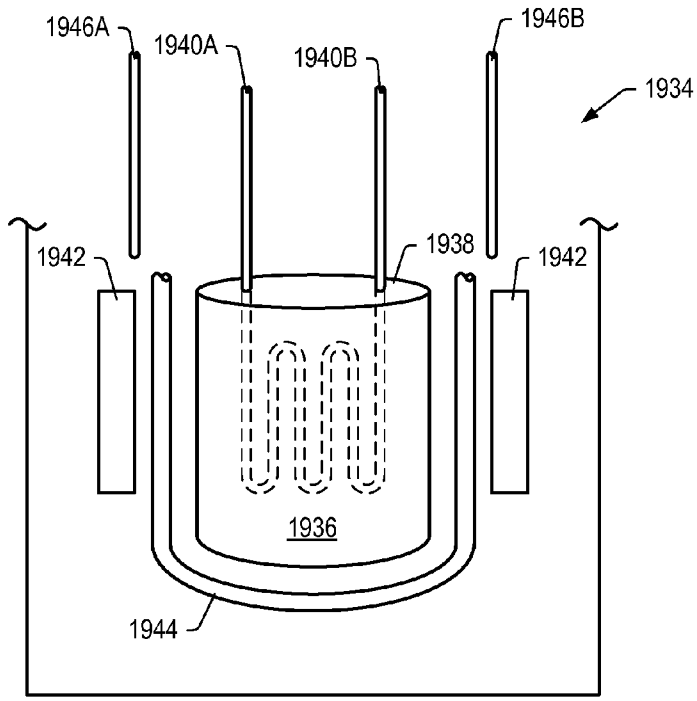

FIG. 268 depicts a schematic representation of an embodiment of a self-regulating nuclear reactor.

Figure 269:
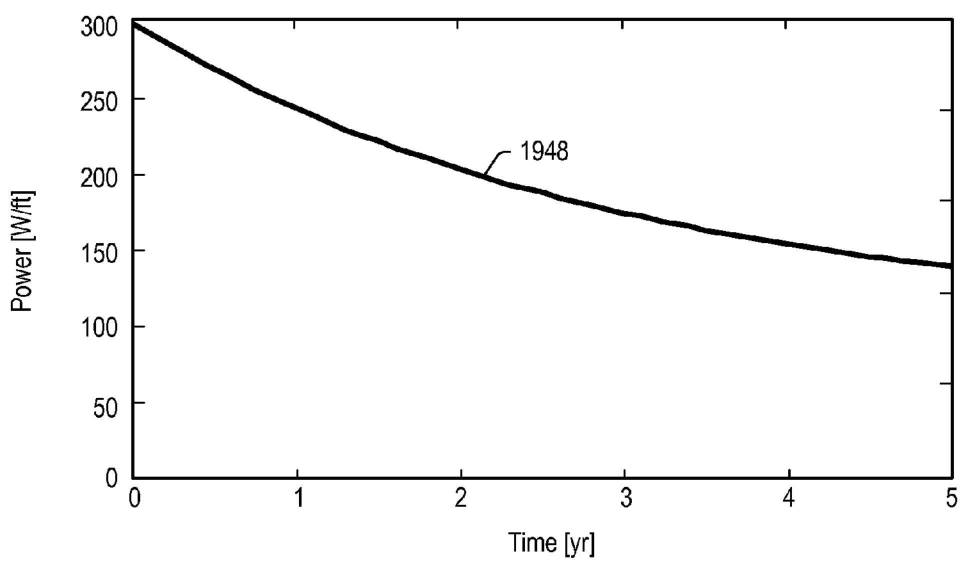

FIG. 269 depicts power (W/ft) (y-axis) versus time (yr) (x-axis) of in situ hydrocarbon remediation power injection requirements.

Figure 270:
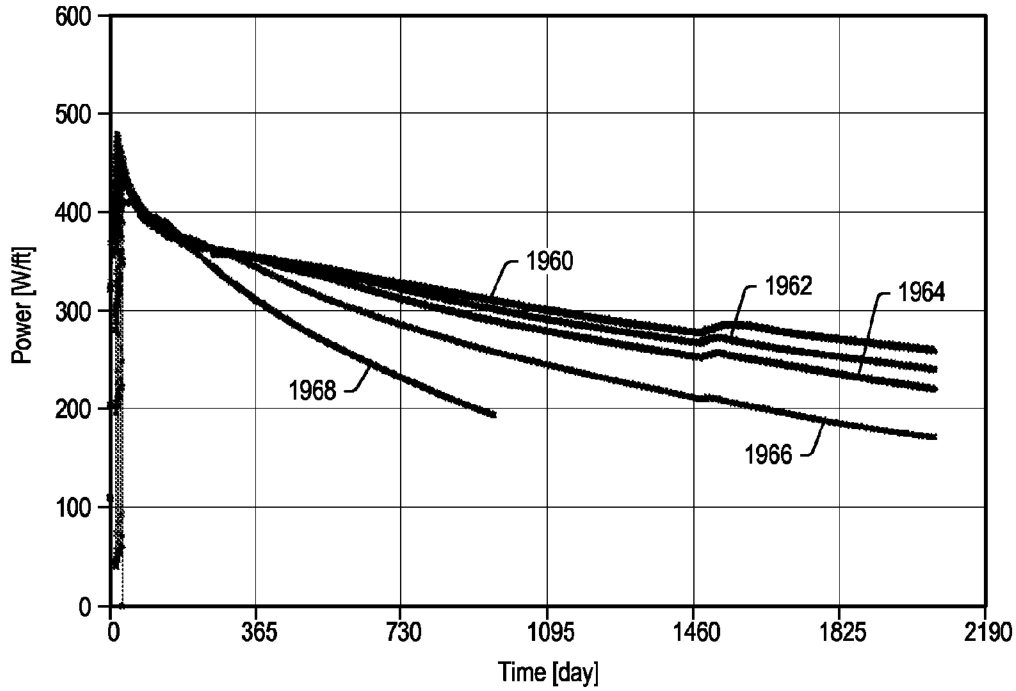

FIG. 270 depicts power (W/ft) (y-axis) versus time (days) (x-axis) of in situ hydrocarbon remediation power injection requirements for different spacings between wellbores.

Figure 271:
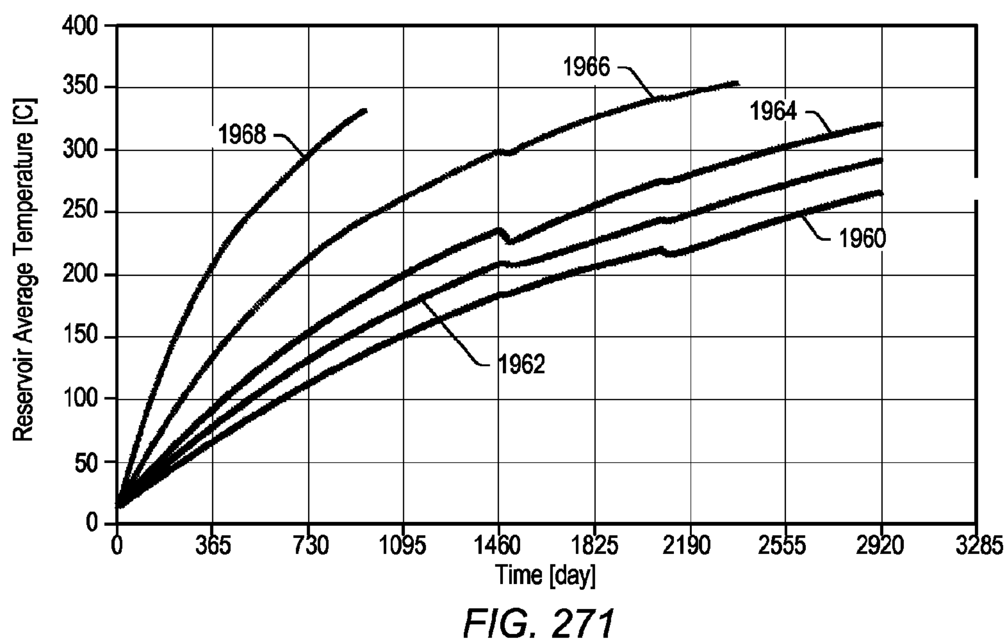

FIG. 271 depicts reservoir average temperature (° C.) (y-axis) versus time (days) (x-axis) of in situ hydrocarbon remediation for different spacings between wellbores.

Figure 272:
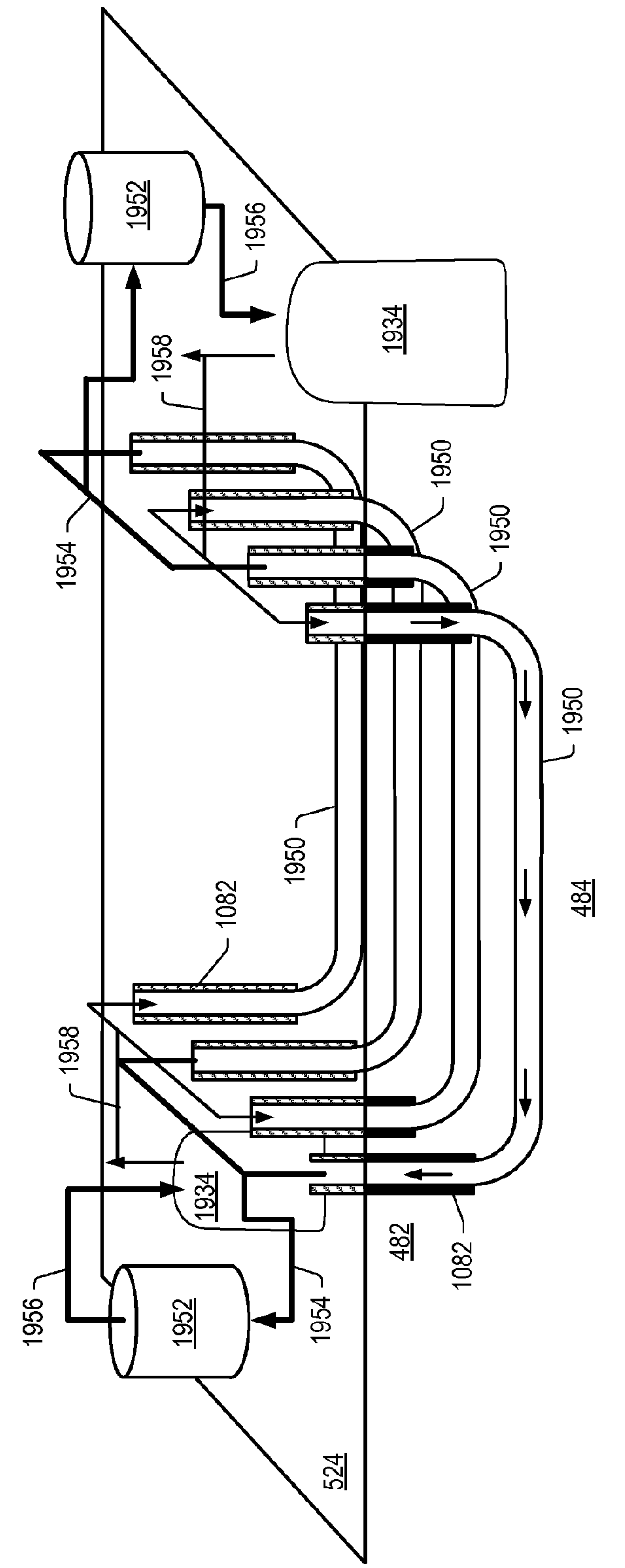

FIG. 272 depicts a schematic representation of an embodiment of an in situ heat treatment system with u-shaped wellbores using self-regulating nuclear reactors.

Figure 273:
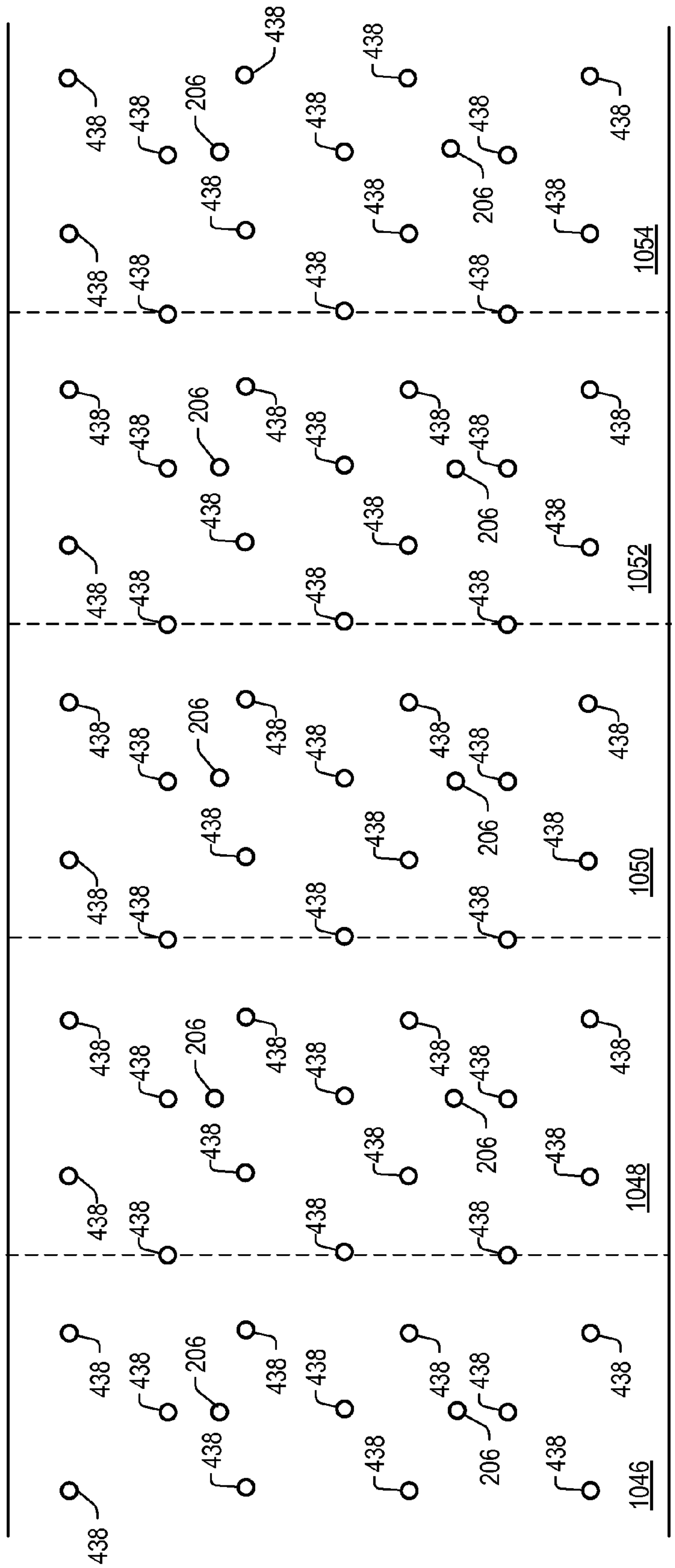

FIG. 273 depicts a side view representation of an embodiment for an in situ staged heating and production process for treating a tar sands formation.

Figure 274:
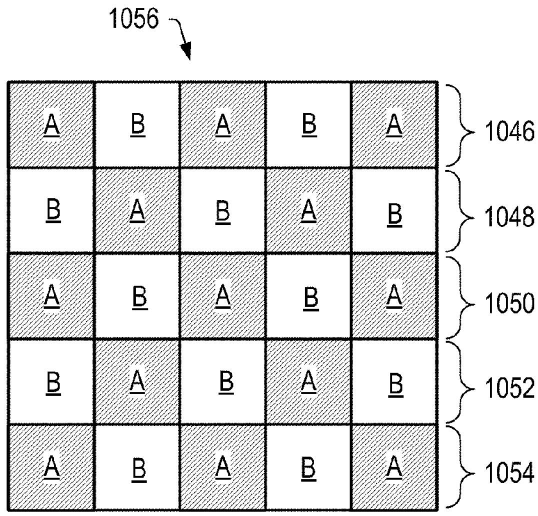

FIG. 274 depicts a top view of a rectangular checkerboard pattern embodiment for the in situ staged heating and production process.

Figure 275:
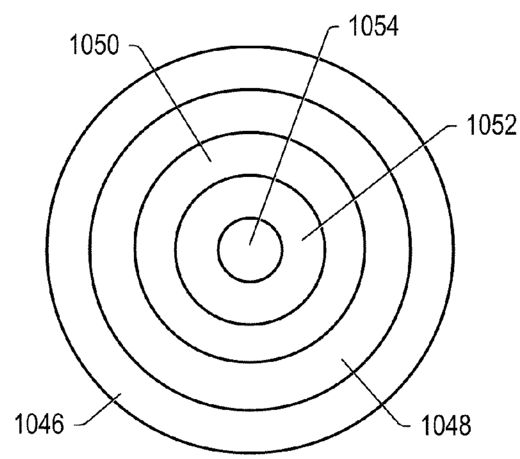

FIG. 275 depicts a top view of a ring pattern embodiment for the in situ staged heating and production process.

Figure 276:
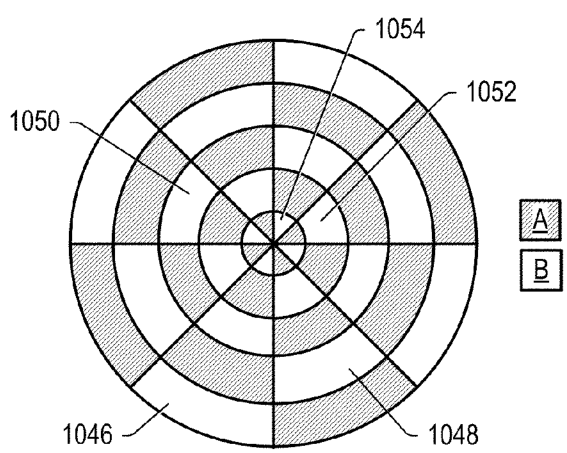

FIG. 276 depicts a top view of a checkerboard ring pattern embodiment for the in situ staged heating and production process.

Figure 277:
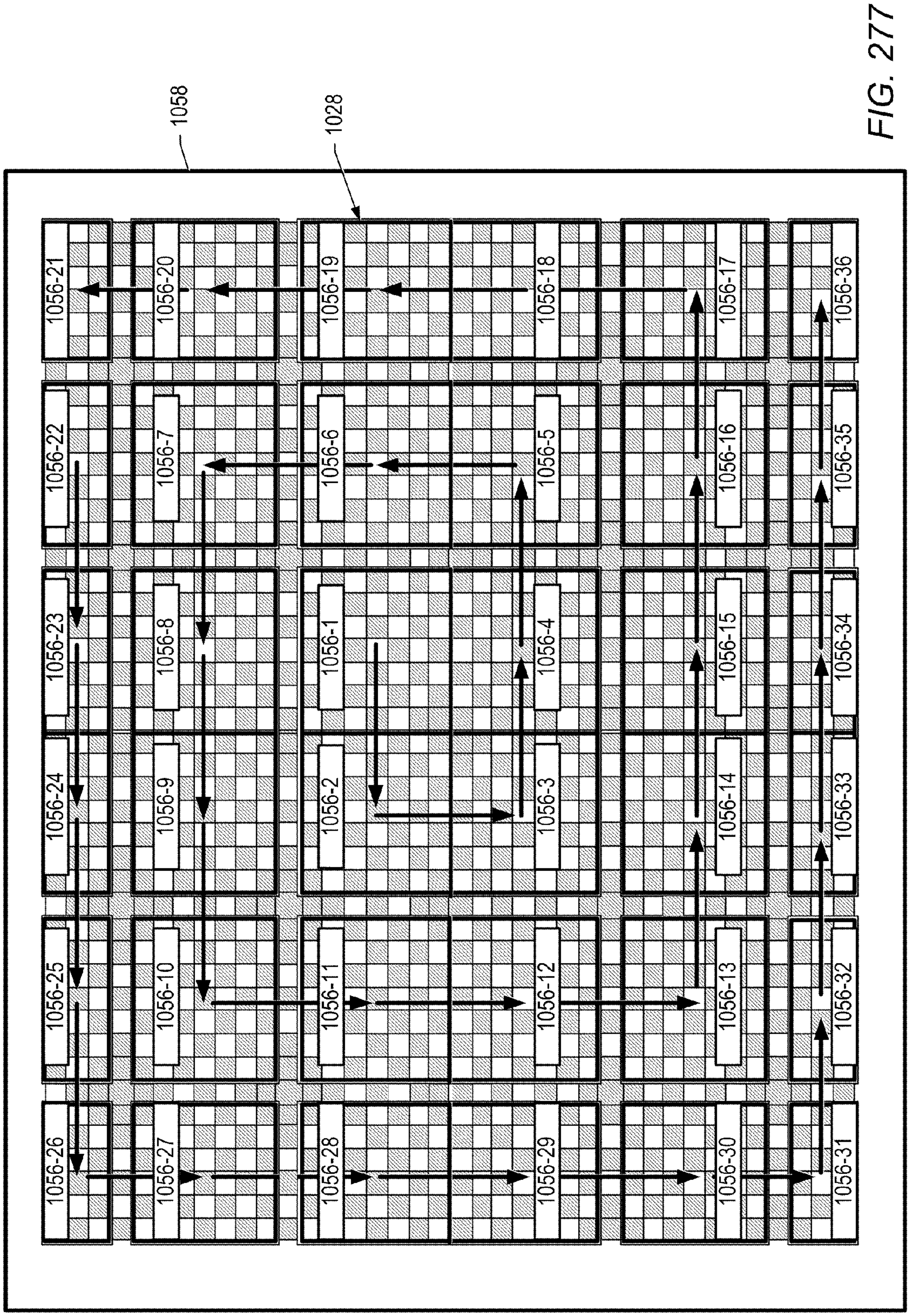

FIG. 277 depicts a top view an embodiment of a plurality of rectangular checkerboard patterns in a treatment area for the in situ staged heating and production process.

Figure 278:
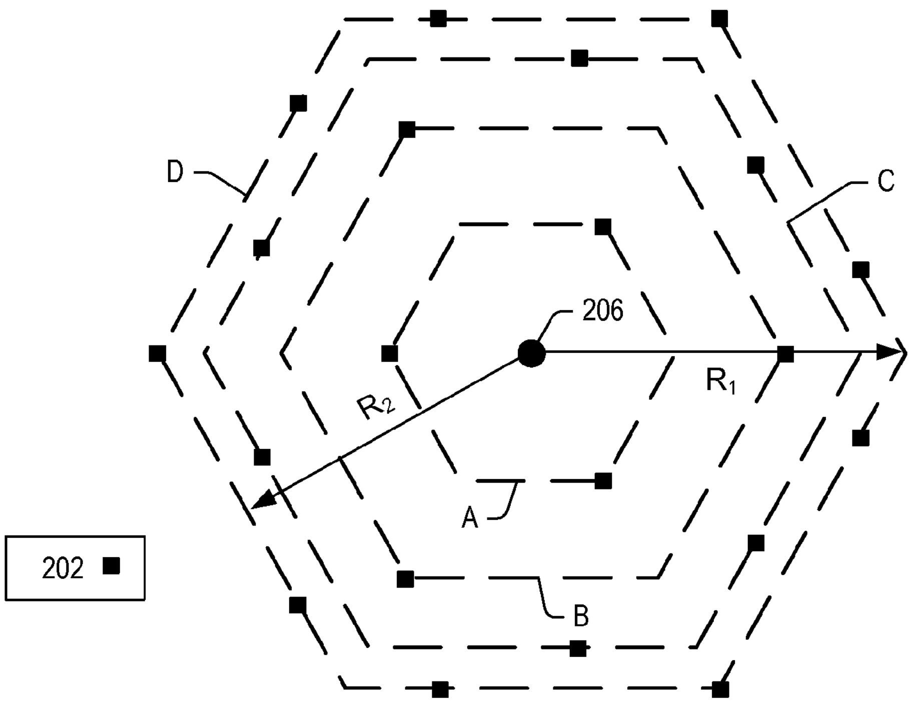

FIG. 278 depicts an embodiment of irregular spaced heat sources with the heater density increasing as distance from a production well increases.

Figure 279:
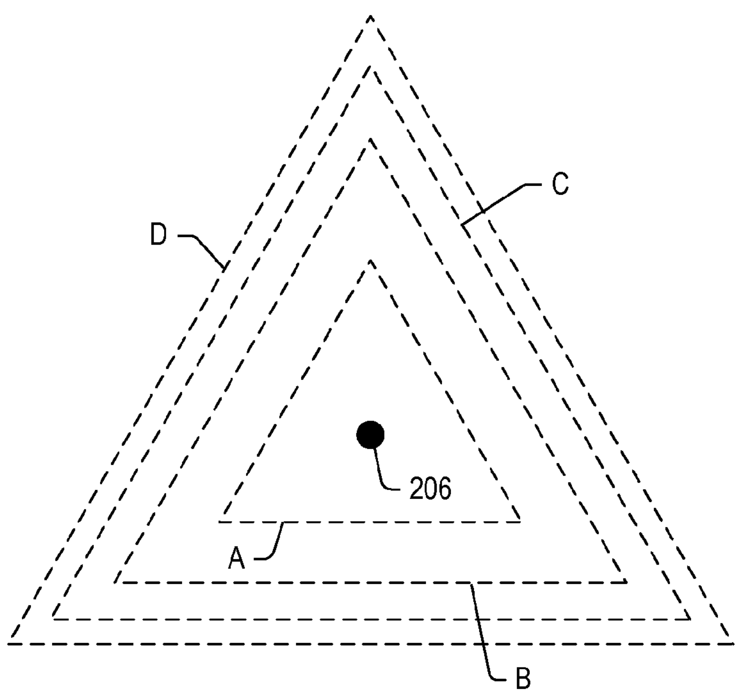

FIG. 279 depicts an embodiment of an irregular spaced triangular pattern.

Figure 280:
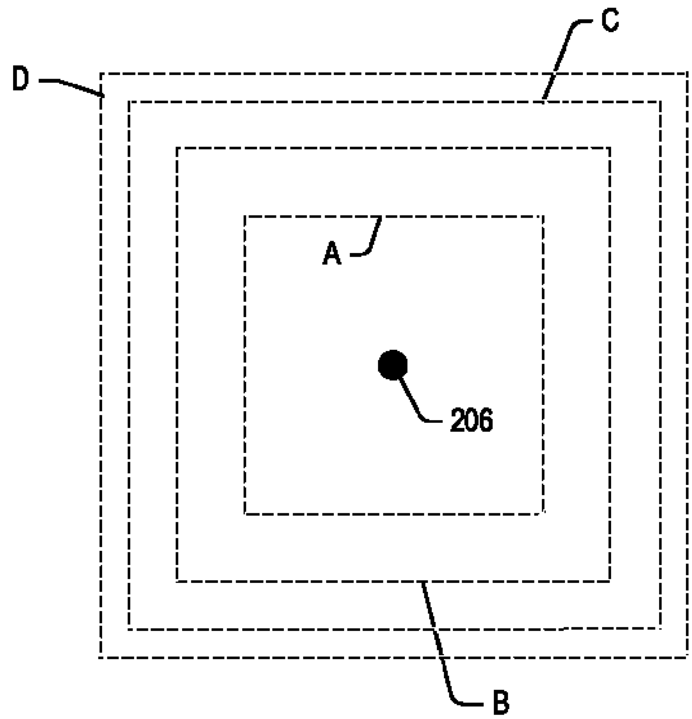

FIG. 280 depicts an embodiment of irregular spaced square pattern.

Figure 281:
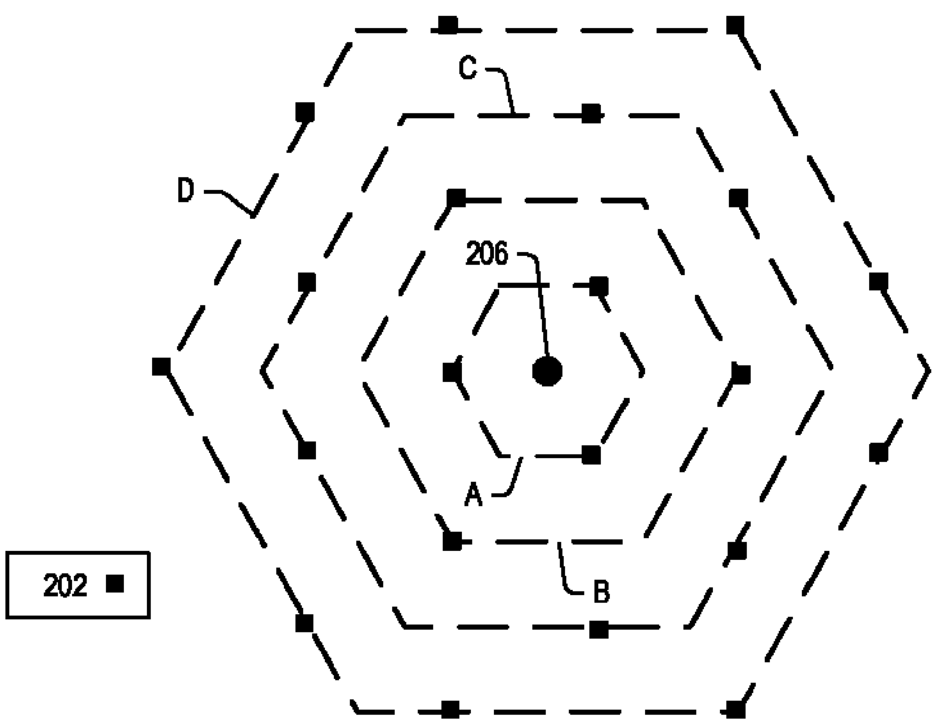

FIG. 281 depicts an embodiment of a regular pattern of equally spaced rows of heat sources.

Figure 282:
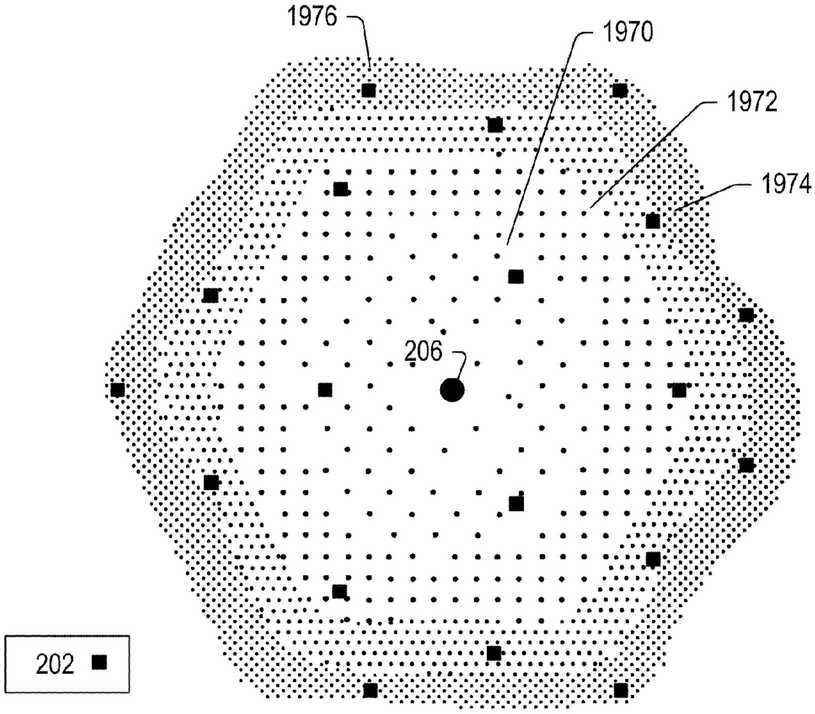

FIG. 282 depicts an embodiment of irregular spaced heat sources defining volumes around a production well.

Figure 283:
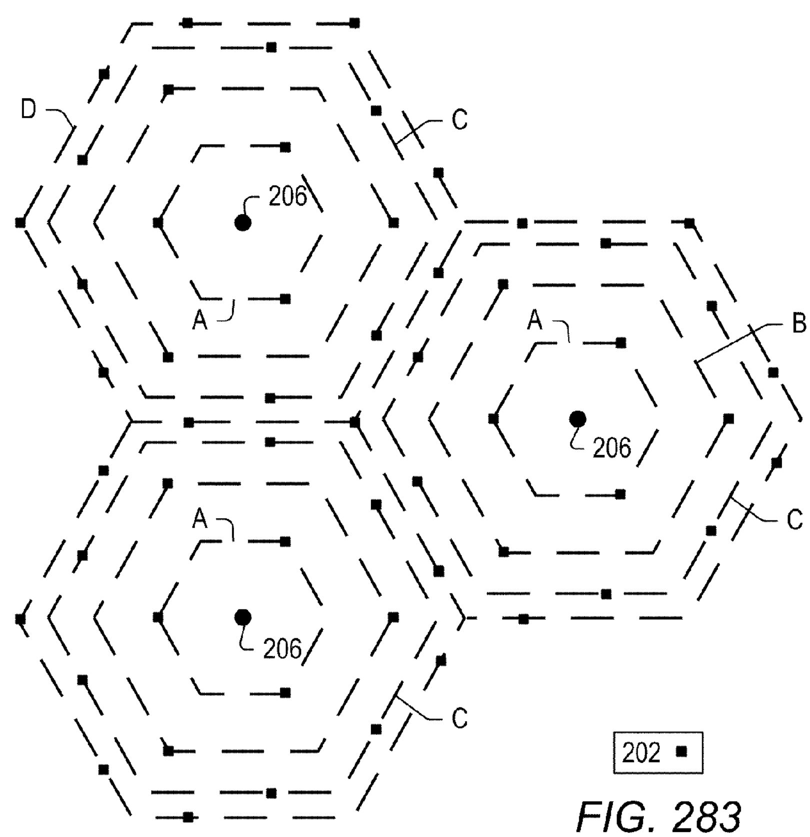

FIG. 283 depicts an embodiment of a repeated pattern of irregular spaced heat sources with the heater density of each pattern increasing as distance from the production well increases.

Figure 284:
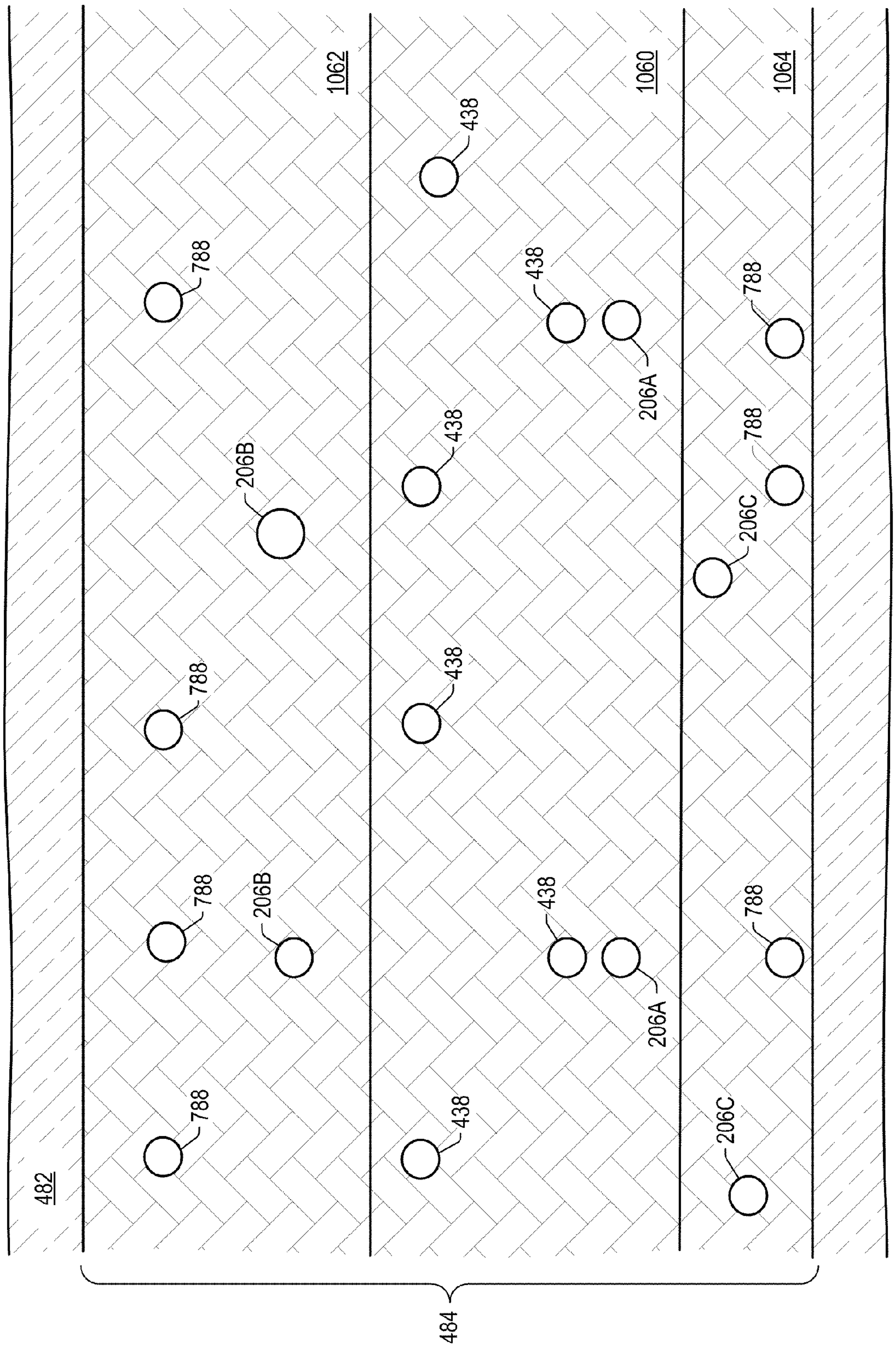

FIG. 284 depicts a side view representation of embodiments for producing mobilized fluids from a hydrocarbon formation.

Figure 285:
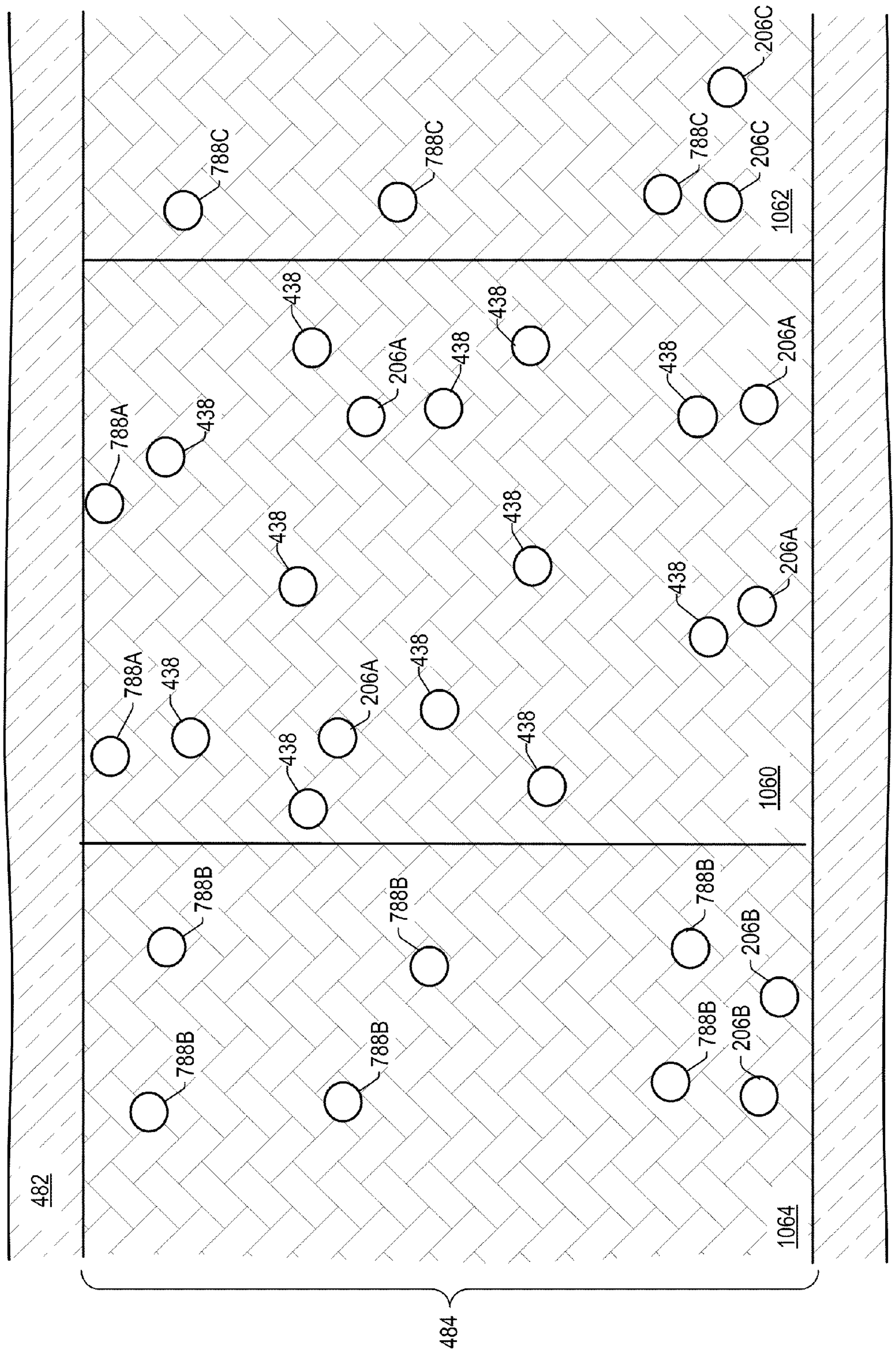

FIG. 285 depicts a side view representation of an embodiment for producing mobilized fluids from a hydrocarbon formation heated by residual heat.

Figure 286:
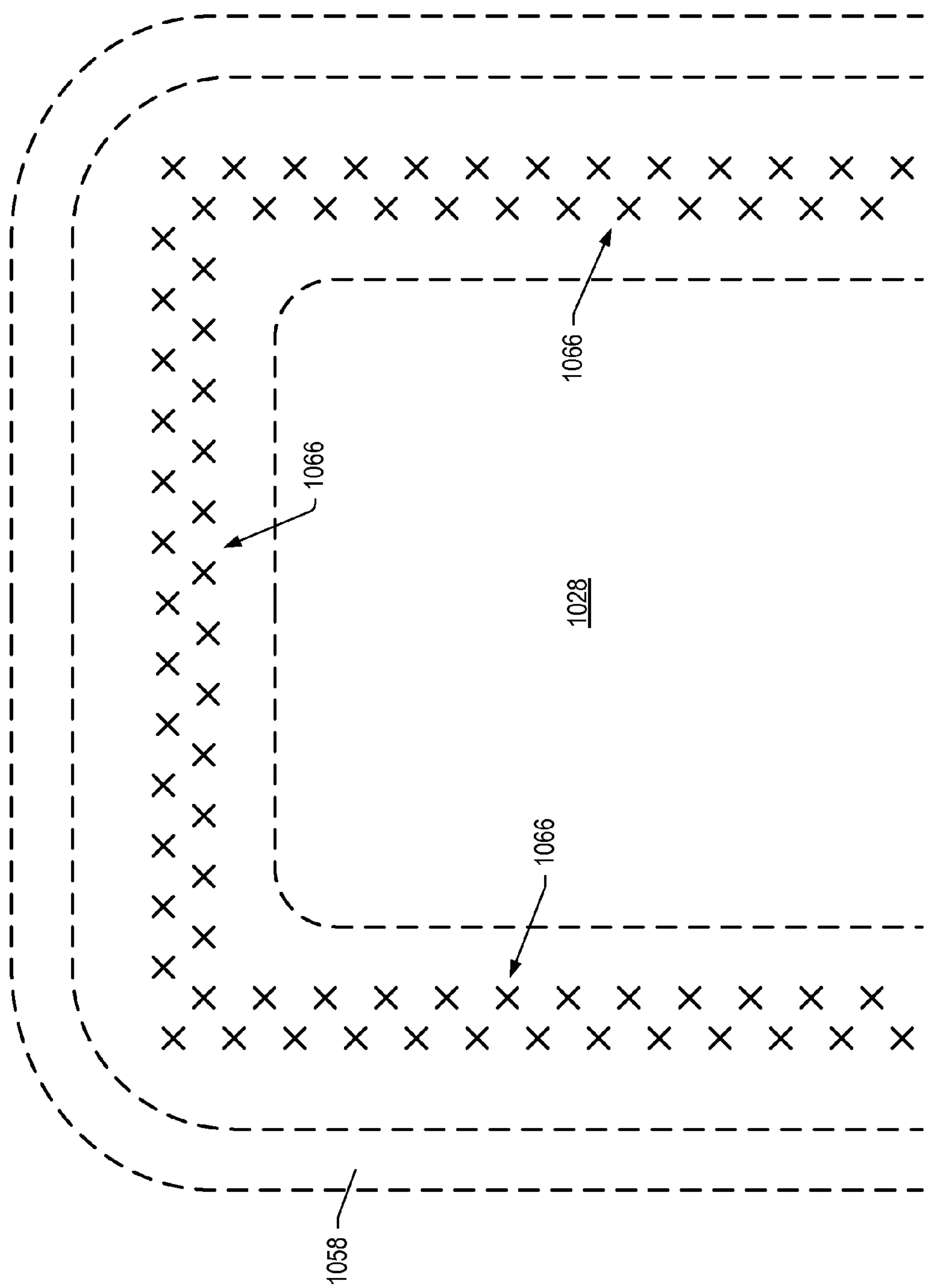

FIG. 286 depicts a schematic representation of a system for inhibiting migration of formation fluid from a treatment area.

Figure 287:
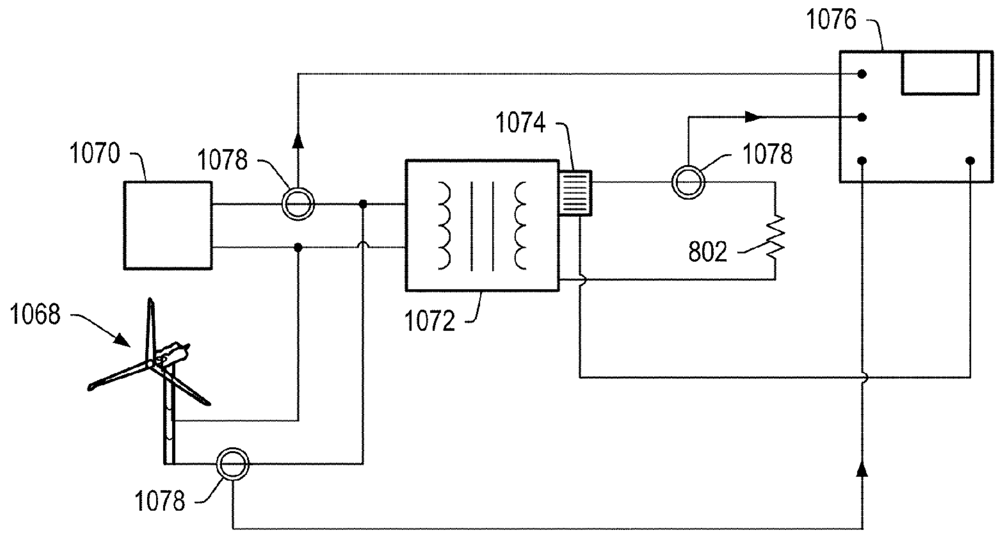

FIG. 287 depicts an embodiment of a windmill for generating electricity for subsurface heaters.

Figure 288:
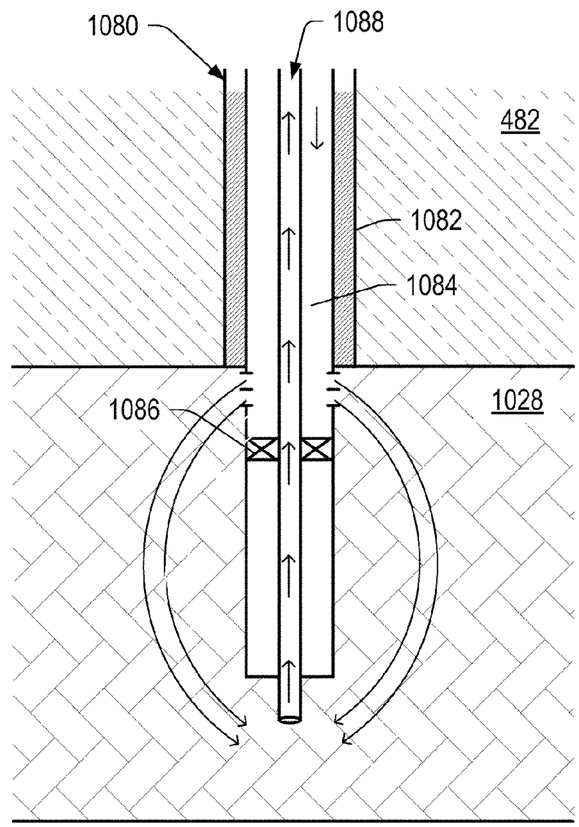

FIG. 288 depicts an embodiment of a solution mining well.

Figure 289:
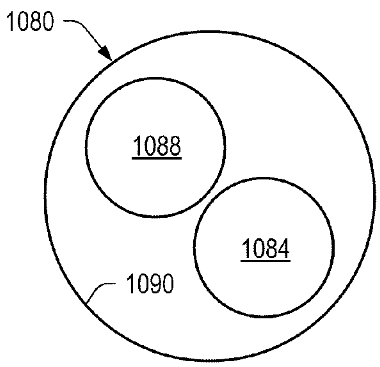

FIG. 289 depicts a representation of a portion of a solution mining well.

Figure 290:
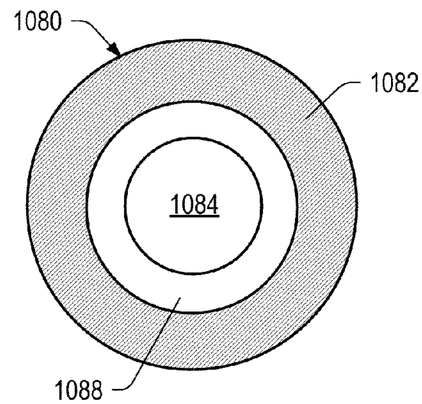

FIG. 290 depicts a representation of a portion of a solution mining well.

Figure 291:
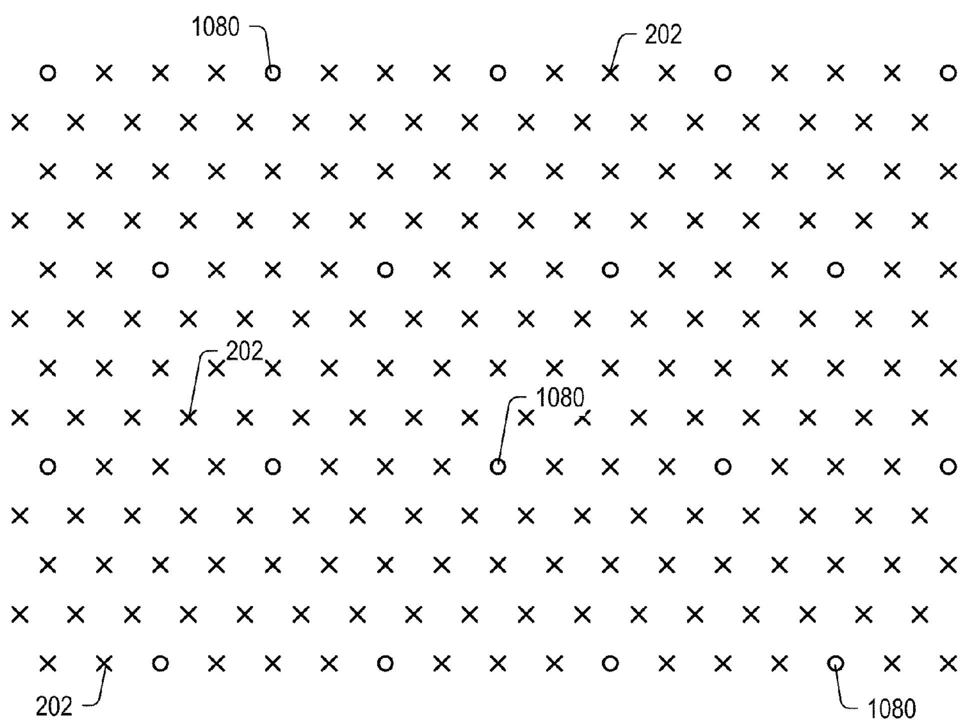

FIG. 291 depicts an elevational view of a well pattern for solution mining and/or an in situ heat treatment process.

Figure 292:
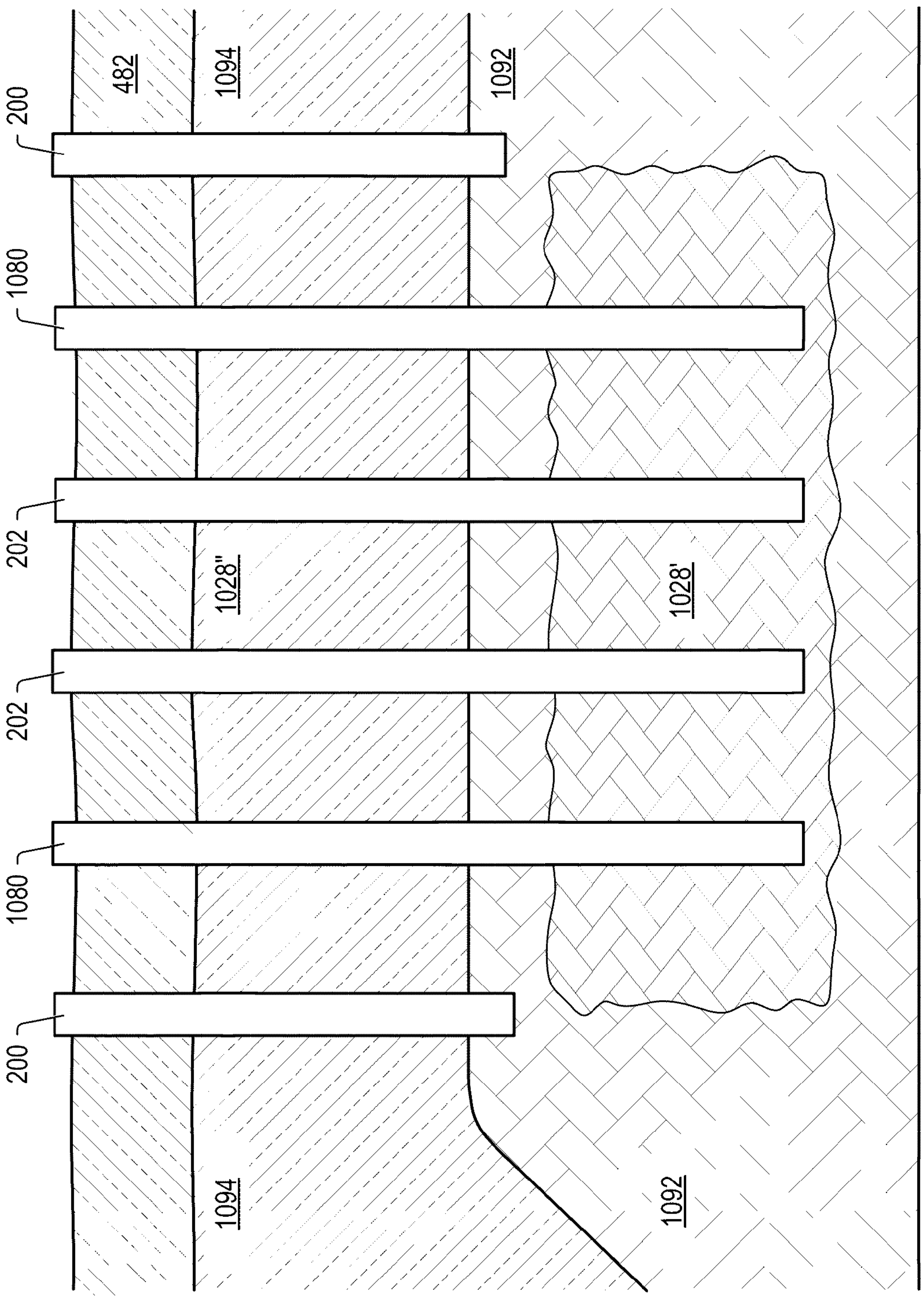

FIG. 292 depicts a representation of wells of an in situ heating treatment process for solution mining and producing hydrocarbons from a formation.

Figure 293:
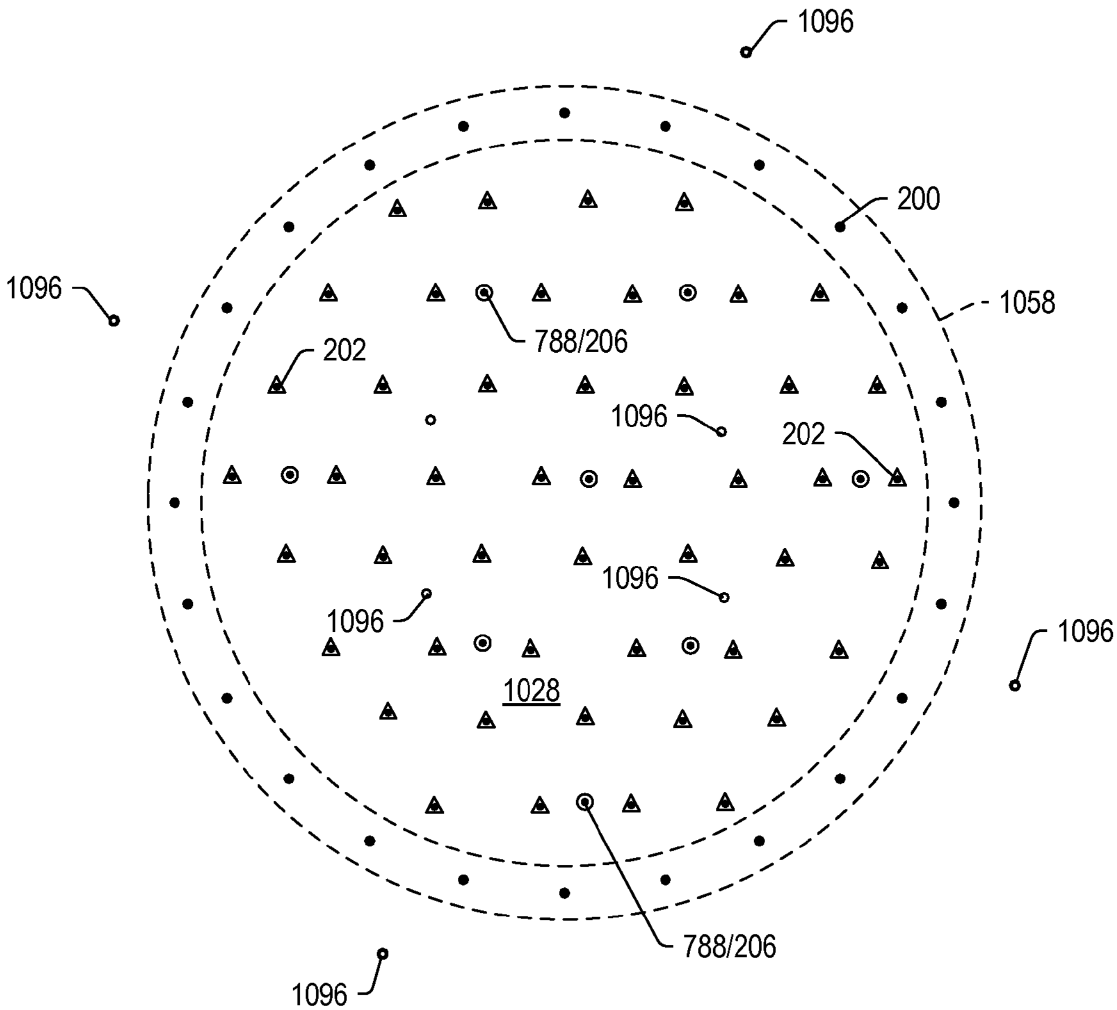

FIG. 293 depicts an embodiment for solution mining a formation.

Figure 294:
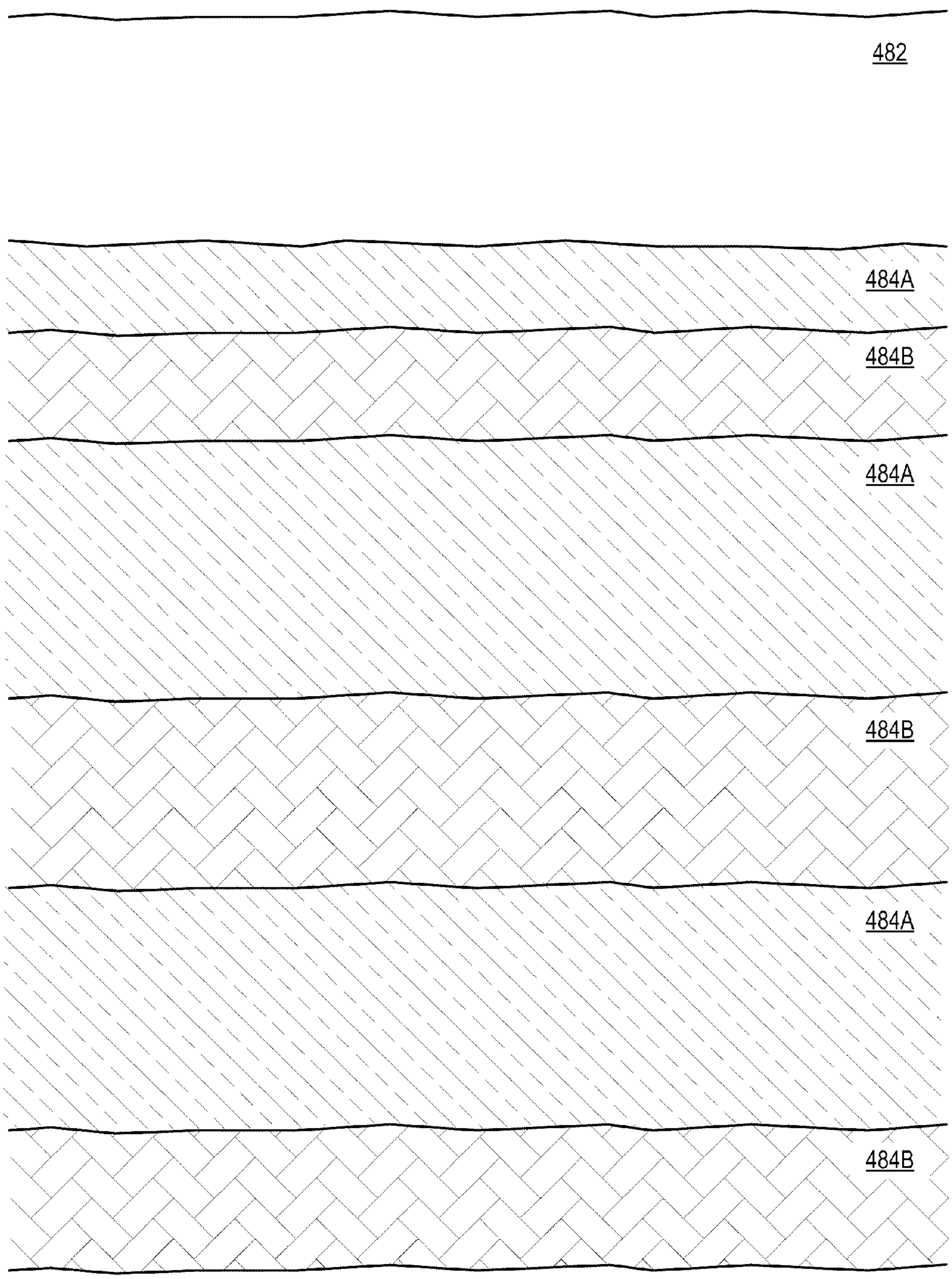

FIG. 294 depicts an embodiment of a formation with nahcolite layers in the formation before solution mining nahcolite from the formation.

Figure 295:
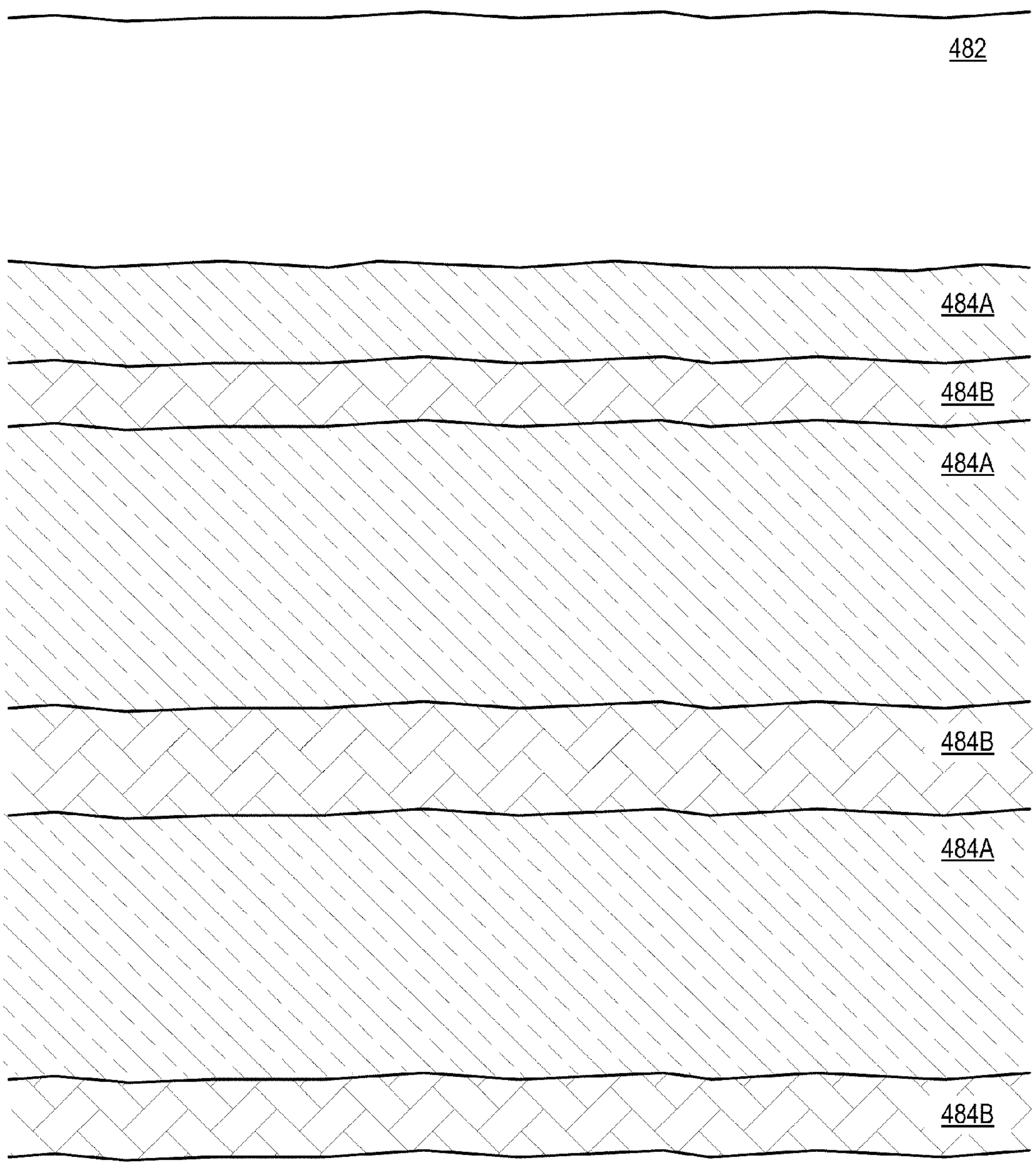

FIG. 295 depicts the formation of FIG. 294 after the nahcolite has been solution mined.

Figure 296:
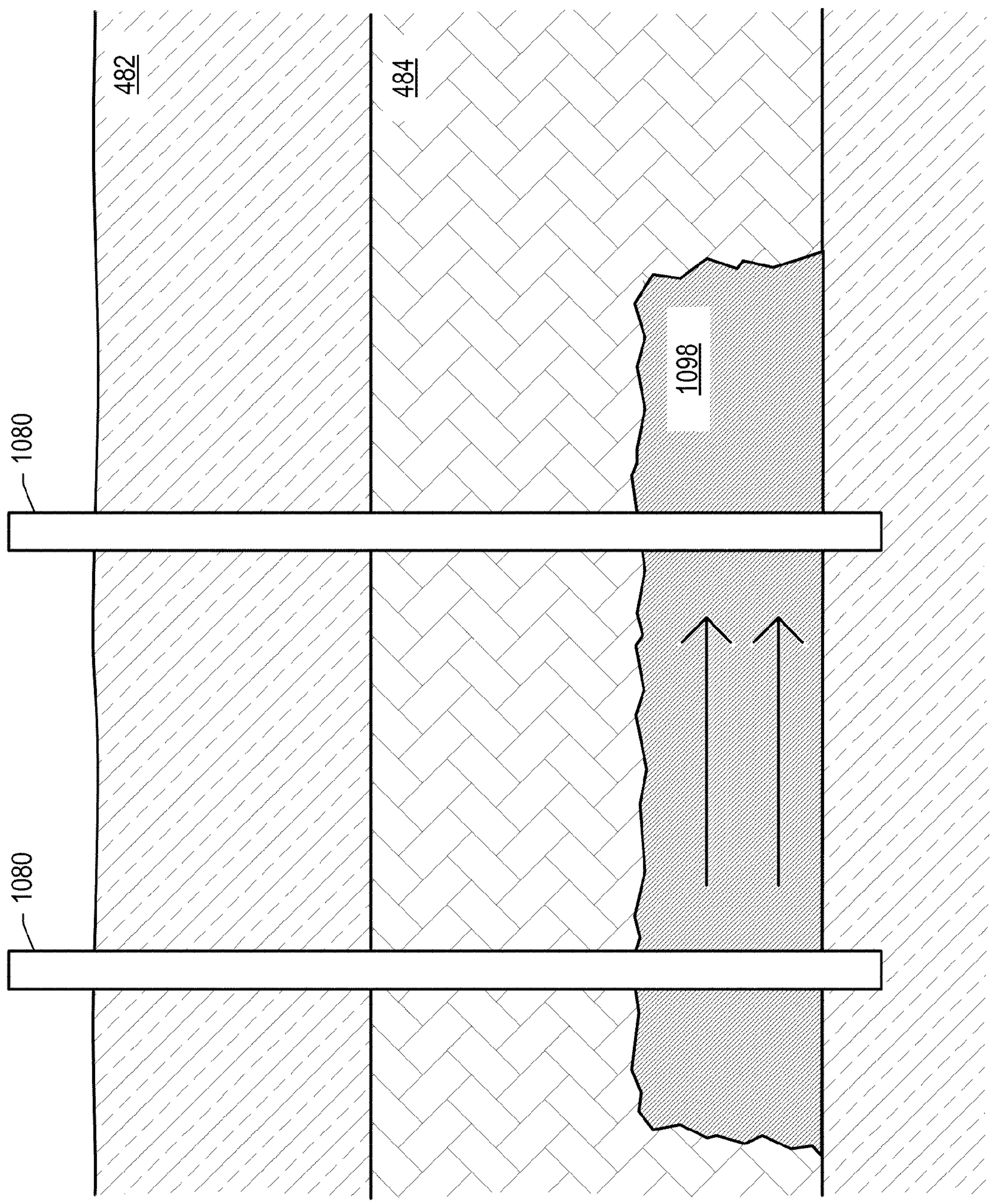

FIG. 296 depicts an embodiment of two injection wells interconnected by a zone that has been solution mined to remove nahcolite from the zone.

Figure 297:
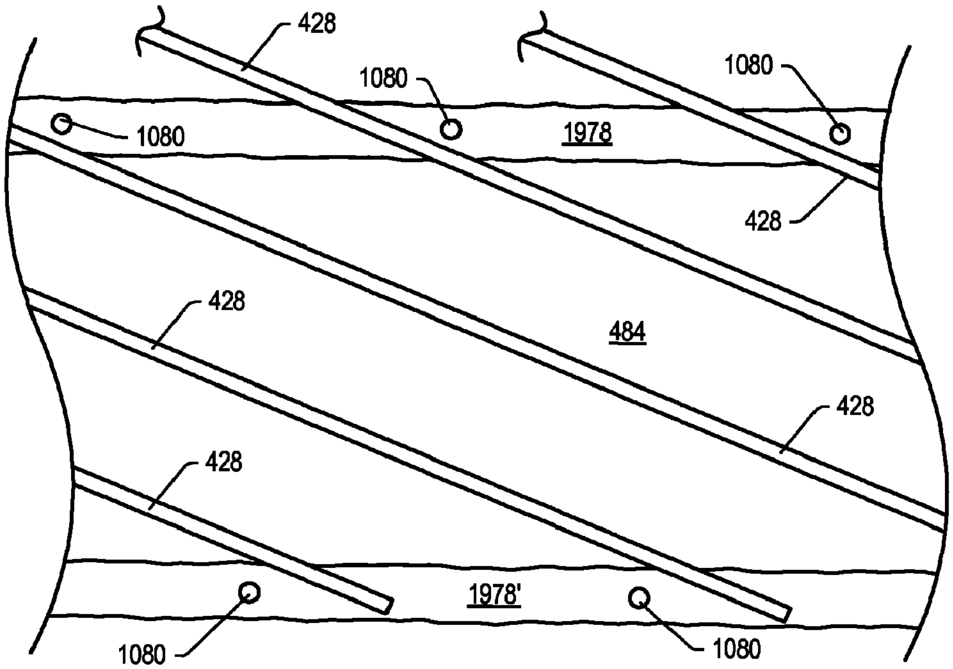

FIG. 297 depicts a representation of an embodiment for treating a portion of a formation having a hydrocarbon containing formation between an upper nahcolite bed above and a lower nahcolite bed.

Figure 298:
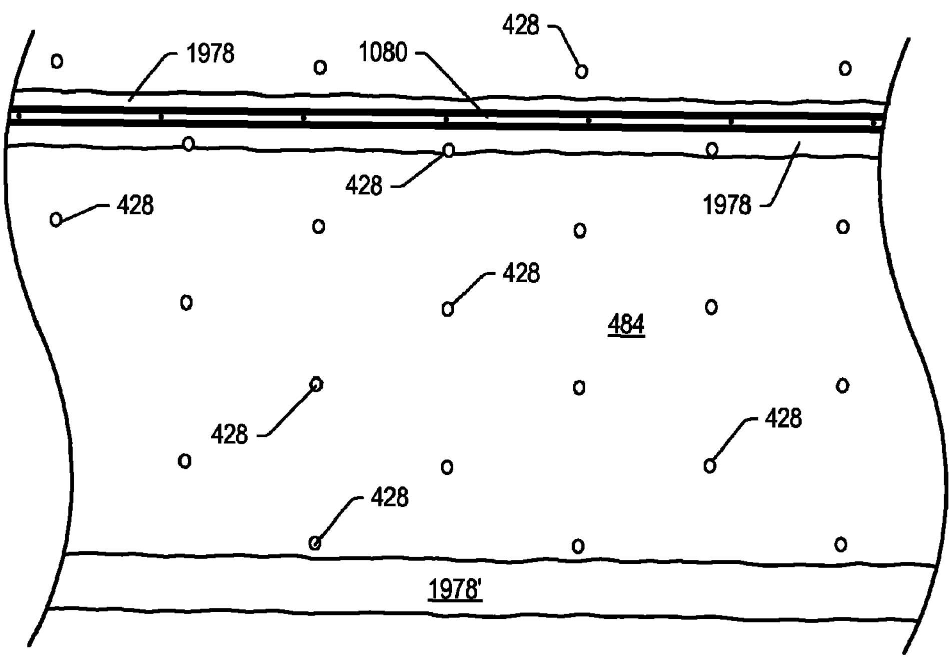

FIG. 298 depicts a representation of a portion of the formation that is orthogonal to the formation depicted in FIG. 297 and passes through one of the solution mining wells in the upper nahcolite bed.

Figure 299:
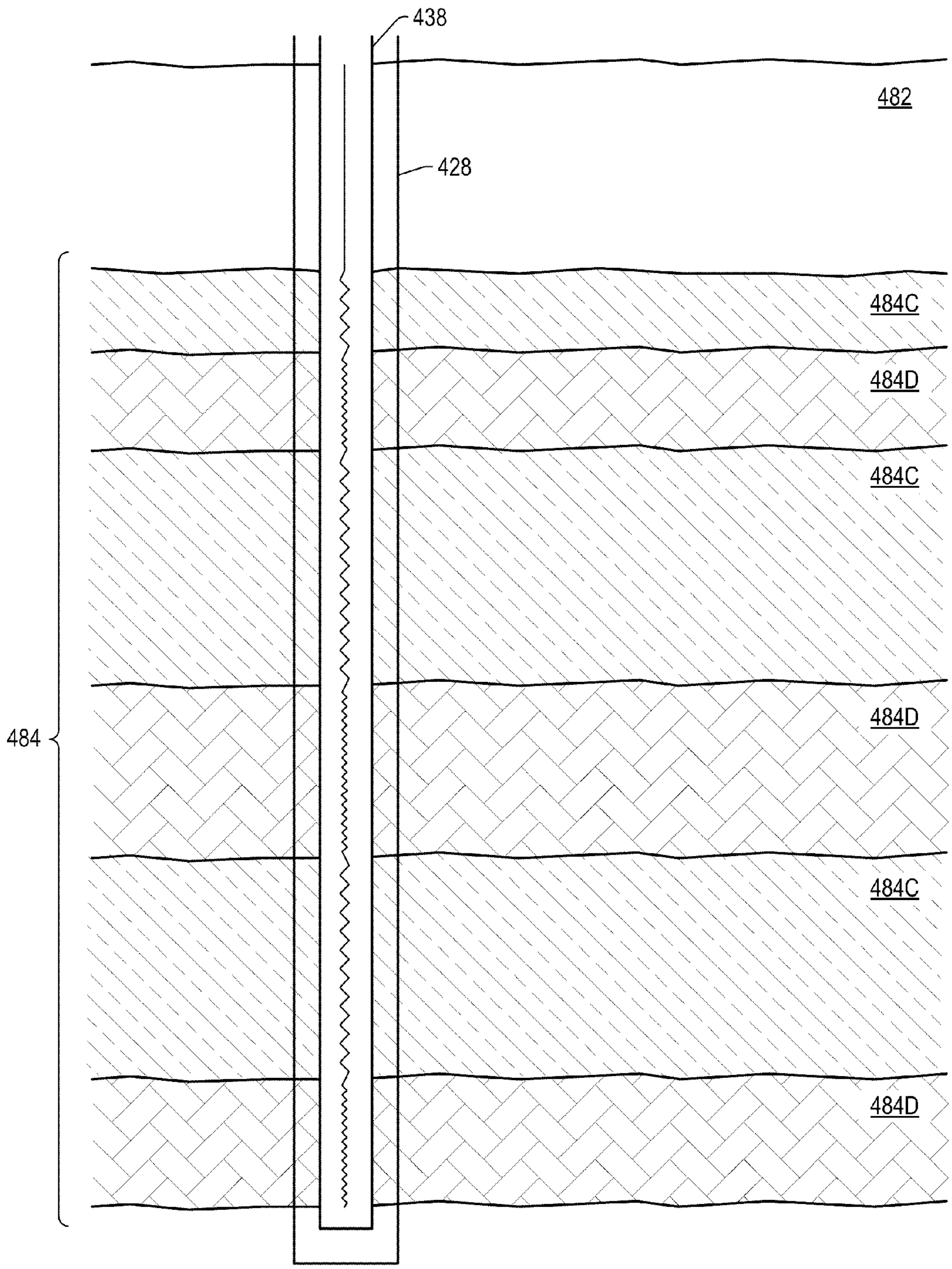

FIG. 299 depicts an embodiment for heating a formation with dawsonite in the formation.

Figure 300:
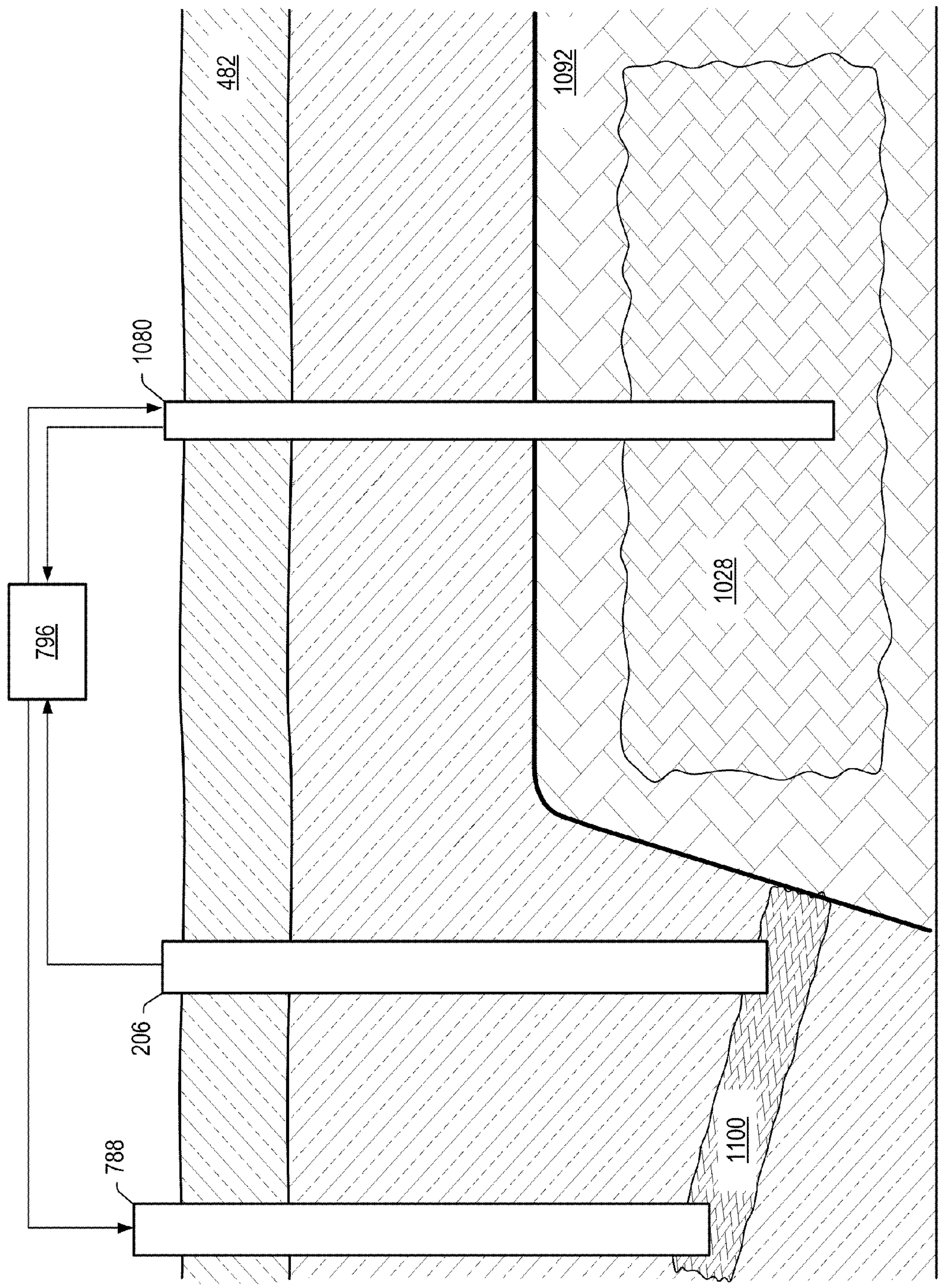

FIG. 300 depicts a representation of an embodiment for solution mining with a steam and electricity cogeneration facility.

Figure 301:
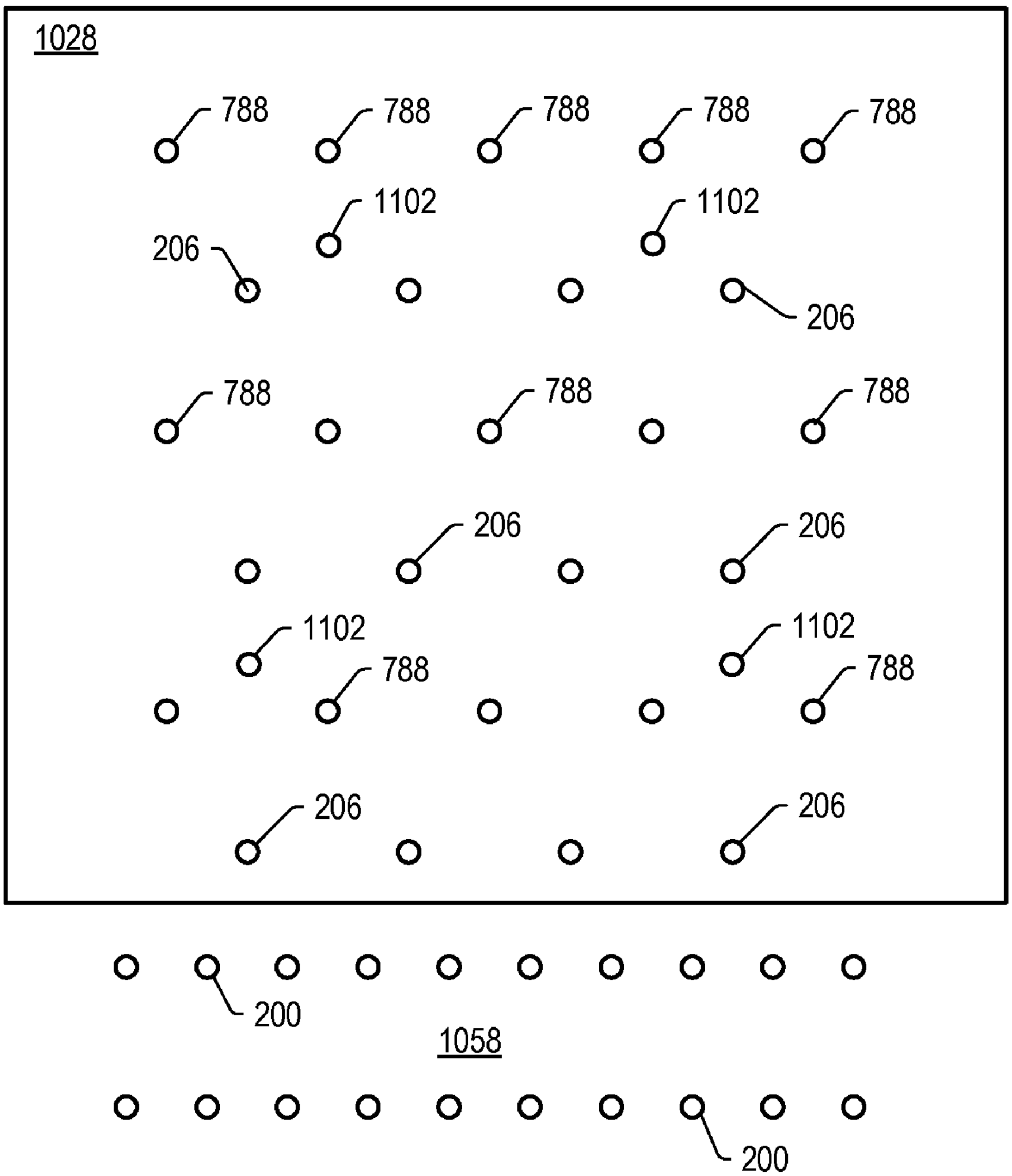

FIG. 301 depicts an embodiment of treating a hydrocarbon containing formation with a combustion front.

Figure 302:
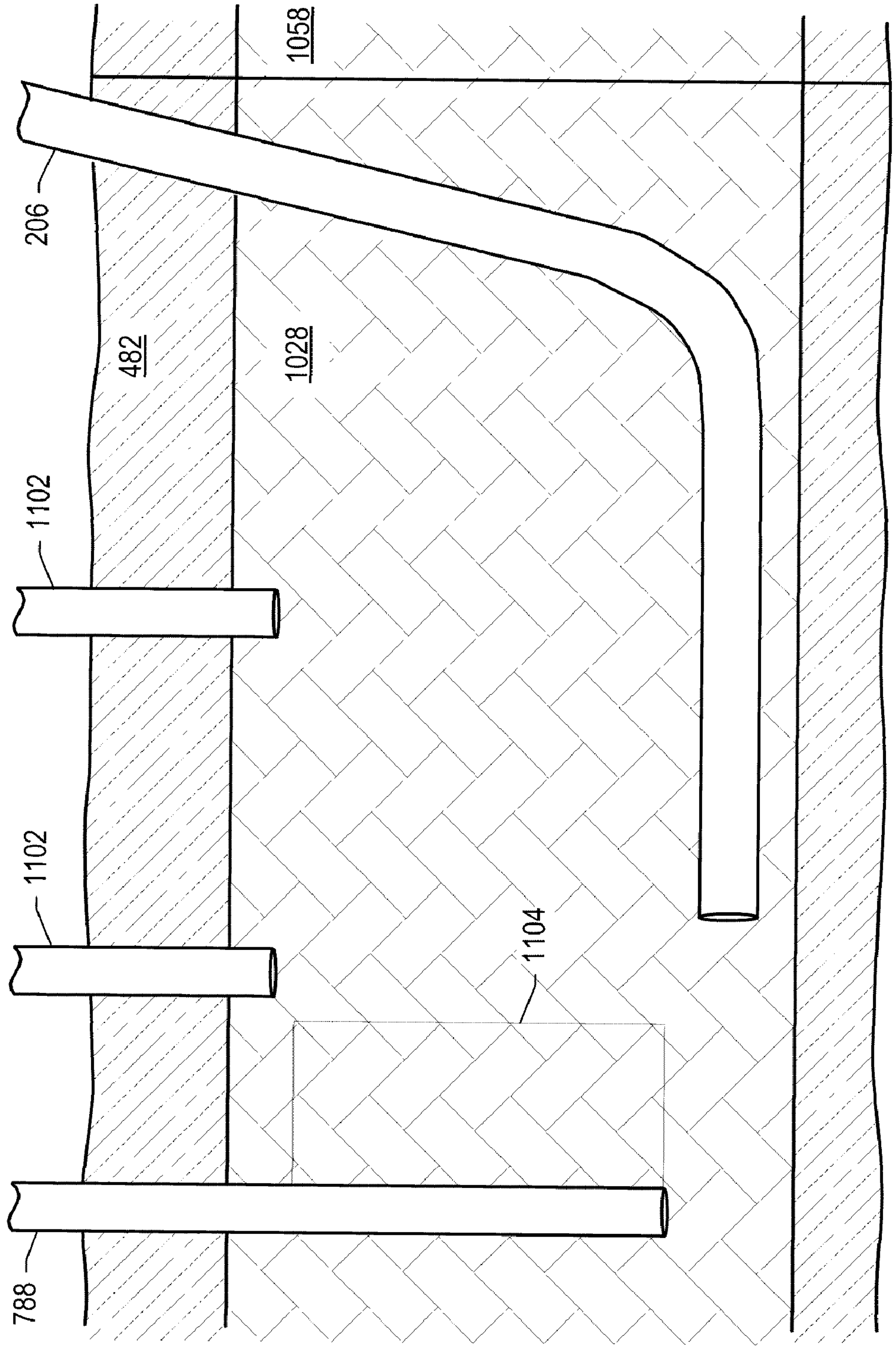

FIG. 302 depicts a representation of an embodiment for treating a hydrocarbon containing formation with a combustion front.

Figure 303:
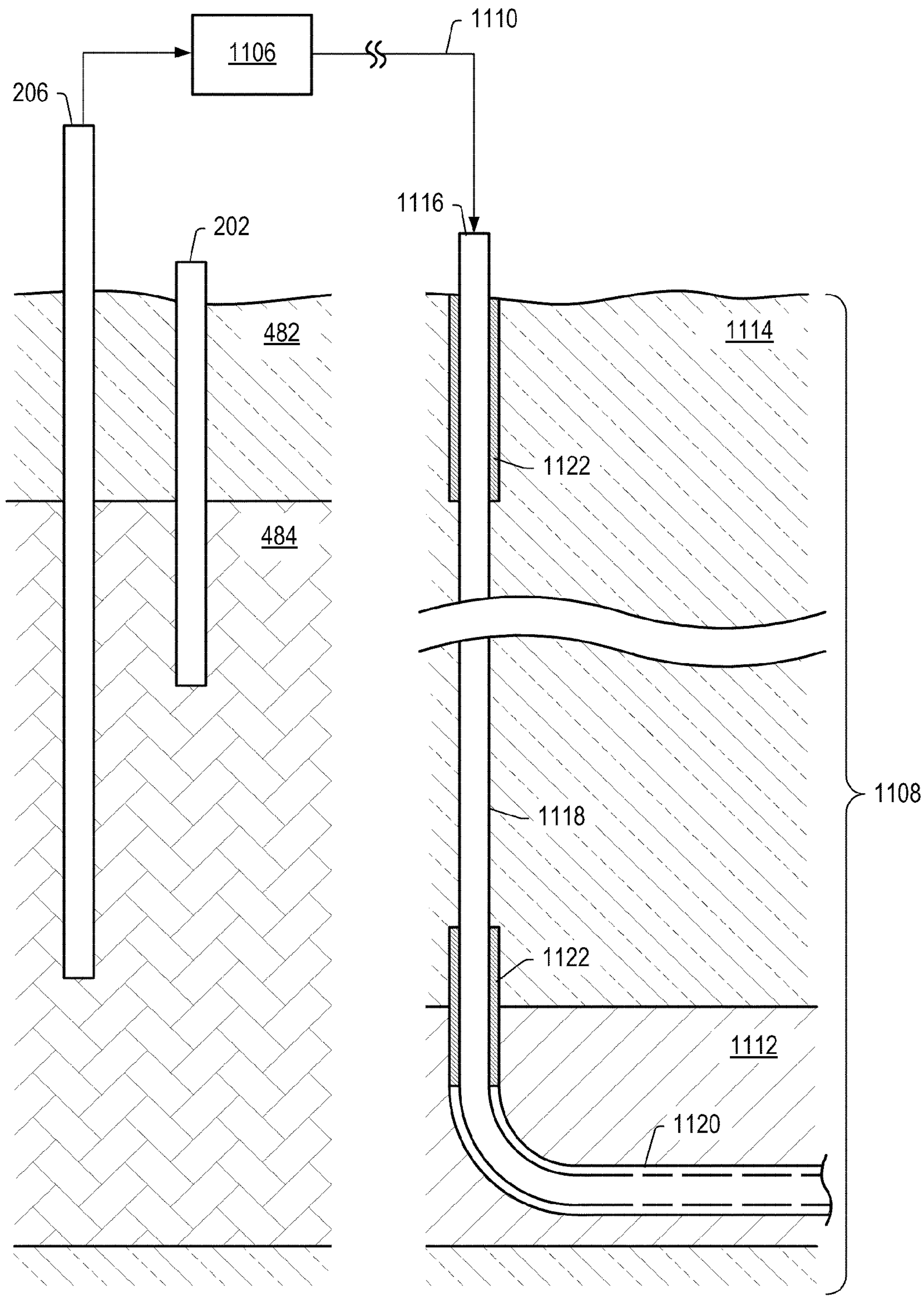

FIG. 303 depicts a schematic representation of a system for producing formation fluid and introducing sour gas into a subsurface formation.

Figure 304:
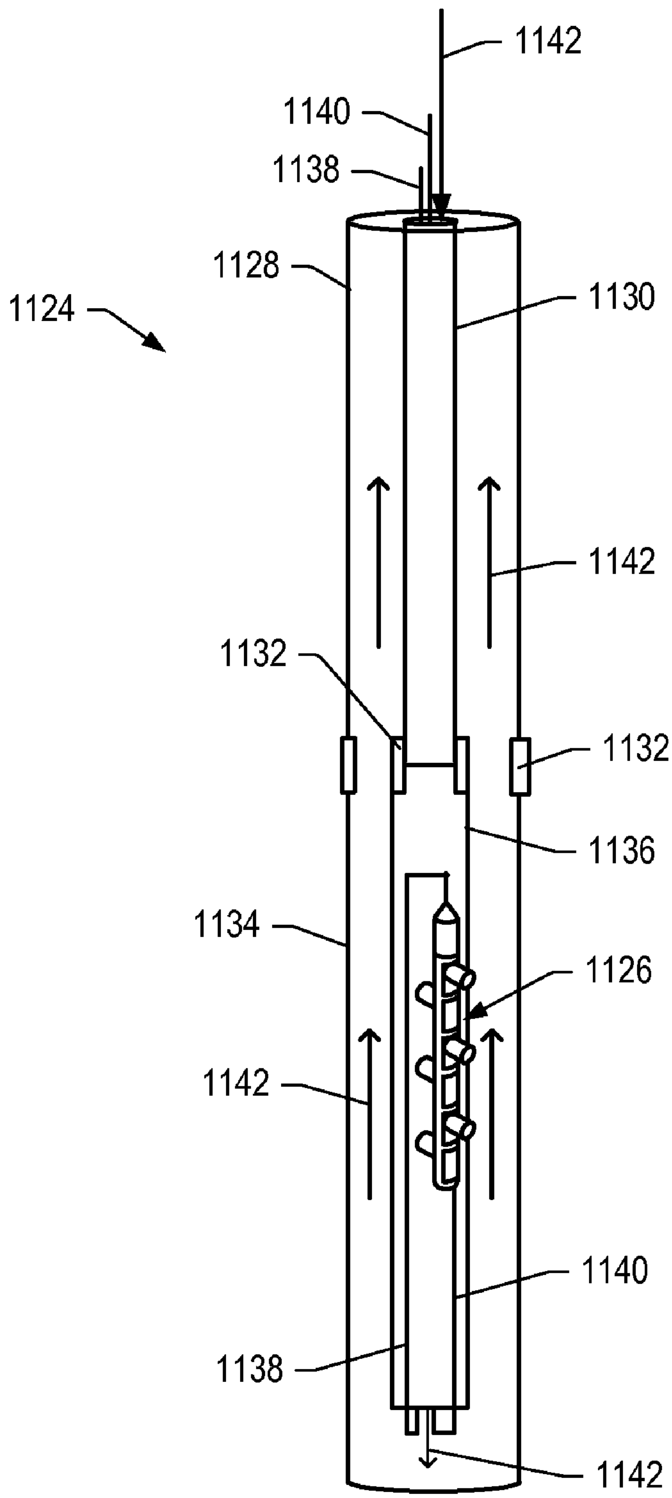

FIG. 304 depicts a schematic representation of a circulated fluid cooling system.

Figure 305:
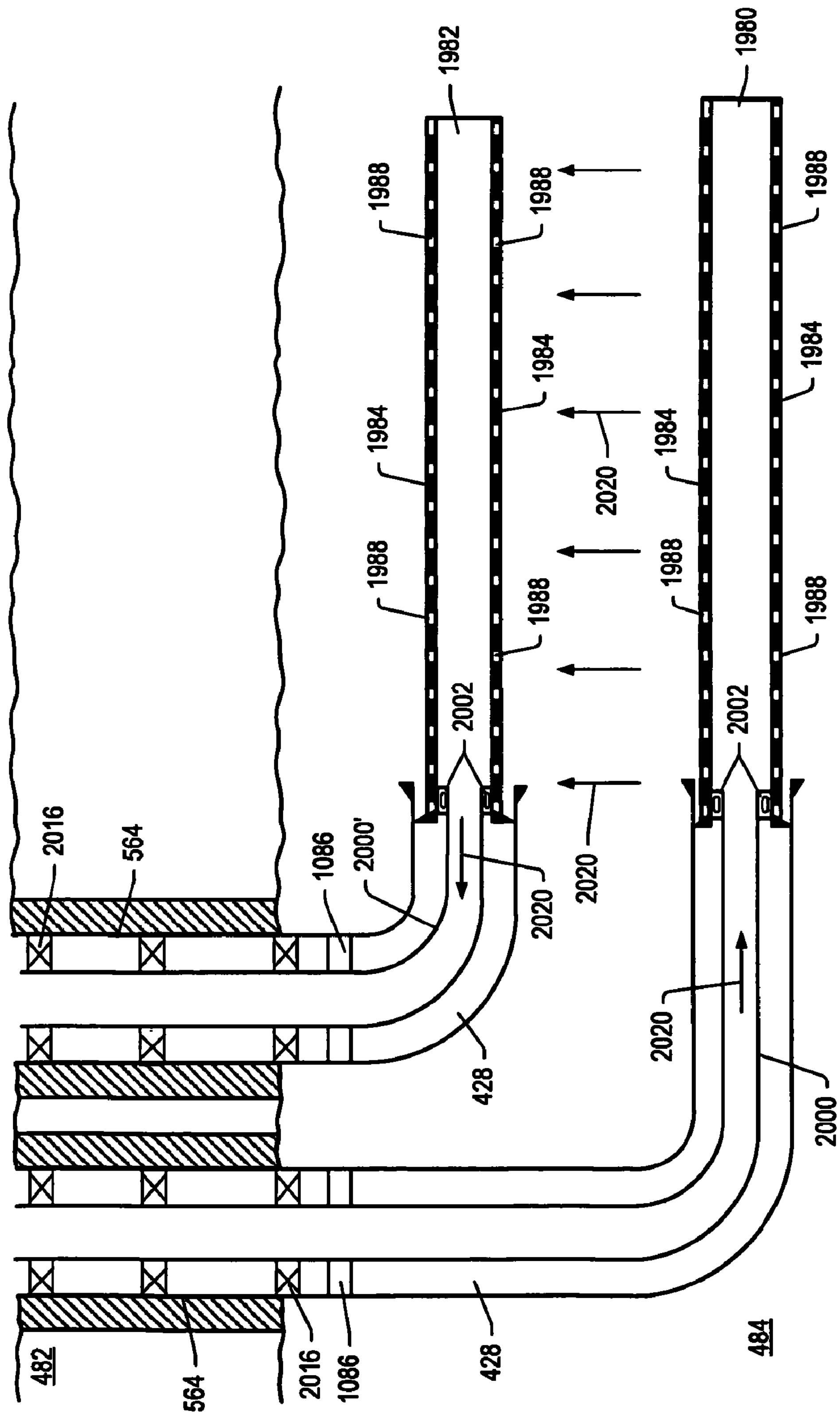

FIG. 305 depicts a schematic of an embodiment for treating a subsurface formation using heat sources having electrically conductive material.

Figure 306:
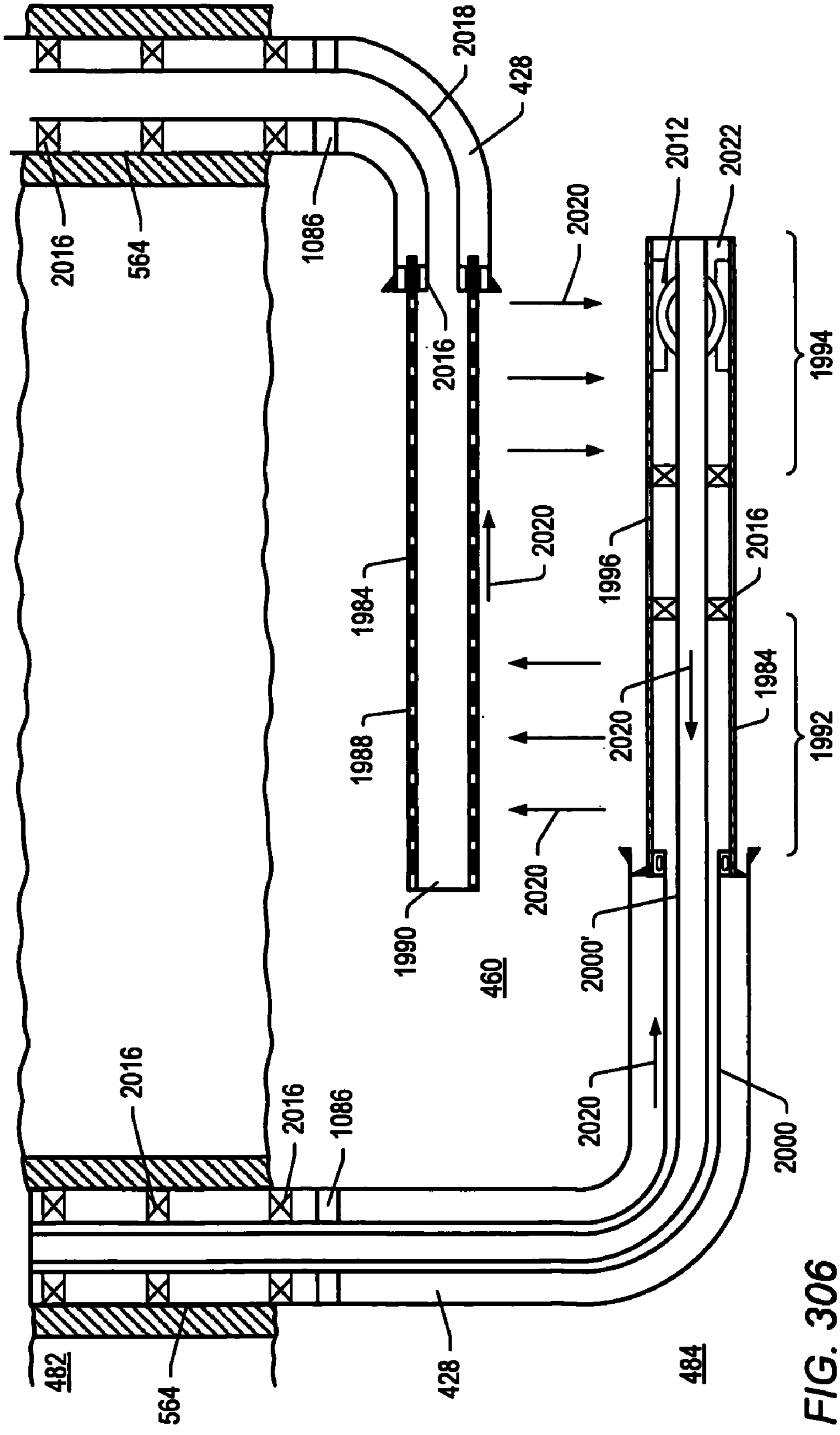

FIG. 306 depicts a schematic of an embodiment for treating a subsurface formation having a shale layer using heat sources having electrically conductive material.

FIG. 306 depicts a schematic of an embodiment for treating a subsurface formation using a ground and heat sources having electrically conductive material.

Figure 307:
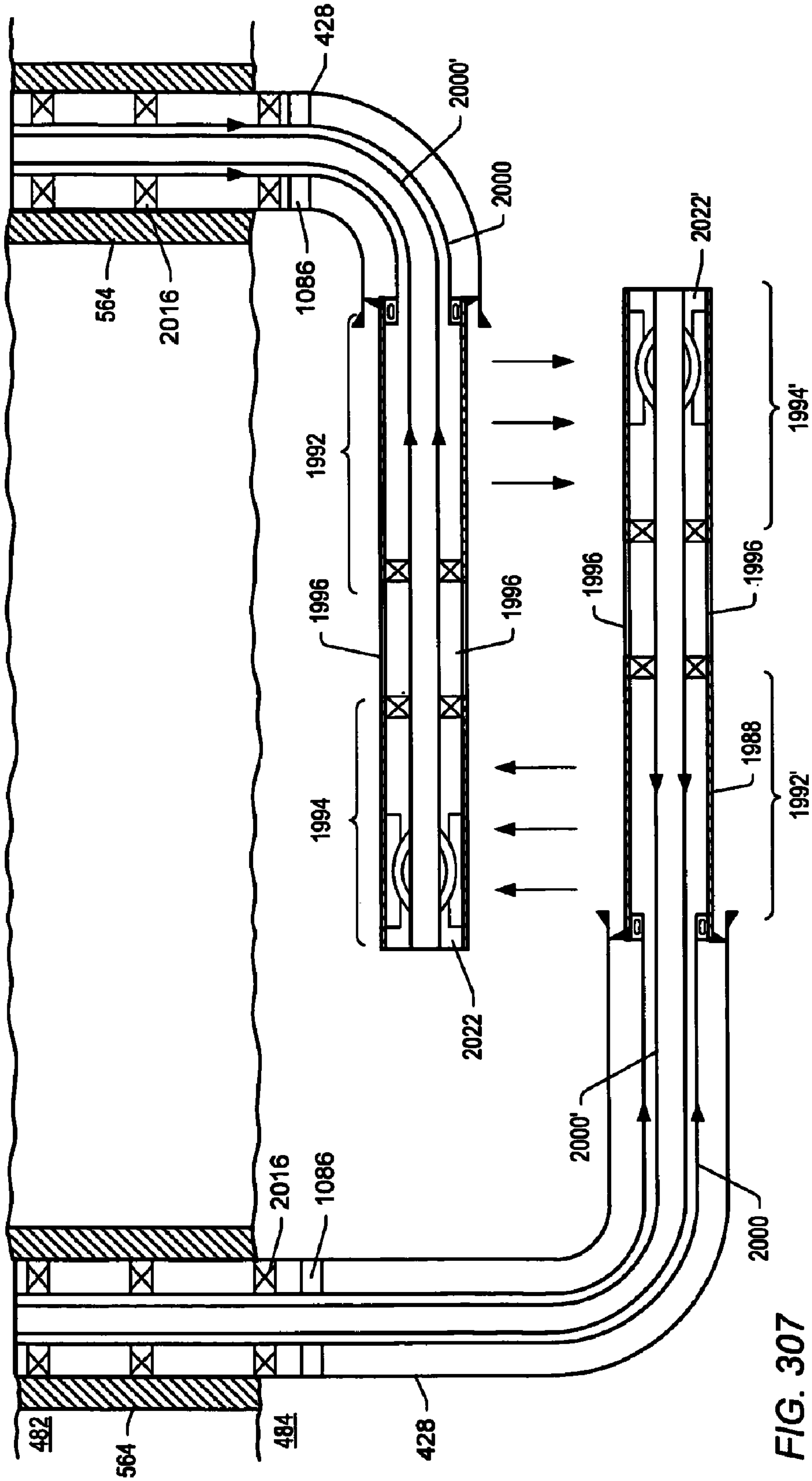

FIG. 307 depicts a schematic of an embodiment for treating a subsurface formation using heat sources having electrically conductive material and an electrical insulator.

Figure 308:
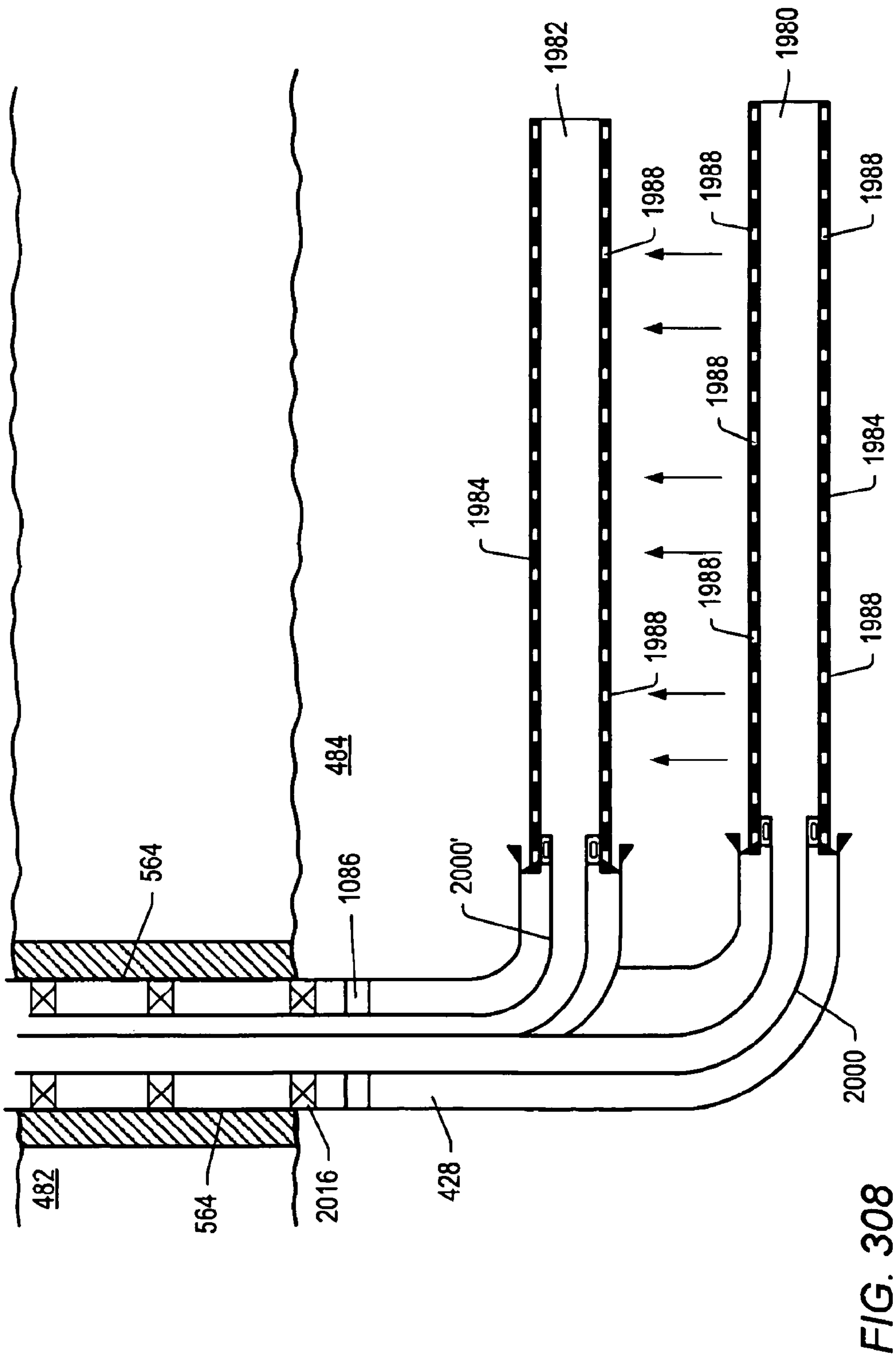

FIG. 308 depicts a schematic of an embodiment for treating a subsurface formation using electrically conductive heat sources extending from a common wellbore.

Figure 309:
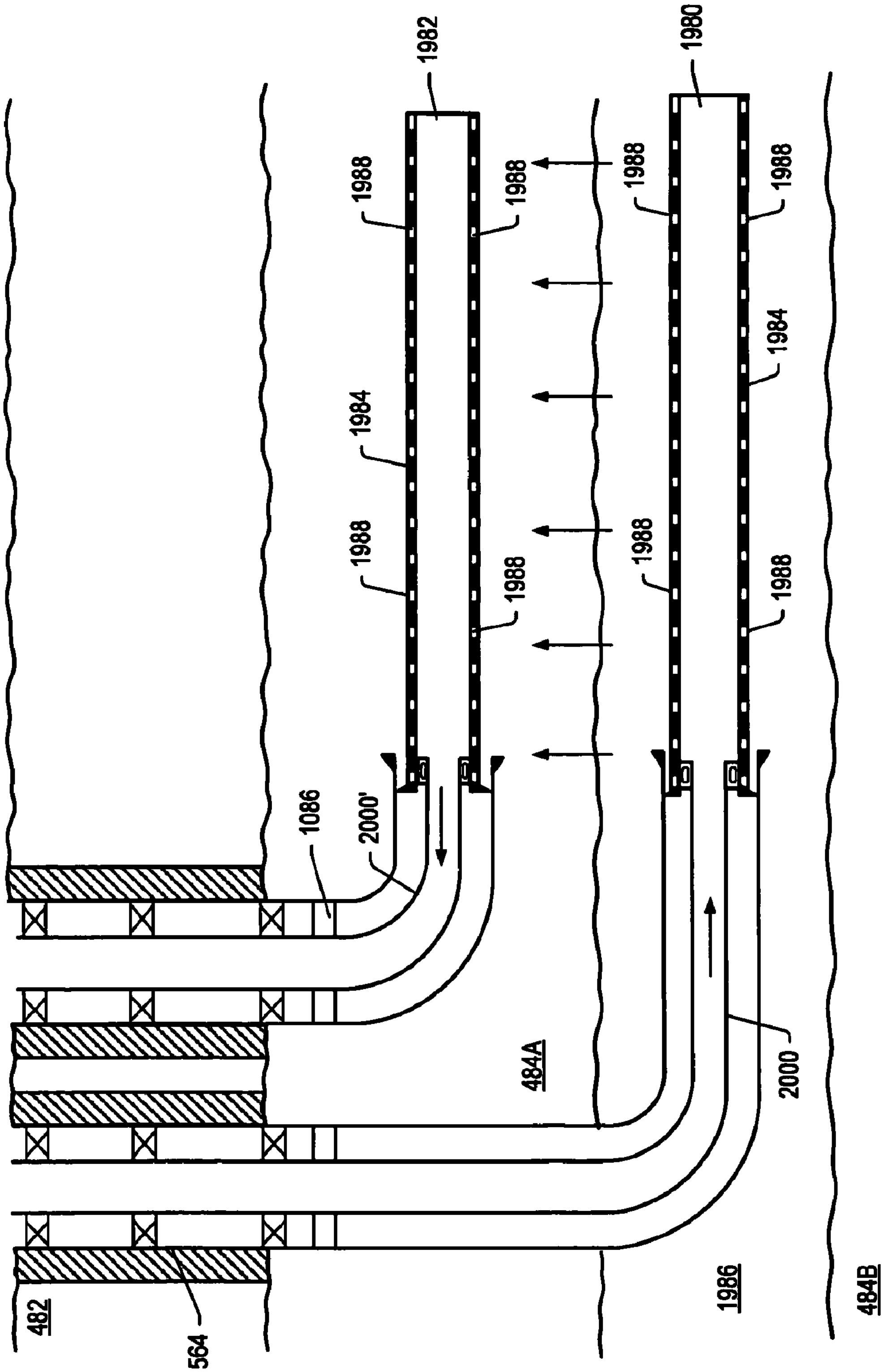

FIG. 309 depicts a schematic of an embodiment for treating a subsurface formation having a shale layer using heat sources having electrically conductive material.

Figure 310A:
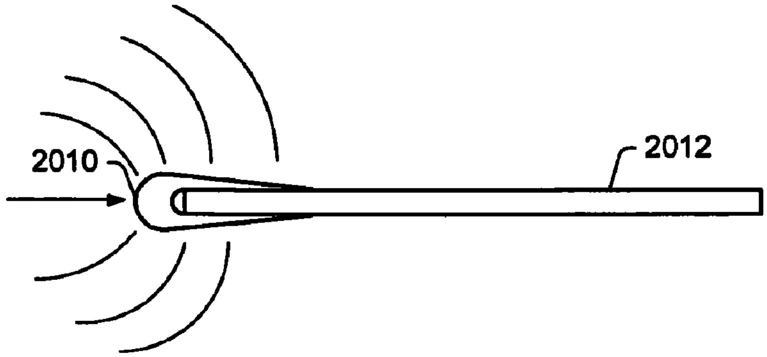

FIGS. 310A,B depicts a schematics of an embodiments of an uncoated electrode and an electrode with a coated end, respectively.

Figure 311A:
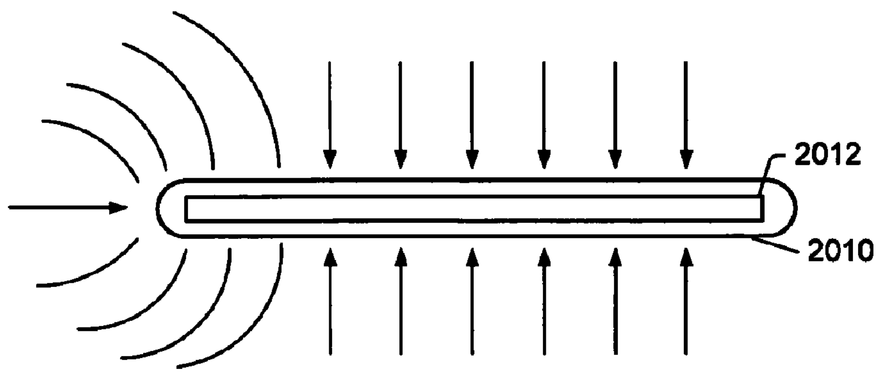

FIGS. 311A,B depicts a schematics of an embodiments of an uncoated electrode and a coated electrode, respectively.

Figure 312:
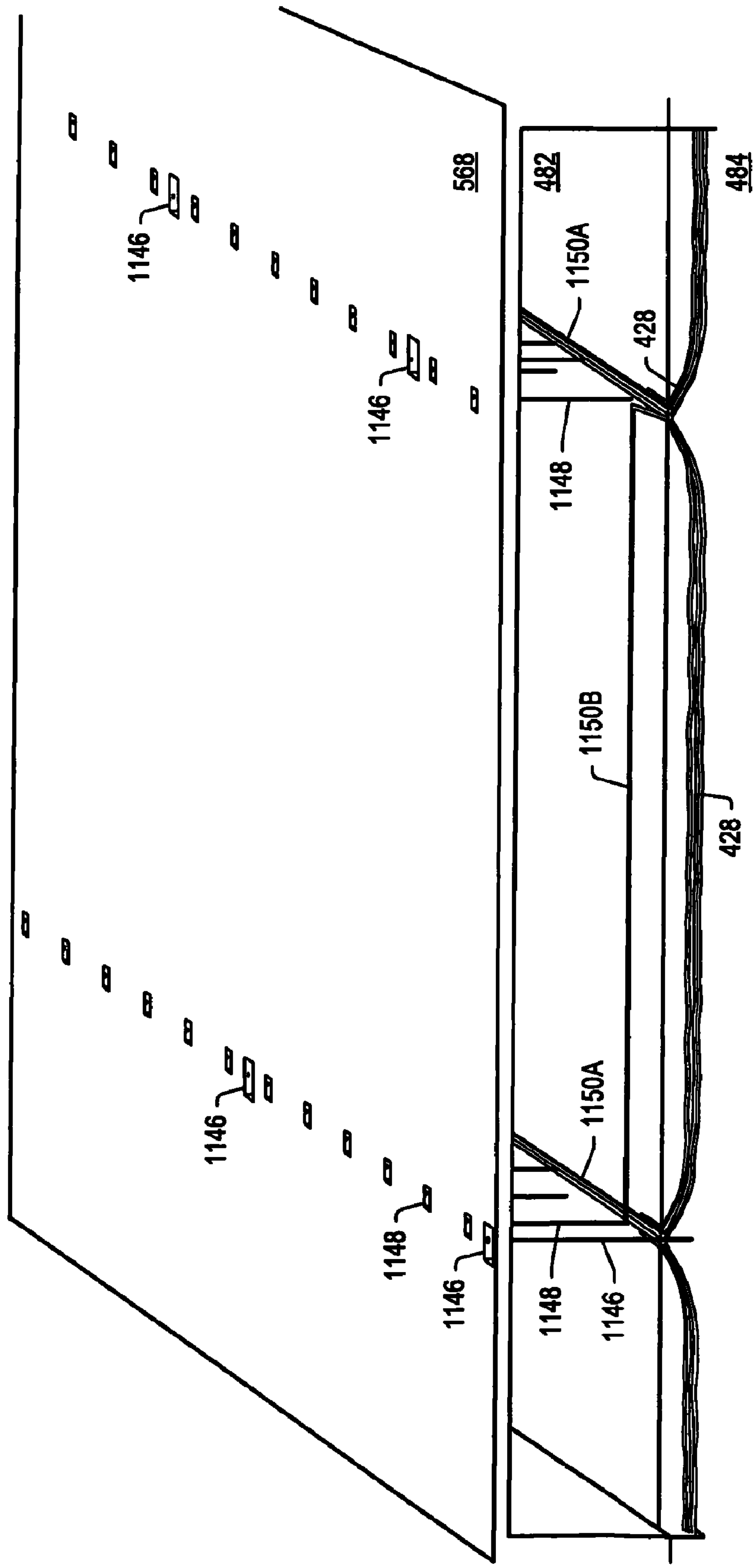

FIG. 312 depicts a perspective view of an embodiment of an underground treatment system.

Figure 313:
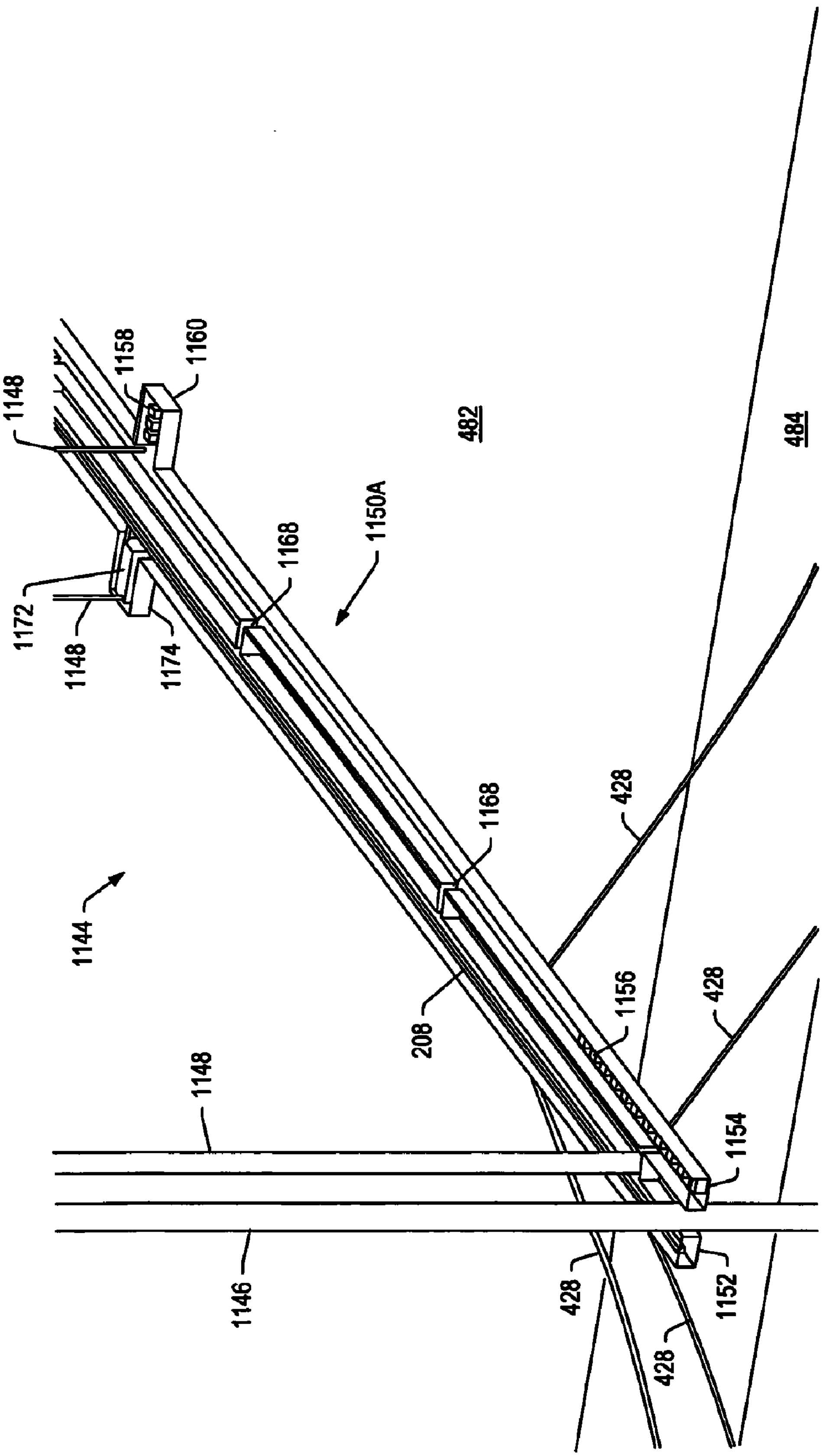

FIG. 313 depicts a perspective view of tunnels of an embodiment of an underground treatment system.

Figure 314:
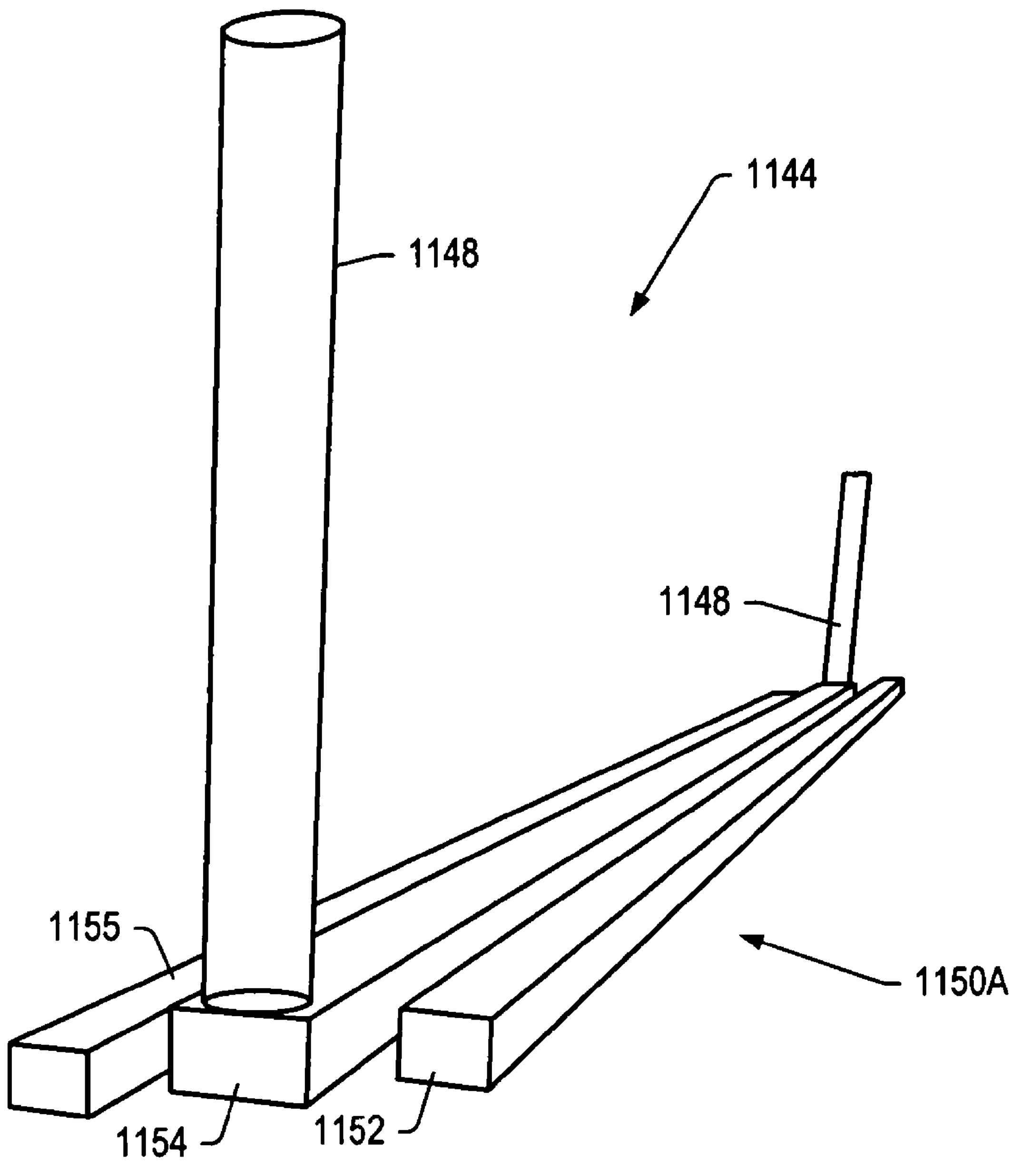

FIG. 314 depicts another exploded perspective view of a portion of an underground treatment system and tunnels.

Figure 315:
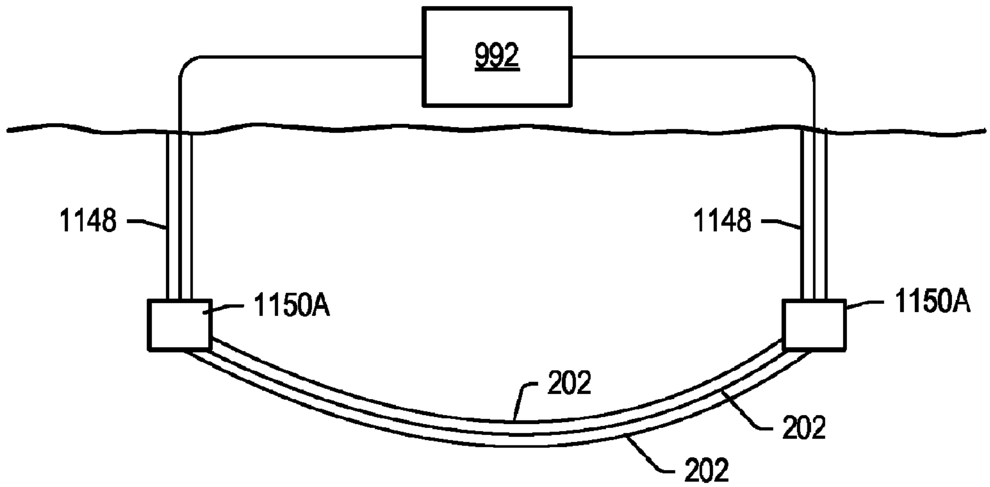

FIG. 315 depicts a side view representation of an embodiment for flowing heated fluid through heat sources between tunnels.

Figure 316:
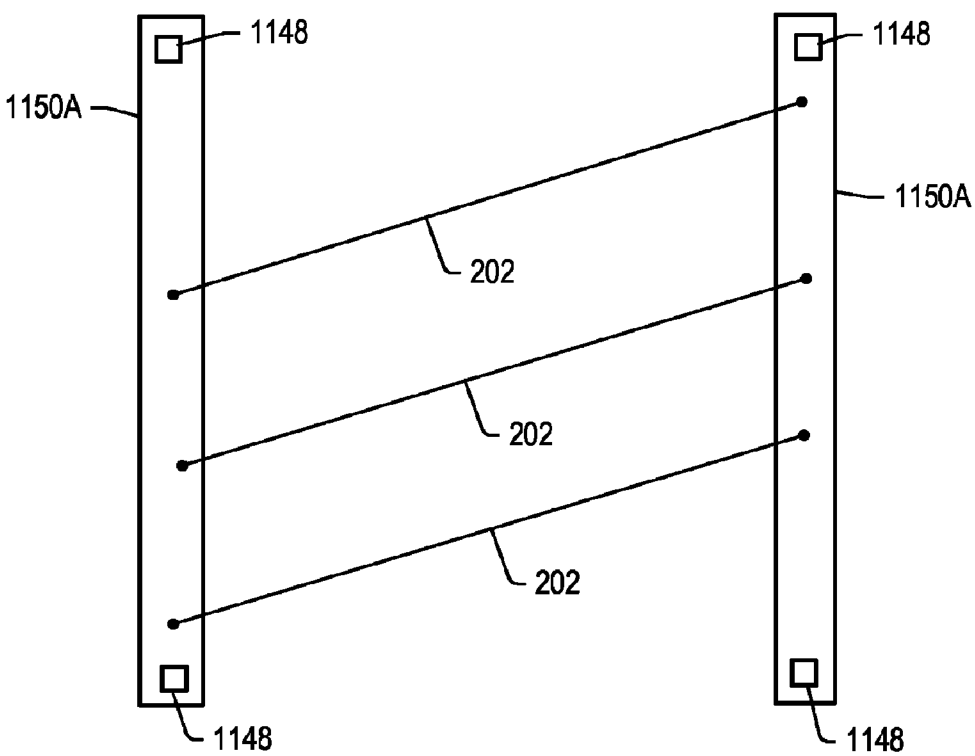

FIG. 316 depicts a top view representation of an embodiment for flowing heated fluid through heat sources between tunnels.

Figure 317:
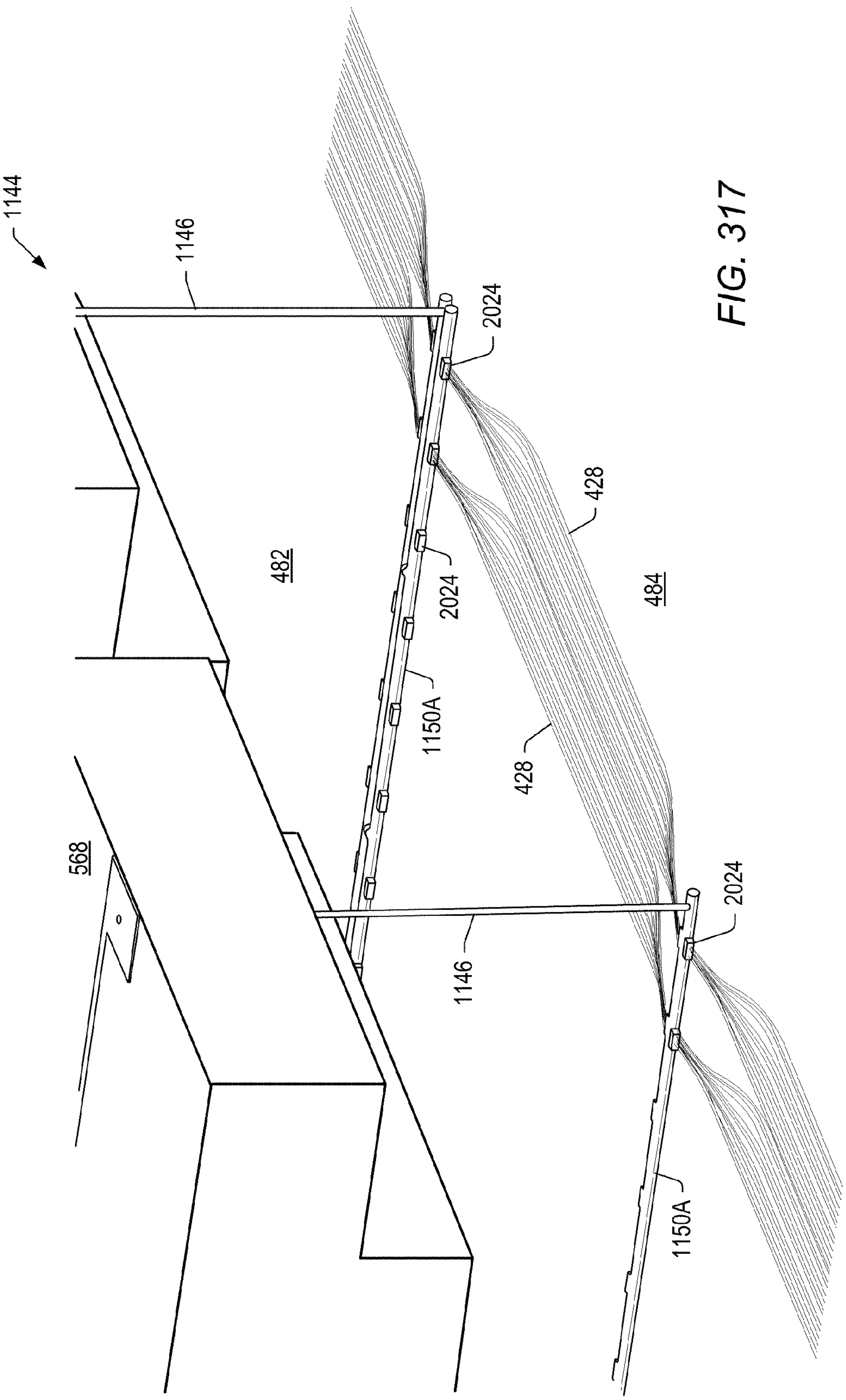

FIG. 317 depicts a perspective view of an embodiment of an underground treatment system having heater wellbores spanning between to two tunnels of the underground treatment system.

Figure 318:
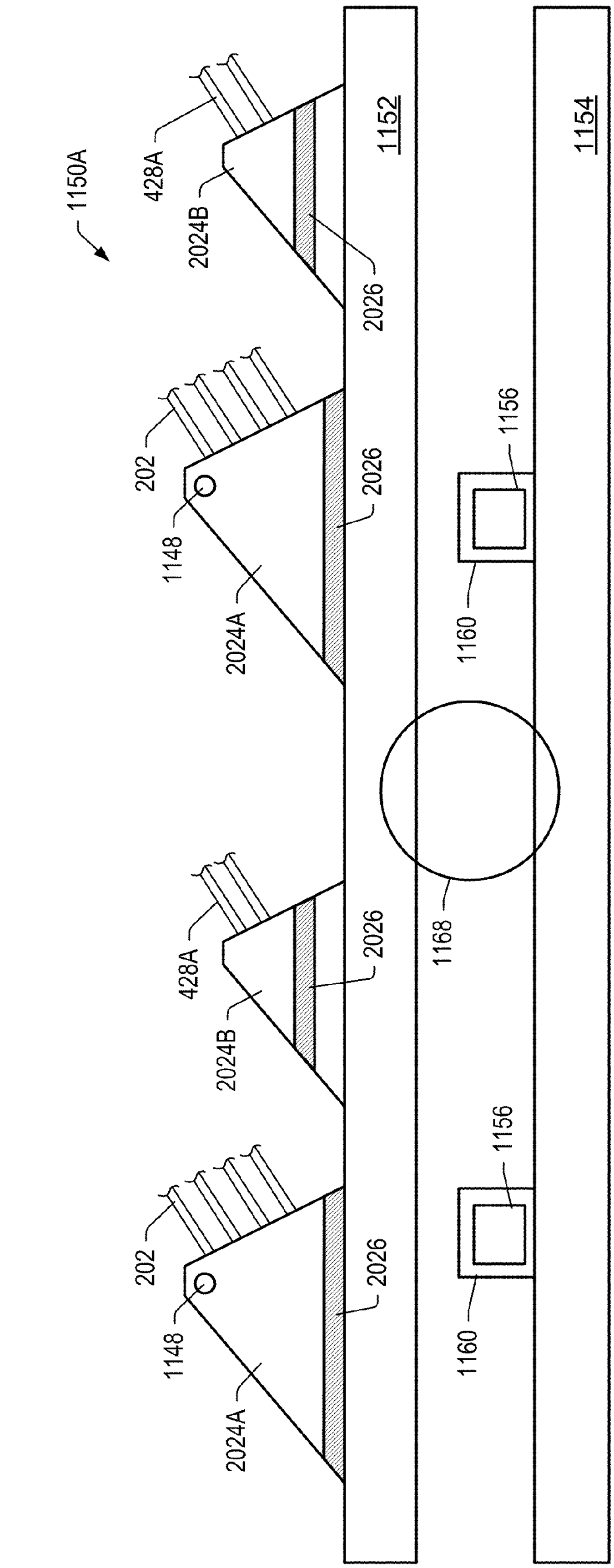

FIG. 318 depicts a top view of an embodiment of tunnels with wellbore chambers.

Figure 319:
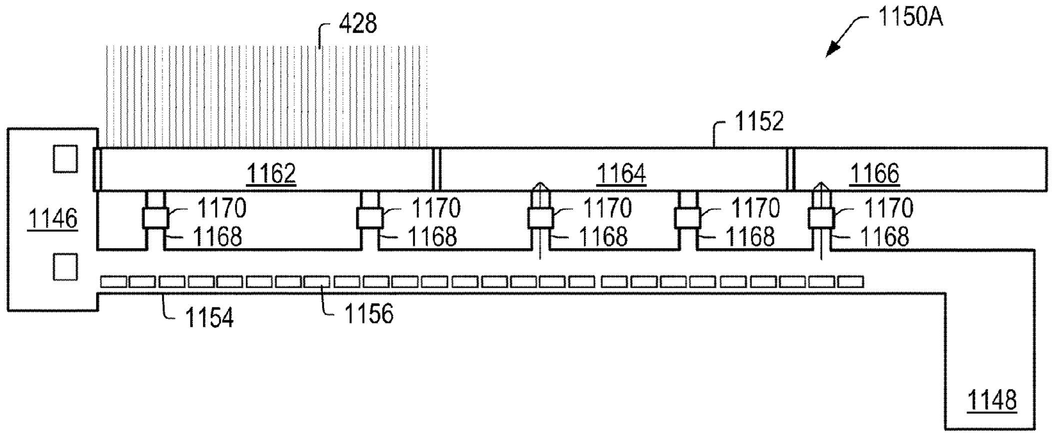

FIG. 319 depicts a schematic view of tunnel sections of an embodiment of an underground treatment system.

Figure 320:
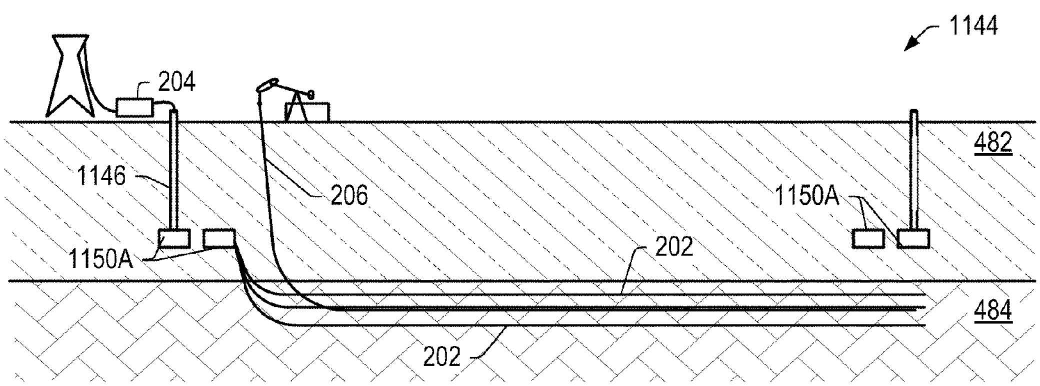

FIG. 320 depicts a schematic view of an embodiment of an underground treatment system with surface production.

Figure 321:
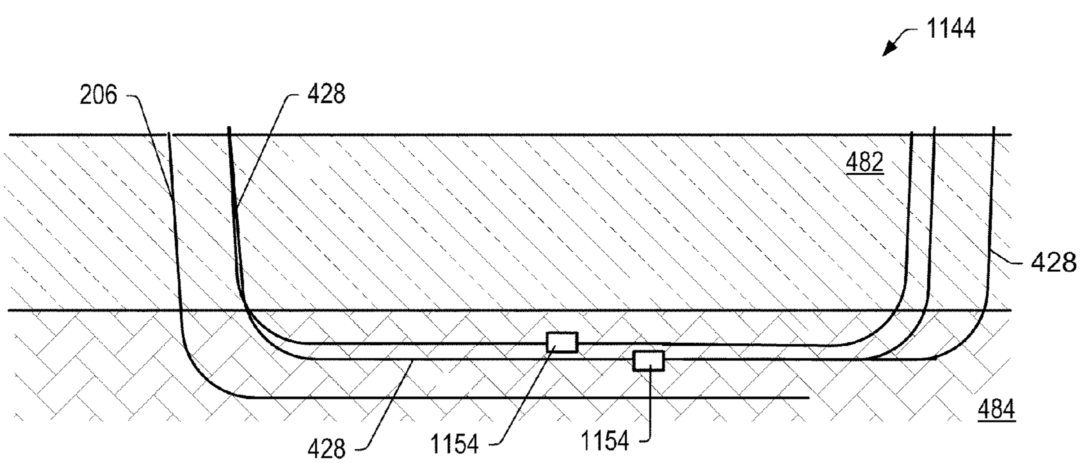

FIG. 321 depicts a side view of an embodiment of an underground treatment system.

Figure 322:
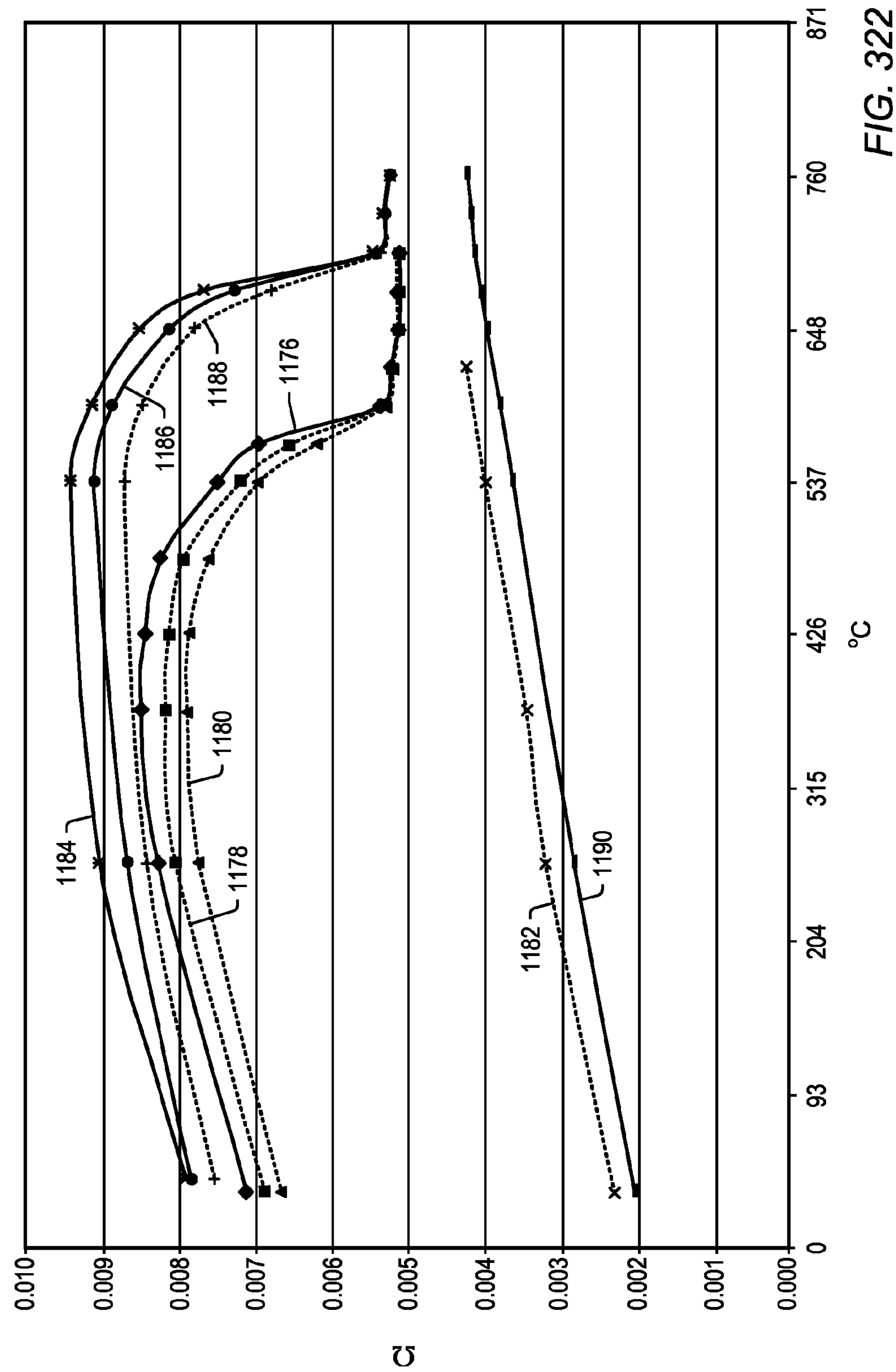

FIG. 322 depicts electrical resistance versus temperature at various applied electrical currents for a 446 stainless steel rod.

Figure 323:
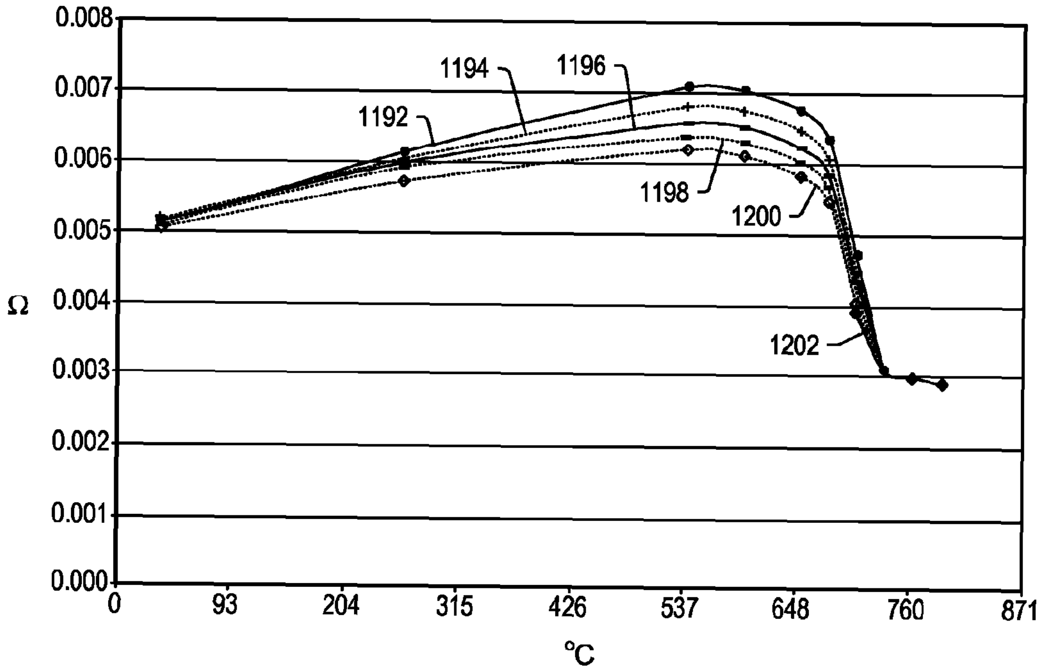

FIG. 323 shows resistance profiles as a function of temperature at various applied electrical currents for a copper rod contained in a conduit of Sumitomo HCM12A.

Figure 324:
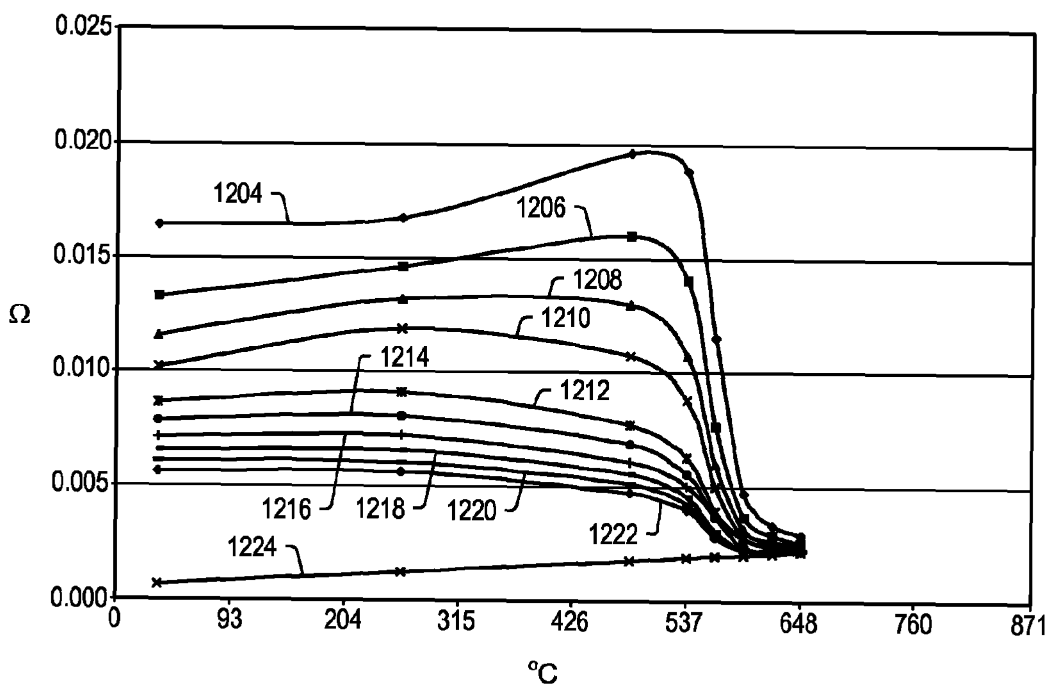

FIG. 324 depicts electrical resistance versus temperature at various applied electrical currents for a temperature limited heater.

Figure 325:
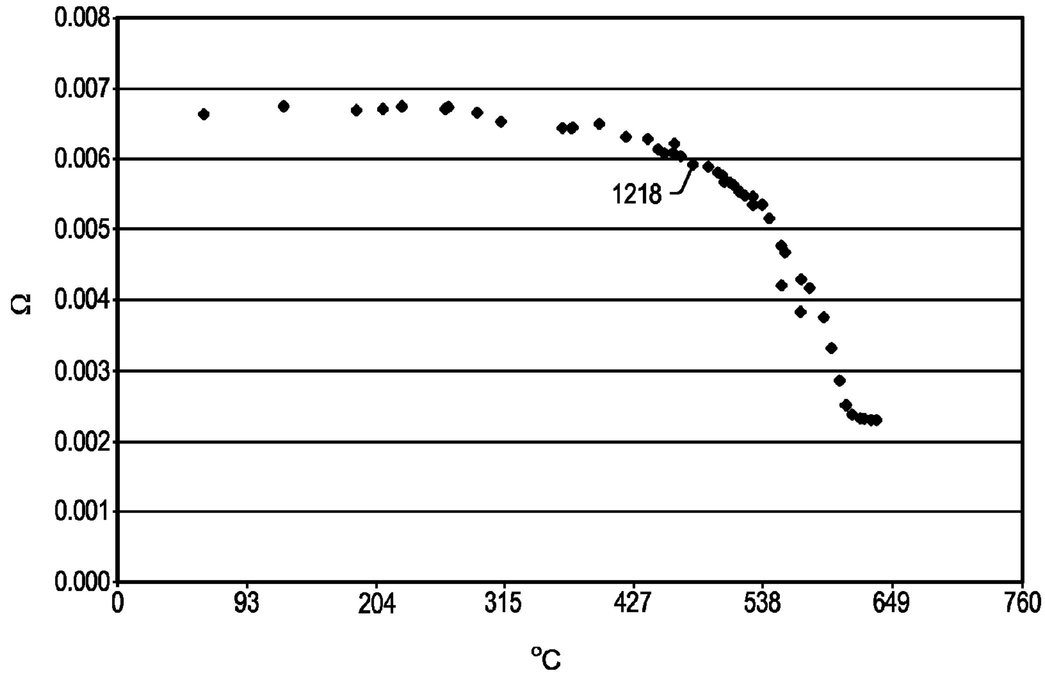

FIG. 325 depicts raw data for a temperature limited heater.

Figure 326:
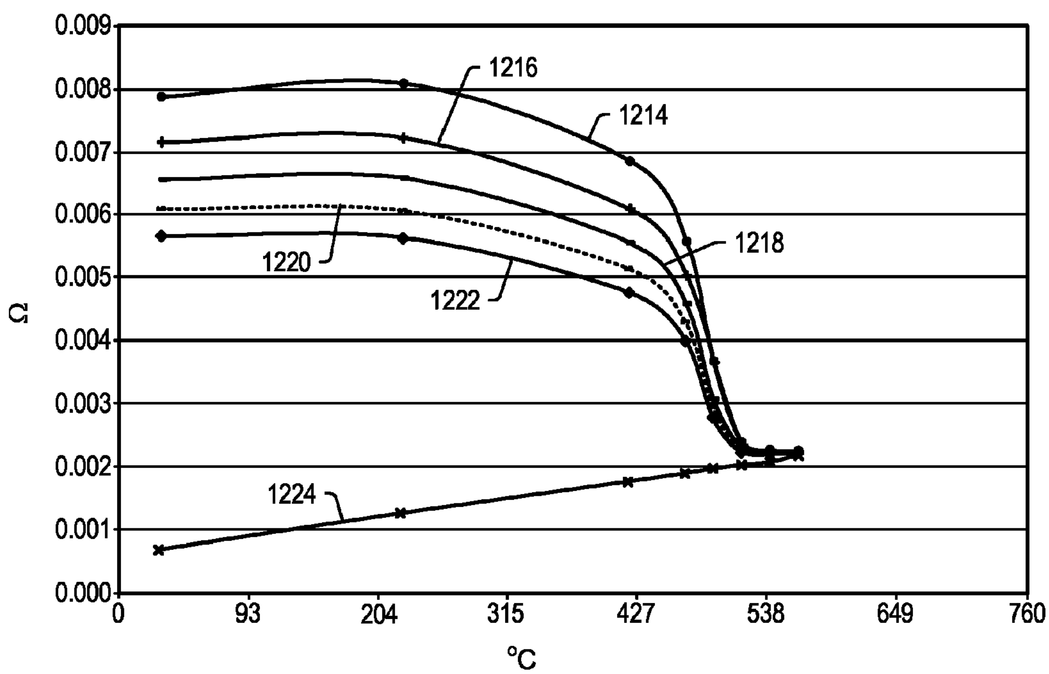

FIG. 326 depicts electrical resistance versus temperature at various applied electrical currents for a temperature limited heater.

Figure 327:
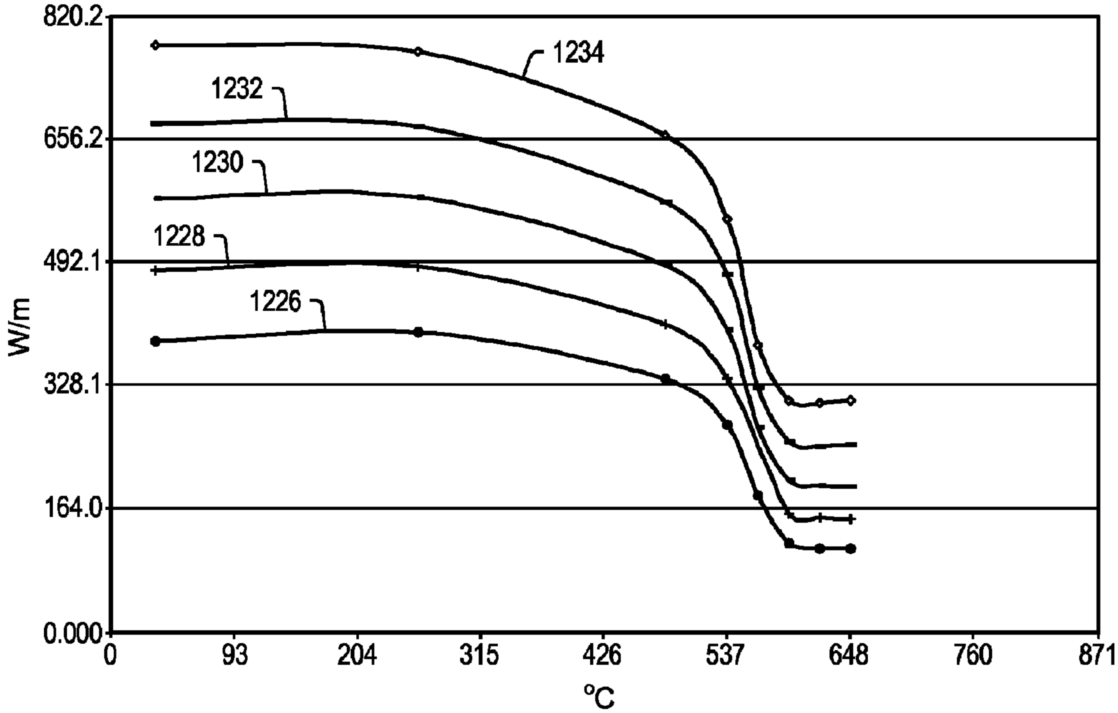

FIG. 327 depicts power versus temperature at various applied electrical currents for a temperature limited heater.

Figure 328:
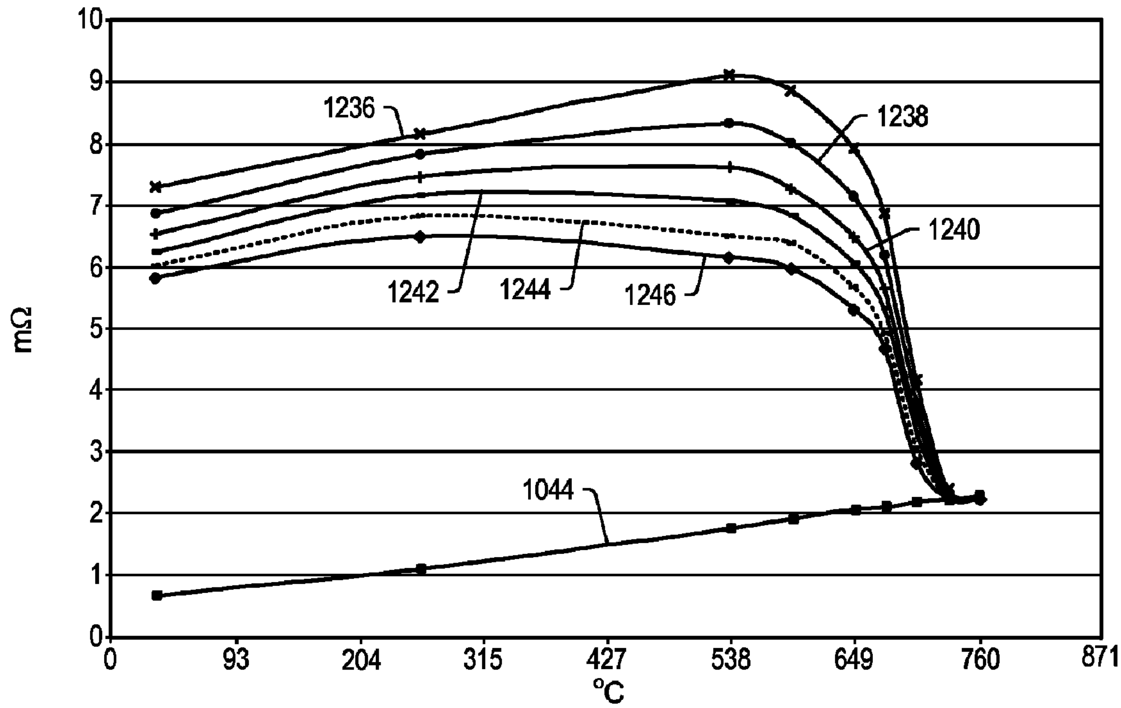

FIG. 328 depicts electrical resistance versus temperature at various applied electrical currents for a temperature limited heater.

Figure 329:
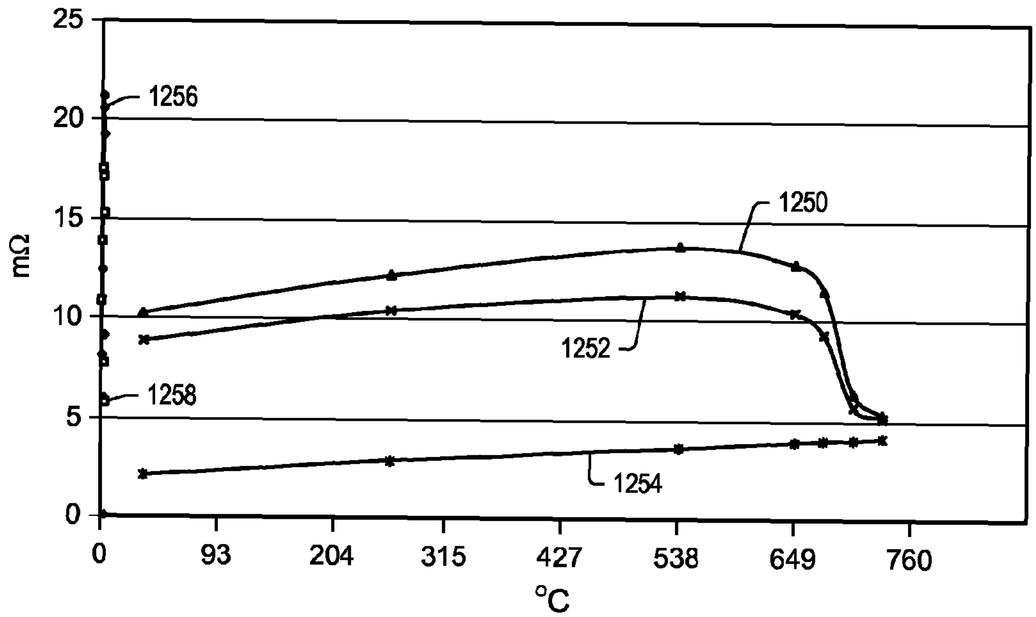

FIG. 329 depicts data of electrical resistance versus temperature for a solid 2.54 cm diameter, 1.8 m long 410 stainless steel rod at various applied electrical currents.

Figure 330:
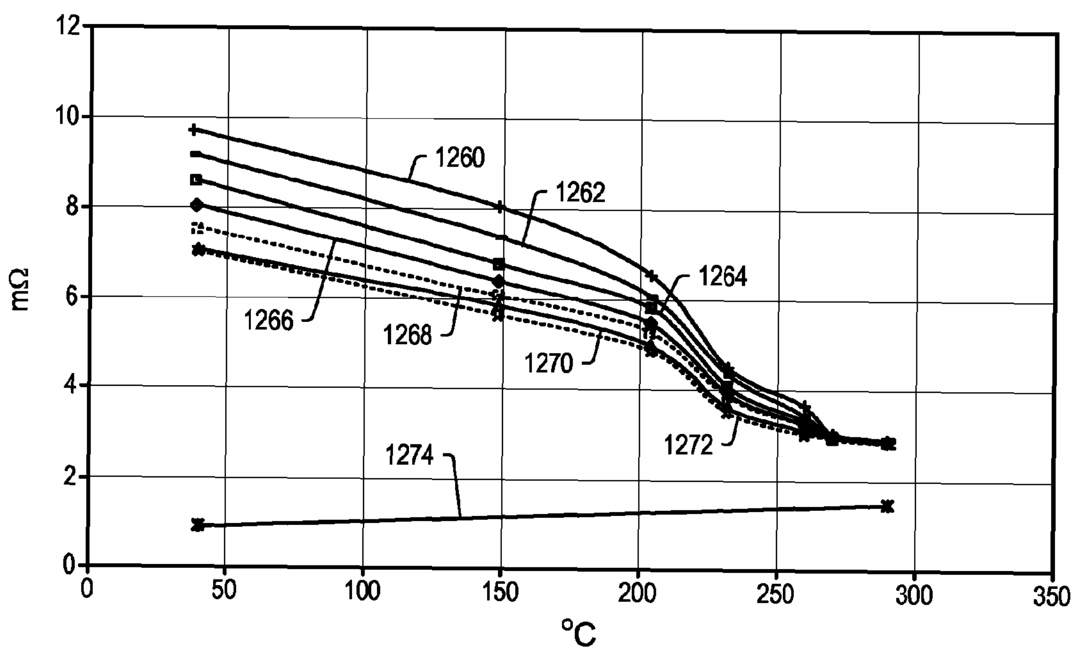

FIG. 330 depicts data of electrical resistance versus temperature for a composite 1.9 cm, 1.8 m long alloy 42-6 rod with a copper core (the rod has an outside diameter to copper diameter ratio of 2:1) at various applied electrical currents.

Figure 331:
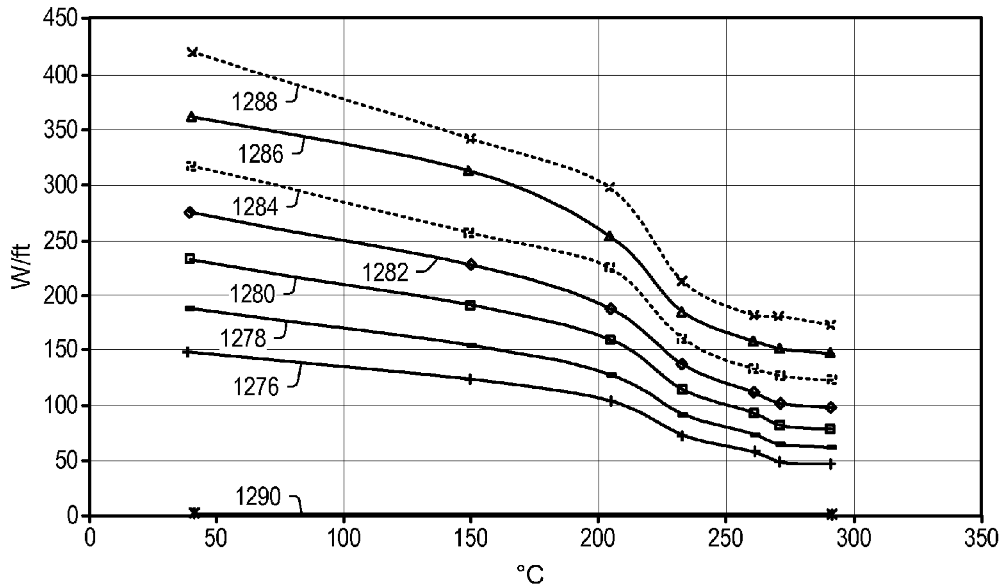

FIG. 331 depicts data of power output versus temperature for a composite 1.9 cm diameter, 1.8 m long alloy 42-6 rod with a copper core (the rod has an outside diameter to copper diameter ratio of 2:1) at various applied electrical currents.

Figure 332:
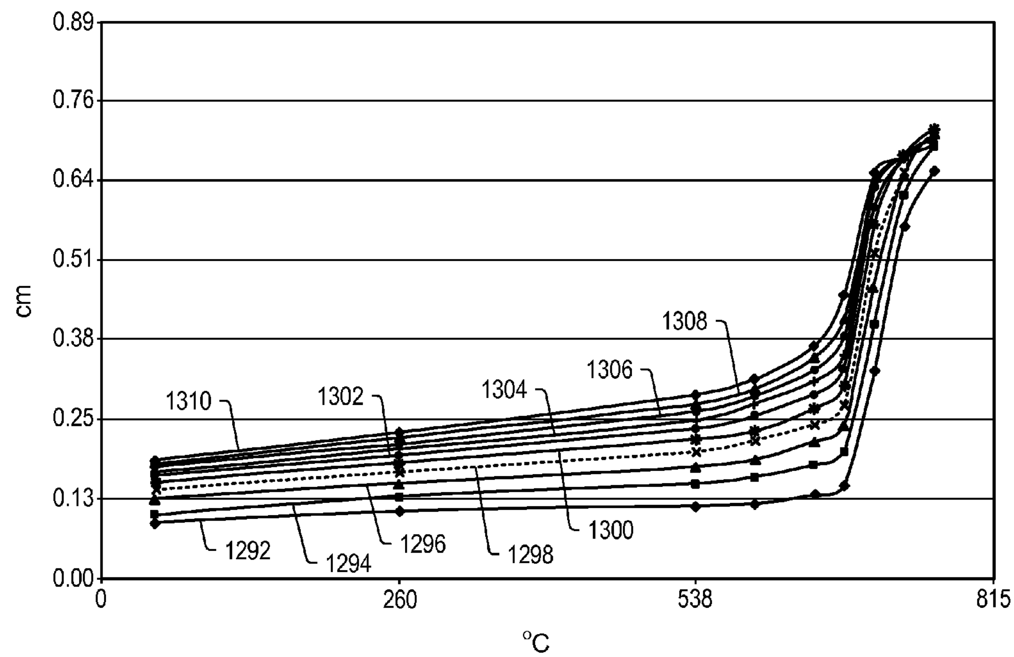

FIG. 332 depicts data for values of skin depth versus temperature for a solid 2.54 cm diameter, 1.8 m long 410 stainless steel rod at various applied AC electrical currents.

Figure 333:
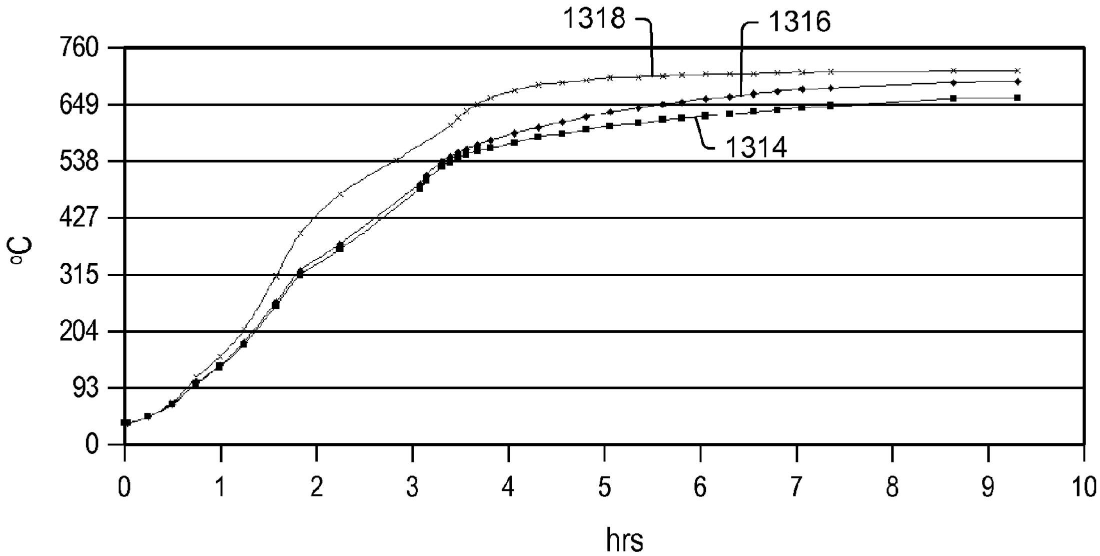

FIG. 333 depicts temperature versus time for a temperature limited heater.

Figure 334:
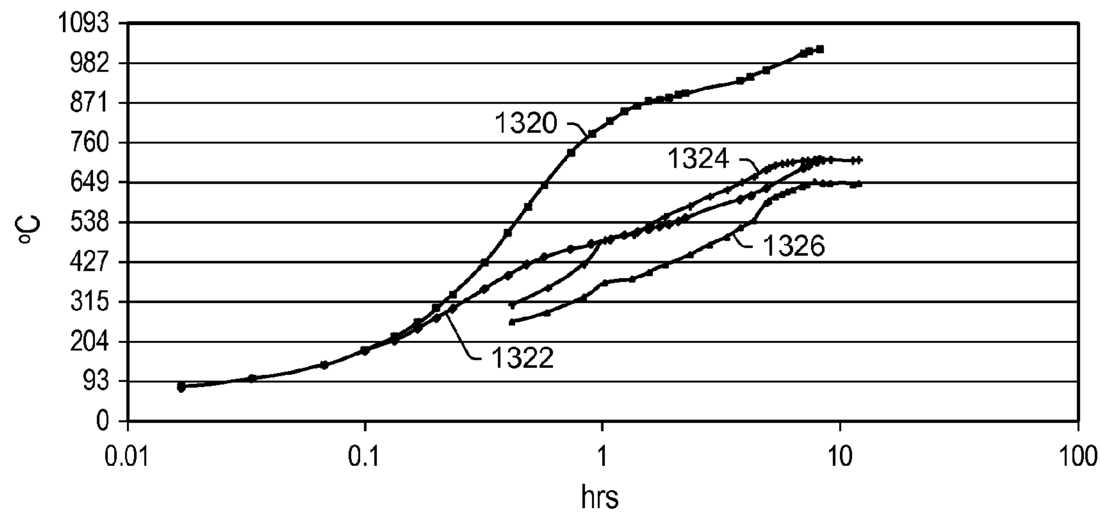

FIG. 334 depicts temperature versus log time data for a 2.5 cm diameter solid 410 stainless steel rod and a 2.5 cm diameter solid 304 stainless steel rod.

Figure 335:
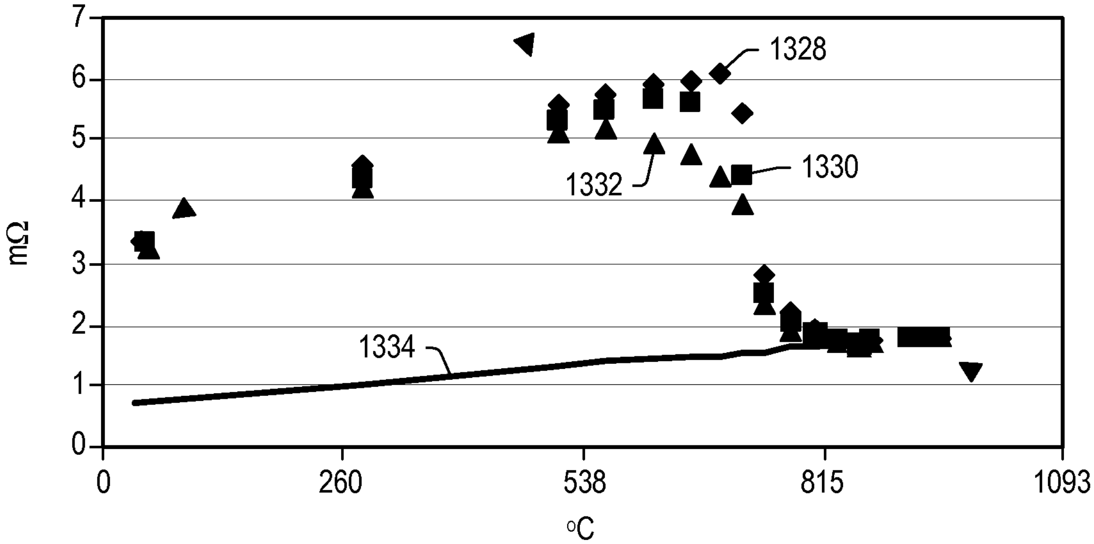

FIG. 335 depicts experimentally measured resistance versus temperature at several currents for a temperature limited heater with a copper core, a carbon steel ferromagnetic conductor, and a 347H stainless steel support member.

Figure 336:
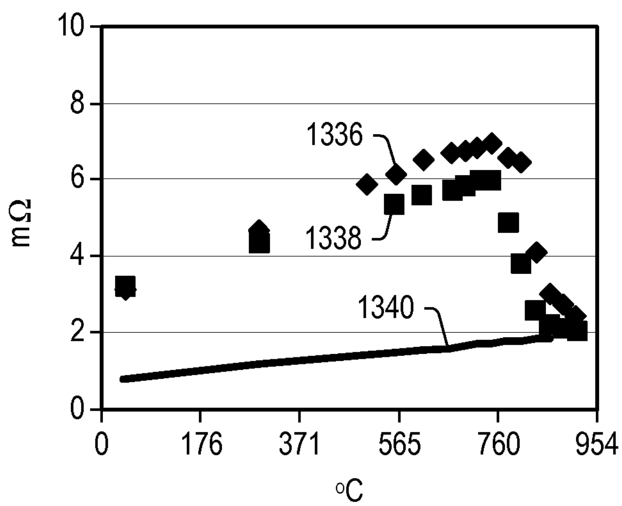

FIG. 336 depicts experimentally measured resistance versus temperature at several currents for a temperature limited heater with a copper core, an iron-cobalt ferromagnetic conductor, and a 347H stainless steel support member.

Figure 337:
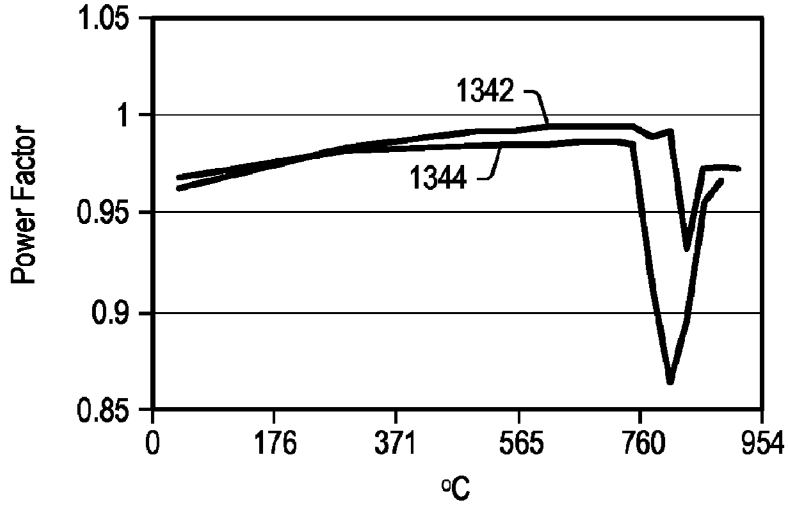

FIG. 337 depicts experimentally measured power factor versus temperature at two AC currents for a temperature limited heater with a copper core, a carbon steel ferromagnetic conductor, and a 347H stainless steel support member.

Figure 338:
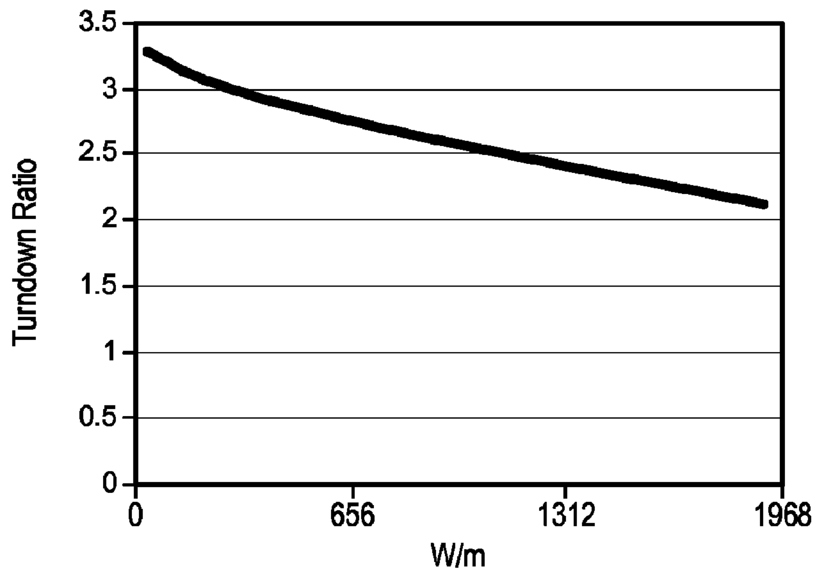

FIG. 338 depicts experimentally measured turndown ratio versus maximum power delivered for a temperature limited heater with a copper core, a carbon steel ferromagnetic conductor, and a 347H stainless steel support member.

Figure 339:
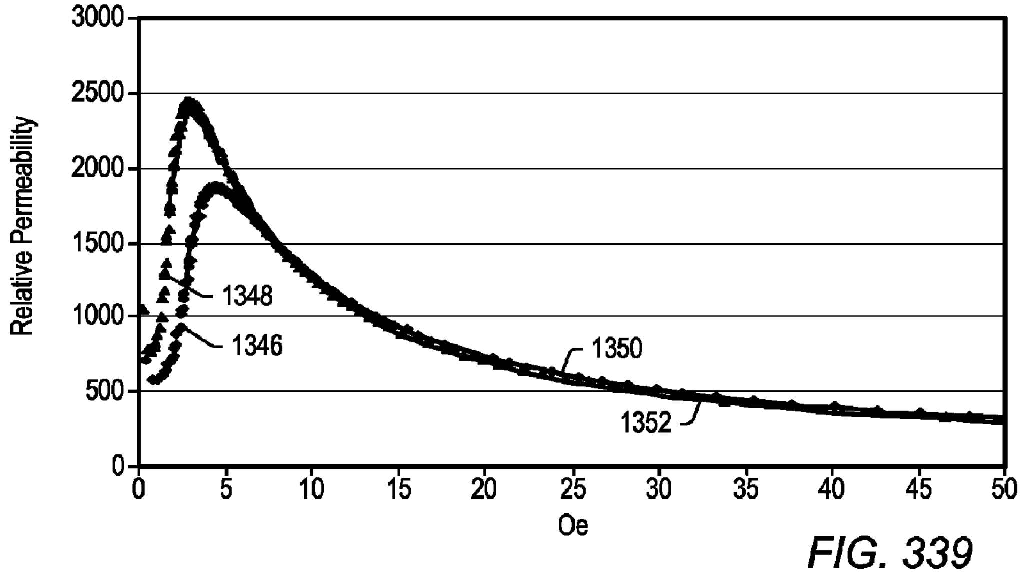

FIG. 339 depicts examples of relative magnetic permeability versus magnetic field for both the found correlations and raw data for carbon steel.

Figure 340:
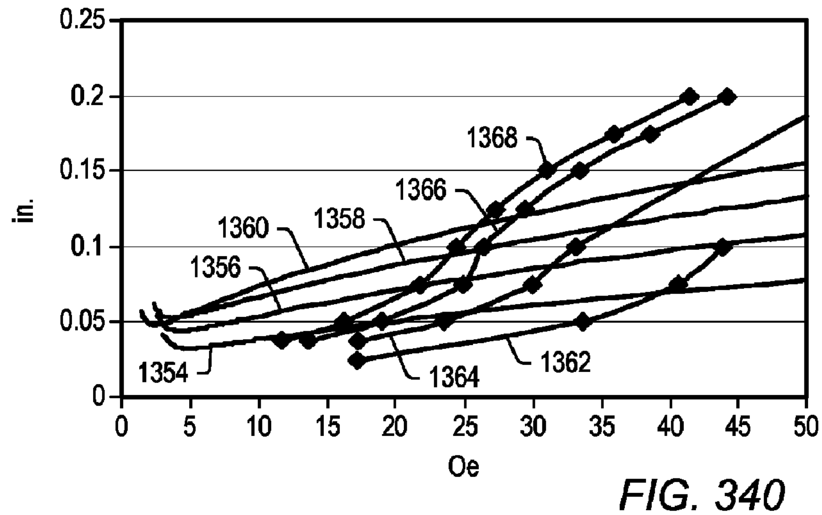

FIG. 340 shows the resulting plots of skin depth versus magnetic field for four temperatures and 400 A current.

Figure 341:
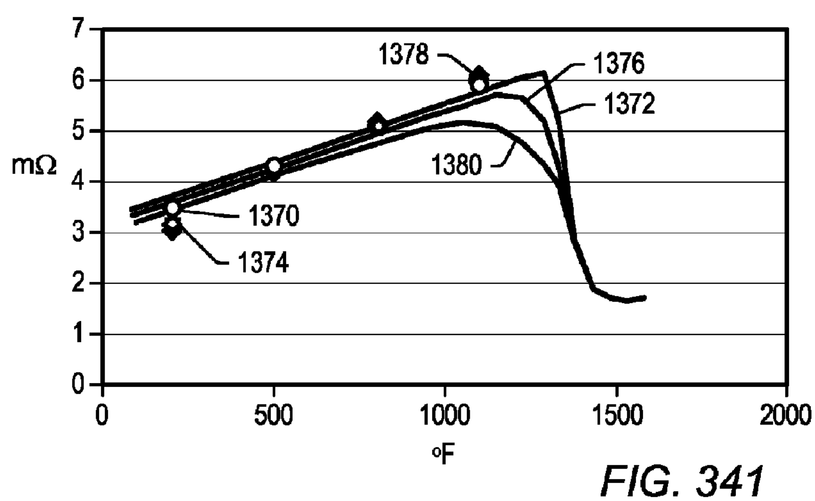

FIG. 341 shows a comparison between the experimental and numerical (calculated) AC resistances for currents of 300 A, 400 A, and 500 A.

Figure 342:
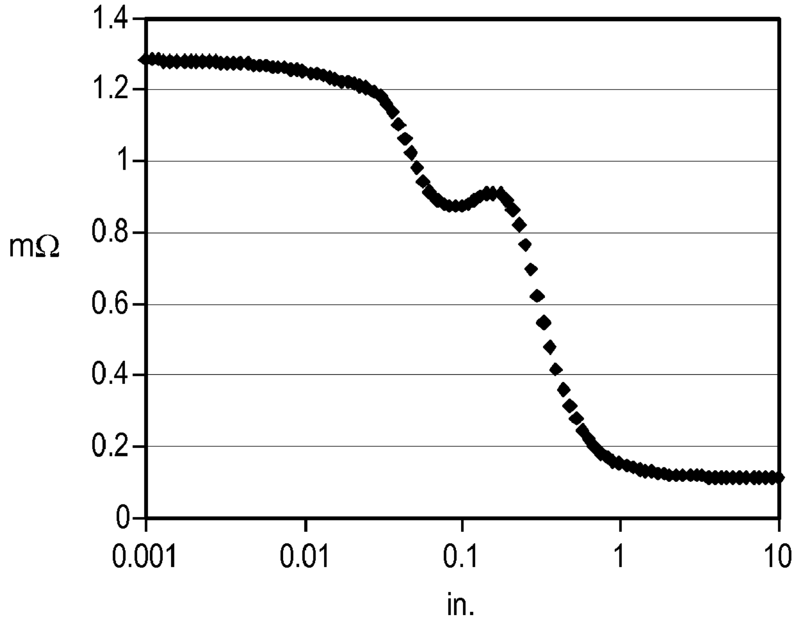

FIG. 342 shows the AC resistance per foot of the heater element as a function of skin depth at 1100° F. calculated from the theoretical model.

Figure 343:
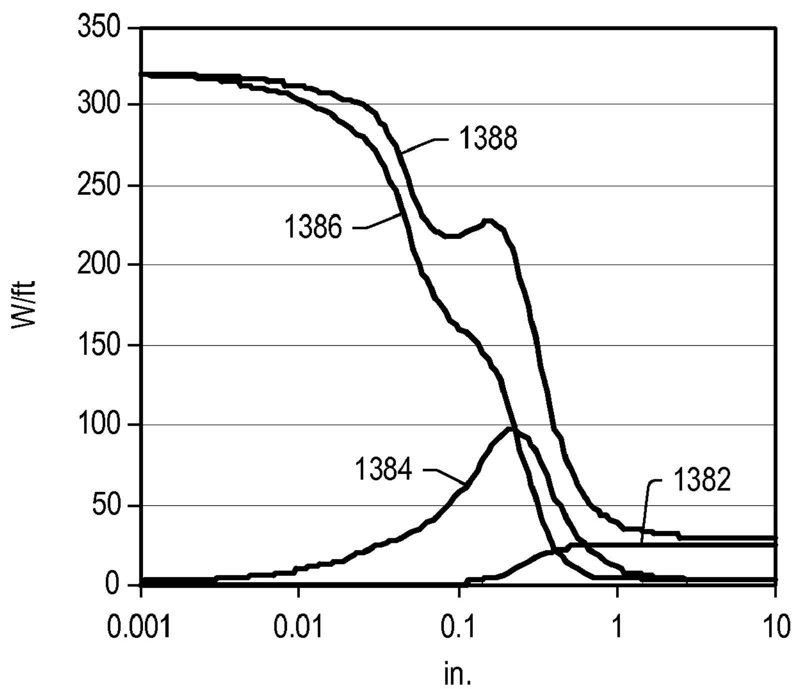

FIG. 343 depicts the power generated per unit length in each heater component versus skin depth for a temperature limited heater.

Figure 344A:
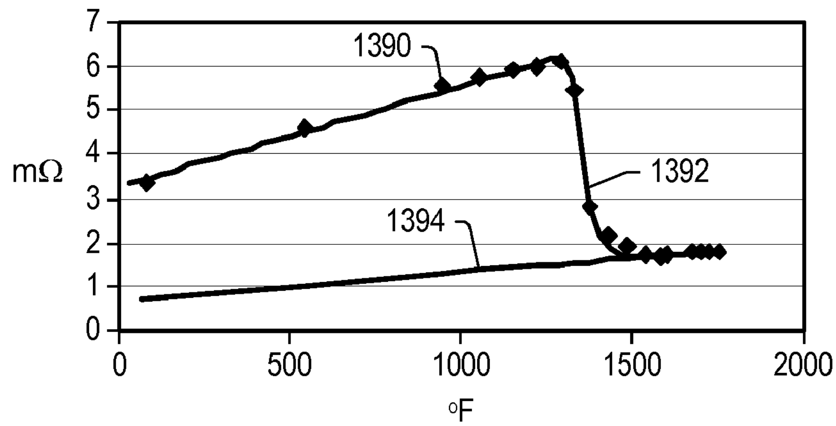
Figure 344B:
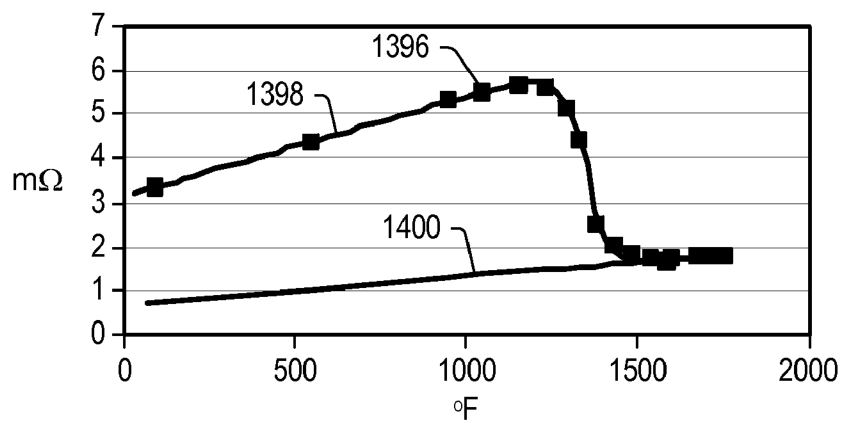
Figure 344C:
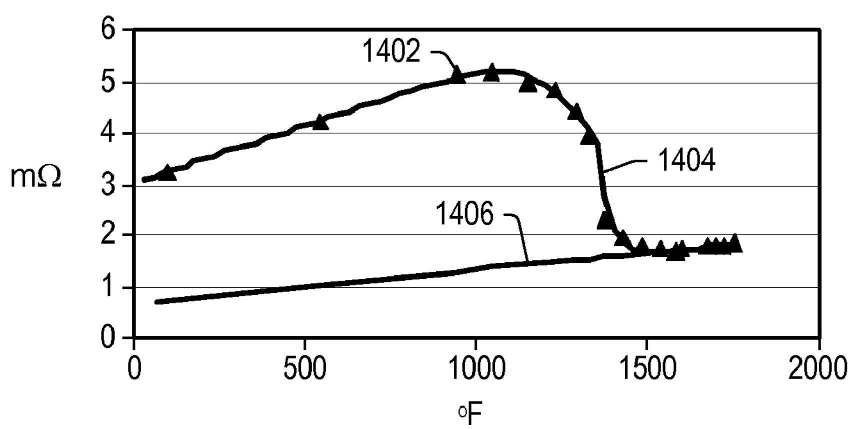

FIGS. 344A-C compare the results of theoretical calculations with experimental data for resistance versus temperature in a temperature limited heater.

Figure 345:
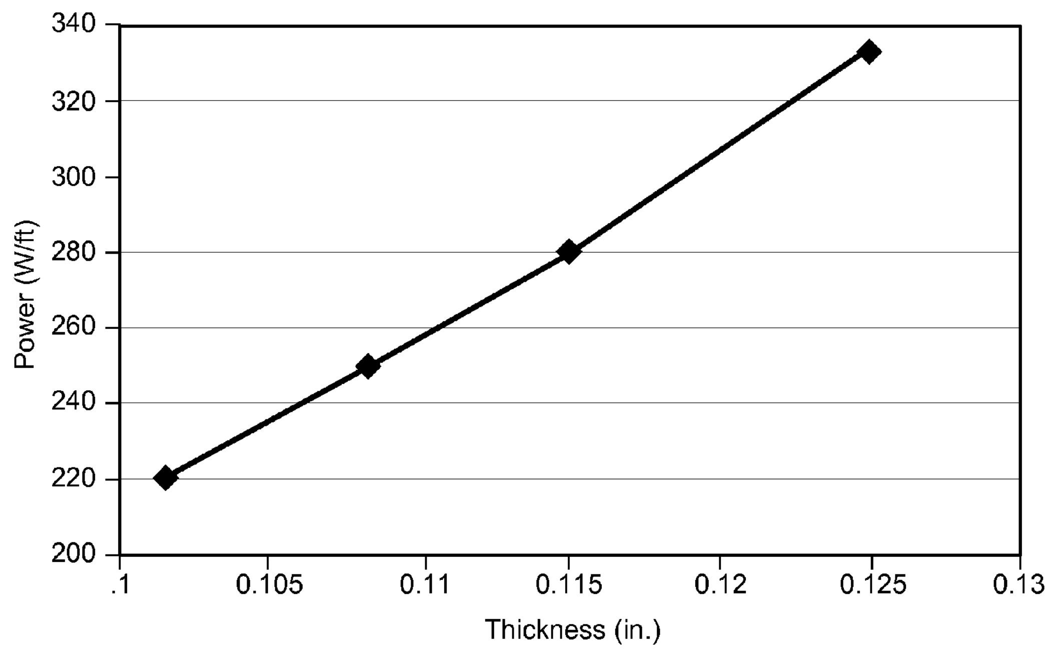

FIG. 345 depicts a plot of heater power versus core diameter.

Figure 346:
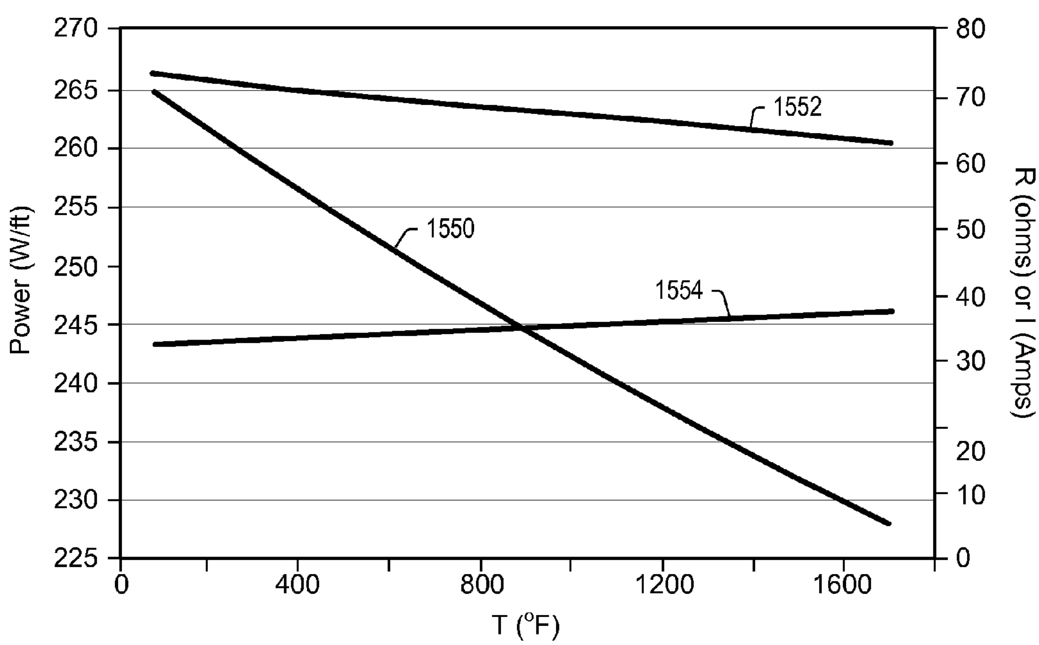

FIG. 346 depicts power, resistance, and current versus temperature for a heater with a core diameter of 0.105".

Figure 347:
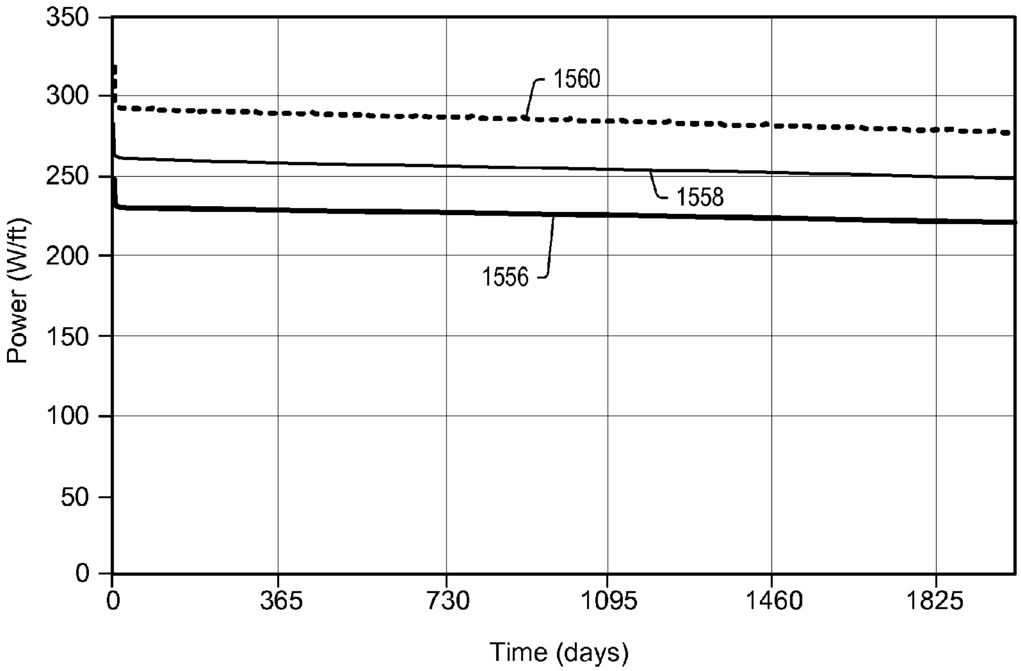

FIG. 347 depicts actual heater power versus time during the simulation for three different heater designs.

Figure 348:
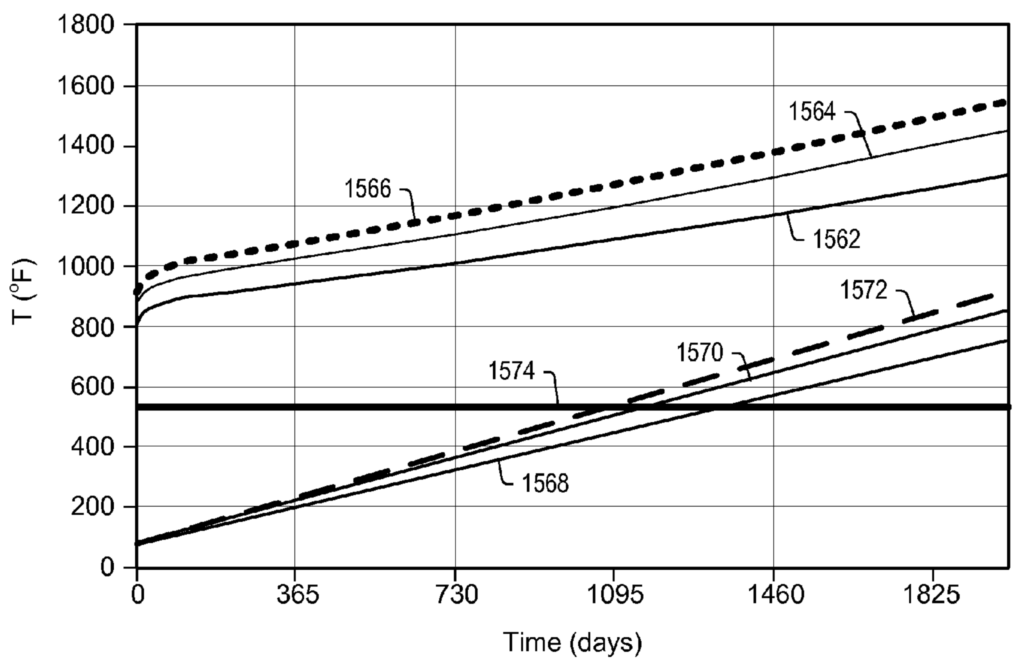

FIG. 348 depicts heater element temperature (core temperature) and average formation temperature versus time for three different heater designs.

Figure 349:
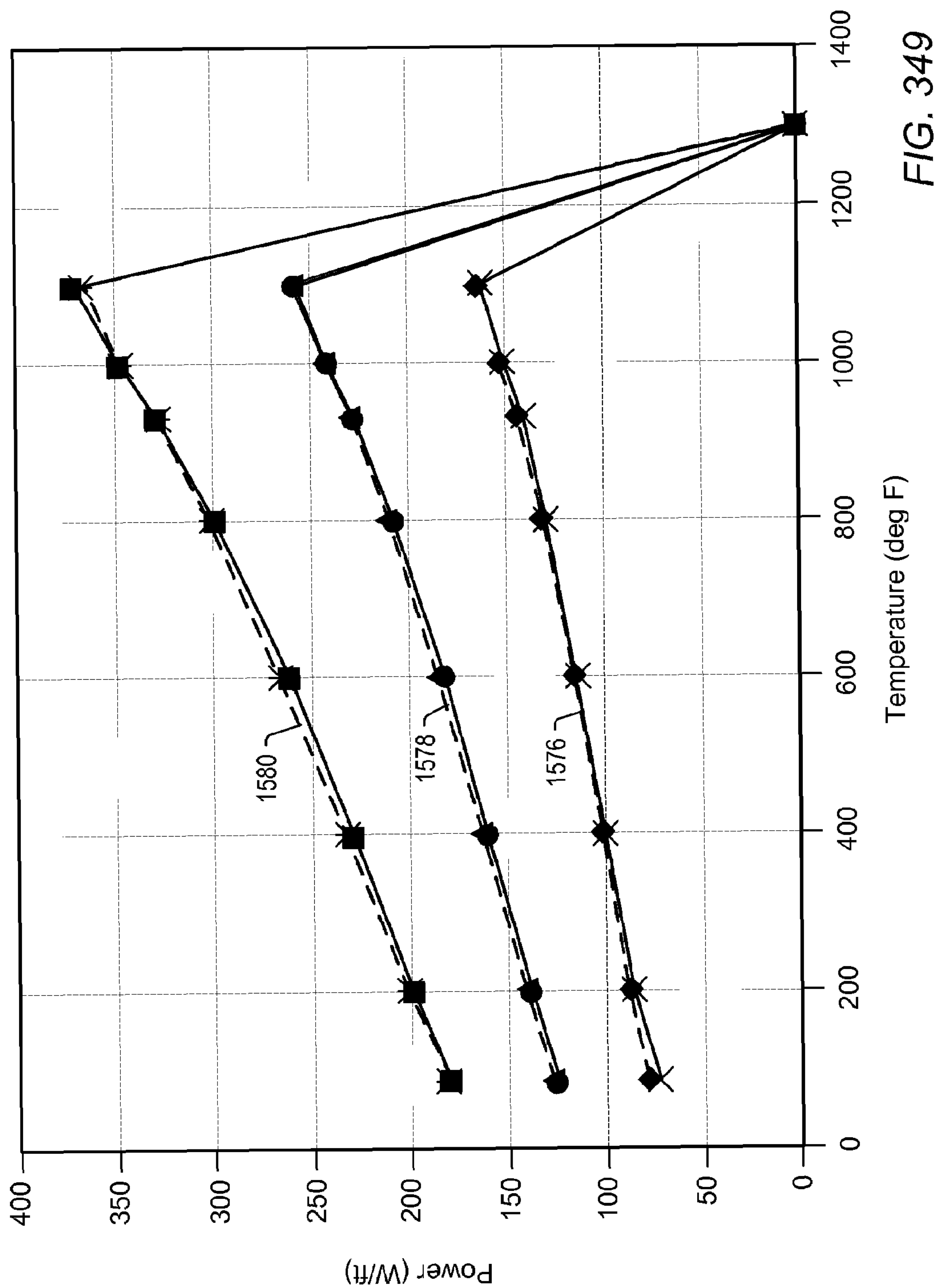

FIG. 349 depicts plots of power versus temperature at three currents for an induction heater.

Figure 350:
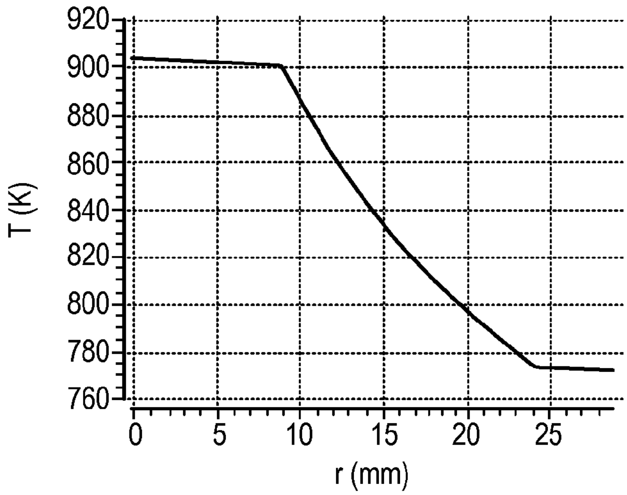

FIG. 350 depicts temperature versus radial distance for a heater with air between an insulated conductor and conduit.

Figure 351:
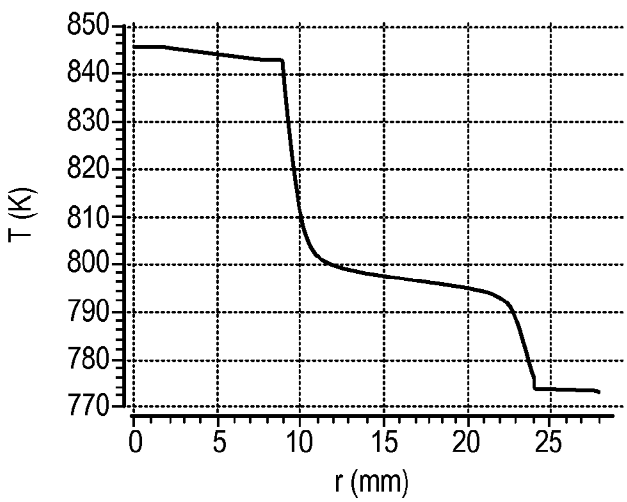

FIG. 351 depicts temperature versus radial distance for a heater with molten solar salt between an insulated conductor and conduit.

Figure 352:
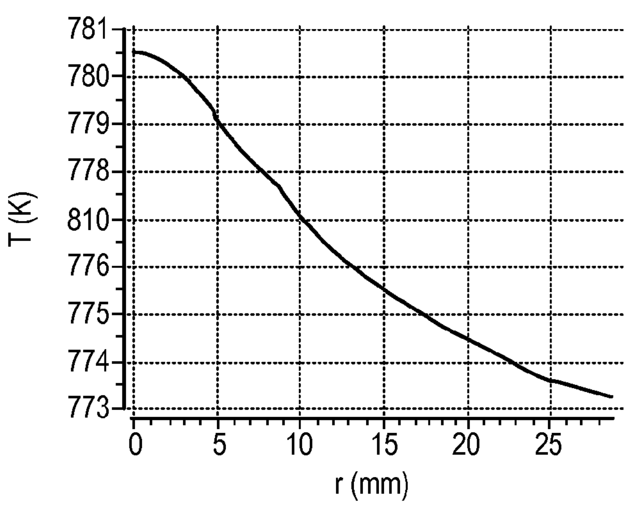

FIG. 352 depicts temperature versus radial distance for a heater with molten tin between an insulated conductor and conduit.

Figure 353:
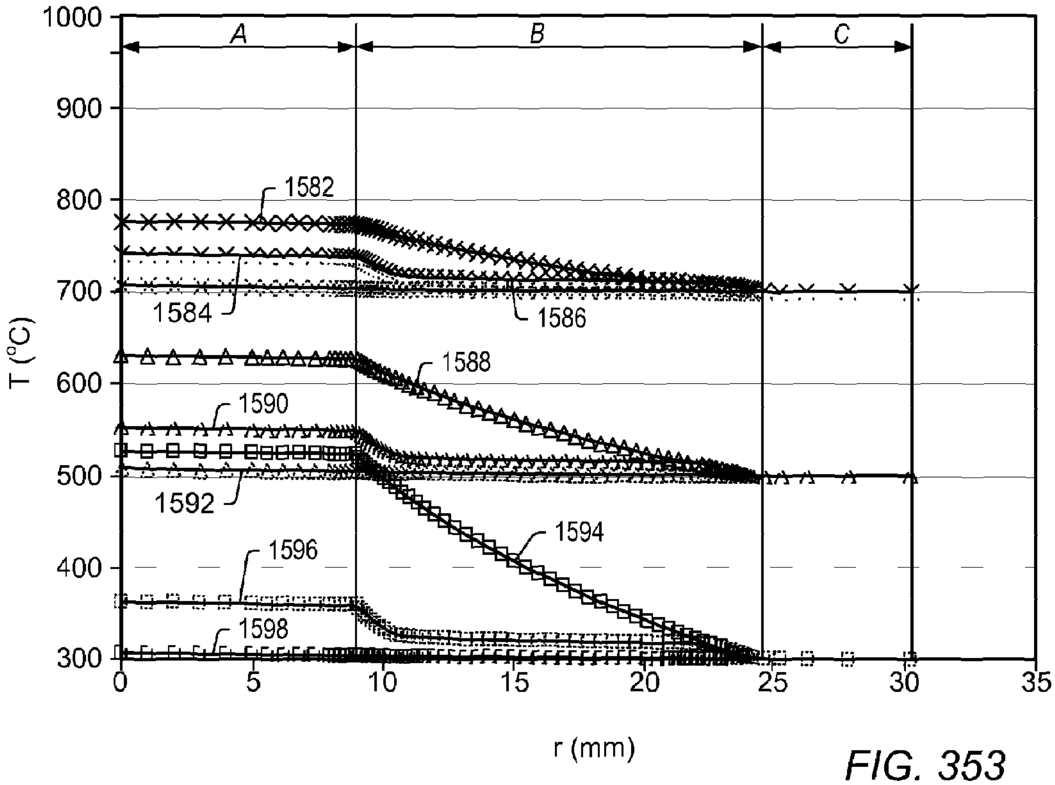

FIG. 353 depicts simulated temperature versus radial distance for various heaters of a first size, with various fluids between the insulated conductors and conduits, and at different temperatures of the outer surfaces of the conduits.

Figure 354:
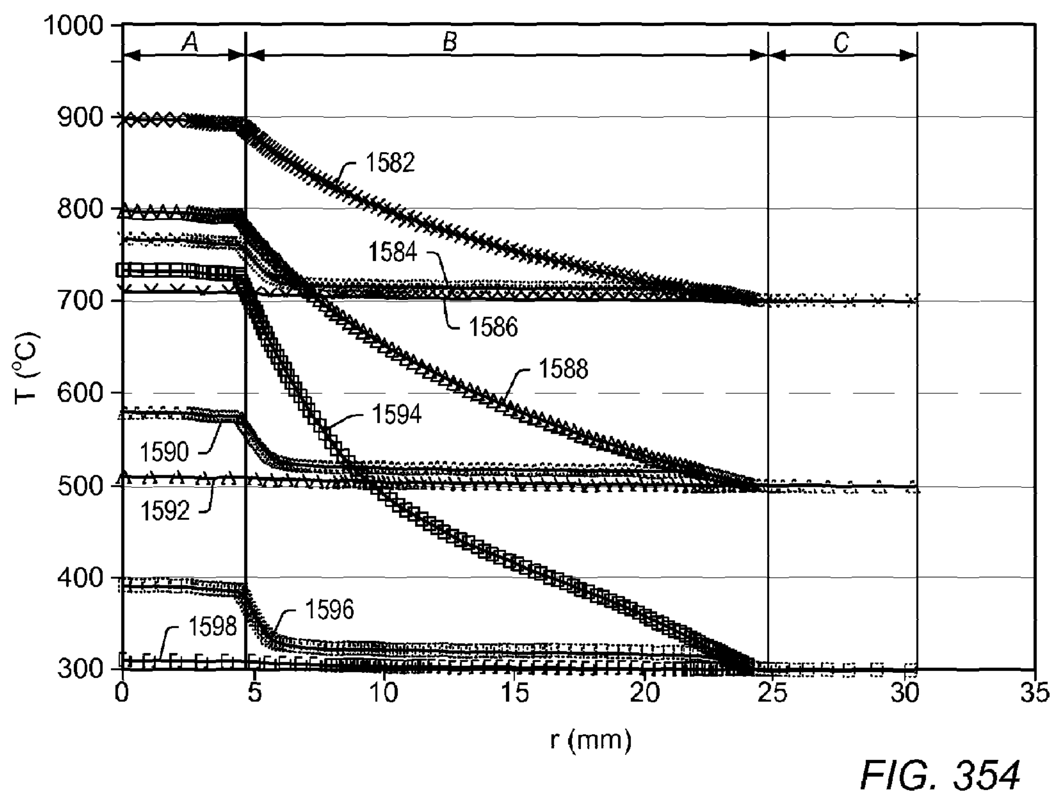

FIG. 354 depicts simulated temperature versus radial distance for various heaters wherein the dimensions of the insulated conductor are half the size of the insulated conductor used to generate FIG. 353, with various fluids between the insulated conductors and conduits, and at different temperatures of the outer surfaces of the conduits.

Figure 355:
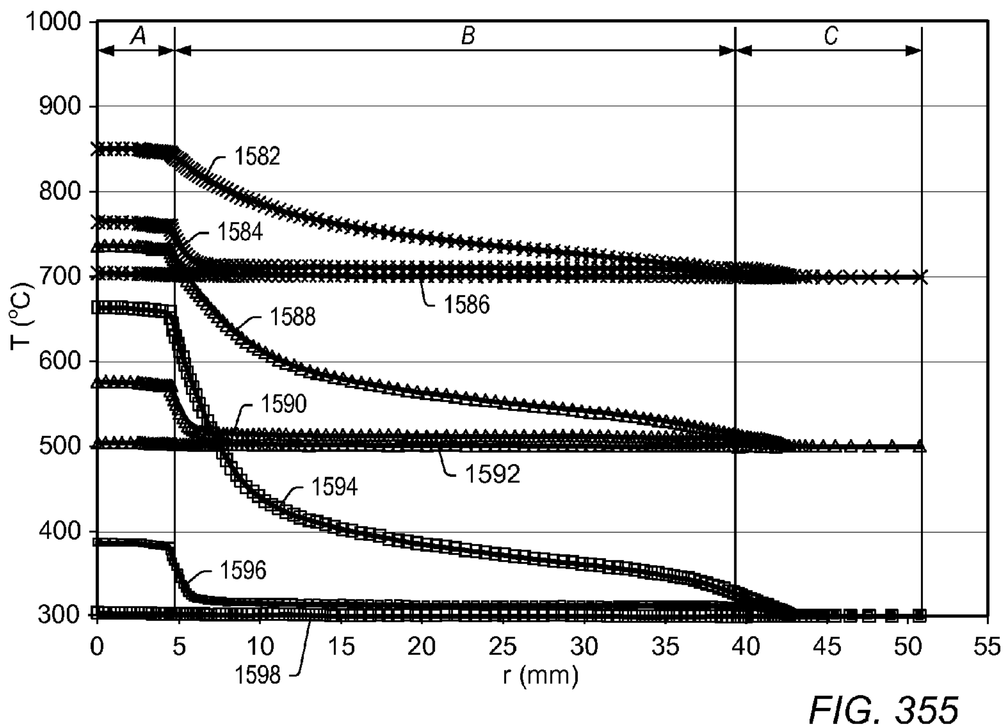

FIG. 355 depicts simulated temperature versus radial distance for various heaters wherein the dimensions of the insulated conductor is the same as the insulated conductor used to generate FIG. 354, and the conduit is larger than the conduit used to generate FIG. 354 with various fluids between the insulated conductors and conduits, and at various temperatures of the outer surfaces of the conduits.

Figure 356:
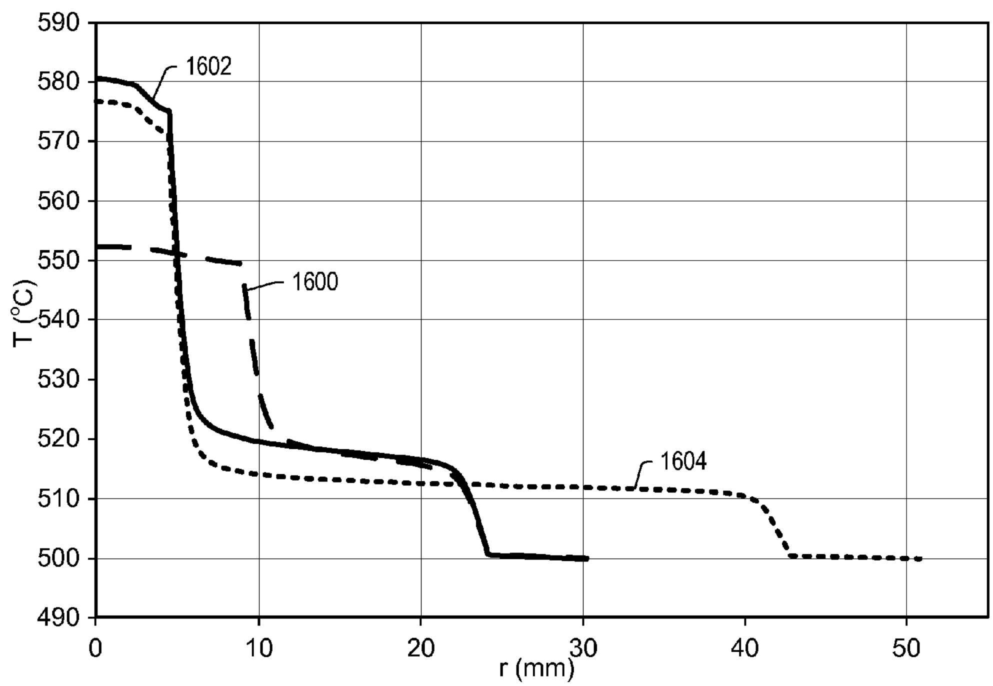

FIG. 356 depicts simulated temperature versus radial distance for various heaters with molten salt between insulated conductors and conduits of the heaters and a boundary condition of 500° C.

Figure 357:
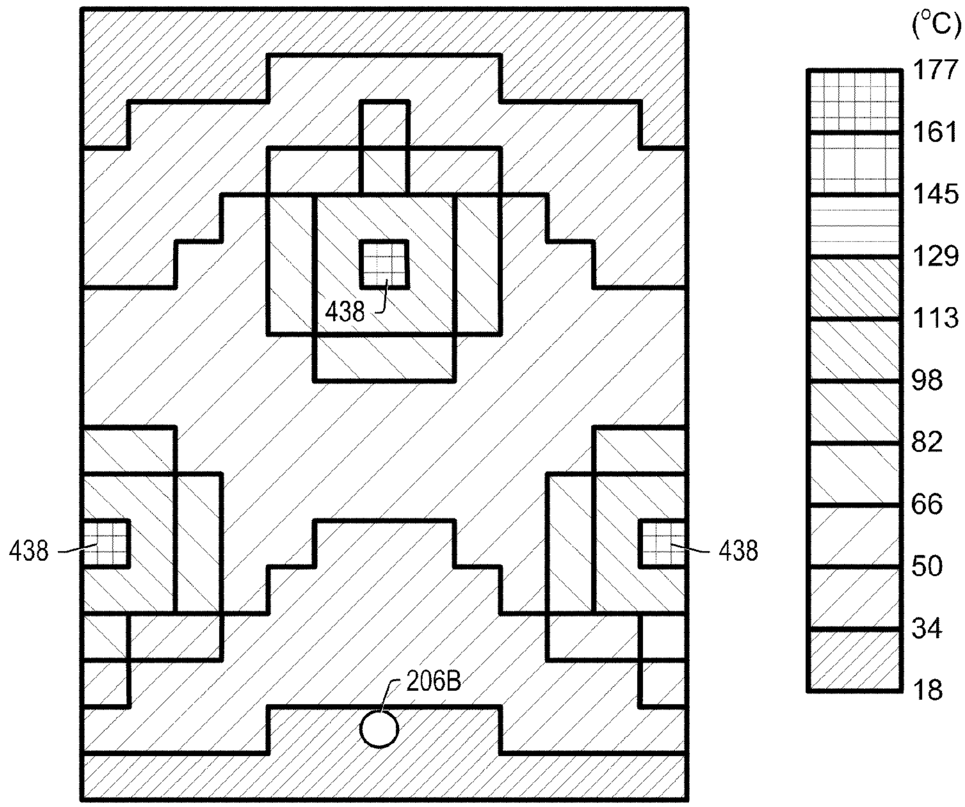

FIG. 357 depicts a temperature profile in the formation after 360 days using the STARS simulation.

Figure 358:
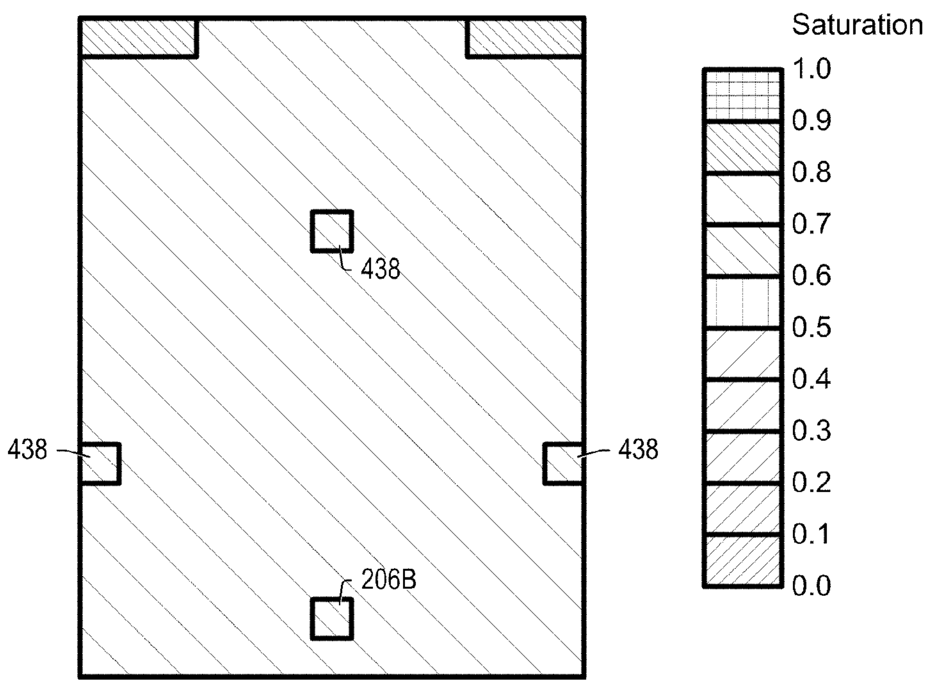

FIG. 358 depicts an oil saturation profile in the formation after 360 days using the STARS simulation.

Figure 359:
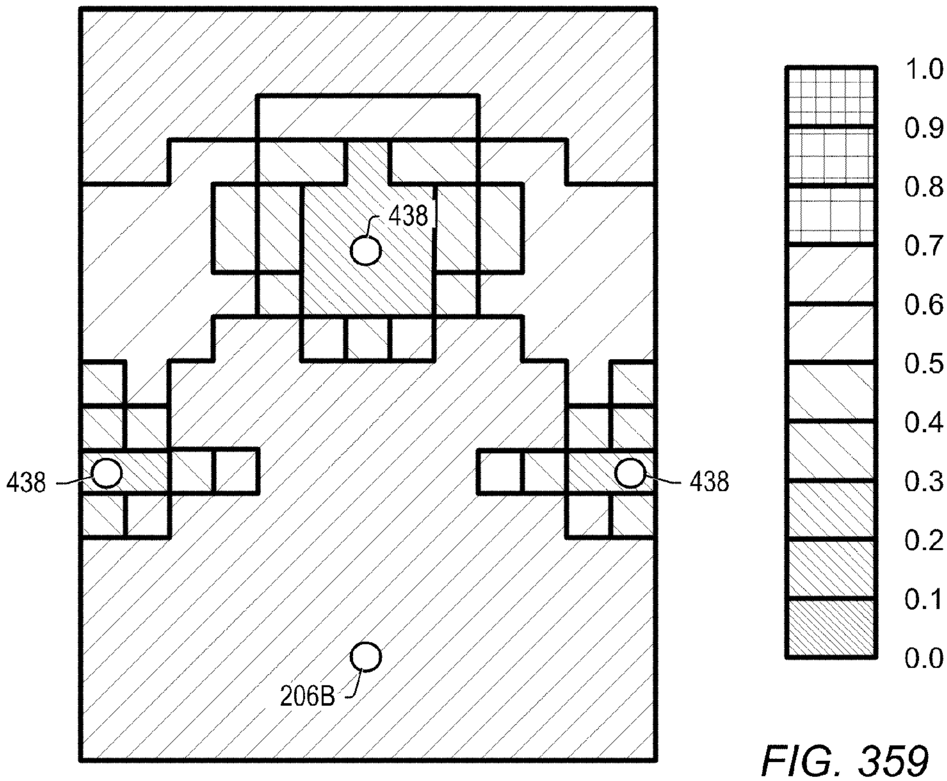

FIG. 359 depicts the oil saturation profile in the formation after 1095 days using the STARS simulation.

Figure 360:
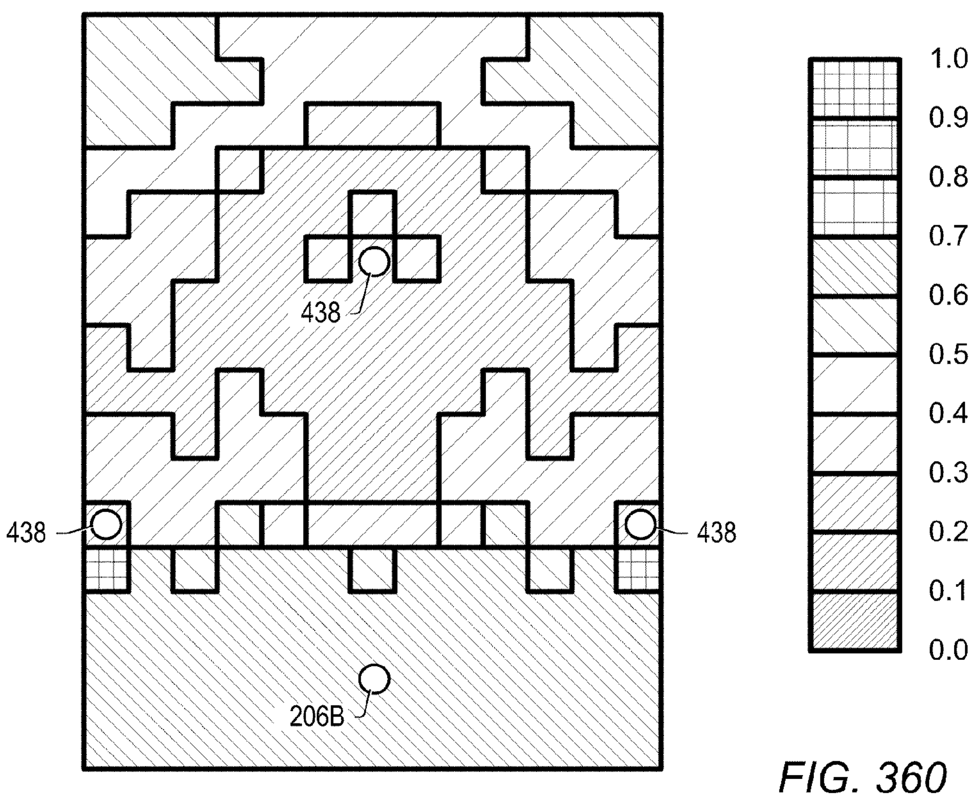

FIG. 360 depicts the oil saturation profile in the formation after 1470 days using the STARS simulation.

Figure 361:
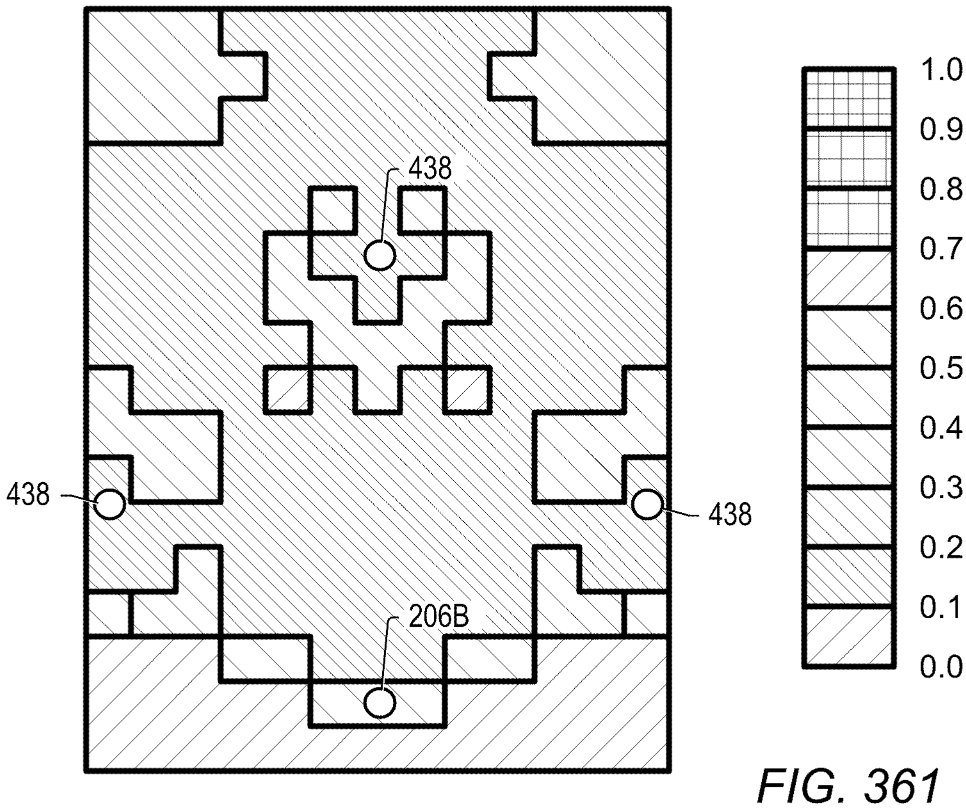

FIG. 361 depicts the oil saturation profile in the formation after 1826 days using the STARS simulation.

Figure 362:
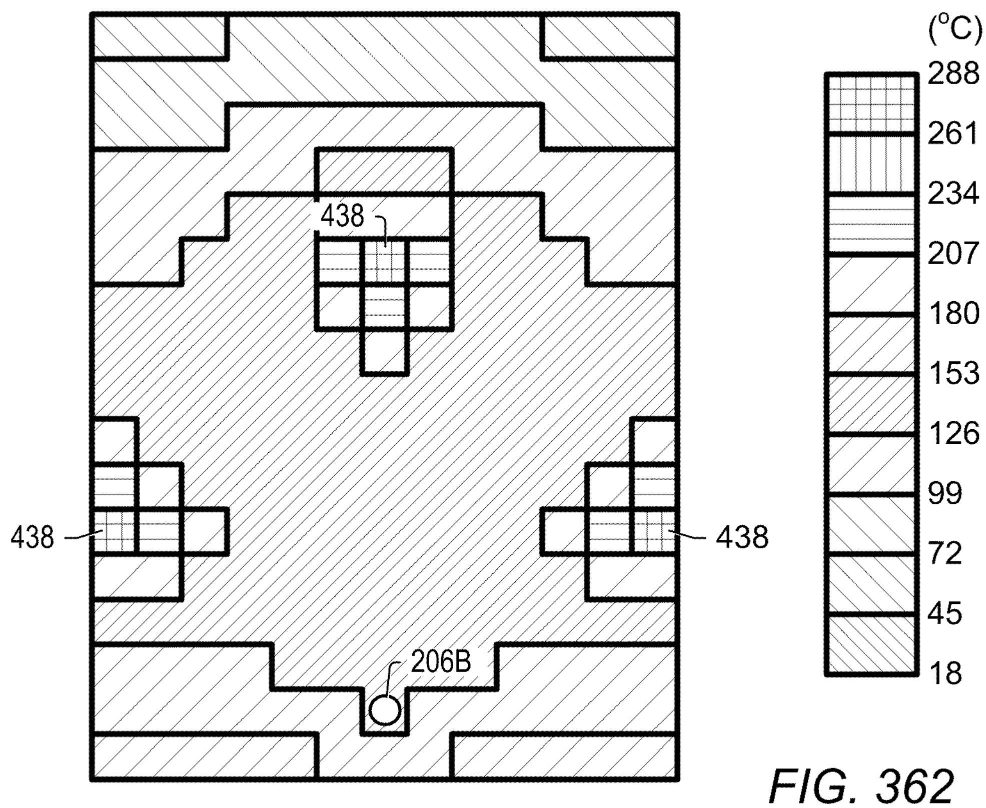

FIG. 362 depicts the temperature profile in the formation after 1826 days using the STARS simulation.

Figure 363:
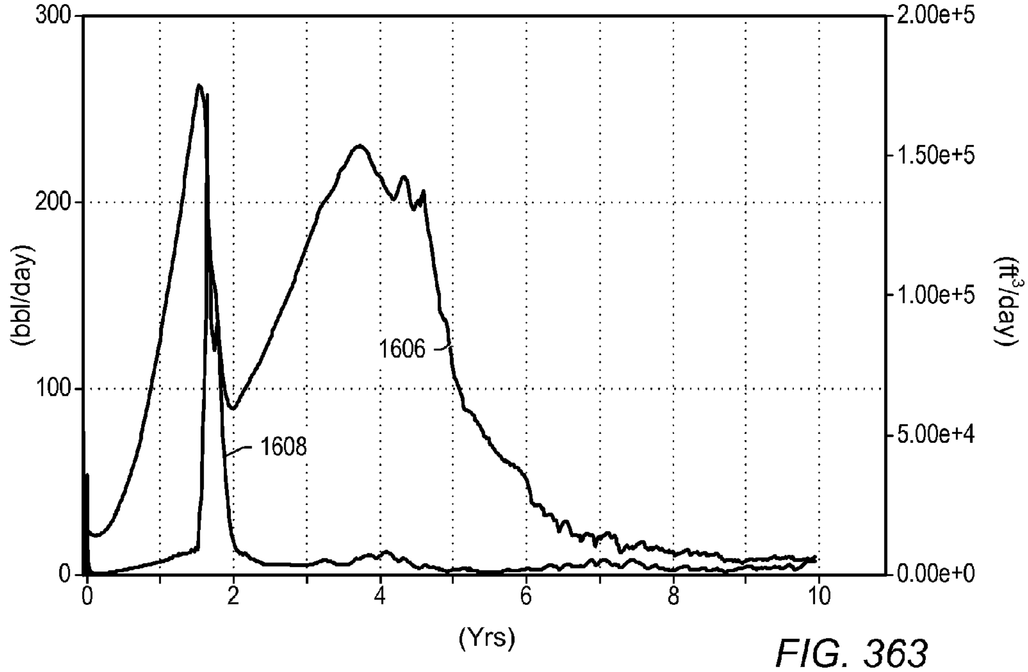

FIG. 363 depicts oil production rate and gas production rate versus time.

Figure 364:
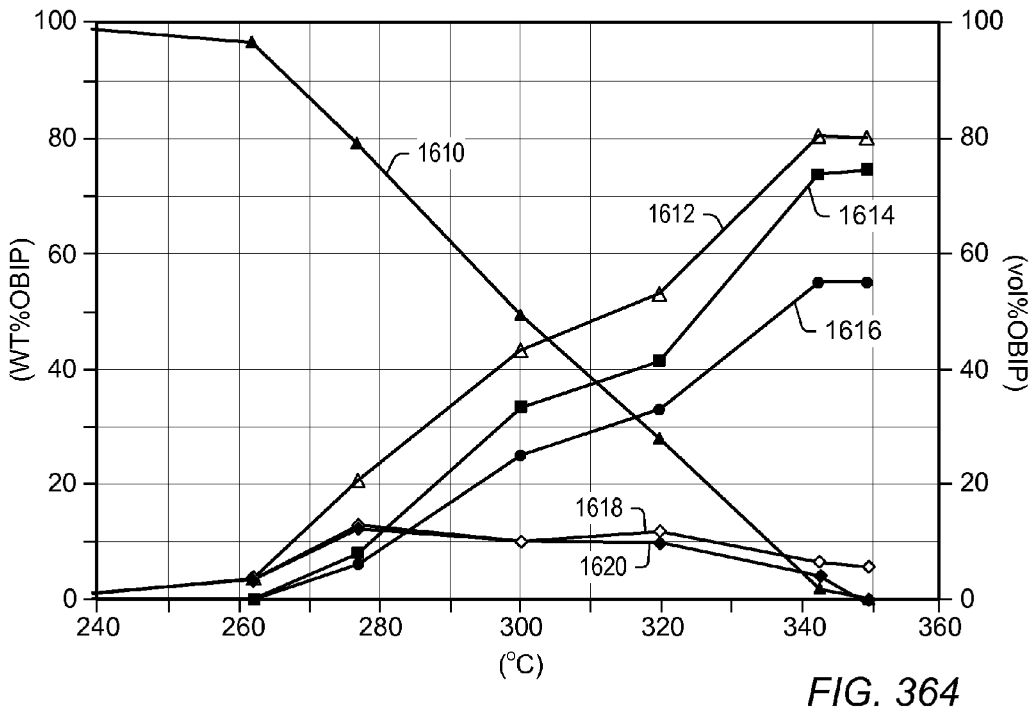

FIG. 364 depicts weight percentage of original bitumen in place (OBIP) (left axis) and volume percentage of OBIP (right axis) versus temperature (° C.).

Figure 365:
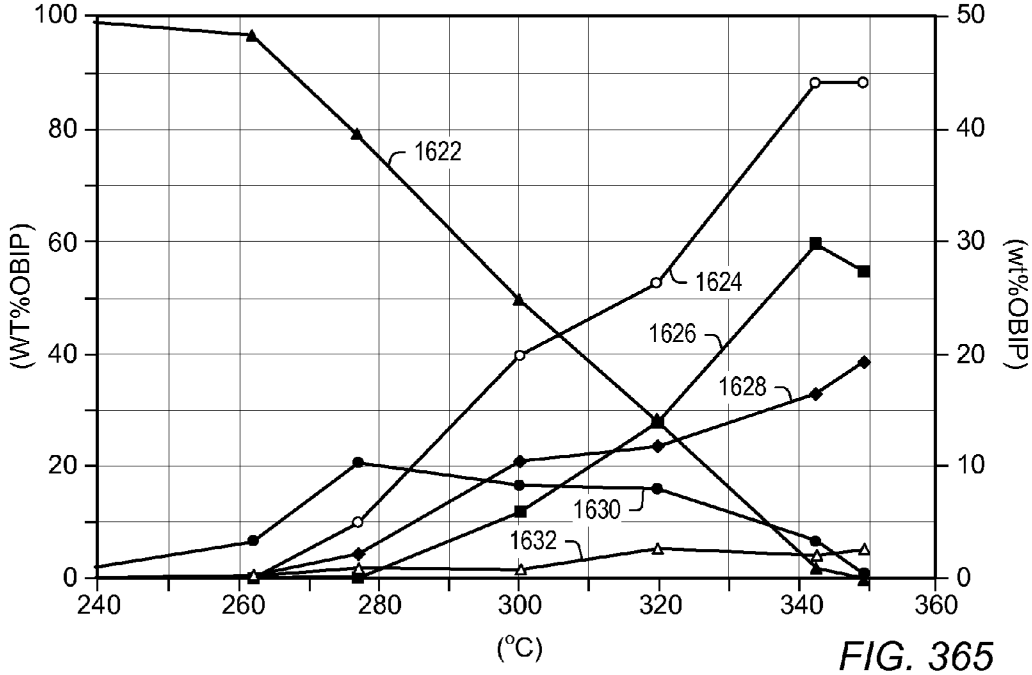

FIG. 365 depicts bitumen conversion percentage (weight percentage of (OBIP)) (left axis) and oil, gas, and coke weight percentage (as a weight percentage of OBIP) (right axis) versus temperature (° C.).

Figure 366:
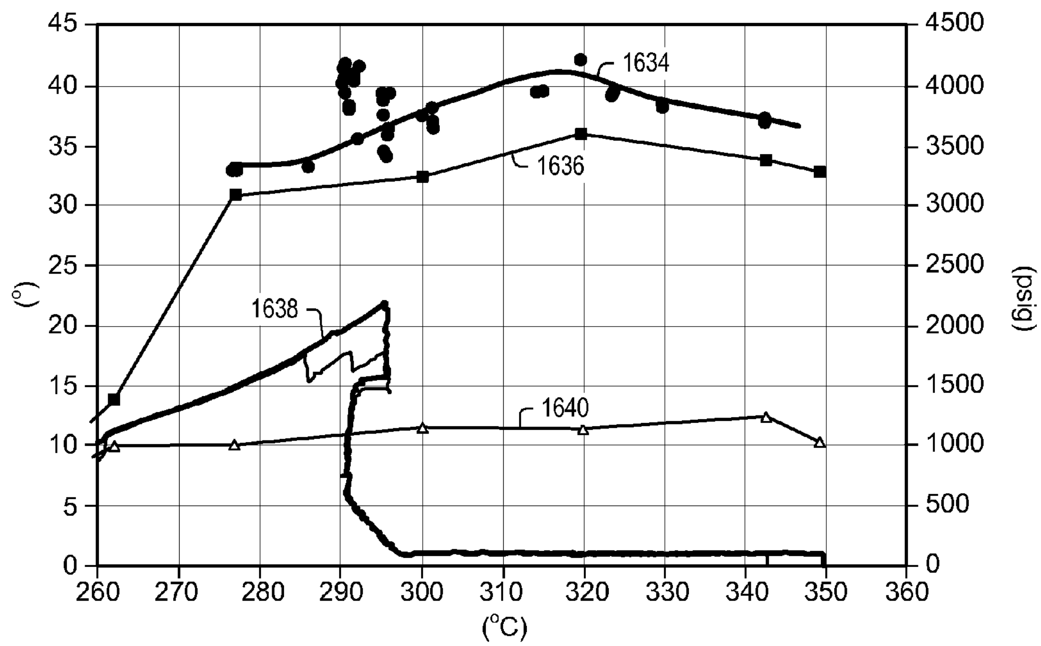

FIG. 366 depicts API gravity (°) (left axis) of produced fluids, blow down production, and oil left in place along with pressure (psig) (right axis) versus temperature (° C.).

FIGS. 367A-D depict gas-to-oil ratios (GOR) in thousand cubic feet per barrel ((Mcf/bbl) (y-axis)) versus temperature (° C.) (x-axis) for different types of gas at a low temperature blow down (about 277° C.) and a high temperature blow down (at about 290° C.).

Figure 368:
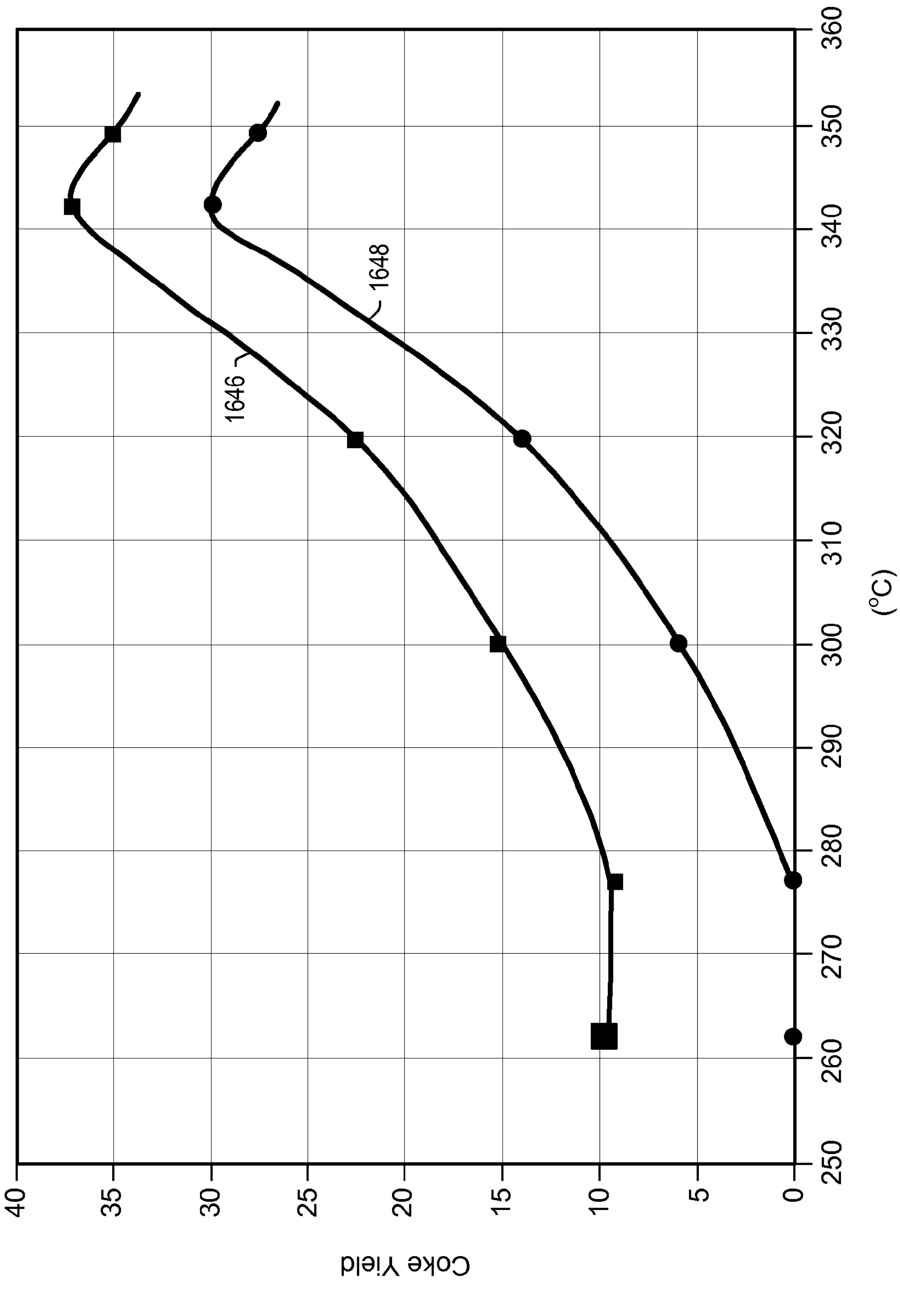

FIG. 368 depicts coke yield (weight percentage) (y-axis) versus temperature (° C.) (x-axis).

FIGS. 369A-D depict assessed hydrocarbon isomer shifts in fluids produced from the experimental cells as a function of temperature and bitumen conversion.

Figure 370:
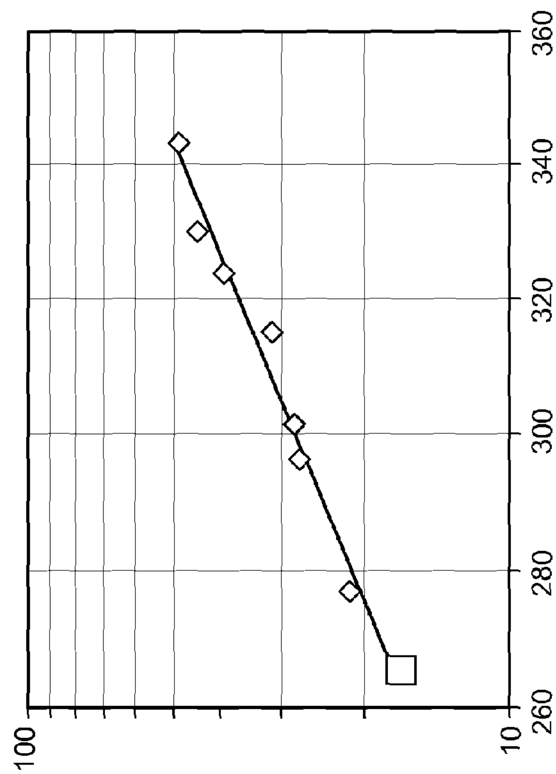

FIG. 370 depicts weight percentage (Wt %) (y-axis) of saturates from SARA analysis of the produced fluids versus temperature (° C.) (x-axis).

Figure 371:
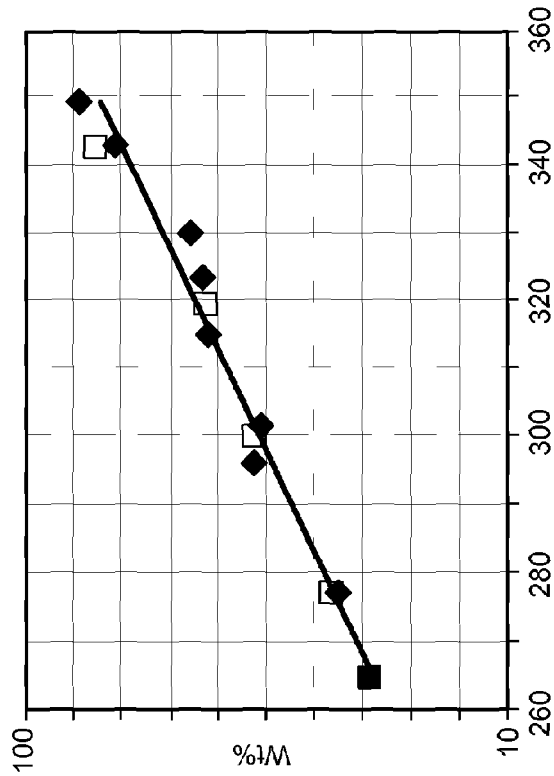

FIG. 371 depicts weight percentage (Wt %) (y-axis) of n-$C_7$ of the produced fluids versus temperature (° C.) (x-axis).

Figure 372:
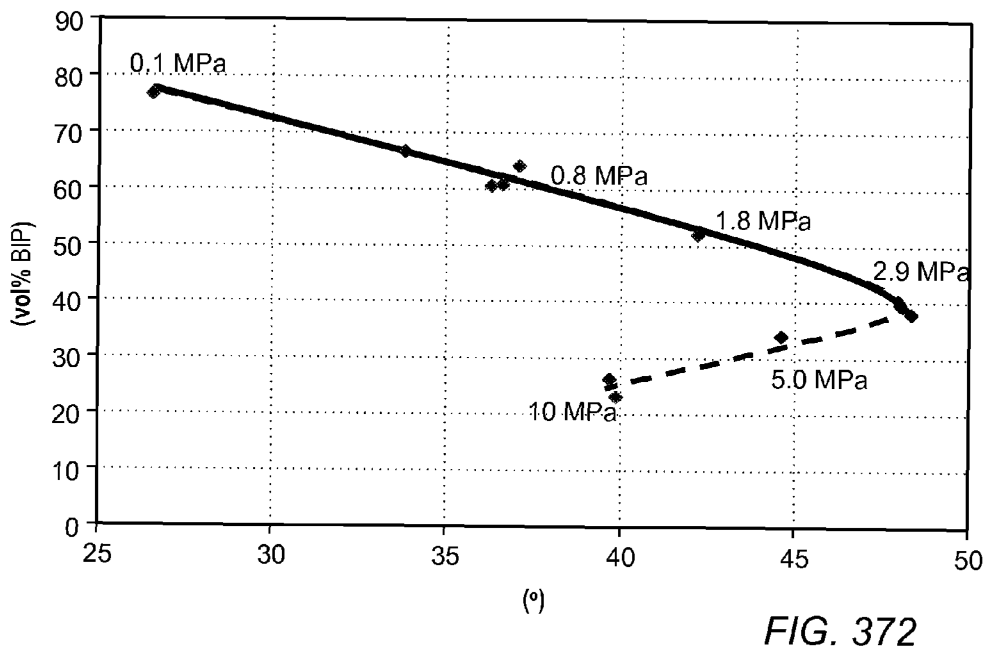

FIG. 372 depicts oil recovery (volume percentage bitumen in place (vol % BIP)) versus API gravity (°) as determined by the pressure (MPa) in the formation in an experiment.

Figure 373:
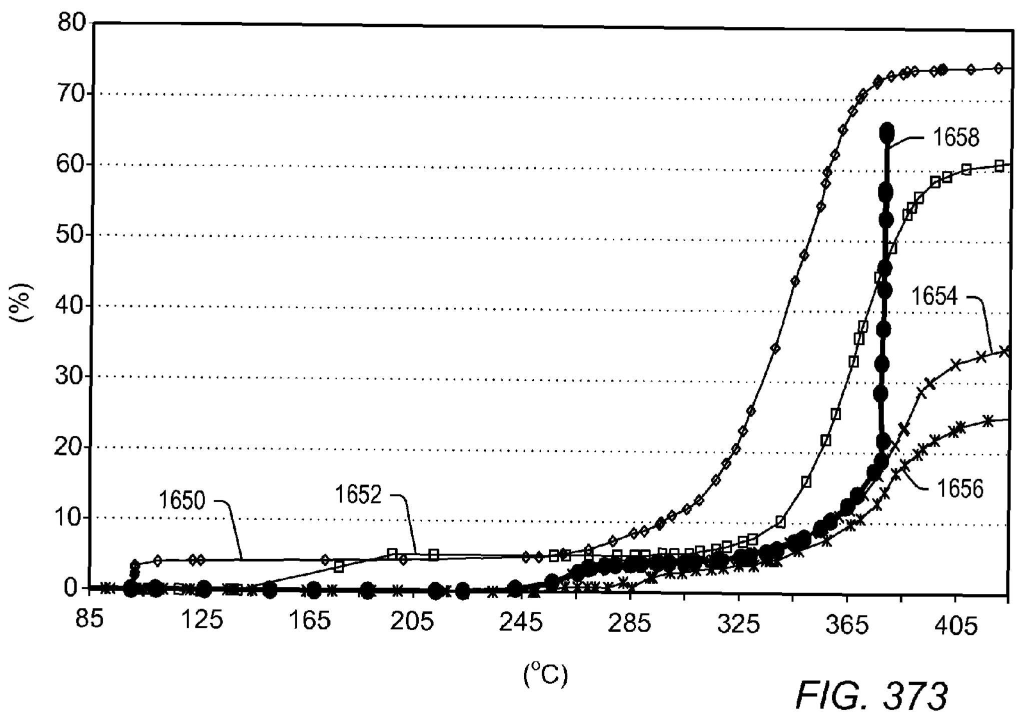

FIG. 373 depicts recovery efficiency (%) versus temperature (° C.) at different pressures in an experiment.

Figure 374:
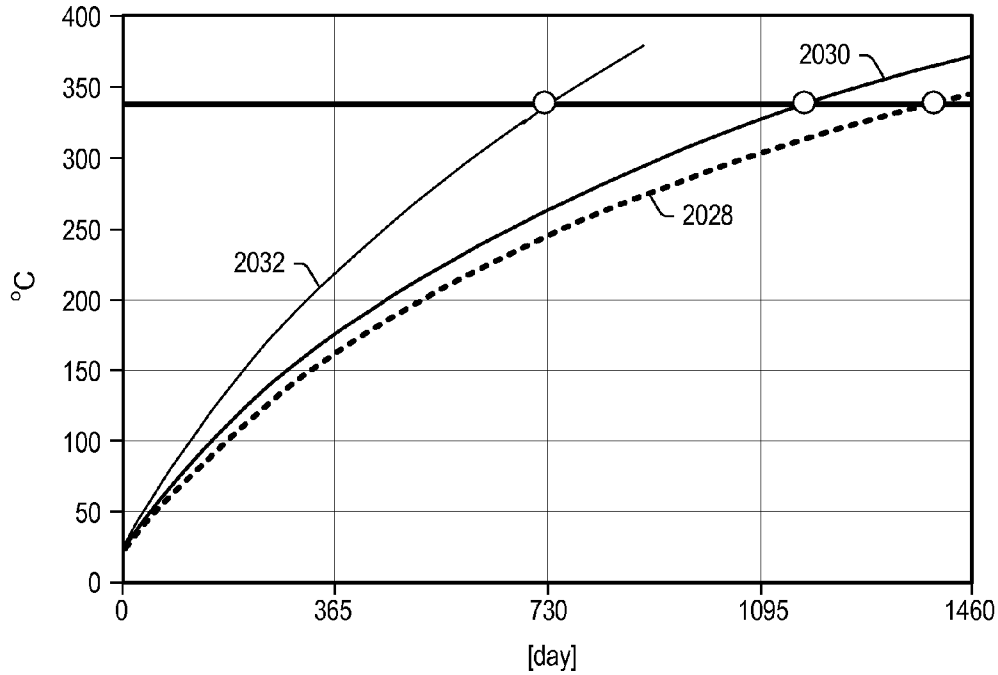

FIG. 374 depicts average formation temperature (° C.) versus days for heating a formation using molten salt circulated through conduit-in-conduit heaters.

Figure 375:
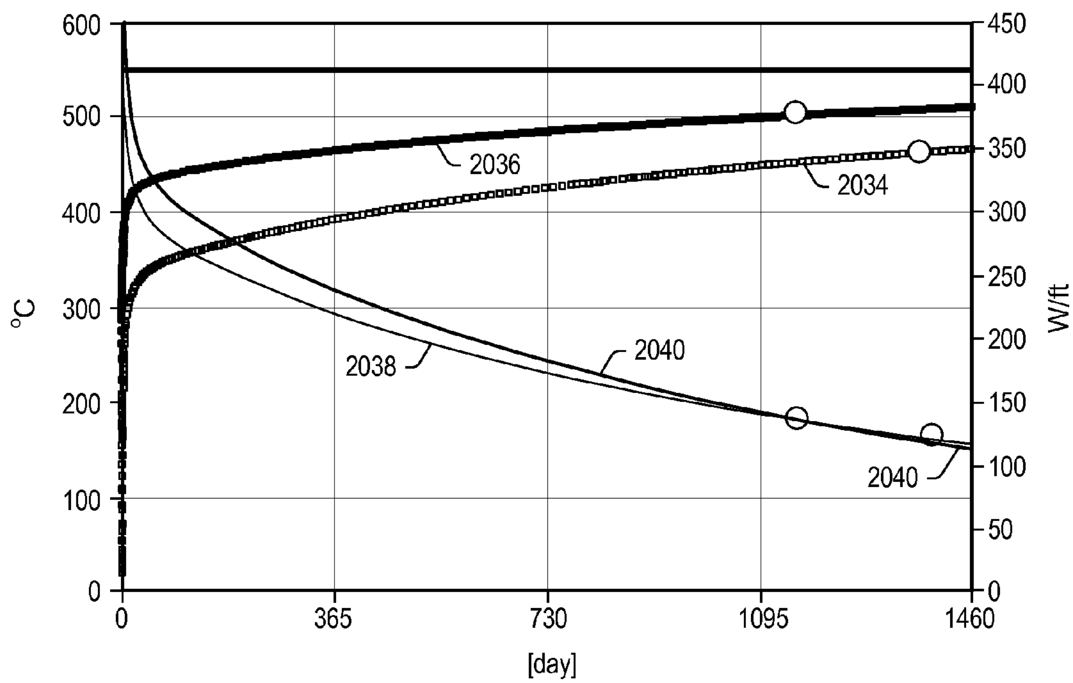

FIG. 375 depicts molten salt temperature (° C.) and power injection rate (W/ft) versus time (days).

Figure 376:
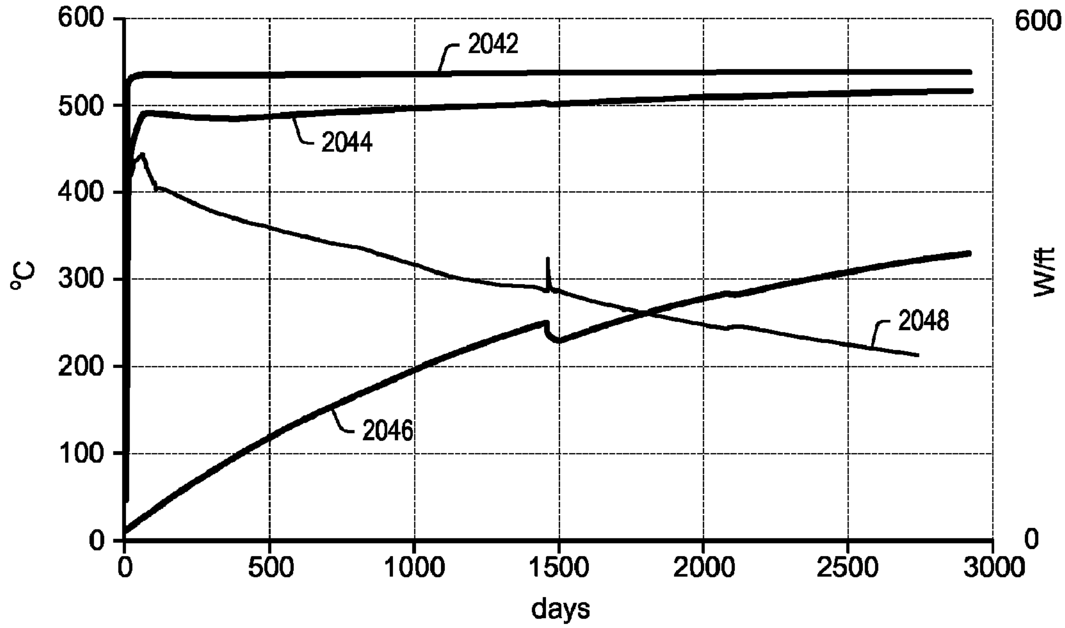

FIG. 376 depicts temperature (° C.) and power injection rate (W/ft) versus time (days) for heating a formation using molten salt circulated through heaters with a heating length of 8000 ft at a mass flow rate of 18 kg/s.

Figure 377:
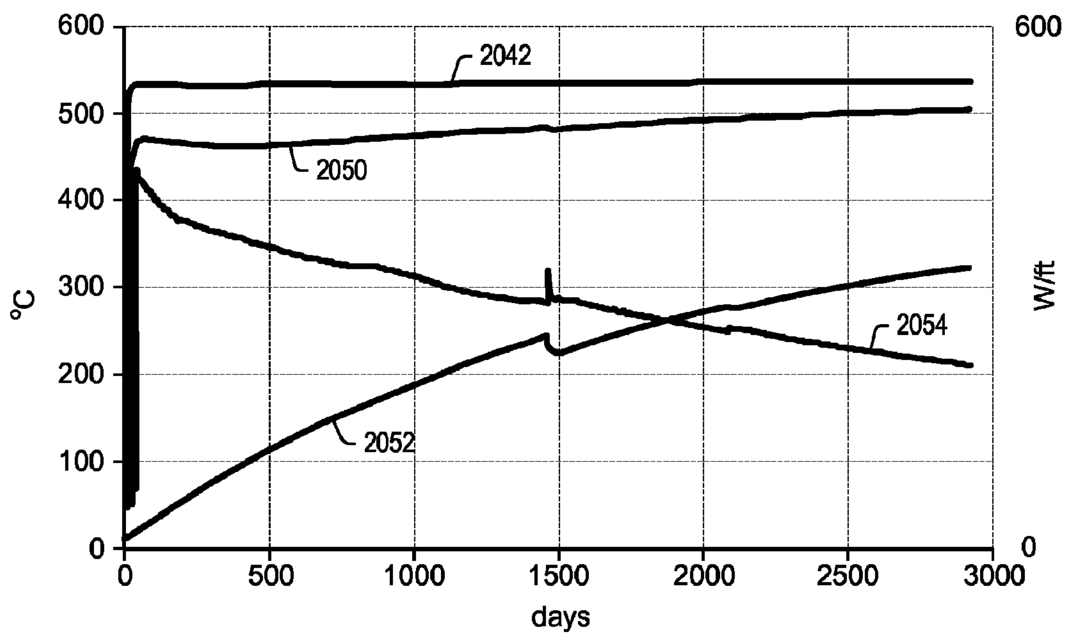

FIG. 377 depicts temperature (° C.) and power injection rate (W/ft) versus time (days) for heating a formation using molten salt circulated through heaters with a heating length of 8000 ft at a mass flow rate of 12 kg/s.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

The following description generally relates to systems and methods for treating hydrocarbons in the formations. Such formations may be treated to yield hydrocarbon products, hydrogen, and other products.

"Alternating current (AC)" refers to a time-varying current that reverses direction substantially sinusoidally. AC produces skin effect electricity flow in a ferromagnetic conductor.

"Annular region" is the region between an outer conduit and an inner conduit positioned in the outer conduit.

"API gravity" refers to API gravity at 15.5° C. (60° F.). API gravity is as determined by ASTM Method D6822 or ASTM Method D1298.

"ASTM" refers to American Standard Testing and Materials.

In the context of reduced heat output heating systems, apparatus, and methods, the term "automatically" means such systems, apparatus, and methods function in a certain way without the use of external control (for example, external controllers such as a controller with a temperature sensor and a feedback loop, PID controller, or predictive controller).

"Bare metal" and "exposed metal" refer to metals of elongated members that do not include a layer of electrical insulation, such as mineral insulation, that is designed to provide electrical insulation for the metal throughout an operating temperature range of the elongated member. Bare metal and exposed metal may encompass a metal that includes a corrosion inhibitor such as a naturally occurring oxidation layer, an applied oxidation layer, and/or a film. Bare metal and exposed metal include metals with polymeric or other types of electrical insulation that cannot retain electrical insulating properties at typical operating temperature of the elongated member. Such material may be placed on the metal and may be thermally degraded during use of the heater.

Boiling range distributions for the formation fluid and liquid streams described herein are as determined by ASTM Method D5307 or ASTM Method D2887. Content of hydrocarbon components in weight percent for paraffins, iso-paraffins, olefins, naphthenes and aromatics in the liquid streams is as determined by ASTM Method D6730. Content of aromatics in volume percent is as determined by ASTM Method D1319. Weight percent of hydrogen in hydrocarbons is as determined by ASTM Method D3343.

"Bromine number" refers to a weight percentage of olefins in grams per 100 gram of portion of the produced fluid that has a boiling range below 246° C. and testing the portion using ASTM Method D1159.

"Carbon number" refers to the number of carbon atoms in a molecule. A hydrocarbon fluid may include various hydrocarbons with different carbon numbers. The hydrocarbon fluid may be described by a carbon number distribution. Carbon numbers and/or carbon number distributions may be determined by true boiling point distribution and/or gas-liquid chromatography.

"Chemically stability" refers to the ability of a formation fluid to be transported without components in the formation fluid reacting to form polymers and/or compositions that plug pipelines, valves, and/or vessels.

"Clogging" refers to impeding and/or inhibiting flow of one or more compositions through a process vessel or a conduit.

"Column X element" or "Column X elements" refer to one or more elements of Column X of the Periodic Table, and/or one or more compounds of one or more elements of Column X of the Periodic Table, in which X corresponds to a column number (for example, 13-18) of the Periodic Table. For example, "Column 15 elements" refer to elements from Column 15 of the Periodic Table and/or compounds of one or more elements from Column 15 of the Periodic Table.

"Column X metal" or "Column X metals" refer to one or more metals of Column X of the Periodic Table and/or one or more compounds of one or more metals of Column X of the Periodic Table, in which X corresponds to a column number (for example, 1-12) of the Periodic Table. For example, "Column 6 metals" refer to metals from Column 6 of the Periodic Table and/or compounds of one or more metals from Column 6 of the Periodic Table.

"Condensable hydrocarbons" are hydrocarbons that condense at 25° C. and one atmosphere absolute pressure. Condensable hydrocarbons may include a mixture of hydrocarbons having carbon numbers greater than 4. "Non-condensable hydrocarbons" are hydrocarbons that do not condense at 25° C. and one atmosphere absolute pressure. Non-condensable hydrocarbons may include hydrocarbons having carbon numbers less than 5.

"Coring" is a process that generally includes drilling a hole into a formation and removing a substantially solid mass of the formation from the hole.

"Cracking" refers to a process involving decomposition and molecular recombination of organic compounds to produce a greater number of molecules than were initially present. In cracking, a series of reactions take place accompanied by a transfer of hydrogen atoms between molecules. For example, naphtha may undergo a thermal cracking reaction to form ethene and $H_2$.

"Curie temperature" is the temperature above which a ferromagnetic material loses all of its ferromagnetic properties. In addition to losing all of its ferromagnetic properties above the Curie temperature, the ferromagnetic material begins to lose its ferromagnetic properties when an increasing electrical current is passed through the ferromagnetic material.

"Cycle oil" refers to a mixture of light cycle oil and heavy cycle oil. "Light cycle oil" refers to hydrocarbons having a boiling range distribution between 430° F. (221° C.) and 650° F. (343° C.) that are produced from a fluidized catalytic cracking system. Light cycle oil content is determined by ASTM Method D5307. "Heavy cycle oil" refers to hydrocarbons having a boiling range distribution between 650° F. (343° C.) and 800° F. (427° C.) that are produced from a fluidized catalytic cracking system. Heavy cycle oil content is determined by ASTM Method D5307.

"Diad" refers to a group of two items (for example, heaters, wellbores, or other objects) coupled together.

"Diesel" refers to hydrocarbons with a boiling range distribution between 260° C. and 343° C. (500-650° F.) at 0.101 MPa. Diesel content is determined by ASTM Method D2887.

"Enriched air" refers to air having a larger mole fraction of oxygen than air in the atmosphere. Air is typically enriched to increase combustion-supporting ability of the air.

"Fluid injectivity" is the flow rate of fluids injected per unit of pressure differential between a first location and a second location.

"Fluid pressure" is a pressure generated by a fluid in a formation. "Lithostatic pressure" (sometimes referred to as "lithostatic stress") is a pressure in a formation equal to a weight per unit area of an overlying rock mass. "Hydrostatic pressure" is a pressure in a formation exerted by a column of water.

A "formation" includes one or more hydrocarbon containing layers, one or more non-hydrocarbon layers, an overburden, and/or an underburden. "Hydrocarbon layers" refer to layers in the formation that contain hydrocarbons. The hydrocarbon layers may contain non-hydrocarbon material and hydrocarbon material. The "overburden" and/or the "underburden" include one or more different types of impermeable materials. For example, the overburden and/or underburden may include rock, shale, mudstone, or wet/tight carbonate. In some embodiments of in situ heat treatment processes, the overburden and/or the underburden may include a hydrocarbon containing layer or hydrocarbon containing layers that are relatively impermeable and are not subjected to temperatures during in situ heat treatment processing that result in significant characteristic changes of the hydrocarbon containing layers of the overburden and/or the underburden. For example, the underburden may contain shale or mudstone, but the underburden is not allowed to heat to pyrolysis temperatures during the in situ heat treatment process. In some cases, the overburden and/or the underburden may be somewhat permeable.

"Formation fluids" refer to fluids present in a formation and may include pyrolyzation fluid, synthesis gas, mobilized hydrocarbons, and water (steam). Formation fluids may include hydrocarbon fluids as well as non-hydrocarbon fluids. The term "mobilized fluid" refers to fluids in a hydrocarbon containing formation that are able to flow as a result of thermal treatment of the formation. "Produced fluids" refer to fluids removed from the formation.

"Freezing point" of a hydrocarbon liquid refers to the temperature below which solid hydrocarbon crystals may form in the liquid. Freezing point is as determined by ASTM Method D5901.

"Gasoline hydrocarbons" refer to hydrocarbons having a boiling point range from 32° C. (90° F.) to about 204° C. (400° F.). Gasoline hydrocarbons include, but are not limited to, straight run gasoline, naphtha, fluidized or thermally catalytically cracked gasoline, VB gasoline, and coker gasoline. Gasoline hydrocarbons content is determined by ASTM Method D2887.

A "heat source" is any system for providing heat to at least a portion of a formation substantially by conductive and/or radiative heat transfer. For example, a heat source may include electric heaters such as an insulated conductor, an elongated member, and/or a conductor disposed in a conduit. A heat source may also include systems that generate heat by burning a fuel external to or in a formation. The systems may be surface burners, downhole gas burners, flameless distributed combustors, and natural distributed combustors. In some embodiments, heat provided to or generated in one or more heat sources may be supplied by other sources of energy. The other sources of energy may directly heat a formation, or the energy may be applied to a transfer medium that directly or indirectly heats the formation. It is to be understood that one or more heat sources that are applying heat to a formation may use different sources of energy. Thus, for example, for a given formation some heat sources may supply heat from electric resistance heaters, some heat sources may provide heat from combustion, and some heat sources may provide heat from one or more other energy sources (for example, chemical reactions, solar energy, wind energy, biomass, or other sources of renewable energy). A chemical reaction may include an exothermic reaction (for example, an oxidation reaction). A heat source may also include a heater that provides heat to a zone proximate and/or surrounding a heating location such as a heater well.

A "heater" is any system or heat source for generating heat in a well or a near wellbore region. Heaters may be, but are not limited to, electric heaters, burners, combustors that react with material in or produced from a formation, and/or combinations thereof.

"Heavy hydrocarbons" are viscous hydrocarbon fluids. Heavy hydrocarbons may include highly viscous hydrocarbon fluids such as heavy oil, tar, and/or asphalt. Heavy hydrocarbons may include carbon and hydrogen, as well as smaller concentrations of sulfur, oxygen, and nitrogen. Additional elements may also be present in heavy hydrocarbons in trace amounts. Heavy hydrocarbons may be classified by API gravity. Heavy hydrocarbons generally have an API gravity below about 20°. Heavy oil, for example, generally has an API gravity of about 10-20°, whereas tar generally has an API gravity below about 10°. The viscosity of heavy hydrocarbons is generally greater than about 100 centipoise at 15° C. Heavy hydrocarbons may include aromatics or other complex ring hydrocarbons.

Heavy hydrocarbons may be found in a relatively permeable formation. The relatively permeable formation may include heavy hydrocarbons entrained in, for example, sand or carbonate. "Relatively permeable" is defined, with respect to formations or portions thereof, as an average permeability of 10 millidarcy or more (for example, 10 or 100 millidarcy). "Relatively low permeability" is defined, with respect to formations or portions thereof, as an average permeability of less than about 10 millidarcy. One darcy is equal to about 0.99 square micrometers. An impermeable layer generally has a permeability of less than about 0.1 millidarcy.

Certain types of formations that include heavy hydrocarbons may also include, but are not limited to, natural mineral waxes, or natural asphaltites. "Natural mineral waxes" typically occur in substantially tubular veins that may be several meters wide, several kilometers long, and hundreds of meters deep. "Natural asphaltites" include solid hydrocarbons of an aromatic composition and typically occur in large veins. In situ recovery of hydrocarbons from formations such as natural mineral waxes and natural asphaltites may include melting to form liquid hydrocarbons and/or solution mining of hydrocarbons from the formations.

"Hydrocarbons" are generally defined as molecules formed primarily by carbon and hydrogen atoms. Hydrocarbons may also include other elements such as, but not limited to, halogens, metallic elements, nitrogen, oxygen, and/or sulfur. Hydrocarbons may be, but are not limited to, kerogen, bitumen, pyrobitumen, oils, natural mineral waxes, and asphaltites. Hydrocarbons may be located in or adjacent to mineral matrices in the earth. Matrices may include, but are not limited to, sedimentary rock, sands, silicilytes, carbonates, diatomites, and other porous media. "Hydrocarbon fluids" are fluids that include hydrocarbons. Hydrocarbon fluids may include, entrain, or be entrained in non-hydrocarbon fluids such as hydrogen, nitrogen, carbon monoxide, carbon dioxide, hydrogen sulfide, water, and ammonia.

An "in situ conversion process" refers to a process of heating a hydrocarbon containing formation from heat sources to raise the temperature of at least a portion of the formation above a pyrolysis temperature so that pyrolyzation fluid is produced in the formation.

An "in situ heat treatment process" refers to a process of heating a hydrocarbon containing formation with heat sources to raise the temperature of at least a portion of the formation above a temperature that results in mobilized fluid, visbreaking, and/or pyrolysis of hydrocarbon containing material so that mobilized fluids, visbroken fluids, and/or pyrolyzation fluids are produced in the formation.

"Insulated conductor" refers to any elongated material that is able to conduct electricity and that is covered, in whole or in part, by an electrically insulating material.

"Karst" is a subsurface shaped by the dissolution of a soluble layer or layers of bedrock, usually carbonate rock such as limestone or dolomite. The dissolution may be caused by meteoric or acidic water. The Grosmont formation in Alberta, Canada is an example of a karst (or "karsted") carbonate formation.

"Kerogen" is a solid, insoluble hydrocarbon that has been converted by natural degradation and that principally contains carbon, hydrogen, nitrogen, oxygen, and sulfur. Coal and oil shale are typical examples of materials that contain kerogen. "Bitumen" is a non-crystalline solid or viscous hydrocarbon material that is substantially soluble in carbon disulfide. "Oil" is a fluid containing a mixture of condensable hydrocarbons.

"Kerosene" refers to hydrocarbons with a boiling range distribution between 204° C. and 260° C. at 0.101 MPa. Kerosene content is determined by ASTM Method D2887.

"Modulated direct current (DC)" refers to any substantially non-sinusoidal time-varying current that produces skin effect electricity flow in a ferromagnetic conductor.

"Naphtha" refers to hydrocarbon components with a boiling range distribution between 38° C. and 200° C. at 0.101 MPa. Naphtha content is determined by ASTM Method D5307.

"Nitride" refers to a compound of nitrogen and one or more other elements of the Periodic Table. Nitrides include, but are not limited to, silicon nitride, boron nitride, or alumina nitride.

"Nitrogen compound content" refers to an amount of nitrogen in an organic compound. Nitrogen content is as determined by ASTM Method D5762.

"Octane Number" refers to a calculated numerical representation of the antiknock properties of a motor fuel compared to a standard reference fuel. A calculated octane number is determined by ASTM Method D6730.

"Olefins" are molecules that include unsaturated hydrocarbons having one or more non-aromatic carbon-carbon double bonds.

"Olefin content" refers to an amount of non-aromatic olefins in a fluid. Olefin content for a produced fluid is determined by obtaining a portion of the produce fluid that has a boiling point of 246° C. and testing the portion using ASTM Method D1159 and reporting the result as a bromine factor in grams per 100 gram of portion. Olefin content is also determined by the Canadian Association of Petroleum Producers (CAPP) olefin method and is reported in percent olefin as 1-decene equivalent.

"Organonitrogen compounds" refers to hydrocarbons that contain at least one nitrogen atom. Non-limiting examples of organonitrogen compounds include, but are not limited to, alkyl amines, aromatic amines, alkyl amides, aromatic amides, pyridines, pyrazoles, and oxazoles.

"Orifices" refer to openings, such as openings in conduits, having a wide variety of sizes and cross-sectional shapes including, but not limited to, circles, ovals, squares, rectangles, triangles, slits, or other regular or irregular shapes.

"P (peptization) value" or "P-value" refers to a numerical value, which represents the flocculation tendency of asphaltenes in a formation fluid. P-value is determined by ASTM method D7060.

"Perforations" include openings, slits, apertures, or holes in a wall of a conduit, tubular, pipe or other flow pathway that allow flow into or out of the conduit, tubular, pipe or other flow pathway.

"Periodic Table" refers to the Periodic Table as specified by the International Union of Pure and Applied Chemistry (IUPAC), November 2003. In the scope of this application, weight of a metal from the Periodic Table, weight of a compound of a metal from the Periodic Table, weight of an element from the Periodic Table, or weight of a compound of an element from the Periodic Table is calculated as the weight of metal or the weight of element. For example, if 0.1 grams of $MoO_3$ is used per gram of catalyst, the calculated weight of the molybdenum metal in the catalyst is 0.067 grams per gram of catalyst.

"Phase transformation temperature" of a ferromagnetic material refers to a temperature or a temperature range during which the material undergoes a phase change (for example, from ferrite to austenite) that decreases the magnetic permeability of the ferromagnetic material. The reduction in magnetic permeability is similar to reduction in magnetic permeability due to the magnetic transition of the ferromagnetic material at the Curie temperature.

"Physical stability" refers to the ability of a formation fluid to not exhibit phase separation or flocculation during transportation of the fluid. Physical stability is determined by ASTM Method D7060.

"Pyrolysis" is the breaking of chemical bonds due to the application of heat. For example, pyrolysis may include transforming a compound into one or more other substances by heat alone. Heat may be transferred to a section of the formation to cause pyrolysis.

"Pyrolyzation fluids" or "pyrolysis products" refers to fluid produced substantially during pyrolysis of hydrocarbons. Fluid produced by pyrolysis reactions may mix with other fluids in a formation. The mixture would be considered pyrolyzation fluid or pyrolyzation product. As used herein, "pyrolysis zone" refers to a volume of a formation (for example, a relatively permeable formation such as a tar sands formation) that is reacted or reacting to form a pyrolyzation fluid.

"Residue" refers to hydrocarbons that have a boiling point above 537° C. (1000° F.).

"Rich layers" in a hydrocarbon containing formation are relatively thin layers (typically about 0.2 m to about 0.5 m thick). Rich layers generally have a richness of about 0.150 L/kg or greater. Some rich layers have a richness of about 0.170 L/kg or greater, of about 0.190 L/kg or greater, or of about 0.210 L/kg or greater. Lean layers of the formation have a richness of about 0.100 L/kg or less and are generally thicker than rich layers. The richness and locations of layers are determined, for example, by coring and subsequent Fischer assay of the core, density or neutron logging, or other logging methods. Rich layers may have a lower initial thermal conductivity than other layers of the formation. Typically, rich layers have a thermal conductivity 1.5 times to 3 times lower than the thermal conductivity of lean layers. In addition, rich layers have a higher thermal expansion coefficient than lean layers of the formation.

"Smart well technology" or "smart wellbore" refers to wells that incorporate downhole measurement and/or control. For injection wells, smart well technology may allow for controlled injection of fluid into the formation in desired zones. For production wells, smart well technology may allow for controlled production of formation fluid from selected zones. Some wells may include smart well technology that allows for formation fluid production from selected zones and simultaneous or staggered solution injection into other zones. Smart well technology may include fiber optic systems and control valves in the wellbore. A smart wellbore used for an in situ heat treatment process may be Westbay Multilevel Well System MP55 available from Westbay Instruments Inc. (Burnaby, British Columbia, Canada).

"Subsidence" is a downward movement of a portion of a formation relative to an initial elevation of the surface.

"Sulfur compound content" refers to an amount of sulfur in an organic compound. Sulfur content is as determined by ASTM Method D4294.

"Superposition of heat" refers to providing heat from two or more heat sources to a selected section of a formation such that the temperature of the formation at least at one location between the heat sources is influenced by the heat sources.

"Synthesis gas" is a mixture including hydrogen and carbon monoxide. Additional components of synthesis gas may include water, carbon dioxide, nitrogen, methane, and other gases. Synthesis gas may be generated by a variety of processes and feedstocks. Synthesis gas may be used for synthesizing a wide range of compounds.

"TAN" refers to a total acid number expressed as milligrams ("mg") of KOH per gram ("g") of sample. TAN is as determined by ASTM Method D3242.

"Tar" is a viscous hydrocarbon that generally has a viscosity greater than about 10,000 centipoise at 15° C. The specific gravity of tar generally is greater than 1.000. Tar may have an API gravity less than 10°.

A "tar sands formation" is a formation in which hydrocarbons are predominantly present in the form of heavy hydrocarbons and/or tar entrained in a mineral grain framework or other host lithology (for example, sand or carbonate). Examples of tar sands formations include formations such as the Athabasca formation, the Grosmont formation, and the Peace River formation, all three in Alberta, Canada; and the Faj a formation in the Orinoco belt in Venezuela.

"Temperature limited heater" generally refers to a heater that regulates heat output (for example, reduces heat output) above a specified temperature without the use of external controls such as temperature controllers, power regulators, rectifiers, or other devices. Temperature limited heaters may be AC (alternating current) or modulated (for example, "chopped") DC (direct current) powered electrical resistance heaters.

"Thermally conductive fluid" includes fluid that has a higher thermal conductivity than air at standard temperature and pressure (STP) (0° C. and 101.325 kPa).

"Thermal conductivity" is a property of a material that describes the rate at which heat flows, in steady state, between two surfaces of the material for a given temperature difference between the two surfaces.

"Thermal fracture" refers to fractures created in a formation caused by expansion or contraction of a formation and/or fluids in the formation, which is in turn caused by increasing/decreasing the temperature of the formation and/or fluids in the formation, and/or by increasing/decreasing a pressure of fluids in the formation due to heating.

"Thermal oxidation stability" refers to thermal oxidation stability of a liquid. Thermal oxidation stability is as determined by ASTM Method D3241.

"Thickness" of a layer refers to the thickness of a cross section of the layer, wherein the cross section is normal to a face of the layer.

"Time-varying current" refers to electrical current that produces skin effect electricity flow in a ferromagnetic conductor and has a magnitude that varies with time. Time-varying current includes both alternating current (AC) and modulated direct current (DC).

"Triad" refers to a group of three items (for example, heaters, wellbores, or other objects) coupled together.

"Turndown ratio" for the temperature limited heater in which current is applied directly to the heater is the ratio of the highest AC or modulated DC resistance below the Curie temperature to the lowest resistance above the Curie temperature for a given current. Turndown ratio for an inductive heater is the ratio of the highest heat output below the Curie temperature to the lowest heat output above the Curie temperature for a given current applied to the heater.

A "u-shaped wellbore" refers to a wellbore that extends from a first opening in the formation, through at least a portion of the formation, and out through a second opening in the formation. In this context, the wellbore may be only roughly in the shape of a "v" or "u", with the understanding that the "legs" of the "u" do not need to be parallel to each other, or perpendicular to the "bottom" of the "u" for the wellbore to be considered "u-shaped".

"Upgrade" refers to increasing the quality of hydrocarbons. For example, upgrading heavy hydrocarbons may result in an increase in the API gravity of the heavy hydrocarbons.

"Visbreaking" refers to the untangling of molecules in fluid during heat treatment and/or to the breaking of large molecules into smaller molecules during heat treatment, which results in a reduction of the viscosity of the fluid.

"Viscosity" refers to kinematic viscosity at 40° C. unless otherwise specified. Viscosity is as determined by ASTM Method D445.

"VGO" or "vacuum gas oil" refers to hydrocarbons with a boiling range distribution between 343° C. and 538° C. at 0.101 MPa. VGO content is determined by ASTM Method D5307.

A "vug" is a cavity, void or large pore in a rock that is commonly lined with mineral precipitates.

"Wax" refers to a low melting organic mixture, or a compound of high molecular weight that is a solid at lower temperatures and a liquid at higher temperatures, and when in solid form can form a barrier to water. Examples of waxes include animal waxes, vegetable waxes, mineral waxes, petroleum waxes, and synthetic waxes.

The term "wellbore" refers to a hole in a formation made by drilling or insertion of a conduit into the formation. A wellbore may have a substantially circular cross section, or another cross-sectional shape. As used herein, the terms "well" and "opening," when referring to an opening in the formation may be used interchangeably with the term "wellbore."

A formation may be treated in various ways to produce many different products. Different stages or processes may be used to treat the formation during an in situ heat treatment process. In some embodiments, one or more sections of the formation are solution mined to remove soluble minerals from the sections. Solution mining minerals may be performed before, during, and/or after the in situ heat treatment process. In some embodiments, the average temperature of one or more sections being solution mined may be maintained below about 120° C.

In some embodiments, one or more sections of the formation are heated to remove water from the sections and/or to remove methane and other volatile hydrocarbons from the sections. In some embodiments, the average temperature may be raised from ambient temperature to temperatures below about 220° C. during removal of water and volatile hydrocarbons.

In some embodiments, one or more sections of the formation are heated to temperatures that allow for movement and/or visbreaking of hydrocarbons in the formation. In some embodiments, the average temperature of one or more sections of the formation are raised to mobilization temperatures of hydrocarbons in the sections (for example, to temperatures ranging from 100° C. to 250° C., from 120° C. to 240° C., or from 150° C. to 230° C.).

In some embodiments, one or more sections are heated to temperatures that allow for pyrolysis reactions in the formation. In some embodiments, the average temperature of one or more sections of the formation may be raised to pyrolysis temperatures of hydrocarbons in the sections (for example, temperatures ranging from 230° C. to 900° C., from 240° C. to 400° C. or from 250° C. to 350° C.).

Heating the hydrocarbon containing formation with a plurality of heat sources may establish thermal gradients around the heat sources that raise the temperature of hydrocarbons in the formation to desired temperatures at desired heating rates. The rate of temperature increase through mobilization temperature range and/or pyrolysis temperature range for desired products may affect the quality and quantity of the formation fluids produced from the hydrocarbon containing formation. Slowly raising the temperature of the formation through the mobilization temperature range and/or pyrolysis temperature range may allow for the production of high quality, high API gravity hydrocarbons from the formation. Slowly raising the temperature of the formation through the mobilization temperature range and/or pyrolysis temperature range may allow for the removal of a large amount of the hydrocarbons present in the formation as hydrocarbon product.

In some in situ heat treatment embodiments, a portion of the formation is heated to a desired temperature instead of slowly heating the temperature through a temperature range. In some embodiments, the desired temperature is 300° C., 325° C., or 350° C. Other temperatures may be selected as the desired temperature.

Superposition of heat from heat sources allows the desired temperature to be relatively quickly and efficiently established in the formation. Energy input into the formation from the heat sources may be adjusted to maintain the temperature in the formation substantially at a desired temperature.

Mobilization and/or pyrolysis products may be produced from the formation through production wells. In some embodiments, the average temperature of one or more sections is raised to mobilization temperatures and hydrocarbons are produced from the production wells. The average temperature of one or more of the sections may be raised to pyrolysis temperatures after production due to mobilization decreases below a selected value. In some embodiments, the average temperature of one or more sections may be raised to pyrolysis temperatures without significant production before reaching pyrolysis temperatures. Formation fluids including pyrolysis products may be produced through the production wells.

In some embodiments, the average temperature of one or more sections may be raised to temperatures sufficient to allow synthesis gas production after mobilization and/or pyrolysis. In some embodiments, hydrocarbons may be raised to temperatures sufficient to allow synthesis gas production without significant production before reaching the temperatures sufficient to allow synthesis gas production. For example, synthesis gas may be produced in a temperature range from about 400° C. to about 1200° C., about 500° C. to about 1100° C., or about 550° C. to about 1000° C. A synthesis gas generating fluid (for example, steam and/or water) may be introduced into the sections to generate synthesis gas. Synthesis gas may be produced from production wells.

Solution mining, removal of volatile hydrocarbons and water, mobilizing hydrocarbons, pyrolyzing hydrocarbons, generating synthesis gas, and/or other processes may be performed during the in situ heat treatment process. In some embodiments, some processes may be performed after the in situ heat treatment process. Such processes may include, but are not limited to, recovering heat from treated sections, storing fluids (for example, water and/or hydrocarbons) in previously treated sections, and/or sequestering carbon dioxide in previously treated sections.

Figure 1:
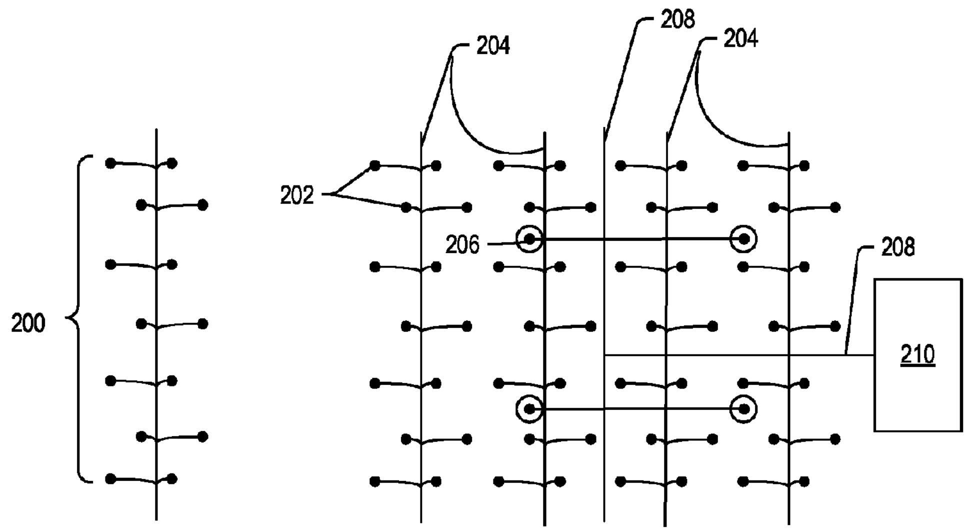
FIG. 1 shows a schematic view of an embodiment of a portion of an in situ heat treatment system for treating a hydrocarbon containing formation.

FIG. 1 depicts a schematic view of an embodiment of a portion of the in situ heat treatment system for treating the hydrocarbon containing formation. The in situ heat treatment system may include barrier wells 200. Barrier wells are used to form a barrier around a treatment area. The barrier inhibits fluid flow into and/or out of the treatment area. Barrier wells include, but are not limited to, dewatering wells, vacuum wells, capture wells, injection wells, grout wells, freeze wells, or combinations thereof. In some embodiments, barrier wells 200 are dewatering wells. Dewatering wells may remove liquid water and/or inhibit liquid water from entering a portion of the formation to be heated, or to the formation being heated. In the embodiment depicted in FIG. 1, the barrier wells 200 are shown extending only along one side of heat sources 202, but the barrier wells typically encircle all heat sources 202 used, or to be used, to heat a treatment area of the formation.

Heat sources 202 are placed in at least a portion of the formation. Heat sources 202 may include heaters such as insulated conductors, conductor-in-conduit heaters, surface burners, flameless distributed combustors, and/or natural distributed combustors. Heat sources 202 may also include other types of heaters. Heat sources 202 provide heat to at least a portion of the formation to heat hydrocarbons in the formation. Energy may be supplied to heat sources 202 through supply lines 204. Supply lines 204 may be structurally different depending on the type of heat source or heat sources used to heat the formation. Supply lines 204 for heat sources may transmit electricity for electric heaters, may transport fuel for combustors, or may transport heat exchange fluid that is circulated in the formation. In some embodiments, electricity for an in situ heat treatment process may be provided by a nuclear power plant or nuclear power plants. The use of nuclear power may allow for reduction or elimination of carbon dioxide emissions from the in situ heat treatment process.

When the formation is heated, the heat input into the formation may cause expansion of the formation and geomechanical motion. The heat sources may be turned on before, at the same time, or during a dewatering process. Computer simulations may model formation response to heating. The computer simulations may be used to develop a pattern and time sequence for activating heat sources in the formation so that geomechanical motion of the formation does not adversely affect the functionality of heat sources, production wells, and other equipment in the formation.

Heating the formation may cause an increase in permeability and/or porosity of the formation. Increases in permeability and/or porosity may result from a reduction of mass in the formation due to vaporization and removal of water, removal of hydrocarbons, and/or creation of fractures. Fluid may flow more easily in the heated portion of the formation because of the increased permeability and/or porosity of the formation. Fluid in the heated portion of the formation may move a considerable distance through the formation because of the increased permeability and/or porosity. The considerable distance may be over 1000 m depending on various factors, such as permeability of the formation, properties of the fluid, temperature of the formation, and pressure gradient allowing movement of the fluid. The ability of fluid to travel considerable distance in the formation allows production wells 206 to be spaced relatively far apart in the formation.

Production wells 206 are used to remove formation fluid from the formation. In some embodiments, production well 206 includes a heat source. The heat source in the production well may heat one or more portions of the formation at or near the production well. In some in situ heat treatment process embodiments, the amount of heat supplied to the formation from the production well per meter of the production well is less than the amount of heat applied to the formation from a heat source that heats the formation per meter of the heat source. Heat applied to the formation from the production well may increase formation permeability adjacent to the production well by vaporizing and removing liquid phase fluid adjacent to the production well and/or by increasing the permeability of the formation adjacent to the production well by formation of macro and/or micro fractures.

More than one heat source may be positioned in the production well. A heat source in a lower portion of the production well may be turned off when superposition of heat from adjacent heat sources heats the formation sufficiently to counteract benefits provided by heating the formation with the production well. In some embodiments, the heat source in an upper portion of the production well may remain on after the heat source in the lower portion of the production well is deactivated. The heat source in the upper portion of the well may inhibit condensation and reflux of formation fluid.

In some embodiments, the heat source in production well 206 allows for vapor phase removal of formation fluids from the formation. Providing heating at or through the production well may: (1) inhibit condensation and/or refluxing of production fluid when such production fluid is moving in the production well proximate the overburden, (2) increase heat input into the formation, (3) increase production rate from the production well as compared to a production well without a heat source, (4) inhibit condensation of high carbon number compounds ($C_6$ hydrocarbons and above) in the production well, and/or (5) increase formation permeability at or proximate the production well.

Subsurface pressure in the formation may correspond to the fluid pressure generated in the formation. As temperatures in the heated portion of the formation increase, the pressure in the heated portion may increase as a result of thermal expansion of in situ fluids, increased fluid generation and vaporization of water. Controlling rate of fluid removal from the formation may allow for control of pressure in the formation. Pressure in the formation may be determined at a number of different locations, such as near or at production wells, near or at heat sources, or at monitor wells.

In some hydrocarbon containing formations, production of hydrocarbons from the formation is inhibited until at least some hydrocarbons in the formation have been mobilized and/or pyrolyzed. Formation fluid may be produced from the formation when the formation fluid is of a selected quality. In some embodiments, the selected quality includes an API gravity of at least about 20°, 30°, or 40°. Inhibiting production until at least some hydrocarbons are mobilized and/or pyrolyzed may increase conversion of heavy hydrocarbons to light hydrocarbons. Inhibiting initial production may minimize the production of heavy hydrocarbons from the formation. Production of substantial amounts of heavy hydrocarbons may require expensive equipment and/or reduce the life of production equipment.

In some hydrocarbon containing formations, hydrocarbons in the formation may be heated to mobilization and/or pyrolysis temperatures before substantial permeability has been generated in the heated portion of the formation. An initial lack of permeability may inhibit the transport of generated fluids to production wells 206. During initial heating, fluid pressure in the formation may increase proximate heat sources 202. The increased fluid pressure may be released, monitored, altered, and/or controlled through one or more heat sources 202. For example, selected heat sources 202 or separate pressure relief wells may include pressure relief valves that allow for removal of some fluid from the formation.

In some embodiments, pressure generated by expansion of mobilized fluids, pyrolysis fluids or other fluids generated in the formation may be allowed to increase although an open path to production wells 206 or any other pressure sink may not yet exist in the formation. The fluid pressure may be allowed to increase towards a lithostatic pressure. Fractures in the hydrocarbon containing formation may form when the fluid approaches the lithostatic pressure. For example, fractures may form from heat sources 202 to production wells 206 in the heated portion of the formation. The generation of fractures in the heated portion may relieve some of the pressure in the portion. Pressure in the formation may have to be maintained below a selected pressure to inhibit unwanted production, fracturing of the overburden or underburden, and/or coking of hydrocarbons in the formation.

After mobilization and/or pyrolysis temperatures are reached and production from the formation is allowed, pressure in the formation may be varied to alter and/or control a composition of formation fluid produced, to control a percentage of condensable fluid as compared to non-condensable fluid in the formation fluid, and/or to control an API gravity of formation fluid being produced. For example, decreasing pressure may result in production of a larger condensable fluid component. The condensable fluid component may contain a larger percentage of olefins.

In some in situ heat treatment process embodiments, pressure in the formation may be maintained high enough to promote production of formation fluid with an API gravity of greater than 20°. Maintaining increased pressure in the formation may inhibit formation subsidence during in situ heat treatment. Maintaining increased pressure may reduce or eliminate the need to compress formation fluids at the surface to transport the fluids in collection conduits to treatment facilities.

Maintaining increased pressure in a heated portion of the formation may surprisingly allow for production of large quantities of hydrocarbons of increased quality and of relatively low molecular weight. Pressure may be maintained so that formation fluid produced has a minimal amount of compounds above a selected carbon number. The selected carbon number may be at most 25, at most 20, at most 12, or at most 8. Some high carbon number compounds may be entrained in vapor in the formation and may be removed from the formation with the vapor. Maintaining increased pressure in the formation may inhibit entrainment of high carbon number compounds and/or multi-ring hydrocarbon compounds in the vapor. High carbon number compounds and/or multi-ring hydrocarbon compounds may remain in a liquid phase in the formation for significant time periods. The significant time periods may provide sufficient time for the compounds to pyrolyze to form lower carbon number compounds.

Generation of relatively low molecular weight hydrocarbons is believed to be due, in part, to autogenous generation and reaction of hydrogen in a portion of the hydrocarbon containing formation. For example, maintaining an increased pressure may force hydrogen generated during pyrolysis into the liquid phase within the formation. Heating the portion to a temperature in a pyrolysis temperature range may pyrolyze hydrocarbons in the formation to generate liquid phase pyrolyzation fluids. The generated liquid phase pyrolyzation fluids components may include double bonds and/or radicals. Hydrogen ($H_2$) in the liquid phase may reduce double bonds of the generated pyrolyzation fluids, thereby reducing a potential for polymerization or formation of long chain compounds from the generated pyrolyzation fluids. In addition, $H_2$ may also neutralize radicals in the generated pyrolyzation fluids. $H_2$ in the liquid phase may inhibit the generated pyrolyzation fluids from reacting with each other and/or with other compounds in the formation.

Formation fluid produced from production wells 206 may be transported through collection piping 208 to treatment facilities 210. Formation fluids may also be produced from heat sources 202. For example, fluid may be produced from heat sources 202 to control pressure in the formation adjacent to the heat sources. Fluid produced from heat sources 202 may be transported through tubing or piping to collection piping 208 or the produced fluid may be transported through tubing or piping directly to treatment facilities 210. Treatment facilities 210 may include separation units, reaction units, upgrading units, fuel cells, turbines, storage vessels, and/or other systems and units for processing produced formation fluids. The treatment facilities may form transportation fuel from at least a portion of the hydrocarbons produced from the formation. In some embodiments, the transportation fuel may be jet fuel, such as JP-8.

Formation fluid may be hot when produced from the formation through the production wells. Hot formation fluid may be produced during solution mining processes and/or during in situ heat treatment processes. In some embodiments, electricity may be generated using the heat of the fluid produced from the formation. Also, heat recovered from the formation after the in situ process may be used to generate electricity. The generated electricity may be used to supply power to the in situ heat treatment process. For example, the electricity may be used to power heaters, or to power a refrigeration system for forming or maintaining a low temperature barrier. Electricity may be generated using a Kalina cycle, Rankine cycle or other thermodynamic cycle. In some embodiments, the working fluid for the cycle used to generate electricity is aqua ammonia.

Figure 2:
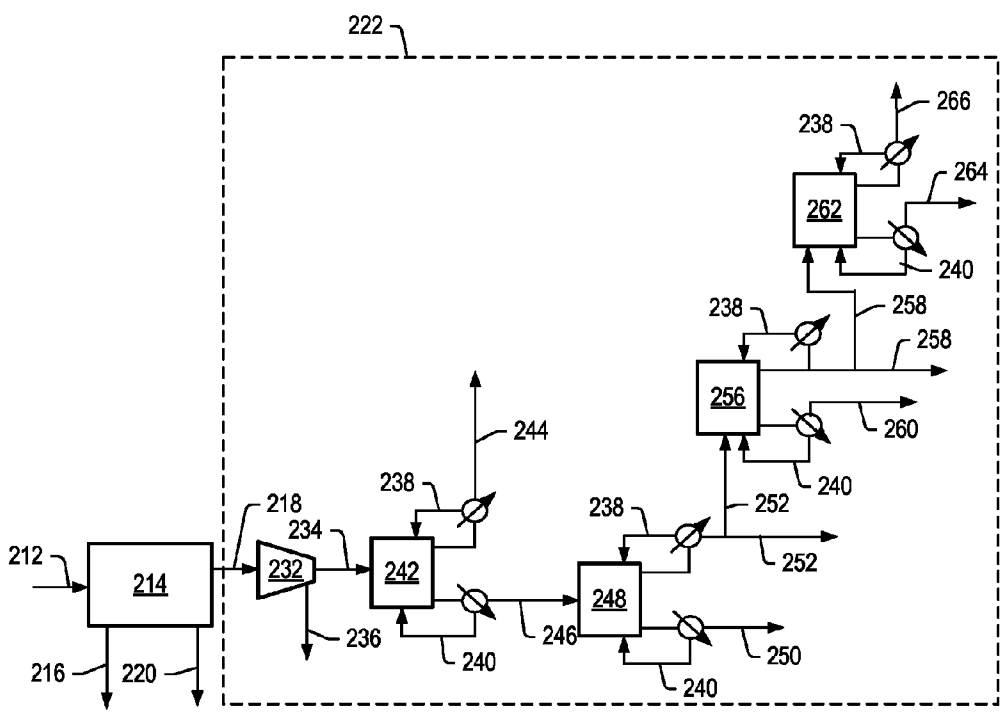
FIG. 2 depicts a schematic representation of an embodiment of a system for treating in situ heat treatment process gas.
Figure 5:
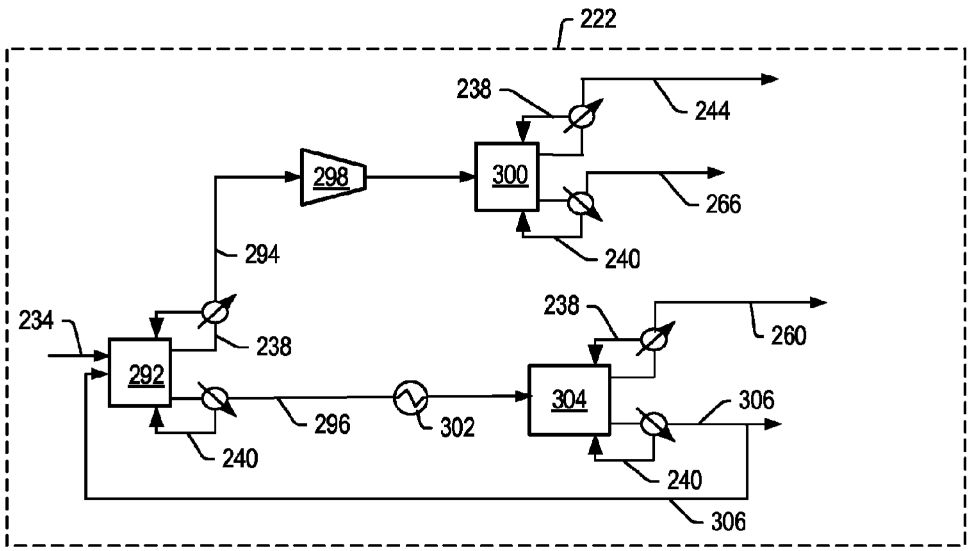
FIG. 5 depicts a schematic representation of an embodiment of a system for treating in situ heat treatment process gas.
Figure 6:
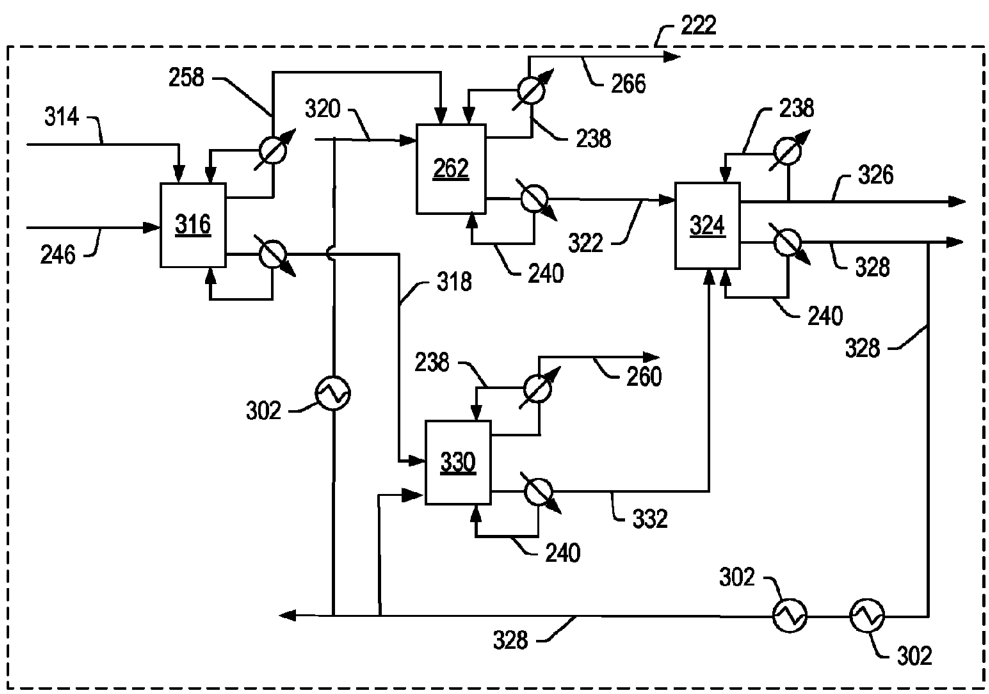
FIG. 6 depicts a schematic representation of an embodiment of a system for treating in situ heat treatment process gas.
Figure 7:
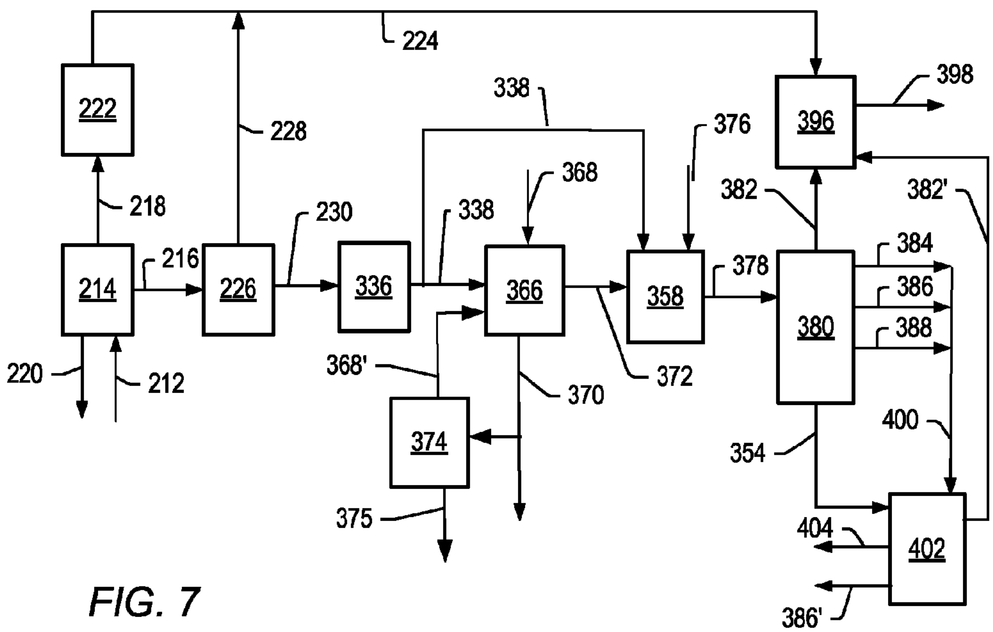
FIG. 7 depicts a schematic representation of an embodiment of a system for treating the mixture produced from an in situ heat treatment process.
Figure 8:
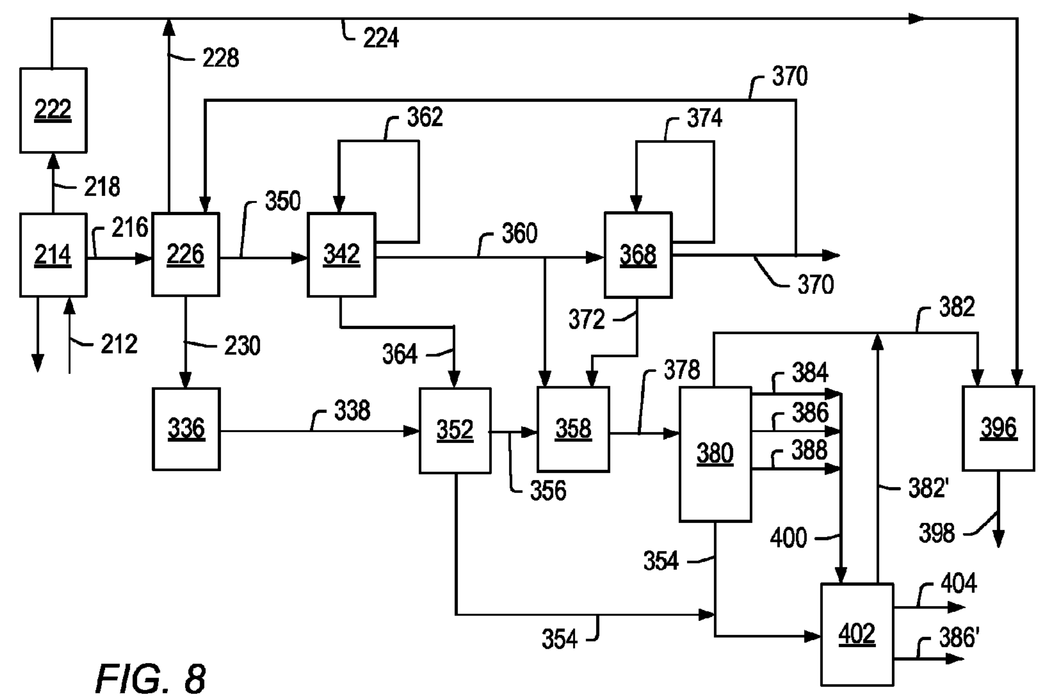
FIG. 8 depicts a schematic representation of an embodiment of a system for treating a liquid stream produced from an in situ heat treatment process.

FIGS. 2-8 depict schematics representation of systems for producing crude products and/or commercial products from the in situ heat treatment process liquid stream and/or the in situ heat treatment process gas stream. As shown in FIGS. 2, 7 and 8, formation fluid 212 enters fluid separation unit 214 and is separated into in situ heat treatment process liquid stream 216, in situ heat treatment process gas 218 and aqueous stream 220. In some embodiments, liquid stream 216 may be transported to other processing units and/or facilities.

Formation fluid 212 enters fluid separation unit 214 and is separated into in situ heat treatment process liquid stream 216, in situ heat treatment process gas 218, and aqueous stream 220. Liquid stream 216 may be transported to other processing units and/or facilities. In some embodiments, fluid separation unit 214 includes a quench zone.

In situ heat treatment process gas 218 may enter gas separation unit 222 to separate gas hydrocarbon stream 224 from the in situ heat treatment process gas. In some embodiments, the gas separation unit is a rectified adsorption and high pressure fractionation unit. Gas hydrocarbon stream 224 includes hydrocarbons having a carbon number of at least 3.

In some embodiments, fluid separation unit 214 includes a quench zone. As produced formation fluid enters the quench zone, quenching fluid such as water, nonpotable water, hydrocarbon diluent, and/or other components may be added to the formation fluid to quench and/or cool the formation fluid to a temperature suitable for handling in downstream processing equipment. Quenching the formation fluid may inhibit formation of compounds that contribute to physical and/or chemical instability of the fluid (for example, inhibit formation of compounds that may precipitate from solution, contribute to corrosion, and/or fouling of downstream equipment and/or piping). The quenching fluid may be introduced into the formation fluid as a spray and/or a liquid stream. In some embodiments, the formation fluid is introduced into the quenching fluid. In some embodiments, the formation fluid is cooled by passing the fluid through a heat exchanger to remove some heat from the formation fluid. The quench fluid may be added to the cooled formation fluid when the temperature of the formation fluid is near or at the dew point of the quench fluid. Quenching the formation fluid near or at the dew point of the quench fluid may enhance solubilization of salts that may cause chemical and/or physical instability of the quenched fluid (for example, ammonium salts). In some embodiments, an amount of water used in the quench is minimal so that salts of inorganic compounds and/or other components do not separate from the mixture. In separation unit 214, at least a portion of the quench fluid may be separated from the quench mixture and recycled to the quench zone with a minimal amount of treatment. Heat produced from the quench may be captured and used in other facilities. In some embodiments, vapor may be produced during the quench. The produced vapor may be sent to gas separation unit 222 and/or sent to other facilities for processing.

In situ heat treatment process gas 218 may enter gas separation unit 222 to separate gas hydrocarbon stream 224 from the in situ heat treatment process gas. In some embodiments, the gas separation unit is a rectified adsorption and high pressure fractionation unit. Gas hydrocarbon stream 224 includes hydrocarbons having a carbon number of at least 3. In gas separation unit 222, treatment of in situ heat conversion treatment gas 218 removes sulfur compounds, carbon dioxide, and/or hydrogen to produce gas hydrocarbon stream 224. In some embodiments, in situ heat treatment process gas 218 includes about 20 vol % hydrogen, about 30% methane, about 12% carbon dioxide, about 14 vol % $C_2$ hydrocarbons, about 5 vol % hydrogen sulfide, about 10 vol % $C_3$ hydrocarbons, about 7 vol % $C_4$ hydrocarbons, about 2 vol % $C_5$ hydrocarbons, and mixtures thereof, with the balance being heavier hydrocarbons, water, ammonia, COS, thiols and thiophenes.

Gas separation unit 222 may include a physical treatment system and/or a chemical treatment system. The physical treatment system may include, but is not limited to, a membrane unit, a pressure swing adsorption unit, a liquid absorption unit, and/or a cryogenic unit. The chemical treatment system may include units that use amines (for example, diethanolamine or di-isopropanolamine), zinc oxide, sulfolane, water, or mixtures thereof in the treatment process. In some embodiments, gas separation unit 222 uses a Sulfinol gas treatment process for removal of sulfur compounds. Carbon dioxide may be removed using Catacarb® (Catacarb, Overland Park, Kans., U.S.A.) and/or Benfield (UOP, Des Plaines, Ill., U.S.A.) gas treatment processes. In some embodiments, the gas separation unit is a rectified adsorption and high pressure fractionation unit. In some embodiments, in situ heat treatment process gas is treated to remove at least 50%, at least 60%, at least 70%, at least 80% or at least 90% by volume of ammonia present in the gas stream.

In situ heat treatment process gas 218 may include one or more carbon oxides and sulfur compounds that render the in situ heat treatment process gas unacceptable for sale, transportation, and/or use as a fuel. The in situ heat treatment process gas 218 may be processed as described herein to produce a gas stream acceptable for sale, transportation, and/or use as a fuel. It would be advantageous to separate the in situ treatment process gas 218 at the treatment site to produce streams useable as energy sources to lower overall energy costs. For example, streams containing hydrocarbons and/or hydrogen may be used as fuel for burners and/or process equipment. Streams containing sulfur compounds may be used as fuel for burners. Streams containing one or more carbon oxides and/or hydrocarbons may be used to form barriers around a treatment site. Streams containing hydrocarbons having a carbon number of at most 2 may be provided to ammonia processing facilities and/or barrier well systems. In situ heat treatment process gas 218 may include a sufficient amount of hydrogen such that the freezing point of carbon dioxide is depressed. Depression of the freezing point of carbon dioxide may allow cryogenic separation of hydrogen and/or hydrocarbons from the carbon dioxide using distillation methods instead of removing the carbon dioxide by cryogenic precipitation methods. In some embodiments, the freezing point of carbon dioxide may be depressed by adjusting the concentration of molecular hydrogen and/or addition of heavy hydrocarbons to the process gas stream.

As shown in FIG. 2, in situ heat treatment process gas 218 may enter compressor 232 of gas separation unit 222 to form compressed gas stream 234 and heavy stream 236. Heavy stream 236 may be transported to one or more liquid separation units for further processing. Compressor 232 may be any compressor suitable for compressing gas. In certain embodiments, compressor 232 is a multistage compressor (for example 2 to 3 compressor trains) having an outlet pressure of about 40 bars. In some embodiments, compressed gas stream 234 may include at least 1 vol % carbon dioxide, at least 10 vol % hydrogen, at least 1 vol % hydrogen sulfide, at least 50 vol % of hydrocarbons having a carbon number of at most 4, or mixtures thereof. Compression of in situ heat treatment process gas 218 removes hydrocarbons having a carbon number of at least 5 and water. Removal of water and hydrocarbons having a carbon number of at least 5 from the in situ process gas allows compressed gas stream 234 to be treated cryogenically. Cryogenic treatment of compressed gas stream 234 having small amounts of high boiling materials may be done more efficiently. In certain embodiments, compressed gas stream 234 is dried by passing the gas through a water adsorption unit. In some embodiments, compressing in situ heat treatment process gas 218 is not necessary.

As shown in FIGS. 2 through 6, gas separation unit 222 includes one or more cryogenic units or zones. Cryogenic units described herein may include one or more theoretical distillation stages. In FIGS. 2 through 6, one or more heat exchangers may be positioned prior to or after cryogenic units and/or separation units described herein to assist in removing and/or adding heat to one or more streams described herein. At least a portion or all of the separated hydrocarbons streams and/or the separated carbon dioxides streams may be transported to the heat exchangers. Heat integration from one or more heat exchangers to various units or zones may be applied to improve the energy efficiency of the process.

In some embodiments, theoretical distillation stages may include from 1 to about 100 stages, from about 5 to about 50 theoretical distillation stages, or from about 10 to about 40 theoretical distillation stages. Zones of the cryogenic units may be cooled to temperatures ranging from about −110° C. to about 0° C. For example, zone 1 (top theoretical distillation stage) in a cryogenic unit is cooled to about −110° C., zone 5 (theoretical distillation stage 5) is cooled to about −25° C., and zone 10 (theoretical distillation stage 10) is cooled to about −1° C. Total pressures in cryogenic units may range from about 1 bar to about 50 bar, from about 5 bar to about 40 bar, or from about 10 bar to about 30 bar. Operating the cryogenic zones and/or units at these temperatures and pressures may allow separation of hydrogen sulfide and/or carbon dioxide from hydrocarbons in the process stream. Cryogenic units described herein may include condenser recycle conduits 238 and reboiler recycle conduits 240. Condenser recycle conduits 238 allow recycle of the cooled condensed gases so that the feed may be cooled as it enters the cryogenic units. Condenser liquid recycle or reflux may improve fractionation effectiveness. Temperatures in condensation loops may range from about −110° C. to about −1° C., from about −90° C. to about −5° C., or from about −80° C. to about −10° C. Temperatures in reboiler loops may range from about 25° C. to about 200° C., from about 50° C. to about 150° C., or from about 75° C. to about 100° C. Reboiler recycle conduits 240 allow recycle of the stream exiting the cryogenic unit to heat the feed as it enters the cryogenic unit. Recycle of the cooled and/or warmed separated stream may enhance energy efficiency of the cryogenic unit.

As shown in FIG. 2, compressed gas stream 234 enters methane/hydrogen cryogenic unit 242. In cryogenic unit 242, compressed gas stream 234 may be separated into a methane/molecular hydrogen gas stream 244 and a bottoms stream 246. Bottoms stream 246 may include, but is not limited to carbon dioxide, hydrogen sulfide, and hydrocarbons having a carbon number of at least 2. A majority of methane/hydrogen stream 244 is methane and molecular hydrogen. Methane/hydrogen stream 244 may include a minimal amount of $C_2$ hydrocarbons and carbon dioxide. For example, methane/hydrogen stream 244 may include about 1 vol % $C_2$ hydrocarbons and about 1 vol % carbon dioxide. In some embodiments, the methane/hydrogen stream is recycled to one or more heat exchangers positioned prior to cryogenic unit 242. In some embodiments, the methane/hydrogen stream is used as a fuel for downhole burners and/or an energy source for surface facilities.

In some embodiments, cryogenic unit 242 may include one distillation column having 1 to about 30 theoretical distillation stages, about 5 to about 25 theoretical distillation stages, or about 10 to about 20 theoretical distillation stages. Zones of cryogenic unit 242 may be cooled to temperatures ranging from about −150° C. to about 10° C. For example, zone 1 (top theoretical distillation stage) is cooled to about −138° C., zone 5 (theoretical distillation stage 5) is cooled to about −25° C., and zone 10° C. (theoretical distillation stage 10) is cooled to at about −1° C. At temperatures lower than −79° C. cryogenic separation of the carbon dioxide from other gases may be difficult due to the freezing point of carbon dioxide. In some embodiments, cryogenic unit 242 includes about 20 theoretical distillation stages. Cryogenic unit 242 may be operated at a pressure of 40 bar with distillation temperatures ranging from about −45° C. to about −94° C.

Compressed gas stream 234 may include sufficient hydrogen and/or hydrocarbons having a carbon number of at least 1 to inhibit solid carbon dioxide formation. For example, in situ heat treatment process gas 218 may include from about 30 vol % to about 40 vol % of hydrogen, from about 50 vol % to 60 vol % of hydrocarbons having a carbon number from 1 to 2, from about 0.1 vol % to about 15 vol % of carbon dioxide with the balance being other gases such as, but not limited to, carbon monoxide, nitrogen, and hydrogen sulfide. Inhibiting solid carbon dioxide formation may allow for better separation of gases and/or less fouling of the cryogenic unit. In some embodiments, hydrocarbons having a carbon number of at least five may be added to cryogenic unit 242 to inhibit formation of solid carbon dioxide. The resulting methane/hydrogen gas stream 244 may be used as an energy source. For example, methane/hydrogen gas stream 244 may be transported to surface facilities and burned to generate electricity.

As shown in FIG. 2, bottoms stream 246 enters cryogenic separation unit 248. In cryogenic separation unit 248, bottoms stream 246 is separated into $C_3$ hydrocarbons stream 250 and gas stream 252. $C_3$ hydrocarbons stream 250 may include hydrocarbons having a carbon number of at least 3. $C_3$ hydrocarbons stream 250 may be a liquid and/or a gas depending on the separation conditions. In some embodiments, $C_3$ hydrocarbons stream 250 includes at least 50 vol %, at least 70 vol % or at least 90 vol % of $C_3$ hydrocarbons. $C_3$ hydrocarbons stream 250 may include at most 1 ppm of carbon dioxide, and about 0.1 vol % of hydrogen sulfide. In some embodiments, $C_3$ hydrocarbons stream 250 includes hydrocarbons having a carbon number of at least 2 and organosulfur compounds. In some embodiments, $C_3$ hydrocarbons stream 250 includes hydrocarbons having a carbon number from 3 to 5. In some embodiments, $C_3$ hydrocarbons stream 250 includes hydrogen sulfide in quantities sufficient to require treatment of the stream to remove the hydrogen sulfide. In some embodiments, $C_3$ hydrocarbons gas stream 250 is suitable for transportation and/or use as an energy source without further treatment. In some embodiments, $C_3$ hydrocarbons stream 250 is used as an energy source for in situ heat treatment processes.

Gas stream 252 may include hydrocarbons having a carbon number of at least 2, carbon oxides and sulfur compounds. In some embodiments, gas stream 252 includes hydrocarbons having a carbon number of at most 2. A portion of gas stream 252 may be transported to one or more portions of the formation and sequestered. In some embodiments, all of gas stream 252 is sequestered in one or more portions of the formation. In some embodiments, a portion of gas stream 252 enters cryogenic unit 256. In cryogenic unit 256, gas stream 252 is separated into $C_2$ hydrocarbons/carbon dioxide stream 258 and hydrogen sulfide stream 260. In some embodiments, $C_2$ hydrocarbons/carbon dioxide stream 258 includes at most 0.5 vol % of hydrogen sulfide.

In some embodiments, hydrogen sulfide stream 260 includes about 0.01 vol % to about 5 vol % of $C_3$ hydrocarbons. In some embodiments, hydrogen sulfide stream 260 includes hydrogen sulfide, carbon dioxide, $C_3$ hydrocarbons, or mixtures thereof. For example, hydrogen sulfide stream 260 includes, about 32 vol % of hydrogen sulfide, 67 vol % carbon dioxide, and 1 vol % $C_3$ hydrocarbons. In some embodiments, hydrogen sulfide stream 260 is used as an energy source for an in situ heat treatment process and/or sent to a Claus plant for further treatment.

A portion or all of $C_2$ hydrocarbons/carbon dioxide stream 258 may enter separation unit 262. In separation unit 262, $C_2$ hydrocarbons/carbon dioxide stream 258 is separated into $C_2$ hydrocarbons stream 264 and carbon dioxide stream 266. Separation of $C_2$ hydrocarbons from carbon dioxide is performed using separation methods known in the art, for example, pressure swing adsorption units, and/or extractive distillation units. In some embodiments, $C_2$ hydrocarbons are separated from carbon dioxide using extractive distillation methods. For example, hydrocarbons having a carbon number from 3 to 8 may be added to separation unit 262. Addition of a higher carbon number hydrocarbon solvent allows $C_2$ hydrocarbons to be extracted from the carbon dioxide. $C_2$ hydrocarbons are then separated from the higher carbon number hydrocarbons using distillation techniques. In some embodiments, $C_2$ hydrocarbons stream 264 is transported to other process facilities and/or used as an energy source. For example, $C_2$ hydrocarbons stream 264 may be provided to one or more ammonia processing facilities. Carbon dioxide stream 266 may be sequestered in one or more portions of the formation. In some embodiments, carbon dioxide stream 266 is provided to one or more barrier well systems. In some embodiments, carbon dioxide stream 266 contains at most 0.005 grams of non-carbon dioxide compounds per gram of carbon dioxide stream. In some embodiments, carbon dioxide stream 266 is mixed with one or more oxidant sources supplied to one or more downhole burners.

In some embodiments, a portion or all of $C_2$ hydrocarbons/carbon dioxide stream 258 is sequestered and/or transported to other facilities and/or provided to one or more barrier well systems. In some embodiments, a portion or all of $C_2$ hydrocarbons/carbon dioxide stream 258 is mixed with one or more oxidant sources supplied to one or more downhole burners.

Figure 3:
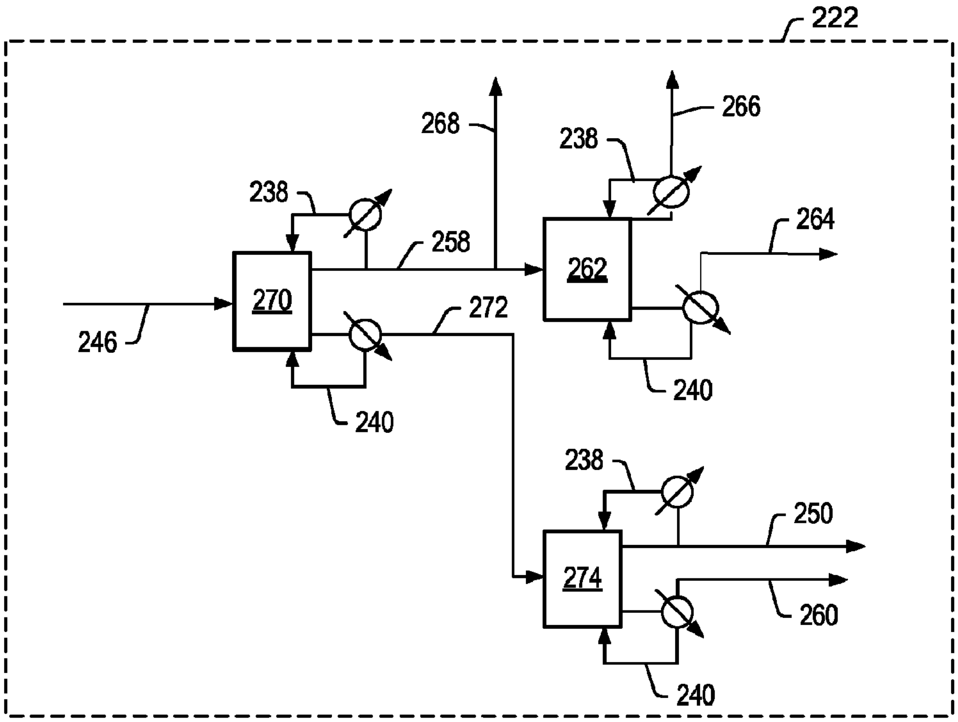
FIG. 3 depicts a schematic representation of an embodiment of a system for treating in situ heat treatment process gas.

As depicted in FIG. 3, bottoms stream 246 enters cryogenic separation unit 270. In cryogenic separation unit 270, bottoms stream 246 may be separated into $C_2$ hydrocarbons/carbon dioxide stream 258 and hydrogen sulfide/hydrocarbon gas stream 272. In some embodiments, $C_2$ hydrocarbons/carbon dioxide stream 258 contains hydrogen sulfide. Hydrogen sulfide/hydrocarbon gas stream 272 may include hydrocarbons having a carbon number of at least 3.

In some embodiments, a portion or all of $C_2$ hydrocarbons/carbon dioxide stream 258 are transported via conduit 268 to other processes and/or to one or more portions of the formation to be sequestered. In some embodiments, a portion or all of $C_2$ hydrocarbons/carbon dioxide stream 258 are treated in separation unit 262. Separation unit 262 is described above with reference to FIG. 2.

Hydrogen sulfide/hydrocarbon gas stream 272 may enter cryogenic separation unit 274. In cryogenic separation unit 274, hydrogen sulfide may be separated from hydrocarbons having a carbon number of at least 3 to produce hydrogen sulfide stream 260 and $C_3$ hydrocarbons stream 250. Hydrogen sulfide stream 260 may include, but is not limited to, hydrogen sulfide, $C_3$ hydrocarbons, carbon dioxide, or mixtures thereof. In some embodiments, hydrogen sulfide stream 260 may contain from about 20 vol % to about 80 vol % of hydrogen sulfide, from about 4 vol % to about 18 vol % of propane and from about 2 vol % to about 70 vol % of carbon dioxide. In some embodiments, hydrogen sulfide stream 260 is burned to produce $SO_x$. The $SO_x$ may be sequestered and/or treated using known techniques in the art.

In some embodiments, $C_3$ hydrocarbons stream 250 includes a minimal amount of hydrogen sulfide and carbon dioxide. For example, $C_3$ hydrocarbons stream 250 may include about 99.6 vol % of hydrocarbons having a carbon number of at least 3, about 0.4 vol % of hydrogen sulfide and at most 1 ppm of carbon dioxide. In some embodiments, $C_3$ hydrocarbons stream 250 is transported to other processing facilities as an energy source. In some embodiments, $C_3$ hydrocarbons stream 250 needs no further treatment.

Figure 4:
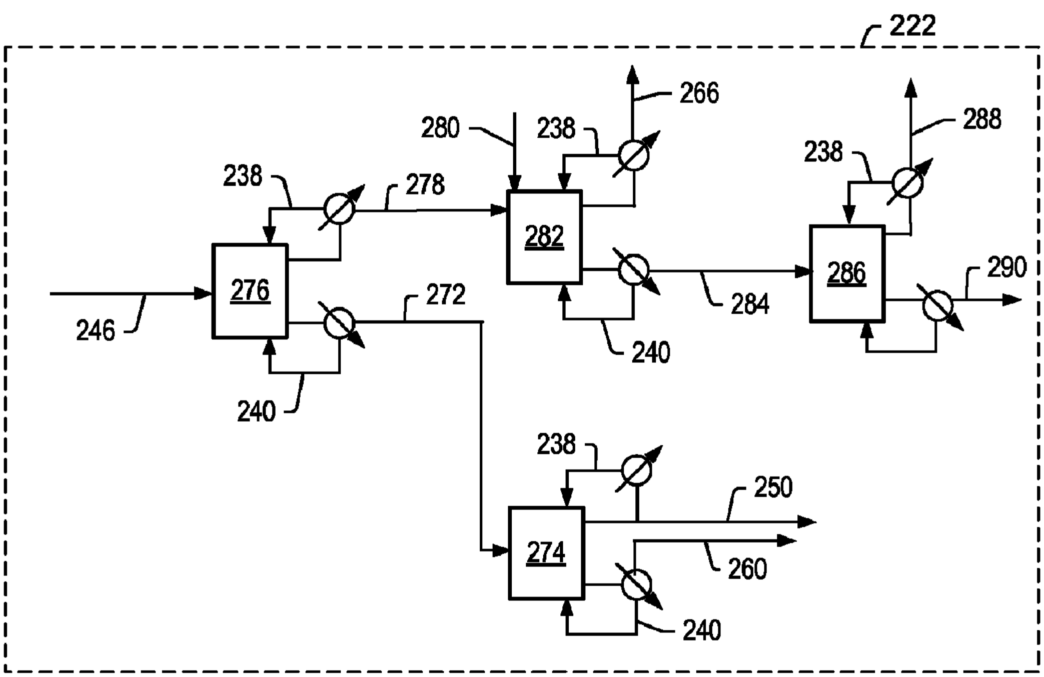
FIG. 4 depicts a schematic representation of an embodiment of a system for treating in situ heat treatment process gas.

As depicted in FIG. 4, bottoms stream 246 may enter cryogenic separation unit 276. In cryogenic separation unit 276, bottoms stream 246 may be separated into $C_2$ hydrocarbons/hydrogen sulfide/carbon dioxide gas stream 278 and hydrogen sulfide/hydrocarbon gas stream 272. In some embodiments, cryogenic separation unit 276 includes 45 theoretical distillation stages. A top zone (top theoretical distillation stage) of cryogenic separation unit 276 may be operated at a temperature of −31° C. and a pressure of about 20 bar.

A portion or all of $C_2$ hydrocarbons/hydrogen sulfide/carbon dioxide gas stream 278 and hydrocarbon stream 280 may enter cryogenic separation unit 282. Hydrocarbon stream 280 may be any hydrocarbon stream suitable for use in a cryogenic extractive distillation system. In some embodiments, hydrocarbon stream 280 is n-hexane. In cryogenic separation unit 282, $C_2$ hydrocarbons/hydrogen sulfide/carbon dioxide gas stream 278 is separated into carbon dioxide stream 266 and additional hydrocarbon/hydrogen sulfide stream 284. In some embodiments, cryogenic separation unit 282 includes 40 theoretical distillation stages. Cryogenic separation unit 282 may be operated at a temperature of about −19° C. and a pressure of about 20 bar.

In some embodiments, carbon dioxide stream 266 includes about 2.5 vol % of hydrocarbons having a carbon number of at most 2. In some embodiments, carbon dioxide stream 266 may be mixed with diluent fluid and/or oxidant for downhole burners, may be used as a carrier fluid for oxidizing fluid for downhole burners, may be used as a drive fluid for producing hydrocarbons, may be vented, may be used in barrier wells, and/or may be sequestered. In some embodiments carbon dioxide stream 266 is solidified.

Additional hydrocarbon/hydrogen sulfide stream 284 may be in the gas or liquid phase depending on the composition of the stream and/or the process conditions. Additional hydrocarbon/hydrogen sulfide stream 284 may enter cryogenic separation unit 286. Additional hydrocarbon/hydrogen sulfide stream 284 may include solvent hydrocarbons, $C_2$ hydrocarbons and hydrogen sulfide. In cryogenic separation unit 286, additional hydrocarbon/hydrogen sulfide stream 284 may be separated into $C_2$ hydrocarbons/hydrogen sulfide gas stream 288 and hydrocarbon stream 290. Hydrocarbon stream 290 may contain hydrocarbons having a carbon number of at least 3. Hydrocarbon stream 290 may be a liquid or gas depending on the composition of the stream and/or process conditions. In some embodiments, separation unit 286 includes 20 theoretical distillation stages. Cryogenic separation unit 286 may be operated at temperatures of about −16° C. and a pressure of about 10 bar.

Hydrogen sulfide/hydrocarbon gas stream 272 may enter cryogenic separation unit 274. In cryogenic separation unit 274, hydrogen sulfide may be separated from hydrocarbons having a carbon number of at least 3 to produce hydrogen sulfide stream 260 and $C_3$ hydrocarbons stream 250. Hydrogen sulfide stream 260 may include, but is not limited to, hydrogen sulfide, $C_2$ hydrocarbons, $C_3$ hydrocarbons, carbon dioxide, or mixtures thereof. In some embodiments, hydrogen sulfide stream 260 contains about 31 vol % hydrogen sulfide with the balance being $C_2$ and $C_3$ hydrocarbons. Hydrogen sulfide stream 260 may be burned to produce $SO_x$. The $SO_x$ may be sequestered and/or treated using known techniques in the art.

In some embodiments, cryogenic separation unit 274 includes about 40 theoretical distillation stages. Temperatures in cryogenic separation unit 274 may range from about 0° C. to about 10° C. Pressure in cryogenic separation unit 274 may be about 20 bar.

$C_3$ hydrocarbons stream 250 may be a gas or liquid stream depending on the composition of the stream and/or process conditions. $C_3$ hydrocarbons stream 250 may include a minimal amount of hydrogen sulfide and carbon dioxide. In some embodiments, $C_3$ hydrocarbons stream 250 includes about 50 ppm of hydrogen sulfide. In some embodiments, $C_3$ hydrocarbons stream 250 is transported to other processing facilities as an energy source. In some embodiments, hydrocarbons stream $C_3$ hydrocarbon stream 250 needs no further treatment.

As depicted in FIG. 5, compressed gas stream 234 may be treated using a modified Ryan/Holmes type process to recover the carbon dioxide from the compressed gas stream. Compressed gas stream 234 enters cryogenic separation unit 292. In some embodiments cryogenic separation unit 292 includes 40 theoretical distillation stages. Cryogenic separation unit 292 may be operated at a temperature ranging from about 60° C. to about −56° C. and a pressure of about 30 bar. In cryogenic separation unit 292, compressed gas stream 234 may be separated into methane/carbon dioxide gas stream 294 and hydrocarbon/hydrogen sulfide stream 296.

Methane/carbon dioxide gas stream 294 may include hydrocarbons having a carbon number of at most 2 and carbon dioxide. Methane/carbon dioxide gas stream 294 may be compressed in compressor 298 and enter cryogenic separation unit 300. In cryogenic separation unit 300, methane/carbon dioxide gas stream 294 is separated into carbon dioxide stream 266 and methane stream 244. In some embodiments, cryogenic separation unit 300 includes 20 theoretical distillation stages. Temperatures in cryogenic separation unit 300 may range from about −56° C. to about −96° C. at a pressure of about 45 bar.

Carbon dioxide stream 266 may include some hydrogen sulfide. For example, carbon dioxide stream 266 may include about 80 ppm of hydrogen sulfide. At least a portion of carbon dioxide stream 266 may be used as a heat exchange medium in heat exchanger 302. In some embodiments, at least a portion of carbon dioxide stream 266 is sequestered in the formation and/or at least a portion of the carbon dioxide stream is used as a diluent in downhole oxidizer assemblies.

Hydrocarbon/hydrogen sulfide stream 296 may include hydrocarbons having a carbon number of at least 2 and hydrogen sulfide. Hydrocarbon/hydrogen sulfide stream 296 may be a gas or liquid stream depending on the hydrocarbon content of the stream and/or process conditions. Hydrocarbon/hydrogen sulfide stream 296 may pass through heat exchanger 302 and enter separation unit 304. In separation unit 304, hydrocarbon/hydrogen sulfide stream 296 may be separated into hydrocarbon stream 306 and hydrogen sulfide stream 260. In some embodiments, separation unit 304 includes 30 theoretical distillation stages. Temperatures in separation unit 304 may range from about 60° C. to about 27° C. at a pressure of about 10 bar.

Hydrocarbon stream 306 may include hydrocarbons having a carbon number of at least 3. Hydrocarbon stream 306 may include some hydrocarbons having a carbon number greater than 5. Hydrocarbon stream 306 may include hydrocarbons having a carbon number of at most 5. In some embodiments, hydrocarbon stream 306 includes 10 vol % n-butanes and 85 vol % hydrocarbons having a carbon number of 5. At least a portion of hydrocarbon stream 306 may be recycled to cryogenic separation unit 292 to maintain a ratio of about 1.4:1 of hydrocarbons to compressed gas stream 234.

Hydrogen sulfide stream 260 may include hydrogen sulfide, $C_2$ hydrocarbons, and some carbon dioxide. In some embodiments, hydrogen sulfide stream 260 includes about 13 vol % hydrogen sulfide, about 0.8 vol % carbon dioxide with the balance being $C_2$ hydrocarbons. At least a portion of the hydrogen sulfide stream 260 may be burned as an energy source. In some embodiments, hydrogen sulfide stream 260 is used as a fuel source in downhole burners.

In some embodiments, substantial removal of all the hydrogen sulfide from the $C_2$ hydrocarbons is desired. $C_2$ hydrocarbons may be used as an energy source in surface facilities. Recovery of $C_2$ hydrocarbons may enhance the energy efficiency of the process. Separation of hydrogen sulfide from $C_2$ hydrocarbons may be difficult because $C_2$ hydrocarbons boil at approximately the same temperature as a hydrogen sulfide/$C_2$ hydrocarbons mixture. Addition of higher molecular weight (higher boiling) hydrocarbons does not enable the separation between hydrogen sulfide and $C_2$ hydrocarbons as the addition of higher molecular weight hydrocarbons decreases the volatility of the $C_2$ hydrocarbons. It has been advantageously found that the addition of carbon dioxide to the hydrogen sulfide/$C_2$ hydrocarbons mixture allows separation of hydrogen sulfide from the $C_2$ hydrocarbons.

As shown in FIG. 6, bottoms stream 246 and carbon dioxide stream 314 enter cryogenic separation unit 316. In some embodiments, the carbon dioxide stream is added to the bottom stream prior to entering the cryogenic separation unit. In cryogenic separation unit 316, bottoms stream 246 may be separated into $C_2$ hydrocarbons/carbon dioxide gas stream 258 and hydrogen sulfide/hydrocarbon stream 318 by addition of sufficient carbon dioxide to form a $C_2$ hydrocarbons/carbon dioxide azeotrope (for example, a $C_2$ hydrocarbons/carbon dioxide volume ratio of 0.17:1 may be used). The $C_2$ hydrocarbons/carbon dioxide azeotrope has a boiling point lower than the boiling point of $C_2$ hydrocarbons. For example, the $C_2$ hydrocarbons/carbon dioxide azeotrope, where the $C_2$ hydrocarbons are ethane, has a boiling point that is 14° C. lower than $C_2$ boiling point at 10 bar, and a boiling point that is 22° C. lower than the $C_2$ boiling point at 40 bar. Use of a $C_2$ hydrocarbons/carbon dioxide azeotrope allows formation of a $C_2$ hydrocarbons/carbon dioxide stream having a minimal amount of hydrogen sulfide (for example, a $C_2$ hydrocarbons/carbon dioxide stream having at most 30 ppm, at most 25 ppm, at most 20 ppm, or at most 10 ppm of hydrogen sulfide). In some embodiments, cryogenic separation unit 316 includes 40 theoretical distillation stages and may be operated at a pressure of about 10 bar.

At least a portion of $C_2$ hydrocarbons/carbon dioxide stream 258 and hydrocarbon recovery stream 320 may enter separation unit 262. Hydrocarbon recovery stream 320 may include hydrocarbons having a carbon number ranging from 4 to 7. In separation unit 262, contact of $C_2$ hydrocarbons/carbon dioxide stream 258 with hydrocarbon recovery stream 320 allows for separation of hydrocarbons from the $C_2$ hydrocarbons/carbon dioxide stream to form separated carbon dioxide stream 266 and $C_2$ rich hydrocarbon stream 322. For example, a hydrocarbon recovery stream to $C_2$ hydrocarbons/carbon dioxide stream ratio of 1.25 to 1 may effectively extract all the hydrocarbons from the carbon dioxide. The ratio of hydrocarbon recovery stream to $C_2$ hydrocarbons/carbon dioxide stream may depend on the relative concentrations of $C_2$ hydrocarbons and carbon dioxide in the $C_2$ hydrocarbons/carbon dioxide stream. Separated carbon dioxide stream 266 may be sequestered in the formation, used as a drive fluid, recycled to cryogenic separation unit 316, or used as a cooling fluid in other processes.

$C_2$ rich hydrocarbon stream 322 may enter hydrocarbon recovery unit 324. In hydrocarbon recovery unit 324, $C_2$ rich hydrocarbon stream 322 may be separated into light hydrocarbons stream 326 and bottom hydrocarbon stream 328. In some embodiments, hydrocarbon recovery unit 324 includes 30 theoretical distillation stages and is operated at a pressure of 10 bar. Light hydrocarbons stream 326 may include hydrocarbons having a carbon number from 2 to 4, a residual amount of hydrogen sulfide, thiols, and/or COS. For example, light hydrocarbons stream 326 may have about 30 ppm hydrogen sulfide, 280 ppm thiols and 260 ppm COS. Light hydrocarbons stream 326 may be treated further (for example, contacted with molecular sieves) to remove the sulfur compounds. In some embodiments, light hydrocarbons stream 326 requires no further purification and is suitable for transportation and/or use as a fuel.

Hydrocarbon stream 328 may include hydrocarbons having a carbon number ranging from 3 to 7. Some of hydrocarbon stream 328 may be directed to separation unit 330 and/or separation unit 262 after passing through one or more heat exchangers 302. Heat exchangers 302 may be integrated with one or more units to maximize energy efficiency. Mixing of hydrocarbon stream 328 with hydrocarbon recovery stream 320 stabilize the composition of hydrocarbon recovery stream 320 and avoid build-up of heavy hydrocarbons and sulfur compounds (for example, organosulfur compounds). In some embodiments, hydrocarbon stream 328 and hydrocarbon recovery stream 320 are the same stream. In some embodiments, hydrocarbon stream 328 is treated to remove sulfur compounds (for example, the hydrocarbon stream is contacted with caustic).

Hydrogen sulfide/hydrocarbon gas stream 318 from cryogenic separation unit 316 may include, but is not limited to, hydrocarbons having a carbon number of at least 3, hydrocarbons that include organosulfur compounds, hydrogen sulfide, or mixtures thereof. A portion or all of hydrogen sulfide/hydrocarbon gas stream 318 and hydrocarbon recovery stream 320 enter hydrogen sulfide separation unit 330. Output from cryogenic separation unit 330 may include hydrogen sulfide stream 260 and rich $C_3$ hydrocarbons stream 332. To facilitate separation of the hydrogen sulfide from rich $C_3$ hydrocarbon stream 332, a volume ratio of 0.73 to 1 of rich $C_3$ hydrocarbons stream to hydrogen sulfide may be used. In some embodiments, separation unit 330 includes 30 theoretical distillation stages. Cryogenic separation unit 330 may be operated at a temperature of about −16° C. and a pressure of about 10 bar. $C_3$ hydrocarbon stream 332 may contain hydrocarbons having a carbon number of at least 3. At least a portion of $C_3$ hydrocarbon stream 332 may enter hydrocarbon recovery unit 324.

Hydrogen sulfide stream 260 may include, but is not limited to, hydrogen sulfide, $C_2$ hydrocarbons, $C_3$ hydrocarbons, carbon dioxide, or mixtures thereof. In some embodiments, hydrogen sulfide stream 260 contains about 99 vol % hydrogen sulfide with the balance being $C_2$ and $C_3$ hydrocarbons. Hydrogen sulfide stream 260 may be burned to produce $SO_x$. In some embodiments, at least a portion of the hydrogen sulfide stream is used as a fuel in downhole burners. The $SO_x$ may be used as a drive fluid, sequestered and/or treated using known techniques in the art.

As shown in FIGS. 7 and 8, in situ heat treatment process liquid stream 216 enters liquid separation unit 226. In some embodiments, liquid separation unit 226 is not necessary. In liquid separation unit 226, separation of in situ heat treatment process liquid stream 216 produces gas hydrocarbon stream 228 and salty process liquid stream 230. Gas hydrocarbon stream 228 may include hydrocarbons having a carbon number of at most 5. A portion of gas hydrocarbon stream 228 may be combined with gas hydrocarbon stream 224.

Salty process liquid stream 230 may be processed through desalting unit 336 to form liquid stream 338. Desalting unit 336 removes mineral salts and/or water from salty process liquid stream 230 using known desalting and water removal methods. In certain embodiments, desalting unit 336 is upstream of liquid separation unit 226.

Liquid stream 338 includes, but is not limited to, hydrocarbons having a carbon number of at least 5 and/or hydrocarbon containing heteroatoms (for example, hydrocarbons containing nitrogen, oxygen, sulfur, and phosphorus). Liquid stream 338 may include at least 0.001 g, at least 0.005 g, or at least 0.01 g of hydrocarbons with a boiling range distribution between about 95° C. and about 200° C. at 0.101 MPa; at least 0.01 g, at least 0.005 g, or at least 0.001 g of hydrocarbons with a boiling range distribution between about 200° C. and about 300° C. at 0.101 MPa; at least 0.001 g, at least 0.005 g, or at least 0.01 g of hydrocarbons with a boiling range distribution between about 300° C. and about 400° C. at 0.101 MPa; and at least 0.001 g, at least 0.005 g, or at least 0.01 g of hydrocarbons with a boiling range distribution between 400° C. and 650° C. at 0.101 MPa. In some embodiments, liquid stream 338 contains at most 10% by weight water, at most 5% by weight water, at most 1% by weight water, or at most 0.1% by weight water.

In some embodiments, the separated liquid stream may have a boiling range distribution between about 50° C. and about 350° C., between about 60° C. and 340° C., between about 70° C. and 330° C. or between about 80° C. and 320° C. In some embodiments, the separated liquid stream has a boiling range distribution between 180° C. and 330° C.

In some embodiments, at least 50%, at least 70%, or at least 90% by weight of the total hydrocarbons in the separated liquid stream have a carbon number from 8 to 13. About 50% to about 100%, about 60% to about 95%, about 70% to about 90%, or about 75% to 85% by weight of liquid stream may have a carbon number distribution from 8 to 13. At least 50% by weight of the total hydrocarbons in the separated liquid stream may have a carbon number from about 9 to 12 or from 10 to 11.

In some embodiments, the separated liquid stream has at most 15%, at most 10%, at most 5% by weight of naphthenes; at least 70%, at least 80%, or at least 90% by weight total paraffins; at most 5%, at most 3%, or at most 1% by weight olefins; and at most 30%, at most 20%, or at most 10% by weight aromatics.

In some embodiments, the separated liquid stream has a nitrogen compound content of at least 0.01%, at least 0.1% or at least 0.4% by weight nitrogen compound. The separated liquid stream may have a sulfur compound content of at least 0.01%, at least 0.5% or at least 1% by weight sulfur compound.

In some embodiments, liquid stream 338 includes organonitrogen compounds. As shown in FIG. 7 liquid stream 338 enters separation unit 366. In some embodiments, liquid stream 338 is passed through one or more filtration units in separation unit 226 to remove solids from the liquid stream. In separation unit 366, liquid stream 338 may be treated with an aqueous acid solution 368 to form an aqueous stream 370 and product hydrocarbon stream 372. Hydrocarbon stream 372 may include at most 0.01% by weight nitrogen compounds. Hydrocarbon stream 372 may enter hydrotreating unit 358.

Aqueous acid solution 368 includes water and acids suitable to complex with nitrogen compounds (for example, sulfuric acid, phosphoric acid, acetic acid, formic acid and/or other suitable acidic compounds). Aqueous stream 370 includes salts of the organonitrogen compounds and acid and water. At least a portion of aqueous stream 370 is sent separation unit 374. In separation unit 374, aqueous stream 370 is separated (for example, distilled) to form aqueous acid stream 368' and concentrated organonitrogen stream 375. Concentrated organonitrogen stream 375 includes organonitrogen compounds, water, and/or acid. Separated aqueous stream 368' may be introduced into separation unit 366. In some embodiments, separated aqueous stream 368' is combined with aqueous acid solution 368 prior to entering the separation unit.

In some embodiments, at least a portion of aqueous stream 370 and/or concentrated organonitrogen stream 375 are introduced in a hydrocarbon portion or layer of subsurface formation that has been at least partially treated by an in situ heat treatment process. Aqueous stream 370 and/or concentrated organonitrogen stream 375 may be heated prior to injection in the formation. In some embodiments, the hydrocarbon portion or layer includes a shale and/or nahcolite (for example, a nahcolite zone in the Piceance Basin). In some embodiments, the aqueous stream 370 and/or concentrated organonitrogen stream 375 is used a part of the water source for solution mining nahcolite from the formation. In some embodiments, the aqueous stream 370 and/or concentrated organonitrogen stream 375 is introduced in a portion of a formation that contains nahcolite after at least a portion of the nahcolite has been removed. In some embodiments, the aqueous stream 370 and/or concentrated organonitrogen stream 375 374 is introduced in a portion of a formation that contains nahcolite after at least a portion of the nahcolite has been removed and/or the portion has been at least partially treated using an in situ heat treatment process. The hydrocarbon layer may be heated to temperatures above 200° C. prior to introduction of the aqueous stream. In the heated formation, the organonitrogen compounds may form hydrocarbons, amines, and/or ammonia and at least some of such hydrocarbons, amines and/or ammonia may be produced. In some embodiments, at least some of the acid used in the extraction process is produced.

In some embodiments, the desalting unit may produce a liquid hydrocarbon stream and a salty process liquid stream, as shown in FIG. 8. In situ heat treatment process liquid stream 216 enters liquid separation unit 226. Separation unit 226 may include one or more distillation units. In liquid separation unit 226, separation of in situ heat treatment process liquid stream 216 produces gas hydrocarbon stream 228, salty process liquid stream 230, and liquid hydrocarbon stream 350. Gas hydrocarbon stream 228 may include hydrocarbons having a carbon number of at most 5. A portion of gas hydrocarbon stream 228 may be combined with gas hydrocarbon stream 224. Salty process liquid stream 230 may be processed as described in the discussion of FIG. 7. Salty process liquid stream 230 may include hydrocarbons having a boiling point above 260° C. In some embodiments and as depicted in FIG. 8, salty process liquid stream 230 enters desalting unit 336. In desalting unit 336, salty process liquid stream 230 may be treated to form liquid stream 338 using known desalting and water removal methods. Liquid stream 338 may enter separation unit 352. In separation unit 352, liquid stream 338 is separated into bottoms stream 354 and hydrocarbon stream 356. In some embodiments, hydrocarbon stream 356 may have a boiling range distribution between about 200° C. and about 350° C., between about 220° C. and 340° C., between about 230° C. and 330° C. or between about 240° C. and 320° C.

In some embodiments, at least 50%, at least 70%, or at least 90% by weight of the total hydrocarbons in hydrocarbon stream 356 have a carbon number from 8 to 13. About 50% to about 100%, about 60% to about 95%, about 70% to about 90%, or about 75% to 85% by weight of liquid stream may have a carbon number distribution from 8 to 13. At least 50% by weight of the total hydrocarbons in the separated liquid stream may have a carbon number from about 9 to 12 or from 10 to 11.

In some embodiments, hydrocarbon stream 356 has at most 15%, at most 10%, at most 5% by weight of naphthenes; at least 70%, at least 80%, or at least 90% by weight total paraffins; at most 5%, at most 3%, or at most 1% by weight olefins; and at most 30%, at most 20%, or at most 10% by weight aromatics.

In some embodiments, hydrocarbon stream 356 has a nitrogen compound content of at least 0.01%, at least 0.1% or at least 0.4% by weight nitrogen compound. The separated liquid stream may have a sulfur compound content of at least 0.01%, at least 0.5% or at least 1% by weight sulfur compound.

Hydrocarbon stream 356 enters hydrotreating unit 358. In hydrotreating unit 358, liquid stream 338 may be hydrotreated to form compounds suitable for processing to hydrogen and/or commercial products.

Liquid hydrocarbon stream 350 from liquid separation unit 226 may include hydrocarbons having a boiling point up to 260° C. Liquid hydrocarbon stream 350 may include entrained asphaltenes and/or other compounds that may contribute to the instability of hydrocarbon streams. For example, liquid hydrocarbon stream 350 is a naphtha/kerosene fraction that includes entrained, partially dissolved, and/or dissolved asphaltenes and/or high molecular weight compounds that may contribute to phase instability of the liquid hydrocarbon stream. In some embodiments, liquid hydrocarbon stream 350 may include at least 0.5% by weight asphaltenes, 1% by weight asphaltenes or at least 5% by weight asphaltenes.

As properties of the liquid hydrocarbon stream 350 are changed during processing (for example, TAN, asphaltenes, P-value, olefin content, mobilized fluids content, visbroken fluids content, pyrolyzed fluids content, or combinations thereof), the asphaltenes and other components may become less soluble in the liquid hydrocarbon stream. In some instances, components in the produced fluids and/or components in the separated hydrocarbons may form two phases and/or become insoluble. Formation of two phases, through flocculation of asphaltenes, change in concentration of components in the produced fluids, change in concentration of components in separated hydrocarbons, and/or precipitation of components may cause processing problems (for example, plugging) and/or result in hydrocarbons that do not meet pipeline, transportation, and/or refining specifications. In some embodiments, further treatment of the produced fluids and/or separated hydrocarbons is necessary to produce products with desired properties.

During processing, the P-value of the separated hydrocarbons may be monitored and the stability of the produced fluids and/or separated hydrocarbons may be assessed. Typically, a P-value that is at most 1.0 indicates that flocculation of asphaltenes from the separated hydrocarbons may occur. If the P-value is initially at least 1.0 and such P-value increases or is relatively stable during heating, then this indicates that the separated hydrocarbons are relatively stable.

Liquid hydrocarbon stream 350 may be treated to at least partially remove asphaltenes and/or other compounds that may contribute to instability. Removal of the asphaltenes and/or other compounds that may contribute to instability may inhibit plugging in downstream processing units. Removal of the asphaltenes and/or other compounds that may contribute to instability may enhance processing unit efficiencies and/or prevent plugging of transportation pipelines.

Liquid hydrocarbon stream 350 may enter filtration system 342. Filtration system 342 separates at least a portion of the asphaltenes and/or other compounds that contribute to instability from liquid hydrocarbon stream 350. In some embodiments, filtration system 342 is skid mounted. Skid mounting filtration system 342 may allow the filtration system to be moved from one processing unit to another. In some embodiments, filtration system 342 includes one or more membrane separators, for example, one or more nanofiltration membranes or one or more reverse osmosis membranes. Use of a filtration system that operates at below ambient, ambient, or slightly higher than ambient temperatures may reduce energy costs as compared to conventional catalytic and/or thermal methods to remove asphaltenes from a hydrocarbon stream.

The membranes may be ceramic membranes and/or polymeric membranes. The ceramic membranes may be ceramic membranes having a molecular weight cut off of at most 2000 Daltons (Da), at most 1000 Da, or at most 500 Da. Ceramic membranes may not swell during removal of the desired materials from a substrate (for example, asphaltenes from the liquid stream). In addition, ceramic membranes may be used at elevated temperatures. Examples of ceramic membranes include, but are not limited to, mesoporous titania, mesoporous gamma-alumina, mesoporous zirconia, mesoporous silica, and combinations thereof.

Polymeric membranes may include top layers made of dense membrane and base layers (supports) made of porous membranes. The polymeric membranes may be arranged to allow the liquid stream (permeate) to flow first through the top layers and then through the base layer so that the pressure difference over the membrane pushes the top layer onto the base layer. The polymeric membranes are organophilic or hydrophobic membranes so that water present in the liquid stream is retained or substantially retained in the retentate.

The dense membrane layer of the polymeric membrane may separate at least a portion or substantially all of the asphaltenes from liquid hydrocarbon stream 350. In some embodiments, the dense polymeric membrane has properties such that liquid hydrocarbon stream 350 passes through the membrane by dissolving in and diffusing through the structure of dense membrane. At least a portion of the asphaltenes may not dissolve and/or diffuse through the dense membrane, thus they are removed. The asphaltenes may not dissolve and/or diffuse through the dense membrane because of the complex structure of the asphaltenes and/or their high molecular weight. The dense membrane layer may include cross-linked structure as described in WO 96/27430 to Schmidt et al., which is incorporated by reference herein. A thickness of the dense membrane layer may range from 1 micrometer to 15 micrometers, from 2 micrometers to 10 micrometers, or from 3 micrometers to 5 micrometers.

The dense membrane may be made from polysiloxane, poly-di-methyl siloxane, poly-octyl-methyl siloxane, polyimide, polyaramide, poly-tri-methyl silyl propyne, or mixtures thereof. Porous base layers may be made of materials that provide mechanical strength to the membrane. The porous base layers may be any porous membranes used for ultra filtration, nanofiltration, and/or reverse osmosis. Examples of such materials are polyacrylonitrile, polyamideimide in combination with titanium oxide, polyetherimide, polyvinylidenedifluoroide, polytetrafluoroethylene, or combinations thereof.

During separation of asphaltenes from liquid stream 350, the pressure difference across the membrane may range from about 0.5 MPa to about 6 MPa, from about 1 MPa to about 5 MPa, or from about 2 MPa to about 4 MPa. A temperature of the unit during separation may range from the pour point of liquid hydrocarbon stream 350 up to 100° C., from about −20° C. to about 100° C., from about 10° C. to about 90° C., or from about 20° C. to about 85° C. During continuous operation, the permeate flux rate may be at most 50% of the initial flux, at most 70% of the initial flux, or at most 90% of the initial flux. A weight recovery of the permeate on feed may range from about 50% by weight to 97% by weight, from about 60% by weight to 90% by weight, or from about 70% by weight to 80% by weight.

Filtration system 342 may include one or more membrane separators. The membrane separators may include one or more membrane modules. When two or more membrane separators are used, the separators may be arranged in a parallel configuration to allow feed (retentate) from a first membrane separator to flow into a second membrane separator. Examples of membrane modules include, but are not limited to, spirally wound modules, plate and frame modules, hollow fibers, and tubular modules. Membrane modules are described in Encyclopedia of Chemical Engineering, 4b Ed., 1995, John Wiley & Sons Inc., Vol. 16, pages 158-164. Examples of spirally wound modules are described in, for example, WO/2006/040307 to Boestert et al., U.S. Pat. Nos. 5,102,551 to Pasternak; 5,093,002 to Pasternak; 5,275,726 to Feimer et al.; 5,458,774 to Mannapperuma; and 5,150,118 to Finkle et al, all of which are incorporated by reference herein.

In some embodiments, a spirally wound module is used when a dense membrane is used in filtration system 342. A spirally wound module may include a membrane assembly of two membrane sheets between which a permeate spacer sheet is sandwiched. The membrane assembly may be sealed at three sides. The fourth side is connected to a permeate outlet conduit such that the area between the membranes is in fluid communication with the interior of the conduit. A feed spacer sheet may be arranged on top of one of the membranes. The assembly with feed spacer sheet is rolled up around the permeate outlet conduit to form a substantially cylindrical spirally wound membrane module. The feed spacer may have a thickness of at least 0.6 mm, at least 1 mm, or at least 3 mm to allow sufficient membrane surface to be packed into the spirally wound module. In some embodiments, the feed spacer is a woven feed spacer. During operation, the feed mixture may be passed from one end of the cylindrical module between the membrane assemblies along the feed spacer sheet sandwiched between feed sides of the membranes. Part of the feed mixture passes through either one of the membrane sheets to the permeate side. The resulting permeate flows along the permeate spacer sheet into the permeate outlet conduit.

In some embodiments, the membrane separation is a continuous process. Liquid stream 350 passes over the membrane due to the pressure difference to obtain filtered liquid stream 360 (permeate) and/or recycle liquid stream 362 (retentate). In some embodiments, filtered liquid stream 360 may have reduced concentrations of asphaltenes and/or high molecular weight compounds that may contribute to phase instability. Continuous recycling of recycle liquid stream 362 through the filter system can increase the production of filtered liquid stream 360 to as much as 95% of the original volume of filtered liquid stream 360. Recycle liquid stream 362 may be continuously recycled through a spirally wound membrane module for at least 10 hours, for at least one day, or for at least one week without cleaning the feed side of the membrane. Upon completion of the filtration, asphaltene enriched stream 364 (retentate) may include a high concentration of asphaltenes and/or high molecular weight compounds.

In some embodiments, liquid stream 338 is contacted with hydrogen in the presence of one or more catalysts to change one or more desired properties of the crude feed to meet transportation and/or refinery specifications using known hydrodemetallation, hydrodesulfurization, hydrodenitrofication techniques. Other methods to change one or more desired properties of the crude feed are described in U.S. Published Patent Applications Nos. 2005-0133414; 2006-0231465; and 2007-0000810 to Bhan et al.; 2005-0133405 to Wellington et al.; and 2006-0289340 to Brownscombe et al., all of which are incorporated by reference herein.

In some embodiments, the hydrotreated liquid stream has a nitrogen compound content of at most 200 ppm by weight, at most 150 ppm, at most 110 ppm, at most 50 ppm, or at most 10 ppm of nitrogen compounds. The separated liquid stream may have a sulfur compound content of at most 1000 ppm, at most 500 ppm, at most 300 ppm, at most 100 ppm, or at most 10 ppm by weight of sulfur compounds.

As shown in FIG. 7 and FIG. 8, liquid stream 338 and/or filtered liquid stream 344 may enter hydrotreating unit 358. In some embodiments, hydrogen source 376 enters hydrotreating unit 358 in addition to liquid stream 338 and/or filtered liquid stream 344. In some embodiments, the hydrogen source is not needed. Liquid stream 338 and/or filtered liquid stream 344 may be selectively hydrogenated in hydrotreating unit 358 such that di-olefins are reduced to mono-olefins. For example, liquid stream 338 and/or filtered liquid stream 344 is contacted with hydrogen in the presence of DN-200 (Criterion Catalysts & Technologies, Houston Tex., U.S.A.) at temperatures ranging from 100° C. to 200° C. and total pressures of 0.1 MPa to 40 MPa to produce liquid stream 378. In some embodiments, filtered liquid stream 344 is hydrotreated at a temperature ranging from about 190° C. to about 200° C. at a pressure of at least 6 MPa. Liquid stream 378 includes a reduced content of di-olefins and an increased content of mono-olefins relative to the di-olefin and mono-olefin content of liquid stream 338. In some embodiments, the conversion of di-olefins to mono-olefins under these conditions is at least 50%, at least 60%, at least 80% or at least 90%. Liquid stream 378 exits hydrotreating unit 358 and enters one or more processing units positioned downstream of hydrotreating unit 358. The units positioned downstream of hydrotreating unit 358 may include distillation units, catalytic reforming units, hydrocracking units, hydrotreating units, hydrogenation units, hydrodesulfurization units, catalytic cracking units, delayed coking units, gasification units, or combinations thereof. In some embodiments, hydrotreating prior to fractionation is not necessary. In some embodiments, liquid stream 378 may be severely hydrotreated to remove undesired compounds from the liquid stream prior to fractionation. In certain embodiments, liquid stream 378 may be fractionated and the produced streams may each be hydrotreated to meet industry standards and/or transportation standards.

Liquid stream 378 may exit hydrotreating unit 358 and enter fractionation unit 380. In fractionation unit 380, liquid stream 378 may be distilled to form one or more crude products. Crude products include, but are not limited to, $C_3$-$C_5$ hydrocarbon stream 382, naphtha stream 384, kerosene stream 386, diesel stream 388, and bottoms stream 354. Fractionation unit 380 may be operated at atmospheric and/or under vacuum conditions.

In some embodiments, hydrotreated liquid streams and/or streams produced from fractions (for example, aromatic rich streams, distillates and/or naphtha) are blended with the in situ heat treatment process liquid and/or formation fluid to produce a blended fluid. The blended fluid may have enhanced physical stability and chemical stability as compared to the formation fluid. The blended fluid may have a reduced amount of reactive species (for example, di-olefins, other olefins and/or compounds containing oxygen, sulfur and/or nitrogen) relative to the formation fluid. Thus, chemical stability of the blended fluid is enhanced. The blended fluid may decrease an amount of asphaltenes relative to the formation fluid. Thus, physical stability of the blended fluid is enhanced. The blended fluid may be a more a fungible feed than the formation fluid and/or the liquid stream produced from the in situ heat treatment process. The blended feed may be more suitable for transportation, for use in chemical processing units and/or for use in refining units than formation fluid.

In some embodiments, a fluid produced by methods described herein from an oil shale formation may be blended with heavy oil/tar sands in situ heat treatment process (IHTP) fluid. Blended fluids may have properties (for example, viscosity and/or P-value) that make the blended fluid more acceptable for transportation and/or distribution to processing units. In some embodiments, produced oil shale fluid may be blended with bitumen to produce a blended bitumen having acceptable viscosity and/or stability properties. Thus, the blended bitumen may be transported and/or distributed to processing units.

As shown in FIG. 7 and FIG. 8, $C_3$-$C_5$ hydrocarbon stream 382 produced from fractionation unit 380 and/or hydrocarbon gas stream 224 enter alkylation unit 396. In alkylation unit 396, reaction of the olefins in hydrocarbon gas stream 224 (for example, propylene, butylenes, amylenes, or combinations thereof) with the iso-paraffins in $C_3$-$C_5$ hydrocarbon stream 382 produces hydrocarbon stream 398. In some embodiments, the olefin content in hydrocarbon gas stream 224 is acceptable and an additional source of olefins is not needed. Hydrocarbon stream 398 includes hydrocarbons having a carbon number of at least 4. Hydrocarbons having a carbon number of at least 4 include, but are not limited to, butanes, pentanes, hexanes, heptanes, and octanes. In certain embodiments, hydrocarbons produced from alkylation unit 396 have an octane number greater than 70, greater than 80, or greater than 90. In some embodiments, hydrocarbon stream 398 is suitable for use as gasoline without further processing.

In some embodiments, and as depicted in FIG. 7 and FIG. 8, bottoms stream 354 may be hydrocracked to produce naphtha and/or other products. The resulting naphtha may, however, need reformation to alter the octane level so that the product may be sold commercially as gasoline. Alternatively, bottoms stream 354 may be treated in a catalytic cracker to produce naphtha and/or feed for an alkylation unit. In some embodiments, naphtha stream 384, kerosene stream 386, and diesel stream 388 have an imbalance of paraffinic hydrocarbons, olefinic hydrocarbons, and/or aromatic hydrocarbons. The streams may not have a suitable quantity of olefins and/or aromatics for use in commercial products. This imbalance may be changed by combining at least a portion of the streams to form combined stream 400 which has a boiling range distribution from about 38° C. to about 343° C. Catalytically cracking combined stream 400 may produce olefins and/or other streams suitable for use in an alkylation unit and/or other processing units. In some embodiments, naphtha stream 384 is hydrocracked to produce olefins.

Combined stream 400 and bottoms stream 354 from fractionation unit 380 enter catalytic cracking unit 402. Under controlled cracking conditions (for example, controlled temperatures and pressures), catalytic cracking unit 402 produces additional $C_3$-$C_5$ hydrocarbon stream 382', gasoline hydrocarbons stream 404, and additional kerosene stream 386'.

Additional $C_3$-$C_5$ hydrocarbon stream 382' may be sent to alkylation unit 396, combined with $C_3$-$C_5$ hydrocarbon stream 382, and/or combined with hydrocarbon gas stream 224 to produce gasoline suitable for commercial sale. In some embodiments, the olefin content in hydrocarbon gas stream 224 is acceptable and an additional source of olefins is not needed.

Many wells are needed for treating the hydrocarbon formation using the in situ heat treatment process. In some embodiments, vertical or substantially vertical wells are formed in the formation. In some embodiments, horizontal or U-shaped wells are formed in the formation. In some embodiments, combinations of horizontal and vertical wells are formed in the formation.

Figure 9:
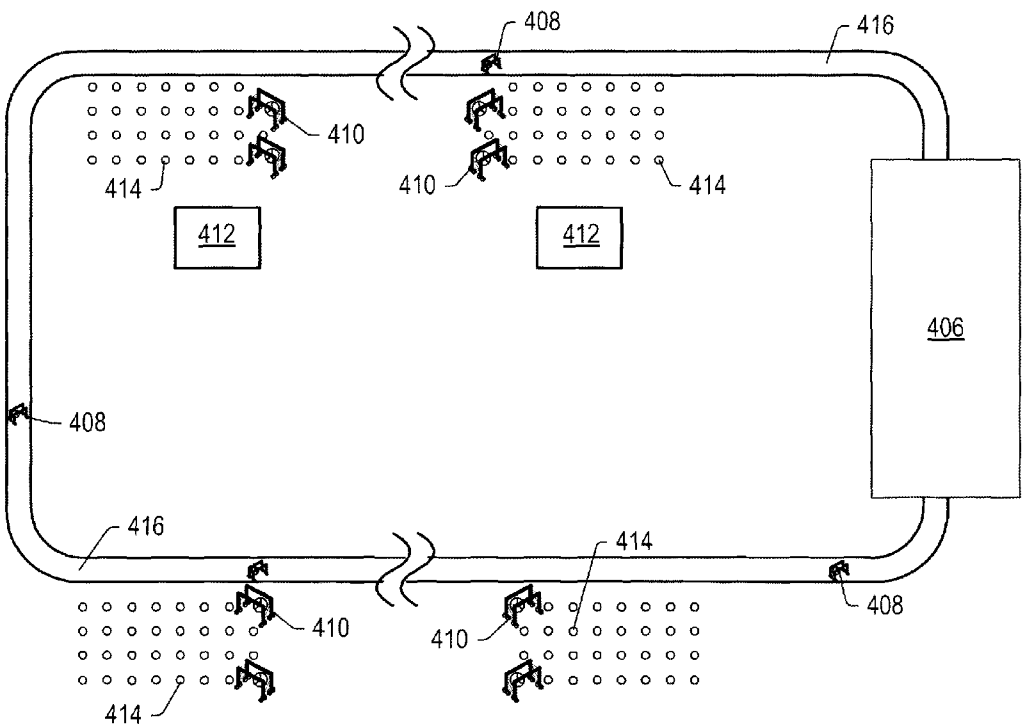
FIG. 9 depicts a schematic representation of an embodiment of a system for forming and transporting tubing to a treatment area.

A manufacturing approach for forming wellbores in the formation may be used due to the large number of wells that need to be formed for the in situ heat treatment process. The manufacturing approach may be particularly applicable for forming wells for in situ heat treatment processes that utilize u-shaped wells or other types of wells that have long non-vertically oriented sections. Surface openings for the wells may be positioned in lines running along one or two sides of the treatment area. FIG. 9 depicts a schematic representation of an embodiment of a system for forming wellbores of the in situ heat treatment process.

The manufacturing approach for forming wellbores may include: 1) delivering flat rolled steel to near site tube manufacturing plant that forms coiled tubulars and/or pipe for surface pipelines; 2) manufacturing large diameter coiled tubing that is tailored to the required well length using electrical resistance welding (ERW), wherein the coiled tubing has customized ends for the bottom hole assembly (BHA) and hang off at the wellhead; 3) deliver the coiled tubing to a drilling rig on a large diameter reel; 4) drill to total depth with coil and a retrievable bottom hole assembly; 5) at total depth, disengage the coil and hang the coil on the wellhead; 6) retrieve the BHA; 7) launch an expansion cone to expand the coil against the formation; 8) return empty spool to the tube manufacturing plant to accept a new length of coiled tubing; 9) move the gantry type drilling platform to the next well location; and 10) repeat.

In situ heat treatment process locations may be distant from established cities and transportation networks. Transporting formed pipe or coiled tubing for wellbores to the in situ process location may be untenable due to the lengths and quantity of tubulars needed for the in situ heat treatment process. One or more tube manufacturing facilities 406 may be formed at or near to the in situ heat treatment process location. The tubular manufacturing facility may form plate steel into coiled tubing. The plate steel may be delivered to tube manufacturing facilities 406 by truck, train, ship or other transportation system. In some embodiments, different sections of the coiled tubing may be formed of different alloys. The tubular manufacturing facility may use ERW to longitudinally weld the coiled tubing.

Tube manufacturing facilities 406 may be able to produce tubing having various diameters. Tube manufacturing facilities may initially be used to produce coiled tubing for forming wellbores. The tube manufacturing facilities may also be used to produce heater components, piping for transporting formation fluid to surface facilities, and other piping and tubing needs for the in situ heat treatment process.

Tube manufacturing facilities 406 may produce coiled tubing used to form wellbores in the formation. The coiled tubing may have a large diameter. The diameter of the coiled tubing may be from about 4 inches to about 8 inches in diameter. In some embodiments, the diameter of the coiled tubing is about 6 inches in diameter. The coiled tubing may be placed on large diameter reels. Large diameter reels may be needed due to the large diameter of the tubing. The diameter of the reel may be from about 10 m to about 50 m. One reel may hold all of the tubing needed for completing a single well to total depth.

In some embodiments, tube manufacturing facilities 406 has the ability to apply expandable zonal inflow profiler (EZIP) material to one or more sections of the tubing that the facility produces. The EZIP material may be placed on portions of the tubing that are to be positioned near and next to aquifers or high permeability layers in the formation. When activated, the EZIP material forms a seal against the formation that may serve to inhibit migration of formation fluid between different layers. The use of EZIP layers may inhibit saline formation fluid from mixing with non-saline formation fluid.

The size of the reels used to hold the coiled tubing may prohibit transport of the reel using standard moving equipment and roads. Because tube manufacturing facility 406 is at or near the in situ heat treatment location, the equipment used to move the coiled tubing to the well sites does not have to meet existing road transportation regulations and can be designed to move large reels of tubing. In some embodiments the equipment used to move the reels of tubing is similar to cargo gantries used to move shipping containers at ports and other facilities. In some embodiments, the gantries are wheeled units. In some embodiments, the coiled tubing may be moved using a rail system or other transportation system.

The coiled tubing may be moved from the tubing manufacturing facility to the well site using gantries 408. Drilling gantry 410 may be used at the well site. Several drilling gantries 410 may be used to form wellbores at different locations. Supply systems for drilling fluid or other needs may be coupled to drilling gantries 410 from central facilities 412.

Drilling gantry 410 or other equipment may be used to set the conductor for the well. Drilling gantry 410 takes coiled tubing, passes the coiled tubing through a straightener, and a BHA attached to the tubing is used to drill the wellbore to depth. In some embodiments, a composite coil is positioned in the coiled tubing at tube manufacturing facility 406. The composite coil allows the wellbore to be formed without having drilling fluid flowing between the formation and the tubing. The composite coil also allows the BHA to be retrieved from the wellbore. The composite coil may be pulled from the tubing after wellbore formation. The composite coil may be returned to the tubing manufacturing facility to be placed in another length of coiled tubing. In some embodiments, the BHAs are not retrieved from the wellbores.

In some embodiments, drilling gantry 410 takes the reel of coiled tubing from gantry 408. In some embodiments, gantry 408 is coupled to drilling gantry 410 during the formation of the wellbore. For example, the coiled tubing may be fed from gantry 408 to drilling gantry 410, or the drilling gantry lifts the gantry to a feed position and the tubing is fed from the gantry to the drilling gantry.

The wellbore may be formed using the bottom hole assembly, coiled tubing and the drilling gantry. The BHA may be self-seeking to the destination. The BHA may form the opening at a fast rate. In some embodiments, the BHA forms the opening at a rate of about 100 meters per hour.

After the wellbore is drilled to total depth, the tubing may be suspended from the wellhead. An expansion cone may be used to expand the tubular against the formation. In some embodiments, the drilling gantry is used to install a heater and/or other equipment in the wellbore.

When drilling gantry 410 is finished at well site 414, the drilling gantry may release gantry 408 with the empty reel or return the empty reel to the gantry. Gantry 408 may take the empty reel back to tube manufacturing facility 406 to be loaded with another coiled tube. Gantries 408 may move on looped path 416 from tube manufacturing facility 406 to well sites 414 and back to the tube manufacturing facility.

Drilling gantry 410 may be moved to the next well site. Global positioning satellite information, lasers and/or other information may be used to position the drilling gantry at desired locations. Additional wellbores may be formed until all of the wellbores for the in situ heat treatment process are formed.

In some embodiments, positioning and/or tracking system may be utilized to track gantries 408, drilling gantries 410, coiled tubing reels and other equipment and materials used to develop the in situ heat treatment location. Tracking systems may include bar code tracking systems to ensure equipment and materials arrive where and when needed.

Directionally drilled wellbores may be formed using steerable motors. Deviations in wellbore trajectory may be made using slide drilling systems or using rotary steerable systems. During use of slide drilling systems, the mud motor rotates the bit downhole with little or no rotation of the drilling string from the surface during trajectory changes. The bottom hole assembly is fitted with a bent sub and/or a bent housing mud motor for directional drilling. The bent sub and the drill bit are oriented in the desired direction. With little or no rotation of the drilling string, the drill bit is rotated with the mud motor to set the trajectory. When the desired trajectory is obtained, the entire drilling string is rotated and drills straight rather than at an angle. Drill bit direction changes may be made by utilizing torque/rotary adjusting to control the drill bit in the desired direction.

By controlling the amount of wellbore drilled in the sliding and rotating modes, the wellbore trajectory may be controlled. Torque and drag during sliding and rotating modes may limit the capabilities of slide mode drilling. Steerable motors may produce tortuosity in the slide mode. Tortuosity may make further sliding more difficult. Many methods have been developed, or are being developed, to improve slide drilling systems. Examples of improvements to slide drilling systems include agitators, low weight bits, slippery muds, and torque/toolface control systems.

Limitations in slide drilling led to the development of rotary steerable systems. Rotary steerable systems allow directional drilling with continuous rotation from the surface, thus making the need to slide the drill string unnecessary. Continuous rotation transfers weight to the drill bit more efficiently, thus increasing the rate of penetration. Current rotary steerable systems may be mechanically and/or electrically complicated with a high cost of delivery due to service companies requiring a high rate of return and due to relatively high failure rates for the systems.

In some embodiments, a dual motor rotary steerable system is used. The dual motor rotary steerable system allows a bent sub and/or bent housing mud motor to change the trajectory of the drilling while the drilling string remains in rotary mode. The dual motor rotary steerable system uses a second motor in the bottom hole assembly to rotate a portion of the bottom hole assembly in a direction opposite to the direction of rotation of the drilling string. The addition of the second motor may allow continuous forward rotation of a drilling string while simultaneously controlling the drill bit and, thus, the directional response of the bottom hole assembly. In some embodiments, the rotation speed of the drilling string is used in achieving drill bit control.

Figure 10:
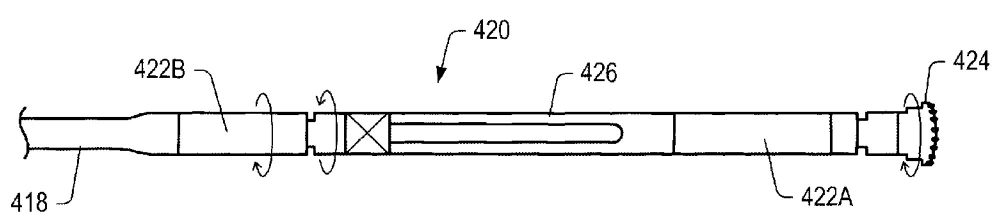
FIG. 10 depicts an embodiment of a drilling string with dual motors on a bottom hole assembly.

FIG. 10 depicts a schematic representation of an embodiment of drilling string 418 with dual motors in bottom hole assembly 420. Drilling string 418 is coupled to bottom hole assembly 420. Bottom hole assembly 420 includes motor 422A and motor 422B. Motor 422A may be a bent sub and/or bent housing steerable mud motor. Motor 422A may drive drill bit 424. Motor 422B may operate in a rotation direction that is opposite to the rotation of drilling string 418 and/or motor 422A. Motor 422B may operate at a relatively low rotary speed and have high torque capacity as compared to motor 422A. Bottom hole assembly 420 may include sensing array 426 between motors 422A, motor 422B.

As noted above, motor 422B may rotate in a direction opposite to the rotation of drilling string 418. In this manner, portions of bottom hole assembly 420 beyond motor 422B may have less rotation in the direction of rotation of drilling string 418. The revolutions per minute (rpm) versus differential pressure relationship for bottom hole assembly 420 may be assessed prior to running drilling string 418 and the bottom hole assembly 420 in the formation to determine the differential pressure at neutral drilling speed (when the drilling string speed is equal and opposite to the speed of motor 422B). Measured differential pressure may be used by a control system during drilling to control the speed of the drilling string relative to the neutral drilling speed.

In some embodiments, motor 422B is operated at a substantially fixed speed. For example, motor 422B may be operated at a speed of 30 rpm. Other speeds may be used as desired.

In some embodiments, a mud motor is installed in a bottom hole assembly in an inverted orientation (for example, upside-down from the normal orientation). The inverted mud motor may be operated in a reverse direction of rotation relative to other mud motors, a drill bit, and/or a drilling string. For example, motor 422B, shown in FIG. 10, may be installed in an inverted orientation to produce a relative counter-clockwise rotation in portions of bottom hole assembly 420 distal to motor 422B (see counterclockwise arrow). Installing a mud motor in an inverted orientation may allow for the use of off-the-shelf motors to produce counter-rotation and/or non-rotation of selected elements of the bottom hole assembly. In one embodiment, a threading kit is used to adapt a threaded mounting for mud motor to ensure that a secure connection between an inverted mud motor and its mounting is maintained during drilling (e.g., by reversing the threads).

In some embodiments, the rotation speed of drilling string 418 is used to control the trajectory of the wellbore being formed. For example, drilling string 418 may initially be rotating at 40 rpm, and motor 422B rotates at 30 rpm. The counter-rotation of motor 422B and drilling string 418 results in a forward rotation speed (for example, an absolute forward rotation speed) of 10 rpm in the lower portion of bottom hole assembly 420 (the portion of the bottom hole assembly below motor 422B). When a directional course correction is to be made, the speed of drilling string 418 is changed to the neutral drilling speed. Because drilling string 418 is rotating, there is no need to lift drill bit 424 off the bottom of the borehole. Operating at neutral drilling speed may effectively cancel the torque of the drilling string so that drill bit 424 is subjected to torque induced by motor 422A and the formation.

Figure 11:
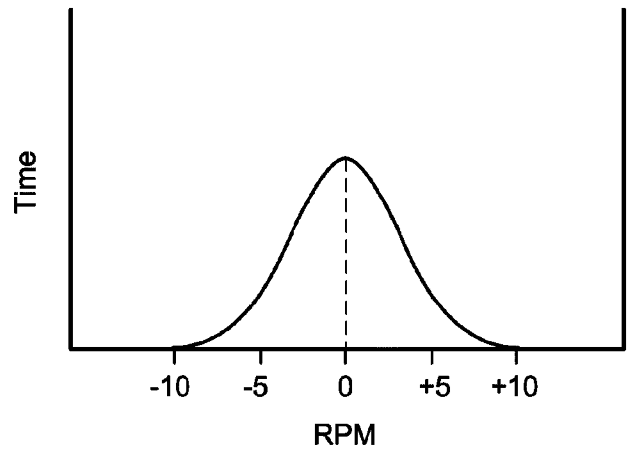
FIG. 11 depicts time versus rpm (revolutions per minute) for a conventional steerable motor bottom hole assembly during a drill bit direction change.
Figure 12:
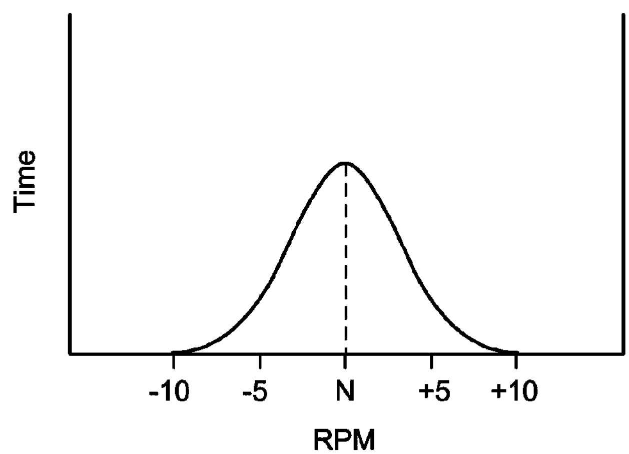
FIG. 12 depicts time versus rpm for a dual motor bottom hole assembly during a drill bit direction change.

The continuous rotation of drilling string 418 keeps windup of the drilling string consistent and stabilizes drill bit 424. Directional changes of drill bit 424 may be made by changing the speed of drilling string 418. Using a dual motor rotary steerable system allows the changing of the direction of the drilling string to occur while the drilling string rotates at or near the normal operating rotation speed of drilling string 418. FIG. 11 depicts time at drilling string rotation during direction change versus rotation speed (rpm) of the drilling string for a conventional steerable motor bottom hole assembly during a drill bit direction change. FIG. 12 depicts time at rotation speed during directional change versus change in drilling string rotating speed for the dual motor drilling string during the drill bit direction change. Drill bit control may be substantially the same as for conventional slide mode drilling where torque/rotary adjustment is used to control the drill bit in the desired direction, but to the effect that 0 rpm on the x-axis of FIG. 11 becomes N (the neutral drilling string speed) in FIG. 12.

The connection of bottom hole assembly 420 to drilling string 418 of the dual motor rotary steerable system depicted in FIG. 10 may be subjected to the net effect of all the torque components required to rotate the entire bottom hole assembly (including torque generated at drill bit 424 during wellbore formation). Threaded connections along drilling string 418 may include profile-matched sleeves such as those known in the art for utilities drilling systems.

In some embodiments, a control system used to control wellbore formation includes a system that sets a desired rotation speed of drilling string 418 when direction changes in trajectory of the wellbore are to be implemented. The system may include fine tuning of the desired drilling string rotation speed.

In certain embodiments, drilling string 418 is integrated with position measurement and down hole tools (for example, sensing array 426) to autonomously control the hole path along a designed geometry. An autonomous control system for controlling the path of drilling string 418 may utilize two or more domains of functionality. In one embodiment, a control system utilizes at least three domains of functionality including, but not limited to, measurement, trajectory, and control. Measurement may be made using sensor systems and/or other equipment hardware that assess angles, distances, magnetic fields, and/or other data. Trajectory may include flight path calculation and algorithms that utilize physical measurements to calculate angular and spatial offsets of the drilling string. The control system may implement actions to keep the drilling string in the proper path. The control system may include tools that utilize software/control interfaces built into an operating system of the drilling equipment, drilling string and/or bottom hole assembly.

In certain embodiments, the control system utilizes position and angle measurements to define spatial and angular offsets from the desired drilling geometry. The defined offsets may be used to determine a steering solution to move the trajectory of the drilling string (thus, the trajectory of the borehole) back into convergence with the desired drilling geometry. The steering solution may be based on an optimum alignment solution in which a desired rate of curvature of the borehole path is set, and required angle change segments and angle change directions for the path are assessed (for example, by computation).

In some embodiments, the control system uses a fixed angle change rate associated with the drilling string, assesses the lengths of the sections of the drilling string, and assesses the desired directions of the drilling to autonomously execute and control movement of the drilling string. Thus, the control system assesses position measurements and controls of the drilling string to control the direction of the drilling string.

In some embodiments, differential pressure or torque across motor 422A and/or motor 422B is used to control the rate of penetration. A relationship between rate of penetration, weight-on-bit, and torque may be assessed for drilling string 418. Measurements of torque and the rate of penetration/weight-on-bit/torque relationship may be used to control the feed rate of drilling string 418 into the formation.

Accuracy and efficiency in forming wellbores in subsurface formations may be affected by the density and quality of directional data during drilling. The quality of directional data may be diminished by vibrations and angular accelerations during rotary drilling, especially during rotary drilling segments of wellbore formation using slide mode drilling.

Figure 13:
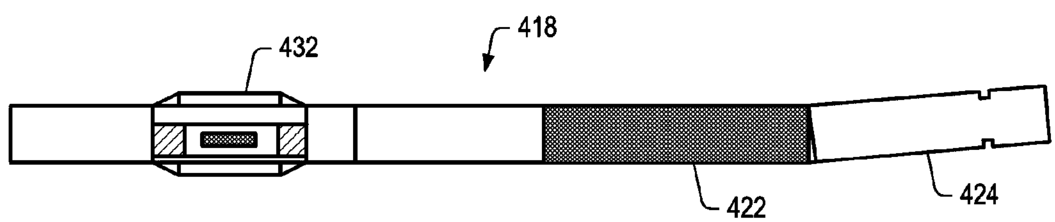
FIG. 13 depicts an embodiment of a drilling string with a non-rotating sensor.

In certain embodiments, the quality of the data assessed during rotary drilling is increased by installing directional sensors in a non-rotating housing. FIG. 13 depicts an embodiment of drilling string 418 with non-rotating sensor 432. Non-rotating sensor 432 is located behind motor 422. Motor 422 may be a steerable motor. Motor 422 is located behind drill bit 424. In certain embodiments, sensor 432 is located between non-magnetic components in drilling string 418.

In some embodiments, non-rotating sensor 432 is located in a sleeve over motor 422. In some embodiments, non-rotating sensor 432 is run on a bottom hole assembly for improved data assessment. In an embodiment, a non-rotating sensor is coupled to and/or driven by a motor that produces relative counter-rotation of the sensor relative to other components of the bottom hole assembly. For example, a sensor may be coupled to motor having a rotation speed equal and opposite to that of bottom hole assembly housing to which it is attached so that the absolute rotation speed of the sensor is or is substantially zero. In certain embodiments, the motor for a sensor is a mud motor installed in an inverted orientation such as described above relative to FIG. 10.

In certain embodiments, non-rotating sensor 432 includes one or more transceivers for communicating data either into drilling string 418 within the bottom hole assembly or to similar transceivers in nearby boreholes. The transceivers may be used for telemetry of data and/or as a means of position assessment or verification. In certain embodiments, use of non-rotating sensor 432 is used for continuous position measurement. Continuous position measurement may be useful in control systems used for drilling position systems and/or umbilical position control.

Figure 14:
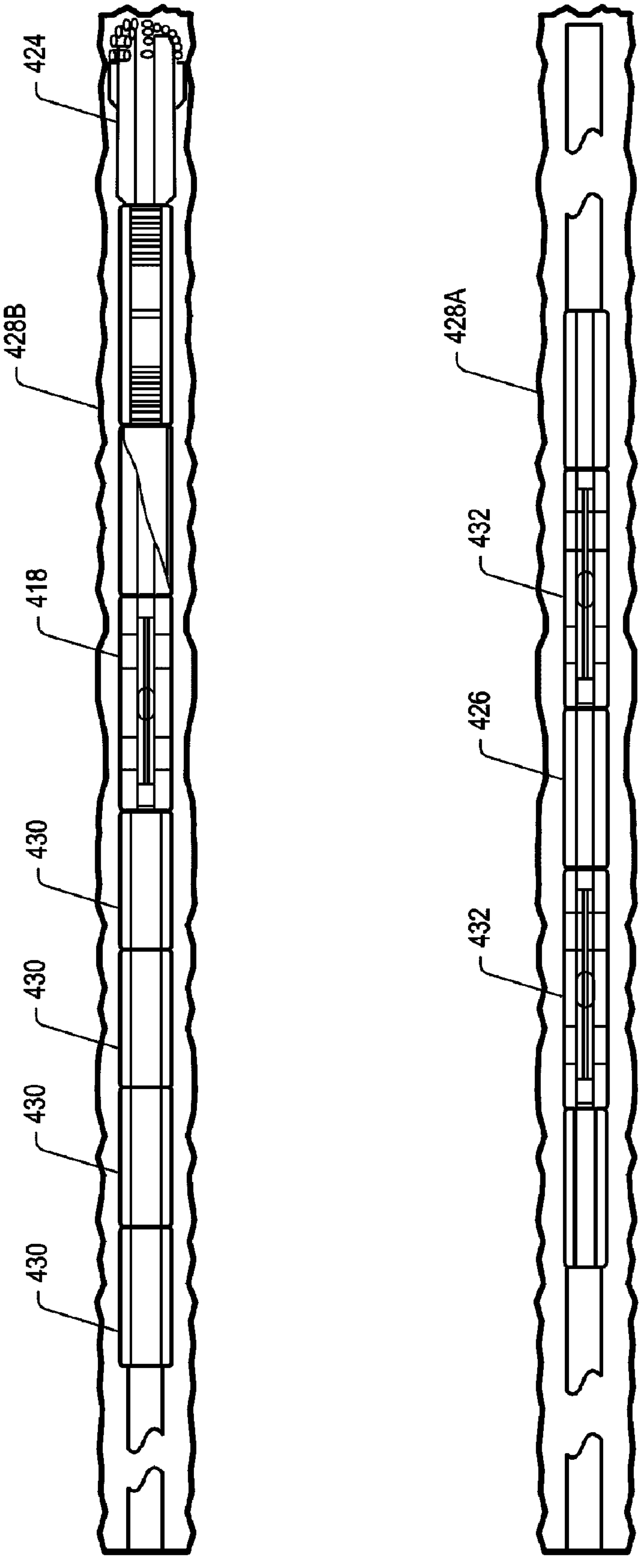
FIG. 14 depicts an embodiment for assessing a position of a first wellbore relative to a second wellbore using multiple magnets.

FIG. 14 depicts an embodiment for assessing a position of a first wellbore relative to a second wellbore using multiple magnets. First wellbore 428A is formed in a subsurface formation. Wellbore 428A may be formed by directionally drilling in the formation along a desired path. For example, wellbore 428A may be horizontally or vertically drilled, or drilled at an inclined angle, in the subsurface formation.

Second wellbore 428B may be formed in the subsurface formation with drill bit 424 on drilling string 418. In certain embodiments, drilling string 418 includes one or more magnets 430. Wellbore 428B may be formed in a selected relationship to wellbore 428A. In certain embodiments, wellbore 428B is formed substantially parallel to wellbore 428A. In other embodiments, wellbore 428B is formed at other angles relative to wellbore 428A. In some embodiments, wellbore 428B is formed perpendicular to wellbore 428A.

In certain embodiments, wellbore 428A includes sensing array 426. Sensing array 426 may include two or more sensors 432. Sensors 432 may sense magnetic fields produced by magnets 430 in wellbore 428B. The sensed magnetic fields may be used to assess a position of wellbore 428A relative to wellbore 428B. In some embodiments, sensors 432 measure two or more magnetic fields provided by magnets 430.

Two or more sensors 432 in wellbore 428A may allow for continuous assessment of the relative position of wellbore 428A versus wellbore 428B. Using two or more sensors 432 in wellbore 428A may also allow the sensors to be used as gradiometers. In some embodiments, sensors 432 are positioned in advance (ahead of) magnets 430. Positioning sensors 432 in advance of magnets 430 allows the magnets to traverse past the sensors so that the magnet's position (the position of wellbore 428B) is measurable continuously or "live" during drilling of wellbore 428B. Sensing array 426 may be moved intermittently (at selected intervals) to move sensors 432 ahead of magnets 430. Positioning sensors 432 in advance of magnets 430 also allows the sensors to measure, store, and zero the Earth's field before sensing the magnetic fields of the magnets. The Earth's field may be zeroed by, for example, using a null function before arrival of the magnets, calculating background components from a known sensor attitude, or using paired sensors that function as gradiometers.

The relative position of wellbore 428B versus wellbore 428A may be used to adjust the drilling of wellbore 428B using drilling string 418. For example, the direction of drilling for wellbore 428B may be adjusted so that wellbore 428B remains a set distance away from wellbore 428A and the wellbores remain substantially parallel. In certain embodiments, the drilling of wellbore 428B is continuously adjusted based on continuous position assessments made by sensors 432. Data from drilling string 418 (for example, orientation, attitude, and/or gravitational data) may be combined or synchronized with data from sensors 432 to continuously assess the relative positions of the wellbores and adjust the drilling of wellbore 428B accordingly. Continuously assessing the relative positions of the wellbores may allow for coiled tubing drilling of wellbore 428B.

In some embodiments, drilling string 418 may include two or more sensing arrays. The sensing arrays may include two or more sensors. Using two or more sensing arrays in drilling string 418 may allow for direct measurement of magnetic interference of magnets 430 on the measurement of the Earth's magnetic field. Directly measuring any magnetic interference of magnets 430 on the measurement of the Earth's magnetic field may reduce errors in readings (for example, error to pointing azimuth). The direct measurement of the field gradient from the magnets from within drill string 418 also provides confirmation of reference field strength of the field to be measured from within wellbore 428A.

Figure 15:
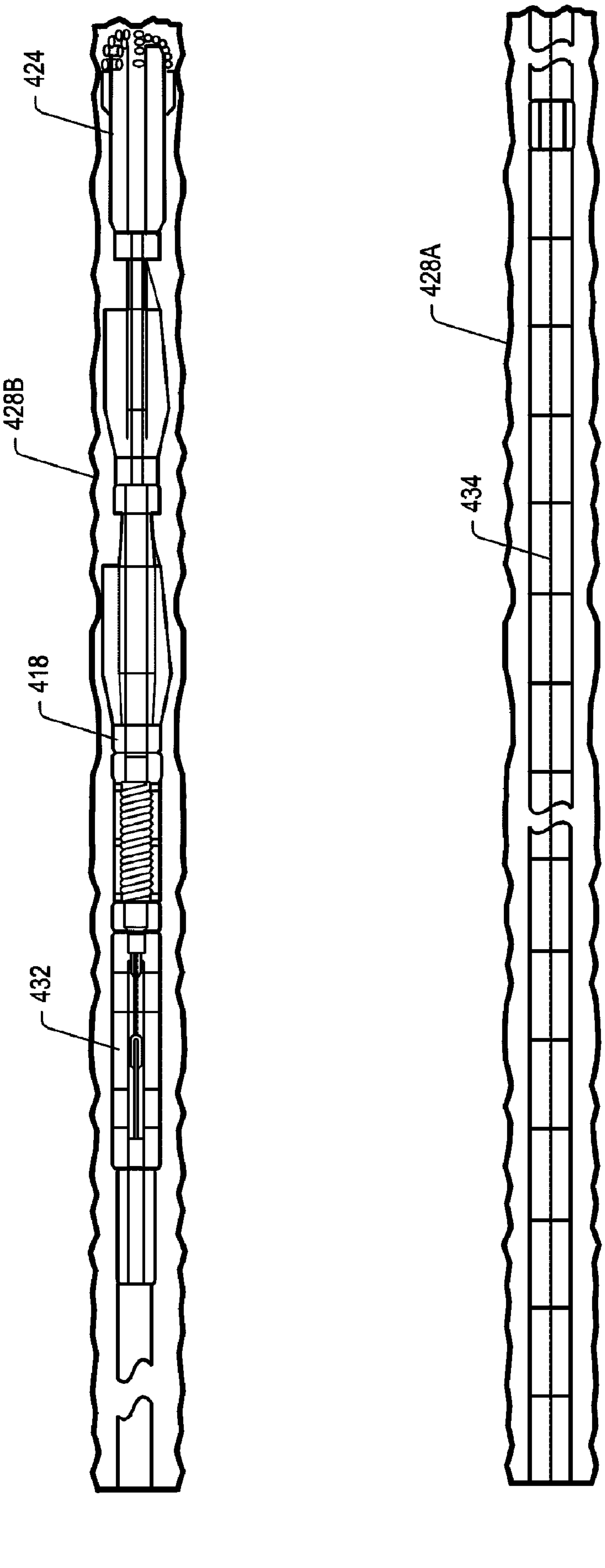
FIG. 15 depicts an embodiment for assessing a position of a first wellbore relative to a second wellbore using a continuous pulsed signal.

FIG. 15 depicts an embodiment for assessing a position of a first wellbore relative to a second wellbore using a continuous pulsed signal. Signal wire 434 may be placed in wellbore 428A. Sensor 432 may be located in drilling string 418 in wellbore 428B. In certain embodiments, wire 434 provides a current path and/or reference voltage signal (for example, a pulsed DC reference signal) into wellbore 428A. In one embodiment, the reference voltage signal is a 10 Hz pulsed DC signal. In one embodiment, the reference voltage signal is a 5 Hz pulsed DC signal. In some embodiments, the reference voltage signal is between 0.5 Hz pulsed DC signal and 0.75 Hz pulsed DC signal. Providing the current path and reference voltage signal may generate a known and, in some embodiments, fixed current in wellbore 428A. In some embodiments, the voltage signal is automatically varied on the surface to generate a uniform fixed current in the wellbore. Automatically varying the voltage signal on the surface may minimize bandwidth needs by reducing or eliminating the need to send current downhole and/or sensor raw data uphole.

In some embodiments, wire 434 carries current into and out of wellbore 428A (the forward and return conductors are both on the wire). In some embodiments, wire 434 carries current into wellbore 428A and the current is returned on a casing in the wellbore (for example, the casing of a heater or production conduit in the wellbore). In some embodiments, wire 434 carries current into wellbore 428A and the current is returned on another conductor located in the formation. For example, current flows from wire 434 in wellbore 428A through the formation to an electrode (current return) in the formation. In certain embodiments, current flows out an end of wellbore 428A. The electrode may be, for example, an electrode in another wellbore in the formation or a bare electrode extending from another wellbore in the formation. The electrode may be the casing in another wellbore in the formation. In some embodiments, wellbore 428A is substantially horizontal in the formation and current flows from wire 434 in the wellbore to a bare electrode extending from a substantially vertical wellbore in the formation.

The electromagnetic field provided by the voltage signal may be sensed by sensor 432. The sensed signal may be used to assess a position of wellbore 428B relative to wellbore 428A.

In some embodiments, wire 434 is a ranging wire located in wellbore 428A. In some embodiments, the voltage signal is provided by an electrical conductor that will be used as part of a heater in wellbore 428A. In some embodiments, the voltage signal is provided by an electrical conductor that is part of a heater or production equipment located in wellbore 428A. Wire 434, or other electrical conductors used to provide the voltage signal, may be grounded so that there is no current return along the wire or in the wellbore. Return current may cancel the electromagnetic field produced by the wire.

Where return current exists, the current may be measured and modeled to generate a "net current" from which a resultant electromagnetic field may be resolved. For example, in some areas, a 600 A signal current may only yield a 3-6 A net current. In some embodiments where it is not feasible to eliminate sufficient return current along the wellbore containing the conductor, two conductors may be installed in separate wellbores. In this method, signal wires from each of the existing wellbores are connected to opposite voltage terminals of the signal generator. The return current path is in this way guided through the earth from the contactor region of one conductor to the other. In certain embodiments, calculations are used to assess (determine) the amount of voltage needed to conduct current through the formation.

In certain embodiments, the reference voltage signal is turned on and off (pulsed) so that multiple measurements are taken by sensor 432 over a selected time period. The multiple measurements may be averaged to reduce or eliminate resolution error in sensing the reference voltage signal. In some embodiments, providing the reference voltage signal, sensing the signal, and adjusting the drilling based on the sensed signals are performed continuously without providing any data to the surface or any surface operator input to the downhole equipment. For example, an automated system located downhole may be used to perform all the downhole sensing and adjustment operations. In some embodiments, an iterative process is used to perform calculations used in the automated downhole sensing and adjustment operations. In certain embodiments, distance and direction are calculated continuously downhole, filtered and averaged. A best estimate final distance and direction may be output to the surface and combined with known along hole depth and source location to determine three-axis position data.

The signal field generated by the net current passing through the conductors may be resolved from the general background field existing when the signal field is "off". A method for resolving the signal field from the general background field on a continuous basis may include: 1.) calculating background components based on the known attitude of the sensors and the known value background field strength and dip; 2.) a synchronized "null" function to be applied immediately before the reference field is switched "on"; 3.) Synchronized sampling of forward and reversed DC polarities (the subtraction of these sampled values may effectively remove the background field yielding the reference total current field); and/or 4.) Sampling values of background magnetic field at one or more fixed sampling frequencies and storing them for subtraction from the reference signal "on" data.

In some embodiments, slight changes in the sensor roll position and/or movement of the sensor between sampling steps (for example, between samples of signal off and signal on data) is compensated or counteracted by rotating the sensor data coordinate system to a reference attitude (for example, a "zero") after each sample is taken or after a set of data is taken. For example, the sensor data coordinate system may be rotated to a tensor coordinate system. Parameters such as position, inclination, roll, and/or azimuth of the sensor may be calculated using sensor data rotated to the tensor coordinate system. In some embodiments, adjustments in calculations and/or data gathering are made to adjust for sensing and ranging at low wellbore inclination angles (for example, angles near vertical).

Figure 16:
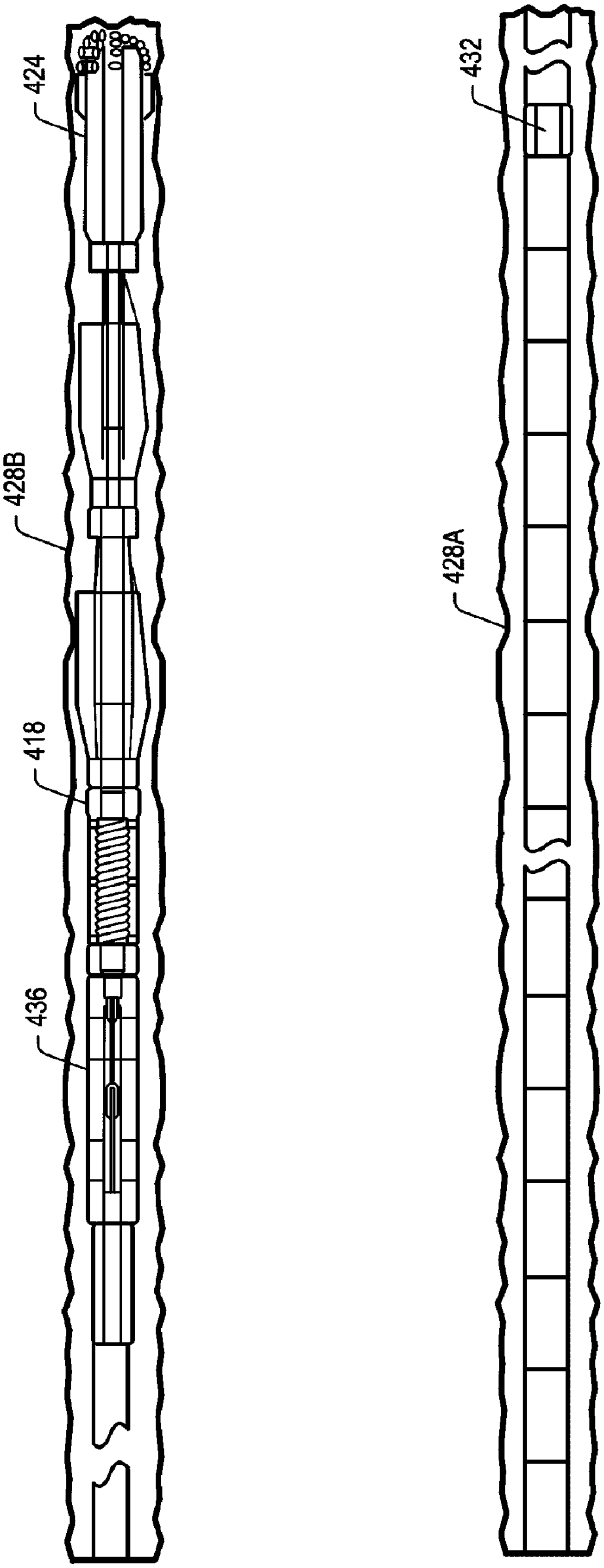
FIG. 16 depicts an embodiment for assessing a position of a first wellbore relative to a second wellbore using a radio ranging signal.

FIG. 16 depicts an embodiment for assessing a position of a first wellbore relative to a second wellbore using a radio ranging signal. Sensor 432 may be placed in wellbore 428A. Source 436 may be located in drilling string 418 in wellbore 428B. In some embodiments, source 436 is located in wellbore 428A and sensor 432 is located in wellbore 428B. In certain embodiments, source 436 is an electromagnetic wave producing source. For example, source 436 may be an electromagnetic sonde. Sensor 432 may be an antenna (for example, an electromagnetic or radio antenna). In some embodiments sensor 432 is located in part of a heater in wellbore 428A.

The signal provided by source 436 may be sensed by sensor 432. The sensed signal may be used to assess a position of wellbore 428B relative to wellbore 428A. In certain embodiments, the signal is continuously sensed using sensor 432. "Continuous" or "continuously" in the context of sensing signals (such as magnetic, electromagnetic, voltage, or other electrical or magnetic signals) includes sensing continuous signals and sensing pulsed signals repeatedly over a selected period time. The continuously sensed signal may be used to continuously and/or automatically adjust the drilling of wellbore 428B by drillbit 424. The continuous sensing of the electromagnetic signal may be dual directional so as to create a data link between transceivers. The antenna/sensor 432 may be directly connected to a surface interface allowing a data link between surface and subsurface to be established.

In some embodiments, source 436 and/or sensor 432 are sources and sensors used in a walkover radio locater system. Walkover radio locater systems are, for example, used in telecommunications to locate underground lines and to communicate the location to drilling tools used for utilities installation. Radio locater systems may be available, for example, from Digital Control Incorporated (Kent, Wash., U.S.A.). In some embodiments, the walkover radio located system components may be modified to be located in wellbore 428A and wellbore 428B so that the relative positions of the wellbores are assessable using the walkover radio located system components.

Figure 17:
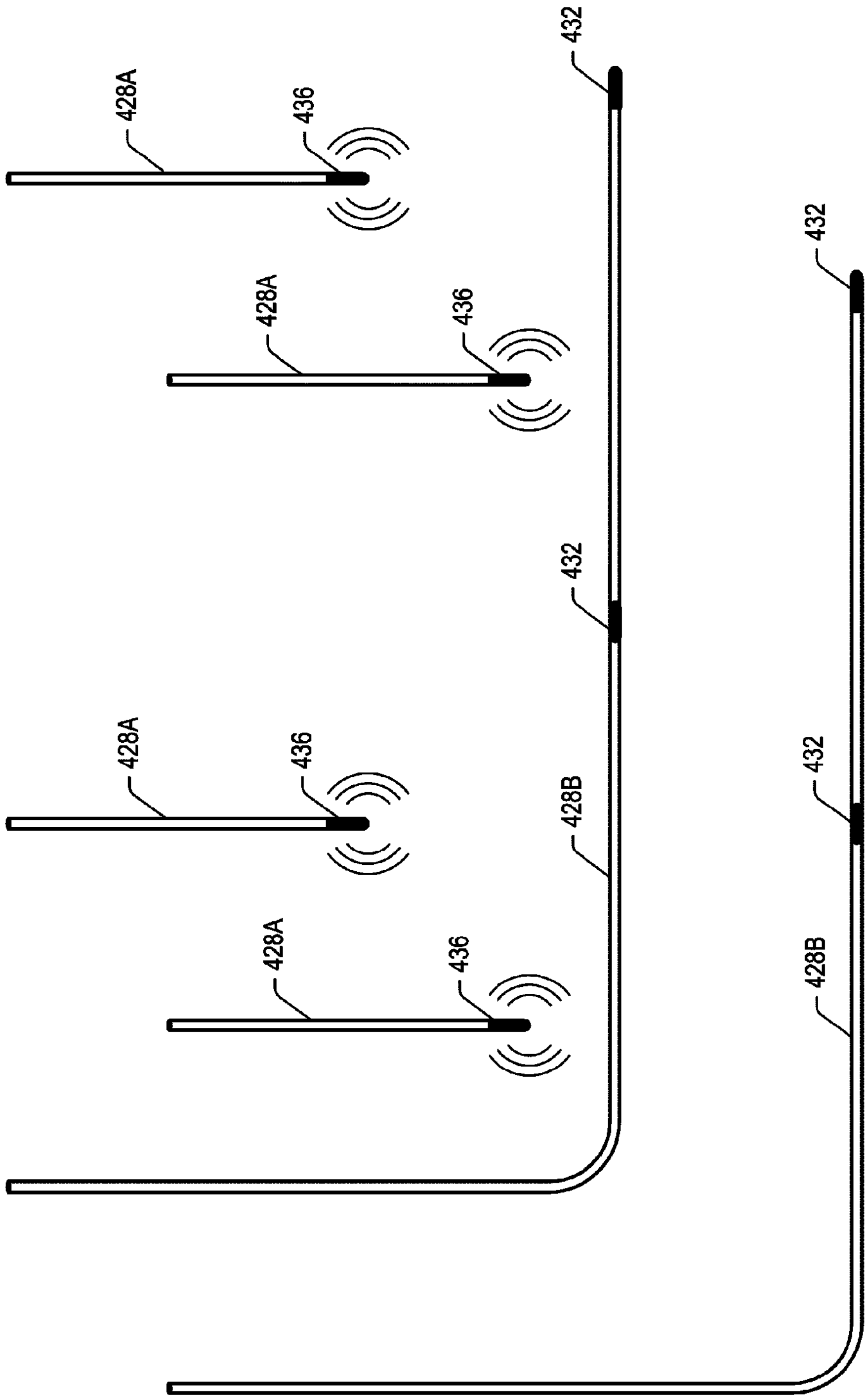
FIG. 17 depicts an embodiment for assessing a position of a plurality of first wellbores relative to a plurality of second wellbores using radio ranging signals.

In certain embodiments, multiple sources and multiple sensors may be used to assess and adjust the drilling of one or more wellbores. FIG. 17 depicts an embodiment for assessing a position of a plurality of first wellbores relative to a plurality of second wellbores using radio ranging signals. Sources 436 may be located in a plurality of wellbores 428A. Sensors 432 may be located in one or more wellbores 428B. In some embodiments, sources 436 are located in wellbores 428B and sensors 432 are located in wellbores 428A.

In one embodiment, wellbores 428A are drilled substantially vertically in the formation and wellbores 428B are drilled substantially horizontally in the formation. Thus, wellbores 428B are substantially perpendicular to wellbores 428A. Sensors 432 in wellbores 428B may detect signals from one or more of sources 436. Detecting signals from more than one source may allow for more accurate measurement of the relative positions of the wellbores in the formation. In some embodiments, electromagnetic attenuation and phase shift detected from multiple sources is used to define the position of a sensor (and the wellbore). The paths of the electromagnetic radio waves may be predicted to allow detection and use of the electromagnetic attenuation and the phase shift to define the sensor position.

Figure 18:
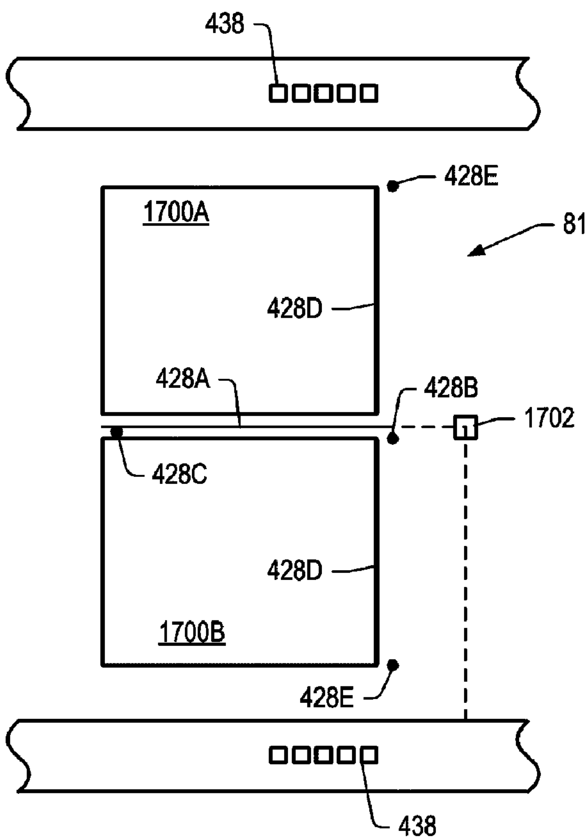
FIG. 18 depicts a top view representation of an embodiment for forming a plurality of wellbores in a formation.

In certain embodiments, continuous pulsed signals and/or radio ranging signals are used to form a plurality of wellbores in a formation. FIG. 18 depicts a top view representation of an embodiment for forming a plurality of wellbores in a formation. Treatment area 816 may include clusters of heaters 438 on opposite sides of the treatment area. Control wellbore 428A may be located at or near the center line of treatment area 816. In certain embodiments, control wellbore 428A is located in a barrier area between heater corridors 1700A, 1700B. Control wellbore 428A may be a horizontal, substantially horizontal, or slightly inclined wellbore. Control wellbore 428A may have a length between about 250 m and about 3000 m, between about 500 m and about 2500 m, or between about 1000 m and about 2000 m.

In certain embodiments, the position (lateral and/or vertical position) of control wellbore 428A in treatment area 816 is assessed relative to vertical wellbores 428B, 428C, of which the position is known. The relative position to vertical wellbores 428B, 428C of control wellbore 428A may be assessed using, for example, continuous pulsed signals and/or radio ranging signals as described herein. In certain embodiments, vertical wellbores 428B, 428C are located within about 10 m, within about 5 m, or within about 3 m of control wellbore 428A.

Heater wellbores 428D may be the first heater wellbores deployed in either corridor 1700A or corridor 1700B. Ranging sources (for example, wire 434, depicted in FIG. 15, or source 436, depicted in FIGS. 16 and 17) and/or sensors (for example, sensors 432, depicted in FIGS. 15-17) located in either heater wellbores 428D and/or control wellbore 428A may be used to assess the positions (lateral and/or vertical) of the heater wellbores relative to the control wellbore. In some embodiments, the ranging systems are deployed inside a conduit provided into control wellbore 428A. In some embodiments, control wellbore 428A acts as a current return for electrical current flowing from heater wellbores 428D. Control wellbore 428A may include a steel casing or other metal element that allows current to flow into the wellbore. The current may be returned to the surface through control wellbore 428A to complete the electrical circuit used for ranging (as shown by the dotted lines in FIG. 18).

In certain embodiments, the position of heater wellbores 428D are further assessed using ranging from vertical wellbores 428E. Assessing the position of heater wellbores 428D relative to vertical wellbores 428E may be used to verify position data from ranging from control wellbore 428A. Vertical wellbores 428B, 428C, 428E may have depths that are at least the depth of heater wellbores 428D and/or control wellbore 428A. In certain embodiments, vertical wellbores 428E are located within about 10 m, within about 5 m, or within about 3 m of heater wellbores 428D.

After heater wellbores 428D are formed in treatment area 816, additional heater wellbores may be formed in corridor 1700A and/or corridor 1700B. The additional heater wellbores may be formed using heater wellbores 428D and/or control wellbore 428A as guides. For example, ranging systems may be located in heater wellbores 428D and/or control wellbore 428A to assess and/or adjust the relative position of the additional heater wellbores while the additional heater wellbores are being formed.

In some embodiments, central monitoring system 1702 is coupled to control wellbore 428A. In certain embodiments, central monitoring system 1702 includes a geomagnetic monitoring system. Central monitoring system 1702 may be located at a known location relative to control wellbore 428A and heater wellbores 428D. The known location may include known alignment azimuths from control wellbore 428A. For example, the known location may include north-south alignment azimuths, east-west alignment azimuths, and any heater wellbore alignment azimuth that is intended for corridor 1700A and/or corridor 1700B (for example, azimuths off the 90° angle depicted in FIG. 18). The geomagnetic monitoring system, along with the known location, may be used to calibrate individual tools used during formation of wellbores and ranging operations and/or to assess the properties of components in bottom hole assemblies or other downhole assemblies.

Figure 19:
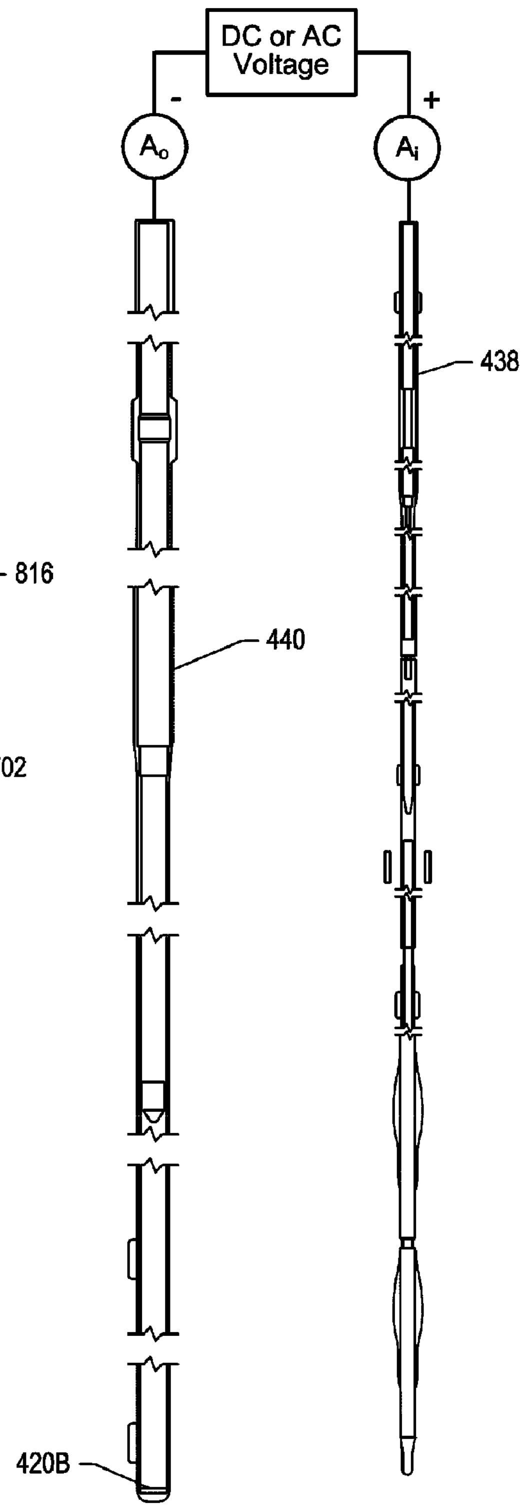
FIGS. 19 and 20 depict an embodiment for assessing a position of a first wellbore relative to a second wellbore using a heater assembly as a current conductor.
Figure 20:
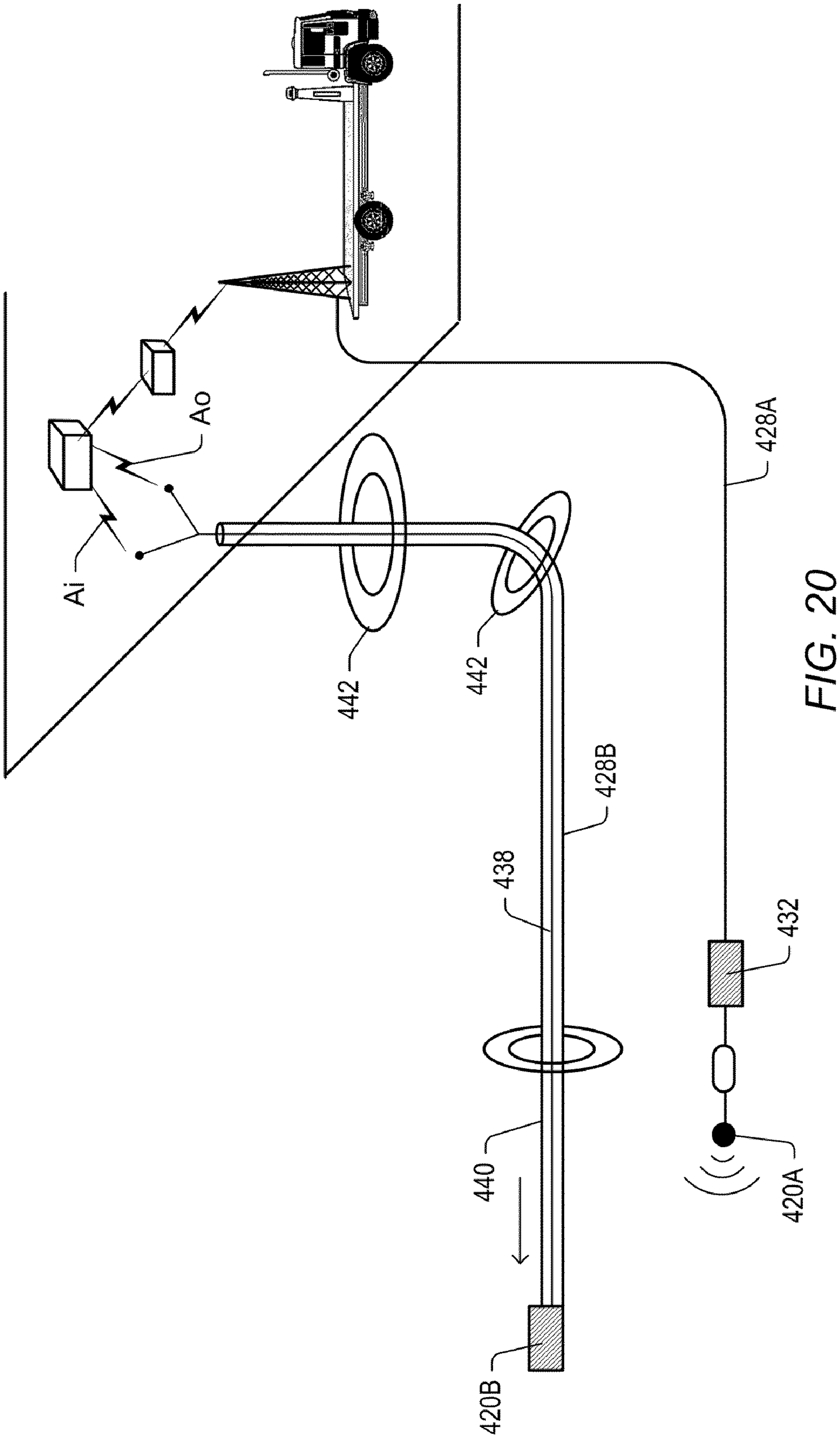

FIGS. 19 and 20 depict an embodiment for assessing a position of a first wellbore relative to a second wellbore using a heater assembly as a current conductor. In some embodiments, a heater may be used as a long conductor for a reference current (pulsed DC or AC) to be injected for assessing a position of a first wellbore relative to a second wellbore. If a current is injected onto an insulated internal heater element, the current may pass to the end of heater element 438 where it makes contact with heater casing 440. This is the same current path when the heater is in heating mode. Once the current passes across to bottom hole assembly 420B, at least some of the current is generally absorbed by the earth on the current's return trip back to the surface, resulting in a net current (difference in Amps in ($A_i$) versus Amps out ($A_o$).

Resulting electromagnetic field 442 is measured by sensor 432 (for example, a transceiving antenna) in bottom hole assembly 420A of first wellbore 428A being drilled in proximity to the location of heater 438. A predetermined "known" net current in the formation may be relied upon to provide a reference magnetic field.

The injection of the reference current may be rapidly pulsed and synchronized with the receiving antenna and/or sensor data. Access to a high data rate signal from the magnetometers can be used to filter the effects of sensor movement during drilling. The measurement of the reference magnetic field may provide a distance and direction to the heater. Averaging many of these results will provide the position of the actively drilled hole. The known position of the heater and known depth of the active sensors may be used to assess position coordinates of easting, northing, and elevation.

The quality of data generated with such a method may depend on the accuracy of the net current prediction along the length of the heater. Using formation resistivity data, a model may be used to predict the losses to earth along the length of the heater canister and/or wellbore casing or wellbore liner.

The current may be measured on both the element and the bottom hole assembly at the surface. The difference in values is the overall current loss to the formation. It is anticipated that the net field strength will vary along the length of the heater. The field is expected to be greater at the surface when the positive voltage applies to the bottom hole assembly.

If there are minimal losses to earth in the formation, the net field may not be strong enough to provide a useful detection range. In some embodiments, a net current in the range of about 2 A to about 50 A, about 5 A to about 40 A, or about 10 A to about 30 A, may be employed.

In some embodiments, two or more heaters are used as a long conductor for a reference current (pulsed DC or AC) to be injected for assessing a position of a first wellbore relative to a second wellbore. Utilizing two or more separate heater elements may result in relatively better control of return current path and therefore better control of reference current strength.

Figure 21:
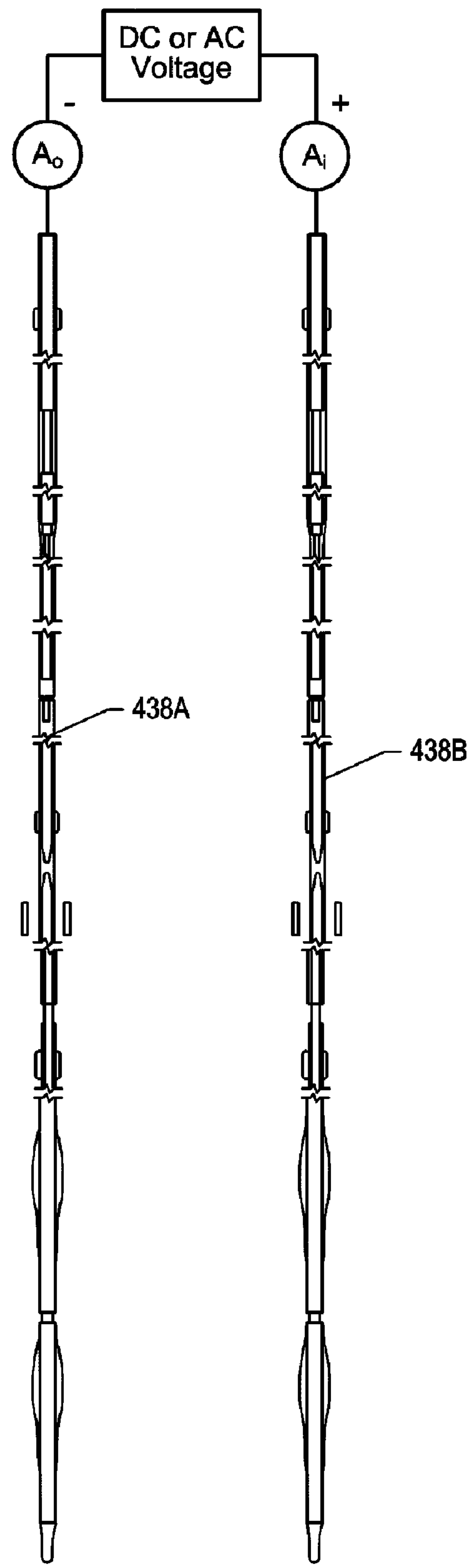
FIGS. 21 and 22 depict an embodiment for assessing a position of a first wellbore relative to a second wellbore using two heater assemblies as current conductors.
Figure 22:
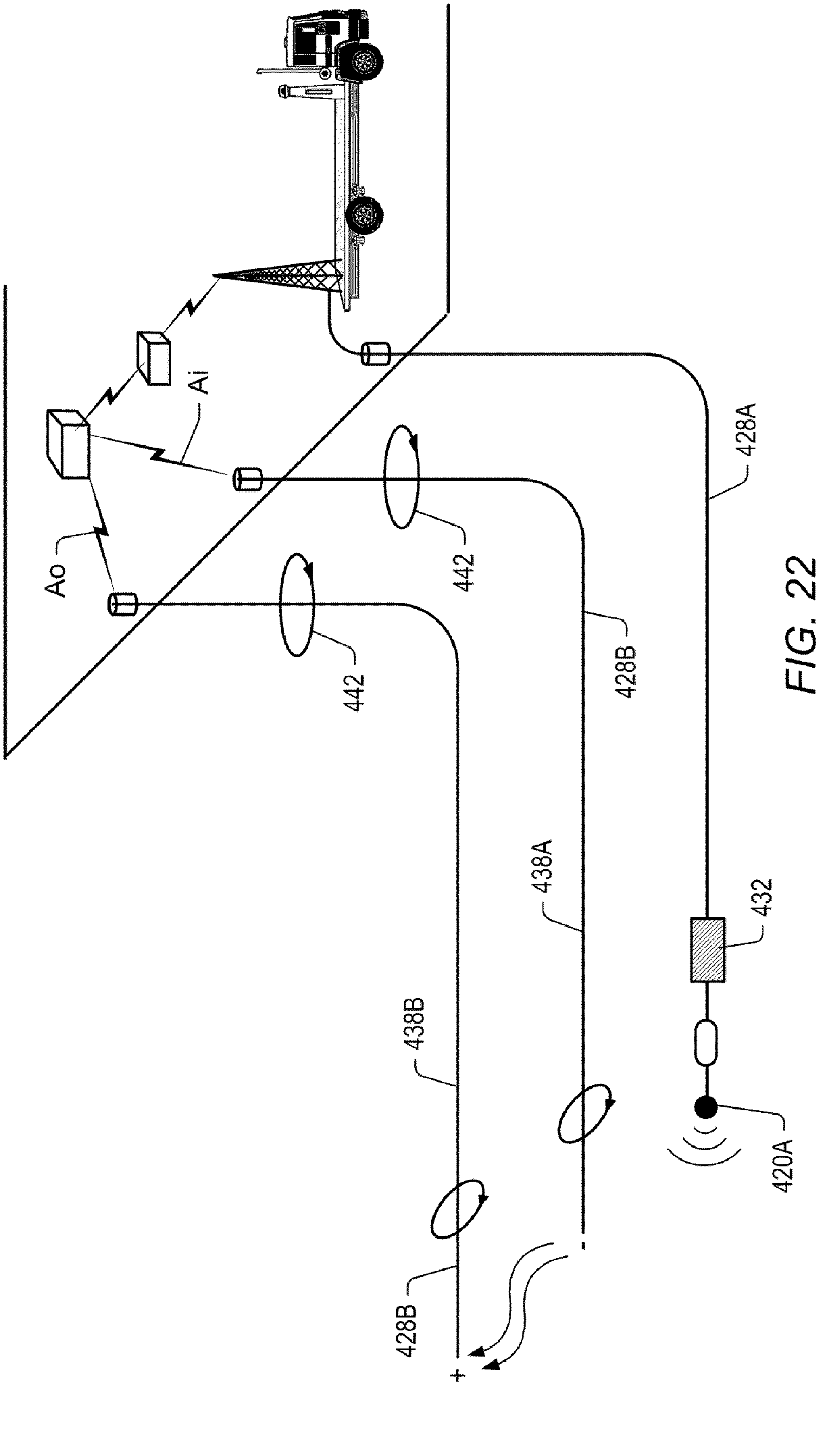

A two or more heater method may not rely on the accuracy of a "model of current loss to formation", as current is contained in the heater element along the full length of the heaters. Current may be rapidly pulsed and synchronized with the transceiving antenna and/or sensor data to resolve distance and direction to the heater. FIGS. 21 and 22 depict an embodiment for assessing a position of first wellbore 428A relative to second wellbore 428B using two heater assemblies 438A and 438B as current conductors. Resulting electromagnetic field 442 is measured by sensor 432 (for example, a transceiving antenna) in bottom hole assembly 420A of first wellbore 428A being drilled in proximity to the location of heaters 438A in second wellbores 428B.

In some embodiments, parallel well tracking (PWT) may be used for assessing a position of a first wellbore relative to a second wellbore. Parallel well tracking may utilize magnets of a known strength and a known length positioned in the pre-drilled second wellbore. Magnetic sensors positioned in the active first wellbore may be used to measure the field from the magnets in the second wellbore. Measuring the generated magnetic field in the second wellbore with sensors in the first wellbore may assess distance and direction of the active first wellbore. In some embodiments, magnets positioned in the second wellbore may be carefully positioned and multiple static measurements taken to resolve any general "background" magnetic field. Background magnetic fields may be resolved through use of a null function before positioning the magnets in the second wellbore, calculating background components from known sensor attitudes, and/or a gradiometer setup.

In some embodiments, reference magnets may be positioned in the drilling bottom hole assembly of the first wellbore. Sensors may be positioned in the passive second wellbore. The prepositioned sensors may be nulled prior to the arrival of the magnets in the detectable range to eliminate Earth's background field. Nulling the sensors may significantly reduce the time required to assess the position and direction of the first wellbore during drilling as the bottom hole assembly continues drilling with no stoppages. The commercial availability of low cost sensors such as Terrella6™ (available from Clymer Technologies (Mystic, Conn., U.S.A.) (utilizing magnetoresistives rather than fluxgates) may be incorporated into the wall of a deployment coil at useful separations.

In some embodiments, multiple types of sources may be used in combination with two or more sensors to assess and adjust the drilling of one or more wellbores. A method of assessing a position of a first wellbore relative to a second wellbore may include a combination of angle sensors, telemetry, and/or ranging systems. Such a method may be referred to as umbilical position control.

Angle sensors may assess an attitude (i.e., the azimuth, inclination, and roll) of a bottom hole assembly. Assessing the attitude of a bottom hole assembly may include measuring, for example, azimuth, inclination, and/or roll. Telemetry may transmit data (for example, measurements) between the surface and, for example, sensors positioned in a wellbore. Ranging may assess the position of a bottom hole assembly in a first wellbore relative to a second wellbore. In some embodiments, the second wellbore may include an existing, previously drilled wellbore.

Figure 23:
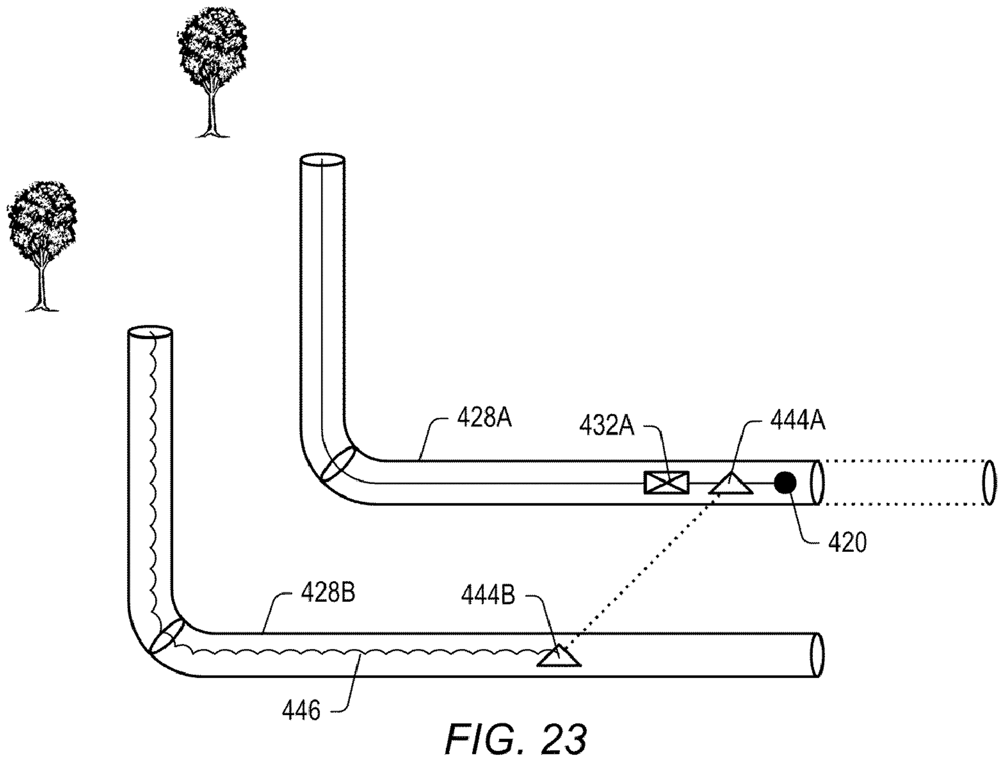
FIG. 23 depicts an embodiment of an umbilical positioning control system employing a magnetic gradiometer system and wellbore to wellbore wireless telemetry system.

FIG. 23 depicts an embodiment of an umbilical positioning control system employing a magnetic gradiometer system and wellbore to wellbore wireless telemetry system. The magnetic gradiometer system may be used to resolve bottom hole assembly interference. Second transceiver 444B may be deployed from the surface down second wellbore 428B, which effectively functions as a telemetry system for first wellbore 428A. A transceiver may communicate with the surface via wire or fiber optics (for example, wire 446) coupled to the transceiver.

In first wellbore 428A, sensor 432A may be coupled to first transceiving antenna 444A. First transceiving antenna 444A may communicate with second transceiving antenna 444B in second wellbore 428B. The first transceiving antenna may be positioned on bottom hole assembly 420. Sensors coupled to the first transceiving antenna may include, for example, magnetometers and/or accelerometers. In certain embodiments, sensors coupled to the first transceiving antenna may include dual magnetometer/accelerometer sets.

To accomplish data transfer, first transceiving antenna 444A transmits ("short hops") measured data through the ground to second transceiving antenna 444B located in the second wellbore. The data may then be transmitted to the surface via embedded wires 446 in the deployment tubular. In some embodiments, data transmission to/from the surface is provided through one or more data lines (wires) that previously exist in the deployment tubular wellbore.

Figure 24:
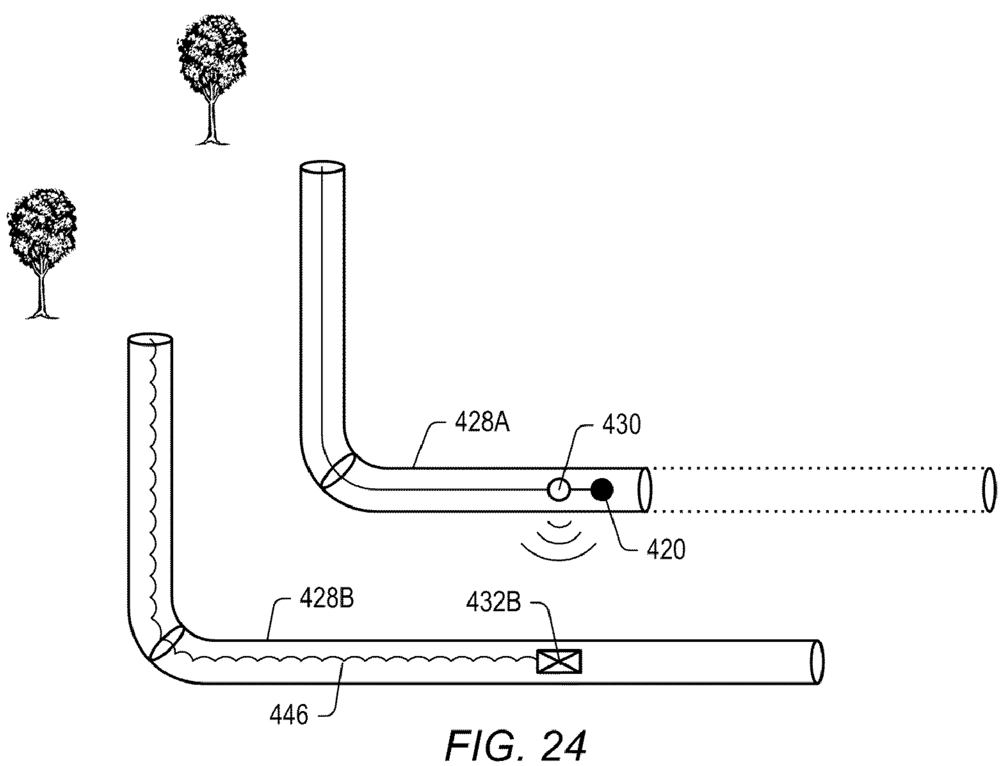
FIG. 24 depicts an embodiment of an umbilical positioning control system employing a magnetic gradiometer system in an existing wellbore.

Two redundant ranging systems may be utilized for umbilical control systems. A first ranging system may include a version of parallel well tracking (PWT). FIG. 24 depicts an embodiment of an umbilical positioning control system employing a magnetic gradiometer system in an existing wellbore. A PWT may include a pair of sensors 432B (for example, magnetometer/accelerometer sets) embedded in the wall of second wellbore deployment coil (the umbilical) or within a nonmagnetic section of jointed tubular string. These sensors act as a magnetic gradiometer to detect the magnetic field from reference magnet 430 installed in bottom hole assembly 420 of first wellbore 428A. In a horizontal section of the second wellbore, a relative position of the umbilical to the first wellbore reference magnet(s) may be determined by the gradient. Data may be sent to the surface through fiber optic cables or wires 446 positioned in second wellbore 428B.

Figure 25:
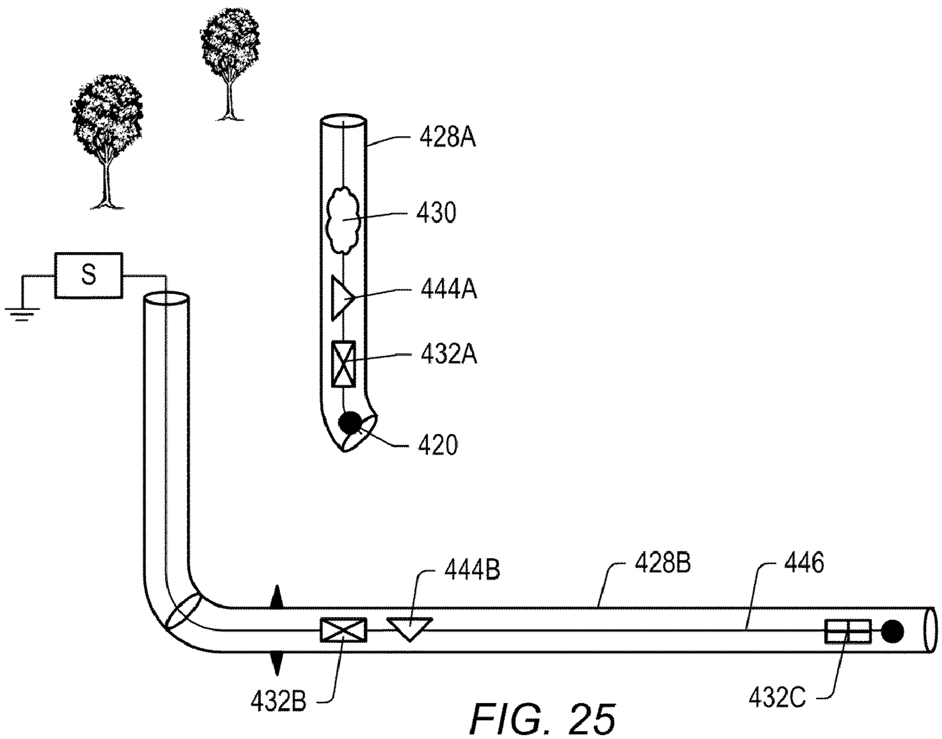
FIG. 25 depicts an embodiment of an umbilical positioning control system employing a combination of systems being used in a first stage of deployment.
Figure 26:
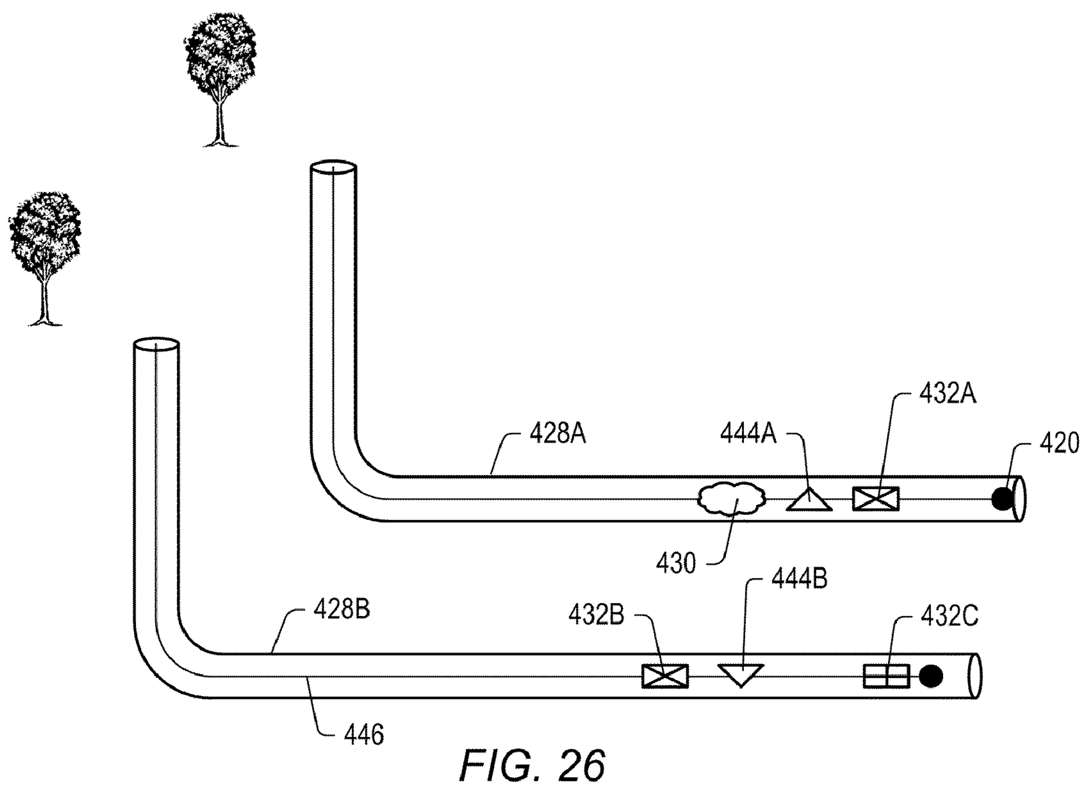
FIG. 26 depicts an embodiment of an umbilical positioning control system employing a combination of systems being used in a second stage of deployment.

FIGS. 25 and 26 depict an embodiment of umbilical positioning control system employing a combination of systems being used in a first stage of deployment and a second stage of deployment, respectively. A third set of sensors 432C (for example, magnetometers) may be located on the leading end of wire 446 in second wellbore 428B. Sensors 432B, 432C may detect magnetic fields produced by reference magnets 430 in bottom hole assembly 420 of first wellbore 428A. The role of sensors 432C may include mapping the Earth's magnetic field ahead of the arrival of the gradient sensors and confirming that the angle of the deployment tubular matches that of the originally defined hole geometry. Since the attitude of the magnetic field sensors are known based on the original survey of the hole and the checks of sensors 432B, 432C, the values for the Earth's field can be calculated based on current sensor orientation (inclinometers measure the roll and inclination and the model defines azimuth, Mag total, and Mag dip). Using this method, an estimation of the field vector due to reference magnets 430 can be calculated allowing distance and direction to be resolved.

A second ranging system may be based on using the signal strength and phase of the "through the earth" wireless link (for example, radio) established between first transceiving antenna 444A in first wellbore 428A and second transceiving antenna 444B in second wellbore 428B. Sensor 432A may be coupled to first transceiving antenna 444A. Given the close spacing of wellbores 428A, 428B and the variability in electrical properties of the formation, the attenuation rates for the electromagnetic signal may be predictable. Predictable attenuation rates for the electromagnetic signal allow the signal strength to be used as a measure of separation between first and second transceiver pairs 444A, 444B. The vector direction of the magnetic field induced by the electromagnetic transmissions from the first wellbore may provide the direction. A transceiver may communicate with the surface via wire or fiber optics (for example, wire 446) coupled to the transceiver.

Figure 27:
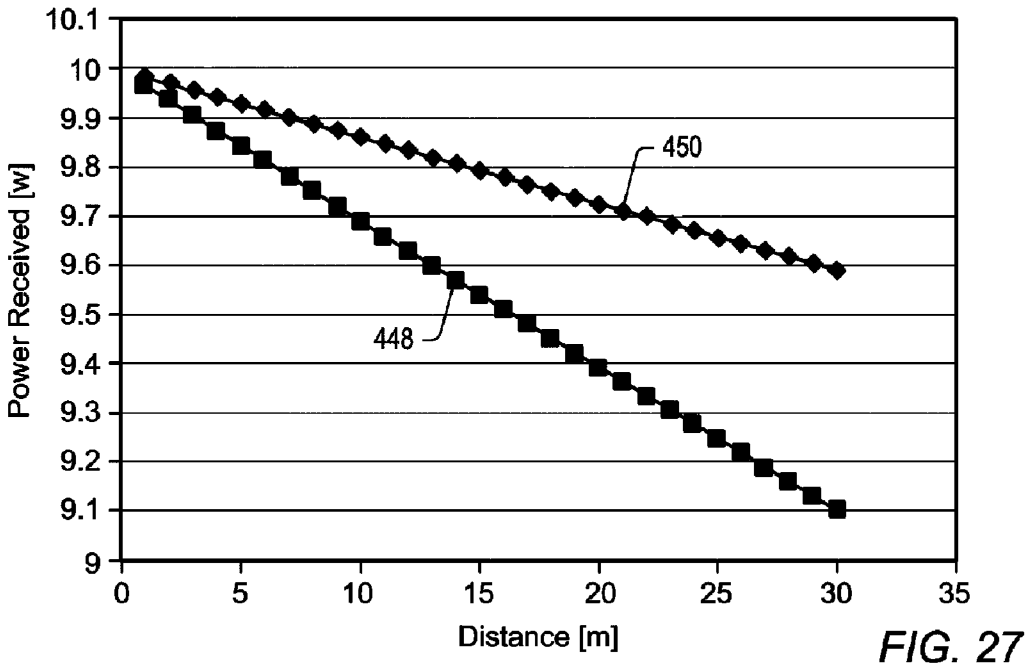
FIG. 27 depicts two examples of the relationship between power received and distance based upon two different formations with different resistivities.

With a known resistivity of the formation and operating frequency, the distance between the source and point of measurement may be calculated. FIG. 27 depicts two examples of the relationship between power received and distance based upon two different formations with different resistivities 448 and 450. If 10 W is transmitted at a 12 Hz frequency in 20 ohm-m formation 448, the power received amounts to approximately 9.10 W at 30 m distance. The resistivity was chosen at random and may vary depending on where you are in the ground. If a higher resistivity was chosen at the given frequency, such as 100 ohm-m formation 450, a lower attenuation is observed, and a low characterization occurs whereupon it receives 9.58 W at 30 m distance. Thus, high resistivity, although transmitting power desirably, shows a negative affect in electromagnetic ranging possibilities. Since the main influence in attenuation is the distance itself, calculations may be made solving for the distance between a source and a point of measurement.

The frequency of the electromagnetic source operates on is another factor that affects attenuation. Typically, the higher the frequency, the higher the attenuation and vice versa. A strategy for choosing between various frequencies may depend on the formation chosen. For example, while the attenuation at a resistivity of 100 ohm-m may be good for data communications, it may not be sufficient for distance calculations. Thus, a higher frequency may be chosen to increase attenuation. Alternatively, a lower frequency may be chosen for the opposite purpose. In some embodiments, a combination of different frequencies is used in sequence to optimize for both low and high frequency functions.

Wireless data communications in ground may allow an opportunity for electromagnetic ranging and the variable frequency it operates on must be observed to balance out benefits for both functionalities. Benefits of wireless data communication may include, but are not be limited to: 1) automatic depth sync through the use of ranging and telemetry; 2) fast communications with a dedicated coil for a transceiving antenna running in the second wellbore that is hardwired (for example, with optic fiber); 3) functioning as an alternative method for fast communication when hardwire in the first wellbore is not available; 4) functioning in under balanced and over balanced drilling; 5) providing a similar method for transmitting control commands to a bottom hole assembly; 6) reusing sensors to reduce costs and waste; 7) decreasing noise measurement functions split between the first wellbore and the second wellbore; and/or 8) using simultaneous multiple position measurement techniques to provide real time best estimates of position and attitude.

In some embodiments, it may be advisable to employ sensors able to compensate for magnetic fields produced internally by carbon steel casing built in the vertical section of a reference hole (for example, high range magnetometers). In some embodiments, modification may be made to account for problems with wireless antenna communications between wellbores penetrating through wellbore casings.

Pieces of formation or rock may protrude or fall into the wellbore due to various failures including rock breakage or plastic deformation during and/or after wellbore formation. Protrusions may interfere with drilling string movement and/or the flow of drilling fluids. Protrusions may prevent running tubulars into the wellbore after the drilling string has been removed from the wellbore. Significant amounts of material entering or protruding into the wellbore may cause wellbore integrity failure and/or lead to the drilling string becoming stuck in the wellbore. Some causes of wellbore integrity failure may be in situ stresses and high pore pressures. Mud weight may be increased to hold back the formation and inhibit wellbore integrity failure during wellbore formation. When increasing the mud weight is not practical, the wellbore may be reamed.

Reaming the wellbore may be accomplished by moving the drilling string up and down one joint while rotating and circulating. Picking the drilling string up can be difficult because of material protruding into the borehole above the bit or BHA (bottom hole assembly). Picking up the drilling string may be facilitated by placing upward facing cutting structures on the drill bit. Without upward facing cutting structures on the drill bit, the rock protruding into the borehole above the drill bit must be broken by grinding or crushing rather than by cutting. Grinding or crushing may induce additional wellbore failure.

Moving the drilling string up and down may induce surging or pressure pulses that contribute to wellbore failure. Pressure surging or fluctuations may be aggravated or made worse by blockage of normal drilling fluid flow by protrusions into the wellbore. Thus, attempts to clear the borehole of debris may cause even more debris to enter the wellbore.

When the wellbore fails further up the drilling string than one joint from the drill bit, the drilling string must be raised more than one joint. Lifting more than one joint in length may require that joints be removed from the drilling string during lifting and placed back on the drilling string when lowered. Removing and adding joints requires additional time and labor, and increases the risk of surging as circulation is stopped and started for each joint connection.

Figure 28A:
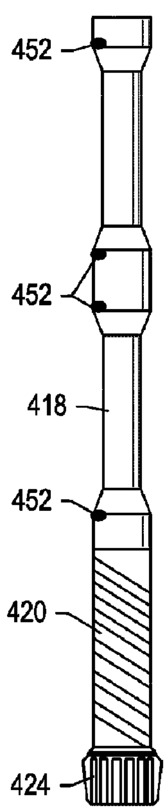
FIG. 28A depicts an embodiment of a drilling string including cutting structures positioned along the drilling string.
Figure 28B:
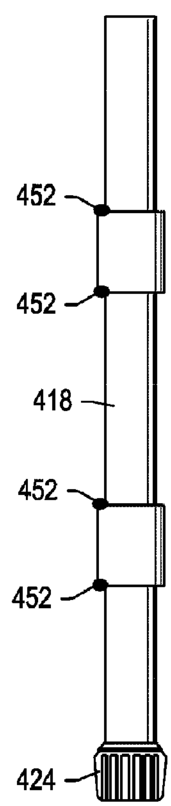
FIG. 28B depicts an embodiment of a drilling string including cutting structures positioned along the drilling string.
Figure 28C:
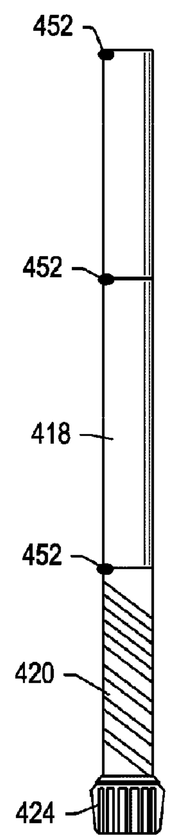
FIG. 28C depicts an embodiment of a drilling string including cutting structures positioned along the drilling string.

In some embodiments, cutting structures may be positioned at various points along the drilling string. Cutting structures may be positioned on the drilling string at selected locations, for example, where the diameter of the drilling string or BHA changes. FIG. 28A and FIG. 28B depict cutting structures 452 located at or near diameter changes in drilling string 418 near to drill bit 424 and/or BHA 420. As depicted in FIG. 28C, cutting structures 452 may be positioned at selected locations along the length of BHA 420 and/or drilling string 418 that has a substantially uniform diameter. Cutting structures 452 may remove formation that extends into the wellbore as the drilling string is rotated. Cuttings formed by the cutting structures 452 may be removed from the wellbore by the normal circulation used during the formation of the wellbore.

Figure 29:
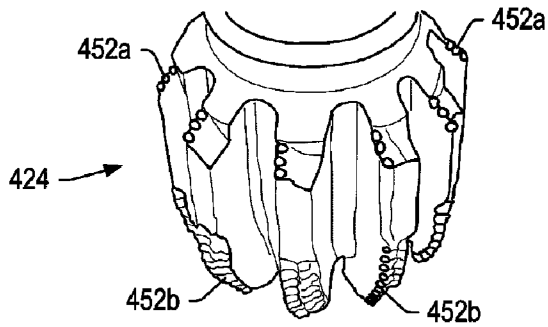
FIG. 29 depicts an embodiment of a drill bit including upward cutting structures.

FIG. 29 depicts an embodiment of drill bit 424 including cutting structures 452. Drill bit 424 includes downward facing cutting structures 452*b* for forming the wellbore. Cutting structures 452*a* are upwardly facing cutting structures for reaming out the wellbore to remove protrusions from the wellbore.

Figure 30:
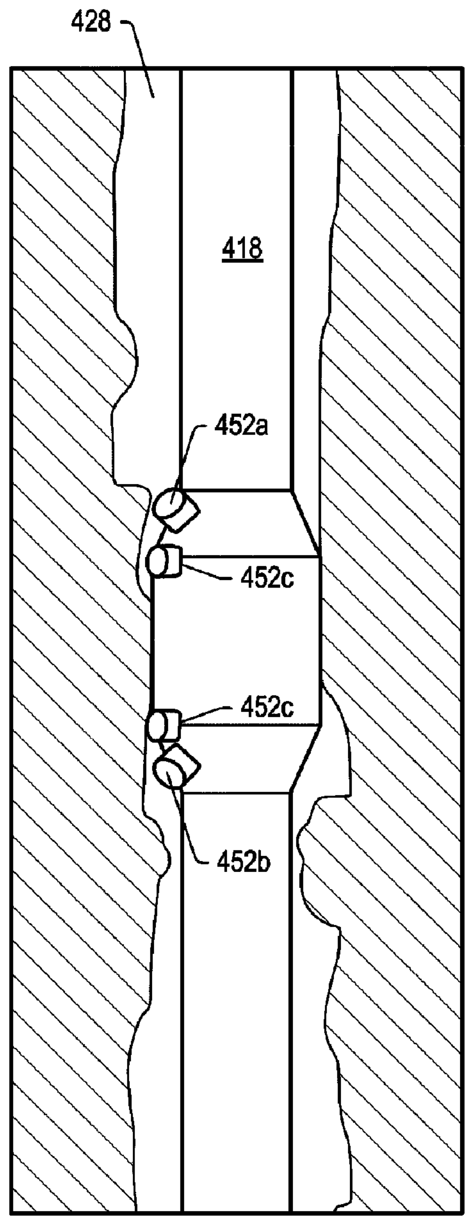
FIG. 30 depicts an embodiment of a tubular including cutting structures positioned in a wellbore.

In some embodiments, some cutting structures may be upwardly facing, some cutting structures may be downwardly facing, and/or some cutting structures may be oriented substantially perpendicular to the drilling string. FIG. 30 depicts an embodiment of a portion of drilling string 418 including upward facing cutting structures 452*a*, downward facing cutting structures 452*b*, and cutting structures 452*c* that are substantially perpendicular to the drilling string. Cutting structures 452*a* may remove protrusions extending into wellbore 428 that would inhibit upward movement of drilling string 418. Cutting structures 452*a* may facilitate reaming of wellbore 428 and/or removal of drilling string 418 from the wellbore for drill bit change, BHA maintenance and/or when total depth has been reached. Cutting structures 452*b* may remove protrusions extending into wellbore 428 that would inhibit downward movement of drilling string 418. Cutting structures 452*c* may ensure that enlarged diameter portions of drilling string 418 do not become stuck in wellbore 428.

Positioning downward facing cutting structures 452*b* at various locations along a length of the drilling string may allow for reaming of the wellbore while the drill bit forms additional borehole at the bottom of the wellbore. The ability to ream while drilling may avoid pressure surges in the wellbore caused by lifting the drilling string. Reaming while drilling allows the wellbore to be reamed without interrupting normal drilling operation. Reaming while drilling allows the wellbore to be formed in less time because a separate reaming operation is avoided. Upward facing cutting structures 452*a* allow for easy removal of the drilling string from the wellbore.

In some embodiments, the drilling string includes a plurality of cutting structures positioned along the length of the drilling string, but not necessarily along the entire length of the drilling string. The cutting structures may be positioned at regular or irregular intervals along the length of the drilling string. Positioning cutting structures along the length of the drilling string allows the entire wellbore to be reamed without the need to remove the entire drilling string from the wellbore.

Cutting structures may be coupled or attached to the drilling string using techniques known in the art (for example, by welding). In some embodiments, cutting structures are formed as part of a hinged ring or multi-piece ring that may be bolted, welded, or otherwise attached to the drilling string. In some embodiments, the distance that the cutting structures extend beyond the drilling string may be adjustable. For example, the cutting element of the cutting structure may include threading and a locking ring that allows for positioning and setting of the cutting element.

In some wellbores, a wash over or over-coring operation may be needed to free or recover an object in the wellbore that is stuck in the wellbore due to caving, closing, or squeezing of the formation around the object. The object may be a canister, tool, drilling string, or other item. A wash-over pipe with downward facing cutting structures at the bottom of the pipe may be used. The wash over pipe may also include upward facing cutting structures and downward facing cutting structures at locations near the end of the wash-over pipe. The additional upward facing cutting structures and downward facing cutting structures may facilitate freeing and/or recovery of the object stuck in the wellbore. The formation holding the object may be cut away rather than broken by relying on hydraulics and force to break the portion of the formation holding the stuck object.

A problem in some formations is that the formed borehole begins to close soon after the drilling string is removed from the borehole. Boreholes which close up soon after being formed make it difficult to insert objects such as tubulars, canisters, tools, or other equipment into the wellbore. In some embodiments, reaming while drilling applied to the core drilling string allows for emplacement of the objects in the center of the core drill pipe. The core drill pipe includes one or more upward facing cutting structures in addition to cutting structures located at the end of the core drill pipe. The core drill pipe may be used to form the wellbore for the object to be inserted in the formation. The object may be positioned in the core of the core drill pipe. Then, the core drill pipe may be removed from the formation. Any parts of the formation that may inhibit removal of the core drill pipe are cut by the upward facing cutting structures as the core drill pipe is removed from the formation.

Replacement canisters may be positioned in the formation using over core drill pipe. First, the existing canister to be replaced is over cored. The existing canister is then pulled from within the core drill pipe without removing the core drill pipe from the borehole. The replacement canister is then run inside of the core drill pipe. Then, the core drill pipe is removed from the borehole. Upward facing cutting structures positioned along the length of the core drill pipe cut portions of the formation that may inhibit removal of the core drill pipe.

During some in situ heat treatment processes, wellbores may need to be formed in heated formations. Wellbores may also need to be formed in hot portions of geothermally heated or other high temperature formations. Certain formations may be heated by heat sources (for example, heaters) to temperatures above ambient temperatures of the formations. In some embodiments, formations are heated to temperatures significantly above ambient temperatures of the formations. For example, a formation may be heated to a temperature at least about 50° C. above ambient temperature, at least about 100° C. above ambient temperature, at least about 200° C. above ambient temperature, or at least about 500° C. above ambient temperature. Wellbores drilled into hot formation may be additional or replacement heater wells, additional or replacement production wells, and/or monitor wells.

Cooling while drilling may enhance wellbore stability, safety, and longevity of drilling tools. When the drilling fluid is liquid, significant wellbore cooling can occur due to the circulation of the drilling fluid. Downhole cooling does not have to be applied all the way to the bottom of the wellbore to have beneficial effects. Applying cooling to only part of the drilling string and/or downhole equipment may be a trade off between benefit and the effort involved to apply the cooling to the drilling string and downhole equipment. The target of the cooling may be the formation, the drill bit, and/or the bottom hole assembly. In some embodiments, cooling of the formation is inhibited to promote wellbore stability. Cooling of the formation may be inhibited by using insulation to inhibit heat transfer from the formation to the drilling string, bottom hole assembly, and/or the drill bit. In some embodiments, insulation is used to inhibit heat transfer and/or phase changes of drilling fluid and/or cooling fluid in portions of the drilling string, bottom hole assembly, and/or the drill bit.

In some in situ heat treatment process embodiments, a barrier formed around all or a portion of the in situ heat treatment process is formed by freeze wells that form a low temperature zone around the freeze wells. A portion of the cooling capacity of the freeze well equipment may be utilized to cool the equipment needed to drill into the hot formation. A closed loop circulation system may be used to cool drilling bits and/or other downhole equipment. Drilling bits may be advanced slowly in hot sections to ensure that the formed wellbore cools sufficiently to preclude drilling problems and/or to enhance borehole stability.

When using conventional circulation, drilling fluid flows down the inside of the drilling string and back up the outside of the drilling string. Other circulation systems, such as reverse circulation, may also be used. In some embodiments, the drill pipe may be positioned in a pipe-in-pipe configuration, or a pipe-in-pipe-in-pipe configuration (for example, when a closed loop circulation system is used to cool downhole equipment).

The drilling string used to form the wellbore may function as a counter-flow heat exchanger. The deeper the well, the more the drilling fluid heats up on the way down to the drill bit as the drilling string passes through heated portions of the formation. When normal circulation does not deliver low enough temperatures drilling fluid to the drill bit to provide adequate cooling, two options may be employed to enhance cooling: mud coolers on the surface can be used to reduce the inlet temperature of the drilling fluid being pumped downhole; and, if cooling is still inadequate, an at least partially insulated drilling string can be used to reduce the counter-flow heat exchanger effect.

For various reasons including, but not limited to, lost circulation, wells are frequently drilled with gas (for example, air, nitrogen, carbon dioxide, methane, ethane, and other light hydrocarbon gases) or gas/liquid mixtures. Gas/liquid mixtures are used as the drilling fluid primarily to maintain a low equivalent circulating density (low downhole pressure gradient). Gas has low potential for cooling the wellbore because mass flow rates of gas drilling are much lower than when liquid drilling fluid is used. Also, gas has a low heat capacity compared to liquid. As a result of heat flow from the outside to the inside of the drilling string, the gas arrives at the drill bit at close to formation temperature. Controlling the inlet temperature of the gas (analogous to using mud coolers when drilling with liquid) or using insulated drilling string may marginally reduce the counter-flow heat exchanger effect when gas drilling. Some gases are more effective than others at transferring heat, but the use of gasses with better heat transfer properties may not significantly improve wellbore cooling while gas drilling.

Gas drilling may deliver the drilling fluid to the drill bit at close to the formation temperature. The gas may have little capacity to absorb heat. A feature of gas drilling is the low density column in the annulus. The benefits of gas drilling can be accomplished if the drilling fluid or a cooling fluid is liquid while flowing down the drilling string and gas while flowing back up the annulus. The heat of vaporization may be used to cool the drill bit and the formation rather than using the sensible heat of the drilling fluid to cool.

An advantage of this approach may be that even though the liquid arrives at the bit at close to formation temperature, the liquid can absorb heat by vaporizing. The heat of vaporization is typically larger than the heat that can be absorbed by a temperature rise. As a comparison, a 7⅞" wellbore is drilled with a 3½" drilling string circulating low density mud at about 203 gpm with about a 100 ft/min typical annular velocity. Drilling through a 450° F. zone at 1000 feet will result in a mud exit temperature about 8° F. hotter than the inlet temperature. This results in the removal of about 14,000 Btu/min. The removal of this heat lowers the bit temperature from about 450° F. to about 285° F. If liquid water is injected down the drilling string and allowed to boil at the bit and steam is produced up the annulus, the mass flow required to remove ½" cuttings is about 34 $lb_m$/min assuming the back pressure is about 100 psia. At 34 $lb_m$/min, the heat removed from the wellbore would be about 34 $lb_m$/min×(1187−180) Btu/$lb_m$, or about 34,000 Btu/min. This heat removal amount is about 2.4 times the liquid cooling case. Thus, at reasonable annular steam flow rates, a significant amount of heat may be removed by vaporization.

The high velocities required for gas drilling may be achieved by the expansion that occurs during vaporization rather than by employing compressors on the surface. Eliminating or minimizing the need for compressors may simplify the drilling process, eliminate or lower compression costs, and eliminate or reduce a source of heat applied to the drilling fluid on the way to the drill bit.

Figure 31:
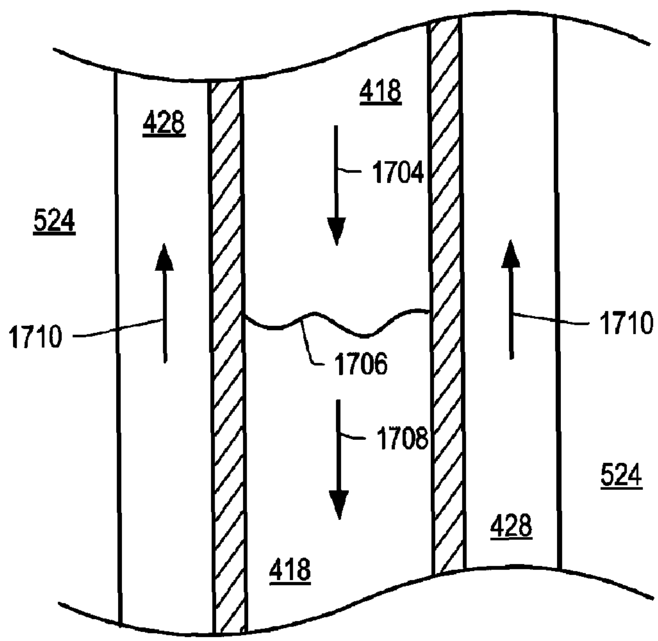
FIG. 31 depicts a cross-sectional representation of fluid flow in the drilling string of a wellbore with no control of vaporization of the fluid.

In some embodiments, it is helpful to inhibit vaporization within the drilling string. If the drilling fluid flowing downwards vaporizes before reaching the drill bit, the heat of vaporization tends to extract heat from the drilling fluid flowing up the annulus. The heat transferred from the annulus (outside the drilling string) to inside the drilling string is heat that is not rejected from the well when drilling fluid reaches the surface. Vaporization that occurs inside of the drilling string before the drilling fluid reaches the bottom of the hole is less beneficial to drill bit and/or wellbore cooling. FIG. 31 depicts drilling fluid flow in drilling string 418 in wellbore 428 with no control of vaporization of the fluid. Liquid drilling fluid flows down drilling string 418 as indicated by arrow 1704. Liquid changes to vapor at interface 1706. Vapor flows down drilling string 418 below interface 1706 as indicated by arrow 1708. In certain embodiments, interface 1706 is a region instead of an abrupt change from liquid to vapor. Vapor and cuttings may flow up the annular region between drilling string 418 and formation 524 in the directions indicated by arrows 1710. Heat transfers from formation 524 to the vapor moving up drilling string 418 and to the drilling string. Heat from drilling string 418 transfers to liquid and vapor flowing down the drilling string.

If the pressure in the drilling string is maintained above the boiling pressure for a given temperature by use of a back pressure device, then the transfer of heat from outside the drilling string to fluid on the inside of the drilling string can be limited so that the fluid on the inside of the drilling string does not change phases. Fluid downstream of the back pressure device may be allowed to change phase. The fluid downstream the back pressure device may be partially or totally vaporized. Vaporization may result in the drilling fluid absorbing the heat of vaporization from the drill bit and formation. For example, if the back pressure device is set to allow flow only when the back pressure is above a selected pressure (for example, 250 psi for water or another pressure depending on the fluid), the fluid within the drilling string may not vaporize unless the temperature is above a selected temperature (for example, 400° F. for water or another temperature depending on the fluid). If the temperature of the formation is above the selected temperature (for example, the temperature is about 500° F.), steps may be taken to inhibit vaporization of the fluid on the way down to the drill bit. In an embodiment, the back pressure device is set to maintain a back pressure that inhibits vaporization of the drilling fluid at the temperature of the formation (for example, 580 psi to inhibit vaporization up to a temperature of 500° F. for water).

In another embodiment, the drilling pipe is insulated and/or the drilling fluid is cooled so that the back pressure device is able to maintain any drilling fluid that reaches the drill bit as a liquid.

Examples of two back pressure devices that may be used to maintain elevated pressure within the drilling string are a choke and a pressure activated valve. Other types of back pressure devices may also be used. Chokes have a restriction in the flow area that creates back pressure by resisting flow. Resisting the flow results in increased upstream pressure to force the fluid through the restriction. Pressure activated valves may not open until a minimum upstream pressure is obtained. The pressure difference across a pressure activated valve may determine if the pressure activated valve is open to allow flow or the valve is closed.

In some embodiments, both a choke and a pressure activated valve may be used. A choke can be the bit nozzles allowing the liquid to be jetted toward the drill bit and the bottom of the hole. The bit nozzles may enhance drill bit cleaning and help inhibit fouling of the drill bit and pressure activated valve. Fouling may occur if boiling in the drill bit or pressure activated valve causes solids to precipitate. The pressure activated valve may inhibit premature vaporization at low flow rates such as flow rates below which the chokes are effective.

In some embodiments, additives are added to the cooling fluid or the drilling fluid. The additives may modify the properties of the fluids in the liquid phase and/or the gas phase. Additives may include, but are not limited to, surfactants to foam the fluid, additives to chemically alter the interaction of the fluid with the formations (for example, to stabilize the formation), additives to control corrosion, and additives for other benefits.

In some embodiments, a non-condensable gas is added to the cooling fluid or the drilling fluid pumped down the drilling string. The non-condensable gas may be, but is not limited to, nitrogen, carbon dioxide, air, and mixtures thereof. Adding the non-condensable gas results in pumping a two phase mixture down the drilling string. One reason for adding the non-condensable gas may be to enhance the flow of the fluid out of the formation. The presence of the non-condensable gas may inhibit condensation of the vaporized cooling or drilling fluid and/or help to carry cuttings out of the formation. In some embodiments, one or more heaters are present at one or more locations in the wellbore to provide heat that inhibits condensation and reflux of cooling or drilling fluid leaving the formation.

In certain embodiments, managed pressure drilling and/or managed volumetric drilling is used during the formation of wellbores. The back pressure on the wellbore may be held to a prescribed value to control the downhole pressure. Similarly, the volume of fluid entering and exiting the wellbore may be balanced such that there is no or minimally controlled net influx or out-flux of drilling fluid into the formation.

Figure 32:
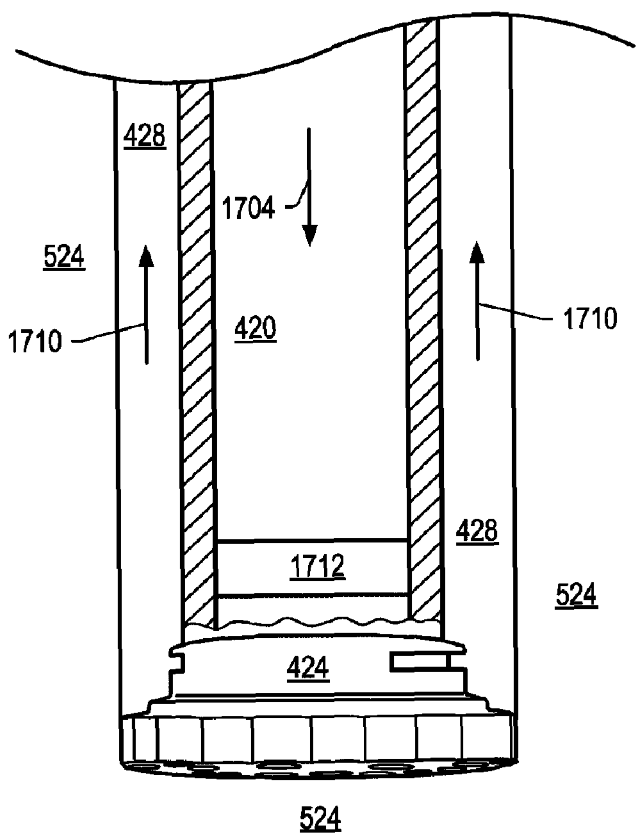
FIG. 32 depicts a partial cross-sectional representation of a system for drilling with controlled vaporization of drilling fluid to cool the drilling bit.

FIG. 32 depicts a representation of a system for forming wellbore 428 in heated formation 524. Liquid drilling fluid flows down the drilling string to bottom hole assembly 420 in the direction indicated by arrow 1704. Bottom hole assembly 420 may include back pressure device 1712. Back pressure device 1712 may include pressure activated valves and/or chokes. In some embodiments, back pressure device 1712 is adjustable. Back pressure device 1712 may be electrically coupled to bottom hole assembly 420. The control system for bottom hole assembly 420 may control the inlet flow of cooling or drilling fluid and may adjust the amount of flow through back pressure device 1712 to maintain the pressure of cooling or drilling fluid located above the back pressure device above a desired pressure. Thus, back pressure device 1712 may be operated to control vaporization of the cooling fluid. In certain embodiments, back pressure device 1712 includes a control volume. In some embodiments, the control volume is a conduit that carries the cooling fluid to bottom hole assembly 420.

The desired pressure may be a pressure sufficient to maintain cooling or drilling fluid as a liquid phase to cool drill bit 424 when the liquid phase of the cooling or drilling fluid is vaporized. At least a portion of the liquid phase of the cooling or drilling fluid may vaporize and absorb heat from drill bit 424. In certain embodiments, vaporization of the cooling fluid is controlled to control a temperature at or near bottom hole assembly 420. In some embodiments, bottom hole assembly 420 includes insulation to inhibit heat transfer from the formation to the bottom hole assembly. In some embodiments, drill bit 424 includes a conduit for flow of the cooling fluid. Vapor phase cooling or drilling fluid and cuttings may flow upwards to the surface in the direction indicated by arrow 1710.

In some embodiments, cooling fluid in a closed loop is circulated into and out of the wellbore to provide cooling to the formation, drilling string, and/or downhole equipment. In some embodiments, phase change of the cooling fluid is not utilized during cooling. In some embodiments, the cooling fluid is subjected to a phase change to cool the formation, drilling string, and/or downhole equipment.

Figure 33:
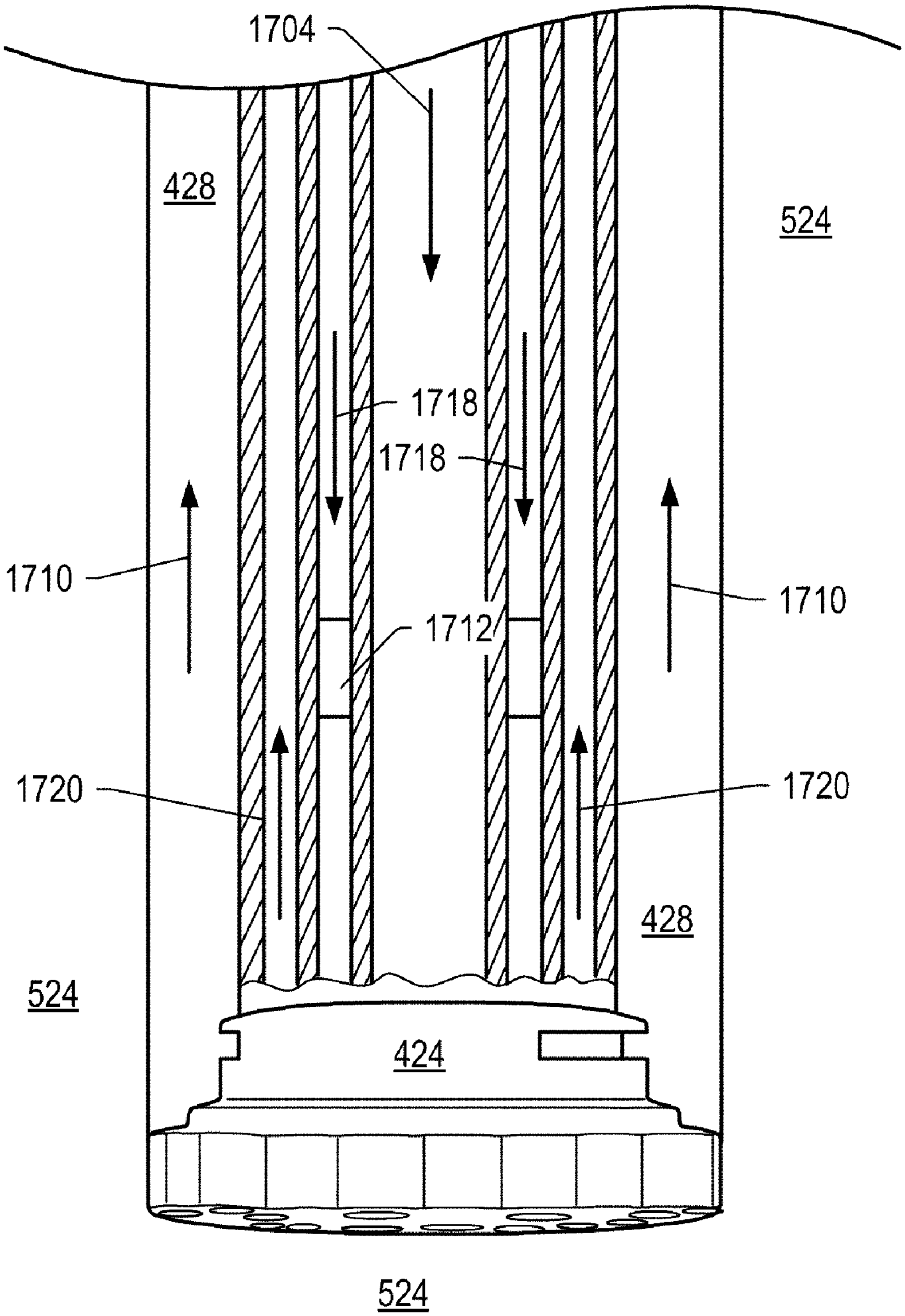
FIG. 33 depicts a partial cross-sectional representation of a system for cooling a downhole region that utilizes triple walled drilling string used and cooling fluid.

In an embodiment, cooling fluid in a closed loop system is passed through a back pressure device and allowed to vaporize to provide cooling to a selected region. FIG. 33 depicts a representation of a system that uses phase change of a cooling fluid to provide downhole cooling. Drilling fluid may flow down the center drilling string to drill bit 424 in the direction indicated by arrow 1704. Return drilling fluid and cuttings may flow to the surface in the direction indicated by arrows 1710. Cooling fluid may flow down the annular region between center drilling string and the middle drilling string in the direction indicated by arrows 1718. The cooling fluid may pass through back pressure device 1712 to a vaporization chamber. The vaporization chamber may be located above the bottom hole assembly. Back pressure device 1712 may maintain a significant portion of cooling fluid in a liquid phase above the back pressure device. Cooling fluid is allowed to vaporize below back pressure device 1712 in the vaporization chamber. In certain embodiments, at least a majority of the cooling fluid is vaporized. Return vaporized cooling fluid may flow back to a cooling system that reliquefies the cooling fluid for subsequent usage in the drilling string and/or another drilling string. The vaporized cooling fluid may flow to the surface in the annular region between the middle drilling string and the outer drilling string in the direction indicated by arrows 1720. Liquid cooling fluid may maintain the drilling fluid flowing through the center drilling string at a temperature below the boiling temperature of the cooling fluid.

Figure 34:
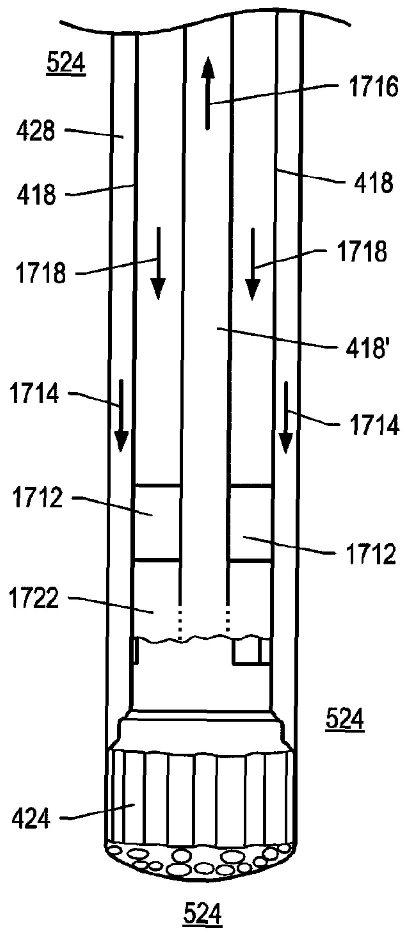
FIG. 34 depicts a partial cross-sectional representation of a reverse circulation flow scheme that uses cooling fluid, wherein the cooling fluid returns with the drilling fluid and cuttings.

FIG. 34 depicts a representation of a system for forming wellbore 428 in heated formation 524 using reverse circulation. Drilling fluid flows down the annular region between formation 524 and outer drilling string 418 in the direction indicated by arrows 1714. Drilling fluid and cuttings pass through drill bit 424 and up center drilling string 418' in the direction indicated by arrow 1716. Cooling fluid may flow down the annular region between outer drilling string 418 and center drilling string 418' in the direction indicated by arrows 1718. The cooling fluid may be water or another type of cooling fluid that is able to change from a liquid phase to a vapor phase and absorb heat. The cooling fluid may flow to back pressure device 1712. Back pressure device 1712 may maintain the pressure of the cooling fluid located above the back pressure device above a pressure sufficient to maintain the cooling fluid as a liquid phase to cool drill bit 424 when the liquid phase of the drilling fluid is vaporized. Cooling fluid may pass through back pressure device 1712 into vaporization chamber 1722. Vaporization of cooling fluid may absorb heat from drill bit 424 and/or from formation 524. Vaporized cooling fluid may pass through one or more lift valves into center drilling string 418' to help transport drilling fluid and cuttings to the surface.

Figure 35:
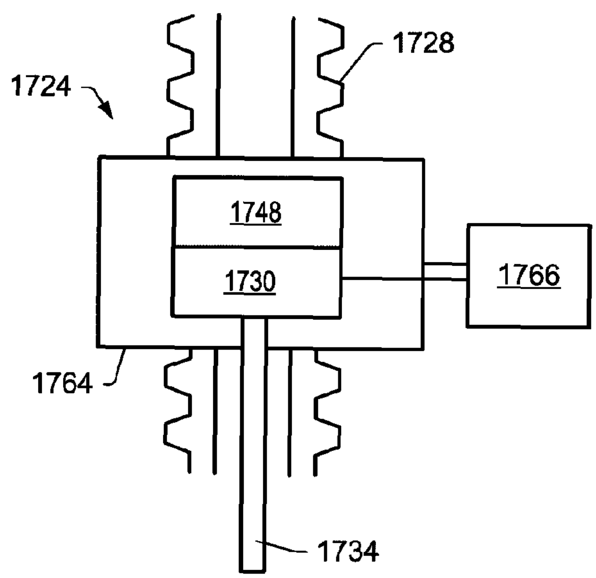
FIG. 35 depicts a schematic of a rack and pinion drilling system.

In some embodiments, an auto-positioning control system in combination with a rack and pinion drilling system may be used for forming wellbores in a formation. Use of an auto-positioning control and/or measurement system in combination with a rack and pinion drilling system may allow wellbores to be drilled more accurately than drilling using manual positioning and calibration. For example, the auto-positioning system may be continuously and/or semi-continuously calibrated during drilling. FIG. 35 depicts a schematic of a portion of a system including a rack and pinion drive system. Rack and pinion drive system 1724 includes, but is not limited to, rack 1728, carriage 1764, chuck drive system 1730, and circulating sleeve 1748. Chuck drive system 1730 may hold tubular 1734. Push/pull capacity of a rack and pinion type system may allow enough force (for example, about 5 tons) to push tubulars into wellbores so that rotation of the tubulars is not necessary. A rack and pinion system may apply downward force on the drill bit. The force applied to the drill bit may be independent of the weight of the drilling string and/or collars. In certain embodiments, collar size and weight is reduced because the weight of the collars is not needed to enable drilling operations. Drilling wellbores with long horizontal portions may be performed using rack and pinion drilling systems because of the ability of the drilling systems to apply force to the drilling bit.

Rack and pinion drive system 1724 may be coupled to auto-positioning control system 1766. Auto-positioning control system 1766 may include, but is not limited to, rotary steerable systems, dual motor rotary steerable systems, and/or hole measurement systems. In some embodiments, heaters are included in tubular 1734. In some embodiments, auto-positioning measurement tools are positioned in the heaters. In some embodiments, a measurement system includes magnetic ranging and/or a non-rotating sensor.

In some embodiments, a hole measuring system includes canted accelerometers. Use of canted accelerometers may allow for surveying of a shallow portion of the formation. For example, shallow portions of the formation may have steel casing strings from drilling operations and/or other wells. The steel casings may affect the use of magnetic survey tools in determining the direction of deflection incurred during drilling. Canted accelerometers may be positioned in a bottom hole assembly with the surface as reference of string rotational position. Positioning the canted accelerometers in a bottom hole assembly may allow accurate measurement of inclination and direction of a hole regardless of the influence of nearby magnetic interference sources (for example, casing strings). In some embodiments, the relative rotational position of the tubular is monitored by measuring and tracking incremental rotation of the shaft. By monitoring the relative rotation of tubulars added to existing tubulars, more accurate positioning of tubulars may be achieved. Such monitoring may allow tubulars to be added in a continuous manner. In some embodiments, a method of drilling using a rack and pinion system includes continuous downhole measurement. A measurement system may be operated using a predetermined and constant current signal. Distance and direction are calculated continuously downhole. The results of the calculations are filtered and averaged. A best estimate final distance and direction is reported to the surface. When received on surface, the known along hole depth and source location may be combined with the calculated distance and direction to calculate X, Y & Z position data.

During drilling with jointed pipes, the time taken to shut down circulation, add the next pipe, re-establish circulation, and hole making may require a substantial amount of time, particularly when using two-phase circulation. Handling tubulars (for example, pipes) has historically been a key safety risk area where manual handling techniques have been used. Coiled tubing drilling has had some success in eliminating the need for making connections and manual tubular handling, however, the inability to rotate and the limitations on practical coil diameters may limit the extent to which it can be used.

In some embodiments, a drilling sequence is used in which tubulars are added to a string without interrupting the drilling process. Such a sequence may allow continuous rotary drilling with large diameter tubulars. A continuous rotary drilling system may include a drilling platform, which includes, but is not limited to, one or more platforms, a top drive system, and a bottom drive system. The platform may include a rack to allow multiple independent traversing of components. The top drive system may include an extended drive sub (for example, an extended drive system manufactured by American Augers, West Salem, Ohio, U.S.A.). The bottom drive system may include a chuck drive system and a hydraulic system. The bottom drive system may operate in a similar manner to a rack and pinion drilling system. The chuck drive system may be mounted on a separate carriage. The hydraulic system may include, but is not limited to, one or more motors and a circulating sleeve. The circulating sleeve may allow circulation between tubulars and the annulus. The circulating sleeve may be used to open or shut off production from various intervals in the well. In some embodiments, a system includes a tubular handling system. A tubular handling system may be automated, manually operated, or a combination thereof.

FIGS. 36A-36D depict a schematic of an illustrative continuous drilling sequence. The system used to carry out the continuous drilling sequence includes bottom drive system 1738, tubular handling system 1740, and top drive system 1742. Top drive system 1742 includes circulating sleeve 1744 and drive sub 1758. Top drive system 1740 may be, for example, a rotary drive system or a rack and pinion drive system. Bottom drive system 1738 includes circulating sleeve 1748 and chuck 1762. For example, bottom drive system 1738 may be a rack and pinion type system such as depicted in FIG. 35. In some embodiments, the chuck may be on a separate carriage system. During the sequence, new tubulars (for example, new tubular 1736) may be coupled successively, one after another, to an existing tubular (for example, existing tubular 1734). Bottom drive system 1738 and top drive system 1742 may alternate control of the drilling operation.

Figures 36A, 36B, 36C, 36D:
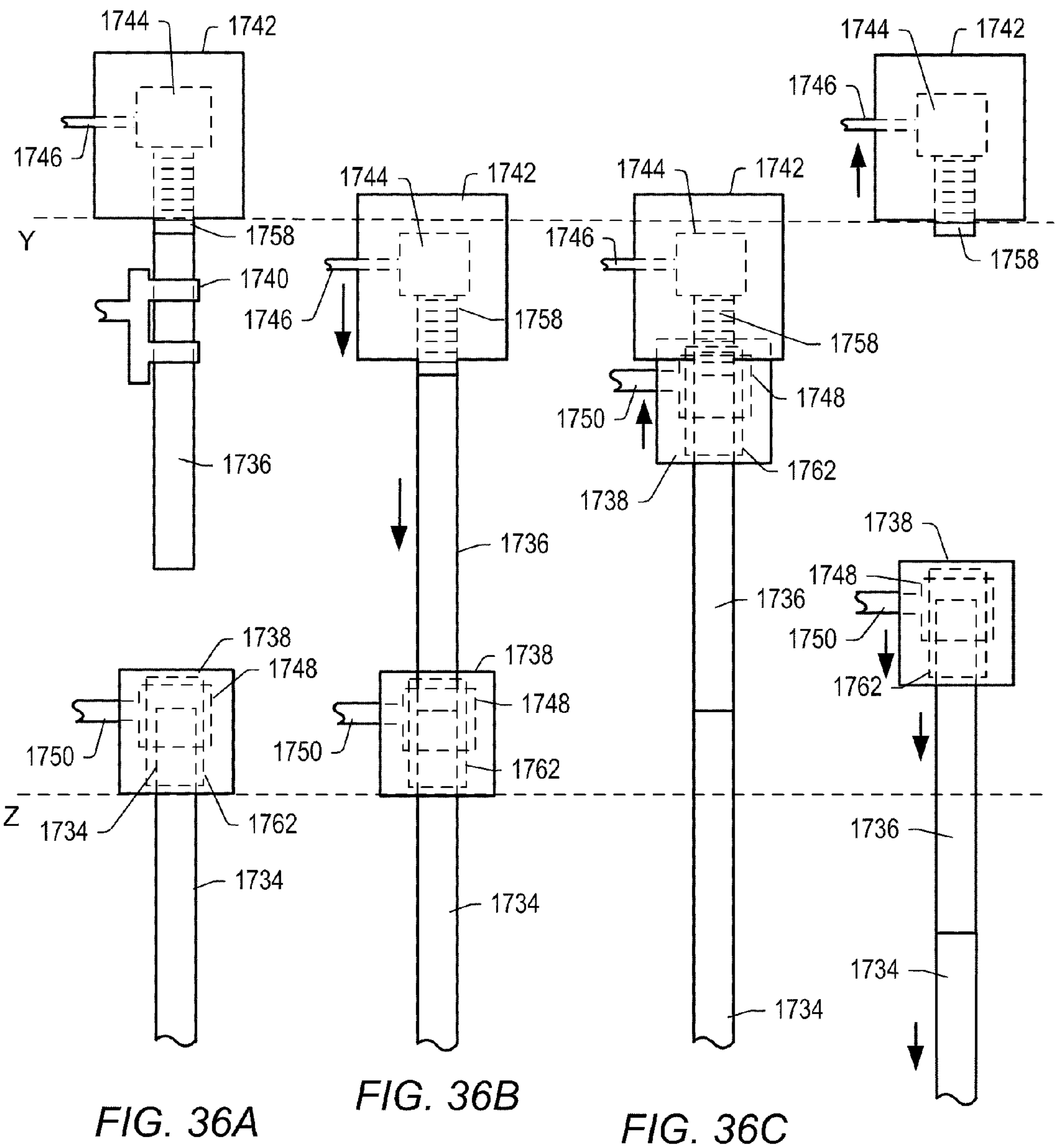
FIGS. 36A through 36D depict schematics of an embodiment for a continuous drilling sequence.

As the sequence commences, existing tubular 1734 is coupled to chuck 1762, and bottom drive system 1738 controls drilling. Fluid may flow through port 1750 into circulating sleeve 1748 of bottom drive system 1738. Top drive system 1742 is at reference line Y and bottom drive system 1738 is at reference line Z. It will be understood that reference lines Y and Z are shown for illustrative purposes only, and the heights of the drive systems at various stages in the sequence may be different than those depicted in FIGS. 36A-36D. As shown in FIG. 36A, new tubular 1736 may be aligned with bottom drive system 1738 using tubular handling system 1740. Once in position, top drive system 1742 may be connected to a top end (for example, a box end) of new tubular 1736.

As shown in FIG. 36B, as chuck 1762 of bottom drive system 1738 continues to control drilling, top drive system 1742 lowers and positions or drops a bottom end of new tubular 1736 in circulating sleeve 1748 (see arrows). Once new tubular 1736 is in the chamber of circulating sleeve 1748, circulation changes to top drive system 1742 and a connection is made between new tubular 1736 and existing tubular 1734. After the connection between existing tubular 1734 and new tubular 1736 is made, bottom drive system 1738 may relinquish control of the drilling process to top drive system 1742. Fluid flows through port 1746 into circulating sleeve 1744 of top drive system 1742.

As shown in FIG. 36C, with top drive system 1742 controlling the drilling process, bottom drive system 1738 may be actuated to travel upward (see arrow) toward top drive system 1742 along the length of new tubular 1736. When bottom drive system 1738 reaches the top of new tubular 1736, the new tubular may be engaged with chuck 1762 of bottom drive system 1738. Top drive system 1742 may relinquish control of the drilling process to bottom drive system 1738. Bottom drive system 1738 may resume control of the drilling operation while top drive system 1742 disconnects from the new tubular 1736. Chuck 1762 may transfer force to new tubular 1736 to continue drilling. Top drive system 1742 may be raised relative to bottom drive system 1738 (see arrow) (for example, until top drive system 1742 reaches reference line Y). As shown in FIG. 36D, bottom drive system 1738 may be lowered to push new tubular 1736 and existing tubular 1734 downward into the formation (see arrows). Bottom drive system 1738 may continue to be lowered (for example, until bottom drive system 1738 has returned to reference line Z). The sequence described above may be repeated any number of times so as to maintain continuous drilling operations.

Figure 37:
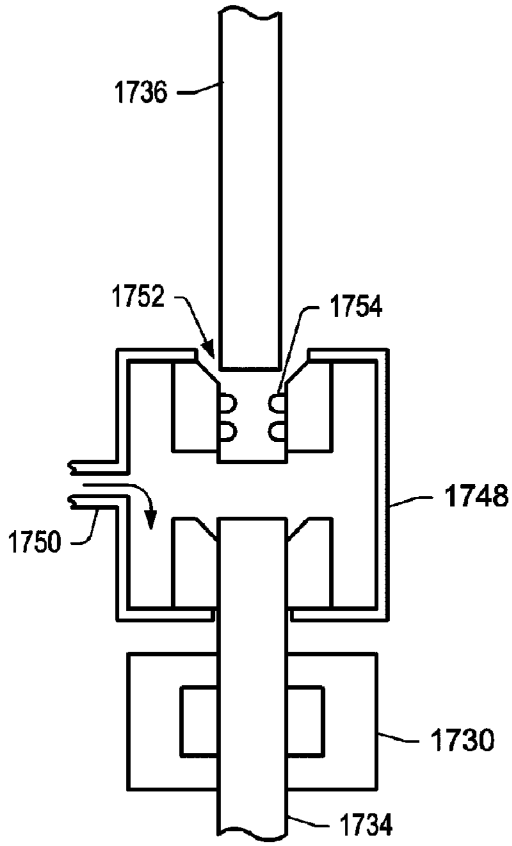
FIG. 37 depicts a schematic of an embodiment of circulating sleeves.

FIG. 37 depicts a schematic of an embodiment of circulating sleeve 1748. Fluid may enter circulating sleeve 1748 through port 1750 and flow around existing tubular 1734. Fluid may remove heat away from chuck 1762 and/or tubulars. Circulating sleeve 1748 includes opening 1752. Opening 1752 allows new tubular 1736 to enter circulating sleeve 1748 so that the new tubular may be coupled to existing tubular 1734. In some embodiments, a valve is provided at opening 1752. For example, the valve may be a UBD circulation valve. Opening 1752 may include one or more tooljoints 1754. Tooljoints 1754 may guide entry of new tubular 1736 in an inner section of circulating sleeve. As new tubular 1736 enters opening 1752 of circulating sleeve 1748, fluid flow through the circulating sleeve may be under pressure. For example, fluid through the circulating sleeve may be at pressures of up to about 13.8 MPa (up to about 2000 psi).

Figure 38:
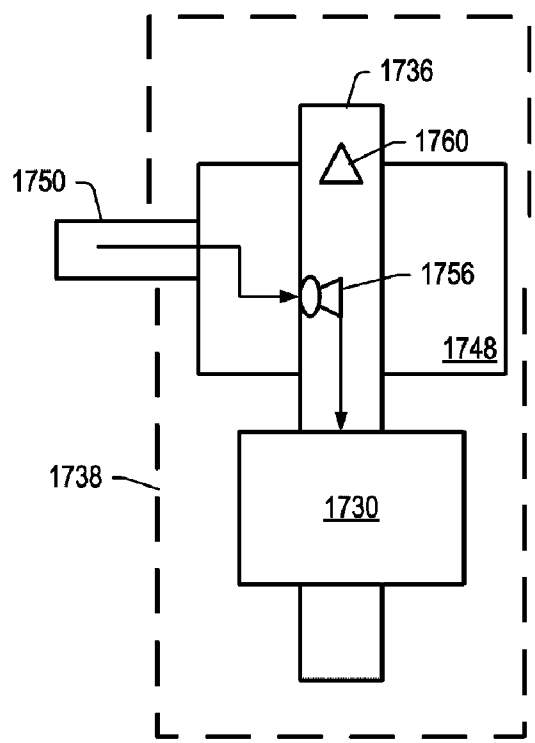
FIG. 38 depicts schematics of an embodiment of a circulating sleeve with valves.

In some embodiments, circulating sleeve 1748 may include, and/or operate in conjunction with, one or more valves. FIG. 38 depicts a schematic of system including circulating sleeve 1748, side valve 1756, and top valve 1760. Side valve 1756 may be a check valve incorporated into a side entry flow and check valve port. Top entry valve 1760 may be a check valve. Use of check valves may facilitate change of circulation entry points and creation of a seal.

As circulating system sleeve 1748 comes into proximity with drive sub 1758 (as described in FIG. 36D), fluid from top drive system 1742 may be flowing from circulating sleeve 1744 of top drive system 1742 through top valve 1760. Circulating sleeve 1748 may be pressurized and side valve 1756 may open to provide flow. Top valve 1760 may shut and/or partially close as side valve 1756 opens to provide flow to circulating sleeve 1744. Circulation may be slowed or discontinued through top drive system 1742. As circulation is stopped through top drive system 1742, top valve 1760 may close completely and all fluid may be furnished through side valve 1756 from port 1750.

In some embodiments, one piece of equipment may be used to drill multiple wellbores in a single day. The wellbores may be formed at penetration rates that are many times faster than the penetration rates using conventional drilling with drilling bits. The high penetration rate allows separate equipment to accomplish drilling and casing operations in a more efficient manner than using a one-rig approach. The high penetration rate requires accurate, near real time directional drilling control in three dimensions.

In some embodiments, high penetration rates may be attained using composite coiled tubing in combination with particle jet drilling. Particle jet drilling forms an opening in a formation by impacting the formation with high velocity fluid containing particles to remove material from the formation. The particles may function as abrasives. In addition to composite coiled tubing and particle jet drilling, a downhole electric orienter, bubble entrained mud, downhole inertial navigation, and a computer control system may be needed. Other types of drilling fluid and drilling fluid systems may be used instead of using bubble entrained mud. Such drilling fluid systems may include, but are not limited to, straight liquid circulation systems, multiphase circulation systems using liquid and gas, and/or foam circulation systems.

Composite coiled tubing has a fatigue life that is significantly greater than the fatigue life of steel coiled tubing. Composite coiled tubing is available from Airborne Composites BV (The Hague, The Netherlands). Composite coiled tubing can be used to form many boreholes in a formation. The composite coiled tubing may include integral power lines for providing electricity to downhole tools. The composite coiled tubing may include integral data lines for providing real time information regarding downhole conditions to the computer control system and for sending real time control information from the computer control system to the downhole equipment. The primary computer control system may be downhole or may be at surface.

The coiled tubing may include an abrasion resistant outer sheath. The outer sheath may inhibit damage to the coiled tubing due to sliding experienced by the coiled tubing during deployment and retrieval. In some embodiments, the coiled tubing may be rotated during use in lieu of or in addition to having an abrasion resistant outer sheath to minimize uneven wear of the composite coiled tubing.

Particle jet drilling may advantageously allow for stepped changes in the drilling rate. Drill bits are no longer needed and downhole motors are eliminated. Particle jet drilling may decouple cutting formation to form the borehole from the bottom hole assembly (BHA). Decoupling cutting formation to form the borehole from the BHA reduces the impact that variable formation properties (for example, formation dip, vugs, fractures and transition zones) have on wellbore trajectory. The decoupling lowers the required torque and thrust that would normally be required if conventional drilling bits were used to form a borehole in the formation. By decoupling cutting formation to form the borehole from the BHA, directional drilling may be reduced to orienting one or more particle jet nozzles in appropriate directions. The orientation of the BHA becomes easier with the reduced torque on the assembly from the hole making process. Additionally, particle jet drilling may be used to under ream one or more portions of a wellbore to form a larger diameter opening.

Particles may be introduced into a pressurized injection stream during particle jet drilling. The ability to achieve and circulate high particle laden fluid under pressure may facilitate the successful use of particle jet drilling. Traditional oilfield drilling and/or servicing pumps are not designed to handle the abrasive nature of the particles used for particle jet drilling for extended periods of time. Wear on the pump components may be high resulting in impractical maintenance and repairs. One type of pump that may be used for particle jet drilling is a heavy duty piston membrane pump. Heavy duty piston membrane pumps may be available from ABEL GmbH & Co. KG (Buchen, Germany). Piston membrane pumps have been used for long term, continuous pumping of slurries containing high total solids in the mining and power industries. Piston membrane pumps are similar to triplex pumps used for drilling operations in the oil and gas industry except heavy duty preformed membranes separate the slurry from the hydraulic side of the pump. In this fashion, the solids laden fluid is brought up to pressure in the injection line in one step and circulated downhole without damaging the internal mechanisms of the pump.

Another type of pump that may be used for particle jet drilling is an annular pressure exchange pump. Annular pressure exchange pumps may be available from Macmahon Mining Services Pty Ltd (Lonsdale, Australia). Annular pressure exchange pumps have been used for long term, continuous pumping of slurries containing high total solids in the mining industry. Annular pressure exchange pumps use hydraulic oil to compress a hose inside a high-strength pressure chamber in a peristaltic like way to displace the contents of the hose. Annular pressure exchange pumps may obtain continuous flow by having twin chambers. One chamber fills while the other chamber is purged.

The BHA may include a downhole electric orienter. The downhole electric orienter may allow for directional drilling by directing one or more jets or particle jet drilling nozzles in an appropriate fashion to facilitate forward hole making progress in the desired direction. The downhole electric orienter may be coupled to a computer control system through one or more integral data lines of the composite coiled tubing. Power for the downhole electric orienter may be supplied through an integral power line of the composite coiled tubing or through a battery system in the BHA.

Bubble entrained mud may be used as the drilling fluid. Bubble entrained mud may allow for particle jet drilling without raising the equivalent circulating density to unacceptable levels. A form of managed pressure drilling may be affected by varying the density of bubble entrainment. In some embodiments, particles in the drilling fluid may be separated from the drilling fluid using magnetic recovery when the particles include iron or alloys that may be influenced by magnetic fields. Bubble entrained mud may be used because using air or other gas as the drilling fluid may result in excessive wear of components from high velocity particles in the return stream. The density of the bubble entrained mud going downhole as a function of real time gains and losses of fluid may be automated using the computer control system.

In some embodiments, multiphase systems are used. For example, if gas injection rates are low enough that wear rates are acceptable, a gas-liquid circulating system may be used. Bottom hole circulating pressures may be adjusted by the computer control system. The computer control system may adjust the gas and/or liquid injection rates.

In some embodiments, pipe-in-pipe drilling is used. Pipe-in-pipe drilling may include circulating fluid through the space between the outer pipe and the inner pipe instead of between the wellbore and the drill string. Pipe-in-pipe drilling may be used if contact of the drilling fluid with one or more fresh water aquifers is not acceptable. Pipe-in-pipe drilling may be used if the density of the drilling fluid cannot be adjusted low enough to effectively reduce potential lost circulation issues.

Downhole inertial navigation may be part of the BHA. The use of downhole inertial navigation allows for determination of the position (including depth, azimuth and inclination) without magnetic sensors. Magnetic interference from casings and/or emissions from the high density of wells in the formation may interfere with a system that determines the position of the BHA based on magnet sensors.

The computer control system may receive information from the BHA. The computer control system may process the information to determine the position of the BHA. The computer control system may control drilling fluid rate, drilling fluid density, drilling fluid pressure, particle density, other variables, and/or the downhole electric orienter to control the rate of penetration and/or the direction of borehole formation.

Figure 39:
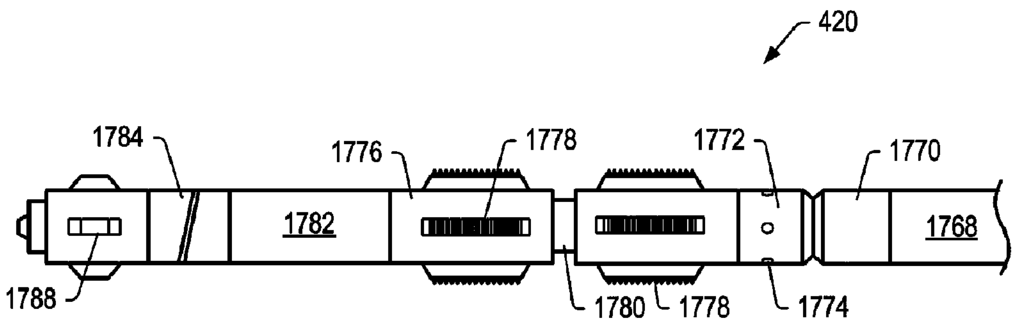
FIG. 39 depicts an embodiment of a bottom hole assembly for use with particle jet drilling.

FIG. 39 depicts a representation of an embodiment of bottom hole assembly 420 used to form an opening in the formation. Composite coiled tubing 1768 may be secured to connector 1770 of BHA 420. Connector 1770 may be coupled to combination circulation and disconnect sub 1772. Sub 1772 may include ports 1774. Sub 1772 may be coupled to tractor system 1776. Tractor system 1776 may include a plurality of grippers 1778 and ram 1780. Tractor system 1776 may be coupled to sensor sub 1782 that includes inertial navigation sensors, pressure sensors, temperature sensors and/or other sensors. Sensor sub 1782 may be coupled to orienter 1784. Orienter 1784 may be coupled to jet head 1786. Jet head 1786 may include centralizers 1788. Other BHA embodiments may include other components and/or the same components in a different order.

Figure 40:
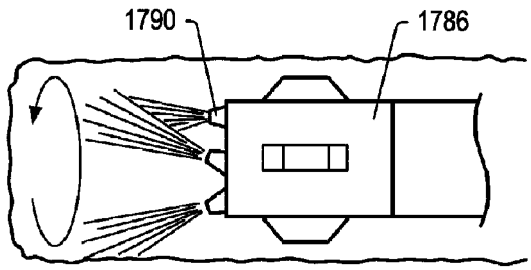
FIG. 40 depicts a rotating jet head with multiple nozzles for use during particle jet drilling.
Figure 41:
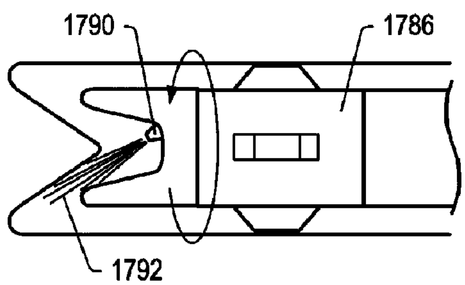
FIG. 41 depicts a rotating jet head with a single nozzle for use during particle jet drilling.

In some embodiments, the jet head is rotated during use. The BHA may include a motor for rotating the jet head. FIG. 40 depicts an embodiment of jet head 1786 with multiple nozzles 1790. The motor in the BHA may rotate jet head 1786 in the direction indicated by the arrow. Nozzles 1790 may direct particle jet streams 1792 against the formation. FIG. 41 depicts an embodiment of jet head 1786 with single nozzles 1790. Nozzle 1790 may direct particle jet stream 1792 against the formation.

Figure 42:
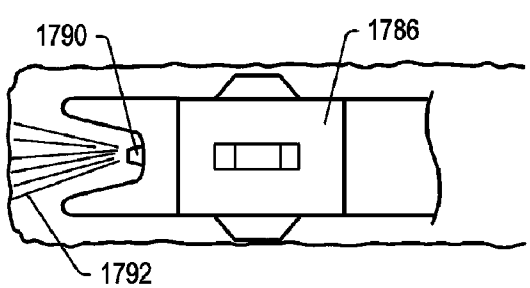
FIG. 42 depicts a non-rotating jet head for use during particle jet drilling.

In some embodiments, the jet head is not rotated during use. FIG. 42 depicts an embodiment of non-rotational jet head 1786. Jet head 1786 may include one or more nozzles 1790 that direct particle jet streams against the formation.

Figure 43:
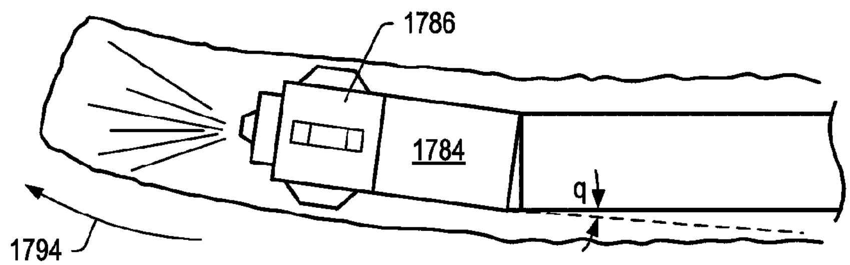
FIG. 43 depicts a bottom hole assembly that uses an electric orienter to change the direction of wellbore formation.
Figure 44:
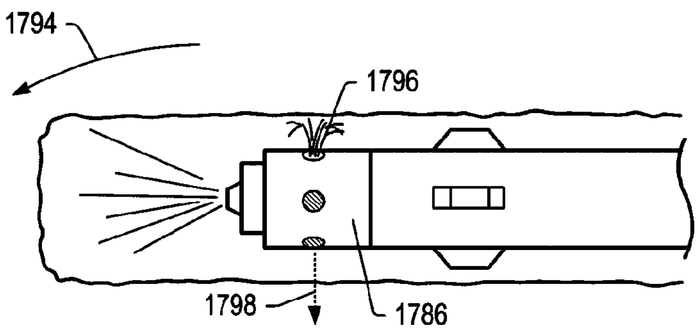
FIG. 44 depicts a bottom hole assembly that uses directional jets to change the direction of wellbore formation.

Direction change of the wellbore formed by the BHA may be controlled in a number of ways. FIG. 43 depicts a representation wherein the BHA includes an electrical orienter 1784. Electrical orienter 1784 adjusts angle θ between a back portion of the BHA and jet head 1786 that allows the BHA to form the opening in the direction indicated by arrow 1794. FIG. 44 depicts a representation wherein jet head 1786 includes directional jets 1796 around the circumference of the jet head. Directing fluid through one or more of the directional jets 1796 applies a force in the direction indicated by arrow 1798 to jet head 1786 that moves the jet head so that one or more jets of the jet head form the wellbore in the direction indicated by arrow 1794.

Figure 45:
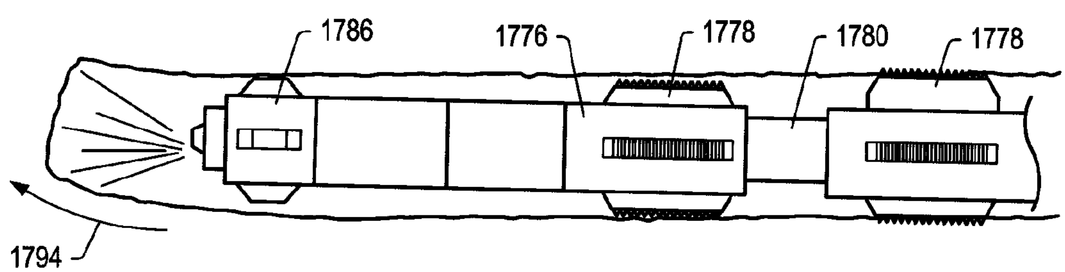
FIG. 45 depicts a bottom hole assembly the uses a tractor system to change the direction of wellbore formation.

In some embodiments, the tractor system of the BHA may be used to change the direction of wellbore formation. FIG. 45 depicts tractor system 1776 in use to change the direction of wellbore formation to the direction indicated by arrow 1794. One or more grippers of the rear gripper assembly may be extended to contact the formation and establish a desired angle of jet head. Ram 1780 may be extended to move jet head forward. When ram 1780 is fully extended, grippers of the front gripper assembly may be extended to contact the formation, and grippers of the read gripper assembly may be retracted to allow the ram to be compressed. Force may be applied to the coiled tubing to compress ram 1780. When the ram is compressed, grippers of the front gripper assembly may be retracted, and grippers of the rear gripper assembly may be extended to contact the formation and set the jet head in the desired direction. Additional wellbore may be formed by directing particle jets through the jet head while extending ram 1780.

In some embodiments, robots are used to perform a task in a wellbore formed or being formed using composite coiled tubing. The task may be, but is not limited to, providing traction to move the coiled tubing, surveying, removing cuttings, logging, and/or freeing pipe. For example, a robot may be used when drilling a horizontal opening if enough weight cannot be applied to the BHA to advance the coiled tubing and BHA in the formed borehole. The robot may be sent down the borehole. The robot may clamp to the composite coiled tubing or BHA. Portions of the robot may extend to engage the formation. Traction between the robot and the formation may be used to advance the robot forward so that the composite coiled tubing and the BHA advance forward. The displacement data from the forward advancement of the BHA using the robot may be supplied directly to the inertial navigation system to improve accuracy of the opening being formed.

The robots may be battery powered. To use the robot, drilling could be stopped, and the robot could be connected to the outside of the composite coiled tubing. The robot would run along the outside of the composite coiled tubing to the bottom of the hole. If needed, the robot could electrically couple to the BHA. The robot could couple to a contact plate on the BHA. The BHA may include a step-down transformer that brings the high voltage, low current electricity supplied to the BHA to a lower voltage and higher current (for example, one third the voltage and three times the amperage supplied to the BHA). The lower voltage, higher current electricity supplied from the step-down transformer may be used to recharge the batteries of the robot. In some embodiments, the robot may function while coupled to the BHA. The batteries may supply sufficient energy for the robot to travel to the drill bit and back to the surface.

A robot may be run integral to the BHA on the end of the composite coiled tubing. Portions of the robot may extend to engage the formation. Traction between the robot and the formation may be used to advance the robot forward so that the composite coiled tubing and the BHA advance forward. The integral robot could be battery powered, could be powered by the composite coiled tubing power lines or could be hydraulically powered by flow through the BHA.

Figure 46:
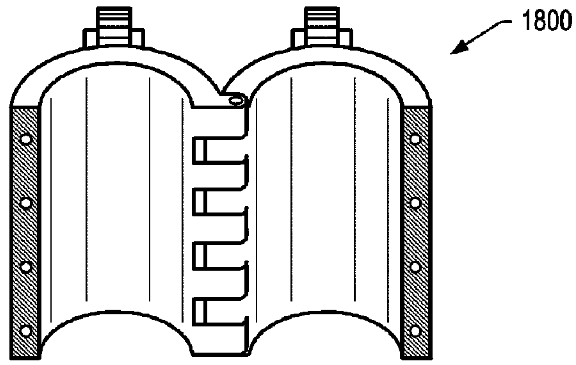
FIG. 46 depicts a perspective representation of a robot used to move the bottom hole assembly in a wellbore.
Figure 47:
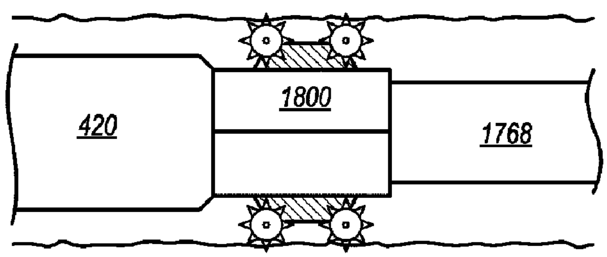
FIG. 47 depicts a representation of the robot positioned against the bottom hole assembly.

FIG. 46 depicts a perspective representation of opened robot 1800. Robot 1800 may be used for propelling the BHA forward in the wellbore. Robot 1800 may include electronics, a battery, and a drive mechanism such as wheels, chains, treads, or other mechanism for advancing the robot forward. The battery and the electronics may be power the drive mechanism. Robot 1800 may be placed around composite coiled tubing and closed. Robot 1800 may travel down the composite coiled tubing but cannot pass over the BHA. FIG. 47 depicts a representation of robot attached to composite coiled tubing 1768 and abutting BHA 420. When robot 1800 reaches BHA 420, the robot may electrically couple to the BHA. BHA 420 may supply power to the robot to power the drive mechanism and/or recharge the battery of the robot. BHA 420 may send control signals to the electronics of robot 1800 that control the operation of the robot when the robot is coupled to the BHA. The control signals provided by BHA 420 may instruct robot 1800 to move forward to move the BHA forward.

Some wellbores formed in the formation may be used to facilitate formation of a perimeter barrier around a treatment area. Heat sources in the treatment area may heat hydrocarbons in the formation within the treatment area. The perimeter barrier may be, but is not limited to, a low temperature or frozen barrier formed by freeze wells, a wax barrier formed in the formation, dewatering wells, a grout wall formed in the formation, a sulfur cement barrier, a barrier formed by a gel produced in the formation, a barrier formed by precipitation of salts in the formation, a barrier formed by a polymerization reaction in the formation, and/or sheets driven into the formation. Heat sources, production wells, injection wells, dewatering wells, and/or monitoring wells may be installed in the treatment area defined by the barrier prior to, simultaneously with, or after installation of the barrier.

A low temperature zone around at least a portion of a treatment area may be formed by freeze wells. In an embodiment, refrigerant is circulated through freeze wells to form low temperature zones around each freeze well. The freeze wells are placed in the formation so that the low temperature zones overlap and form a low temperature zone around the treatment area. The low temperature zone established by freeze wells is maintained below the freezing temperature of aqueous fluid in the formation. Aqueous fluid entering the low temperature zone freezes and forms the frozen barrier. In other embodiments, the freeze barrier is formed by batch operated freeze wells. A cold fluid, such as liquid nitrogen, is introduced into the freeze wells to form low temperature zones around the freeze wells. The fluid is replenished as needed.

In some embodiments, two or more rows of freeze wells are located about all or a portion of the perimeter of the treatment area to form a thick interconnected low temperature zone. Thick low temperature zones may be formed adjacent to areas in the formation where there is a high flow rate of aqueous fluid in the formation. The thick barrier may ensure that breakthrough of the frozen barrier established by the freeze wells does not occur.

In some embodiments, a double barrier system is used to isolate a treatment area. The double barrier system may be formed with a first barrier and a second barrier. The first barrier may be formed around at least a portion of the treatment area to inhibit fluid from entering or exiting the treatment area. The second barrier may be formed around at least a portion of the first barrier to isolate an inter-barrier zone between the first barrier and the second barrier. The inter-barrier zone may have a thickness from about 1 m to about 300 m. In some embodiments, the thickness of the inter-barrier zone is from about 10 m to about 100 m, or from about 20 m to about 50 m.

The double barrier system may allow greater project depths than a single barrier system. Greater depths are possible with the double barrier system because the stepped differential pressures across the first barrier and the second barrier is less than the differential pressure across a single barrier. The smaller differential pressures across the first barrier and the second barrier make a breach of the double barrier system less likely to occur at depth for the double barrier system as compared to the single barrier system. In some embodiments, additional barriers may be positioned to connect the inner barrier to the outer barrier. The additional barriers may further strengthen the double barrier system and define compartments that limit the amount of fluid that can pass from the inter-barrier zone to the treatment area should a breach occur in the first barrier.

The first barrier and the second barrier may be the same type of barrier or different types of barriers. In some embodiments, the first barrier and the second barrier are formed by freeze wells. In some embodiments, the first barrier is formed by freeze wells, and the second barrier is a grout wall. The grout wall may be formed of cement, sulfur, sulfur cement, or combinations thereof. In some embodiments, a portion of the first barrier and/or a portion of the second barrier is a natural barrier, such as an impermeable rock formation.

In some embodiments, one or both barriers may be formed from wellbores positioned in the formation. The position of the wellbores used to form the second barrier may be adjusted relative to the wellbores used to form the first barrier to limit a separation distance between a breach or portion of the barrier that is difficult to form and the nearest wellbore. For example, if freeze wells are used to form both barriers of a double barrier system, the position of the freeze wells may be adjusted to facilitate formation of the barriers and limit the distance between a potential breach and the closest wells to the breach. Adjusting the position of the wells of the second barrier relative to the wells of the first barrier may also be used when one or more of the barriers are barriers other than freeze barriers (for example, dewatering wells, cement barriers, grout barriers, and/or wax barriers).

In some embodiments, wellbores for forming the first barrier are formed in a row in the formation. During formation of the wellbores, logging techniques and/or analysis of cores may be used to determine the principal fracture direction and/or the direction of water flow in one or more layers of the formation. In some embodiments, two or more layers of the formation may have different principal fracture directions and/or the directions of water flow that need to be addressed. In such formations, three or more barriers may need to be formed in the formation to allow for formation of the barriers that inhibit inflow of formation fluid into the treatment area or outflow of formation fluid from the treatment area. Barriers may be formed to isolate particular layers in the formation.

The principal fracture direction and/or the direction of water flow may be used to determine the placement of wells used to form the second barrier relative to the wells used to form the first barrier. The placement of the wells may facilitate formation of the first barrier and the second barrier.

Figure 48:
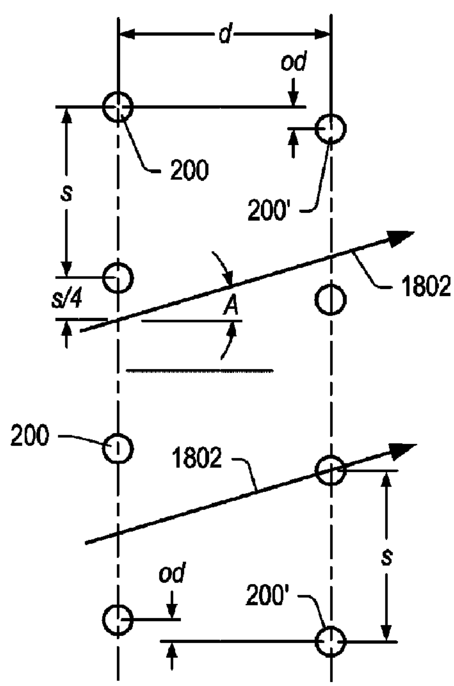
FIG. 48 depicts a schematic representation of a first group of barrier wells used to form a first barrier and a second group of barrier wells used to form a second barrier.

FIG. 48 depicts a schematic representation of barrier wells 200 used to form a first barrier and barrier wells 200' used to form a second barrier when the principal fracture direction and/or the direction of water flow is at angle A relative to the first barrier. The principal fracture direction and/or direction of water flow is indicated by arrow 1802. The case where angle A is 0 is the case where the principal fracture direction and/or the direction of water flow is substantially normal to the barriers. Spacing between two adjacent barrier wells 200 of the first barrier or between barrier wells 200' of the second barrier are indicated by distance s. The spacing s may be 2 m, 3 m, 10 m or greater. Distance d indicates the separation distance between the first barrier and the second barrier. Distance d may be less than s, equal to s, or greater than s. Barrier wells 200' of the second barrier may have offset distance od relative to barrier wells 200 of the first barrier. Offset distance od may be calculated by the equation:

$$od = s/2 - d^{*}\tan(A) \qquad \text{(EQN. 1)}$$

Using the od according to EQN. 1 maintains a maximum separation distance of s/4 between a barrier well and a regular fracture extending between the barriers. Having a maximum separation distance of s/4 by adjusting the offset distance based on the principal fracture direction and/or the direction of water flow may enhance formation of the first barrier and/or second barrier. Having a maximum separation distance of s/4 by adjusting the offset distance of wells of the second barrier relative to the wells of the first barrier based on the principal fracture direction and/or the direction of water flow may reduce the time needed to reform the first barrier and/or the second barrier should a breach of the first barrier and/or the second barrier occur.

In some embodiments, od may be set at a value between the value generated by EQN. 1 and the worst case value. The worst case value of od may be if barrier wells 200 of the first freeze barrier and barrier wells 200' of the second barrier are located along the principal fracture direction and/or direction of water flow (i.e., along arrow 1802). In such a case, the maximum separation distance would be s/2. Having a maximum separation distance of s/2 may slow the time needed to form the first barrier and/or the second barrier, or may inhibit formation of the barriers.

In some embodiments, the barrier wells for the treatment area are freeze wells. Vertically positioned freeze wells and/or horizontally positioned freeze wells may be positioned around sides of the treatment area. If the upper layer (the overburden) or the lower layer (the underburden) of the formation is likely to allow fluid flow into the treatment area or out of the treatment area, horizontally positioned freeze wells may be used to form an upper and/or a lower barrier for the treatment area. In some embodiments, an upper barrier and/or a lower barrier may not be necessary if the upper layer and/or the lower layer are at least substantially impermeable. If the upper freeze barrier is formed, portions of heat sources, production wells, injection wells, and/or dewatering wells that pass through the low temperature zone created by the freeze wells forming the upper freeze barrier wells may be insulated and/or heat traced so that the low temperature zone does not adversely affect the functioning of the heat sources, production wells, injection wells and/or dewatering wells passing through the low temperature zone.

Figure 49:
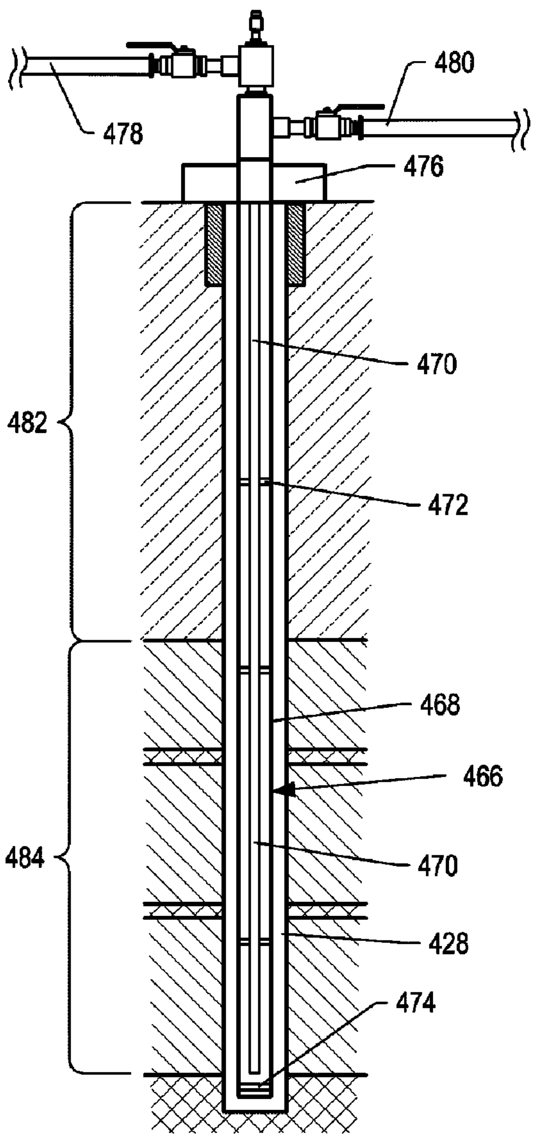
FIG. 49 depicts an embodiment of a freeze well for a circulated liquid refrigeration system, wherein a cutaway view of the freeze well is represented below ground surface.

FIG. 49 depicts an embodiment of freeze well 466. Freeze well 466 may include canister 468, inlet conduit 470, spacers 472, and wellcap 474. Spacers 472 may position inlet conduit 470 in canister 468 so that an annular space is formed between the canister and the conduit. Spacers 472 may promote turbulent flow of refrigerant in the annular space between inlet conduit 470 and canister 468, but the spacers may also cause a significant fluid pressure drop. Turbulent fluid flow in the annular space may be promoted by roughening the inner surface of canister 468, by roughening the outer surface of inlet conduit 470, and/or by having a small cross-sectional area annular space that allows for high refrigerant velocity in the annular space. In some embodiments, spacers are not used. Wellhead 476 may suspend canister 468 in wellbore 428.

Formation refrigerant may flow through cold side conduit 478 from a refrigeration unit to inlet conduit 470 of freeze well 466. The formation refrigerant may flow through an annular space between inlet conduit 470 and canister 468 to warm side conduit 480. Heat may transfer from the formation to canister 468 and from the canister to the formation refrigerant in the annular space. Inlet conduit 470 may be insulated to inhibit heat transfer to the formation refrigerant during passage of the formation refrigerant into freeze well 466. In an embodiment, inlet conduit 470 is a high density polyethylene tube. At cold temperatures, some polymers may exhibit a large amount of thermal contraction. For example, a 260 m initial length of polyethylene conduit subjected to a temperature of about −25° C. may contract by 6 m or more. If a high density polyethylene conduit, or other polymer conduit, is used, the large thermal contraction of the material must be taken into account in determining the final depth of the freeze well. For example, the freeze well may be drilled deeper than needed, and the conduit may be allowed to shrink back during use. In some embodiments, inlet conduit 470 is an insulated metal tube. In some embodiments, the insulation may be a polymer coating, such as, but not limited to, polyvinylchloride, high density polyethylene, and/or polystyrene.

Freeze well 466 may be introduced into the formation using a coiled tubing rig. In an embodiment, canister 468 and inlet conduit 470 are wound on a single reel. The coiled tubing rig introduces the canister and inlet conduit 470 into the formation. In an embodiment, canister 468 is wound on a first reel and inlet conduit 470 is wound on a second reel. The coiled tubing rig introduces canister 468 into the formation. Then, the coiled tubing rig is used to introduce inlet conduit 470 into the canister. In other embodiments, freeze well is assembled in sections at the wellbore site and introduced into the formation.

An insulated section of freeze well 466 may be placed adjacent to overburden 482. An uninsulated section of freeze well 466 may be placed adjacent to layer or layers 484 where a low temperature zone is to be formed. In some embodiments, uninsulated sections of the freeze wells may be positioned adjacent only to aquifers or other permeable portions of the formation that would allow fluid to flow into or out of the treatment area. Portions of the formation where uninsulated sections of the freeze wells are to be placed may be determined using analysis of cores and/or logging techniques.

Figure 50:
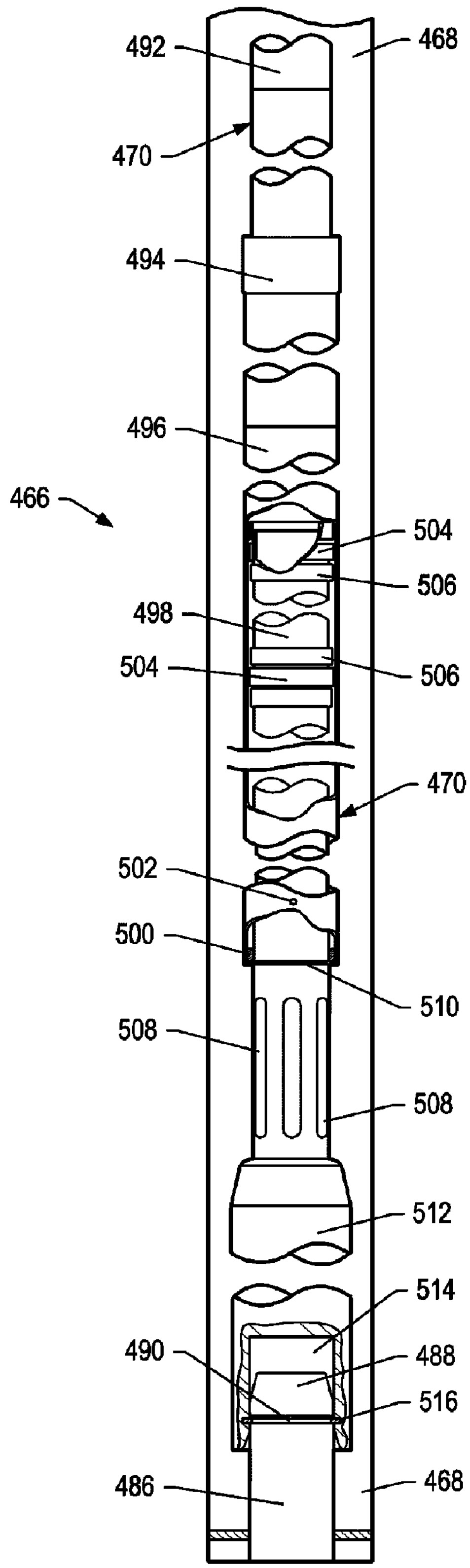
FIG. 50 depicts a representation of a portion of a freeze well embodiment.

FIG. 50 depicts an embodiment of the lower portion of freeze well 466. Freeze well may include canister 468, and inlet conduit 470. Latch pin 486 may be welded to canister 468. Latch pin 486 may include tapered upper end 488 and groove 490. Tapered upper end 488 may facilitate placement of a latch of inlet conduit 470 on latch pin 486. A spring ring of the latch may be positioned in groove 490 to couple inlet conduit 470 to canister 468.

Inlet conduit 470 may include plastic portion 492, transition piece 494, outer sleeve 496, and inner sleeve 498. Plastic portion 492 may be a plastic conduit that carries refrigerant into freeze well 466. In some embodiments, plastic portion 492 is high density polyethylene pipe.

Transition piece 494 may be a transition between plastic portion 492 and outer sleeve 496. A plastic end of transition piece 494 may be fusion welded to the end of plastic portion 492. A metal portion of transition piece may be butt welded to outer sleeve 496. In some embodiments, the metal portion and outer sleeve 496 are formed of 304 stainless steel. Other material may be used in other embodiments. Transition pieces 494 may be available from Central Plastics Company (Shawnee, Okla., U.S.A.).

In some embodiments, outer sleeve 496 may include stop 500. Stop 500 may engage a stop of inner sleeve 498 to limit a bottom position of the outer sleeve relative to the inner sleeve. In some embodiments, outer sleeve 496 may include opening 502. Opening 502 may align with a corresponding opening in inner sleeve 498. A shear pin may be positioned in the openings during insertion of inlet conduit 470 in canister 468 to inhibit movement of outer sleeve 496 relative to inner sleeve 498. Shear pin is strong enough to support the weight of inner sleeve 498, but weak enough to shear due to force applied to the shear pin when outer sleeve 496 moves upwards in the wellbore due to thermal contraction or during installation of the inlet conduit after inlet conduit is coupled to canister 468.

Inner sleeve 498 may be positioned in outer sleeve 496. Inner sleeve has a length sufficient to inhibit separation of the inner sleeve from outer sleeve 496 when inlet conduit has fully contracted due to exposure of the inlet conduit to low temperature refrigerant. Inner sleeve 498 may include a plurality of slip rings 504 held in place by positioners 506, a plurality of openings 508, stop 510, and latch 512. Slip rings 504 may position inner sleeve 498 relative to outer sleeve 496 and allow the outer sleeve to move relative to the inner sleeve. In some embodiments, slip rings 504 are TEFLON® rings, such as polytetrafluoroethylene rings. Slip rings 504 may be made of different material in other embodiments. Positioners 506 may be steel rings welded to inner sleeve. Positioners 506 may be thinner than slip rings 504. Positioners 506 may inhibit movement of slip rings 504 relative to inner sleeve 498.

Openings 508 may be formed in a portion of inner sleeve 498 near the bottom of the inner sleeve. Openings 508 may allow refrigerant to pass from inlet conduit 470 to canister 468. A majority of refrigerant flowing through inlet conduit 470 may pass through openings 508 to canister 468. Some refrigerant flowing through inlet conduit 470 may pass to canister 468 through the space between inner sleeve 498 and outer sleeve 496.

Stop 510 may be located above openings 508. Stop 510 interacts with stop 500 of outer sleeve 496 to limit the downward movement of the outer sleeve relative to inner sleeve 498.

Latch 512 may be welded to the bottom of inner sleeve 498. Latch 512 may include flared opening 514 that engages tapered end 488 of latch pin 486. Latch 512 may include spring ring 516 that snaps into groove 490 of latch pin 486 to couple inlet conduit 470 to canister 468.

To install freeze well 466, a wellbore is formed in the formation and canister 468 is placed in the wellbore. The bottom of canister 468 has latch pin 486. Transition piece is fusion welded to an end of coiled plastic portion 492 of inlet conduit 470. Latch 512 is placed in canister 468 and inlet conduit is spooled into the canister. Spacers may be coupled to plastic portion 492 at selected positions. Latch may be lowered until flared opening 514 engages tapered end 488 of latch pin 486 and spring ring 516 snaps into the groove of the latch pin. After spring ring 516 engages latch pin 486, inlet conduit 470 may be moved upwards to shear the pin joining outer sleeve 496 to inner sleeve 498. Inlet conduit 470 may be coupled to the refrigerant supply piping and canister may be coupled to the refrigerant return piping.

If needed, inlet conduit 470 may be removed from canister 468. Inlet conduit may be pulled upwards to separate outer sleeve 496 from inner sleeve 498. Plastic portion 492, transition piece 494, and outer sleeve 496 may be pulled out of canister 468. A removal instrument may be lowered into canister 468. The removal instrument may secure to inner sleeve 498. The removal instrument may be pulled upwards to pull spring ring 516 of latch 512 out of groove 490 of latch pin 486. The removal tool may be withdrawn out of canister 468 to remove inner sleeve 498 from the canister.

Grout, wax, polymer or other material may be used in combination with freeze wells to provide a barrier for the in situ heat treatment process. The material may fill cavities (vugs) in the formation and reduces the permeability of the formation. The material may have higher thermal conductivity than gas and/or formation fluid that fills cavities in the formation. Placing material in the cavities may allow for faster low temperature zone formation. The material may form a perpetual barrier in the formation that may strengthen the formation. The use of material to form the barrier in unconsolidated or substantially unconsolidated formation material may allow for larger well spacing than is possible without the use of the material. The combination of the material and the low temperature zone formed by freeze wells may constitute a double barrier for environmental regulation purposes. In some embodiments, the material is introduced into the formation as a liquid, and the liquid sets in the formation to form a solid. The material may be, but is not limited to, fine cement, micro fine cement, sulfur, sulfur cement, viscous thermoplastics, and/or waxes. The material may include surfactants, stabilizers or other chemicals that modify the properties of the material. For example, the presence of surfactant in the material may promote entry of the material into small openings in the formation.

Material may be introduced into the formation through freeze well wellbores. The material may be allowed to set. The integrity of the wall formed by the material may be checked. The integrity of the material wall may be checked by logging techniques and/or by hydrostatic testing. If the permeability of a section formed by the material is too high, additional material may be introduced into the formation through freeze well wellbores. After the permeability of the section is sufficiently reduced, freeze wells may be installed in the freeze well wellbores.

Material may be injected into the formation at a pressure that is high, but below the fracture pressure of the formation. In some embodiments, injection of material is performed in 16 m increments in the freeze wellbore. Larger or smaller increments may be used if desired. In some embodiments, material is only applied to certain portions of the formation. For example, material may be applied to the formation through the freeze wellbore only adjacent to aquifer zones and/or to relatively high permeability zones (for example, zones with a permeability greater than about 0.1 darcy). Applying material to aquifers may inhibit migration of water from one aquifer to a different aquifer. For material placed in the formation through freeze well wellbores, the material may inhibit water migration between aquifers during formation of the low temperature zone. The material may also inhibit water migration between aquifers when an established low temperature zone is allowed to thaw.

In some embodiments, the material used to form a barrier may be fine cement and micro fine cement. Cement may provide structural support in the formation. Fine cement may be ASTM type 3 Portland cement. Fine cement may be less expensive than micro fine cement. In an embodiment, a freeze wellbore is formed in the formation. Selected portions of the freeze wellbore are grouted using fine cement. Then, micro fine cement is injected into the formation through the freeze wellbore. The fine cement may reduce the permeability down to about 10 millidarcy. The micro fine cement may further reduce the permeability to about 0.1 millidarcy. After the grout is introduced into the formation, a freeze wellbore canister may be inserted into the formation. The process may be repeated for each freeze well that will be used to form the barrier.

In some embodiments, fine cement is introduced into every other freeze wellbore. Micro fine cement is introduced into the remaining wellbores. For example, grout may be used in a formation with freeze wellbores set at about 5 m spacing. A first wellbore is drilled and fine cement is introduced into the formation through the wellbore. A freeze well canister is positioned in the first wellbore. A second wellbore is drilled 10 m away from the first wellbore. Fine cement is introduced into the formation through the second wellbore. A freeze well canister is positioned in the second wellbore. A third wellbore is drilled between the first wellbore and the second wellbore. In some embodiments, grout from the first and/or second wellbores may be detected in the cuttings of the third wellbore. Micro fine cement is introduced into the formation through the third wellbore. A freeze wellbore canister is positioned in the third wellbore. The same procedure is used to form the remaining freeze wells that will form the barrier around the treatment area.

In some embodiments, material including wax is used to form a barrier in a formation. Wax barriers may be formed in wet, dry, or oil wetted formations. Wax barriers may be formed above, at the bottom of, and/or below the water table. Material including liquid wax introduced into the formation may permeate into adjacent rock and fractures in the formation. The material may permeate into rock to fill microscopic as well as macroscopic pores and vugs in the rock. The wax solidifies to form a barrier that inhibits fluid flow into or out of a treatment area. A wax barrier may provide a minimal amount of structural support in the formation. Molten wax may reduce the strength of poorly consolidated soil by reducing inter-grain friction so that the poorly consolidated soil sloughs or liquefies. Poorly consolidated layers may be consolidated by use of cement or other binding agents before introduction of molten wax.

In some embodiments, the formation where a wax barrier is to be established is dewatered before and/or during formation of the wax barrier. In some embodiments, the portion of the formation where the wax barrier is to form is dewatered or diluted to remove or reduce saline water that could adversely affect the properties of the material introduced into the formation to form the wax barrier.

In some embodiments, water is introduced into the formation during formation of the wax barrier. Water may be introduced into the formation when the barrier is to be formed below the water table or in a dry portion of the formation. The water may be used to heat the formation to a desired temperature before introducing the material that forms the wax barrier. The water may be introduced at an elevated temperature and/or the water may be heated in the formation from one or more heaters.

The wax of the barrier may be a branched paraffin to inhibit biological degradation of the wax. The wax may include stabilizers, surfactants or other chemicals that modify the physical and/or chemical properties of the wax. The physical properties may be tailored to meet specific needs. The wax may melt at a relative low temperature (for example, the wax may have a typical melting point of about 52° C.). The temperature at which the wax congeals may be at least 5° C., 10° C., 20° C., or 30° C. above the ambient temperature of the formation prior to any heating of the formation. When molten, the wax may have a relatively low viscosity (for example, 4 to 10 cp at about 99° C.). The flash point of the wax may be relatively high (for example, the flash point may be over 204° C.). The wax may have a density less than the density of water and may have a heat capacity that is less than half the heat capacity of water. The solid wax may have a low thermal conductivity (for example, about 0.18 W/m ° C.) So that the solid wax is a thermal insulator. Waxes suitable for forming a barrier are available as WAXFIX™ from Carter Technologies Company (Sugar Land, Tex., U.S.A.). WAXFIX™ is very resistant to microbial attack. WAXFIX™ may have a half life of greater than 5000 years.

In some embodiments, a wax barrier or wax barriers may be used as the barriers for the in situ heat treatment process. In some embodiments, a wax barrier may be used in conjunction with freeze wells that form a low temperature barrier around the treatment area. In some embodiments, the wax barrier is formed and freeze wells are installed in the wellbores used for introducing wax into the formation. In some embodiments, the wax barrier is formed in wellbores offset from the freeze well wellbores. The wax barrier may be on the outside or the inside of the freeze wells. In some embodiments, a wax barrier may be formed on both the inside and outside of the freeze wells. The wax barrier may inhibit water flow in the formation that would inhibit the formation of the low temperature zone by the freeze wells. In some embodiments, a wax barrier is formed in the inter-barrier zone between two freeze barriers of a double barrier system.

Material used to form the wax barrier may be introduced into the formation through wellbores. The wellbores may include vertical wellbores, slanted wellbores, and/or horizontal wellbores (for example, wellbores with sections that are horizontally or near horizontally oriented). The use of vertical wellbores, slanted wellbores, and/or horizontal wellbores for forming the wax barrier allows the formation of a barrier that seals both horizontal and vertical fractures.

Wellbores may be formed in the formation around the treatment area at a close spacing. In some embodiments, the spacing is from about 1.5 m to about 4 m. Larger or smaller spacings may be used. Low temperature heaters may be inserted in the wellbores. The heaters may operate at temperatures from about 260° C. to about 320° C. so that the temperature at the formation face is below the pyrolysis temperature of hydrocarbons in the formation. The heaters may be activated to heat the formation until the overlap between two adjacent heaters raises the temperature of the zone between the two heaters above the melting temperature of the wax. Heating the formation to obtain superposition of heat with a temperature above the melting temperature of the wax may take one month, two months, or longer. After heating, the heaters may be turned off. In some embodiments, the heaters are downhole antennas that operate at about 10 MHz to heat the formation.

After heating, the material used to form the wax barrier may be introduced into the wellbores to form the barrier. The material may flow into the formation and fill any fractures and porosity that has been heated. The wax in the material congeals when the wax flows to cold regions beyond the heated circumference. This wax barrier formation method may form a more complete barrier than some other methods of wax barrier formation, but the time for heating may be longer than for some of the other methods. Also, if a low temperature barrier is to be formed with the freeze wells placed in the wellbores used for injection of the material used to form the barrier, the freeze wells will have to remove the heat supplied to the formation to allow for introduction of the material used to form the barrier. The low temperature barrier may take longer to form.

Figure 51:
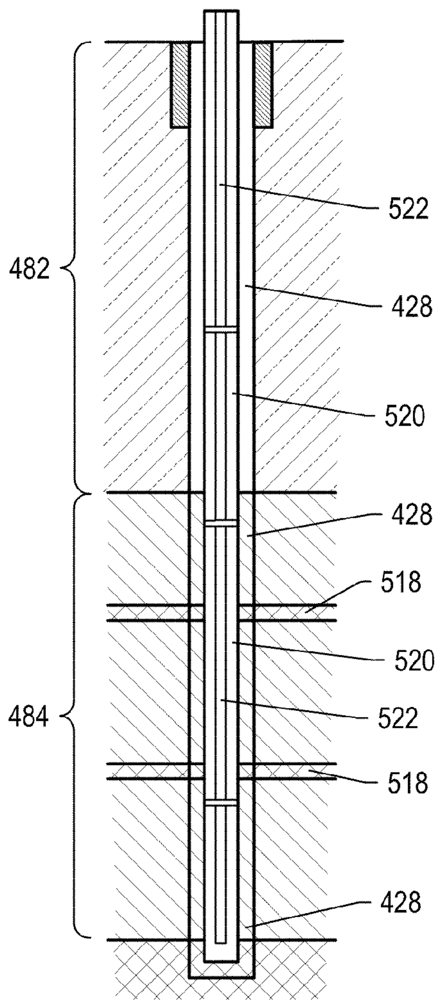
FIG. 51 depicts an embodiment of a wellbore for introducing wax into a formation to form a wax barrier.

In some embodiments, the wax barrier may be formed using a conduit placed in the wellbore. FIG. 51 depicts an embodiment of a system for forming a wax barrier in a formation. Wellbore 428 may extend into one or more layers 484 below overburden 482. Wellbore 428 may be an open wellbore below overburden 482. One or more of the layers 484 may include fracture systems 518. One or more of the layers may be vuggy so that the layer or a portion of the layer has a high porosity. Conduit 520 may be positioned in wellbore 428. In some embodiments, low temperature heater 522 may be strapped or attached to conduit 520. In some embodiments, conduit 520 may be a heater element. Heater 522 may be operated so that the heater does not cause pyrolysis of hydrocarbons adjacent to the heater. At least a portion of wellbore

428 may be filled with fluid. The fluid may be formation fluid or water. Heater 522 may be activated to heat the fluid. A portion of the heated fluid may move outwards from heater 522 into the formation. The heated fluid may be injected into the fractures and permeable vuggy zones. The heated fluid may be injected into the fractures and permeable vuggy zones by introducing heated barrier material into wellbore 428 in the annular space between conduit 520 and the wellbore. The introduced material flows to the areas heated by the fluid and congeals when the fluid reaches cold regions not heated by the fluid. The material fills fracture systems 518 and permeable vuggy pathways heated by the fluid, but the material may not permeate through a significant portion of the rock matrix as when the hot material is introduced into a heated formation as described above. The material flows into fracture systems 518 a sufficient distance to join with material injected from an adjacent well so that a barrier to fluid flow through the fracture systems forms when the wax congeals. A portion of material may congeal along the wall of a fracture or a vug without completely blocking the fracture or filling the vug. The congealed material may act as an insulator and allow additional liquid wax to flow beyond the congealed portion to penetrate deeply into the formation and form blockages to fluid flow when the material cools below the melting temperature of the wax in the material.

Material in the annular space of wellbore 428 between conduit 520 and the formation may be removed through conduit by displacing the material with water or other fluid. Conduit 520 may be removed and a freeze well may be installed in the wellbore. This method may use less material than the method described above. The heating of the fluid may be accomplished in less than a week or within a day. The small amount of heat input may allow for quicker formation of a low temperature barrier if freeze wells are to be positioned in the wellbores used to introduce material into the formation.

In some embodiments, a heater may be suspended in the well without a conduit that allows for removal of excess material from the wellbore. The material may be introduced into the well. After material introduction, the heater may be removed from the well. In some embodiments, a conduit may be positioned in the wellbore, but a heater may not be coupled to the conduit. Hot material may be circulated through the conduit so that the wax enters fractures systems and/or vugs adjacent to the wellbore.

In some embodiments, material may be used during the formation of a wellbore to improve inter-zonal isolation and protect a low-pressure zone from inflow from a high-pressure zone. During wellbore formation where a high pressure zone and a low pressure zone are penetrated by a common wellbore, it is possible for fluid from the high pressure zone to flow into the low pressure zone and cause an underground blowout. To avoid this, the wellbore may be formed through the first zone. Then, an intermediate casing may be set and cemented through the first zone. Setting casing may be time consuming and expensive. Instead of setting a casing, material may be introduced to form a wax barrier that seals the first zone. The material may also inhibit or prevent mixing of high salinity brines from lower, high pressure zones with fresher brines in upper, lower pressure zones.

Figure 52A:
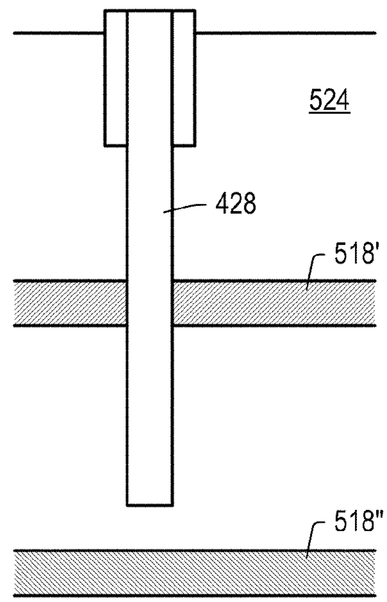
FIG. 52A depicts a representation of a wellbore drilled to an intermediate depth in a formation.
Figure 52B:
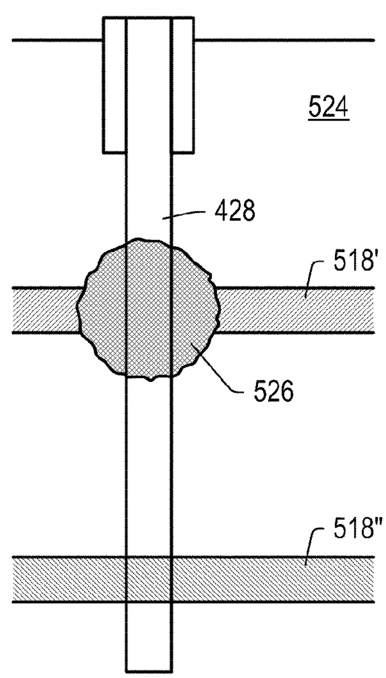
FIG. 52B depicts a representation of the wellbore drilled to the final depth in the formation.

FIG. 52A depicts wellbore 428 drilled to a first depth in formation 524. After the surface casing for wellbore 428 is set and cemented in place, the wellbore is drilled to the first depth which passes through a permeable zone, such as an aquifer. The permeable zone may be fracture system 518'. In some embodiments, a heater is placed in wellbore 428 to heat the vertical interval of fracture system 518'. In some embodiments, hot fluid is circulated in wellbore 428 to heat the vertical interval of fracture system 518'. After heating, molten material is pumped down wellbore 428. The molten material flows a selected distance into fracture system 518' before the material cools sufficiently to solidify and form a seal. The molten material is introduced into formation 524 at a pressure below the fracture pressure of the formation. In some embodiments, pressure is maintained on the wellhead until the material has solidified. In some embodiments, the material is allowed to cool until the material in wellbore 428 is almost to the congealing temperature of the material. The material in wellbore 428 may then be displaced out of the wellbore. Wax in the material makes the portion of formation 524 near wellbore 428 into a substantially impermeable zone. Wellbore 428 may be drilled to depth through one or more permeable zones that are at higher pressures than the pressure in the first permeable zone, such as fracture system 518". Congealed wax in fracture system 518' may inhibit blowout into the lower pressure zone. FIG. 52B depicts wellbore 428 drilled to depth with congealed wax 526 in formation 524.

In some embodiments, a material including wax may be used to contain and inhibit migration in a subsurface formation that has liquid hydrocarbon contaminants (for example, compounds such as benzene, toluene, ethylbenzene and xylene) condensed in fractures in the formation. The location of the contaminants may be surrounded with heated injection wells. The material may be introduced into the wells to form an outer wax barrier. The material injected into the fractures from the injection wells may mix with the contaminants. The contaminants may be solubilized into the material. When the material congeals, the contaminants may be permanently contained in the solid wax phase of the material.

In some embodiments, a portion or all of the wax barrier may be removed after completion of the in situ heat treatment process. Removing all or a portion of the wax barrier may allow fluid to flow into and out of the treatment area of the in situ heat treatment process. Removing all or a portion of the wax barrier may return flow conditions in the formation to substantially the same conditions as existed before the in situ heat treatment process. To remove a portion or all of the wax barrier, heaters may be used to heat the formation adjacent to the wax barrier. In some embodiments, the heaters raise the temperature above the decomposition temperature of the material forming the wax barrier. In some embodiments, the heaters raise the temperature above the melting temperature of the material forming the wax barrier. Fluid (for example water) may be introduced into the formation to drive the molten material to one or more production wells positioned in the formation. The production wells may remove the material from the formation.

In some embodiments, a composition that includes a cross-linkable polymer may be used with or in addition to a material that includes wax to form the barrier. Such composition may be provided to the formation as is described above for the material that includes wax. The composition may be configured to react and solidify after a selected time in the formation, thereby allowing the composition to be provided as a liquid to the formation. The cross-linkable polymer may include, for example, acrylates, methacrylates, urethanes, and/or epoxies. A cross-linking initiator may be included in the composition. The composition may also include a cross-linking inhibitor. The cross-linking inhibitor may be configured to degrade while in the formation, thereby allowing the composition to solidify.

In situ heat treatment processes and solution mining processes may heat the treatment area, remove mass from the treatment area, and greatly increase the permeability of the treatment area. In certain embodiments, the treatment area after being treated may have a permeability of at least 0.1 darcy. In some embodiments, the treatment area after being treated has a permeability of at least 1 darcy, of at least 10 darcy, or of at least 100 darcy. The increased permeability allows the fluid to spread in the formation into fractures, microfractures, and/or pore spaces in the formation. Outside of the treatment area, the permeability may remain at the initial permeability of the formation. The increased permeability allows fluid introduced to flow easily within the formation.

In certain embodiments, a barrier may be formed in the formation after a solution mining process and/or an in situ heat treatment process by introducing a fluid into the formation. The barrier may inhibit formation fluid from entering the treatment area after the solution mining and/or in situ heat treatment processes have ended. The barrier formed by introducing fluid into the formation may allow for isolation of the treatment area.

The fluid introduced into the formation to form a barrier may include wax, bitumen, heavy oil, sulfur, polymer, gel, saturated saline solution, and/or one or more reactants that react to form a precipitate, solid or high viscosity fluid in the formation. In some embodiments, bitumen, heavy oil, reactants and/or sulfur used to form the barrier are obtained from treatment facilities associated with the in situ heat treatment process. For example, sulfur may be obtained from a Claus process used to treat produced gases to remove hydrogen sulfide and other sulfur compounds.

The fluid may be introduced into the formation as a liquid, vapor, or mixed phase fluid. The fluid may be introduced into a portion of the formation that is at an elevated temperature. In some embodiments, the fluid is introduced into the formation through wells located near a perimeter of the treatment area. The fluid may be directed away from the treatment area. The elevated temperature of the formation maintains or allows the fluid to have a low viscosity so that the fluid moves away from the wells. A portion of the fluid may spread outwards in the formation towards a cooler portion of the formation. The relatively high permeability of the formation allows fluid introduced from one wellbore to spread and mix with fluid introduced from other wellbores. In the cooler portion of the formation, the viscosity of the fluid increases, a portion of the fluid precipitates, and/or the fluid solidifies or thickens so that the fluid forms the barrier to flow of formation fluid into or out of the treatment area.

In some embodiments, a low temperature barrier formed by freeze wells surrounds all or a portion of the treatment area. As the fluid introduced into the formation approaches the low temperature barrier, the temperature of the formation becomes colder. The colder temperature increases the viscosity of the fluid, enhances precipitation, and/or solidifies the fluid to form the barrier to the flow of formation fluid into or out of the formation. The fluid may remain in the formation as a highly viscous fluid or a solid after the low temperature barrier has dissipated.

In certain embodiments, saturated saline solution is introduced into the formation. Components in the saturated saline solution may precipitate out of solution when the solution reaches a colder temperature. The solidified particles may form the barrier to the flow of formation fluid into or out of the formation. The solidified components may be substantially insoluble in formation fluid.

In certain embodiments, brine is introduced into the formation as a reactant. A second reactant, such as carbon dioxide, may be introduced into the formation to react with the brine. The reaction may generate a mineral complex that grows in the formation. The mineral complex may be substantially insoluble to formation fluid. In an embodiment, the brine solution includes a sodium and aluminum solution. The second reactant introduced in the formation is carbon dioxide. The carbon dioxide reacts with the brine solution to produce dawsonite. The minerals may solidify and form the barrier to the flow of formation fluid into or out of the formation.

In some embodiments, the barrier may be formed around a treatment area using sulfur. Advantageously, elemental sulfur is insoluble in water. Liquid and/or solid sulfur in the formation may form a barrier to formation fluid flow into or out of the treatment area.

A sulfur barrier may be established in the formation during or before initiation of heating to heat the treatment area of the in situ heat treatment process. In some embodiments, sulfur may be introduced into wellbores in the formation that are located between the treatment area and a first barrier (for example, a low temperature barrier established by freeze wells). The formation adjacent to the wellbores that the sulfur is introduced into may be dewatered. In some embodiments, the formation adjacent to the wellbores that the sulfur is introduced into is heated to facilitate removal of water and to prepare the wellbores and adjacent formation for the introduction of sulfur. The formation adjacent to the wellbores may be heated to a temperature below the pyrolysis temperature of hydrocarbons in the formation. The formation may be heated so that the temperature of a portion of the formation between two adjacent heaters is influenced by both heaters. In some embodiments, the heat may increase the permeability of the formation so that a first wellbore is in fluid communication with an adjacent wellbore.

After the formation adjacent to the wellbores is heated, molten sulfur at a temperature below the pyrolysis temperature of hydrocarbons in the formation is introduced into the formation. Over a certain temperature range, the viscosity of molten sulfur increases with increasing temperature. The molten sulfur introduced into the formation may be near the melting temperature of sulfur (about 115° C.) So that the sulfur has a relatively low viscosity (about 4-10 cp). Heaters in the wellbores may be temperature limited heaters with Curie temperatures near the melting temperature of sulfur so that the temperature of the molten sulfur stays relatively constant and below temperatures resulting in the formation of viscous molten sulfur. In some embodiments, the region adjacent to the wellbores may be heated to a temperature above the melting point of sulfur, but below the pyrolysis temperature of hydrocarbons in the formation. The heaters may be turned off and the temperature in the wellbores may be monitored (for example, using a fiber optic temperature monitoring system). When the temperature in the wellbore cools to a temperature near the melting temperature of sulfur, molten sulfur may be introduced into the formation.

The sulfur introduced into the formation is allowed to flow and diffuse into the formation from the wellbores. As the sulfur enters portions of the formation below the melting temperature, the sulfur solidifies and forms a barrier to fluid flow in the formation. Sulfur may be introduced until the formation is not able to accept additional sulfur. Heating may be stopped, and the formation may be allowed to naturally cool so that the sulfur in the formation solidifies. After introduction of the sulfur, the integrity of the formed barrier may be tested using pulse tests and/or tracer tests.

A barrier may be formed around the treatment area after the in situ heat treatment process. The sulfur may form a substantially permanent barrier in the formation. In some embodiments, a low temperature barrier formed by freeze wells surrounds the treatment area. Sulfur may be introduced on one or both sides of the low temperature barrier to form a barrier in the formation. The sulfur may be introduced into the formation as vapor or a liquid. As the sulfur approaches the low temperature barrier, the sulfur may condense and/or solidify in the formation to form the barrier.

In some embodiments, the sulfur may be introduced in the heated portion of the portion. The sulfur may be introduced into the formation through wells located near the perimeter of the treatment area. The temperature of the formation may be hotter than the vaporization temperature of sulfur (about 445° C.). The sulfur may be introduced as a liquid, vapor or mixed phase fluid. If a part of the introduced sulfur is in the liquid phase, the heat of the formation may vaporize the sulfur. The sulfur may flow outwards from the introduction wells towards cooler portions of the formation. The sulfur may condense and/or solidify in the formation to form the barrier.

In some embodiments, the Claus reaction may be used to form sulfur in the formation after the in situ heat treatment process. The Claus reaction is a gas phase equilibrium reaction. The Claus reaction is:

$$4H_2S+2SO_2 \leftrightarrow 3S_2+4H_2O \quad \text{(EQN. 2)}$$

Hydrogen sulfide may be obtained by separating the hydrogen sulfide from the produced fluid of an ongoing in situ heat treatment process. A portion of the hydrogen sulfide may be burned to form the needed sulfur dioxide. Hydrogen sulfide may be introduced into the formation through a number of wells in the formation. Sulfur dioxide may be introduced into the formation through other wells. The wells used for injecting sulfur dioxide or hydrogen sulfide may have been production wells, heater wells, monitor wells or other type of well during the in situ heat treatment process. The wells used for injecting sulfur dioxide or hydrogen sulfide may be near the perimeter of the treatment area. The number of wells may be enough so that the formation in the vicinity of the injection wells does not cool to a point where the sulfur dioxide and the hydrogen sulfide can form sulfur and condense, rather than remain in the vapor phase. The wells used to introduce the sulfur dioxide into the formation may also be near the perimeter of the treatment area. In some embodiments, the hydrogen sulfide and sulfur dioxide may be introduced into the formation through the same wells (for example, through two conduits positioned in the same wellbore). The hydrogen sulfide and the sulfur dioxide may react in the formation to form sulfur and water. The sulfur may flow outwards in the formation and condense and/or solidify to form the barrier in the formation.

The sulfur barrier may form in the formation beyond the area where hydrocarbons in formation fluid generated by the heat treatment process condense in the formation. Regions near the perimeter of the treated area may be at lower temperatures than the treated area. Sulfur may condense and/or solidify from the vapor phase in these lower temperature regions. Additional hydrogen sulfide, and/or sulfur dioxide may diffuse to these lower temperature regions. Additional sulfur may form by the Claus reaction to maintain an equilibrium concentration of sulfur in the vapor phase. Eventually, a sulfur barrier may form around the treated zone. The vapor phase in the treated region may remain as an equilibrium mixture of sulfur, hydrogen sulfide, sulfur dioxide, water vapor and other vapor products present or evolving from the formation.

The conversion to sulfur is favored at lower temperatures, so the conversion of hydrogen sulfide and sulfur dioxide to sulfur may take place a distance away from the wells that introduce the reactants into the formation. The Claus reaction may result in the formation of sulfur where the temperature of the formation is cooler (for example where the temperature of the formation is at temperatures from about 180° C. to about 240° C.).

A temperature monitoring system may be installed in wellbores of freeze wells and/or in monitor wells adjacent to the freeze wells to monitor the temperature profile of the freeze wells and/or the low temperature zone established by the freeze wells. The monitoring system may be used to monitor progress of low temperature zone formation. The monitoring system may be used to determine the location of high temperature areas, potential breakthrough locations, or breakthrough locations after the low temperature zone has formed. Periodic monitoring of the temperature profile of the freeze wells and/or low temperature zone established by the freeze wells may allow additional cooling to be provided to potential trouble areas before breakthrough occurs. Additional cooling may be provided at or adjacent to breakthroughs and high temperature areas to ensure the integrity of the low temperature zone around the treatment area. Additional cooling may be provided by increasing refrigerant flow through selected freeze wells, installing an additional freeze well or freeze wells, and/or by providing a cryogenic fluid, such as liquid nitrogen, to the high temperature areas. Providing additional cooling to potential problem areas before breakthrough occurs may be more time efficient and cost efficient than sealing a breach, reheating a portion of the treatment area that has been cooled by influx of fluid, and/or remediating an area outside of the breached frozen barrier.

In some embodiments, a traveling thermocouple may be used to monitor the temperature profile of selected freeze wells or monitor wells. In some embodiments, the temperature monitoring system includes thermocouples placed at discrete locations in the wellbores of the freeze wells, in the freeze wells, and/or in the monitoring wells. In some embodiments, the temperature monitoring system comprises a fiber optic temperature monitoring system.

Fiber optic temperature monitoring systems are available from Sensornet (London, United Kingdom), Sensa (Houston, Tex., U.S.A.), Luna Energy (Blacksburg, Va., U.S.A.), Lios Technology GMBH (Cologne, Germany), Oxford Electronics Ltd. (Hampshire, United Kingdom), and Sabeus Sensor Systems (Calabasas, Calif., U.S.A.). The fiber optic temperature monitoring system includes a data system and one or more fiber optic cables. The data system includes one or more lasers for sending light to the fiber optic cable; and one or more computers, software and peripherals for receiving, analyzing, and outputting data. The data system may be coupled to one or more fiber optic cables.

A single fiber optic cable may be several kilometers long. The fiber optic cable may be installed in many freeze wells and/or monitor wells. In some embodiments, two fiber optic cables may be installed in each freeze well and/or monitor well. The two fiber optic cables may be coupled. Using two fiber optic cables per well allows for compensation due to optical losses that occur in the wells and allows for better accuracy of measured temperature profiles.

The fiber optic temperature monitoring system may be used to detect the location of a breach or a potential breach in a frozen barrier. The search for potential breaches may be performed at scheduled intervals, for example, every two or three months. To determine the location of the breach or potential breach, flow of formation refrigerant to the freeze wells of interest is stopped. In some embodiments, the flow of formation refrigerant to all of the freeze wells is stopped. The rise in the temperature profiles, as well as the rate of change of the temperature profiles, provided by the fiber optic temperature monitoring system for each freeze well can be used to determine the location of any breaches or hot spots in the low temperature zone maintained by the freeze wells. The temperature profile monitored by the fiber optic temperature monitoring system for the two freeze wells closest to the hot spot or fluid flow will show the quickest and greatest rise in temperature. A temperature change of a few degrees Centigrade in the temperature profiles of the freeze wells closest to a troubled area may be sufficient to isolate the location of the trouble area. The shut down time of flow of circulation fluid in the freeze wells of interest needed to detect breaches, potential breaches, and hot spots may be on the order of a few hours or days, depending on the well spacing and the amount of fluid flow affecting the low temperature zone.

Fiber optic temperature monitoring systems may also be used to monitor temperatures in heated portions of the formation during in situ heat treatment processes. Temperature monitoring systems positioned in production wells, heater wells, injection wells, and/or monitor wells may be used to measure temperature profiles in treatment areas subjected to in situ heat treatment processes. The fiber of a fiber optic cable used in the heated portion of the formation may be clad with a reflective material to facilitate retention of a signal or signals transmitted down the fiber. In some embodiments, the fiber is clad with gold, copper, nickel, aluminum and/or alloys thereof. The cladding may be formed of a material that is able to withstand chemical and temperature conditions in the heated portion of the formation. For example, gold cladding may allow an optical sensor to be used up to temperatures of 700° C. In some embodiments, the fiber is clad with aluminum. The fiber may be dipped in or run through a bath of liquid aluminum. The clad fiber may then be allowed to cool to secure the aluminum to the fiber. The gold or aluminum cladding may reduce hydrogen darkening of the optical fiber.

A potential source of heat loss from the heated formation is due to reflux in wells. Refluxing occurs when vapors condense in a well and flow into a portion of the well adjacent to the heated portion of the formation. Vapors may condense in the well adjacent to the overburden of the formation to form condensed fluid. Condensed fluid flowing into the well adjacent to the heated formation absorbs heat from the formation. Heat absorbed by condensed fluids cools the formation and necessitates additional energy input into the formation to maintain the formation at a desired temperature. Some fluids that condense in the overburden and flow into the portion of the well adjacent to the heated formation may react to produce undesired compounds and/or coke. Inhibiting fluids from refluxing may significantly improve the thermal efficiency of the in situ heat treatment system and/or the quality of the product produced from the in situ heat treatment system.

For some well embodiments, the portion of the well adjacent to the overburden section of the formation is cemented to the formation. In some well embodiments, the well includes packing material placed near the transition from the heated section of the formation to the overburden. The packing material inhibits formation fluid from passing from the heated section of the formation into the section of the wellbore adjacent to the overburden. Cables, conduits, devices, and/or instruments may pass through the packing material, but the packing material inhibits formation fluid from passing up the wellbore adjacent to the overburden section of the formation.

In some embodiments, one or more baffle systems may be placed in the wellbores to inhibit reflux. The baffle systems may be obstructions to fluid flow into the heated portion of the formation. In some embodiments, refluxing fluid may revaporize on the baffle system before coming into contact with the heated portion of the formation.

In some embodiments, a gas may be introduced into the formation through wellbores to inhibit reflux in the wellbores. In some embodiments, gas may be introduced into wellbores that include baffle systems to inhibit reflux of fluid in the wellbores. The gas may be carbon dioxide, methane, nitrogen or other desired gas. In some embodiments, the introduction of gas may be used in conjunction with one or more baffle systems in the wellbores. The introduced gas may enhance heat exchange at the baffle systems to help maintain top portions of the baffle systems colder than the lower portions of the baffle systems.

The flow of production fluid up the well to the surface is desired for some types of wells, especially for production wells. Flow of production fluid up the well is also desirable for some heater wells that are used to control pressure in the formation. The overburden, or a conduit in the well used to transport formation fluid from the heated portion of the formation to the surface, may be heated to inhibit condensation on or in the conduit. Providing heat in the overburden, however, may be costly and/or may lead to increased cracking or coking of formation fluid as the formation fluid is being produced from the formation.

To avoid the need to heat the overburden or to heat the conduit passing through the overburden, one or more diverters may be placed in the wellbore to inhibit fluid from refluxing into the wellbore adjacent to the heated portion of the formation. In some embodiments, the diverter retains fluid above the heated portion of the formation. Fluids retained in the diverter may be removed from the diverter using a pump, gas lifting, and/or other fluid removal technique. In certain embodiments, two or more diverters that retain fluid above the heated portion of the formation may be located in the production well. Two or more diverters provide a simple way of separating initial fractions of condensed fluid produced from the in situ heat treatment system. A pump may be placed in each of the diverters to remove condensed fluid from the diverters.

In some embodiments, the diverter directs fluid to a sump below the heated portion of the formation. An inlet for a lift system may be located in the sump. In some embodiments, the intake of the lift system is located in casing in the sump. In some embodiments, the intake of the lift system is located in an open wellbore. The sump is below the heated portion of the formation. The intake of the pump may be located 1 m, 5 m, 10 m, 20 m or more below the deepest heater used to heat the heated portion of the formation. The sump may be at a cooler temperature than the heated portion of the formation. The sump may be more than 10° C., more than 50° C., more than 75° C., or more than 100° C. below the temperature of the heated portion of the formation. A portion of the fluid entering the sump may be liquid. A portion of the fluid entering the sump may condense within the sump. The lift system moves the fluid in the sump to the surface.

Production well lift systems may be used to efficiently transport formation fluid from the bottom of the production wells to the surface. Production well lift systems may provide and maintain the maximum required well drawdown (minimum reservoir producing pressure) and producing rates. The production well lift systems may operate efficiently over a wide range of high temperature/multiphase fluids (gas/vapor/steam/water/hydrocarbon liquids) and production rates expected during the life of a typical project. Production well lift systems may include dual concentric rod pump lift systems, chamber lift systems and other types of lift systems.

Temperature limited heaters may be in configurations and/or may include materials that provide automatic temperature limiting properties for the heater at certain temperatures. In certain embodiments, ferromagnetic materials are used in temperature limited heaters. Ferromagnetic material may self-limit temperature at or near the Curie temperature of the material and/or the phase transformation temperature range to provide a reduced amount of heat when a time-varying current is applied to the material. In certain embodiments, the ferromagnetic material self-limits temperature of the temperature limited heater at a selected temperature that is approximately the Curie temperature and/or in the phase transformation temperature range. In certain embodiments, the selected temperature is within about 35° C., within about 25° C., within about 20° C., or within about 10° C. of the Curie temperature and/or the phase transformation temperature range. In certain embodiments, ferromagnetic materials are coupled with other materials (for example, highly conductive materials, high strength materials, corrosion resistant materials, or combinations thereof) to provide various electrical and/or mechanical properties. Some parts of the temperature limited heater may have a lower resistance (caused by different geometries and/or by using different ferromagnetic and/or non-ferromagnetic materials) than other parts of the temperature limited heater. Having parts of the temperature limited heater with various materials and/or dimensions allows for tailoring the desired heat output from each part of the heater.

Temperature limited heaters may be more reliable than other heaters. Temperature limited heaters may be less apt to break down or fail due to hot spots in the formation. In some embodiments, temperature limited heaters allow for substantially uniform heating of the formation. In some embodiments, temperature limited heaters are able to heat the formation more efficiently by operating at a higher average heat output along the entire length of the heater. The temperature limited heater operates at the higher average heat output along the entire length of the heater because power to the heater does not have to be reduced to the entire heater, as is the case with typical constant wattage heaters, if a temperature along any point of the heater exceeds, or is about to exceed, a maximum operating temperature of the heater. Heat output from portions of a temperature limited heater approaching a Curie temperature and/or the phase transformation temperature range of the heater automatically reduces without controlled adjustment of the time-varying current applied to the heater. The heat output automatically reduces due to changes in electrical properties (for example, electrical resistance) of portions of the temperature limited heater. Thus, more power is supplied by the temperature limited heater during a greater portion of a heating process.

In certain embodiments, the system including temperature limited heaters initially provides a first heat output and then provides a reduced (second heat output) heat output, near, at, or above the Curie temperature and/or the phase transformation temperature range of an electrically resistive portion of the heater when the temperature limited heater is energized by a time-varying current. The first heat output is the heat output at temperatures below which the temperature limited heater begins to self-limit. In some embodiments, the first heat output is the heat output at a temperature about 50° C., about 75° C., about 100° C., or about 125° C. below the Curie temperature and/or the phase transformation temperature range of the ferromagnetic material in the temperature limited heater.

The temperature limited heater may be energized by time-varying current (alternating current or modulated direct current) supplied at the wellhead. The wellhead may include a power source and other components (for example, modulation components, transformers, and/or capacitors) used in supplying power to the temperature limited heater. The temperature limited heater may be one of many heaters used to heat a portion of the formation.

In certain embodiments, the temperature limited heater includes a conductor that operates as a skin effect or proximity effect heater when time-varying current is applied to the conductor. The skin effect limits the depth of current penetration into the interior of the conductor. For ferromagnetic materials, the skin effect is dominated by the magnetic permeability of the conductor. The relative magnetic permeability of ferromagnetic materials is typically between 10 and 1000 (for example, the relative magnetic permeability of ferromagnetic materials is typically at least 10 and may be at least 50, 100, 500, 1000 or greater). As the temperature of the ferromagnetic material is raised above the Curie temperature, or the phase transformation temperature range, and/or as the applied electrical current is increased, the magnetic permeability of the ferromagnetic material decreases substantially and the skin depth expands rapidly (for example, the skin depth expands as the inverse square root of the magnetic permeability). The reduction in magnetic permeability results in a decrease in the AC or modulated DC resistance of the conductor near, at, or above the Curie temperature, the phase transformation temperature range, and/or as the applied electrical current is increased. When the temperature limited heater is powered by a substantially constant current source, portions of the heater that approach, reach, or are above the Curie temperature and/or the phase transformation temperature range may have reduced heat dissipation. Sections of the temperature limited heater that are not at or near the Curie temperature and/or the phase transformation temperature range may be dominated by skin effect heating that allows the heater to have high heat dissipation due to a higher resistive load.

Curie temperature heaters have been used in soldering equipment, heaters for medical applications, and heating elements for ovens (for example, pizza ovens). Some of these uses are disclosed in U.S. Pat. Nos. 5,579,575 to Lamome et al.; 5,065,501 to Henschen et al.; and 5,512,732 to Yagnik et al., all of which are incorporated by reference as if fully set forth herein. U.S. Pat. No. 4,849,611 to Whitney et al., which is incorporated by reference as if fully set forth herein, describes a plurality of discrete, spaced-apart heating units including a reactive component, a resistive heating component, and a temperature responsive component.

An advantage of using the temperature limited heater to heat hydrocarbons in the formation is that the conductor is chosen to have a Curie temperature and/or a phase transformation temperature range in a desired range of temperature operation. Operation within the desired operating temperature range allows substantial heat injection into the formation while maintaining the temperature of the temperature limited heater, and other equipment, below design limit temperatures. Design limit temperatures are temperatures at which properties such as corrosion, creep, and/or deformation are adversely affected. The temperature limiting properties of the temperature limited heater inhibit overheating or burnout of the heater adjacent to low thermal conductivity "hot spots" in the formation. In some embodiments, the temperature limited heater is able to lower or control heat output and/or withstand heat at temperatures above 25° C., 37° C., 100° C., 250° C., 500° C., 700° C., 800° C., 900° C., or higher up to 1131° C., depending on the materials used in the heater.

The temperature limited heater allows for more heat injection into the formation than constant wattage heaters because the energy input into the temperature limited heater does not have to be limited to accommodate low thermal conductivity regions adjacent to the heater. For example, in Green River oil shale there is a difference of at least a factor of 3 in the thermal conductivity of the lowest richness oil shale layers and the highest richness oil shale layers. When heating such a formation, substantially more heat is transferred to the formation with the temperature limited heater than with the conventional heater that is limited by the temperature at low thermal conductivity layers. The heat output along the entire length of the conventional heater needs to accommodate the low thermal conductivity layers so that the heater does not overheat at the low thermal conductivity layers and burn out. The heat output adjacent to the low thermal conductivity layers that are at high temperature will reduce for the temperature limited heater, but the remaining portions of the temperature limited heater that are not at high temperature will still provide high heat output. Because heaters for heating hydrocarbon formations typically have long lengths (for example, at least 10 m, 100 m, 300 m, 500 m, 1 km or more up to about 10 km), the majority of the length of the temperature limited heater may be operating below the Curie temperature and/or the phase transformation temperature range while only a few portions are at or near the Curie temperature and/or the phase transformation temperature range of the temperature limited heater.

The use of temperature limited heaters allows for efficient transfer of heat to the formation. Efficient transfer of heat allows for reduction in time needed to heat the formation to a desired temperature. For example, in Green River oil shale, pyrolysis typically requires 9.5 years to 10 years of heating when using a 12 m heater well spacing with conventional constant wattage heaters. For the same heater spacing, temperature limited heaters may allow a larger average heat output while maintaining heater equipment temperatures below equipment design limit temperatures. Pyrolysis in the formation may occur at an earlier time with the larger average heat output provided by temperature limited heaters than the lower average heat output provided by constant wattage heaters. For example, in Green River oil shale, pyrolysis may occur in 5 years using temperature limited heaters with a 12 m heater well spacing. Temperature limited heaters counteract hot spots due to inaccurate well spacing or drilling where heater wells come too close together. In certain embodiments, temperature limited heaters allow for increased power output over time for heater wells that have been spaced too far apart, or limit power output for heater wells that are spaced too close together. Temperature limited heaters also supply more power in regions adjacent the overburden and underburden to compensate for temperature losses in these regions.

Temperature limited heaters may be advantageously used in many types of formations. For example, in tar sands formations or relatively permeable formations containing heavy hydrocarbons, temperature limited heaters may be used to provide a controllable low temperature output for reducing the viscosity of fluids, mobilizing fluids, and/or enhancing the radial flow of fluids at or near the wellbore or in the formation. Temperature limited heaters may be used to inhibit excess coke formation due to overheating of the near wellbore region of the formation.

In some embodiments, the use of temperature limited heaters eliminates or reduces the need for expensive temperature control circuitry. For example, the use of temperature limited heaters eliminates or reduces the need to perform temperature logging and/or the need to use fixed thermocouples on the heaters to monitor potential overheating at hot spots.

In certain embodiments, phase transformation (for example, crystalline phase transformation or a change in the crystal structure) of materials used in a temperature limited heater change the selected temperature at which the heater self-limits. Ferromagnetic material used in the temperature limited heater may have a phase transformation (for example, a transformation from ferrite to austenite) that decreases the magnetic permeability of the ferromagnetic material. This reduction in magnetic permeability is similar to reduction in magnetic permeability due to the magnetic transition of the ferromagnetic material at the Curie temperature. The Curie temperature is the magnetic transition temperature of the ferrite phase of the ferromagnetic material. The reduction in magnetic permeability results in a decrease in the AC or modulated DC resistance of the temperature limited heater near, at, or above the temperature of the phase transformation and/or the Curie temperature of the ferromagnetic material.

The phase transformation of the ferromagnetic material may occur over a temperature range. The temperature range of the phase transformation depends on the ferromagnetic material and may vary, for example, over a range of about 5° C. to a range of about 200° C. Because the phase transformation takes place over a temperature range, the reduction in the magnetic permeability due to the phase transformation takes place over the temperature range. The reduction in magnetic permeability may also occur hysteretically over the temperature range of the phase transformation. In some embodiments, the phase transformation back to the lower temperature phase of the ferromagnetic material is slower than the phase transformation to the higher temperature phase (for example, the transition from austenite back to ferrite is slower than the transition from ferrite to austenite). The slower phase transformation back to the lower temperature phase may cause hysteretic operation of the heater at or near the phase transformation temperature range that allows the heater to slowly increase to higher resistance after the resistance of the heater reduces due to high temperature.

In some embodiments, the phase transformation temperature range overlaps with the reduction in the magnetic permeability when the temperature approaches the Curie temperature of the ferromagnetic material. The overlap may produce a faster drop in electrical resistance versus temperature than if the reduction in magnetic permeability is solely due to the temperature approaching the Curie temperature. The overlap may also produce hysteretic behavior of the temperature limited heater near the Curie temperature and/or in the phase transformation temperature range.

In certain embodiments, the hysteretic operation due to the phase transformation is a smoother transition than the reduction in magnetic permeability due to magnetic transition at the Curie temperature. The smoother transition may be easier to control (for example, electrical control using a process control device that interacts with the power supply) than the sharper transition at the Curie temperature. In some embodiments, the Curie temperature is located inside the phase transformation range for selected metallurgies used in temperature limited heaters. This phenomenon provides temperature limited heaters with the smooth transition properties of the phase transformation in addition to a sharp and definite transition due to the reduction in magnetic properties at the Curie temperature. Such temperature limited heaters may be easy to control (due to the phase transformation) while providing finite temperature limits (due to the sharp Curie temperature transition). Using the phase transformation temperature range instead of and/or in addition to the Curie temperature in temperature limited heaters increases the number and range of metallurgies that may be used for temperature limited heaters.

In certain embodiments, alloy additions are made to the ferromagnetic material to adjust the temperature range of the phase transformation. For example, adding carbon to the ferromagnetic material may increase the phase transformation temperature range and lower the onset temperature of the phase transformation. Adding titanium to the ferromagnetic material may increase the onset temperature of the phase transformation and decrease the phase transformation temperature range. Alloy compositions may be adjusted to provide desired Curie temperature and phase transformation properties for the ferromagnetic material. The alloy composition of the ferromagnetic material may be chosen based on desired properties for the ferromagnetic material (such as, but not limited to, magnetic permeability transition temperature or temperature range, resistance versus temperature profile, or power output). Addition of titanium may allow higher Curie temperatures to be obtained when adding cobalt to 410 stainless steel by raising the ferrite to austenite phase transformation temperature range to a temperature range that is above, or well above, the Curie temperature of the ferromagnetic material.

In some embodiments, temperature limited heaters are more economical to manufacture or make than standard heaters. Typical ferromagnetic materials include iron, carbon steel, or ferritic stainless steel. Such materials are inexpensive as compared to nickel-based heating alloys (such as nichrome, Kanthal™ (Bulten-Kanthal AB, Sweden), and/or LOHM™ (Driver-Harris Company, Harrison, N.J., U.S.A.)) typically used in insulated conductor (mineral insulated cable) heaters. In one embodiment of the temperature limited heater, the temperature limited heater is manufactured in continuous lengths as an insulated conductor heater to lower costs and improve reliability.

In some embodiments, the temperature limited heater is placed in the heater well using a coiled tubing rig. A heater that can be coiled on a spool may be manufactured by using metal such as ferritic stainless steel (for example, 409 stainless steel) that is welded using electrical resistance welding (ERW). U.S. Pat. No. 7,032,809 to Hopkins, which is incorporated by reference as if fully set forth herein, describes forming seam-welded pipe. To form a heater section, a metal strip from a roll is passed through a former where it is shaped into a tubular and then longitudinally welded using ERW.

In some embodiments, a composite tubular may be formed from the seam-welded tubular. The seam-welded tubular is passed through a second former where a conductive strip (for example, a copper strip) is applied, drawn down tightly on the tubular through a die, and longitudinally welded using ERW. A sheath may be formed by longitudinally welding a support material (for example, steel such as 347H or 347HH) over the conductive strip material. The support material may be a strip rolled over the conductive strip material. An overburden section of the heater may be formed in a similar manner.

In certain embodiments, the overburden section uses a non-ferromagnetic material such as 304 stainless steel or 316 stainless steel instead of a ferromagnetic material. The heater section and overburden section may be coupled using standard techniques such as butt welding using an orbital welder. In some embodiments, the overburden section material (the non-ferromagnetic material) may be pre-welded to the ferromagnetic material before rolling. The pre-welding may eliminate the need for a separate coupling step (for example, butt welding). In an embodiment, a flexible cable (for example, a furnace cable such as a MGT 1000 furnace cable) may be pulled through the center after forming the tubular heater. An end bushing on the flexible cable may be welded to the tubular heater to provide an electrical current return path. The tubular heater, including the flexible cable, may be coiled onto a spool before installation into a heater well. In an embodiment, the temperature limited heater is installed using the coiled tubing rig. The coiled tubing rig may place the temperature limited heater in a deformation resistant container in the formation. The deformation resistant container may be placed in the heater well using conventional methods.

Temperature limited heaters may be used for heating hydrocarbon formations including, but not limited to, oil shale formations, coal formations, tar sands formations, and formations with heavy viscous oils. Temperature limited heaters may also be used in the field of environmental remediation to vaporize or destroy soil contaminants. Embodiments of temperature limited heaters may be used to heat fluids in a wellbore or sub-sea pipeline to inhibit deposition of paraffin or various hydrates. In some embodiments, a temperature limited heater is used for solution mining a subsurface formation (for example, an oil shale or a coal formation). In certain embodiments, a fluid (for example, molten salt) is placed in a wellbore and heated with a temperature limited heater to inhibit deformation and/or collapse of the wellbore. In some embodiments, the temperature limited heater is attached to a sucker rod in the wellbore or is part of the sucker rod itself. In some embodiments, temperature limited heaters are used to heat a near wellbore region to reduce near wellbore oil viscosity during production of high viscosity crude oils and during transport of high viscosity oils to the surface. In some embodiments, a temperature limited heater enables gas lifting of a viscous oil by lowering the viscosity of the oil without coking the oil. Temperature limited heaters may be used in sulfur transfer lines to maintain temperatures between about 110° C. and about 130° C.

The ferromagnetic alloy or ferromagnetic alloys used in the temperature limited heater determine the Curie temperature of the heater. Curie temperature data for various metals is listed in "American Institute of Physics Handbook," Second Edition, McGraw-Hill, pages 5-170 through 5-176. Ferromagnetic conductors may include one or more of the ferromagnetic elements (iron, cobalt, and nickel) and/or alloys of these elements. In some embodiments, ferromagnetic conductors include iron-chromium (Fe—Cr) alloys that contain tungsten (W) (for example, HCM12A and SAVE12 (Sumitomo Metals Co., Japan) and/or iron alloys that contain chromium (for example, Fe—Cr alloys, Fe—Cr—W alloys, Fe—Cr—V (vanadium) alloys, and Fe—Cr—Nb (Niobium) alloys). Of the three main ferromagnetic elements, iron has a Curie temperature of approximately 770° C.; cobalt (Co) has a Curie temperature of approximately 1131° C.; and nickel has a Curie temperature of approximately 358° C. An iron-cobalt alloy has a Curie temperature higher than the Curie temperature of iron. For example, iron-cobalt alloy with 2% by weight cobalt has a Curie temperature of approximately 800° C.; iron-cobalt alloy with 12% by weight cobalt has a Curie temperature of approximately 900° C.; and iron-cobalt alloy with 20% by weight cobalt has a Curie temperature of approximately 950° C. Iron-nickel alloy has a Curie temperature lower than the Curie temperature of iron. For example, iron-nickel alloy with 20% by weight nickel has a Curie temperature of approximately 720° C., and iron-nickel alloy with 60% by weight nickel has a Curie temperature of approximately 560° C.

Some non-ferromagnetic elements used as alloys raise the Curie temperature of iron. For example, an iron-vanadium alloy with 5.9% by weight vanadium has a Curie temperature of approximately 815° C. Other non-ferromagnetic elements (for example, carbon, aluminum, copper, silicon, and/or chromium) may be alloyed with iron or other ferromagnetic materials to lower the Curie temperature. Non-ferromagnetic materials that raise the Curie temperature may be combined with non-ferromagnetic materials that lower the Curie temperature and alloyed with iron or other ferromagnetic materials to produce a material with a desired Curie temperature and other desired physical and/or chemical properties. In some embodiments, the Curie temperature material is a ferrite such as $NiFe_2O_4$. In other embodiments, the Curie temperature material is a binary compound such as $FeNi_3$ or $Fe_3Al$.

In some embodiments, the improved alloy includes carbon, cobalt, iron, manganese, silicon, or mixtures thereof. In certain embodiments, the improved alloy includes, by weight: about 0.1% to about 10% cobalt; about 0.1% carbon, about 0.5% manganese, about 0.5% silicon, with the balance being iron. In certain embodiments, the improved alloy includes, by weight: about 0.1% to about 10% cobalt; about 0.1% carbon, about 0.5% manganese, about 0.5% silicon, with the balance being iron.

In some embodiments, the improved alloy includes chromium, carbon, cobalt, iron, manganese, silicon, titanium, vanadium, or mixtures thereof. In certain embodiments, the improved alloy includes, by weight: about 5% to about 20% cobalt, about 0.1% carbon, about 0.5% manganese, about 0.5% silicon, about 0.1% to about 2% vanadium with the balance being iron. In some embodiments, the improved alloy includes, by weight: about 12% chromium, about 0.1% carbon, about 0.5% silicon, about 0.1% to about 0.5% manganese, above 0% to about 15% cobalt, above 0% to about 2% vanadium, above 0% to about 1% titanium, with the balance being iron. In some embodiments, the improved alloy includes, by weight: about 12% chromium, about 0.1% carbon, about 0.5% silicon, about 0.1% to about 0.5% manganese, above 0% to about 2% vanadium, above 0% to about 1% titanium, with the balance being iron. In some embodiments, the improved alloy includes, by weight: about 12% chromium, about 0.1% carbon, about 0.5% silicon, about 0.1% to about 0.5% manganese, above 0% to about 2% vanadium, with the balance being iron. In certain embodiments, the improved alloy includes, by weight: about 12% chromium, about 0.1% carbon, about 0.5% silicon, about 0.1% to about 0.5% manganese, above 0% to about 15% cobalt, above 0% to about 1% titanium, with the balance being iron. In certain embodiments, the improved alloy includes, by weight: about 12% chromium, about 0.1% carbon, about 0.5% silicon, about 0.1% to about 0.5% manganese, above 0% to about 15% cobalt, with the balance being iron. The addition of vanadium may allow for use of higher amounts of cobalt in the improved alloy.

Certain embodiments of temperature limited heaters may include more than one ferromagnetic material. Such embodiments are within the scope of embodiments described herein if any conditions described herein apply to at least one of the ferromagnetic materials in the temperature limited heater.

Ferromagnetic properties generally decay as the Curie temperature and/or the phase transformation temperature range is approached. The "Handbook of Electrical Heating for Industry" by C. James Erickson (IEEE Press, 1995) shows a typical curve for 1% carbon steel (steel with 1% carbon by weight). The loss of magnetic permeability starts at temperatures above 650° C. and tends to be complete when temperatures exceed 730° C. Thus, the self-limiting temperature may be somewhat below the actual Curie temperature and/or the phase transformation temperature range of the ferromagnetic conductor. The skin depth for current flow in 1% carbon steel is 0.132 cm at room temperature and increases to 0.445 cm at 720° C. From 720° C. to 730° C., the skin depth sharply increases to over 2.5 cm. Thus, a temperature limited heater embodiment using 1% carbon steel begins to self-limit between 650° C. and 730° C.

Skin depth generally defines an effective penetration depth of time-varying current into the conductive material. In general, current density decreases exponentially with distance from an outer surface to the center along the radius of the conductor. The depth at which the current density is approximately 1/e of the surface current density is called the skin depth. For a solid cylindrical rod with a diameter much greater than the penetration depth, or for hollow cylinders with a wall thickness exceeding the penetration depth, the skin depth, δ, is:

$$\delta=1981.5*(\rho/(\mu*f))^{1/2}; \qquad \text{(EQN. 3)}$$

in which:

δ=skin depth in inches;

ρ=resistivity at operating temperature (ohm-cm);

μ=relative magnetic permeability; and f=frequency (Hz).

EQN. 3 is obtained from "Handbook of Electrical Heating for Industry" by C. James Erickson (IEEE Press, 1995). For most metals, resistivity (ρ) increases with temperature. The relative magnetic permeability generally varies with temperature and with current. Additional equations may be used to assess the variance of magnetic permeability and/or skin depth on both temperature and/or current. The dependence of μ on current arises from the dependence of μ on the electromagnetic field.

Materials used in the temperature limited heater may be selected to provide a desired turndown ratio. Turndown ratios of at least 1.1:1, 2:1, 3:1, 4:1, 5:1, 10:1, 30:1, or 50:1 may be selected for temperature limited heaters. Larger turndown ratios may also be used. A selected turndown ratio may depend on a number of factors including, but not limited to, the type of formation in which the temperature limited heater is located (for example, a higher turndown ratio may be used for an oil shale formation with large variations in thermal conductivity between rich and lean oil shale layers) and/or a temperature limit of materials used in the wellbore (for example, temperature limits of heater materials). In some embodiments, the turndown ratio is increased by coupling additional copper or another good electrical conductor to the ferromagnetic material (for example, adding copper to lower the resistance above the Curie temperature and/or the phase transformation temperature range).

The temperature limited heater may provide a maximum heat output (power output) below the Curie temperature and/or the phase transformation temperature range of the heater. In certain embodiments, the maximum heat output is at least 400 W/m (Watts per meter), 600 W/m, 700 W/m, 800 W/m, or higher up to 2000 W/m. The temperature limited heater reduces the amount of heat output by a section of the heater when the temperature of the section of the heater approaches or is above the Curie temperature and/or the phase transformation temperature range. The reduced amount of heat may be substantially less than the heat output below the Curie temperature and/or the phase transformation temperature range. In some embodiments, the reduced amount of heat is at most 400 W/m, 200 W/m, 100 W/m or may approach 0 W/m.

In certain embodiments, the temperature limited heater operates substantially independently of the thermal load on the heater in a certain operating temperature range. "Thermal load" is the rate that heat is transferred from a heating system to its surroundings. It is to be understood that the thermal load may vary with temperature of the surroundings and/or the thermal conductivity of the surroundings. In an embodiment, the temperature limited heater operates at or above the Curie temperature and/or the phase transformation temperature range of the temperature limited heater such that the operating temperature of the heater increases at most by 3° C., 2° C., 1.5° C., 1° C., or 0.5° C. for a decrease in thermal load of 1 W/m proximate to a portion of the heater. In certain embodiments, the temperature limited heater operates in such a manner at a relatively constant current.

The AC or modulated DC resistance and/or the heat output of the temperature limited heater may decrease as the temperature approaches the Curie temperature and/or the phase transformation temperature range and decrease sharply near or above the Curie temperature due to the Curie effect and/or phase transformation effect. In certain embodiments, the value of the electrical resistance or heat output above or near the Curie temperature and/or the phase transformation temperature range is at most one-half of the value of electrical resistance or heat output at a certain point below the Curie temperature and/or the phase transformation temperature range. In some embodiments, the heat output above or near the Curie temperature and/or the phase transformation temperature range is at most 90%, 70%, 50%, 30%, 20%, 10%, or less (down to 1%) of the heat output at a certain point below the Curie temperature and/or the phase transformation temperature range (for example, 30° C. below the Curie temperature, 40° C. below the Curie temperature, 50° C. below the Curie temperature, or 100° C. below the Curie temperature). In certain embodiments, the electrical resistance above or near the Curie temperature and/or the phase transformation temperature range decreases to 80%, 70%, 60%, 50%, or less (down to 1%) of the electrical resistance at a certain point below the Curie temperature and/or the phase transformation temperature range (for example, 30° C. below the Curie temperature, 40° C. below the Curie temperature, 50° C. below the Curie temperature, or 100° C. below the Curie temperature).

In some embodiments, AC frequency is adjusted to change the skin depth of the ferromagnetic material. For example, the skin depth of 1% carbon steel at room temperature is 0.132 cm at 60 Hz, 0.0762 cm at 180 Hz, and 0.046 cm at 440 Hz. Since heater diameter is typically larger than twice the skin depth, using a higher frequency (and thus a heater with a smaller diameter) reduces heater costs. For a fixed geometry, the higher frequency results in a higher turndown ratio. The turndown ratio at a higher frequency is calculated by multiplying the turndown ratio at a lower frequency by the square root of the higher frequency divided by the lower frequency. In some embodiments, a frequency between 100 Hz and 1000 Hz, between 140 Hz and 200 Hz, or between 400 Hz and 600 Hz is used (for example, 180 Hz, 540 Hz, or 720 Hz). In some embodiments, high frequencies may be used. The frequencies may be greater than 1000 Hz.

To maintain a substantially constant skin depth until the Curie temperature and/or the phase transformation temperature range of the temperature limited heater is reached, the heater may be operated at a lower frequency when the heater is cold and operated at a higher frequency when the heater is hot. Line frequency heating is generally favorable, however, because there is less need for expensive components such as power supplies, transformers, or current modulators that alter frequency. Line frequency is the frequency of a general supply of current. Line frequency is typically 60 Hz, but may be 50 Hz or another frequency depending on the source for the supply of the current. Higher frequencies may be produced using commercially available equipment such as solid state variable frequency power supplies. Transformers that convert three-phase power to single-phase power with three times the frequency are commercially available. For example, high voltage three-phase power at 60 Hz may be transformed to single-phase power at 180 Hz and at a lower voltage. Such transformers are less expensive and more energy efficient than solid state variable frequency power supplies. In certain embodiments, transformers that convert three-phase power to single-phase power are used to increase the frequency of power supplied to the temperature limited heater.

In certain embodiments, modulated DC (for example, chopped DC, waveform modulated DC, or cycled DC) may be used for providing electrical power to the temperature limited heater. A DC modulator or DC chopper may be coupled to a DC power supply to provide an output of modulated direct current. In some embodiments, the DC power supply may include means for modulating DC. One example of a DC modulator is a DC-to-DC converter system. DC-to-DC converter systems are generally known in the art. DC is typically modulated or chopped into a desired waveform. Waveforms for DC modulation include, but are not limited to, square-wave, sinusoidal, deformed sinusoidal, deformed square-wave, triangular, and other regular or irregular waveforms.

The modulated DC waveform generally defines the frequency of the modulated DC. Thus, the modulated DC waveform may be selected to provide a desired modulated DC frequency. The shape and/or the rate of modulation (such as the rate of chopping) of the modulated DC waveform may be varied to vary the modulated DC frequency. DC may be modulated at frequencies that are higher than generally available AC frequencies. For example, modulated DC may be provided at frequencies of at least 1000 Hz. Increasing the frequency of supplied current to higher values advantageously increases the turndown ratio of the temperature limited heater.

In certain embodiments, the modulated DC waveform is adjusted or altered to vary the modulated DC frequency. The DC modulator may be able to adjust or alter the modulated DC waveform at any time during use of the temperature limited heater and at high currents or voltages. Thus, modulated DC provided to the temperature limited heater is not limited to a single frequency or even a small set of frequency values. Waveform selection using the DC modulator typically allows for a wide range of modulated DC frequencies and for discrete control of the modulated DC frequency. Thus, the modulated DC frequency is more easily set at a distinct value whereas AC frequency is generally limited to multiples of the line frequency. Discrete control of the modulated DC frequency allows for more selective control over the turndown ratio of the temperature limited heater. Being able to selectively control the turndown ratio of the temperature limited heater allows for a broader range of materials to be used in designing and constructing the temperature limited heater.

In some embodiments, the modulated DC frequency or the AC frequency is adjusted to compensate for changes in properties (for example, subsurface conditions such as temperature or pressure) of the temperature limited heater during use. The modulated DC frequency or the AC frequency provided to the temperature limited heater is varied based on assessed downhole conditions. For example, as the temperature of the temperature limited heater in the wellbore increases, it may be advantageous to increase the frequency of the current provided to the heater, thus increasing the turndown ratio of the heater. In an embodiment, the downhole temperature of the temperature limited heater in the wellbore is assessed.

In certain embodiments, the modulated DC frequency, or the AC frequency, is varied to adjust the turndown ratio of the temperature limited heater. The turndown ratio may be adjusted to compensate for hot spots occurring along a length of the temperature limited heater. For example, the turndown ratio is increased because the temperature limited heater is getting too hot in certain locations. In some embodiments, the modulated DC frequency, or the AC frequency, are varied to adjust a turndown ratio without assessing a subsurface condition.

At or near the Curie temperature and/or the phase transformation temperature range of the ferromagnetic material, a relatively small change in voltage may cause a relatively large change in current to the load. The relatively small change in voltage may produce problems in the power supplied to the temperature limited heater, especially at or near the Curie temperature and/or the phase transformation temperature range. The problems include, but are not limited to, reducing the power factor, tripping a circuit breaker, and/or blowing a fuse. In some cases, voltage changes may be caused by a change in the load of the temperature limited heater. In certain embodiments, an electrical current supply (for example, a supply of modulated DC or AC) provides a relatively constant amount of current that does not substantially vary with changes in load of the temperature limited heater. In an embodiment, the electrical current supply provides an amount of electrical current that remains within 15%, within 10%, within 5%, or within 2% of a selected constant current value when a load of the temperature limited heater changes.

Temperature limited heaters may generate an inductive load. The inductive load is due to some applied electrical current being used by the ferromagnetic material to generate a magnetic field in addition to generating a resistive heat output. As downhole temperature changes in the temperature limited heater, the inductive load of the heater changes due to changes in the ferromagnetic properties of ferromagnetic materials in the heater with temperature. The inductive load of the temperature limited heater may cause a phase shift between the current and the voltage applied to the heater.

A reduction in actual power applied to the temperature limited heater may be caused by a time lag in the current waveform (for example, the current has a phase shift relative to the voltage due to an inductive load) and/or by distortions in the current waveform (for example, distortions in the current waveform caused by introduced harmonics due to a non-linear load). Thus, it may take more current to apply a selected amount of power due to phase shifting or waveform distortion. The ratio of actual power applied and the apparent power that would have been transmitted if the same current were in phase and undistorted is the power factor. The power factor is always less than or equal to 1. The power factor is 1 when there is no phase shift or distortion in the waveform.

Actual power applied to a heater due to a phase shift may be described by EQN. 4:

$$P=I\times V\times\cos(\theta); \qquad \text{(EQN. 4)}$$

in which P is the actual power applied to a heater; I is the applied current; V is the applied voltage; and θ is the phase angle difference between voltage and current. Other phenomena such as waveform distortion may contribute to further lowering of the power factor. If there is no distortion in the waveform, then cos(θ) is equal to the power factor.

In certain embodiments, the temperature limited heater includes an inner conductor inside an outer conductor. The inner conductor and the outer conductor are radially disposed about a central axis. The inner and outer conductors may be separated by an insulation layer. In certain embodiments, the inner and outer conductors are coupled at the bottom of the temperature limited heater. Electrical current may flow into the temperature limited heater through the inner conductor and return through the outer conductor. One or both conductors may include ferromagnetic material.

The insulation layer may comprise an electrically insulating ceramic with high thermal conductivity, such as magnesium oxide, aluminum oxide, silicon dioxide, beryllium oxide, boron nitride, silicon nitride, or combinations thereof. The insulating layer may be a compacted powder (for example, compacted ceramic powder). Compaction may improve thermal conductivity and provide better insulation resistance. For lower temperature applications, polymer insulation made from, for example, fluoropolymers, polyimides, polyamides, and/or polyethylenes, may be used. In some embodiments, the polymer insulation is made of perfluoroalkoxy (PFA) or polyetheretherketone (PEEK™ (Victrex Ltd, England)). The insulating layer may be chosen to be substantially infrared transparent to aid heat transfer from the inner conductor to the outer conductor. In an embodiment, the insulating layer is transparent quartz sand. The insulation layer may be air or a non-reactive gas such as helium, nitrogen, or sulfur hexafluoride. If the insulation layer is air or a non-reactive gas, there may be insulating spacers designed to inhibit electrical contact between the inner conductor and the outer conductor. The insulating spacers may be made of, for example, high purity aluminum oxide or another thermally conducting, electrically insulating material such as silicon nitride. The insulating spacers may be a fibrous ceramic material such as Nextel™ 312 (3M Corporation, St. Paul, Minn., U.S.A.), mica tape, or glass fiber. Ceramic material may be made of alumina, alumina-silicate, alumina-borosilicate, silicon nitride, boron nitride, or other materials.

The insulation layer may be flexible and/or substantially deformation tolerant. For example, if the insulation layer is a solid or compacted material that substantially fills the space between the inner and outer conductors, the temperature limited heater may be flexible and/or substantially deformation tolerant. Forces on the outer conductor can be transmitted through the insulation layer to the solid inner conductor, which may resist crushing. Such a temperature limited heater may be bent, dog-legged, and spiraled without causing the outer conductor and the inner conductor to electrically short to each other. Deformation tolerance may be important if the wellbore is likely to undergo substantial deformation during heating of the formation.

In certain embodiments, an outermost layer of the temperature limited heater (for example, the outer conductor) is chosen for corrosion resistance, yield strength, and/or creep resistance. In one embodiment, austenitic (non-ferromagnetic) stainless steels such as 201, 304H, 347H, 347HH, 316H, 310H, 347HP, NF709 (Nippon Steel Corp., Japan) stainless steels, or combinations thereof may be used in the outer conductor. The outermost layer may also include a clad conductor. For example, a corrosion resistant alloy such as 800H or 347H stainless steel may be clad for corrosion protection over a ferromagnetic carbon steel tubular. If high temperature strength is not required, the outermost layer may be constructed from ferromagnetic metal with good corrosion resistance such as one of the ferritic stainless steels. In one embodiment, a ferritic alloy of 82.3% by weight iron with 17.7% by weight chromium (Curie temperature of 678° C.) provides desired corrosion resistance.

The Metals Handbook, vol. 8, page 291 (American Society of Materials (ASM)) includes a graph of Curie temperature of iron-chromium alloys versus the amount of chromium in the alloys. In some temperature limited heater embodiments, a separate support rod or tubular (made from 347H stainless steel) is coupled to the temperature limited heater made from an iron-chromium alloy to provide yield strength and/or creep resistance. In certain embodiments, the support material and/or the ferromagnetic material is selected to provide a 100,000 hour creep-rupture strength of at least 20.7 MPa at 650° C. In some embodiments, the 100,000 hour creep-rupture strength is at least 13.8 MPa at 650° C. or at least 6.9 MPa at 650° C. For example, 347H steel has a favorable creep-rupture strength at or above 650° C. In some embodiments, the 100, 000 hour creep-rupture strength ranges from 6.9 MPa to 41.3 MPa or more for longer heaters and/or higher earth or fluid stresses.

In temperature limited heater embodiments with both an inner ferromagnetic conductor and an outer ferromagnetic conductor, the skin effect current path occurs on the outside of the inner conductor and on the inside of the outer conductor. Thus, the outside of the outer conductor may be clad with the corrosion resistant alloy, such as stainless steel, without affecting the skin effect current path on the inside of the outer conductor.

A ferromagnetic conductor with a thickness of at least the skin depth at the Curie temperature and/or the phase transformation temperature range allows a substantial decrease in resistance of the ferromagnetic material as the skin depth increases sharply near the Curie temperature and/or the phase transformation temperature range. In certain embodiments when the ferromagnetic conductor is not clad with a highly conducting material such as copper, the thickness of the conductor may be 1.5 times the skin depth near the Curie temperature and/or the phase transformation temperature range, 3 times the skin depth near the Curie temperature and/or the phase transformation temperature range, or even 10 or more times the skin depth near the Curie temperature and/or the phase transformation temperature range. If the ferromagnetic conductor is clad with copper, thickness of the ferromagnetic conductor may be substantially the same as the skin depth near the Curie temperature and/or the phase transformation temperature range. In some embodiments, the ferromagnetic conductor clad with copper has a thickness of at least three-fourths of the skin depth near the Curie temperature and/or the phase transformation temperature range.

In certain embodiments, the temperature limited heater includes a composite conductor with a ferromagnetic tubular and a non-ferromagnetic, high electrical conductivity core. The non-ferromagnetic, high electrical conductivity core reduces a required diameter of the conductor. For example, the conductor may be composite 1.19 cm diameter conductor with a core of 0.575 cm diameter copper clad with a 0.298 cm thickness of ferritic stainless steel or carbon steel surrounding the core. The core or non-ferromagnetic conductor may be copper or copper alloy. The core or non-ferromagnetic conductor may also be made of other metals that exhibit low electrical resistivity and relative magnetic permeabilities near 1 (for example, substantially non-ferromagnetic materials such as aluminum and aluminum alloys, phosphor bronze, beryllium copper, and/or brass). A composite conductor allows the electrical resistance of the temperature limited heater to decrease more steeply near the Curie temperature and/or the phase transformation temperature range. As the skin depth increases near the Curie temperature and/or the phase transformation temperature range to include the copper core, the electrical resistance decreases very sharply.

The composite conductor may increase the conductivity of the temperature limited heater and/or allow the heater to operate at lower voltages. In an embodiment, the composite conductor exhibits a relatively flat resistance versus temperature profile at temperatures below a region near the Curie temperature and/or the phase transformation temperature range of the ferromagnetic conductor of the composite conductor. In some embodiments, the temperature limited heater exhibits a relatively flat resistance versus temperature profile between 100° C. and 750° C. or between 300° C. and 600° C. The relatively flat resistance versus temperature profile may also be exhibited in other temperature ranges by adjusting, for example, materials and/or the configuration of materials in the temperature limited heater. In certain embodiments, the relative thickness of each material in the composite conductor is selected to produce a desired resistivity versus temperature profile for the temperature limited heater.

In certain embodiments, the relative thickness of each material in a composite conductor is selected to produce a desired resistivity versus temperature profile for a temperature limited heater. In an embodiment, the composite conductor is an inner conductor surrounded by 0.127 cm thick magnesium oxide powder as an insulator. The outer conductor may be 304H stainless steel with a wall thickness of 0.127 cm. The outside diameter of the heater may be about 1.65 cm.

A composite conductor (for example, a composite inner conductor or a composite outer conductor) may be manufactured by methods including, but not limited to, coextrusion, roll forming, tight fit tubing (for example, cooling the inner member and heating the outer member, then inserting the inner member in the outer member, followed by a drawing operation and/or allowing the system to cool), explosive or electromagnetic cladding, arc overlay welding, longitudinal strip welding, plasma powder welding, billet coextrusion, electroplating, drawing, sputtering, plasma deposition, coextrusion casting, magnetic forming, molten cylinder casting (of inner core material inside the outer or vice versa), insertion followed by welding or high temperature braising, shielded active gas welding (SAG), and/or insertion of an inner pipe in an outer pipe followed by mechanical expansion of the inner pipe by hydroforming or use of a pig to expand and swage the inner pipe against the outer pipe. In some embodiments, a ferromagnetic conductor is braided over a non-ferromagnetic conductor. In certain embodiments, composite conductors are formed using methods similar to those used for cladding (for example, cladding copper to steel). A metallurgical bond between copper cladding and base ferromagnetic material may be advantageous. Composite conductors produced by a coextrusion process that forms a good metallurgical bond (for example, a good bond between copper and 446 stainless steel) may be provided by Anomet Products, Inc. (Shrewsbury, Mass., U.S.A.).

In certain embodiments, it may be desirable to form a composite conductor by various methods including longitudinal strip welding. In some embodiments, however, it may be difficult to use longitudinal strip welding techniques if the desired thickness of a layer of a first material has such a large thickness, in relation to the inner core/layer onto which such layer is to be bended, that it does not effectively and/or efficiently bend around an inner core or layer that is made of a second material. In such circumstances, it may be beneficial to use multiple thinner layers of the first material in the longitudinal strip welding process such that the multiple thinner layers can more readily be employed in a longitudinal strip welding process and coupled together to form a composite of the first material with the desired thickness. So, for example, a first layer of the first material may be bent around an inner core or layer of second material, and then a second layer of the first material may be bent around the first layer of the first material, with the thicknesses of the first and second layers being such that the first and second layers will readily bend around the inner core or layer in a longitudinal strip welding process. Thus, the two layers of the first material may together form the total desired thickness of the first material.

FIGS. 53-74 depict various embodiments of temperature limited heaters. One or more features of an embodiment of the temperature limited heater depicted in any of these figures may be combined with one or more features of other embodiments of temperature limited heaters depicted in these figures. In certain embodiments described herein, temperature limited heaters are dimensioned to operate at a frequency of 60 Hz AC. It is to be understood that dimensions of the temperature limited heater may be adjusted from those described herein to operate in a similar manner at other AC frequencies or with modulated DC current.

The temperature limited heaters may be used in conductor-in-conduit heaters. In some embodiments of conductor-in-conduit heaters, the majority of the resistive heat is generated in the conductor, and the heat radiatively, conductively and/or convectively transfers to the conduit. In some embodiments of conductor-in-conduit heaters, the majority of the resistive heat is generated in the conduit.

Figure 55:
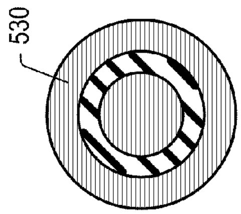
FIGS. 53, 54, and 55 depict cross-sectional representations of an embodiment of a temperature limited heater with an outer conductor having a ferromagnetic section and a non-ferromagnetic section.
Figure 53:
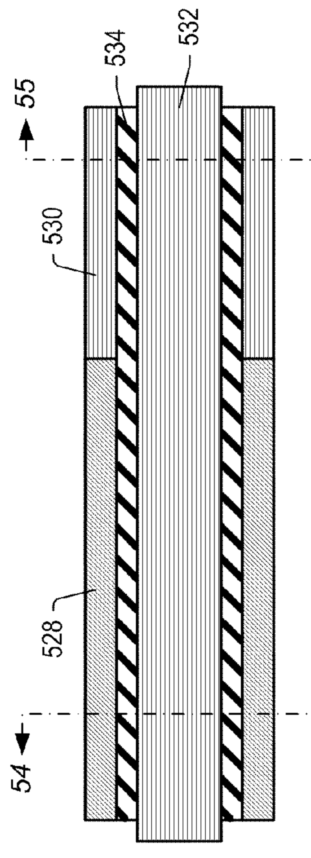
Figure 54:
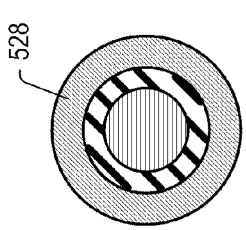

FIG. 53 depicts a cross-sectional representation of an embodiment of the temperature limited heater with an outer conductor having a ferromagnetic section and a non-ferromagnetic section. FIGS. 54 and 55 depict transverse cross-sectional views of the embodiment shown in FIG. 53. In one embodiment, ferromagnetic section 528 is used to provide heat to hydrocarbon layers in the formation. Non-ferromagnetic section 530 is used in the overburden of the formation. Non-ferromagnetic section 530 provides little or no heat to the overburden, thus inhibiting heat losses in the overburden and improving heater efficiency. Ferromagnetic section 528 includes a ferromagnetic material such as 409 stainless steel or 410 stainless steel. Ferromagnetic section 528 has a thickness of 0.3 cm. Non-ferromagnetic section 530 is copper with a thickness of 0.3 cm. Inner conductor 532 is copper. Inner conductor 532 has a diameter of 0.9 cm. Electrical insulator 534 is silicon nitride, boron nitride, magnesium oxide powder, or another suitable insulator material. Electrical insulator 534 has a thickness of 0.1 cm to 0.3 cm.

Figure 58:
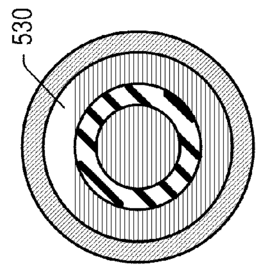
FIGS. 56, 57, 58, and 59 depict cross-sectional representations of an embodiment of a temperature limited heater with an outer conductor having a ferromagnetic section and a non-ferromagnetic section placed inside a sheath.
Figure 56:
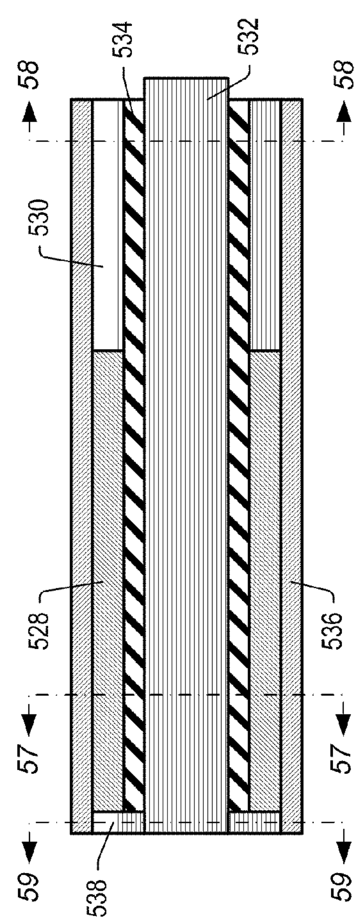
Figure 57:
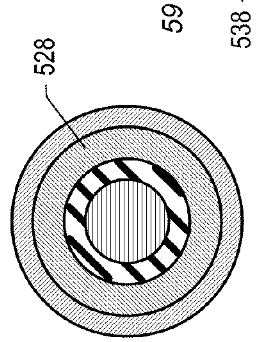
Figure 59:
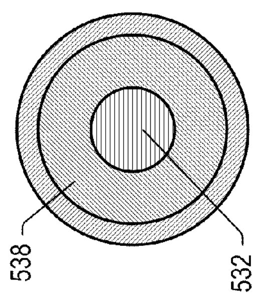

FIG. 56 depicts a cross-sectional representation of an embodiment of a temperature limited heater with an outer conductor having a ferromagnetic section and a non-ferromagnetic section placed inside a sheath. FIGS. 57, 58, and 59 depict transverse cross-sectional views of the embodiment shown in FIG. 56. Ferromagnetic section 528 is 410 stainless steel with a thickness of 0.6 cm. Non-ferromagnetic section 530 is copper with a thickness of 0.6 cm. Inner conductor 532 is copper with a diameter of 0.9 cm. Outer conductor 536 includes ferromagnetic material. Outer conductor 536 provides some heat in the overburden section of the heater. Providing some heat in the overburden inhibits condensation or refluxing of fluids in the overburden. Outer conductor 536 is 409, 410, or 446 stainless steel with an outer diameter of 3.0 cm and a thickness of 0.6 cm. Electrical insulator 534 includes compacted magnesium oxide powder with a thickness of 0.3 cm. In some embodiments, electrical insulator 534 includes silicon nitride, boron nitride, or hexagonal type boron nitride. Conductive section 538 may couple inner conductor 532 with ferromagnetic section 528 and/or outer conductor 536.

Figure 60B:
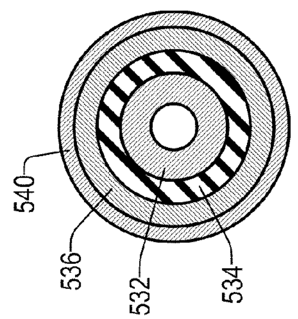
FIGS. 60A and 60B depict cross-sectional representations of an embodiment of a temperature limited heater.
Figure 60A:
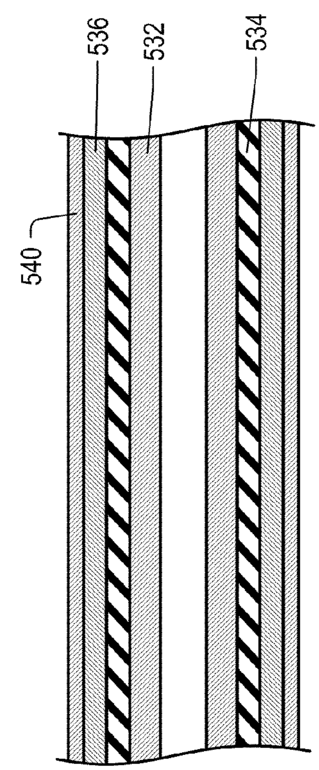

FIG. 60A and FIG. 60B depict cross-sectional representations of an embodiment of a temperature limited heater with a ferromagnetic inner conductor. Inner conductor 532 is a 1" Schedule XXS 446 stainless steel pipe. In some embodiments, inner conductor 532 includes 409 stainless steel, 410 stainless steel, Invar 36, alloy 42-6, alloy 52, or other ferromagnetic materials. Inner conductor 532 has a diameter of 2.5 cm. Electrical insulator 534 includes compacted silicon nitride, boron nitride, or magnesium oxide powders; or polymers, Nextel ceramic fiber, mica, or glass fibers. Outer conductor 536 is copper or any other non-ferromagnetic material, such as but not limited to copper alloys, aluminum and/or aluminum alloys. Outer conductor 536 is coupled to jacket 540. Jacket 540 is 304H, 316H, or 347H stainless steel. In this embodiment, a majority of the heat is produced in inner conductor 532.

Figure 61B:
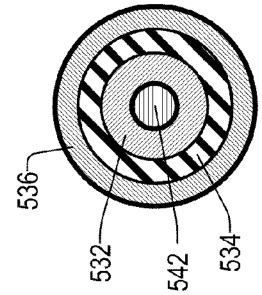
FIGS. 61A and 61B depict cross-sectional representations of an embodiment of a temperature limited heater.
Figure 61A:
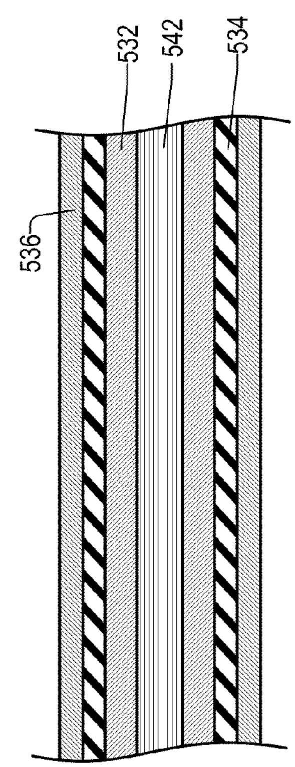

FIG. 61A and FIG. 61B depict cross-sectional representations of an embodiment of a temperature limited heater with a ferromagnetic inner conductor and a non-ferromagnetic core. Inner conductor 532 may be made of 446 stainless steel, 409 stainless steel, 410 stainless steel, carbon steel, Armco ingot iron, iron-cobalt alloys, or other ferromagnetic materials. Core 542 may be tightly bonded inside inner conductor 532. Core 542 is copper or other non-ferromagnetic material. In certain embodiments, core 542 is inserted as a tight fit inside inner conductor 532 before a drawing operation. In some embodiments, core 542 and inner conductor 532 are coextrusion bonded. Outer conductor 536 is 347H stainless steel. A drawing or rolling operation to compact electrical insulator 534 (for example, compacted silicon nitride, boron nitride, or magnesium oxide powder) may ensure good electrical contact between inner conductor 532 and core 542. In this embodiment, heat is produced primarily in inner conductor 532 until the Curie temperature and/or the phase transformation temperature range is approached. Resistance then decreases sharply as current penetrates core 542.

Figure 62B:
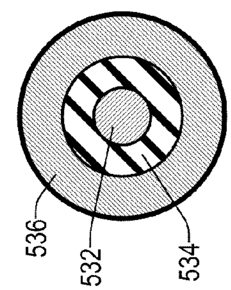
FIGS. 62A and 62B depict cross-sectional representations of an embodiment of a temperature limited heater.
Figure 62A:
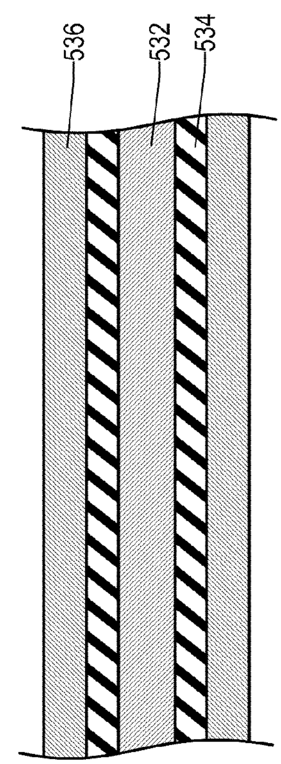

FIG. 62A and FIG. 62B depict cross-sectional representations of an embodiment of a temperature limited heater with a ferromagnetic outer conductor. Inner conductor 532 is nickel-clad copper. Electrical insulator 534 is silicon nitride, boron nitride, or magnesium oxide. Outer conductor 536 is a 1" Schedule XXS carbon steel pipe. In this embodiment, heat is produced primarily in outer conductor 536, resulting in a small temperature differential across electrical insulator 534.

Figure 63B:
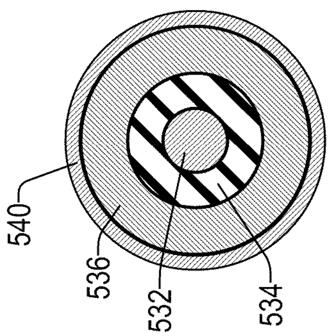
FIGS. 63A and 63B depict cross-sectional representations of an embodiment of a temperature limited heater.
Figure 63A:
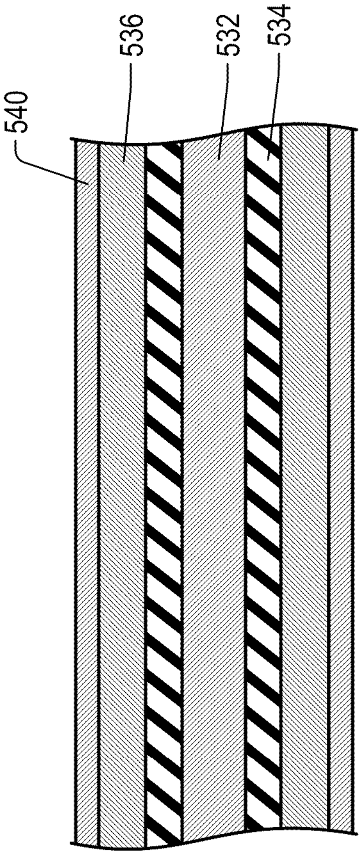

FIG. 63A and FIG. 63B depict cross-sectional representations of an embodiment of a temperature limited heater with a ferromagnetic outer conductor that is clad with a corrosion resistant alloy. Inner conductor 532 is copper. Outer conductor 536 is a 1" Schedule XXS carbon steel pipe. Outer conductor 536 is coupled to jacket 540. Jacket 540 is made of corrosion resistant material (for example, 347H stainless steel). Jacket 540 provides protection from corrosive fluids in the wellbore (for example, sulfidizing and carburizing gases). Heat is produced primarily in outer conductor 536, resulting in a small temperature differential across electrical insulator 534.

Figure 64B:
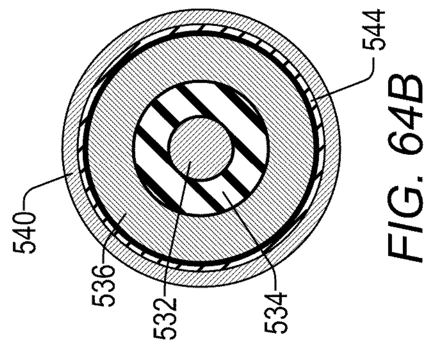
FIGS. 64A and 64B depict cross-sectional representations of an embodiment of a temperature limited heater.
Figure 64A:
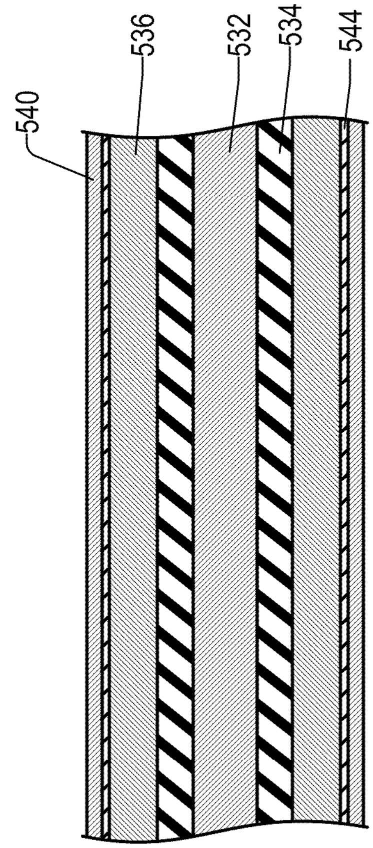

FIG. 64A and FIG. 64B depict cross-sectional representations of an embodiment of a temperature limited heater with a ferromagnetic outer conductor. The outer conductor is clad with a conductive layer and a corrosion resistant alloy. Inner conductor 532 is copper. Electrical insulator 534 is silicon nitride, boron nitride, or magnesium oxide. Outer conductor 536 is a 1" Schedule 80 446 stainless steel pipe. Outer conductor 536 is coupled to jacket 540. Jacket 540 is made from corrosion resistant material such as 347H stainless steel. In an embodiment, conductive layer 544 is placed between outer conductor 536 and jacket 540. Conductive layer 544 is a copper layer. Heat is produced primarily in outer conductor 536, resulting in a small temperature differential across electrical insulator 534. Conductive layer 544 allows a sharp decrease in the resistance of outer conductor 536 as the outer conductor approaches the Curie temperature and/or the phase transformation temperature range. Jacket 540 provides protection from corrosive fluids in the wellbore.

In certain embodiments, inner conductor 532 includes a core of copper or another non-ferromagnetic conductor surrounded by ferromagnetic material (for example, a low Curie temperature material such as Invar 36). In certain embodiments, the copper core has an outer diameter between about 0.125" and about 0.375" (for example, about 0.5") and the ferromagnetic material has an outer diameter between about 0.625" and about 1" (for example, about 0.75"). The copper core may increase the turndown ratio of the heater and/or reduce the thickness needed in the ferromagnetic material, which may allow a lower cost heater to be made. Electrical insulator 534 may be magnesium oxide with an outer diameter between about 1" and about 1.2" (for example, about 1.11"). Outer conductor 536 may include non-ferromagnetic electrically conductive material with high mechanical strength such as 825 stainless steel. Outer conductor 536 may have an outer diameter between about 1.2" and about 1.5" (for example, about 1.33"). In certain embodiments, inner conductor 532 is a forward current path and outer conductor 536 is a return current path. Conductive layer 544 may include copper or another non-ferromagnetic material with an outer diameter between about 1.3" and about 1.4" (for example, about 1.384"). Conductive layer 544 may decrease the resistance of the return current path (to reduce the heat output of the return path such that little or no heat is generated in the return path) and/or increase the turndown ratio of the heater. Conductive layer 544 may reduce the thickness needed in outer conductor 536 and/or jacket 540, which may allow a lower cost heater to be made. Jacket 540 may include ferromagnetic material such as carbon steel or 410 stainless steel with an outer diameter between about 1.6" and about 1.8" (for example, about 1.684"). Jacket 540 may have a thickness of at least 2 times the skin depth of the ferromagnetic material in the jacket. Jacket 540 may provide protection from corrosive fluids in the wellbore. In some embodiments, inner conductor 532, electrical insulator 534, and outer conductor 536 are formed as composite heater (for example, an insulated conductor heater) and conductive layer 544 and jacket 540 are formed around (for example, wrapped) the composite heater and welded together to form the larger heater embodiment described herein.

In certain embodiments, jacket 540 includes ferromagnetic material that has a higher Curie temperature than ferromagnetic material in inner conductor 532. Such a temperature limited heater may "contain" current such that the current does not easily flow from the heater to the surrounding formation and/or to any surrounding fluids (for example, production fluids, formation fluids, brine, groundwater, or formation water). In this embodiment, a majority of the current flows through inner conductor 532 until the Curie temperature of the ferromagnetic material in the inner conductor is reached. After the Curie temperature of ferromagnetic material in inner conductor 532 is reached, a majority of the current flows through the core of copper in the inner conductor. The ferromagnetic properties of jacket 540 inhibit the current from flowing outside the jacket and "contain" the current. Such a heater may be used in lower temperature applications where fluids are present such as providing heat in a production wellbore to increase oil production.

In some embodiments, the conductor (for example, an inner conductor, an outer conductor, or a ferromagnetic conductor) is the composite conductor that includes two or more different materials. In certain embodiments, the composite conductor includes two or more ferromagnetic materials. In some embodiments, the composite ferromagnetic conductor includes two or more radially disposed materials. In certain embodiments, the composite conductor includes a ferromagnetic conductor and a non-ferromagnetic conductor. In some embodiments, the composite conductor includes the ferromagnetic conductor placed over a non-ferromagnetic core. Two or more materials may be used to obtain a relatively flat electrical resistivity versus temperature profile in a temperature region below the Curie temperature, and/or the phase transformation temperature range, and/or a sharp decrease (a high turndown ratio) in the electrical resistivity at or near the Curie temperature and/or the phase transformation temperature range. In some cases, two or more materials are used to provide more than one Curie temperature and/or phase transformation temperature range for the temperature limited heater.

The composite electrical conductor may be used as the conductor in any electrical heater embodiment described herein. For example, the composite conductor may be used as the conductor in a conductor-in-conduit heater or an insulated conductor heater. In certain embodiments, the composite conductor may be coupled to a support member such as a support conductor. The support member may be used to provide support to the composite conductor so that the composite conductor is not relied upon for strength at or near the Curie temperature and/or the phase transformation temperature range. The support member may be useful for heaters of lengths of at least 100 m. The support member may be a non-ferromagnetic member that has good high temperature creep strength. Examples of materials that are used for a support member include, but are not limited to, Haynes® 625 alloy and Haynes® HR120® alloy (Haynes International, Kokomo, Ind., U.S.A.), NF709, Incoloy® 800H alloy and 347HP alloy (Allegheny Ludlum Corp., Pittsburgh, Pa., U.S.A.). In some embodiments, materials in a composite conductor are directly coupled (for example, brazed, metallurgically bonded, or swaged) to each other and/or the support member. Using a support member may reduce the need for the ferromagnetic member to provide support for the temperature limited heater, especially at or near the Curie temperature and/or the phase transformation temperature range. Thus, the temperature limited heater may be designed with more flexibility in the selection of ferromagnetic materials.

Figure 65:
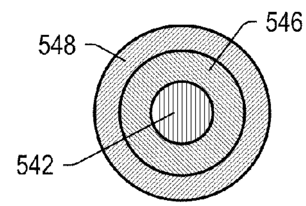
FIG. 65 depicts a cross-sectional representation of an embodiment of a composite conductor with a support member.

FIG. 65 depicts a cross-sectional representation of an embodiment of the composite conductor with the support member. Core 542 is surrounded by ferromagnetic conductor 546 and support member 548. In some embodiments, core 542, ferromagnetic conductor 546, and support member 548 are directly coupled (for example, brazed together or metallurgically bonded together). In one embodiment, core 542 is copper, ferromagnetic conductor 546 is 446 stainless steel, and support member 548 is 347H alloy. In certain embodiments, support member 548 is a Schedule 80 pipe. Support member 548 surrounds the composite conductor having ferromagnetic conductor 546 and core 542. Ferromagnetic conductor 546 and core 542 may be joined to form the composite conductor by, for example, a coextrusion process. For example, the composite conductor is a 1.9 cm outside diameter 446 stainless steel ferromagnetic conductor surrounding a 0.95 cm diameter copper core.

In certain embodiments, the diameter of core 542 is adjusted relative to a constant outside diameter of ferromagnetic conductor 546 to adjust the turndown ratio of the temperature limited heater. For example, the diameter of core 542 may be increased to 1.14 cm while maintaining the outside diameter of ferromagnetic conductor 546 at 1.9 cm to increase the turndown ratio of the heater.

Figure 66:
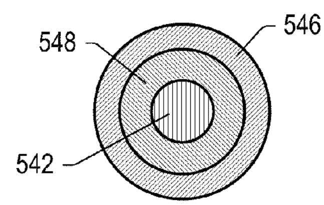
FIG. 66 depicts a cross-sectional representation of an embodiment of a composite conductor with a support member separating the conductors.

FIG. 66 depicts a cross-sectional representation of an embodiment of the composite conductor with support member 548 separating the conductors. In one embodiment, core 542 is copper with a diameter of 0.95 cm, support member 548 is 347H alloy with an outside diameter of 1.9 cm, and ferromagnetic conductor 546 is 446 stainless steel with an outside diameter of 2.7 cm. The support member depicted in FIG. 66 has a lower creep strength relative to the support members depicted in FIG. 65.

Figure 67:
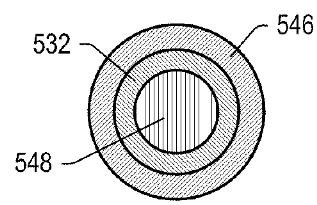
FIG. 67 depicts a cross-sectional representation of an embodiment of a composite conductor surrounding a support member.

In certain embodiments, support member 548 is located inside the composite conductor. FIG. 67 depicts a cross-sectional representation of an embodiment of the composite conductor surrounding support member 548. Support member 548 is made of 347H alloy. Inner conductor 532 is copper. Ferromagnetic conductor 546 is 446 stainless steel. In one embodiment, support member 548 is 1.25 cm diameter 347H alloy, inner conductor 532 is 1.9 cm outside diameter copper, and ferromagnetic conductor 546 is 2.7 cm outside diameter 446 stainless steel. The turndown ratio is higher than the turndown ratio for the embodiments depicted in FIGS. 65, 66, and 68 for the same outside diameter, but the creep strength is lower.

In some embodiments, the thickness of inner conductor 532, which is copper, is reduced and the thickness of support member 548 is increased to increase the creep strength at the expense of reduced turndown ratio. For example, the diameter of support member 548 is increased to 1.6 cm while maintaining the outside diameter of inner conductor 532 at 1.9 cm to reduce the thickness of the conduit. This reduction in thickness of inner conductor 532 results in a decreased turndown ratio relative to the thicker inner conductor embodiment but an increased creep strength.

Figure 68:
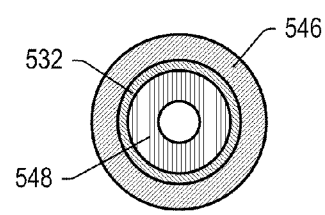
FIG. 68 depicts a cross-sectional representation of an embodiment of a composite conductor surrounding a conduit support member.

FIG. 68 depicts a cross-sectional representation of an embodiment of the composite conductor surrounding support member 548. In one embodiment, support member 548 is 347H alloy with a 0.63 cm diameter center hole. In some embodiments, support member 548 is a preformed conduit. In certain embodiments, support member 548 is formed by having a dissolvable material (for example, copper dissolvable by nitric acid) located inside the support member during formation of the composite conductor. The dissolvable material is dissolved to form the hole after the conductor is assembled. In an embodiment, support member 548 is 347H alloy with an inside diameter of 0.63 cm and an outside diameter of 1.6 cm, inner conductor 532 is copper with an outside diameter of 1.8 cm, and ferromagnetic conductor 546 is 446 stainless steel with an outside diameter of 2.7 cm.

In certain embodiments, the composite electrical conductor is used as the conductor in the conductor-in-conduit heater. For example, the composite electrical conductor may be used as conductor 550 in FIG. 69.

Figure 69:
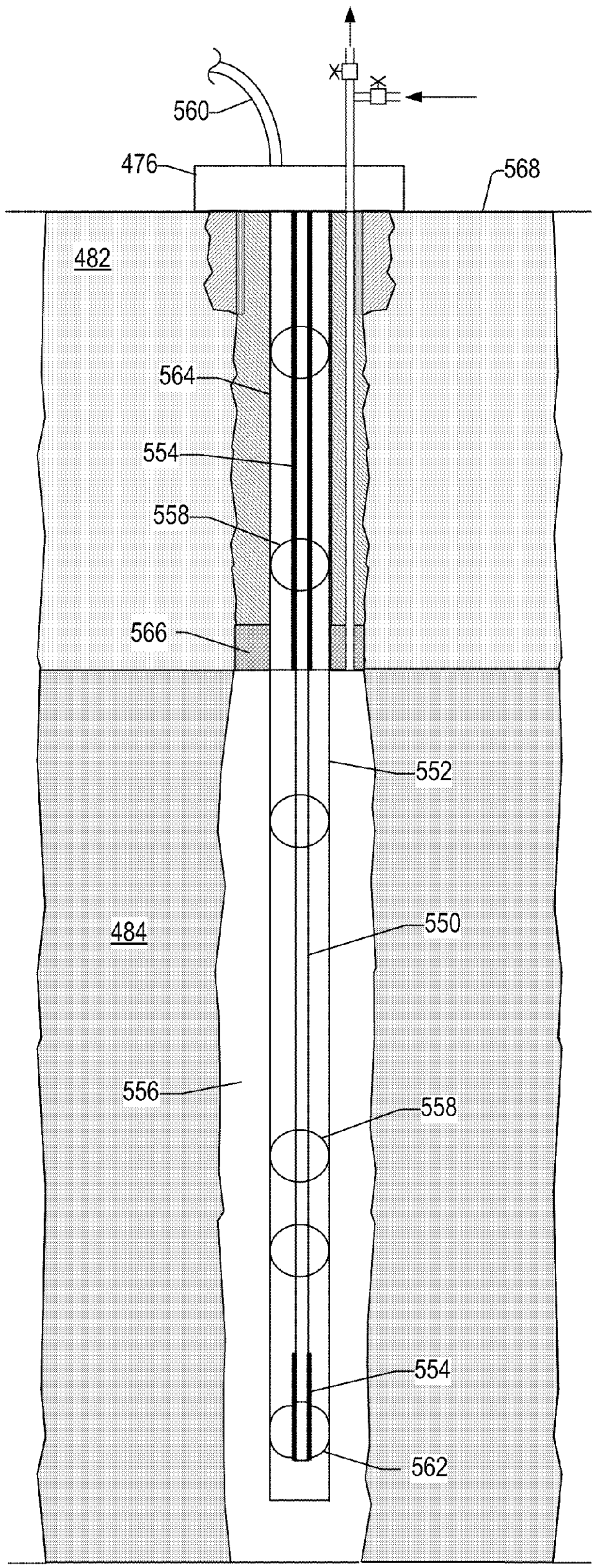
FIG. 69 depicts a cross-sectional representation of an embodiment of a conductor-in-conduit heat source.

FIG. 69 depicts a cross-sectional representation of an embodiment of the conductor-in-conduit heater. Conductor 550 is disposed in conduit 552. Conductor 550 is a rod or conduit of electrically conductive material. Low resistance sections 554 are present at both ends of conductor 550 to generate less heating in these sections. Low resistance section 554 is formed by having a greater cross-sectional area of conductor 550 in that section, or the sections are made of material having less resistance. In certain embodiments, low resistance section 554 includes a low resistance conductor coupled to conductor 550.

Conduit 552 is made of an electrically conductive material. Conduit 552 is disposed in opening 556 in hydrocarbon layer 484. Opening 556 has a diameter that accommodates conduit 552.

Conductor 550 may be centered in conduit 552 by centralizers 558. Centralizers 558 electrically isolate conductor 550 from conduit 552. Centralizers 558 inhibit movement and properly locate conductor 550 in conduit 552. Centralizers 558 are made of ceramic material or a combination of ceramic and metallic materials. Centralizers 558 inhibit deformation of conductor 550 in conduit 552. Centralizers 558 are touching or spaced at intervals between approximately 0.1 m (meters) and approximately 3 m or more along conductor 550.

A second low resistance section 554 of conductor 550 may couple conductor 550 to wellhead 476. Electrical current may be applied to conductor 550 from power cable 560 through low resistance section 554 of conductor 550. Electrical current passes from conductor 550 through sliding connector 562 to conduit 552. Conduit 552 may be electrically insulated from overburden casing 564 and from wellhead 476 to return electrical current to power cable 560. Heat may be generated in conductor 550 and conduit 552. The generated heat may radiate in conduit 552 and opening 556 to heat at least a portion of hydrocarbon layer 484.

Overburden casing 564 may be disposed in overburden 482. In some embodiments, overburden casing 564 is surrounded by materials (for example, reinforcing material and/or cement) that inhibit heating of overburden 482. Low resistance section 554 of conductor 550 may be placed in overburden casing 564. Low resistance section 554 of conductor 550 is made of, for example, carbon steel. Low resistance section 554 of conductor 550 may be centralized in overburden casing 564 using centralizers 558. Centralizers 558 are spaced at intervals of approximately 6 m to approximately 12 m or, for example, approximately 9 m along low resistance section 554 of conductor 550. In a heater embodiment, low resistance sections 554 are coupled to conductor 550 by one or more welds. In other heater embodiments, low resistance sections are threaded, threaded and welded, or otherwise coupled to the conductor. Low resistance section 554 generates little or no heat in overburden casing 564. Packing 566 may be placed between overburden casing 564 and opening 556. Packing 566 may be used as a cap at the junction of overburden 482 and hydrocarbon layer 484 to allow filling of materials in the annulus between overburden casing 564 and opening 556. In some embodiments, packing 566 inhibits fluid from flowing from opening 556 to surface 568.

Figure 70:
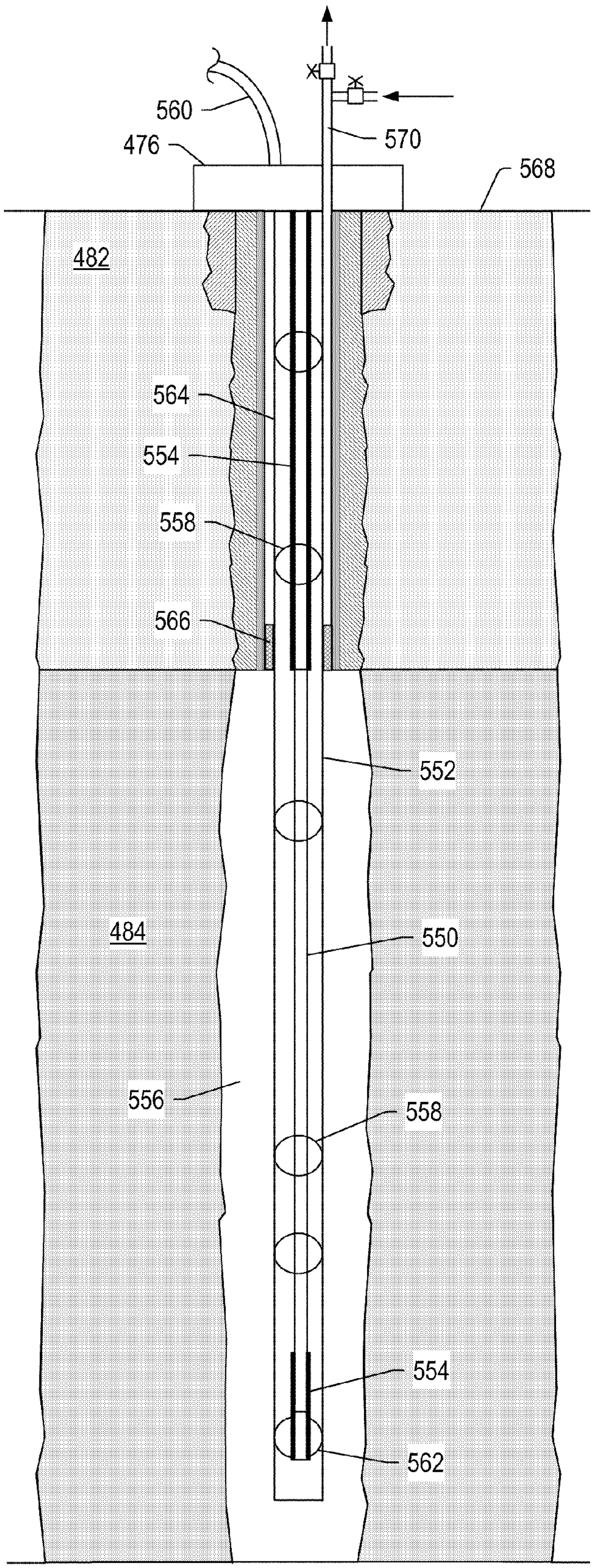
FIG. 70 depicts a cross-sectional representation of an embodiment of a removable conductor-in-conduit heat source.

FIG. 70 depicts a cross-sectional representation of an embodiment of a removable conductor-in-conduit heat source. Conduit 552 may be placed in opening 556 through overburden 482 such that a gap remains between the conduit and overburden casing 564. Fluids may be removed from opening 556 through the gap between conduit 552 and overburden casing 564. Fluids may be removed from the gap through conduit 570. Conduit 552 and components of the heat source included in the conduit that are coupled to wellhead 476 may be removed from opening 556 as a single unit. The heat source may be removed as a single unit to be repaired, replaced, and/or used in another portion of the formation.

For a temperature limited heater in which the ferromagnetic conductor provides a majority of the resistive heat output below the Curie temperature and/or the phase transformation temperature range, a majority of the current flows through material with highly non-linear functions of magnetic field (H) versus magnetic induction (B). These non-linear functions may cause strong inductive effects and distortion that lead to decreased power factor in the temperature limited heater at temperatures below the Curie temperature and/or the phase transformation temperature range. These effects may render the electrical power supply to the temperature limited heater difficult to control and may result in additional current flow through surface and/or overburden power supply conductors. Expensive and/or difficult to implement control systems such as variable capacitors or modulated power supplies may be used to compensate for these effects and to control temperature limited heaters where the majority of the resistive heat output is provided by current flow through the ferromagnetic material.

In certain temperature limited heater embodiments, the ferromagnetic conductor confines a majority of the flow of electrical current to an electrical conductor coupled to the ferromagnetic conductor when the temperature limited heater is below or near the Curie temperature and/or the phase transformation temperature range of the ferromagnetic conductor. The electrical conductor may be a sheath, jacket, support member, corrosion resistant member, or other electrically resistive member. In some embodiments, the ferromagnetic conductor confines a majority of the flow of electrical current to the electrical conductor positioned between an outermost layer and the ferromagnetic conductor. The ferromagnetic conductor is located in the cross section of the temperature limited heater such that the magnetic properties of the ferromagnetic conductor at or below the Curie temperature and/or the phase transformation temperature range of the ferromagnetic conductor confine the majority of the flow of electrical current to the electrical conductor. The majority of the flow of electrical current is confined to the electrical conductor due to the skin effect of the ferromagnetic conductor. Thus, the majority of the current is flowing through material with substantially linear resistive properties throughout most of the operating range of the heater.

In certain embodiments, the ferromagnetic conductor and the electrical conductor are located in the cross section of the temperature limited heater so that the skin effect of the ferromagnetic material limits the penetration depth of electrical current in the electrical conductor and the ferromagnetic conductor at temperatures below the Curie temperature and/or the phase transformation temperature range of the ferromagnetic conductor. Thus, the electrical conductor provides a majority of the electrically resistive heat output of the temperature limited heater at temperatures up to a temperature at or near the Curie temperature and/or the phase transformation temperature range of the ferromagnetic conductor. In certain embodiments, the dimensions of the electrical conductor may be chosen to provide desired heat output characteristics.

Because the majority of the current flows through the electrical conductor below the Curie temperature and/or the phase transformation temperature range, the temperature limited heater has a resistance versus temperature profile that at least partially reflects the resistance versus temperature profile of the material in the electrical conductor. Thus, the resistance versus temperature profile of the temperature limited heater is substantially linear below the Curie temperature and/or the phase transformation temperature range of the ferromagnetic conductor if the material in the electrical conductor has a substantially linear resistance versus temperature profile. For example, the temperature limited heater in which the majority of the current flows in the electrical conductor below the Curie temperature and/or the phase transformation temperature range may have a resistance versus temperature profile similar to the profile shown in FIG. 336. The resistance of the temperature limited heater has little or no dependence on the current flowing through the heater until the temperature nears the Curie temperature and/or the phase transformation temperature range. The majority of the current flows in the electrical conductor rather than the ferromagnetic conductor below the Curie temperature and/or the phase transformation temperature range.

Resistance versus temperature profiles for temperature limited heaters in which the majority of the current flows in the electrical conductor also tend to exhibit sharper reductions in resistance near or at the Curie temperature and/or the phase transformation temperature range of the ferromagnetic conductor. For example, the reduction in resistance shown in FIG. 336 is sharper than the reduction in resistance shown in FIG. 322. The sharper reductions in resistance near or at the Curie temperature and/or the phase transformation temperature range are easier to control than more gradual resistance reductions near the Curie temperature and/or the phase transformation temperature range because little current is flowing through the ferromagnetic material.

In certain embodiments, the material and/or the dimensions of the material in the electrical conductor are selected so that the temperature limited heater has a desired resistance versus temperature profile below the Curie temperature and/or the phase transformation temperature range of the ferromagnetic conductor.

Temperature limited heaters in which the majority of the current flows in the electrical conductor rather than the ferromagnetic conductor below the Curie temperature and/or the phase transformation temperature range are easier to predict and/or control. Behavior of temperature limited heaters in which the majority of the current flows in the electrical conductor rather than the ferromagnetic conductor below the Curie temperature and/or the phase transformation temperature range may be predicted by, for example, the resistance versus temperature profile and/or the power factor versus temperature profile. Resistance versus temperature profiles and/or power factor versus temperature profiles may be assessed or predicted by, for example, experimental measurements that assess the behavior of the temperature limited heater, analytical equations that assess or predict the behavior of the temperature limited heater, and/or simulations that assess or predict the behavior of the temperature limited heater.

In certain embodiments, assessed or predicted behavior of the temperature limited heater is used to control the temperature limited heater. The temperature limited heater may be controlled based on measurements (assessments) of the resistance and/or the power factor during operation of the heater. In some embodiments, the power, or current, supplied to the temperature limited heater is controlled based on assessment of the resistance and/or the power factor of the heater during operation of the heater and the comparison of this assessment versus the predicted behavior of the heater. In certain embodiments, the temperature limited heater is controlled without measurement of the temperature of the heater or a temperature near the heater. Controlling the temperature limited heater without temperature measurement eliminates operating costs associated with downhole temperature measurement. Controlling the temperature limited heater based on assessment of the resistance and/or the power factor of the heater also reduces the time for making adjustments in the power or current supplied to the heater compared to controlling the heater based on measured temperature.

As the temperature of the temperature limited heater approaches or exceeds the Curie temperature and/or the phase transformation temperature range of the ferromagnetic conductor, reduction in the ferromagnetic properties of the ferromagnetic conductor allows electrical current to flow through a greater portion of the electrically conducting cross section of the temperature limited heater. Thus, the electrical resistance of the temperature limited heater is reduced and the temperature limited heater automatically provides reduced heat output at or near the Curie temperature and/or the phase transformation temperature range of the ferromagnetic conductor. In certain embodiments, a highly electrically conductive member is coupled to the ferromagnetic conductor and the electrical conductor to reduce the electrical resistance of the temperature limited heater at or above the Curie temperature and/or the phase transformation temperature range of the ferromagnetic conductor. The highly electrically conductive member may be an inner conductor, a core, or another conductive member of copper, aluminum, nickel, or alloys thereof.

The ferromagnetic conductor that confines the majority of the flow of electrical current to the electrical conductor at temperatures below the Curie temperature and/or the phase transformation temperature range may have a relatively small cross section compared to the ferromagnetic conductor in temperature limited heaters that use the ferromagnetic conductor to provide the majority of resistive heat output up to or near the Curie temperature and/or the phase transformation temperature range. A temperature limited heater that uses the electrical conductor to provide a majority of the resistive heat output below the Curie temperature and/or the phase transformation temperature range has low magnetic inductance at temperatures below the Curie temperature and/or the phase transformation temperature range because less current is flowing through the ferromagnetic conductor as compared to the temperature limited heater where the majority of the resistive heat output below the Curie temperature and/or the phase transformation temperature range is provided by the ferromagnetic material. Magnetic field (H) at radius (r) of the ferromagnetic conductor is proportional to the current (I) flowing through the ferromagnetic conductor and the core divided by the radius, or:

$$H \propto I/r. \quad \text{(EQN. 5)}$$

Since only a portion of the current flows through the ferromagnetic conductor for a temperature limited heater that uses the outer conductor to provide a majority of the resistive heat output below the Curie temperature and/or the phase transformation temperature range, the magnetic field of the temperature limited heater may be significantly smaller than the magnetic field of the temperature limited heater where the majority of the current flows through the ferromagnetic material. The relative magnetic permeability (μ) may be large for small magnetic fields.

The skin depth (δ) of the ferromagnetic conductor is inversely proportional to the square root of the relative magnetic permeability (μ):

$$\delta \propto (1/\mu)^{1/2}. \quad \text{(EQN. 6)}$$

Increasing the relative magnetic permeability decreases the skin depth of the ferromagnetic conductor. However, because only a portion of the current flows through the ferromagnetic conductor for temperatures below the Curie temperature and/or the phase transformation temperature range, the radius (or thickness) of the ferromagnetic conductor may be decreased for ferromagnetic materials with large relative magnetic permeabilities to compensate for the decreased skin depth while still allowing the skin effect to limit the penetration depth of the electrical current to the electrical conductor at temperatures below the Curie temperature and/or the phase transformation temperature range of the ferromagnetic conductor. The radius (thickness) of the ferromagnetic conductor may be between 0.3 mm and 8 mm, between 0.3 mm and 2 mm, or between 2 mm and 4 mm depending on the relative magnetic permeability of the ferromagnetic conductor. Decreasing the thickness of the ferromagnetic conductor decreases costs of manufacturing the temperature limited heater, as the cost of ferromagnetic material tends to be a significant portion of the cost of the temperature limited heater. Increasing the relative magnetic permeability of the ferromagnetic conductor provides a higher turndown ratio and a sharper decrease in electrical resistance for the temperature limited heater at or near the Curie temperature and/or the phase transformation temperature range of the ferromagnetic conductor.

Ferromagnetic materials (such as purified iron or iron-cobalt alloys) with high relative magnetic permeabilities (for example, at least 200, at least 1000, at least $1\times10^4$, or at least $1\times10^5$) and/or high Curie temperatures (for example, at least 600° C., at least 700° C., or at least 800° C.) tend to have less corrosion resistance and/or less mechanical strength at high temperatures. The electrical conductor may provide corrosion resistance and/or high mechanical strength at high temperatures for the temperature limited heater. Thus, the ferromagnetic conductor may be chosen primarily for its ferromagnetic properties.

Confining the majority of the flow of electrical current to the electrical conductor below the Curie temperature and/or the phase transformation temperature range of the ferromagnetic conductor reduces variations in the power factor. Because only a portion of the electrical current flows through the ferromagnetic conductor below the Curie temperature and/or the phase transformation temperature range, the non-linear ferromagnetic properties of the ferromagnetic conductor have little or no effect on the power factor of the temperature limited heater, except at or near the Curie temperature and/or the phase transformation temperature range. Even at or near the Curie temperature and/or the phase transformation temperature range, the effect on the power factor is reduced compared to temperature limited heaters in which the ferromagnetic conductor provides a majority of the resistive heat output below the Curie temperature and/or the phase transformation temperature range. Thus, there is less or no need for external compensation (for example, variable capacitors or waveform modification) to adjust for changes in the inductive load of the temperature limited heater to maintain a relatively high power factor.

In certain embodiments, the temperature limited heater, which confines the majority of the flow of electrical current to the electrical conductor below the Curie temperature and/or the phase transformation temperature range of the ferromagnetic conductor, maintains the power factor above 0.85, above 0.9, or above 0.95 during use of the heater. Any reduction in the power factor occurs only in sections of the temperature limited heater at temperatures near the Curie temperature and/or the phase transformation temperature range. Most sections of the temperature limited heater are typically not at or near the Curie temperature and/or the phase transformation temperature range during use. These sections have a high power factor that approaches 1.0. The power factor for the entire temperature limited heater is maintained above 0.85, above 0.9, or above 0.95 during use of the heater even if some sections of the heater have power factors below 0.85.

Maintaining high power factors allows for less expensive power supplies and/or control devices such as solid state power supplies or SCRs (silicon controlled rectifiers). These devices may fail to operate properly if the power factor varies by too large an amount because of inductive loads. With the power factors maintained at high values; however, these devices may be used to provide power to the temperature limited heater. Solid state power supplies have the advantage of allowing fine tuning and controlled adjustment of the power supplied to the temperature limited heater.

In some embodiments, transformers are used to provide power to the temperature limited heater. Multiple voltage taps may be made into the transformer to provide power to the temperature limited heater. Multiple voltage taps allow the current supplied to switch back and forth between the multiple voltages. This maintains the current within a range bound by the multiple voltage taps.

The highly electrically conductive member, or inner conductor, increases the turndown ratio of the temperature limited heater. In certain embodiments, thickness of the highly electrically conductive member is increased to increase the turndown ratio of the temperature limited heater. In some embodiments, the thickness of the electrical conductor is reduced to increase the turndown ratio of the temperature limited heater. In certain embodiments, the turndown ratio of the temperature limited heater is between 1.1 and 10, between 2 and 8, or between 3 and 6 (for example, the turndown ratio is at least 1.1, at least 2, or at least 3).

Figure 71:
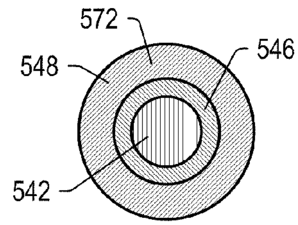
FIG. 71 depicts a cross-sectional representation of an embodiment of a temperature limited heater in which the support member provides a majority of the heat output below the Curie temperature of the ferromagnetic conductor.

FIG. 71 depicts an embodiment of a temperature limited heater in which the support member provides a majority of the heat output below the Curie temperature and/or the phase transformation temperature range of the ferromagnetic conductor. Core 542 is an inner conductor of the temperature limited heater. In certain embodiments, core 542 is a highly electrically conductive material such as copper or aluminum. In some embodiments, core 542 is a copper alloy that provides mechanical strength and good electrically conductivity such as a dispersion strengthened copper. In one embodiment, core 542 is Glidcop® (SCM Metal Products, Inc., Research Triangle Park, N.C., U.S.A.). Ferromagnetic conductor 546 is a thin layer of ferromagnetic material between electrical conductor 572 and core 542. In certain embodiments, electrical conductor 572 is also support member 548. In certain embodiments, ferromagnetic conductor 546 is iron or an iron alloy. In some embodiments, ferromagnetic conductor 546 includes ferromagnetic material with a high relative magnetic permeability. For example, ferromagnetic conductor 546 may be purified iron such as Armco ingot iron (AK Steel Ltd., United Kingdom). Iron with some impurities typically has a relative magnetic permeability on the order of 400. Purifying the iron by annealing the iron in hydrogen gas ($H_2$) at 1450° C. increases the relative magnetic permeability of the iron. Increasing the relative magnetic permeability of ferromagnetic conductor 546 allows the thickness of the ferromagnetic conductor to be reduced. For example, the thickness of unpurified iron may be approximately 4.5 mm while the thickness of the purified iron is approximately 0.76 mm.

In certain embodiments, electrical conductor 572 provides support for ferromagnetic conductor 546 and the temperature limited heater. Electrical conductor 572 may be made of a material that provides good mechanical strength at temperatures near or above the Curie temperature and/or the phase transformation temperature range of ferromagnetic conductor 546. In certain embodiments, electrical conductor 572 is a corrosion resistant member. Electrical conductor 572 (support member 548) may provide support for ferromagnetic conductor 546 and corrosion resistance. Electrical conductor 572 is made from a material that provides desired electrically resistive heat output at temperatures up to and/or above the Curie temperature and/or the phase transformation temperature range of ferromagnetic conductor 546.

In an embodiment, electrical conductor 572 is 347H stainless steel. In some embodiments, electrical conductor 572 is another electrically conductive, good mechanical strength, corrosion resistant material. For example, electrical conductor 572 may be 304H, 316H, 347HH, NF709, Incoloy® 800H alloy (Inco Alloys International, Huntington, West Va., U.S.A.), Haynes® HR120 alloy, or Inconel® 617 alloy.

In some embodiments, electrical conductor 572 (support member 548) includes different alloys in different portions of the temperature limited heater. For example, a lower portion of electrical conductor 572 (support member 548) is 347H stainless steel and an upper portion of the electrical conductor (support member) is NF709. In certain embodiments, different alloys are used in different portions of the electrical conductor (support member) to increase the mechanical strength of the electrical conductor (support member) while maintaining desired heating properties for the temperature limited heater.

In some embodiments, ferromagnetic conductor 546 includes different ferromagnetic conductors in different portions of the temperature limited heater. Different ferromagnetic conductors may be used in different portions of the temperature limited heater to vary the Curie temperature and/or the phase transformation temperature range and, thus, the maximum operating temperature in the different portions. In some embodiments, the Curie temperature and/or the phase transformation temperature range in an upper portion of the temperature limited heater is lower than the Curie temperature and/or the phase transformation temperature range in a lower portion of the heater. The lower Curie temperature and/or the phase transformation temperature range in the upper portion increases the creep-rupture strength lifetime in the upper portion of the heater.

In the embodiment depicted in FIG. 71, ferromagnetic conductor 546, electrical conductor 572, and core 542 are dimensioned so that the skin depth of the ferromagnetic conductor limits the penetration depth of the majority of the flow of electrical current to the support member when the temperature is below the Curie temperature and/or the phase transformation temperature range of the ferromagnetic conductor. Thus, electrical conductor 572 provides a majority of the electrically resistive heat output of the temperature limited heater at temperatures up to a temperature at or near the Curie temperature and/or the phase transformation temperature range of ferromagnetic conductor 546. In certain embodiments, the temperature limited heater depicted in FIG. 71 is smaller (for example, an outside diameter of 3 cm, 2.9 cm, 2.5 cm, or less) than other temperature limited heaters that do not use electrical conductor 572 to provide the majority of electrically resistive heat output. The temperature limited heater depicted in FIG. 71 may be smaller because ferromagnetic conductor 546 is thin as compared to the size of the ferromagnetic conductor needed for a temperature limited heater in which the majority of the resistive heat output is provided by the ferromagnetic conductor.

Figure 72:
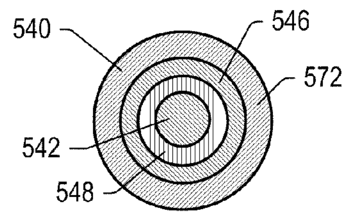
FIGS. 72 and 73 depict cross-sectional representations of embodiments of temperature limited heaters in which the jacket provides a majority of the heat output below the Curie temperature of the ferromagnetic conductor.
Figure 73:
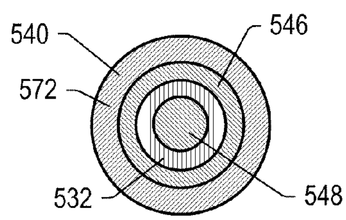

In some embodiments, the support member and the corrosion resistant member are different members in the temperature limited heater. FIGS. 72 and 73 depict embodiments of temperature limited heaters in which the jacket provides a majority of the heat output below the Curie temperature and/or the phase transformation temperature range of the ferromagnetic conductor. In these embodiments, electrical conductor 572 is jacket 540. Electrical conductor 572, ferromagnetic conductor 546, support member 548, and core 542 (in FIG. 72) or inner conductor 532 (in FIG. 73) are dimensioned so that the skin depth of the ferromagnetic conductor limits the penetration depth of the majority of the flow of electrical current to the thickness of the jacket. In certain embodiments, electrical conductor 572 is a material that is corrosion resistant and provides electrically resistive heat output below the Curie temperature and/or the phase transformation temperature range of ferromagnetic conductor 546. For example, electrical conductor 572 is 825 stainless steel or 347H stainless steel. In some embodiments, electrical conductor 572 has a small thickness (for example, on the order of 0.5 mm).

In FIG. 72, core 542 is highly electrically conductive material such as copper or aluminum. Support member 548 is 347H stainless steel or another material with good mechanical strength at or near the Curie temperature and/or the phase transformation temperature range of ferromagnetic conductor 546.

In FIG. 73, support member 548 is the core of the temperature limited heater and is 347H stainless steel or another material with good mechanical strength at or near the Curie temperature and/or the phase transformation temperature range of ferromagnetic conductor 546. Inner conductor 532 is highly electrically conductive material such as copper or aluminum.

In some embodiments, a relatively thin conductive layer is used to provide the majority of the electrically resistive heat output of the temperature limited heater at temperatures up to a temperature at or near the Curie temperature and/or the phase transformation temperature range of the ferromagnetic conductor. Such a temperature limited heater may be used as the heating member in an insulated conductor heater. The heating member of the insulated conductor heater may be located inside a sheath with an insulation layer between the sheath and the heating member.

Figure 74B:
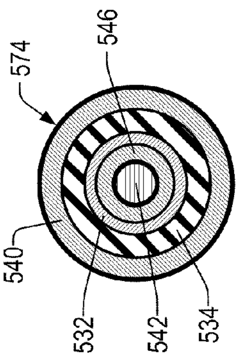
FIGS. 74A and 74B depict cross-sectional representations of an embodiment of a temperature limited heater component used in an insulated conductor heater.
Figure 74A:
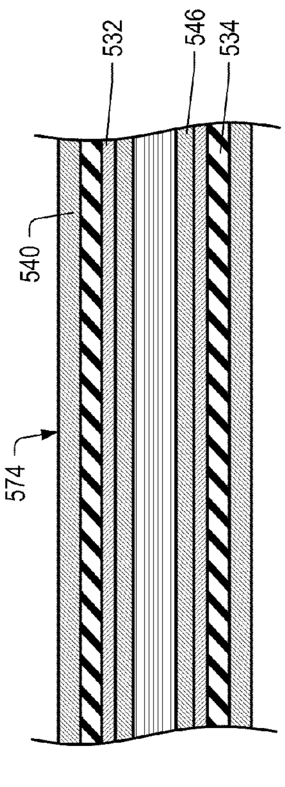

FIGS. 74A and 74B depict cross-sectional representations of an embodiment of the insulated conductor heater with the temperature limited heater as the heating member. Insulated conductor 574 includes core 542, ferromagnetic conductor 546, inner conductor 532, electrical insulator 534, and jacket 540. Core 542 is a copper core. Ferromagnetic conductor 546 is, for example, iron or an iron alloy.

Inner conductor 532 is a relatively thin conductive layer of non-ferromagnetic material with a higher electrical conductivity than ferromagnetic conductor 546. In certain embodiments, inner conductor 532 is copper. Inner conductor 532 may be a copper alloy. Copper alloys typically have a flatter resistance versus temperature profile than pure copper. A flatter resistance versus temperature profile may provide less variation in the heat output as a function of temperature up to the Curie temperature and/or the phase transformation temperature range. In some embodiments, inner conductor 532 is copper with 6% by weight nickel (for example, CuNi6 or LOHM™). In some embodiments, inner conductor 532 is CuNi10Fe1Mn alloy. Below the Curie temperature and/or the phase transformation temperature range of ferromagnetic conductor 546, the magnetic properties of the ferromagnetic conductor confine the majority of the flow of electrical current to inner conductor 532. Thus, inner conductor 532 provides the majority of the resistive heat output of insulated conductor 574 below the Curie temperature and/or the phase transformation temperature range.

In certain embodiments, inner conductor 532 is dimensioned, along with core 542 and ferromagnetic conductor 546, so that the inner conductor provides a desired amount of heat output and a desired turndown ratio. For example, inner conductor 532 may have a cross-sectional area that is around 2 or 3 times less than the cross-sectional area of core 542. Typically, inner conductor 532 has to have a relatively small cross-sectional area to provide a desired heat output if the inner conductor is copper or copper alloy. In an embodiment with copper inner conductor 532, core 542 has a diameter of 0.66 cm, ferromagnetic conductor 546 has an outside diameter of 0.91 cm, inner conductor 532 has an outside diameter of 1.03 cm, electrical insulator 534 has an outside diameter of 1.53 cm, and jacket 540 has an outside diameter of 1.79 cm. In an embodiment with a CuNi6 inner conductor 532, core 542 has a diameter of 0.66 cm, ferromagnetic conductor 546 has an outside diameter of 0.91 cm, inner conductor 532 has an outside diameter of 1.12 cm, electrical insulator 534 has an outside diameter of 1.63 cm, and jacket 540 has an outside diameter of 1.88 cm. Such insulated conductors are typically smaller and cheaper to manufacture than insulated conductors that do not use the thin inner conductor to provide the majority of heat output below the Curie temperature and/or the phase transformation temperature range.

Electrical insulator 534 may be magnesium oxide, aluminum oxide, silicon dioxide, beryllium oxide, boron nitride, silicon nitride, or combinations thereof. In certain embodiments, electrical insulator 534 is a compacted powder of magnesium oxide. In some embodiments, electrical insulator 534 includes beads of silicon nitride.

In certain embodiments, a small layer of material is placed between electrical insulator 534 and inner conductor 532 to inhibit copper from migrating into the electrical insulator at higher temperatures. For example, a small layer of nickel (for example, about 0.5 mm of nickel) may be placed between electrical insulator 534 and inner conductor 532.

Jacket 540 is made of a corrosion resistant material such as, but not limited to, 347 stainless steel, 347H stainless steel, 446 stainless steel, or 825 stainless steel. In some embodiments, jacket 540 provides some mechanical strength for insulated conductor 574 at or above the Curie temperature and/or the phase transformation temperature range of ferromagnetic conductor 546. In certain embodiments, jacket 540 is not used to conduct electrical current.

For long vertical temperature limited heaters (for example, heaters at least 300 m, at least 500 m, or at least 1 km in length), the hanging stress becomes important in the selection of materials for the temperature limited heater. Without the proper selection of material, the support member may not have sufficient mechanical strength (for example, creep-rupture strength) to support the weight of the temperature limited heater at the operating temperatures of the heater.

In certain embodiments, materials for the support member are varied to increase the maximum allowable hanging stress at operating temperatures of the temperature limited heater and, thus, increase the maximum operating temperature of the temperature limited heater. Altering the materials of the support member affects the heat output of the temperature limited heater below the Curie temperature and/or the phase transformation temperature range because changing the materials changes the resistance versus temperature profile of the support member. In certain embodiments, the support member is made of more than one material along the length of the heater so that the temperature limited heater maintains desired operating properties (for example, resistance versus temperature profile below the Curie temperature and/or the phase transformation temperature range) as much as possible while providing sufficient mechanical properties to support the heater. In some embodiments, transition sections are used between sections of the heater to provide strength that compensates for the difference in temperature between sections of the heater. In certain embodiments, one or more portions of the temperature limited heater have varying outside diameters and/or materials to provide desired properties for the heater.

In certain embodiments of temperature limited heaters, three temperature limited heaters are coupled together in a three-phase wye configuration. Coupling three temperature limited heaters together in the three-phase wye configuration lowers the current in each of the individual temperature limited heaters because the current is split between the three individual heaters. Lowering the current in each individual temperature limited heater allows each heater to have a small diameter. The lower currents allow for higher relative magnetic permeabilities in each of the individual temperature limited heaters and, thus, higher turndown ratios. In addition, there may be no return current path needed for each of the individual temperature limited heaters. Thus, the turndown ratio remains higher for each of the individual temperature limited heaters than if each temperature limited heater had its own return current path.

In the three-phase wye configuration, individual temperature limited heaters may be coupled together by shorting the sheaths, jackets, or canisters of each of the individual temperature limited heaters to the electrically conductive sections (the conductors providing heat) at their terminating ends (for example, the ends of the heaters at the bottom of a heater wellbore). In some embodiments, the sheaths, jackets, canisters, and/or electrically conductive sections are coupled to a support member that supports the temperature limited heaters in the wellbore.

In certain embodiments, coupling multiple heaters (for example, mineral insulated conductor heaters) to a single power source, such as a transformer, is advantageous. Coupling multiple heaters to a single transformer may result in using fewer transformers to power heaters used for a treatment area as compared to using individual transformers for each heater. Using fewer transformers reduces surface congestion and allows easier access to the heaters and surface components. Using fewer transformers reduces capital costs associated with providing power to the treatment area. In some embodiments, at least 4, at least 5, at least 10, at least 25 heaters, at least 35 heaters, or at least 45 heaters are powered by a single transformer. Additionally, powering multiple heaters (in different heater wells) from the single transformer may reduce overburden losses because of reduced voltage and/or phase differences between each of the heater wells powered by the single transformer. Powering multiple heaters from the single transformer may inhibit current imbalances between the heaters because the heaters are coupled to the single transformer.

To provide power to multiple heaters using the single transformer, the transformer may have to provide power at higher voltages to carry the current to each of the heaters effectively. In certain embodiments, the heaters are floating (ungrounded) heaters in the formation. Floating the heaters allows the heaters to operate at higher voltages. In some embodiments, the transformer provides power output of at least about 3 kV, at least about 4 kV, at least about 5 kV, or at least about 6 kV.

Figure 75:
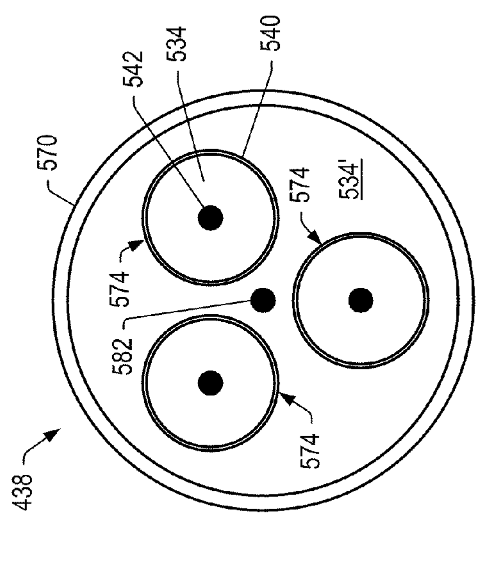
FIG. 75 depicts a top view representation of three insulated conductors in a conduit.

FIG. 75 depicts a top view representation of heater 438 with three insulated conductors 574 in conduit 570. Heater 438 may be located in a heater well in the subsurface formation. Conduit 570 may be a sheath, jacket, or other enclosure around insulated conductors 574. Each insulated conductor 574 includes core 542, electrical insulator 534, and jacket 540. Insulated conductors 574 may be mineral insulated conductors with core 542 being a copper alloy (for example, a copper-nickel alloy such as Alloy 180), electrical insulator 534 being magnesium oxide, and jacket 540 being Incoloy® 825, copper, or stainless steel (for example 347H stainless steel). In some embodiments, jacket 540 includes non-work hardenable metals so that the jacket is annealable.

In some embodiments, core 542 and/or jacket 540 include ferromagnetic materials. In some embodiments, one or more insulated conductors 574 are temperature limited heaters. In certain embodiments, the overburden portion of insulated conductors 574 include high electrical conductivity materials in core 542 (for example, pure copper or copper alloys such as copper with 3% silicon at a weld joint) so that the overburden portions of the insulated conductors provide little or no heat output. In certain embodiments, conduit 570 includes non-corrosive materials and/or high strength materials such as stainless steel. In one embodiment, conduit 570 is 347H stainless steel.

Insulated conductors 574 may be coupled to the single transformer in a three-phase configuration (for example, a three-phase wye configuration). Each insulated conductor 574 may be coupled to one phase of the single transformer. In certain embodiments, the single transformer is also coupled to a plurality of identical heaters 438 in other heater wells in the formation (for example, the single transformer may couple to 40 or more heaters in the formation). In some embodiments, the single transformer couples to at least 4, at least 5, at least 10, at least 15, or at least 25 additional heaters in the formation.

Electrical insulator 534' may be located inside conduit 570 to electrically insulate insulated conductors 574 from the conduit. In certain embodiments, electrical insulator 534' is magnesium oxide (for example, compacted magnesium oxide). In some embodiments, electrical insulator 534' is silicon nitride (for example, silicon nitride blocks). Electrical insulator 534' electrically insulates insulated conductors 574 from conduit 570 so that at high operating voltages (for example, 3 kV or higher), there is no arcing between the conductors and the conduit. In some embodiments, electrical insulator 534' inside conduit 570 has at least the thickness of electrical insulators 534 in insulated conductors 574. The increased thickness of insulation in heater 438 (from electrical insulators 534 and/or electrical insulator 534') inhibits and may prevent current leakage into the formation from the heater. In some embodiments, electrical insulator 534' spatially locates insulated conductors 574 inside conduit 570.

Figure 76:
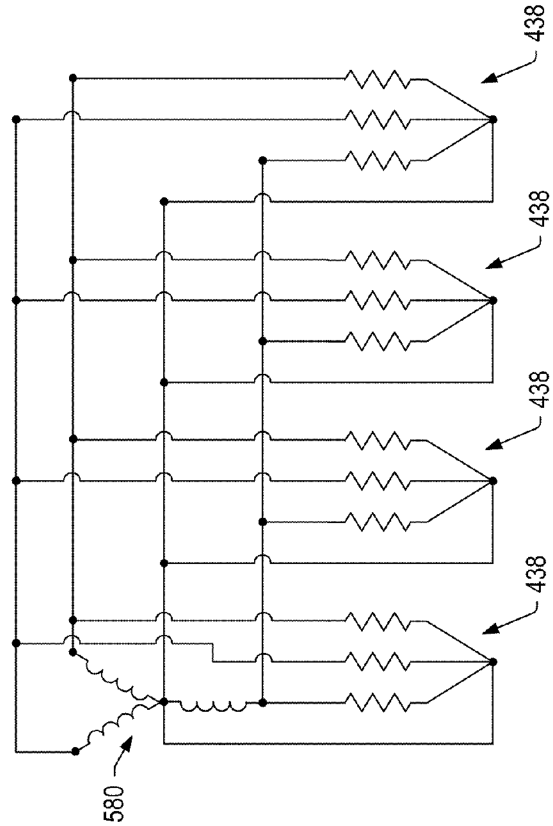
FIG. 76 depicts an embodiment of three-phase wye transformer coupled to a plurality of heaters.

FIG. 76 depicts an embodiment of three-phase wye transformer 580 coupled to a plurality of heaters 438. For simplicity in the drawing, only four heaters 438 are shown in FIG. 76. It is to be understood that several more heaters may be coupled to the transformer 580. As shown in FIG. 76, each leg (each insulated conductor) of each heater is coupled to one phase of transformer 580 and current is returned to the neutral or ground of the transformer (for example, returned through conductor 582 depicted in FIGS. 75 and 77).

Figure 77:
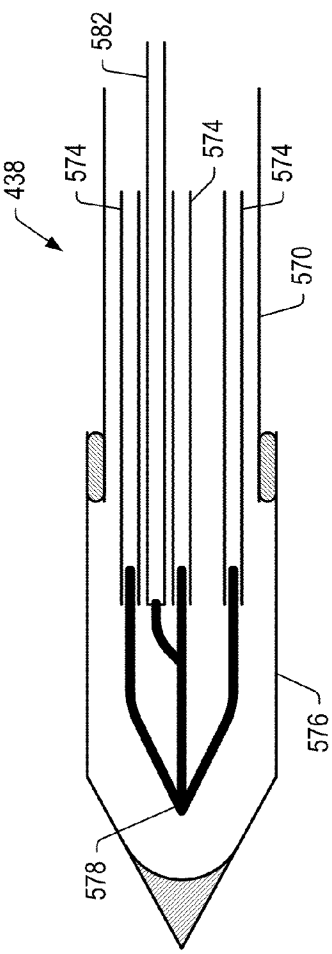
FIG. 77 depicts a side view representation of an end section of three insulated conductors in a conduit.

Return conductor 582 may be electrically coupled to the ends of insulated conductors 574 (as shown in FIG. 77) current returns from the ends of the insulated conductors to the transformer on the surface of the formation. Return conductor 582 may include high electrical conductivity materials such as pure copper, nickel, copper alloys, or combinations thereof so that the return conductor provides little or no heat output. In some embodiments, return conductor 582 is a tubular (for example, a stainless steel tubular) that allows an optical fiber to be placed inside the tubular to be used for temperature and/or other measurement. In some embodiments, return conductor 582 is a small insulated conductor (for example, small mineral insulated conductor). Return conductor 582 may be coupled to the neutral or ground leg of the transformer in a three-phase wye configuration. Thus, insulated conductors 574 are electrically isolated from conduit 570 and the formation. Using return conductor 582 to return current to the surface may make coupling the heater to a wellhead easier. In some embodiments, current is returned using one or more of jackets 540, depicted in FIG. 75. One or more jackets 540 may be coupled to cores 542 at the end of the heaters and return current to the neutral of the three-phase wye transformer.

FIG. 77 depicts a side view representation of the end section of three insulated conductors 574 in conduit 570. The end section is the section of the heaters the furthest away from (distal from) the surface of the formation. The end section includes contactor section 576 coupled to conduit 570. In some embodiments, contactor section 576 is welded or brazed to conduit 570. Termination 578 is located in contactor section 576. Termination 578 is electrically coupled to insulated conductors 574 and return conductor 582. Termination 578 electrically couples the cores of insulated conductors 574 to the return conductor 582 at the ends of the heaters.

In certain embodiments, heater 438, depicted in FIGS. 75 and 77, includes an overburden section using copper as the core of the insulated conductors. The copper in the overburden section may be the same diameter as the cores used in the heating section of the heater. The copper in the overburden section may have a larger diameter than the cores in the heating section of the heater. Increasing the size of the copper in the overburden section may decrease losses in the overburden section of the heater.

Heaters that include three insulated conductors 574 in conduit 570, as depicted in FIGS. 75 and 77, may be made in a multiple step process. In some embodiments, the multiple step process is performed at the site of the formation or treatment area. In some embodiments, the multiple step process is performed at a remote manufacturing site away from the formation. The finished heater is then transported to the treatment area.

Insulated conductors 574 may be pre-assembled prior to the bundling either on site or at a remote location. Insulated conductors 574 and return conductor 582 may be positioned on spools. A machine may draw insulated conductors 574 and return conductor 582 from the spools at a selected rate. Preformed blocks of insulation material may be positioned around return conductor 582 and insulated conductors 574. In an embodiment, two blocks are positioned around return conductor 582 and three blocks are positioned around insulated conductors 574 to form electrical insulator 534'. The insulated conductors and return conductor may be drawn or pushed into a plate of conduit material that has been rolled into a tubular shape. The edges of the plate may be pressed together and welded (for example, by laser welding). After forming conduit 570 around electrical insulator 534', the bundle of insulated conductors 574, and return conductor 582, the conduit may be compacted against the electrical insulator 582 so that all of the components of the heater are pressed together into a compact and tightly fitting form. During the compaction, the electrical insulator may flow and fill any gaps inside the heater.

In some embodiments, heater 438 (which includes conduit 570 around electrical insulator 534' and the bundle of insulated conductors 574 and return conductor 582) is inserted into a coiled tubing tubular that is placed in a wellbore in the formation. The coiled tubing tubular may be left in place in the formation (left in during heating of the formation) or removed from the formation after installation of the heater. The coiled tubing tubular may allow for easier installation of heater 438 into the wellbore.

Figure 78:
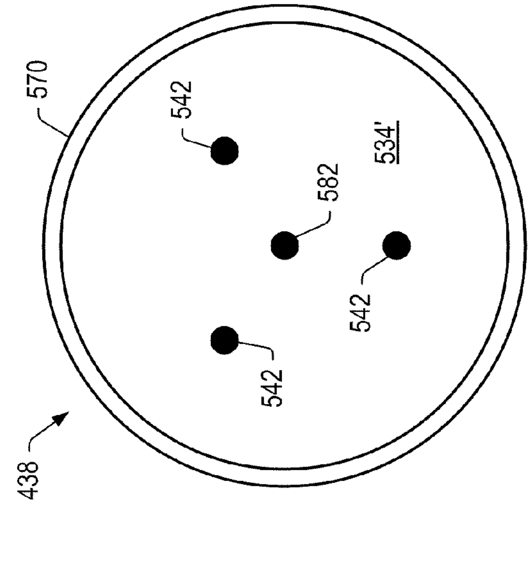
FIG. 78 depicts an embodiment of a heater with three insulated cores in a conduit.

In some embodiments, one or more components of heater 438 are varied (for example, removed, moved, or replaced) while the operation of the heater remains substantially identical. FIG. 78 depicts an embodiment of heater 438 with three insulated cores 542 in conduit 570. In this embodiment, electrical insulator 534' surrounds cores 542 and return conductor 582 in conduit 570. Cores 542 are located in conduit 570 without an electrical insulator and jacket surrounding the cores. Cores 542 are coupled to the single transformer in a three-phase wye configuration with each core 542 coupled to one phase of the transformer. Return conductor 582 is electrically coupled to the ends of cores 542 and returns current from the ends of the cores to the transformer on the surface of the formation.

Figure 79:
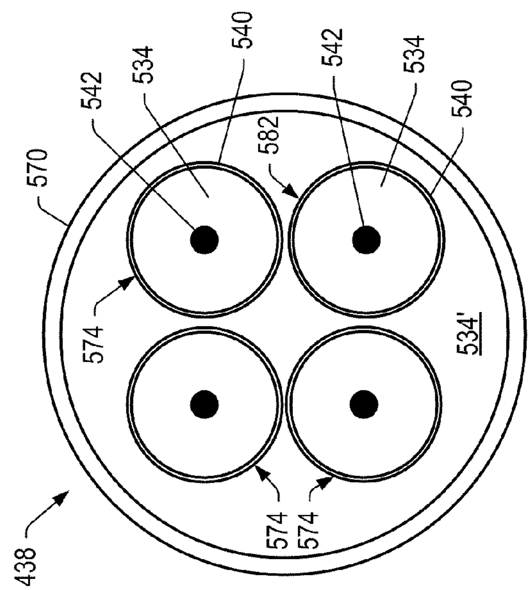
FIG. 79 depicts an embodiment of a heater with three insulated conductors and an insulated return conductor in a conduit.

FIG. 79 depicts an embodiment of heater 438 with three insulated conductors 574 and insulated return conductor in conduit 570. In this embodiment, return conductor 582 is an insulated conductor with core 542, electrical insulator 534, and jacket 540. Return conductor 582 and insulated conductors 574 are located in conduit 570 surrounded by electrical insulator 534'. Return conductor 582 and insulated conductors 574 may be the same size or different sizes. Return conductor 582 and insulated conductors 574 operate substantially the same as in the embodiment depicted in FIGS. 75 and 77.

Figure 80:
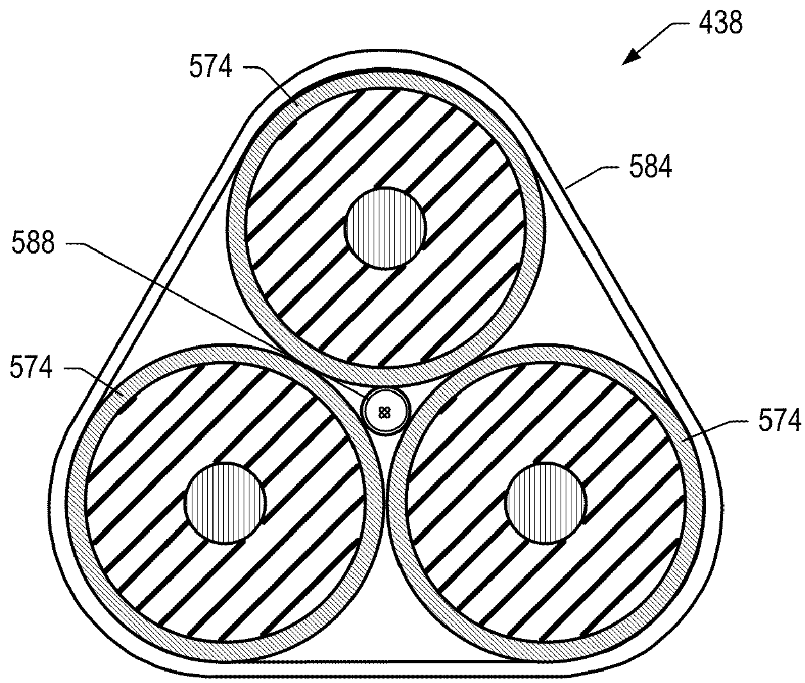
FIG. 80 depicts a cross-sectional representation of an embodiment of three insulated conductors banded together.
Figure 81:
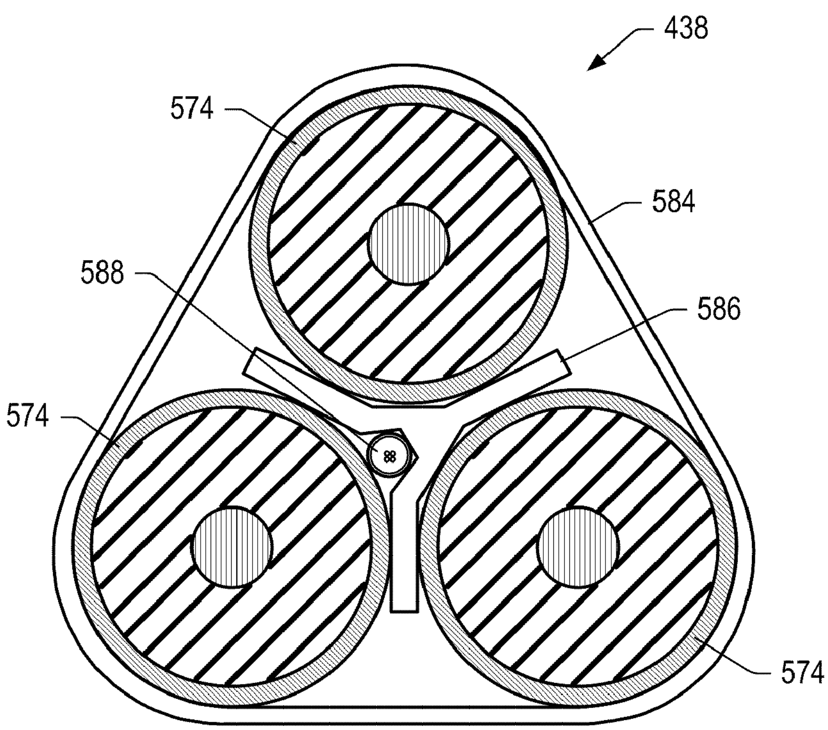
FIG. 81 depicts a cross-sectional representation of an embodiment of three insulated conductors banded together with a support member between the insulated conductors.

FIGS. 80 and 81 depict embodiments of three insulated conductors 574 banded together. Heater 438 includes three insulated conductors 574 coupled together in a spiral configuration. In other embodiments, six, nine, or multiples of three insulated conductors are coupled together. In certain embodiments, insulated conductors 574 are held together in the spiral configuration with bands 584 that are periodically placed around insulated conductors 574.

Banding insulated conductors 574 together instead of placing the conductors in a casing allows open spaces between the conductors to radiate heat to the formation, thus increasing the radiating surface area of heater 438. Banding insulated conductors 574 together may improve the insertion strength of heater 438.

In some embodiments, insulated conductors 574 are banded onto and around support member 586, as shown in FIG. 81. Support member 586 may provide structural support and/or increase the insertion strength of heater 438. In some embodiments, support member 586 includes a conduit used to provide fluids and/or to remove fluids from heater 438. For example, oxidization inhibiting fluids may be provided to heater 438 through support member 586. In some embodiments, other structures are used to provide fluids and/or to remove fluids from heater 438.

Heater 438 may be provided power from single phase power sources (for example, as depicted in FIG. 80), or from three-phase power sources (for example, as depicted in FIG. 81) depending on desired operation of the heater. Support member 586 may provide electrical isolation for insulated conductors 438 coupled to the three-phase power source. The voltage differentials on the surfaces (jackets) of insulated conductors 574 in the three-phase embodiment may be reduced because of the proximity effect.

In some embodiments, optical sensor 588 is located at or near a center of insulated conductors 574. Optical sensor 588 may be used to assess properties of heater 438 such as, but not limited to, stress, temperature, and/or pressure. In some embodiments, support member 586 includes a notch, as shown in FIG. 81, for insertion of optical sensor 588. The notch may allow continuous insertion of optical sensor optical sensor 588 during installation of heater 438.

In some embodiments, three insulated conductor heaters (for example, mineral insulated conductor heaters) are coupled together into a single assembly. The single assembly may be built in long lengths and may operate at high voltages (for example, voltages of 4000 V nominal). In certain embodiments, the individual insulated conductor heaters are enclosed in corrosive resistant jackets to resist damage from the external environment. The jackets may be, for example, seam welded stainless steel armor similar to that used on type MC/CWCMC cable.

In some embodiments, three insulated conductor heaters are cabled and the insulating filler added in conventional methods known in the art. The insulated conductor heaters may include one or more heater sections that resistively heat and provide heat to formation adjacent to the heater sections.

The insulated conductors may include one or more other sections that provide electricity to the heater sections with relatively small heat loss. The individual insulated conductor heaters may be wrapped with high temperature fiber tapes before being placed on a take-up reel (for example, a coiled tubing rig). The reel assembly may be moved to another machine for application of an outer metallic sheath or outer protective conduit.

In some embodiments, the fillers include glass, ceramic or other temperature resistant fibers that withstand operating temperature of 760° C. or higher. In addition, the insulated conductor cables may be wrapped in multiple layers of a ceramic fiber woven tape material. By wrapping the tape around the cabled insulated conductor heaters prior to application of the outer metallic sheath, electrical isolation is provided between the insulated conductor heaters and the outer sheath. This electrical isolation inhibits leakage current from the insulated conductor heaters passing into the subsurface formation and forces any leakage currents to return directly to the power source on the individual insulated conductor sheaths and/or on a lead-in conductor or lead-out conductor coupled to the insulated conductors. The lead-in or lead-out conductors may be coupled to the insulated conductors when the insulated conductors are placed into an assembly with the outer metallic sheath.

In certain embodiments, the insulated conductor heaters are wrapped with a metallic tape or other type of tape instead of the high temperature ceramic fiber woven tape material. The metallic tape holds the insulated conductor heaters together. A widely-spaced wide pitch spiral wrapping of a high temperature fiber rope may be wrapped around the insulated conductor heaters. The fiber rope may provide electrical isolation between the insulated conductors and the outer sheath. The fiber rope may be added at any stage during assembly. For example, the fiber rope may be added as a part of the final assembly when the outer sheath is added. Application of the fiber rope may be simpler than other electrical isolation methods because application of the fiber rope is done with only a single layer of rope instead of multiple layers of ceramic tape. The fiber rope may be less expensive than multiple layers of ceramic tape. The fiber rope may increase heat transfer between the insulated conductors and the outer sheath and/or reduce interference with any welding process used to weld the outer sheath around the insulated conductors (for example, seam welding).

Figure 82:
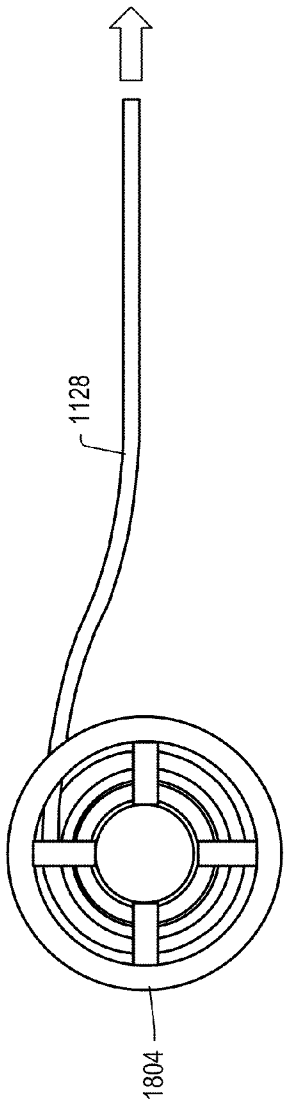
FIG. 82 depicts outer tubing partially unspooled from a coiled tubing rig.
Figure 83:
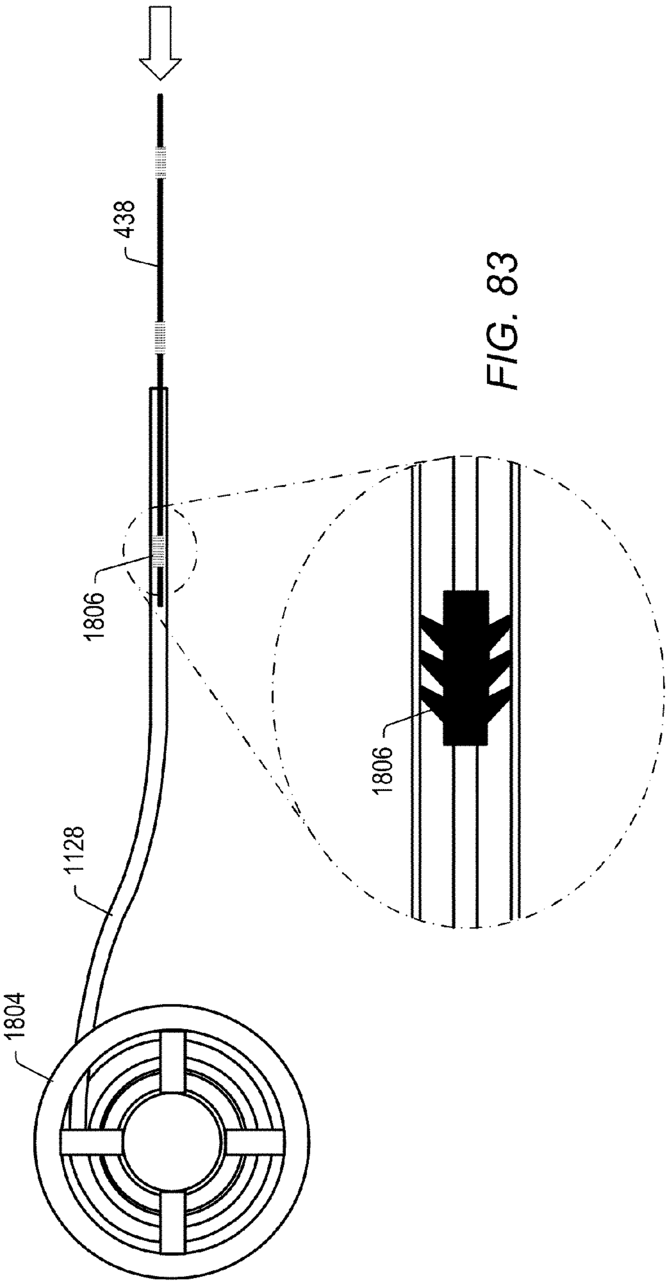
FIG. 83 depicts a heater being pushed into outer tubing partially unspooled from a coiled tubing rig.

In certain embodiments, an insulated conductor or another type of heater is installed in a wellbore or opening in the formation using outer tubing coupled to a coiled tubing rig. FIG. 82 depicts outer tubing 1128 partially unspooled from coiled tubing rig 1804. Outer tubing 1128 may be made of metal or polymeric material. Outer tubing 1128 may be a flexible conduit such as, for example, a tubing guide string or other coiled tubing string. Heater 438 may be pushed into outer tubing 1128, as shown in FIG. 83. In certain embodiments, heater 438 is pushed into outer tubing 1128 by pumping the heater into the outer tubing.

In certain embodiments, one or more flexible cups 1806 are coupled to the outside of heater 438. Flexible cups 1806 may have a variety of shapes and/or sizes but typically are shaped and sized to maintain at least some pressure inside at least a portion of outer tubing 1128 as heater 438 is pushed or pumped into the outer tubing. For example, flexible cups 1806 may have flexible edges that provide limited mechanical resistance as heater 438 is pushed into outer tubing 1128 but remain in contact with the inner walls of outer tubing 1128 as the heater is pushed so that pressure is maintained between the heater and the outer tubing. Maintaining at least some pressure in outer tubing 1128 between flexible cups 1806 allows heater 438 to be continuously pushed into the outer tubing with lower pump pressures. Without flexible cups 1806, higher pressures may be needed to push heater 438 into outer tubing 1128. In some embodiments, cups 1806 allow some pressure to be released while maintaining some pressure in outer tubing 1128. In certain embodiments, flexible cups 1806 are spaced to distribute pumping forces optimally along heater 438 inside outer tubing 1128.

Figure 84:
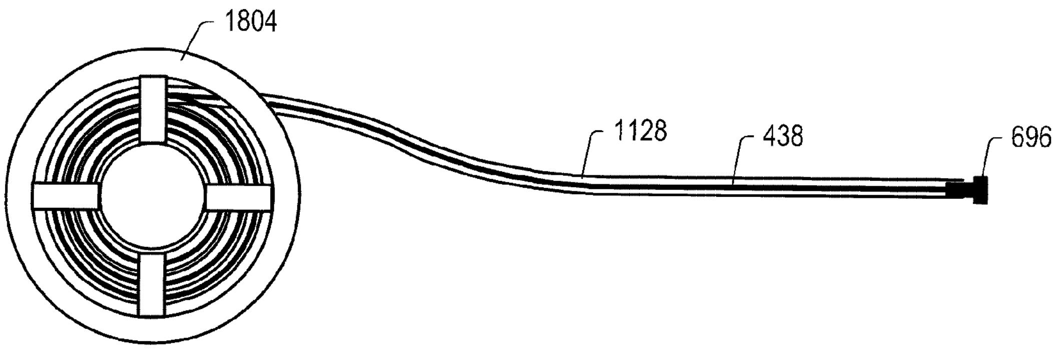
FIG. 84 depicts a heater being fully inserted into outer tubing with a drilling guide coupled to the end of the heater.
Figure 85:
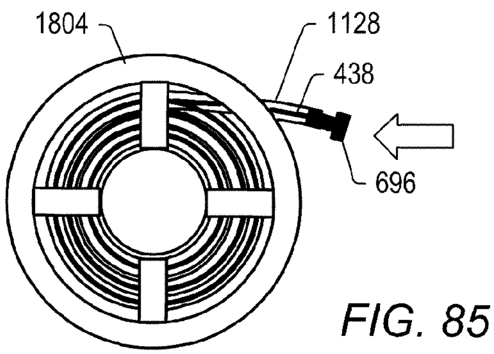
FIG. 85 depicts a heater, outer tubing, and drilling guide spooled onto a coiled tubing rig.

Heater 438 is pushed into outer tubing 1128 until the heater is fully inserted into the outer tubing, as shown in FIG. 84. Drilling guide 696 may be coupled to the end of heater 438. Heater 438, outer tubing 1128, and drilling guide 696 may be spooled onto coiled tubing rig 1804, as shown in FIG. 85. After heater 438, outer tubing 1128, and drilling guide 696 are spooled onto coiled tubing rig 1804, the assembly may be transported to a location for installation of the heater. For example, the assembly may be transported to the location of a subsurface heater wellbore (opening).

Figure 86:
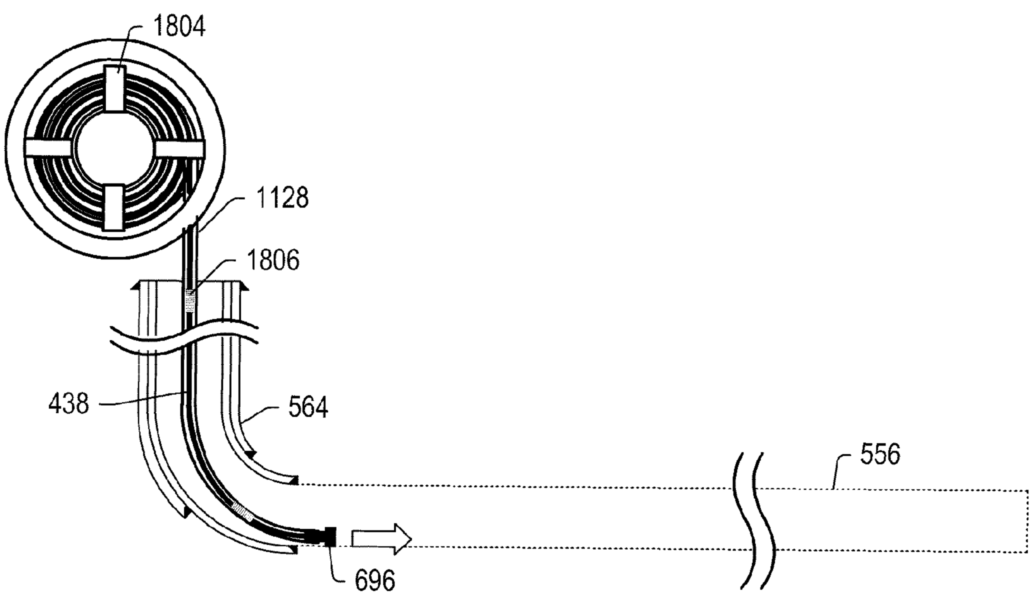
FIG. 86 depicts a coiled tubing rig being used to install a heater and outer tubing into an opening using a drilling guide.

FIG. 86 depicts coiled tubing rig 1804 being used to install heater 438 and outer tubing 1128 into opening 556 using drilling guide 696. In certain embodiments, opening 556 is an L-shaped opening or wellbore with a substantially horizontal or inclined portion in a hydrocarbon containing layer of the formation. In such embodiments, heater 438 has a heating section that is placed in the substantially horizontally or inclined portion of opening 556 to be used to heat the hydrocarbon containing layer. In some embodiments, opening 556 has a horizontal or inclined section that is at least about 1000 m in length, at least about 1500 m in length, or at least about 2000 m in length. Overburden casing 564 may be located around the outer walls of opening 556 in an overburden section of the formation. In some embodiments, drilling fluid is left in opening 556 after the opening has been completed (the opening has been drilled).

Figure 87:
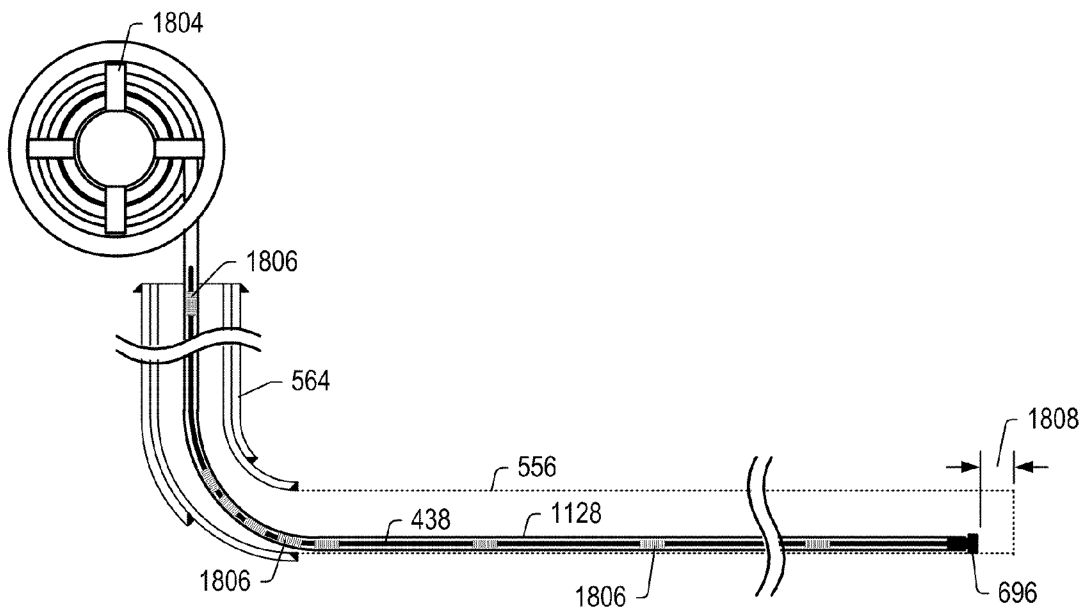
FIG. 87 depicts a heater and outer tubing installed in an opening.

FIG. 87 depicts heater 438 and outer tubing 1128 installed in opening 556. Gap 1808 may be left at or near the far end of heater 438 and outer tubing 1128. Gap 1808 may allow for some heater expansion in opening 556 after the heater is energized.

Figure 88:
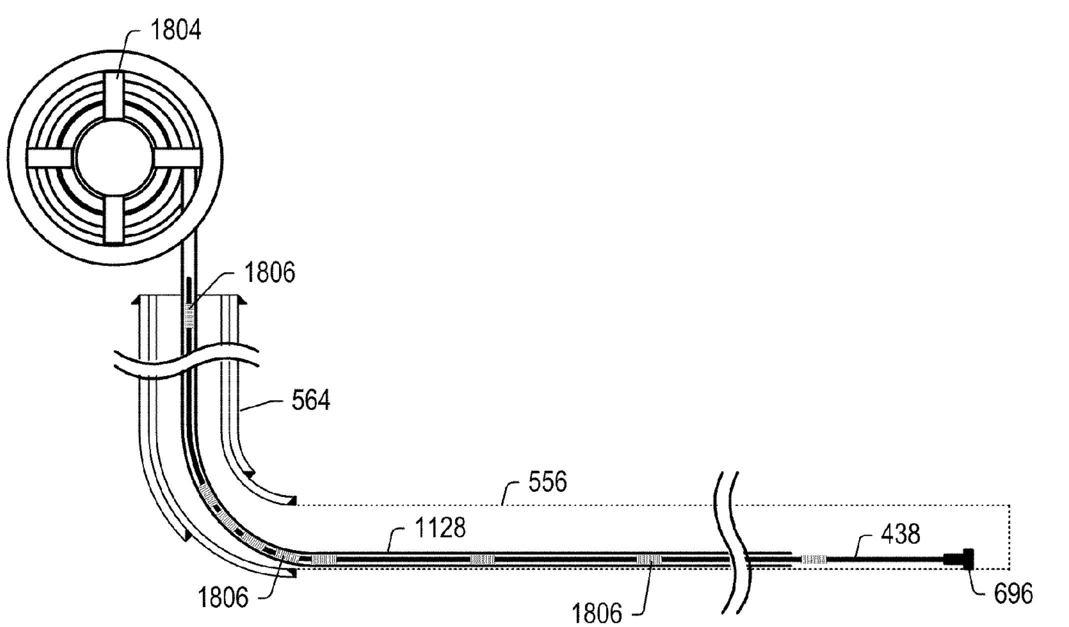
FIG. 88 depicts outer tubing being removed from an opening while leaving a heater installed in the opening.

After heater 438 and outer tubing 1128 are installed in opening 556, the outer tubing may be removed from the opening to leave the heater in place in the opening. FIG. 88 depicts outer tubing 1128 being removed from opening 556 while leaving heater 438 installed in the opening. Outer tubing 1128 is spooled back onto coiled tubing rig 1804 as the outer tubing is pulled off heater 438. In some embodiments, outer tubing 1128 is pumped down to allow the outer tubing to be pulled off heater 438.

Figure 89:
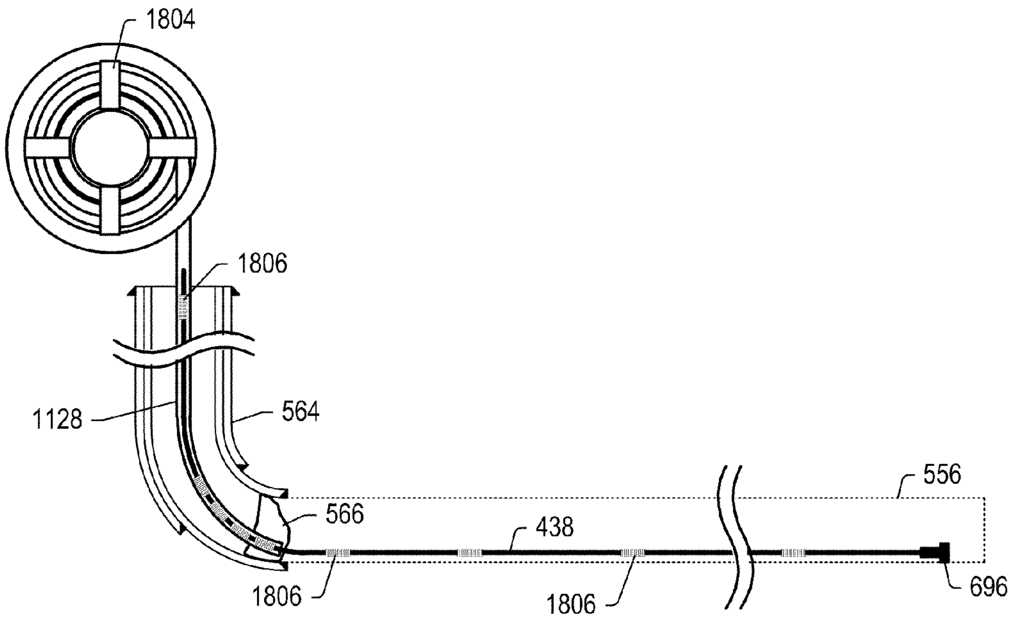
FIG. 89 depicts outer tubing used to provide a packing material into an opening.

FIG. 89 depicts outer tubing 1128 used to provide packing material 566 into opening 556. As outer tubing 1128 reaches the "shoe" or bend in opening 556, the outer tubing may be used to provide packing material into the opening. The shoe of opening 556 may be located at or near the bottom of overburden casing 564. Packing material 566 may be provided (for example, pumped) through outer tubing 1128 and out the end of the outer tubing at the shoe of opening 556. Packing material 566 is provided into opening 556 to seal off the opening around heater 438. Packing material 566 provides a barrier between the overburden section and heating section of opening 556. In certain embodiments, packing material 566 is cement or another suitable plugging material. In some embodiments, outer tubing 1128 is continuously spooled while packing material 566 is provided into opening 556. Outer tubing 1128 may be spooled slowly while packing material 566 is provided into opening 556 to allow the packing material to settle into the opening properly.

Figure 90:
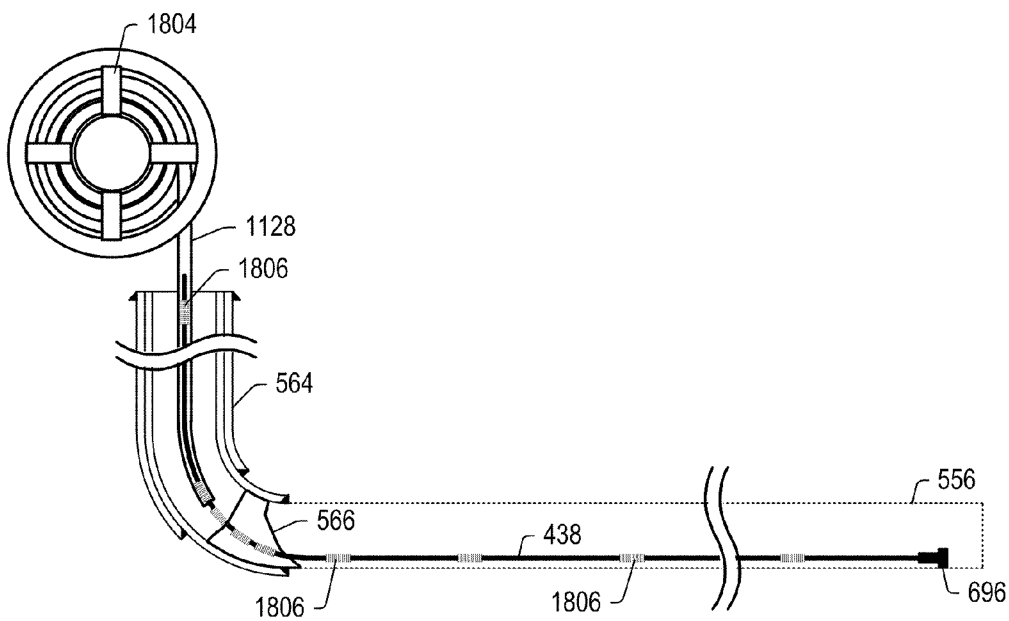
FIG. 90 depicts outer tubing being spooled onto a coiled tubing rig after packing material is provided into an opening.
Figure 91:
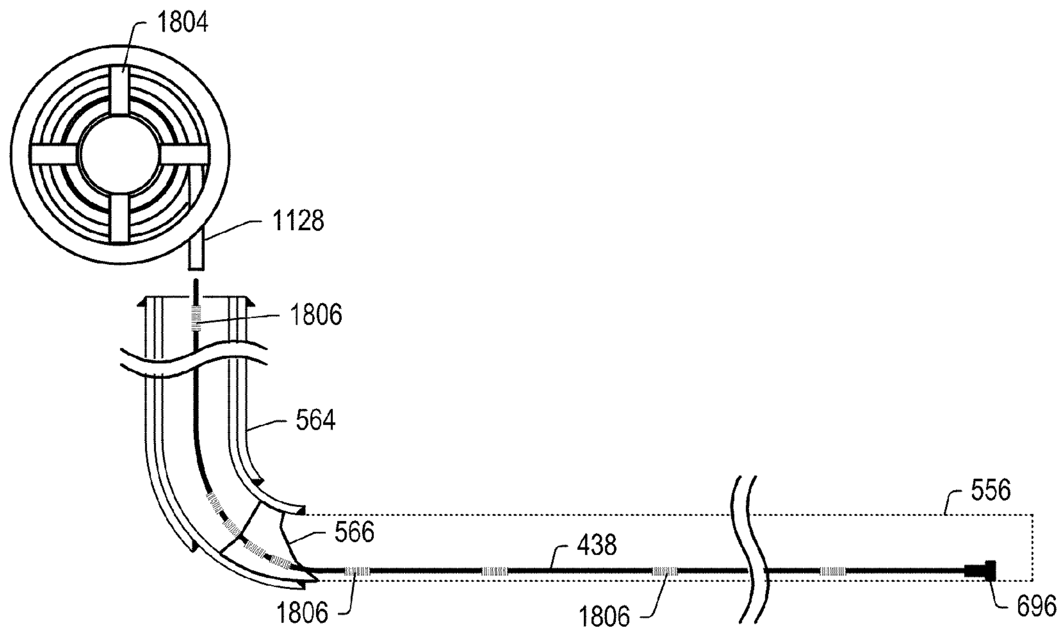
FIG. 91 depicts outer tubing spooled onto a coiled tubing rig with a heater installed in an opening.

After packing material 566 is provided into opening 556, outer tubing 1128 is spooled further onto coiled tubing rig 1804, as shown in FIG. 90. FIG. 91 depicts outer tubing 1128 spooled onto coiled tubing rig 1804 with heater 438 installed in opening 556. In certain embodiments, flexible cups 1806 are spaced in the portion of opening 556 with overburden casing 564 to facilitate adequate stand-off of heater 438 in the overburden portion of the opening. Flexible cups 1806 may electrically insulate heater 438 from overburden casing 564. For example, flexible cups 1806 may space apart heater 438 and overburden casing 564 such that they are not in physical contact with each other.

Figure 92:
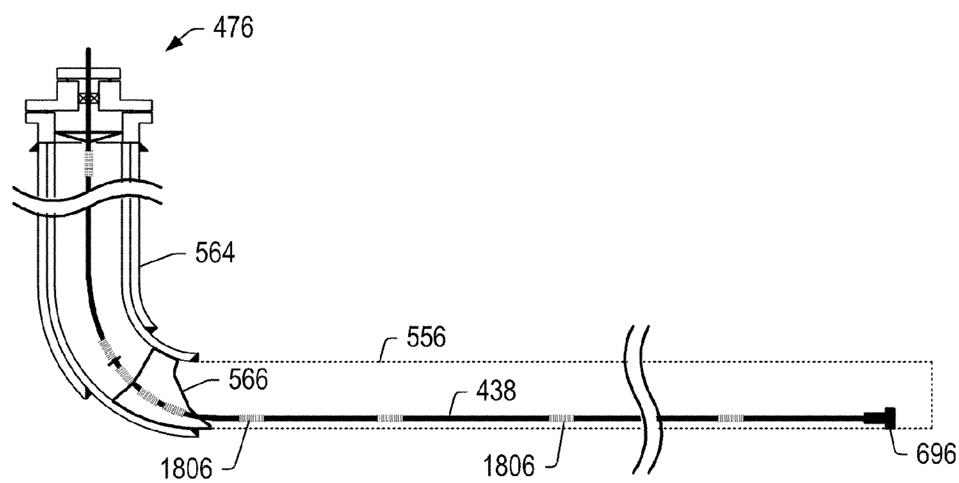
FIG. 92 depicts a heater installed in an opening with a wellhead.

After outer tubing 1128 is removed from opening 556, wellhead 476 and/or other completions may be installed at the surface of the opening, as shown in FIG. 92. When heater 438 is energized to begin heating, flexible cups 1806 may begin to burn or melt off. Flexible cups 1806 may begin to burn or melt off at relatively low temperatures during the heating process.

Figure 93:
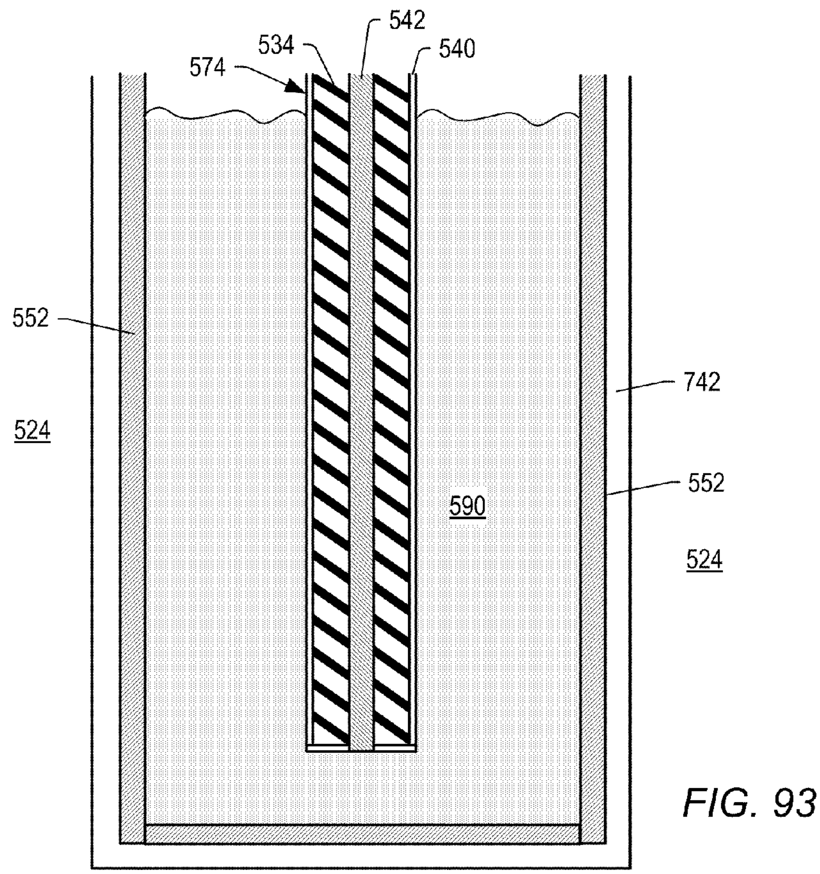
FIG. 93 depicts an embodiment of an insulated conductor in a conduit with liquid between the insulated conductor and the conduit.

FIG. 93 depicts an embodiment of a heater in wellbore 742 in formation 524. The heater includes insulated conductor 574 in conduit 552 with material 590 between the insulated conductor and the conduit. In some embodiments, insulated conductor 574 is a mineral insulated conductor. Electricity supplied to insulated conductor 574 resistively heats the insulated conductor. Insulated conductor conductively transfers heat to material 590. Heat may transfer within material 590 by heat conduction and/or by heat convection. Radiant heat from insulated conductor 574 and/or heat from material 590 transfers to conduit 552. Heat may transfer to the formation from the heater by conductive or radiative heat transfer from conduit 552. Material 590 may be molten metal, molten salt, or other liquid. In some embodiments, a gas (for example, nitrogen, carbon dioxide, and/or helium) is in conduit 552 above material 590. The gas may inhibit oxidation or other chemical changes of material 590. The gas may inhibit vaporization of material 590. U.S. Published Patent Application 2008-0078551 to DeVault et al., which is incorporated by reference as if fully set forth herein, describes a system for placement in a wellbore, the system including a heater in a conduit with a liquid metal between the heater and the conduit for heating subterranean earth.

Insulated conductor 574 and conduit 552 may be placed in an opening in a subsurface formation. Insulated conductor 574 and conduit 552 may have any orientation in a subsurface formation (for example, the insulated conductor and conduit may be substantially vertical or substantially horizontally oriented in the formation). Insulated conductor 574 includes core 542, electrical insulator 534, and jacket 540. In some embodiments, core 542 is a copper core. In some embodiments, core 542 includes other electrical conductors or alloys (for example, copper alloys). In some embodiments, core 542 includes a ferromagnetic conductor so that insulated conductor 574 operates as a temperature limited heater. In some embodiments, core 542 does not include a ferromagnetic conductor.

In some embodiments, core 542 of insulated conductor 574 is made of two or more portions. The first portion may be placed adjacent to the overburden. The first portion may be sized and/or made of a highly conductive material so that the first portion does not resistively heat to a high temperature. One or more other portions of core 574 may be sized and/or made of material that resistively heats to a high temperature. These portions of core 574 may be positioned adjacent to sections of the formation that are to be heated by the heater. In some embodiments, the insulated conductor does not include a highly conductive first portion. A lead in cable may be coupled to the insulated conductor to supply electricity to the insulated conductor.

In some embodiments, core 542 of insulated conductor 574 is a highly conductive material such as copper. Core 542 may be electrically coupled to jacket 540 at or near the end of the insulated conductor. In some embodiments, insulated conductor 574 is electrically coupled to conduit 552. Electrical current supplied to insulated conductor 574 may resistively heat core 542, jacket 540, material 590, and/or conduit 552. Resistive heating of core 542, jacket 540, material 590, and/or conduit 552 generates heat that may transfer to the formation.

Electrical insulator 534 may be magnesium oxide, aluminum oxide, silicon dioxide, beryllium oxide, boron nitride, silicon nitride, or combinations thereof. In certain embodiments, electrical insulator 534 is a compacted powder of magnesium oxide. In some embodiments, electrical insulator 534 includes beads of silicon nitride. In certain embodiments, a thin layer of material clad over core 542 to inhibit the core from migrating into the electrical insulator at higher temperatures (i.e., to inhibit copper of the core from migrating into magnesium oxide of the insulation). For example, a small layer of nickel (for example, about 0.5 mm of nickel) may be clad on core 542.

In some embodiments, material 590 may be relatively corrosive. Jacket 540 and/or at least the inside surface of conduit 552 may be made of a corrosion resistant material such as, but not limited to, nickel, Alloy N (Carpenter Metals), 347 stainless steel, 347H stainless steel, 446 stainless steel, or 825 stainless steel. For example, conduit 552 may be plated or lined with nickel. In some embodiments, material 590 may be relatively non-corrosive. Jacket 540 and/or at least the inside surface of conduit 552 may be made of a material such as carbon steel.

In some embodiments, jacket 540 of insulated conductor 574 is not used as the main return of electrical current for the insulated conductor. In embodiments where material 590 is a good electrical conductor such as a molten metal, current returns through the molten metal in the conduit and/or through the conduit 552. In some embodiments, conduit 552 is made of a ferromagnetic material, (for example 410 stainless steel). Conduit 552 may function as a temperature limited heater until the temperature of the conduit approaches, reaches or exceeds the Curie temperature or phase transition temperature of the conduit material.

In some embodiments, material 590 returns electrical current to the surface from insulated conductor 574 (i.e., the material acts as the return or ground conductor for the insulated conductor). Material 590 may provide a current path with low resistance so that a long insulated conductor 574 is useable in conduit 552. The long heater may operate at low voltages for the length of the heater due to the presence of material 590 that is conductive.

Figure 94:
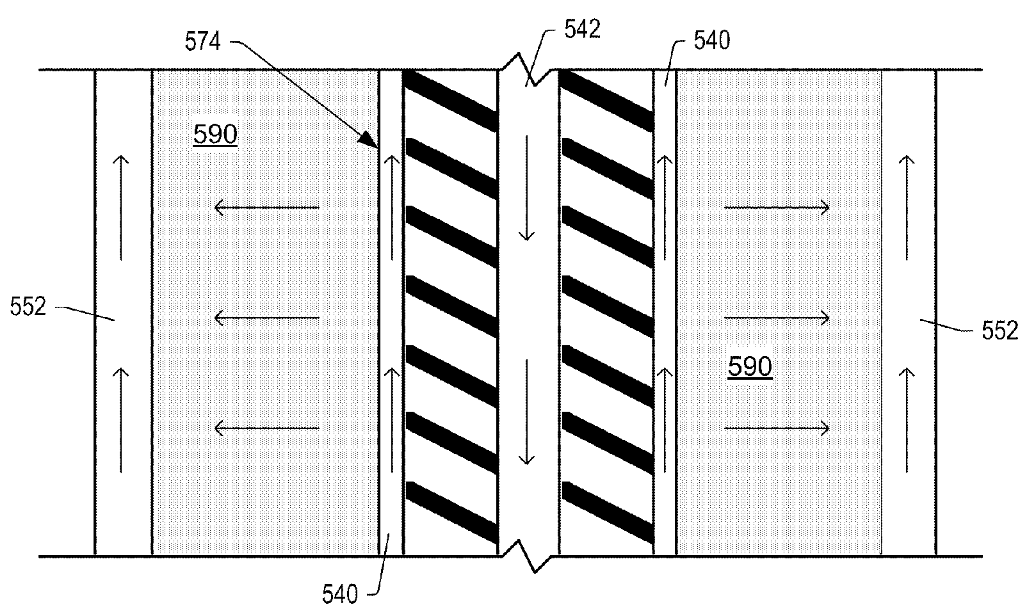
FIG. 94 depicts an embodiment of an insulated conductor heater in a conduit with a conductive liquid between the insulated conductor and the conduit.

FIG. 94 depicts an embodiment of a portion of insulated conductor 574 in conduit 552 wherein material 590 is a good conductor (for example, a liquid metal) and current flow is indicated by the arrows. Current flows down core 542 and returns through jacket 540, material 590, and conduit 552. Jacket 540 and conduit 552 may be at approximately constant potential. Current flows radially from jacket 540 to conduit 552 through material 590. Material 590 may resistively heat. Heat from material 590 may transfer through conduit 552 into the formation.

In embodiments where material 590 is partially electrically conductive (for example, the material is a molten salt), current returns mainly through jacket 540. All or a portion of the current that passes through partially conductive material 590 may pass to ground through conduit 552.

In the embodiment depicted in FIG. 93, core 542 of insulated conductor 574 has a diameter of about 1 cm, electrical insulator 534 has an outside diameter of about 1.6 cm, and jacket 540 has an outside diameter of about 1.8 cm. In other embodiments, the insulated conductor is smaller. For example, core 542 has a diameter of about 0.5 cm, electrical insulator 534 has an outside diameter of about 0.8 cm, and jacket 540 has an outside diameter of about 0.9 cm. Other insulated conductor geometries may be used. For the same size conduit 552, the smaller geometry of insulated conductor 574 may result in a higher operating temperature of the insulated conductor to achieve the same temperature at the conduit. The smaller geometry insulated conductors may be significantly more economically favorable due to manufacturing cost, weight, and other factors.

Material 590 may be placed between the outside surface of insulated conductor 574 and the inside surface of conduit 552. In certain embodiments, material 590 is placed in the conduit in a solid form as balls or pellets. Material 590 may melt below the operating temperatures of insulated conductor 574. Material may melt above ambient subsurface formation temperatures. Material 590 may be placed in conduit 552 after insulated conductor 574 is placed in the conduit. In certain embodiments, material 590 is placed in conduit 574 as a liquid. The liquid may be placed in conduit 552 before or after insulated conductor 574 is placed in the conduit (for example, the molten liquid may be poured into the conduit before or after the insulated conductor is placed in the conduit). Additionally, material 590 may be placed in conduit 552 before or after insulated conductor 574 is energized (i.e., supplied with electricity). Material 590 may be added to conduit 552 or removed from the conduit after operation of the heater is initialized. Material 590 may be added to or removed from conduit 552 to maintain a desired head of fluid in the conduit. In some embodiments, the amount of material 590 in conduit 552 may be adjusted (i.e., added to or depleted) to adjust or balance the stresses on the conduit. Material 590 may inhibit deformation of conduit 552. The head of material 590 in conduit 552 may inhibit the formation from crushing or otherwise deforming the conduit should the formation expand against the conduit. The head of fluid in conduit 552 allows the wall of the conduit to be relatively thin. Having thin conduits 552 may increase the economic viability of using multiple heaters of this type to heat portions of the formation.

Material 590 may support insulated conductor 574 in conduit 552. The support provided by material 590 of insulated conductor 574 may allow for the deployment of long insulated conductors as compared to insulated conductors positioned only in a gas in a conduit without the use of special metallurgy to accommodate the weight of the insulated conductor. In certain embodiments, insulated conductor 574 is buoyant in material 590 in conduit 552. For example, insulated conductor may be buoyant in molten metal. The buoyancy of insulated conductor 574 reduces creep associated problems in long, substantially vertical heaters. A bottom weight or tie down may be coupled to the bottom of insulated conductor 574 to inhibit the insulated conductor from floating in material 590.

Material 590 may remain a liquid at operating temperatures of insulated conductor 574. In some embodiments, material 590 melts at temperatures above about 100° C., above about 200° C., or above about 300° C. The insulated conductor may operate at temperatures greater than 200° C., greater than 400° C., greater than 600° C., or greater than 800° C. In certain embodiments, material 590 provides enhanced heat transfer from insulated conductor 574 to conduit 552 at or near the operating temperatures of the insulated conductor.

Material 590 may include metals such as tin, zinc, an alloy such as a 60% by weight tin, 40% by weight zinc alloy; bismuth; indium; cadmium, aluminum; lead; and/or combinations thereof (for example, eutectic alloys of these metals such as binary or ternary alloys). In one embodiment, material 590 is tin. Some liquid metals may be corrosive. The jacket of the insulated conductor and/or at least the inside surface of the canister may need to be made of a material that is resistant to the corrosion of the liquid metal. The jacket of the insulated conductor and/or at least the inside surface of the conduit may be made of materials that inhibit the molten metal from leaching materials from the insulating conductor and/or the conduit to form eutectic compositions or metal alloys. Molten metals may be highly thermal conductive, but may block radiant heat transfer from the insulated conductor and/or have relatively small heat transfer by natural convection.

Material 590 may be or include molten salts such as solar salt, salts presented in Table 1, or other salts. The molten salts may be infrared transparent to aid in heat transfer from the insulated conductor to the canister. In some embodiments, solar salt includes sodium nitrate and potassium nitrate (for example, about 60% by weight sodium nitrate and about 40% by weight potassium nitrate). Solar salt melts at about 220° C. and is chemically stable up to temperatures of about 593° C. Other salts that may be used include, but are not limited to $LiNO_3$ (melt temperature ($T_m$) of 264° C. and a decomposition temperature of about 600° C.) and eutectic mixtures such as 53% by weight $KNO_3$, 40% by weight $NaNO_3$ and 7% by weight $NaNO_2$ ($T_m$ of about 142° C. and an upper working temperature of over 500° C.); 45.5% by weight $KNO_3$ and 54.5% by weight $NaNO_2$ ($T_m$ of about 142-145° C. and an upper working temperature of over 500° C.); or 50% by weight NaCl and 50% by weight $SrCl_2$ ($T_m$ of about 19° C. and an upper working temperature of over 1200° C.).

TABLE 1

| Material | $T_m$ (° C.) | $T_b$ (° C.) |
|---|---|---|
| Zn | 420 | 907 |
| $CdBr_2$ | 568 | 863 |
| $CdI_2$ | 388 | 744 |
| $CuBr_2$ | 498 | 900 |
| $PbBr_2$ | 371 | 892 |
| TlBr | 460 | 819 |
| TlF | 326 | 826 |
| $ThI_4$ | 566 | 837 |
| $SnF_2$ | 215 | 850 |
| $SnI_2$ | 320 | 714 |
| $ZnCl_2$ | 290 | 732 |

Some molten salts, such as solar salt, may be relatively non-corrosive so that the conduit and/or the jacket may be made of relatively inexpensive material (for example, carbon steel). Some molten salts may have good thermal conductivity, may have high heat density, and may result in large heat transfer by natural convection.

In fluid mechanics, the Rayleigh number is a dimensionless number associated with heat transfer in a fluid. When the Rayleigh number is below the critical value for the fluid, heat transfer is primarily in the form of conduction; and when the Rayleigh number is above the critical value, heat transfer is primarily in the form of convection. The Rayleigh number is the product of the Grashof number (which describes the relationship between buoyancy and viscosity in a fluid) and the Prandtl number (which describes the relationship between momentum diffusivity and thermal diffusivity). For the same size insulated conductors in conduits, and where the temperature of the conduit is 500° C., the Rayleigh number for solar salt in the conduit is about 10 times the Rayleigh number for tin in the conduit. The higher Rayleigh number implies that the strength of natural convection in the molten solar salt is much stronger than the strength of the natural convection in molten tin. The stronger natural convection of molten salt may distribute heat and inhibit the formation of hot spots at locations along the length of the conduit. Hot spots may be caused by coke build up at isolated locations adjacent to or on the conduit, contact of the conduit by the formation at isolated locations, and/or other high thermal load situations.

Conduit 552 may be a carbon steel or stainless steel canister. In some embodiments, conduit 552 may include cladding on the outer surface to inhibit corrosion of the conduit by formation fluid. Conduit 552 may include cladding on an inner surface of the conduit that is corrosion resistant to material 590 in the conduit. Cladding applied to conduit 552 may be a coating and/or a liner. If the conduit contains a metal salt, the inner surface of the conduit may include coating of nickel, or the conduit may be or include a liner of a corrosion resistant metal such as Alloy N. If the conduit contains a molten metal, the conduit may include a corrosion resistant metal liner or coating, and/or a ceramic coating (for example, a porcelain coating or fired enamel coating). In an embodiment, conduit 552 is a canister of 410 stainless steel with an outside diameter of about 6 cm. Conduit 552 may not need a thick wall because material 590 may provide internal pressure that inhibits deformation or crushing of the conduit due to external stresses.

Figure 95:
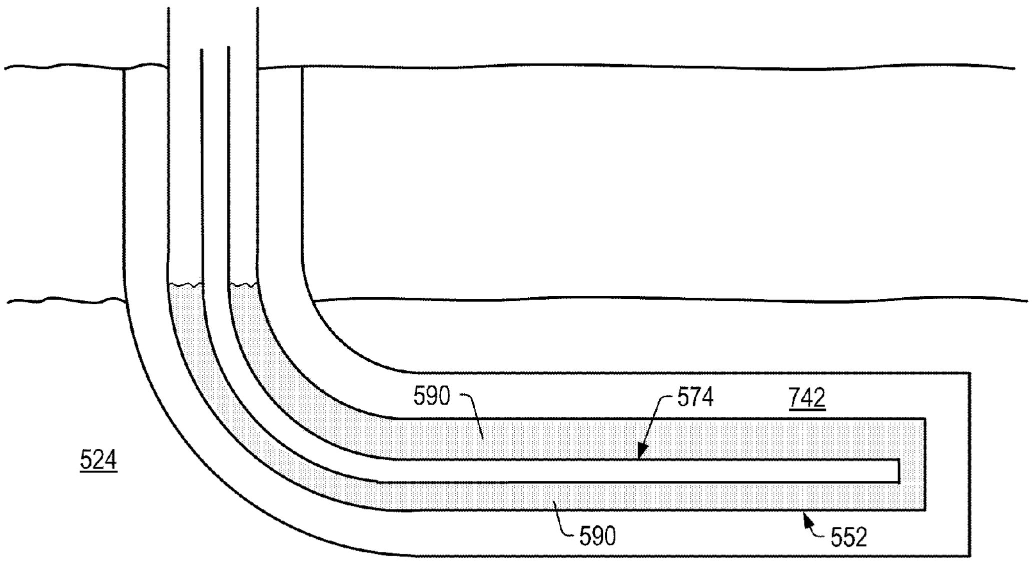
FIG. 95 depicts an embodiment of an insulated conductor in a conduit with liquid between the insulated conductor and the conduit, where a portion of the conduit and the insulated conductor are oriented horizontally in the formation.

FIG. 95 depicts an embodiment of the heater positioned in wellbore 742 of formation 524 with a portion of insulated conductor 574 and conduit 552 oriented substantially horizontally in the formation. Material 590 may provide a head in conduit 552 due to the pressure of the material. The pressure head may keep material 590 in conduit 552. The pressure head may also provide internal pressure that inhibits deformation or collapse of conduit 552 due to external stresses.

In some embodiments, two or more insulated conductors are placed in the conduit. In some embodiments, only one of the insulated conductors is energized. Should the energized conductor fail, one of the other conductors may be energized to maintain the material in a molten phase. The failed insulated conductor may be removed and/or replaced.

Figure 96:
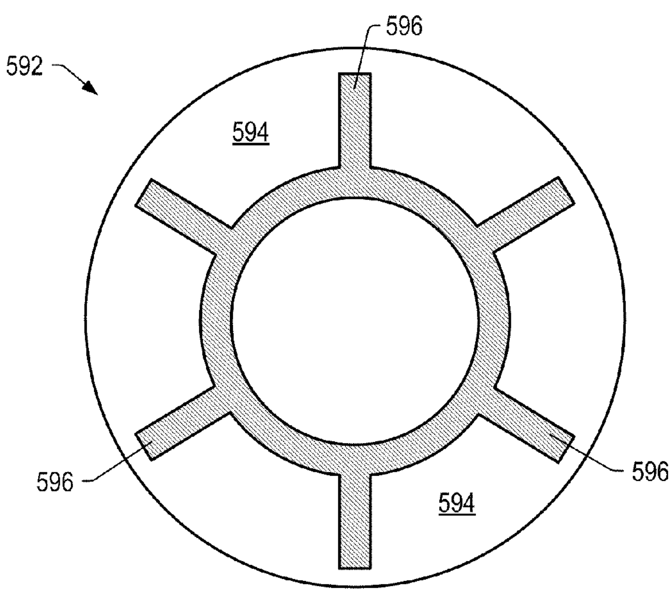
FIG. 96 depicts a cross-sectional representation of a ribbed conduit.
Figure 97:
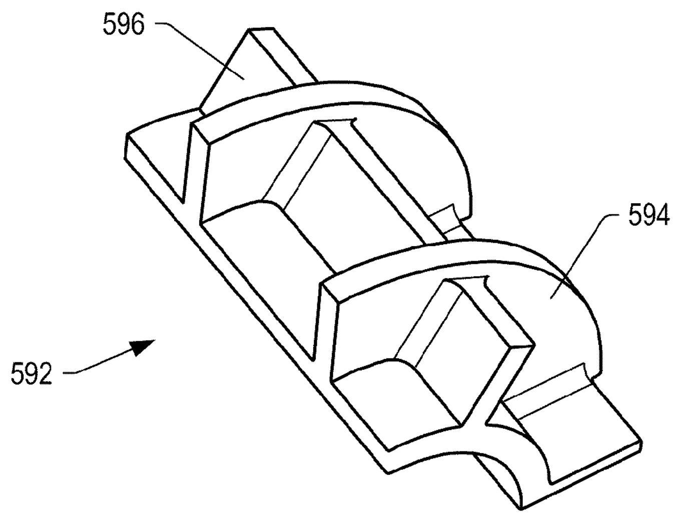
FIG. 97 depicts a perspective representation of a portion of a ribbed conduit.

The conduit of the heater may be a ribbed conduit. The ribbed conduit may improve the heat transfer characteristics of the conduit as compared to a cylindrical conduit. FIG. 96 depicts a cross-sectional representation of ribbed conduit 592. FIG. 97 depicts a perspective view of a portion of ribbed conduit 592. Ribbed conduit 592 may include rings 594 and ribs 596. Rings 594 and ribs 596 may improve the heat transfer characteristics of ribbed conduit 592. In an embodiment, the cylinder of conduit has an inner diameter of about 5.1 cm and a wall thickness of about 0.57 cm. Rings 594 may be spaced about every 3.8 cm. Rings 594 may have a height of about 1.9 cm and a thickness of about 0.5 cm. Six ribs 596 may be spaced evenly about conduit 552. Ribs 596 may have a thickness of about 0.5 cm and a height of about 1.6 cm. Other dimensions for the cylinder, rings and ribs may be used. Ribbed conduit 592 may be formed from two or more rolled pieces that are welded together to form the ribbed conduit. Other types of conduit with extra surface area to enhance heat transfer from the conduit to the formation may be used.

In some embodiments, the ribbed conduit may be used as the conduit of a conductor-in-conduit heater. For example, the conductor may be a 3.05 cm 410 stainless steel rod and the conduit has dimensions as described above. In other embodiments, the conductor is an insulated conductor and a fluid is positioned between the conductor and the ribbed conduit. The fluid may be a gas or liquid at operating temperatures of the insulated conductor.

In some embodiments, the heat source for the heater is not an insulated conductor. For example, the heat source may be hot fluid circulated through an inner conduit positioned in an outer conduit. The material may be positioned between the inner conduit and the outer conduit. Convection currents in the material may help to more evenly distribute heat to the formation and may inhibit or limit formation of a hot spot where insulation that limits heat transfer to the overburden ends. In some embodiments, the heat sources are downhole oxidizers. The material is placed between an outer conduit and an oxidizer conduit. The oxidizer conduit may be an exhaust conduit for the oxidizers or the oxidant conduit if the oxidizers are positioned in a u-shaped wellbore with exhaust gases exiting the formation through one of the legs of the u-shaped conduit. The material may help inhibit the formation of hot spots adjacent to the oxidizers of the oxidizer assembly.

Figure 98:
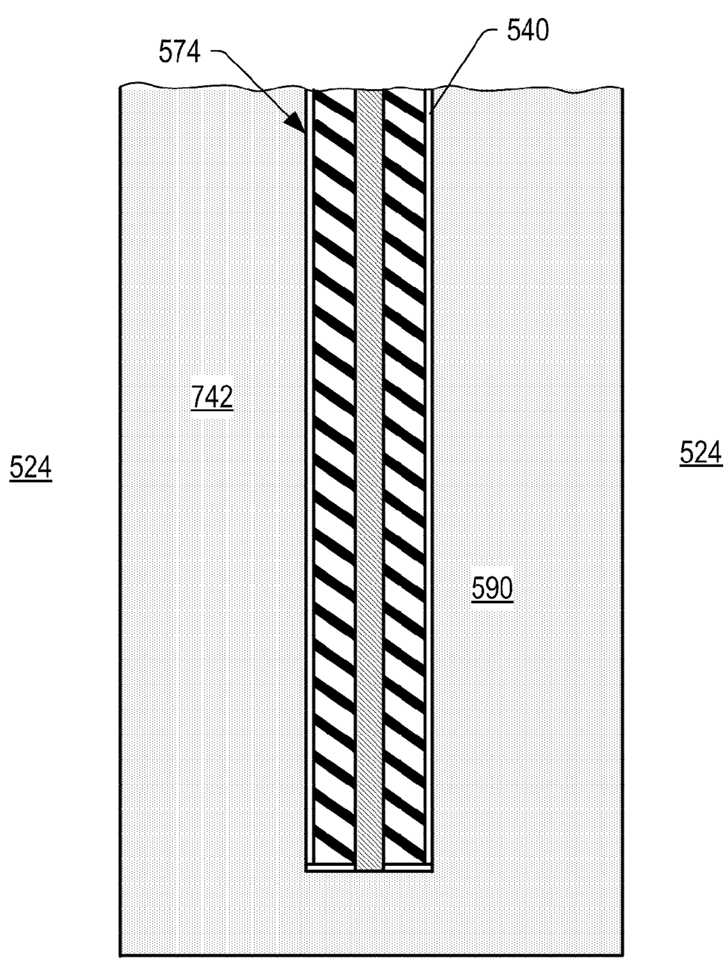
FIG. 98 depicts an embodiment of a portion of an insulated conductor in a bottom portion of an open wellbore with a liquid between the insulated conductor and the formation.

The material to be heated by the insulated conductor may be placed in an open wellbore. FIG. 98 depicts material 590 in open wellbore 742 in formation 524 with insulated conductor 574 in the wellbore. In some embodiments, a gas (for example, nitrogen, carbon dioxide, and/or helium) is placed in wellbore 742 above material 590. The gas may inhibit oxidation or other chemical changes of material 590. The gas may inhibit vaporization of material 590.

Material 590 may have a melting point that is above the pyrolysis temperature of hydrocarbons in the formation. The melting point of material 590 may be above 375° C., above 400° C., or above 425° C. The insulated conductor may be energized to heat the formation. Heat from the insulated conductor may pyrolyze hydrocarbons in the formation. Adjacent the wellbore, the heat from insulated conductor 574 may result in coking that reduces the permeability and plugs the formation near wellbore 742. The plugged formation inhibits material 590 from leaking from wellbore 742 into formation 524 when the material is a liquid. In some embodiments, material 590 is a salt.

In some embodiments, material 590 leaking from wellbore 742 into formation 524 may be self-healing and/or self-sealing. Material 590 flowing away from wellbore 742 may travel until the temperature becomes less than the solidification temperature of the material. Temperature may drop rapidly a relatively small distance away from the heater used to maintain material 590 in a liquid state. The rapid drop off in temperature may result in migrating material 590 solidifying close to wellbore 742. Solidified material 590 may inhibit migration of additional material from wellbore 742, and thus self-heal and/or self-seal the wellbore.

Return electrical current for insulated conductor 574 may return through jacket 540 of the insulated conductor. Any current that passes through material 590 may pass to ground. Above the level of material 590, any remaining return electrical current may be confined to jacket 540 of insulated conductor 574.

Using liquid material in open wellbores heated by heaters may allow for delivery of high power rates (for example, up to about 2000 W/m) to the formation with relatively low heater surface temperatures. Hot spot generation in the formation may be reduced or eliminated due to convection smoothing out the temperature profile along the length of the heater. Natural convection occurring in the wellbore may greatly enhance heat transfer from the heater to the formation. Also, the large gap between the formation and the heater may prevent thermal expansion of the formation from harming the heater.

In some embodiments, an 8" (20.3 cm) wellbore may be formed in the formation. In some embodiments, casing may be placed through all or a portion of the overburden. A 0.6 inch (1.5 cm) diameter insulated conductor heater may be placed in the wellbore. The wellbore may be filled with solid material (for example, solid particles of salt). A packer may be placed near an interface between the treatment area and the overburden. In some embodiments, a pass through conduit in the packer may be included to allow for the addition of more material to the treatment area. A non-reactive or substantially non-reactive gas (for example, carbon dioxide and/or nitrogen) may be introduced into the wellbore. The insulated conductor may be energized to begin the heating that melts the solid material and heats the treatment area.

In some embodiments, other types of heat sources besides for insulated conductors are used to heat the material placed in the open wellbore. The other types of heat sources may include gas burners, pipes through which hot heat transfer fluid flows, or other types of heaters.

In some embodiments, heat pipes are placed in the formation. The heat pipes may reduce the number of active heat sources needed to heat a treatment area of a given size. The heat pipes may reduce the time needed to heat the treatment area of a given size to a desired average temperature. A heat pipe is a closed system that utilizes phase change of fluid in the heat pipe to transport heat applied to a first region to a second region remote from the first region. The phase change of the fluid allows for large heat transfer rates. Heat may be applied to the first region of the heat pipes from any type of heat source, including but not limited to, electric heaters, oxidizers, heat provided from geothermal sources, and/or heat provided from nuclear reactors.

Heat pipes are passive heat transport systems that include no moving parts. Heat pipes may be positioned in near horizontal to vertical configurations. The fluid used in heat pipes for heating the formation may have a low cost, a low melting temperature, a boiling temperature that is not too high (for example, generally below about 900° C.), a low viscosity at temperatures below about 540° C., a high heat of vaporization, and a low corrosion rate for the heat pipe material. In some embodiments, the heat pipe includes a liner of material that is resistant to corrosion by the fluid. TABLE 1 shows melting and boiling temperatures for several materials that may be used as the fluid in heat pipes. Other salts that may be used include, but are not limited to $LiNO_3$, and eutectic mixtures such as 53% by weight $KNO_3$; 40% by weight $NaNO_3$ and 7% by weight $NaNO_2$; 45.5% by weight $KNO_3$ and 54.5% by weight $NaNO_2$; or 50% by weight NaCl and 50% by weight $SrCl_2$.

Figure 99:
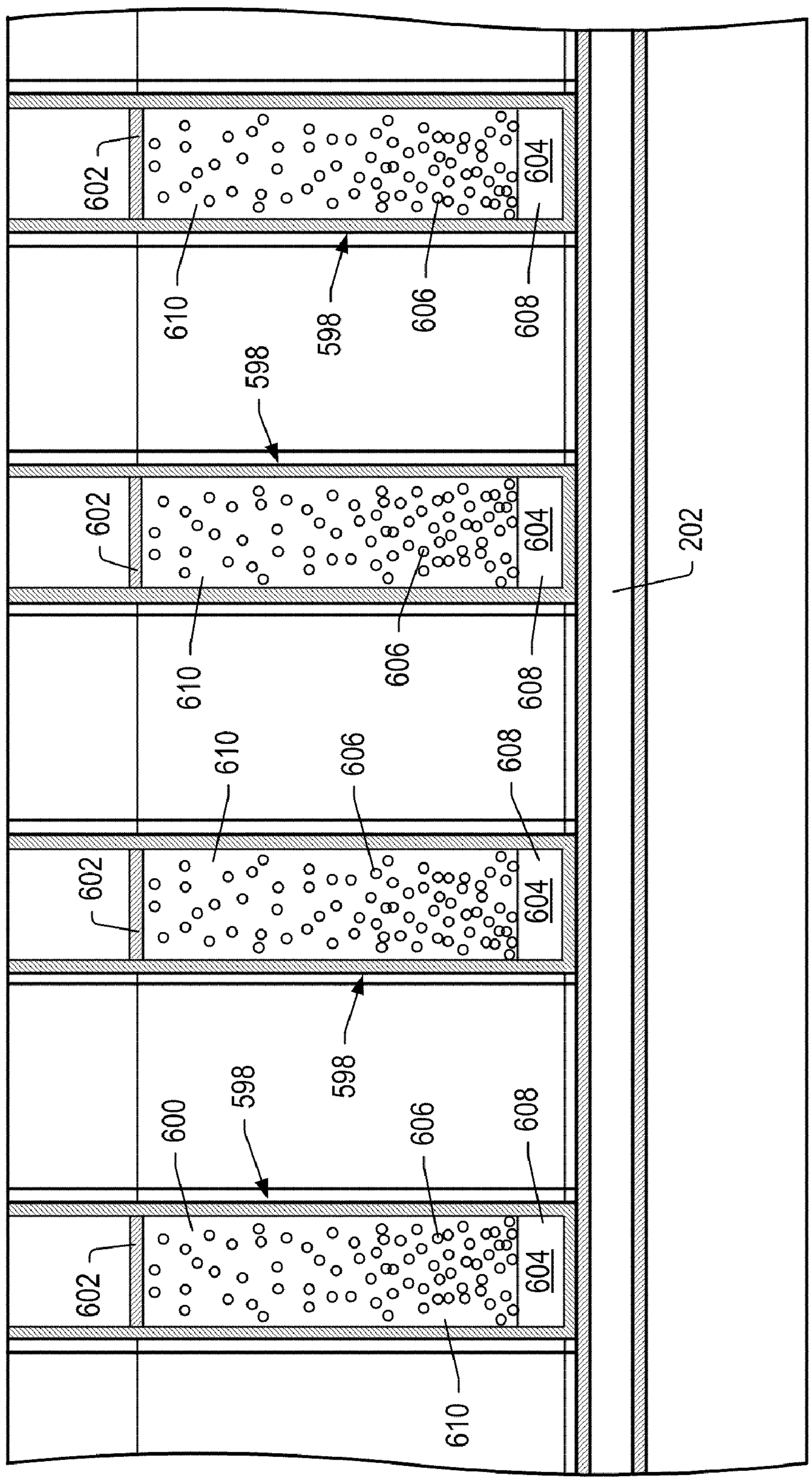
FIG. 99 depicts a schematic cross-sectional representation of a portion of a formation with heat pipes positioned adjacent to a substantially horizontal portion of a heat source.

FIG. 99 depicts schematic cross-sectional representation of a portion of the formation with heat pipes 598 positioned adjacent to a substantially horizontal portion of heat source 202. Heat source 202 is placed in a wellbore in the formation. Heat source 202 may be a gas burner assembly, an electrical heater, a leg of a circulation system that circulates hot fluid through the formation, or other type of heat source. Heat pipes 598 may be placed in the formation so that distal ends of the heat pipes are near or contact heat source 202. In some embodiments, heat pipes 598 mechanically attach to heat source 202. Heat pipes 598 may be spaced a desired distance apart. In an embodiment, heat pipes 598 are spaced apart by about 40 feet. In other embodiments, large or smaller spacings are used. Heat pipes 598 may be placed in a regular pattern with each heat pipe spaced a given distance from the next heat pipe. In some embodiments, heat pipes 598 are placed in an irregular pattern. An irregular pattern may be used to provide a greater amount of heat to a selected portion or portions of the formation. Heat pipes 598 may be vertically positioned in the formation. In some embodiments, heat pipes 598 are placed at an angle in the formation.

Heat pipes 598 may include sealed conduit 600, seal 602, liquid heat transfer fluid 604 and vaporized heat transfer fluid 606. In some embodiments, heat pipes 598 include metal mesh or wicking material that increases the surface area for condensation and/or promotes flow of the heat transfer fluid in the heat pipe. Conduit 600 may have first portion 608 and second portion 610. Liquid heat transfer fluid 604 may be in first portion 608. Heat source 202 external to heat pipe 598 supplies heat that vaporizes liquid heat transfer fluid 604. Vaporized heat transfer fluid 606 diffuses into second portion 610. Vaporized heat transfer fluid 606 condenses in second portion and transfers heat to conduit 600, which in turn transfers heat to the formation. The condensed liquid heat transfer fluid 604 flows by gravity to first portion 608.

Position of seal 602 is a factor in determining the effective length of heat pipe 598. The effective length of heat pipe 598 may also depend on the physical properties of the heat transfer fluid and the cross-sectional area of conduit 600. Enough heat transfer fluid may be placed in conduit 600 so that some liquid heat transfer fluid 604 is present in first portion 608 at all times.

Seal 602 may provide a top seal for conduit 600. In some embodiments, conduit 600 is purged with nitrogen, helium or other fluid prior to being loaded with heat transfer fluid and sealed. In some embodiments, a vacuum may be drawn on conduit 600 to evacuate the conduit before the conduit is sealed. Drawing a vacuum on conduit 600 before sealing the conduit may enhance vapor diffusion throughout the conduit. In some embodiments, an oxygen getter may be introduced in conduit 600 to react with any oxygen present in the conduit.

Figure 100:
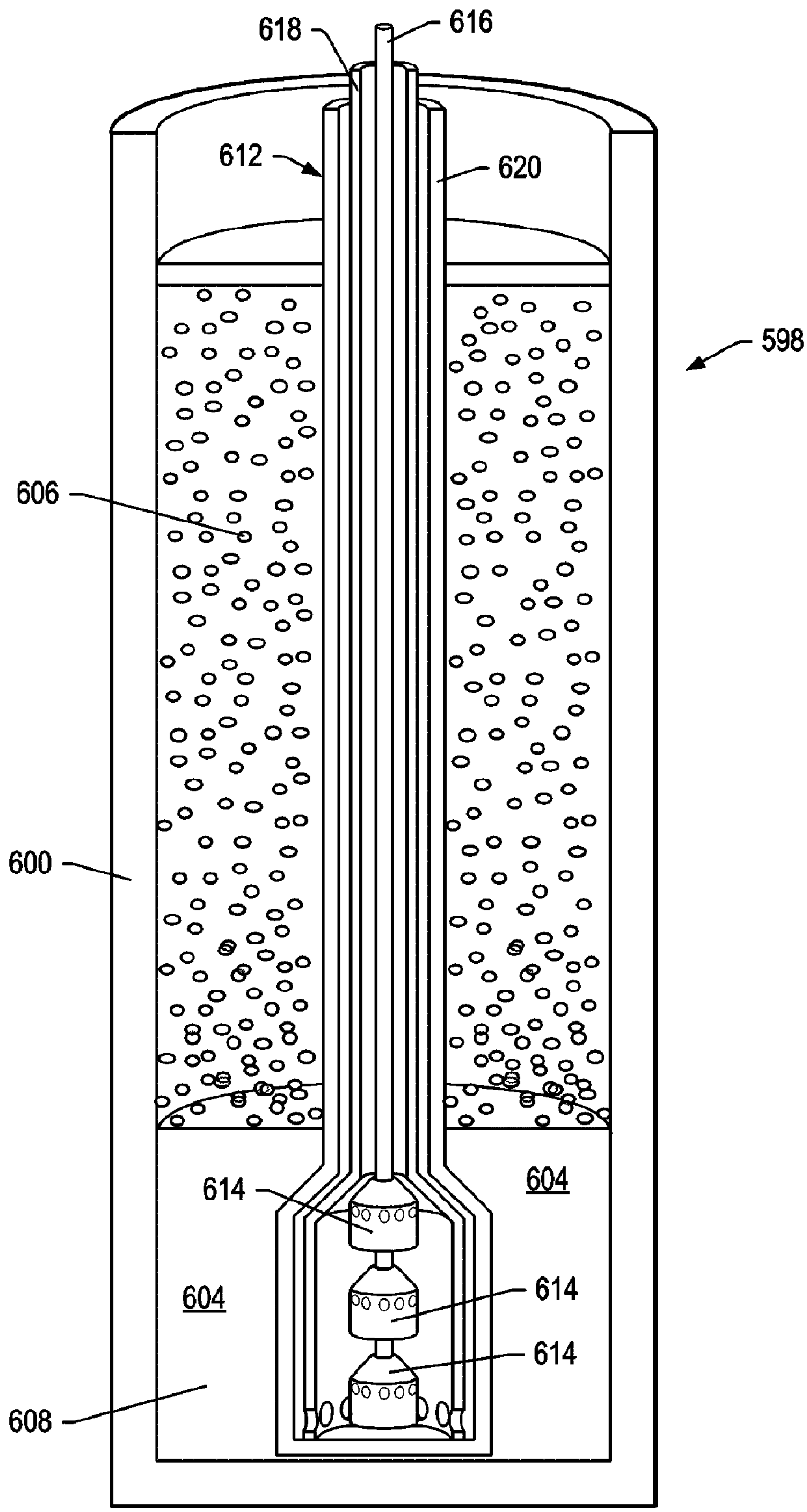
FIG. 100 depicts a perspective cut-out representation of a portion of a heat pipe embodiment with the heat pipe located radially around an oxidizer assembly.

FIG. 100 depicts a perspective cut-out representation of a portion of a heat pipe embodiment with heat pipe 598 located radially around oxidizer assembly 612. Oxidizers 614 of oxidizer assembly 612 are positioned adjacent to first portion 608 of heat pipe 598. Fuel may be supplied to oxidizers 614 through fuel conduit 616. Oxidant may be supplied to oxidizers 614 through oxidant conduit 618. Exhaust gas may flow through the space between outer conduit 620 and oxidant conduit 618. Oxidizers 614 combust fuel to provide heat that vaporizes liquid heat transfer fluid 604. Vaporized heat transfer fluid 606 rises in heat pipe 598 and condenses on walls of the heat pipe to transfer heat to sealed conduit 600. Exhaust gas from oxidizers 614 provides heat along the length of sealed conduit 600. The heat provided by the exhaust gas along the effective length of heat pipe 598 may increase convective heat transfer and/or reduce the lag time before significant heat is provided to the formation from the heat pipe along the effective length of the heat pipe.

Figure 101:
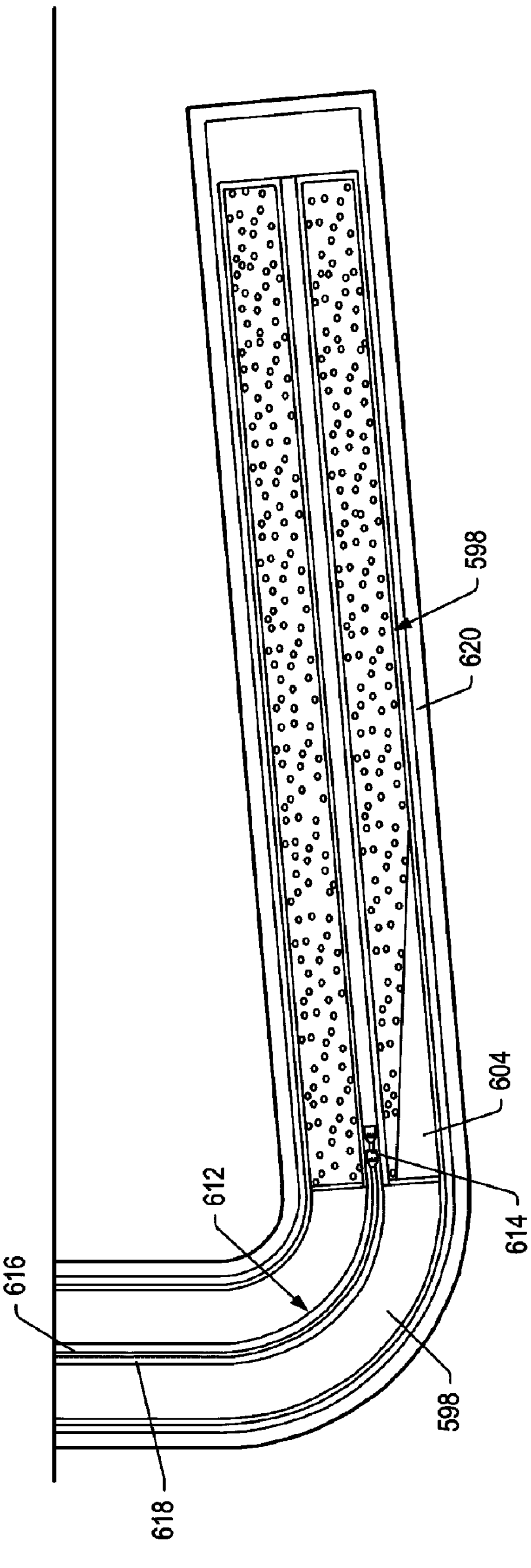
FIG. 101 depicts a cross-sectional representation of an angled heat pipe embodiment with an oxidizer assembly located near a lowermost portion of the heat pipe.

FIG. 101 depicts a cross-sectional representation of an angled heat pipe embodiment with oxidizer assembly 612 located near a lowermost portion of heat pipe 598. Fuel may be supplied to oxidizers 614 through fuel conduit 616. Oxidant may be supplied to oxidizers 614 through oxidant conduit 618. Exhaust gas may flow through the space between outer conduit 620 and oxidant conduit 618.

Figure 102:
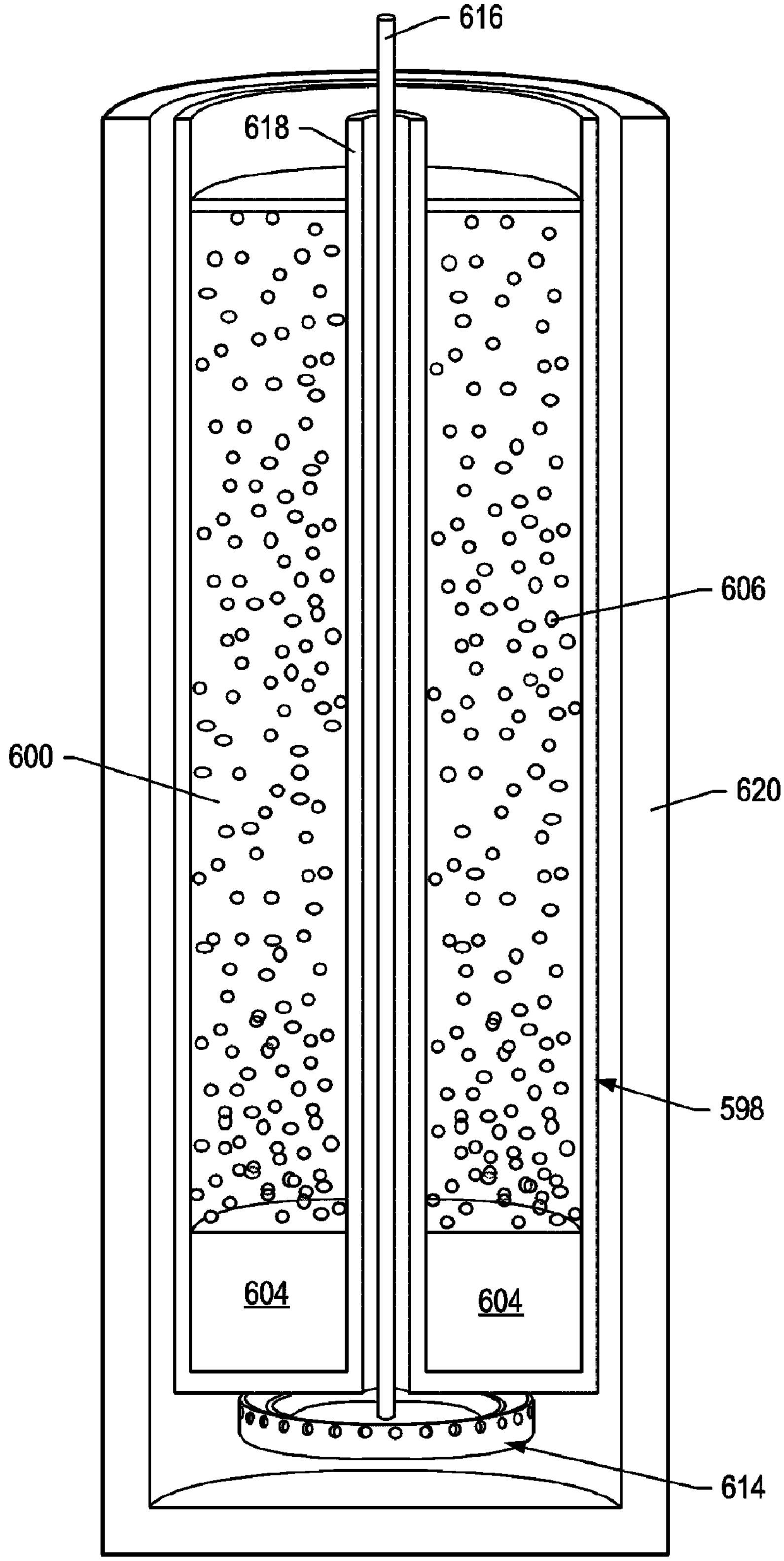
FIG. 102 depicts a perspective cut-out representation of a portion of a heat pipe embodiment with an oxidizer located at the bottom of the heat pipe.
Figure 103:
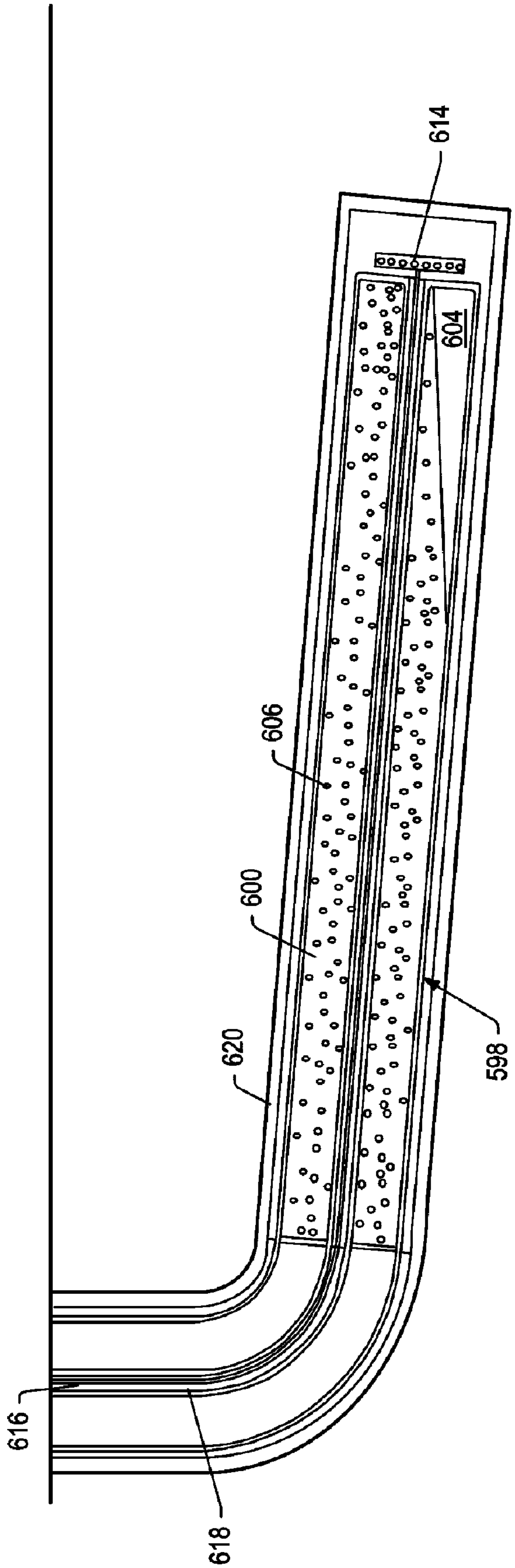
FIG. 103 depicts a cross-sectional representation of an angled heat pipe embodiment with an oxidizer located at the bottom of the heat pipe.

FIG. 102 depicts a perspective cut-out representation of a portion of a heat pipe embodiment with oxidizer 614 located at the bottom of heat pipe 598. Fuel may be supplied to oxidizer 614 through fuel conduit 616. Oxidant may be supplied to oxidizer 614 through oxidant conduit 618. Exhaust gas may flow through the space between the outer wall of heat pipe 598 and outer conduit 620. Oxidizer 614 combusts fuel to provide heat that vaporizers liquid heat transfer fluid 604. Vaporized heat transfer fluid 606 rises in heat pipe 598 and condenses on walls of the heat pipe to transfer heat to sealed conduit 600. Exhaust gas from oxidizers 614 provides heat along the length of sealed conduit 600 and to outer conduit 620. The heat provided by the exhaust gas along the effective length of heat pipe 598 may increase convective heat transfer and/or reduce the lag time before significant heat is provided to the formation from the heat pipe and oxidizer combination along the effective length of the heat pipe. FIG. 103 depicts a similar embodiment with heat pipe 598 positioned at an angle in the formation.

Figure 104:
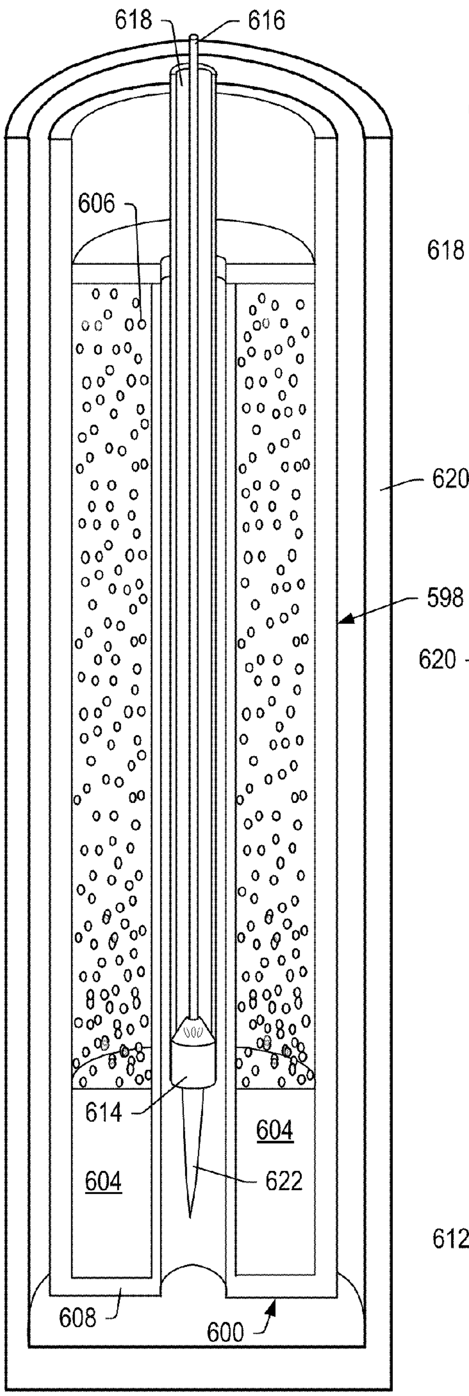
FIG. 104 depicts a perspective cut-out representation of a portion of a heat pipe embodiment with an oxidizer that produces a flame zone adjacent to liquid heat transfer fluid in the bottom of the heat pipe.

FIG. 104 depicts a perspective cut-out representation of a portion of a heat pipe embodiment with oxidizer 614 that produces flame zone adjacent to liquid heat transfer fluid 604 in the bottom of heat pipe 598. Fuel may be supplied to oxidizer 614 through fuel conduit 616. Oxidant may be supplied to oxidizer 614 through oxidant conduit 618. Oxidant and fuel are mixed and combusted to produce flame zone 622. Flame zone 622 provides heat that vaporizes liquid heat transfer fluid 604. Exhaust gases from oxidizer 614 may flow through the space between oxidant conduit 618 and the inner surface of heat pipe 598, and through the space between the outer surface of the heat pipe and outer conduit 620. The heat provided by the exhaust gas along the effective length of heat pipe 598 may increase convective heat transfer and/or reduce the lag time before significant heat is provided to the formation from the heat pipe and oxidizer combination along the effective length of the heat pipe.

Figure 105:
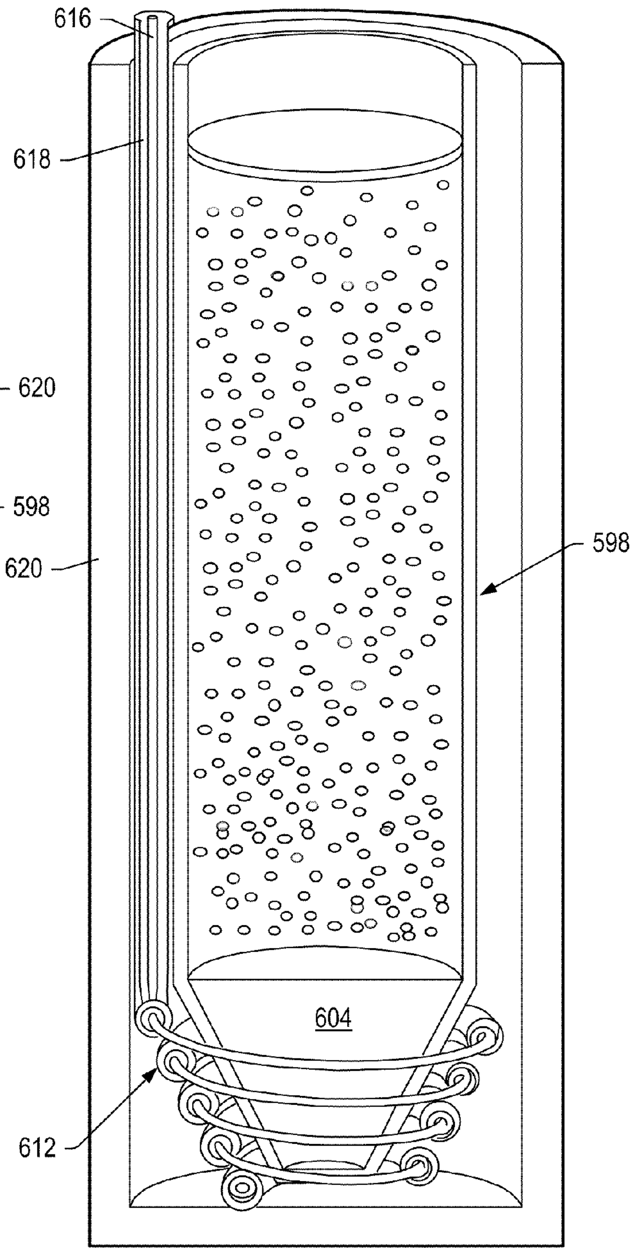
FIG. 105 depicts a perspective cut-out representation of a portion of a heat pipe embodiment with a tapered bottom that accommodates multiple oxidizers.

FIG. 105 depicts a perspective cut-out representation of a portion of a heat pipe embodiment with a tapered bottom that accommodates multiple oxidizers of an oxidizer assembly. In some embodiments, efficient heat pipe operation requires a high heat input. Multiple oxidizers of oxidizer assembly 612 may provide high heat input to liquid heat transfer fluid 604 of heat pipe 598. A portion of oxidizer assembly with the oxidizers may be helically wound around a tapered portion of heat pipe 598. The tapered portion may have a large surface area to accommodate the oxidizers. Fuel may be supplied to the oxidizers of oxidizer assembly 612 through fuel conduit 616. Oxidant may be supplied to oxidizer 614 through oxidant conduit 618. Exhaust gas may flow through the space between the outer wall of heat pipe 598 and outer conduit 620. Exhaust gas from oxidizers 614 provides heat along the length of sealed conduit 600 and to outer conduit 620. The heat provided by the exhaust gas along the effective length of heat pipe 598 may increase convective heat transfer and/or reduce the lag time before significant heat is provided to the formation from the heat pipe and oxidizer combination along the effective length of the heat pipe.

Figure 106:
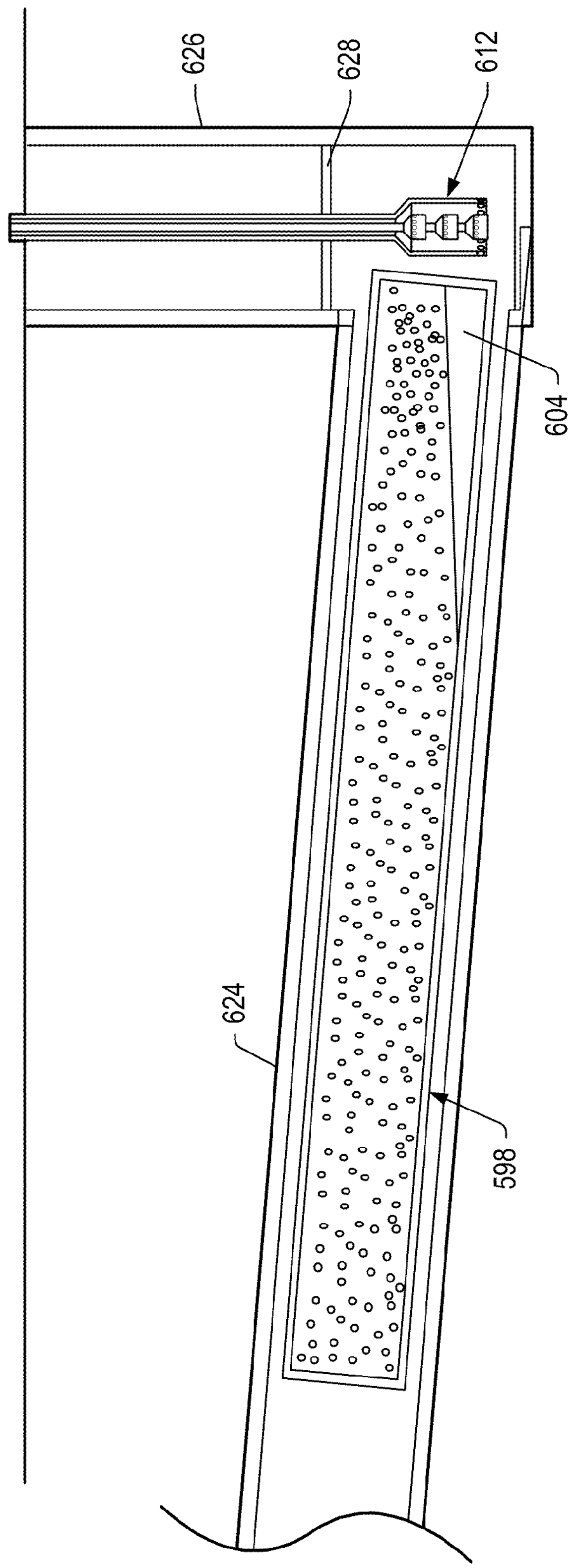
FIG. 106 depicts a cross-sectional representation of a heat pipe embodiment that is angled within the formation.

FIG. 106 depicts a cross-sectional representation of a heat pipe embodiment that is angled within the formation. First wellbore 624 and second wellbore 626 are drilled in the formation using magnetic ranging or techniques so that the first wellbore intersects the second wellbore. Heat pipe 598 may be positioned in first wellbore 624. First wellbore 624 may be sloped so that liquid heat transfer fluid 604 within heat pipe 598 is positioned near the intersection of the first wellbore and second wellbore 626. Oxidizer assembly 612 may be positioned in second wellbore 626. Oxidizer assembly 612 provides heat to heat pipe 598 that vaporizes liquid heat transfer fluid in the heat pipe. Packer or seal 628 may direct exhaust gas from oxidizer assembly 612 through first wellbore 624 to provide additional heat to the formation from the exhaust gas.

In some embodiments, the temperature limited heater is used to achieve lower temperature heating (for example, for heating fluids in a production well, heating a surface pipeline, or reducing the viscosity of fluids in a wellbore or near wellbore region). Varying the ferromagnetic materials of the temperature limited heater allows for lower temperature heating. In some embodiments, the ferromagnetic conductor is made of material with a lower Curie temperature than that of 446 stainless steel. For example, the ferromagnetic conductor may be an alloy of iron and nickel. The alloy may have between 30% by weight and 42% by weight nickel with the rest being iron. In one embodiment, the alloy is Invar 36. Invar 36 is 36% by weight nickel in iron and has a Curie temperature of 277° C. In some embodiments, an alloy is a three component alloy with, for example, chromium, nickel, and iron. For example, an alloy may have 6% by weight chromium, 42% by weight nickel, and 52% by weight iron. A 2.5 cm diameter rod of Invar 36 has a turndown ratio of approximately 2 to 1 at the Curie temperature. Placing the Invar 36 alloy over a copper core may allow for a smaller rod diameter. A copper core may result in a high turndown ratio. The insulator in lower temperature heater embodiments may be made of a high performance polymer insulator (such as PFA or PEEK™) when used with alloys with a Curie temperature that is below the melting point or softening point of the polymer insulator.

In certain embodiments, a conductor-in-conduit temperature limited heater is used in lower temperature applications by using lower Curie temperature and/or the phase transformation temperature range ferromagnetic materials. For example, a lower Curie temperature and/or the phase transformation temperature range ferromagnetic material may be used for heating inside sucker pump rods. Heating sucker pump rods may be useful to lower the viscosity of fluids in the sucker pump or rod and/or to maintain a lower viscosity of fluids in the sucker pump rod. Lowering the viscosity of the oil may inhibit sticking of a pump used to pump the fluids. Fluids in the sucker pump rod may be heated up to temperatures less than about 250° C. or less than about 300° C. Temperatures need to be maintained below these values to inhibit coking of hydrocarbon fluids in the sucker pump system.

In certain embodiments, a temperature limited heater includes a flexible cable (for example, a furnace cable) as the inner conductor. For example, the inner conductor may be a 27% nickel-clad or stainless steel-clad stranded copper wire with four layers of mica tape surrounded by a layer of ceramic and/or mineral fiber (for example, alumina fiber, aluminosilicate fiber, borosilicate fiber, or aluminoborosilicate fiber). A stainless steel-clad stranded copper wire furnace cable may be available from Anomet Products, Inc. The inner conductor may be rated for applications at temperatures of 1000° C. or higher. The inner conductor may be pulled inside a conduit. The conduit may be a ferromagnetic conduit (for example, a ¾" Schedule 80 446 stainless steel pipe). The conduit may be covered with a layer of copper, or other electrical conductor, with a thickness of about 0.3 cm or any other suitable thickness. The assembly may be placed inside a support conduit (for example, a 1¼" Schedule 80 347H or 347HH stainless steel tubular). The support conduit may provide additional creep-rupture strength and protection for the copper and the inner conductor. For uses at temperatures greater than about 1000° C., the inner copper conductor may be plated with a more corrosion resistant alloy (for example, Incoloy® 825) to inhibit oxidation. In some embodiments, the top of the temperature limited heater is sealed to inhibit air from contacting the inner conductor.

The temperature limited heater may be a single-phase heater or a three-phase heater. In a three-phase heater embodiment, the temperature limited heater has a delta or a wye configuration. Each of the three ferromagnetic conductors in the three-phase heater may be inside a separate sheath. A connection between conductors may be made at the bottom of the heater inside a splice section. The three conductors may remain insulated from the sheath inside the splice section.

Figure 107:
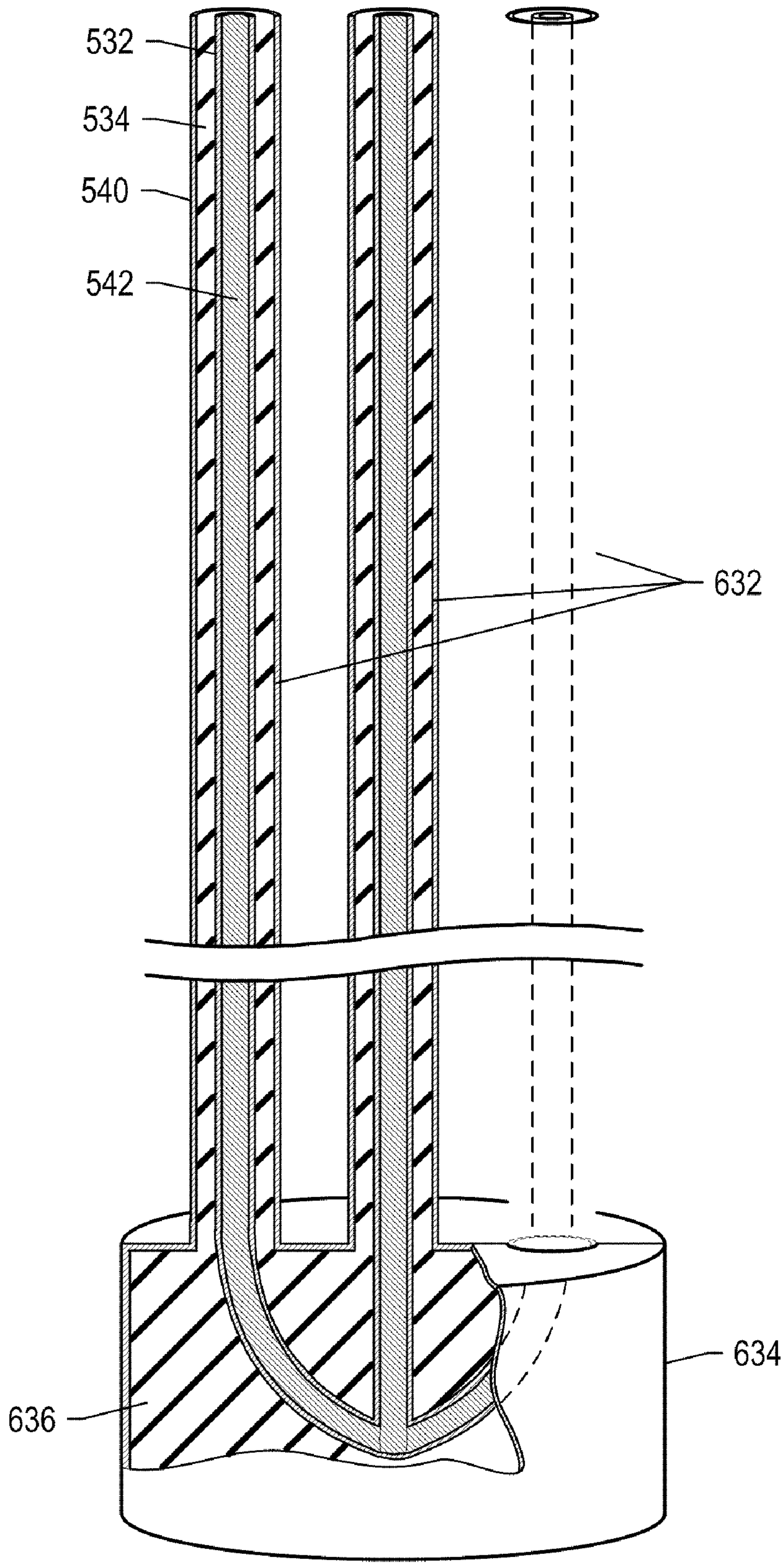
FIG. 107 depicts an embodiment of a three-phase temperature limited heater with a portion shown in cross section.

FIG. 107 depicts an embodiment of a three-phase temperature limited heater with ferromagnetic inner conductors. Each leg 632 has inner conductor 532, core 542, and jacket 540. Inner conductors 532 are ferritic stainless steel or 1% carbon steel. Inner conductors 532 have core 542. Core 542 may be copper. Each inner conductor 532 is coupled to its own jacket 540. Jacket 540 is a sheath made of a corrosion resistant material (such as 304H stainless steel). Electrical insulator 534 is placed between inner conductor 532 and jacket 540. Inner conductor 532 is ferritic stainless steel or carbon steel with an outside diameter of 1.14 cm and a thickness of 0.445 cm. Core 542 is a copper core with a 0.25 cm diameter. Each leg 632 of the heater is coupled to terminal block 634. Terminal block 634 is filled with insulation material 636 and has an outer surface of stainless steel. In some embodiments, insulation material 636 is silicon nitride, boron nitride, magnesium oxide or other suitable electrically insulating material. Inner conductors 532 of legs 632 are coupled (welded) in terminal block 634. Jackets 540 of legs 632 are coupled (welded) to the outer surface of terminal block 634. Terminal block 634 may include two halves coupled around the coupled portions of legs 632.

Figure 108:
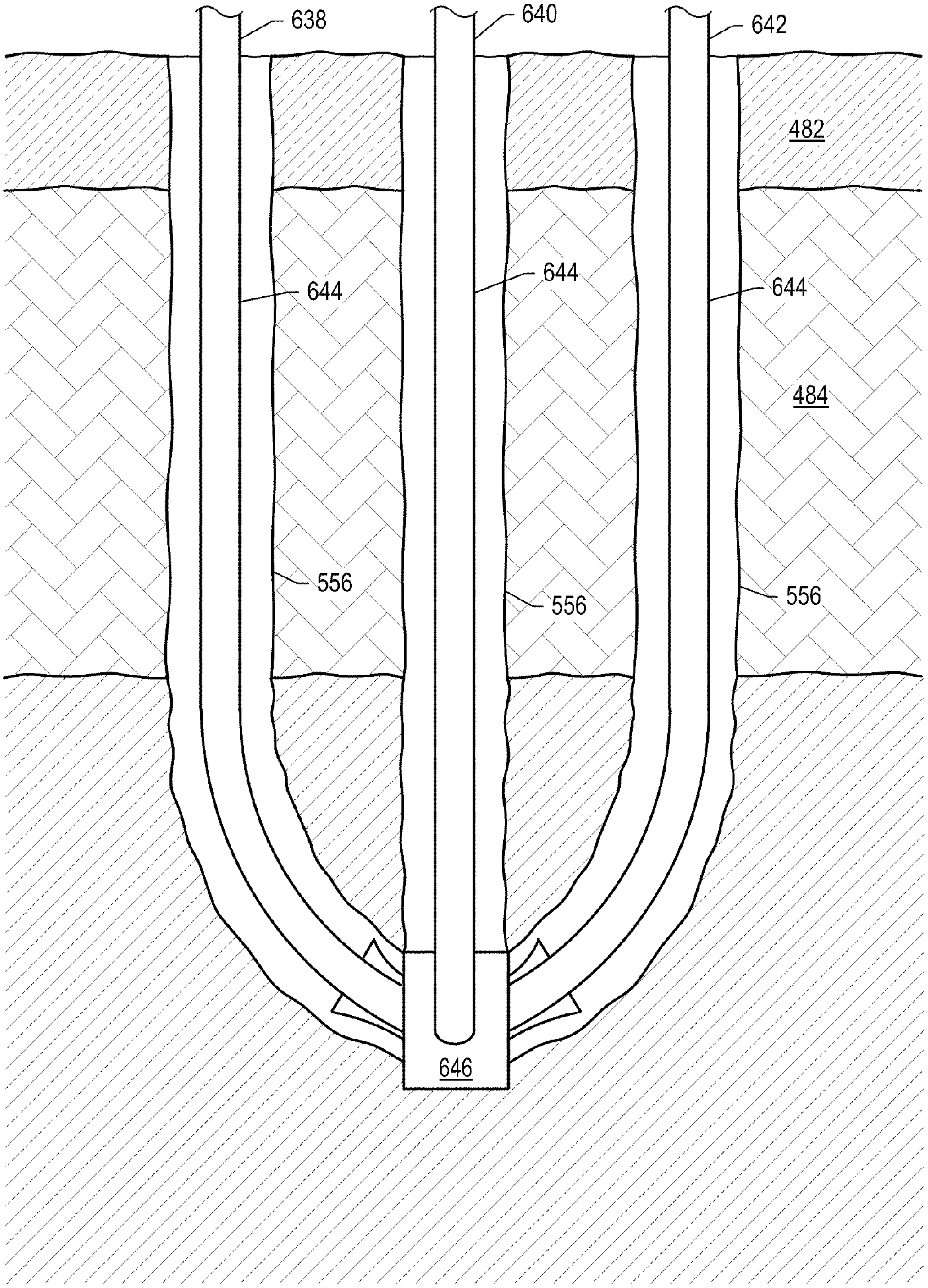
FIG. 108 depicts an embodiment of temperature limited heaters coupled together in a three-phase configuration.

In some embodiments, the three-phase heater includes three legs that are located in separate wellbores. The legs may be coupled in a common contacting section (for example, a central wellbore, a connecting wellbore, or a solution filled contacting section). FIG. 108 depicts an embodiment of temperature limited heaters coupled in a three-phase configuration. Each leg 638, 640, 642 may be located in separate openings 556 in hydrocarbon layer 484. Each leg 638, 640, 642 may include heating element 644. Each leg 638, 640, 642 may be coupled to single contacting element 646 in one opening 556. Contacting element 646 may electrically couple legs 638, 640, 642 together in a three-phase configuration. Contacting element 646 may be located in, for example, a central opening in the formation. Contacting element 646 may be located in a portion of opening 556 below hydrocarbon layer 484 (for example, in the underburden). In certain embodiments, magnetic tracking of a magnetic element located in a central opening (for example, opening 556 of leg 640) is used to guide the formation of the outer openings (for example, openings 556 of legs 638 and 642) so that the outer openings intersect the central opening. The central opening may be formed first using standard wellbore drilling methods. Contacting element 646 may include funnels, guides, or catchers for allowing each leg to be inserted into the contacting element.

Figure 109:
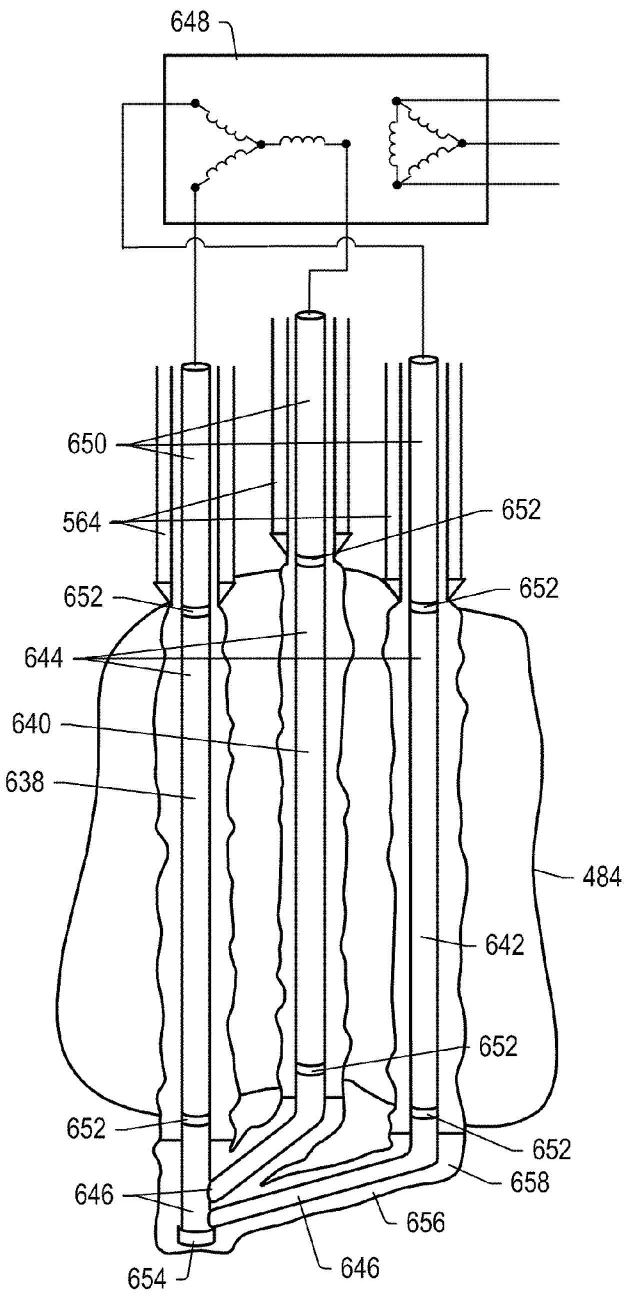
FIG. 109 depicts an embodiment of three heaters coupled in a three-phase configuration.

FIG. 109 depicts an embodiment of three heaters coupled in a three-phase configuration. Conductor "legs" 638, 640, 642 are coupled to three-phase transformer 648. Transformer 648 may be an isolated three-phase transformer. In certain embodiments, transformer 648 provides three-phase output in a wye configuration. Input to transformer 648 may be made in any input configuration, such as the shown delta configuration. Legs 638, 640, 642 each include lead-in conductors 650 in the overburden of the formation coupled to heating elements 644 in hydrocarbon layer 484. Lead-in conductors 650 include copper with an insulation layer. For example, lead-in conductors 650 may be a 4-0 copper cables with TEFLON® insulation, a copper rod with polyurethane insulation, or other metal conductors such as bare copper or aluminum. In certain embodiments, lead-in conductors 650 are located in an overburden portion of the formation. The overburden portion may include overburden casings 564. Heating elements 644 may be temperature limited heater heating elements. In an embodiment, heating elements 644 are 410 stainless steel rods (for example, 3.1 cm diameter 410 stainless steel rods). In some embodiments, heating elements 644 are composite temperature limited heater heating elements (for example, 347 stainless steel, 410 stainless steel, copper composite heating elements; 347 stainless steel, iron, copper composite heating elements; or 410 stainless steel and copper composite heating elements). In certain embodiments, heating elements 644 have a length of about 10 m to about 2000 m, about 20 m to about 400 m, or about 30 m to about 300 m.

In certain embodiments, heating elements 644 are exposed to hydrocarbon layer 484 and fluids from the hydrocarbon layer. Thus, heating elements 644 are "bare metal" or "exposed metal" heating elements. Heating elements 644 may be made from a material that has an acceptable sulfidation rate at high temperatures used for pyrolyzing hydrocarbons. In certain embodiments, heating elements 644 are made from material that has a sulfidation rate that decreases with increasing temperature over at least a certain temperature range (for example, 500° C. to 650° C., 530° C. to 650° C., or 550° C. to 650° C.). For example, 410 stainless steel may have a sulfidation rate that decreases with increasing temperature between 530° C. and 650° C. Using such materials reduces corrosion problems due to sulfur-containing gases (such as $H_2S$) from the formation. In certain embodiments, heating elements 644 are made from material that has a sulfidation rate below a selected value in a temperature range. In some embodiments, heating elements 644 are made from material that has a sulfidation rate at most about 25 mils per year at a temperature between about 800° C. and about 880° C. In some embodiments, the sulfidation rate is at most about 35 mils per year at a temperature between about 800° C. and about 880° C., at most about 45 mils per year at a temperature between about 800° C. and about 880° C., or at most about 55 mils per year at a temperature between about 800° C. and about 880° C. Heating elements 644 may also be substantially inert to galvanic corrosion.

In some embodiments, heating elements 644 have a thin electrically insulating layer such as aluminum oxide or thermal spray coated aluminum oxide. In some embodiments, the thin electrically insulating layer is a ceramic composition such as an enamel coating. Enamel coatings include, but are not limited to, high temperature porcelain enamels. High temperature porcelain enamels may include silicon dioxide, boron oxide, alumina, and alkaline earth oxides (CaO or MgO), and minor amounts of alkali oxides ($Na_2O$, $K_2O$, LiO). The enamel coating may be applied as a finely ground slurry by dipping the heating element into the slurry or spray coating the heating element with the slurry. The coated heating element is then heated in a furnace until the glass transition temperature is reached so that the slurry spreads over the surface of the heating element and makes the porcelain enamel coating. The porcelain enamel coating contracts when cooled below the glass transition temperature so that the coating is in compression. Thus, when the coating is heated during operation of the heater, the coating is able to expand with the heater without cracking.

The thin electrically insulating layer has low thermal impedance allowing heat transfer from the heating element to the formation while inhibiting current leakage between heating elements in adjacent openings and/or current leakage into the formation. In certain embodiments, the thin electrically insulating layer is stable at temperatures above at least 350° C., above 500° C., or above 800° C. In certain embodiments, the thin electrically insulating layer has an emissivity of at least 0.7, at least 0.8, or at least 0.9. Using the thin electrically insulating layer may allow for long heater lengths in the formation with low current leakage.

Heating elements 644 may be coupled to contacting elements 646 at or near the underburden of the formation. Contacting elements 646 are copper or aluminum rods or other highly conductive materials. In certain embodiments, transition sections 652 are located between lead-in conductors 650 and heating elements 644, and/or between heating elements 644 and contacting elements 646. Transition sections 652 may be made of a conductive material that is corrosion resistant such as 347 stainless steel over a copper core. In certain embodiments, transition sections 652 are made of materials that electrically couple lead-in conductors 650 and heating elements 644 while providing little or no heat output. Thus, transition sections 652 help to inhibit overheating of conductors and insulation used in lead-in conductors 650 by spacing the lead-in conductors from heating elements 644. Transition section 652 may have a length of between about 3 m and about 9 m (for example, about 6 m).

Contacting elements 646 are coupled to contactor 654 in contacting section 656 to electrically couple legs 638, 640, 642 to each other. In some embodiments, contact solution 658 (for example, conductive cement) is placed in contacting section 656 to electrically couple contacting elements 646 in the contacting section. In certain embodiments, legs 638, 640, 642 are substantially parallel in hydrocarbon layer 484 and leg 638 continues substantially vertically into contacting section 656. The other two legs 640, 642 are directed (for example, by directionally drilling the wellbores for the legs) to intercept leg 638 in contacting section 656.

Each leg 638, 640, 642 may be one leg of a three-phase heater embodiment so that the legs are substantially electrically isolated from other heaters in the formation and are substantially electrically isolated from the formation. Legs 638, 640, 642 may be arranged in a triangular pattern so that the three legs form a triangular shaped three-phase heater. In an embodiment, legs 638, 640, 642 are arranged in a triangular pattern with 12 m spacing between the legs (each side of the triangle has a length of 12 m).

Figure 110:
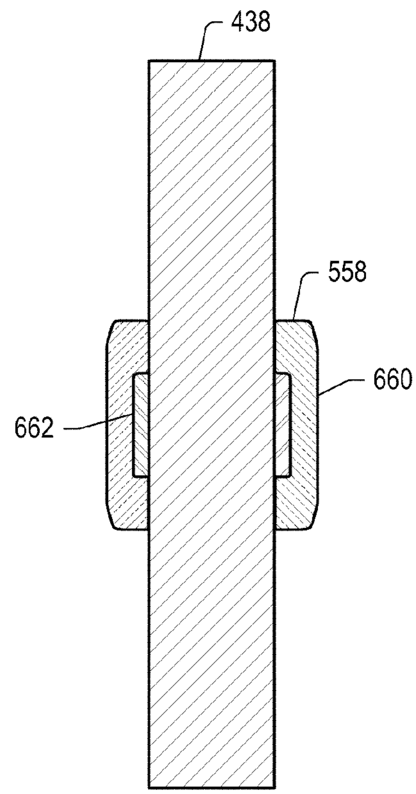
FIG. 110 depicts a cross-sectional representation of an embodiment of a centralizer on a heater.
Figure 111:
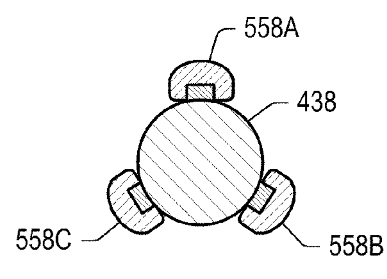
FIG. 111 depicts a cross-sectional representation of an embodiment of a centralizer on a heater.

FIG. 110 depicts a side view representation of an embodiment of centralizer 558 on heater 438. FIG. 111 depicts an end view representation of the embodiment of centralizer 558 on heater 438 depicted in FIG. 110. In certain embodiments, centralizers 558 are made of three or more parts coupled to heater 438 so that the parts are spaced around the outside diameter of the heater. Having spaces between the parts of a centralizer allows debris to fall along the heater (when the heater is vertical or substantially vertical) and inhibit debris from collecting at the centralizer. In certain embodiments, the centralizer is installed on a long heater without inserting a ring. In certain embodiments, heater 438, as depicted in FIGS. 110 and 111, is an electrical conductor used as part of a heater (for example, the electrical conductor of a conductor-in-conduit heater). In certain embodiments, centralizer 558 includes three centralizer parts 558A, 558B, and 558C. In other embodiments, centralizer 558 includes four or more centralizer parts. Centralizer parts 558A, 558B, 558C may be evenly distributed around the outside diameter of heater 438. Centralizer parts 558A, 558B, 558C may have shapes that inhibit collection of material and/or gouging of the canister that surrounds heater 438, even when the centralizer parts are rotated in the canister. In some embodiments, upper portions of centralizer parts 558A, 558B, 558C may taper and/or be rounded to inhibit accumulation of material on top of the centralizer parts.

In certain embodiments, centralizer parts 558A, 558B, 558C include insulators 660 and weld bases 662. Insulators 660 may be made of electrically insulating material such as, but not limited to, ceramic (for example, magnesium oxide) or silicon nitride. Weld bases 662 may be made of weldable metal such as, but not limited to, Alloy 625, the same metal used for heater 438, or another metal that may be brazed or solid state welded to insulators 660 and welded to a metal used for heater 438.

Weld bases 662 may be brazed or brazed to heater 438. In certain embodiments, insulators 660 are brazed, or otherwise coupled, to weld bases 662 to form centralizer parts 558A, 558B, 558C. Point load transfer between insulators 660 and weld bases 662 may be minimized by the coupling. In some embodiments, weld bases 662 are coupled to heater 438 first and then insulators 660 are coupled to the weld bases to form centralizer parts 558A, 558B, 558C. Insulators 660 may be coupled to weld bases 662 as the heater is being installed into the formation. In some embodiments, the bottoms of insulators 660 conform to the shape of heater 438. In other embodiments, the bottoms of insulators 660 are flat or have other geometries.

In certain embodiments, centralizer parts 558A, 558B, 558C are spaced evenly around the outside diameter of heater 438, as shown in FIGS. 110 and 111. In other embodiments, centralizer parts 558A, 558B, 558C have other spacings around the outside diameter of heater 438.

Having space between centralizer parts 558A, 558B, 558C allows installation of the heaters and centralizers from a spool or coiled tubing installation of the heaters and centralizers. Centralizer parts 558A, 558B, 558C also allow debris (for example, metal dust or pieces of formation) to fall along heater 438 through the area of the centralizer. Thus, debris is inhibited from collecting at or near centralizer 558. In addition, centralizer parts 558A, 558B, 558C may be inexpensive to manufacture and install and easy to replace if broken.

Figure 112:
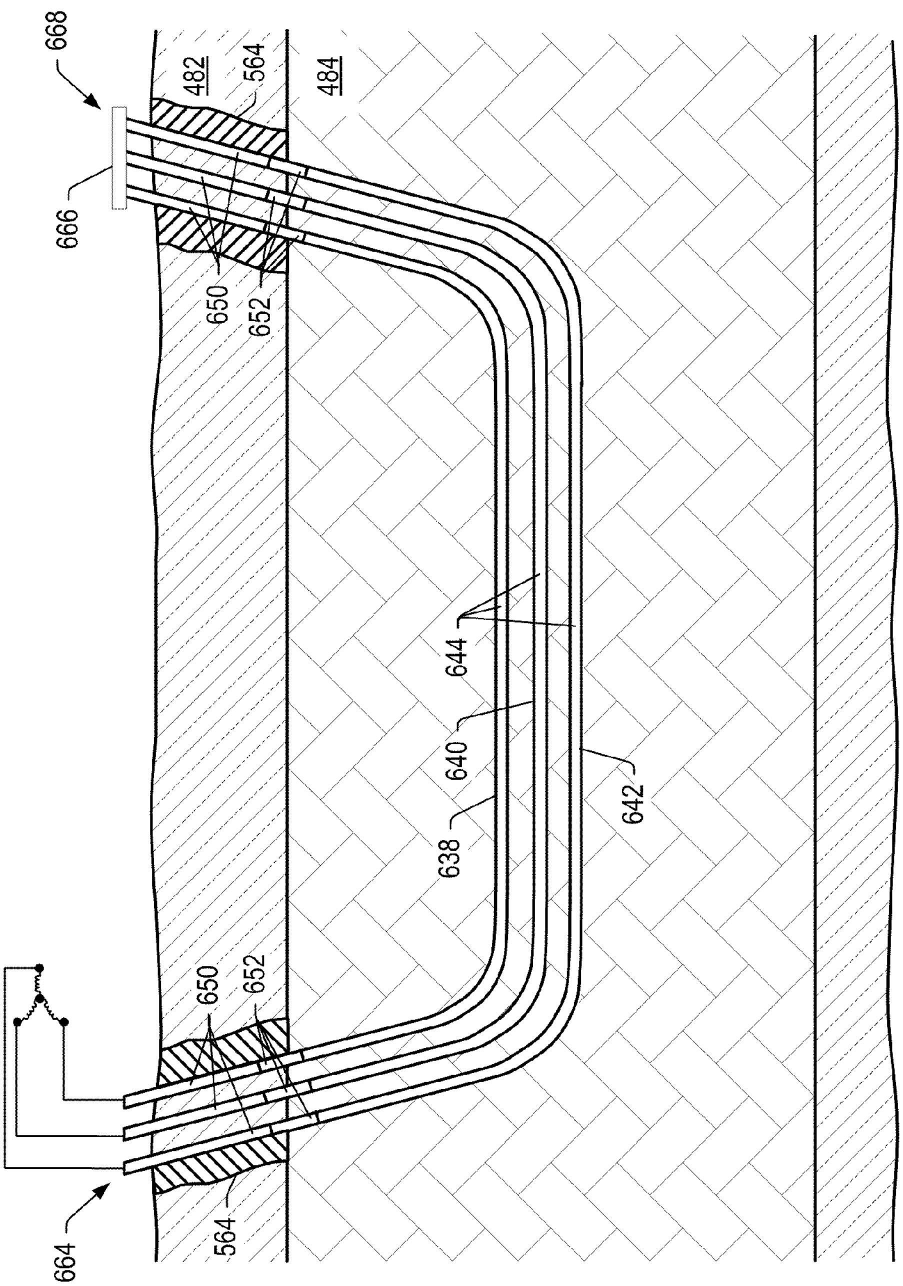
FIG. 112 depicts a side view representation of an embodiment of a substantially u-shaped three-phase heater in a formation.

FIG. 112 depicts a side view representation of an embodiment of a substantially u-shaped three-phase heater. First ends of legs 638, 640, 642 are coupled to transformer 648 at first location 664. In an embodiment, transformer 648 is a three-phase AC transformer. Ends of legs 638, 640, 642 are electrically coupled together with connector 666 at second location 668. Connector 666 electrically couples the ends of legs 638, 640, 642 so that the legs can be operated in a three-phase configuration. In certain embodiments, legs 638, 640, 642 are coupled to operate in a three-phase wye configuration. In certain embodiments, legs 638, 640, 642 are substantially parallel in hydrocarbon layer 484. In certain embodiments, legs 638, 640, 642 are arranged in a triangular pattern in hydrocarbon layer 484. In certain embodiments, heating elements 644 include thin electrically insulating material (such as a porcelain enamel coating) to inhibit current leakage from the heating elements. In certain embodiments, the thin electrically insulating layer allows for relatively long, substantially horizontal heater leg lengths in the hydrocarbon layer with a substantially u-shaped heater. In certain embodiments, legs 638, 640, 642 are electrically coupled so that the legs are substantially electrically isolated from other heaters in the formation and are substantially electrically isolated from the formation.

In certain embodiments, overburden casings (for example, overburden casings 564, depicted in FIGS. 109 and 112) in overburden 482 include materials that inhibit ferromagnetic effects in the casings. Inhibiting ferromagnetic effects in casings 564 reduces heat losses to the overburden. In some embodiments, casings 564 may include non-metallic materials such as fiberglass, polyvinylchloride (PVC), chlorinated polyvinylchloride (CPVC), or high-density polyethylene (HDPE). HDPEs with working temperatures in a range for use in overburden 482 include HDPEs available from Dow Chemical Co., Inc. (Midland, Mich., U.S.A.). A non-metallic casing may also eliminate the need for an insulated overburden conductor. In some embodiments, casings 564 include carbon steel coupled on the inside diameter of a non-ferromagnetic metal (for example, carbon steel clad with copper or aluminum) to inhibit ferromagnetic effects or inductive effects in the carbon steel. Other non-ferromagnetic metals include, but are not limited to, manganese steels with at least 10% by weight manganese, iron aluminum alloys with at least 18% by weight aluminum, and austentitic stainless steels such as 304 stainless steel or 316 stainless steel.

In certain embodiments, one or more non-ferromagnetic materials used in casings 564 are used in a wellhead coupled to the casings and legs 638, 640, 642. Using non-ferromagnetic materials in the wellhead inhibits undesirable heating of components in the wellhead. In some embodiments, a purge gas (for example, carbon dioxide, nitrogen or argon) is introduced into the wellhead and/or inside of casings 564 to inhibit reflux of heated gases into the wellhead and/or the casings.

In certain embodiments, one or more of legs 638, 640, 642 are installed in the formation using coiled tubing. In certain embodiments, coiled tubing is installed in the formation, the leg is installed inside the coiled tubing, and the coiled tubing is pulled out of the formation to leave the leg installed in the formation. The leg may be placed concentrically inside the coiled tubing. In some embodiments, coiled tubing with the leg inside the coiled tubing is installed in the formation and the coiled tubing is removed from the formation to leave the leg installed in the formation. The coiled tubing may extend only to a junction of the hydrocarbon layer and the contacting section, or to a point at which the leg begins to bend in the contacting section.

Figure 113:
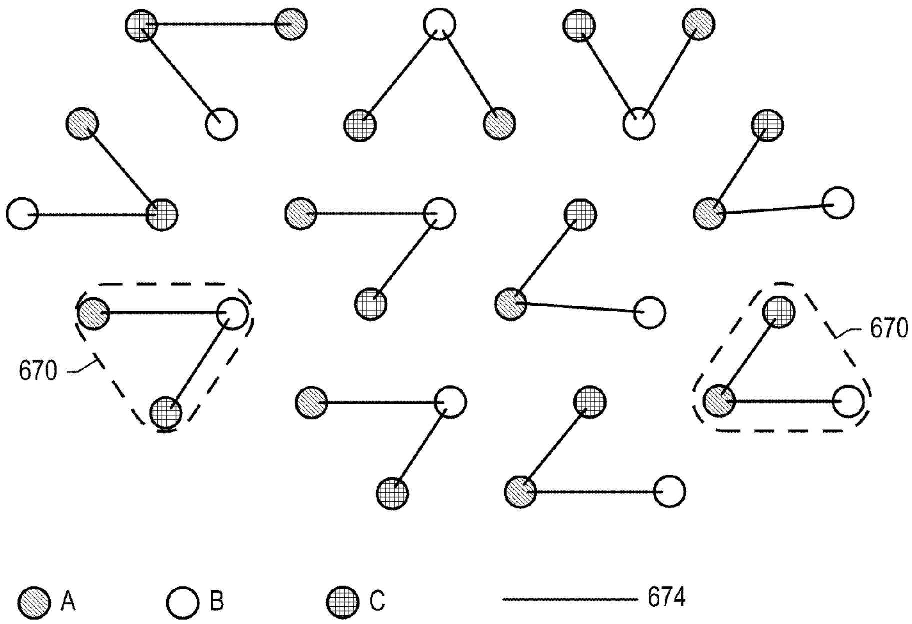
FIG. 113 depicts a top view representation of an embodiment of a plurality of triads of three-phase heaters in a formation.

FIG. 113 depicts a top view representation of an embodiment of a plurality of triads of three-phase heaters in the formation. Each triad 670 includes legs A, B, C (which may correspond to legs 638, 640, 642 depicted in FIGS. 109 and 112) that are electrically coupled by linkages 674. Each triad 670 is coupled to its own electrically isolated three-phase transformer so that the triads are substantially electrically isolated from each other. Electrically isolating the triads inhibits net current flow between triads.

The phases of each triad 670 may be arranged so that legs A, B, C correspond between triads as shown in FIG. 113. Legs A, B, C are arranged such that a phase leg (for example, leg A) in a given triad is about two triad heights from a same phase leg (leg A) in an adjacent triad. The triad height is the distance from a vertex of the triad to a midpoint of the line intersecting the other two vertices of the triad. In certain embodiments, the phases of triads 670 are arranged to inhibit net current flow between individual triads. There may be some leakage of current within an individual triad but little net current flows between two triads due to the substantial electrical isolation of the triads and, in certain embodiments, the arrangement of the triad phases.

In the early stages of heating, an exposed heating element (for example, heating element 644 depicted in FIGS. 109 and 112) may leak some current to water or other fluids that are electrically conductive in the formation so that the formation itself is heated. After water or other electrically conductive fluids are removed from the wellbore (for example, vaporized or produced), the heating elements become electrically isolated from the formation. Later, when water is removed from the formation, the formation becomes even more electrically resistant and heating of the formation occurs even more predominantly via thermally conductive and/or radiative heating. Typically, the formation (the hydrocarbon layer) has an initial electrical resistance that averages at least 10 ohm m. In some embodiments, the formation has an initial electrical resistance of at least 100 ohm·m or of at least 300 ohm m.

Using the temperature limited heaters as the heating elements limits the effect of water saturation on heater efficiency. With water in the formation and in heater wellbores, there is a tendency for electrical current to flow between heater elements at the top of the hydrocarbon layer where the voltage is highest and cause uneven heating in the hydrocarbon layer. This effect is inhibited with temperature limited heaters because the temperature limited heaters reduce localized overheating in the heating elements and in the hydrocarbon layer.

Figure 114:
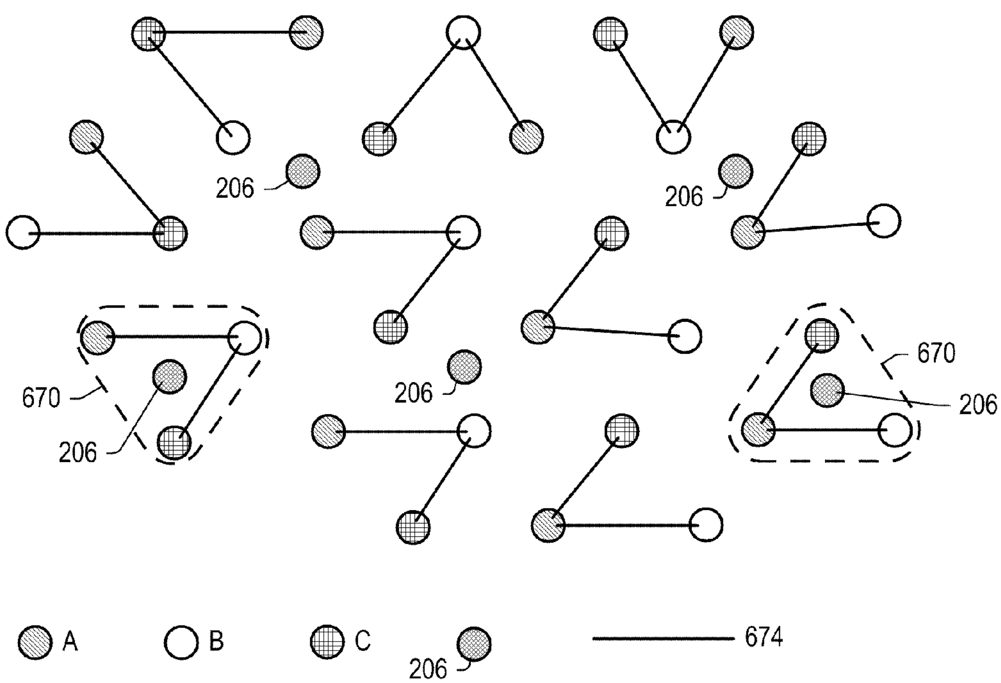
FIG. 114 depicts a top view representation of an embodiment of a plurality of triads of three-phase heaters in a formation with production wells.

In certain embodiments, production wells are placed at a location at which there is relatively little or zero voltage potential. This location minimizes stray potentials at the production well. Placing production wells at such locations improves the safety of the system and reduces or inhibits undesired heating of the production wells caused by electrical current flow in the production wells. FIG. 114 depicts a top view representation of the embodiment depicted in FIG. 113 with production wells 206. In certain embodiments, production wells 206 are located at or near center of triad 670. In certain embodiments, production wells 206 are placed at a location between triads at which there is relatively little or zero voltage potential (at a location at which voltage potentials from vertices of three triads average out to relatively little or zero voltage potential). For example, production well 206 may be at a location equidistant from leg A of one triad, leg B of a second triad, and leg C of a third triad, as shown in FIG. 114.

Figure 115:
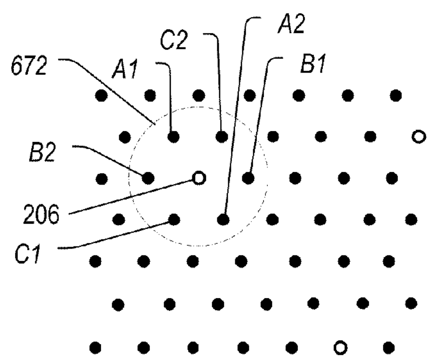
FIG. 115 depicts a top view representation of an embodiment of a plurality of triads of three-phase heaters in a hexagonal pattern.
Figure 116:
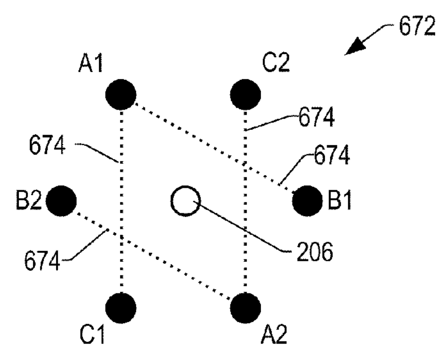
FIG. 116 depicts a top view representation of an embodiment of a hexagon from FIG. 115.

FIG. 115 depicts a top view representation of an embodiment of a plurality of triads of three-phase heaters in a hexagonal pattern in the formation. FIG. 116 depicts a top view representation of an embodiment of a hexagon from FIG. 115. Hexagon 672 includes two triads of heaters. The first triad includes legs A1, B1, C1 electrically coupled together by linkages 674 in a three-phase configuration. The second triad includes legs A2, B2, C2 electrically coupled together by linkages 674 in a three-phase configuration. The triads are arranged so that corresponding legs of the triads (for example, A1 and A2, B1 and B2, C1 and C2) are at opposite vertices of hexagon 672. The triads are electrically coupled and arranged so that there is relatively little or zero voltage potential at or near the center of hexagon 672.

Production well 206 may be placed at or near the center of hexagon 672. Placing production well 206 at or near the center of hexagon 672 places the production well at a location that reduces or inhibits undesired heating due to electromagnetic effects caused by electrical current flow in the legs of the triads and increases the safety of the system. Having two triads in hexagon 672 provides for redundant heating around production well 206. Thus, if one triad fails or has to be turned off, production well 206 still remains at a center of one triad.

As shown in FIG. 115, hexagons 672 may be arranged in a pattern in the formation such that adjacent hexagons are offset. Using electrically isolated transformers on adjacent hexagons may inhibit electrical potentials in the formation so that little or no net current leaks between hexagons.

Triads of heaters and/or heater legs may be arranged in any shape or desired pattern. For example, as described above, triads may include three heaters and/or heater legs arranged in an equilateral triangular pattern. In some embodiments, triads include three heaters and/or heater legs arranged in other triangular shapes (for example, an isosceles triangle or a right angle triangle). In some embodiments, heater legs in the triad cross each other (for example, criss-cross) in the formation. In certain embodiments, triads includes three heaters and/or heater legs arranged sequentially along a straight line.

Distal sections of the heater legs may be electrically coupled together. The distal sections may be electrically coupled to a connector or to each other. In certain embodiments, contacting elements of the heater legs are physically coupled to establish the electrical coupling. For example, heater legs may be electrically coupled by soldering, by welding, by explosive crimping, by interconnecting brush contacts and/or by other techniques that involve physically attaching the legs to each other or to a connector. In some embodiments, the contacting elements of the heater legs are placed in a contacting solution or other electrically conductive material to electrically couple the heater legs together.

Figure 117:
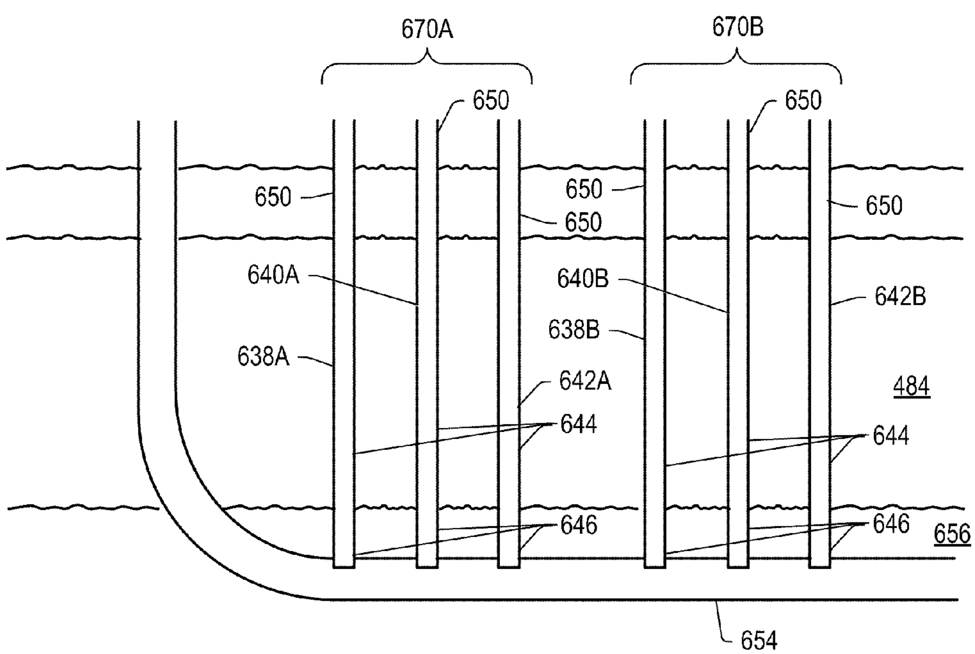
FIG. 117 depicts an embodiment of triads of heaters coupled to a horizontal bus bar.

FIG. 117 depicts an embodiment with triads coupled to a horizontal connector well. Triad 670A includes legs 638A, 640A, 642A. Triad 670B includes legs 638B, 640B, 642B. Legs 638A, 640A, 642A and legs 638B, 640B, 642B may be arranged along a straight line on the surface of the formation. In some embodiments, legs 638A, 640A, 642A are arranged along a straight line and offset from legs 638B, 640B, 642B, which may be arranged along a straight line. Legs 638A, 640A, 642A and legs 638B, 640B, 642B include heating elements 644 located in hydrocarbon layer 484. Lead-in conductors 650 couple heating elements 644 to the surface of the formation. Heating elements 644 are coupled to contacting elements 646 at or near the underburden of the formation. In certain embodiments, transition sections (for example, transition sections 652 depicted in FIG. 109) are located between lead-in conductors 650 and heating elements 644, and/or between heating elements 644 and contacting elements 646.

Contacting elements 646 are coupled to contactor 654 in contacting section 656 to electrically couple legs 638A, 640A, 642A to each other to form triad 670A and electrically couple legs 638B, 640B, 642B to each other to form triad 670B. In certain embodiments, contactor 654 is a ground conductor so that triad 670A and/or triad 670B may be coupled in three-phase wye configurations. In certain embodiments, triad 670A and triad 670B are electrically isolated from each other. In some embodiments, triad 670A and triad 670B are electrically coupled to each other (for example, electrically coupled in series or parallel).

In certain embodiments, contactor 654 is a substantially horizontal contactor located in contacting section 656. Contactor 654 may be a casing or a solid rod placed in a wellbore drilled substantially horizontally in contacting section 656. Legs 638A, 640A, 642A and legs 638B, 640B, 642B may be electrically coupled to contactor 654 by any method described herein or any method known in the art. For example, containers with thermite powder are coupled to contactor 654 (for example, by welding or brazing the containers to the contactor); legs 638A, 640A, 642A and legs 638B, 640B, 642B are placed inside the containers; and the thermite powder is activated to electrically couple the legs to the contactor. The containers may be coupled to contactor 654 by, for example, placing the containers in holes or recesses in contactor 654 or coupled to the outside of the contactor and then brazing or welding the containers to the contactor.

Figure 118:
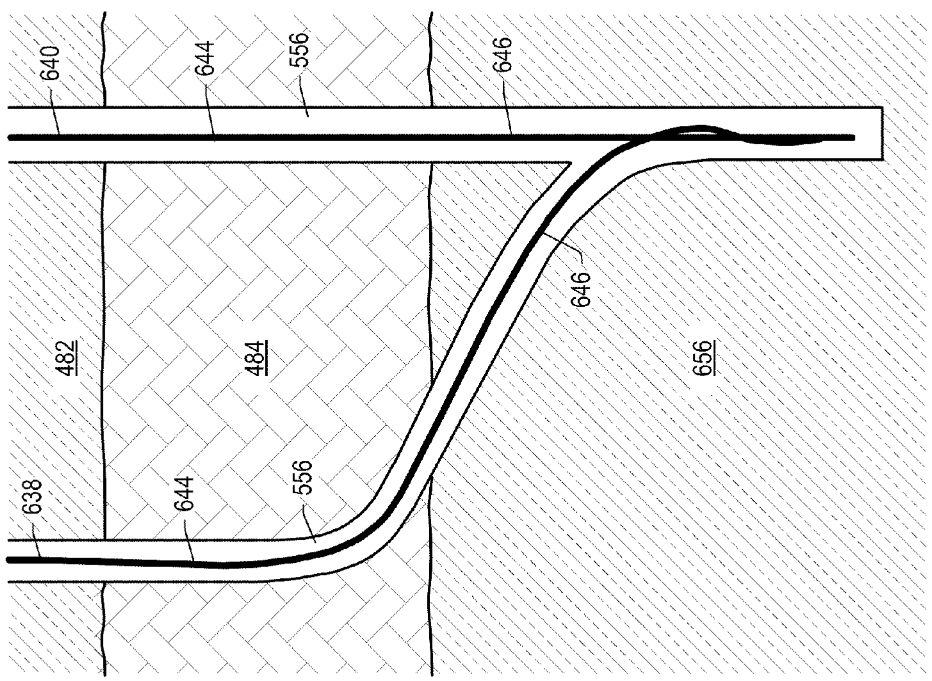
FIG. 118 depicts an embodiment of two temperature limited heaters coupled together in a single contacting section.

In certain embodiments, two legs in separate wellbores intercept in a single contacting section. FIG. 118 depicts an embodiment of two temperature limited heaters coupled in a single contacting section. Legs 638 and 640 include one or more heating elements 644. Heating elements 644 may include one or more electrical conductors. In certain embodiments, legs 638 and 640 are electrically coupled in a single-phase configuration with one leg positively biased versus the other leg so that current flows downhole through one leg and returns through the other leg.

Heating elements 644 in legs 638 and 640 may be temperature limited heaters. In certain embodiments, heating elements 644 are solid rod heaters. For example, heating elements 644 may be rods made of a single ferromagnetic conductor element or composite conductors that include ferromagnetic material. During initial heating when water is present in the formation being heated, heating elements 644 may leak current into hydrocarbon layer 484. The current leaked into hydrocarbon layer 484 may resistively heat the hydrocarbon layer.

In some embodiments (for example, in oil shale formations), heating elements 644 do not need support members. Heating elements 644 may be partially or slightly bent, curved, made into an S-shape, or made into a helical shape to allow for expansion and/or contraction of the heating elements. In certain embodiments, solid rod heating elements 644 are placed in small diameter wellbores (for example, about 3¾" (about 9.5 cm) diameter wellbores). Small diameter wellbores may be less expensive to drill or form than larger diameter wellbores, and there will be less cuttings to dispose of.

In certain embodiments, portions of legs 638 and 640 in overburden 482 have insulation (for example, polymer insulation) to inhibit heating the overburden. Heating elements 644 may be substantially vertical and substantially parallel to each other in hydrocarbon layer 484. At or near the bottom of hydrocarbon layer 484, leg 638 may be directionally drilled towards leg 640 to intercept leg 640 in contacting section 656. Drilling two wellbores to intercept each other may be easier and less expensive than drilling three or more wellbores to intercept each other. The depth of contacting section 656 depends on the length of bend in leg 638 needed to intercept leg 640. For example, for a 40 ft (about 12 m) spacing between vertical portions of legs 638 and 640, about 200 ft (about 61 m) is needed to allow the bend of leg 638 to intercept leg 640. Coupling two legs may require a thinner contacting section 656 than coupling three or more legs in the contacting section.

Figure 119:
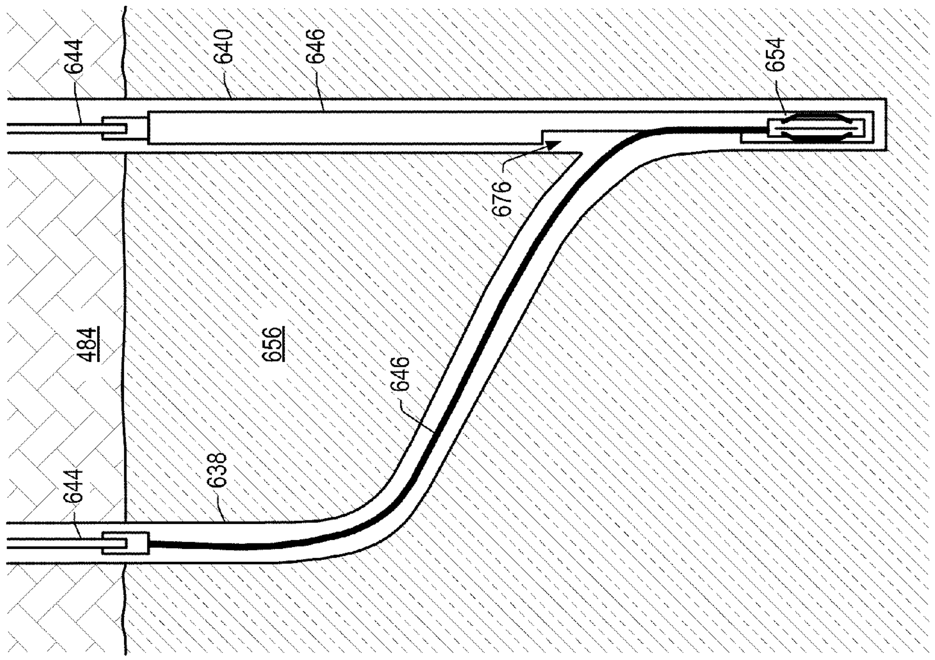
FIG. 119 depicts an embodiment of two temperature limited heaters with legs coupled in a contacting section.

FIG. 119 depicts an embodiment for coupling legs 638 and 640 in contacting section 656. Heating elements 644 are coupled to contacting elements 646 at or near junction of contacting section 656 and hydrocarbon layer 484. Contacting elements 646 may be copper or another suitable electrical conductor. In certain embodiments, contacting element 646 in leg 640 is a liner with opening 676. Contacting element 646 from leg 638 passes through opening 676. Contactor 654 is coupled to the end of contacting element 646 from leg 638. Contactor 654 provides electrical coupling between contacting elements in legs 638 and 640.

In certain embodiments, contacting elements 646 include one or more fins or projections. The fins or projections may increase an electrical contact area of contacting elements 646. In some embodiments, contacting element 646 of leg 640 has an opening or other orifice that allows the contacting element of 638 to couple to the contacting element of leg 640.

Figure 120:
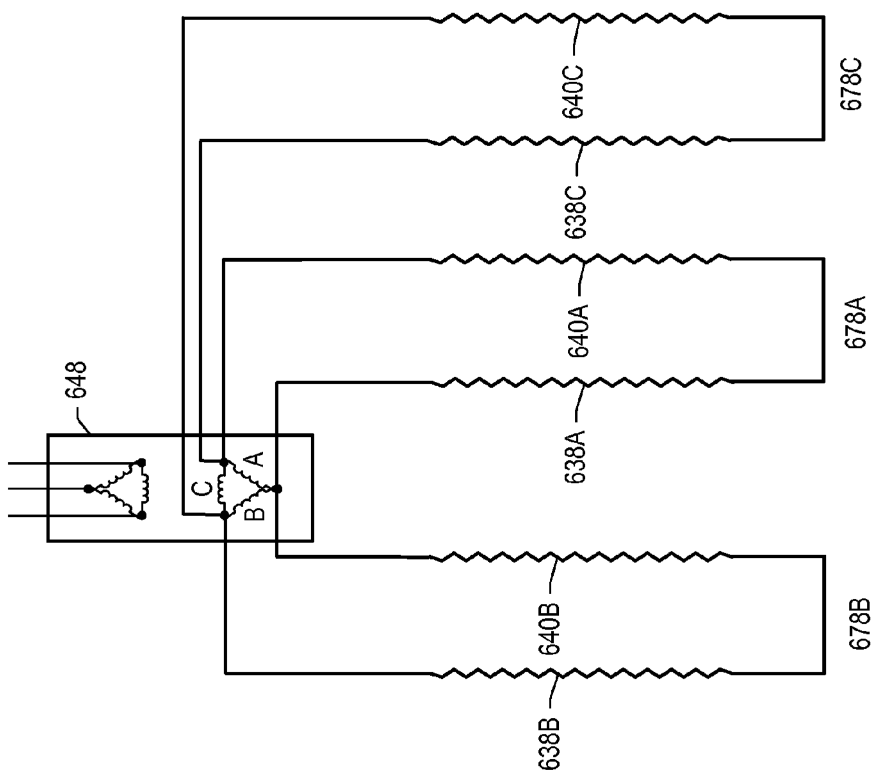
FIG. 120 depicts an embodiment of three diads coupled to a three-phase transformer.

In certain embodiments, legs 638 and 640 are coupled together to form a diad. Three diads may be coupled to a three-phase transformer to power the legs of the heaters. FIG. 120 depicts an embodiment of three diads coupled to a three-phase transformer. In certain embodiments, transformer 648 is a delta three-phase transformer. Diad 678A includes legs 638A and 640A. Diad 678B includes legs 638B and 640B. Diad 678C includes legs 638C and 640C. Diads 678A, 678B, 678C are coupled to the secondaries of transformer 648. Diad 678A is coupled to the "A" secondary. Diad 678B is coupled to the "B" secondary. Diad 678C is coupled to the "C" secondary.

Coupling the diads to the secondaries of the delta three-phase transformer isolates the diads from ground. Isolating the diads from ground inhibits leakage to the formation from the diads. Coupling the diads to different phases of the delta three-phase transformer also inhibits leakage between the heating legs of the diads in the formation.

Figure 121:
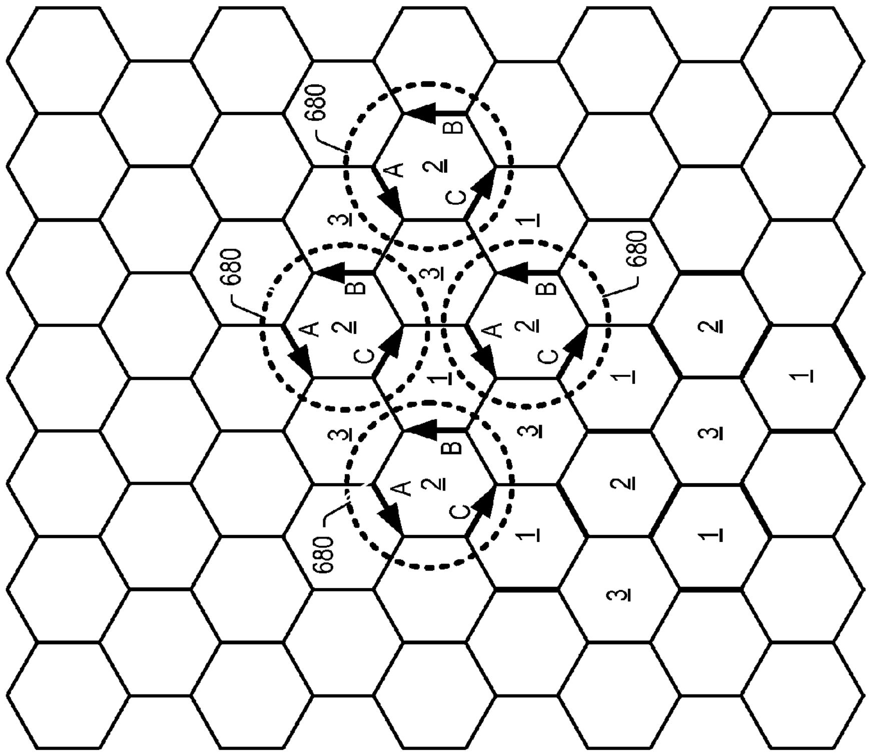
FIG. 121 depicts an embodiment of groups of diads in a hexagonal pattern.

In some embodiments, diads are used for treating formations using triangular or hexagonal heater patterns. FIG. 121 depicts an embodiment of groups of diads in a hexagonal pattern. Heaters may be placed at the vertices of each of the hexagons in the hexagonal pattern. Each group 680 of diads (enclosed by dashed circles) may be coupled to a separate three-phase transformer. "A", "B", and "C" inside groups 680 represent each diad (for example, diads 678A, 678B, 678C depicted in FIG. 120) that is coupled to each of the three secondary phases of the transformer with each phase coupled to one diad (with the heaters at the vertices of the hexagon). The numbers "1", "2", and "3" inside the hexagons represent the three repeating types of hexagons in the pattern depicted in FIG. 121.

Figure 122:
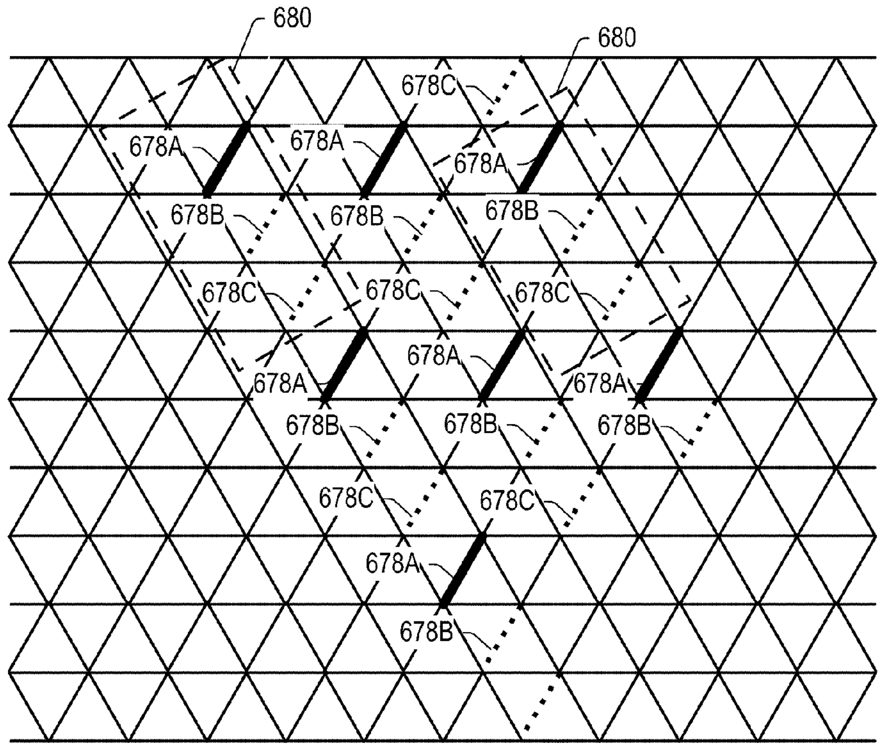
FIG. 122 depicts an embodiment of diads in a triangular pattern.

FIG. 122 depicts an embodiment of diads in a triangular pattern. Three diads 678A, 678B, 678C may be enclosed in each group 680 of diads (enclosed by dashed rectangles). Each group 680 may be coupled to a separate three-phase transformer.

In certain embodiments, exposed metal heating elements are used in substantially horizontal sections of u-shaped wellbores. Substantially u-shaped wellbores may be used in tar sands formations, oil shale formation, or other formations with relatively thin hydrocarbon layers. Tar sands or thin oil shale formations may have thin shallow layers that are more easily and uniformly heated using heaters placed in substantially u-shaped wellbores. Substantially u-shaped wellbores may also be used to process formations with thick hydrocarbon layers. In some embodiments, substantially u-shaped wellbores are used to access rich layers in a thick hydrocarbon formation.

Heaters in substantially u-shaped wellbores may have long lengths compared to heaters in vertical wellbores because horizontal heating sections do not have problems with creep or hanging stress encountered with vertical heating elements. Substantially u-shaped wellbores may make use of natural seals in the formation and/or the limited thickness of the hydrocarbon layer. For example, the wellbores may be placed above or below natural seals in the formation without punching large numbers of holes in the natural seals, as would be needed with vertically oriented wellbores. Using substantially u-shaped wellbores instead of vertical wellbores may also reduce the number of wells needed to treat a surface footprint of the formation. Using less wells reduces capital costs for equipment and reduces the environmental impact of treating the formation by reducing the amount of wellbores on the surface and the amount of equipment on the surface. Substantially u-shaped wellbores may also utilize a lower ratio of overburden section to heated section than vertical wellbores.

Substantially u-shaped wellbores may allow for flexible placement of the openings of the wellbores on the surface. Openings to the wellbores may be placed according to the surface topology of the formation. In certain embodiments, the openings of wellbores are placed at geographically accessible locations such as topological highs (for examples, hills). For example, the wellbore may have a first opening on a first topologic high and a second opening on a second topologic high and the wellbore crosses beneath a topologic low (for example, a valley with alluvial fill) between the first and second topologic highs. This placement of the openings may avoid placing openings or equipment in topologic lows or other inaccessible locations. In addition, the water level may not be artesian in topologically high areas. Wellbores may be drilled so that the openings are not located near environmentally sensitive areas such as, but not limited to, streams, nesting areas, or animal refuges.

Figure 123:
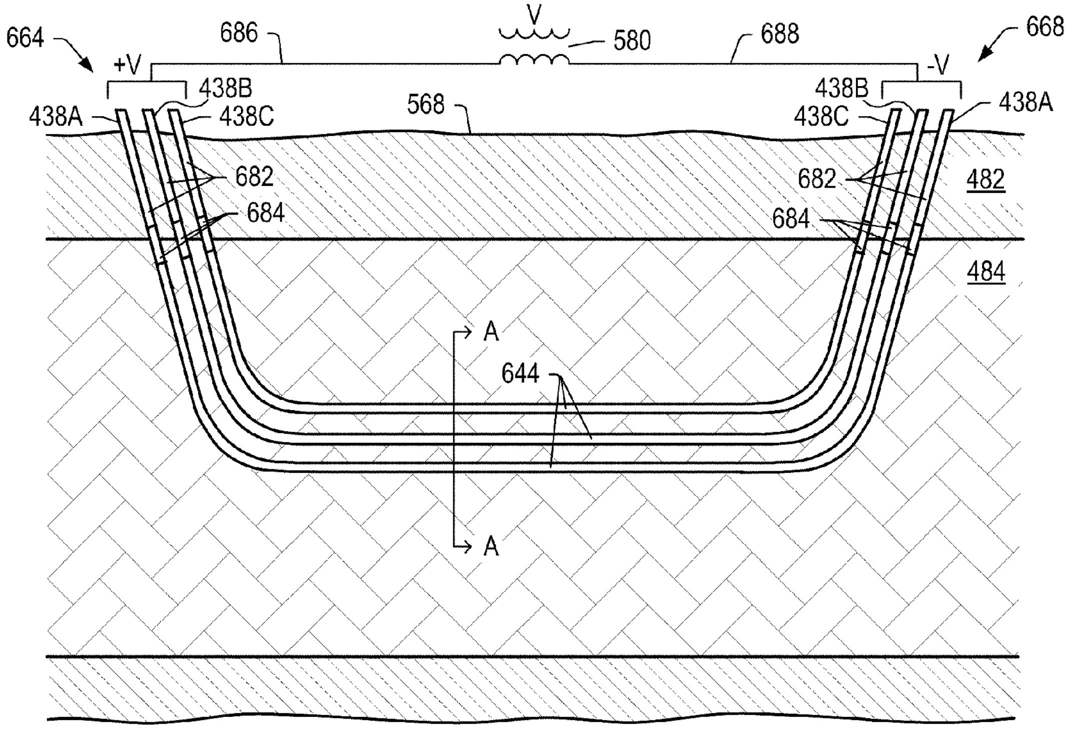
FIG. 123 depicts a cross-sectional representation of an embodiment of substantially u-shaped heaters in a formation.

FIG. 123 depicts a cross-sectional representation of an embodiment of a heater with an exposed metal heating element placed in a substantially u-shaped wellbore. Heaters 438A, 438B, 438C have first end portions at first location 664 on surface 568 of the formation and second end portions at second location 668 on the surface. Heaters 438A, 438B, 438C have sections 682 in overburden 482. Sections 682 are configured to provide little or no heat output. In certain embodiments, sections 682 include an insulated electrical conductor such as insulated copper. Sections 682 are coupled to heating elements 644.

In certain embodiments, portions of heating elements 644 are substantially parallel in hydrocarbon layer 484. In certain embodiments, heating elements 644 are exposed metal heating elements. In certain embodiments, heating elements 644 are exposed metal temperature limited heating elements. Heating elements 644 may include ferromagnetic materials such as 9% by weight to 13% by weight chromium stainless steel like 410 stainless steel, chromium stainless steels such as T/P91 or T/P92, 409 stainless steel, VM12 (Vallourec and Mannesmann Tubes, France) or iron-cobalt alloys for use as temperature limited heaters. In some embodiments, heating elements 644 are composite temperature limited heating elements such as 410 stainless steel and copper composite heating elements or 347H, iron, copper composite heating elements. Heating elements 644 may have lengths of at least about 100 m, at least about 500 m, or at least about 1000 m, up to lengths of about 6000 m.

Heating elements 644 may be solid rods or tubulars. In certain embodiments, solid rod heating elements have diameters several times the skin depth at the Curie temperature of the ferromagnetic material. Typically, the solid rod heating elements may have diameters of 1.91 cm or larger (for example, 2.5 cm, 3.2 cm, 3.81 cm, or 5.1 cm). In certain embodiments, tubular heating elements have wall thicknesses of at least twice the skin depth at the Curie temperature of the ferromagnetic material. Typically, the tubular heating elements have outside diameters of between about 2.5 cm and about 15.2 cm and wall thickness in range between about 0.13 cm and about 1.01 cm.

In certain embodiments, tubular heating elements 644 allow fluids to be convected through the tubular heating elements. Fluid flowing through the tubular heating elements may be used to preheat the tubular heating elements to initially heat the formation and/or to recover heat from the formation after heating is completed for the in situ heat treatment process. Fluids that may flow through the tubular heating elements include, but are not limited to, air, water, steam, helium, carbon dioxide or other fluids. In some embodiments, a hot fluid, such as carbon dioxide or helium, flows through the tubular heating elements to provide heat to the formation. The hot fluid may be used to provide heat to the formation before electrical heating is used to provide heat to the formation. In some embodiments, the hot fluid is used to provide heat in addition to electrical heating. Using the hot fluid to provide heat to the formation in addition to providing electrical heating may be less expensive than using electrical heating alone to provide heat to the formation. In some embodiments, water and/or steam flows through the tubular heating element to recover heat from the formation. The heated water and/or steam may be used for solution mining and/or other processes.

Transition sections 684 may couple heating elements 644 to sections 682. In certain embodiments, transition sections 684 include material that has a high electrical conductivity but is corrosion resistant, such as 347 stainless steel over copper. In an embodiment, transition sections include a composite of stainless steel clad over copper. Transition sections 684 inhibit overheating of copper and/or insulation in sections 682.

Figure 124:
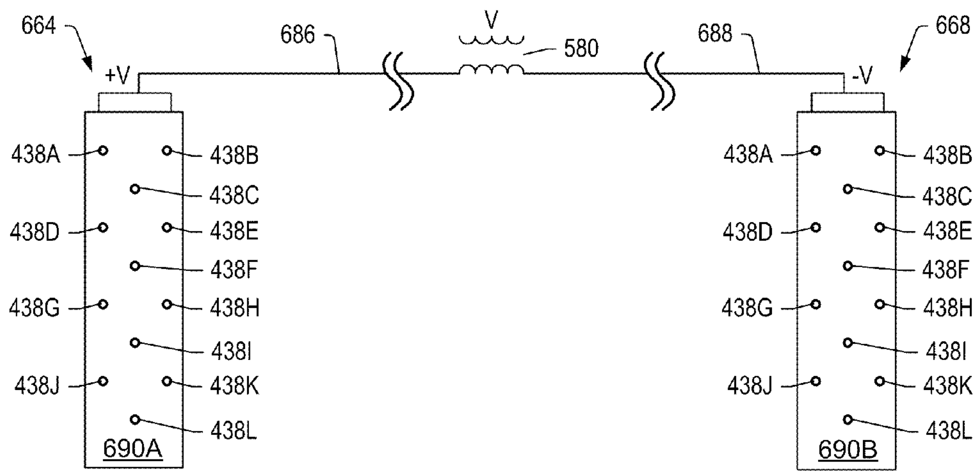

FIG. 124 depicts a top view representation of an embodiment of a surface pattern of the heaters depicted in FIG. 123. Heaters 438A-L may be arranged in a repeating triangular pattern on the surface of the formation. A triangle may be formed by heaters 438A, 438B, and 438C and a triangle formed by heaters 438C, 438D, and 438E. In some embodiments, heaters 438A-L are arranged in a straight line on the surface of the formation. Heaters 438A-L have first end portions at first location 664 on the surface and second end portions at second location 668 on the surface. Heaters 438A-L are arranged such that (a) the patterns at first location 664 and second location 668 correspond to each other, (b) the spacing between heaters is maintained at the two locations on the surface, and/or (c) the heaters all have substantially the same length (substantially the same horizontal distance between the end portions of the heaters on the surface as shown in the top view of FIG. 124).

As depicted in FIGS. 123 and 124, cables 686, 688 may be coupled to transformer 580 and one or more heater units, such as the heater unit including heaters 438A, 438B, 438C. Cables 686, 688 may carry a large amount of power. In certain embodiments, cables 686, 688 are capable of carrying high currents with low losses. For example, cables 686, 688 may be thick copper or aluminum conductors. The cables may also have thick insulation layers. In some embodiments, cable 686 and/or cable 688 may be superconducting cables. The superconducting cables may be cooled by liquid nitrogen. Superconducting cables are available from Superpower, Inc. (Schenectady, N.Y., U.S.A.). Superconducting cables may minimize power loss and reduce the size of the cables needed to couple transformer 580 to the heaters. In some embodiments, cables 686, 688 may be made of carbon nanotubes. Carbon nanotubes as conductors may have about 1000 times the conductivity of copper for the same diameter. Also, carbon nanotubes may not require refrigeration during use.

In certain embodiments, bus bar 690A is coupled to first end portions of heaters 438A-L and bus bar 690B is coupled to second end portions of heaters 438A-L. Bus bars 690A,B electrically couple heaters 438A-L to cables 686, 688 and transformer 580. Bus bars 690A,B distribute power to heaters 438A-L. In certain embodiments, bus bars 690A,B are capable of carrying high currents with low losses. In some embodiments, bus bars 690A,B are made of superconducting material such as the superconductor material used in cables 686, 688. In some embodiments, bus bars 690A,B may include carbon nanotube conductors.

As shown in FIG. 124, heaters 438A-L are coupled to a single transformer 580. In certain embodiments, transformer 580 is a source of time-varying current. In certain embodiments, transformer 580 is an electrically isolated, single-phase transformer. In certain embodiments, transformer 580 provides power to heaters 438A-L from an isolated secondary phase of the transformer. First end portions of heaters 438A-L may be coupled to one side of transformer 580 while second end portions of the heaters are coupled to the opposite side of the transformer. Transformer 580 provides a substantially common voltage to the first end portions of heaters 438A-L and a substantially common voltage to the second end portions of heaters 438A-L. In certain embodiments, transformer 580 applies a voltage potential to the first end portions of heaters 438A-L that is opposite in polarity and substantially equal in magnitude to a voltage potential applied to the second end portions of the heaters. For example, a +660 V potential may be applied to the first end portions of heaters 438A-L and a −660 V potential applied to the second end portions of the heaters at a selected point on the wave of time-varying current (such as AC or modulated DC). Thus, the voltages at the two end portion of the heaters may be equal in magnitude and opposite in polarity with an average voltage that is substantially at ground potential.

Figure 125:
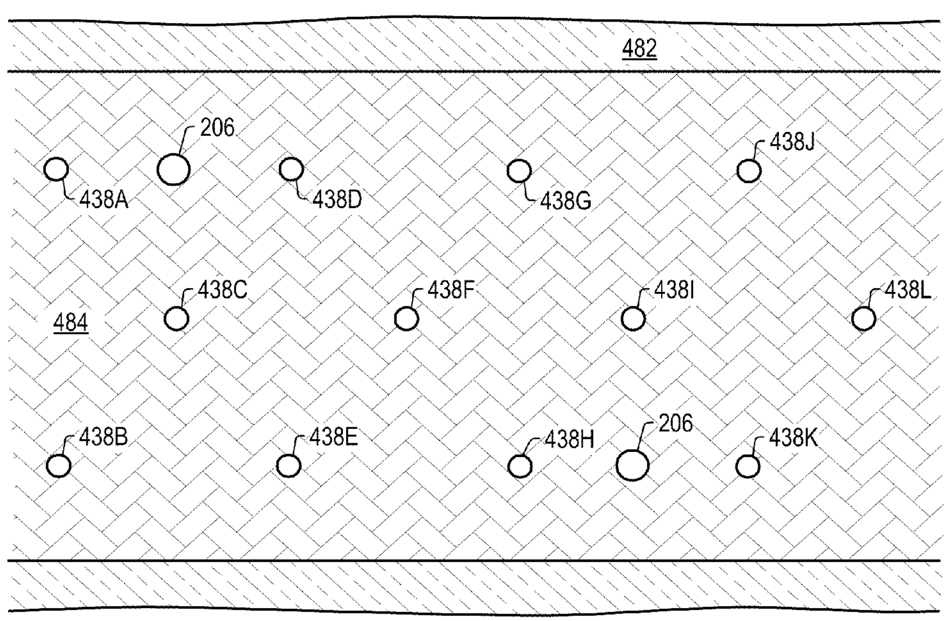

Applying the same voltage potentials to the end portions of all heaters 438A-L produces voltage potentials along the lengths of the heaters that are substantially the same along the lengths of the heaters. FIG. 125 depicts a cross-sectional representation, along a vertical plane, such as the plane A-A shown in FIG. 123, of substantially u-shaped heaters in a hydrocarbon layer. The voltage potential at the cross-sectional point shown in FIG. 125 along the length of heater 438A is substantially the same as the voltage potential at the corresponding cross-sectional points on heaters 438B-L. At lines equidistant between heater wellheads, the voltage potential is approximately zero. Other wells, such as production wells or monitoring wells, may be located along these zero voltage potential lines, if desired. Production wells 206 located close to the overburden may be used to transport formation fluid that is initially in a vapor phase to the surface. Production wells located close to a bottom of the heated portion of the formation may be used to transport formation fluid that is initially in a liquid phase to the surface.

In certain embodiments, the voltage potential at the midpoint of heaters 438A-L is about zero. Having similar voltage potentials along the lengths of heaters 438A-L inhibits current leakage between the heaters. Thus, there is little or no current flow in the formation and the heaters may have long lengths. Having the opposite polarity and substantially equal voltage potentials at the end portions of the heaters also halves the voltage applied at either end portion of the heater versus having one end portion of the heater grounded and one end portion at full potential. Reducing (halving) the voltage potential applied to an end portion of the heater generally reduces current leakage, reduces insulator requirements, and/or reduces arcing distances because of the lower voltage potential to ground applied at the end portions of the heaters.

Figure 126:
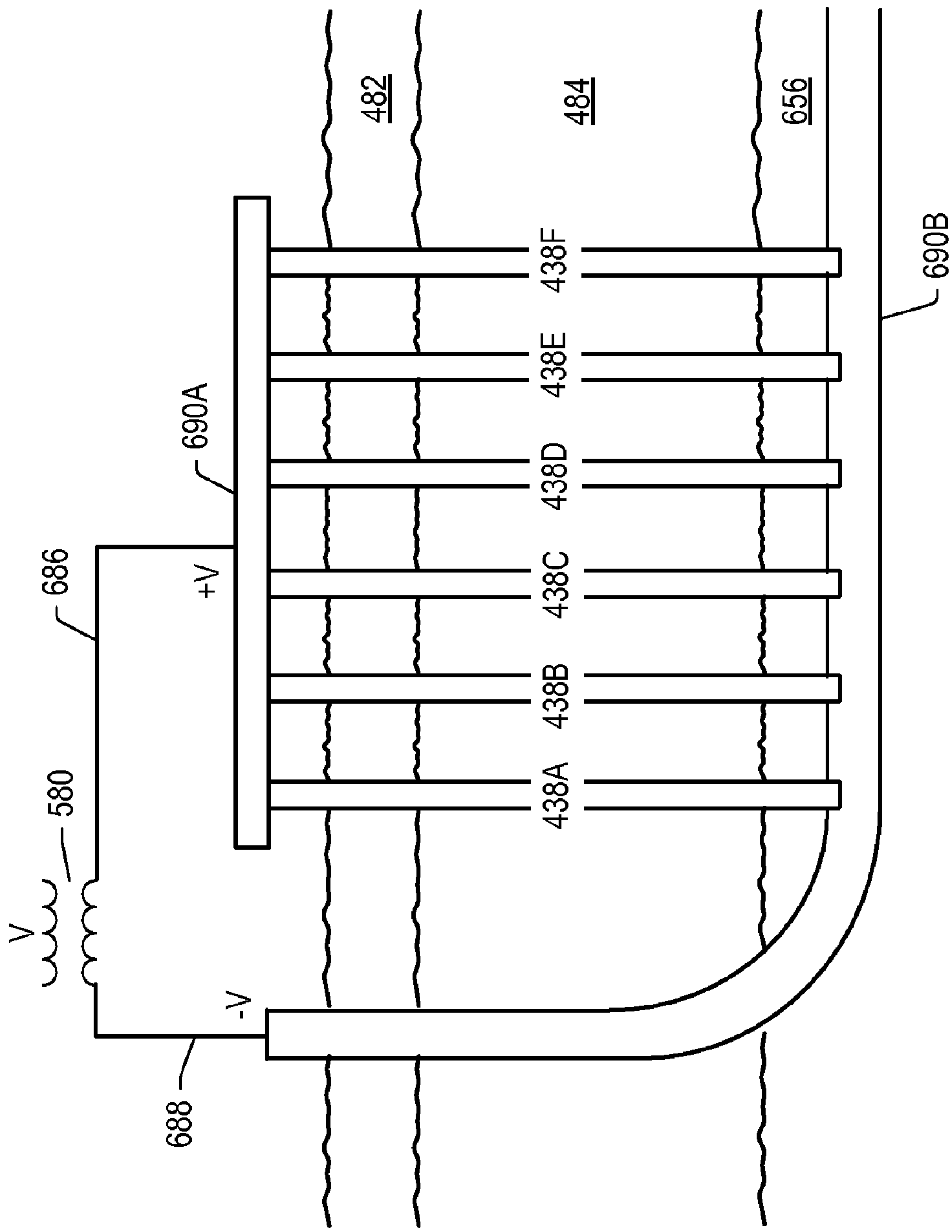

In certain embodiments, substantially vertical heaters are used to provide heat to the formation. Opposite polarity and substantially equal voltage potentials, as described above, may be applied to the end portions of the substantially vertical heaters. FIG. 126 depicts a side view representation of substantially vertical heaters coupled to a substantially horizontal wellbore. Heaters 438A, 438B, 438C, 438D, 438E, 438F are substantially vertical in hydrocarbon layer 484. First end portions of heaters 438A, 438B, 438C, 438D, 438E, 438F are coupled to bus bar 690A on a surface of the formation. Second end portions of heaters 438A, 438B, 438C, 438D, 438E, 438F are coupled to bus bar 690B in contacting section 656.

Bus bar 690B may be a bus bar located in a substantially horizontal wellbore in contacting section 656. Second end portions of heaters 438A, 438B, 438C, 438D, 438E, 438F may be coupled to bus bar 690B by any method described herein or any method known in the art. For example, containers with thermite powder are coupled to bus bar 690B (for example, by welding or brazing the containers to the bus bar), end portions of heaters 438A, 438B, 438C, 438D, 438E, 438F are placed inside the containers, and the thermite powder is activated to electrically couple the heaters to the bus bar. The containers may be coupled to bus bar 690B by, for example, placing the containers in holes or recesses in bus bar 690B or coupled to the outside of the bus bar and then brazing or welding the containers to the bus bar.

Bus bar 690A and bus bar 690B may be coupled to transformer 580 with cables 686, 688, as described above. Transformer 580 may provide voltages to bar 690A and bus bar 690B as described above for the embodiments depicted in FIGS. 123 and 124. For example, transformer 580 may apply a voltage potential to the first end portions of heaters 438A-F that is opposite in polarity and substantially equal in magnitude to a voltage potential applied to the second end portions of the heaters. Applying the same voltage potentials to the end portions of all heaters 438A-F may produce voltage potentials along the lengths of the heaters that are substantially the same along the lengths of the heaters. Applying the same voltage potentials to the end portions of all heaters 438A-F may inhibit current leakage between the heaters and/or into the formation. In some embodiments, heaters 438A-F are electrically coupled in pairs to the isolated delta winding on the secondary of a three-phase transformer.

In certain embodiments, it may be advantageous to allow some current leakage into the formation during early stages of heating to heat the formation at a faster rate. Current leakage from the heaters into the formation electrically heats the formation directly. The formation is heated by direct electrical heating in addition to conductive heat provided by the heaters. The formation (the hydrocarbon layer) may have an initial electrical resistance that averages at least 10 ohm m. In some embodiments, the formation has an initial electrical resistance of at least 100 ohm·m or of at least 300 ohm·m. Direct electrical heating is achieved by having opposite potentials applied to adjacent heaters in the hydrocarbon layer. Current may be allowed to leak into the formation until a selected temperature is reached in the heaters or in the formation. The selected temperature may be below or near the temperature that water proximate one or more heaters boils off. After water boils off, the hydrocarbon layer is substantially electrically isolated from the heaters and direct heating of the formation is inefficient. After the selected temperature is reached, the voltage potential is applied in the opposite polarity and substantially equal magnitude manner described above for FIGS. 123 and 124 so that adjacent heaters will have the same voltage potential along their lengths.

Current is allowed to leak into the formation by reversing the polarity of one or more heaters shown in FIG. 124 so that a first group of heaters has a positive voltage potential at first location 664 and a second group of heaters has a negative voltage potential at the first location. The first end portions, at first location 664, of a first group of heaters (for example, heaters 438A, 438B, 438D, 438E, 438G, 438H, 438J, 438K, depicted in FIG. 124) are applied with a positive voltage potential that is substantially equal in magnitude to a negative voltage potential applied to the second end portions, at second location 668, of the first group of heaters. The first end portions, at first location 664, of the second group of heaters (for example, heaters 438C, 438F, 438I, 438L) are applied with a negative voltage potential that is substantially equal in magnitude to the positive voltage potential applied to the first end portions of the first group of heaters. Similarly, the second end portions, at second location 668, of the second group of heaters are applied with a positive voltage potential substantially equal in magnitude to the negative potential applied to the second end portions of the first group of heaters. After the selected temperature is reached, the first end portions of both groups of heaters are applied with voltage potential that is opposite in polarity and substantially similar in magnitude to the voltage potential applied to the second end portions of both groups of heaters.

In some embodiments, the heating elements have thin electrically insulating material to inhibit current leakage from the heating elements. In some embodiments, the thin electrically insulating layer is aluminum oxide or thermal spray coated aluminum oxide. In some embodiments, the thin electrically insulating layer is an enamel coating of a ceramic composition. The thin electrically insulating layer may inhibit heating elements of a three-phase heater from leaking current between the elements, from leaking current into the formation, and from leaking current to other heaters in the formation. Thus, the three-phase heater may have a longer heater length.

In certain embodiments, a plurality of substantially horizontal (or inclined) heaters are coupled to a single substantially horizontal bus bar in the subsurface formation. Having the plurality of substantially horizontal heaters connected to a single bus bar in the subsurface reduces the overall footprint of heaters on the surface of the formation and the number of wells drilled in the formation. In addition, the amount of subsurface space used to couple the heaters may be minimized so that more of the formation is treated with heat to recover hydrocarbons (for example, there is less unheated depth in the formation). The number and spacing of heaters coupled to the single bus bar may be varied depending on factors such as, but not limited to, size of the treatment area, vertical thickness of the formation, heating requirements for the formation, number of layers in the formation, and capacity limitations of the surface power supply.

Figure 127:
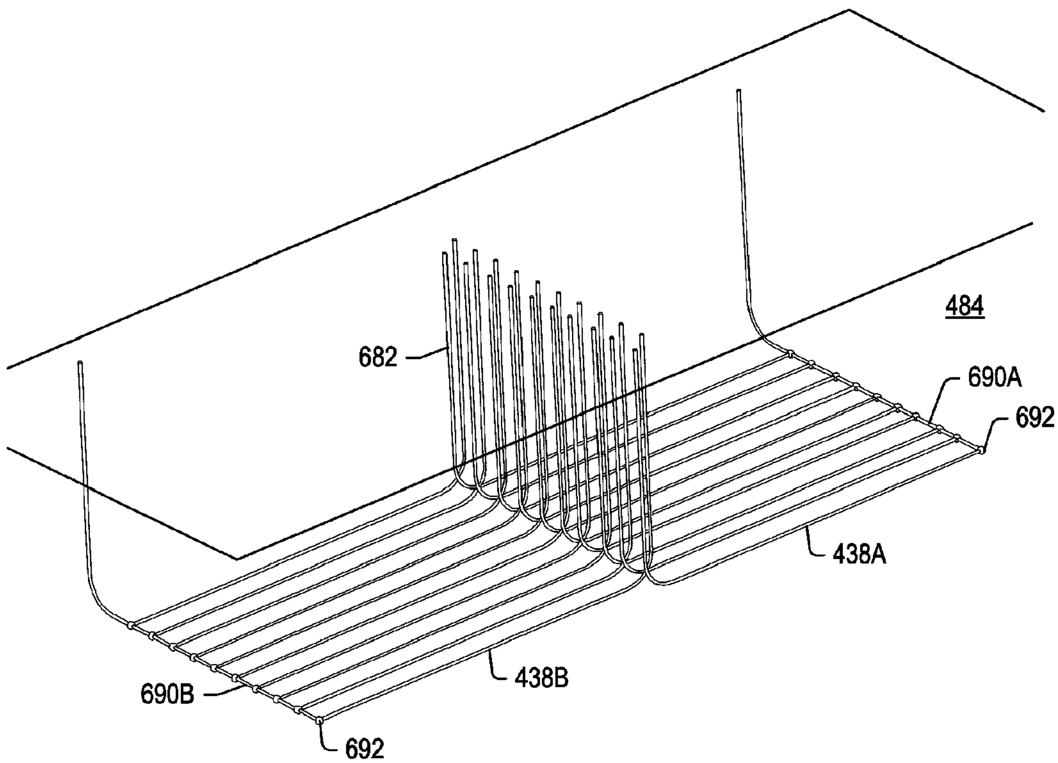

FIG. 127 depicts an embodiment of pluralities of substantially horizontal heaters 438A,B coupled to bus bars 690A,B in hydrocarbon layer 484. Heaters 438A,B have sections 682 in the overburden of hydrocarbon layer 484. Sections 682 may include high electrical conductivity, low thermal loss electrical conductors such as copper or copper clad carbon steel. Heaters 438A,B enter hydrocarbon layer 484 with substantially vertical sections and then redirect so that the heaters have substantially horizontal sections in hydrocarbon layer 484. The substantially horizontal sections of heaters 438A,B in hydrocarbon layer 484 may provide the majority of the heat to the hydrocarbon layer. Heaters 438A,B may be coupled to bus bars 690A,B, which are located distant from each other in the formation while being substantially parallel to each other.

In certain embodiments, heaters 438A,B include exposed metal heating elements. In certain embodiments, heaters 438A,B include exposed metal temperature limited heating elements. The heating elements may include ferromagnetic materials such as 9% by weight to 13% by weight chromium stainless steel like 410 stainless steel, chromium stainless steels such as T/P91 or T/P92, 409 stainless steel, VM12 (Vallourec and Mannesmann Tubes, France) or iron-cobalt alloys for use as temperature limited heaters. In some embodiments, the heating elements are composite temperature limited heating elements such as 410 stainless steel and copper composite heating elements or 347H, iron, copper composite heating elements. The substantially horizontal sections of heaters 438A,B in hydrocarbon layer 484 may have lengths of at least about 100 m, at least about 500 m, or at least about 1000 m, up to lengths of about 6000 m.

In some embodiments, two groups of heaters 438A,B enter the subsurface near each other and then branch away from each other in hydrocarbon layer 484. Having the surface portions of more than one group of heaters located near each other creates less of a surface footprint of the heaters and allows a single group of surface facilities to be used for both groups of heaters.

In certain embodiments, the groups of heaters 438A or 438B are each coupled to a single transformer. In some embodiments, three heaters in the groups are coupled in a triad configuration (each heater is coupled to one of the phases (A, B, or C) of a three phase transformer and the bus bar is coupled to the neutral, or center point, of the transformer). Each phase of the three-phase transformer may be coupled to more than one heater in each group of heaters (for example, phase A may be coupled to 5 heaters in the group of heaters 438A). In some embodiments, the heaters are coupled to a single phase transformer (either in series or in parallel configurations).

Figure 128:
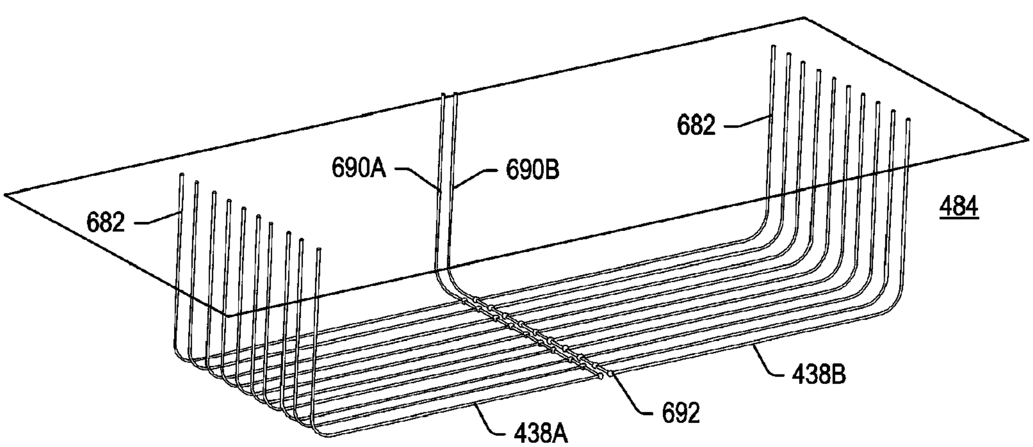

FIG. 128 depicts an embodiment of pluralities of substantially horizontal heaters 438A,B coupled to bus bars 690A,B in hydrocarbon layer 484. In such an embodiment, two groups of heaters 438A,B enter the formation at distal locations on the surface of the formation. Heaters 438A,B branch towards each other in hydrocarbon layer 484 so that the ends of the heaters are directed towards each other. Heaters 438A,B may be coupled to bus bars 690A,B, which are located proximate each other and substantially parallel to each other. Bus bars 690A,B may enter the subsurface in proximity to each other so that the footprint of the bus bars on the surface is small.

In certain embodiments, heaters 438A,B are coupled to a single phase transformer in series or parallel. The heaters may be coupled so that the polarity (direction of current flow) alternates in the row of heaters so that each heater has a polarity opposite the heater adjacent to it. Additionally, heaters 438A,B and bus bars 690A,B may be electrically coupled such that the bus bars are opposite in polarity from each other (the current flows in opposite directions at any point in time in each bus bar). Coupling the heaters and the bus bars in such a manner inhibits current leakage into and/or through the formation.

As shown in FIGS. 127 and 128, heaters 438A may be electrically coupled to bus bar 690A and heaters 438B may be electrically coupled to bus bar 690B. Bus bars 690A,B may electrically couple to the ends of heaters 438A,B and be a return or neutral connection for the heaters with bus bar 690A being the neutral connection for heaters 438A and bus bar 690B being the neutral connection for heaters 438B. Bus bars 690A,B may be located in wellbores that are formed substantially perpendicular to the path of wellbores with heaters 438A,B, as shown in FIG. 127. Directional drilling and/or magnetic steering may be used so that the wells for bus bars 690A,B and the wellbores for heaters 438A,B intersect.

In certain embodiments, heaters 438A,B are coupled to bus bars 690A,B using "mousetrap" type connectors 692. In some embodiments, other couplings, such as those described herein or known in the art, are used to couple heaters 438A,B to bus bars 690A,B. For example, a molten metal or a liquid conducting fluid may fill up the connection space (in the wellbores) to electrically couple the heaters and the bus bars.

Figure 129:
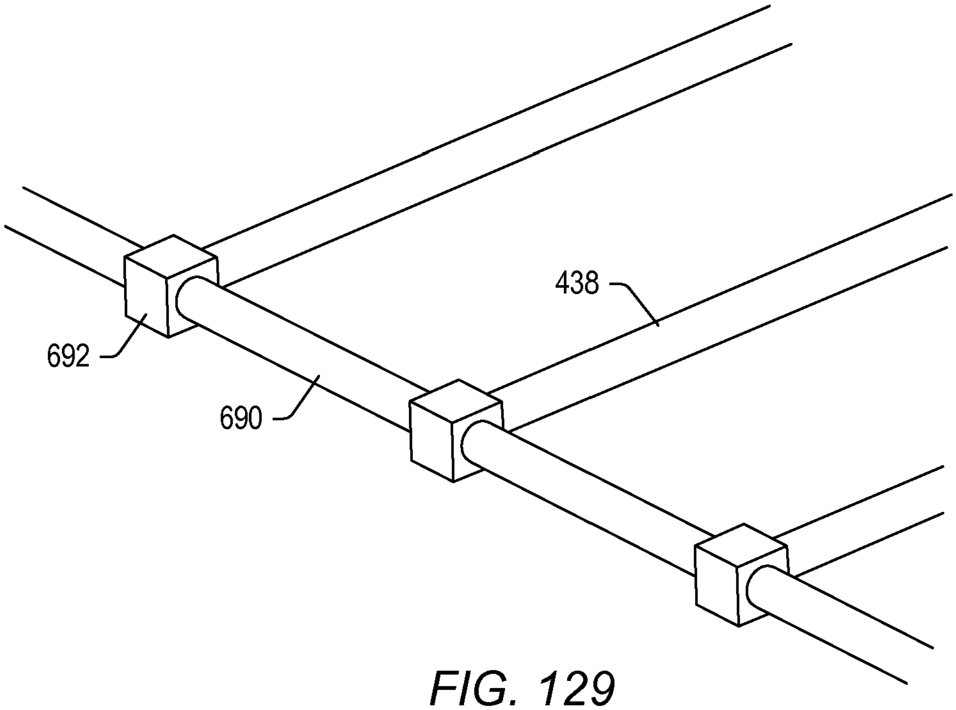

FIG. 129 depicts an enlarged view of an embodiment of bus bar 690 coupled to heaters 438 with connectors 692. In certain embodiments, bus bar 690 includes carbon steel or other electrically conducting metals. In some embodiments, a high electrical conductivity conductor or metal is coupled to or included in bus bar 690. For example, bus bar 690 may include carbon steel with copper cladded to the carbon steel.

Figure 130:
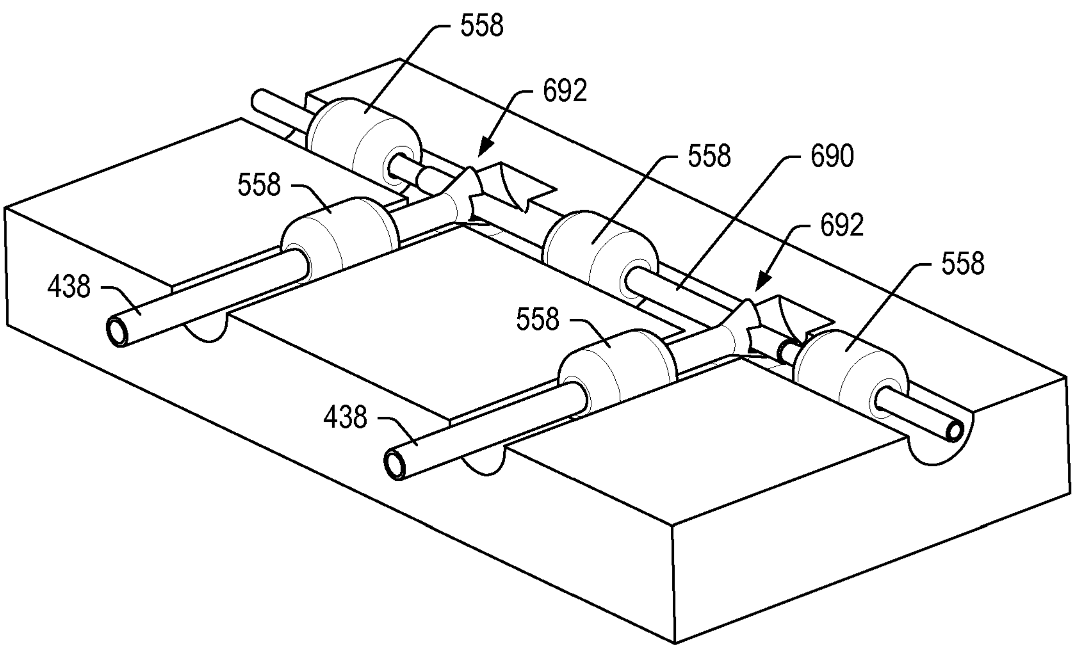

In some embodiments, a centralizer or other centralizing device is used to locate or guide heaters 438 and/or bus bars 690 so that the heaters and bus bars can be coupled. FIG. 130 depicts an enlarged view of an embodiment of bus bar 690 coupled to heater 438 with connectors 692 and centralizers 558. Centralizers 558 may locate heater 438 and/or bus bar 690 so that connectors 692 easily couple the heater and the bus bar. Centralizers 558 may ensure proper spacing of heater 438 and/or bus bar 690 so that the heater and the bus bar can be coupled with connectors 692. Centralizers 558 may inhibit heater 438 and/or bus bar 690 from contacting the sides of the wellbores at or near connectors 692.

Figure 131:
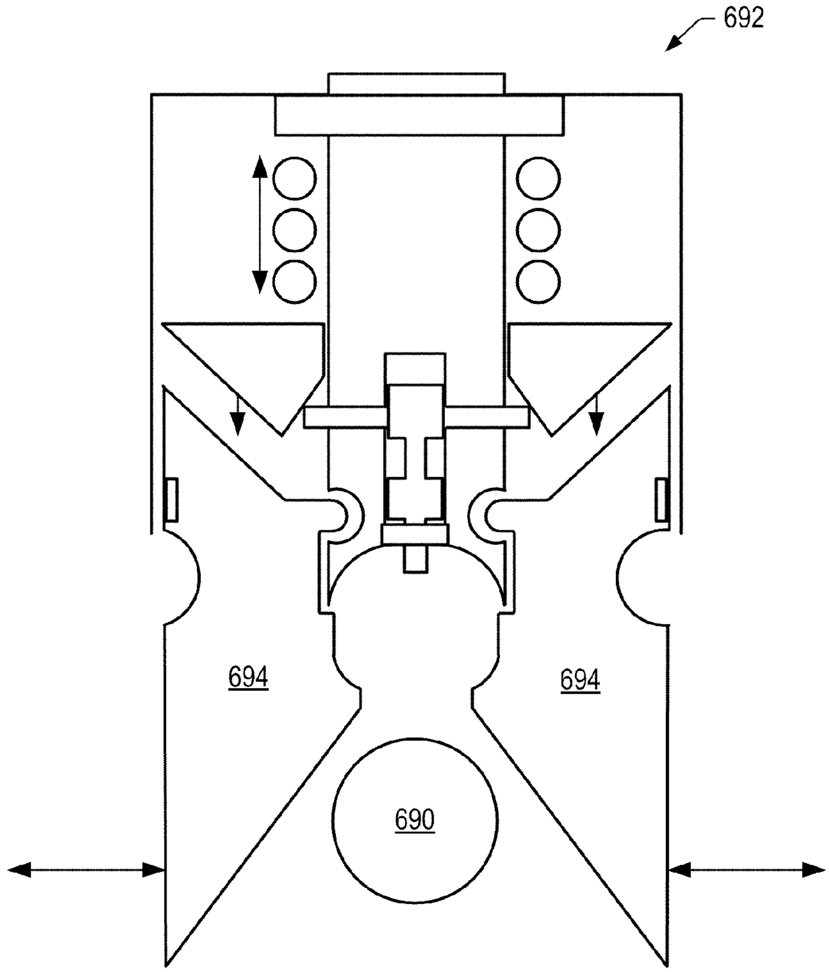
Figure 132:
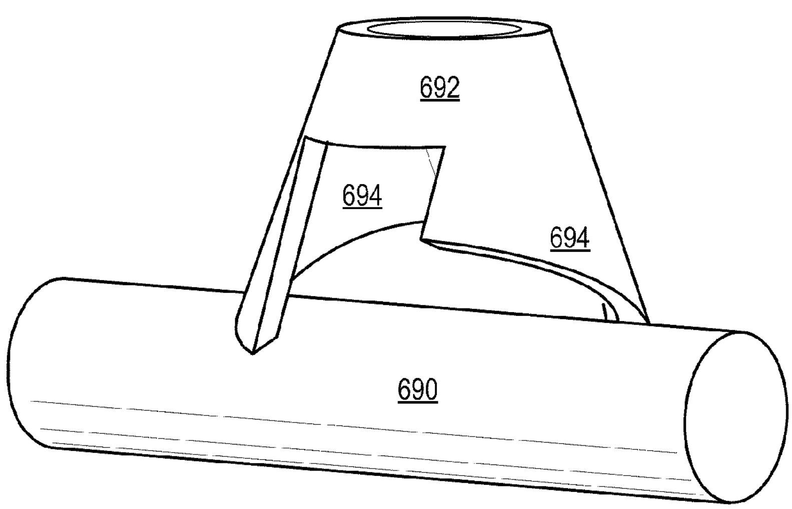

FIG. 131 depicts a cross-sectional representation of connector 692 coupling to bus bar 690. FIG. 132 depicts a perspective representation of connector 692 coupling to bus bar 690. Connectors 692 are shown in proximity to bus bar 690 (before the connector clamps around the bus bar). Connector 692 is connected or directly attached to the heater so that the connector is rotatable around the end of the heater while maintaining electrical contact with the heater. In some embodiments, the connector and the end of the heater are twisted into position to align with the bus bar. Connector 692 includes collets 694. Collets 694 are shaped (for example, diagonally cut or helically profiled) so that as the connector is pushed onto bus bar 690, the shape of the collets rotates the head of the connector as the collets slide over the bus bar. Collets 694 may be spring loaded so that the collets hold down against bus bar 690 after the collets slide over the bus bar. Thus, connector 692 clamps to bus bar 690 using collets 694. Connector 692, including collets 694, is made of electrically conductive materials so that the connector electrically couples bus bar 690 to the heater attached to the connector.

In some embodiments, an explosive element is added to connectors 692, such as the connectors shown in FIGS. 131 and 132. Connector 692 is used to position bus bar 690 and the heater in proper positions for explosive bonding of the bus bar to the heater. The explosive element may be located on connector 692. For example, the explosive element may be located on one or both of collets 694. The explosive element may be used to explosively bond connector 692 to bus bar 690 so that the heater is metallically bonded to the bus bar.

In some embodiment, the explosive bonding is applied along the axial direction of bus bar 690. In some embodiments, the explosive bonding process is a self cleaning process. For example, the explosive bonding process may drive out air and/or debris from between components during the explosion. In some embodiments, the explosive element is a shape charge explosive element. Using the shape charge element may focus the explosive energy in a desired direction.

Figure 133:
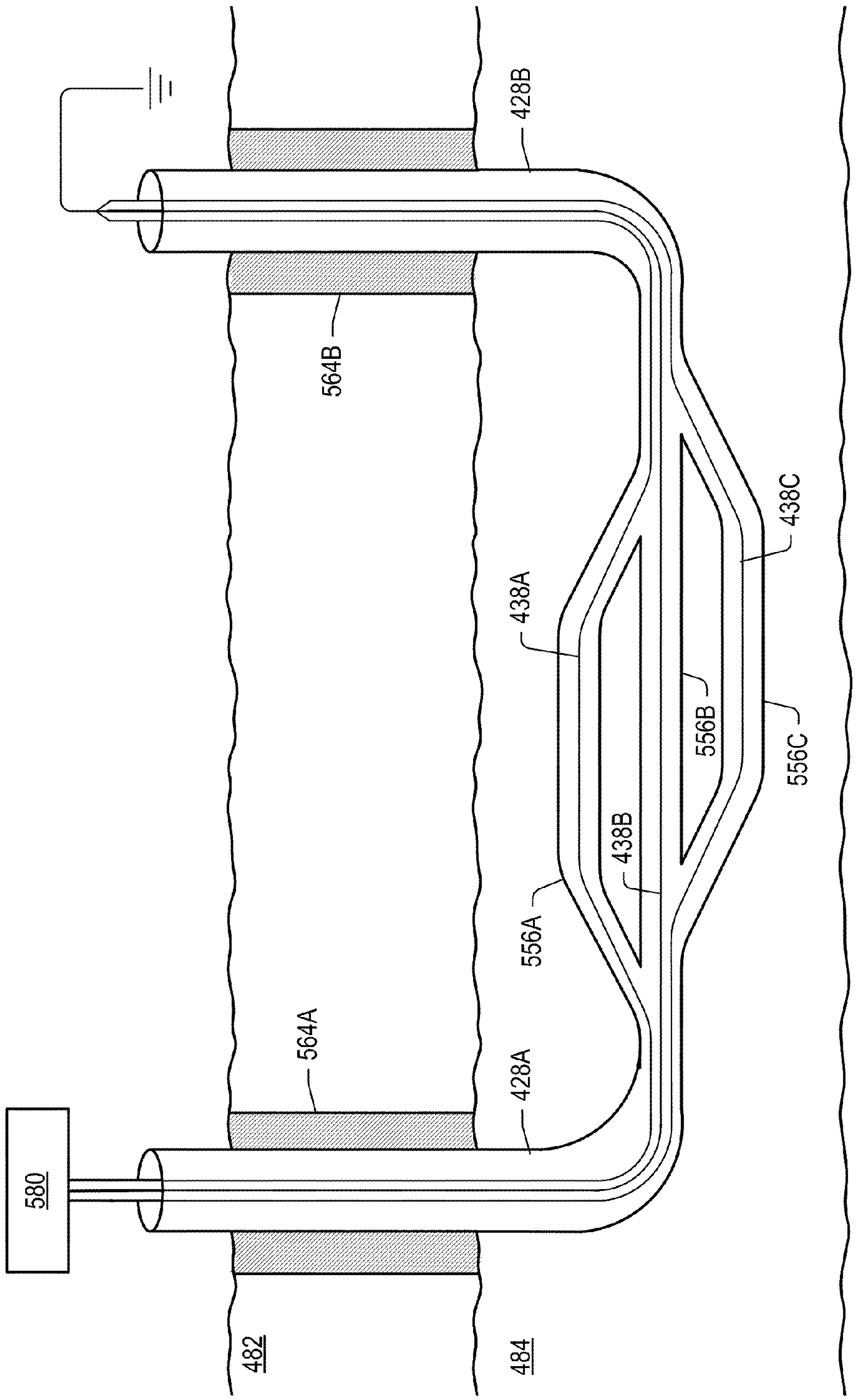

FIG. 133 depicts an embodiment of three u-shaped heaters with common overburden sections coupled to a single three-phase transformer. In certain embodiments, heaters 438A, 438B, 438C are exposed metal heaters. In some embodiments, heaters 438A, 438B, 438C are exposed metal heaters with a thin, electrically insulating coating on the heaters. For example, heaters 438A, 438B, 438C may be 410 stainless steel, carbon steel, 347H stainless steel, or other corrosion resistant stainless steel rods or tubulars (such as 2.5 cm or 3.2 cm diameter rods). The rods or tubulars may have porcelain enamel coatings on the exterior of the rods to electrically insulate the rods.

In some embodiments, heaters 438A, 438B, 438C are insulated conductor heaters. In some embodiments, heaters 438A, 438B, 438C are conductor-in-conduit heaters. Heaters 438A, 438B, 438C may have substantially parallel heating sections in hydrocarbon layer 484. Heaters 438A, 438B, 438C may be substantially horizontal or at an incline in hydrocarbon layer

484. In some embodiments, heaters 438A, 438B, 438C enter the formation through common wellbore 428A. Heaters 438A, 438B, 438C may exit the formation through common wellbore 428B. In certain embodiments, wellbores 428A, 428B are uncased (for example, open wellbores) in hydrocarbon layer 484.

Openings 556A, 556B, 556C span between wellbore 428A and wellbore 428B. Openings 556A, 556B, 556C may be uncased openings in hydrocarbon layer 484. In certain embodiments, openings 556A, 556B, 556C are formed by drilling from wellbore 428A and/or wellbore 428B. In some embodiments, openings 556A, 556B, 556C are formed by drilling from each wellbore 428A and 428B and connecting at or near the middle of the openings. Drilling from both sides towards the middle of hydrocarbon layer 484 allows longer openings to be formed in the hydrocarbon layer. Thus, longer heaters may be installed in hydrocarbon layer 484. For example, heaters 438A, 438B, 438C may have lengths of at least about 1500 m, at least about 3000 m, or at least about 4500 m.

Having multiple long, substantially horizontal or inclined heaters extending from only two wellbores in hydrocarbon layer 484 reduces the footprint of wells on the surface needed for heating the formation. The number of overburden wellbores that need to be drilled in the formation is reduced, which reduces capital costs per heater in the formation. Heating the formation with long, substantially horizontal or inclined heaters also reduces overall heat losses in overburden 482 when heating the formation because of the reduced number of overburden sections used to treat the formation (for example, losses in overburden 482 are a smaller fraction of total power supplied to the formation).

In some embodiments, heaters 438A, 438B, 438C are installed in wellbores 428A, 428B and openings 556A, 556B, 556C by pulling the heaters through the wellbores and the openings from one end to the other. For example, an installation tool may be pushed through the openings and coupled to a heater in wellbore 428A. The heater may then be pulled through the openings towards wellbore 428B using the installation tool. The heater may be coupled to the installation tool using a connector such as a claw, a catcher, or other devices known in the art.

In some embodiments, the first half of an opening is drilled from wellbore 428A and then the second half of the opening is drilled from wellbore 428B through the first half of the opening. The drill bit may be pushed through to wellbore 428A and a first heater may be coupled to the drill bit to pull the first heater back through the opening and install the first heater in the opening. The first heater may be coupled to the drill bit using a connector such as a claw, a catcher, or other devices known in the art.

Figure 134:
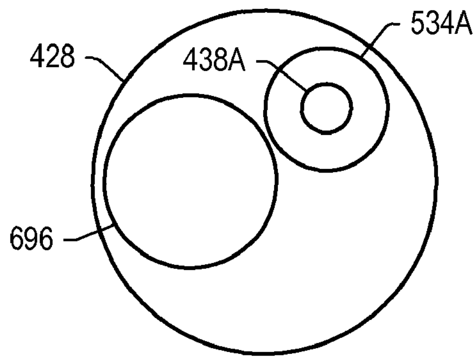

After the first heater is installed, a tube or other guide may be placed in wellbore 428A and/or wellbore 428B to guide drilling of a second opening. FIG. 134 depicts a top view of an embodiment of heater 438A and drilling guide 696 in wellbore 428. Drilling guide 696 may be used to guide the drilling of the second opening in the formation and the installation of a second heater in the second opening. Insulator 534A may electrically and mechanically insulate heater 438A from drilling guide 696. Drilling guide 696 and insulator 534A may protect heater 438A from being damaged while the second opening is being drilled and the second heater is being installed.

Figure 135:
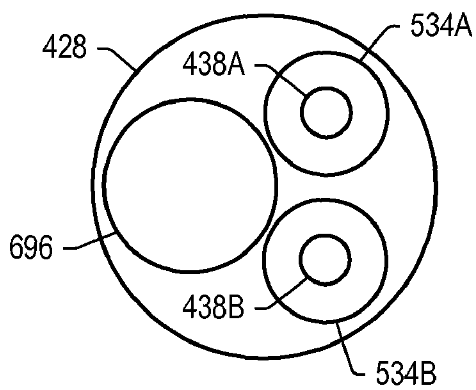

After the second heater is installed, drilling guide 696 may be placed in wellbore 428 to guide drilling of a third opening, as shown in FIG. 135. Drilling guide 696 may be used to guide the drilling of the third opening in the formation and the installation of a third heater in the third opening. Insulators 534A and 534B may electrically and mechanically insulate heaters 438A and 438B, respectively, from drilling guide 696. Drilling guide 696 and insulators 534A and 534B may protect heaters 438A and 438B from being damaged while the third opening is being drilled and the third heater is being installed. After the third heater is installed, insulators 534A and 534B may be removed and a centralizer may be placed in wellbore 428 to separate and space heaters 438A, 438B, 438C. FIG. 136 depicts heaters 438A, 438B, 438C in wellbore 428 separated by centralizer 558.

In some embodiments, all the openings are formed in the formation and then the heaters are installed in the formation. In certain embodiments, one of the openings is formed and one of the heaters is installed in the formation before the other openings are formed and the other heaters are installed. The first installed heater may be used as a guide during the formation of additional openings. The first installed heater may be energized to produce an electromagnetic field that is used to guide the formation of the other openings. For example, the first installed heater may be energized with a bipolar DC current to magnetically guide drilling of the other openings.

In certain embodiments, heaters 438A, 438B, 438C are coupled to a single three-phase transformer 580 at one end of the heaters, as shown in FIG. 133. Heaters 438A, 438B, 438C may be electrically coupled in a triad configuration. In some embodiments, two heaters are coupled together in a diad configuration. Transformer 580 may be a three-phase wye transformer. The heaters may each be coupled to one phase of transformer 580. Using three-phase power to power the heaters may be more efficient than using single-phase power. Using three-phase connections for the heaters allows the magnetic fields of the heaters in wellbore 428A to cancel each other. The cancelled magnetic fields may allow overburden casing 564A to be ferromagnetic (for example, carbon steel). Using ferromagnetic casings in the wellbores may be less expensive and/or easier to install than non-ferromagnetic casings (such as fiberglass casings).

In some embodiments, the overburden section of heaters 438A, 438B, 438C are coated with an insulator, such as a polymer or an enamel coating, to inhibit shorting between the overburden sections of the heaters. In some embodiments, only the overburden sections of the heaters in wellbore 428A are coated with the insulator as the heater sections in wellbore 428B may not have significant electrical losses. In some embodiments, ends or end portions (portions at, near, or in the vicinity of the ends) of heaters 438A, 438B, 438C in wellbore 428A are at least one diameter of the heaters away from overburden casing 564A so that no insulator is needed. The ends or end portions of heaters 438A, 438B, 438C may be, for example, centralized in wellbore 428A using a centralizer to keep the heaters the desired distance away from overburden casing 564A.

In some embodiments, the ends or end portions of heaters 438A, 438B, 438C passing through wellbore 428B are electrically coupled together and grounded outside of the wellbore, as shown in FIG. 133. The magnetic fields of the heaters may cancel each other in wellbore 428B. Thus, overburden casing 564B may be ferromagnetic (for example, carbon steel). In certain embodiments, the overburden section of heaters 438A, 438B, 438C are copper rods or tubulars. The build sections of the heaters (the transition sections between the overburden sections and the heating sections) may also be made of copper or similar electrically conductive material.

In some embodiments, the ends or end portions of heaters 438A, 438B, 438C passing through wellbore 428B are electrically coupled together inside the wellbore. The ends or end portions of the heaters may be coupled inside the wellbore at or near the bottom of overburden 482. Coupling the heaters together at or near overburden 482 reduces electrical losses in the overburden section of the wellbore.

FIG. 137 depicts an embodiment for coupling ends or end portions of heaters 438A, 438B, 438C in wellbore 428B. Plate 698 may be located at or near the bottom of the overburden section of wellbore 428B. Plate 698 may have openings sized to allow heaters 438A, 438B, 438C to be inserted through the plate. Plate 698 may be slid down heaters 438A, 438B, 438C into position in wellbore 428B. Plate 698 may be made of copper or another electrically conductive material.

Balls 700 may be placed into the overburden section of wellbore 428B. Plate 698 may allow balls 700 to settle in the overburden section of wellbore 428B around heaters 438A, 438B, 438C. Balls 700 may be made of electrically conductive material such as copper or nickel-plated copper. Balls 700 and plate 698 may electrically couple heaters 438A, 438B, 438C to each other so that the heaters are grounded. In some embodiments, portions of the heaters above plate 698 (the overburden sections of the heaters) are made of carbon steel while portions of the heaters below the plate (build sections of the heaters) are made of copper.

In some embodiments, heaters 438A, 438B, 438C, as depicted in FIG. 133, provide varying heat outputs along the lengths of the heaters. For example, heaters 438A, 438B, 438C may have varying dimensions (for example, thicknesses or diameters) along the lengths of the heater. The varying thicknesses may provide different electrical resistances along the length of the heater and, thus, different heat outputs along the length of the heaters.

In some embodiments, heaters 438A, 438B, 438C are divided into two or more sections of heating. In some embodiments, the heaters are divided into repeating sections of different heat outputs (for example, alternating sections of two different heat outputs that are repeated). In some embodiments, the repeating sections of different heat outputs may be used to heat the formation in stages. In one embodiment, the halves of the heaters closest to wellbore 428A may provide heat in a first section of hydrocarbon layer 484 and the halves of the heaters closest to wellbore 428B may provide heat in a second section of hydrocarbon layer 484. Hydrocarbons in the formation may be mobilized by the heat provided in the first section. Hydrocarbons in the second section may be heated to higher temperatures than the first section to upgrade the hydrocarbons in the second section (for example, the hydrocarbons may be further mobilized and/or pyrolyzed). Hydrocarbons from the first section may move, or be moved, into the second section for the upgrading. For example, a drive fluid may be provided through wellbore 428A to move the first section mobilized hydrocarbons to the second section.

In some embodiments, more than three heaters extend from wellbore 428A and/or 428B. If multiples of three heaters extend from the wellbores and are coupled to transformer 580, the magnetic fields may cancel in the overburden sections of the wellbores as in the case of three heaters in the wellbores. For example, six heaters may be coupled to transformer 580 with two heaters coupled to each phase of the transformer to cancel the magnetic fields in the wellbores.

In some embodiments, multiple heaters extend from one wellbore in different directions. FIG. 138 depicts a schematic of an embodiment of multiple heaters extending in different directions from wellbore 428A. Heaters 438A, 438B, 438C may extend to wellbore 428B. Heaters 438D, 438E, 438F may extend to wellbore 428C in the opposite direction of heaters 438A, 438B, 438C. Heaters 438A, 438B, 438C and heaters 438D, 438E, 438F may be coupled to a single, three-phase transformer so that magnetic fields are cancelled in wellbore 428A.

In some embodiments, heaters 438A, 438B, 438C may have different heat outputs from heaters 438D, 438E, 438F so that hydrocarbon layer 484 is divided into two heating sections with different heating rates and/or temperatures (for example, a mobilization and a pyrolyzation section). In some embodiments, heaters 438A, 438B, 438C and/or heaters 438D, 438E, 438F may have heat outputs that vary along the lengths of the heaters to further divide hydrocarbon layer 484 into more heating sections. In some embodiments, additional heaters may extend from wellbore 428B and/or wellbore 428C to other wellbores in the formation as shown by the dashed lines in FIG. 138.

In some embodiments, multiple levels of heaters extend between two wellbores. FIG. 139 depicts a schematic of an embodiment of multiple levels of heaters extending between wellbore 428A and wellbore 428B. Heaters 438A, 438B, 438C may provide heat to a first level of hydrocarbon layer 484. Heaters 438D, 438E, 438F may branch off and provide heat to a second level of hydrocarbon layer 484. Heaters 438G, 438H, 438I may further branch off and provide heat to a third level of hydrocarbon layer 484. In some embodiments, heaters 438A, 438B, 438C, heaters 438D, 438E, 438F, and heaters 438G, 438H, 438I provide heat to levels in the formation with different properties. For example, the different groups of heaters may provide different heat outputs to levels with different properties in the formation so that the levels are heated at or about the same rate.

In some embodiments, the levels are heated at different rates to create different heating zones in the formation. For example, the first level (heated by heaters 438A, 438B, 438C) may be heated so that hydrocarbons are mobilized, the second level (heated by heaters 438D, 438E, 438F) may be heated so that hydrocarbons are somewhat upgraded from the first level, and the third level (heated by heaters 438G, 438H, 438I) may be heated to pyrolyze hydrocarbons. As another example, the first level may be heated to create gases and/or drive fluid in the first level and either the second level or the third level may be heated to mobilize and/or pyrolyze fluids or just to a level to allow production in the level. In addition, heaters 438A, 438B, 438C, heaters 438D, 438E, 438F, and/or heaters 438G, 438H, 438I may have heat outputs that vary along the lengths of the heaters to further divide hydrocarbon layer 484 into more heating sections.

FIG. 140 depicts a schematic of an embodiment of a u-shaped heater that has an inductively energized tubular. Heater 438 includes electrical conductor 572 and tubular 702 in an opening that spans between wellbore 428A and wellbore 428B. In certain embodiments, electrical conductor 572 and/or the current carrying portion of the electrical conductor is electrically insulated from tubular 702. Electrical conductor 572 and/or the current carrying portion of the electrical conductor is electrically insulated from tubular 702 such that electrical current does not flow from the electrical conductor to the tubular, or vice versa (for example, the tubular is not directly connected electrically to the electrical conductor).

In some embodiments, electrical conductor 572 is centralized inside tubular 702 (for example, using centralizers 558 or other support structures, as shown in FIG. 141). Centralizers 558 may electrically insulate electrical conductor 572 from tubular 702. In some embodiments, tubular 702 contacts electrical conductor 572. For example, tubular 702 may hang, drape, or otherwise touch electrical conductor 572. In some embodiments, electrical conductor 572 includes electrical insulation (for example, magnesium oxide or porcelain enamel) that insulates the current carrying portion of the electrical conductor from tubular 702. The electrical insulation inhibits current from flowing between the current carrying portion of electrical conductor 572 and tubular 702 if the electrical conductor and the tubular are in physical contact with each other.

In some embodiments, electrical conductor 572 is an exposed metal conductor heater or a conductor-in-conduit heater. In certain embodiments, electrical conductor 572 is an insulated conductor such as a mineral insulated conductor. The insulated conductor may have a copper core, copper alloy core, or a similar electrically conductive, low resistance core that has low electrical losses. In some embodiments, the core is a copper core with a diameter between about 0.5" (1.27 cm) and about 1" (2.54 cm). The sheath or jacket of the insulated conductor may be a non-ferromagnetic, corrosion resistant steel such as 347 stainless steel, 625 stainless steel, 825 stainless steel, 304 stainless steel, or copper with a protective layer (for example, a protective cladding). The sheath may have an outer diameter of between about 1" (2.54 cm) and about 1.25" (3.18 cm).

In some embodiments, the sheath or jacket of the insulated conductor is in physical contact with the tubular 702 (for example, the tubular is in physical contact with the sheath along the length of the tubular) or the sheath is electrically connected to the tubular. In such embodiments, the electrical insulation of the insulated conductor electrically insulates the core of the insulated conductor from the jacket and the tubular. FIG. 142 depicts an embodiment of an induction heater with the sheath of an insulated conductor in electrical contact with tubular 702. Electrical conductor 572 is the insulated conductor. The sheath of the insulated conductor is electrically connected to tubular 702 using electrical contactors 704. In some embodiments, electrical contactors 704 are sliding contactors. In certain embodiments, electrical contactors 704 electrically connect the sheath of the insulated conductor to tubular 702 at or near the ends of the tubular. Electrically connecting at or near the ends of tubular 702 substantially equalizes the voltage along the tubular with the voltage along the sheath of the insulated conductor. Equalizing the voltages along tubular 702 and along the sheath may inhibit arcing between the tubular and the sheath.

Tubular 702, such as the tubular shown in FIGS. 140, 141, and 142, may be ferromagnetic or include ferromagnetic materials. Tubular 702 may have a thickness such that when electrical conductor 572 induces electrical current flow on the surfaces of tubular 702 when the electrical conductor is energized with time-varying current. The electrical conductor induces electrical current flow due to the ferromagnetic properties of the tubular. Current flow is induced on both the inside surface of the tubular and the outside surface of tubular 702. Tubular 702 may operate as a skin effect heater when current flow is induced in the skin depth of one or more of the tubular surfaces. In certain embodiments, the induced current circulates axially (longitudinally) on the inside and/or outside surfaces of tubular 702. Longitudinal flow of current through electrical conductor 572 induces primarily longitudinal current flow in tubular 702 (the majority of the induced current flow is in the longitudinal direction in the tubular). Having primarily longitudinal induced current flow in tubular 702 may provide a higher resistance per foot than if the induced current flow is primarily angular current flow.

In certain embodiments, current flow in tubular 702 is induced with low frequency current in electrical conductor 572 (for example, from 50 Hz or 60 Hz up to about 1000 Hz). In some embodiments, induced currents on the inside and outside surfaces of tubular 702 are substantially equal.

In certain embodiments, tubular 702 has a thickness that is greater than the skin depth of the ferromagnetic material in the tubular at or near the Curie temperature of the ferromagnetic material or at or near the phase transformation temperature of the ferromagnetic material. For example, tubular 702 may have a thickness of at least 2.1, at least 2.5 times, at least 3 times, or at least 4 times the skin depth of the ferromagnetic material in the tubular near the Curie temperature or the phase transformation temperature of the ferromagnetic material. In certain embodiments, tubular 702 has a thickness of at least 2.1 times, at least 2.5 times, at least 3 times, or at least 4 times the skin depth of the ferromagnetic material in the tubular at about 50° C. below the Curie temperature or the phase transformation temperature of the ferromagnetic material.

In certain embodiments, tubular 702 is carbon steel. In some embodiments, tubular 702 is coated with a corrosion resistant coating (for example, porcelain or ceramic coating) and/or an electrically insulating coating. In some embodiments, electrical conductor 572 has an electrically insulating coating. Examples of the electrically insulating coating on tubular 702 and/or electrical conductor 572 include, but are not limited to, a porcelain enamel coating, an alumina coating, or an alumina-titania coating.

In some embodiments, tubular 702 and/or electrical conductor 572 are coated with a coating such as polyethylene or another suitable low friction coefficient coating that may melt or decompose when the heater is energized. The coating may facilitate placement of the tubular and/or the electrical conductor in the formation.

In some embodiments, tubular 702 includes corrosion resistant ferromagnetic material such as, but not limited to, 410 stainless steel, 446 stainless steel, T/P91 stainless steel, T/P92 stainless steel, alloy 52, alloy 42, and Invar 36. In some embodiments, tubular 702 is a stainless steel tubular with cobalt added (for example, between about 3% by weight and about 10% by weight cobalt added) and/or molybdenum (for example, about 0.5% molybdenum by weight).

At or near the Curie temperature or the phase transformation temperature of the ferromagnetic material in tubular 702, the magnetic permeability of the ferromagnetic material decreases rapidly. When the magnetic permeability of tubular 702 decreases at or near the Curie temperature or the phase transformation temperature, there is little or no current flow in the tubular because, at these temperatures, the tubular is essentially non-ferromagnetic and electrical conductor 572 is unable to induce current flow in the tubular. With little or no current flow in tubular 702, the temperature of the tubular will drop to lower temperatures until the magnetic permeability increases and the tubular becomes ferromagnetic. Thus, tubular 702 self-limits at or near the Curie temperature or the phase transformation temperature and operates as a temperature limited heater due to the ferromagnetic properties of the ferromagnetic material in the tubular. Because current is induced in tubular 702, the turndown ratio may be higher and the drop in current sharper for the tubular than for temperature limited heaters that apply current directly to the ferromagnetic material. For example, heaters with current induced in tubular 702 may have turndown ratios of at least about 5, at least about 10, or at least about 20 while temperature limited heaters that apply current directly to the ferromagnetic material may have turndown ratios that are at most about 5.

When current is induced in tubular 702, the tubular provides heat to hydrocarbon layer 484 and defines the heating zone in the hydrocarbon layer. In certain embodiments, tubular 702 heats to temperatures of at least about 300° C., at least about 500° C., or at least about 700° C. Because current is induced on both the inside and outside surfaces of tubular 702, the heat generation of the tubular is increased as compared to temperature limited heaters that have current directly applied to the ferromagnetic material and current flow is limited to one surface. Thus, less current may be provided to electrical conductor 572 to generate the same heat as heaters that apply current directly to the ferromagnetic material. Using less current in electrical conductor 572 decreases power consumption and reduces power losses in the overburden of the formation.

In certain embodiments, tubulars 702 have large diameters. The large diameters may be used to equalize or substantially equalize high pressures on the tubular from either the inside or the outside of the tubular. In some embodiments, tubular 702 has a diameter in a range between about 1.5" (about 3.8 cm) and about 6" (about 15.2 cm). In some embodiments, tubular 702 has a diameter in a range between about 3 cm and about 13 cm, between about 4 cm and about 12 cm, or between about 5 cm and about 11 cm. Increasing the diameter of tubular 702 may provide more heat output to the formation by increasing the heat transfer surface area of the tubular.

In certain embodiments, tubular 702 has surfaces that are shaped to increase the resistance of the tubular. FIG. 143 depicts an embodiment of a heater with tubular 702 having radial grooved surfaces. Heater 438 may include electrical conductors 572A,B coupled to tubular 702. Electrical conductors 572A,B may be insulated conductors. Electrical contactors may electrically and physically couple electrical conductors 572A,B to tubular 702. In certain embodiments, the electrical contactors are attached to ends of electrical conductors 572A,B. The electrical contactors have a shape such that when the ends of electrical conductors 572A,B are pushed into the ends of tubular 702, the electrical contactors physically and electrically couple the electrical conductors to the tubular. For example, the electrical contactors may be cone shaped. Heater 438 generates heat when current is applied directly to tubular 702. Current is provided to tubular 702 using electrical conductors 572A,B. Grooves 706 may increase the heat transfer surface area of tubular 702.

In some embodiments, one or more surfaces of the tubular of an induction heater may be textured to increase the resistance of the heater and increase the heat transfer surface area of the tubular. FIG. 144 depicts heater 438 that is an induction heater. Electrical conductor 572 extends through tubular 702.

Tubular 702 may include grooves 706. In some embodiments, grooves 706 are cut in tubular 702. In some embodiments, fins are coupled to tubular to form ridges and grooves 706. The fins may be welded or otherwise attached to the tubular. In an embodiment, the fins are coupled to a tubular sheath that is placed over the tubular. The sheath is physically and electrically coupled to the tubular to form tubular 702.

In certain embodiments, grooves 706 are on the outer surface of tubular 702. In some embodiments, the grooves are on the inner surface of the tubular. In some embodiments, the grooves are on both the inner and outer surfaces of the tubular.

In certain embodiments, grooves 706 are radial grooves (grooves that wrap around the circumference of tubular 702). In certain embodiments, grooves 706 are straight, angled, or spiral grooves or protrusions. In some embodiments, grooves 706 are evenly spaced grooves along the surface of tubular 702. In some embodiments, grooves 706 are part of a threaded surface on tubular 702 (the grooves are formed as a winding thread on the surface). Grooves 706 may have a variety of shapes as desired. For example, grooves 706 may have square edges, rectangular edges, v-shaped edges, u-shaped edges, or have rounded edges.

Grooves 706 increase the effective resistance of tubular 702 by increasing the path length of induced current on the surface of the tubular. Grooves 706 increase the effective resistance of tubular 702 as compared to a tubular with the same inside and outside diameters with smooth surfaces. Because induced current travels axially, the induced current has to travel up and down the grooves along the surface of the tubular. Thus, the depth of grooves 706 may be varied to provide a selected resistance in tubular 702. For example, increasing the grooves depth increases the path length and the resistance.

Increasing the resistance of tubular 702 with grooves 706 increases the heat generation of the tubular as compared to a tubular with smooth surfaces. Thus, the same electrical current in electrical conductor 572 will provide more heat output in the radial grooved surface tubular than the smooth surface tubular. Therefore, to provide the same heat output with the radial grooved surface tubular as the smooth surface tubular, less current is needed in electrical conductor 572 with the radial grooved surface tubular.

In some embodiments, grooves 706 are filled with materials that decompose at lower temperatures to protect the grooves during installation of tubular 702. For example, grooves 706 may be filled with polyethylene or asphalt. The polyethylene or asphalt may melt and/or desorb when heater 438 reaches normal operating temperatures of the heater.

It is to be understood that grooves 706 may be used in other embodiments of tubulars 702 described herein to increase the resistance of such tubulars. For example, grooves 706 may be used in embodiments of tubulars 702 depicted in FIGS. 140, 141, and 142.

FIG. 145 depicts an embodiment of heater 438 divided into tubular sections to provide varying heat outputs along the length of the heater. Heater 438 may include tubular sections 702A, 702B, 702C, 702D that have different properties to provide different heat outputs in each tubular section. Heat output from tubular sections 702D may be less than the heat output from grooved sections 702A, 702B, 702C. Examples of properties that may be varied include, but are not limited to, thicknesses, diameters, cross-sectional areas, resistances, materials, number of grooves, depth of grooves. The different properties in tubular sections 702A, 702B, and 702C may provide different maximum operating temperatures (for example, different Curie temperatures or phase transformation temperatures) along the length of heater 438. The different maximum temperatures of the tubular sections provides different heat outputs from the tubular sections. Sections such as grooved section 702A may be separate sections that are placed down the wellbore in separation installation procedures. Some sections, such as grooved section 702B and 702C may be connected together by non-grooved section 702D, and may be placed down the wellbore together.

Providing different heat outputs along heater 438 may provide different heating in one or more hydrocarbon layers. For example, heater 438 may be divided into two or more sections of heating to provide different heat outputs to different sections of a hydrocarbon layer and/or different hydrocarbon layers.

In one embodiment, a first portion of heater 438 may provide heat to a first section of the hydrocarbon layer and a second portion of the heater may provide heat to a second section of the hydrocarbon layer. Hydrocarbons in the first section may be mobilized by the heat provided by the first portion of the heater. Hydrocarbons in the second section may be heated by the second portion of the heater to a higher temperature than the first section. The higher temperature in the second section may upgrade hydrocarbons in the second section relative to the first section. For example, the hydrocarbons may be mobilized, visbroken, and/or pyrolyzed in the second section. Hydrocarbons from the first section may be moved into the second section by, for example, a drive fluid provided to the first section. As another example, heater 438 may have end sections that provide higher heat outputs to counteract heat losses at the ends of the heater to maintain a more constant temperature in the heated portion of the formation.

In certain embodiments, three, or multiples of three, electrical conductors enter and exit the formation through common wellbores with tubulars surrounding the electrical conductors in the portion of the formation to be heated. FIG. 146 depicts an embodiment of three electrical conductors 572A,B,C entering the formation through first common wellbore 428A and exiting the formation through second common wellbore 428C with three tubulars 702A,B,C surrounding the electrical conductors in hydrocarbon layer 484. In some embodiments, electrical conductors 572A,B,C are powered by a single, three-phase wye transformer. Tubulars 702A,B,C and portions of electrical conductors 572A,B,C may be in three separate wellbores in hydrocarbon layer 484. The three separate wellbores may be formed by drilling the wellbores from first common wellbore 428A to second common wellbore 428B, vice versa, or drilling from both common wellbores and connecting the drilled openings in the hydrocarbon layer.

Having multiple induction heaters extending from only two wellbores in hydrocarbon layer 484 reduces the footprint of wells on the surface needed for heating the formation. The number of overburden wellbores drilled in the formation is reduced, which reduces capital costs per heater in the formation. Power losses in the overburden may be a smaller fraction of total power supplied to the formation because of the reduced number of wells through the overburden used to treat the formation. In addition, power losses in the overburden may be smaller because the three phases in the common wellbores substantially cancel each other and inhibit induced currents in the casings or other structures of the wellbores.

In some embodiments, three, or multiples of three, electrical conductors and tubulars are located in separate wellbores in the formation. FIG. 147 depicts an embodiment of three electrical conductors 572A,B,C and three tubulars 702A,B,C in separate wellbores in the formation. Electrical conductors 572A,B,C may be powered by single, three-phase wye transformer 580 with each electrical conductor coupled to one phase of the transformer. In some embodiments, the single, three-phase wye transformer is used to power 6, 9, 12, or other multiples of three electrical conductors. Connecting multiples of three electrical conductors to the single, three-phase wye transformer may reduce equipment costs for providing power to the induction heaters.

In some embodiments, two, or multiples of two, electrical conductors enter the formation from a first common wellbore and exit the formation from a second common wellbore with tubulars surrounding each electrical conductor in the hydrocarbon layer. The multiples of two electrical conductors may be powered by a single, two-phase transformer. In such embodiments, the electrical conductors may be homogenous electrical conductors (for example, insulated conductors using the same materials throughout) in the overburden sections and heating sections of the insulated conductor. The reverse flow of current in the overburden sections may reduce power losses in the overburden sections of the wellbores because the currents reduce or cancel inductive effects in the overburden sections.

In certain embodiments, tubulars 702 depicted in FIGS. 140-146 include multiple layers of ferromagnetic materials separated by electrical insulators. FIG. 148 depicts an embodiment of a multilayered induction tubular. Tubular 702 includes ferromagnetic layers 708A,B,C separated by electrical insulators 534A,B. Three ferromagnetic layers and two layers of electrical insulators are shown in FIG. 148. Tubular 702 may include additional ferromagnetic layers and/or electrical insulators as desired. For example, the number of layers may be chosen to provide a desired heat output from the tubular.

Ferromagnetic layers 708A,B,C are electrically insulated from electrical conductor 572 by, for example, an air gap. Ferromagnetic layers 708A,B,C are electrically insulated from each other by electrical insulator 534A and electrical insulator 534B. Thus, direct flow of current is inhibited between ferromagnetic layers 708A,B,C and electrical conductor 572. When current is applied to electrical conductor 572, electrical current flow is induced in ferromagnetic layers 708A,B,C because of the ferromagnetic properties of the layers. Having two or more electrically insulated ferromagnetic layers provides multiple current induction loops for the induced current. The multiple current induction loops may effectively appear as electrical loads in series to a power source for electrical conductor 572. The multiple current induction loops may increase the heat generation per unit length of tubular 702 as compared to a tubular with only one current induction loop. For the same heat output, the tubular with multiple layers may have a higher voltage and lower current as compared to the single layer tubular.

In certain embodiments, ferromagnetic layers 708A,B,C include the same ferromagnetic material. In some embodiments, ferromagnetic layers 708A,B,C include different ferromagnetic materials. Properties of ferromagnetic layers 708A,B,C may be varied to provide different heat outputs from the different layers. Examples of properties of ferromagnetic layers 708A,B,C that may be varied include, but are not limited to, ferromagnetic material and thicknesses of the layers.

Electrical insulators 534A and 534B may be magnesium oxide, porcelain enamel, and/or another suitable electrical insulator. The thicknesses and/or materials of electrical insulators 534A and 534B may be varied to provide different operating parameters for tubular 702.

In some embodiments, fluids are circulated through tubulars 702 depicted in FIGS. 140-146. In some embodiments, fluids are circulated through the tubulars to add heat to the formation. For example, fluids may be circulated through the tubulars to preheat the formation prior to energizing the tubulars (providing current to the heating system). In some embodiments, fluids are circulated through the tubulars to recover heat from the formation. The recovered heat may be used to provide heat to other portions of the formation and/or surface processes used to treat fluids produced from the formation. In some embodiments, the fluids are used to cool down the heater.

In certain embodiments, insulated conductors are operated as induction heaters. FIG. 149 depicts a cross-sectional end view of an embodiment of insulated conductor 574 that is used as an induction heater. FIG. 150 depicts a cross-sectional side view of the embodiment depicted in FIG. 149. Insulated conductor 574 includes core 542, electrical insulator 534, and jacket 540. Core 542 may be copper or another non-ferromagnetic electrical conductor with low resistance that provides little or no heat output. In some embodiments, core may be clad with a thin layer of material such as nickel to inhibit migration of portions of the core into electrical insulator 534. Electrical insulator 534 may be magnesium oxide or another suitable electrical insulator that inhibits arcing at high voltages.

Jacket 540 includes at least one ferromagnetic material. In certain embodiments, jacket 540 includes carbon steel or another ferromagnetic steel (for example, 410 stainless steel, 446 stainless steel, T/P91 stainless steel, T/P92 stainless steel, alloy 52, alloy 42, and Invar 36). In some embodiments, jacket 540 includes an outer layer of corrosion resistant material (for example, stainless steel such as 347H stainless steel or 304 stainless steel). The outer layer may be clad to the ferromagnetic material or otherwise coupled to the ferromagnetic material using methods known in the art.

In certain embodiments, jacket 540 has a thickness of at least about 2 skin depths of the ferromagnetic material in the jacket. In some embodiments, jacket 540 has a thickness of at least about 3 skin depths, at least about 4 skin depths, or at least about 5 skin depths. Increasing the thickness of jacket 540 may increase the heat output from insulated conductor 574.

In one embodiment, core 542 is copper with a diameter of about 0.5" (1.27 cm), electrical insulator 534 is magnesium oxide with a thickness of about 0.20" (0.5 cm) (the outside diameter is about 0.9" (2.3 cm)), and jacket 540 is carbon steel with an outside diameter of about 1.6" (4.1 cm) (the thickness is about 0.35" (0.88 cm)). A thin layer (about 0.1" (0.25 cm) thickness (outside diameter of about 1.7" (4.3 cm)) of corrosion resistant material 347H stainless steel may be clad on the outside of jacket 540.

In another embodiment, core 542 is copper with a diameter of about 0.338" (0.86 cm), electrical insulator 534 is magnesium oxide with a thickness of about 0.096" (0.24 cm) (the outside diameter is about 0.53" (1.3 cm)), and jacket 540 is carbon steel with an outside diameter of about 1.13" (2.9 cm) (the thickness is about 0.30" (0.76 cm)). A thin layer (about 0.065" (0.17 cm) thickness (outside diameter of about 1.26" (3.2 cm)) of corrosion resistant material 347H stainless steel may be clad on the outside of jacket 540.

In another embodiment, core 542 is copper, electrical insulator 534 is magnesium oxide, and jacket 540 is a thin layer of copper surrounded by carbon steel. Core 542, electrical insulator 534, and the thin copper layer of jacket 540 may be obtained as a single piece of insulated conductor. Such insulated conductors may be obtained as long pieces of insulated conductors (for example, lengths of about 500' (about 150 m) or more). The carbon steel layer of jacket 540 may be added by drawing down the carbon steel over the long insulated conductor. Such an insulated conductor may only generate heat on the outside of jacket 540 as the thin copper layer in the jacket shorts to the inside surface of the jacket.

In some embodiments, jacket 540 is made of multiple layers of ferromagnetic material. The multiple layers may be the same ferromagnetic material or different ferromagnetic materials. For example, in one embodiment, jacket 540 is a 0.35" (0.88 cm) thick carbon steel jacket made from three layers of carbon steel. The first and second layers are 0.10" (0.25 cm) thick and the third layer is 0.15" (0.38 cm) thick. In another embodiment, jacket 540 is a 0.3" (0.76 cm) thick carbon steel jacket made from three 0.10" (0.25 cm) thick layers of carbon steel.

In certain embodiments, jacket 540 and core 542 are electrically insulated such that there is no direct electrical connection between the jacket and the core. Core 542 may be electrically coupled to a single power source with each end of the core being coupled to one pole of the power source. For example, insulated conductor 574 may be a u-shaped heater located in a u-shaped wellbore with each end of core 542 being coupled to one pole of the power source.

When core 542 is energized with time-varying current, the core induces electrical current flow on the surfaces of jacket 540 (as shown by the arrows in FIG. 150) due to the ferromagnetic properties of the ferromagnetic material in the jacket. In certain embodiments, current flow is induced on both the inside and outside surfaces of jacket 540. In these induction heater embodiments, jacket 540 operates as the heating element of insulated conductor 574.

At or near the Curie temperature or the phase transformation temperature of the ferromagnetic material in jacket 540, the magnetic permeability of the ferromagnetic material decreases rapidly. When the magnetic permeability of jacket 540 decreases at or near the Curie temperature or the phase transformation temperature, there is little or no current flow in the jacket because, at these temperatures, the jacket is essentially non-ferromagnetic and core 542 is unable to induce current flow in the jacket. With little or no current flow in jacket 540, the temperature of the jacket will drop to lower temperatures until the magnetic permeability increases and the jacket becomes ferromagnetic. Thus, jacket 540 self-limits at or near the Curie temperature or the phase transformation temperature and insulated conductor 574 operates as a temperature limited heater due to the ferromagnetic properties of the jacket. Because current is induced in jacket 540, the turndown ratio may be higher and the drop in current sharper for the jacket than if current is directly applied to the jacket.

In certain embodiments, portions of jacket 540 in the overburden of the formation do not include ferromagnetic material (for example, are non-ferromagnetic). Having the overburden portions of jacket 540 made of non-ferromagnetic material inhibits current induction in the overburden portions of the jackets. Power losses in the overburden are inhibited or reduced by inhibiting current induction in the overburden portions.

FIG. 151 depicts a cross-sectional view of an embodiment of two-leg insulated conductor 574 that is used as an induction heater. FIG. 152 depicts a longitudinal cross-sectional view of the embodiment depicted in FIG. 151. Insulated conductor 574 is a two-leg insulated conductor that includes two cores 542A,B; two electrical insulators 534A,B; and two jackets 540A,B. The two legs of insulated conductor 574 may be in physical contact with each other such that jacket 540A contacts jacket 540B along their lengths. Cores 542A,B; electrical insulators 534A,B; and jackets 540A,B may include materials such as those used in the embodiment of insulated conductor 574 depicted in FIGS. 149 and 150.

As shown in FIG. 152, core 542A and core 542B are coupled to transformer 580 and terminal block 634. Thus, core 542A and core 542B are electrically coupled in series such that current in core 542A flows in an opposite direction from current in core 542B, as shown by the arrows in FIG. 152. Current flow in cores 542A,B induces current flow in jackets 540A,B, respectively, as shown by the arrows in FIG. 152.

In certain embodiments, portions of jacket 540A and/or jacket 540B are coated with an electrically insulating coating (for example, a porcelain enamel coating, alumina coating, and/or alumina-titania coating). The electrically insulating coating may inhibit the currents in one jacket from affecting current in the other jacket or vice versa (for example, current in one jacket cancelling out current in the other jacket). Electrically insulating the jackets from each other may inhibit the turndown ratio of the heater from being reduced by the interaction of induced currents in the jackets.

Because core 542A and core 542B are electrically coupled in series to a single transformer (transformer 580), insulated conductor 574 may be located in a wellbore that terminates in the formation (for example, a wellbore with a single surface opening such as an L-shaped or J-shaped wellbore). Insulated conductor 574, as depicted in FIG. 152, may be operated as a subsurface termination induction heater with electrical connections between the heater and the power source (the transformer) being made through one surface opening.

Portions of jackets 540A,B in the overburden and/or adjacent to portions of the formation that are not to be significantly heated (for example, thick shale breaks between two hydrocarbon layers) may be non-ferromagnetic to inhibit induction currents in such portions. The jacket may include one or more sections that are electrically insulating to restrict induced current flow to heater portions of the insulated conductor. Inhibiting induction currents in the overburden portion of the jackets inhibits inductive heating and/or power losses in the overburden. Induction effects in other structures in the overburden that surround insulated conductor 574 (for example, overburden casings) may be inhibited because the current in core 542A flows in an opposite direction from the current in core 542B.

FIG. 153 depicts a cross-sectional view of an embodiment of a multilayered insulated conductor that is used as an induction heater. Insulated conductor 574 includes core 542 surrounded by electrical insulator 534A and jacket 540A. Electrical insulator 534A and jacket 540A comprise a first layer of insulated conductor 574. The first layer is surrounded by a second layer that includes electrical insulator 534B and jacket 540B. Two layers of electrical insulators and jackets are shown in FIG. 153. The insulated conductor may include additional layers as desired. For example, the number of layers may be chosen to provide a desired heat output from the insulated conductor.

Jacket 540A and jacket 540B are electrically insulated from core 542 and each other by electrical insulator 534A and electrical insulator 534B. Thus, direct flow of current is inhibited between jacket 540A and jacket 540B and core 542. When current is applied to core 542, electrical current flow is induced in both jacket 540A and jacket 540B because of the ferromagnetic properties of the jackets. Having two or more layers of electrical insulators and jackets provides multiple current induction loops. The multiple current induction loops may effectively appear as electrical loads in series to a power source for insulated conductor 574. The multiple current induction loops may increase the heat generation per unit length of insulated conductor 574 as compared to an insulated conductor with only one current induction loop. For the same heat output, the insulated conductor with multiple layers may have a higher voltage and lower current as compared to the single layer insulated conductor.

In certain embodiments, jacket 540A and jacket 540B include the same ferromagnetic material. In some embodiments, jacket 540A and jacket 540B include different ferromagnetic materials. Properties of jacket 540A and jacket 540B may be varied to provide different heat outputs from the different layers. Examples of properties of jacket 540A and jacket 540B that may be varied include, but are not limited to, ferromagnetic material and thicknesses of the layers.

Electrical insulators 534A and 534B may be magnesium oxide, porcelain enamel, and/or another suitable electrical insulator. The thicknesses and/or materials of electrical insulators 534A and 534B may be varied to provide different operating parameters for insulated conductor 574.

FIG. 154 depicts an end view of an embodiment of three insulated conductors 574 located in a coiled tubing conduit and used as induction heaters. Insulated conductors 574 may each be, for example, the insulated conductor depicted in FIGS. 149, 150, and 153. The cores of insulated conductors 574 may be coupled to each other such that the insulated conductors are electrically coupled in a three-phase wye configuration. FIG. 155 depicts a representation of cores 542 of insulated conductors 574 coupled together at their ends.

As shown in FIG. 154, insulated conductors 574 are located in tubular 702. Tubular 702 may be a coiled tubing conduit or other coiled tubing tubular or casing. Insulated conductors 574 may be in a spiral or helix formation inside tubular 702 to reduce stresses on the insulated conductors when the insulated conductors are coiled, for example, on a coiled tubing reel. Tubular 702 allows the insulated conductors to be installed in the formation using a coiled tubing rig and protects the insulated conductors during installation into the formation.

FIG. 156 depicts an end view of an embodiment of three insulated conductors 574 located on a support member and used as induction heaters. Insulated conductors 574 may each be, for example, the insulated conductor depicted in FIGS. 149, 150, and 153. The cores of insulated conductors 574 may be coupled to each other such that the insulated conductors are electrically coupled in a three-phase wye configuration. For example, the cores may be coupled together as shown in FIG. 155.

As shown in FIG. 156, insulated conductors 574 are coupled to support member 548. Support member 548 provides support for insulated conductors 574. Insulated conductors 574 may be wrapped around support member 548 in a spiral or helix formation. In some embodiments, support member 548 includes ferromagnetic material. Current flow may be induced in the ferromagnetic material of support member 548. Thus, support member 548 may generate some heat in addition to the heat generated in the jackets of insulated conductors 574.

In certain embodiments, insulated conductors 574 are held together on support member 548 with band 584. Band 584 may be stainless steel or another non-corrosive material. In some embodiments, band 584 includes a plurality of bands that hold together insulated conductors 574. The bands may be periodically placed around insulated conductors 574 to hold the conductors together.

In some embodiments, jacket 540, depicted in FIGS. 149 and 150, or jackets 540A,B, depicted in FIG. 152, include grooves or other structures on the outer surface and/or the inner surface of the jacket to increase the effective resistance of the jacket. Increasing the resistance of jacket 540 and/or jackets 540A,B with grooves increases the heat generation of the jackets as compared to jackets with smooth surfaces. Thus, the same electrical current in core 542 and/or cores 542A,B will provide more heat output in the grooved surface jackets than the smooth surface jackets.

In some embodiments, jacket 540 (such as the jackets depicted in FIGS. 149 and 150, or jackets 540A,B depicted in FIG. 152) are divided into sections to provide varying heat outputs along the length of the heaters. For example, jacket 540 and/or jackets 540A,B may be divided into sections such as tubular sections 702A, 702B, and 702C, depicted in FIG. 145. The sections of the jackets 540 depicted in FIGS. 149, 150, and 152 may have different properties to provide different heat outputs in each section. Examples of properties that may be varied include, but are not limited to, thicknesses, diameters, resistances, materials, number of grooves, depth of grooves. The different properties in the sections may provide different maximum operating temperatures (for example, different Curie temperatures or phase transformation temperatures) along the length of insulated conductor 574. The different maximum temperatures of the sections provides different heat outputs from the sections.

In certain embodiments, induction heaters include insulated electrical conductors surrounded by spiral wound ferromagnetic materials. For example, the spiral wound ferromagnetic materials may operate as inductive heating elements similarly to tubulars 702, depicted in FIGS. 140-146. FIG. 157 depicts a representation of an embodiment of an induction heater with core 542 and electrical insulator 534 surrounded by ferromagnetic layer 708. Core 542 may be copper or another non-ferromagnetic electrical conductor with low resistance that provides little or no heat output. Electrical insulator 534 may be a polymeric electrical insulator such as Teflon@, XPLE (cross-linked polyethylene), or EPDM (ethylene-propylene diene monomer). In some embodiments, core 542 and electrical insulator 534 are obtained together as a polymer (insulator) coated cable. In some embodiments, electrical insulator 534 is magnesium oxide or another suitable electrical insulator that inhibits arcing at high voltages and/or at high temperatures.

In certain embodiments, ferromagnetic layer 708 is spirally wound onto core 542 and electrical insulator 534. Ferromagnetic layer 708 may include carbon steel or another ferromagnetic steel (for example, 410 stainless steel, 446 stainless steel, T/P91 stainless steel, T/P92 stainless steel, alloy 52, alloy 42, and Invar 36).

In some embodiments, ferromagnetic layer 708 is spirally wound onto an insulated conductor. In some embodiments, ferromagnetic layer 708 includes an outer layer of corrosion resistant material. In some embodiments, ferromagnetic layer is bar stock. FIG. 158 depicts a representation of an embodiment of insulated conductor 574 surrounded by ferromagnetic layer 708. Insulated conductor 574 includes core 542, electrical insulator 534, and jacket 540. Core 542 is copper or another non-ferromagnetic electrical conductor with low resistance that provides little or no heat output. Electrical insulator 534 is magnesium oxide or another suitable electrical insulator. Ferromagnetic layer 708 is spirally wound onto insulated conductor 574.

Spirally winding ferromagnetic layer 708 onto the heater may increase control over the thickness of the ferromagnetic layer as compared to other construction methods for induction heaters. For example, more than one ferromagnetic layer 708 may be wound onto the heater to vary the output of the heater. The number of ferromagnetic layers 708 may be chosen to provide desired output from the heater. FIG. 159 depicts a representation of an embodiment of an induction heater with two ferromagnetic layers 708A,B spirally wound onto core 542 and electrical insulator 534. In some embodiments, ferromagnetic layer 708A is counter-wound relative to ferromagnetic layer 708B to provide neutral torque on the heater. Neutral torque may be useful when the heater is suspended or allowed to hang freely in an opening in the formation.

The number of spiral windings (for example, the number of ferromagnetic layers) may be varied to alter the heat output of the induction heater. In addition, other parameters may be varied to alter the heat output of the induction heater. Examples of other varied parameters include, but are not limited to, applied current, applied frequency, geometry, ferromagnetic materials, and thickness and/or number of spiral windings.

Use of spiral wound ferromagnetic layers may allow induction heaters to be manufactured in continuous long lengths by spiral winding the ferromagnetic material onto long lengths of conventional or easily manufactured insulated cable. Thus, spiral wound induction heaters may have reduced manufacturing costs as compared to other induction heaters. The spiral wound ferromagnetic layers may increase the mechanical flexibility of the induction heater as compared to solid ferromagnetic tubular induction heaters. The increased flexibility may allow spiral wound induction heaters to be bent over surface protrusions such as hanger joints.

FIG. 160 depicts an embodiment for assembling ferromagnetic layer 708 onto insulated conductor 574. Insulated conductor 574 may be an insulated conductor cable (for example, mineral insulated conductor cable or polymer insulated conductor cable) or other suitable electrical conductor core covered by insulation.

In certain embodiments, ferromagnetic layer 708 is made of ferromagnetic material 1812 fed from reel 1810 and wound onto insulated conductor 574. Reel 1810 may be a coiled tubing rig or other rotatable feed rig. Reel 1810 may rotate around insulated conductor 574 as ferromagnetic material 1812 is wound onto the insulated conductor to form ferromagnetic layer 708. Insulated conductor 574 may be fed from a reel or from a mill as reel 1810 rotates around the insulated conductor.

In some embodiments, ferromagnetic material 1812 is heated prior to winding the material onto insulated conductor 574. For example, ferromagnetic material 1812 may be heated using inductive heater 1814. Pre-heating ferromagnetic material 1812 prior to winding the ferromagnetic material may allow the ferromagnetic material to contract and grip onto insulated conductor 574 when the ferromagnetic material cools.

In some embodiments, portions of casings in the overburden sections of heater wellbores have surfaces that are shaped to increase the effective diameter of the casing. Casings in the overburden sections of heater wellbores may include, but are not limited to, overburden casings, heater casings, heater tubulars, and/or jackets of insulated conductors. Increasing the effective diameter of the casing may reduce inductive effects in the casing when current used to power a heater or heaters below the overburden is transmitted through the casing (for example, when one phase of power is being transmitted through the overburden section). When current is transmitted in only one direction through the overburden, the current may induce other currents in ferromagnetic or other electrically conductive materials such as those found in overburden casings. These induced currents may provide undesired power losses and/or undesired heating in the overburden of the formation.

FIG. 161 depicts an embodiment of casing 710 having a grooved or corrugated surface. In certain embodiments, casing 710 includes grooves 712. In some embodiments, grooves 712 are corrugations or include corrugations. Grooves 712 may be formed as a part of the surface of casing 710 (for example, the casing is formed with grooved surfaces) or the grooves may be formed by adding or removing (for example, milling) material on the surface of the casing. For example, grooves 712 may be located on a long piece of tubular that is welded to casing 710.

In certain embodiments, grooves 712 are on the outer surface of casing 710. In some embodiments, grooves 712 are on the inner surface of casing 710. In some embodiments, grooves 712 are on both the inner and outer surfaces of casing 710.

In certain embodiments, grooves 712 are axial grooves (grooves that go longitudinally along the length of casing 710). In certain embodiments, grooves 712 are straight, angled, or longitudinally spiral. In some embodiments, grooves 712 are substantially axial grooves or spiral grooves with a significant longitudinal component (i.e., the spiral angle is less than 10°, less than 5°, or less than 1°). In some embodiments, grooves 712 extend substantially axially along the length of casing 710. In some embodiments, grooves 712 are evenly spaced grooves along the surface of casing 710.

Grooves 712 may have a variety of shapes as desired. For example, grooves 712 may have square edges, v-shaped edges, u-shaped edges, rectangular edges, or have rounded edges.

Grooves 712 increase the effective circumference of casing 710. Grooves 712 increase the effective circumference of casing 710 as compared to the circumference of a casing with the same inside and outside diameters and smooth surfaces. The depth of grooves 712 may be varied to provide a selected effective circumference of casing 710. For example, axial grooves that are ¼" (0.63 cm) wide and ¼" (0.63 cm) deep, and spaced ¼" (0.63 cm) apart may increase the effective circumference of a 6" (15.24 cm) diameter pipe from 18.84" (47.85 cm) to 37.68" (95.71 cm) (or the circumference of a 12" (30.48 cm) diameter pipe).

In certain embodiments, grooves 712 increase the effective circumference of casing 710 by a factor of at least about 2 as compared to a casing with the same inside and outside diameters and smooth surfaces. In some embodiments, grooves 712 increase the effective circumference of casing 710 by a factor of at least about 3, at least about 4, or at least about 6 as compared to a casing with the same inside and outside diameters and smooth surfaces.

Increasing the effective circumference of casing 710 with grooves 712 increases the surface area of the casing. Increasing the surface area of casing 710 reduces the induced current in the casing for a given current flux. Power losses associated with inductive heating in casing 710 are reduced as compared to a casing with smooth surfaces because of the reduced induced current. Thus, the same electrical current will provide less heat output from inductive heating in the axial grooved surface casing than the smooth surface casing. Reducing the heat output in the overburden section of the heater will increase the efficiency of, and reduce the costs associated with, operating the heater. Increasing the effective circumference of casing 710 and reducing inductive effects in the casing allows the casing to be made with less expensive materials such as carbon steel.

In some embodiments, an electrically insulating coating (for example, a porcelain enamel coating) is placed on one or more surfaces of casing 710 to inhibit current and/or power losses from the casing. In some embodiments, casing 710 is formed from two or more longitudinal sections of casing (for example, longitudinal sections welded or threaded together end to end). The longitudinal sections may be aligned so that the grooves on the sections are aligned. Aligning the sections may allow for cement or other material to flow along the grooves.

In some embodiments, an insulated conductor heater is placed in the formation by itself and the outside of the insulated conductor heater is electrically isolated from the formation because the heater has little or no voltage potential on the outside of the heater. FIG. 162 depicts an embodiment of a single-ended, substantially horizontal insulated conductor heater that electrically isolates itself from the formation. In such an embodiment, heater 438 is insulated conductor 574. Insulated conductor 574 may be a mineral insulated conductor heater (for example, insulated conductor 574 depicted in FIGS. 163A and 163B). Insulated conductor 574 is located in opening 556 in hydrocarbon layer 484. In certain embodiments, opening 556 is an uncased or open wellbore. In some embodiments, opening 556 is a cased or lined wellbore. In some embodiments, insulated conductor heater 574 is a substantially u-shaped heater and is located in a substantially u-shaped opening.

Insulated conductor 574 has little or no current flowing along the outside surface of the insulated conductor so that the insulated conductor is electrically isolated from the formation and leaks little or no current into the formation. The outside surface (or jacket) of insulated conductor 574 is a metal or thermal radiating body so that heat is radiated from the insulated conductor to the formation.

FIGS. 163A and 163B depict cross-sectional representations of an embodiment of insulated conductor 574 that is electrically isolated on the outside of jacket 540. In certain embodiments, jacket 540 is made of ferromagnetic materials. In one embodiment, jacket 540 is made of 410 stainless steel. In other embodiments, jacket 540 is made of T/P91 or T/P92 stainless steel. In some embodiments, jacket 540 may include carbon steel. Core 542 is made of a highly conductive material such as copper or a copper alloy. Electrical insulator 534 is an electrically insulating material such as magnesium oxide. Insulated conductor 574 may be an inexpensive and easy to manufacture heater.

In the embodiment depicted in FIGS. 163A and 163B, core 542 brings current into the formation, as shown by the arrow. Core 542 and jacket 540 are electrically coupled at the distal end (bottom) of the heater. Current returns to the surface of the formation through jacket 540. The ferromagnetic properties of jacket 540 confine the current to the skin depth along the inside diameter of the jacket, as shown by arrows 714 in FIG. 163A. Jacket 540 has a thickness at least 2 or 3 times the skin depth of the ferromagnetic material used in the jacket at 25° C. and at the design current frequency so that most of the current is confined to the inside surface of the jacket and little or no current flows on the outside diameter of the jacket. Thus, there is little or no voltage potential on the outside of jacket 540. Having little or no voltage potential on the outside surface of insulated conductor 574 does not expose the formation to any high voltages, inhibits current leakage to the formation, and reduces or eliminates the need for isolation transformers, which decrease energy efficiency.

Because core 542 is made of a highly conductive material such as copper and jacket 540 is made of more resistive ferromagnetic material, a majority of the heat generated by insulated conductor 574 is generated in the jacket. Generating the majority of the heat in jacket 540 increases the efficiency of heat transfer from insulated conductor 574 to the formation over an insulated conductor (or other heater) that uses a core or a center conductor to generate the majority of the heat.

In certain embodiments, core 542 is made of copper. Using copper in core 542 allows the heating section of the heater and the overburden section to have identical core materials. Thus, the heater may be made from one long core assembly. The long single core assembly reduces or eliminates the need for welding joints in the core, which can be unreliable and susceptible to failure. Additionally, the long, single core assembly heater may be manufactured remote from the installation site and transported in a final assembly (ready to install assembly) to the installation site. The single core assembly also allows for long heater lengths (for example, about 1000 m or longer) depending on the breakdown voltage of the electrical insulator.

In certain embodiments, jacket 540 is made from two or more layers of the same materials and/or different materials. Jacket 540 may be formed from two or more layers to achieve thicknesses needed for the jacket (for example, to have a thickness at least 3 times the skin depth of the ferromagnetic material used in the jacket at 25° C. and at the design current frequency). Manufacturing and/or material limitations may limit the thickness of a single layer of jacket material. For example, the amount each layer can be strained during manufacturing (forming) the layer on the heater may limit the thickness of each layer. Thus, to reach jacket thicknesses needed for certain embodiments of insulated conductor 574, jacket 540 may be formed from several layers of jacket material. For example, three layers of T/P92 stainless steel may be used to form jacket 540 with a thickness of about 3 times the skin depth of the T/P92 stainless steel at 25° C. and at the design current frequency.

In some embodiments, jacket 540 includes two or more different materials. In some embodiments, jacket 540 includes different materials in different layers of the jacket. For example, jacket 540 may have one or more inner layers of ferromagnetic material chosen for their electrical and/or electromagnetic properties and one or more outer layers chosen for its non-corrosive properties.

In some embodiments, the thickness of jacket 540 and/or the material of the jacket are varied along the heater length. The thickness and/or material of jacket 540 may be varied to vary electrical properties and/or mechanical properties along the length of the heater. For example, the thickness and/or material of jacket 540 may be varied to vary the turndown ratio or the Curie temperature along the length of the heater. In some embodiments, the inner layer of jacket 540 includes copper or other highly conductive metals in the overburden section of the heater. The inner layer of copper limits heat losses in the overburden section of the heater.

FIGS. 164 and 165 depict an embodiment of insulated conductor 574 inside tubular 702. Insulated conductor 574 may include core 542, electrical insulator 534, and jacket 540. Core 542 and jacket 540 may be electrically coupled (shorted) at a distal end of the insulated conductor. FIG. 166 depicts a cross-sectional representation of an embodiment of the distal end of insulated conductor 574 inside tubular 702. Endcap 630 may electrically couple core 542 and jacket 540 to tubular 702 at the distal end of insulated conductor 574 and the tubular. Endcap 630 may include electrical conducting materials such as copper or steel.

In certain embodiments, core 542 is copper, electrical insulator 534 is magnesium oxide, and jacket 540 is non-ferromagnetic stainless steel (for example, 316H stainless steel, 347H stainless steel, 204-Cu stainless steel, 201Ln stainless steel, or 204 M stainless steel). Insulated conductor 574 may be placed in tubular 702 to protect the insulated conductor, increase heat transfer to the formation, and/or allow for coiled tubing or continuous installation of the insulated conductor. Tubular 702 may be made of ferromagnetic material such as 410 stainless steel, T/P 9 alloy steel, T/P91 alloy steel, low alloy steel, or carbon steel. In certain embodiments, tubular 702 is made of corrosion resistant materials. In some embodiments, tubular 702 is made of non-ferromagnetic materials.

In certain embodiments, jacket 540 of insulated conductor 574 is longitudinally welded to tubular 702 along weld joint 716, as shown in FIG. 165. The longitudinal weld may be a laser weld, a tandem GTAW (gas tungsten arc welding) weld, or an electron beam weld that welds the surface of jacket 540 to tubular 702. In some embodiments, tubular 702 is made from a longitudinal strip of metal. Tubular 702 may be made by rolling the longitudinal strip to form a cylindrical tube and then welding the longitudinal ends of the strip together to make the tubular.

In certain embodiments, insulated conductor 574 is welded to tubular 702 as the longitudinal ends of the strip are welded together (in the same welding process). For example, insulated conductor 574 is placed along one of the longitudinal ends of the strip so that jacket 540 is welded to tubular 702 at the location where the ends are welded together. In some embodiments, insulated conductor 574 is welded to one of the longitudinal ends of the strip before the strip is rolled to form the cylindrical tube. The ends of the strip may then be welded to form tubular 702.

In some embodiments, insulated conductor 574 is welded to tubular 702 at another location (for example, at a circumferential location away from the weld joining the ends of the strip used to form the tubular). For example, jacket 540 of insulated conductor 574 may be welded to tubular 702 diametrically opposite from where the longitudinal ends of the strip used to form the tubular are welded. In some embodiments, tubular 702 is made of multiple strips of material that are rolled together and coupled (for example, welded) to form the tubular with a desired thickness. Using more than one strip of metal may be easier to roll into the cylindrical tube used to form the tubular.

Jacket 540 and tubular 702 may be electrically and mechanically coupled at weld joint 716. Longitudinally welding jacket 540 to tubular 702 inhibits arcing between insulated conductor 574 and the tubular. Tubular 702 may return electrical current from core 542 along the inside of the tubular if the tubular is ferromagnetic. If tubular 702 is non-ferromagnetic, a thin electrically insulating layer such as a porcelain enamel coating or a spray coated ceramic may be put on the outside of the tubular to inhibit current leakage from the tubular into the formation. In some embodiments, a fluid is placed in tubular 702 to increase heat transfer between insulated conductor 574 and the tubular and/or to inhibit arcing between the insulated conductor and the tubular. Examples of fluids include, but are not limited to, thermally conductive gases such as helium, carbon dioxide, or steam. Fluids may also include fluids such as oil, molten metals, or molten salts (for example, solar salt (60% $NaNO_3$/40% $KNO_3$)). In some embodiments, heat transfer fluids are transported inside tubular 702 and heated inside the tubular (in the space between the tubular and insulated conductor 574). In some embodiments, an optical fiber, thermocouple, or other temperature sensor is placed inside tubular 702.

In certain embodiments, the heater depicted in FIGS. 164, 165, and 166 is energized with AC current (or time-varying electrical current). A majority of the heat is generated in tubular 702 when the heater is energized with AC current. If tubular 702 is ferromagnetic and the wall thickness of the tubular is at least about twice the skin depth at 25° C. and at the design current frequency, then the heater will operate as a temperature limited heater. Generating the majority of the heat in tubular 702 improves heat transfer to the formation as compared to a heater that generates a majority of the heat in the insulated conductor.

In certain embodiments, portions of the wellbore that extend through the overburden include casings. The casings may include materials that inhibit inductive effects in the casings. Inhibiting inductive effects in the casings may inhibit induced currents in the casing and/or reduce heat losses to the overburden. In some embodiments, the overburden casings may include non-metallic materials such as fiberglass, polyvinylchloride (PVC), chlorinated PVC (CPVC), high-density polyethylene (HDPE), high temperature polymers (such as nitrogen based polymers), or other high temperature plastics. HDPEs with working temperatures in a usable range include HDPEs available from Dow Chemical Co., Inc. (Midland, Mich., U.S.A.). The overburden casings may be made of materials that are spoolable so that the overburden casings can be spooled into the wellbore. In some embodiments, overburden casings may include non-magnetic metals such as aluminum or non-magnetic alloys such as manganese steels having at least 10% manganese, iron aluminum alloys with at least 18% aluminum, or austentitic stainless steels such as 304 stainless steel or 316 stainless steel. In some embodiments, overburden casings may include carbon steel or other ferromagnetic material coupled on the inside diameter to a highly conductive non-ferromagnetic metal (for example, copper or aluminum) to inhibit inductive effects or skin effects. In some embodiments, overburden casings are made of inexpensive materials that may be left in the formation (sacrificial casings).

In certain embodiments, wellheads for the wellbores may be made of one or more non-ferromagnetic materials. FIG. 167 depicts an embodiment of wellhead 718. The components in the wellheads may include fiberglass, PVC, CPVC, HDPE, high temperature polymers (such as nitrogen based polymers), and/or non-magnetic alloys or metals. Some materials (such as polymers) may be extruded into a mold or reaction injection molded (RIM) into the shape of the wellhead. Forming the wellhead from a mold may be a less expensive method of making the wellhead and save in capital costs for providing wellheads to a treatment site. Using non-ferromagnetic materials in the wellhead may inhibit undesired heating of components in the wellhead. Ferromagnetic materials used in the wellhead may be electrically and/or thermally insulated from other components of the wellhead. In some embodiments, an inert gas (for example, nitrogen or argon) is purged inside the wellhead and/or inside of casings to inhibit reflux of heated gases into the wellhead and/or the casings.

In some embodiments, ferromagnetic materials in the wellhead are electrically coupled to a non-ferromagnetic material (for example, copper) to inhibit skin effect heat generation in the ferromagnetic materials in the wellhead. The non-ferromagnetic material is in electrical contact with the ferromagnetic material so that current flows through the non-ferromagnetic material. In certain embodiments, as shown in FIG. 167, non-ferromagnetic material 720 is coupled (and electrically coupled) to the inside walls of conduit 552 and wellhead walls 722. In some embodiments, copper may be plasma sprayed, coated, clad, or lined on the inside and/or outside walls of the wellhead. In some embodiments, a non-ferromagnetic material such as copper is welded, brazed, clad, or otherwise electrically coupled to the inside and/or outside walls of the wellhead. For example, copper may be swaged out to line the inside walls in the wellhead. Copper may be liquid nitrogen cooled and then allowed to expand to contact and swage against the inside walls of the wellhead. In some embodiments, the copper is hydraulically expanded or explosively bonded to contact against the inside walls of the wellhead.

In some embodiments, two or more substantially horizontal wellbores are branched off of a first substantially vertical wellbore drilled downwards from a first location on a surface of the formation. The substantially horizontal wellbores may be substantially parallel through a hydrocarbon layer. The substantially horizontal wellbores may reconnect at a second substantially vertical wellbore drilled downwards at a second location on the surface of the formation. Having multiple wellbores branching off of a single substantially vertical wellbore drilled downwards from the surface reduces the number of openings made at the surface of the formation.

In certain embodiments, a horizontal heater, or a heater at an incline is installed in more than one part. FIG. 168 depicts an embodiment of heater 438 that has been installed in two parts. Heater 438 includes heating section 438A and lead-in section 438B. Heating section 438A may be located horizontally or at an incline in a hydrocarbon layer in the formation. Lead-in section 438B may be the overburden section or low resistance section of the heater (for example, the section of the heater with little or no electrical heat output).

During installation of heater 438, heating section 438A may be installed first into the formation. Heating section 438A may be installed by pushing the heating section into the opening in the formation using a drill pipe or other installation tool that pushes the heating section into the opening. After installation of heating section 438A, the installation tool may be removed from the opening in the formation. Installing only heating section 438A with the installation tool at this time may allow the heating section to be installed further into the formation than if the heating section and the lead-in section are installed together because a higher compressive strength may be applied to the heating section alone (for example, the installation tool only has to push in the horizontal or inclined direction).

In some embodiments, heating section 438A is coupled to mechanical connector 692. Connector 692 may be used to hold heating section 438A in the opening. In some embodiments, connector 692 includes copper or other electrically conductive materials so that the connector is used as an electrical connector (for example, as an electrical ground). In some embodiments, connector 692 is used to couple heating section 438A to a bus bar or electrical return rod located in an opening perpendicular to the opening of the heating section.

Lead-in section 438B may be installed after installation of heating section 438A. Lead-in section 438B may be installed with a drill pipe or other installation tool. In some embodiments, the installation tool may be the same tool used to install heating section 438A.

Lead-in section 438B may couple to heating section 438A as the lead-in section is installed into the opening. In certain embodiments, coupling joint 724 is used to couple lead-in section 438B to heating section 438A. Coupling joint 724 may be located on either lead-in section 438B or heating section 438A. In some embodiments, coupling joint 724 includes portions located on both sections. Coupling joint 724 may be a coupler such as, but not limited to, a wet connect or wet stab. In some embodiments, heating section 438A includes a catcher or other tool that guides an end of lead-in section 438B to form coupling joint 724.

In some embodiments, coupling joint 724 includes a container (for example, a can) located on heating section 438A that accepts the end of lead-in section 438B. Electrically conductive beads (for example, balls, spheres, or pebbles) may be located in the container. The beads may move around as the end of lead-in section 438B is pushed into the container to make electrical contact between the lead-in section and heating section 438A. The beads may be made of, for example, copper or aluminum. The beads may be coated or covered with a corrosion inhibitor such as nickel. In some embodiments, the beads are coated with a solder material that melts at lower temperatures (for example, below the boiling point of water in the formation). A high electrical current may be applied to the container to melt the solder. The melted solder may flow and fill void spaces in the container and be allowed to solidify before energizing the heater. In some embodiments, sacrificial beads are put in the container. The sacrificial beads may corrode first so that copper or aluminum beads in the container are less likely to be corroded during operation of the heater.

Power supplies are used to provide power to downhole power devices (downhole loads) such as, but not limited to, reservoir heaters, electric submersible pumps (ESPs), compressors, electric drills, electrical tools for construction and maintenance, diagnostic systems, sensors, or acoustic wave generators. Surface based power supplies may have long supply cabling (power cables) that contribute to problems such as voltage drops and electrical losses. Thus, it may be necessary to provide power to the downhole loads at high voltages to reduce electrical losses. However, many downhole loads are limited by an acceptable supply voltage level to the load. Therefore, an efficient high-voltage energy supply may not be viable without further conditioning. In such cases, a system for stepping down the voltage from the high voltage supply cable to the low voltage load may be necessary. The system may be a transformer.

The electrical power supply for downhole loads is typically provided using alternating current voltage (AC voltage) from supply grids of 50 Hz or 60 Hz frequency. The voltage of the supply grid may correspond to the voltage of the downhole load. High supply voltages may reduce loss and voltage drop in the supply cable and/or allow the use of supply cables with relatively small cross sections. High supply voltages, however, may cause technical difficulties and require cost intensive isolation efforts at the load. Voltage drops, electrical losses, and supply cable cross section limits may limit the length of the supply cable and, thus, the wellbore depth or depth of the downhole load. Locating the transformer downhole may reduce the amount of cabling needed to provide power to the downhole loads and allow deeper wellbore depths and/or downhole load depths while minimizing voltage drops and electrical losses in the power system.

Current technical solutions for offshore-applications make use of sea-bed mounted step-down transformers to reduce cable loss (for example, "Converter-Fed Subsea Motor Drives", Raad, R. O.; Henriksen, T.; Raphael, H. B.; Hadler-Jacobsen, A.; Industry Applications, IEEE Transactions on Volume 32, Issue 5, September-October 1996 Page(s): 1069-1079, which is incorporated by reference as if fully set forth herein). However, these sea-bed mounted transformers may not be useful to drive downhole loads under solid ground (for example, in a subsurface wellbore).

FIGS. 169 and 170 depict an embodiment of transformer 580 that may be located in a subsurface wellbore. FIG. 169 depicts a top view representation of the embodiment of transformer 580 showing the windings and core of the transformer. FIG. 170 depicts a side view representation of the embodiment of transformer 580 showing the windings, the core, and the power leads. Transformer 580 includes primary windings 738A and secondary windings 738B. Primary windings 738A and secondary windings 738B may have different cross-sectional areas.

Core 740 may include two half-shell core sections 740A and 740B around primary windings 738A and secondary windings 738B. In certain embodiments, core sections 740A and 740B are semicircular, symmetric shells. Core sections 740A and 740B may be single pieces that extend the full length of transformer 580 or the core sections may be assembled from multiple shell segments put together (for example, multiple pieces strung together to make the core sections). In certain embodiments, a core section is formed by putting together the section from two halves. The two halves of the core section may be put together after the windings, which may be pre-fabricated, are placed in the transformer.

In certain embodiments, core sections 740A and 740B have about the same cross section on the circumference of transformer 580 so that the core properly guides the magnetic flux in the transformer. Core sections 740A and 740B may be made of several layers of core material. Certain orientations of these layers may be designed to minimize eddy current losses in transformer 580. In some embodiments, core sections 740A and 740B are made of continuous ribbons and windings 738A and 738B are wound into the core sections.

Transformer 580 may have certain advantages over current transformer configurations (such as a toroid core design with the winding on the outside of the cores). Core sections 740A and 740B have outer surfaces that offer large surface areas for cooling transformer 580. Additionally, transformer 580 may be sealed so that a cooling liquid may be continuously run across the outer surfaces of the transformer to cool the transformer. Transformer 580 may be sealed so that cooling liquids do not directly contact the inside of the core and/or the windings. In certain embodiments, transformer is sealed in an epoxy resin or other electrically insulating sealing material. Cooling transformer 580 allows the transformer to operate at higher power densities. In certain embodiments, windings 738A and 738B are substantially isolated from core sections 740A and 740B so that the outside surfaces of transformer 580 may touch the walls of a wellbore without causing electrical problems in the wellbore.

In some embodiments, the profile of the core of transformer 580 and/or the winding window profile are made with clearances to allow for additional cooling devices, mechanical supports, and/or electrical contacts on the transformer. In some embodiments, transformer 580 is coupled to one or more additional transformers in the subsurface wellbore to increase power in the wellbore and/or phase options in the wellbore. Transformer 580 and/or the phases of the transformer may be coupled to the additional transformers, and/or the varying phases of the additional transformers, in either series or parallel configurations as needed to provide power to the downhole load.

FIG. 171 depicts an embodiment of transformer 580 in a wellbore 742. Transformer 580 is located in the overburden section of wellbore 742. The overburden section of wellbore 742 has overburden casing 564. Overburden casing 564 electrically and thermally insulates the overburden from the inside of wellbore 742. Packing material 566 is located at the bottom of the overburden section of wellbore 742. Packing material 566 inhibits fluid flow between the overburden section of wellbore 742 and the heating section of the wellbore.

Power lead 744 may be coupled to transformer 580 and pass through packing material 566 to provide power to the downhole load (for example, a downhole heater). In certain embodiments, cooling fluid 746 is located in wellbore 742. Transformer 580 may be immersed in cooling fluid 746. Cooling fluid 746 may cool transformer 580 by removing heat from the transformer and moving the heat away from the transformer. Cooling fluid 746 may be circulated in wellbore 742 to increase heat transfer between transformer 580 and the cooling fluid. In some embodiments, cooling fluid 746 is circulated to a chiller or other heat exchanger to remove heat from the cooling fluid and maintain a temperature of the cooling fluid at a selected temperature. Maintaining cooling fluid 746 at a selected temperature may provide efficient heat transfer between the cooling fluid and transformer 580 so that the transformer is maintained at a desired operating temperature.

In certain embodiments, cooling fluid 746 maintains a temperature of transformer 580 below a selected temperature. The selected temperature may be a maximum operating temperature of the transformer. In some embodiments, the selected temperature is a maximum temperature that allows for a selected operational efficiency of the transformer. In some embodiments, transformer 580 operates at an efficiency of at least 95%, at least 90%, at least 80%, or at least 70% when the transformer operates below the selected temperature.

In certain embodiments, cooling fluid 746 is water. In some embodiments, cooling fluid 746 is another heat transfer fluid such as, but not limited to, oil, ammonia, helium, or Freon® (E. I. du Pont de Nemours and Company, Wilmington, Del., U.S.A.). In some embodiments, the wellbore adjacent to the overburden functions as a heat pipe. Transformer 580 boils cooling fluid 746. Vaporized cooling fluid 746 rises in the wellbore, condenses, and flows back to transformer 580. Vaporization of cooling fluid 746 transfers heat to the cooling fluid and condensation of the cooling fluid allows heat to transfer to the overburden. Transformer 580 may operate near the vaporization temperature of cooling fluid 746.

In some embodiments, cooling fluid is circulated in a pipe that surrounds the transformer. The pipe may be in direct thermal contact with the transformer so that heat is removed from the transformer into the cooling fluid circulating through the pipe. In some embodiments, the transformer includes fans, heat sinks, fins, or other devices that assist in transferring heat away from the transformer. In some embodiments, the transformer is, or includes, a solid state transformer device such as an AC to DC converter.

In certain embodiments, the cooling fluid for the downhole transformer is circulated using a heat pipe in the wellbore. FIG. 172 depicts an embodiment of transformer 580 in wellbore 742 with heat pipes 748A,B. Lid 750 is placed at the top of a reservoir of cooling fluid 746 that surrounds transformer 580. Heated cooling fluid expands and flows up heat pipe 748A. The heated cooling fluid 746 cools adjacent to the overburden and flows back to lid 750. The cooled cooling fluid 746 flows back into the reservoir through heat pipe 748B. Heat pipes 748A,B act to create a flow path for the cooling fluid so that the cooling fluid circulates around transformer 580 and maintains a temperature of the transformer below the selected temperature.

Computational analysis has shown that a circulated water column was sufficient to cool a 60 Hz transformer that was 125 feet in length and generated 80 W/ft of heat. The transformer and the formation were initially at ambient temperatures. The water column was initially at an elevated temperature. The water column and transformer cooled over a period of about 1 to 2 hours. The transformer initially heated up (but was still at operable temperatures) but then was cooled by the water column to lower operable temperatures. The computations also showed that the transformer would be cooled by the water column when the transformer and the formation were initially at higher than normal temperatures.

Modern utility voltage regulators have microprocessor controllers that monitor output voltage and adjust taps up or down to match a desired setting. Typical controllers include current monitoring and may be equipped with remote communications capabilities. The controller firmware may be modified for current based control (for example, control desired for maintaining constant wattage as heater resistances vary with temperature). Load resistance monitoring as well as other electrical analysis based evaluation and control are a possibility because of the availability of both current and voltage sensing by the controller. In addition to current, sensed electrical properties including, but not limited to power, voltage, power factor, resistance or harmonics may be used as control parameters. Typical tap changers have a 200% of nominal, short time current rating. Thus, the regulator controller may be programmed to respond to overload currents by means of tap changer operation.

Electronic heater controls such as silicon-controlled rectifiers (SCRs) may be used to provide power to and control subsurface heaters. SCRs may be expensive to use and may waste electrical energy in the power circuit. SCRs may also produce harmonic distortions during power control of the subsurface heaters. Harmonic distortion may put noise on the power line and stress heaters. In addition, SCRs may overly stress heaters by switching the power between being full on and full off rather than regulating the power at or near the ideal current setting. Thus, there may be significant overshooting and/or undershooting at the target current for temperature limited heaters (for example, heaters using ferromagnetic materials for self-limiting temperature control).

A variable voltage, load tap changing transformer, which is based on a load tap changing regulator design, may be used to provide power to and control subsurface heaters more simply and without the harmonic distortion associated with electronic heater control. The variable voltage transformer may be connected to power distribution systems by simple, inexpensive fused cutouts. The variable voltage transformer may provide a cost effective, stand alone, full function heater controller and isolation transformer.

FIG. 173 depicts a schematic for a conventional design of tap changing voltage regulator 752. Regulator 752 provides plus or minus 10% adjustment of the input or line voltage. Regulator 752 includes primary winding 754 and tap changer section 756, which includes the secondary winding of the regulator. Primary winding 754 is a series winding electrically coupled to the secondary winding of tap changer section 756. Tap changer section 756 includes eight taps 758A-H that separate the voltage on the secondary winding into voltage steps. Moveable tap changer 760 is a moveable preventive autotransformer with a balance winding. Tap changer 760 may be a sliding tap changer that moves between taps 758A-H in tap changer section 756. Tap changer 760 may be capable of carrying high currents up to, for example, 668 A or more.

Tap changer 760 contacts either one tap 758 or bridges between two taps to provide a midpoint between the two tap voltages. Thus, 16 equivalent voltage steps are created for tap changer 760 to couple to in tap changer section 756. The voltage steps divide the 10% range of regulation equally (⅝% per step). Switch 762 changes the voltage adjustment between plus and minus adjustment. Thus, voltage can be regulated plus 10% or minus 10% from the input voltage.

Voltage transformer 764 senses the potential at bushing 766. The potential at bushing 766 may be used for evaluation by a microprocessor controller. The controller adjusts the tap position to match a preset value. Control power transformer 768 provides power to operate the controller and the tap changer motor. Current transformer 770 is used to sense current in the regulator.

FIG. 174 depicts a schematic for variable voltage, load tap changing transformer 772. The schematic for transformer 772 is based on the load tap changing regulator schematic depicted in FIG. 173. Primary winding 754 is isolated from the secondary winding of tap changer section 756 to create distinct primary and secondary windings. Primary winding 754 may be coupled to a voltage source using bushings 774, 776. The voltage source may provide a first voltage across primary winding 754. The first voltage may be a high voltage such as voltages of at least 5 kV, at least 10 kV, at least 25 kV, or at least 35 kV up to about 50 kV. The secondary winding in tap changer section 756 may be coupled to an electrical load (for example, one or more subsurface heaters) using bushings 778, 780. The electrical load may include, but not be limited to, an insulated conductor heater (for example, mineral insulated conductor heater), a conductor-in-conduit heater, a temperature limited heater, a dual leg heater, or one heater leg of a three-phase heater configuration. The electrical load may be other than a heater (for example, a bottom hole assembly for forming a wellbore).

The secondary winding in tap changer section 756 steps down the first voltage across primary winding 754 to a second voltage (for example, voltage lower than the first voltage or a second voltage). In certain embodiments, the secondary winding in tap changer section 756 steps down the voltage from primary winding 754 to the second voltage that is between 5% and 20% of the first voltage across the primary winding. In some embodiments, the secondary winding in tap changer section 756 steps down the voltage from primary winding 754 to the second voltage that is between 1% and 30% or between 3% and 25% of the first voltage across the primary winding. In one embodiment, the secondary winding in tap changer section 756 steps down the voltage from primary winding 754 to the second voltage that is 10% of the first voltage across the primary winding. For example, a first voltage of 7200 V across the primary winding may be stepped down to a second voltage of 720 V across the secondary winding in tap changer section 756.

In some embodiments, the step down percentage in tap changer section 756 is preset. In some embodiments, the step down percentage in tap changer section 756 may be adjusted as needed for desired operation of a load coupled to transformer 772.

Taps 758A-H (or any other number of taps) divide the second voltage on the secondary winding in tap changer section 756 into voltage steps. The second voltage is divided into voltage steps from a selected minimum percentage of the second voltage up to the full value of the second voltage. In certain embodiments, the second voltage is divided into equivalent voltage steps between the selected minimum percentage and the full second voltage value. In some embodiments, the selected minimum percentage is 0% of the second voltage. For example, the second voltage may be equally divided by the taps in voltage steps ranging between 0 V and 720 V. In some embodiments, the selected minimum percentage is 25% or 50% of the second voltage.

Transformer 772 includes tap changer 760 that contacts either one tap 758 or bridges between two taps to provide a midpoint between the two tap voltages. The position of tap changer 760 on the taps determines the voltage provided to an electrical load coupled to bushings 778, 780. As an example, an arrangement with 8 taps in tap changer section 756 provides 16 voltage steps for tap changer 760 to couple to in tap changer section 756. Thus, the electrical load may be provided with 16 different voltages varying between the selected minimum percentage and the second voltage.

In certain embodiments of transformer 772, the voltage steps divide the range between the selected minimum percentage and the second voltage equally (the voltage steps are equivalent). For example, eight taps may divide a second voltage of 720 V into 16 voltage steps between 0 V and 720 V so that each tap increments the voltage provided to the electrical load by 45V. In some embodiments, the voltage steps divide the range between the selected minimum percentage and the second voltage in non-equal increments (the voltage steps are not equivalent).

Switch 762 may be used to electrically disconnect bushing 780 from the secondary winding and taps 758. Electrically isolating bushing 780 from the secondary winding turns off the power (voltage) provided to the electrical load coupled to bushings 778, 780. Thus, switch 762 provides an internal disconnect in transformer 772 to electrically isolate and turn off power (voltage) to the electrical load coupled to the transformer.

In transformer 772, voltage transformer 764, control power transformer 768, and current transformer 770 are electrically isolated from primary winding 754. Electrical isolation protects voltage transformer 764, control power transformer 768, and current transformer 770 from current and/or voltage overloads caused by primary winding 754.

In certain embodiments, transformer 772 is used to provide power to a variable electrical load (for example, a subsurface heater such as, but not limited to, a temperature limited heater using ferromagnetic material that self-limits at the Curie temperature or a phase transition temperature range). Transformer 772 allows power to the electrical load to be adjusted in small voltage increments (voltage steps) by moving tap changer 760 between taps 758. Thus, the voltage supplied to the electrical load may be adjusted incrementally to provide constant current to the electrical load in response to changes in the electrical load (for example, changes in resistance of the electrical load). Voltage to the electrical load may be controlled from a minimum voltage (the selected minimum percentage) up to full potential (the second voltage) in increments. The increments may be equal increments or non-equal increments. Thus, power to the electrical load does not have to be turned full on or off to control the electrical load such as is done with a SCR controller. Using small increments may reduce cycling stress on the electrical load and may increase the lifetime of the device that is the electrical load. Transformer 772 changes the voltage using mechanical operation instead of the electrical switching used in SCRs. Electrical switching can add harmonics and/or noise to the voltage signal provided to the electrical load. The mechanical switching of transformer 772 provides clean, noise free, incrementally adjustable control of the voltage provided to the electrical load.

Transformer 772 may be controlled by controller 782. Controller 782 may be a microprocessor controller. Controller 782 may be powered by control power transformer 768. Controller 782 may assess properties of transformer 772, including tap changer section 756, and/or the electrical load coupled to the transformer. Examples of properties that may be assessed by controller 782 include, but are not limited to, voltage, current, power, power factor, harmonics, tap change operation count, maximum and minimum value recordings, wear of the tap changer contacts, and electrical load resistance.

In certain embodiments, controller 782 is coupled to the electrical load to assess properties of the electrical load. For example, controller 782 may be coupled to the electrical load using an optical fiber. The optical fiber allows measurement of properties of the electrical load such as, but not limited to, electrical resistance, impedance, capacitance, and/or temperature. In some embodiments, controller 782 is coupled to voltage transformer 764 and/or current transformer 770 to assess the voltage and/or current output of transformer 772. In some embodiments, the voltage and current are used to assess a resistance of the electrical load over one or more selected time periods. In some embodiments, the voltage and current are used to assess or diagnose other properties of the electrical load (for example, temperature).

In certain embodiments, controller 782 adjusts the voltage output of transformer 772 in response to changes in the electrical load coupled to the transformer or other changes in the power distribution system such as, but not limited to, input voltage to the primary winding or other power supply changes. For example, controller 782 may adjust the voltage output of transformer 772 in response to changes in the electrical resistance of the electrical load. Controller 782 may adjust the output voltage by controlling the movement of control tap changer 760 between taps 758 to adjust the voltage output of transformer 772. In some embodiments, controller 782 adjusts the voltage output of transformer 772 so that the electrical load (for example, a subsurface heater) is operated at a relatively constant current. In some embodiments, controller 782 may adjust the voltage output of transformer 772 by moving tap changer 760 to a new tap, assess the resistance and/or power at the new tap, and move the tap changer to another new tap if needed.

In some embodiments, controller 782 assesses the electrical resistance of the load (for example, by measuring the voltage and current using the voltage and current transformers or by measuring the resistance of the electrical load using the optical fiber) and compares the assessed electrical resistance to a theoretical resistance. Controller 782 may adjust the voltage output of transformer 772 in response to differences between the assessed resistance and the theoretical resistance. In some embodiments, the theoretical resistance is an ideal resistance for operation of the electrical load. In some embodiments, the theoretical resistance varies over time due to other changes in the electrical load (for example, temperature of the electrical load).

In some embodiments, controller 782 is programmable to cycle tap changer 760 between two or more taps 758 to achieve intermediate voltage outputs (for example, a voltage output between two tap voltage outputs). Controller 782 may adjust the time tap changer 760 is on each of the taps cycled between to obtain an average voltage at or near the desired intermediate voltage output. For example, controller 782 may keep tap changer 760 at two taps approximately 50% of the time each to maintain an average voltage approximately midway between the voltages at the two taps.

In some embodiments, controller 782 is programmable to limit the numbers of voltage changes (movement of tap changer 760 between taps 758 or cycles of tap changes) over a period of time. For example, controller 782 may only allow 1 tap change every 30 minutes or 2 tap changes per hour. Limiting the number of tap changes over the period of time reduces the stress on the electrical load (for example, a heater) from changes in voltage to the load. Reducing the stresses applied to the electrical load may increase the lifetime of the electrical load. Limiting the number of tap changes may also increase the lifetime of the tap changer apparatus. In some embodiments, the number of tap changes over the period of time is adjustable using the controller. For example, a user may be allowed to adjust the cycle limit for tap changes on transformer 772.

In some embodiments, controller 782 is programmable to power the electrical load in a start up sequence. For example, subsurface heaters may require a certain start up protocol (such as high current during early times of heating and lower current as the temperature of the heater reaches a set point). Ramping up power to the heaters in a desired procedure may reduce mechanical stresses on the heaters from materials expanding at different rates. In some embodiments, controller 782 ramps up power to the electrical load with controlled increases in voltage steps over time. In some embodiments, controller 782 ramps up power to the electrical load with controlled increases in watts per hour. Controller 782 may be programmed to automatically start up the electrical load according to a user input start up procedure or a pre-programmed start up procedure.

In some embodiments, controller 782 is programmable to turn off power to the electrical load in a shut down sequence. For example, subsurface heaters may require a certain shut down protocol to inhibit the heaters from cooling to quickly. Controller 782 may be programmed to automatically shut down the electrical load according to a user input shut down procedure or a pre-programmed shut down procedure.

In some embodiments, controller 782 is programmable to power the electrical load in a moisture removal sequence. For example, subsurface heaters or motors may require start up at second voltages to remove moisture from the system before application of higher voltages. In some embodiments, controller 782 inhibits increases in voltage until required electrical load resistance values are met. Limiting increases in voltage may inhibit transformer 772 from applying voltages that cause shorting due to moisture in the system. Controller 782 may be programmed to automatically start up the electrical load according to a user input moisture removal sequence or a pre-programmed moisture removal procedure.

In some embodiments, controller 782 is programmable to reduce power to the electrical load based on changes in the voltage input to primary winding 754. For example, the power to the electrical load may be reduced during brownouts or other power supply shortages. Reducing the power to the electrical load may compensate for the reduced power supply.

In some embodiments, controller 782 is programmable to protect the electrical load from being overloaded. Controller 782 may be programmed to automatically and immediately reduce the voltage output if the current to the electrical load increases above a selected value. The voltage output may be stepped down as fast as possible while sensing the current. Sensing of the current occurs on a faster time scale than the step downs in voltage so the voltage may be stepped down as fast as possible until the current drops below a selected level. In some embodiments, tap changes (voltage steps) may be inhibited above higher current levels. At the higher current levels, secondary fusing may be used to limit the current. Reducing the tap setting in response to the higher current levels may allow for continued operation of the transformer even after partial failure or quenching of electrical loads such as heaters.

In some embodiments, controller 782 records or tracks data from the operation of the electrical load and/or transformer 772. For example, controller 782 may record changes in the resistance or other properties of the electrical load or transformer 772. In some embodiments, controller 782 records faults in operation of transformer 772 (for example, missed step changes).

In certain embodiments, controller 782 includes communication modules. The communication modules may be programmed to provide status, data, and/or diagnostics for any device or system coupled to the controller such as the electrical load or transformer 772. The communication modules may communicate using RS485 serial communication, Ethernet, fiber, wireless, and/or other communication technologies known in the art. The communication modules may be used to transmit information remotely to another site so that controller 782 and transformer 772 are operated in a self-contained or automatic manner but are able to report to another location (for example, a central monitoring location). The central monitoring location may monitor several controllers and transformers (for example, controllers and transformers located in a hydrocarbon processing field). In some embodiments, users or equipment at the central monitoring location are able to remotely operate one or more of the controllers using the communications modules.

FIG. 175 depicts a representation of an embodiment of transformer 772 and controller 782. In certain embodiments, transformer 772 is enclosed in enclosure 784. Enclosure 784 may be a cylindrical can. Enclosure 784 may be any other suitable enclosure known in the art (for example, a substation style rectangular enclosure). Controller 782 may be mounted to the outside of enclosure 784. Bushings 774, 776, 778, and 780 may be open air, high voltage bushings located on the outside of enclosure 784 for coupling transformer 772 to the power supply and the electrical load.

In certain embodiments, enclosure 784 is mounted on a pole or otherwise supported off the ground. In some embodiments, one or more enclosures 784 are mounted on an elevated platform supported by a pole or elevated mounting support. Mounting enclosure 784 on a pole or mounting support increases air circulation around and in the enclosure and transformer 772. Increasing air circulation decreases operating temperatures and increases efficiency of the transformer. In certain embodiments, components of transformer 772 are coupled to the top of enclosure 784 so that the components are removed as a single unit from the enclosure by removing the top of the enclosure.

In certain embodiments, three transformers 772 are used to operate three, or multiples of three, electrical loads in a three-phase configuration. The three transformers may be monitored to assess if the tap positions in each transformer are in sync (at the same tap position). In some embodiments, one controller 782 is used to control the three transformers. The controller may monitor the transformers to ensure that the transformers are in sync.

In certain embodiments, a temperature limited heater is utilized for heavy oil applications (for example, treatment of relatively permeable formations or tar sands formations). A temperature limited heater may provide a relatively low Curie temperature and/or phase transformation temperature range so that a maximum average operating temperature of the heater is less than 350° C., 300° C., 250° C., 225° C., 200° C., or 150° C. In an embodiment (for example, for a tar sands formation), a maximum temperature of the temperature limited heater is less than about 250° C. to inhibit olefin generation and production of other cracked products. In some embodiments, a maximum temperature of the temperature limited heater is above about 250° C. to produce lighter hydrocarbon products. In some embodiments, the maximum temperature of the heater may be at or less than about 500° C.

A heater may heat a volume of formation adjacent to a production wellbore (a near production wellbore region) so that the temperature of fluid in the production wellbore and in the volume adjacent to the production wellbore is less than the temperature that causes degradation of the fluid. The heat source may be located in the production wellbore or near the production wellbore. In some embodiments, the heat source is a temperature limited heater. In some embodiments, two or more heat sources may supply heat to the volume. Heat from the heat source may reduce the viscosity of crude oil in or near the production wellbore. In some embodiments, heat from the heat source mobilizes fluids in or near the production wellbore and/or enhances the flow of fluids to the production wellbore. In some embodiments, reducing the viscosity of crude oil allows or enhances gas lifting of heavy oil (at most about 10° API gravity oil) or intermediate gravity oil (approximately 12° to 20° API gravity oil) from the production wellbore. In certain embodiments, the initial API gravity of oil in the formation is at most 10°, at most 20°, at most 25°, or at most 30°. In certain embodiments, the viscosity of oil in the formation is at least 0.05 Pa·s (50 cp). In some embodiments, the viscosity of oil in the formation is at least 0.10 Pa·s (100 cp), at least 0.15 Pa·s (150 cp), or at least at least 0.20 Pa·s (200 cp). Large amounts of natural gas may have to be utilized to provide gas lift of oil with viscosities above 0.05 Pa·s. Reducing the viscosity of oil at or near the production wellbore in the formation to a viscosity of 0.05 Pa·s (50 cp), 0.03 Pa·s (30 cp), 0.02 Pa·s (20 cp), 0.01 Pa·s (10 cp), or less (down to 0.001 Pa·s (1 cp) or lower) lowers the amount of natural gas or other fluid needed to lift oil from the formation. In some embodiments, reduced viscosity oil is produced by other methods such as pumping.

The rate of production of oil from the formation may be increased by raising the temperature at or near a production wellbore to reduce the viscosity of the oil in the formation in and adjacent to the production wellbore. In certain embodiments, the rate of production of oil from the formation is increased by 2 times, 3 times, 4 times, or greater over standard cold production with no external heating of formation during production. Certain formations may be more economically viable for enhanced oil production using the heating of the near production wellbore region. Formations that have a cold production rate approximately between 0.05 $m^3$/(day per meter of wellbore length) and 0.20 $m^3$/(day per meter of wellbore length) may have significant improvements in production rate using heating to reduce the viscosity in the near production wellbore region. In some formations, production wells up to 775 m, up to 1000 m, or up to 1500 m in length are used. Thus, a significant increase in production is achievable in some formations. Heating the near production wellbore region may be used in formations where the cold production rate is not between 0.05 $m^3$/(day per meter of wellbore length) and 0.20 $m^3$/(day per meter of wellbore length), but heating such formations may not be as economically favorable. Higher cold production rates may not be significantly increased by heating the near wellbore region, while lower production rates may not be increased to an economically useful value.

Using the temperature limited heater to reduce the viscosity of oil at or near the production well inhibits problems associated with non-temperature limited heaters and heating the oil in the formation due to hot spots. One possible problem is that non-temperature limited heaters can cause coking of oil at or near the production well if the heater overheats the oil because the heaters are at too high a temperature. Higher temperatures in the production well may also cause brine to boil in the well, which may lead to scale formation in the well. Non-temperature limited heaters that reach higher temperatures may also cause damage to other wellbore components (for example, screens used for sand control, pumps, or valves). Hot spots may be caused by portions of the formation expanding against or collapsing on the heater. In some embodiments, the heater (either the temperature limited heater or another type of non-temperature limited heater) has sections that are lower because of sagging over long heater distances. These lower sections may sit in heavy oil or bitumen that collects in lower portions of the wellbore. At these lower sections, the heater may develop hot spots due to coking of the heavy oil or bitumen. A standard non-temperature limited heater may overheat at these hot spots, thus producing a non-uniform amount of heat along the length of the heater. Using the temperature limited heater may inhibit overheating of the heater at hot spots or lower sections and provide more uniform heating along the length of the wellbore.

In certain embodiments, fluids in the relatively permeable formation containing heavy hydrocarbons are produced with little or no pyrolyzation of hydrocarbons in the formation. In certain embodiments, the relatively permeable formation containing heavy hydrocarbons is a tar sands formation. For example, the formation may be a tar sands formation such as the Athabasca tar sands formation in Alberta, Canada or a carbonate formation such as the Grosmont carbonate formation in Alberta, Canada. The fluids produced from the formation are mobilized fluids. Producing mobilized fluids may be more economical than producing pyrolyzed fluids from the tar sands formation. Producing mobilized fluids may also increase the total amount of hydrocarbons produced from the tar sands formation.

FIGS. 176-179 depict side view representations of embodiments for producing mobilized fluids from tar sands formations. In FIGS. 176-179, heaters 438 have substantially horizontal heating sections in hydrocarbon layer 484 (as shown, the heaters have heating sections that go into and out of the page). Hydrocarbon layer 484 may be below overburden 482. FIG. 176 depicts a side view representation of an embodiment for producing mobilized fluids from a tar sands formation with a relatively thin hydrocarbon layer. FIG. 177 depicts a side view representation of an embodiment for producing mobilized fluids from a hydrocarbon layer that is thicker than the hydrocarbon layer depicted in FIG. 176. FIG. 178 depicts a side view representation of an embodiment for producing mobilized fluids from a hydrocarbon layer that is thicker than the hydrocarbon layer depicted in FIG. 177. FIG. 179 depicts a side view representation of an embodiment for producing mobilized fluids from a tar sands formation with a hydrocarbon layer that has a shale break.

In FIG. 176, heaters 438 are placed in an alternating triangular pattern in hydrocarbon layer 484. In FIGS. 177, 178, and 179, heaters 438 are placed in an alternating triangular pattern in hydrocarbon layer 484 that repeats vertically to encompass a majority or all of the hydrocarbon layer. In FIG. 179, the alternating triangular pattern of heaters 438 in hydrocarbon layer 484 repeats uninterrupted across shale break 786. In FIGS. 176-179, heaters 438 may be equidistantly spaced from each other. In the embodiments depicted in FIGS. 176-179, the number of vertical rows of heaters 438 depends on factors such as, but not limited to, the desired spacing between the heaters, the thickness of hydrocarbon layer 484, and/or the number and location of shale breaks 786. In some embodiments, heaters 438 are arranged in other patterns. For example, heaters 438 may be arranged in patterns such as, but not limited to, hexagonal patterns, square patterns, or rectangular patterns.

In the embodiments depicted in FIGS. 176-179, heaters 438 provide heat that mobilizes hydrocarbons (reduces the viscosity of the hydrocarbons) in hydrocarbon layer 484. In certain embodiments, heaters 438 provide heat that reduces the viscosity of the hydrocarbons in hydrocarbon layer 484 below about 0.50 Pa·s (500 cp), below about 0.10 Pa·s (100 cp), or below about 0.05 Pa·s (50 cp). The spacing between heaters 438 and/or the heat output of the heaters may be designed and/or controlled to reduce the viscosity of the hydrocarbons in hydrocarbon layer 484 to desirable values. Heat provided by heaters 438 may be controlled so that little or no pyrolyzation occurs in hydrocarbon layer 484. Superposition of heat between the heaters may create one or more drainage paths (for example, paths for flow of fluids) between the heaters. In certain embodiments, production wells 206A and/or production wells 206B are located proximate heaters 438 so that heat from the heaters superimposes over the production wells. The superimposition of heat from heaters 438 over production wells 206A and/or production wells 206B creates one or more drainage paths from the heaters to the production wells. In certain embodiments, one or more of the drainage paths converge. For example, the drainage paths may converge at or near a bottommost heater and/or the drainage paths may converge at or near production wells 206A and/or production wells 206B. Fluids mobilized in hydrocarbon layer 484 tend to flow towards the bottommost heaters 438, production wells 206A and/or production wells 206B in the hydrocarbon layer because of gravity and the heat and pressure gradients established by the heaters and/or the production wells. The drainage paths and/or the converged drainage paths allow production wells 206A and/or production wells 206B to collect mobilized fluids in hydrocarbon layer 484.

In certain embodiments, hydrocarbon layer 484 has sufficient permeability to allow mobilized fluids to drain to production wells 206A and/or production wells 206B. For example, hydrocarbon layer 484 may have a permeability of at least about 0.1 darcy, at least about 1 darcy, at least about 10 darcy, or at least about 100 darcy. In some embodiments, hydrocarbon layer 484 has a relatively large vertical permeability to horizontal permeability ratio ($K_v/K_h$). For example, hydrocarbon layer 484 may have a $K_v/K_h$ ratio between about 0.01 and about 2, between about 0.1 and about 1, or between about 0.3 and about 0.7.

In certain embodiments, fluids are produced through production wells 206A located near heaters 438 in the lower portion of hydrocarbon layer 484. In some embodiments, fluids are produced through production wells 206B located below and approximately midway between heaters 438 in the lower portion of hydrocarbon layer 484. At least a portion of production wells 206A and/or production wells 206B may be oriented substantially horizontal in hydrocarbon layer 484 (as shown in FIGS. 176-179, the production wells have horizontal portions that go into and out of the page). Production wells 206A and/or 206B may be located proximate lower portion heaters 438 or the bottommost heaters.

In some embodiments, production wells 206A are positioned substantially vertically below the bottommost heaters in hydrocarbon layer 484. Production wells 206A may be located below heaters 438 at the bottom vertex of a pattern of the heaters (for example, at the bottom vertex of the triangular pattern of heaters depicted in FIGS. 176-179). Locating production wells 206A substantially vertically below the bottommost heaters may allow for efficient collection of mobilized fluids from hydrocarbon layer 484.

In certain embodiments, the bottommost heaters are located between about 2 m and about 10 m from the bottom of hydrocarbon layer 484, between about 4 m and about 8 m from the bottom of the hydrocarbon layer, or between about 5 m and about 7 m from the bottom of the hydrocarbon layer. In certain embodiments, production wells 206A and/or production wells 206B are located at a distance from the bottommost heaters 438 that allows heat from the heaters to superimpose over the production wells but at a distance from the heaters that inhibits coking at the production wells. Production wells 206A and/or production wells 206B may be located a distance from the nearest heater (for example, the bottommost heater) of at most ¾ of the spacing between heaters in the pattern of heaters (for example, the triangular pattern of heaters depicted in FIGS. 176-179). In some embodiments, production wells 206A and/or production wells 206B are located a distance from the nearest heater of at most ⅔, at most ½, or at most ⅓ of the spacing between heaters in the pattern of heaters. In certain embodiments, production wells 206A and/or production wells 206B are located between about 2 m and about 10 m from the bottommost heaters, between about 4 m and about 8 m from the bottommost heaters, or between about 5 m and about 7 m from the bottommost heaters. Production wells 206A and/or production wells 206B may be located between about 0.5 m and about 8 m from the bottom of hydrocarbon layer 484, between about 1 m and about 5 m from the bottom of the hydrocarbon layer, or between about 2 m and about 4 m from the bottom of the hydrocarbon layer.

In some embodiments, at least some production wells 206A are located substantially vertically below heaters 438 near shale break 786, as depicted in FIG. 179. Production wells 206A may be located between heaters 438 and shale break 786 to produce fluids that flow and collect above the shale break. Shale break 786 may be an impermeable barrier in hydrocarbon layer 484. In some embodiments, shale break 786 has a thickness between about 1 m and about 6 m, between about 2 m and about 5 m, or between about 3 m and about 4 m. Production wells 206A between heaters 438 and shale break 786 may produce fluids from the upper portion of hydrocarbon layer 484 (above the shale break) and production wells 206A below the bottommost heaters in the hydrocarbon layer may produce fluids from the lower portion of the hydrocarbon layer (below the shale break), as depicted in FIG. 179. In some embodiments, two or more shale breaks may exist in a hydrocarbon layer. In such an embodiment, production wells are placed at or near each of the shale breaks to produce fluids flowing and collecting above the shale breaks.

In some embodiments, shale break 786 breaks down (is desiccated or decomposes) as the shale break is heated by heaters 438 on either side of the shale break. As shale break 786 breaks down, the permeability of the shale break increases and fluids flow through the shale break. Once fluids are able to flow through shale break 786, production wells above the shale break may not be needed for production as fluids can flow to production wells at or near the bottom of hydrocarbon layer 484 and be produced there.

In certain embodiments, the bottommost heaters above shale break 786 are located between about 2 m and about 10 m from the shale break, between about 4 m and about 8 m from the bottom of the shale break, or between about 5 m and about 7 m from the shale break. Production wells 206A may be located between about 2 m and about 10 m from the bottommost heaters above shale break 786, between about 4 m and about 8 m from the bottommost heaters above the shale break, or between about 5 m and about 7 m from the bottommost heaters above the shale break. Production wells 206A may be located between about 0.5 m and about 8 m from shale break 786, between about 1 m and about 5 m from the shale break, or between about 2 m and about 4 m from the shale break.

In some embodiments, heat is provided in production wells 206A and/or production wells 206B, depicted in FIGS. 176-179. Providing heat in production wells 206A and/or production wells 206B may maintain and/or enhance the mobility of the fluids in the production wells. Heat provided in production wells 206A and/or production wells 206B may superimpose with heat from heaters 438 to create the flow path from the heaters to the production wells. In some embodiments, production wells 206A and/or production wells 206B include a pump to move fluids to the surface of the formation. In some embodiments, the viscosity of fluids (oil) in production wells 206A and/or production wells 206B is lowered using heaters and/or diluent injection (for example, using a conduit in the production wells for injecting the diluent).

In certain embodiments, in situ heat treatment of the relatively permeable formation containing hydrocarbons (for example, the tar sands formation) includes heating the formation to visbreaking temperatures. For example, the formation may be heated to temperatures between about 100° C. and 260° C., between about 150° C. and about 250° C., between about 200° C. and about 240° C., between about 205° C. and 230° C., between about 210° C. and 225° C. In one embodiment, the formation is heated to a temperature of about 220° C. In one embodiment, the formation is heated to a temperature of about 230° C. At visbreaking temperatures, fluids in the formation have a reduced viscosity (versus their initial viscosity at initial formation temperature) that allows fluids to flow in the formation. The reduced viscosity at visbreaking temperatures may be a permanent reduction in viscosity as the hydrocarbons go through a step change in viscosity at visbreaking temperatures (versus heating to mobilization temperatures, which may only temporarily reduce the viscosity). The visbroken fluids may have API gravities that are relatively low (for example, at most about 10°, about 12°, about 15°, or about 19° API gravity), but the API gravities are higher than the API gravity of non-visbroken fluid from the formation. The non-visbroken fluid from the formation may have an API gravity of 7° or less.

In some embodiments, heaters in the formation are operated at full power output to heat the formation to visbreaking temperatures or higher temperatures. Operating at full power may rapidly increase the pressure in the formation. In certain embodiments, fluids are produced from the formation to maintain a pressure in the formation below a selected pressure as the temperature of the formation increases. In some embodiments, the selected pressure is a fracture pressure of the formation. In certain embodiments, the selected pressure is between about 1000 kPa and about 15000 kPa, between about 2000 kPa and about 10000 kPa, or between about 2500 kPa and about 5000 kPa. In one embodiment, the selected pressure is about 10000 kPa. Maintaining the pressure as close to the fracture pressure as possible may minimize the number of production wells needed for producing fluids from the formation.

In certain embodiments, treating the formation includes maintaining the temperature at or near visbreaking temperatures (as described above) during the entire production phase while maintaining the pressure below the fracture pressure. The heat provided to the formation may be reduced or eliminated to maintain the temperature at or near visbreaking temperatures. Heating to visbreaking temperatures but maintaining the temperature below pyrolysis temperatures or near pyrolysis temperatures (for example, below about 230° C.) inhibits coke formation and/or higher level reactions. Heating to visbreaking temperatures at higher pressures (for example, pressures near but below the fracture pressure) keeps produced gases in the liquid oil (hydrocarbons) in the formation and increases hydrogen reduction in the formation with higher hydrogen partial pressures. Heating the formation to only visbreaking temperatures also uses less energy input than heating the formation to pyrolysis temperatures.

Fluids produced from the formation may include visbroken fluids, mobilized fluids, and/or pyrolyzed fluids. In some embodiments, a produced mixture that includes these fluids is produced from the formation. The produced mixture may have assessable properties (for example, measurable properties). The produced mixture properties are determined by operating conditions in the formation being treated (for example, temperature and/or pressure in the formation). In certain embodiments, the operating conditions may be selected, varied, and/or maintained to produce desirable properties in hydrocarbons in the produced mixture. For example, the produced mixture may include hydrocarbons that have properties that allow the mixture to be easily transported (for example, sent through a pipeline without adding diluent or blending the mixture and/or resulting hydrocarbons with another fluid).

In some embodiments, after the formation reaches visbreaking temperatures, the pressure in the formation is reduced. In certain embodiments, the pressure in the formation is reduced at temperatures above visbreaking temperatures. Reducing the pressure at higher temperatures allows more of the hydrocarbons in the formation to be converted to higher quality hydrocarbons by visbreaking and/or pyrolysis. Allowing the formation to reach higher temperatures before pressure reduction, however, may increase the amount of carbon dioxide produced and/or the amount of coking in the formation. For example, in some formations, coking of bitumen (at pressures above 700 kPa) begins at about 280° C. and reaches a maximum rate at about 340° C. At pressures below about 700 kPa, the coking rate in the formation is minimal. Allowing the formation to reach higher temperatures before pressure reduction may decrease the amount of hydrocarbons produced from the formation.

In certain embodiments, the temperature in the formation (for example, an average temperature of the formation) when the pressure in the formation is reduced is selected to balance one or more factors. The factors considered may include: the quality of hydrocarbons produced, the amount of hydrocarbons produced, the amount of carbon dioxide produced, the amount hydrogen sulfide produced, the degree of coking in the formation, and/or the amount of water produced. Experimental assessments using formation samples and/or simulated assessments based on the formation properties may be used to assess results of treating the formation using the in situ heat treatment process. These results may be used to determine a selected temperature, or temperature range, for when the pressure in the formation is to be reduced. The selected temperature, or temperature range, may also be affected by factors such as, but not limited to, hydrocarbon or oil market conditions and other economic factors. In certain embodiments, the selected temperature is in a range between about 275° C. and about 305° C., between about 280° C. and about 300° C., or between about 285° C. and about 295° C.

In certain embodiments, an average temperature in the formation is assessed from an analysis of fluids produced from the formation. For example, the average temperature of the formation may be assessed from an analysis of the fluids that have been produced to maintain the pressure in the formation below the fracture pressure of the formation.

In some embodiments, values of the hydrocarbon isomer shift in fluids (for example, gases) produced from the formation is used to indicate the average temperature in the formation. Experimental analysis and/or simulation may be used to assess one or more hydrocarbon isomer shifts and relate the values of the hydrocarbon isomer shifts to the average temperature in the formation. The assessed relation between the hydrocarbon isomer shifts and the average temperature may then be used in the field to assess the average temperature in the formation by monitoring one or more of the hydrocarbon isomer shifts in fluids produced from the formation. In some embodiments, the pressure in the formation is reduced when the monitored hydrocarbon isomer shift reaches a selected value. The selected value of the hydrocarbon isomer shift may be chosen based on the selected temperature, or temperature range, in the formation for reducing the pressure in the formation and the assessed relation between the hydrocarbon isomer shift and the average temperature. Examples of hydrocarbon isomer shifts that may be assessed include, but are not limited to, n-butane-$\delta^{13}C_4$ percentage versus propane-$\delta^{13}C_3$ percentage, n-pentane-$\delta^{13}C_5$ percentage versus propane-$\delta^{13}C_3$ percentage, n-pentane-$\delta^{13}C_5$ percentage versus n-butane-$\delta^{13}C_4$ percentage, and i-pentane-$\delta^{13}C_5$ percentage versus i-butane-$\delta^{13}C_4$ percentage. In some embodiments, the hydrocarbon isomer shift in produced fluids is used to indicate the amount of conversion (for example, amount of pyrolysis) that has taken place in the formation.

In some embodiments, weight percentages of saturates in fluids produced from the formation is used to indicate the average temperature in the formation. Experimental analysis and/or simulation may be used to assess the weight percentage of saturates as a function of the average temperature in the formation. For example, SARA (Saturates, Aromatics, Resins, and Asphaltenes) analysis (sometimes referred to as Asphaltene/Wax/Hydrate Deposition analysis) may be used to assess the weight percentage of saturates in a sample of fluids from the formation. In some formations, the weight percentage of saturates has a linear relationship to the average temperature in the formation. The relation between the weight percentage of saturates and the average temperature may then be used in the field to assess the average temperature in the formation by monitoring the weight percentage of saturates in fluids produced from the formation. In some embodiments, the pressure in the formation is reduced when the monitored weight percentage of saturates reaches a selected value. The selected value of the weight percentage of saturates may be chosen based on the selected temperature, or temperature range, in the formation for reducing the pressure in the formation and the relation between the weight percentage of saturates and the average temperature. In some embodiments, the selected value of weight percentage of saturates is between about 20% and about 40%, between about 25% and about 35%, or between about 28% and about 32%. For example, the selected value may be about 30% by weight saturates.

In some embodiments, weight percentages of n-$C_7$ in fluids produced from the formation is used to indicate the average temperature in the formation. Experimental analysis and/or simulation may be used to assess the weight percentages of n-$C_7$ as a function of the average temperature in the formation. In some formations, the weight percentages of n-$C_7$ has a linear relationship to the average temperature in the formation. The relation between the weight percentages of n-$C_7$ and the average temperature may then be used in the field to assess the average temperature in the formation by monitoring the weight percentages of n-$C_7$ in fluids produced from the formation. In some embodiments, the pressure in the formation is reduced when the monitored weight percentage of n-$C_7$ reaches a selected value. The selected value of the weight percentage of n-$C_7$ may be chosen based on the selected temperature, or temperature range, in the formation for reducing the pressure in the formation and the relation between the weight percentage of n-$C_7$ and the average temperature. In some embodiments, the selected value of weight percentage of n-$C_7$ is between about 50% and about 70%, between about 55% and about 65%, or between about 58% and about 62%. For example, the selected value may be about 60% by weight n-$C_7$.

The pressure in the formation may be reduced by producing fluids (for example, visbroken fluids and/or mobilized fluids) from the formation. In some embodiments, the pressure is reduced below a pressure at which fluids coke in the formation to inhibit coking at pyrolysis temperatures. For example, the pressure is reduced to a pressure below about 1000 kPa, below about 800 kPa, or below about 700 kPa (for example, about 690 kPa). In certain embodiments, the selected pressure is at least about 100 kPa, at least about 200 kPa, or at least about 300 kPa. The pressure may be reduced to inhibit coking of asphaltenes or other high molecular weight hydrocarbons in the formation. In some embodiments, the pressure may be maintained below a pressure at which water passes through a liquid phase at downhole (formation) temperatures to inhibit liquid water and dolomite reactions. After reducing the pressure in the formation, the temperature may be increased to pyrolysis temperatures to begin pyrolyzation and/or upgrading of fluids in the formation. The pyrolyzed and/or upgraded fluids may be produced from the formation.

In certain embodiments, the amount of fluids produced at temperatures below visbreaking temperatures, the amount of fluids produced at visbreaking temperatures, the amount of fluids produced before reducing the pressure in the formation, and/or the amount of upgraded or pyrolyzed fluids produced may be varied to control the quality and amount of fluids produced from the formation and the total recovery of hydrocarbons from the formation. For example, producing more fluid during the early stages of treatment (for example, producing fluids before reducing the pressure in the formation) may increase the total recovery of hydrocarbons from the formation while reducing the overall quality (lowering the overall API gravity) of fluid produced from the formation. The overall quality is reduced because more heavy hydrocarbons are produced by producing more fluids at the lower temperatures. Producing less fluids at the lower temperatures may increase the overall quality of the fluids produced from the formation but may lower the total recovery of hydrocarbons from the formation. The total recovery may be lower because more coking occurs in the formation when less fluids are produced at lower temperatures.

In certain embodiments, the formation is heated using isolated cells of heaters (cells or sections of the formation that are not interconnected for fluid flow). The isolated cells may be created by using larger heater spacings in the formation. For example, large heater spacings may be used in the embodiments depicted in FIGS. 176-179. These isolated cells may be produced during early stages of heating (for example, at temperatures below visbreaking temperatures). Because the cells are isolated from other cells in the formation, the pressures in the isolated cells are high and more liquids are producible from the isolated cells. Thus, more liquids may be produced from the formation and a higher total recovery of hydrocarbons may be reached. During later stages of heating, the heat gradient may interconnect the isolated cells and pressures in the formation will drop.

In certain embodiments, the heat gradient in the formation is modified so that a gas cap is created at or near an upper portion of the hydrocarbon layer. For example, the heat gradient made by heaters 438 depicted in the embodiments depicted in FIGS. 176-179 may be modified to create the gas cap at or near overburden 482 of hydrocarbon layer 484. The gas cap may push or drive liquids to the bottom of the hydrocarbon layer so that more liquids may be produced from the formation. In situ generation of the gas cap may be more efficient than introducing pressurized fluid into the formation. The in situ generated gas cap applies force evenly through the formation with little or no channeling or fingering that may reduce the effectiveness of introduced pressurized fluid.

In certain embodiments, the number and/or location of production wells in the formation is varied based on the viscosity of fluid in the formation. The viscosities in the zones may be assessed before placing the production wells in the formation, before heating the formation, and/or after heating the formation. In some embodiments, more production wells are located in zones in the formation that have lower viscosities. For example, in certain formations, upper portions, or zones, of the formation may have lower viscosities. In some embodiments, more production wells are located in the upper zones. Producing through production wells in the less viscous zones of the formation may result in production of higher quality (more upgraded) oil from the formation.

In some embodiments, more production wells are located in zones in the formation that have higher viscosities. Pressure propagation may be slower in the zones with higher viscosities. The slower pressure propagation may make it more difficult to control pressure in the zones with higher viscosities. Thus, more production wells may be located in the zones with higher viscosities to provide better pressure control in these zones.

In some embodiments, zones in the formation with different assessed viscosities are heated at different rates. In certain embodiments, zones in the formation with higher viscosities are heated at higher heating rates than zones with lower viscosities. Heating the zones with higher viscosities at the higher heating rates mobilizes and/or upgrades these zones at a faster rate so that these zones may "catch up" in viscosity and/or quality to the slower heated zones.

In some embodiments, the heater spacing is varied to provide different heating rates to zones in the formation with different assessed viscosities. For example, denser heater spacings (less spaces between heaters) may be used in zones with higher viscosities to heat these zones at higher heating rates. In some embodiments, a production well (for example, a substantially vertical production well) is located in the zones with denser heater spacings and higher viscosities. The production well may be used to remove fluids from the formation and relieve pressure from the higher viscosity zones. In some embodiments, one or more substantially vertical openings, or production wells, are located in the higher viscosity zones to allow fluids to drain in the higher viscosity zones. The draining fluids may be produced from the formation through production wells located near the bottom of the higher viscosity zones.

In certain embodiments, production wells are located in more than one zone in the formation. The zones may have different initial permeabilities. In certain embodiments, a first zone has an initial permeability of at least about 1 darcy and a second zone has an initial permeability of at most about 0.1 darcy. In some embodiments, the first zone has an initial permeability of between about 1 darcy and about 10 darcy. In some embodiments, the second zone has an initial permeability between about 0.01 darcy and 0.1 darcy. The zones may be separated by a substantially impermeable barrier (with an initial permeability of about 10 μdarcy or less). Having the production well located in both zones allows for fluid communication (permeability) between the zones and/or pressure equalization between the zones.

In some embodiments, openings (for example, substantially vertical openings) are formed between zones with different initial permeabilities that are separated by a substantially impermeable barrier. Bridging the zones with the openings allows for fluid communication (permeability) between the zones and/or pressure equalization between the zones. In some embodiments, openings in the formation (such as pressure relief openings and/or production wells) allow gases or low viscosity fluids to rise in the openings. As the gases or low viscosity fluids rise, the fluids may condense or increase viscosity in the openings so that the fluids drain back down the openings to be further upgraded in the formation. Thus, the openings may act as heat pipes by transferring heat from the lower portions to the upper portions where the fluids condense. The wellbores may be packed and sealed near or at the overburden to inhibit transport of formation fluid to the surface.

In some embodiments, production of fluids is continued after reducing and/or turning off heating of the formation. The formation may be heated for a selected time. The formation may be heated until it reaches a selected average temperature. Production from the formation may continue after the selected time. Continuing production may produce more fluid from the formation as fluids drain towards the bottom of the formation and/or as fluids are upgraded by passing by hot spots in the formation. In some embodiments, a horizontal production well is located at or near the bottom of the formation (or a zone of the formation) to produce fluids after heating is turned down and/or off.

In certain embodiments, initially produced fluids (for example, fluids produced below visbreaking temperatures), fluids produced at visbreaking temperatures, and/or other viscous fluids produced from the formation are blended with diluent to produce fluids with lower viscosities. In some embodiments, the diluent includes upgraded or pyrolyzed fluids produced from the formation. In some embodiments, the diluent includes upgraded or pyrolyzed fluids produced from another portion of the formation or another formation. In certain embodiments, the amount of fluids produced at temperatures below visbreaking temperatures and/or fluids produced at visbreaking temperatures that are blended with upgraded fluids from the formation is adjusted to create a fluid suitable for transportation and/or use in a refinery. The amount of blending may be adjusted so that the fluid has chemical and physical stability. Maintaining the chemical and physical stability of the fluid may allow the fluid to be transported, reduce pre-treatment processes at a refinery and/or reduce or eliminate the need for adjusting the refinery process to compensate for the fluid.

In certain embodiments, formation conditions (for example, pressure and temperature) and/or fluid production are controlled to produce fluids with selected properties. For example, formation conditions and/or fluid production may be controlled to produce fluids with a selected API gravity and/or a selected viscosity. The selected API gravity and/or selected viscosity may be produced by combining fluids produced at different formation conditions (for example, combining fluids produced at different temperatures during the treatment as described above). As an example, formation conditions and/or fluid production may be controlled to produce fluids with an API gravity of about 19° and a viscosity of about 0.35 Pa·s (350 cp) at 5° C.

In certain embodiments, a drive process (for example, a steam injection process such as cyclic steam injection, a steam assisted gravity drainage process (SAGD), a solvent injection process, a vapor solvent and SAGD process, or a carbon dioxide injection process) is used to treat the tar sands formation in addition to the in situ heat treatment process. In some embodiments, heaters are used to create high permeability zones (or injection zones) in the formation for the drive process. Heaters may be used to create a mobilization geometry or production network in the formation to allow fluids to flow through the formation during the drive process. For example, heaters may be used to create drainage paths between the heaters and production wells for the drive process. In some embodiments, the heaters are used to provide heat during the drive process. The amount of heat provided by the heaters may be small compared to the heat input from the drive process (for example, the heat input from steam injection).

The concentration of components in the formation and/or produced fluids may change during an in situ heat treatment process. As the concentration of the components in the formation and/or produced fluids and/or hydrocarbons separated from the produced fluid changes due to formation of the components, solubility of the components in the produced fluids and/or separated hydrocarbons tends to change. Hydrocarbons separated from the produced fluid may be hydrocarbons that have been treated to remove salty water and/or gases from the produced fluid. For example, the produced fluids and/or separated hydrocarbons may contain components that are soluble in the condensable hydrocarbon portion of the produced fluids at the beginning of processing. As properties of the hydrocarbons in the produced fluids change (for example, TAN, asphaltenes, P-value, olefin content, mobilized fluids content, visbroken fluids content, pyrolyzed fluids content, or combinations thereof), the components may tend to become less soluble in the produced fluids and/or in the hydrocarbon stream separated from the produced fluids. In some instances, components in the produced fluids and/or components in the separated hydrocarbons may form two phases and/or become insoluble. Formation of two phases, through flocculation of asphaltenes, change in concentration of components in the produced fluids, change in concentration of components in separated hydrocarbons, and/or precipitation of components may result in hydrocarbons that do not meet pipeline, transportation, and/or refining specifications. Additionally, the efficiency of the process may be reduced. For example, further treatment of the produced fluids and/or separated hydrocarbons may be necessary to produce products with desired properties.

During processing, the P-value of the separated hydrocarbons may be monitored and the stability of the produced fluids and/or separated hydrocarbons may be assessed. Typically, a P-value that is at most 1.0 indicates that flocculation of asphaltenes from the separated hydrocarbons generally occurs. If the P-value is initially at least 1.0, and such P-value increases or is relatively stable during heating, then this indicates that the separated hydrocarbons are relatively stable. Stability of separated hydrocarbons, as assessed by P-value, may be controlled by controlling operating conditions in the formation such as temperature, pressure, hydrogen uptake, hydrocarbon feed flow, or combinations thereof.

In some embodiments, change in API gravity may not occur unless the formation temperature is at least 100° C. For some formations, temperatures of at least 220° C. may be required to produce hydrocarbons that meet desired specifications. At increased temperatures coke formation may occur, even at elevated pressures. As the properties of the formation are changed, the P-value of the separated hydrocarbons may decrease below 1.0 and/or sediment may form, causing the separated hydrocarbons to become unstable.

In some embodiments, olefins may form during heating of formation fluids to produce fluids having a reduced viscosity. Separated hydrocarbons that include olefins may be unacceptable for processing facilities. Olefins in the separated hydrocarbons may cause fouling and/or clogging of processing equipment. For example, separated hydrocarbons that contains olefins may cause coking of distillation units in a refinery, which results in frequent down time to remove the coked material from the distillation units.

During processing, the olefin content of separated hydrocarbons may be monitored and quality of the separated hydrocarbons assessed. Typically, separated hydrocarbons having a bromine number of 3% and/or a CAPP olefin number of 3% as 1-decene equivalent indicates that olefin production is occurring. If the olefin value decreases or is relatively stable during producing, then this indicates that a minimal or substantially low amount of olefins are being produced. Olefin content, as assessed by bromine value and/or CAPP olefin number, may be controlled by controlling operating conditions in the formation such as temperature, pressure, hydrogen uptake, hydrocarbon feed flow, or combinations thereof.

In some embodiments, the P-value and/or olefin content may be controlled by controlling operating conditions. For example, if the temperature increases above 225° C. and the P-value drops below 1.0, the separated hydrocarbons may become unstable. Alternatively, the bromine number and/or CAPP olefin number may increase to above 3%. If the temperature is maintained below 225° C., minimal changes to the hydrocarbon properties may occur. In certain embodiments, operating conditions are selected, varied, and/or maintained to produce separated hydrocarbons having a P-value of at least about 1, at least about 1.1, at least about 1.2, or at least about 1.3. In certain embodiments, operating conditions are selected, varied, and/or maintained to produce separated hydrocarbons having a bromine number of at most about 3%, at most about 2.5%, at most about 2%, or at most about 1.5%. Heating of the formation at controlled operating conditions includes operating at temperatures between about 100° C. and about 260° C., between about 150° C. and about 250° C., between about 200° C. and about 240° C., between about 210° C. and about 230° C., or between about 215° C. and about 225° C. Pressures may be between about 1000 kPa and about 15000 kPa, between about 2000 kPa and about 10000 kPa, or between about 2500 kPa and about 5000 kPa or at or near a fracture pressure of the formation. In certain embodiments, the selected pressure of about 10000 kPa produces separated hydrocarbons having properties acceptable for transportation and/or refineries (for example, viscosity, P-value, API gravity, and/or olefin content within acceptable ranges).

Examples of produced mixture properties that may be measured and used to assess the separated hydrocarbon portion of the produced mixture include, but are not limited to, liquid hydrocarbon properties such as API gravity, viscosity, asphaltene stability (P-value), and olefin content (bromine number and/or CAPP number). In certain embodiments, operating conditions in the formation are selected, varied, and/or maintained to produce an API gravity of at least about 15°, at least about 17°, at least about 19°, or at least about 20° in the produced mixture. In certain embodiments, operating conditions in the formation are selected, varied, and/or maintained to produce a viscosity (measured at 1 atm and 5° C.) of at most about 400 cp, at most about 350 cp, at most about 250 cp, or at most about 100 cp in the produced mixture. As an example, the initial viscosity of fluid in the formation is above about 1000 cp or, in some cases, above about 1 million cp. In certain embodiments, operating conditions are selected, varied, and/or maintained to produce an asphaltene stability (P-value) of at least about 1, at least about 1.1, at least about 1.2, or at least about 1.3 in the produced mixture. In certain embodiments, operating conditions are selected, varied, and/or maintained to produce a bromine number of at most about 3%, at most about 2.5%, at most about 2%, or at most about 1.5% in the produced mixture.

In certain embodiments, the mixture is produced from one or more production wells located at or near the bottom of the hydrocarbon layer being treated. In other embodiments, the mixture is produced from other locations in the hydrocarbon layer being treated (for example, from an upper portion of the layer or a middle portion of the layer).

In one embodiment, the formation is heated to 220° C. or 230° C. while maintaining the pressure in the formation below 10000 kPa. The separated hydrocarbon portion of the mixture produced from the formation may have several desirable properties such as, but not limited to, an API gravity of at least 19°, a viscosity of at most 350 cp, a P-value of at least 1.1, and a bromine number of at most 2%. Such separated hydrocarbons may be transportable through a pipeline without adding diluent or blending the mixture with another fluid. The mixture may be produced from one or more production wells located at or near the bottom of the hydrocarbon layer being treated.

The in situ heat treatment process may provide less heat to the formation (for example, use a wider heater spacing) if the in situ heat treatment process is followed by a drive process. The drive process may involve introducing a hot fluid into the formation to increase the amount of heat provided to the formation. In some embodiments, the heaters of the in situ heat treatment process may be used to pretreat the formation to establish injectivity for the subsequent drive process. In some embodiments, the in situ heat treatment process creates or produces the drive fluid in situ. The in situ produced drive fluid may move through the formation and move mobilized hydrocarbons from one portion of the formation to another portion of the formation.

FIG. 180 depicts a top view representation of an embodiment for preheating using heaters before using the drive process (for example, a steam drive process). Injection wells 788 and production wells 206 are substantially vertical wells. Heaters 438 are long substantially horizontal heaters positioned so that the heaters pass in the vicinity of injection wells 788. Heaters 438 intersect the vertical well patterns slightly displaced from the vertical wells.

The vertical location of heaters 438 with respect to injection wells 788 and production wells 206 depends on, for example, the vertical permeability of the formation. In formations with at least some vertical permeability, injected steam will rise to the top of the permeable layer in the formation. In such formations, heaters 438 may be located near the bottom of the hydrocarbon layer 484, as shown in FIG. 181. In formations with very low vertical permeabilities, more than one horizontal heater may be used with the heaters stacked substantially vertically or with heaters at varying depths in the hydrocarbon layer (for example, heater patterns as shown in FIGS. 176-179). The vertical spacing between the horizontal heaters in such formations may correspond to the distance between the heaters and the injection wells. Heaters 438 are located in the vicinity of injection wells 788 and/or production wells 206 so that sufficient energy is delivered by the heaters to provide flow rates for the drive process that are economically viable. The spacing between heaters 438 and injection wells 788 or production wells 206 may be varied to provide an economically viable drive process. The amount of preheating may also be varied to provide an economically viable process.

In some embodiments, the steam injection (or drive) process (for example, SAGD, cyclic steam soak, or another steam recovery process) is used to treat the formation and produce hydrocarbons from the formation. The steam injection process may recover a low amount of oil in place from the formation (for example, less than 20% recovery of oil in place from the formation). The in situ heat treatment process may be used following the steam injection process to increase the recovery of oil in place from the formation. In certain embodiments, the steam injection process is used until the steam injection process is no longer efficient at removing hydrocarbons from the formation (for example, until the steam injection process is no longer economically feasible). The in situ heat treatment process is used to produce hydrocarbons remaining in the formation after the steam injection process. Using the in situ heat treatment process after the steam injection process may allow recovery of at least about 25%, at least about 50%, at least about 55%, or at least about 60% of oil in place in the formation.

In some embodiments, the formation has been at least somewhat heated by the steam injection process before treating the formation using the in situ heat treatment process. For example, the steam injection process may heat the formation to an average temperature between about 200° C. and about 250° C., between about 175° C. and about 265° C., or between about 150° C. and about 270° C. In certain embodiments, the heaters are placed in the formation after the steam injection process is at least 50% completed, at least 75% completed, or near 100% completed. The heaters provide heat for treating the formation using the in situ heat treatment process. In some embodiments, the heaters are already in place in the formation during the steam injection process. In such embodiments, the heaters may be energized after the steam injection process is completed or when production of hydrocarbons using the steam injection process is reduced below a desired level. In some embodiments, steam injection wells from the steam injection process are converted to heater wells for the in situ heat treatment process.

Treating the formation with the in situ heat treatment process after the steam injection process may be more efficient than only treating the formation with the in situ heat treatment process. The steam injection process may provide some energy (heat) to the formation with the steam. Any energy added to the formation during the steam injection process reduces the amount of energy needed to be supplied by heaters for the in situ heat treatment process. Reducing the amount of energy supplied by heaters reduces costs for treating the formation using the in situ heat treatment process.

In certain embodiments, treating the formation using the steam injection process does not treat the formation uniformly. For example, steam injection may not be uniform throughout the formation. Variations in the properties of the formation (for example, fluid injectivities, permeabilities, and/or porosities) may result in non-uniform injection of the steam through the formation. Because of the non-uniform injection of the steam, the steam may remove hydrocarbons from different portions of the formation at different rates or with different results. For example, some portions of the formation may have little or no steam injectivity, which inhibits the hydrocarbon production from these portions. After the steam injection process is completed, the formation may have portions that have lower amounts of hydrocarbons produced (more hydrocarbons remaining) than other parts of the formation.

FIG. 182 depicts a side view representation of an embodiment of a tar sands formation subsequent to a steam injection process. Injection well 788 is used to inject steam into hydrocarbon layer 484 below overburden 482. Portion 790 may have little or no steam injectivity and have small amounts of hydrocarbons or no hydrocarbons at all removed by the steam injection process. Portions 792 may include portions that have steam injectivity and measurable amounts of hydrocarbons are removed by the steam injection process. Thus, portion 790 may have a greater amount of hydrocarbons remaining than portions 792 following treatment with the steam injection process. In some embodiments, hydrocarbon layer 484 includes two or more portions 790 with more hydrocarbons remaining than portions 792.

In some embodiments, the portions with more hydrocarbons remaining (such as portion 790, depicted in FIG. 182) are large portions of the formation. In some embodiments, the amount of hydrocarbons remaining in these portions is significantly higher than other portions of the formation (such as portions 792). For example, portions 790 may have a recovery of at most about 10% of the oil in place and portions 792 may have a recovery of at least about 30% of the oil in place. In some embodiments, portions 790 have a recovery of between about 0% and about 10% of the oil in place, between about 0% and about 15% of the oil in place, or between about 0% and about 20% of the oil in place. The portions 792 may have a recovery of between about 20% and about 25% of the oil in place, between about 20% and about 40% of the oil in place, or between about 20% and about 50% of the oil in place. Coring, logging techniques, and/or seismic imaging may be used to assess hydrocarbons remaining in the formation and assess the location of one or more of the first and/or second portions.

In certain embodiments, during the in situ heat treatment process, more heat is provided to the first portions of the formation that have more hydrocarbons remaining than the second portions with less hydrocarbons remaining. In some embodiments, heaters are located in the first portions but not in the second portions. In some embodiments, heaters are located in both the first portions and the second portions but the heaters in the first portions are designed or operated to provide more heat than the heaters in the second portions. In some embodiments, heaters pass through both first portions and second portions and the heaters are designed or operated to provide more heat in the first portions than the second portions.

In some embodiments, steam injection is continued during the in situ heat treatment process. For example, steam injection may be continued while liquids are being produced from the formation. The steam injection may increase the production of liquids from the formation. In certain embodiments, steam injection may be reduced or stopped when gas production from the formation begins.

In some embodiments, the formation is treated using the in situ heat treatment process a significant time after the formation has been treated using the steam injection process. For example, the in situ heat treatment process is used 1 year, 2 years, 3 years, or longer (for example, 10 years to 20 years) after a formation has been treated using the steam injection process. During this dormant period, heat from the steam injection process may diffuse to cooler parts of the formation and result in a more uniform preheating of the formation prior to in situ heat treatment. The in situ heat treatment process may be used on formations that have been left dormant after the steam injection process treatment because further hydrocarbon production using the steam injection process is not possible and/or not economically feasible. In some embodiments, the formation remains at least somewhat heated from the steam injection process even after the significant time.

In certain embodiments, a fluid is injected into the formation (for example, a drive fluid or an oxidizing fluid) to move hydrocarbons through the formation from a first section to a second section. In some embodiments, the hydrocarbons are moved from the first section to the second section through a third section. FIG. 183 depicts a side view representation of an embodiment using at least three treatment sections in a tar sands formation. Hydrocarbon layer 484 may be divide into three or more treatment sections. In certain embodiments, hydrocarbon layer 484 includes three different types of treatment sections: section 794A, section 794B, and section 794C. Section 794C and sections 794A are separated by sections 794B. Section 794C, sections 794A, and sections 794B may be horizontally displaced from each other in the formation. In some embodiments, one side of section 794C is adjacent to an edge of the treatment area of the formation or an untreated section of the formation is left on one side of section 794C before the same or a different pattern is formed on the opposite side of the untreated section.

In certain embodiments, sections 794A and 794C are heated at or near the same time to similar temperatures (for example, pyrolysis temperatures). Sections 794A and 794C may be heated to mobilize and/or pyrolyze hydrocarbons in the sections. The mobilized and/or pyrolyzed hydrocarbons may be produced (for example, through one or more production wells) from section 794A and/or section 794C. Section 794B may be heated to lower temperatures (for example, mobilization temperatures). Little or no production of hydrocarbons to the surface may take place through section 794B. For example, sections 794A and 794C may be heated to average temperatures of about 300° C. while section 794B is heated to an average temperature of about 100° C. and no production wells are operated in section 794B.

In certain embodiments, heating and producing hydrocarbons from section 794C creates fluid injectivity in the section. After fluid injectivity has been created in section 794C, a fluid such as a drive fluid (for example, steam, water, or hydrocarbons) and/or an oxidizing fluid (for example, air, oxygen, enriched air, or other oxidants) may be injected into the section. The fluid may be injected through heaters 438, a production well, and/or an injection well located in section 794C. In some embodiments, heaters 438 continue to provide heat while the fluid is being injected. In other embodiments, heaters 438 may be turned down or off before or during fluid injection.

In some embodiments, providing oxidizing fluid such as air to section 794C causes oxidation of hydrocarbons in the section. For example, coked hydrocarbons and/or heated hydrocarbons in section 794C may oxidize if the temperature of the hydrocarbons is above an oxidation ignition temperature. In some embodiments, treatment of section 794C with the heaters creates coked hydrocarbons with substantially uniform porosity and/or substantially uniform injectivity so that heating of the section is controllable when oxidizing fluid is introduced to the section. The oxidation of hydrocarbons in section 794C will maintain the average temperature of the section or increase the average temperature of the section to higher temperatures (for example, about 400° C. or above).

In some embodiments, injection of the oxidizing fluid is used to heat section 794C and a second fluid is introduced into the formation after or with the oxidizing fluid to create drive fluids in the section. During injection of oxidant, excess oxidant and/or oxidation products may be removed from section 794C through one or more production wells. After the formation is raised to a desired temperature, a second fluid may be introduced into section 794C to react with coke and/or hydrocarbons and generate drive fluid (for example, synthesis gas). In some embodiments, the second fluid includes water and/or steam. Reactions of the second fluid with carbon in the formation may be endothermic reactions that cool the formation. In some embodiments, oxidizing fluid is added with the second fluid so that some heating of section 794C occurs simultaneous with the endothermic reactions. In some embodiments, section 794C may be treated in alternating steps of adding oxidant to heat the formation, and then adding second fluid to generate drive fluids.

The generated drive fluids in section 794C may include steam, carbon dioxide, carbon monoxide, hydrogen, methane, and/or pyrolyzed hydrocarbons. The high temperature in section 794C and the generation of drive fluid in the section may increase the pressure of the section so the drive fluids move out of the section into adjacent sections. The increased temperature of section 794C may also provide heat to section 794B through conductive heat transfer and/or convective heat transfer from fluid flow (for example, hydrocarbons and/or drive fluid) to section 794B.

In some embodiments, hydrocarbons (for example, hydrocarbons produced from section 794C) are provided as a portion of the drive fluid. The injected hydrocarbons may include at least some pyrolyzed hydrocarbons such as pyrolyzed hydrocarbons produced from section 794C. In some embodiments, steam or water are provided as a portion of the drive fluid. Steam or water in the drive fluid may be used to control temperatures in the formation. For example, steam or water may be used to keep temperatures lower in the formation. In some embodiments, water injected as the drive fluid is turned into steam in the formation due to the higher temperatures in the formation. The conversion of water to steam may be used to reduce temperatures or maintain lower temperatures in the formation.

Fluids injected in section 794C may flow towards section 794B, as shown by the arrows in FIG. 183. Fluid movement through the formation transfers heat convectively through hydrocarbon layer 484 into sections 794B and/or 794A. In addition, some heat may transfer conductively through the hydrocarbon layer between the sections.

Low level heating of section 794B mobilizes hydrocarbons in the section. The mobilized hydrocarbons in section 794B may be moved by the injected fluid through the section towards section 794A, as shown by the arrows in FIG. 183. Thus, the injected fluid is pushing hydrocarbons from section 794C through section 794B to section 794A. Mobilized hydrocarbons may be upgraded in section 794A due to the higher temperatures in the section. Pyrolyzed hydrocarbons that move into section 794A may also be further upgraded in the section. The upgraded hydrocarbons may be produced through production wells located in section 794A.

In certain embodiments, at least some hydrocarbons in section 794B are mobilized and drained from the section prior to injecting the fluid into the formation. Some formations may have high oil saturation (for example, the Grosmont formation has high oil saturation). The high oil saturation corresponds to low gas permeability in the formation that may inhibit fluid flow through the formation. Thus, mobilizing and draining (removing) some oil (hydrocarbons) from the formation may create gas permeability for the injected fluids.

Fluids in hydrocarbon layer 484 may preferentially move horizontally within the hydrocarbon layer from the point of injection because tar sands tend to have a larger horizontal permeability than vertical permeability. The higher horizontal permeability allows the injected fluid to move hydrocarbons between sections preferentially versus fluids draining vertically due to gravity in the formation. Providing sufficient fluid pressure with the injected fluid may ensure that fluids are moved to section 794A for upgrading and/or production.

In certain embodiments, section 794B has a larger volume than section 794A and/or section 794C. Section 794B may be larger in volume than the other sections so that more hydrocarbons are produced for less energy input into the formation. Because less heat is provided to section 794B (the section is heated to lower temperatures), having a larger volume in section 794B reduces the total energy input to the formation per unit volume. The desired volume of section 794B may depend on factors such as, but not limited to, viscosity, oil saturation, and permeability. In addition, the degree of coking is much less in section 794B due to the lower temperature so less hydrocarbons are coked in the formation when section 794B has a larger volume. In some embodiments, the lower degree of heating in section 794B allows for cheaper capital costs as lower temperature materials (cheaper materials) may be used for heaters used in section 794B.

In some embodiments, karsted formations or karsted layers in formations have vugs in one or more layers of the formations. The vugs may be filled with viscous fluids such as bitumen or heavy oil. In some embodiments, the karsted layers have a porosity of at least about 20 porosity units, at least about 30 porosity units, or at least about 35 porosity units. The karsted formation may have a porosity of at most about 15 porosity units, at most about 10 porosity units, or at most about 5 porosity units. Vugs filled with viscous fluids may inhibit steam or other fluids from being injected into the formation or the layers. In certain embodiments, the karsted formation or karsted layers of the formation are treated using the in situ heat treatment process.

Heating of these formations or layers may decrease the viscosity of the viscous fluids in the vugs and allow the fluids to drain (for example, mobilize the fluids). Formations with karsted layers may have sufficient permeability so that when the viscosity of fluids (hydrocarbons) in the formation is reduced, the fluids drain and/or move through the formation relatively easily (for example, without a need for creating higher permeability in the formation).

In some embodiments, the relative amount (the degree) of karst in the formation is assessed using techniques known in the art (for example, 3D seismic imaging of the formation). The assessment may give a profile of the formation showing layers or portions with varying amounts of karst in the formation. In certain embodiments, more heat is provided to selected karsted portions of the formation than other karsted portions of the formation. In some embodiments, selective amounts of heat are provided to portions of the formation as a function of the degree of karst in the portions. Amounts of heat may be provided by varying the number and/or density of heaters in the portions with varying degrees of karst.

In certain embodiments, the hydrocarbon fluids in karsted portions have higher viscosities than hydrocarbons in other non-karsted portions of the formation. Thus, more heat may be provided to the karsted portions to reduce the viscosity of the hydrocarbons in the karsted portions.

In certain embodiments, only the karsted layers of the formation are treated using the in situ heat treatment process. Other non-karsted layers of the formation may be used as seals for the in situ heat treatment process. For example, karsted layers with different quantities of hydrocarbons in the layers may be treated while other layers are used as natural seals for the treatment process. In some embodiments, karsted layers with low quantities of hydrocarbons as compared to the other karsted and/or non-karsted layers are used as seals for the treatment process. The quantity of hydrocarbons in the Karsted layer may be determined using logging methods and/or Dean Stark distillation methods. The quantity of hydrocarbons may be reported as a volume percent of hydrocarbons per volume percent of rock, or as volume of hydrocarbons per mass of rock.

In some embodiments, karsted layers with fewer hydrocarbons are treated along with karsted layers with more hydrocarbons. In some embodiments, karsted layers with fewer hydrocarbons are above and below a karsted layer with more hydrocarbons (the middle karsted layer). Less heat may be provided to the upper and lower karsted layers than the middle karsted layer. Less heat may be provided in the upper and lower karsted layers by having greater heat spacing and/or less heaters in the upper and lower karsted layers as compared to the middle karsted layer. In some embodiments, less heating of the upper and lower karsted layers includes heating the layers to mobilization and/or visbreaking temperatures, but not to pyrolysis temperatures. In some embodiments, the upper and/or lower karsted layers are heated with heaters and the residual heat from the upper and/or lower layers transfers to the middle layer.

One or more production wells may be located in the middle karsted layer. Mobilized and/or visbroken hydrocarbons from the upper karsted layer may drain to the production wells in the middle karsted layer. Heat provided to the lower karsted layer may create a thermal expansion drive and/or a gas pressure drive in the lower karsted layer. The thermal expansion and/or gas pressure may drive fluids from the lower karsted layer to the middle karsted layer. These fluids may be produced through the production wells in the middle karsted layer. Providing some heat to the upper and lower karsted layers may increase the total recovery of fluids from the formation by, for example, 25% or more.

In some embodiments, the karsted layers with fewer hydrocarbons are further heated to pyrolysis temperatures after production from the karsted layer with more hydrocarbons is completed or almost completed. The karsted layers with fewer hydrocarbons may also be further treated by producing fluids through production wells located in the layers.

In some embodiments, a drive process, a solvent injection process and/or a pressurizing fluid process is used after the in situ heat treatment of the karsted formation or karsted layers. A drive process may include injection of a drive fluid such as steam. A drive process includes, but is not limited to, a steam injection process such as cyclic steam injection, a steam assisted gravity drainage process (SAGD), and a vapor solvent and SAGD process. A drive process may drive fluids from one portion of the formation towards a production well.

A solvent injection process may include injection of a solvating fluid. A solvating fluid includes, but is not limited to, water, emulsified water, hydrocarbons, surfactants, alkaline water solutions (for example, sodium carbonate solutions), caustic, polymers, carbon disulfide, carbon dioxide, or mixtures thereof. The solvation fluid may mix with, solvate and/or dilute the hydrocarbons to form a mixture of condensable hydrocarbons and solvation fluids. The mixture may have a reduced viscosity as compared to the initial viscosity of the fluids in the formation. The mixture may flow and/or be mobilized towards production wells in the formation.

A pressurizing process may include moving hydrocarbons in the formation by injection of a pressurized fluid. The pressurizing fluid may include, but is not limited to, carbon dioxide, nitrogen, steam, methane, and/or mixtures thereof.

In some embodiments, the drive process (for example, the steam injection process) is used to mobilize fluids before the in situ heat treatment process. Steam injection may be used to get hydrocarbons (oil) away from rock or other strata in the formation. The steam injection may mobilize the hydrocarbons without significantly heating the rock.

In some embodiments, fluid injected in the formation (for example, steam and/or carbon dioxide) may absorb heat from the formation and cool the formation depending on the pressure in the formation and the temperature of the injected fluid. In some embodiments, the injected fluid is used to recover heat from the formation. The recovered heat may be used in surface processing fluids and/or to preheat other portions of the formation using the drive process.

In some embodiments, heaters are used to preheat the karsted formation or karsted layers to create injectivity in the formation. In situ heat treatment of karsted formations and/or karsted layers may allow for drive fluid injection, solvent injection and/or pressurizing fluid injection where it was previously unfavorable or unmanageable. Typically, karsted formations were unfavorable for drive processes because channeling of the fluid injected in the formation inhibited pressure build-up in the formation. In situ heat treatment of karsted formations may allow for injection of a drive fluid, a solvent and/or a pressurizing fluid by reducing the viscosity of hydrocarbons in the formation and allowing pressure to build in the formations without significant bypass of the fluid through channels in the formations. For example, heating a section of the formation using in situ heat treatment may heat and mobilize heavy hydrocarbons (bitumen) by reducing the viscosity of the heavy hydrocarbons in the karsted layer. Some of the heated less viscous heavy hydrocarbons may flow from the karsted layer into other portions of the formation that are cooler than the heated karsted portion. The heated less viscous heavy hydrocarbons may flow through channels and/or fractures. The heated heavy hydrocarbons may cool and solidify in the channels, thus creating a temporary seal for the drive fluid, solvent, and/or pressurizing fluid.

In certain embodiments, the karsted formation or karsted layers are heated to temperatures below the decomposition temperature of minerals in the formation (for example, rock minerals such as dolomite and/or clay minerals such as kaolinite, illite, or smectite). In some embodiments, the karsted formation or karsted layers are heated to temperatures of at most 400° C., at most 450° C., or at most 500° C. (for example, to a temperature below a dolomite decomposition temperature at formation pressure). In some embodiments, the karsted formation or karsted layers are heated to temperatures below a decomposition temperature of clay minerals (such as kaolinite) at formation pressure.

In some embodiments, heat is preferentially provided to portions of the formation with low weight percentages of clay minerals (for example, kaolinite) as compared to the content of clay in other portions of the formation. For example, more heat may be provided to portions of the formation with at most 1% by weight clay minerals, at most 2% by weight clay minerals, or at most 3% by weight clay minerals than portions of the formation with higher weight percentages of clay minerals. In some embodiments, the rock and/or clay mineral distribution is assessed in the formation prior to designing a heater pattern and installing the heaters. The heaters may be arranged to preferentially provide heat to the portions of the formation that have been assessed to have lower weight percentages of clay minerals as compared to other portions of the formation. In certain embodiments, the heaters are placed substantially horizontally in layers with low weight percentages of clay minerals.

Providing heat to portions of the formation with low weight percentages of clay minerals may minimize changes in the chemical structure of the clays. For example, heating clays to high temperatures may drive water from the clays and change the structure of the clays. The change in structure of the clay may adversely affect the porosity and/or permeability of the formation. If the clays are heated in the presence of air, the clays may oxidize and the porosity and/or permeability of the formation may be adversely affected. Portions of the formation with a high weight percentage of clay minerals may be inhibited from reaching temperatures above temperatures that effect the chemical composition of the clay minerals at formation pressures. For example, portions of the formation with large amounts of kaolinite relative to other portions of the formation may be inhibited from reaching temperatures above 240° C. In some embodiments, portions of the formation with a high quantity of clay minerals relative to other portions of the formation may be inhibited from reaching temperatures above 200° C., above 220° C., above 240° C., or above 300° C.

In some embodiments, karsted formations may include water. Minerals (for example, carbonate minerals) in the formation may at least partially dissociate in the water to form carbonic acid. The concentration of carbonic acid in the water may be sufficient to make the water acidic. At pressure greater than ambient formation pressures, dissolution of minerals in the water may be enhanced, thus formation of acidic water is enhanced. Acidic water may react with other minerals in the formation such as dolomite ($MgCa(CO_3)_2$) and increase the solubility of the minerals. Water at lower pressures, or non-acidic water, may not solubilize the minerals in the formation. Dissolution of the minerals in the formation may form fractures in the formation. Thus, controlling the pressure and/or the acidity of water in the formation may control the solubilization of minerals in the formation. In some embodiments, other inorganic acids in the formation enhance the solubilization of minerals such as dolomite.

In some embodiments, the karsted formation or karsted layers are heated to temperatures above the decomposition temperature of minerals in the formation. At temperatures above the minerals decomposition temperature, the minerals may decompose to produce carbon dioxide or other products. The decomposition of the minerals and the carbon dioxide production may create permeability in the formation and mobilize viscous fluids in the formation. In some embodiments, the produced carbon dioxide is maintained in the formation to generate a gas cap in the formation. The carbon dioxide may be allowed to rise to the upper portions of the karsted layers to generate the gas cap.

In some embodiments, the production front of the drive process follows behind the heat front of the in situ heat treatment process. In some embodiments, areas behind the production front are further heated to produce more fluids from the formation. Further heating behind the production front may also maintain the gas cap behind the production front and/or maintain quality in the production front of the drive process.

In certain embodiments, the drive process is used before the in situ heat treatment of the formation. In some embodiments, the drive process is used to mobilize fluids in a first section of the formation. The mobilized fluids may then be pushed into a second section by heating the first section with heaters. Fluids may be produced from the second section. In some embodiments, the fluids in the second section are pyrolyzed and/or upgraded using the heaters.

In formations with low permeabilities, the drive process may be used to create a “gas cushion” or pressure sink before the in situ heat treatment process. The gas cushion may inhibit pressures from increasing quickly to fracture pressure during the in situ heat treatment process. The gas cushion may provide a path for gases to escape or travel during early stages of heating during the in situ heat treatment process.

In some embodiments, the drive process (for example, the steam injection process) is used to mobilize fluids before the in situ heat treatment process. Steam injection may be used to get hydrocarbons (oil) away from rock or other strata in the formation. The steam injection may mobilize the oil without significantly heating the rock.

In some embodiments, injection of a fluid (for example, steam or carbon dioxide) may consume heat in the formation and cool the formation depending on the pressure in the formation. In some embodiments, the injected fluid is used to recover heat from the formation. The recovered heat may be used in surface processing fluids and/or to preheat other portions of the formation using the drive process.

FIG. 184 depicts a representation of an embodiment for producing hydrocarbons from a hydrocarbon containing formation (for example, a tar sands formation). Hydrocarbon layer 484 includes one or more portions with heavy hydrocarbons. Hydrocarbons may be produced from hydrocarbon layer 484 using more than one process. In certain embodiments, hydrocarbons are produced from a first portion of hydrocarbon layer 484 using a steam injection process (for example, cyclic steam injection or steam assisted gravity drainage) and a second portion of the hydrocarbon layer using an in situ heat treatment process. In the steam injection process, steam is injected into the first portion of hydrocarbon layer 484 through injection well 788. First hydrocarbons are produced from the first portion through production well 206A. The first hydrocarbons include hydrocarbons mobilized by the injection of steam. In certain embodiments, the first hydrocarbons have an API gravity of at most 15°, at most 10°, at most 80, or at most 60.

Heaters 438 are used to heat the second portion of hydrocarbon layer 484 to mobilization, visbreaking, and/or pyrolysis temperatures. Second hydrocarbons are produced from the second portion through production well 206B. In some embodiments, the second hydrocarbons include at least some pyrolyzed hydrocarbons. In certain embodiments, the second hydrocarbons have an API gravity of at least 15°, at least 20°, or at least 25°.

In some embodiments, the first portion of hydrocarbon layer 484 is treated using heaters after the steam injection process. Heaters may be used to increase the temperature of the first portion and/or treat the first portion using an in situ heat treatment process. Second hydrocarbons (including at least some pyrolyzed hydrocarbons) may be produced from the first portion through production well 206A.

In some embodiments, the second portion of hydrocarbon layer 484 is treated using the steam injection process before using heaters 438 to treat the second portion. The steam injection process may be used to produce some fluids (for example, first hydrocarbons or hydrocarbons mobilized by the steam injection) through production well 206B from the second portion and/or preheat the second portion before using heaters 438. In some embodiments, the steam injection process may be used after using heaters 438 to treat the first portion and/or the second portion.

Producing hydrocarbons through both processes increases the total recovery of hydrocarbons from hydrocarbon layer 484 and may be more economical than using either process alone. In some embodiments, the first portion is treated with the in situ heat treatment process after the steam injection process is completed. For example, after the steam injection process no longer produces viable amounts of hydrocarbon from the first portion, the in situ heat treatment process may be used on the first portion.

Steam is provided to injection well 788 from facility 796. Facility 796 is a steam and electricity cogeneration facility. Facility 796 may burn hydrocarbons in generators to make electricity. Facility 796 may burn gaseous and/or liquid hydrocarbons to make electricity. The electricity generated is used to provide electrical power for heaters 438. Waste heat from the generators is used to make steam. In some embodiments, some of the hydrocarbons produced from the formation are used to provide gas for heaters 438, if the heaters utilize gas to provide heat to the formation. The amount of electricity and steam generated by facility 796 may be controlled to vary the production rate and/or quality of hydrocarbons produced from the first portion and/or the second portion of hydrocarbon layer 484. The production rate and/or quality of hydrocarbons produced from the first portion and/or the second portion may be varied to produce a selected API gravity in a mixture made by blending the first hydrocarbons with the second hydrocarbons. The first hydrocarbon and the second hydrocarbons may be blended after production to produce the selected API gravity. The production from the first portion and/or the second portion may be varied in response to changes in the marketplace for either first hydrocarbons, second hydrocarbons, and/or a mixture of the first and second hydrocarbons.

First hydrocarbons produced from production well 206A and/or second hydrocarbons produced from production well 206B may be used as fuel for facility 796. In some embodiments, first hydrocarbons and/or second hydrocarbons are treated (for example, removing undesirable products) before being used as fuel for facility 796. In some embodiments, coke or other hydrocarbon residue produced or removed from the formation (for example, mined from the formation) may provide fuel for facility 796. The hydrocarbon residue may be gasified or burned in a residue burning facility before providing the hydrocarbons to facility 796. The residue burning facility may produce hydrocarbon gases (such as natural gas) and/or other products (such as carbon dioxide or syngas products (synthesis gas products)). The carbon dioxide may be sequestered in the formation after treatment of the formation.

The amount of first hydrocarbons and second hydrocarbons used as fuel for facility 796 may be determined, for example, by economics for the overall process, the marketplace for either first or second hydrocarbons, availability of treatment facilities for either first or second hydrocarbons, and/or transportation facilities available for either first or second hydrocarbons. In some embodiments, most or all the hydrocarbon gas produced from hydrocarbon layer 484 is used as fuel for facility 796. Burning all the hydrocarbon gas in facility 796 eliminates the need for treatment and/or transportation of gases produced from hydrocarbon layer 484.

The produced first hydrocarbons and the second hydrocarbons may be treated and/or blended in facility 798. In some embodiments, the first and second hydrocarbons are blended to make a mixture that is transportable through a pipeline. In some embodiments, the first and second hydrocarbons are blended to make a mixture that is useable as a feedstock for a refinery. The amount of first and second hydrocarbons produced may be varied based on changes in the requirements for treatment and/or blending of the hydrocarbons. In some embodiments, treated hydrocarbons are used in facility 796.

In some embodiments, the steam injection process and the in situ heat treatment process (for example, the in situ conversion process) are used synergistically in different layers (for example, vertically displaced layers) in the formation. For example, in a karsted formation, different zones or layers in the formation may have different oil saturations, water saturations, porosities, and/or permeabilities. Some layers may have good steam injectivities while others have near zero steam injectivity. The steam injectivity may depend on the water saturation of the zone and the permeability. Thus, varying the use of the steam injection process and the in situ heat treatment process in these layers may be economically advantageous by, for example, producing more hydrocarbons with less energy input into the formation. The steam injection process may include steam drive, cyclic steam injection, SAGD, or other process of steam injection into the formation.

FIG. 185 depicts a representation of an embodiment for producing hydrocarbons from multiple layers in a tar sands formation. Hydrocarbon layers 484A,B,C include one or more portions with heavy hydrocarbons. Hydrocarbon layers 484A,B,C may have different oil saturations, water saturations, porosities, and/or permeabilities. In one embodiment, hydrocarbon layers 484A,C have lower oil saturations, higher water saturations, and lower porosities than hydrocarbon layer 484B. The steam injection process may be used in hydrocarbon layers 484A,C using injection wells 788A,C and production wells 206A,C. The in situ heat treatment process may be used in hydrocarbon layer 484B using heaters 438 and production well 206B. Hydrocarbon layer 484B may have high oil saturation and low steam injectivity. After in situ heat treatment of hydrocarbon layer 484B, the layer may have steam injectivity. Hydrocarbon layer 484B may be treated using the steam injection process for a selected time (for example, one year, two years, three years, or longer).

Injecting steam into hydrocarbon layers 484A,C above and below hydrocarbon layer 484B may increase the efficiency of producing hydrocarbons from the formation. Steam injection in hydrocarbon layers 484A,C lowers the viscosity and increases the pressures in these layers so that hydrocarbons move into hydrocarbon layer 484B. Heat from hydrocarbon layer 484B may conduct and/or convect into hydrocarbon layers 484A,C and preheat these layers to lower the oil viscosity and/or increase the steam injectivity in hydrocarbon layers 484A,C. Additionally, some steam may rise from hydrocarbon layer 484C into hydrocarbon layer 484B. This steam may provide additional heat and increased mobilization in hydrocarbon layer 484B. The steam injection process and/or the in situ heat treatment process may be used (for example, varied) as described above for the embodiment depicted in FIG. 184. Hydrocarbons produced from any of hydrocarbon layers 484A,B,C may be used and/or processed in facility 796 and/or facility 798, as described above for the embodiment depicted in FIG. 184.

In some embodiments, impermeable shale layers exist between hydrocarbon layer 484B and hydrocarbon layers 484A,C. Using the in situ heat treatment process on hydrocarbon layer 484B may desiccate the shale layers and increase the permeability of the shale layers to allow fluid to flow through the shale layers. The increased permeability in the shale layers allows mobilized hydrocarbons to flow from hydrocarbon layer 484A into hydrocarbon layer 484B. These hydrocarbons may be upgraded and produced in hydrocarbon layer 484B.

FIG. 186 depicts an embodiment for heating and producing from the formation with the temperature limited heater in a production wellbore. Production conduit 800 is located in wellbore 742. In certain embodiments, a portion of wellbore 742 is located substantially horizontally in formation 524. In some embodiments, the wellbore is located substantially vertically in the formation. In an embodiment, at least a portion of wellbore 742 is an open wellbore (an uncased wellbore). In some embodiments, the wellbore has a casing or liner with perforations or openings to allow fluid to flow into the wellbore.

Conduit 800 may be made from carbon steel or more corrosion resistant materials such as stainless steel. Conduit 800 may include apparatus and mechanisms for gas lifting or pumping produced oil to the surface. For example, conduit 800 includes gas lift valves used in a gas lift process. Examples of gas lift control systems and valves are disclosed in U.S. Pat. Nos. 6,715,550 to Vinegar et al. and 7,259,688 to Hirsch et al., and U.S. Patent Application Publication No. 2002-0036085 to Bass et al., each of which is incorporated by reference as if fully set forth herein. Conduit 800 may include one or more openings (perforations) to allow fluid to flow into the production conduit. In certain embodiments, the openings in conduit 800 are in a portion of the conduit that remains below the liquid level in wellbore 742. For example, the openings are in a horizontal portion of conduit 800.

Heater 802 is located in conduit 800. In some embodiments, heater 802 is located outside conduit 800, as shown in FIG. 187. The heater located outside the production conduit may be coupled (strapped) to the production conduit. In some embodiments, more than one heater (for example, two, three, or four heaters) are placed about conduit 800. The use of more than one heater may reduce bowing or flexing of the production conduit caused by heating on only one side of the production conduit. In an embodiment, heater 802 is a temperature limited heater. Heater 802 provides heat to reduce the viscosity of fluid (such as oil or hydrocarbons) in and near wellbore 742. In certain embodiments, heater 802 raises the temperature of the fluid in wellbore 742 up to a temperature of 250° C. or less (for example, 225° C., 200° C., or 150° C.). Heater 802 may be at higher temperatures (for example, 275° C., 300° C., or 325° C.) because the heater provides heat to conduit 800 and there is some temperature differential between the heater and the conduit. Thus, heat produced from the heater does not raise the temperature of fluids in the wellbore above 250° C.

In certain embodiments, heater 802 includes ferromagnetic materials such as Carpenter Temperature Compensator "32", Alloy 42-6, Alloy 52, Invar 36, or other iron-nickel or iron-nickel-chromium alloys. In certain embodiments, nickel or nickel-chromium alloys are used in heater 802. In some embodiments, heater 802 includes a composite conductor with a more highly conductive material such as copper on the inside of the heater to improve the turndown ratio of the heater. Heat from heater 802 heats fluids in or near wellbore 742 to reduce the viscosity of the fluids and increase a production rate through conduit 800.

In certain embodiments, portions of heater 802 above the liquid level in wellbore 742 (such as the vertical portion of the wellbore depicted in FIGS. 186 and 187) have a lower maximum temperature than portions of the heater located below the liquid level. For example, portions of heater 802 above the liquid level in wellbore 742 may have a maximum temperature of 100° C. while portions of the heater located below the liquid level have a maximum temperature of 250° C. In certain embodiments, such a heater includes two or more ferromagnetic sections with different Curie temperatures and/or phase transformation temperature ranges to achieve the desired heating pattern. Providing less heat to portions of wellbore 742 above the liquid level and closer to the surface may save energy.

In certain embodiments, heater 802 is electrically isolated on the outside surface of the heater and allowed to move freely in conduit 800. In some embodiments, electrically insulating centralizers are placed on the outside of heater 802 to maintain a gap between conduit 800 and the heater.

In some embodiments, heater 802 is cycled (turned on and off) so that fluids produced through conduit 800 are not overheated. In an embodiment, heater 802 is turned on for a specified amount of time until a temperature of fluids in or near wellbore 742 reaches a desired temperature (for example, the maximum temperature of the heater). During the heating time (for example, 10 days, 20 days, or 30 days), production through conduit 800 may be stopped to allow fluids in the formation to "soak" and obtain a reduced viscosity. After heating is turned off or reduced, production through conduit 800 is started and fluids from the formation are produced without excess heat being provided to the fluids. During production, fluids in or near wellbore 742 will cool down without heat from heater 802 being provided. When the fluids reach a temperature at which production significantly slows down, production is stopped and heater 802 is turned back on to reheat the fluids. This process may be repeated until a desired amount of production is reached. In some embodiments, some heat at a lower temperature is provided to maintain a flow of the produced fluids. For example, low temperature heat (for example, 100° C., 125° C., or 150° C.) may be provided in the upper portions of wellbore 742 to keep fluids from cooling to a lower temperature.

In some embodiments, a temperature limited heater positioned in a wellbore heats steam that is provided to the wellbore. The heated steam may be introduced into a portion of the formation. In certain embodiments, the heated steam may be used as a heat transfer fluid to heat a portion of the formation. In some embodiments, the steam is used to solution mine desired minerals from the formation. In some embodiments, the temperature limited heater positioned in the wellbore heats liquid water that is introduced into a portion of the formation.

In an embodiment, the temperature limited heater includes ferromagnetic material with a selected Curie temperature and/or a selected phase transformation temperature range. The use of a temperature limited heater may inhibit a temperature of the heater from increasing beyond a maximum selected temperature (for example, a temperature at or about the Curie temperature and/or the phase transformation temperature range). Limiting the temperature of the heater may inhibit potential burnout of the heater. The maximum selected temperature may be a temperature selected to heat the steam to above or near 100% saturation conditions, superheated conditions, or supercritical conditions. Using a temperature limited heater to heat the steam may inhibit overheating of the steam in the wellbore. Steam introduced into a formation may be used for synthesis gas production, to heat the hydrocarbon containing formation, to carry chemicals into the formation, to extract chemicals or minerals from the formation, and/or to control heating of the formation.

A portion of the formation where steam is introduced or that is heated with steam may be at significant depths below the surface (for example, greater than about 1000 m, about 2500 m, or about 5000 m below the surface). If steam is heated at the surface of the formation and introduced to the formation through a wellbore, a quality of the heated steam provided to the wellbore at the surface may have to be relatively high to accommodate heat losses to the wellbore casing and/or the overburden as the steam travels down the wellbore. Heating the steam in the wellbore may allow the quality of the steam to be significantly improved before the steam is provided to the formation. A temperature limited heater positioned in a lower section of the overburden and/or adjacent to a target zone of the formation may be used to controllably heat steam to improve the quality of the steam injected into the formation and/or inhibit condensation along the length of the heater. In certain embodiments, the temperature limited heater improves the quality of the steam injected and/or inhibits condensation in the wellbore for long steam injection wellbores (especially for long horizontal steam injection wellbores).

A temperature limited heater positioned in a wellbore may be used to heat the steam to above or near 100% saturation conditions or superheated conditions. In some embodiments, a temperature limited heater may heat the steam so that the steam is above or near supercritical conditions. The static head of fluid above the temperature limited heater may facilitate producing 100% saturation, superheated, and/or supercritical conditions in the steam. Supercritical or near supercritical steam may be used to strip hydrocarbon material and/or other materials from the formation. In certain embodiments, steam introduced into the formation may have a high density (for example, a specific gravity of about 0.8 or above). Increasing the density of the steam may improve the ability of the steam to strip hydrocarbon material and/or other materials from the formation.

In some embodiments, the tar sands formation may be treated by the in situ heat treatment process to produce pyrolyzed product from the formation. A significant amount of carbon in the form of coke may remain in tar sands formation when production of pyrolysis product from the formation is complete. In some embodiments, the coke in the formation may be utilized to produce heat and/or additional products from the heated coke containing portions of the formation.

In some embodiments, air, oxygen enriched air, and/or other oxidants may be introduced into the treatment area that has been pyrolyzed to react with the coke in the treatment area. The temperature of the treatment area may be sufficiently hot to support burning of the coke without additional energy input from heaters. The oxidation of the coke may significantly heat the portion of the formation. Some of the heat may transfer to portions of the formation adjacent to the treatment area. The transferred heat may mobilize fluids in portions of the formation adjacent to the treatment area. The mobilized fluids may flow into and be produced from production wells near the perimeter of the treatment area.

Gases produced from the formation heated by combusting coke in the formation may be at high temperature. The hot gases may be utilized in an energy recovery cycle (for example, a Kalina cycle or a Rankine cycle) to produce electricity.

The air, oxygen enriched air and/or other oxidants may be introduced into the formation for a sufficiently long period of time to heat a portion of the treatment area to a desired temperature sufficient to allow for the production of synthesis gas of a desired composition. The temperature may be from 500° C. to about 1000° C. or higher. When the temperature of the portion is at or near the desired temperature, a synthesis gas generating fluid, such as water, may be introduced into the formation to result in the formation of synthesis gas. Synthesis gas produced from the formation may be sent to a treatment facility and/or be sent through a pipeline to a desired location. During introduction of the synthesis gas generating fluid, the introduction of air, oxygen enriched air, and/or other oxidants may be stopped, reduced, or maintained. If the temperature of the formation reduces so that the synthesis gas produced from the formation does not have the desired composition, introduction of the syntheses gas generating fluid may be stopped or reduced, and the introduction of air, enriched air and/or other oxidants may be started or increased so that oxidation of coke in the formation reheats portions of the treatment area. The introduction of oxidant to heat the formation and the introduction of synthesis gas generating fluid to produce synthesis gas may be cycled until all or a significant portion of the treatment area is treated.

In certain embodiments, a subsurface formation is treated in stages. The treatment may be initiated with electrical heating with further heating generated from oxidation of hydrocarbons and hot gas production from the formation. Hydrocarbons (e.g., heavy hydrocarbons and/or bitumen) may be moved from one portion of the formation to another where the hydrocarbons are produced from the formation. By using a combination of heaters, oxidizing fluid and/or drive fluid, the overall time necessary to initiate production from a formation may be decreased relative to times necessary to initiate production using heaters and/or drive processes alone. By controlling a rate of oxidizing fluid injection and/or drive fluid injection in conjunction with heating with heaters, a relatively uniform temperature distribution may be obtained in sections (portions) of the subsurface formation.

A method for treating a hydrocarbon containing formation with heaters in combination with an oxidizing fluid may include providing heat to a first portion of the formation from a plurality of heaters located in heater wells in the first portion. Fluids may be produced through one or more production wells in a second portion of the formation that is substantially adjacent to the first portion. The heat provided to the first portion may be reduced or turned off after a selected time. An oxidizing fluid may be provided through one or more of the heater wells in the first portion. Heat may be provided to the first portion and the second portion through oxidation of at least some hydrocarbons in the first portion. Fluids may be produced through at least one of the production wells in the second portion. The fluids may include at least some oxidized hydrocarbons. Transportation fuel may be produced from the hydrocarbons produced from the first and/or second of the formation.

FIG. 188 depicts a schematic of an embodiment of a first stage of treating the tar sands formation with electrical heaters. Hydrocarbon layer 484 may be separated into section 794A and section 794B. Heaters 438 may be located in section 794A. Production wells 206 may be located in section 794B. In some embodiments, production wells 206 extend into section 794A.

Heaters 438 may be used to heat and treat portions of section 794A through conductive, convective, and/or radiative heat transfer. For example, heaters 438 may mobilize, visbreak, and/or pyrolyze hydrocarbons in section 794A. Production wells 206 may be used to produce mobilized, visbroken, and/or pyrolyzed hydrocarbons from section 794A.

FIG. 189 depicts a schematic of an embodiment of a second stage of treating the tar sands formation with fluid injection and oxidation. After at least some hydrocarbons from section 794A have been produced (for example, a majority of hydrocarbons in the section or almost all producible hydrocarbons in the section), the heater wells in section 794A may be converted to injection wells 788. In some embodiments, the heater wells are open wellbores below the overburden. In some embodiments, the heater wells are initially installed into wellbores that include perforated casings. In some embodiments, the heater wells are perforated using perforation guns after heating from the heater wells is completed.

Injection wells 788 may be used to inject an oxidizing fluid (for example, air, oxygen, enriched air, or other oxidants) into the formation. In some embodiments, the oxidation includes liquid water and/or steam. The amount of oxidizing fluid may be controlled to adjust subsurface combustion patterns. In some embodiments, carbon dioxide or other fluids are injected into the formation to control heating/production in the formation. The oxidizing fluid may oxidize (combust) or otherwise react with hydrocarbons remaining in the formation (for example, coke). Water in the oxidizing fluid may react with coke and/or hydrocarbons in the hot formation to produce syngas in the formation. Production wells 206 in section 794B may be converted to heater/gas production wells 804. Heater/gas production wells 804 may be used to produce oxidation gases and/or syngas products from the formation. Producing the hot oxidation gases and/or syngas through heater/gas production wells 804 in section 794B may heat the section to higher temperatures so that hydrocarbons in the section are mobilized, visbroken, and/or pyrolyzed in the section. Production wells 206 in section 794C may be used to produce mobilized, visbroken, and/or pyrolyzed hydrocarbons from section 794B.

In certain embodiments, the pressure of the injected fluids and the pressure in formation are controlled to control the heating in the formation. The pressure in the formation may be controlled by controlling the production rate of fluids from the formation (for example, the production rate of oxidation gases and/or syngas products from heater/gas production wells 804). Heating in the formation may be controlled so that there is enough hydrocarbon volume in the formation to maintain the oxidation reactions in the formation. Heating may be controlled so that the formation near the injection wells is at a temperature that will generate desired synthesis gas if a synthesis gas generating fluid such as water is included in the oxidation fluid. Heating in the formation may also be controlled so that enough heat is generated to conductively heat the formation to mobilize, visbreak, and/or pyrolyze hydrocarbons in adjacent sections of the formation.

The process of injecting oxidizing fluid and/or water in one section, producing oxidation gases and/or syngas products in an adjacent section to heat the adjacent section, and producing upgraded hydrocarbons (mobilized, visbroken, and/or pyrolyzed hydrocarbons) from a subsequent section may be continued in further sections of the tar sands formation. For example, FIG. 190 depicts a schematic of an embodiment of a third stage of treating the tar sands formation with fluid injection and oxidation. The gas heater/producer wells in section 794B are converted to injection wells 788 to inject air and/or water. The producer wells in section 794C are converted to production wells (for example, heater/gas production wells 804) to produce oxidation gases and/or syngas products. Production wells 206 are formed in section 794D to produce upgraded hydrocarbons.

In some embodiments, significant amounts of residue and/or coke remain in a subsurface formation after heating the formation with heaters and producing formation fluids from the formation. In some embodiments, sections of the formation include heavy hydrocarbons such as bitumen that are difficult to heat to mobilization temperatures adjacent to sections of the formation that are being treated using an in situ heat treatment process. Heating of heavy hydrocarbons may require high energy input, a large number of heater wells and/or increase in capital costs (for example, materials for heater construction). It would be advantageous to produce formation fluids from subsurface formations with lower energy costs, fewer heater wells and/or heater cost with improved product quality and/or recovery efficiency.

In some embodiments, a method for treating a subsurface formation includes producing a at least a third hydrocarbons from a first portion by an in situ heat treatment process. An average temperature of the first portion is less than 350° C. An oxidizing fluid may be injected in the first portion to cause the average temperature in the first portion to increase sufficiently to oxidize hydrocarbon in the first portion and to raise the average temperature in the first portion to greater than 350° C. In some embodiments, the temperature of the first portion is raised to an average temperature ranging from 350° C. to 700° C. A heavy hydrocarbon fluid that includes one or more condensable hydrocarbons may be injected in the first portion to from a diluent and/or drive fluid. In some embodiments, a catalyst system is added to the first portion.

FIGS. 191, 192, and 193 depict side view representations of embodiments of treating a subsurface formation in stages with heaters, oxidizing fluid, catalyst, and/or drive fluid. Hydrocarbon layer 484 may be divided into three or more treatment sections. In certain embodiments, hydrocarbon layer 484 includes five treatment sections: section 794A, section 794B, section 794C, section 794D and section 794E. Sections 794A and section 794C are separated by section 794B. Sections 794C and section 794E are separated by section 794D. Section 794A through section 794E may be horizontally displaced from each other in the formation. In some embodiments, one side of section 794A is adjacent to an edge of the treatment area of the formation or an untreated section of the formation is left on one side of section 794A before the same or a different pattern is formed on the opposite side of the untreated section.

In certain embodiments, section 794A is heated to pyrolysis temperatures with heaters 438. Section 794A may be heated to mobilize and/or pyrolyze hydrocarbons in the section. In some embodiments, section 794A is heated to an average temperature of 250° C., 300° C., or up to 350° C. The mobilized and/or pyrolyzed hydrocarbons may be produced through one or more production wells 206. Once at least a third, a substantial portion, or all of the hydrocarbons have been produced from section 794A, the temperature in section 794A may be maintained at an average temperature that allows the section to be used as a reactor and/or reaction zone to treat formation fluid and/or hydrocarbons from surface facilities. Use of one or more heated portions of the formation to treat such hydrocarbons may reduce or eliminate the need for surface facilities that treat such fluids (for example, coking units and/or delayed coking units).

In certain embodiments, heating and producing hydrocarbons from sections 794A creates fluid infectivity in the sections. After fluid injectivity has been created in section 794A, an oxidizing fluid may be injected into the section. For example, oxidizing fluid may be injected in section 794A after at least a third or a majority of the hydrocarbons have been produced from the section. The fluid may be injected through heater wellbores, production wells 206, and/or injection wells located in section 794A. In some embodiments, heaters 438 continue to provide heat while the fluid is being injected. In certain embodiments, heaters 438 may be turned down or off before or during fluid injection.

During injection of oxidant, excess oxidant and/or oxidation products may be removed from section 794A through one or more production wells 206 and/or heater/gas production wells. In some embodiments, after the formation is raised to a desired temperature, a second fluid may be introduced into section 794A. The second fluid may be water and/or steam. Addition of the second fluid may cool the formation. For example, when the second fluid is steam and/or water, the reactions of the second fluid with coke and/or hydrocarbons are endothermic and produce synthesis gas. In some embodiments, oxidizing fluid is added with the second fluid so that some heating of section 794A occurs simultaneous with the endothermic reactions. In some embodiments, section 794A is treated in alternating steps of adding oxidant and second fluid to heat the formation for selected periods of time.

In certain embodiments, the pressure of the injected fluids and the pressure section 794A are controlled to control the heating in the formation. The pressure in section 794A may be controlled by controlling the production rate of fluids from the section (for example, the production rate of hydrocarbons, oxidation gases and/or syngas products). Heating in section 794A may be controlled so that section reaches a desired temperature (e.g., temperatures of at least 350° C., of at least about 400° C., or at least about 500° C., about 700° C., or higher). Injection of the oxidizing fluid may allow portions of the formation below the section heated by heaters to be heated, thus allowing heating of formation fluids in deeper and/or inaccessible portions of the formation. The control of heat and pressure in the section may improve efficiency and quality of products produced from the formation.

During heating and/or after heating of section 794A, heavy hydrocarbons with low economic value and/or waste hydrocarbon streams from surface facilities may be injected in the section. Low economic value hydrocarbons and/or waste hydrocarbon streams may include, but are not limited to, hydrocarbons produced during surface mining operations, residue, bitumen and/or bottom extracts from bitumen mining. In some embodiments, hydrocarbons produced from section 794A or other sections of the formation may be introduced into section 794A. In some embodiments, one or more of the heater wells in section 794A are converted to injection wells.

Heating of hydrocarbons and/or coke in section 794A may generate drive fluids. Generated drive fluids in section 794A may include air, steam, carbon dioxide, carbon monoxide, hydrogen, methane, pyrolyzed hydrocarbons and/or in situ diluent. In some embodiments, hydrocarbon fluids are introduced into section 794A prior to injecting an oxidizing fluid and/or the second fluid. Oxidation and/or thermal cracking of introduced hydrocarbon fluids may create the drive fluid.

In some embodiments, drive fluid may be injected into the formation. The addition of oxidizing fluid, steam, and/or water in the drive fluid may be used to control temperatures in section 794A. For example, the addition of hydrocarbons to section 794A may cool the average temperature in section 794A to a temperature below temperatures that allow for cracking of the introduced hydrocarbons. Oxidizing fluid may be injected to increase and/or maintain the average temperature between 250° C. and 700° C. or between 350° C. and 600° C. Maintaining the temperature between 250° C. and 700° C. may allow for the production of high quality hydrocarbons from the low value hydrocarbons and/or waste streams. Controlling the input of hydrocarbons, oxidizing fluid, and/or drive fluid into section 794A may allow for the production of condensable hydrocarbons with a minimal amount non-condensable gases. In some embodiments, controlling the input of hydrocarbons, oxidizing fluid, and/or drive fluid into section 794A may allow for the production of large amounts of non-condensable hydrocarbons and/or hydrogen with minimal amounts of condensable hydrocarbons.

In some embodiments, a catalyst system is introduced to section 794A when the section is at a desired temperature (for example, a temperature of at least 350° C., at least 400° C., or at least 500° C.). In some embodiments, the section is heated after and/or during introduction of the catalyst system. The catalyst system may be provided to the formation by injecting the catalyst system into one or more injection wells and/or production wells in section 794A. In some embodiments, the catalyst system is positioned in wellbores proximate the section of the formation to be treated. In some embodiments, the catalyst is introduced to one or more sections during in situ heat treatment of the sections. The catalyst may be provided to section 794A as a slurry and/or a solution in sufficient quantity to allow the catalyst to be dispersed in the section. For example, the catalyst system may be dissolved in water and/or slurried in an emulsion of water and hydrocarbons. At temperatures of at least 100° C., at least 200° C., or at least 250° C., vaporization of water from the solution allows the catalyst to be dispersed in the rock matrix of section 794A.

The catalyst system may include one or more catalysts. The catalysts may be supported or unsupported catalysts. Catalysts include, but are not limited to, alkali metal carbonates, alkali metal hydroxides, alkali metal hydrides, alkali metal amides, alkali metal sulfides, alkali metal acetates, alkali metal oxalates, alkali metal formates, alkali metal pyruvates, alkaline-earth metal carbonates, alkaline-earth metal hydroxides, alkaline-earth metal hydrides, alkaline-earth metal amides, alkaline-earth metal sulfides, alkaline-earth metal acetates, alkaline-earth metal oxalates, alkaline-earth metal formates, alkaline-earth metal pyruvates, or commercially available fluid catalytic cracking catalysts, dolomite, silicon-alumina catalyst fines, zeolites, zeolite catalyst fines any catalyst that promotes formation of aromatic hydrocarbons, or mixtures thereof.

In some embodiments, fractions from surface facilities include catalyst fines. Surface facilities may include catalytic cracking units and/or hydrotreating units. These fractions may be injected in section 794A to provide a source of catalyst for the section. Injection of the fractions in section 794A may provide an advantageous method for disposal and/or upgrading of the fractions as compared to conventional disposal methods for fractions containing catalyst fines.

After injecting catalyst in section 794A, the average temperature in section 794A may be increased or maintained in a range from about 250° C. to about 700° C., from about 300° C. to about 650° C., or from about 350° C. to about 600° C. by injection of reaction fluids (for example, oxidizing fluid, steam, water and/or combinations thereof). In some embodiments, heaters 438 are used to raise or maintain the temperature in section 794A in the desired range. In some embodiments, heaters 438 and the introduction of reaction fluids into section 794A are used to raise or maintain the temperature in the desired range. Hydrocarbon fluids may be introduced in section 794A once the desired temperature is obtained. In some embodiments, the catalyst system is slurried with a portion of the hydrocarbons, and the slurry is introduced to section 794A. In some embodiments, a portion of the hydrocarbon fluids are introduced to section 794A prior to introduction of the catalyst system. The introduced hydrocarbon fluids may be hydrocarbons in formation fluid from an adjacent portion of the formation, and/or low value hydrocarbons. The hydrocarbons may contact the catalyst system to produce desirable hydrocarbons (for example, visbroken hydrocarbons, cracked hydrocarbons, aromatic hydrocarbons, or mixtures thereof). The desired temperature in section 794A may be maintained by turning on heaters in the section and/or continuous injection of oxidizing fluid to cause exothermic reactions that heat the formation.

In some embodiments, hydrocarbons produced through thermal and/or catalytic treatment in section 794A may be used as a diluent and/or a solvent in the section. The produced hydrocarbons may include aromatic hydrocarbons. The aromatic enriched diluent may dilute or solubilize a portion of the heavy hydrocarbons in section 794A and/or other sections in the formation (for example, sections 794B and/or 794C) and form a mixture. The mixture may be produced from the formation (for example, produced from sections 794A and/or 794C). In some embodiments, the mixture is produced from section 794B. In some embodiments, the mixture drains to a bottom portion of the section and solubilizes additional hydrocarbons at the bottom of the section. Solubilized hydrocarbons may be produced or mobilized from the formation. In some embodiments, fluids produced in section 794A (for example, diluent, desirable products, oxidized products, and/or solubilized hydrocarbons) may be pushed towards section 794B as shown by the arrows in FIG. 191 by oxidizing fluid, drive fluid, and/or created drive fluid.

In some embodiments, the temperatures in section 794A and the generation of drive fluid in section 794A increases the pressure of section 794A so the drive fluid pushes fluids through section 794B into section 794C. Hot fluids flowing from section 794A into section 794B may melt, solubilize, visbreak and/or crack fluids in section 794B sufficiently to allow the fluids to move to section 794C. In section 794C, the fluids may be upgraded and/or produced through production wells 206.

In some embodiments, a portion of the catalyst system from section 794A enters section 794B and/or section 794C and contacts fluids in the sections. Contact of the catalyst with formation fluids in 794B and/or section 794C may result in the production of hydrocarbons having a lower API gravity than the mobilized fluids.

The fluid mixture formed from contact of hydrocarbons, formation fluid and/or mobilized fluids with the catalyst system may be produced from the formation. The liquid hydrocarbon portion of the fluid mixture may have an API gravity between 10° and 25°, between 12° and 23° or between 15° and 20°. In some embodiments, the produced mixture has at most 0.25 grams of aromatics per gram of total hydrocarbons. In some embodiments, the produced mixture includes some of the catalysts and/or used catalysts.

In some embodiments, contact of the hydrocarbon fluids with the catalyst system produces coke in 794A. Oxidizing fluid may be introduced into section 794A. The oxidizing fluid may react with the coke to generate heat that maintains the average temperature of section 794A in a desired range. For some time intervals, additional oxidizing fluid may be added to section 794A to increase the oxidation reactions to regenerate catalyst in the section. The reaction of the oxidizing fluid with the coke may reduce the amount of coke and heat formation and/or catalyst to temperatures sufficient to remove impurities on the catalyst. Coke, nitrogen containing compounds, sulfur containing compounds, and/or metals such as nickel and/or vanadium may be removed from the catalyst. Removing impurities from the catalyst in situ may enhance catalyst life. After catalyst regeneration, introduction of reaction fluids may be adjusted to allow section 794A to return to an average temperature in the desired temperature range. The average temperature in section 794A may the controlled to be in range from about 250° C. to about 700° C. Hydrocarbons may be introduced in section 794A to continue the cycle. Additional catalyst systems may be introduced into the formation as needed.

A method for treating a subsurface formation in stages may include using an in situ heat treatment process in combination with injection of an oxidizing fluid and/or drive fluid in one or more portions (sections) of the formation. In some embodiments, hydrocarbons are produced from a first portion and/or a third portion by an in situ heat treatment process. A second portion that separates the first and third portions may be heated with one or more heaters to an average temperature of at least about 100° C. The heat provided to the first portion may be reduced or turned off after a selected time. Oxidizing fluid may be injected in the first portion to oxidize hydrocarbons in the first portion and raise the temperature of the first portion. A drive fluid and/or additional oxidizing fluid may be injected and/or created in the third portion to cause at least some hydrocarbons to move from the third portion through the second portion to the first portion of the hydrocarbon layer. Injection of the oxidizing fluid in the first portion may be reduced or discontinued and additional hydrocarbons and/or syngas may be produced from the first portion of the formation. The additional hydrocarbons and/or syngas may include at least some hydrocarbons from the second and third portions of the formation. Transportation fuel may be produced from the hydrocarbons produced from the first, second and/or third portions of the formation. In some embodiments, a catalyst system is provided to the first portion and/or third portion.

In certain embodiments, sections 794A and 794C are heated at or near the same time to similar temperatures (for example, pyrolysis temperatures) with heaters 438. Sections 794A and 794C may be heated to mobilize and/or pyrolyze hydrocarbons in the sections. The mobilized and/or pyrolyzed hydrocarbons may be produced (for example, through one or more production wells 206) from section 794A and/or section 794C. Section 794B may be heated to lower temperatures (for example, mobilization temperatures) by heaters 438. Sections 794D and 794E may not be heated. Little or no production of hydrocarbons to the surface may take place through section 794B, section 794D and/or section 794E. For example, sections 794A and 794C may be heated to average temperatures of at least about 300° C. or at least about 330° C. while section 794B is heated to an average temperature of at least about 100° C., sections 794D and 794E are not heated and no production wells are operated in section 794B, section 794D, and/or section 794E. In some embodiments, heat from section 794A and/or section 794C transfers to sections section 794D and/or section 794E.

In some embodiments, heavy hydrocarbons in section 794B may be heated to mobilization temperatures and flow into sections 794A and 794C. The mobilized hydrocarbons may be produce from production wells 206 in sections 794A and 794C. After some or most of the fluids have been produced from sections 794A and 794C, production of formation fluids in the sections may be slowed and/or discontinued.

In certain embodiments, heating and producing hydrocarbons from sections 794A and 794C creates fluid injectivity in the sections. After fluid injectivity has been created in section 794C, an oxidizing fluid may be injected into the section. For example, oxidizing fluid may be injected in section 794C after a majority of the hydrocarbons have been produced from the section. The fluid may be injected through heaters 438, production wells 206, and/or injection wells located in section 794C. In some embodiments, heaters 438 continue to provide heat while the fluid is being injected. In certain embodiments, heaters 438 may be turned down or off before or during fluid injection.

During injection of oxidant, excess oxidant and/or oxidation products may be removed from section 794C through one or more production wells 206 and/or heater/gas production wells. In some embodiments, after the formation is raised to a desired temperature, a second fluid may be introduced into section 794C. The second fluid may be steam and/or water. Addition of the second fluid may cool the formation. For example, when the second fluid is steam and/or water, the reactions of the second fluid with coke and/or hydrocarbons are endothermic and produce synthesis gas. In some embodiments, oxidizing fluid is added with the second fluid so that some heating of section 794C occurs simultaneous with the endothermic reactions. In some embodiments, section 794C is treated in alternating steps of adding oxidant and second fluid to heat the formation for selected periods of time.

In certain embodiments, the pressure of the injected fluids and the pressure section 794C are controlled to control the heating in the formation. The pressure in section 794C may be controlled by controlling the production rate of fluids from the section (for example, the production rate of hydrocarbons, oxidation gases and/or syngas products). Heating in section 794C may be controlled so that there is enough hydrocarbon volume in the section to maintain the oxidation reactions in the formation. Heating and/or pressure in section 794C may also be controlled (for example, by producing a minimal amount of hydrocarbons, oxidation gases and/or syngas products) so that enough pressure is generated to create fractures in sections adjacent to the section (for example, creation of fractures in section 794B). Creation of fractures in adjacent sections may allow fluids from adjacent sections to flow into section 794C and cool the section. Injection of oxidizing fluid may allow portions of the formation below the section heated by heaters to be heated, thus allowing heating of formation fluids in deeper and/or inaccessible portions of the subsurface to be accessed. Section 794C may be cooled from temperatures that promote syngas production to temperatures that promote formation of visbroken and/or upgrade products. Such control of heat and pressure in the section may improve efficiency and quality of products produced from the formation.

During heating of section 794C or after the section has reached a desired temperature (e.g., temperatures of at least 300° C., at least about 400° C., or at least about 500° C.), an oxidizing fluid and/or a drive fluid may be injected and/or created in section 794A. The drive fluid includes, but is not limited to, steam, water, hydrocarbons, surfactants, polymers, carbon dioxide, air, or mixtures thereof. In some embodiments, the catalyst system described herein is injected in section 794A. In some embodiments, the catalyst system is injected prior to injecting the oxidizing fluid. In some embodiments, production of fluid from section 794A is discontinued prior to injecting fluids in the section. In some embodiments, heater wells in section 794A are converted to injection wells.

In some embodiments, drive fluids are created in section 794A. Created drive fluids may include air, steam, carbon dioxide, carbon monoxide, hydrogen, methane, pyrolyzed hydrocarbons and/or diluent. In some embodiments, hydrocarbons (for example, hydrocarbons produced from section 794A and/or section 794C, low value hydrocarbons and/or or waste hydrocarbon streams) are provided as a portion of the drive fluid. In some embodiments, hydrocarbons are introduced into section 794A prior to injecting an oxidizing fluid and/or the second fluid. Oxidation, catalytic cracking, and/or thermal cracking of introduced hydrocarbon fluids may create the drive fluid and/or a diluent.

In some embodiments, oxidizing fluid, steam or water are provided as a portion of the drive fluid. The addition of oxidizing fluid, steam, and/or water in the drive fluid may be used to control temperatures in the sections. For example, the addition of steam or water may be cool the section. In some embodiments, water injected as the drive fluid is turned into steam in the formation due to the higher temperatures in the formation. The conversion of water to steam may be used to reduce temperatures or maintain temperatures in the sections between 270° C. and 450° C. Maintaining the temperature between 270° C. and 450° C. may produce higher quality hydrocarbons and/or generate a minimal amount of non-condensable gases.

Residual hydrocarbons and/or coke in section 794A may be melted, visbroken, upgraded and/or oxidized to produce products that may be pushed towards section 794B as shown by the arrows in FIG. 191. In some embodiments, the temperature in section 794C and the generation of drive fluid in section 794A may increase the pressure of section 794A so the drive fluid pushes fluids through section 794B into section 794C. Hot fluids flowing from section 794A into section 794B may melt and/or visbreak fluids in section 794B sufficiently to allow the fluids to move to section 794C. In section 794C, the fluids may be upgraded and/or produced through production wells 206.

In some embodiments, oxidizing fluid injected in section 794A is controlled to raise the average temperature in the section to a desired temperature (for example, at least about 350° C., or at least about 450° C.). Injection of oxidizing fluid and/or drive fluid in section 794A may continue until most or a substantial portion of the fluids from section 794A are moved through section 794B to section 794C. After a period of time, injection of oxidant and/or drive fluid into 794A is slowed and/or discontinued.

Injection of oxidizing fluid into section 794C may be slowed or stopped during injection and/or creation of drive fluid and/or creation of diluent in section 794A. In some embodiments, injection of oxidizing fluid in section 794C is continued to maintain an average temperature in the section of about 500° C. during injection and/or creation of drive fluid and/or diluent in section 794A. In some embodiments, the catalyst system is injected in section 794C.

As section 794A and/or section 794C are treated with oxidizing fluid, heaters in sections 794D and 794E may be turned on. In some embodiments, section 794D is heated through conductive heat transfer from section 794C and/or convective heat transfer. Section 794E may be heated with heaters. For example, an average temperature in section 794E may be raised to above 300° C. while an average temperature in section 794D is maintained between 80° C. and 120° C. (for example, at about 100° C.).

As temperatures in section 794E reach a desired temperature (for example, above 300° C.), production of formation fluids from section 794E through production wells 206 may be started. The temperature may be reached before, during or after oxidizing fluid and/or drive fluid is injected and/or drive fluid and/or diluent is created in section 794A.

Once the desired temperature in section 794E has been obtained (for example, above 300° C., or above 400° C.), production may be slowed and/or stopped in section 794C and oxidation fluid and/or drive fluid is injected and/or created in section 794C to move fluids from section 794C through cooler section 794D towards section 794E as shown by the arrows in FIG. 192. Injection and/or creation of additional oxidation fluid and/or drive fluid in section 794C may upgrade hydrocarbons from section 794B that are in section 794C and/or may move fluids towards section 794E.

In some embodiments, heaters in combination with heating produced by oxidizing hydrocarbons in sections 794A, 794C and/or section 794E allows for a reduction in the number of heaters to be used in the sections and/or less capital costs as heaters made of less expensive materials may be used. The heating pattern may be repeated through the formation.

In some embodiments, fluids in hydrocarbon layer 484 (for example, layers in a tar sands formation) may preferentially move horizontally within the hydrocarbon layer from the point of injection because the layers tend to have a larger horizontal permeability than vertical permeability. The higher horizontal permeability allows the injected fluid to move hydrocarbons between sections preferentially versus fluids draining vertically due to gravity in the formation. Providing sufficient fluid pressure with the injected fluid may ensure that fluids are moved from section 794A through section 794B into section 794C for upgrading and/or production or from section 794C through section 794D into section 794E for upgrading and/or production. Increased heating in sections 794A, 794C, and 794E may mobilize fluids from sections 794B and 794D into adjacent sections. Increased heating may also mobilize fluids below section 794A through 794E and the fluid may flow from the colder sections into the heated sections for upgrading and/or production due to pressure gradients established by producing fluid from the formation. In some embodiments, one or more production wells are placed in the formation below sections 794A through 794E to facilitate production of additional hydrocarbons.

In some embodiments, after sections 794A and 794C are heated to desired temperatures, the oxidizing fluid is injected into section 794C to increase the temperature in the section. The fluids in section 794C may move through section 794B into section 794A as indicated by the arrows in FIG. 193. The fluids may be produced from section 794A. Once a majority of the fluids have been produced from section 794A, the treatment process described in FIG. 191 and FIG. 192 may be repeated.

In some embodiments, treating a formation in stages includes heating a first portion from one or more heaters located in the first portion. Hydrocarbons may be produced from the first portion. Heat provided to the first portion may be reduced or turned off after a selected time. A second portion may be substantially adjacent to the first portion. An oxidizing fluid may be injected in the first portion to cause a temperature of the first portion to increase sufficiently to oxidize hydrocarbons in the first portion and a third portion, the third portion being substantially below the first portion. The second portion may be heated from heat provided from the first portion and/or third portion and/or one or more heaters located in the second portion such that an average temperature in the second portion is at least about 100° C. Hydrocarbons may flow from the second portion into the first portion and/or third portion. Injection of the oxidizing fluid may be reduced or discontinued in the first portion. The temperature of the first portion may cool to below 600° C. to 700° C. and additional hydrocarbons may be produced from the first portion of the formation. The additional hydrocarbons may include oxidized hydrocarbons from the first portion, at least some hydrocarbons from the second portion, at least some hydrocarbons from the third portion of the formation, or mixtures thereof. Transportation fuel may be produced from the hydrocarbons produced from the first, second and/or third portions of the formation.

In some embodiments, in situ heat treatment followed by oxidation and/or catalyst addition as described for horizontal sections is performed in vertical sections of the formation. Heating a bottom vertical layer followed by oxidation may create microfractures in middle sections thus allowing heavy hydrocarbons to flow from the "cold" middle section to the warmer bottom section. Lighter fluids may flow into the top section and continue to be upgraded and/or produced through production wells. In some embodiments, two vertical sections are treated with heaters followed by oxidizing fluid.

In some embodiments, heaters in combination with an oxidizing fluid and/or drive fluid are used in various patterns. For example, cylindrical patterns, square patterns, or hexagonal patterns may be used to heat and produce fluids from a subsurface formation. FIG. 194 and FIG. 195, depict various patterns for treatment of a subsurface formation. FIG. 194 depicts an embodiment of treating a subsurface formation using a cylindrical pattern. FIG. 195 depicts an embodiment of treating multiple sections of a subsurface formation in a rectangular pattern. FIG. 196 is a schematic top view of the pattern depicted in FIG. 195.

Hydrocarbon layer 484 may be separated into section 794A and section 794B. Section 794A represents a section of the subsurface formation that is to be produced using an in situ heat treatment process. Section 794B represents a section of formation that surrounds section 794A and is not heated during the in situ heat treatment process. In certain embodiments, section 794B has a larger volume than section 794A and/or section 794C. Section 794A may be heated using heaters 438 to mobilize and/or pyrolyze hydrocarbons in the section. The mobilized and/or pyrolyzed hydrocarbons may be produced (for example, through one or more production wells 206) from section 794A. After some or all of the hydrocarbons in section 794A have been produced, an oxidizing fluid may be injected into the section. The fluid may be injected through heaters 438, a production well, and/or an injection well located in section 794A. In some embodiments, at least a portion of heaters 438 are used and/or converted to injection wells. In some embodiments, heaters 438 continue to provide heat while the fluid is being injected. In other embodiments, heaters 438 may be turned down or off before or during fluid injection.

In some embodiments, providing oxidizing fluid such as air to section 794A causes oxidation of hydrocarbons in the section and in portions of section 794C. In some embodiments, treatment of section 794A with the heaters creates coked hydrocarbons and formation with substantially uniform porosity and/or substantially uniform injectivity so that heating of the section is controllable when oxidizing fluid is introduced to the section. The oxidation of hydrocarbons in section 794A will maintain the average temperature of the section or increase the average temperature of the section to higher temperatures (for example, above 400° C., above 500° C., above 600° C., or higher).

In some embodiments, an average temperature of section 794C that is located below section 794A increases due to heat generated through oxidation of hydrocarbons and/or coke in section 794A. For example, an average temperature in section 794C may increase from formation temperature to above 500° C. As the average temperature in section 794A and/or section 794C increases through oxidation reactions, the temperature in section 794B increases and fluids may be mobilized towards section 794A as shown by the arrows in FIG. 194 and FIG. 195. In some embodiments, section 794B is heated by heaters to an average temperature of at least about 100° C.

In section 794A, mobilized hydrocarbons are oxidized and/or pyrolyzed to produce visbroken, oxidized, pyrolyzed products. For example, cold bitumen in section 794B may be heated to mobilization temperature of at least about 100° C. so that it flows into section 794A and/or section 794C. In section 794A and/or section 794C, the bitumen is pyrolyzed to produce formation fluids. Fluids may be produced through production wells 206 and/or heater/gas production wells in section 794A. In some embodiments, no fluids are produced from section 794A during oxidation. Injection of oxidizing fluid may be reduced or discontinued in section 794A once a desired temperature is reached (for example, a temperature of at least 350° C., at least 300° C., or above 450° C.). Once oxidizing fluid is slowed and/or discontinued in sections 794A, 794C, the sections may cool (e.g. to temperatures below about 700° C., about 600° C., below 500° C. or below 400° C.) and remain at upgrading and/or pyrolysis temperatures for a period of time. Fluids may continue to be upgraded and may be produced from section 794A through production wells.

In certain embodiments, section 794B and/or section 794D as described in reference to FIGS. 188-196 has a larger volume than section 794A, section 794C, and/or section 794E. Section 794B and/or section 794D may be larger in volume than the other sections so that more hydrocarbons are produced for less energy input into the formation. Because less heat is provided to section 794B and/or section 794D (the section is heated to lower temperatures), having a larger volume in section 794B and/or section 794D reduces the total energy input to the formation per unit volume. The desired volume of section 794B and/or section 794D may depend on factors such as, but not limited to, viscosity, oil saturation, and permeability. In addition, the degree of coking is much less in section 794B and/or section 794D due to the lower temperature so less hydrocarbons are coked in the formation when section 794B and/or section 794D has a larger volume. In some embodiments, the lower degree of heating in section 794B and/or section 794D allows for cheaper capital costs as lower temperature materials (cheaper materials) may be used for heaters used in section 794B and/or section 794D.

Using the remaining hydrocarbons for heat generation and only using electrical heating for the initial heating stage may improve the overall energy use efficiency of treating the formation. Using electrical heating only in the initial step may decrease the electrical power needs for treating the formation. In addition, forming wells that are used for the combination of production, injection, and heating/gas production may decrease well construction costs. In some embodiments, hot gases produced from the formation are provided to turbines. Providing the hot gases to turbines may recover some energy and improve the overall energy use efficiency of the process used to treat the formation.

Treating the subsurface formation, as shown by the embodiments of FIGS. 188-194 may utilize carbon remaining after production of mobilized, visbroken, and/or pyrolyzed hydrocarbons for heat generation in the formation. In some embodiment, treating hydrocarbons in the subsurface formation, as shown in by the embodiments in FIGS. 188-194 creates products having economic value from hydrocarbons having low economic value and/or from waste hydrocarbon streams from surface facilities.

A downhole heater assembly may include 5, 10, 20, 40, or more heaters coupled together. For example, a heater assembly may include between 10 and 40 heaters. Heaters in a downhole heater assembly may be coupled in series. In some embodiments, heaters in a heater assembly may be spaced from about 8 meters (about 25 feet) to about 60 meters (about 195 feet) apart. For example, heaters in a heater assembly may be spaced about 15 meters (about 50 feet) apart. Spacing between heaters in a heater assembly may be a function of heat transfer from the heaters to the formation. Spacing between heaters may be chosen to limit temperature variation along a length of a heater assembly to acceptable limits. Heaters in a heater assembly may include, but are not limited to, electrical heaters, flameless distributed combustors, natural distributed combustors, and/or oxidizers. In some embodiments, heaters in a downhole heater assembly may include only oxidizers.

FIG. 197 depicts a schematic of an embodiment of downhole oxidizer assembly 612 including oxidizers 614 connected in series. In some embodiments, oxidizer assembly 612 may include oxidizers 614 and flameless distributed combustors. Oxidizer assembly 612 may be lowered into an opening in a formation and positioned as desired. In some embodiments, a portion of the opening in the formation may be substantially parallel to the surface of the Earth. In some embodiments, the opening of the formation may be otherwise angled with respect to the surface of the Earth. In an embodiment, the opening may include a significant vertical portion and a portion otherwise angled with respect to the surface of the Earth. In certain embodiments, the opening may be a branched opening. Oxidizer assemblies may branch from common fuel and/or oxidant conduits in a central portion of the opening.

Oxidizing fluid 806 may be supplied to oxidizer assembly 612 through oxidant conduit 618. In some embodiments, fuel conduit 616 and/or oxidizers 614 may be positioned concentrically, or substantially concentrically, in oxidant conduit 618. In some embodiments, fuel conduit 616 and/or oxidizers 614 may be arranged other than concentrically with respect to oxidant conduit 618. In certain branched opening embodiments, fuel conduit 616 and/or oxidant conduit 618 may have a weld or coupling to allow placement of oxidizer assemblies 612 in branches of the opening. Exhaust gas 808 may pass through outer conduit 620 and out of the formation.

In some embodiments, the downhole oxidizer assembly includes a water conduit positioned in the oxidant conduit to deliver water to the fuel conduit prior to the first oxidizer in the oxidizer assembly. A portion of the water conduit may pass through a heated zone generated by the first oxidizer prior to a water entry point into the fuel conduit. In some embodiments, the fuel conduit is positioned adjacent to the oxidizers, and branches from the fuel conduit provide fuel to the other oxidizers. In some embodiments, the fuel conduit may comprise one or more orifices to selectively control the pressure loss along the fuel conduit.

Fuel 810 may be supplied to oxidizers 614 through fuel conduit 616. In some embodiments, the fuel for the oxidizers includes synthesis gas. In some embodiments, the fuel includes synthesis gas (for example, a mixture that includes hydrogen and carbon monoxide) that was produced using an in situ heat treatment process. In certain embodiments, the fuel may comprise natural gas mixed with heavier components such as ethane, propane, butane, or carbon monoxide. In some embodiments, the fuel and/or synthesis gas may include non-combustible gases such as nitrogen. In some embodiments, the fuel contains products from a coal or heavy oil gasification process. The coal or heavy oil gasification process may be an in situ process or an ex situ process. After initiation of combustion of fuel and oxidant mixture in oxidizers 614, composition of the fuel may be varied to enhance operational stability of the oxidizers.

In certain embodiments, fuel used to initiate combustion may be enriched to decrease the temperature required for ignition or otherwise facilitate startup of oxidizers 614. In some embodiments, hydrogen or other hydrogen rich fluids may be used to enrich fuel initially supplied to the oxidizers. After ignition of the oxidizers, enrichment of the fuel may be stopped. In some embodiments, a portion or portions of fuel conduit 616 may include a catalytic surface (for example, a catalytic outer surface) to decrease an ignition temperature of fuel 810.

In some embodiments, non-condensable gases produced from treatment areas of in situ heat treatment processes are used as fuel for heaters that heat treatment areas in the formation. The heaters may be burners. The burners may be oxidizers of downhole oxidizer assemblies, flameless distributed combustors and/or burners that heat a heat transfer fluid used to heat the treatment areas. The non-condensable gases may include combustible gases (for example, hydrogen, hydrogen sulfide, methane and other hydrocarbon gases) and noncombustible gases (for example, carbon dioxide). The presence of noncombustible gases may inhibit coking of the fuel and/or may reduce the flame zone temperature of oxidizers when the fuel is used as fuel for oxidizers of downhole oxidizer assemblies. The reduced flame zone temperature may inhibit formation of NOx compounds and/or other undesired combustion products by the oxidizers. Other components such as water may be included in the fuel supplied to the burners. Combustion of in situ heat treatment process gas may reduce and/or eliminate the need for gas treatment facilities and/or the need to treat the non-condensable portion of formation fluid produced using the in situ heat treatment process to obtain pipeline gas and/or other gas products. Combustion of in situ heat treatment process gas in burners may create concentrated carbon dioxide and/or $SO_x$ effluents that may be used in other processes, sequestered and/or treated to remove undesired components.

In some embodiments, use of non-condensable fluids from in situ heat treatment processes in burners reduces or eliminates the need to build power plants near the in situ heat treatment processes. Heat initially used to increase the temperature of treatment areas in the formation may be provided by burning pipeline gas or other fuel. After the formation begins producing formation fluid, a portion or all of the non-condensable fluids produced from the formation may replace or supplement the pipeline gas or other fuel used to heat treatment areas.

In some embodiments, the oxidizing fluid supplied to the burners is air or enriched air. In some embodiments, the oxidizing fluid is produced by blending oxygen with a carrier fluid such as carbon dioxide to reduce or eliminate the presence of nitrogen in the oxidizing fluid. For example, the oxidizing fluid may be about 50% by volume oxygen and about 50% by volume carbon dioxide. Eliminating or reducing nitrogen in the oxidizing fluid may eliminate or reduce the amount of NOx compounds generated by the burners. Eliminating or reducing nitrogen in the oxidizing fluid may also enable transporting and geologically storing exhaust gases from the burners without having to separate nitrogen from the exhaust gases.

FIG. 198 depicts an embodiment of a system that uses non-condensable fluid from an in situ heat treatment process to heat a treatment area in a formation. Formation fluid 212 produced from treatment areas in the formation enters separation unit 214. Separation unit 214 may separate the formation fluid into in situ heat treatment process liquid stream 216, in situ heat treatment process gas 218, and aqueous stream 220. In situ heat treatment process gas 218 may entrain some water and/or condensable hydrocarbons. In situ heat treatment process gas 218 enters gas separation unit 222. Gas separation unit 222 may remove one or more components from in situ heat treatment process gas 218 to produce fuel 812 and one or more other streams 814. For example, other streams 814 may include carbon dioxide streams 266 and 314 from processes described in FIGS. 2-6. Fuel 812 may include, but is not limited to, hydrogen, sulfur compounds, hydrocarbons having a carbon number of at most 5, carbon oxides, nitrogen compounds, or mixtures thereof. Fuel 812 may include streams produced as described in FIGS. 2-6 (for example, streams 244, 250, 258, 264, 288, 290, or mixtures thereof). In some embodiments, gas separation unit 222 uses chemical and/or physical treatment systems and/or systems described in FIGS. 2-6 to remove or reduce the amount of carbon dioxide in fuel 812. In some embodiments, in situ heat treatment process gas 218 is minimally treated before being used as a fuel. For example, gas separation unit 222 may minimally treat in situ heat treatment process gas 218 to remove water and/or hydrocarbons having a carbon number greater than 5. In some embodiments, in situ heat treatment process gas 218 is suitable for use as a fuel so the gas separation unit 222 is not necessary.

Fuel 812 may enter fuel conduit 616 that provides fuel to oxidizers of oxidizer assemblies (for example, a plurality of oxidizer assemblies such as downhole oxidizer assembly as described in U.S. Published Application No. 20080135254 to Vinegar et al.) that heat treatment area 816. Air stream 818 and/or diluent fluid 820 may be mixed with oxidizing fluid 806 to form mixed oxidizing fluid 822 that is provided to the oxidizers of the downhole oxidizing assemblies. Diluent fluid 820 may be, but is not limited to, carbon oxides separated from in situ heat treatment process gas 218, a portion of stream 814 from gas separation unit 222, carbon dioxide 824 from the exhaust of the downhole oxidizing assemblies, separated carbon dioxide gas streams from gas separation systems described in FIGS. 2-6, or mixtures thereof. In some embodiments, diluent fluid 820 includes sufficient amounts of carbon dioxide to inhibit oxidation of conduits and/or metal parts in fuel conduit 616 that come in contact with oxidizing fluid 806. In some embodiments, the amount of excess oxidant supplied to the downhole oxidizers is reduced to less than about 50% excess oxidant by volume by mixing oxidizing fluid 806 with the diluent fluid 820.

Initially, pipeline gas or other fuel may be supplied to treatment area 816. Valves 826 may be adjusted to control the amount of initial fuel supplied to treatment area 816 as fuel 812 becomes available. Initially, air stream 818 may be supplied to treatment area 816 as the oxidizing fluid. After additional oxidant sources become available, valves 826' may be adjusted to control the composition of oxidizing fluid 822 provided to treatment area 816.

Exhaust gas 808 from burners used to heat treatment area 816 may be directed to exhaust treatment unit 828. Exhaust gas 808 may include, but is not limited to, carbon dioxide and/or $SO_x$. In exhaust separation unit 828, carbon dioxide stream 824 is separated from $SO_x$ stream 830. Separated carbon dioxide stream 824 may be mixed with diluent fluid 820, may be used as a carrier fluid for oxidizing fluid 806, may be used as a drive fluid for producing hydrocarbons, and/or may be sequestered. $SO_x$ stream 830 may be treated using known $SO_x$ treatment methods (for example, sent to a Claus plant). Formation fluid 212' produced from heat treatment area 816 may be mixed with formation fluid 212 from other treatment areas and/or may enter separation unit 214.

In some embodiments, onsite production of oxygen gas is desirable. Production of oxygen gas at or proximate downhole oxidizer assemblies may reduce production costs and/or enhance efficiency of operation of the production of formation fluids. Oxygen gas may be produced by separation of oxygen from air using cryogenic and/or non-cryogenic systems. Non-cryogenic systems include, but are not limited to, pressure swing adsorption, vacuum swing adsorption, vacuum-pressure swing adsorption, membranes, or combinations thereof. Cryogenic systems rely on differences in boiling points to separate and purify the desired products.

FIG. 199 depicts a schematic representation of an embodiment of a system for producing oxygen for use as a portion of oxidizing fluid 822 provided to burners used to heat treatment area 816. Air stream 818 enters air separation unit 832. In air separation unit 832, air 818 is separated into oxygen steam 834 and nitrogen stream 836.

Oxygen stream 834 enters mixed oxidizing fluid 822 and/or is mixed with oxidizing fluid 806. A portion of nitrogen stream 836 may be recycled to air separation unit 832 for use as a coolant. Nitrogen stream 836 may be used as a drive fluid, as a reactant to produce ammonia, as a coolant for forming a low temperature barrier, as a fluid used during drilling, or as a fluid for other processes.

In some embodiments, oxygen is produced through the decomposition of water. For example, electrolysis of water produces oxygen and hydrogen. Using water as a source of oxygen provides a source of oxidant with minimal or no carbon dioxide emissions. The produced hydrogen may be used as a hydrogenation fluid for treating hydrocarbon fluids in situ or ex situ, a fuel source and/or for other purposes. FIG. 200 depicts a schematic representation of an embodiment of a system for producing oxygen using electrolysis of water for use in an oxidizing fluid provided to burners that heat treatment area 816. Water stream 838 enters electrolysis unit 840. In electrolysis unit 840, current is applied to water stream 838 and produces oxygen stream 842 and hydrogen stream 844. In some embodiments, electrolysis of water stream 838 is performed at temperatures ranging from about 600° C. to about 1000° C., from about 700° C. to about 950° C., or from 800° C. to about 900° C. In some embodiments, electrolysis unit 840 is powered by nuclear energy and/or a solid oxide fuel cell and/or a molten salt fuel cell. The use of nuclear energy and/or a solid oxide fuel cell and/or a molten salt fuel cell provides a heat source with minimal and/or no carbon dioxide emissions. High temperature electrolysis may generate hydrogen and oxygen more efficiently than conventional electrolysis because energy losses resulting from the conversion of heat to electricity and electricity to heat are avoided by directly utilizing the heat produced from the nuclear reactions without producing electricity. Oxygen stream 842 mixes with mixed oxidizing fluid 822 and/or is mixed with oxidizing fluid 806. A portion or all of hydrogen stream 844 may be recycled to electrolysis unit 840 and used as an energy source. A portion or all of hydrogen stream 844 may be used for other purposes such as, but not limited to, a fuel for burners and/or a hydrogen source for in situ or ex situ hydrogenation of hydrocarbons.

Exhaust gas 808 from burners used to heat treatment area 816 may be directed to exhaust treatment unit 828. Exhaust gas 808 may include, but is not limited to, carbon dioxide and/or $SO_x$. In exhaust separation unit 828, carbon dioxide stream 824 is separated from $SO_x$ stream 830. Separated carbon dioxide stream 824 may be mixed with diluent fluid 820, may be used as a carrier fluid for oxidizing fluid 806, may be used as a drive fluid for producing hydrocarbons, and/or may be sequestered. $SO_x$ stream 830 may be treated using known $SO_x$ treatment methods (for example, sent to a Claus plant). Formation fluid 212' produced from heat treatment area 816 may be mixed with formation fluid 212 from other treatment areas and/or formation fluid 212' may enter separation unit 214. Separation unit 214 may separate the formation fluid into in situ heat treatment process liquid stream 216, in situ heat treatment process gas 218, and aqueous stream 220. Gas separation unit 222 may remove one or more components from in situ heat treatment process gas 218 to produce fuel 812 and one or more other streams 814. Fuel 812 may include, but is not limited to, hydrogen, sulfur compounds, hydrocarbons having a carbon number of at most 5, carbon oxides, nitrogen compounds, or mixtures thereof. In some embodiments, gas separation unit 222 uses chemical and/or physical treatment systems to remove or reduce the amount of carbon dioxide in fuel 812. Fuel 812 may enter fuel conduit 616 that provides fuel to oxidizers of oxidizer assemblies that heat treatment area 816.

In some embodiments, electrolysis unit 840 is powered by nuclear energy. Nuclear energy may be provided by a number of different types of available nuclear reactors and nuclear reactors currently under development (for example, generation IV reactors). In some embodiments, nuclear reactors may include a self-regulating nuclear reactor. Self-regulating nuclear reactors may include a fissile metal hydride which functions as both fuel for the nuclear reaction as well as a moderator for the nuclear reaction. The nuclear reaction may be moderated by the temperature driven mobility of the hydrogen isotope contained in the hydride. Self-regulating nuclear reactors may produce thermal power on the order of tens of megawatts per unit. Self-regulating nuclear reactors may operate at a maximum fuel temperature ranging from about 400° C. to about 900° C., from about 450° C. to about 800° C., and from about 500° C. to about 600° C. Self-regulating nuclear reactors have several advantages including, but not limited to, a compact/modular design, ease of transport, and a simple cost effective design.

In some embodiments, nuclear reactors may include one or more very high temperature reactors (VHTRs). VHTRs may use helium as a coolant to drive a gas turbine for treating hydrocarbon fluids in situ, powering electrolysis unit 840 and/or for other purposes. VHTRs may produce heat for electrolysis units up to about 950° C. or more. In some embodiments, nuclear reactors may include a sodium-cooled fast reactor (SFR). SFRs may be designed on a smaller scale (for example, 50 MWe), and therefore are more cost effective to manufacture on site for treating hydrocarbon fluids in situ, powering electrolysis units and/or for other purposes. SFRs may be of a modular design and potentially portable. SFRs may produce heat for electrolysis units ranging from about 500° C. to about 600° C., from about 525° C. to about 575° C., or from 540° C. to about 560° C.

In some embodiments, pebble bed reactors may be employed to provide heat for electrolysis. Pebble bed reactors may produce up to about 165 MWe. Pebble bed reactors may produce heat for electrolysis units ranging from about 500° C. to about 1100° C., from about 800° C. to about 1000° C., or from about 900° C. to about 950° C. In some embodiments, nuclear reactors may include supercritical-water-cooled reactors (SCWRs) based at least in part on previous light water reactors (LWR) and supercritical fossil-fired boilers. In some embodiments, SCWRs may be employed to provide heat for electrolysis. SCWRs may produce heat for electrolysis units ranging from about 400° C. to about 650° C., from about 450° C. to about 550° C., or from about 500° C. to about 550° C.

In some embodiments, nuclear reactors may include lead-cooled fast reactors (LFRs). In some embodiments, LFRs may be employed to provide heat for electrolysis. LFRs may be manufactured in a range of sizes, from modular systems to several hundred megawatt or more sized systems. LFRs may produce heat for electrolysis units ranging from about 400° C. to about 900° C., from about 500° C. to about 850° C., or from about 550° C. to about 800° C.

In some embodiments, nuclear reactors may include molten salt reactors (MSRs). In some embodiments, MSRs may be employed to provide heat for electrolysis. MSRs may include fissile, fertile, and fission isotopes dissolved in a molten fluoride salt with a boiling point of about 1,400° C. which function as both the reactor fuel and the coolant. MSRs may produce heat for electrolysis units ranging from about 400° C. to about 900° C., from about 500° C. to about 850° C., or from about 600° C. to about 800° C.

FIG. 201 depicts a schematic representation of an embodiment of a system for producing hydrogen for use as a fuel for burners that heat treatment area 816. In situ heat treatment process gas 218 and/or fuel 812 may pass to reformation unit 846. In some embodiments, in situ heat treatment process gas 218 is mixed with fuel 812 and then passed to reformation unit 846. A portion of in situ heat treatment process gas 218 enters gas separation unit 222. Gas separation unit 222 may remove one or more components from in situ heat treatment process gas 218 to produce fuel 812 and one or more other streams 814. Other streams 814 may include carbon dioxide and/or hydrogen sulfide. The carbon dioxide may be mixed with diluent fluid 820, may be used as a carrier fluid for oxidizing fluid 806, may be used as a drive fluid for producing hydrocarbons, may be vented, and/or may be sequestered. Hydrogen sulfide may be sent to a Claus plant for conversion to sulfur compounds or sulfur, may be burned to produce heat, and/or may be sequestered in a formation. Fuel 812 may include, but is not limited to, hydrogen, hydrocarbons having a carbon number of at most 5, or mixtures thereof. Some or all of fuel 812 may pass to fuel conduit 616.

Reformer unit 846 may be, for example, an autothermal reformer and/or a steam reformer. Reformer unit 846 may include one or more catalysts that enhance the production of hydrogen and carbon dioxide from hydrocarbons. For example, reformation unit 846 may include water gas shift catalysts. Reformation unit 846 may include one or more separation systems (for example, membranes and/or a pressure swing adsorption system) capable of separating hydrogen from other components. Reformation of fuel 812 and/or in situ heat treatment process gas 218 may produce hydrogen stream 844 and carbon oxide stream 848. Reformation of fuel 812 and/or in situ heat treatment process gas 218 may be performed using techniques known in the art for catalytic and/or thermal reformation of hydrocarbons to produce hydrogen. In some embodiments, fuel 812 and/or in situ heat treatment process gas 218 is passed through a drying system prior to entering reformation unit 846 to remove water in the fuel and/or gas.

Hydrogen stream 844 may be provided to fuel conduit 616. A portion or all of hydrogen stream 844 may be used for other purposes such as, but not limited to, an energy source and/or a hydrogen source for in situ or ex situ hydrogenation of hydrocarbons. Valves 826 may be adjusted to control the amount of initial fuel supplied to treatment area 816 as fuel 812 and/or hydrogen stream 844 become available.

Carbon oxide stream 848 may include, but is not limited to, carbon dioxide and carbon monoxide. Carbon oxide stream 848 may be mixed with diluent fluid 820, may be used as a carrier fluid for oxidizing fluid 806, may be used as a drive fluid for producing hydrocarbons, may be vented, and/or may be sequestered.

Combinations of processes described in FIGS. 198 through 201 may be used to produce fuel and/or oxidizing fluid for burners that provide heat to heat treatment area 816.

Coke formation may occur inside the fuel conduit if the fuel contains hydrocarbons and the heat flux is sufficiently high. After oxidizer ignition, steps may be taken to reduce coking. For example, steam or water may be added to the fuel conduit. In some embodiments, coking is inhibited by decreasing a residence time of fuel in the fuel conduit. The residence time of fuel in the fuel conduit may be decreased by varying the size of the fuel conduit. For example, one portion of the fuel conduit may be approximately ¾ inch (approximately 1.9 cm) in diameter while another portion may be approximately ⅜ inch (approximately 0.95 cm) in diameter. Alternatively, the thickness and length of all or portions of the fuel conduit may be varied.

In some embodiments, coking is inhibited by insulating portions of the fuel conduit that pass through high temperature zones proximate the oxidizers. For example, a portion of the fuel conduit may be coated with an insulating layer and/or a conductive layer. The insulating layer may be made from thermal insulating materials such as silicon carbide, alumina, mullite, zirconia, and other material known in the art. The conductive layer may be made from commercially available highly conductive materials such as ceramics and/or high temperature metals, including but not limited to Hexyloy (available from Arklay S. Richards Co., Inc.). The insulating layer and/or the conductive layer may be applied to the fuel conduit using a high velocity oxygen fuel or air plasma process. The resulting layer or layers may be heat treated.

In some embodiments, the fuel conduit is treated to remove coke formed in the fuel conduit by decoking. Decoking may be performed through mechanical means and/or chemical means. For example, coke may be removed from the fuel conduit by pumping a metal studded, foam or plastic pig through the fuel conduit. In an embodiment, a rod is inserted into fuel conduit 616 to dislodge coke particles and push them towards the last oxidizer in the oxidizer assembly. The rod may be a hydrolance or other high pressure pipe or tube used to direct high pressure water, air, nitrogen, and/or other gas to dislodge the coke.

FIG. 202 and FIG. 203 depict embodiments of oxidizers 614 of oxidizer assemblies positioned in outer conduits 620. Oxidizer 614 may be coupled to fuel conduit 616 that is positioned in oxidant conduit 618. Oxidant and fuel enter mix chamber 850 of oxidizer 614. A combustible mixture of fuel and oxidant passes from mix chamber 850 into the space between fuel conduit 616 and shield 852. Shield 852 surrounds a portion of fuel conduit 616. Shield 852 may allow development of flame zone 622 in oxidizer 614. Shield 852 may inhibit gas flowing in the oxidant conduit from extinguishing flame zone 622 formed in oxidizer 614. Spacers may position oxidizer 614 in oxidant conduit 618. The spacers may be coupled to shield 852 and/or to oxidizer conduit 618. An igniter and/or combusting fuel in flame zone 622 oxidizes the mixture of fuel and oxidant in the flame zone.

Insulating layer 854 may be placed around fuel conduit 616 to at least partially surround a portion of the fuel conduit. Insulating layer 854 may be made of a material with low thermal conductivity. Insulating layer 854 may inhibit coking in fuel conduit 616. Insulating layer 854 may only surround portions of fuel conduit 616 that pass through oxidizers 614. In some embodiments, the insulating layer covers the portion of the fuel conduit passing through the oxidizer and a portion of the fuel conduit before and/or after the oxidizer. In some embodiments, the entire fuel conduit is insulated.

Thermally conductive layer 856 may surround or partially surround insulating layer 854. Thermally conductive layer 856 may be located adjacent to flame zone 622. Thermally conductive layer 856 may spread the heat of flame zone 622 over a large area to help reduce the temperature applied to insulating layer 854 below the flame zone. In some embodiments, the insulating layer does not include a thermally conductive layer.

FIG. 203 depicts a cross-sectional representation of an embodiment of oxidizer 614 with gas cooled sleeve 858. A portion of sleeve 858 may pass through oxidizer 614 to form an annular space. One or more spacers may be located between fuel conduit 616 and sleeve 858 to position the sleeve relative to the fuel conduit. One or more feedthroughs 860 may direct fuel from fuel conduit 616 to mix chamber 850 and/or to the area between shield 852 and the fuel conduit of oxidizer 614. Some gas flowing in oxidant conduit 618 passes between fuel conduit 616 and insulating sleeve 854. Insulating sleeve 854 may include thermally conductive layer 856 to dissipate some of the heat from flame zone 622 over a large area. Gas passing between fuel conduit 616 and insulating sleeve 854 may inhibit excessive heating of the fuel conduit adjacent to flame zone 622.

The flow of fuel in fuel conduit 616 is represented by arrow 862, and the flow of gas (for example, air and exhaust products and unburned fuel from previous oxidizers) in oxidant conduit 618 is represented by arrow 864. Exhaust gases from all oxidizers in the oxidizer assembly pass through outer conduit 620 in the direction indicated by arrow 866. Flow of gas between fuel conduit 616 and insulating sleeve 854 may reduce the amount of heat transfer from the insulating sleeve to the fuel conduit. Flame zone 622 may have a temperature of about 1100° C. (about 2000° F.) while the temperature in oxidant conduit adjacent to the shield of oxidizer 614 may be about 700° C. (about 1300° F.).

Oxidant may be supplied through the oxidant conduit to the oxidizers. Oxidizing fluid may include, but is not limited to, air, oxygen enriched air, and/or hydrogen peroxide. Depletion of oxygen in the oxidant may occur toward a terminal end of an oxidizer assembly. In some embodiments, the amount of excess oxidant supplied to the oxidizers is reduced to less than about 50% excess oxidant by weight by controlling the pressure, temperature, and flow rate of the oxidant in the oxidant conduit. For example, after ignition, the amount of oxidant can be reduced when the temperature of the fuel conduit reaches about 650° C. (about 1200° F.). In some embodiments, the amount of excess oxidant is reduced to less than about 25% excess oxidant by weight. In other embodiments, the amount of excess oxidant is reduced to less than about 10% excess oxidant by weight.

In some embodiments, the amount of excess oxidant is reduced when the temperature downstream of the oxidizers becomes sufficiently hot to support reaction of oxidant and fuel outside of the oxidizers. Oxidant and fuel may react in regions between oxidizers. During such operation, the oxidizer assembly functions much like a flameless distributed combustor. Generating heat in the regions between the oxidizers may result in a smoother temperature profile along the length of the oxidizer assembly. The excess oxidant may be reduced such that the last oxidizer in the oxidizer assembly substantially eliminates the remaining oxidant in the oxidant conduit. The last oxidizer may be a catalytic oxidizer to minimize or eliminate oxidant remaining in the oxidant conduit.

When the temperature along the length of the oxidizer assembly increases to a temperature sufficient to support reaction of oxidant with fuel outside of the shields of the oxidizers, the mode of operation of the oxidizer assembly may shift from a series of individual oxidizers with aerodynamically staged flames to a more uniformly distributed or "reactor-stable" mode of operation. During the reactor-stable mode of operation, combustion may take place outside the shield along the entire length of the oxidant conduit. Under this condition stability is achieved by balancing overall heat loss and heat generation over the broad reaction zone. Local recirculation of hot combustion products to incoming reactants enables minimum reaction temperature where fuel-oxidant mixtures will oxidize without aerodynamic stabilization. In this mode of operation, the oxidizers may still serve as a "safety" or means of continuing stabilization, if the temperature falls below the temperature needed to sustain oxidation of the fuel and oxidant in one or more regions of the oxidizer. During reactor-stable mode of operation, the amount of excess oxygen supplied to the oxidizer assembly may be reduced. Having the ability to reduce the amount of excess oxygen supplied to the oxidizer assembly may significantly improve the overall economics of the system used to heat the formation.

A common problem associated with the operation of gas burners employing a flame mechanism is that at high temperatures, particularly above about 1500° C. (about 2730° F.), oxygen and nitrogen present in the air combine by a thermal formation mechanism to form pollutants such as NO and $NO_2$, commonly referred to as $NO_x$. By controlling the flow of fuel and oxidant, and by maintaining a distributed temperature, the formation of $NO_x$ may be inhibited. In some embodiments, the flow of fuel and oxidant is controlled to produce less than about 10 parts per million by weight of $NO_x$ from the gas burner. The flow of oxidant may be controlled by having openings in shields of the oxidizers sized to bring a sufficient flow rate to the flame zone to dilute the flame without causing the flame to be extinguished. Additionally, water added to the fuel conduit may inhibit $NO_x$ formation.

In some embodiments, initiation of the burner assembly is accomplished by initializing combustion in a specified sequence beginning with the last oxidizer in the assembly. Referring to FIG. 197, oxidizer assembly 612 includes first oxidizer 868, last oxidizer 870, and second-to-last oxidizer 872. In some embodiments, fuel is supplied through fuel conduit 616, and oxidant is supplied through oxidant conduit 618 to provide a first combustible mixture to last oxidizer 870. Combustion is initiated in last oxidizer 870 and the supply of oxidant is adjusted to supply second-to-last oxidizer 872 with a second combustible mixture. Ignition of last oxidizer 870 is maintained as second-to-last oxidizer 872 is ignited. Thereafter this process of adjusting the supply of oxidant to provide a combustible fuel and oxidant mixture to the next unignited oxidizer and initiating combustion in the unignited oxidizer is repeated until first oxidizer 868 is ignited. In some embodiments, the fuel pressure is greater than the oxidant pressure at an oxidizer before initiating combustion in the oxidizer.

In an embodiment, the start up sequence is optimized by controlling the oxidant and fuel pressure differential along the length of the oxidizer assembly. Because the pressure differential varies over the length of the burner assembly, a planned sequential ignition from oxidizer to oxidizer, starting with last (most remote) oxidizer 870 may be achieved. In this embodiment, the fuel-oxidant mixture in the ignition region is optimized at last oxidizer 870, then at the second to last oxidizer 872, and so on, with the fuel-to-oxidant ratio being least optimal at first oxidizer 868. The profiles may be controlled to change the sequence of ignition. In an embodiment, the profiles may be reversed so that first oxidizer 868 is ignited first. Altering the profiles may comprise altering the pressure differential along the oxidizer assembly length by design of the fuel conduit diameter coupled with optimization of opening sizes that provide fuel to the oxidizers, of opening sizes that provide oxidant to the mix chambers of the oxidizers, and of openings in the shields that supply oxidant to the flame zone. In addition, control may be facilitated by flow restrictions positioned in fuel conduit 616.

FIG. 204 depicts a perspective view of an embodiment of oxidizer 614 of the downhole oxidizer assembly. Oxidizer 614 may include mix chamber 850, igniter holder 874, ignition chamber 876, and shield 852. Fuel conduit 616 may pass through oxidizer 614. Fuel conduit 616 may have one or more fuel openings 878 within mix chamber 850 (as shown in FIG. 202). In some embodiments, additional openings in fuel conduit 616 allow additional fuel to pass into the space between the fuel conduit and shield 852. Openings 880 allow oxidant to flow into mix chamber 850. Opening 882 allows a portion of the igniter supported on igniter holder 874 to pass into oxidizer 614. Shield 852 may include openings 884. Openings 884 may provide additional oxidant to a flame in shield 852. Openings 884 may stabilize the flame in oxidizer 614 and moderate the temperature of the flame. Spacers 886 may be positioned on shield 852 to keep oxidizer 614 positioned in oxidant conduit 618.

In some embodiments, flame stabilizers may be added to the oxidizers. The flame stabilizers may attach the flame to the shield. The high bypass flow around the oxidizer cools the shield and protects the internals of the oxidizer from damage enabling long term operation. FIGS. 205-210 depict various embodiments of shields 852 with flame stabilizers 888. Flame stabilizer 888 depicted in FIG. 205 is a ring substantially perpendicular to shield 852. The ring shown in FIG. 206 is angled away from openings 884. The rings may amount to up to about 25% annular area blockage. The rings may establish a recirculation zone near shield 852 and away from the fuel conduit passing through the center of the shield.

FIG. 207 depicts an embodiment of flame stabilizer 888 in shield 852. Flame stabilizer 888 is positioned at an angle over the openings. Flame stabilizer 888 may divert incoming fluid flow through openings 884 in an upstream direction. The diverted incoming fluid may set up a flow condition somewhat analogous to high swirl recirculation (reverse flow). One or more stagnation zones may develop where a flame front is stable.

FIG. 208 depicts an embodiment of multiple flame stabilizers 888 in shield 852. Shield 852 may have two or more sets of openings 884 along an axial length of the shield. Rings may be positioned behind one or more of the sets of openings 884. In some embodiments, adjacent rings may cause too much gas flow interference. To inhibit gas flow interference, 3 partial rings (each ring being about ⅙ the circumference) may be evenly spaced about the circumference instead of one complete ring. The next set of 3 partial rings along the axial length of heat shield may be staggered (for example, the partial rings may be rotated by 60° relative to the first set of 3 partial rings). FIG. 209 depicts a cross-sectional representation of shield 852 showing the last set of openings 884 and the last set of flame stabilizers 888. Shield 852 includes spacers 886. In other embodiments, fewer or more than 3 partial rings may be used (for example, two partial rings may be used for the first set of openings, and four partial rings may be used for the next set of openings). Flame stabilizers 888 may be perpendicular to shield 852, angled towards openings 884, angled away from the openings (as depicted in FIG. 208) or positioned as combinations of perpendicular and angled orientations.

FIG. 210 depicts an embodiment wherein flame stabilizers 888 are deflector plates or baffles extending over all or portions of openings 884. The portions of flame stabilizers 888 positioned over the openings may be cylindrical sections with the concave portions facing openings 884. Flame stabilizers 888 may divert incoming fluid flow and allow the flame root area to develop around the deflectors. Some openings in the shield may not include flame stabilizers.

In some embodiments, deflectors may be positioned on the outer surface of the shield near to openings in the shield. The deflectors may direct some of the gas flowing through the oxidant conduit through the openings in the shield.

In one embodiment, one or more of the oxidizers have flame stabilizers that utilize a louvered design to direct flow into the shield. FIG. 211 depicts oxidizer 614 with louvered openings 884 in shield 852. Louvered openings 884 are in communication with the oxidant conduit. An extension on the inside wall of shield 852 directs gas flow into shield 852 in a direction opposite to the direction of flow in the oxidant conduit. FIG. 212 depicts a cross-sectional representation of a portion of shield 852 with louvered opening 884. Gas with oxidant entering shield 852 may be directed by extension 890 in a desired direction. Arrow 892 indicates the direction of gas flow from the oxidant conduit to the inside of shield. Arrow 894 indicates the direction of gas flow in the oxidant conduit.

As depicted in FIGS. 204-212, shield 852 may include openings 884. The size and/or number of openings 884 may be varied depending on position of the oxidizer in the oxidizer assembly to moderate the temperature and ensure fuel combustion. In some embodiments, the geometry and size of openings 884 on a single oxidizer may be varied to compensate for changing conditions and needs along the length of the oxidizer.

FIGS. 213-215 depict perspective views of various sectioned oxidizer embodiments. Oxidizers 614 include oxidant openings 880, mix chambers 850, ignition chambers 876, and shields 852. FIGS. 213-215 depict various positions and sizes for openings 884 in shields 852.

In some embodiments, one or more of the openings in the shield may be angled in a non-perpendicular direction relative to the longitudinal axis of the shield. Angled openings act as nozzles to alter the entry path of gas into the shield. Angled openings may promote formation of internal low velocity recirculation zones where the reaction front can stabilize and improve the stability and reliability of the oxidizer.

The use of flame stabilizers, various sizes of openings in the shield and/or angled openings may establish the flame zone of the oxidizer close to the shield and far away from the fuel conduit to maximize radial separation of the flame zone from the fuel conduit so as to minimize direct heating of the fuel conduit by the flame zone. The use of flame stabilizers, various sizes of openings in the shield and/or angled openings may also achieve lower $NO_x$ emissions by effectively aerodynamically staging the combustion zone and creating fuel rich and lean zones. In fuel rich zones, $N_2$ formation (instead of $NO_x$) will be favored and aerodynamic staging will control peak temperatures and thermal $NO_x$ formation. Such configurations can also enable control of the peak longitudinal temperature profile and flame radiation, thus suppressing overheating of the fuel conduit.

In some embodiments, fuel passes through a heated region before being supplied to the first oxidizer (oxidizer 868 in FIG. 197). Passing the fuel through the heated region may preheat the fuel and ensure that the fuel and additives in the fuel (for example, water to inhibit coking) are in the gas phase. Ensuring gas phase fuel may avoid plugging in first oxidizer 868. FIG. 216 depicts an embodiment of first oxidizer 868 and fuel conduit 616. Fuel conduit 616 may include sleeve 896. Fuel may flow through sleeve 896, and a portion of the fuel may flow in the opposite direction in the annular space between the sleeve and fuel conduit 616. A portion of the fuel flowing in the annular space between sleeve 896 and fuel conduit 616 passes through openings 878 into mix chamber 850.

In some embodiments, a portion of the fuel flowing in the annular space between sleeve 896 and fuel conduit 616 passes through openings 878 into the annular space between the fuel conduit and shield 852. Supplying fuel into this annular space may allow flame zone 622 to extend through a significant portion of first oxidizer 868 so that the first oxidizer is able to input more heat into the formation. First oxidizer 868 may be configured to input more heat into the formation to help compensate for heat losses attributable to the oxidizer being the first oxidizer of the oxidizer assembly. Having first oxidizer configured to input more heat into the formation than other oxidizers of the oxidizer assembly may allow for a decrease in the total number of oxidizers needed in the downhole assembly.

One or more of the oxidizers in an oxidizer assembly may be a catalytic burner. The catalytic burners may include a catalytic portion (for example, a catalyst chamber) followed by a homogenous portion (for example, an ignition chamber). Catalytic burners may be started late in an ignition sequence, and may ignite without igniters. Oxidant for the catalytic burners may be sufficiently hot from upstream burners (for example, the oxidant may be at a temperature of about 370° F. (about 700° C.) if the fuel is primarily methane) so that a primary mixture would react over the catalyst in the catalyst portion and produce enough heat so that exiting products ignite a secondary mixture in the homogenous portion of the oxidizer. In some embodiments, the fuel may include enough hydrogen to allow the needed temperature of the oxidant to be lower. Catalysts used for this purpose may include palladium, platinum, platinum/iridium, platinum/rhodium or mixtures thereof.

FIG. 217 depicts a cross-sectional representation of catalytic burner 898. Oxidant may enter mix chamber 850 through openings 880. Fuel may enter mix chamber 850 from fuel conduit 616 through fuel openings 878'. Fuel and oxidizer may flow to catalyst chamber 902. Catalyst chamber 902 contains catalyst which reacts a mixture from mix chamber 850 to produce reaction products at a temperature that is sufficient to ignite fuel and oxidant. In some embodiments, the catalyst includes palladium on a honeycomb ceramic support. The fuel and oxidant react in catalyst chamber 902 to form hot reaction products. The hot reaction products may be directed to the annular space between shield 852 and fuel conduit 616. Additional fuel enters the annular space through openings 878" in fuel conduit 616. Additional oxidant enters the annular space through openings 884. The hot reaction products generated by catalyst 902 may ignite fuel and oxidant in autoignition zone 904. Autoignition zone 904 may allow fuel and oxidant to form flame zone 622. In some embodiments, the catalytic burner includes flame stabilizers or other types of gas flow modifiers.

In some embodiments a catalytic burner may include an igniter to simplify startup procedures. FIG. 218 depicts catalytic burner 898 that includes igniter 900. Igniter 900 is positioned in mix chamber 850. Catalytic burner 898 includes catalyst chamber 902. Catalyst chamber contains a catalyst that reacts a mixture from mix chamber 850 to produce reaction products at a temperature that is sufficient to ignite fuel and oxidant. Oxidant enters mix chamber through openings 880A. Fuel enters the mix chamber from fuel line through fuel openings 878A. The fuel input into mixture chamber 850 may be only a small fraction of the fuel input for catalytic burner 898. Igniter 900 raises the temperature of the fuel and oxidant to combustion temperatures in pre-heat zone 906. Flame stabilizer 888 may be positioned in mixing chamber 850. Heat from pre-heat zone 906 and/or combustion products may heat additional fuel that enters mixing chamber 850 through fuel openings 878B and additional oxidant that enters the mixing chamber through openings 880B. Openings 878B and openings 880B may be upstream of flame stabilizer 888. The additional fuel and oxidant are heated to a temperature sufficient to support reaction on catalyst 902.

Heated fuel and oxidant from mixing chamber 850 pass to catalyst 902. The fuel and oxidant react on catalyst 902 to form hot reaction products. The hot reaction products may be directed to heat shield 852. Additional fuel enters heat shield 852 through openings 878C in fuel conduit 616. Additional oxidant enters heat shield 852 through openings 884. The hot reaction products generated by catalyst 902 may ignite fuel and oxidant in autoignition zone 904. Autoignition zone 904 may allow fuel and oxidant to form main combustion zone 622. In some embodiments, the catalytic burner includes flame stabilizers or other types of gas flow modifiers.

In some embodiments, all of the oxidizers in the oxidizer assembly are catalytic burners. In some embodiments, the first or the first several oxidizers in the oxidizer assembly are catalytic burners. The oxidant supplied to these burners may be at a lower temperature than subsequent burners. Using catalytic burners with igniters may stabilize the initial performance of the first several oxidizers in the oxidizer assembly. Catalytic burners may be used in-line with other burners to reduce emissions by allowing lower flame temperatures while still having substantially complete combustion.

In some embodiments, a catalytic converter may be positioned at the end of the oxidizer assembly or in the exhaust gas return. The catalytic converter may remove unburned hydrocarbons and/or remaining $NO_x$ compounds or other pollutants. The catalytic converter may benefit from the relatively high temperature of the exhaust gas. In some embodiments, catalytic burners in series may be integrated with coupled catalytic converters to limit undesired emissions from the oxidizer assembly. In some embodiments, a selectively permeable material may be used to allow carbon dioxide or other fluids to be separated from the exhaust gas.

In one embodiment, initiation of the burner assembly may be accomplished by initializing combustion with hydrogen and later switching to natural gas or another fuel. The use of hydrogen-enriched fuel may suppress flame radiation and reduce heating of the fuel conduit. Oxidizers of the oxidizer assembly may be ignited using hydrogen or fuel that is highly enriched with hydrogen. Once ignited, the composition of fuel may be adjusted to comprise natural gas and/or other fuels. The initial use of hydrogen or hydrogen-enriched fuel widens the flammability envelope enabling much easier startup. An initial fuel composition could then be "chased" with production gas or other more economical gases. Alternatively, the entire system could burn hydrogen. With no carbon in the fuel, there would be no need for additional decoking methods.

FIG. 219 depicts a cross-sectional representation of an embodiment of oxidizer 614 of oxidizer assembly 612 with the section taken substantially perpendicular to a central axis of the oxidizer through fuel conduit 616 that enters mix chamber 850 of the oxidizer. Oxidizer 614 is positioned in oxidant conduit 618. Supports 908 position oxidizer 614 in oxidant conduit 618. Supports 908 may be welded or otherwise secured to oxidizer 614 and/or oxidant conduit 618. In some embodiments, one or more supports or spacers may be positioned in the space between oxidant conduit 618 and outer conduit 620 to position the oxidant conduit in the outer conduit.

Oxidant conduit 618 is positioned in outer conduit 620. Fuel conduits 616 are positioned in the space between oxidant conduit 618 and outer conduit 620. In the depicted embodiment, four fuel conduits 616 are shown. More than four fuel conduits or less than four fuel conduits may be positioned in the oxidizer assembly in other embodiments. Fuel taps 910 may pass from fuel conduits 616 through oxidant conduit 618 to a mix chamber of an oxidizer. In some embodiments, each fuel conduit 616 supplies a single oxidizer. In some embodiments, one fuel conduit supplies two or more oxidizers of the oxidizer assembly. Portions or all of fuel conduits 616 and/or portions or all of fuel taps 910 may be insulated. In some embodiments, fuel conduits 616 are positioned radially away from oxidant conduit 618 so that exhaust gas returning through the space between outer conduit 620 and the oxidant conduit transfers heat with the fuel conduits to limit the upper temperature attained by the fuel conduits.

Using multiple fuel conduits may allow the supply of fuel to be interrupted to one or more of oxidizers without adversely affecting all of the oxidizers. Multiple fuel conduits also allow for adjustment of fuel mixtures supplied to the oxidizers during startup and after steady operation of the oxidizers is established.

Igniter supply conduits 912 may be positioned in the space between oxidant conduit 618 and outer conduit 620. In some embodiments, the igniter supply conduits are positioned in the oxidant conduit. Igniters 900 may branch from igniter supply conduits 912 into ignition chambers of the oxidizers. In the depicted embodiment, four igniter supply conduits 912 are shown. More than four igniter supply conduits or less than four igniter supply conduits may be positioned in the oxidizer assembly in other embodiments. Igniter supply conduits may be conduits that convey a fuel (for example, hydrogen) to a catalyst in the igniter. Igniter supply conduits may hold insulated conductors that provide electricity to the igniters. The igniters may be glow plugs, spark plugs, or other types of igniters that use electricity to ignite the oxidizers. In some embodiments, the igniter supply conduit is an insulated conductor. In some embodiments, some igniter supply conduits may convey fuel and other igniter supply conduits of the oxidizer assembly may transmit electricity.

FIG. 220 depicts a cross-sectional representation of an embodiment of oxidizer 614 of oxidizer assembly 612 with the section taken substantially along the central axis of the oxidizer. Additional oxidizers may be positioned above and/or below the oxidizer shown. Supports 908 position oxidizer 614 in oxidant conduit 618. Oxidizer 614 includes mix chamber 850, ignition chamber 876 and shield 852. Oxidant conduit 618 is positioned in outer conduit 620. Fuel conduit 616 is positioned in the space between outer conduit 620 and oxidant conduit 618. One or more fuel taps 910 from fuel conduit 616 pass through oxidant conduit 618 to mix chamber 850. Mix chamber 850 has one or more openings 880 that allow passage of oxidant from oxidant conduit 618 into the mix chamber. The size and/or number of openings may be set for each oxidizer so that the oxidizer receives an appropriate inflow into mix chamber 850. In some embodiments, the amount of flow into the mix chamber of one or more oxidizers is adjusted by a control system that is able to change the size of the openings into the mix chamber.

A mixture of fuel and oxidant passes from mix chamber 850 to ignition chamber 876 through mixture opening 914. Mixture opening 914 may be positioned along a central axis of oxidizer 614 as depicted in FIG. 219 and FIG. 220. Positioning mixture opening 914 allows flame zone 622 generated by ignited fuel mixture to be substantially axisymmetric within oxidizer 614. Flame zone 622 may be stable and result in the production of low amount of $NO_x$ compounds. Flame zone 622 may have the potential for swirl applications.

In some embodiments, igniter 900 branches from igniter supply conduit 912 through oxidant conduit 618 into ignition chamber 876. Igniter 900 may be used during start up of the oxidizer assembly to initiate combustion of fuel and oxidant mixture passing through opening 914. In some embodiments, use of the igniters is stopped after start up of the oxidizers in the oxidizer assembly. Flame zone 622 generated by combusting the oxidant and fuel mixture may extend through ignition chamber 876 into shield 852. Shield 852 may stabilize flame zone 622 and inhibit blow out of the flame zone by oxidant and exhaust gas flowing through oxidant conduit 618.

In some embodiments, one or more small oxidant conduit lines may be positioned in the oxidizer assembly to provide additional oxidizing fluid to the oxidizers located near the end of the oxidizer assembly. Small oxidant lines may be positioned in the main oxidant conduit and/or in the space between the oxidant conduit and the outer conduit. Additional oxidizing fluid may be introduced into the exhaust and oxidizing fluid flowing through the main oxidant conduit. The additional oxidizing fluid may result in combustion of all of the fuel supplied to the oxidizers.

In some embodiments, oxidizers that produce a flame are used as preheaters upstream of flameless distributed combustors. The oxidizers preheat the oxidizing fluid and/or the fuel supplied to the flameless distributed combustors above a temperature of about 815° C., which is above the auto-ignition temperature of a mixture of oxidant fluid and fuel.

The flameless distributed combustor segments may be 100 ft to 500 ft in length. Shorter or longer flameless distributed combustor segment lengths may also be used. The oxidizer assembly may have less than ten oxidizers. FIG. 221 depicts a schematic representation of oxidizer assembly 612 with oxidizers 614 that preheat fuel and oxidant supplied to flameless distributed combustors 916. Oxidizers 614 may be similar to the oxidizer depicted in FIG. 204.

Flameless distributed combustors 916 depicted in FIG. 221 may include a series of orifices 918 in central fuel conduit 616. Orifices 918 may be critical flow orifices. Orifices 918 allow heated fuel to mix with heated oxidizing fluid so that the mixture reacts to produce additional heat. Flameless distributed combustors 916 may operate at much lower temperature than oxidizers 614 since no flame is present. The lower temperature may result in the production of less $NO_x$ compounds if the oxidizing fluid includes, or the fuel includes, nitrogen or nitrogen compounds.

In some embodiments, one or more additional fuel conduits may be positioned in the space between the oxidant conduit and the outer conduit. Taps from the additional fuel conduits may pass through the oxidant conduit to provide fuel to the oxidizers and/or to the central fuel conduit prior to one of the oxidizers.

In some embodiments, pulverized coal is the fuel used to heat the subsurface formation. The pulverized coal may be carried into the wellbores with a non-oxidizing fluid (for example, carbon dioxide and/or nitrogen). An oxidant may be mixed with the pulverized coal at several locations in the wellbore. The oxidant may be air, oxygen enriched air and/or other types of oxidizing fluids. Igniters located at or near the mixing locations initiate oxidation of the coal and oxidant. The igniters may be catalytic igniters, glow plugs, spark plugs, and/or electrical heaters (for example, an insulated conductor temperature limited heater with heating sections located at mixing locations of pulverized coal and oxidant) that are able to initiate oxidation of the oxidant with the pulverized coal.

The particles of the pulverized coal may be small enough to pass through flow orifices and achieve rapid combustion in the oxidant. The pulverized coal may have a particle size distribution from about 1 micron to about 300 microns, from about 5 microns to about 150 microns, or from about 10 microns to about 100 microns. Other pulverized coal particle size distributions may also be used. At 600° C., the time to burn the volatiles in pulverized coal with a particle size distribution from about 10 microns to about 100 microns may be about one second.

FIG. 222 depicts a representation of oxidizer assembly 612 in inclined or substantially horizontal wellbore 428. FIG. 223 depicts a representation of downhole oxidizer assembly 612 in u-shaped wellbore 428. Pulverized coal entrained in a carrier fluid may be fuel 810 supplied to oxidizers 614 through fuel conduit 616. Oxidizing fluid 806 may be supplied to oxidizers through oxidant conduit 618. Initially, oxidizer assembly 612 may be started using hydrogen, natural gas, or other fuel. After temperatures of oxidizers 614 are hot enough to support rapid pulverized coal oxidation (for example, the temperature in and adjacent to oxidizers 614 is above about 600° C.), the fuel may be changed to pulverized coal and carrier gas. In FIG. 222, exhaust gas 808 may flow through outer conduit 620 to the surface. Exhaust gas 808 passing conduit 618 may help to inhibit formation of hot spots adjacent to oxidizers 614. In FIG. 223, fuel 810 and oxidizing fluid 806 may enter u-shaped wellbore at location 664. Exhaust gas may flow to the surface to location 668 through conduit 618. In some embodiments, a fluid (for example, a molten salt or a molten metal) may be positioned in outer conduit 620 to inhibit formation of hot spots adjacent to oxidizers 614. In some embodiments, oxidant conduit 618 may be positioned directly in u-shaped wellbore 428 without being positioned in an outer conduit.

Exhaust gas 808 from oxidizer assemblies 612 depicted in FIG. 222 and FIG. 223 may be treated to remove unreacted coal, ash, fines and/or other particles in the exhaust gas. In some embodiments, exhaust gas 808 passes through one or more cyclones to remove particles from the exhaust gas. Exhaust 808 gas may be further processed to remove selected compounds (for example, sulfur and/or nitrogen compounds), may be used as a drive fluid for mobilizing hydrocarbons in a formation, may be sequestered in a subsurface formation, and/or may be otherwise handled.

In other embodiments, other types of downhole oxidizers are used for the subsurface oxidation of coal to heat selected portions of the formation. FIG. 224 depicts a schematic representation of heater 920 that uses pulverized coal as fuel. Heater 920 may include outer conduit 620, first conduit 922, and second conduit 924. First conduit 922 is positioned in outer conduit 620, and second conduit 924 is positioned in the first conduit. The end of second conduit 924 may be closed. Second conduit 924 may include critical flow orifices 926. The flow rate and/or pressures of the fluids flowing through first conduit 922 and second conduit 924 may be controlled to allow for mixing of fluid from the first conduit with fluid from the second conduit at desired locations in the first conduit.

In an embodiment, coal and carrier gas is introduced into heater 920 through first conduit 922, and oxidant is introduced through second conduit 924. The flow rate and/or pressure in first conduit 922 and second conduit 924 are controlled so that the oxidant flows through critical flow orifices 926 into the coal and carrier gas flowing through first conduit 922. Reaction of the coal and oxidant occurs in first conduit 922. Exhaust gases pass through outer conduit 620 to the surface. Passing the exhaust gases past the locations where oxidant and coal are oxidized may reduce temperature variations along the length of the heated section of heater 920.

In an embodiment, oxidant is introduced into heater 920 through first conduit 922, and coal and carrier gas is introduced through second conduit 924. The flow rate and/or pressure in first conduit 922 and second conduit 924 are controlled so that the coal and carrier gas flows through critical flow orifices 926 into the oxidant flowing through first conduit 922. Reaction of the coal and oxidant occurs in first conduit 922. Exhaust gases pass through outer conduit 620 to the surface.

FIG. 225 depicts a schematic representation of heater 920 that uses pulverized coal as fuel. Heater 920 may include outer conduit 620, first conduit 922, and second conduit 924. First conduit 922 is positioned in outer conduit 620, and second conduit 924 is positioned in the first conduit. The end of first conduit 922 may be sealed closed against second conduit 924. Second conduit 924 may include critical flow orifices 926. The flow rate and/or pressures of the fluids flowing through first conduit 922 and second conduit 924 may be controlled to allow for mixing of fluid from the first conduit with fluid from the second conduit at desired locations in the second conduit.

In an embodiment, oxidant is introduced into heater 920 through first conduit 922, and coal and carrier gas is introduced through second conduit 924. The flow rate and/or pressure in first conduit 922 and second conduit 924 are controlled so that the oxidant flows through critical flow orifices 926 into the coal and carrier gas flowing through second conduit 924. Reaction of the coal and oxidant occurs in second conduit 924. Reacting coal and oxidant in second conduit 924 and passing exhaust gases through outer conduit 620 to the surface may reduce the formation of hot zones adjacent to sections of heater 920 where oxidation occurs.

In an embodiment, coal and carrier gas is introduced into heater 920 through first conduit 922, and oxidant is introduced through second conduit 924. The flow rate and/or pressure in first conduit 922 and second conduit 924 are controlled so that the coal and carrier gas flows through critical flow orifices 926 into oxidant flowing through second conduit 924. Reaction of the coal and oxidant occurs in second conduit 924. Exhaust gases pass through outer conduit 620 to the surface.

In certain embodiments, a heater is located in a u-shaped wellbore or an l-shaped wellbore. The heater may include a heating section that is moved during treatment of the formation. Moving the heating section during treatment of the formation allows the heating section to be used over a wide area of the formation. Using the movable heating section may allow the heating section (and/or heater) to be significantly shorter in length than the length of the wellbore. The shorter heating section may reduce equipment costs and/or operating costs of the heater as compared to a longer heating section (for example, a heating section that has a length nearly as long as the length of the wellbore).

FIG. 226 depicts an embodiment of heater 438 with heating section 1816 located in a u-shaped wellbore. Heater 438 is located in opening 556. In certain embodiments, opening 556 is a u-shaped opening with a substantially horizontal or inclined section in hydrocarbon layer 484 below overburden 482. Heater 438 may be a u-shaped heater with ends that extend out of both legs of the wellbore. In certain embodiments, heater 438 is an electrical resistance heater (a heater that provides heat by electrical resistance heating when energized with electrical current). In some embodiments, heater 438 is an oxidation heater (for example, a heater that oxidizes (combusts) fluids to produce heat). In certain embodiments, heater 438 is a circulating fluid heater such as a molten salt circulating heater.

In certain embodiments, heater 438 includes heating section 1816. Heating section 1816 may be the portion of heater 438 that provides heat to hydrocarbon layer 484. In certain embodiments, heating section 1816 is the portion of heater 438 that has a higher electrical resistance than the rest of the heater such that the heating section is the only portion of the heater that provides substantial heat output to hydrocarbon layer 484. In some embodiments, heating section 1816 is the portion of the heater that includes a downhole oxidizer (for example, downhole burner) or a plurality of downhole oxidizers. Other portions of heater 438 may be non-heating portions of the heater (for example, lead-in or lead-out sections of the heater).

In certain embodiments, heater 438 is similar in length to the horizontal portion of opening 556 and heating section 1816 is the portion of heater 438 shown in FIG. 226. Thus, heating section 1816 is short in length compared to the horizontal portion of opening 556. In some embodiments, heating section 1816 extends along the entire horizontal portion of the heater 438 (or nearly the entire horizontal portion of the heater) and the heater is short in length compared to the horizontal portion of opening 556 so that the heating section is shorter in length than the horizontal portion of the opening.

In some embodiments, heating section 1816 is at most ½ the length of the horizontal portion of opening 556, at most ¼ the length of the horizontal portion of opening 556, or at most ⅕ the length of the horizontal portion of opening 556. For example, the horizontal portion of opening 556 in hydrocarbon layer 484 may be between about 1500 m and about 3000 m in length and heating section 1816 may be between about 300 m and about 500 m in length.

Having shorter heating section 1816 allows heat to be provided to a small portion of hydrocarbon layer 484. The portion of hydrocarbon layer 484 heated by heating section 1816 is typically first volume 1818. First volume 1818 may be created around heater 438 proximate heating section 1816.

In certain embodiments, heater 438 and heating section 1816 are moved to provide heat to another portion of the formation. FIG. 227 depicts heater 438 and heating section 1816 moved to heat second volume 1820. In some embodiments, heating section 1816 is moved by pulling heater 438 from one end of opening 556 (for example, pulling the heater from the left end of the opening, as shown in FIG. 227). In certain embodiments, heater 438 and heating section 1816 are moved further to provide heat to third volume 1822, as shown in FIG. 228.

In certain embodiments, first volume 1818, second volume 1820, and third volume 1822 are heated sequentially from the first volume to the third volume. In some embodiments, portions of the volumes may overlap depending on the moving rate of heater 438 and heating section 1816. In certain embodiments, heater 438 and heating section 1816 are moved at a controlled rate. For example, heater 438 and heating section 1816 may be moved after treating first volume 1818 for a selected period of time.

Moving heater 438 and heating section 1816 at the controlled rate may provide controlled heating in hydrocarbon layer 484. In some embodiments, the moving rate is controlled to control the amount of mobilization in hydrocarbon layer 484, first volume 1818, second volume 1820, and/or third volume 1822. In some embodiments, the moving rate is controlled to control the amount of pyrolyzation in hydrocarbon layer 484, first volume 1818, second volume 1820, and/or third volume 1822. The movement rate when mobilizing may be faster than the moving rate when pyrolyzing as more heat needs to be provided in a selected volume of the formation to result in pyrolyzation reactions in the selected volume. In general, the movement rate of heater 438 and heating section 1816 is controlled to achieve desired heating results for treatment of hydrocarbon layer 484. The movement rate may be determined, for example, by assessing treatment of hydrocarbon layer 484 using simulations and/or other calculations.

In certain embodiments, heater 438 is a u-shaped heater that is moved (for example, pulled) through u-shaped opening 556, as shown in FIGS. 226-228. In some embodiments, heater 438 is an L-shaped or J-shaped heater that is moved through a u-shaped opening (for example, the heater may be shaped like the heater depicted in FIG. 228). The L-shaped or J-shaped heater may be moved by either pulling or pushing the heater from either end of the u-shaped opening.

In some embodiments, heater 438 is an L-shaped or J-shaped heater that is moved through an L-shaped or J-shaped opening. FIGS. 229-231 depict movement of L-shaped or J-shaped heater 438 as the heater is moved through opening 556 to heat first volume 1818, second volume 1820, and third volume 1822.

FIG. 232 depicts an embodiment with two heaters 438A, 438B located in u-shaped opening 556. Heaters 438A, 438B may have heating sections 1816A, 1816B, respectively. Heaters 438A, 438B and heating sections 1816A, 1816B may be moved (pulled) away from each other, as shown by the arrows in FIG. 232. Moving heating sections 1816A, 1816B in opposite directions may create heated volumes in hydrocarbon layer 484 on each side of the middle of opening 556. In some embodiments, the heated volumes created by heating section 1816A may substantially mirror the heated volumes created by heating section 1816B. Thus, mirrored heated volumes may be sequentially created going in opposite directions from the middle of opening 556 by moving heating sections 1816A, 1816B away from each other at a controlled rate.

In some embodiments, fast fluidized transport line systems may be used for subsurface heating. Fast fluidized transport line systems may have significantly higher overall energy efficiency as compared to using electrical heating. The systems may have high heat transfer efficiency. Low value fuel (for example, bitumen or pulverized coal) may be used as the heat source. Solid transport line circulation is commercially proven technology having relatively reliable operation.

FIG. 233 depicts a schematic representation of a portion of a fast fluidized transport line heating system. Fast fluidized transport systems 928 may include combustion unit 930, supply conduit 932, return conduit 934, wellbores having inlet legs 936 and outlet legs 938, replenishment line 940, treatment unit 942, oxidant supply line 944 and gas lift supply line 946. Each combustion unit 930 may provide hot fluidized material to a large number of u-shaped wellbores. For example, one combustion unit 930 may supply hot fluidized material to 20 or more u-shaped wellbores. In some embodiments, the u-shaped wellbores are formed so that the surface footprint has long rows of inlet legs 936 and exit legs 938 of u-shaped wellbores. The exit legs and inlet legs of these u-shaped wellbores are located in adjacent rows. FIG. 233 depicts a portion of fast fluidized transport systems 928 adjacent to a portion of a row of inlet legs 936 and outlet legs 938. Additional fluidized transport systems would be located on the same row to supply all of the u-shaped wellbores on the row. Also, additional fluidized transport systems would be positioned on adjacent rows to supply inlet legs and outlet legs of the adjacent rows.

In some embodiments, one or more of combustion units 930 used to heat the formation are fluidized combustors. A portion of the fluidized material from the fluidized bed reactor flows into supply conduit 932, and from the supply conduit to inlet legs 936 of u-shaped wellbores in the formation. In some embodiments, one or more of combustion units 930 used to heat the formation are furnaces, nuclear reactors, or other high temperature heat sources. Such combustion units heat fluidized material that passes through the combustion units. The fluidized material flows from the combustion units to supply conduit 932, and from the supply conduit to inlet legs 936 of u-shaped wellbores in the formation.

Oxidant may be supplied to combustion unit 930 through oxidant line 948. Fuel may be supplied to combustion unit 930 through fuel line 950. Exhaust gases may be removed from combustion unit 930 through exhaust line 952. The oxidant line, fuel line and exhaust line may not be needed if the combustion unit is a nuclear reactor. If combustion unit 930 is a fluidized bed combustor, fuel line 950 may spray fuel oil or other fuel into the fluidized combustor in addition to the fuel sent to the combustion unit contained in the fluidized material in conduit 956. Fluidized material exiting combustion unit 930 may be at a high temperature. For example, the fluidized material may be at temperatures from about 300° C. to about 1000° C., from about 500° C. to about 800° C., or from about 700° C. to about 750° C.

The u-shaped conduits in the formation may have a relatively small diameter. For example, the diameter of the u-shaped conduits in the formation may be less than 8 cm. Heat transfers substantially by radiation and/or conduction from the u-shaped conduits to the formation. Inlet legs 936 and/or outlet legs 938 may be insulated through the overburden to inhibit heat transfer to the overburden. In some embodiments, the direction of flow in the u-shaped conduits is reversed periodically to promote more uniform heating of the formation from the conduits. For example, the flow may be reversed every six months. Other time periods before reversing the flow may be used. In some embodiments, the direction of fluidized material flow in one u-shaped conduit is opposite in direction to the flow of fluidized material in an adjacent u-shaped conduit.

The inner surfaces of the u-shaped conduits may include inserts, baffles and/or roughened surfaces. The inserts may be liners that are periodically replaced in the conduits. The inserts, baffles and/or roughened surfaces may increase turbulence of the fluidized material in the conduits to increase heat transfer to the conduits. Fluidized material flowing through the u-shaped conduits may impact on the inserts, baffles and/or roughened surfaces. The impacts may transfer heat kinetically to the conduits. In some embodiments, portions of the outside surfaces of the conduits may include roughening and/or protrusions to increase heat transfer from the conduits to the formation.

Fluidized material exiting the formation may pass from the u-shaped conduits into return conduits line 934. Return conduit 934 may direct the fluidized material to treatment unit 942. Treatment unit 942 may include cyclones and/or other separation units that separate fines and exhaust gas 954 from fluidized material that may be recirculated through fast fluidized transport system 928. In some embodiments, fluidized material that is to be recirculated is coated with bitumen or other hydrocarbons in treatment unit 942 before being sent to combustion unit 930.

Replenishment line 940 may supply fresh fluidized material to line 956 returning to combustion unit 930. The fresh fluidized material may compensate for fines and exhaust gas 954 removed in treatment unit 942.

Fluidized material in line 956 may include coal particles (for example, pulverized coal), other hydrocarbon or carbon containing material (for example, bitumen and coke), and heat carrier particles. The heat carrier particles may include, but are not limited to, sand, silica, ceramic particles, waste fluidized catalytic cracking catalyst, other particles used for heat transfer, or mixtures thereof. In some embodiments, the particle range distribution of the fluidized material may span from between about 5 and 200 microns.

A portion of the hydrocarbon content in fluidized material may combust and/or pyrolyze in combustion unit 930. Fluidized material may still have a significant carbon (coke) and/or hydrocarbon content after passing through combustion unit 930. Inlet legs 936 of the u-shaped conduits in the formation may be supplied with oxidant (for example, air) through oxidant supply lines 944. The oxidant may react with the carbon and/or hydrocarbons in the fluidized material in the u-shaped conduits. In some embodiments, the temperature of the oxidant in oxidant supply line 944 is raised by passing through combustion unit 930 or otherwise raising the temperature of the oxidant prior to introducing the oxidant into the u-shaped conduits. Introducing heated oxidant into the u-shaped conduits may promote oxidation of hydrocarbons and carbon in the fluidized material. The combustion of hydrocarbons and carbon in the fluidized material may maintain a high temperature of the fluidized material and/or generate heat that transfers to the formation. In some embodiments, oxidant from oxidant supply line 944 is supplied to outer conduits that surround portions of inlet legs 936. Valves in inlet legs 936 pass oxidant from the outer conduits into the inlet legs.

Gas lifting may facilitate transport of the fluidized material in the u-shaped conduits to return conduit 934. Outlet legs 938 may be positioned in outer conduits. Multiple valves in the outlet legs 938 may allow entry of lift gas into the outlet legs to transport the fluidized material to return conduit 934. In some embodiments, the lift gas is air. Other gases may be used as the lift gas.

In some in situ heat treatment processes, coal, oil shale and/or biomass may be used as a fuel to directly heat a portion of the formation. The fuel may be provided as a solid. The fuel may be ground or otherwise sized so that the size of the chunks, pellets, or granules provides a large surface area that facilitates combustion of the fuel. An opening may be formed in the formation. In some embodiment, the opening is a u-shaped wellbore. In some embodiments, the opening is a mine shaft or tunnel. In some embodiments, the fuel is burned as the fuel is transported on a grate through the opening in the formation. In some embodiments, the fuel is burned in a batch or semi-batch operation. Fuel is placed on a carrier and the carrier is moved to a location in the formation. The fuel is combusted, and the carrier is pulled out of the formation. Another carrier is placed in the formation with fresh fuel.

Heat from the burning fuel may heat the formation. Enough fuel may be placed on the carriers and enough oxidant may be supplied so that all or substantially all of the fuel is combusted before the carrier is removed from the formation.

Coal, oil shale and/or biomass may be significantly less expensive than other energy sources for heating the formation (for example, electricity and/or gas). Combusting coal, oil shale and/or biomass in the formation may improve energy efficiency and lower cost as compared with using such fuels to produce electricity that in turn is used to heat the formation. Combustion products such as ash and other calcination products may be produced efficiently when burning the coal, oil shale, and/or bio-mass in the formation to heat the formation, as compared to the efficiency of using surface manufacturing techniques to generate combustion products. The combustion products may be used in cement production and/or other industrial processes. Gaseous combustion products such as carbon dioxide may be used as drive fluids and/or may be sequestered in the formation or another formation.

FIG. 234 depicts a schematic representation of opening 958 that may be used to transport burning fuel through the formation. Opening 958 may have a relatively large bore diameter. The casing placed in the opening may have a diameter that is greater than 20 cm, greater than 30 cm, or greater than 50 cm. Entry leg 960 and exit leg 962 of opening 958 may be drilled at relative shallow angles, for example, less than 45°, less 30°, or less than 25°. Heat conductor shafts 964 may branch off from the opening. Heat pipes and/or heat conductive gel may be placed in the heat conductor shafts 964. Heat from heat conductor shafts 964 may transfer heat away from opening 958 to other portions of the formation. Heat conducted by heat conductor shafts 964 may be sufficient to mobilize and or pyrolyze hydrocarbons in at least a portion of the formation proximate the heat conductor shafts. The heat conducted by heat conductor shafts 964 may be used in carbon dioxide compression and/or for carbon dioxide sequestration, and/or barrier well applications. In some embodiments, heat conductor shafts are not necessary. In some embodiments, high velocity gas (for example, pressurized carbon dioxide) may be used to move heat through the formation.

FIG. 235 depicts a top view of a portion of carrier system 966 that may convey burning coal, oil shale and/or biomass through the opening to heat the treatment area. FIG. 236 depicts a side view representation of a portion of carrier system 966 used to heat the treatment area positioned in wellbore casing 968. Carrier system 966 may include fuel carriers 970, fuel 972, oxidant conduit 974, conveyor 976, and clean-up bin 978. In some embodiments, conveyor system 966 includes an electrical conduit and heaters 980 that branch off of the electrical conduit. Heaters 980 may be inductive heaters, temperature limited heaters, or other types of electrical heaters that provide heat to initiate combustion of fuel 972. In some embodiments, heaters 980 travel with conveyor system 966. In some embodiments, heaters 980 are immobile. After fuel 972 begins combusting and/or after formation adjacent to the opening is hot enough to support combustion of the fuel, use of heaters 980 may be reduced and/or stopped. In other embodiments, a downhole oxidizer or other type of heater may be used to initiate combustion of the fuel. In some embodiments, combustion initiation is only performed in the first part of the opening where heat is to be applied to the formation. After combustion initiation, the supply of oxidant keeps the fuel burning as the fuel is drawn through the formation on carrier system 966.

In some embodiments, a removable electric heater or combustor is used to initiate combustion of the fuel. The electric heater and/or combustor may be inserted in the formation beneath the overburden. The electric heater and/or combustor may be used to raise the temperature near the interface between the overburden and the treatment area above an auto-ignition temperature of the fuel on the grate of a fuel carrier. The fuel on the grate may begin to combust as the fuel passes through the heated zone. Heat from combusting fuel heats the treatment area as the fuel carrier moves through the treatment area. When the treatment area adjacent to the entrance to the treatment area rises above the auto-ignition temperature of the fuel so that fuel on the grate of a fuel carrier begins combusting due to the heat at the entrance to the treatment area, use of the electric heater and/or combustor may be reduced and/or stopped. In some embodiments, the electric heater and/or combustor are removed from the formation.

Fuel carriers 970 may include grates 982 and ash catchers 984. Fuel 972 may be positioned on top of grates 982. Fuel 972 placed on grate 982 of fuel carrier 970 may be pulverized, ground or otherwise sized so that the average particle size of the fuel is larger than the size of openings through the grates. When fuel 972 burns, ash may fall through the openings in grates to fall on ash catchers 984. Oxidant conduit 974 and heater 980 may pass through ash catchers 984.

Oxidant conduit 974 may carry an oxidant such as air, enriched air, or oxygen and a carrier fluid (for example, carbon dioxide) to fuel 972. Oxidant conduit 974 may include a number of openings that allow the oxidant to be introduced into the formation along the length of the opening that is to be heated. In some embodiments, the openings are critical flow orifices. In some embodiments, more than one oxidant conduit 974 is placed in the opening. In some embodiments, one or more oxidant conduits 974 enter the formation from each side of the opening.

Conveyor 976 may pull fuel carriers 970 through the opening. In some embodiments, conveyor 976 is a belt, cable and/or chain. In some embodiments, one or more powered vehicles pull and/or push the fuel carriers through the opening. For example, a train of several fuel carriers may be coupled to an engine that moves the fuel carriers through the opening. The powered vehicles may be guided by the walls of the opening, by one or more rails, by a cable, and/or by a computer control system. In some embodiments, fuel is transported pneumatically through the opening. Canisters with openings are loaded with fuel. Openings in the canisters allow oxidant in and exhaust products out of the canisters. The canisters may be pneumatically drawn through the wellbore.

Clean-up bins 978 may be positioned periodically in carrier system 966. Clean-up bins may remove ash from the opening that does not fall into ash catchers 984. Clean-up bins 978 may have an open end that substantially conforms to the bottom of casing 968.

Temperature sensors in the opening may provide information on temperature along the opening to a control system. Speed of the carrier system, position, loading patterns of the grates, oxidant delivery through the oxidant conduit and/or other adjustable parameters may be changed by the control system to control the heating of the treatment area.

In some embodiments, the fuel carriers are drawn in a loop through two or more openings in the formation to form a circuit. FIG. 237 depicts an aerial view representation of a system that heats the treatment area using burning fuel that is moved through the treatment area. The fuel carriers may enter leg 960 of opening 958, and exit through leg 962. The fuel carriers may be drawn through supply station 986 by conveyor 976. Supply station may include machinery that interacts with conveyor 976 to move the fuel carriers along the loop. In supply station 986, the fuel carriers may be re-supplied with fuel, inspected, repaired, and/or cleaned of ash. Ash may be sent to a treatment facility or disposal site. The fuel carriers may leave supply station 986 and enter leg 960' of opening 958'. The fuel carriers travels through opening 958' and exits through leg 962'. Combustion of fuel on the fuel carriers in the opening may heat the formation adjacent to the opening. The fuel carriers may enter supply station 986'. At supply station 986', the fuel carriers may be re-supplied with fuel, inspected, repaired, and/or cleaned of ash. Supply station 986' may also include machinery that interacts with conveyor 976 to move the fuel carriers along the loop.

Exhaust conduits 988 may convey exhaust from the burned fuel to exhaust treatment system 990. Exhaust treatment system 990 may treat exhaust to remove noxious compounds from the exhaust (for example, $NO_x$ and $CO_x$). In some embodiments, exhaust treatment system 990 may include a catalytic converter system. Treated exhaust may be used for other processes (for example, the treated exhaust may be used as a drive fluid) and/or the treated exhaust may be sequestered.

In some in situ heat treatment process embodiments, a circulation system is used to heat the formation. The circulation system may be a closed loop circulation system. FIG. 238 depicts a schematic representation of a system for heating a formation using a circulation system. The system may be used to heat hydrocarbons that are relatively deep in the ground and that are in formations that are relatively large in extent. In some embodiments, the hydrocarbons may be 100 m, 200 m, 300 m or more below the surface. The circulation system may also be used to heat hydrocarbons that are not as deep in the ground. The hydrocarbons may be in formations that extend lengthwise up to 1000 m, 3000 m, 5000 m, or more. The heaters of the circulation system may be positioned relative to adjacent heaters so that superposition of heat between heaters of the circulation system allows the temperature of the formation to be raised at least above the boiling point of aqueous formation fluid in the formation.

In some embodiments, heaters 802 may be formed in the formation by drilling a first wellbore and then drilling a second wellbore that connects with the first wellbore. Piping may be positioned in the u-shaped wellbore to form u-shaped heater 802. Heaters 802 are connected to heat transfer fluid circulation system 992 by piping. In some embodiments, the heaters are positioned in triangular patterns. In other embodiments, other patterns are used. Production wells and/or injection wells may also be formed in the formation. The production wells and/or the injection wells may have long substantially horizontal sections similar to the heating portions of heaters 802, or the production wells and/or injection wells may otherwise oriented (for example, the wells may be vertically oriented wells, or wells that include one or more slanted portions).

In some embodiments vertical, slanted or L-shaped wells heater wells may be used instead of u-shaped wells that have an entrance at a first location and an exit at another location. FIG. 239 depicts L-shaped heater 802. Heater 802 may include heat transfer fluid circulation system 992, inlet conduit 1824, and outlet conduit 1826. Heat transfer fluid circulation system 992 may supply heat transfer fluid to multiple heaters. Heat transfer fluid from heat transfer fluid circulation system 992 may flow down inlet conduit 1824 and back up outlet conduit 1826. Inlet conduit 1824 and outlet conduit 1826 may be insulated through overburden. In some embodiments, inlet conduit 1824 is insulated through overburden 482 and hydrocarbon containing layer 484 to inhibit undesired heat transfer between ingoing and outgoing heat transfer fluid.

In some embodiments wellbore 428 adjacent to overburden 482 is larger than the wellbore adjacent to hydrocarbon containing layer 484. Having a larger opening adjacent to the overburden may allow for accommodation of insulation used to separately insulate inlet conduit 1824 and outlet conduit 1826. Some heat loss to the overburden from the return flow may not cause much of an efficiency impact, especially when the heat transfer fluid is a molten salt or other fluid that needs to be heated to remain a liquid. The heated overburden adjacent to heater 802 may maintain the heat transfer fluid as a liquid for a significant time should circulation of heat transfer fluid stop. Allowing some heat to transfer to overburden 482 may eliminate the need for expensive insulation systems between outlet conduit 1826 and the overburden. In some embodiments, insulative cement is used between overburden 482 and outlet conduit 1826.

For vertical, slanted or L-shaped heaters, the wellbores may be drilled longer than needed to accommodate the non-heated heaters. Thermal expansion of the heaters may cause portions of the heaters to move into the extra length of the wellbores to accommodate thermal expansion of the heaters. For L-shaped heaters, remaining drilling fluid and/or formation fluid in the wellbore may facilitate movement of the heater deeper into the wellbore as the heater expands during preheating and/or heating with heat transfer fluid.

For a vertical or slanted wellbore, the wellbore may be drilled deeper than needed to accommodate the inserted heater. When the heater is preheated and/or heated with the heat transfer fluid used to heat the treatment area, the heater may expand into the extra depth of the wellbore.

FIG. 240 depicts a schematic representation of an embodiment of a portion of vertical heater 802. Heat transfer fluid circulation system 992 may provide heat transfer fluid to inlet conduit 1824 of heater 802. Heat transfer fluid circulation system 992 may receive heat transfer fluid from outlet conduit heat 1826. Inlet conduit 1824 may be secured to outlet conduit 1826 by welds 1922. Inlet conduit 1824 may include insulating sleeve 1836. Insulating sleeve 1836 may be formed of a number of sections. Each section of insulating sleeve 1836 for inlet conduit 1824 is able to accommodate the thermal expansion caused by the temperature difference between the temperature of the inlet conduit and the temperature outside of the insulating sleeve. Change in length of inlet conduit 1824 and insulation sleeve 1836 due to thermal expansion is accommodated in outlet conduit 1826.

Outlet conduit 1826 may include insulating sleeve 1836'. Insulating sleeve 1836' may end near treatment area 1028. In some embodiments, insulating sleeve 1836' is installed using a coiled tubing rig. An upper first portion of insulating sleeve 1836' may be secured to outlet conduit 1826 above or near wellhead 476 by weld 1922. Heater 802 may be supported in wellhead 476 by a coupling between the outer support member of insulating sleeve 1836' and the wellhead. The outer support member of insulating sleeve 1836' may have sufficient strength to support heater 802. A separate lower second portion of insulating sleeve 1836' may be secured to outlet conduit 1826 by welds 1922 or other types of seals that can withstand high temperature below packer 1924. Welds 1922 between insulating sleeve 1836' and outlet conduit 1826 may inhibit formation fluid from passing between the insulating sleeve and the outlet conduit. During heating, thermal expansion causing by the temperature difference between the outer relatively cool surface of insulating sleeve 1836' and the inner surface of the insulating sleeve 1836' may cause separation between the first portion of the insulating sleeve 1836' and the second portion of the insulating sleeve. The separation may occur adjacent to the overburden portion of heater 802 above packer 1924. Heat loss to the overburden may not cause much of an energy efficiency impact for the system. Insulating cement between casing 564 and the formation may inhibit heat loss to the formation and improve the overall energy efficiency of the system.

Packer 1924 may be a polished bore receptacle. Packer 1924 may be fixed to casing 564 of the wellbore 428. In some embodiments, packer 1924 is 1000 m or more below the surface. Packer 1924 may be located at a depth above 1000 m if desired. Packer 1924 may inhibit formation fluid from flowing from the heated portion of the formation up the wellbore to wellhead 476. Packer 1924 may allow movement of insulating sleeve 1836' downwards to accommodate thermal expansion of heater 802.

Wellhead 476 may include fixed seal 1926. Fixed seal 1926 may be a second seal that inhibits formation fluid from reaching the surface through wellbore 428 of heater 802.

FIG. 241 depicts vertical heater 802 in wellbore 428. The embodiment depicted in FIG. 241 is similar to the embodiment depicted in FIG. 240, but fixed seal 1926 is located adjacent to overburden 482, and sliding seal 1852 is located in wellhead 476. The portion of insulating sleeve 1836' from fixed sleeve to wellhead 476 is able to expand upward out of the wellhead to accommodate thermal expansion. The portion of heater located below fixed seal 1926 is able to expand into the excess length of wellbore 428 to accommodate thermal expansion.

In some embodiments, the heater may include a flow switcher. The flow switcher may allow the heat transfer fluid from the circulation system to flow down through the overburden in the inner conduit of the heater. The return flow from the heater may flow upwards through the annular region between the inner conduit and the outer conduit. The flow switcher may change the downward flow from the inner conduit to the annular region between the outer conduit and the inner conduit. The flow switcher may also change the upward flow from the inner conduit to the annular region. The use of the flow switcher may allow the heater to operate at a higher temperature adjacent to the treatment area without increasing the initial temperature of the heat transfer fluid provided to the heaters.

For vertical, slanted or L-shaped heaters where the flow of heat transfer fluid is directed down the inlet conduit and returns through the annular region between the inlet conduit and the outlet conduit, a temperature gradient may form in the heater with the hottest portion being located at a distal end of the heater. For L-shaped heaters, horizontal portions of a set of first heaters may be alternated with the horizontal portions of a second set of heaters. The hottest portions used to heat the formation of the first set of heaters may be adjacent to the coldest portions used to heat the formation of the second set of heaters, while the hottest portions used to heat the formation of the second set of heaters are adjacent to the coldest portions used to heat the formation of the first set of heaters. For vertical or slanted heaters, flow switchers in selected heaters may allow the heaters to be arranged with the hottest portions used to heat the formation of first heaters adjacent to coldest portions used to heat the formation of second heaters. Having hottest portions used to heat the formation of the first set of heaters that are adjacent to coldest portions used to heat the formation of the second set of heaters may allow for more uniform heating of the formation.

Treatment areas in a formation may be treated in patterns. FIG. 242 depicts a schematic representation of treatment area 1028 treated using a corridor pattern system. Heat transfer circulation systems 992, 992' may be positioned on each side of treatment area 1028. Inlet wellheads 1828 and outlet wellheads 1830 of subsurface heaters 802 may be positioned in rows along each side of the treatment area. Although one row of wellheads is depicted on each side of treatment area 1028, sufficient wells may be formed in the formation so that heaters 802 in the formation form a three dimensional pattern in the treatment area with well spacings that allow for superposition of heat from adjacent heaters. Hot heat transfer fluid from circulation system 992 flows through manifolds to inlet wellheads 1828 on the first side of treatment area 1028. The heat transfer fluid passes through heaters 802 to outlet wellbores 1830 on the second side of treatment area 1028. Heat is transferred from the heat transfer fluid to treatment area 1028 as the heat transfer fluid travels from inlet wellheads 1828 to outlet wellheads 1830. The heat transfer fluid passes from outlet wellheads 1830 through manifolds to heat transfer fluid circulation system 992' on the second side of treatment area 1028. Additional corridor patterns above, below and/or to the sides of treatment area 1028 may processed during or after in heat situ treatment of treatment area 1028.

FIG. 243 depicts a schematic representation of treatment area 1028 treated using a radial pattern system. Treatment area 1028 may be an annular region located between heater inlets and heater outlets. Central heat transfer fluid circulation systems 992 may be positioned near to or on a first side of treatment area 1028. Outer heat transfer fluid circulation systems 992' may be positioned near to or on a second side of treatment area 1028. Inlet wellheads 1828 and outlet wellheads 1830 of subsurface heaters 802 may be positioned in rings along each side of the treatment area. Although one ring of inlet wellheads 1828 and one ring of outlet wellheads 1830 is depicted on each side of treatment area 1028, sufficient wells may be formed in the formation so that heaters 802 in the formation form a three-dimensional pattern in the treatment area with well spacings that allow for superposition of heat from adjacent heaters. Hot heat transfer fluid from central heat transfer fluid circulation systems 992 flows through manifolds to inlet wellheads on the first side of treatment area 1028. The heat transfer fluid passes through heaters 802 to outlet wellbores 1830 on the second side of treatment area 1028. Heat is transferred from the heat transfer fluid to the treatment area as the heat transfer fluid travels from inlet wellheads 1828 to outlet wellheads 1830. The heat transfer fluid passes from outlet wellheads 1830 through manifolds to outer heat transfer fluid circulation systems 992' on the second side of treatment area 1028. Heat transfer fluid heated by outer heat transfer fluid circulation systems 992' passes through manifolds to inlet wellheads 1828. The heat transfer fluid passes through heaters 802 to outlet wellheads 1830 on the first side of treatment area 1028. The heat transfer fluid flows through manifolds to central heat transfer fluid circulation systems 992. Additional radial patterns may be formed at other locations in the formation.

In some embodiments, only a portion of the ring of treatment area is treated. In some embodiments, the entire ring of the treatment area, or a portion of the treatment area is treated in sections. For example, central circulation system or central circulation systems 992 may supply heat transfer fluid to a first set of heaters. The first set of heaters, along with a second set of return heaters may treat a first section of about one eighth (or 45°) of the treatment area. Other section sizes may be chosen. The heat transfer fluid from central circulation system or central circulation systems 992 may be received by one or more outer circulation systems 992'. One or more outer circulation systems 992' may provide heat transfer fluid return to central circulation system or central circulation systems 992. After completion of heating of the first section of treatment area, an adjacent section to the first section or another section of the treatment area not adjacent to the first section may be treated. The outer circulation system may be mobile so that the outer circulation system can be used to treat different sections of the treatment area. In some embodiments, one or more production wells for a particular section may be used to produce formation fluid during the treatment of another section.

Due to the radial layout of heaters 802, the heater density and/or heat input per volume of formation increases from the second side of treatment area 1028 towards the first side of the treatment area. The heater density and/or heat input per volume change may establish a temperature gradient through treatment area 1028 with the average temperature of the treatment area increasing from the second side of the treatment area towards the first side of the treatment area. For example, the average temperature near the first side of treatment area 1028 may be about 300° C. to about 350° C. while the average temperature near the second side may be about 180° C. to about 220° C. The higher temperature near the first side of treatment area 1028 may result in the mobilization of hydrocarbons towards the second side of the treatment area.

FIG. 244 depicts a plan view of an embodiment of wellbore openings on a first side of treatment area 1028. Heat transfer fluid entries 1002 into the formation alternate with heat transfer fluid exits 1004. Alternating heat transfer fluid entries 1002 with heat transfer fluid exits 1004 may allow for more uniform heating of the hydrocarbons in formation 524.

In some embodiments, piping and surface facilities for the circulation system may allow the direction of heat transfer fluid flow through the formation to be changed. Changing the direction of heat transfer fluid flow through the formation allows each end of a u-shaped wellbore to initially receive the heat transfer fluid at the hottest temperature of the heat transfer fluid for a period of time, which may result in more uniform heating of the formation. The direction of heat transfer fluid may be changed at desired time intervals. The desired time interval may be about a year, about six months, about three months, about two months or any other desired time interval.

Gas at high pressure may be used as the heat transfer fluid in the circulation system. In some embodiments, the heat transfer fluid is carbon dioxide. Carbon dioxide is chemically stable at the required temperatures and pressures and has a relatively high molecular weight that results in a high volumetric heat capacity. Other fluids such as steam, air, helium and/or nitrogen may also be used. The pressure of the heat transfer fluid entering the formation may be 3000 kPa or higher. The use of high pressure heat transfer fluid allows the heat transfer fluid to have a greater density, and therefore a greater capacity to transfer heat. Also, the pressure drop across the heaters is less for a system where the heat transfer fluid enters the heaters at a first pressure for a given mass flow rate than when the heat transfer fluid enters the heaters at a second pressure at the same mass flow rate when the first pressure is greater than the second pressure.

In some embodiments, a liquid heat transfer fluid is used as the heat transfer fluid. The liquid heat transfer fluid may be natural or synthetic oil, molten metal, molten salt, or other type of high temperature heat transfer fluid. A liquid heat transfer fluid may allow for smaller diameter piping and reduced pumping/compression costs. In some embodiments, the piping is made of a material resistant to corrosion by the liquid heat transfer fluid. In some embodiments, the piping is lined with a material that is resistant to corrosion by the liquid heat transfer fluid. For example, if the heat transfer fluid is a molten fluoride salt, the piping may include a 10 mil thick nickel liner. The piping may be formed by roll bonding a nickel strip onto a strip of the piping material (for example, stainless steel), rolling the composite strip, and longitudinally welding the composite strip to form the piping. Other techniques may also be used. Corrosion of nickel by the molten fluoride salt may be less than 1 mil per year at a temperature of about 840° C.

As depicted in FIG. 238, heat transfer fluid circulation system 992 may include heat supply 994, first heat exchanger 996, second heat exchanger 998, and fluid movers 1000. Heat supply 994 heats the heat transfer fluid to a high temperature. Heat supply 994 may be a furnace, solar collector, chemical reactor, nuclear reactor, fuel cell, and/or other high temperature source able to supply heat to the heat transfer fluid. If the heat transfer fluid is a gas, fluid movers 1000 may be compressors. If the heat transfer fluid is a liquid, fluid movers 1000 may be pumps.

After exiting formation 524, the heat transfer fluid passes through first heat exchanger 996 and second heat exchanger 998 to fluid movers 1000. First heat exchanger 996 transfers heat between heat transfer fluid exiting formation 524 and heat transfer fluid exiting fluid movers 1000 to raise the temperature of the heat transfer fluid that enters heat supply 994 and reduce the temperature of the fluid exiting formation 524. Second heat exchanger 998 further reduces the temperature of the heat transfer fluid. In some embodiments, second heat exchanger 998 includes or is a storage tank for the heat transfer fluid.

Heat transfer fluid passes from second heat exchanger 998 to fluid movers 1000. Fluid movers 1000 may be located before heat supply 994 so that the fluid movers do not have to operate at a high temperature.

In an embodiment, the heat transfer fluid is carbon dioxide. Heat supply 994 is a furnace that heats the heat transfer fluid to a temperature in a range from about 700° C. to about 920° C., from about 770° C. to about 870° C., or from about 800° C. to about 850° C. In an embodiment, heat supply 994 heats the heat transfer fluid to a temperature of about 820° C. The heat transfer fluid flows from heat supply 994 to heaters 802. Heat transfers from heaters 802 to formation 524 adjacent to the heaters. The temperature of the heat transfer fluid exiting formation 524 may be in a range from about 350° C. to about 580° C., from about 400° C. to about 530° C., or from about 450° C. to about 500° C. In an embodiment, the temperature of the heat transfer fluid exiting formation 524 is about 480° C. The metallurgy of the piping used to form heat transfer fluid circulation system 992 may be varied to significantly reduce costs of the piping. High temperature steel may be used from heat supply 994 to a point where the temperature is sufficiently low so that less expensive steel can be used from that point to first heat exchanger 996. Several different steel grades may be used to form the piping of heat transfer fluid circulation system 992.

In an embodiment, the heat transfer fluid is a molten salt, such as solar salt. Heat supply is a furnace that heats the heat transfer fluid to a temperature of about 560° C. The return temperature of the heat transfer fluid may be from about 350° C. to about 450° C. Piping from heat transfer fluid circulation system 992 may be insulated and/or heat traced to facilitate startup and to ensure fluid flow.

In some embodiments, the diameter of the conduit through which the heat transfer fluid flows in overburden 482 may be smaller than the diameter of the conduit through the treatment area. For example, the diameter of the pipe in the overburden may be about 3 inches, and the diameter of the piping adjacent to the treatment area may be about 5 inches. The smaller diameter pipe through overburden 482 may allow for less heat transfer to the overburden. Reducing the amount of heat transfer to overburden 482 reduces the amount of cooling of the heat transfer fluid supplied to the conduit adjacent to hydrocarbon layer 484. The increased heat transfer in the smaller diameter pipe due to increased velocity of heat transfer fluid through the small diameter pipe is offset by the smaller surface area of the smaller diameter pipe and the decrease in residence time of the heat transfer fluid in the smaller diameter pipe.

Heat transfer fluid from heat supply 994 of heat transfer fluid circulation system 992 passes through overburden 482 of formation 524 to hydrocarbon layer 484. Portions of heaters 802 extending through overburden 482 may be insulated. In some embodiments, the insulation or part of the insulation is a polyimide insulating material. Inlet portions of heaters 802 in hydrocarbon layer 484 may have tapering insulation to reduce overheating of the hydrocarbon layer near the inlet of the heater into the hydrocarbon layer.

The overburden section may be insulated to prevent or inhibit heat loss into non-hydrocarbon bearing zones of the formation. Thermal insulation may be provided by a conduit-in-conduit design. The heat transfer fluid flows through the inner conduit. Insulation fills the space between the inner conduit and outer conduit. An effective insulation may be a combination of metal foil to inhibit radiative heat loss and microporous silica powder to inhibit conductive heat loss. Reducing the pressure in the space between the inner conduit and the outer conduit by pulling a vacuum during assembly and/or with getters may further reduce heat losses when using the conduit-in-conduit configuration. To account for the differential thermal expansion of the inner conduit and the outer conduit, the inner conduit may be pre-stressed or made of a material with low thermal expansion (for example, Invar). The insulated conduit-in-conduit may be installed continuously in conjunction with coiled tubing installation. Insulated conduit-in-conduit systems may be available from Industrial Thermo Polymers Limited (Ontario, Canada), and Oil Tech Services, Inc. (Houston, Tex., U.S.A.). Other effective insulation materials include, but are not limited to, ceramic blankets, foam cements, cements with low thermal conductivity aggregates such as vermiculite, Izoflex insulation, and aerogel/glass-fiber composites such as those provided by Aspen Aerogels (Northborough, Mass.).

FIG. 245 depicts a cross-sectional view of an embodiment of overburden insulation. Insulating cement 1832 may be placed between casing 564 and formation 524. Insulating cement 1832 may also be placed between heat transfer fluid conduit 1834 and casing 564.

FIG. 246 depicts a cross-sectional view of an alternate embodiment of overburden insulation that includes insulating sleeve 1836 around heat transfer fluid conduit 1834. Insulating sleeve 1836 may include an aerogel. Gap 1838 may be located between insulating sleeve 1836 and casing 564. The emissivities of insulating sleeve 1836 and casing 564 may be low to inhibit radiative heat transfer. A non-reactive gas may be placed in gap 1838 between insulating sleeve 1836 and casing 564. Gas in gap 1838 may limit conductive heat transfer between insulating sleeve 1836 and casing 564. In some embodiments, a vacuum may be drawn and maintained in gap 1838. Insulating cement 1832 may be placed between casing 564 and formation 524. Insulating sleeve 1836 may have a significantly smaller thermal conductivity value than the thermal conductivity value of insulating cement. The insulation provided by the insulation depicted in FIG. 246 may be significantly better than the insulation provided by the insulating depicted in FIG. 245.

FIG. 247 depicts a cross-sectional view of an alternate embodiment of overburden insulation with insulating sleeve 1836 around heat transfer fluid conduit 1834, vacuum gap 1840 between the insulating sleeve and conduit 1842, and gap 1838 between the conduit and casing 564. Insulating cement 1832 may be placed between casing 564 and formation 524. A non-reactive gas may be placed in gap 1838 between conduit 1842 and casing 564. In some embodiments, a vacuum may be drawn and maintained in gap 1838. A vacuum may be drawn and maintained in vacuum gap 1840 between insulating sleeve 1836 and conduit 1842. Insulating sleeve 1836 may include layers of insulating material separated by foil 1844. The insulation material may be aerogel. The layers of insulating material separated by foil 1844 may provide significant insulation around heat transfer fluid conduit 1834. Vacuum gap 1840 may inhibit radiative, convective and conductive heat transfer from insulating sleeve 1836 to conduit 1842. A non-reactive gas may be placed in gap 1838. The emissivities of conduit 1842 and casing 564 may be low to inhibit radiative heat transfer from the conduit to the casing. The insulation provided by the insulation depicted in FIG. 247 may be significantly better than the insulation provided by the insulating depicted in FIG. 246.

When heat transfer fluid is circulated through piping in the formation to heat the formation, the heat of the heat transfer fluid will cause changes in the piping. The heat of the piping may significantly reduce the strength of the piping since Young's modulus and other strength characteristics vary with temperature. The high temperatures of the piping may raise creep concerns, may cause buckling conditions, and may move the piping from the elastic deformation region to the plastic deformation region.

Heating the piping will cause thermal expansion of the piping. For long heaters placed in the wellbore, the heater may expand 20 m or more. In some embodiments, the horizontal portion of the heater is cemented in the formation with thermally conductive cement. Care may need to be taken to ensure that there are no significant gaps in the cement so that piping does not expand in the gaps and fail. Thermal expansion of the piping may cause ripples in the pipe and/or an increase in the wall thickness of the pipe.

For long heaters with gradual bend radii (for example, about 10° of bend per 30 m), thermal expansion of the piping may be accommodated in the overburden or above surface. After thermal expansion is completed, the position of the heaters relative to the wellheads may be secured. When heating is finished and the formation is cooled, the position of the heaters may be unsecured so that thermal contraction of the heaters does not destroy the heaters.

FIGS. 248-255 depict schematic representations of various methods for accommodating thermal expansion. In some embodiments, change in length of the heater due to thermal expansion may be accommodated above the wellhead. After significant changes in the length of the heater due to thermal expansion cease because the heater is hot, the heater position relative to the wellhead may be fixed. The heater position relative to the wellhead may remain fixed until the end of heating of the formation. After heating is ended, the position of the heater relative to the wellhead may be freed so that the heater is able to accommodate thermal contraction as the heater cools.

FIG. 248 depicts a representation of bellows 1846. Length L of bellows 1846 may change to accommodate thermal expansion and/or contraction of piping 1848. Bellows 1846 may be located subsurface or above the surface.

FIG. 249 depicts a representation of piping 1848 with expansion loop 1850 above wellhead 476. Sliding seals in the wellhead 476, stuffing boxes, or other pressure control equipment of the wellhead allow piping 1848 to move relative to casing 564. Expansion of piping 1848 is accommodated in one or more expansion loops 1850. In some embodiments, expansion is accommodated by coiling the portion of the heater exiting the formation on a spool using a coiled tubing rig.

FIG. 250 depicts piping in a portion of piping 1848 in overburden 482 after thermal expansion of the piping has occurred. Casing 564 has a large diameter. Insulating cement 1832 may be between underburden 482 and casing 564. Thermal expansion of piping 1848 is allowed to cause helical or sinusoidal buckling of the piping. The helical or sinusoidal buckling of piping 1848 accommodates the thermal expansion of the piping, including the horizontal piping adjacent to the treatment area being heated. As depicted in FIG. 251, piping 1848 may be more than one conduit positioned in large diameter casing 564. Having piping 1848 as multiple conduits allows for accommodation of thermal expansion of all of the piping in the formation without significantly increasing the pressure drop of the fluid flowing through piping in overburden 482.

In some embodiments, thermal expansion of subsurface piping is translated up to the wellhead. Expansion may be accommodated by one or more sliding seals at the wellhead. The seals may include Grafoil® gaskets, Stellite® gaskets, and/or Nitronic gaskets.

FIG. 252 depicts a representation of wellhead 476 with sliding seal 1852, stuffing box and/or other pressure control equipment. Circulated fluid may pass through conduit 1834. Conduit 1834 may be at least partially surrounded by insulated conduit 1836. The use of insulated conduit 1836 may obviate the need for a high temperature sliding seal and the need to seal against the heat transfer fluid. Expansion of conduit 1834 may be handled at the surface with expansion loops, bellows, coiled tubing rigs, and/or sliding joints. In some embodiments, packers 1854 between insulated conduit 1836 and casing 564 seal the wellbore against formation pressure. Packers 1854 may be inflatable packers and/or polished bore receptacles.

In some embodiments, thermal expansion of subsurface piping is handled at the surface with a slip joint that allows the heat transfer fluid conduit expand out of the formation to accommodate thermal expansion. Hot heat transfer fluid may pass from a fixed conduit into the heat transfer fluid conduit in the formation. Return heat transfer fluid from the formation may pass from the heat transfer fluid conduit into a fixed conduit. A sliding seal between the fixed conduit and the piping in the formation, and a sliding seal between the wellhead and the piping in the formation, may accommodate expansion of the heat transfer fluid conduit. FIG. 253 depicts a representation of a system where heat transfer fluid in conduit 1834 is transferred to or from fixed conduit 1856. Insulating sleeve 1836 may surround conduit 1834. Sliding seal 1852 may be between insulated sleeve 1836 and wellhead 476. Packers between insulating sleeve 1836 and casing 564 may seal the wellbore against formation pressure. Heat transfer fluid seals 1858 may be positioned between a portion of fixed conduit 1856 and conduit 1834. Heat transfer fluid seals may be secured to fixed conduit 1856. The resulting slip joint allows insulating sleeve 1836 and conduit 1834 to move relative to wellhead 476 to accommodate thermal expansion of the piping positioned in the formation. Conduit 1834 is able to move relative to fixed conduit 1856 in order to accommodate thermal expansion. Heat transfer fluid seals 1858 may be uninsulated and spatially separated from the flowing heat transfer fluid to maintain the heat transfer fluid seals at relatively low temperatures.

In some embodiments, thermal expansion may be handled at the surface with a slip joint where the heat transfer fluid conduit is free to move and the fixed conduit is part of the wellhead. FIG. 254 depicts a representation of system where fixed conduit 1856 is secured to wellhead 476. Fixed conduit 1856 may include insulating sleeve 1836. Heat transfer fluid seals 1858 may be coupled to an upper portion of conduit 1834. Heat transfer fluid seals 1858 may be uninsulated and spatially separated from the flowing heat transfer fluid to maintain the heat transfer fluid seals at relatively low temperatures. Conduit 1834 is able to move relative to fixed conduit 1856 without the need for a sliding seal in wellhead 476.

In an embodiment, lift systems are coupled to the piping of a heater that extends out of the formation. The lift systems may lift portions of the heater out of the formation to accommodate thermal expansion. FIG. 255 depicts a representation of u-shaped wellbore 428 with heater 802 positioned in the wellbore. Wellbore 428 may include casings 564 and lower seals 1860. Heater 802 may include insulated portions 1862, and heater portion 1864 adjacent to treatment area 1028. Moving seals 1858 may be coupled to an upper portion of heater 802. Lifting systems 1866 may be coupled to insulated portions 1862 above wellheads 476. A non-reactive gas (for example, nitrogen and/or carbon dioxide) may be introduced in subsurface annular region 1868 between casings 564 and insulated portions 1862 to inhibit gaseous formation fluid from rising to wellhead 476 and to provide an insulating gas blanket. Insulated portions 1862 may be conduit-in-conduits with the heat transfer fluid of the circulation system flowing through the inner conduit. The outer conduit of each insulated portion 1862 may be at a significantly lower temperature than the inner conduit. The lower temperature of the outer conduit allows the outer conduits to be used as a load bearing member for lifting heater 802. Differential expansion between the outer pipe and the inner pipe may be mitigated by internal bellows and/or by sliding seals.

Lifting systems 1866 may include hydraulic lifters, powered coiled tubing rigs, and/or counterweight systems capable of supporting heater 802 and moving insulated portions 1862 into or out of the formation. When lifting systems 1866 include hydraulic lifters, the outer conduits of insulated portions 1862 may be kept cool at the hydraulic lifters by dedicated slick transition joints. The hydraulic lifters may include two sets of slips. The first set of slips may be coupled to the heater. The hydraulic lifters may maintain a constant pressure against the heater for the full stroke of the hydraulic cylinder. The second set of slips may periodically be set against the outer conduit while the stroke of the hydraulic cylinder is reset. Lifting systems 1866 may also include strain gauges and control systems. The strain gauges may be attached to the outer conduit of insulated portions 1862, or the strain gauges may be attached to the inner conduits of the insulated portions below the insulation. Attaching the strain gauges to the outer conduit may be easier and the attachment may be more reliable.

Before heating begins, set points for the control systems may be established by using lifting systems 1866 to lift heater 802 so that portions of the heater contact casing 564 in the bend portions of wellbore 428. The strain when heater 802 is lifted may be used as the set point for the control system. In other embodiments, the set point may be chosen in a different manner. When heating begins, heater portion 1864 will begin expanding and some of the heater section will advance horizontally. If the expansion forces portions of heater 802 against casing 564, the weight of the heater will be supported at the contact points of insulated portions 1862 and the casing. The strain measured by lifting system 1866 will go towards zero. Additional thermal expansion may cause heater 802 to buckle and fail. Instead of allowing heater 802 to press against casing 564, hydraulic lifters of lifting systems 1866 may move sections of insulated portions 1862 upwards and out of the formation to keep the heater against the top of the casing. The control systems of lifting systems 1866 may lift heater 802 to maintain the strain measured by the strain gauges near the set point value. Lifting system 1866 may also be used to reintroduce insulated portions 1862 into the formation when the formation cools to avoid damage to heater 802 during thermal contraction.

Thermal expansion of the heater may be complete in a relatively short time frame. In some embodiments, the position of the heater is fixed relative to the wellbore after thermal expansion is completed. The lifting systems may be removed from the heaters and used on other heaters that have not yet been heated. Lifting systems may be reattached to the heaters when the formation is cooled to accommodate thermal contraction of the heaters.

In some embodiments, the lifting systems may be controlled based on the hydraulic pressure of the lifters. Change in the tension of the pipe may result in a change in the hydraulic pressure. The control system may maintain the hydraulic pressure substantially at a set point hydraulic pressure to provide accommodation of thermal expansion of the heater in the formation.

In some embodiments, the circulation system uses a liquid to heat the formation. The use of liquid heat transfer fluid may allow for high overall energy efficiency for the system as compared to electrical heating or gas heaters due to the high energy efficiency of heat supplies used to heat the liquid heat transfer fluid. If furnaces are used to heat the liquid heat transfer fluid, the carbon dioxide footprint of the process may be reduced as compared to electrically heating or using gas burners positioned in wellbores due to the efficiencies of the furnaces. If nuclear power is used to heat the liquid heat transfer fluid, the carbon dioxide footprint of the process may be significantly reduced or eliminated. The surface facilities for the heating system may be formed from commonly available industrial equipment in simple layouts. The commonly available equipment in simple layouts increases the overall reliability of the system.

The liquid heat transfer fluid may be a molten salt or other liquid that has the potential to solidify if the temperature becomes too low. A secondary heating system may be needed to ensure that heat transfer fluid remains in liquid form and that the heat transfer fluid is at a temperature that allows the heat transfer fluid to flow through the heaters by the circulation system. The secondary heating system may not heat the heater and/or the heat transfer fluid to a high temperature, but only to a temperature sufficient to melt and ensure flowability of the heat transfer fluid. The secondary heating system may only be needed for a short period of time during startup and or re-startup of the fluid circulation system. In some embodiments, the secondary heating system is removable from the heater. In some embodiments, the secondary heating systems are not made to last for the life of the heater.

In an embodiment, molten salt is used as the heat transfer fluid. Insulated return storage tanks receive return molten salt from the formation. Temperatures in the return storage tanks may be in the vicinity of about 350° C. Pumps may move the molten salt to furnaces. Each of the pumps may need to move from 4 kg/s to 30 kg/s of the molten salt. Each furnace may provide heat to molten salt. The molten salt may pass from the piping to insulated feed storage tanks. Exit temperatures of the molten salt from the furnaces may be about 550° C. The molten salt may pass from the furnaces to insulated feed storage tanks. Each feed storage stank may supply molten salt to 50 or more piping systems that enter into the formation. The molten salt flows through the formation and to return storage tanks. The furnaces may have efficiencies that are 90% or greater. Heat loss to the overburden may be 8% or less.

In some embodiments, the heaters for the circulation systems include insulation along the lengths of the heaters, including portions of the heaters that will be used to heat the treatment area. The insulation may facilitate insertion of the heaters into the formation. The insulation adjacent to portions that are to be used to heat the treatment area may be sufficient to provide insulation during preheating, but may decompose at temperatures provided by the heat transfer fluid during steady operation of the circulation system. In some embodiments, the insulation layer changes the emissivity of the heater so that radiative heat transfer from the heater is inhibited. After decomposition of the insulation, the emissivity of the heater may promote radiative heat transformation to the treatment area. The insulation may reduce the time needed to raise the temperature of the heaters and/or the heat transfer fluid in the heaters to temperatures sufficient to ensure melt and flowability. In some embodiments, the insulation adjacent to portions of the heaters that will heat the treatment area may include polymer coatings. Insulation of portions of the heaters adjacent to the overburden is different than the insulation of the heaters adjacent to the portions of the heaters that are to heat the treatment area. The insulation of the heaters adjacent to the overburden is able to survive for the life of the heaters.

In some embodiments, degradable insulation material (for example, a polymer foam) may be introduced into the wellbore after or during placement of the heater. The degradable insulation may provide insulation adjacent to the portions of the heaters that are to heat the treatment area during preheating. The liquid heat transfer fluid used to heat the treatment area may raise the temperature sufficiently of the heater enough to degrade and eliminate the insulation layer.

In some embodiments, the secondary heating system may electrically heat the heaters of the fluid circulation system. In some embodiments, electricity is applied directly to the heat transfer fluid conduit to resistively heat the heat transfer fluid conduit. Directly heating the heat transfer fluid conduit may require large current because of the relatively low resistance of the heat transfer fluid conduit. A return current path may be needed.

In some embodiments, the heat transfer fluid conduit may include ferromagnetic material that allows the effective resistance of the heat transfer fluid conduit to be high due to the skin effect heating when time varying current is applied to the heat transfer fluid conduit. For example, the heat transfer fluid conduit may be made of steel with 9% to 13% by weight chromium, such as 410 stainless steel. A return current path may be needed.

Resistively heating the heater may require special considerations. Wellheads may need to include isolation flanges to ensure that the current path travels down the subsurface conduits and not through the surface pipe manifolds. Also, casings in the formation may need to be made of a non-ferromagnetic material (for example, non-ferromagnetic high manganese steel, fiberglass, or carbon fiber) to inhibit induction that heats the casing and surrounding formation. In some embodiments, the overburden section of the heater is a conduit-in-conduit configuration with a thermal barrier between the conduits. The insulation may limit the amount of heat transferred to the inner conduit and the molten salt. Making the outer conduit of a non-ferromagnetic material may allow for distribution of current between the inner conduit and the outer conduit that allows for adequate heating of the inner conduit and salt. Electrically conductive centralizers may be located between the casing and the heater.

FIG. 256 depicts a side view representation of an embodiment of a system for heating a portion of a formation using a circulated fluid system and/or electrical heating. Wellheads 476 of heaters 802 may be coupled to heat transfer fluid circulation system 992 by piping. Wellheads 476 may also be coupled to electrical power supply system 1006. In some embodiments, heat transfer fluid circulation system 992 is disconnected from the heaters when electrical power is used to heat the formation. In some embodiments, electrical power supply system 1006 is disconnected from the heaters when heat transfer fluid circulation system 992 is used to heat the formation.

Electrical power supply system 1006 may include transformer 580 and cables 686, 688. In certain embodiments, cables 686, 688 are capable of carrying high currents with low losses. For example, cables 686, 688 may be thick copper or aluminum conductors. The cables may also have thick insulation layers. In some embodiments, cable 686 and/or cable 688 may be superconducting cables. The superconducting cables may be cooled by liquid nitrogen. Superconducting cables are available from Superpower, Inc. (Schenectady, N.Y., U.S.A.). Superconducting cables may minimize power loss and/or reduce the size of the cables needed to couple transformer 580 to the heaters. In some embodiments, cables 686, 688 may be made of carbon nanotubes. Cables 686, 688 may be electrically coupled to heaters 802 to resistively heat the heaters.

FIG. 257 depicts a representation of heater 802 that may initially be resistively heated with the return current path provided by insulated conductor 574. Electrical connection between a lead of transformer 580 and heater 802 may be made near a first side of the heater. The other lead of transformer 580 may be electrically coupled to insulated conductor 574. Electrical connection 1870 between heater 802 and insulated conductor 574 may be made on an opposite side of heater from transformer 580 to complete the electrical circuit. FIG. 258 depicts a representation of heater 802 that may initially be resistively heated with the return current path provided by two insulated conductors 574. Transformers 580 may be located on each side of heater 802. Leads from transformers 580 may be electrically coupled to heater 802. The other leads for transformers 580 may be electrically coupled to insulated conductors 574. Electrical connections between insulated conductors 574 and heater 802 may be made near the center of the heater to complete the electrical circuits. Insulated conductors 574 depicted in FIG. 257 and FIG. 258 may be good electrical conductors that provide little or no resistive heating. Insulated conductors 574 may be coupled to the outside of heaters 802 as depicted, or the insulated conductors may be positioned inside of the heaters.

In some embodiments, insulated conductors that resistively heat may be used to preheat and/or ensure heat transfer flow in heaters of a fluid circulation system. FIG. 259 depicts a representation of insulated conductors 574 used to resistively heat heaters 802 of a circulated fluid heating system. Insulated conductors 574 may be coupled to transformer 580 in a three phase configuration. Lead in and lead out portions of insulated conductors may be good electrical conductors that provide little or no resistive heating. Portions of insulated conductors 574 coupled to or positioned in heaters 802 may include material that resistively heats to temperatures sufficient to heat the heat transfer fluid in the heaters to a temperature sufficient to allow the heat transfer fluid to flow. The material may be ferromagnetic so the insulated conductors are temperature limited heaters. The Curie point temperature limit or phase transition temperature limit of the ferromagnetic material may allow the insulated conductors to reach temperatures above but relatively close to the temperature needed to ensure melt and flowability of heat transfer fluid in heaters 802.

FIG. 260 depicts insulated conductor 574 positioned in heater 802. Heater 802 is piping of the circulation system positioned in the formation. Electricity applied to insulated conductor 574 resistively heats the insulated conductor. The generated heat transfers to heater 802 and heat transfer fluid in the heater. In some embodiments, the insulated conductors may be strapped to the outside of the heaters instead of being placed inside of the heaters. Insulated conductor 574 may be a relatively thin mineral insulated conductor positioned in a relatively large diameter piping as shown and described with respect to FIG. 356. In some embodiments, insulated conductors positioned in the heaters may be placed inside of a protective sleeve. For example, the insulated conductor with an outer diameter of about 0.6 inches may be placed inside a 1 inch tube or pipe that is placed in the 5 inch heater pipe.

In some embodiments, insulated conductors positioned inside or outside heaters used with a circulated fluid heating system may provide current that is used to cause inductive heating. The current flowing through the insulated conductors may be used to induce currents in the heater so that the heater is resistively heated. In some embodiments, the insulated conductors may be wrapped with a coil that is inductively heated. The coil may be made of a material that has a Curie temperature limit or phase transition temperature limit slightly higher than the temperature needed to ensure melt and flowability of heat transfer fluid in the heaters.

In some embodiments, insulated conductors used as current paths or as heaters may be removable from heaters. After heat transfer fluid circulation in a heater is initiated and stabilizes, the heat transfer fluid will heat the adjacent formation to temperatures above the temperature needed to ensure melt and flowability of the heat transfer fluid. The heat of the formation and the heat of the heat transfer fluid may be sufficient to ensure melt and flowability of the heat transfer fluid should the circulation system temporarily be interrupted (for example, for a day, a week, or a month). For heaters with the insulated conductor positioned in the heater, the insulated conductors may be pulled out of the heater through seals in the wellhead that allow for electrical connection to the insulated conductors. The insulated conductors may be coiled and reused in heaters that have not been preheated. Should it be necessary, insulated conductor heaters may be reintroduced into the heaters.

In some embodiments of circulation systems that use molten salt or other liquid as the heat transfer fluid, the heater may be a single conduit in the formation. The conduit may be preheated to a temperature sufficient to ensure flowability of the heat transfer fluid. In some embodiments, a secondary heat transfer fluid is circulated through the conduit to preheat the conduit and/or the formation adjacent to the conduit. After the temperature of the conduit and/or the formation adjacent to the conduit is sufficiently hot, the fluid may be flushed from the conduit and the heat transfer fluid may be circulated through the pipe. In some embodiments, aqueous solutions of the salt composition that is to be used as the heat transfer fluid are used to preheat the conduit. The composition of the salt and/or the pressure of the system may be adjusted to inhibit boiling of the aqueous solution as the temperature is increased. When the conduit is preheated to a temperature sufficient to ensure flowability of the molten salt, the remaining water may be removed from the aqueous solution to leave only the molten salt. The water may be removed by evaporation while the salt solution is in a storage tank of the circulation system. After the heater is raised to a temperature sufficient to ensure continued flow of heat transfer fluid through the heater, a vacuum may be drawn on the passageway for the second heat transfer fluid to inhibit heat transfer from the first passageway to the second passageway. In some embodiments, the passageway for the second heat transfer fluid is filled with insulating material and/or is otherwise blocked.

In some embodiments of circulation systems that use molten salt or other liquid as the heat transfer fluid, the heater may have a conduit-in-conduit configuration. The liquid heat transfer fluid used to heat the formation may flow through a first passageway through the heater. A second heat transfer flow may flow through a second passageway through the conduit-in-conduit heater for preheating and/or for flow assurance of the liquid heat transfer fluid. The passageways in the conduit of the conduit-in-conduit heater may include the inner conduit and the annular region between the inner conduit and the outer conduit. In some embodiments, one or more flow switchers are used to change the flow in the conduit-in-conduit heater from the inner conduit to the annular region and/or vice versa.

FIG. 261 depicts a cross-sectional view of an embodiment of heater 802 for a heat transfer circulation heating system adjacent to treatment area 1028. Heater 802 may be positioned in wellbore 428. Heater 802 may include outer conduit 1872 and inner conduit 1874. During normal operation of heater 802, liquid heat transfer fluid may flow through annular region 1876 between outer conduit 1872 and inner conduit 1874. During normal operation, fluid flow through inner conduit 1874 may not be needed.

During preheating and/or for flow assurance, a secondary heat transfer fluid may flow through inner conduit 1874. The secondary fluid may be, but is not limited to, air, carbon dioxide, exhaust gas, and/or a natural or synthetic oil (for example, DowTherm A, SylTHerm, or Therminol 59), room temperature molten salts (for example, $NaCl_2$—$SrCl_2$, $VCl_4$, $SnCl_4$, or $TiCl_4$), high pressure liquid water, steam, or room temperature molten metal alloys (for example, a K—Na eutectic or a Ga—In—Sn eutectic). In some embodiments, outer conduit 1872 is heated by a secondary heat transfer fluid flowing through annular region 1876 (for example, carbon dioxide or exhaust gas) before the heat transfer fluid that is to be used to heat the formation is introduced into the annular region. If exhaust gas or other high temperature fluid is used, another heat transfer fluid (for example, water or steam) may need to be passed through the heater to reduce the temperature below the upper working temperature limit of the liquid heat transfer fluid. The secondary heat transfer fluid may be displaced from the annular region when the liquid heat transfer fluid is introduced into the heater. The secondary heat transfer fluid in inner conduit 1874 may be the same fluid or a different fluid than the secondary fluid used to preheat outer conduit 1872 during preheating. Using two different secondary heat transfer fluids may allow for the identification of integrity problems in heater 802. Any integrity problems may be identified and fixed before the use of the molten salt is initiated.

In some embodiments, the secondary heat transfer fluid that flows through annular region 1876 during preheating is an aqueous mixture of the salt to be used during normal operation. The salt concentration may be increased periodically to allow for increasing temperature while remaining below the boiling temperature of the aqueous mixture. The aqueous mixture may be used to raise the temperature of outer conduit 1872 to a temperature sufficient to allow the molten salt to flow in annular region 1876. When the temperature is reached, the remaining water in the aqueous mixture may be allowed to evaporate out of the mixture to leave the molten salt. The molten salt may be used to heat treatment area 1028.

In some embodiments, inner conduit 1874 may be made of a relative inexpensive material such as carbon steel. Inner conduit 1874 needs to survive through an initial early stage of the heat treatment process. Outer conduit 1872 may be made of material resistant to corrosion by the molten salt and formation fluid (for example, P91 steel).

For a given mass flow rate of liquid heat transfer fluid, heating a treatment area using liquid heat transfer fluid flowing in annular region between outer conduit 1872 and inner conduit 1874 may have certain advantages over flowing the liquid heat transfer fluid through a single conduit. Flowing secondary heat transfer fluid through inner pipe 1874 may pre-heat heater 802 and ensure flow when liquid heat transfer fluid is first used and/or when flow needs to be restarted after a stop of circulation. The large outer surface area of outer conduit 1872 provides a large surface area for heat transfer to the formation, while still allowing for reduced amount of liquid heat transfer fluid needed for the circulation system because of the presence of inner conduit 1874. The circulated liquid heat transfer fluid may deliver a better power injection rate distribution to the treatment area due to increased velocity of the liquid heat transfer fluid for the same mass flow rate. Reliability of the heater may be improved.

Having a conduit-in-conduit heater configuration allows flow switchers to be used that change the flow of heat transfer fluid in the heater from flow through the annular region between the outer conduit and the inner conduit while adjacent to the treatment area to flow through the inner conduit while adjacent to the overburden. FIG. 262 depicts a schematic representation of conduit-in-conduit heaters 802 that are used with fluid circulation systems 992, 992' to heat treatment area 1028. Heaters 802 include outer conduit 1872, inner conduit 1874, flow switchers 1878. Fluid circulation systems 992, 992' provide heated liquid heat transfer fluid to wellheads 476. The direction of flow of liquid heat transfer fluid is indicated by arrow 1880. Heat transfer fluid from fluid circulation system 992 passes through wellhead 476 to inner conduit 1874. The heat transfer fluid passes through flow switcher 1878 which changes the flow to the annular region between outer conduit 1872 and inner conduit 1874. The heat transfer fluid flows through treatment area 1028. Heat from the heat transfer fluid is transferred to treatment area 1028. The heat transfer fluid passes through a second flow switcher which changes the flow from the annular region to flow through inner conduit 1874. The heat transfer fluid flows through second wellhead 476' to fluid circulation system 992'. Heated heat transfer fluid from fluid circulation systems 992' passes through heater 802' back to fluid circulation system 992.

Using flow switchers 1878 to pass the fluid through the annular region while the fluid is adjacent to treatment area 1028 promotes increased heat transfer to the treatment area due in part to the large heat transfer area of outer conduit 1872. Using flow switchers 1878 to pass the fluid through the inner conduit when adjacent to overburden 482 may reduce heat losses to the overburden. Additionally, heaters 802 may be insulated adjacent to overburden 482 to reduce heat losses to the formation.

FIG. 263 depicts a cross-sectional view of an embodiment of a conduit-in-conduit heater 802 adjacent to overburden 482. Insulation 1882 may be positioned between outer conduit 1872 and inner conduit 1874. Liquid heat transfer fluid may flow through the center of inner conduit 1874. Insulation 1882 may be a highly porous insulation layer that inhibits high temperature radiation (for example, temperatures above 500° C.) and allows flow of a secondary heat transfer fluid during preheating and/or flow assurance stages of heating. During normal operating, flow of fluid through the annular region between outer conduit 1872 and inner conduit 1874 adjacent to overburden 482 may be stopped or inhibited.

Insulating sleeve 1836 may be positioned around outer conduit 1872. Insulating sleeves on each side of a u-shaped heater may be securely coupled to outer conduit 1872 over a long length when the system is not heated so that the insulating sleeves on each side of the u-shaped wellbore are able to support the weight of the heater. Insulating sleeve 1836 may include an outer member that is a structural member that allows heater 802 to be lifted to accommodate thermal expansion of the heater. Casing 564 may surround insulating sleeve 1836. Insulating cement 1832 may couple casing 564 to overburden 482. Insulating cement 1832 may be a low thermal conductivity cement that reduces conductive heat losses. Insulating cement 1832 may be a vermiculite/cement aggregate. A non-reactive gas may be introduced into gap 1838 between insulating sleeve 1836 and casing 564 to inhibit rising formation fluid and/or to provide an insulating gas blanket.

FIG. 264 depicts a schematic of an embodiment of circulation system 992 that supplies to liquid heat transfer fluid to conduit-in-conduit heaters positioned in the formation. Circulation system 992 may include heat supply 994, compressor 1884, heat exchanger 1886, exhaust system 1888, liquid storage tank 1890, pumps 1000, supply manifold 1892, return manifold 1894, and secondary heat transfer fluid circulation system 1896.

Heat supply 994 may be a furnace. Fuel for heat supply 994 may be supplied through fuel line 1898. Control valve 1900 may regulate the amount of fuel supplied to heat supply 994 based on the temperature of hot heat transfer fluid as measured by temperature monitor 1902.

Oxidant for heat supply 994 may be supplied through oxidant line 1904. Exhaust from heat supply 994 may pass through heat exchanger 1886 to exhaust system 1888. Oxidant from compressor 1884 may pass through heat exchanger 1886 to be heated by the exhaust from heat supply 994.

In some embodiments, valve 1906 may be opened during preheating and/or during start-up of fluid circulation to the heaters to supply secondary heat transfer fluid circulation system 1896 with a heating fluid. In some embodiments, exhaust gas is circulated through the heaters by secondary heat transfer fluid circulation system 1896. In some embodiments, the exhaust gas passes through one or more heat exchangers of secondary heat transfer fluid circulation system 1896 to heat fluid that is circulated through the heaters.

During preheating, secondary heat transfer fluid circulation system 1896 may supply secondary heat transfer fluid to the inner conduit of the heaters and/or to the annular region between the inner conduit and the outer conduit. Line 1912 may provide secondary heat transfer fluid to the part of supply manifold 1892 that supplies fluid to the inner conduits of the heaters. Line 1914 may provide secondary heat transfer fluid to the part of supply manifold 1892 that supplies fluid to the annular regions between the inner conduits and the outer conduits of the heaters. Line 1916 may return secondary heat transfer fluid from the part of the return manifold 1894 that returns fluid from the inner conduits of the heaters. Line 1918 may return secondary heat transfer fluid from the part of the return manifold 1894 that returns fluid from the annular regions of the heaters. Valves 1920 of secondary heat transfer fluid circulation system 1896 may allow or stop secondary heat transfer flow to or from supply manifold 1892 and/or return manifold 1894. During preheating, all valves 1920 may be open. During the flow assurance stage of heating, valves 1920 for line 1912 and for line 1916 may be closed, and valves 1920 for line 1914 and line 1918 may be closed. Liquid heat transfer fluid from heat supply may be provided to the part of supply manifold 1892 that supplies fluid to the inner conduits of the heaters during the flow assurance stage of heating. Liquid heat transfer fluid may return to supply tank from the portion of return manifold 1894 that returns fluid from the inner conduits of the heaters. During normal operation, all valves 1920 may be closed.

Secondary heat transfer fluid circulation system 1896 may be a mobile system. Once normal flow of heat transfer fluid through the heaters is established, mobile secondary heat transfer fluid circulation systems 1896 may be moved and attached to another circulation system that has not been initiated.

During normal operation, liquid storage tank 1890 may receive heat transfer fluid from return manifold 1894. Liquid storage tank 1890 may be insulated and heat traced. Heat tracing may include steam circulation system 1908 that circulates steam through coils in liquid storage tank 1890. Steam passed through the coils maintains heat transfer fluid in liquid storage tank 1890 at a desired temperature or in a desired temperature range.

Pumps 1000 may move liquid heat transfer fluid from liquid storage tank 1890 to heat supply 994. In some embodiments, pumps 1000 are submersible pumps that are positioned in liquid storage tank 1890. Having pumps 1000 in storage tanks may keep the pumps at temperatures well within the operating temperature limits of the pumps. Also, the heat transfer fluid may function as a lubricant for the pumps. One or more redundant pump systems may be placed in liquid storage tank 1890. A redundant pump system may be used if the primary pump system shuts down or needs to be serviced.

During start-up of heat supply 994, valves 1910 may be configured to direct liquid heat transfer fluid to liquid storage tank. After preheating of a heater in the formation is completed, valves 1910 may be reconfigured to direct liquid heat transfer fluid to the part of supply manifold 1892 that supplies the liquid heat transfer fluid to the inner conduit of the preheated heater. Return liquid heat transfer fluid from the inner conduit of a preheated return conduit may pass through the part of return manifold 1894 that receives heat transfer fluid that has passed through the formation and directs the heat transfer fluid to liquid storage tank 1890.

To begin using fluid circulation system 992, liquid storage tank 1890 may be heated using steam circulation system 1908. The heat transfer fluid may be added to liquid storage tank 1890. The heat transfer fluid may be added as solid particles that melt in liquid storage tank 1890, or liquid heat transfer fluid may be added to the liquid storage tank. Heat supply 994 may be started, and pumps 1000 may be used to circulate heat transfer fluid from liquid storage tank 1890 to the heat supply and back. Secondary heat transfer fluid circulation system 1896 may be used to heat heaters in the formation that are coupled to supply manifolds 1892 and return manifolds 1894. Supply of secondary heat transfer fluid to the portion of supply manifold 1892 that feeds the inner conduits of the heaters may be stopped. The return of secondary heat transfer fluid from the portion of return manifold that receives heat transfer fluid from the inner conduits of the heaters may be stopped. Heat transfer fluid from heat supply 994 may be directed to the inner conduit of the heaters.

The heat transfer fluid may flow through the inner conduits of the heaters to first flow switchers that change the flow of fluid from the inner conduits to the annular regions between the inner conduits and the outer conduits. The heat transfer fluid may pass through second flow switchers that change the flow back to the inner conduits. Valves coupled to the heaters may allow heat transfer fluid flow to the individual heaters to be started sequentially instead of having the fluid circulation system supply heat transfer fluid to all of the heaters at once.

Return manifold receives heat transfer fluid that has passed through heaters in the formation that are supplied from a second fluid circulation system. Heat transfer fluid from return manifold 1894 may be directed back into liquid storage tank 1890.

During initial heating, secondary heat transfer fluid circulation system 1896 may continue to circulate secondary heat transfer fluid through the portion of the heater not receiving the heat transfer fluid supplied from heat supply 994. In some embodiments, secondary heat transfer fluid circulation system 1896 directs the secondary heat transfer fluid in the same direction as the flow of heat transfer fluid supplied from heat supply 994. In some embodiments, secondary heat transfer fluid circulation system 1896 directs the secondary heat transfer fluid in the opposite direction to the flow of heat transfer fluid supplied from heat supply 994. The secondary heat transfer fluid may ensure continued flow of the heat transfer fluid supplied from heat supply 994. Flow of the secondary heat transfer fluid may be stopped when the secondary heat transfer fluid leaving the formation is hotter than the secondary heat transfer fluid supplied to the formation due to heat transfer with the heat transfer fluid supplied from heat supply 994. In some embodiments, flow of secondary heat transfer fluid may be stopped when other conditions are met, such as the passage of a period of time.

FIG. 265 depicts a schematic representation of a system for providing and removing liquid heat transfer fluid to the treatment area of a formation using gravity and gas lifting as the driving forces for moving the liquid heat transfer fluid. The liquid heat transfer fluid may be a molten metal or a molten salt. Vessel 1008 is elevated above heat exchanger 1010. Heat transfer fluid from vessel 1008 flows through heat transfer unit 1010 to the formation by gravity drainage. In an embodiment, heat exchanger 1010 is a tube and shell heat exchanger. Input stream 1012 is a hot fluid (for example, helium) from nuclear reactor 1014. Exit stream fluid 1016 may be sent as a coolant stream to nuclear reactor 1014. In some embodiments, the heat exchanger is a furnace, solar collector, chemical reactor, fuel cell, and/or other high temperature source able to supply heat to the liquid heat transfer fluid.

Hot heat transfer fluid from heat exchanger 1010 may pass to a manifold that provides heat transfer fluid to individual heater legs positioned in the treatment area of the formation. The heat transfer fluid may pass to the heater legs by gravity drainage. The heat transfer fluid may pass through overburden 482 to hydrocarbon containing layer 484 of the treatment area. The piping adjacent to overburden 482 may be insulated. Heat transfer fluid flows downwards to sump 1018.

Gas lift piping may include gas supply line 1020 within conduit 1022. Gas supply line 1020 may enter sump 1018. When lift chamber 1024 in sump 1018 fills to a selected level with heat transfer fluid, a gas lift control system operates valves of the gas lift system so that the heat transfer fluid is lifted through the space between gas supply line 1020 and conduit 1022 to separator 1026. Separator 1026 may receive heat transfer fluid and lifting gas from a piping manifold that transports the heat transfer fluid and lifting gas from the individual heater legs in the formation. Separator 1026 separates the lift gas from the heat transfer fluid. The heat transfer fluid is sent to vessel 1008.

Conduits 1022 from sumps 1018 to separator 1026 may include one or more insulated conductors or other types of heaters. The insulated conductors or other types of heaters may be placed in conduits 1022 and/or be strapped or otherwise coupled to the outside of the conduits. The heaters may inhibit solidification of the heat transfer fluid in conduits 1022 during the gas lift from sump 1018.

In some embodiments, solar salt (i.e., a salt containing 60 wt % $NaNO_3$ and 40 wt % $KNO_3$) may be used as the heat transfer fluid in a circulated fluid system. Solar salt may have a melting point of about 230° C. and an upper temperature limit of about 565° C. In some embodiments, $LiNO_3$ may be added to the $NaNO_3$ and $KNO_3$ mixture to produce tertiary salt mixtures with larger operating temperature ranges and lower melting temperatures, and only a slight decrease in the maximum working temperature as compared to solar salt. Table 2 shows the composition, melting point and upper temperature limit of several salt compositions. The lower melting temperature of the tertiary salt mixtures may decrease the preheating requirements and allow the use of pressurized water as a heat transfer fluid for preheating the piping of the circulation system. The corrosion rates of the metal of the heaters due to the tertiary salt compositions at 550° C. is comparable to the corrosion rate of the metal of the heaters due to solar salt at 565° C.

A portion of the heat input into a treatment area using circulated heat transfer fluid may recovered after the in suit heat treatment process is completed. Initially, the same heat transfer fluid used to heat the treatment area may be circulated through the formation without the heat source reheating the heat transfer fluid so that the heat transfer fluid absorbs heat from the treatment area. The heat transfer fluid heated by the treatment area may be circulated through an adjacent unheated treatment area to begin heating the unheated treatment area. In some embodiments, the heat transfer fluid heated by the treatment area passes through a heat exchanger to heat a second heat transfer fluid that is used to begin heating the unheated treatment area.

In some embodiments, a different heat transfer fluid than the heat transfer fluid used to heat the treatment area may be used to recover heat from the formation. A different heat transfer fluid may be used when the heat transfer fluid used to heat the treatment area has the potential to solidify in the piping during recovery of heat from the treatment area. The different heat transfer fluid may be a low melting temperature salt or salt mixture, steam, carbon dioxide, or a synthetic oil (for example, DowTherm or Therminol).

In some embodiments, initial heating of the formation may be performed using circulated molten solar salt ($NaNO_3$—$KNO_3$) flowing through conduits in the formation. Heating may be continued until fluid communication between heater wells and producer wells is established and a relatively large amount of coke develops around the heater wells. Circulation may be stopped and one or more of the conduits may be perforated. In an embodiment, the heater includes a perforated outer conduit and an inner liner that is chemically resistant to the heat transfer fluid. When heat transfer fluid is stopped, the liner may be withdrawn or chemically dissolved to allow fluid flow from the heater into the formation. In other embodiments, perforation guns may be used in the piping after flow of circulated heat transfer fluid is stopped. Nitrate salts or other oxidizers may be introduced into the formation through the perforations. The nitrate salts or other oxidizers may oxidize the coke to finish heating the reservoir to desired temperatures. The concentration and amount of nitrate salts or other oxidizers introduced into the formation may be controlled to control the heating of the formation. Oxidizing the coke in the formation may heat the formation efficiently and reduce the time for heating the formation to a desired temperature. Oxidation product gases may convectively transfer heat in the formation and provide a gas drive that moves formation fluid towards the production wells.

In some embodiments, nuclear energy is used to heat the heat transfer fluid used in a circulation system to heat a portion of the formation. Heat supply 994 in FIG. 238 may be a pebble bed reactor or other type of nuclear reactor, such as a light water reactor or a fissile metal hydride reactor. The use of nuclear energy provides a heat source with little or no carbon dioxide emissions. Also, in some embodiments, the use of nuclear energy is more efficient because energy losses resulting from the conversion of heat to electricity and electricity to heat are avoided by directly utilizing the heat produced from the nuclear reactions without producing electricity.

In some embodiments, a nuclear reactor heats a heat transfer fluid such as helium. For example, helium flows through a pebble bed reactor, and heat transfers to the helium. The helium may be used as the heat transfer fluid to heat the formation. In some embodiments, the nuclear reactor heats helium, and the helium is passed through a heat exchanger to provide heat to another heat transfer fluid used to heat the formation. The nuclear reactor may include a pressure vessel that contains encapsulated enriched uranium dioxide fuel. Helium may be used as a heat transfer fluid to remove heat from the nuclear reactor. Heat may be transferred in a heat exchanger from the helium to the heat transfer fluid used in the circulation system. The heat transfer fluid used in the circulation system may be carbon dioxide, a molten salt, or other fluids. Pebble bed reactor systems are available, for example, from PBMR Ltd (Centurion, South Africa).

FIG. 266 depicts a schematic diagram of a system that uses nuclear energy to heat treatment area 1028. The system may include helium system gas mover 1030, nuclear reactor 1032, heat exchanger unit 1034, and heat transfer fluid mover 1036. Helium system gas mover 1030 may blow, pump, or compress heated helium from nuclear reactor 1032 to heat exchanger unit 1034. Helium from heat exchanger unit 1034 may pass through helium system gas mover 1030 to nuclear reactor 1032. Helium from nuclear reactor 1032 may be at a temperature between about 900° C. and about 1000° C. Helium from helium gas mover 1030 may be at a temperature between about 500° C. and about 600° C. Heat transfer fluid mover 1036 may draw heat transfer fluid from heat exchanger unit 1034 through treatment area 1028. Heat transfer fluid may pass through heat transfer fluid mover 1036 to heat exchanger unit 1034. The heat transfer fluid may be carbon dioxide, a molten salt, and/or other fluids. The heat transfer fluid may be at a temperature between about 850° C. and about 950° C. after exiting heat exchanger unit 1034.

In some embodiments, the system includes auxiliary power unit 1038. In some embodiments, auxiliary power unit 1038 generates power by passing the helium from heat exchanger unit 1034 through a generator to make electricity. The helium may be sent to one or more compressors and/or heat exchangers to adjust the pressure and temperature of the helium before the helium is sent to nuclear reactor 1032. In some embodiments, auxiliary power unit 1038 generates power using a heat transfer fluid (for example, ammonia or aqua ammonia). Helium from heat exchanger unit 1034 may be sent to additional heat exchanger units to transfer heat to the heat transfer fluid. The heat transfer fluid may be taken through a power cycle (such as a Kalina cycle) to generate electricity. In an embodiment, nuclear reactor 1032 is a 400 MW reactor and auxiliary power unit 1038 generates about 30 MW of electricity.

FIG. 267 depicts a schematic elevational view of an arrangement for an in situ heat treatment process. Wellbores (which may be U-shaped or in other shapes) may be formed in the formation to define treatment areas 1028A, 1028B, 1028C, 1028D. Additional treatment areas could be formed to the sides of the shown treatment areas. Treatment areas 1028A, 1028B, 1028C, 1028D may have widths of over 300 m, 500 m, 1000 m, or 1500 m. Well exits and entrances for the wellbores may be formed in well openings area 1040. Rail lines 1042 may be formed along sides of treatment areas 1028. Warehouses, administration offices, and/or spent fuel storage facilities may be located near ends of rail lines 1042. Facilities 1044 may be formed at intervals along spurs of rail lines 1042. One or more facilities 1044 may include a nuclear reactor, compressors, heat exchanger units, and/or other equipment needed for circulating hot heat transfer fluid to the wellbores. Facilities 1044 may also include surface facilities for treating formation fluid produced from the formation. In some embodiments, heat transfer fluid produced in facility 1044' may be reheated by the reactor in facility 1044" after passing through treatment area 1028A. In some embodiments, each facility 1044 is used to provide hot treatment fluid to wells in one half of the treatment area 1028 adjacent to the facility. Facilities 1044 may be moved by rail to another facility site after production from a treatment area is completed.

In some embodiments, nuclear energy is used to directly heat a portion of a subsurface formation. The portion of the subsurface formation may be part of a hydrocarbon treatment area. As opposed to using a nuclear reactor facility to heat a heat transfer fluid, which is then provided to the subsurface formation to heat the subsurface formation, one or more self-regulating nuclear heaters may be positioned underground to directly heat the subsurface formation. The self-regulating nuclear reactor may be positioned in or proximate to one or more tunnels.

In some embodiments, treatment of the subsurface formation requires heating the formation to a desired initial upper range (for example, between about 250° C. and 350° C.). After heating the subsurface formation to the desired temperature range, the temperature may be maintained in the range for a desired time (for example, until a percentage of hydrocarbons have been pyrolyzed or an average temperature in the formation reaches a selected value). As the formation temperature rises, the heater temperature may be slowly lowered over a period of time. Currently, certain nuclear reactors described (for example, nuclear pebble reactors), upon activation, reach a natural heat output limit of about 900° C., eventually decaying as the uranium-235 fuel is depleted and resulting in lower temperatures at the heater produced over time. The natural energy output curve of certain nuclear reactors (for example, nuclear pebble reactors) may be used to provide a desired heating versus time profile for certain subsurface formations.

In some embodiments, nuclear energy is provided by a self-regulating nuclear reactor (for example, a pebble bed reactor or a fissile metal hydride reactor). The self-regulating nuclear reactor may not exceed a certain temperature based upon its design. The self-regulating nuclear reactor may be substantially compact relative to traditional nuclear reactors. The self-regulating nuclear reactor may be, for example, approximately 2 m, 3 m, or 5 m square or even less in size. The self-regulating nuclear reactor may be modular.

FIG. 268 depicts a schematic representation of self-regulating nuclear reactor 1934. In some embodiments, the self-regulating nuclear reactor includes fissile metal hydride 1936. The fissile metal hydride may function as both fuel for the nuclear reaction as well as a moderator for the nuclear reaction. A core of the nuclear reactor may include a metal hydride material. The control of the nuclear reaction may function due to the temperature driven mobility of the hydrogen isotope contained in the hydride. If the temperature increases above a set point in core 1938 of self-regulating nuclear reactor 1934, a hydrogen isotope dissociates from the hydride and escapes out of the core and the power production decreases. If the core temperature decreases, the hydrogen isotope reassociates with the fissile metal hydride reversing the process. The fissile metal hydride may be in a powdered form, which allows hydrogen to more easily permeate the fissile metal hydride.

Due to its basic design, the self-regulating nuclear reactor may include few if any moving parts associated with the control of the nuclear reaction itself. The small size and simple construction of the self-regulating nuclear reactor may have distinct advantages, especially relative to conventional commercial nuclear reactors used commonly throughout the world today. Advantages may include relative ease of manufacture, transportability, security, safety, and financial feasibility. The compact design of self-regulating nuclear reactors may allow for the reactor to be constructed at one facility and transported to a site of use, such as a hydrocarbon containing formation. Upon arrival and installation, the self-regulating nuclear reactor may be activated.

Self-regulating nuclear reactors may produce thermal power on the order of tens of megawatts per unit. Two or more self-regulating nuclear reactors may be used at the hydrocarbon containing formation. Self-regulating nuclear reactors may operate at a fuel temperature ranging between about 450° C. and about 900° C., between about 500° C. and about 800° C., or between about 550° C. and about 650° C. The operating temperature may be in the range between about 550° C. and about 600° C. The operating temperature may be in the range between about 500° C. and about 650° C.

Self-regulating nuclear reactors may include energy extraction system 1940 in core 1938. Energy extraction system 1940 may function to extract energy in the form of heat produced by the activated nuclear reactor. The energy extraction system may include a heat transfer fluid that circulates through piping 1940A and 1940B. At least a portion of the tubing may be positioned in the core of the nuclear reactor. A fluid circulation system may function to continuously circulate heat transfer fluid through the piping. Density and volume of piping positioned in the core may be dependent on the enrichment of the fissile metal hydride.

In some embodiments, the energy extraction system includes alkali metal (for example, potassium) heat pipes. Heat pipes may further simplify the self-regulating nuclear reactor by eliminating the need for mechanical pumps to convey a heat transfer fluid through the core. Any simplification of the self-regulating nuclear reactor may decrease the chances of any malfunctions and increase the safety of the nuclear reactor. The energy extraction system may include a heat exchanger coupled to the heat pipes. Heat transfer fluids may convey thermal energy from the heat exchanger.

The dimensions of the nuclear reactor may be determined by the enrichment of the fissile metal hydride. Nuclear reactors with a higher enrichment result in smaller relative reactors. Proper dimensions may be ultimately determined by particular specifications of a hydrocarbon containing formation and the formation's energy needs. In some embodiments, the fissile metal hydride is diluted with a fertile hydride. The fertile hydride may be formed from a different isotope of the fissile portion. The fissile metal hydride may include the fissile hydride $U^{235}$ and the fertile hydride may include the isotope $U^{238}$. In some embodiments, the core of the nuclear reactor may include the nuclear fuel including about 5% of $U^{235}$ and about 95% of $U^{238}$.

Other combinations of fissile metal hydrides mixed with fertile or non-fissile hydrides will also work. The fissile metal hydride may include plutonium. Plutonium's low melting temperature (about 640° C.) makes the hydride particles less attractive as a reactor fuel to power a steam generator. The fissile metal hydride may include thorium hydride. Thorium permits higher temperature operation of the reactor because of its high melting temperature (about 1755° C.). In some embodiments, different combinations of fissile metal hydride are used in order to achieve different energy output parameters.

In some embodiments, nuclear reactor 1934 may include one or more hydrogen storage containers 1942. A hydrogen storage container may include one or more non-fissile hydrogen absorbing materials to absorb the hydrogen expelled from the core. The non-fissile hydrogen absorbing material may include a non-fissile isotope of the core hydride. The non-fissile hydrogen absorbing material may have a hydride dissociation pressure close to that of the fissile material.

Core 1938 and hydrogen storage containers 1942 may be separated by insulation layer 1944. The insulation layer may function as a neutron reflector to reduce neutron leakage from the core. The insulation layer may function to reduce thermal feedback. The insulation layer may function to protect the hydrogen storage containers from being heated by the nuclear core (for example, with radiative heating or with convective heating from the gas within the chamber).

The effective steady-state temperature of the core may be controlled by the ambient hydrogen gas pressure, which is controlled by the temperature at which the non-fissile hydrogen absorbing material is maintained. The temperature of the fissile metal hydride may be independent of the amount of energy being extracted. The energy output may be dependent on the ability of the energy extraction system to extract the power from the nuclear reactor.

Hydrogen gas in the reactor core may be monitored for purity and periodically repressurized to maintain the correct quantity and isotopic content. In some embodiments, the hydrogen gas is maintained via access to the core of the nuclear reactor through one or more pipes (for example, pipes 1946A and 1946B). The temperature of the self-regulating nuclear reactor may be controlled by controlling a pressure of hydrogen supplied to the self-regulating nuclear reactor. The pressure may be regulated based upon the temperature of the heat transfer fluid at one or more points (for example, at the point where the heat transfer fluid enters one or more wellbores). In some embodiments, the pressure may be regulated, and therefore the thermal energy produced by the self-regulating nuclear reactor, based on one or more conditions associated with the formation being treated. Formation conditions may include, for example, temperature of a portion of the formation, type of formation (for example, coal or tar sands), and/or type of processing method being applied to the formation.

In some embodiments, the nuclear reaction occurring in the self-regulating nuclear reactor may be controlled by introducing a neutron-absorbing gas. The neutron-absorbing gas may, in sufficient quantities, quench the nuclear reaction in the self-regulating nuclear reactor (ultimately reducing the temperature of the reactor to ambient temperature). The neutron-absorbing gas may include $xenon^{135}$.

In some embodiments, the nuclear reaction of an activated self-regulating nuclear reactor is controlled using control rods. Control rods may be positioned at least partially in at least a portion of the nuclear core of the self-regulating nuclear reactor. Control rods may be formed from one or more neutron-absorbing material. Neutron-absorbing materials may include silver, indium, cadmium, boron, cobalt, hafnium, dysprosium, gadolinium, samarium, erbium, and/or europium.

Currently, self-regulating nuclear reactors described herein, upon activation, reach a natural heat output limit of about 900° C., eventually decaying as the fuel is depleted. The natural energy output curve of self-regulating nuclear reactors may be used to provide a desired heating versus time profile for certain subsurface formations.

In some embodiments, self-regulating nuclear reactors may have a natural energy output which decays at a rate of about 1/E (E is sometimes referred to as Euler's number and is equivalent to about 2.71828). Typically, once a formation has been heated to a desired temperature, less heat is required and the amount of thermal energy put into the formation in order to heat the formation is reduced over time. In some embodiments, heat input to at least a portion of the formation over time approximately correlates to a rate of decay of the self-regulating nuclear reactor. Due to the natural decay of self-regulating nuclear reactors, heating systems may be designed such that the heating systems take advantage of the natural rate of decay of a nuclear reactor. Heaters are typically positioned in wellbores placed throughout the formation. Wellbores may include, for example, U-shaped and L-shaped wellbores or other shapes of wellbores. In some embodiments, spacing between wellbores is determined based on the decay rate of the energy output of self-regulating nuclear reactors.

The self-regulating nuclear reactor may initially provide, to at least a portion of the wellbores, an energy output of about 300 watts/foot; and thereafter decreasing over a predetermined time period to about 120 watts/foot. The predetermined time period may be determined by the design of the self-regulating nuclear reactor itself (for example, fuel used in the nuclear core as well as the enrichment of the fuel). The natural decrease in energy output may match energy injection time dependence of the formation. Either variable (for example, power output and/or power injection) may be adjusted so that the two variables at least approximately correlate or match. The self-regulating nuclear reactor may be designed to decay over a period of 4-9 years, 5-7 years, or about 7 years. The decay period of the self-regulating nuclear reactor may correspond to an IUP (in situ upgrading process) and/or an ICP (in situ conversion process) heating cycle.

FIG. 269 depicts curve 1948 of power (W/ft) (y-axis) versus time (yr) (x-axis) of the power injection requirements for a typical in situ hydrocarbon remediation. FIG. 270 depicts power (W/ft) (y-axis) versus time (days) (x-axis) of in situ hydrocarbon remediation power injection requirements for different spacings between wellbores. Molten salt was circulated through wellbores in a hydrocarbon containing formation and the power requirements to heat the formation using molten salt were assessed over time. The distance between the wellbores was varied to determine the effect upon the power requirements. Curves 1960-1968 depict the results in FIG. 270. Curve 1964 depicts power required verses time for the Grosmont formation in Alberta, Canada, with heater wellbores laid out in a hexagonal pattern and with a spacing of about 12 meters. Curve 1966 depicts power required verses time for heater wellbores with a spacing of about 9.6 meters. Curve 1968 depicts power required verses time for heater wellbores with a spacing of about 7.2 meters. Curve 1962 depicts power required verses time for heater wellbores with a spacing of about 13.2 meters. Curve 1960 depicts power required verses time for heater wellbores with a spacing of about 14.4 meters.

From the graph in FIG. 270, wellbore spacing represented by curve 1966 may be the spacing which approximately correlates to the energy output over time of certain nuclear reactors (for example, nuclear reactors having an energy output which decays at a rate of about 1/E). Curves 1960-1964, in FIG. 270, depict the required energy output for heater wellbores with spacing ranging from about 12 meters to about 14.4 meters. Spacing between heater wellbores greater than about 12 meters may require more energy input than certain nuclear reactors may be able to provide. Spacing between heater wellbores less than about 8 meters (for example, as represented by curve 1968 in FIG. 270) may not make efficient use of the energy input provided by certain nuclear reactors.

FIG. 271 depicts reservoir average temperature (° C.) (y-axis) versus time (days) (x-axis) of in situ hydrocarbon remediation for different spacings between wellbores. Curves 1960-1968 depict the temperature increase in the formation over time based upon the power input requirements for the well spacing. A target temperature for in situ remediation of hydrocarbon containing formations, in some embodiments, for example may be about 350° C. The target temperature for a formation may vary depending on, at least, the type of formation and/or the desired hydrocarbon products. The spacing between the wellbores for curves 1960-1968 in FIG. 271 are the same for curves 1960-1968 in FIG. 270. Curves 1960-1964, in FIG. 271, depict the increasing temperature in the formation over time for heater wellbores with spacing ranging from about 12 meters to about 14.4 meters. Spacing between heater wellbores greater than about 12 meters may heat the formation too slowly such that more energy may be required than certain nuclear reactors may be able to provide (especially after about 5 years in the current example). Spacing between heater wellbores less than about 8 meters (for example, as represented by curve 1968 in FIG. 271) may heat the formation too quickly for some in situ remediation situations. From the graph in FIG. 271, wellbore spacing represented by curve 1966 may be the spacing that achieves a typical target temperature of about 350° C. in a desirable time frame (for example, about 5 years).

In some embodiments, spacing between heater wellbores depends on a rate of decay of one or more nuclear reactors used to provide power. In some embodiments, spacing between heater wellbores ranges between about 8 meters and about 11 meters, between about 9 meters and about 10 meters, or between about 9.4 meters and about 9.8 meters.

In certain situations, it may be advantageous to continue a particular level of energy output of the self-regulating nuclear reactor for a longer period than the natural decay of the fuel material in the nuclear core would normally allow. In some embodiments, in order to keep the level of output within a desired range, a second self-regulating nuclear reactor may be coupled to the formation being treated (for example, being heated). The second self-regulating nuclear reactor may, in some embodiments, have a decayed energy output. The energy output of the second reactor may have already decreased due to prior use. The energy output of the two self-regulating nuclear reactors may be substantially equivalent to the initial energy output of the first self-regulating nuclear reactor and/or a desired energy output. Additional self-regulating nuclear reactors may be coupled to the formation as needed to achieve the desired energy output. Such a system may advantageously increase the effective useful lifetime of the self-regulating nuclear reactors.

The effective useful lifetime of self-regulating nuclear reactors may be extended by using the thermal energy produced by the nuclear reactor to produce steam which, depending upon the formation and/or systems used, may require far less thermal energy than other uses outlined herein. Steam may be used for a number of purposes including, but not limited to, producing electricity, producing hydrogen on site, converting hydrocarbons, and/or upgrading hydrocarbons. Hydrocarbons may be converted and/or mobilized in situ by injecting the produced steam in the formation.

A product stream (for example, including methane, hydrocarbons, and/or heavy hydrocarbons) may be produced from a formation heated with heat transfer fluids heated by the nuclear reactor. Steam produced from heat generated by the nuclear reactor or a second nuclear reactor may be used to reform at least a portion of the product stream. The product stream may be reformed to make at least some molecular hydrogen.

The molecular hydrogen may be used to upgrade at least a portion of the product stream. The molecular hydrogen may be injected in the formation. The product stream may be produced from a surface upgrading process. The product stream may be produced from an in situ heat treatment process. The product stream may be produced from a subsurface steam heating process.

At least a portion of the steam may be injected in a subsurface steam heating process. At least some of the steam may be used to reform methane. At least some of the steam may be used for electrical generation. At least a portion of the hydrocarbons in the formation may be mobilized.

In some embodiments, self-regulating nuclear reactors may be used to produce electricity (for example, via steam driven turbines). The electricity may be used for any number of applications normally associated with electricity. Specifically, the electricity may be used for applications associated with IUP and ICP requiring energy. Electricity from self-regulating nuclear reactors may be used to provide energy for downhole electric heaters.

Converting heat from self-regulating nuclear reactors into electricity may not be the most efficient use of the thermal energy produced by the nuclear reactors. In some embodiments, thermal energy produced by self-regulating nuclear reactors is used to directly heat portions of a formation. In some embodiments, one or more self-regulating nuclear reactors are positioned underground in the formation such that thermal energy produced directly heats at least a portion of the formation. One or more self-regulating nuclear reactors may be positioned underground in the formation below the overburden thus increasing the efficient use of the thermal energy produced by the self-regulating nuclear reactors. Self-regulating nuclear reactors positioned underground may be encased in a material for further protection. For example, self-regulating nuclear reactors positioned underground may be encased in a concrete container.

In some embodiments, thermal energy produced by self-regulating nuclear reactors may be extracted using heat transfer fluids. Thermal energy produced by self-regulating nuclear reactors may be transferred to and distributed through at least a portion of the formation using heat transfer fluids. Heat transfer fluids may circulate through the piping of the energy extraction system of the self-regulating nuclear reactor. As heat transfer fluids circulate in and through the core of the self-regulating nuclear reactor, the heat produced from the nuclear reaction heats the heat transfer fluids.

In some embodiments, two or more heat transfer fluids may be employed to transfer thermal energy produced by self-regulating nuclear reactors. A first heat transfer fluid may circulate through the piping of the energy extraction system of the self-regulating nuclear reactor. The first heat transfer fluid may pass through a heat exchanger and used to heat a second heat transfer fluid. The second heat transfer fluid may be used for treating hydrocarbon fluids in situ, powering electrolysis unit, and/or for other purposes. The first heat transfer fluid and the second heat transfer fluid may be different materials. Using two heat transfer fluids may reduce the risk of unnecessary exposure of systems and personnel to any radiation absorbed by the first heat transfer fluid. Heat transfer fluids that are resistant to absorbing nuclear radiation may be used (for example, nitrite salts, nitrate salts).

In some embodiments, the energy extraction system includes alkali metal (for example, potassium) heat pipes. Heat pipes may further simplify the self-regulating nuclear reactor by eliminating the need for mechanical pumps to convey a heat transfer fluid through the core. Any simplification of the self-regulating nuclear reactor may decrease the chances of any malfunctions and increase the safety of the nuclear reactor. The energy extraction system may include a heat exchanger coupled to the heat pipes. Heat transfer fluids may convey thermal energy from the heat exchanger.

Heat transfer fluids may include natural or synthetic oil, molten metal, molten salt, or other type of high temperature heat transfer fluid. The heat transfer fluid may have a low viscosity and a high heat capacity at normal operating conditions. When the heat transfer fluid is a molten salt or other fluid that has the potential to solidify in the formation, piping of the system may be electrically coupled to an electricity source to resistively heat the piping when needed and/or one or more heaters may be positioned in or adjacent to the piping to maintain the heat transfer fluid in a liquid state. In some embodiments, an insulated conductor heater is placed in the piping. The insulated conductor may melt solids in the pipe.

In some embodiments, heat transfer fluids include molten salts. Molten salts function well as heat transfer fluids due to their typically stable nature as a solid and a liquid, their relatively high heat capacity, and unlike water, their lack of expansion when they solidify. Molten salts have a fairly high melting point and typically a large range over which the salt is liquid before it reaches a temperature high enough to decompose. Due to the wide variety of salts, a salt with a desirable temperature range may be found. If necessary, a mixture of different salts may be used in order to achieve a molten salt mixture with the appropriate properties (for example, an appropriate temperature range).

In some embodiments, the molten salt includes a nitrite salt or a combination of nitrite salts. Examples of different nitrite salts may include lithium, sodium, and/or potassium nitrite salts. The molten salt may include about 15 to about 50 wt. % potassium nitrite salts and about 50 to about 80 wt. % sodium nitrite salts. The molten salt may include a nitrate salt or a combination of nitrate salts. Examples of different nitrate salts may include lithium, sodium, and/or potassium nitrate salts. The molten salt may include about 15 to about 60 wt. % potassium nitrate salts and about 40 to about 80 wt. % sodium nitrate salts. The molten salt may include a mixture of nitrite and nitrate salts. In some embodiments, the molten salt may include HITEC and/or HITEC XL which are available from Coastal Chemical Co., L.L.C. located in Abbeville, La., U.S.A. HITEC may include a eutectic mixture of sodium nitrite, sodium nitrate, and potassium nitrate. HITEC may include a recommended operating temperature range of between about 149° C. and about 538° C. HITEC XL may include a eutectic mixture of calcium nitrate, sodium nitrate, and potassium nitrate. In some embodiments, a manufacturing facility may be used to convert nitrite salts to nitrate salts and/or nitrate salts to nitrite salts.

In some embodiments, the molten salt includes a customized mixture of different salts that achieve a desirable temperature range. A desirable temperature range may be dependent upon the formation and/or material being heated with the molten salt. TABLE 2 depicts ranges of different mixtures of nitrate salts. TABLE 2 demonstrates how varying a ratio of a mixture of different salts may affect the salt's usable temperature range as a heat transfer fluid. For example, a lithium doped nitrate salt mixture (for example, Li:Na:K:$NO_3$) has several advantages over the non lithium doped nitrate salt mixture (for example, Na:K:$NO_3$). The Li:Na:K:$NO_3$ salt mixture may offer a large operating temperature range. The Li:Na:K:$NO_3$ salt mixture may have a lower melting point, which reduces the preheating requirements.

TABLE 2

| $NO_3$ Salts | Composition (wt. %) | Melting Point (° C.) | Upper Limit (° C.) |
|---|---|---|---|
| Na:K | 60:40 | 230 | 565 |
| Li:Na:K | 12:18:70 | 200 | 550 |
| Li:Na:K | 20:28:52 | 150 | 550 |
| Li:Na:K | 27:33:40 | 160 | 550 |
| Li:Na:K | 30:18:52 | 120 | 550 |

In some embodiments, pressurized hot water is used to preheat the piping in heater wellbores such that molten salts may be used. Preheating piping in heater wellbores (for example, to at least approximate the melting point of the molten salt to be used) may inhibit molten salts from freezing and occluding the piping when the molten salt is first circulated through the piping. Piping in the heater wellbore may be preheated using pressurized hot water (for example, water at about 120° C. pressurized to about 15 psi). The piping may be heated until at least a majority of the piping reaches a temperature approximate to the circulating hot water temperature. In some embodiments, the hot water is flushed from the piping with air after the piping has been heated to the desired temperature. A preheated molten salt (for example, Li:Na:K:$NO_3$) may then be circulated through the piping in the heater wellbores to achieve the desired temperature.

In some embodiments, a salt (for example, Li:Na:K:$NO_3$) is dissolved in water to form a salt solution before circulating the salt through piping in heater wellbores. Dissolving the salt in water may reduce the freezing point (for example, from about 120° C. to about 0° C.) Such that the salt may be safely circulated through the piping with little fear of the salt freezing and obstructing the piping. The salt solution, in some embodiments, is preheated (for example, to about 90° C.) before circulating the solution through the piping in heater wellbores. The salt solution may be heated at an elevated pressure (for example, greater than about 15 psi) to above the water's boiling point. As the salt solution is heated to about 120° C., the water from the solution may evaporate. The evaporating water may be allowed to vent from the heat transfer fluid circulation system. Eventually, only the anhydrous molten salt remains to heat the formation.

In some embodiments, preheating of piping in heater wellbores is accomplished by a heat trace (for example, an electric heat trace). The heat trace may be accomplished by using a cable and/or running current directly through the pipe. In some embodiments, a relatively thin conductive layer is used to provide the majority of the electrically resistive heat output of the temperature limited heater at temperatures up to a temperature at or near the Curie temperature and/or the phase transformation temperature range of the ferromagnetic conductor. Such a temperature limited heater may be used as the heating member in an insulated conductor heater. The heating member of the insulated conductor heater may be located inside a sheath with an insulation layer between the sheath and the heating member.

FIG. 272 depicts a schematic representation of an embodiment of an in situ heat treatment system positioned in formation 524 with u-shaped wellbores 1950 using self-regulating nuclear reactors 1934. Self-regulating nuclear reactors 1934, depicted in FIG. 272, may produce about 70 MWth. In some embodiments, spacing between wellbores 1950 is determined based on the decay rate of the energy output of self-regulating nuclear reactors 1934.

U-shaped wellbores may run down through overburden 482 and into hydrocarbon containing layer 484. The piping in wellbores 1950 adjacent to overburden 482 may include insulated portion 1082. Insulated storage tanks 1952 may receive molten salt from the formation 524 through piping 1954. Piping 1954 may transport molten salts with temperatures ranging from about 350° C. to about 500° C. Temperatures in the storage tanks may be dependent on the type of molten salt used. Temperatures in the storage tanks may be in the vicinity of about 350° C. Pumps may move the molten salt to self-regulating nuclear reactors 1934 through piping 1956. Each of the pumps may need to move 6 kg/sec to 12 kg/sec of the molten salt. Each self-regulating nuclear reactor 1934 may provide heat to the molten salt. The molten salt may pass from piping 1958 to wellbores 1950. The heated portion of wellbore 1950 which passes through layer 484 may extend, in some embodiments, from about 8,000 feet to about 10,000 feet. Exit temperatures of the molten salt from self-regulating nuclear reactors 1934 may be about 550° C. Each self-regulating nuclear reactor 1934 may supply molten salt to about 20 or more wellbores 1950 that enter into the formation. The molten salt flows through the formation and back to storage tanks 1952 through piping 1954.

In some embodiments, nuclear energy is used in a cogeneration process. In an embodiment for producing hydrocarbons from a hydrocarbon containing formation (for example, a tar sands formation), produced hydrocarbons may include one or more portions with heavy hydrocarbons. Hydrocarbons may be produced from the formation using more than one process. In certain embodiments, nuclear energy is used to assist in producing at least some of the hydrocarbons. At least some of the produced heavy hydrocarbons may be subjected to pyrolysis temperatures. Pyrolysis of the heavy hydrocarbons may be used to produce steam. Steam may be used for a number of purposes including, but not limited to, producing electricity, converting hydrocarbons, and/or upgrading hydrocarbons.

In some embodiments, a heat transfer fluid is heated using a self-regulating nuclear reactor. The heat transfer fluid may be heated to temperatures that allow for steam production (for example, from about 550° C. to about 600° C.). In some embodiments, in situ heat treatment process gas and/or fuel passes to a reformation unit. In some embodiments, in situ heat treatment process gas is mixed with fuel and then passed to the reformation unit. A portion of in situ heat treatment process gas may enter a gas separation unit. The gas separation unit may remove one or more components from the in situ heat treatment process gas to produce the fuel and one or more other streams (for example, carbon dioxide, hydrogen sulfide). The fuel may include, but is not limited to, hydrogen, hydrocarbons having a carbon number of at most 5, or mixtures thereof.

The reformer unit may be a steam reformer. The reformer unit may combine steam with a fuel (for example, methane) to produce hydrogen. For example, the reformation unit may include water gas shift catalysts. The reformation unit may include one or more separation systems (for example, membranes and/or a pressure swing adsorption system) capable of separating hydrogen from other components. Reformation of the fuel and/or the in situ heat treatment process gas may produce a hydrogen stream and a carbon oxide stream. Reformation of the fuel and/or the in situ heat treatment process gas may be performed using techniques known in the art for catalytic and/or thermal reformation of hydrocarbons to produce hydrogen. In some embodiments, electrolysis is used to produce hydrogen from the steam. A portion or all of the hydrogen stream may be used for other purposes such as, but not limited to, an energy source and/or a hydrogen source for in situ or ex situ hydrogenation of hydrocarbons.

Self-regulating nuclear reactors may be used to produce hydrogen at facilities located adjacent to hydrocarbon containing formations. The ability to produce hydrogen on site at hydrocarbon containing formations is highly advantageous due to the plurality of ways in which hydrogen is used for converting and upgrading hydrocarbons on site at hydrocarbon containing formations.

In some embodiments, the first heat transfer fluid is heated using thermal energy stored in the formation. Thermal energy in the formation may be the result of a number of different remediation methods.

Self-regulating nuclear reactors have been discussed for uses associated with in situ hydrocarbon remediation, and self-regulating nuclear reactors do have several advantages over many current constant output nuclear reactors. However, there are several new nuclear reactors whose designs have received regulatory approval for construction. Nuclear energy may be provided by a number of different types of available nuclear reactors and nuclear reactors currently under development (for example, generation IV reactors).

In some embodiments, nuclear reactors include very high temperature reactors (VHTR). VHTRs may use, for example, helium as a coolant to drive a gas turbine for treating hydrocarbon fluids in situ, powering an electrolysis unit, and/or for other purposes. VHTRs may produce heat up to about 950° C. or more. In some embodiments, nuclear reactors include a sodium-cooled fast reactor (SFR). SFRs may be designed on a smaller scale (for example, 50 MWe) and therefore may be more cost effective to manufacture on site for treating hydrocarbon fluids in situ, powering electrolysis units, and/or for other purposes. SFRs may be of a modular design and potentially portable. SFRs may produce temperatures ranging between about 500° C. and about 600° C., between about 525° C. and about 575° C., or between 540° C. and about 560° C.

In some embodiments, pebble bed reactors are employed to provide thermal energy. Pebble bed reactors may produce up to 165 MWe. Pebble bed reactors may produce temperatures ranging between about 500° C. and about 1100° C., between about 800° C. and about 1000° C., or between about 900° C. and about 950° C. In some embodiments, nuclear reactors include supercritical-water-cooled reactors (SCWR) based at least in part on previous light water reactors (LWR) and supercritical fossil-fired boilers. SCWRs may produce temperatures ranging between about 400° C. and about 650° C., between about 450° C. and about 550° C., or between about 500° C. and about 550° C.

In some embodiments, nuclear reactors include lead-cooled fast reactors (LFR). LFRs may be manufactured in a range of sizes, from modular systems to several hundred megawatt or more sized systems. LFRs may produce temperatures ranging between about 400° C. and about 900° C., between about 500° C. and about 850° C., or between about 550° C. and about 800° C.

In some embodiments, nuclear reactors include molten salt reactors (MSR). MSRs may include fissile, fertile, and fission isotopes dissolved in a molten fluoride salt with a boiling point of about 1,400° C. The molten fluoride salt may function as both the reactor fuel and the coolant. MSRs may produce temperatures ranging between about 400° C. and about 900° C., between about 500° C. and about 850° C., or between about 600° C. and about 800° C.

In some embodiments, two or more heat transfer fluids (for example, molten salts) are employed to transfer thermal energy to and/or from a hydrocarbon containing formation. A first heat transfer fluid may be heated (for example, with a nuclear reactor). The first heat transfer fluid may be circulated through a plurality of wellbores in at least a portion of the formation in order to heat the portion of the formation. The first heat transfer fluid may have a first temperature range in which the first heat transfer fluid is in a liquid form and stable. The first heat transfer fluid may be circulated through the portion of the formation until the portion reaches a desired temperature range (for example, a temperature towards an upper end of the first temperature range).

A second heat transfer fluid may be heated (for example, with a nuclear reactor). The first heat transfer fluid may have a second temperature range in which the second heat transfer fluid is in a liquid form and stable. An upper end of the second temperature range may be hotter and above the first temperature range. A lower end of the second temperature range may overlap with the first temperatures range. The second heat transfer fluid may be circulated through the plurality of wellbores in the portion of the formation in order to heat the portion of the formation to a higher temperature than is possible with the first heat transfer fluid.

The advantages of using two or more different heat transfer fluids may include, for example, the ability to heat the portion of the formation to a much higher temperature than is normally possible while using other supplementary heating methods as little as possible to increase overall efficiency (for example, electric heaters). Using two or more different heat transfer fluids may be necessary if a heat transfer fluid with a large enough temperature range capable of heating the portion of the formation to the desired temperature is not available.

In some embodiments, after the portion of the hydrocarbon containing formation has been heated to a desired temperature range, the first heat transfer fluid may be recirculated through the portion of the formation. The first heat transfer fluid may not be heated before recirculation through the formation (other than heating the heat transfer fluid to the melting point if necessary in the case of molten salts). The first heat transfer fluid may be heated using the thermal energy already stored in the portion of the formation from prior attempts at hydrocarbon remediation. The first heat transfer fluid may then be transferred out of the formation such that the thermal energy recovered by the first heat transfer fluid may be reused for some other process in the portion of the formation, in a second portion of the formation, and/or in an additional formation.

In some in situ heat treatment embodiments, compressors provide compressed gases to the treatment area. For example, compressors may be used to provide oxidizing fluid 806 and/or fuel 810 to a plurality of oxidizer assemblies like oxidizer assembly 612 depicted in FIG. 197. Each oxidizer assembly 612 may include a number of oxidizers 614. Oxidizers 614 may burn a mixture of oxidizing fluid 806 and fuel 810 to produce heat that heats the treatment area in the formation. Also, compressors 1000 may be used to supply gas phase heat transfer fluid to the formation as depicted in FIG. 238. In some embodiments, pumps provide liquid phase heat transfer fluid to the treatment area.

A significant cost of the in situ heat treatment process may be operating the compressors and/or pumps over the life of the in situ heat treatment process if conventional electrical energy sources are used to power the compressors and/or pumps of the in situ heat treatment process. In some embodiments, nuclear power may be used to generate electricity that operates the compressors and/or pumps needed for the in situ heat treatment process. The nuclear power may be supplied by one or more nuclear reactors. The nuclear reactors may be light water reactors, pebble bed reactors, and/or other types of nuclear reactors. The nuclear reactors may be located at or near to the in situ heat treatment process site. Locating the nuclear reactors at or near to the in situ heat treatment process site may reduce equipment costs and electrical transmission losses over long distances. The use of nuclear power may reduce or eliminate the amount of carbon dioxide generation associated with operating the compressors and/or pumps over the life of the in situ heat treatment process.

Excess electricity generated by the nuclear reactors may be used for other in situ heat treatment process needs. For example, excess electricity may be used to cool fluid for forming a low temperature barrier (frozen barrier) around treatment areas, and/or for providing electricity to treatment facilities located at or near the in situ heat treatment process site. In some embodiments, the electricity or excess electricity produced by the nuclear reactors may be used to resistively heat the conduits used to circulate heat transfer fluid through the treatment area.

In some embodiments, excess heat available from the nuclear reactors may be used for other in situ processes. For example, excess heat may be used to heat water or make steam that is used in solution mining processes. In some embodiments, excess heat from the nuclear reactors may be used to heat fluids used in the treatment facilities located near or at the in situ heat treatment site.

In some embodiments, geothermal energy may be used to heat or preheat a treatment area of an in situ heat treatment process or a treatment area to be solution mined. Geothermal energy may have little or no carbon dioxide emissions. In some embodiments, geothermally heated fluid may be produced from a layer or layers located below or near the treatment area. The geothermally heated fluid includes, but is not limited to, steam, water, and/or brine. One or more of the layers may be geothermally pressurized geysers. Geothermally heated fluid may be pumped from one or more of the layers. The layer or layers may be at least 2 km, at least 4 km, at least 8 km or more below the surface. The geothermally heated fluid may be at a temperature of at least 100° C., at least 200° C., or at least 300° C.

The geothermally heated fluid may be produced and circulated through piping in the treatment area to raise the temperature of the treatment area. In some embodiments, the geothermally heated fluid is introduced directly into the treatment area. In some embodiments, the geothermally heated fluid is circulated through the treatment area or piping in the treatment area without being produced to the surface and re-introduced into the treatment area. In some embodiments, the geothermally heated fluid may be produced from a location near the treatment area. The geothermally heated fluid may be transported to the treatment area. Once transported to the treatment area, the geothermally heated fluid is circulated through piping in the treatment area and/or the geothermally heated fluid is introduced directly into the treatment area.

In some embodiments, geothermally heated fluid produced from a layer or layers is used to solution mine minerals from the formation. The geothermally heated fluid may be used to raise the temperature of the formation to a temperature below the dissociation temperature of the minerals, but to a temperature high enough to increase the amount of mineral going into solution in a first fluid introduced into the formation. The geothermally heated fluid may be introduced directly into the formation as all or a portion of the first fluid, and/or the geothermally heated fluid may be circulated through piping in the formation.

In some embodiments, geothermally heated fluid produced from a layer or layers may be used to heat the treatment area before using electrical heaters, gas burners, or other types of heat sources to heat the treatment area to pyrolysis temperatures. The geothermally heated fluid may not be at a temperature sufficient to raise the temperature of the treatment area to pyrolysis temperatures. Using the geothermally heated fluid to heat the treatment area before using electrical heaters or other heat sources to heat the treatment area to pyrolysis temperatures may reduce energy costs for the in situ heat treatment process.

In some embodiments, hot dry rock technology may be used to produce steam or other hot heat transfer fluid from a deep portion of the formation. Injection wells may be drilled to a depth where the formation is hot. The injection wells may be at least 2 km, at least 4 km, or at least 8 km deep. Sections of the formation adjacent to the bottom portions of the injection wells may be hydraulically, or otherwise fractured, to provide large contact area with the formation and/or to provide flow paths to heated fluid production wells. Water, steam and/or other heat transfer fluid (for example, a synthetic oil or a natural oil) may be introduced into the formation through the injection wells. Heat transfers to the introduced fluid from the formation. Steam and/or hot heat transfer fluid may be produced from the heated fluid production wells. In some embodiments, the steam and/or hot heat transfer fluid is directed into the treatment area from the production wells without first producing the steam and/or hot heat transfer fluid to the surface. The steam and/or hot heat transfer fluid may be used to heat a portion of a hydrocarbon containing formation above the deep hot portion of the formation.

In some embodiments, steam produced from heated fluid production wells may be used as the steam for a drive process (for example, a steam flood process or a steam assisted gravity drainage process). In some embodiments, steam or other hot heat transfer fluid produced through heated fluid production wells is passed through U-shaped wellbores or other types of wellbores to provide initial heating to the formation. In some embodiments, cooled steam or water, or cooled heat transfer fluid, resulting from the use of the steam and/or heat transfer fluid from the hot portion of the formation may be collected and sent to the hot portion of the formation to be reheated.

In certain embodiments, a controlled or staged in situ heating and production process is used to in situ heat treat a hydrocarbon containing formation (for example, an oil shale formation). The staged in situ heating and production process may use less energy input to produce hydrocarbons from the formation than a continuous or batch in situ heat treatment process. In some embodiments, the staged in situ heating and production process is about 30% more efficient in treating the formation than the continuous or batch in situ heat treatment process. The staged in situ heating and production process may also produce less carbon dioxide emissions than a continuous or batch in situ heat treatment process. In certain embodiments, the staged in situ heating and production process is used to treat rich layers in the oil shale formation. Treating only the rich layers may be more economical than treating both rich layers and lean layers because heat may be wasted heating the lean layers.

FIG. 273 depicts a top view representation of an embodiment for the staged in situ heating and producing process for treating the formation. In certain embodiments, heaters 438 are arranged in triangular patterns. In other embodiments, heaters 438 are arranged in any other regular or irregular patterns. The heater patterns may be divided into one or more sections 1046, 1048, 1050, 1052, and/or 1054. The number of heaters 438 in each section may vary depending on, for example, properties of the formation or a desired heating rate for the formation. One or more production wells 206 may be located in each section 1046, 1048, 1050, 1052, and/or 1054. In certain embodiments, production wells 206 are located at or near the centers of the sections. In some embodiments, production wells 206 are in other portions of sections 1046, 1048, 1050, 1052, and 1054. Production wells 206 may be located at other locations in sections 1046, 1048, 1050, 1052, and/or 1054 depending on, for example, a desired quality of products produced from the sections and/or a desired production rate from the formation.

In certain embodiments, heaters 438 in one of the sections are turned on while the heaters in other sections remain turned off. For example, heaters 438 in section 1046 may be turned on while the heaters in the other sections are left turned off. Heat from heaters 438 in section 1046 may create permeability, mobilize fluids, and/or pyrolysis fluids in section 1046. While heat is being provided by heaters 438 in section 1046, production wells 206 in section 1048 may be opened to produce fluids from the formation. Some heat from heaters 438 in section 1046 may transfer to section 1048 and "pre-heat" section 1048. The pre-heating of section 1048 may create permeability in section 1048, mobilize fluids in section 1048, and allow fluids to be produced from the section through production wells 206.

In certain embodiments, portions of section 1048 proximate production wells 206, however, are not heated by conductive heating from heaters 438 in section 1046. For example, the superposition of heat from heaters 438 in section 1046 does not overlap the portion proximate production wells 206 in section 1048. The portion proximate production wells 206 in section 1048 may be heated by fluids (such as hydrocarbons) flowing to the production well (for example, by convective heat transfer from the fluids).

As fluids are produced from section 1048, the movement of fluids from section 1046 to section 1048 transfers heat between the sections. The movement of the hot fluids through the formation increases heat transfer within the formation. Allowing hot fluids to flow between the sections uses the energy of the hot fluids for heating of unheated sections rather than removing the heat from the formation by producing the hot fluids directly from section 1046. Thus, the movement of the hot fluids allows for less energy input to get production from the formation than is required if heat is provided from heaters 438 in both sections to get production from the sections.

In certain embodiments, the temperature of the portion proximate production well 206 in section 1048 is controlled so that the temperature in the portion is at most a selected temperature. For example, the temperature in the portion proximate the production well may be controlled so that the temperature is at most about 100° C., at most about 200° C., or at most about 250° C. In some embodiments, the temperature of the portion proximate production well 206 in section 1048 is controlled by controlling the production rate of fluids through the production well. In some embodiments, producing more fluids increases heat transfer to the production well and the temperature in the portion proximate the production well.

In some embodiments, production through production wells 206 in section 1048 is reduced or turned off after the portions proximate the production wells reach the selected temperature. Reducing or turning off production through the production wells at higher temperatures keeps heated fluids in the formation. Keeping the heated fluids in the formation keeps energy in the formation and reduces the energy input needed to heat the formation. The selected temperature at which production is reduced or turned off may be, for example, about 100° C., about 200° C., or about 250° C.

In some embodiments, section 1046 and/or section 1048 may be treated prior to turning on heaters 438 to increase the permeability in the sections. For example, the sections may be dewatered to increase the permeability in the sections. In some embodiments, steam injection or other fluid injection may be used to increase the permeability in the sections.

In certain embodiments, after a selected time, heaters 438 in section 1048 are turned on. Turning on heaters 438 in section 1048 may provide additional heat to sections 1046, 1048 and 1050 to increase the permeability, mobility, and/or pyrolysis of fluids in these sections. In some embodiments, as heaters 438 in section 1048 are turned on, production in section 1048 is reduced or turned off (shut down) and production wells 206 in section 1050 are opened to produce fluids from the formation. Thus, fluid flows in the formation towards production wells 206 in section 1050, and section 1050 is heated by the flow of hot fluids as described above for section 1048. In some embodiments, production wells 206 in section 1048 may be left open after the heaters are turned on in the section, if desired. In some embodiments, production in section 1048 is reduced or turned off at the selected temperature, as described above.

The process of reducing or turning off heaters and shifting production to adjacent sections may be repeated for subsequent sections in the formation. For example, after a selected time, heaters in section 1050 may be turned on and fluids are produced from production wells 206 in section 1052 and so on through the formation.

In some embodiments, heat is provided by heaters 438 in alternating sections (for example, sections 1046, 1050, and 1054) while fluids are produced from the sections in between the heated sections (for example, sections 1048 and 1052). After a selected time, heaters 438 in the unheated sections (sections 1048 and 1052) are turned on and fluids are produced from one or more of the sections as desired.

In certain embodiments, a smaller heater spacing is used in the staged in situ heating and producing process than in the continuous or batch in situ heat treatment processes. For example, the continuous or batch in situ heat treatment process may use a heater spacing of about 12 m while the in situ staged heating and producing process uses a heater spacing of about 10 m. The staged in situ heating and producing process may use the smaller heater spacing because the staged process allows for relatively rapid heating of the formation and expansion of the formation.

In some embodiments, the sequence of heated sections begins with the outermost sections and moves inwards. For example, for a selected time, heat may be provided by heaters 438 in sections 1046 and 1054 as fluids are produced from sections 1048 and 1052. After the selected time, heaters 438 in sections 1048 and 1052 may be turned on and fluids are produced from section 1050. After another selected amount of time, heaters 438 in section 1050 may be turned on, if needed.

In certain embodiments, sections 1046-1054 are substantially equal sized sections. The size and/or location of sections 1046-1054 may vary based on desired heating and/or production from the formation. For example, simulation of the staged in situ heating and production process treatment of the formation may be used to determine the number of heaters in each section, the optimum pattern of sections and/or the sequence for heater power up and production well startup for the staged in situ heating and production process. The simulation may account for properties such as, but not limited to, formation properties and desired properties and/or quality in the produced fluids. In some embodiments, heaters 438 at the edges of the treated portions of the formation (for example, heaters 438 at the left edge of section 1046 or the right edge of section 1054) may have tailored or adjusted heat outputs to produce desired heat treatment of the formation.

In some embodiments, the formation is sectioned into a checkerboard pattern for the staged in situ heating and production process. FIG. 274 depicts a top view of rectangular checkerboard pattern 1056 for the staged in situ heating and production process. In some embodiments, heaters in the "A" sections (sections 1046A, 1048A, 1050A, 1052A, and 1054A) may be turned on and fluids are produced from the "B" sections (sections 1046B, 1048B, 1050B, 1052B, and 1054B). After the selected time, heaters in the "B" sections may be turned on. The size and/or number of "A" and "B" sections in rectangular checkerboard pattern 1056 may be varied depending on factors such as, but not limited to, heater spacing, desired heating rate of the formation, desired production rate, size of treatment area, subsurface geomechanical properties, subsurface composition, and/or other formation properties.

In some embodiments, heaters in sections 1046A are turned on and fluids are produced from sections 1046B and/or sections 1048B. After the selected time, heaters in sections 1048A may be turned on and fluids are produced from sections 1048B and/or 1050B. After another selected time, heaters in sections 1050A may be turned on and fluids are produced from sections 1050B and/or 1052B. After another selected time, heaters in sections 1052A may be turned on and fluids are produced from sections 1052B and/or 1054B. In some embodiments, heaters in a "B" section that has been produced from may be turned on when heaters in the subsequent "A" section are turned on. For example, heaters in section 1046B may be turned on when the heaters in section 1048A are turned on. Other alternating heater startup and production sequences may also be contemplated for the in situ staged heating and production process embodiment depicted in FIG. 274.

In some embodiments, the formation is divided into a circular, ring, or spiral pattern for the staged in situ heating and production process. FIG. 275 depicts a top view of the ring pattern embodiment for the staged in situ heating and production process. Sections 1046, 1048, 1050, 1052, and 1054 may be treated with heater startup and production sequences similar to the sequences described above for the embodiments depicted in FIGS. 273 and 274. The heater startup and production sequences for the embodiment depicted in FIG. 275 may start with section 1046 (going inwards towards the center) or with section 1054 (going outwards from the center). Starting with section 1046 may allow expansion of the formation as heating moves towards the center of the ring pattern. Shearing of the formation may be minimized or inhibited because the formation is allowed to expand into heated and/or pyrolyzed portions of the formation. In some embodiments, the center section (section 1054) is cooled after treatment.

FIG. 276 depicts a top view of a checkerboard ring pattern embodiment for the staged in situ heating and production process. The embodiment depicted in FIG. 276 divides the ring pattern embodiment depicted in FIG. 275 into a checkerboard pattern similar to the checkerboard pattern depicted in FIG. 274. Sections 1046A, 1048A, 1050A, 1052A, 1054A, 1046B, 1048B, 1050B, 1052B, and 1054B, depicted in FIG. 276, may be treated with heater startup and production sequences similar to the sequences described above for the embodiment depicted in FIG. 274.

In some embodiments, fluids are injected to drive fluids between sections of the formation. Injecting fluids such as steam or carbon dioxide may increase the mobility of hydrocarbons and may increase the efficiency of the staged in situ heating and production process. In some embodiments, fluids are injected into the formation after the in situ heat treatment process to recover heat from the formation. In some embodiments, the fluids injected into the formation for heat recovery include some fluids produced from the formation (for example, carbon dioxide, water, and/or hydrocarbons produced from the formation). The embodiments depicted in FIGS. 273-276 may be used for in situ solution mining of the formation. Hot water or another fluid may be used to get permeability in the formation at low temperatures for solution mining.

In certain embodiments, several rectangular checkerboard patterns (for example, rectangular checkerboard pattern 1056 depicted in FIG. 274) are used to treat a treatment area of the formation. FIG. 277 depicts a top view of a plurality of rectangular checkerboard patterns 1056(1-36) in treatment area 1028 for the staged in situ heating and production process. Treatment area 1028 may be enclosed by barrier 1058. Each of rectangular checkerboard patterns 1056(1-36) may individually be treated according to embodiments described above for the rectangular checkerboard patterns.

In certain embodiments, the startup of treatment of rectangular checkerboard patterns 1056(1-36) proceeds in a sequential process. The sequential process may include starting the treatment of each of the rectangular checkerboard patterns one by one sequentially. For example, treatment of a second rectangular checkerboard pattern (for example, the onset of heating of the second rectangular checkerboard pattern) may be started after treatment of a first rectangular checkerboard pattern and so on. The startup of treatment of the second rectangular checkerboard pattern may be at any point in time after the treatment of the first rectangular checkerboard pattern has begun. The time selected for startup of treatment of the second rectangular checkerboard pattern may be varied depending on factors such as, but not limited to, desired heating rate of the formation, desired production rate, subsurface geomechanical properties, subsurface composition, and/or other formation properties. In some embodiments, the startup of treatment of the second rectangular checkerboard pattern begins after a selected amount of fluids have been produced from the first rectangular checkerboard pattern area or after the production rate from the first rectangular checkerboard pattern increases above a selected value or falls below a selected value.

In some embodiments, the startup sequence for rectangular checkerboard patterns 1056(1-36) is arranged to minimize or inhibit expansion stresses in the formation. In an embodiment, the startup sequence of the rectangular checkerboard patterns proceeds in an outward spiral sequence, as shown by the arrows in FIG. 277. The outward spiral sequence proceeds sequentially beginning with treatment of rectangular checkerboard pattern 1056-1, followed by treatment of rectangular checkerboard pattern 1056-2, rectangular checkerboard pattern 1056-3, rectangular checkerboard pattern 1056-4, and continuing the sequence up to rectangular checkerboard pattern 1056-36. Sequentially starting the rectangular checkerboard patterns in the outwards spiral sequence may minimize or inhibit expansion stresses in the formation.

Starting treatment in rectangular checkerboard patterns at or near the center of treatment area 1028 and moving outwards maximizes the starting distance from barrier 1058. Barrier 1058 may be most likely to fail when heat is provided at or near the barrier. Starting treatment/heating at or near the center of treatment area 1028 delays heating of rectangular checkerboard patterns near barrier 1058 until later times of heating in treatment area 1028 or at or near the end of production from the treatment area. Thus, if barrier 1058 does fail, the failure of the barrier occurs after a significant portion of treatment area 1028 has been treated.

Starting treatment in rectangular checkerboard patterns at or near the center of treatment area 1028 and moving outwards also creates open pore space in the inner portions of the outward moving startup pattern. The open pore space allows portions of the formation being started at later times to expand inwards into the open pore space and, for example, minimize shearing in the formation.

In some embodiments, support sections are left between one or more rectangular checkerboard patterns 1056(1-36). The support sections may be unheated sections that provide support against geomechanical shifting, shearing, and/or expansion stress in the formation. In some embodiments, some heat may be provided in the support sections. The heat provided in the support sections may be less than heat provided inside rectangular checkerboard patterns 1056(1-36). In some embodiments, each of the support sections may include alternating heated and unheated sections. In some embodiments, fluids are produced from one or more of the unheated support sections.

In some embodiments, one or more of rectangular checkerboard patterns 1056(1-36) have varying sizes. For example, the outer rectangular checkerboard patterns (such as rectangular checkerboard patterns 1056(21-26) and rectangular checkerboard patterns 1056(31-36)) may have smaller areas and/or numbers of checkerboards. Reducing the area and/or the number of checkerboards in the outer rectangular checkerboard patterns may reduce expansion stresses and/or geomechanical shifting in the outer portions of treatment area 1028. Reducing the expansion stresses and/or geomechanical shifting in the outer portions of treatment area 1028 may minimize or inhibit expansion stress and/or shifting stress on barrier 1058.

In certain embodiments, heat sources (for example, heaters) have uneven or irregular spacing in a heater pattern. For example, the space between heat sources in the heater pattern varies or the heat sources are not evenly distributed in the heater pattern. In certain embodiments, the space between heat sources in the heater pattern decreases as the distance from the production well at the center of the pattern increases. Thus, the density of heat sources (number of heat sources per square area) increases as the heat sources get more distant from the production well.

In some embodiments, heat sources are evenly spaced (equally spaced or evenly distributed) in the heater pattern but have varying heat outputs such that the heat sources provide an uneven or varying heat distribution in the heater pattern. Varying the heat output of the heat sources may be used to, for example, effectively mimic having heat sources with varying spacing in the heater pattern. For example, heat sources closer to the production well at the center of the heater pattern may provide lower heat outputs than heat sources at further distances from the production well. The heater outputs may be varied such that the heater outputs gradually increase as the heat sources increase in distance from the production well.

In certain embodiments, the uneven or irregular spacing of heat sources is based on regular geometric patterns. For example, the irregular spacing of heat sources may be based on a hexagonal, triangular, square, octagonal, other geometric combinations, and/or combinations thereof. In some embodiments, heat sources are placed at irregular intervals along one or more of the geometric patterns to provide the irregular spacing. In some embodiments, the heat sources are placed in an irregular geometric pattern. In some embodiments, the geometric pattern has irregular spacing between rows in the pattern to provide the irregular spacing of heat sources.

FIG. 278 depicts an embodiment of irregular spaced heat sources 202 with the heater density increasing as distance from production well 206 increases. In certain embodiments, production well 206 is located at or near the center of the pattern of heat sources 202. In certain embodiments, heat sources 202 are heaters (for example, electric heaters). FIG. 278 depicts an embodiment of irregular spaced heat sources in a hexagonal pattern. FIG. 279 depicts an embodiment of an irregular spaced triangular pattern. FIG. 280 depicts an embodiment of irregular spaced square pattern. Heat sources may be placed at desired locations along the rows depicted in FIG. 279 and FIG. 280. It is to be understood that the heat sources may be placed in any regular or irregular geometric pattern in the formation. Heat sources may be arranged in any regular or irregular geometric pattern (for example, regular or irregular triangle, regular or irregular hexagonal, regular or irregular rectagonal, circular, oval, elliptical, or combinations thereof) as long as the heat source density increases as distance from the production well increases. In some embodiments, the heat sources are spaced asymmetrically around the production well with the heat source density increasing as the distance from the production well increases. The irregular patterns of heat sources may be a pattern of vertical (or substantially vertical) heat sources in a formation or a pattern of horizontal (or substantially horizontal) heat sources in the formation.

As shown in FIG. 278, heat sources 202 are represented by solid squares in rows A, B, C, and D. Rows A, B, C, and D may be triangular and/or hexagonal rows (or rows in other shapes) of heat sources that have decreasing space between the rows as the rows move away from production well 206. Heat sources 202 may be distributed regularly or irregularly in rows A, B, C, and D (for example, the heaters may have equal or non-equal spacing in the rows). In certain embodiments, heat sources are placed in the rows such that the density of heat sources increases as the heat sources are further distanced away from production well 206. Thus, the heat output from the heat sources per volume of formation increases with distance from the production well.

In certain embodiments, the irregular pattern of heat sources has the same number of heat sources per production well as a regular pattern of heat sources but with heat source spacing that decreases with increasing distance from the production well. The decreasing heat source spacing increases the heat input into the formation per volume of formation as the distance from the production well increases. FIG. 281 depicts an embodiment of a regular pattern of equally spaced rows of heat sources. The embodiments depicted in FIGS.

278 and 281 each have a pattern ratio of 16 heat sources 202 to one production well 206 (for example, 12 (from rows A, B, C)+1 (from the three heat sources at the vertices of row D because each of these heat sources supplies heat to three patterns)+3 (from the 6 heat sources located in row D between the vertices because each of these heat sources supplies heat to two patterns)). The heater/producer ratio for both embodiments is 16:1 and the total heat input into the formation per volume of formation in the pattern is substantially equal (assuming equal and constant heat source outputs). The spacing between heat sources in the embodiment depicted in FIG. 278, however, is different than the spacing between heat sources in the embodiment depicted in FIG. 281. Thus, the average heat input per volume of formation increases with increasing distance from the production well in the embodiment depicted in FIG. 278 while the average heat input per volume of formation is substantially uniform throughout the pattern depicted in FIG. 281. In some embodiments, the equally spaced embodiment depicted in FIG. 281 may provide increasing heat input per volume of formation with increasing distance from the production well by adjusting the heat output of the heat sources to increase with increasing distance from the production well.

FIG. 282 depicts an embodiment of irregular spaced heat sources 202 defining volumes with increasing heat input density around production well 206. FIG. 282 depicts the same heater pattern as FIG. 278 with shading defining areas representing volumes 1970, 1972, 1974, and 1976. Increases in the shading in FIG. 282 represent increases in the heat input density into the formation (heat input per volume of formation). First volume 1970 substantially surrounds production well 206; second volume 1972 substantially surrounds first volume 1970; third volume 1974 substantially surrounds second volume 1972; and fourth volume 1976 substantially surrounds third volume 1974. In certain embodiments, first volume 1970 does not include production well 206. In some embodiments, first volume 1970 includes production well 206.

In certain embodiments, at least one heat source 202 is located in first volume 1970, in second volume 1972, in third volume 1974, and/or in fourth volume 1976. In some embodiments, at least two heat sources 202 are located in first volume 1970, in second volume 1972, in third volume 1974, and/or in fourth volume 1976. In some embodiments, at least three heat sources 202 are located in first volume 1970, in second volume 1972, in third volume 1974, and/or in fourth volume 1976.

In certain embodiments, all heat sources 202 located in first volume 1970 are closer to production well 206 than any of the heaters in second volume 1972. In some embodiments, all heat sources 202 located in second volume 1972 are closer to production well 206 than any of the heaters in third volume 1974. In some embodiments, all heat sources 202 located in third volume 1974 are closer to production well 206 than any of the heaters in fourth volume 1976.

In certain embodiments, the average distance from production well 206 of heat sources 202 in first volume 1970 is less than the average distance from production well 206 of heat sources 202 in second volume 1972. In some embodiments, the average distance from production well 206 of heat sources 202 in second volume 1972 is less than the average distance from production well 206 of heat sources 202 in third volume 1974. In some embodiments, the average distance from production well 206 of heat sources 202 in third volume 1974 is less than the average distance from production well 206 of heat sources 202 in fourth volume 1976.

In certain embodiments, first volume 1970 is approximately equal in volume to second volume 1972, third volume 1974, and/or fourth volume 1976. In some embodiments, second volume 1972 is approximately equal in volume to third volume 1974 and/or fourth volume 1976. In some embodiments, third volume 1974 is approximately equal in volume to fourth volume 1976.

In certain embodiments, as shown in FIGS. 278 and 282, first volume 1970, second volume 1972, third volume 1974, and fourth volume 1976 have increasing average radial distances from production well 206 with the average radial distance of the first volume being the smallest and the average radial distance of the fourth volume being the largest. Thus, first volume 1970 is closer to production well 206 than second volume 1972; the second volume is closer to the production well than third volume 1974; and the third volume is closer to the production well than fourth volume 1976.

The differences in density of heat sources 202 in rows A, B, C, and D and/or the differences in heat output of the heat sources may produce temperature gradients in the section of the formation heated by the pattern of heat sources shown in FIGS. 278 and 282. Heat input into the formation from heat sources 202 in row A may approximately define first volume 1970. Heat input into the formation from heat sources 202 in row B may approximately define second volume 1972. Heat input into the formation from heat sources 202 in row C may approximately define third volume 1974. Heat input into the formation from heat sources 202 in row D may approximately define fourth volume 1976.

In certain embodiments, volumes 1970, 1972, 1974, and 1976 have boundaries that are defined approximately by the differences in heat source density between rows A, B, C, and D. The shapes of the boundaries of volumes 1970, 1972, 1974, and 1976 and or the size of the volumes may be defined, for example, by the location of heat sources 202, the heating characteristics of the heat sources, and the thermal and/or geomechanical properties of the formation. The shapes and/or sizes of volumes 1970, 1972, 1974, and 1976 may vary based on changes in the above example properties and/or the point in time during heating of the formation. The boundaries of volumes 1970, 1972, 1974, and 1976, as shown in FIGS. 278 and 282, approximate measurable temperature differences in the section because of the changes in heater density (or heat source output) at a selected point in time during heating of the section.

In some embodiments, the number of heat sources 202 per volume of formation in a volume increases from first volume 1970 to fourth volume 1976. Thus, the heat source density increases from first volume 1970 to fourth volume 1976. Because the heat source density increases from first volume 1970 to fourth volume 1976, the average heat output of heat sources in first volume 1970 is less than the average heat output of heat sources in second volume 1972; the average heat output of heat sources in the second volume is less than the average heat output of heat sources in third volume 1974; and the average heat output of heat sources in the third volume is less than the average heat output of heat sources in fourth volume 1976.

In addition, because of the increasing heater density (or heat output) as distance from production well 206 increases; the heat input to the formation per volume of formation in first volume 1970 is less than the heat input to the formation per volume of formation in second volume 1972; the heat input to the formation per volume of formation in the second volume is less than the heat input to the formation per volume of formation in third volume 1974; and the heat input to the formation per volume of formation in the third volume is less than the heat input to the formation per volume of formation in fourth volume 1976. Thus, first volume 1970 is at a lower average temperature than second volume 1972; the second volume is at a lower average temperature than third volume 1974; and the third volume is at a lower average temperature than fourth volume 1976.

Regardless of any change in the shapes and/or sizes of volumes 1970, 1972, 1974, and 1976, the spatial relation of the volumes remains constant during heating of the formation (the first volume surrounds the production well with the other volumes surrounding the first volume, respectively). Similarly, heat input into the formation may increase constantly from first volume 1970 to fourth volume 1976.

In certain embodiments, the formation has sufficient permeability to allow fluids (for example, mobilized fluids) to flow towards production well 206 from the outermost heat sources in the pattern (heat sources 202 in row D). The flow of fluids from the higher heat density portions of the formation towards the production well provides convective heat transfer in the formation. Fluids may be cooled as the fluids move towards the production well by transferring heat to the formation. Convective heat transfer from fluid flow in the formation may transfer heat through the formation faster than conductive heat transfer. In some embodiments, convective heat transfer may be increased by providing unobstructed or substantially unobstructed flow paths from the outermost heat sources to the production well. Increasing heat transfer in the formation may increase heating efficiency and/or recovery efficiency for treating the formation. For example, fluids mobilized by heat at longer distances from the production well may provide heat to the formation as the mobilized fluids move towards the production well. Providing some heat to the formation from movement of mobilized fluids may be a more efficient use of heat provided to the formation.

In certain embodiments, fluids produced through production well 206 include a majority of liquid hydrocarbons that are hydrocarbons originally in place in the section the pattern surrounding the production well. The liquid hydrocarbons may be hydrocarbons that are liquids at 25° C. and 1 atm.

As shown in FIG. 278, hexagonal rows A, B, C, and D have varying spacing between the rows with rows A, B, and C being shifted outwards from production well 206 using an "offset factor". An offset factor of zero produces rows substantially equally spaced from each other. FIG. 281 depicts an embodiment with equally spaced rows of hexagon. The offset factor may be used in a series of related equations to determine the spacing between rows. For example, equations may be used for a heater pattern with four hexagonal rows surrounding a production well.

As shown in FIG. 278, the largest hexagon is the outer constraint of the pattern of heat sources around the production well. The largest hexagon has radii $R_1$ and $R_2$ with $R_1$ being the larger radius (the radius to a vertex of the hexagon) and $R_2$ being the smaller radius (the radius to the bisect of a side of a hexagon). In the embodiment with equally spaced hexagons, shown in FIG. 281 yields:

$$r_1+r_2+r_3+r_4=R_1 \quad \text{(EQN. 7)}$$

where $r_1$ is the radius from the center to the vertex of the first hexagon, $r_2$ is the radius from the vertex of the first hexagon to the vertex of the second hexagon, $r_3$ is the radius from the vertex of the second hexagon to the vertex of the third hexagon, and $r_4$ is the radius from the vertex of the third hexagon to the vertex of the fourth hexagon (the largest hexagon).

For the equally spaced hexagon case, the four radii are equal so that:

$$r_1=r_2=r_3=r_4=R_1/4. \quad \text{(EQN.8)}$$

For the case of four hexagons spaced geometrically, shown in FIG. 278, the hexagons may have an offset factor, s. The spacing of the hexagons may be described by:

$$r'_1+4s+r'_2+3s+r'_3+2s+r'_4+S=R_1. \quad \text{(EQN. 9)}$$

If $r'_i$ is assumed to be a constant ($r'_1=r'_2=r'_3=r'_4=r'$), then:

$$4r'+10s=R_1. \quad \text{(EQN. 10)}$$

Certain assumptions may be made on the offset factor, s, so that the dimensions (the distances from the production well) of the four hexagons may be described accordingly:

$r'+4s$=distance to the vertex of the first hexagon from the production well; (EQN. 11)

$2r'+7s$=distance to the vertex of the second hexagon from the production well; (EQN. 12)

$3r'+9s$=distance to the vertex of the third hexagon from the production well; and (EQN. 13)

$4r'+10s$=distance to the vertex of the fourth hexagon from the production well. (EQN. 14)

Thus, for an offset factor of zero, the spacing of the hexagons would be equal, as shown in FIG. 281. FIG. 278 depicts hexagons geometrically spaced with an offset factor of about 8 for a nominal spacing of about 40 feet (about 12 m) between equally spaced hexagons.

Decreasing the density of heat sources 202 closer to production well 206, as shown in FIG. 278, provides less heating at or near the production well. Providing less heat at or near the production well may reduce the enthalpy of fluids produced through the production well. Less heating at or near the production well may provide lower temperatures in the production well such that less energy is removed from the formation through produced fluids and more energy is kept in the formation to heat the formation. Thus, waste energy from the formation may be decreased. Decreasing waste energy in the formation increases energy efficiency (energy into the formation versus energy out of the formation) in treating the formation.

In certain embodiments, the average temperature of produced fluids is maintained below a selected temperature. For example, the average temperature of produced fluids when about 50% of the hydrocarbons in place are pyrolyzed may be maintained below about 310° C., below about 200° C., or below about 190° C. In some embodiments, the average temperature of produced fluids when about 50% of the hydrocarbons in place are mobilized may be maintained below about 310° C., below about 200° C., or below about 190° C. In some embodiments, the average temperature of produced fluids when about 50% of the hydrocarbons in place are produced may be maintained below about 310° C., below about 200° C., or below about 190° C.

In some embodiments, reducing temperatures at or near the production well reduces costs associated with production well completion and/or reduces the potential for failures of piping or other equipment in the production well. For example, treating a formation using the pattern depicted in FIG. 278 may decrease the heat requirement by about 17% versus treating the formation with a regular triangular pattern of heat sources. The reduced requirement for heat injection likely occurs because of convective heat transfer by the high temperature fluids in the formation from high heat density areas (outer portions of the heater pattern) to portions of the formation around the production well.

Less heating at or near the production well, however, may decrease recovery efficiency (amount of oil in place recovered) in the formation. The reduced recovery efficiency may be due to more hydrocarbons being left unmobilized or unpyrolyzed in the formation at the end of production and/or higher concentrations of charring or coking from higher temperatures being generated by the higher heater density in the outer portions of the heater pattern. The reduced recovery efficiency may offset some of the benefits from the reduced energy input into the formation. In some embodiments, further increasing the density of heat sources as the distance from the production well increases (for example, increasing the offset factor in FIG. 278) reduces the recovery efficiency to an extent that overtakes any benefits gained from reducing energy input into the formation.

Larger offset factors may result in shorter time to production ramp up because of accelerated heating from the higher density of heat sources. The larger offset factors, however, also produce lower peak oil production rates and reduced recovery efficiency. In addition, at larger offset factors, more rock may need to be heated to compensate for reduce liquid recovery from the formation. Lowering the offset factor increases oil production rates and recovery efficiency but reduces the heat efficiency in treating the formation. Thus, a desired offset factor (for example, desired increasing heater density pattern) may be a balance between the above described results.

In certain embodiments, simulations, calculations, and/or other optimization methods are used to assess or determine a desired heater density pattern (for example, offset factor) for treating the formation. The desired heater density pattern may be assessed based on factors such as, but not limited to, current or future economic conditions, production needs, and properties of the formation. In some embodiments, the simulations or calculations are used to vary the offset factor and assess a desired (for example, optimum) ratio of energy output from the formation versus energy input into the formation.

Table 3 summarizes data from simulations on three different heater patterns for cumulative oil production (in bbl), gas production (in MMscf), heat injection efficiency (heat injection per barrel oil produced (in MMBtu/bbl)), and cumulative heat injection (MMBtu) on patterns of heaters. Row 1 shows data for a simulation of the equally spaced heater pattern shown in FIG. 281. Row 2 shows data for a simulation of the irregular spaced heater pattern shown in FIG. 278. The simulations that resulted in the data shown in row 1 and row 2 were constrained to have the same constant average formation temperature. Row 3 shows data for a simulation of the irregular spaced heater pattern shown in FIG. 278 with the added feature of leaving the heaters closest to the production well (heaters in row A) on for a longer period of time. The heaters were left on until the cumulative heat injection in the simulation equaled the cumulative heat injection for the simulation of the equally spaced heater pattern (data shown in row 1).

TABLE 3

| Row | Oil (bbl) | Gas (MMscf) | Heat inj. efficiency (MMBtu/bbl) | Cum. Heat (MMBtu) |
|---|---|---|---|---|
| 1 | 91,610 | $2.99 \times 10^2$ | 1.157 | $1.06 \times 10^5$ |
| 2 | 85,666 | $1.43 \times 10^2$ | 1.044 | $8.94 \times 10^4$ |
| 3 | 97,378 | $3.04 \times 10^2$ | 1.089 | $1.06 \times 10^5$ |

As shown by the data in rows 1 and 2 of Table 3, increasing the heat input density as the distance from the production well increases using the irregular heat source pattern increases the heat injection efficiency into the formation and reduces the cumulative heat injection into the formation. Oil production, however, is reduced using the irregular heat source pattern. The data in row 3 shows that adjusting how heat is injected in the irregular heat source pattern (for example, by keeping heaters closer to the production well on longer) may increase oil production to a value even higher than the value for the regular (equally spaced) heat source pattern while getting a heat injection efficiency that is better than the regular heat source pattern. Further adjustments of how heat is injected in the heat source pattern (for example, turning off heaters in the outer parts of the pattern sooner) may further increase heat injection efficiency and/or increase oil production.

It is to be understood that the pattern of heat sources and rows depicted in FIG. 278 is merely representative of one possible embodiment for a pattern of heat sources that increase in heater density with distance from the production well. Many other geometric or non-geometric patterns of heat sources may also be used to provide the same function of increasing the heater density, as depicted in FIG. 278. Simulations, calculations, and/or other optimization methods may be used to assess or determine a desired heater density pattern for treating the formation with any desired geometric or non-geometric pattern. For example, simulations, calculations, and/or other optimization methods may be used to assess and optimize the amount of heat output per volume of formation from the heat sources (or the heat source density) at different radial distances from the production well so that the ratio of energy output from the formation versus energy input into the formation is optimized.

In some embodiments, heat sources 202 in rows A, B, C, and D, depicted in FIG. 278, are turned on and off simultaneously. The heat sources may be turned on and allowed to heat the formation to a selected average temperature before being turned off. The selected temperature may be, for example, a hydrocarbon mobilization temperature, a hydrocarbon visbreaking temperature, or a hydrocarbon pyrolysis temperature. Simulations and/or calculations may be used to assess the selected average temperature for a selected heater density pattern.

In some embodiments, heat sources 202 nearest production well 206 (for example, heat sources 202 in rows A and/or B) are left on for longer times than heat sources further away from the production well (for example, heat sources 202 in rows C and/or D). Leaving heat sources nearer the production well on for longer times may allow for more hydrocarbon production from the formation. Thus, fewer hydrocarbons may remain in place after production is completed and higher recovery efficiencies may be achieved using a selected heater density pattern. Simulations and/or calculations may be used to assess desired times for turning on and off heat sources such that the ratio of energy output from the formation versus energy input into the formation is optimized. In some embodiments, it may be possible to increase the recovery efficiency by tailoring the heat output to recovery efficiencies achieved with regular heating patterns (for example, no offset factor)

In some embodiments, heat sources that are turned on for shorter times (for example, heat sources 202 in row D) are designed for shorter lifetimes. For example, heat sources 202 in row D may be designed to last at most about 3 years or at most about 5 years. Other heat sources in the formation may be designed to last at least about 5 years or at least about 10 years. Shorter lifetime heat sources may use less expensive materials and/or be less expensive to manufacture or install than longer lifetime heat sources. Thus, using the shorter lifetime heat sources may reduce costs associated with treating the formation.

In some embodiments, heat sources 202, depicted in FIG. 278, are turned on in a sequence from outside in towards production well 206. For example, heat sources 202 in row D may be turned on first, followed by heat sources 202 in row C, then heat sources 202 in row B, and lastly heat sources 202 in row A. Such a heater startup sequence may treat the formation in a staged heating method with one or more of the outside heat sources being spaced so that heat from the heat sources does not superposition or conductively heat the production well and heat is primarily transferred through convection of fluids to the production well. For example, heat sources 202 in rows A-D may be considered to be in a first section of the formation and production well 206 is in a second section adjacent to the first section.

In some embodiments, the temperature at or near production well 206 is controlled so that the temperature is at most a selected temperature. For example, the temperature at or near the production well may be controlled so that the temperature is at most about 100° C., at most about 150° C., at most about 200° C., or at most about 250° C. In certain embodiments, the temperature at or near production well 206 is controlled by reducing or turning off the heat provided by heat sources 202 nearest the production well (for example, the heat sources in row A). In some embodiments, the temperature at or near production well 206 is controlled by controlling the production rate of fluids through the production well.

In certain embodiments, the heater pattern depicted in FIG. 278 is a base unit of a pattern repeated through a large portion of the formation to define a larger treatment area. FIG. 283 depicts three base units in the formation. Additional base units may be formed if desired. The number and/or arrangement of base units in a pattern may depend on, for example, the size and/or shape of the formation being treated. In certain embodiments, production wells 206 are located at or near the center of the repeating base units in the pattern. Heater wells 202 and production wells 206 may be used to treat and produce hydrocarbons from the formation using the pattern depicted in FIG. 283.

In certain embodiments, a solvation fluid and/or pressurizing fluid are used to treat the hydrocarbon formation in addition to the in situ heat treatment process. In some embodiments, a solvation fluid and/or pressurizing fluid is used after the hydrocarbon formation has been treated using a drive process.

In some embodiments, heaters are used to heat a first section the formation. For example, heaters may be used to heat a first section of formation to pyrolysis temperatures to produce formation fluids. In some embodiments, heaters are used to heat a first section of the formation to temperatures below pyrolysis temperatures to visbreak and/or mobilize fluids in the formation. In other embodiments, a first section of a formation is heated by heaters prior to, during, or after a drive process is used to produce formation fluids.

Residual heat from first section may transfer to portions of the formation above, below, and/or adjacent to the first section. The transferred residual heat, however, may not be sufficient to mobilize the fluids in the other portions of the formation towards production wells so that recovery of the fluids from the colder sections fluids may be difficult. Addition of a fluid (for example, a solvation fluid and/or a pressurizing fluid) may solubilize and/or drive the hydrocarbons in the sections of the formation heated by residual heat towards production wells. Addition of a solvating and/or pressurizing fluid to portions of the formation heated by residual heat may facilitate recovery of hydrocarbons without requiring heaters to heat the additional sections. Addition of the fluid may allow for the recovery of hydrocarbons in previously produced sections and/or for the recovery of viscous hydrocarbons in colder sections of the formation.

In some embodiments, the formation is treated using the in situ heat treatment process for a significant time after the formation has been treated with a drive process. For example, the in situ heat treatment process is used 1 year, 2 years, 3 years, or longer after a formation has been treated using drive processes. After heating the formation for a significant amount of time using heaters and/or injected fluid (for example, steam), a solvation fluid may be added to the heated section and/or portions above and/or below the heated section. The in situ heat treatment process followed by addition of a solvation fluid and/or a pressurizing fluid may be used on formations that have been left dormant after the drive process treatment because further hydrocarbon production using the drive process is not possible and/or not economically feasible. In some embodiments, the solvation fluid and/or the pressurizing fluid is used to increase the amount of heat provided to the formation. In some embodiments, an in situ heat treatment process may be used following addition of the solvation fluid and/or pressurizing fluid to increase the recovery of hydrocarbons from the formation.

In some embodiments, the solvation fluid forms an in situ solvation fluid mixture. Using the in situ solvation fluid may upgrade the hydrocarbons in the formation. The in situ solvation fluid may enhance solubilization of hydrocarbons and/or and facilitate moving the hydrocarbons from one portion of the formation to another portion of the formation.

FIGS. 284 and 285 depict side view representations of embodiments for producing a fluid mixture from the hydrocarbon containing formation. In FIGS. 284 and 285, heaters 438 have substantially horizontal heating sections below overburden 482 in hydrocarbon layer 484 (as shown, the heaters have heating sections that go into and out of the page). Heaters 438 provide heat to first section 1060 of hydrocarbon layer 484. Patterns of heaters, such as triangles, squares, rectangles, hexagons, and/or octagons may be used within first section 1060. First section 1060 may be heated at least to temperatures sufficient to mobilize some hydrocarbons within the first section. A temperature of the heated first section 1060 may range from about 200° C. to about 240° C. In some embodiments, temperature within first section 1060 may be increased to a pyrolyzation temperature (for example between 250° C. and 400° C.).

In certain embodiments, the bottommost heaters are located between about 2 m and about 10 m from the bottom of hydrocarbon layer 484, between about 4 m and about 8 m from the bottom of the hydrocarbon layer, or between about 5 m and about 7 m from the bottom of the hydrocarbon layer. In certain embodiments, production wells 206A are located at a distance from the bottommost heaters 438 that allows heat from the heaters to superimpose over the production wells, but at a distance from the heaters that inhibits coking at the production wells. Production wells 206A may be located a distance from the nearest heater (for example, the bottommost heater) of at most ¾ of the spacing between heaters in the pattern of heaters (for example, the triangular pattern of heaters depicted in FIGS. 284 and 285). In some embodiments, production wells 206A are located a distance from the nearest heater of at most ⅔, at most ½, or at most ⅓ of the spacing between heaters in the pattern of heaters. In certain embodiments, production wells 206A are located between about 2 m and about 10 m from the bottommost heaters, between about 4 m and about 8 m from the bottommost heaters, or between about 5 m and about 7 m from the bottommost heaters. Production wells 206A may be located between about 0.5 m and about 8 m from the bottom of hydrocarbon layer 484, between about 1 m and about 5 m from the bottom of the hydrocarbon layer, or between about 2 m and about 4 m from the bottom of the hydrocarbon layer.

In some embodiments, formation fluid is produced from first section 1060. The formation fluid may be produced through production wells 206A. In some embodiments, the formation fluids drain by gravity to a bottom portion of the layer. The drained fluids may be produced from production wells 206A positioned at the bottom portion of the layer. Production of the formation fluids may continue until a majority of condensable hydrocarbons in the formation fluid are produced. After the majority of the condensable hydrocarbons have been produced, first section 1060 heat from heaters 438 may be reduced and/or discontinued to allow a reduction in temperature in the first section. In some embodiments, after the majority of the condensable hydrocarbons have been produced, a pressure of first section 1060 may be reduced to a selected pressure after the first section reaches the selected temperature. Selected pressures may range between about 100 kPa and about 1000 kPa, between 200 kPa and 800 kPa, or below a fracture pressure of the formation.

In some embodiments, the formation fluid produced from production wells 206 includes at least some pyrolyzed hydrocarbons. Some hydrocarbons may be pyrolyzed in portions of first section 1060 that are at higher temperatures than a remainder of the first section. For example, portions of formation adjacent to heaters 438 may be at somewhat higher temperatures than the remainder of first section 1060. The higher temperature of the formation adjacent to heaters 438 may be sufficient to cause pyrolysis of hydrocarbons. Some of the pyrolysis product may be produced through production wells 206.

One or more sections may be above and/or below first section 1060 (for example, second section 1062 and/or third section 1064 depicted in FIG. 284). FIG. 285 depicts second section 1062 and/or third section 1064 adjacent to first section 1060. In some embodiments, second section second section 1062 and third section 1064 are outside a perimeter defined by the outermost heaters. Some residual heat from first section 1060 may transfer to second section 1062 and third section 1064. In some embodiments, sufficient residual heat is transferred to heat formation fluids to a temperature that allows the fluids to move in second section 1062 and/or third section 1064 towards productions wells 206. Utilization of residual heat from first section 1060 to heat hydrocarbons in second section 1062 and/or third section 1064 may allow hydrocarbons to be produced from the second section and/or third section without direct heating of these sections. A minimal amount of residual heat to second section 1062 and/or third section 1064 may be superposition heat from heaters 438. Areas of second section 1062 and/or third section 1064 that are at a distance greater than the spacing between heaters 438 may be heated by residual heat from first section 1060. Second section 1062 and/or third section 1064 may be heated by conductive and/or convective heat from first section 1060. A temperature of the sections heated by residual heat may range from 100° C. to 250° C., from 150° C. to 225° C., or from 175° C. to 200° C. depending on the proximity of heaters 438 to second section 1062 and/or third section 1064.

In some embodiments, a solvation fluid is provided to first section 1060 through injection wells 788A to solvate hydrocarbons within the first section. In some embodiments, solvation fluid is added to first section 1060 after a majority of the condensable hydrocarbons have been produced and the first section has cooled. The solvation fluid may solvate and/or dilute the hydrocarbons in first section 1060 to form a mixture of condensable hydrocarbons and solvation fluids. Formation of the mixture may allow for production of hydrocarbons remaining in the first section. Solubilization of hydrocarbons in first section 1060 may allow the hydrocarbons to be produced from the first section after heat has been removed from the section. The mixture may be produced through production wells 206A.

In some embodiments, a solvation fluid is provided to second section 1062 and/or third section 1064 through injection wells 788B and/or 788C to increase mobilization of hydrocarbons within the second section and/or the third section. The solvation fluid may increase a flow of mobilized hydrocarbons into first section 1060. For example, a pressure gradient may be produced between second section 1062 and/or third section 1064 and first section 1060 such that the flow of fluids from the second section and/or the third section to the first section is increased. The solvation fluid may solubilize a portion of the hydrocarbons in second section 1062 and/or third section 1064 to form a mixture. Solubilization of hydrocarbons in second section 1062 and/or third section 1064 may allow the hydrocarbons to be produced from the second section and/or third section without direct heating of the sections. In some embodiments, second section 1062 and/or third section 1064 have been heated from residual heat transferred from first section 1060 prior to addition of the solvation fluid. In some embodiments, the solvation fluid is added after second section 1062 and/or third section 1064 have been heated to a desired temperature by heat from first section 1060. In some embodiments, heat from first section 1060 and/or heat from the solvation fluid heats section 1062 and/or third section 1064 to temperatures sufficient to mobilize heavy hydrocarbons in the sections. In some embodiments, section 1062 and/or third section 1064 are heated to temperatures ranging from 50° C. to 250° C. In some embodiments, temperatures in section 1062 and/or third section 1064 are sufficient to mobilize heavy hydrocarbons, thus the solvation fluid may mobilize the heavy hydrocarbons by displacing the heavy hydrocarbons with minimal mixing.

In some embodiments, water and/or emulsified water may be used as a solvation fluid. Water may be injected into a portion of first section 1060, second section 1062 and/or third section 1064 through injection wells 788. Addition of water to at least a selected section of first section 1060, second section 1062 and/or third section 1064 may water saturate a portion of the sections. The water saturated portions of the selected section may be pressurized by known methods and a water/hydrocarbon mixture may be collected using one or more production wells 206.

In some embodiments, a hydrocarbon formation and/or sections of a hydrocarbon formation may be heated to a selected temperature using a plurality of heaters. Heat from the heaters may transfer from the heaters so that a section of the formation reaches a selected temperature. Treating the hydrocarbon formation with hot water or "near critical" water may extract and/or solvate hydrocarbons from the formation that have been difficult to produce using other solvent processes and/or heat treatment processes. Not to be bound by theory, near critical water may solubilize organic material (for example, hydrocarbons) normally not soluble in water. The solubilized and/or mobilized hydrocarbons may be produced from the formation. In other embodiments, the formation is treated with critical or near critical carbon dioxide instead of hot water or near critical water.

In some embodiments, the hydrocarbon formation or one or more section of the formation may be heated (for example, using heaters) to a temperature ranging from about 100° C. to about 240° C., from about 150° C. to about 230° C., or from about 200° C. to about 220° C. In some embodiments, the hydrocarbon formation is an oil shale formation. In some embodiments, temperature within the section may be increased to a pyrolyzation temperature (for example, between about 250° C. and about 400° C.). During heating, hydrocarbons may be transformed into lighter hydrocarbons, water and gas. The hydrocarbons may include bitumen. In some embodiments, kerogen in an oil formation may be transformed into hydrocarbons, water and gas. During the transformation at least some the kerogen may be transformed into bitumen. In some embodiments, bitumen may flow into heater and/or production wells and solidify. Solidification of the bitumen may decrease connectivity in the heater and/or decrease production of hydrocarbons. In some embodiments, production of the bitumen is difficult due to the flow properties of bitumen.

In some embodiments, after heating the section to the desired temperature, the bitumen may be treated with hot water and/or a hot solution of water and solvent (for example, a solution of water and aromatics such as phenol and cresol). Hot water (for example, water at temperatures above 275° C., above 300° C. or above 350° C.) and/or a hot solution (for example, a hot solution of water and one or more aromatic compounds such as phenol and/or cresol compounds) may be injected in the formation (for example, an oil shale formation) or sections of the formation through heater, production, and/or injection wells. Pressure and temperature in the formation and/or the wells may be controlled to maintain the most of the water in a liquid phase. For example, the water temperature may range from about 250° C. to about 300° C. at pressures ranging from 5,000 kPa to 15,000 kPa or from 6,000 kPa to 10,000 kPa. Water at these temperatures at pressure may have a dielectric constant of about 20 and a density of about 0.7 grams per cubic centimeter. In some embodiments, keeping most of the hot water in a liquid phase may allow the water to enter rock matrix of the formation and mobilize the bitumen and/or extract hydrocarbon fluid from the bitumen. In some embodiments, the hydrocarbon fluid and/or hydrocarbons in the hydrocarbon fluid have a viscosity less than the viscosity of the bitumen. The extracted hydrocarbons and/or mobilized bitumen may be produced from the section and/or be moved into other sections with solvating fluids and/or pressurizing fluids. Extraction of hydrocarbons from the bitumen and/or solvation of the bitumen with hot water and/or a hot solution may enhance hydrocarbon recovery from the formation. For example, extraction of bitumen may produce hydrocarbons having an API gravity of at least 10°, at least 15° or at least 20°. The hydrocarbons may have a viscosity of at least 100 centipoise at 15° C. The quality and/or type of the hydrocarbons produced from less heating in combination with hot water extraction may be improved as compared to the quality of hydrocarbons produced at higher temperatures.

In certain embodiments, first section 1060, second section 1062 and/or third section 1064 may be treated with hydrocarbons (for example, naphtha, kerosene, diesel, vacuum gas oil, or a mixture thereof). In some embodiments, the hydrocarbons have an aromatic content of at least 1% by weight, at least 5% by weight, at least 10% by weight, at least 20% by weight or at least 25% by weight. Hydrocarbons may be injected into a portion of first section 1060, second section 1062 and/or third section 1064 through injection wells 788. In some embodiments, the hydrocarbons are produced from first section 1060 and/or other portions of the formation. In certain embodiments, the hydrocarbons are produced from the formation, treated to remove heavy fractions of hydrocarbons (for example, asphaltenes, hydrocarbons having a boiling point of at least 300° C., of at least 400° C., at least 500° C., or at least 600° C.) and the hydrocarbons are re-introduced into the formation. In some embodiments, one section may be treated with hydrocarbons while another section is treated with water. In some embodiments, water treatment of a section may be alternated with hydrocarbon treatment of the section. In some embodiments, a first portion of hydrocarbons having a relatively high boiling range distribution (for example, kerosene and/or diesel) are introduced in one section. A second portion of hydrocarbons having a relatively low boiling range distribution or hydrocarbons of low economic value (for example, propane) may be introduced into the section after the first portion of hydrocarbons. The introduction of hydrocarbons of different boiling range distributions may enhance recovery of the higher boiling hydrocarbons and more economically valuable hydrocarbons through production wells 206.

In an embodiment, a blend made from hydrocarbon mixtures produced from first section 1060 is used as a solvation fluid. The blend may include about 20% by weight light hydrocarbons (or blending agent) or greater (for example, about 50% by weight or about 80% by weight light hydrocarbons) and about 80% by weight heavy hydrocarbons or less (for example, about 50% by weight or about 20% by weight heavy hydrocarbons). The weight percentage of light hydrocarbons and heavy hydrocarbons may vary depending on, for example, a weight distribution (or API gravity) of light and heavy hydrocarbons, an aromatic content of the hydrocarbons, a relative stability of the blend, or a desired API gravity of the blend. For example, the weight percentage of light hydrocarbons in the blend may at most 50% by weight or at most 20% by weight. In certain embodiments, the weight percentage of light hydrocarbons may be selected to mix the least amount of light hydrocarbons with heavy hydrocarbons that produces a blend with a desired density or viscosity.

In some embodiments, polymers and/or monomers may be used as solvation fluids. Polymers and/or monomers may solvate and/or drive hydrocarbons to allow mobilization of the hydrocarbons towards one or more production wells. The polymer and/or monomer may reduce the mobility of a water phase in pores of the hydrocarbon containing formation. The reduction of water mobility may allow the hydrocarbons to be more easily mobilized through the hydrocarbon containing formation. Polymers that may be used include, but are not limited to, polyacrylamides, partially hydrolyzed polyacrylamide, polyacrylates, ethylenic copolymers, biopolymers, carboxymethylcellulose, polyvinyl alcohol, polystyrene sulfonates, polyvinylpyrrolidone, AMPS (2-acrylamide-2-methyl propane sulfonate), or combinations thereof. Examples of ethylenic copolymers include copolymers of acrylic acid and acrylamide, acrylic acid and lauryl acrylate, lauryl acrylate and acrylamide. Examples of biopolymers include xanthan gum and guar gum. In some embodiments, polymers may be crosslinked in situ in the hydrocarbon containing formation. In other embodiments, polymers may be generated in situ in the hydrocarbon containing formation. Polymers and polymer preparations for use in oil recovery are described in U.S. Pat. Nos. 6,439,308 to Wang; 6,417,268 to Zhang et al.; 6,439,308 to Wang; 5,654,261 to Smith; 5,284,206 to Surles et al.; 5,199,490 to Surles et al.; and 5,103,909 to Morgenthaler et al., each of which is incorporated by reference as if fully set forth herein.

In some embodiments, the solvation fluid includes one or more nonionic additives (for example, alcohols, ethoxylated alcohols, nonionic surfactants and/or sugar based esters). In some embodiments, the solvation fluid includes one or more anionic surfactants (for example, sulfates, sulfonates, ethoxylated sulfates, and/or phosphates).

In some embodiments, the solvation fluid includes carbon disulfide. Hydrogen sulfide, in addition to other sulfur compounds produced from the formation, may be converted to carbon disulfide using known methods. Suitable methods may include oxidizing sulfur compounds to sulfur and/or sulfur dioxide, and reacting sulfur and/or sulfur dioxide with carbon and/or a carbon containing compound to form carbon disulfide. The conversion of the sulfur compounds to carbon disulfide and the use of the carbon disulfide for oil recovery are described in U.S. Patent Publication No. 2006-0254769 to Wang et al., which is incorporated by reference as if fully set forth herein. The carbon disulfide may be introduced into first section 1060, second section 1062 and/or third section 1064 as a solvation fluid.

In some embodiments, the solvation fluid is a hydrocarbon compound that is capable of donating a hydrogen atom to the formation fluids. In some embodiments, the solvation fluid is capable of donating hydrogen to at least a portion of the formation fluid, thus forming a mixture of solvating fluid and dehydrogenated solvating fluid mixture. The solvating fluid/dehydrogenated solvating fluid mixture may enhance solvation and/or dissolution of a greater portion of the formation fluids as compared to the initial solvation fluid. Examples of such hydrogen donating solvating fluids include, but are not limited to, tetralin, alkyl substituted tetralin, tetrahydroquinoline, alkyl substituted hydroquinoline, 1,2-dihydronaphthalene, a distillate cut having at least 40% by weight naphthenic aromatic compounds, or mixtures thereof. In some embodiments, the hydrogen donating hydrocarbon compound is tetralin.

In some embodiments, first section 1060, second section 1062 and/or third section 1064 are heated to a temperature ranging form 175° C. to 350° C. in the presence of the hydrogen donating solvating fluid. At these temperatures at least a portion of the formation fluids may be hydrogenated by hydrogen donated from the hydrogen donating solvation fluid. In some embodiments, the minerals in the formation act as a catalyst for the hydrogenation process so that elevated formation temperatures may not be necessary. Hydrogenation of at least a portion of the formation fluids may upgrade a portion of the formation fluids and form a mixture of upgraded fluids and formation fluids. The mixture may have a reduced viscosity compared to the initial formation fluids. In situ upgrading and the resulting reduction in viscosity may facilitate mobilization and/or recovery of the formation fluids. In situ upgrading products that may be separated from the formation fluids at the surface include, but are not limited to, naphtha, vacuum gas oil, distillate, kerosene, and/or diesel. Dehydrogenation of at least a portion of the hydrogen donating solvent may form a mixture that has increased polarity as compared to the initial hydrogen donating solvent. The increased polarity may enhance solvation or dissolution of a portion of the formation fluids and facilitate production and/or mobilization of the fluids to production wells 206.

In some embodiments, the hydrogen donating hydrocarbon compound is heated in a surface facility prior to being introduced into first section 1060, second section 1062 and/or third section 1064. For example, the hydrogen donating hydrocarbon compound may be heated to a temperature ranging from 100° C. to about 180° C., 120° C. to about 170° C., or from about 130 to 160° C. Heat from the hot hydrogen donating hydrocarbon compound may facilitate mobilization, recovery and/or hydrogenation of fluids from first section 1060, second section 1062 and/or third section 1064.

In some embodiments, a pressurizing fluid is provided in second section 1062 and/or third section 1064 (for example, through injection wells 788B, 788C) to increase mobilization of hydrocarbons within the sections. In some embodiments, a pressurizing fluid is provided to second section 1062 and/or third section 1064 in combination with the solvation fluid to increase mobility of hydrocarbons within the formation. The pressurizing fluid may include gases such as carbon dioxide, nitrogen, steam, methane, and/or mixtures thereof. In some embodiments, fluids produced from the formation (for example, combustion gases, heater exhaust gases, or produced formation fluids) may be used as pressurizing fluid.

Providing a pressurizing fluid may increase a shear rate applied to hydrocarbon fluids in the formation and decrease the viscosity of non-Newtonian hydrocarbon fluids within the formation. In some embodiments, pressurizing fluid is provided to the selected section before significant heating of the formation. Pressurizing fluid injection may increase the volume of the formation available for production. Pressurizing fluid injection may increase a ratio of energy output of the formation (energy content of products produced from the formation) to energy input into the formation (energy costs for treating the formation).

Providing the pressurizing fluid may increase a pressure in a selected section of the formation. The pressure in the selected section may be maintained below a selected pressure. For example, the pressure may be maintained below about 150 bars absolute, about 100 bars absolute, or about 50 bars absolute. In some embodiments, the pressure may be maintained below about 35 bars absolute. Pressure may be varied depending on a number of factors (for example, desired production rate or an initial viscosity of tar in the formation). Injection of a gas into the formation may result in a viscosity reduction of some of the formation fluids.

The pressurizing fluid may enhance the pressure gradient in the formation to flow mobilized hydrocarbons into first section 1060. In certain embodiments, the production of fluids from first section 1060 allows the pressure in second section 1062 and/or third section 1064 to remain below a selected pressure (for example, a pressure below which fracturing of the overburden and/or the underburden may occur). In some embodiments, second section 1062 and/or third section 1064 have been heated by heat transfer from first section 1060 prior to addition of the pressurizing fluid. In some embodiments, the pressurizing fluid is added after second section 1062 and/or third section 1064 have been heated to a desired temperature by residual heat from first section 1060.

In some embodiments, pressure is maintained by controlling flow of the pressurizing fluid into the selected section. In other embodiments, the pressure is controlled by varying a location or locations for injecting the pressurizing fluid. In other embodiments, pressure is maintained by controlling a pressure and/or production rate at production wells 206A, 206B and/or 206C. In some embodiments, the pressurized fluid (for example, carbon dioxide) is separated from the produced fluids and re-introduced into the formation. After production has been stopped, the fluid may be sequestered in the formation.

In certain embodiments, formation fluid is produced from first section 1060, second section 1062 and/or third section 1064. The formation fluid may be produced through production wells 206A, 206B and/or 206C. The formation fluid produced from second section 1062 and/or third section 1064 may include solvation fluid; hydrocarbons from first section 1060, second section 1062 and/or third section 1064; and/or mixtures thereof.

Producing fluid from production wells in first section 1060 may lower the average pressure in the formation by forming an expansion volume for mobilized fluids in adjacent sections of the formation. Producing fluid from production wells 206 in the first section 1060 may establish a pressure gradient in the formation that draws mobilized fluid from second section 1062 and/or third section 1064 into the first section.

Hydrocarbons may be produced from first section 1060, second section 1062 and/or third section 1064 such that at least about 30%, at least about 40%, at least about 50%, at least about 60% or at least about 70% by volume of the initial mass of hydrocarbons in the formation are produced. In certain embodiments, additional hydrocarbons may be produced from the formation such that at least about 60%, at least about 70%, or at least about 80% by volume of the initial volume of hydrocarbons in the sections is produced from the formation through the addition of solvation fluid.

Fluids produced from production wells described herein may be transported through conduits (pipelines) between the formation and treatment facilities or refineries. The produced fluids may be transported through a pipeline to another location for further transportation (for example, the fluids can be transported to a facility at a river or a coast through the pipeline where the fluids can be further transported by tanker to a processing plant or refinery). Incorporation of selected solvation fluids and/or other produced fluids (for example, aromatic hydrocarbons) in the produced formation fluid may stabilize the formation fluid during transportation. In some embodiments, the solvation fluid is separated from the formation fluids after transportation to treatment facilities. In some embodiments, at least a portion of the solvation fluid is separated from the formation fluids prior to transportation. In some embodiments, the fluids produced prior to solvent treatment include heavy hydrocarbons.

In some embodiments, the produced fluids may include at least 85% hydrocarbon liquids by volume and at most 15% gases by volume, at least 90% hydrocarbon liquids by volume and at most 10% gases by volume, or at least 95% hydrocarbon liquids by volume and at most 5% gases by volume. In some embodiments, the mixture produced after solvent and/or pressure treatment includes solvation fluids, gases, bitumen, visbroken fluids, pyrolyzed fluids, or combinations thereof. The mixture may be separated into heavy hydrocarbon liquids, solvation fluid and/or gases. In some embodiments the heavy hydrocarbon liquids, solvation fluid and/or pressuring fluid (for example, carbon dioxide) are re-injected in another section of the formation.

The heavy hydrocarbon liquids separated from the mixture may have an API gravity of between 10° and 25°, between 15° and 24°, or between 19° and 23°. In some embodiments, the separated hydrocarbon liquids may have an API gravity between 19° and 25°, between 20° and 24°, or between 210 and 23°. A viscosity of the separated hydrocarbon liquids may be at most 350 cp at 5° C. A P-value of the separated hydrocarbon liquids may be at least 1.1, at least 1.5 or at least 2.0. The separated hydrocarbon liquids may have a bromine number of at most 3% and/or a CAPP number of at most 2%. In some embodiments, the separated hydrocarbon liquids have an API gravity between 190 and 25°, a viscosity ranging at most 350 cp at 5° C., a P-value of at least 1.1, a CAPP number of at most 2% as 1-decene equivalent, and/or a bromine number of at most 2%.

During an in situ heat treatment process, some formation fluid may migrate outwards from the treatment area. The formation fluid may include benzene and/or other contaminants. Some portions of the formation that contaminants migrate to will be subsequently treated when a new treatment area is defined and processed using the in situ heat treatment process. Such contaminants may be removed or destroyed by the subsequent in situ heat treatment process. Some areas of the formation to which contaminants migrate may not become part of a new treatment area subjected to in situ heat treatment. Migration inhibition systems may be implemented to inhibit contaminants from migrating to areas in the formation that are not to be subjected to in situ heat treatment.

In some embodiments, a barrier (for example, a low temperature zone or freeze barrier) surrounds at least a portion of the perimeter of a treatment area. The barrier may be 20 m to 100 m from the closest heaters in the treatment area used in the in situ heat treatment process to heat the formation. Some contaminants may migrate outwards as vapor towards the barrier through fractures or permeable zones. Some of the contaminants may condense in the formation.

In some in situ heat treatment embodiments, a migration inhibition system may be used to minimize or eliminate migration of formation fluid from the treatment area of the in situ heat treatment process. FIG. 286 depicts a representation of a fluid migration inhibition system. Barrier 1058 may surround treatment area 1028. Migration inhibition wells 1066 may be placed in the formation between barrier 1058 and treatment area 1028. Migration inhibition wells 1066 may be offset from wells used to heat the formation and/or from production wells used to produce fluid from the formation. Migration inhibition wells 1066 may be placed in formation that is below pyrolysis and/or dissociation temperatures of minerals in the formation.

In some embodiments, one or more of the migration inhibition wells 1066 include heaters. The heaters may be used to heat portions of the formation adjacent to the wells to a relatively low temperature. The relatively low temperature may be a temperature below a dissociation temperature of minerals in the formation adjacent to the well or below a pyrolysis temperature of hydrocarbons in the formation. The temperature that the low temperature heater wells raise the formation to may be less than 260° C., less than 230° C., or less than 200° C. In some embodiments, heating elements in migration inhibition wells 1066 may be tailored so that the heating elements only heat portions of the formation that have permeability sufficient to allow for the migration of fluid (for example, fracture systems) and/or to allow for introduction of fluid from the migration inhibition wells.

In some embodiments, one or more heater wells may be installed adjacent to the migration inhibition wells 1066. The heater wells may heat adjacent formation to an average temperature less than the dissociation temperature of minerals in the formation and/or less than the pyrolysis temperature of hydrocarbons in the formation. The heater wells may increase the permeability of the formation adjacent to migration inhibition wells 1066. Heating elements in the heater wells may be tailored to only heat portions of the formation that have permeability sufficient to allow for migration of fluid and/or introduction of fluid from migration inhibition wells 1066 into the formation.

The heat supplied by heaters near or from the migration inhibition wells may inhibit condensation of migrating vapors located adjacent to the migration inhibition wells. Sweep fluid introduced into the formation through the migration inhibition wells may drive migrating vapors back to the heated treatment area. At least a portion of the migrating vapors returned to the treatment area may react in the treatment area. At least a portion of the migrating vapors returned to the treatment area may be produced from the formation through production wells.

Some or all migration inhibition wells 1066 may be injector wells that allow for the introduction of a sweep fluid into the formation. The injector wells may include smart well technology. Sweep fluid may be introduced into the formation through critical orifices, perforations or other types of openings in the injector wells. In some embodiments, the sweep fluid is carbon dioxide. The carbon dioxide may be carbon dioxide produced from an in situ heat treatment process. The sweep fluid may be or include other fluids, such as nitrogen, methane or other non-condensable hydrocarbons, exhaust gases, air, water, and/or steam. The sweep fluid may provide positive pressure in the formation outside of treatment area 1028. The positive pressure may inhibit migration of formation fluid from treatment area 1028 towards barrier 1058. The sweep fluid may move through fractures in the formation toward or into treatment area 1028. The sweep fluid may carry fluids that have migrated away from treatment area 1028 back to the treatment area. The pressure of the fluid introduced through migration inhibition wells 1066 may be maintained below the fracture pressure of the formation.

After an in situ process, energy recovery, remediation, and/or sequestration of carbon dioxide or other fluids in the treated area; the treatment area may still be at an elevated temperature. Sulfur may be introduced into the formation to act as a drive fluid to remove remaining formation fluid from the formation. The sulfur may be introduced through outermost wellbores in the formation. The wellbores may be injection wells, production wells, monitor wells, heater wells, barrier wells, or other types of wells that are converted to use as sulfur injection wells. The sulfur may be used to drive fluid inwards towards production wells in the pattern of wells used during the in situ heat treatment process. The wells used as production wells for sulfur may be production wells, heater wells, injection wells, monitor wells, or other types of wells converted for use as sulfur production wells.

In some embodiments, sulfur may be introduced in the treatment area from an outermost set of wells. Formation fluid may be produced from a first inward set of wellbores until substantially only sulfur is produced from the first inward set of wells. The first inward set of wells may be converted to injection wells. Sulfur may be introduced in the first inward set of wells to drive remaining formation fluid towards a second inward set of wells. The pattern may be continued until sulfur has been introduced into all of the treatment area. In some embodiments, a line drive may be used for introducing the sulfur into the treatment area.

In some embodiments, molten sulfur may be injected into the treatment area. The molten sulfur may act as a displacement agent that moves and/or entrains remaining fluid in the treatment area. The molten sulfur may be injected into the formation from selected wells. The sulfur may be at a temperature near a melting point of sulfur so that the sulfur has a relatively low viscosity. In some embodiments, the formation may be at a temperature above the boiling point of sulfur. Sulfur may be introduced into the formation as a gas or as a liquid.

Sulfur may be introduced into the formation until substantially only sulfur is produced from the last sulfur production well or production wells. When substantially only sulfur is produced from the last sulfur production well or production wells, introduction of additional sulfur may be stopped, and the production from the production well or production wells may be stopped. Sulfur in the formation may be allowed to remain in the formation and solidify.

Alternative energy sources may be used to supply electricity for subsurface electric heaters. Alternative energy sources include, but are not limited to, wind, off-peak power, hydroelectric power, geothermal, solar, and tidal wave action. Some of these alternative energy sources provide intermittent, time-variable power, or power-variable power. To provide power for subsurface electric heaters, power provided by these alternative energy sources may be conditioned to produce power with appropriate operating parameters (for example, voltage, frequency, and/or current) for the subsurface heaters.

FIG. 287 depicts an embodiment for generating electricity for subsurface heaters from an intermittent power source. The generated electrical power may be used to power other equipment used to treat a subsurface formation such as, but not limited to, pumps, computers, or other electrical equipment. In certain embodiments, windmill 1068 is used to generate electricity to power heaters 802. Windmill 1068 may represent one or more windmills in a wind farm. The windmills convert wind to a usable mechanical form of motion. In some embodiments, the wind farm may include advanced windmills as suggested by the National Renewable Energy Laboratory (Golden, Colo., U.S.A.). In some embodiments, windmill 1068 varies its power output during a 24 hour period (for example, the windmill may generate the most power at night). Using windmill 1068 as the power source may reduce the carbon dioxide footprint for supplying power to heaters 802. In some embodiments, windmill 1068 includes other intermittent, time-variable, or power-variable power sources.

In some embodiments, gas turbine 1070 is used to generate electricity to power heaters 802. Windmill 1068 and/or gas turbine 1070 may be coupled to transformer 1072. Transformer 1072 may convert power from windmill 1068 and/or gas turbine 1070 into electrical power with appropriate operating parameters for heaters 802 (for example, AC or DC power with appropriate voltage, current, and/or frequency may be generated by the transformer).

In certain embodiments, tap controller 1074 is coupled to transformer 1072, control system 1076, and heaters 802. Tap controller 1074 may monitor and control transformer 1072 to maintain a constant voltage to heaters 802, regardless of the load of the heaters. Tap controller 1074 may control power output in a range from 5 MVA (megavolt amps) to 500 MVA, from 10 MVA to 400 MVA, or from 20 MVA to 300 MVA. Tap controller 1074 may be designed to meet selected design requirements such as, but not limited to, load limitations of components (such as transformer 1072, control system 1076, and/or heaters 802) and the expected full load current in the electrical circuit. Tap controller 1074 may be an electromechanical, mechanical, electrical, electromagnetic, or solid state tap controller. In one embodiments, tap controller 1074 is a 32 step (±16 steps) electromechanical tap controller obtained from ABB Ltd. (Asea Brown Boveri) (Zurich, Switzerland). Tap controller 1074 may be a step controller that changes power in steps over a period of time (for example, 1 step per minute). Tap controller 1074 may operated over a percentage of the total range (for example, ±15% of the voltage or ±10% of the voltage).

As an example, during operation, an overload of voltage may be sent from transformer 1072. Tap controller 1074 may modify the load provided to heaters 802 and distribute the excess load to other heaters and/or other equipment in need of power. In some embodiments, tap controller 1074 may store the excess load for future use.

Control system 1076 may control tap controller 1074. Control system 1076 may be, for example, a computer controller or an analog logic system. Control system 1076 may use data supplied from power sensors 1078 to generate predictive algorithms and/or control tap controller 1074. For example, data may be an amount of power generated from windmill 1068, gas turbine 1070, and/or transformer 1072. Data may also include an amount of resistive load of heaters 802. Power sensors 1078 may be toroidal current sensors that output voltages that are proportional to the currents in wires passing through the sensors.

Automatic voltage regulation for resistive load of a heater enhances the life of the heaters and/or allows constant heat output from the heaters to a subsurface formation. Adjusting the load demands instead of adjusting the power source allows enhanced control of power supplied to heaters and/or other equipment that requires electricity. Power supplied to heaters 802 may be controlled within selected limits (for example, a power supplied and/or controlled to a heater within 1%, 5%, 10%, or 20% of power required by the heater). Control of power supplied from alternative energy sources may allow output of prime power at its rating, allow energy produced (for example, from an intermittent source, a subsurface formation, or a hydroelectric source) to be stored and used later, and/or allow use of power generated by intermittent power sources to be used as a constant source of energy.

Some hydrocarbon containing formations, such as oil shale formations, may include nahcolite, trona, dawsonite, and/or other minerals within the formation. In some embodiments, nahcolite is contained in partially unleached or unleached portions of the formation. Unleached portions of the formation are parts of the formation where minerals have not been removed by groundwater in the formation. For example, in the Piceance basin in Colorado, U.S.A., unleached oil shale is found below a depth of about 500 m below grade. Deep unleached oil shale formations in the Piceance basin center tend to be relatively rich in hydrocarbons. For example, about 0.10 liters to about 0.15 liters of oil per kilogram (L/kg) of oil shale may be producible from an unleached oil shale formation.

Nahcolite is a mineral that includes sodium bicarbonate ($NaHCO_3$). Nahcolite may be found in formations in the Green River lakebeds in Colorado, U.S.A. In some embodiments, at least about 5 weight %, at least about 10 weight %, or at least about 20 weight % nahcolite may be present in the formation. Dawsonite is a mineral that includes sodium aluminum carbonate ($NaAl(CO_3)(OH)_2$). Dawsonite is typically present in the formation at weight percents greater than about 2 weight % or, in some embodiments, greater than about 5 weight %. Nahcolite and/or dawsonite may dissociate at temperatures used in an in situ heat treatment process. The dissociation is strongly endothermic and may produce large amounts of carbon dioxide.

Nahcolite and/or dawsonite may be solution mined prior to, during, and/or following treatment of the formation in situ to avoid dissociation reactions and/or to obtain desired chemical compounds. In certain embodiments, hot water or steam is used to dissolve nahcolite in situ to form an aqueous sodium bicarbonate solution before the in situ heat treatment process is used to process hydrocarbons in the formation. Nahcolite may form sodium ions ($Na+$) and bicarbonate ions ($HCO_3$—) in aqueous solution. The solution may be produced from the formation through production wells, thus avoiding dissociation reactions during the in situ heat treatment process. In some embodiments, dawsonite is thermally decomposed to alumina during the in situ heat treatment process for treating hydrocarbons in the formation. The alumina is solution mined after completion of the in situ heat treatment process.

Production wells and/or injection wells used for solution mining and/or for in situ heat treatment processes may include smart well technology. The smart well technology allows the first fluid to be introduced at a desired zone in the formation. The smart well technology allows the second fluid to be removed from a desired zone of the formation.

Formations that include nahcolite and/or dawsonite may be treated using the in situ heat treatment process. A perimeter barrier may be formed around the portion of the formation to be treated. The perimeter barrier may inhibit migration of water into the treatment area. During solution mining and/or the in situ heat treatment process, the perimeter barrier may inhibit migration of dissolved minerals and formation fluid from the treatment area. During initial heating, a portion of the formation to be treated may be raised to a temperature below the dissociation temperature of the nahcolite. The temperature may be at most about 90° C., or in some embodiments, at most about 80° C. The temperature may be any temperature that increases the solvation rate of nahcolite in water, but is also below a temperature at which nahcolite dissociates (above about 95° C. at atmospheric pressure).

A first fluid may be injected into the heated portion. The first fluid may include water, brine, steam, or other fluids that form a solution with nahcolite and/or dawsonite. The first fluid may be at an increased temperature, for example, about 90° C., about 95° C., or about 100° C. The increased temperature may be similar to the temperature of the portion of the formation.

In some embodiments, the first fluid is injected at an increased temperature into a portion of the formation that has not been heated by heat sources. The increased temperature may be a temperature below a boiling point of the first fluid, for example, about 90° C. for water. Providing the first fluid at an increased temperature increases a temperature of a portion of the formation. In certain embodiments, additional heat may be provided from one or more heat sources in the formation during and/or after injection of the first fluid.

In other embodiments, the first fluid is or includes steam. The steam may be produced by forming steam in a previously heated portion of the formation (for example, by passing water through u-shaped wellbores that have been used to heat the formation), by heat exchange with fluids produced from the formation, and/or by generating steam in standard steam production facilities. In some embodiments, the first fluid may be fluid introduced directly into a hot portion of the portion and produced from the hot portion of the formation. The first fluid may then be used as the first fluid for solution mining.

In some embodiments, heat from a hot previously treated portion of the formation is used to heat water, brine, and/or steam used for solution mining a new portion of the formation. Heat transfer fluid may be introduced into the hot previously treated portion of the formation. The heat transfer fluid may be water, steam, carbon dioxide, and/or other fluids. Heat may transfer from the hot formation to the heat transfer fluid. The heat transfer fluid is produced from the formation through production wells. The heat transfer fluid is sent to a heat exchanger. The heat exchanger may heat water, brine, and/or steam used as the first fluid to solution mine the new portion of the formation. The heat transfer fluid may be reintroduced into the heated portion of the formation to produce additional hot heat transfer fluid. In some embodiments, heat transfer fluid produced from the formation is treated to remove hydrocarbons or other materials before being reintroduced into the formation as part of a remediation process for the heated portion of the formation.

Steam injected for solution mining may have a temperature below the pyrolysis temperature of hydrocarbons in the formation. Injected steam may be at a temperature below 250° C., below 300° C., or below 400° C. The injected steam may be at a temperature of at least 150° C., at least 135° C., or at least 125° C. Injecting steam at pyrolysis temperatures may cause problems as hydrocarbons pyrolyze and hydrocarbon fines mix with the steam. The mixture of fines and steam may reduce permeability and/or cause plugging of production wells and the formation. Thus, the injected steam temperature is selected to inhibit plugging of the formation and/or wells in the formation.

The temperature of the first fluid may be varied during the solution mining process. As the solution mining progresses and the nahcolite being solution mined is farther away from the injection point, the first fluid temperature may be increased so that steam and/or water that reaches the nahcolite to be solution mined is at an elevated temperature below the dissociation temperature of the nahcolite. The steam and/or water that reaches the nahcolite is also at a temperature below a temperature that promotes plugging of the formation and/or wells in the formation (for example, the pyrolysis temperature of hydrocarbons in the formation).

A second fluid may be produced from the formation following injection of the first fluid into the formation. The second fluid may include material dissolved in the first fluid. For example, the second fluid may include carbonic acid or other hydrated carbonate compounds formed from the dissolution of nahcolite in the first fluid. The second fluid may also include minerals and/or metals. The minerals and/or metals may include sodium, aluminum, phosphorus, and other elements.

Solution mining the formation before the in situ heat treatment process allows initial heating of the formation to be provided by heat transfer from the first fluid used during solution mining. Solution mining nahcolite or other minerals that decompose or dissociate by means of endothermic reactions before the in situ heat treatment process avoids having energy supplied to heat the formation being used to support these endothermic reactions. Solution mining allows for production of minerals with commercial value. Removing nahcolite or other minerals before the in situ heat treatment process removes mass from the formation. Thus, less mass is present in the formation that needs to be heated to higher temperatures and heating the formation to higher temperatures may be achieved more quickly and/or more efficiently. Removing mass from the formation also may increase the permeability of the formation. Increasing the permeability may reduce the number of production wells needed for the in situ heat treatment process. In certain embodiments, solution mining before the in situ heat treatment process reduces the time delay between startup of heating of the formation and production of hydrocarbons by two years or more.

FIG. 288 depicts an embodiment of solution mining well 1080. Solution mining well 1080 may include insulated portion 1082, input 1084, packer 1086, and return 1088. Insulated portion 1082 may be adjacent to overburden 482 of the formation. In some embodiments, insulated portion 1082 is low conductivity cement. The cement may be low density, low conductivity vermiculite cement or foam cement. Input 1084 may direct the first fluid to treatment area 1028. Perforations or other types of openings in input 1084 allow the first fluid to contact formation material in treatment area 1028. Packer 1086 may be a bottom seal for input 1084. First fluid passes through input 1084 into the formation. First fluid dissolves minerals and becomes second fluid. The second fluid may be denser than the first fluid. An entrance into return 1088 is typically located below the perforations or openings that allow the first fluid to enter the formation. Second fluid flows to return 1088. The second fluid is removed from the formation through return 1088.

FIG. 289 depicts a representation of an embodiment of solution mining well 1080. Solution mining well 1080 may include input 1084 and return 1088 in casing 1090. Input 1084 and/or return 1088 may be coiled tubing.

FIG. 290 depicts a representation of an embodiment of solution mining well 1080. Insulating portions 1082 may surround return 1088. Input 1084 may be positioned in return 1088. In some embodiments, input 1084 may introduce the first fluid into the treatment area below the entry point into return 1088. In some embodiments, crossovers may be used to direct first fluid flow and second fluid flow so that first fluid is introduced into the formation from input 1084 above the entry point of second fluid into return 1088.

FIG. 291 depicts an elevational view of an embodiment of wells used for solution mining and/or for an in situ heat treatment process. Solution mining wells 1080 may be placed in the formation in an equilateral triangle pattern. In some embodiments, the spacing between solution mining wells 1080 may be about 36 m. Other spacings may be used. Heat sources 202 may also be placed in an equilateral triangle pattern. Solution mining wells 1080 substitute for certain heat sources of the pattern. In the shown embodiment, the spacing between heat sources 202 is about 9 m. The ratio of solution mining well spacing to heat source spacing is 4. Other ratios may be used if desired. After solution mining is complete, solution mining wells 1080 may be used as production wells for the in situ heat treatment process.

In some formations, a portion of the formation with unleached minerals may be below a leached portion of the formation. The unleached portion may be thick and substantially impermeable. A treatment area may be formed in the unleached portion. Unleached portion of the formation to the sides, above and/or below the treatment area may be used as barriers to fluid flow into and out of the treatment area. A first treatment area may be solution mined to remove minerals, increase permeability in the treatment area, and/or increase the richness of the hydrocarbons in the treatment area. After solution mining the first treatment area, in situ heat treatment may be used to treat a second treatment area. In some embodiments, the second treatment area is the same as the first treatment area. In some embodiments, the second treatment has a smaller volume than the first treatment area so that heat provided by outermost heat sources to the formation do not raise the temperature of unleached portions of the formation to the dissociation temperature of the minerals in the unleached portions.

In some embodiments, a leached or partially leached portion of the formation above an unleached portion of the formation may include significant amounts of hydrocarbon materials. An in situ heating process may be used to produce hydrocarbon fluids from the unleached portions and the leached or partially leached portions of the formation. FIG. 292 depicts a representation of a formation with unleached zone 1092 below leached zone 1094. Unleached zone 1092 may have an initial permeability before solution mining of less than 0.1 millidarcy. Solution mining wells 1080 may be placed in the formation. Solution mining wells 1080 may include smart well technology that allows the position of first fluid entrance into the formation and second flow entrance into the solution mining wells to be changed. Solution mining wells 1080 may be used to form first treatment area 1028' in unleached zone 1092. Unleached zone 1092 may initially be substantially impermeable. Unleached portions of the formation may form a top barrier and side barriers around first treatment area 1028'. After solution mining first treatment area 1028', the portions of solution mining wells 1080 adjacent to the first treatment area may be converted to production wells and/or heater wells.

Heat sources 202 in first treatment area 1028' may be used to heat the first treatment area to pyrolysis temperatures. In some embodiments, one or more heat sources 202 are placed in the formation before first treatment area 1028' is solution mined. The heat sources may be used to provide initial heating to the formation to raise the temperature of the formation and/or to test the functionality of the heat sources. In some embodiments, one or more heat sources are installed during solution mining of the first treatment area, or after solution mining is completed. After solution mining, heat sources 202 may be used to raise the temperature of at least a portion of first treatment area 1028' above the pyrolysis and/or mobilization temperature of hydrocarbons in the formation to result in the generation of mobile hydrocarbons in the first treatment area.

Barrier wells 200 may be introduced into the formation. Ends of barrier wells 200 may extend into and terminate in unleached zone 1092. Unleached zone 1092 may be impermeable. In some embodiments, barrier wells 200 are freeze wells. Barrier wells 200 may be used to form a barrier to fluid flow into or out of unleached zone 1094. Barrier wells 200, overburden 482, and the unleached material above first treatment area 1028' may define second treatment area 1028". In some embodiments, a first fluid may be introduced into second treatment area 1028" through solution mining wells 1080 to raise the initial temperature of the formation in second treatment area 1028" and remove any residual soluble minerals from the second treatment area. In some embodiments, the top barrier above first treatment area 1028' may be solution mined to remove minerals and combine first treatment area 1028' and second treatment area 1028" into one treatment area. After solution mining, heat sources may be activated to heat the treatment area to pyrolysis temperatures.

FIG. 293 depicts an embodiment for solution mining the formation. Barrier 1058 (for example, a frozen barrier and/or a grout barrier) may be formed around a perimeter of treatment area 1028 of the formation. The footprint defined by the barrier may have any desired shape such as circular, square, rectangular, polygonal, or irregular shape. Barrier 1058 may be any barrier formed to inhibit the flow of fluid into or out of treatment area 1028. For example, barrier 1058 may include one or more freeze wells that inhibit water flow through the barrier. Barrier 1058 may be formed using one or more barrier wells 200. Formation of barrier 1058 may be monitored using monitor wells 1096 and/or by monitoring devices placed in barrier wells 200.

Water inside treatment area 1028 may be pumped out of the treatment area through injection wells 788 and/or production wells 206. In certain embodiments, injection wells 788 are used as production wells 206 and vice versa (the wells are used as both injection wells and production wells). Water may be pumped out until a production rate of water is low or stops.

Heat may be provided to treatment area 1028 from heat sources 202. Heat sources may be operated at temperatures that do not result in the pyrolysis of hydrocarbons in the formation adjacent to the heat sources. In some embodiments, treatment area 1028 is heated to a temperature from about 90° C. to about 120° C. (for example, a temperature of about 90° C., 95° C., 100° C., 110° C., or 120° C.). In certain embodiments, heat is provided to treatment area 1028 from the first fluid injected into the formation. The first fluid may be injected at a temperature from about 90° C. to about 120° C. (for example, a temperature of about 90° C., 95° C., 100° C., 110° C., or 120° C.). In some embodiments, heat sources 202 are installed in treatment area 1028 after the treatment area is solution mined. In some embodiments, some heat is provided from heaters placed in injection wells 788 and/or production wells 206. A temperature of treatment area 1028 may be monitored using temperature measurement devices placed in monitoring wells 1096 and/or temperature measurement devices in injection wells 788, production wells 206, and/or heat sources 202.

The first fluid is injected through one or more injection wells 788. In some embodiments, the first fluid is hot water. The first fluid may mix and/or combine with non-hydrocarbon material that is soluble in the first fluid, such as nahcolite, to produce a second fluid. The second fluid may be removed from the treatment area through injection wells 788, production wells 206, and/or heat sources 202. Injection wells 788, production wells 206, and/or heat sources 202 may be heated during removal of the second fluid. Heating one or more wells during removal of the second fluid may maintain the temperature of the fluid during removal of the fluid from the treatment area above a desired value. After producing a desired amount of the soluble non-hydrocarbon material from treatment area 1028, solution remaining within the treatment area may be removed from the treatment area through injection wells 788, production wells 206, and/or heat sources 202. The desired amount of the soluble non-hydrocarbon material may be less than half of the soluble non-hydrocarbon material, a majority of the soluble non-hydrocarbon material, substantially all of the soluble non-hydrocarbon material, or all of the soluble non-hydrocarbon material. Removing soluble non-hydrocarbon material may produce a relatively high permeability treatment area 1028.

Hydrocarbons within treatment area 1028 may be pyrolyzed and/or produced using the in situ heat treatment process following removal of soluble non-hydrocarbon materials. The relatively high permeability treatment area allows for easy movement of hydrocarbon fluids in the formation during in situ heat treatment processing. The relatively high permeability treatment area provides an enhanced collection area for pyrolyzed and mobilized fluids in the formation. During the in situ heat treatment process, heat may be provided to treatment area 1028 from heat sources 202. A mixture of hydrocarbons may be produced from the formation through production wells 206 and/or heat sources 202. In certain embodiments, injection wells 788 are used as either production wells and/or heater wells during the in situ heat treatment process.

In some embodiments, a controlled amount of oxidant (for example, air and/or oxygen) is provided to treatment area 1028 at or near heat sources 202 when a temperature in the formation is above a temperature sufficient to support oxidation of hydrocarbons. At such a temperature, the oxidant reacts with the hydrocarbons to provide heat in addition to heat provided by electrical heaters in heat sources 202. The controlled amount of oxidant may facilitate oxidation of hydrocarbons in the formation to provide additional heat for pyrolyzing hydrocarbons in the formation. The oxidant may more easily flow through treatment area 1028 because of the increased permeability of the treatment area after removal of the non-hydrocarbon materials. The oxidant may be provided in a controlled manner to control the heating of the formation. The amount of oxidant provided is controlled so that uncontrolled heating of the formation is avoided. Excess oxidant and combustion products may flow to production wells in treatment area 1028.

Following the in situ heat treatment process, treatment area 1028 may be cooled by introducing water to produce steam from the hot portion of the formation. Introduction of water to produce steam may vaporize some hydrocarbons remaining in the formation. Water may be injected through injection wells 788. The injected water may cool the formation. The remaining hydrocarbons and generated steam may be produced through production wells 206 and/or heat sources 202.

Treatment area 1028 may be cooled to a temperature near the boiling point of water. The steam produced from the formation may be used to heat a first fluid used to solution mine another portion of the formation.

Treatment area 1028 may be further cooled to a temperature at which water will condense in the formation. Water and/or solvent may be introduced into and be removed from the treatment area. Removing the condensed water and/or solvent from treatment area 1028 may remove any additional soluble material remaining in the treatment area. The water and/or solvent may entrain non-soluble fluid present in the formation. Fluid may be pumped out of treatment area 1028 through production well 206 and/or heat sources 202. The injection and removal of water and/or solvent may be repeated until a desired water quality within treatment area 1028 is achieved. Water quality may be measured at the injection wells, heat sources 202, and/or production wells. The water quality may substantially match or exceed the water quality of treatment area 1028 prior to treatment.

In some embodiments, treatment area 1028 may include a leached zone located above an unleached zone. The leached zone may have been leached naturally and/or by a separate leaching process. In certain embodiments, the unleached zone may be at a depth of at least about 500 m. A thickness of the unleached zone may be between about 100 m and about 500 m. However, the depth and thickness of the unleached zone may vary depending on, for example, a location of treatment area 1028 and/or the type of formation. In certain embodiments, the first fluid is injected into the unleached zone below the leached zone. Heat may also be provided into the unleached zone.

In certain embodiments, a section of a formation may be left untreated by solution mining and/or unleached. The unleached section may be proximate a selected section of the formation that has been leached and/or solution mined by providing the first fluid as described above. The unleached section may inhibit the flow of water into the selected section. In some embodiments, more than one unleached section may be proximate a selected section.

Nahcolite may be present in the formation in layers or beds. Prior to solution mining, such layers may have little or no permeability. In certain embodiments, solution mining layered or bedded nahcolite from the formation causes vertical shifting in the formation. FIG. 294 depicts an embodiment of a formation with nahcolite layers in the formation below overburden 482 and before solution mining nahcolite from the formation. Hydrocarbon layers 484A have substantially no nahcolite and hydrocarbon layers 484B have nahcolite. FIG. 295 depicts the formation of FIG. 294 after the nahcolite has been solution mined. Layers 484B have collapsed due to the removal of the nahcolite from the layers. The collapsing of layers 484B causes compaction of the layers and vertical shifting of the formation. The hydrocarbon richness of layers 484B is increased after compaction of the layers. In addition, the permeability of layers 484B may remain relatively high after compaction due to removal of the nahcolite. The permeability may be more than 5 darcy, more than 1 darcy, or more than 0.5 darcy after vertical shifting. The permeability may provide fluid flow paths to production wells when the formation is treated using an in situ heat treatment process. The increased permeability may allow for a large spacing between production wells. Distances between production wells for the in situ heat treatment system after solution mining may be greater than 10 m, greater than 20 m, or greater than 30 meters. Heater wells may be placed in the formation after removal of nahcolite and the subsequent vertical shifting. Forming heater wellbores and/or installing heaters in the formation after the vertical shifting protects the heaters from being damaged due to the vertical shifting.

In certain embodiments, removing nahcolite from the formation interconnects two or more wells in the formation. Removing nahcolite from zones in the formation may increase the permeability in the zones. Some zones may have more nahcolite than others and become more permeable as the nahcolite is removed. At a certain time, zones with the increased permeability may interconnect two or more wells (for example, injection wells or production wells) in the formation.

FIG. 296 depicts an embodiment of two injection wells interconnected by a zone that has been solution mined to remove nahcolite from the zone. Solution mining wells 1080 are used to solution mine hydrocarbon layer 484, which contains nahcolite. During the initial portion of the solution mining process, solution mining wells 1080 are used to inject water and/or other fluids, and to produce dissolved nahcolite fluids from the formation. Each solution mining well 1080 is used to inject water and produce fluid from a near wellbore region as the permeability of hydrocarbon layer is not sufficient to allow fluid to flow between the injection wells. In certain embodiments, zone 1098 has more nahcolite than other portions of hydrocarbon layer 484. With increased nahcolite removal from zone 1098, the permeability of the zone may increase. The permeability increases from the wellbores outwards as nahcolite is removed from zone 1098. At some point during solution mining of the formation, the permeability of zone 1098 increases to allow solution mining wells 1080 to become interconnected such that fluid will flow between the wells. At this time, one solution mining well 1080 may be used to inject water while the other solution mining well is used to produce fluids from the formation in a continuous process. Injecting in one well and producing from a second well may be more economical and more efficient in removing nahcolite, as compared to injecting and producing through the same well. In some embodiments, additional wells may be drilled into zone 1098 and/or hydrocarbon layer 484 in addition to solution mining wells 1080. The additional wells may be used to circulate additional water and/or to produce fluids from the formation. The wells may later be used as heater wells and/or production wells for the in situ heat treatment process treatment of hydrocarbon layer 484.

In some embodiments, a treatment area has nahcolite beds above and/or below the treatment area. The nahcolite beds may be relatively thin (for example, about 5 m to about 10 m in thickness). In an embodiment, the nahcolite beds are solution mined using horizontal solution mining wells in the nahcolite beds. The nahcolite beds may be solution mined in a short amount of time (for example, in less than 6 months). After solution mining of the nahcolite beds, the treatment area and the nahcolite beds may be heated using one or more heaters. The heaters may be placed either vertically, horizontally, or at other angles within the treatment area and the nahcolite beds. The nahcolite beds and the treatment area may then undergo the in situ heat treatment process.

In some embodiments, the solution mining wells in the nahcolite beds are converted to production wells. The production wells may be used to produce fluids during the in situ heat treatment process. Production wells in the nahcolite bed above the treatment area may be used to produce vapors or gas (for example, gas hydrocarbons) from the formation. Production wells in the nahcolite bed below the treatment area may be used to produce liquids (for example, liquid hydrocarbons) from the formation.

FIG. 297 depicts a representation of an embodiment for treating a portion of a formation having hydrocarbon containing layer 484 between upper nahcolite bed 1978 and lower nahcolite bed 1978'. In an embodiment, nahcolite beds 1978, 1978' have thicknesses of about 5 m and include relatively large amounts of nahcolite (for example, over about 50 weight percent nahcolite. In the embodiment, hydrocarbon containing layer 484 is at a depth of over 595 meters below the surface, has a thickness of 40 m or more and has oil shale with an average richness of over 100 liters per metric ton. Hydrocarbon containing layer 484 may contain relatively little nahcolite, though the hydrocarbon containing layer may contain some seams of nahcolite typically with thicknesses less than 3 m.

Solution mining wells 1080 may be formed in nahcolite beds 1978, 1978' (i.e., into and out of the page as depicted in FIG. 297). FIG. 298 depicts a representation of a portion of the formation that is orthogonal to the formation depicted in FIG. 297 and passes through one of solution mining wells 1080 in nahcolite bed 1978. Solution mining wells 1080 may be spaced apart by 25 m or more. Hot water and/or steam may be circulated into the formation from solution mining wells 1080 to dissolve nahcolite in nahcolite beds 1978, 1978'. Dissolved nahcolite may be produced from the formation through solution mining wells 1080. After completion of solution mining, production liners may be installed in one or more of the solution mining wells 1080 and the solution mining wells may be converted to production wells for an in situ heat treatment process used to produce hydrocarbons from hydrocarbon containing layer 484.

Before, during or after solution mining of nahcolite beds 1978, 1978', heater wellbores 428 may be formed in the formation in a pattern (for example, in a triangular pattern as depicted in FIG. 298 with wellbores going into and out of the page). As depicted in FIG. 297, portions of heater wellbores 428 may pass through nahcolite bed 1978. Portions of heater wellbores 428 may pass into or through nahcolite bed 1978'. Heaters wellbores 428 may be oriented at an angle (as depicted in FIG. 297), oriented vertically, or oriented substantially horizontally if the nahcolite layers dip. Heaters may be placed in heater wellbores 428. Heating sections of the heaters may provide heat to hydrocarbon containing layer 484. The wellbore pattern may allow superposition of heat from the heaters to raise the temperature of hydrocarbon containing layer 484 to a desired temperature in a reasonable amount of time.

Packers, cement, or other sealing systems may be used to inhibit formation fluid from moving up wellbores 428 past an upper portion of nahcolite bed 1978 if formation above the nahcolite bed is not to be treated. Packers, cement, or other sealing systems may be used to inhibit formation fluid past a lower portion of nahcolite bed 1978' if formation below the nahcolite bed is not to be treated and wellbores 428 extend past the nahcolite bed.

After solution mining of nahcolite beds 1978, 1978' is completed, heaters in heater wellbores 428 may raise the temperature of hydrocarbon containing layer 484 to mobilization and/or pyrolysis temperatures. Formation fluid generated from hydrocarbon containing layer 484 may be produced from the formation through converted solution mining wells 1080. Initially, vaporized formation fluid may flow along heater wellbores 428 to converted solution mining wells 1080 in nahcolite bed 1978. Initially, liquid formation fluid may flow along heater wellbores 428 to converted solution mining wells 1080 in nahcolite bed 1978'. As heating is continued, fractures caused by heating and/or increased permeability due to the removal of material may provide additional fluid pathways to nahcolite beds 1978, 1978' so that formation fluid generated from hydrocarbon containing layer 484 may be produced from converted solution mining wells 1080 in the nahcolite beds. Converted solution mining wells 1080 in nahcolite bed 1978 may be used to primarily produce vaporized formation fluids. Converted solution mining wells 1080 in nahcolite bed 1978' may be used to primarily produce liquid formation fluid.

In some embodiments, the second fluid produced from the formation during solution mining is used to produce sodium bicarbonate. Sodium bicarbonate may be used in the food and pharmaceutical industries, in leather tanning, in fire retardation, in wastewater treatment, and in flue gas treatment (flue gas desulphurization and hydrogen chloride reduction). The second fluid may be kept pressurized and at an elevated temperature when removed from the formation. The second fluid may be cooled in a crystallizer to precipitate sodium bicarbonate.

In some embodiments, the second fluid produced from the formation during solution mining is used to produce sodium carbonate, which is also referred to as soda ash. Sodium carbonate may be used in the manufacture of glass, in the manufacture of detergents, in water purification, polymer production, tanning, paper manufacturing, effluent neutralization, metal refining, sugar extraction, and/or cement manufacturing. The second fluid removed from the formation may be heated in a treatment facility to form sodium carbonate (soda ash) and/or sodium carbonate brine. Heating sodium bicarbonate will form sodium carbonate according to the equation:

$$2NaHCO_3 \rightarrow Na_2CO_3 + CO_2 + H_2O. \quad \text{(EQN. 15)}$$

In certain embodiments, the heat for heating the sodium bicarbonate is provided using heat from the formation. For example, a heat exchanger that uses steam produced from the water introduced into the hot formation may be used to heat the second fluid to dissociation temperatures of the sodium bicarbonate. In some embodiments, the second fluid is circulated through the formation to utilize heat in the formation for further reaction. Steam and/or hot water may also be added to facilitate circulation. The second fluid may be circulated through a heated portion of the formation that has been subjected to the in situ heat treatment process to produce hydrocarbons from the formation. At least a portion of the carbon dioxide generated during sodium carbonate dissociation may be adsorbed on carbon that remains in the formation after the in situ heat treatment process. In some embodiments, the second fluid is circulated through conduits previously used to heat the formation.

In some embodiments, higher temperatures are used in the formation (for example, above about 120° C., above about 130° C., above about 150° C., or below about 250° C.) during solution mining of nahcolite. The first fluid is introduced into the formation under pressure sufficient to inhibit sodium bicarbonate from dissociating to produce carbon dioxide. The pressure in the formation may be maintained at sufficiently high pressures to inhibit such nahcolite dissociation but below pressures that would result in fracturing the formation. In addition, the pressure in the formation may be maintained high enough to inhibit steam formation if hot water is being introduced in the formation. In some embodiments, a portion of the nahcolite may begin to decompose in situ. In such cases, nahcolite is removed from the formation as soda ash. If soda ash is produced from solution mining of nahcolite, the soda ash may be transported to a separate facility for treatment. The soda ash may be transported through a pipeline to the separate facility.

As described above, in certain embodiments, following removal of nahcolite from the formation, the formation is treated using the in situ heat treatment process to produce formation fluids from the formation. In some embodiments, the formation is treating using the in situ heat treatment process before solution mining nahcolite from the formation. The nahcolite may be converted to sodium carbonate (from sodium bicarbonate) during the in situ heat treatment process. The sodium carbonate may be solution mined as described above for solution mining nahcolite prior to the in situ heat treatment process.

In some formations, dawsonite is present in the formation. Dawsonite within the heated portion of the formation decomposes during heating of the formation to pyrolysis temperature. Dawsonite typically decomposes at temperatures above 270° C. according to the reaction:

$$2NaAl(OH)_2CO_3 \rightarrow Na_2CO_3 + Al_2O_3 + 2H_2O + CO_2. \quad \text{(EQN. 16)}$$

Sodium carbonate may be removed from the formation by solution mining the formation with water or other fluid into which sodium carbonate is soluble. In certain embodiments, alumina formed by dawsonite decomposition is solution mined using a chelating agent. The chelating agent may be injected through injection wells, production wells, and/or heater wells used for solution mining nahcolite and/or the in situ heat treatment process (for example, injection wells 788, production wells 206, and/or heat sources 202 depicted in FIG. 293). The chelating agent may be an aqueous acid. In certain embodiments, the chelating agent is EDTA (ethylenediaminetetraacetic acid). Other examples of possible chelating agents include, but are not limited to, ethylenediamine, porphyrins, dimercaprol, nitrilotriacetic acid, diethylenetriaminepentaacetic acid, phosphoric acids, acetic acid, acetoxy benzoic acids, nicotinic acid, pyruvic acid, citric acid, tartaric acid, malonic acid, imidizole, ascorbic acid, phenols, hydroxy ketones, sebacic acid, and boric acid. The mixture of chelating agent and alumina may be produced through production wells or other wells used for solution mining and/or the in situ heat treatment process (for example, injection wells 788, production wells 206, and/or heat sources 202, which are depicted in FIG. 293). The alumina may be separated from the chelating agent in a treatment facility. The recovered chelating agent may be recirculated back to the formation to solution mine more alumina.

In some embodiments, alumina within the formation may be solution mined using a basic fluid after the in situ heat treatment process. Basic fluids include, but are not limited to, sodium hydroxide, ammonia, magnesium hydroxide, magnesium carbonate, sodium carbonate, potassium carbonate, pyridine, and amines. In an embodiment, sodium carbonate brine, such as 0.5 Normal $Na_2CO_3$, is used to solution mine alumina. Sodium carbonate brine may be obtained from solution mining nahcolite from the formation. Obtaining the basic fluid by solution mining the nahcolite may significantly reduce costs associated with obtaining the basic fluid. The basic fluid may be injected into the formation through a heater well and/or an injection well. The basic fluid may combine with alumina to form an alumina solution that is removed from the formation. The alumina solution may be removed through a heater well, injection well, or production well.

Alumina may be extracted from the alumina solution in a treatment facility. In an embodiment, carbon dioxide is bubbled through the alumina solution to precipitate the alumina from the basic fluid. Carbon dioxide may be obtained from dissociation of nahcolite, from the in situ heat treatment process, or from decomposition of the dawsonite during the in situ heat treatment process.

In certain embodiments, a formation may include portions that are significantly rich in either nahcolite or dawsonite only. For example, a formation may contain significant amounts of nahcolite (for example, at least about 20 weight %, at least about 30 weight %, or at least about 40 weight %) in a depocenter of the formation. The depocenter may contain only about 5 weight % or less dawsonite on average. However, in bottom layers of the formation, a weight percent of dawsonite may be about 10 weight % or even as high as about 25 weight %. In such formations, it may be advantageous to solution mine for nahcolite only in nahcolite-rich areas, such as the depocenter, and solution mine for dawsonite only in the dawsonite-rich areas, such as the bottom layers. This selective solution mining may significantly reduce fluid costs, heating costs, and/or equipment costs associated with operating the solution mining process.

In certain formations, dawsonite composition varies between layers in the formation. For example, some layers of the formation may have dawsonite and some layers may not. In certain embodiments, more heat is provided to layers with more dawsonite than to layers with less dawsonite. Tailoring heat input to provide more heat to certain dawsonite layers more uniformly heats the formation as the reaction to decompose dawsonite absorbs some of the heat intended for pyrolyzing hydrocarbons. FIG. 299 depicts an embodiment for heating a formation with dawsonite in the formation. Hydrocarbon layer 484 may be cored to assess the dawsonite composition of the hydrocarbon layer. The mineral composition may be assessed using, for example, FTIR (Fourier transform infrared spectroscopy) or x-ray diffraction. Assessing the core composition may also assess the nahcolite composition of the core. After assessing the dawsonite composition, heater 438 may be placed in wellbore 428. Heater 438 includes sections to provide more heat to hydrocarbon layers with more dawsonite in the layers (hydrocarbon layers 484D). Hydrocarbon layers with less dawsonite (hydrocarbon layers 484C) are provided with less heat by heater 438. Heat output of heater 438 may be tailored by, for example, adjusting the resistance of the heater along the length of the heater. In one embodiment, heater 438 is a temperature limited heater, described herein, that has a higher temperature limit (for example, higher Curie temperature) in sections proximate layers 484D as compared to the temperature limit (Curie temperature) of sections proximate layers 484C. The resistance of heater 438 may also be adjusted by altering the resistive conducting materials along the length of the heater to supply a higher energy input (watts per meter) adjacent to dawsonite rich layers.

Solution mining dawsonite and nahcolite may be relatively simple processes that produce alumina and soda ash from the formation. In some embodiments, hydrocarbons produced from the formation using the in situ heat treatment process may be fuel for a power plant that produces direct current (DC) electricity at or near the site of the in situ heat treatment process. The produced DC electricity may be used on the site to produce aluminum metal from the alumina using the Hall process. Aluminum metal may be produced from the alumina by melting the alumina in a treatment facility on the site. Generating the DC electricity at the site may save on costs associated with using hydrotreaters, pipelines, or other treatment facilities associated with transporting and/or treating hydrocarbons produced from the formation using the in situ heat treatment process.

In some embodiments, acid may be introduced into the formation through selected wells to increase the porosity adjacent to the wells. For example, acid may be injected if the formation comprises limestone or dolomite. The acid used to treat the selected wells may be acid produced during in situ heat treatment of a section of the formation (for example, hydrochloric acid), or acid produced from byproducts of the in situ heat treatment process (for example, sulfuric acid produced from hydrogen sulfide or sulfur).

In some embodiments, a saline rich zone is located at or near an unleached portion of the formation. The saline rich zone may be an aquifer in which water has leached out nahcolite and/or other minerals. A high flow rate may pass through the saline rich zone. Saline water from the saline rich zone may be used to solution mine another portion of the formation. In certain embodiments, a steam and electricity cogeneration facility may be used to heat the saline water prior to use for solution mining.

FIG. 300 depicts a representation of an embodiment for solution mining with a steam and electricity cogeneration facility. Treatment area 1028 may be formed in unleached portion 1092 of the formation (for example, an oil shale formation). Several treatment areas 1028 may be formed in unleached portion 1092 leaving top, side, and/or bottom walls of unleached formation as barriers around the individual treatment areas to inhibit inflow and outflow of formation fluid during the in situ heat treatment process. The thickness of the walls surrounding the treatment areas may be 10 m or more. For example, the side wall near closest to saline zone 1100 may be 60 m or more thick, and the top wall may be 30 m or more thick.

Treatment area 1028 may have significant amounts of nahcolite. Saline zone 1100 is located at or near treatment area 1028. In certain embodiments, zone 1100 is located up dip from treatment area 1028. Zone 1100 may be leached or partially leached such that the zone is mainly filled with saline water.

In certain embodiments, saline water is removed (pumped) from zone 1100 using production well 206. Production well 206 may be located at or near the lowest portion of zone 1100 so that saline water flows into the production well. Saline water removed from zone 1100 is heated to hot water and/or steam temperatures in facility 796. Facility 796 may burn hydrocarbons to run generators that produce electricity. Facility 796 may burn gaseous and/or liquid hydrocarbons to make electricity. In some embodiments, pulverized coal is used to make electricity. The electricity generated may be used to provide electrical power for heaters or other electrical operations (for example, pumping). Waste heat from the generators is used to make hot water and/or steam from the saline water. After the in situ heat treatment process of one or more treatment areas 1028 results in the production of hydrocarbons, at least a portion of the produced hydrocarbons may be used as fuel for facility 796.

The hot water and/or steam made by facility 796 is provided to solution mining well 1080. Solution mining well 1080 is used to solution mine treatment area 1028. Nahcolite and/or other minerals are removed from treatment area 1028 by solution mining well 1080. The nahcolite may be removed as a nahcolite solution from treatment area 1028. The solution removed from treatment area 1028 may be a brine solution with dissolved nahcolite. Heat from the removed nahcolite solution may be used in facility 796 to heat saline water from zone 1100 and/or other fluids. The nahcolite solution may then be injected through injection well 788 into zone 1100. In some embodiments, injection well 788 injects the nahcolite solution into zone 1100 up dip from production well 206. Injection may occur a significant distance up dip so that nahcolite solution may be continuously injected as saline water is removed from the zone without the two fluids substantially intermixing. In some embodiments, the nahcolite solution from treatment area 1028 is provided to injection well 788 without passing through facility 796 (the nahcolite solution bypasses the facility).

The nahcolite solution injected into zone 1100 may be left in the zone permanently or for an extended period of time (for example, after solution mining, production well 206 may be shut in). In some embodiments, the nahcolite stored in zone 1100 is accessed at later times. The nahcolite may be produced by removing saline water from zone 1100 and processing the saline water to make sodium bicarbonate and/or soda ash.

Solution mining using saline water from zone 1100 and heat from facility 796 to heat the saline water may be a high efficiency process for solution mining treatment area 1028. Facility 796 is efficient at providing heat to the saline water. Using the saline water to solution mine decreases costs associated with pumping and/or transporting water to the treatment site. Additionally, solution mining treatment area 1028 preheats the treatment area for any subsequent heat treatment of the treatment area, enriches the hydrocarbon content in the treatment area by removing nahcolite, and/or creates more permeability in the treatment area by removing nahcolite.

In certain embodiments, treatment area 1028 is further treated using an in situ heat treatment process following solution mining of the treatment area. A portion of the electricity generated in facility 796 may be used to power heaters for the in situ heat treatment process.

In some embodiments, a perimeter barrier may be formed around the portion of the formation to be treated. The perimeter barrier may inhibit migration of formation fluid into or out of the treatment area. The perimeter barrier may be a frozen barrier and/or a grout barrier. After formation of the perimeter barrier, the treatment area may be processed to produce desired products.

Formations that include non-hydrocarbon materials may be treated to remove and/or dissolve a portion of the non-hydrocarbon materials from a section of the formation before hydrocarbons are produced from the section. In some embodiments, the non-hydrocarbon materials are removed by solution mining. Removing a portion of the non-hydrocarbon materials may reduce the carbon dioxide generation sources present in the formation. Removing a portion of the non-hydrocarbon materials may increase the porosity and/or permeability of the section of the formation. Removing a portion of the non-hydrocarbon materials may result in a raised temperature in the section of the formation.

After solution mining, some of the wells in the treatment may be converted to heater wells, injection wells, and/or production wells. In some embodiments, additional wells are formed in the treatment area. The wells may be heater wells, injection wells, and/or production wells. Logging techniques may be employed to assess the physical characteristics, including any vertical shifting resulting from the solution mining, and/or the composition of material in the formation. Packing, baffles or other techniques may be used to inhibit formation fluid from entering the heater wells. The heater wells may be activated to heat the formation to a temperature sufficient to support combustion.

One or more production wells may be positioned in permeable sections of the treatment area. Production wells may be horizontally and/or vertically oriented. For example, production wells may be positioned in areas of the formation that have a permeability of greater than 5 darcy or 10 darcy. In some embodiments, production wells may be positioned near a perimeter barrier. A production well may allow water and production fluids to be removed from the formation. Positioning the production well near a perimeter barrier enhances the flow of fluids from the warmer zones of the formation to the cooler zones.

FIG. 301 depicts an embodiment of a process for treating a hydrocarbon containing formation with a combustion front. Barrier 1058 (for example, a frozen barrier or a grout barrier) may be formed around a perimeter of treatment area 1028 of the formation. The footprint defined by the barrier may have any desired shape such as circular, square, rectangular, polygonal, or irregular shape. Barrier 1058 may be formed using one or more barrier wells 200. The barrier may be any barrier formed to inhibit the flow of fluid into or out of treatment area 1028. In some embodiments, barrier 1058 may be a double barrier.

Heat may be provided to treatment area 1028 through heaters positioned in injection wells 788. In some embodiments, the heaters in injection wells 788 heat formation adjacent to the injections wells to temperatures sufficient to support combustion. Heaters in injection wells 788 may raise the formation near the injection wells to temperatures from about 90° C. to about 120° C. or higher (for example, a temperature of about 90° C., 95° C., 100° C., 110° C., or 120° C.).

Injection wells 788 may be used to introduce a combustion fuel, an oxidant, steam and/or a heat transfer fluid into treatment area 1028, either before, during, or after heat is provided to treatment area 1028 from heaters. In some embodiments, injection wells 788 are in communication with each other to allow the introduced fluid to flow from one well to another. Injection wells 788 may be located at positions that are relatively far away from perimeter barrier 1058. Introduced fluid may cause combustion of hydrocarbons in treatment area 1028. Heat from the combustion may heat treatment area 1028 and mobilize fluids toward production wells 206.

A temperature of treatment area 1028 may be monitored using temperature measurement devices placed in monitoring wells and/or temperature measurement devices in injection wells 788, production wells 206, and/or heater wells.

In some embodiments, a controlled amount of oxidant (for example, air and/or oxygen) is provided in injection wells 788 to advance a heat front towards production wells 206. In some embodiments, the controlled amount of oxidant is introduced into the formation after solution mining has established permeable interconnectivity between at least two injection wells. The amount of oxidant is controlled to limit the advancement rate of the heat front and to limit the temperature of the heat front. The advancing heat front may pyrolyze hydrocarbons. The high permeability in the formation allows the pyrolyzed hydrocarbons to spread in the formation towards production wells without being overtaken by the advancing heat front.

Vaporized formation fluid and/or gas formed during the combustion process may be removed through gas wells 1102 and/or injection wells 788. Venting of gases through gas wells 1102 and/or injection wells 788 may force the combustion front in a desired direction.

In some embodiments, the formation may be heated to a temperature sufficient to cause pyrolysis of the formation fluid by the steam and/or heat transfer fluid. The steam and/or heat transfer fluid may be heated to temperatures of about 300° C., about 400° C., about 500° C., or about 600° C. In certain embodiments, the steam and/or heat transfer fluid may be co-injected with the fuel and/or oxidant.

FIG. 302 depicts a representation of a cross-sectional view of an embodiment for treating a hydrocarbon containing formation with a combustion front. As the combustion front is initiated and/or fueled through injection wells 788, formation fluid near periphery 1104 of the combustion front becomes mobile and flow towards production wells 206 located proximate barrier 1058. Injection wells may include smart well technology. Combustion products and noncondensable formation fluid may be removed from the formation through gas wells 1102. In some embodiments, no gas wells are formed in the formation. In such embodiments, formation fluid, combustion products and noncondensable formation fluid are produced through production wells 206. In embodiments that include gas wells 1102, condensable formation fluid may be produced through production well 206. In some embodiments, production well 206 is located below injection well 788. Production well 206 may be about 1 m, 5 m, 10 m or more below injection well 788. Production well may be a horizontal well. Periphery 1104 of the combustion front may advance from the toe of production well 206 towards the heel of the production well. Production well 206 may include a perforated liner that allows hydrocarbons to flow into the production well. In some embodiments, a catalyst may be placed in production well 206. The catalyst may upgrade and/or stabilize formation fluid in the production well.

Gases may be produced during in situ heat treatment processes and during many conventional production processes. Some of the produced gases (for example, carbon dioxide and/or hydrogen sulfide) when introduced into water may change the pH of the water to less than 7. Such gases are typically referred to as sour gas or acidic gas. Introducing sour gas from produced fluid into subsurface formations may reduce or eliminate the need for or size of certain surface facilities (for example, a Claus plant or Scot gas treater). Introducing sour gas from produced formation fluid into subsurface formations may make the formation fluid more acceptable for transportation, use, and/or processing. Removal of sour gas having a low heating value (for example, carbon dioxide) from formation fluids may increase the caloric value of the gas stream separated from the formation fluid.

Net release of sour gas to the atmosphere and/or conversion of sour gas to other compounds may be reduced by utilizing the produced sour gas and/or by storing the sour gas within subsurface formations. In some embodiments, the sour gas is stored in deep saline aquifers. Deep saline aquifers may be at depths of about 900 m or more below the surface. The deep saline aquifers may be relatively thick and permeable. A thick and relatively impermeable formation strata may be located over deep saline aquifers. For example, 500 m or more of shale may be located above the deep saline aquifer. The water in the deep saline aquifer may be unusable for agricultural or other common uses because of the high mineral content in the water. Over time, the minerals in the water may react with introduced sour gas to form precipitates in the deep saline aquifer. The deep saline aquifer used to store sour gas may be below the treatment area, at another location in the same formation, or in another formation. If the deep saline aquifer is located at another location in the same formation or in another formation, the sour gas may be transported to the deep saline aquifer by pipeline.

In some embodiments, injection wells used to inject sour gas may be vertical, slanted, and/or directionally steered wells with a significant horizontal or near horizontal portion. The horizontal or near horizontal portion of the injection well may be located near or at the bottom of the deep saline aquifer. FIG. 303 depicts a representation of an embodiment of a system for injection of sour gases produced from the in situ heat treatment process into the deep saline aquifer. Formation fluids may be produced from hydrocarbon layer 484. In certain embodiments, formation fluids are produced using an in situ heat treatment process through production well 206. The sour gas (for example, gas including at least carbon dioxide and hydrogen sulfide) may be separated from the formation fluids in gas/liquid separator 1106 using known gas/liquid separation techniques.

The separated sour gas may be transported to formation 1108 via conduit 1110 (for example, a pipeline). Formation 1108 may include aquifer 1112 (for example, a deep saline aquifer) and barrier portion 1114 (for example, shale). The sour gas may be injected into deep saline aquifer 1112 through injection well 1116. Injection well 1116 may have vertical portion 1118 and horizontal portion 1120. Horizontal portion 1120 may be near or at the bottom of deep saline aquifer 1112. The sour gas may be less dense than formation fluid in the deep saline aquifer. The sour gas may diffuse upwards in the aquifer towards barrier layer 1114. Horizontal portion 1120 may allow injection of the sour gas in a large portion of deep saline aquifer 1112. Openings in horizontal portion 1120 may be critical flow orifices so that fluid is introduced substantially equally along the length of the horizontal portion.

Cement 1122 may be used to seal conduit 1110 in formation. Cement 1122 used in injection wellbores to form seals at the surface and/or at an interface of deep saline aquifer with barrier layer 1114 may be selected so that the cement does not degrade due to the temperature, pressure and chemical environment due to exposure to sour gas.

The deep saline aquifer or aquifers used to store sour gas may be at sufficient depth such that the carbon dioxide in the sour gas is introduced in the formation in a supercritical state. Supercritical carbon dioxide injection may maximize the density of the fluid introduced into the formation. The depths of outlets of injection wells used to introduce acidic gases in the formation may be 900 m or more below the surface.

Injection of sour gas into a non-producing formation and/or using sour gas as flooding agents are described in U.S. Pat. Nos. 7,128,150 to Thomas et al.; RE 39,244 to Eaton; RE 39,077 to Eaton; 6,755,251 to Thomas et al.; 6,283,230 to Peters, all of which are incorporated by reference as if fully set forth herein.

During production of formation fluids from a subsurface formation, acidic gases may react with water in the formation and produce acids. For example, carbonic acid may be produced from the reaction of carbon dioxide with water during heating of the formation. Portions of wells made of certain materials, such as carbon steel, may start to deteriorate or corrode in the presence of the produced acids. To inhibit corrosion due to produced acids (for example, carbonic acid), fluids and/or polymers (for example, corrosion inhibitors, foaming agents, surfactants, basic fluids, hydrocarbons, high density polyethylene, or mixtures thereof) may be introduced in the wellbore to neutralize, dissolve the acids, and/or inhibit corrosion of piping in the formation.

In some embodiments, hydrogen sulfide and/or carbon dioxide are separated from the produced gases and introduced into one or more wellbores in a subsurface formation. Water present in the gas introduced into the formation may interact with hydrogen sulfide to form a sulfide layer on metal surfaces of the injection well. Formation of the sulfide layer may inhibit further corrosion of the metal surfaces of the injection well by carbonic acid and/or other acids. The formation of the sulfide layer may allow for the use of carbon steel or other relatively inexpensive alloys during the introduction of sour gas into subsurface formations.

In certain embodiments, a temperature measurement tool assesses the active impedance of an energized heater. The temperature measurement tool may utilize the frequency domain analysis algorithm associated with Partial Discharge measurement technology (PD) coupled with timed domain reflectometer measurement technology (TDR). A set of frequency domain analysis tools may be applied to a TDR signature. This process may provide unique information in the analysis of the energized heater such as, but not limited to, an impedance log of the entire length of the heater per unit length. The temperature measurement tool may provide certain advantages for assessing the temperature of a downhole heater.

In certain embodiments, the temperature measurement tool assesses the impedance per unit length and gives a profile on the entire length of the heated section of the heater. The impedance profile may be used in association with laboratory data for the heater (such as temperature and resistance profiles for heaters measured at various loads and frequencies) to assess the temperature per unit length of the heated section. The impedance profile may also be used to assess various computer models for heaters that are used in association with the reservoir simulations.

In certain embodiments, the temperature measurement tool assesses an accurate impedance profile of a heater in a specific formation after a number of heater wells have been installed and energized in the specific formation. The accurate impedance profile may assess the actual reactive and real power consumption for each heater that is used similarly. This information may be used to properly size surface electrical distribution equipment and/or eliminate any extra capacity designed to accommodate any anticipated heater impedance turndown ratio or any unknown power factor or reactive power consumption for the heaters.

In certain embodiments, the temperature measurement tool is used to troubleshoot malfunctioning heaters and assess the impedance profile of the length of the heated section. The impedance profile may be able to accurately predict the location of a faulted section and its relative impedance to ground. This information may be used to accurately assess the appropriate reduction in surface voltage to allow the heater to continue to operate in a limited capacity. This method may be more preferable than abandoning the heater in the formation.

In certain embodiments, frequency domain PD testing offers an improved set of PD characterization tools. A basic set of frequency domain PD testing tools are described in "The Case for Frequency Domain PD Testing In The Context Of Distribution Cable", Steven Boggs, *Electrical Insulation Magazine, IEEE*, Vol. 19, Issue 4, July-August 2003, pages 13-19, which is incorporated by reference as if fully set forth herein. Frequency domain PD detection sensitivity under field conditions may be one to two orders of magnitude greater than for time domain testing as a result of there not being a need to trigger on the first PD pulse above the broadband noise, and the filtering effect of the cable between the PD detection site and the terminations. As a result of this greatly increased sensitivity and the set of characterization tools, frequency domain PD testing has been developed into a highly sensitive and reliable tool for characterizing the condition of distribution cable during normal operation while the cable is energized.

During or after solution mining and/or the in situ heat treatment process, some existing cased heater wells and/or some existing cased monitor wells may be converted into production wells and/or injection wells. Existing cased wells may be converted to production and/or injection wells by perforating a portion of the well casing with perforation devices that utilize explosives. Also, some production wells may be perforated at one or more cased locations to facilitate removal of formation fluid through newly opened sections in the production wells. In some embodiments, perforation devices may be used in open wellbores to fracture formation adjacent to the wellbore.

In some embodiments, pre-perforated portions of wells are installed. Coverings may initially be placed over the perforations. At a desired time, the covering of the perforations may be removed to open additional portions of the wells or to convert the wells to production wells and/or injections wells. Knowing which wells will need to be converted to production wells and/or injection wells may not be apparent at the time of well installation. Using pre-perforated wells for all wells may be prohibitively expensive.

Perforation devices may be used to form openings in a well. Perforation devices may be obtained from, for example, Schlumberger USA (Sugar Land, Tex., USA). Perforation devices may include, but are not limited to, capsule guns and/or hollow carrier guns. Perforation devices may use explosives to form openings in a well. The well may need to be at a relatively cool temperature to inhibit premature detonation of the explosives. Temperature exposure limits of some explosives commonly used for perforation devices are a maximum exposure of 1 hour to a temperature of about 260° C., and a maximum exposure of 10 hours to a temperature of about 210° C. In some embodiments, the well is cooled before use of the perforation device. In some embodiments, the perforation device is insulated to inhibit heat transfer to the perforation device. The use of insulation may not be suitable for wells with portions that are at high temperature (for example, above 300° C.).

In some embodiments, the perforation device is equipped with a circulated fluid cooling system. The circulated fluid cooling system may keep the temperature of the perforation device below a desired value. Keeping the temperature of the perforation device below a selected temperature may inhibit premature detonation of explosives in the perforation device.

One or more temperature sensing devices may be included in the circulated fluid cooling system to allow temperatures in the well and/or near the perforating device to be observed. After insertion into the well, the perforation device may be activated to form openings in the well. The openings may be of sufficient size to allow fluid to be pumped through the well after removal of the perforation device positioning apparatus.

FIG. 304 represents a perspective view of circulated fluid cooling system 1124 that provides continuous and/or semi-continuous cooling fluid to perforating device 1126. Circulated fluid cooling system 1124 may include outer tubing 1128, inner tubing 1130, connectors 1132, sleeve 1134, support 1136, perforating device 1126, temperature sensor 1138, and control cable 1140.

Sleeve 1134 may be coupled to outer tubing 1128 by connector 1132. In some embodiments, outer tubing 1128 is a coiled tubing string, and connector 1132 is a threaded connection. Sleeve 1134 may be a thin walled sleeve. In some embodiments, sleeve 1134 is made of a polymer. Sleeve 1134 may have minimal thickness to maximize explosive performance of perforation device 1126, yet still be sufficiently strong to support the forces applied to the sleeve by the hydrostatic column and circulation of cooling fluid.

Inner tubing 1130 may be positioned inside of outer tubing 1128. In some embodiments, inner tubing 1130 is a coiled tubing string. Support 1136 may be coupled to inner tubing by connector 1132. In some embodiments, support 1136 is a pipe and connector 1132 is a threaded connection. Perforation device 1126 may be secured to the outside of support 1136. A number of perforation devices may be secured to the outside of the support in series. Using a number of perforation devices may allow a long length of perforations to be formed in the well on a single trip of circulated fluid cooling system 1124 into the well.

Temperature sensor 1138 and control cable 1140 may be positioned through inner tubing 1130 and support 1136. Temperature sensor 1138 may be a fiber optic cable or plurality of thermocouples that are capable of sensing temperature at various locations in circulated fluid cooling system 1124. Control cable 1140 may be coupled to perforation device 1126. A signal may be sent through control cable to detonate explosives in perforation device 1126.

Cooling fluid 1142 may flow downwards through inner tubing 1130 and support 1136 and return to the surface past perforation device 1126 in the space between the support and sleeve 1134 and in the space between the inner tubing and outer tubing 1128. Cooling fluid 1142 may be water, glycol, or any other suitable heat transfer fluid.

In some embodiments, a long length of support 1136 and sleeve 1134 may be left below perforation device 1126 as a dummy section. Temperature measurements taken by temperature sensor 1138 in the dummy section may be used to monitor the temperature rise of the leading portion of circulated fluid cooling system 1124 as the circulated fluid cooling system is introduced into the well. The dummy section may also be a temperature buffer for perforation device 1126 that inhibits rapid temperature rise in the perforation device. In other embodiments, the circulated fluid cooling system may be introduced into the well without perforation devices to determine that the temperature increase the perforation device will be exposed to will be known before the perforation device is placed in the well.

To use circulated fluid cooling system 1124, the circulated fluid cooling system is lowered into the well. Cooling fluid 1142 keeps the temperature of perforation device 1126 below temperatures that may result in the premature detonation of explosives of the perforation device. After the perforation device is positioned at the desired location in the well, circulation of cooling fluid 1142 is stopped. In some embodiments, cooling fluid 1142 is removed from circulated fluid cooling system 1124. Then, control cable 1140 may be used to detonate the explosives of perforation device 1126 to form openings in the well. Outer tubing 1128 and inner tubing 1130 may be removed from the well, and the remaining portions of sleeve 1134 and/or support 1136 may be disconnected from the outer tubing and the inner tubing.

To perforate another well, a new perforation device may be secured to the support if the support is reusable. The support may be coupled to inner tubing, and a new sleeve may be coupled to the outer tubing. The newly reformed circulated fluid cooling system 1124 may be deployed in the well to be perforated.

Heating a formation with heat sources having electrically conducting material may increase permeability in the formation and/or lower viscosity of hydrocarbons in the formation. Heat sources with electrically conducting material may allow current to flow through the formation from one heat source to another heat source. Heating using current flow or "joule heating" through the formation may heat portions of the hydrocarbon layer in a shorter amount of time relative to heating the hydrocarbon layer using conductive heating between heaters spaced apart in the formation.

In certain embodiments, subsurface formations (for example, tar sands or heavy hydrocarbon formations) include dielectric media. Dielectric media may exhibit conductivity, relative dielectric constant, and loss tangents at temperatures below 100° C. Loss of conductivity, relative dielectric constant, and dissipation factor may occur as the formation is heated to temperatures above 100° C. due to the loss of moisture contained in the interstitial spaces in the rock matrix of the formation. To prevent loss of moisture, formations may be heated at temperatures and pressures that minimize vaporization of water. In some embodiments, conductive solutions are added to the formation to help maintain the electrical properties of the formation. Heating a formation at low temperatures may require the hydrocarbon layer to be heated for long periods of time to produce permeability and/or injectivity.

In some embodiments, formations are heated using joule heating to temperatures and pressures that vaporize the water and/or conductive solutions. Material used to produce the current flow, however, may become damaged due to heat stress and/or loss of conductive solutions may limit heat transfer in the layer. In addition, when using current flow or joule heating, magnetic fields may form. Due to the presence of magnetic fields, non-ferromagnetic materials may be desired for overburden casings. Although many methods have been described for heating formations using joule heating, efficient and economic methods of heating and producing hydrocarbons using heat sources with electrically conductive material are needed.

In some embodiments, heat sources that include electrically conductive materials are positioned in a hydrocarbon layer. Portions of the hydrocarbon layer may be heated from current generated from the heat sources that flows from the heat sources and through the layer. Positioning of electrically conductive heat sources in a hydrocarbon layer at depths sufficient to minimize loss of conductive solutions may allow hydrocarbons layers to be heated at relatively high temperatures over a period of time with minimal loss of water and/or conductive solutions.

FIGS. 305-309 depict schematics of embodiments for treating a subsurface formation using heat sources having electrically conductive material. FIG. 305 depicts first conduit 1980 and second conduit 1982 positioned in wellbores 428 in hydrocarbon layer 484. In certain embodiments, first conduit 1980 and/or second conduit 1982 are conductors (for example, exposed metal or bare metal conductors). In some embodiments, conduits 1980, 1982 are oriented substantially horizontally or at an incline in the formation. In some embodiments, conduits 1980, 1982 are perpendicular to the geological structure to inhibit channels from forming in the rock matrix during heating. Conduits 1980, 1982 may be positioned in a bottom portion of hydrocarbon layer 484.

Wellbores 428 may be open wellbores. In some embodiments, the conduits extend from a portion of the wellbore. In some embodiments, vertical portions of wellbores 428 are cemented with non-conductive cement or foam cement. Wellbores 428 may include packers 1086 and/or electrical insulators 2016. In some embodiments, packers 1086 are not necessary. Electrical insulators 2016 may insulate conduits 1980, 1982 from casing 564.

In some embodiments, the portion of casing 564 adjacent to overburden 482 is made of material that inhibits ferromagnetic effects. The casing in the overburden may be made of fiberglass, polymers, and/or a non-ferromagnetic metal (for example, a high manganese steel). Inhibiting ferromagnetic effects in the portion of casing 564 adjacent to overburden 482 may reduce heat losses to the overburden and/or electrical losses in the overburden. In some embodiments, overburden casings 564 include non-metallic materials such as fiberglass, polyvinylchloride (PVC), chlorinated polyvinylchloride (CPVC), high-density polyethylene (HDPE), and/or non-ferromagnetic metals (for example, non-ferromagnetic high manganese steels). HDPEs with working temperatures in a range for use in overburden 482 include HDPEs available from Dow Chemical Co., Inc. In some embodiments, casing 564 includes carbon steel coupled on the inside and/or outside diameter of a non-ferromagnetic metal (for example, carbon steel clad with copper or aluminum) to inhibit ferromagnetic effects or inductive effects in the carbon steel. Other non-ferromagnetic metals include, but are not limited to, manganese steels with at least 15% by weight manganese, 0.7% by weight carbon, 2% by weight chromium, iron aluminum alloys with at least 18% by weight aluminum, and austenitic stainless steels such as 304 stainless steel or 316 stainless steel.

Portions or all of conduits 1980, 1982 may include electrically conductive material 1984. Electrically conductive materials include, but are not limited to, thick walled copper, heat treated copper ("hardened copper"), carbon steel clad with copper, aluminum or aluminum or copper clad with stainless steel 32. Conduits 1980, 1982 may have dimensions and characteristics that enable the conduits to be used later as injection wells and/or production wells. Conduit 1980 and/or conduit 1982 may include perforations or openings 1988 to allow fluid to flow into or out of the conduits. In some embodiments, portions of conduit 1980 and/or conduit 1982 are pre-perforated. Coverings may initially be placed over the perforations and removed later. In some embodiments, conduit 1980 and/or conduit 1982 include slotted liners. After a desired time (for example, after injectivity has been established in the layer), the coverings of the perforations may be removed or slots may be opened to open portions of conduit 1980 and/or conduit 1982 to convert the conduits to product wells and/or injection wells. In some embodiments, coverings are removed by inserting an expandable mandrel in the conduits to remove coverings and/or open slots. In some embodiments, heat is used to degrade material placed in the openings in conduit 1980 and/or conduit 1982. After degradation, fluid may flow into or out of conduit 1980 and/or conduit 1982.

Power to electrically conductive material 1984 may be supplied from one or more surface power supplies through conductors 2000, 2000'. Conductors 2000, 2000' may be cables supported on a tubular or other support member. In some embodiments, conductors 2000, 2000' are 2000 are conduits through which electricity flows to conduit 1980 or conduit 1982. Electrical connectors 2002 may be used to electrically couple conductors 2000, 2000' to conduits 1980, 1982. Conductor 2000 electrically coupled to conduit 1980 and conductors 2000' electrically coupled to conduit 1982 may be coupled to the same power supply to form an electrical circuit.

In some embodiments, a direct current power source is supplied to either first conduit 1980 or second conduit 1982. In some embodiments, time varying current is supplied to first conduit 1980 and second conduit 1982. Current flowing from conductor 2000, 2000' to conduits 1980, 1982 may be low frequency current (for example, about 50 Hz, about 60 Hz, or up to about 1000 Hz). A voltage differential between the first conduit 1980 and second conduit 1982 may range from about 100 volts to about 1200 volts, from about 200 volts to about 1000 volts, or from about 500 volts to 700 volts. In some embodiments, higher frequency current and/or higher voltage differentials may be utilized. Use of time varying current may allow longer conduits to be positioned in the formation. Use of longer conduits allows more of the formation to be heated at one time and may decrease overall operating expenses. Current flowing to first conduit 1980 may flow through hydrocarbon layer 484 to second conduit 1982, and back to the power supply. Flow of current through hydrocarbon layer 484 may cause resistance heating of the hydrocarbon layer.

During the heating process, current flow in conduits 1980, 1982 may be measured at the surface. Measuring of the current entering conduits 1980, 1982 may be used to monitor the progress of the heating process. Current between conduits 1980, 1982 may increase steadily until vaporization of water occurs at the conduits, at which time a drop in current is observed. Current flow of the system is indicated by arrows 2020. Current flow in hydrocarbon containing layer 484 between conduits 1980, 1982 heats the hydrocarbon layer between and around the conduits. Conduits 1980, 1982 may be part of a pattern of conduits in the formation that provide multiple pathways between wells so that a large portion of layer 484 may be heated. The pattern may be a regular pattern, (for example, a triangular or rectangular pattern) or an irregular pattern.

FIG. 306 depicts a schematic of an embodiment of a system for treating a subsurface formation using electrically conductive material. Conduit 2022 and ground 1990 may extend from wellbores 428 into hydrocarbon layer 484. Ground 1990 may be a rod or conduit positioned in hydrocarbon layer 484 about 10 meters, about 15 meters, or about 20 meters away from conduit 2022. In some embodiments, electrical insulators 2016 electrically isolate ground 1990 from casing 564 and/or conduit 2018 positioned in wellbore 428. If ground 1990 is a conduit, the ground may include openings 1988.

Conduit 2022 may include sections 1992, 1994 of conductive material 1984. Sections 1992, 1994 may be separated by electrically insulating material 1996. Electrically insulating material 1996 may include polymers and/or one or more ceramic isolators. Section 1992 may be electrically coupled to the power supply by conductor 2000. Section 1994 may be electrically coupled to the power supply by conductor 2000'. Electrical insulators 2016 may separate conductor 2000 from conductor 2000'. Electrically insulating material 1996 may have dimensions and insulating properties sufficient to inhibit current from section 1992 flowing across insulation material 1996 to section 1994. For example, a length of electrically insulating material may be about 30 meters, about 35 meters, about 40 meters, or greater. Using a conduit that has electrically conductive sections 1992, 1994 may allow fewer wellbores to be drilled in the formation. Conduits having electrically conductive sections ("segmented heat sources") may allow longer conduit lengths and/or closer spacing.

Current provided through conductor 2000 may flow to conductive section 1992 through hydrocarbon layer 484 to ground 1990. The electrical current may flow along ground 1990 to a section of the ground adjacent to section 1994. The current may flow through hydrocarbon layer 484 to section 1994 and through conductor 2000' back to the power circuit to complete the electrical circuit. Electrical connector 2012 may electrically couple section 1994 to conductor 2000'. Current flow is indicated by arrows 2020. Current flow through hydrocarbon layer 484 may heat the hydrocarbon layer to create fluid injectivity in the layer, mobilize hydrocarbons in the layer, and/or pyrolyze hydrocarbons in the layer. When using segmented heat sources, the amount of current required for the initial heating of the hydrocarbon layer may be at least 50% less than current required for heating using two non-segmented heat sources or two electrodes. Hydrocarbons may be produced from hydrocarbon layer 484 and/or other sections of the formation using production wells. In some embodiments, one or more portions of conduit 1980 is positioned in a shale layer and ground 1990 is be positioned in hydrocarbon layer 484. Current flow through conductors 2000, 2000' in opposite directions may allow for cancellation of at least a portion of the magnetic fields due to the current flow. Cancellation of at least a portion of the magnetic fields may inhibit induction effects in the overburden portion of conduit 1980 and the wellhead of the well.

FIG. 307 depicts an embodiment where first conduit 2022 and second conduit 2022' are used for heating hydrocarbon layer 484. Electrically insulating material 1996 may separate sections 1992, 1994 of first conduit 2022. Electrically insulating material 1996 may separate sections 1992', 1994' of second conduit 2022'.

Current may flow from a power source through conductor 2000 of first conduit 2022 to section 1992. The current may flow through hydrocarbon containing layer 484 to section 1994' of first conduit 2022. The current may return to the power source through conductor 2000' of second conduit 2022'. Similarly, current may flow through conductor 2000 of second conductor 2022' to section 1992', through hydrocarbon layer 484 to section 1994 of first conduit 2022, and the current may return to the power source through conductor 2000' of the first conduit 2022. Current flow is indicated by the arrows. Generation of current flow from electrically conductive sections of conduits 2022, 2022' may heat portions of hydrocarbon layer 484 between the conduits and create fluid injectivity in the layer, mobilize hydrocarbons in the layer, and/or pyrolyze hydrocarbons in the layer. In some embodiments, one or more portions of conduits 2022, 2022' are positioned in shale layers.

By creating opposite current flow through the wellbore, as described with reference to FIG. 306 and FIG. 307, magnetic fields in the overburden may cancel out. Cancellation of the magnetic fields in the overburden may allow ferromagnetic materials be used in overburden casings. Using ferromagnetic casings in the wellbores may be less expensive and/or easier to install than non-ferromagnetic casings (such as fiberglass casings).

In some embodiments, two or more conduits may branch from a common wellbore. FIG. 308 depicts a schematic of an embodiment of two conduits extending from one common wellbore. Extending the conduits from one common wellbore may reduce costs by forming fewer wellbores. Fewer wellbores may be drilled further apart and produce the same heating efficiencies and the same heating times as drilling two different wellbores for each conduit through the formation. Extending conduits from one common wellbore may allow longer conduit lengths and closer spacings to be used.

Conduits 1980, 1982 may extend from common portion 2004 of wellbore 428. Conduits 1980, 1982 may include electrically conductive material 1984. In some embodiments, conduits 1980, 1982 include electrically conductive sections and electrically insulating material, as described in FIGS. 307 and 308. Conduits 1980 and/or conduit 1982 may include openings 1988. Current may flow from a power source to conduit 1980 through conductor 2000. The current may pass through hydrocarbon containing layer 484 to conduit 1982. The current may pass from conduit 1982 through conductor 2000' back to the power source to complete the circuit. The flow of current as shown by the arrows through hydrocarbon layer 484 from conduits 1980, 1982 heats the hydrocarbon layer between the conduits.

In some embodiments, a subsurface formation is heated using heating systems described in FIGS. 305, 306, 307, and/or 308. Fluids in hydrocarbon layer 484 may be heated to mobilization, visbreaking, and/or pyrolyzation temperatures. Such fluids may be produced from the hydrocarbon layer and/or from other sections of the formation. As the hydrocarbon layer 484 is heated, the conductivity of the heated portion of the hydrocarbon layer will increase. As the conductivity increases, heating in those portions may be concentrated. Conductivity of hydrocarbon layers closer to the surface may increase by as much as a factor of three when the temperature of the deposit increases from 20° C. to 100° C. For deeper deposits, where the water vaporization temperature is higher due to increased fluid pressure, the increase in conductivity may be greater. Higher conductivity may increase the heating rate. As a result of heating, the viscosity of heavy hydrocarbons in the hydrocarbon layer are reduced. Reducing the viscosity may creating more injectivity in the layer and/or mobilize hydrocarbons in the layer. As a result of being able to rapidly heat the hydrocarbon layer, injectivity in the hydrocarbon layer may be completed in about two years. In some embodiments, the heating systems are used to create drainage paths between the heaters and production wells for the drive and/or mobilization process. In some embodiments, the heating systems are used to provide heat during the drive process. The amount of heat provided by the heating systems may be small compared to the heat input from the drive process (for example, the heat input from steam injection).

Once fluid injectivity has been established, a drive fluid, a pressuring fluid, and/or a solvation fluid may be injected in the heated portion of hydrocarbon layer 484. Conduit 1982 may be perforated and fluid injected through the conduit to mobilize and/or further heat hydrocarbon layer 484. Fluids may drain and/or be mobilized toward conduit 1980. Conduit 1980 may be perforated at the same time as conduit 1982 or perforated at the start of production. Formation fluids may be produced through conduit 1980 and/or other sections of the formation.

As shown in FIG. 309, conduit 1980 is positioned in layer 1986 located between hydrocarbon layers 484A and 484B. Layer 1986 may be a shale layer. Conduits 1980 may be any of the conduits described in FIGS. 305, 306, 307, and/or 308. In some embodiments, portions of conduit 1980 are positioned in hydrocarbon layers 484A or 484B and in layer 1986.

Layer 1986 may be a conductive layer, water/sand layer, or hydrocarbons layer that has different porosity than hydrocarbon layer 484A and/or hydrocarbon layer 484B. Layer 1986 may have conductivities ranging from about 0.2 to about 0.5 mho/m. Hydrocarbon layers 484A and/or 484B may have conductivities ranging from about 0.02 to about 0.05 mho/m. Conductivity ratios between layer 1986 and hydrocarbon layers 484A and/or 484B may range from about 10:1, about 20:1, or about 100:1. When layer 1986 is a shale layer, heating the layer may desiccate the shale layer and increase the permeability of the shale layer to allow fluid to flow through the shale layer. The increased permeability in the shale layer allows mobilized hydrocarbons to flow from hydrocarbon layer 484A to hydrocarbon layer 484B, allows drive fluids to be injected in hydrocarbon layer 484A, or allows steam drive processes (for example, SAGD, cyclic steam soak (CSS), sequential CSS and SAGD or steam flood, or simultaneous SAGD and CSS) to be performed in hydrocarbon layer 484A.

In some embodiments, conductive layers are selected to provide lateral continuity of conductivity within the conductive layer and to provide a substantially higher conductivity, for a given thickness, than the surrounding hydrocarbon layer. Thin conductive layers selected on this basis may substantially confine the heat generation within and around the conductive layers and allow much greater spacing between rows of electrodes. In some embodiments, layers to be heated are selected, on the basis of resistivity well logs, to provide lateral continuity of conductivity. Selection of layers to be heated is described in U.S. Pat. No. 4,926,941 to Glandt et al., which is incorporated herein by reference.

Once fluid injectivity is created, fluid may be injected in layer 1986 through an injection well and/or conduit 1980 to heat or mobilize fluids in hydrocarbon layer 484B. Fluids may be produced from hydrocarbon layer 484B and/or other sections of the formation. In some embodiments, fluid is injected in conduit 1982 to mobilize and/or heat in hydrocarbon layer 484A. Heated and/or mobilized fluids may be produced from conduit 1980 and/or other production wells located in hydrocarbon layer 484B and/or other sections of the formation.

In certain embodiments, a solvation fluid, in combination with a pressurizing fluid, is used to treat the hydrocarbon formation in addition to the in situ heat treatment process. In some embodiments, a solvation fluid, in combination with a pressurizing fluid, is used after the hydrocarbon formation has been treated using a drive process. In some embodiments, solvating fluids are foamed or made into foams to improve the efficiency of the drive process. Since an effective viscosity of the foam may be greater than the viscosity of the individual components, the use of a foaming composition may improve the sweep efficiency of drive fluids.

In some embodiments, the solvating fluid includes a foaming composition. The foaming composition may be injected simultaneously or alternately with pressurizing fluid and/or drive fluid to form foam in the heated section. Use of foaming compositions may be more advantageous than use of polymer solutions since foaming compositions are thermally stable at temperatures up to 600° C. while polymer compositions may degrade at temperatures above 150° C. Use of foaming compositions at temperatures above about 150° C. may allow more hydrocarbon fluids and/or more efficient removal of hydrocarbons from the formation as compared to use of polymer compositions.

Foaming compositions may include, but are not limited to, surfactants. In certain embodiments, the foaming composition includes a polymer, a surfactant and/or an inorganic base, water, steam, and/or brine. The inorganic base may include, but is not limited to, sodium hydroxide, potassium hydroxide, potassium carbonate, potassium bicarbonate, sodium carbonate, sodium bicarbonate, or mixtures thereof. Polymers include polymers soluble in water or brine such as ethylene oxide or propylene oxide polymers.

Surfactants include ionic surfactants and/or nonionic surfactants. Examples of ionic surfactants include alpha-olefinic sulfonates, alkyl sodium sulfonates, and/or sodium alkyl benzene sulfonates. Non-ionic surfactants include triethanolamine. Surfactants capable of forming foams include, but are not limited to, alpha-olefinic sulfonates, alkylpolyalkoxyalkylene sulfonates, aromatic sulfonates, alkyl aromatic sulfonates, alcohol ethoxy glycerol sulfonates (AEGS), or mixtures thereof. Non-limiting examples of surfactants capable of being foamed include, sodium dodecyl 3EO sulfate, sodium dodecyl (Guerbert) 3PO sulfate[63], ammonium isotridecyl(Guerbert) 4PO sulfate[63], sodium tetradecyl (Guerbert) 4PO sulfate[63], and AEGS 25-12 surfactant. Nonionic and ionic surfactants and/or methods of use and/or methods of foaming for treating a hydrocarbon formation are described in U.S. Pat. Nos. 4,643,256 to Dilgren et al.; 5,193,618 to Loh et al.; 5,046,560 to Teletzke et al.; 5,358,045 to Sevigny et al.; 6,439,308 to Wang; 7,055,602 to Shpakoff et al.; 7,137,447 to Shpakoff et al.; 7,229,950 to Shpakoff et al.; and 7,262,153 to Shpakoff et al.; and by Wellington et al, in "Surfactant-Induced Mobility Control for Carbon Dioxide Studied with Computerized Tomography," American Chemical Society Symposium Series No. 373, 1988, all of which are incorporated herein by reference.

Foam may be formed in the formation by injecting the foaming composition during or after addition of steam. Pressurizing fluid (for example, carbon dioxide, methane and/or nitrogen) may be injected in the formation before, during, or after the foaming composition is injected. A type of pressurizing fluid may be based on the surfactant used in the foaming composition. For example, carbon dioxide may be used with alcohol ethoxy glycerol sulfonates. The pressurizing fluid and foaming composition may mix in the formation and produce foam. In some embodiments, non-condensable gas is mixed with the foaming composition prior to injection to form a pre-foamed composition. The foam composition, the pressurizing fluid, and/or the pre-foamed composition may be periodically injected in the heated formation. The foaming composition, pre-foamed compositions, drive fluids, and/or pressurizing fluids may be injected at a pressure sufficient to displace the formation fluids without fracturing the reservoir.

Figure 310B:
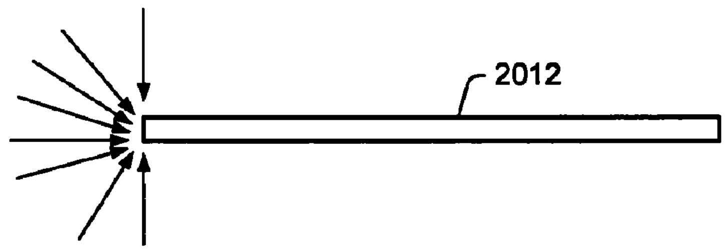
Figure 311B:
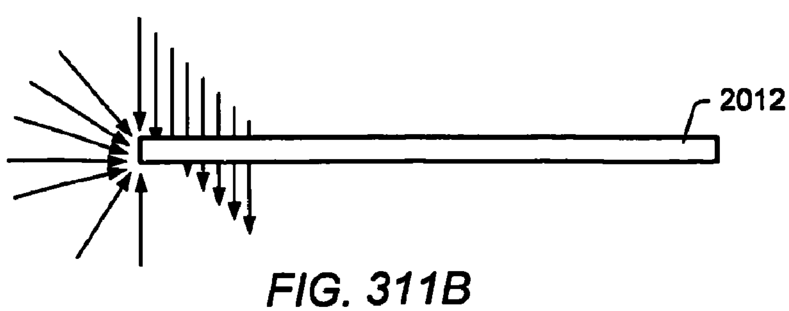

In some embodiments, electrodes may be positioned in wellbores to heat hydrocarbon layers in a subsurface formation. Electrodes may be positioned vertically in the hydrocarbon formation or oriented substantially horizontal or inclined. Heating hydrocarbon formations with electrodes is described in U.S. Pat. Nos. 4,084,537 to Todd; 4,926,941 to Glandt et al.; and 5,046,559 to Glandt, all of which are incorporate herein by reference in their entirety. Electrodes used for heating hydrocarbon formations may have bare elements at the ends of the electrodes. Heating of the hydrocarbon layers may subject the bare element ends to increased current because of the near and far field voltage fields concentrating on the ends. Coating of the electrode to form high voltage stress cones ("stress grading") around sections of the electrode or the entire electrode may enhance the performance of the electrode. FIG. 310A depicts a schematic of an embodiment of an electrode with a sleeve over a section of the electrode. FIG. 310B depicts a schematic of an embodiment of and an uncoated electrode. FIG. 311A depicts a schematic of another embodiment of a coated electrode. FIG. 311B depicts a schematic of another embodiment of an uncoated electrode. Electrode 2012 may include a coating that forms sleeve 2010 around an end (as shown in FIG. 310A) or substantially all (as shown in FIG. 311A) of the electrode. Sleeve 2010 may be formed from a positive temperature coefficient polymer and/or a heat shrinkable material. When sleeve 2010 is coated, as shown by arrows in FIGS. 310A and 311A, current flow is distributed outwardly along sleeve 2010 when electrode 2012 is energized rather than the ends or portions of the electrode, as shown in FIGS. 310B and 311B.

In some embodiments, bulk resistance along sections of the electrode may be increased by layering conductive materials and insulating layers along a section of the electrode. Examples of such electrodes are electrodes made by Raychem (Tyco International Inc., Princeton, N.J., U.S.A.). Increased bulk resistance may allow voltage along the sleeve of the electrode to be distributed, thus decreasing the current density at the end of the electrode.

Many different types of wells or wellbores may be used to treat the hydrocarbon containing formation using the in situ heat treatment process. In some embodiments, vertical and/or substantially vertical wells are used to treat the formation. In some embodiments, horizontal (such as J-shaped wells and/or L-shaped wells), and/or u-shaped wells are used to treat the formation. In some embodiments, combinations of horizontal wells, vertical wells, and/or other combinations are used to treat the formation. In certain embodiments, wells extend through the overburden of the formation to a hydrocarbon containing layer of the formation. Heat in the wells may be lost to the overburden. In certain embodiments, surface and/or overburden infrastructures used to support heaters and/or production equipment in horizontal wellbores and/or u-shaped wellbores are large in size and/or numerous.

In certain embodiments, heaters, heater power sources, production equipment, supply lines, and/or other heater or production support equipment are positioned in substantially horizontal and/or inclined tunnels. Positioning these structures in tunnels may allow smaller sized heaters and/or other equipment to be used to treat the formation. Positioning these structures in tunnels may also reduce energy costs for treating the formation, reduce emissions from the treatment process, facilitate heating system installation, and/or reduce heat loss to the overburden, as compared to conventional hydrocarbon recovery processes that utilize surface based equipment. U.S. Published Patent Application Nos. 2007-0044957 to Watson et al.; 2008-0017416 to Watson et al.; and 2008-0078552 to Donnelly et al., all of which are incorporated herein by reference, describe methods of drilling from a shaft for underground recovery of hydrocarbons and methods of underground recovery of hydrocarbons.

FIG. 312 depicts a perspective view of underground treatment system 1144. Underground treatment system 1144 may be used to treat hydrocarbon layer 484 using the in situ heat treatment process. In certain embodiments, underground treatment system 1144 includes shafts 1146, utility shafts 1148, tunnels 1150A, tunnels 1150B, and wellbores 428. Tunnels 1150A, 1150B may be located in overburden 482, an underburden, a non-hydrocarbon containing layer, or a low hydrocarbon content layer of the formation. In some embodiments, tunnels 1150A, 1150B are located in a rock layer of the formation. In some embodiments, tunnels 1150A, 1150B are located in an impermeable portion of the formation. For example, tunnels 1150A, 1150B may be located in a portion of the formation having permeability of about 1 millidarcy.

Shafts 1146 and/or utility shafts 1148 may be formed and strengthened (for example, supported to inhibit collapse) using methods known in the art. For example, shafts 1146 and/or utility shafts 1148 may be formed using blind and raised bore drilling technologies using mud weight and lining to support the shafts. Conventional techniques may be used to raise and lower equipment in the shafts and/or to provide utilities through the shafts.

Tunnels 1150A, 1150B may be formed and strengthened (for example, supported to inhibit collapse) using methods known in the art. For example, tunnels 1150A, 1150B may be formed road-headers, drill and blast, tunnel boring machine, and/or continuous miner technologies to form the tunnels. Tunnel strengthening may be provided by, for example, roof support, mesh, and/or shot-crete. Tunnel strengthening may be needed to inhibit tunnel collapse and/or to inhibit movement of the tunnels during heat treatment of the formation.

The status of tunnels 1150A, 1150B, shafts 1146, and/or utility shafts 1148 may be monitored for changes in structure or integrity of the tunnels or shafts. For example, conventional mine survey technologies may be used to continuously monitor the structure and integrity of the tunnels and/or shafts. In addition, systems may be used to monitor changes in characteristics of the formation that may affect the structure and/or integrity of the tunnels or shafts.

Tunnels 1150A, 1150B may be substantially horizontal or inclined in the formation. In certain embodiments, tunnels 1150A extend along the line of shafts 1146 and utility shafts 1148. Tunnels 1150B may connect between tunnels 1150A. In some embodiments, tunnels 1150B allow cross-access between tunnels 1150A. In some embodiments, tunnels 1150B are used to cross-connect production between tunnels 1150A below the surface of the formation.

Tunnels 1150A, 1150B may have cross-section shapes that are rectangular, circular, elliptical, or horseshoe-shaped. Tunnels 1150A, 1150B may have cross-sections large enough for personnel, equipment, and/or vehicles to pass through the tunnels. In some embodiments, tunnels 1150A, 1150B have cross-sections large enough to allow personnel and/or vehicles to freely pass by equipment located in the tunnels. In some embodiments, tunnels 1150A, 1150B have an average diameter of at least 1 m, at least 2 m, at least 5 m, or at least 10 m.

In certain embodiments, shafts 1146 and/or utility shafts 1148 connect with tunnels 1150A in overburden 482 (or another layer of the formation). Shafts 1146 and/or utility shafts 1148 may be sunk or formed using methods known in the art for drilling and/or sinking mine shafts. In certain embodiments, shafts 1146 and/or utility shafts 1148 connect surface 568 with tunnels 1150A in overburden 482 and/or hydrocarbon layer 484. In some embodiments, shafts 1146 and/or utility shafts 1148 extend into hydrocarbon layer 484. For example, shafts 1146 may include production conduits and/or other production equipment to produce fluids from hydrocarbon layer 484.

In certain embodiments, shafts 1146 and/or utility shafts 1148 are substantially vertical or slightly angled from vertical. In certain embodiments, shafts 1146 and/or utility shafts 1148 have cross-sections large enough for personnel, equipment, and/or vehicles to pass through the shafts. In some embodiments, shafts 1146 and/or utility shafts 1148 have circular cross-sections. In some embodiments, shafts 1146 and/or utility shafts 1148 have an average cross-sectional diameter of at least 0.5 m, at least 1 m, at least 2 m, at least 5 m, or at least 10 m.

In certain embodiments, the distance between two shafts 1146 is between 500 m and 5000 m, between 1000 m and 4000 m, or between 2000 m and 3000 m. In some embodiments, the distance between two utility shafts 1148 is between 100 m and 1000 m, between 250 m and 750 m, or between 400 m and 600 m.

In certain embodiments, shafts 1146 are larger in cross-section than utility shafts 1148. Shafts 1146 may allow access to tunnels 1150A for large ventilation, materials, equipment, vehicles, and personnel. Utility shafts 1148 may provide service corridor access to tunnels 1150A for equipment or structures such as, but not limited to, power supply legs, production risers, and/or ventilation openings. In some embodiments, shafts 1146 and/or utility shafts 1148 include monitoring and/or sealing systems to monitor and assess gas levels in the shafts and to seal off the shafts if needed.

FIG. 313 depicts an exploded perspective view of a portion of underground treatment system 1144 and tunnels 1150A. In certain embodiments, tunnels 1150A include heater tunnels 1152 and/or utility tunnels 1154. In some embodiments, tunnels 1150A include additional tunnels such as access tunnels and/or service tunnels. FIG. 314 depicts an exploded perspective view of a portion of underground treatment system 1144 and tunnels 1150A. Tunnels 1150A, as shown in FIG. 314, may include heater tunnels 1152, utility tunnels 1154, and/or access tunnels 1155.

In certain embodiments, as shown in FIG. 313, wellbores 428 extend from heater tunnels 1152. Wellbores 428 may include, but not be limited to, heater wells, heat source wells, production wells, injection wells (for example, steam injection wells), and/or monitoring wells. Heaters and/or heat sources that may be located in wellbores 428 include, but are not limited to, electric heaters, oxidation heaters (gas burners), heaters circulating a heat transfer fluid, closed looped molten salt circulating systems, pulverized coal systems, and/or joule heat sources (heating of the formation using electrical current flow between heat sources in two wellbores in the formation). The wellbores used for joule heat sources may extend from the same tunnel (for example, substantially parallel wellbores extending between two tunnels with electrical current flowing between the wellbores) or from different tunnels (for example, wellbores extending from two different tunnels that are spaced to allow electrical current flow between the wellbores).

Introduction of heat sources through heater tunnels 1152 allows hydrocarbon layer 484 to be heated without significant heat losses to overburden 482. Being able to provide heat mainly to hydrocarbon layer 484 with low heat losses in the overburden may enhance heater efficiency. Using tunnels to provide heaters only in the hydrocarbon layer, and not requiring heater wellbore sections in the overburden, may decrease heater costs by at least 30%, at least 50%, at least 60%, or at least 70% as compared to heater costs using heaters that have sections passing through the overburden.

Providing heaters through tunnels may allow higher heat source densities in the hydrocarbon layer 484 to be obtained. Higher heat source densities may result in faster production of hydrocarbons from the formation. Closer spacing of heaters may be economically beneficial due to a significantly lower cost per additional heater. For example, heaters located in the hydrocarbon layer by drilling through the overburden are typically spaced about 12 m apart. Installing heaters from tunnels may allow heaters to be spaced about 8 m apart in the hydrocarbon layer. The closer spacing may accelerate first production to about 2 years as compared to the 5 years for first production obtained from heaters that are spaced 12 m apart and accelerate completion of production to about 5 years from about 8 years. This acceleration in first production may reduce the heating requirement 5% or more.

In certain embodiments, subsurface connections for heaters or heat sources are made in heater tunnels 1152. Connections that are made in heater tunnels 1152 include, but are not limited to, insulated electrical connections, physical support connections, and instrumental/diagnostic connections. For example, electrical connection may be made between electric heater elements and bus bars located in heater tunnels 1152. The bus bars may be used to provide electrical connection to the ends of the heater elements. In certain embodiments, connections made in heater tunnels 1152 are made at a certain safety level. For example, the connections are made such that there is little or no explosion risk (or other potential hazards) in the heater tunnels because of gases from the heat sources or the heat source wellbores that may migrate to heater tunnels 1152. In some embodiments, heater tunnels 1152 are ventilated to the surface or another area to lower the explosion risk in the heater tunnels. For example, heater tunnels 1152 may be vented through utility shafts 1148.

In certain embodiments, heater connections are made between heater tunnels 1152 and utility tunnels 1154. For example, electrical connections from electric heaters extending heater tunnels 1152 may be made into utility tunnels 1154. These connections may be substantially sealed such that there is little or no leaking between the tunnels either through or around the connections.

Utility tunnels 1154 may include power equipment or other equipment necessary to operate heat sources and/or production equipment. In certain embodiments, transformers 1156 and voltage regulators 1158 are located in utility tunnels 1154. Having transformers 1156 and voltage regulators 1158 in the subsurface allows high-voltage to be transported directly into the overburden of the formation to increase the efficiency of providing power to heaters in the formation.

Transformers 1156 may be, for example, gas insulated, water cooled transformers such as $SF_6$ gas-insulated power transformers available from Toshiba Corporation (Tokyo, Japan). Such transformers may be high efficiency transformers. These transformers may be used to provide electricity to multiple heaters in the formation. The higher efficiency of these transformers reduces water cooling requirements for the transformers. Water cooling the transformers allows the transformers to be placed in small chambers without the need for extra cooling to keep the transformers from overheating. Water cooling instead of air cooling allows more heat per volume of cooling fluid to be transported to the surface versus air cooling. Using gas-insulated transformers eliminates the use of flammable oils that may be hazardous in the underground environment.

In some embodiments, transformers 1156 and/or voltage regulators 1158 are located in side chambers of utility tunnels 1154. Locating transformers 1156 and/or voltage regulators 1158 in side chambers moves the transformers and/or voltage regulators out of the way of personnel, equipment, and/or vehicles moving through utility tunnels 1154. Supply lines (for example, supply lines 204 depicted in FIG. 320) in utility shaft 1148 may supply power to voltage regulators 1158 and transformers 1156 in utility tunnels 1154.

In some embodiments and as shown in FIG. 313, voltage regulators are located in power chambers 1160. Power chambers 1160 may connect to utility tunnels 1154 or be side chambers of the utility tunnels. Power may be brought into power chambers 1160 through utility shafts 1148. Use of utility tunnels 1154 may allow easier, quicker, and/or more effective maintenance, repair, and/or replacement of the connections made to heat sources in the subsurface.

In certain embodiments, sections of heater tunnels 1152 and utility tunnels 1154 are interconnected by connecting tunnels 1168. Connecting tunnels 1168 may allow access between heater tunnels 1152 and utility tunnels 1154. Connecting tunnels 1168 may include airlocks or other structures to provide a seal that can be opened and closed between heater tunnels 1152 and utility tunnels 1154.

In some embodiments, heater tunnels 1152 include pipelines 208 or other conduits. In some embodiments, pipelines 208 are used to produce fluids (for example, formation fluids such as hydrocarbon fluids) from production wells or heater wells coupled to heater tunnels 1152. In some embodiments, pipelines 208 are used to provide fluids used in production wells or heater wells (for example, heat transfer fluids for circulating fluid heaters or gas for gas burners). Pumps and associated equipment 1172 for pipelines 208 may be located in pipeline chambers 1174. In some embodiment, pipeline chambers 1174 are isolated (sealed off) from heater tunnels 1154. Fluids may be provided to and/or removed from pipeline chambers 1174 using risers and/or pumps located in utility shafts 1148.

In some embodiments, heat sources are used in wellbores 428 proximate heater tunnels 1152 to control viscosity of formation fluids being produced from the formation. The heat sources may have various lengths and/or provide different amounts of heat at different locations in the formation. In some embodiments, the heat sources are located in wellbores 428 used for producing fluids from the formation (for example, production wells).

As shown in FIG. 312, wellbores 428 may extend between tunnels 1150A in hydrocarbon layer 484. Tunnels 1150A may include one or more of heater tunnels 1152, utility tunnels 1154, and/or access tunnels 1155. In some embodiments, access tunnels 1155 are used as ventilation tunnels. It should be understood that the any number of tunnels and/or any order of tunnels may be used as contemplated or desired.

In some embodiments, heated fluid may flow through wellbores 428 or heat sources 202 that extend between tunnels 1150A. For example, heated fluid may flow between a first heater tunnel and a second heater tunnel. The second tunnel may include a production system that is capable of removing the heated fluids from the formation to the surface of the formation. In some embodiments, the second tunnel includes equipment that collects heated fluids from at least two wellbores. In some embodiments, the heated fluids are moved to the surface using a lift system. The lift system may be located in utility shaft 1148 or a separate production wellbore.

FIG. 315 depicts a side view representation of an embodiment for flowing heated fluid in heat sources 202 between tunnels 1150A. FIG. 316 depicts a top view representation of the embodiment depicted in FIG. 315. Circulation system 992 may circulate heated fluid (for example, molten salt) through heat sources 202. Shafts 1148 and tunnels 1150A may be used to provide the heated fluid to the heat sources and return the heated fluid from the heat sources. Large piping may be used in shafts 1148 and tunnels 1150A. The large piping may minimize pressure drops in transporting the heated fluid through the overburden of the formation. Piping in shafts 1148 and tunnels 1150A may be insulated to inhibit heat losses in the overburden.

FIG. 317 depicts another perspective view of an embodiment of underground treatment system 1144 with wellbores 428 extending between tunnels 1150A. In certain embodiments, wellbores 428 extend from wellbore chambers 2024. Wellbore chambers 2024 may be connected to the sides of tunnels 1150A.

FIG. 318 depicts a top view of an embodiment of tunnels 1150A with wellbore chambers 2024. In certain embodiments, power chambers 1160 are connected to utility tunnel 1154. Transformers 1156 and/or other power equipment may be located in power chambers 1160.

In certain embodiments, tunnels 1150A includes heater tunnel 1152 and utility tunnel 1154. Heater tunnel 1152 may be connected to utility tunnel 1154 with connecting tunnel 1168. Wellbore chambers 2024 are connected to heater tunnel 1152. In certain embodiments, wellbore chambers 2024 include heater wellbore chambers 2024A and adjunct wellbore chambers 2024B. Heat sources 202 (for example, heaters) may extend from heater wellbore chambers 2024A. Heater wellbore chambers 2024A may have angled side walls with respect to heater tunnel 1152 to allow heat sources to be installed into the chambers more easily. The heaters may have limited bending capability and the angled walls may allow the heaters to be installed into the chambers without overbending the heaters.

In certain embodiments, barrier 2026 seals off heater wellbore chambers 2024A from heater tunnel 1152. Barrier 2026 may be a fire and/or blast resistant barrier (for example, a concrete wall). In some embodiments, barrier 2026 includes an access port (for example, an access door) to allow entry into the chambers. Heater wellbore chambers 2024A may be sealed off from heater tunnel 1152 after heat sources 202 have been installed. Utility shaft 1148 may provide ventilation into heater wellbore chambers 2024A. In some embodiments, utility shaft 1148 is used to provide a fire or blast suppression fluid into heater wellbore chambers 2024A.

In certain embodiments, adjunct wellbores 428A extend from adjunct wellbore chambers 2024B. Adjunct wellbores 428A may include wellbores used as, for example, infill wellbores (repair wellbores) or intervention wellbores for killing leaks, and/or monitoring wellbores. Barrier 2026 may seal off adjunct wellbore chambers 2024B from heater tunnel 1152. In some embodiments, heater wellbore chambers 2024A and/or adjunct wellbore chambers 2024B are cemented in (the chambers are filled with cement). Filling the chambers with cement substantially seals off the chambers from inflow or outflow of fluids.

As shown in FIGS. 312 and 317, wellbores 428 may be formed between tunnels 1150A. Wellbores 428 may be formed substantially vertically, substantially horizontally, or inclined in hydrocarbon layer 484 by drilling into the hydrocarbon layer from tunnels 1150A. Wellbores 428 may be formed using drilling techniques known in the art. For example, wellbores 428 may be formed using pneumatic drilling using coiled tubing available from Penguin Automated Systems (Naughton, Ontario, Canada).

Drilling wellbores 428 from tunnels 1150A may increase drilling efficiency and decrease drilling time and allow for longer wellbores because the wellbores do not have to be drilled through overburden 482. Tunnels 1150A may allow large surface footprint equipment to be placed in the subsurface instead of at the surface. Drilling from tunnels 1150A and subsequent placement of equipment and/or connections in the tunnels may reduce a surface footprint as compared to conventional surface drilling methods that use surface based equipment and connections.

Using shafts and tunnels in combination with in situ heat treatment of a hydrocarbon containing formation to produce hydrocarbons from the formation may be beneficial because the overburden section is eliminated from wellbore construction, heater construction, and/or drilling requirements. In some embodiments, a least a portion of the shafts and tunnels are located below aquifers in or above the hydrocarbon containing formation. Locating the shafts and tunnels below the aquifers may reduce contamination risk to the aquifers, and may simplify abandonment of the shafts and tunnels after treatment of the formation.

In certain embodiments, underground treatment system 1144 (depicted in FIGS. 312, 313, 317, 321, and 320) includes one or more seals to seal the tunnels and shafts from the formation pressure and formation fluids. For example, the underground treatment system may include one or more impermeable barriers to seal personnel workspace from the formation. In some embodiments, wellbores are sealed off with impermeable barriers to the tunnels and shafts to inhibit fluids from entering the tunnels and shafts from the wellbores. In some embodiments, the impermeable barriers include cement or other packing materials. In some embodiments, the seals include valves or valve systems, airlocks, or other sealing systems known in the art. The underground treatment system may include at least one entry/exit point to the surface for access by personnel, vehicles, and/or equipment.

FIG. 319 depicts a top view of an embodiment of development of tunnels 1150A. Heater tunnel 1152 may include heat source section 1162, connecting section 1164, and/or drilling section 1166 as the heater tunnel is being formed left to right. In heat source section 1162, wellbores 428 have been formed and heat sources have been introduced into the wellbores. In some embodiments, heat source section 1162 is considered a hazardous confined space. Heat source section 1162 may be isolated from other sections in heater tunnel 1152 and/or utility tunnel 1154 with material impermeable to hydrocarbon gases and/or hydrogen sulfide. For example, cement or another impermeable material may be used to seal off heat source section 1162 from heater tunnel 1152 and/or utility tunnel 1154. In some embodiments, impermeable material is used to seal off heat source section 1162 from the heated portion of the formation to inhibit formation fluids or other hazardous fluids from entering the heat source section. In some embodiments, at least 30 m, at least 40 m, or at least 50 m of wellbore is between the heat sources and heater tunnel 1152. In some embodiments, shaft 1146 proximate to heater tunnel 1152 is sealed (for example, filled with cement) after heating has been initiated in the hydrocarbon layer to inhibit gas or other fluids from entering the shaft.

In some embodiments, heaters controls may be located in utility tunnel 1154. In some embodiments, utility tunnel 1154 includes electrical connections, combustors, tanks, and/or pumps necessary to support heaters and/or heat transport systems. For example, transformers 1156 may be located in utility tunnel 1154.

Connecting section 1164 may be located after heat source section 1162. Connecting section 1164 may include space for performing operations necessary for installing the heat sources and/or connecting heat sources (for example, making electrical connections to the heaters). In some embodiments, connections and/or movement of equipment in connecting section 1164 is automated using robotics or other automation techniques. Drilling section 1166 may be located after connecting section 1164. Additional wellbores may be dug and/or the tunnel may be extended in drilling section 1166.

In certain embodiments, operations in heat source section 1162, connecting section 1164, and/or drilling section 1166 are independent of each other. Heat source section 1162, connecting section 1164, and/or production section 1166 may have dedicated ventilation systems and/or connections to utilities tunnel 1154. Connecting tunnels 1168 may allow access and egress to heat source section 1162, connecting section 1164, and/or drilling section 1166.

In certain embodiments, connecting tunnels 1168 include airlocks 1170 and/or other barriers. Airlocks 1170 may help regulate the relative pressures such that the pressure in heat source section 1162 is less than the air pressure in connecting section 1164, which is less than the air pressure in drilling section 1166. Air flow may move into heat source section 1162 (the most hazardous area) to reduce the probability of a flammable atmosphere in utility tunnel 1154, connecting section 1164, and/or drilling section 1166. Airlocks 1170 may include suitable gas detection and alarms to ensure transformers or other electrical equipment are de-energized in the event that an unsafe flammable limit is encountered in the utility tunnel 1154 (for example, less than one-half of the lower flammable limit). Automated controls may be used to operate airlocks 1170 and/or the other barriers. Airlocks 1170 may be operated to allow personnel controlled access and/or egress during normal operations and/or emergency situations.

In certain embodiments, heat sources located in wellbores extending from tunnels are used to heat the hydrocarbon layer. The heat from the heat sources may mobilize hydrocarbons in the hydrocarbon layer and the mobilized hydrocarbons flow towards production wells. Production wells may be positioned in the hydrocarbon layer below, adjacent, or above the heat sources to produce the mobilized fluids. In some embodiments, formation fluids may gravity drain into tunnels located in the hydrocarbon layer. Production systems may be installed in the tunnels (for example, pipeline 208 depicted in FIG. 313). The tunnel production systems may be operated from surface facilities and/or facilities in the tunnel. Piping, holding facilities, and/or production wells may be located in a production portion of the tunnels to be used to produce the fluids from the tunnels. The production portion of the tunnels may be sealed with an impervious material (for example, cement or a steel liner). The formation fluids may be pumped to the surface through a riser and/or vertical production well located in the tunnels. In some embodiments, formation fluids from multiple horizontal production wellbores drain into one vertical production well located in one tunnel. The formation fluids may be produced to the surface through the vertical production well.

In some embodiments, a production wellbore extending directly from the surface to the hydrocarbon layer is used to produce fluids from the hydrocarbon layer. FIG. 320 depicts production well 206 extending from the surface into hydrocarbon layer 484. In certain embodiments, production well 206 is substantially horizontally located in hydrocarbon layer 484. Production well 206 may, however, have any orientation desired. For example, production well 206 may be a substantially vertical production well.

In some embodiments, as shown in FIG. 320, production well 206 is drilled from the surface of the formation and heat sources 202 are drilled from tunnels 1150A in overburden 482 or another impermeable layer of the formation. Having the production well separated from the tunnels used to provide heat sources into the formation may reduce risks associated with having hot formation fluids (for example, hot hydrocarbon fluids) in the tunnels and near electrical equipment or other heater equipment. In some embodiments, the distance between the location of production wells on the surface and the location of fluid intakes, ventilation intakes, and/or other possible intakes into the tunnels below the surface is maximized to minimize the risk of fluids reentering the formation through the intakes.

In some embodiments, wellbores 428 interconnect with utility tunnels 1154 or other tunnels below the overburden of the formation. FIG. 321 depicts a side view of an embodiment of underground treatment system 1144. In some embodiments, wellbores 428 are directionally drilled to utility tunnels 1154 in hydrocarbon layer 484. Wellbores 428 may be directional drilled from the surface or from tunnels located in overburden 482. Directional drilling to intersect utility tunnel 1154 in hydrocarbon layer 484 may be easier than directional drilling to intersect another wellbore in the formation. Drilling equipment such as, but not limited to, magnetic transmission equipment, magnetic sensing equipment, acoustic transmission equipment, and acoustic sensing equipment may be located in utility tunnels 1154 and used for directional drilling of wellbores 428. The drilling equipment may be removed from utility tunnels 1154 after directional drilling is completed.

EXAMPLES

Non-restrictive examples are set forth below.

Temperature Limited Heater Experimental Data

FIGS. 322-337 depict experimental data for temperature limited heaters. FIG. 322 depicts electrical resistance (Ω) versus temperature (° C.) at various applied electrical currents for a 446 stainless steel rod with a diameter of 2.5 cm and a 410 stainless steel rod with a diameter of 2.5 cm. Both rods had a length of 1.8 m. Curves 1176-1182 depict resistance profiles as a function of temperature for the 446 stainless steel rod at 440 amps AC (curve 1176), 450 amps AC (curve 1178), 500 amps AC (curve 1180), and 10 amps DC (curve 1182). Curves 1184-1190 depict resistance profiles as a function of temperature for the 410 stainless steel rod at 400 amps AC (curve 1184), 450 amps AC (curve 1186), 500 amps AC (curve 1188), 10 amps DC (curve 1190). For both rods, the resistance gradually increased with temperature until the Curie temperature was reached. At the Curie temperature, the resistance fell sharply. Above the Curie temperature, the resistance decreased slightly with increasing temperature. Both rods show a trend of decreasing resistance with increasing AC current. Accordingly, the turndown ratio decreased with increasing current. Thus, the rods provide a reduced amount of heat near and above the Curie temperature of the rods. In contrast, the resistance gradually increased with temperature through the Curie temperature with the applied DC current.

FIG. 323 shows electrical resistance (Ω) profiles as a function of temperature (° C.) at various applied electrical currents for a copper rod contained in a conduit of Sumitomo HCM12A (a high strength 410 stainless steel). The Sumitomo conduit had a diameter of 5.1 cm, a length of 1.8 m, and a wall thickness of about 0.1 cm. Curves 1192-1202 show that at all applied currents (1192: 300 amps AC; 1194: 350 amps AC; 1196: 400 amps AC; 1198: 450 amps AC; 1200: 500 amps AC; 1202: 550 amps AC), resistance increased gradually with temperature until the Curie temperature was reached. At the Curie temperature, the resistance fell sharply. As the current increased, the resistance decreased, resulting in a smaller turndown ratio.

FIG. 324 depicts electrical resistance (Ω) versus temperature (° C.) at various applied electrical currents for a temperature limited heater. The temperature limited heater included a 4/0 MGT-1000 furnace cable inside an outer conductor of ¾" Schedule 80 Sandvik (Sweden) 4C54 (446 stainless steel) with a 0.30 cm thick copper sheath welded onto the outside of the Sandvik 4C54 and a length of 1.8 m. Curves 1204 through 1222 show resistance profiles as a function of temperature for AC applied currents ranging from 40 amps to 500 amps (1204: 40 amps; 1206: 80 amps; 1208: 120 amps; 1210: 160 amps; 1212: 250 amps; 1214: 300 amps; 1216: 350 amps; 1218: 400 amps; 1220: 450 amps; 1222: 500 amps). FIG. 325 depicts the raw data for curve 1218. FIG. 326 depicts the data for selected curves 1214, 1216, 1218, 1220, 1222, and 1224. At lower currents (below 250 amps), the resistance increased with increasing temperature up to the Curie temperature. At the Curie temperature, the resistance fell sharply. At higher currents (above 250 amps), the resistance decreased slightly with increasing temperature up to the Curie temperature. At the Curie temperature, the resistance fell sharply. Curve 1224 shows resistance for an applied DC electrical current of 10 amps. Curve 1224 shows a steady increase in resistance with increasing temperature, with little or no deviation at the Curie temperature.

FIG. 327 depicts power (watts per meter (W/m)) versus temperature (° C.) at various applied electrical currents for a temperature limited heater. The temperature limited heater included a 4/0 MGT-1000 furnace cable inside an outer conductor of ¾" Schedule 80 Sandvik (Sweden) 4C54 (446 stainless steel) with a 0.30 cm thick copper sheath welded onto the outside of the Sandvik 4C54 and a length of 1.8 m. Curves 1226-1234 depict power versus temperature for AC applied currents of 300 amps to 500 amps (1226: 300 amps; 1228: 350 amps; 1230: 400 amps; 1232: 450 amps; 1234: 500 amps). Increasing the temperature gradually decreased the power until the Curie temperature was reached. At the Curie temperature, the power decreased rapidly.

FIG. 328 depicts electrical resistance (mΩ) versus temperature (° C.) at various applied electrical currents for a temperature limited heater. The temperature limited heater included a copper rod with a diameter of 1.3 cm inside an outer conductor of 2.5 cm Schedule 80 410 stainless steel pipe with a 0.15 cm thick copper Everdur™ (DuPont Engineering, Wilmington, Del., U.S.A.) welded sheath over the 410 stainless steel pipe and a length of 1.8 m. Curves 1236-1246 show resistance profiles as a function of temperature for AC applied currents ranging from 300 amps to 550 amps (1236: 300 amps; 1238: 350 amps; 1240: 400 amps; 1242: 450 amps;

1244: 500 amps; 1246: 550 amps). For these AC applied currents, the resistance gradually increases with increasing temperature up to the Curie temperature. At the Curie temperature, the resistance falls sharply. In contrast, curve 1248 shows resistance for an applied DC electrical current of 10 amps. This resistance shows a steady increase with increasing temperature, and little or no deviation at the Curie temperature.

FIG. 329 depicts data of electrical resistance (mΩ) versus temperature (° C.) for a solid 2.54 cm diameter, 1.8 m long 410 stainless steel rod at various applied electrical currents. Curves 1250, 1252, 1254, 1256, and 1258 depict resistance profiles as a function of temperature for the 410 stainless steel rod at 40 amps AC (curve 1256), 70 amps AC (curve 1258), 140 amps AC (curve 1250), 230 amps AC (curve 1252), and 10 amps DC (curve 1254). For the applied AC currents of 140 amps and 230 amps, the resistance increased gradually with increasing temperature until the Curie temperature was reached. At the Curie temperature, the resistance fell sharply. In contrast, the resistance showed a gradual increase with temperature through the Curie temperature for the applied DC current.

FIG. 330 depicts data of electrical resistance (mΩ) versus temperature (° C.) for a composite 1.75 inch (1.9 cm) diameter, 6 foot (1.8 m) long Alloy 42-6 rod with a 0.375 inch diameter copper core (the rod has an outside diameter to copper diameter ratio of 2:1) at various applied electrical currents. Curves 1260, 1262, 1264, 1266, 1268, 1270, 1272, and 1274 depict resistance profiles as a function of temperature for the copper cored alloy 42-6 rod at 300 A AC (curve 1260), 350 A AC (curve 1262), 400 A AC (curve 1264), 450 A AC (curve 1266), 500 A AC (curve 1268), 550 A AC (curve 1270), 600 A AC (curve 1272), and 10 A DC (curve 1274). For the applied AC currents, the resistance decreased gradually with increasing temperature until the Curie temperature was reached. As the temperature approaches the Curie temperature, the resistance decreased more sharply. In contrast, the resistance showed a gradual increase with temperature for the applied DC current.

FIG. 331 depicts data of power output (watts per foot (W/ft)) versus temperature (° C.) for a composite 1.75 inch (1.9 cm) diameter, 6 foot (1.8 m) long Alloy 42-6 rod with a 0.375 inch diameter copper core (the rod has an outside diameter to copper diameter ratio of 2:1) at various applied electrical currents. Curves 1276, 1278, 1280, 1282, 1284, 1286, 1288, and 1290 depict power as a function of temperature for the copper cored alloy 42-6 rod at 300 A AC (curve 1276), 350 A AC (curve 1278), 400 A AC (curve 1280), 450 A AC (curve 1282), 500 A AC (curve 1284), 550 A AC (curve 1286), 600 A AC (curve 1288), and 10 A DC (curve 1290). For the applied AC currents, the power output decreased gradually with increasing temperature until the Curie temperature was reached. As the temperature approaches the Curie temperature, the power output decreased more sharply. In contrast, the power output showed a relatively flat profile with temperature for the applied DC current.

FIG. 332 depicts data for values of skin depth (cm) versus temperature (° C.) for a solid 2.54 cm diameter, 1.8 m long 410 stainless steel rod at various applied AC electrical currents. The skin depth was calculated using EQN. 17:

$$\delta = R_1 - R_1 \times (1 - (1/R_{AC}/R_{DC})); \quad \text{(EQN. 17)}$$

where δ is the skin depth, $R_1$ is the radius of the cylinder, $R_{AC}$ is the AC resistance, and $R_{DC}$ is the DC resistance. In FIG. 332, curves 1292-1310 show skin depth profiles as a function of temperature for applied AC electrical currents over a range of 50 amps to 500 amps (1292: 50 amps; 1294: 100 amps; 1296: 150 amps; 1298: 200 amps; 1300: 250 amps; 1302: 300 amps; 1304: 350 amps; 1306: 400 amps; 1380: 450 amps; 1310: 500 amps). For each applied AC electrical current, the skin depth gradually increased with increasing temperature up to the Curie temperature. At the Curie temperature, the skin depth increased sharply.

FIG. 333 depicts temperature (° C.) versus time (hrs) for a temperature limited heater. The temperature limited heater was a 1.83 m long heater that included a copper rod with a diameter of 1.3 cm inside a 2.5 cm Schedule XXH 410 stainless steel pipe and a 0.325 cm copper sheath. The heater was placed in an oven for heating. Alternating current was applied to the heater when the heater was in the oven. The current was increased over two hours and reached a relatively constant value of 400 amps for the remainder of the time. Temperature of the stainless steel pipe was measured at three points at 0.46 m intervals along the length of the heater. Curve 1314 depicts the temperature of the pipe at a point 0.46 m inside the oven and closest to the lead-in portion of the heater. Curve 1316 depicts the temperature of the pipe at a point 0.46 m from the end of the pipe and furthest from the lead-in portion of the heater. Curve 1318 depicts the temperature of the pipe at about a center point of the heater. The point at the center of the heater was further enclosed in a 0.3 m section of 2.5 cm thick Fiberfrax® (Unifrax Corp., Niagara Falls, N.Y., U.S.A.) insulation. The insulation was used to create a low thermal conductivity section on the heater (a section where heat transfer to the surroundings is slowed or inhibited (a "hot spot")). The temperature of the heater increased with time as shown by curves 1318, 1316, and 1314. Curves 1318, 1316, and 1314 show that the temperature of the heater increased to about the same value for all three points along the length of the heater. The resulting temperatures were substantially independent of the added Fiberfrax® insulation. Thus, the operating temperatures of the temperature limited heater were substantially the same despite the differences in thermal load (due to the insulation) at each of the three points along the length of the heater. Thus, the temperature limited heater did not exceed the selected temperature limit in the presence of a low thermal conductivity section.

FIG. 334 depicts temperature (° C.) versus log time (hrs) data for a 2.5 cm solid 410 stainless steel rod and a 2.5 cm solid 304 stainless steel rod. At a constant applied AC electrical current, the temperature of each rod increased with time. Curve 1320 shows data for a thermocouple placed on an outer surface of the 304 stainless steel rod and under a layer of insulation. Curve 1322 shows data for a thermocouple placed on an outer surface of the 304 stainless steel rod without a layer of insulation. Curve 1324 shows data for a thermocouple placed on an outer surface of the 410 stainless steel rod and under a layer of insulation. Curve 1326 shows data for a thermocouple placed on an outer surface of the 410 stainless steel rod without a layer of insulation. A comparison of the curves shows that the temperature of the 304 stainless steel rod (curves 1320 and 1322) increased more rapidly than the temperature of the 410 stainless steel rod (curves 1324 and 1326). The temperature of the 304 stainless steel rod (curves 1320 and 1322) also reached a higher value than the temperature of the 410 stainless steel rod (curves 1324 and 1326). The temperature difference between the non-insulated section of the 410 stainless steel rod (curve 1326) and the insulated section of the 410 stainless steel rod (curve 1324) was less than the temperature difference between the non-insulated section of the 304 stainless steel rod (curve 1322) and the insulated section of the 304 stainless steel rod (curve 1320). The temperature of the 304 stainless steel rod was increasing at the termination of the experiment (curves 1320 and 1322)

while the temperature of the 410 stainless steel rod had leveled out (curves 1324 and 1326). Thus, the 410 stainless steel rod (the temperature limited heater) provided better temperature control than the 304 stainless steel rod (the non-temperature limited heater) in the presence of varying thermal loads (due to the insulation).

A 6 foot temperature limited heater element was placed in a 6 foot 347H stainless steel canister. The heater element was connected to the canister in a series configuration. The heater element and canister were placed in an oven. The oven was used to raise the temperature of the heater element and the canister. At varying temperatures, a series of electrical currents were passed through the heater element and returned through the canister. The resistance of the heater element and the power factor of the heater element were determined from measurements during passing of the electrical currents.

FIG. 335 depicts experimentally measured electrical resistance (mΩ) versus temperature (° C.) at several currents for a temperature limited heater with a copper core, a carbon steel ferromagnetic conductor, and a 347H stainless steel support member. The ferromagnetic conductor was a low-carbon steel with a Curie temperature of 770° C. The ferromagnetic conductor was sandwiched between the copper core and the 347H support member. The copper core had a diameter of 0.5". The ferromagnetic conductor had an outside diameter of 0.765". The support member had an outside diameter of 1.05". The canister was a 3" Schedule 160 347H stainless steel canister.

Data 1328 depicts electrical resistance versus temperature for 300 A at 60 Hz AC applied current. Data 1330 depicts resistance versus temperature for 400 A at 60 Hz AC applied current. Data 1332 depicts resistance versus temperature for 500 A at 60 Hz AC applied current. Curve 1334 depicts resistance versus temperature for 10 A DC applied current. The resistance versus temperature data indicates that the AC resistance of the temperature limited heater linearly increased up to a temperature near the Curie temperature of the ferromagnetic conductor. Near the Curie temperature, the AC resistance decreased rapidly until the AC resistance equaled the DC resistance above the Curie temperature. The linear dependence of the AC resistance below the Curie temperature at least partially reflects the linear dependence of the AC resistance of 347H at these temperatures. Thus, the linear dependence of the AC resistance below the Curie temperature indicates that the majority of the current is flowing through the 347H support member at these temperatures.

FIG. 336 depicts experimentally measured electrical resistance (mΩ) versus temperature (° C.) data at several currents for a temperature limited heater with a copper core, an iron-cobalt ferromagnetic conductor, and a 347H stainless steel support member. The iron-cobalt ferromagnetic conductor was an iron-cobalt conductor with 6% cobalt by weight and a Curie temperature of 834° C. The ferromagnetic conductor was sandwiched between the copper core and the 347H support member. The copper core had a diameter of 0.465". The ferromagnetic conductor had an outside diameter of 0.765". The support member had an outside diameter of 1.05". The canister was a 3" Schedule 160 347H stainless steel canister.

Data 1336 depicts resistance versus temperature for 100 A at 60 Hz AC applied current. Data 1338 depicts resistance versus temperature for 400 A at 60 Hz AC applied current. Curve 1340 depicts resistance versus temperature for 10 A DC. The AC resistance of this temperature limited heater turned down at a higher temperature than the previous temperature limited heater. This was due to the added cobalt increasing the Curie temperature of the ferromagnetic conductor. The AC resistance was substantially the same as the AC resistance of a tube of 347H steel having the dimensions of the support member. This indicates that the majority of the current is flowing through the 347H support member at these temperatures. The resistance curves in FIG. 336 are generally the same shape as the resistance curves in FIG. 335.

FIG. 337 depicts experimentally measured power factor (y-axis) versus temperature (° C.) at two AC currents for the temperature limited heater with the copper core, the iron-cobalt ferromagnetic conductor, and the 347H stainless steel support member. Curve 1342 depicts power factor versus temperature for 100 A at 60 Hz AC applied current. Curve 1344 depicts power factor versus temperature for 400 A at 60 Hz AC applied current. The power factor was close to unity (1) except for the region around the Curie temperature. In the region around the Curie temperature, the non-linear magnetic properties and a larger portion of the current flowing through the ferromagnetic conductor produce inductive effects and distortion in the heater that lowers the power factor. FIG. 337 shows that the minimum value of the power factor for this heater remained above 0.85 at all temperatures in the experiment. Because only portions of the temperature limited heater used to heat a subsurface formation may be at the Curie temperature at any given point in time and the power factor for these portions does not go below 0.85 during use, the power factor for the entire temperature limited heater would remain above 0.85 (for example, above 0.9 or above 0.95) during use.

From the data in the experiments for the temperature limited heater with the copper core, the iron-cobalt ferromagnetic conductor, and the 347H stainless steel support member, the turndown ratio (y-axis) was calculated as a function of the maximum power (W/m) delivered by the temperature limited heater. The results of these calculations are depicted in FIG. 338. The curve in FIG. 338 shows that the turndown ratio (y-axis) remains above 2 for heater powers up to approximately 2000 W/m. This curve is used to determine the ability of a heater to effectively provide heat output in a sustainable manner. A temperature limited heater with the curve similar to the curve in FIG. 338 would be able to provide sufficient heat output while maintaining temperature limiting properties that inhibit the heater from overheating or malfunctioning.

A theoretical model has been used to predict the experimental results. The theoretical model is based on an analytical solution for the AC resistance of a composite conductor. The composite conductor has a thin layer of ferromagnetic material, with a relative magnetic permeability $\mu_2/\mu_0 \gg 1$, sandwiched between two non-ferromagnetic materials, whose relative magnetic permeabilities, $\mu_1/\mu_0$ and $\mu_3/\mu_0$, are close to unity and within which skin effects are negligible. An assumption in the model is that the ferromagnetic material is treated as linear. In addition, the way in which the relative magnetic permeability, $\mu_2/\mu_0$, is extracted from magnetic data for use in the model is far from rigorous.

Magnetic data was obtained for carbon steel as a ferromagnetic material. B versus H curves, and hence relative permeabilities, were obtained from the magnetic data at various temperatures up to 1100° F. and magnetic fields up to 200 Oe (oersteds). A correlation was found that fitted the data well through the maximum permeability and beyond. FIG. 339 depicts examples of relative magnetic permeability (y-axis) versus magnetic field (Oe) for both the found correlations and raw data for carbon steel. Data 1346 is raw data for carbon steel at 400° F. Data 1348 is raw data for carbon steel at 1000° F. Curve 1350 is the found correlation for carbon steel at 400° F. Curve 1352 is the found correlation for carbon steel at 1000° F.

For the dimensions and materials of the copper/carbon steel/347H heater element in the experiments above, theoretical calculations were carried out to calculate magnetic field at the outer surface of the carbon steel as a function of skin depth. Results of the theoretical calculations were presented on the same plot as skin depth versus magnetic field from the correlations applied to the magnetic data from FIG. 339. The theoretical calculations and correlations were made for four temperatures (200° F., 500° F., 800° F., and 1100° F.) and five total root-mean-square (RMS) currents (100 A, 200 A, 300 A, 400 A, and 500 A).

FIG. 340 shows the resulting plots of skin depth (in) versus magnetic field (Oe) for all four temperatures and 400 A current. Curve 1354 is the correlation from magnetic data at 200° F. Curve 1356 is the correlation from magnetic data at 500° F. Curve 1358 is the correlation from magnetic data at 800° F. Curve 1360 is the correlation from magnetic data at 1100° F. Curve 1362 is the theoretical calculation at the outer surface of the carbon steel as a function of skin depth at 200° F. Curve 1364 is the theoretical calculation at the outer surface of the carbon steel as a function of skin depth at 500° F. Curve 1366 is the theoretical calculation at the outer surface of the carbon steel as a function of skin depth at 800° F. Curve 1368 is the theoretical calculation at the outer surface of the carbon steel as a function of skin depth at 1100° F.

The skin depths obtained from the intersections of the same temperature curves in FIG. 340 were input into equations based on theory and the AC resistance per unit length was calculated. The total AC resistance of the entire heater, including that of the canister, was subsequently calculated. A comparison between the experimental and numerical (calculated) results is shown in FIG. 341 for currents of 300 A (experimental data 1370 and numerical curve 1372), 400 A (experimental data 1374 and numerical curve 1376), and 500 A (experimental data 1378 and numerical curve 1380). Though the numerical results exhibit a steeper trend than the experimental results, the theoretical model captures the close bunching of the experimental data, and the overall values are quite reasonable given the assumptions involved in the theoretical model. For example, one assumption involved the use of a permeability derived from a quasistatic B-H curve to treat a dynamic system.

One feature of the theoretical model describing the flow of alternating current in the three-part temperature limited heater is that the AC resistance does not fall off monotonically with increasing skin depth. FIG. 342 shows the AC resistance (mΩ) per foot of the heater element as a function of skin depth (in.) at 1100° F. calculated from the theoretical model. The AC resistance may be maximized by selecting the skin depth that is at the peak of the non-monotonical portion of the resistance versus skin depth profile (for example, at about 0.23" in FIG. 342).

FIG. 343 shows the power generated per unit length (W/ft) in each heater component (curve 1382 (copper core), curve 1384 (carbon steel), curve 1386 (347H outer layer), and curve 1388 (total)) versus skin depth (in.). As expected, the power dissipation in the 347H falls off while the power dissipation in the copper core increases as the skin depth increases. The maximum power dissipation in the carbon steel occurs at the skin depth of about 0.23 inches and is expected to correspond to the minimum in the power factor, as shown in FIG. 337. The current density in the carbon steel behaves like a damped wave of wavelength $\lambda=2\pi\delta$ and the effect of this wavelength on the boundary conditions at the copper/carbon steel and carbon steel/347H interface may be behind the structure in FIG. 342. For example, the local minimum in AC resistance is close to the value at which the thickness of the carbon steel layer corresponds to $\lambda/4$. Formulae may be developed that describe the shapes of the AC resistance versus temperature profiles of temperature limited heaters for use in simulating the performance of the heaters in a particular embodiment. The data in FIGS. 335 and 336 show that the resistances initially rise linearly, then drop off increasingly steeply towards the DC lines.

FIGS. 344A-C compare the results of the theoretical calculations with experimental data at 300 A (FIG. 344A), 400 A (FIG. 344B) and 500 A (FIG. 344C). FIG. 344A depicts electrical resistance (mΩ) versus temperature (° F.) at 300 A. Data 1390 is the experimental data at 300 A. Curve 1392 is the theoretical calculation at 300 A. Curve 1394 is a plot of resistance versus temperature at 10 A DC. FIG. 344B depicts electrical resistance (mΩ) versus temperature (OF) at 400 A. Data 1396 is the experimental data at 400 A. Curve 1398 is the theoretical calculation at 400 A. Curve 1400 is a plot of resistance versus temperature at 10 A DC. FIG. 344C depicts electrical resistance (mΩ) versus temperature (° F.) at 500 A. Data 1402 is the experimental data at 500 A. Curve 1404 is the theoretical calculation at 500 A. Curve 1406 is a plot of resistance versus temperature at 10 A DC.

High Voltage Insulated Conductors

Simulations (using STARS) were carried out to simulate heating a formation using the heater embodiments shown in FIGS. 75 and 77. The simulation used insulated conductor heaters with Alloy 180 cores with various diameters inside jackets with a diameter of 0.625" and magnesium oxide insulation between the cores and jackets (for example, core 542, electrical insulator 534, and jacket 540 in FIGS. 75 and 77). The various core diameters used were 0.125", 0.115", 0.1084", and 0.1016". The various core diameters produced selected amounts of heater power in the heater (using three insulated conductors in the conduit for the heater). FIG. 345 depicts a plot of heater power (W/ft) versus core diameter (in.). As shown in FIG. 345, core diameters of 0.1016" provides a heater power of about 220 W/ft; core diameters of 0.1084" provides a heater power of about 250 W/ft; core diameters of 0.115" provides a heater power of about 280 W/ft; and core diameters of 0.125" provides a heater power of about 333 W/ft.

For the simulation, the insulated conductor heaters were placed in a conduit (for example, conduit 570 in FIGS. 75 and 77) with an outside diameter of 1.75". The conduit with the insulated conductors was placed in another outside conduit (an outside tubular) that had an outside diameter of 3.5" and an inside diameter of 3.094". The entire heater assembly was placed in a 6" wellbore in the formation.

The simulation was used to simulate heating of 2000 feet of formation depth (target zone) below an overburden of 1225 feet. The voltage provided to the heaters was a constant voltage of 4160 V. The formation properties used were for a typical tar sands formation in the Peace River field in Alberta, Canada. The heater spacing was 40 feet.

FIG. 346 depicts power, resistance, and current versus temperature (OF) for a heater with core diameters of 0.105". Plot 1550 depicts power (W/ft) (left axis) versus temperature. Plot 1552 depicts current (I) in amps (right axis) versus temperature. Plot 1554 depicts resistance (R) in ohms (right axis) versus temperature. As shown in FIG. 346, heater power decreased linearly with increasing temperature with resistance and current varying slightly over the temperature range.

FIG. 347 depicts actual heater power (W/ft) versus time (days) during the simulation for three different heater designs (three power outputs based on three core diameters). Plot 1556 depicts power for a heater with a designed heater output of 220 W/ft (0.1016" core diameters). Plot 1558 depicts power for a heater with a designed heater output of 250 W/ft (0.1084" core diameters). Plot 1560 depicts power for a heater with a designed heater output of 280 W/ft (0.115" core diameters). As shown in FIG. 347, the heater power outputs decrease slightly with time but remain relatively constant over the duration of the simulation.

FIG. 348 depicts heater element temperature (core temperature) (° F.) and average formation temperature (° F.) versus time (days) for three different heater designs (three power outputs based on three core diameters). Plot 1562 depicts heater temperature for the heater with the designed heater output of 220 W/ft (0.1016" core diameters). Plot 1564 depicts heater temperature for the heater with the designed heater output of 250 W/ft (0.1084" core diameters). Plot 1566 depicts heater temperature for the heater with the designed heater output of 280 W/ft (0.115" core diameters). As shown by plots 1566, 1564, and 1562, the heater temperatures increased relatively linearly over time.

Plot 1568 depicts average formation temperature using the heater with the designed heater output of 220 W/ft (0.1016" core diameters). Plot 1570 depicts average formation temperature using the heater with the designed heater output of 250 W/ft (0.1084" core diameters). Plot 1572 depicts average formation temperature using the heater with the designed heater output of 280 W/ft (0.115" core diameters). Plot 1574 depicts the target temperature for the formation of 527° F. As shown by plots 1572, 1570, and 1568, the average formation temperatures increased relatively linearly over time. In addition, time to reach the target formation temperature decreased with the higher powered heaters. For the 220 W/ft heater, the time to reach the target formation temperature was about 1322 days. For the 250 W/ft heater, the time to reach the target formation temperature was about 1145 days. For the 280 W/ft heater, the time to reach the target formation temperature was about 1055 days. The simulation shows that heater embodiments shown in FIGS. 75 and 77 have relatively linear heating properties and may be used to heat subsurface formations to desired temperatures.

Tubular Induction Heater

Non-linear analysis was used to calculate power versus temperature curves at three values of currents for a tubular induction heater. The tubular was a 6" Schedule 80 carbon steel tubular. The tubular was used in heater similar to the heater depicted in FIG. 140. FIG. 349 depicts plots of power versus temperature at the three currents. Plot 1576 depicts power versus temperature for a current of 750 A. Plot 1578 depicts power versus temperature for a current of 1000 A. Plot 1580 depicts power versus temperature for a current of 1250 A. As shown by the plots in FIG. 349, the turndown ratio for the tubular induction heater is relatively sharp. The plots also show the effect of current on the power output for the tubular induction heater.

Insulated Conductor in Conduit with Fluid Between the Conductor and the Conduit Simulations Simulations were performed for a heater including a vertical insulated conductor in a cylindrical conduit (for example, the heater depicted in FIG. 93) with either air, solar salt, or tin between the insulated conductor and the conduit. The simulation used a vertical steady state, two dimensional axi-symmetric system with a temperature boundary condition and a constant power injection rate by the insulated conductor of 300 watts per foot. Values of the temperature boundary condition (temperature of the outside surface of the conduit) were set at 300° C., 500° C. or 700° C. Air was assumed to be an ideal gas. Some representative properties of the solar salt and the tin are given in Table 4. The software used for the simulations was ANSYS CFX 11. The turbulence model was a shear stress transport model, which is an accurate model to solve the heat transfer rate in the near wall region. Table 5 shows the heat transfer modes used for each material.

TABLE 4

| | Molten solar salt | Molten tin |
|---|---|---|
| Density (kg/m$^3$) | 1794 | 6800 |
| Dynamic viscosity (Pa s) | $2.10 \times 10^{-3}$ | 0.001 |
| Specific heat capacity (J/kg K) | 1549 | 3180 |
| Thermal conductivity (W/m K) | 0.5365 | 33.5 |
| Thermal expansivity (1/K) | $2.50 \times 10^{-4}$ | $2.00 \times 10^{-4}$ |

TABLE 5

| Material | Heat Transfer Modes |
|---|---|
| Air | Radiation, convection, and conduction |
| Solar salt | Radiation, convection, and conduction |
| Tin | Convection and conduction |

The simulations were used to examine three different insulated conduit and conduit embodiments. Table 6 shows the sizes of the insulated conductors and conduits used in the simulations.

TABLE 6

| | Case 1 | Case 2 | Case 3 |
|---|---|---|---|
| Insulated conductor: | | | |
| core radius (cm): | 0.5 | 0.25 | 0.25 |
| insulation thickness (cm) | 0.3 | 0.15 | 0.15 |
| jacket thickness (cm) | 0.1 | 0.05 | 0.05 |
| Nominal conduit size (inches) | 2 | 2 | 3.5 |

FIGS. 350-352 depict temperature profiles for case 1 heaters with the boundary condition temperature set at 500° C. The temperature axis of the three figures is different to emphasize the shape of the curves. FIG. 350 depicts temperature versus radial distance for the heater with air between the insulated conductor and the conduit. FIG. 351 depicts temperature versus radial distance for the heater with molten solar salt between the insulated conductor and the conduit. FIG. 352 depicts temperature versus radial distance for the heater with molten tin between the insulated conductor and the conduit. As shown by the shape of the curves in FIGS. 350-352, the effect of natural convection for the molten salt is much stronger than the effect of natural convection for air or molten tin. Table 7 shows calculated values of the Prandtl number (Pr), Grashof number (Gr) and Rayleigh number (Ra) for the solar salt and tin when the boundary condition was set at 500° C.

TABLE 7

| Material | Pr | Gr | Ra |
|---|---|---|---|
| Solar Salt | 6.06 | $4.33 \times 10^5$ | $2.63 \times 10^6$ |
| Tin | 0.09 | $2.98 \times 10^5$ | $2.83 \times 10^5$ |

FIG. 353 depicts simulation results for case 1 heaters with the three different materials between the insulated conductors and the conduits, and with boundary conditions of 700° C., 500° C. and 300° C. Region A is the distance from the center of the insulated conductor to the outside surface of the insulated conductor. Region B is the distance from the outside of the insulated conductor to the inside surface of the conduit. Region C is the distance from the inside surface of the conduit to the outside surface of the conduit. Curve 1582 depicts the temperature profile for air between the insulated conductor and the conduit with the boundary condition for the outer surface of the conduit set at 700° C. Curve 1584 depicts the temperature profile for molten solar salt between the insulated conductor and the conduit with the boundary condition for the outer surface of the conduit set at 700° C. Curve 1586 depicts the temperature profile for molten tin between the insulated conductor and the conduit with the boundary condition for the outer surface of the conduit set at 700° C. Curves 1588, 1590, and 1592 depict the temperature profiles for air, molten salt, and molten tin respectively with the boundary condition for the outer surface of the conduit set at 500° C. Curves 1594, 1596, and 1598 depict the temperature profiles for air, molten salt, and molten tin respectively with the boundary condition for the outer surface of the conduit set at 300° C.

Having air in the gap between the insulated conductor and the conduit results in the largest temperature difference between the insulated conductor and the conduit for a given boundary condition temperature, especially for the lower boundary condition of 300° C. For boundary condition temperatures of 500° C. and 700° C., the temperature difference between the insulated conductor and the conduit for the molten salt and air is significantly reduced because of the increase in radiative heat transfer with increasing temperature.

FIG. 354 depicts simulation results for case 2 heaters with the three different materials between the insulated conductors and the conduits, and with boundary conditions of 700° C., 500° C. and 300° C. Region A is the distance from the center of the insulated conductor to the outside surface of the insulated conductor. Region B is the distance from the outside of the insulated conductor to the inside surface of the conduit. Region C is the distance from the inside surface of the conduit to the outside surface of the conduit. Curves 1582, 1584, and 1586 depict the temperature profiles for air, molten salt, and molten tin, respectively, with the boundary condition for the outer surface of the conduit set at 700° C. Curves 1588, 1590, and 1592 depict the temperature profiles for air, molten salt, and molten tin, respectively, with the boundary condition for the outer surface of the conduit set at 500° C. Curves 1594, 1596, and 1598 depict the temperature profiles for air, molten salt, and molten tin, respectively, with the boundary condition for the outer surface of the conduit set at 300° C. As can be seen by comparing FIG. 353 with FIG. 354, decreasing the heater radius results in higher insulated conductor temperature and therefore larger temperature differences between the insulated conductor and the conduit. As seen in FIG. 353 and in FIG. 354, the temperature profile in the material between the insulated conductor and the conduit falls rapidly for the molten salt and is only slightly higher in temperature than the temperature profile established when the material is molten metal. The rapid temperature fall for the molten salt may be due to natural convection in the molten salt.

FIG. 355 depicts simulation results for case 3 heaters with the three different materials between the insulated conductors and the conduits, and with boundary conditions of 700° C., 500° C. and 300° C. Region A is the distance from the center of the insulated conductor to the outside surface of the insulated conductor. Region B is the distance from the outside of the insulated conductor to the inside surface of the conduit. Region C is the distance from the inside surface of the conduit to the outside surface of the conduit. Curves 1582, 1584, and 1586 depict the temperature profiles for air, molten salt, and molten tin, respectively, with the boundary condition for the outer surface of the conduit set at 700° C. Curves 1588, 1590, and 1592 depict the temperature profiles for air, molten salt, and molten tin, respectively, with the boundary condition for the outer surface of the conduit set at 500° C. Curves 1594, 1596, and 1598 depict the temperature profiles for air, molten salt, and molten tin, respectively, with the boundary condition for the outer surface of the conduit set at 300° C. As can be seen by comparing FIG. 354 with FIG. 355, increasing the size of the conduit results in a lower insulated conductor temperature, and a lower and more uniform temperature in Region B.

FIG. 356 depicts simulation results of temperature (° C.) versus radial distance (mm) for the three cases examined in the simulation with molten salt between the insulated conductors and the conduits, and where the boundary condition was set at 500° C. Curve 1600 depicts the results for case 1, curve 1602 depicts the results for case 2, and curve 1604 depicts the results for case 3. The lower insulated conductor temperature (for example, when r=0) for curve 1600 may result from the larger size of the insulated conductor.

The temperature of insulated conductor (for example, at r=0) is lower for curve 1604 than for curve 1602. Also, the temperature of the molten salt away from the near insulated conductor and near conduit regions is lower for curve 1604 than for curves 1600, 1602. The Rayleigh number is proportional to $x^3$, where x is the radial thickness of the fluid. For the large conduit (i.e., case 3 and curve 1604), the Rayleigh number is about 8 times that of the small conduit (i.e., case 2 and curve 1602). The larger Rayleigh number implies that natural convection for the salt in the large conduit is much stronger than the natural convection in the smaller conduit. The stronger natural convection may increase the heat transfer through the molten salt and reduce the temperature of the insulated conductor.

Tar Sands Simulation

A STARS simulation was used to simulate heating of a tar sands formation using the heater well pattern depicted in FIG. 176. The heaters had a horizontal length in the tar sands formation of 600 m. The heating rate of the heaters was about 750 W/m. Production well 206B, depicted in FIG. 176, was used at the production well in the simulation. The bottom hole pressure in the horizontal production well was maintained at about 690 kPa. The tar sands formation properties were based on Athabasca tar sands. Input properties for the tar sands formation simulation included: initial porosity equals 0.28; initial oil saturation equals 0.8; initial water saturation equals 0.2; initial gas saturation equals 0.0; initial vertical permeability equals 250 millidarcy; initial horizontal permeability equals 500 millidarcy; initial $K_v/K_h$ equals 0.5; hydrocarbon layer thickness equals 28 m; depth of hydrocarbon layer equals 587 m; initial reservoir pressure equals 3771 kPa; distance between production well and lower boundary of hydrocarbon layer equals 2.5 meter; distance of topmost heaters and overburden equals 9 meter; spacing between heaters equals 9.5 meter; initial hydrocarbon layer temperature equals 18.6° C.; viscosity at initial temperature equals 53 Pa·s (53000 cp); and gas to oil ratio (GOR) in the tar equals 50 standard cubic feet/standard barrel. The heaters were constant wattage heaters with a highest temperature of 538° C. at the sand face and a heater power of 755 W/m. The heater wells had a diameter of 15.2 cm.

FIG. 357 depicts a temperature profile in the formation after 360 days using the STARS simulation. The hottest spots are at or near heaters 438. The temperature profile shows that portions of the formation between the heaters are warmer than other portions of the formation. These warmer portions create more mobility between the heaters and create a flow path for fluids in the formation to drain downwards towards the production wells.

FIG. 358 depicts an oil saturation profile in the formation after 360 days using the STARS simulation. Oil saturation is shown on a scale of 0.00 to 1.00 with 1.00 being 100% oil saturation. The oil saturation scale is shown in the sidebar. Oil saturation, at 360 days, is somewhat lower at heaters 438 and production well 206B. FIG. 359 depicts the oil saturation profile in the formation after 1095 days using the STARS simulation. Oil saturation decreased overall in the formation with a greater decrease in oil saturation near the heaters and in between the heaters after 1095 days. FIG. 360 depicts the oil saturation profile in the formation after 1470 days using the STARS simulation. The oil saturation profile in FIG. 360 shows that the oil is mobilized and flowing towards the lower portions of the formation. FIG. 361 depicts the oil saturation profile in the formation after 1826 days using the STARS simulation. The oil saturation is low in a majority of the formation with some higher oil saturation remaining at or near the bottom of the formation in portions below production well 206B. This oil saturation profile shows that a majority of oil in the formation has been produced from the formation after 1826 days.

FIG. 362 depicts the temperature profile in the formation after 1826 days using the STARS simulation. The temperature profile shows a relatively uniform temperature profile in the formation except at heaters 438 and in the extreme (corner) portions of the formation. The temperature profile shows that a flow path has been created between the heaters and to production well 206B.

FIG. 363 depicts oil production rate 1606 (bbl/day) (left axis) and gas production rate 1608 ($ft^3$/day) (right axis) versus time (years). The oil production and gas production plots show that oil is produced at early stages (0-1.5 years) of production with little gas production. The oil produced during this time was most likely heavier mobilized oil that is unpyrolyzed. After about 1.5 years, gas production increased sharply as oil production decreased sharply. The gas production rate quickly decreased at about 2 years. Oil production then slowly increased up to a maximum production around about 3.75 years. Oil production then slowly decreased as oil in the formation was depleted.

From the STARS simulation, the ratio of energy out (produced oil and gas energy content) versus energy in (heater input into the formation) was calculated to be about 12 to 1 after about 5 years. The total recovery percentage of oil in place was calculated to be about 60% after about 5 years. Thus, producing oil from a tar sands formation using an embodiment of the heater and production well pattern depicted in FIG. 176 may produce high oil recoveries and high energy out to energy in ratios.

Tar Sands Example

A STARS simulation was used in combination with experimental analysis to simulate an in situ heat treatment process of a tar sands formation. Heating conditions for the experimental analysis were determined from reservoir simulations. The experimental analysis included heating a cell of tar sands from the formation to a selected temperature and then reducing the pressure of the cell (blow down) to 100 psig. The process was repeated for several different selected temperatures. While heating the cells, formation and fluid properties of the cells were monitored while producing fluids to maintain the pressure below an optimum pressure of 12 MPa before blow down and while producing fluids after blow down (although the pressure may have reached higher pressures in some cases, the pressure was quickly adjusted and does not affect the results of the experiments). FIGS. 364-371 depict results from the simulation and experiments.

FIG. 364 depicts weight percentage of original bitumen in place (OBIP) (left axis) and volume percentage of OBIP (right axis) versus temperature (° C.). The term "OBIP" refers, in these experiments, to the amount of bitumen that was in the laboratory vessel with 100% being the original amount of bitumen in the laboratory vessel. Plot 1610 depicts bitumen conversion (correlated to weight percentage of OBIP). Plot 1610 shows that bitumen conversion began to be significant at about 270° C. and ended at about 340° C. The bitumen conversion was relatively linear over the temperature range.

Plot 1612 depicts barrels of oil equivalent from producing fluids and production at blow down (correlated to volume percentage of OBIP). Plot 1614 depicts barrels of oil equivalent from producing fluids (correlated to volume percentage of OBIP). Plot 1616 depicts oil production from producing fluids (correlated to volume percentage of OBIP). Plot 1618 depicts barrels of oil equivalent from production at blow down (correlated to volume percentage of OBIP). Plot 1620 depicts oil production at blow down (correlated to volume percentage of OBIP). As shown in FIG. 364, the production volume began to significantly increase as bitumen conversion began at about 270° C. with a significant portion of the oil and barrels of oil equivalent (the production volume) coming from producing fluids and only some volume coming from the blow down.

FIG. 365 depicts bitumen conversion percentage (weight percentage of (OBIP)) (left axis) and oil, gas, and coke weight percentage (as a weight percentage of OBIP) (right axis) versus temperature (° C.). Plot 1622 depicts bitumen conversion (correlated to weight percentage of OBIP). Plot 1624 depicts oil production from producing fluids correlated to weight percentage of OBIP (right axis). Plot 1626 depicts coke production correlated to weight percentage of OBIP (right axis). Plot 1628 depicts gas production from producing fluids correlated to weight percentage of OBIP (right axis). Plot 1630 depicts oil production from blow down production correlated to weight percentage of OBIP (right axis). Plot 1632 depicts gas production from blow down production correlated to weight percentage of OBIP (right axis). FIG. 365 shows that coke production begins to increase at about 280° C. and maximizes around 340° C. FIG. 365 also shows that the majority of oil and gas production is from produced fluids with only a small fraction from blow down production.

FIG. 366 depicts API gravity (°) (left axis) of produced fluids, blow down production, and oil left in place along with pressure (psig) (right axis) versus temperature (° C.). Plot 1634 depicts API gravity of produced fluids versus temperature. Plot 1636 depicts API gravity of fluids produced at blow down versus temperature. Plot 1638 depicts pressure versus temperature. Plot 1640 depicts API gravity of oil (bitumen) in the formation versus temperature. FIG. 366 shows that the API gravity of the oil in the formation remains relatively constant at about 100 API and that the API gravity of produced fluids and fluids produced at blow down increases slightly at blow down.

FIGS. 367A-D depict gas-to-oil ratios (GOR) in thousand cubic feet per barrel (Mcf/bbl) (y-axis) versus temperature (° C.) (x-axis) for different types of gas at a low temperature blow down (about 277° C.) and a high temperature blow down (at about 290° C.). FIG. 367A depicts the GOR versus temperature for carbon dioxide ($CO_2$). Plot 1642 depicts the GOR for the low temperature blow down. Plot 1644 depicts the GOR for the high temperature blow down. FIG. 367B depicts the GOR versus temperature for hydrocarbons. FIG. 367C depicts the GOR for hydrogen sulfide ($H_2S$). FIG. 367D depicts the GOR for hydrogen ($H_2$). In FIGS. 367B-D, the GORs were approximately the same for both the low temperature and high temperature blow downs. The GORs for $CO_2$ (shown in FIGS. 367A-*d*) was different for the high temperature blow down and the low temperature blow down. The reason for the difference in the GORs for $CO_2$ may be that $CO_2$ was produced early (at low temperatures) by the hydrous decomposition of dolomite and other carbonate minerals and clays. At these low temperatures, there was hardly any produced oil so the GOR is very high because the denominator in the ratio is practically zero. The other gases (hydrocarbons, $H_2S$, and $H_2$) were produced concurrently with the oil either because they were all generated by the upgrading of bitumen (for example, hydrocarbons, $H_2$, and oil) or because they were generated by the decomposition of minerals (such as pyrite) in the same temperature range as that of bitumen upgrading. Thus, when the GOR was calculated, the denominator (oil) was non zero for hydrocarbons, $H_2S$, and $H_2$.

FIG. 368 depicts coke yield (weight percentage) (y-axis) versus temperature (° C.) (x-axis). Plot 1646 depicts bitumen and kerogen coke as a weight percent of original mass in the formation. Plot 1648 depicts bitumen coke as a weight percent of original bitumen in place (OBIP) in the formation. FIG. 368 shows that kerogen coke is already present at a temperature of about 260° C. (the lowest temperature cell experiment) while bitumen coke begins to form at about 280° C. and maximizes at about 340° C.

FIGS. 369A-D depict assessed hydrocarbon isomer shifts in fluids produced from the experimental cells as a function of temperature and bitumen conversion. Bitumen conversion and temperature increase from left to right in the plots in FIGS. 369A-D with the minimum bitumen conversion being 10%, the maximum bitumen conversion being 100%, the minimum temperature being 277° C., and the maximum temperature being 350° C. The arrows in FIGS. 369A-D show the direction of increasing bitumen conversion and temperature.

Figure 369A:
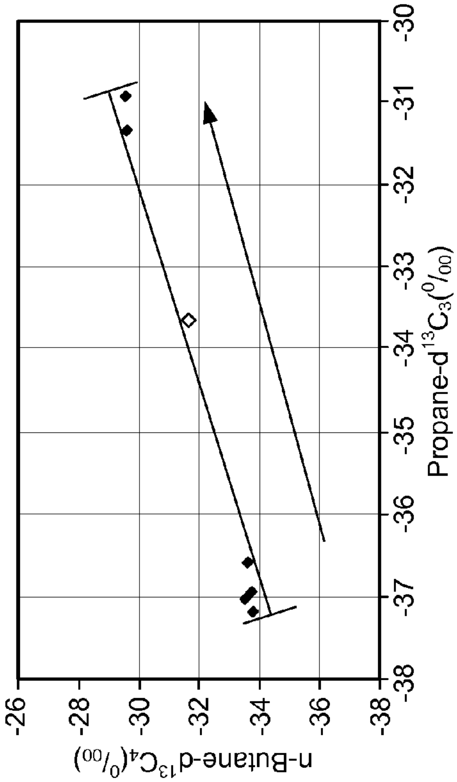
Figure 369B:
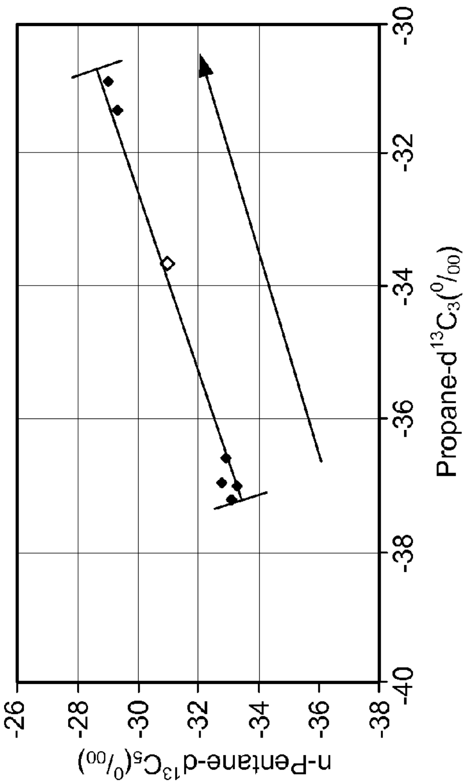
Figure 369C:
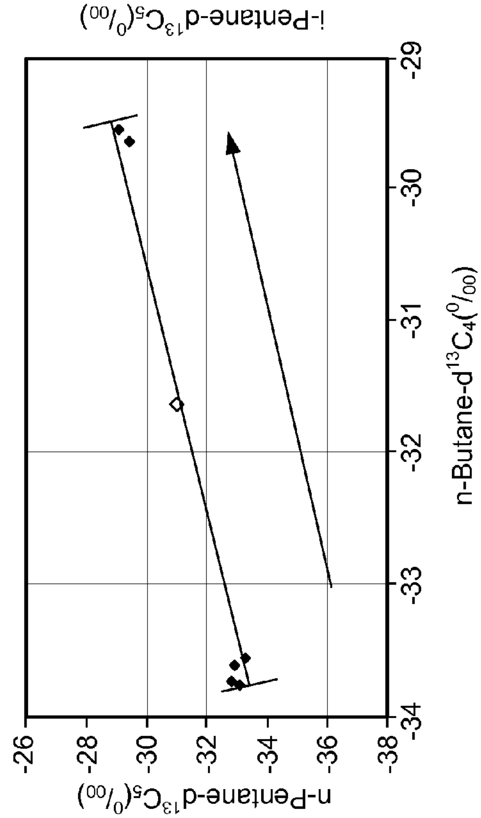
Figure 369D:
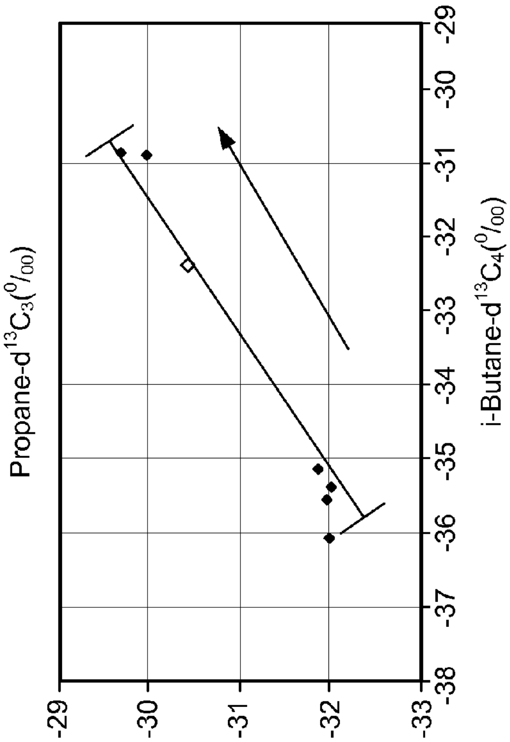

FIG. 369A depicts the hydrocarbon isomer shift of n-butane-$\delta^{13}C_4$ percentage (y-axis) versus propane-$\delta^{13}C_3$ percentage (x-axis). FIG. 369B depicts the hydrocarbon isomer shift of n-pentane-$\delta^{13}C_5$ percentage (y-axis) versus propane-$\delta^{13}C_3$ percentage (x-axis). FIG. 369C depicts the hydrocarbon isomer shift of n-pentane-$\delta^{13}C_5$ percentage (y-axis) versus n-butane-$\delta^{13}C_4$ percentage (x-axis). FIG. 369D depicts the hydrocarbon isomer shift of i-pentane-$\delta^{13}C_5$ percentage (y-axis) versus i-butane-$\delta^{13}C_4$ percentage (x-axis). FIGS. 369A-D show that there is a relatively linear relationship between the hydrocarbon isomer shifts and both temperature and bitumen conversion. The relatively linear relationship may be used to assess formation temperature and/or bitumen conversion by monitoring the hydrocarbon isomer shifts in fluids produced from the formation.

FIG. 370 depicts weight percentage (Wt %) (y-axis) of saturates from SARA analysis of the produced fluids versus temperature (° C.) (x-axis). The logarithmic relationship between the weight percentage of saturates and temperature may be used to assess formation temperature by monitoring the weight percentage of saturates in fluids produced from the formation.

FIG. 371 depicts weight percentage (Wt %) (y-axis) of n-$C_7$ of the produced fluids versus temperature (° C.) (x-axis). The linear relationship between the weight percentage of n-$C_7$ and temperature may be used to assess formation temperature by monitoring the weight percentage of n-$C_7$ in fluids produced from the formation.

Pre-Heating Using Heaters for Injectivity Before Steam Drive Example

An example uses the embodiment depicted in FIGS. 180 and 181 to preheat. Injection wells 788 and production wells 206 are substantially vertical wells. Heaters 438 are long substantially horizontal heaters positioned so that the heaters pass in the vicinity of injection wells 788. Heaters 438 intersect the vertical well patterns slightly displaced from the vertical wells.

The following conditions were assumed for purposes of this example:

(a) heater well spacing; s=330 ft;
(b) formation thickness; h=100 ft;
(c) formation heat capacity; ρc=35 BTU/cu. ft.-° F.
(d) formation thermal conductivity; λ=1.2 BTU/ft-hr-° F.;
(e) electric heating rate; $q_h$=200 watts/ft;
(f) steam injection rate; $q_s$=500 bbls/day;
(g) enthalpy of steam; $h_s$=1000 BTU/lb;
(h) time of heating; t=1 year;
(i) total electric heat injection; $Q_E$=BTU/pattern/year;
(j) radius of electric heat; r=ft; and
(k) total steam heat injected; $Q_s$=BTU/pattern/year.

Electric heating for one well pattern for one year is given by:

$$Q_E=q_h\cdot t\cdot s\text{(BTU/pattern/year)}; \quad \text{(EQN. 18)}$$

with $Q_E$=(200 watts/ft)[0.001 kw/watt](1 yr)[365 day/yr][24 hr/day][3413 BTU/kw·hr](330 ft)=1.9733×10^9 BTU/pattern/year.

Steam heating for one well pattern for one year is given by:

$$Q_s=q_s\cdot t\cdot h_s\text{(BTU/pattern/year)}; \quad \text{(EQN. 19)}$$

with $Q_s$=(500 bbls/day)(1 yr) [365 day/yr][1000 BTU/lb] [350 lbs/bbl]=63.875×10^9 BTU/pattern/year.

Thus, electric heat divided by total heat is given by:

$$Q_E/(Q_E+Q_s)\times 100=3\%\text{ of the total heat.} \quad \text{(EQN. 20)}$$

Thus, the electrical energy is only a small fraction of the total heat injected into the formation.

The actual temperature of the region around a heater is described by an exponential integral function. The integrated form of the exponential integral function shows that about half the energy injected is nearly equal to about half of the injection well temperature. The temperature required to reduce viscosity of the heavy oil is assumed to be 500° F. The volume heated to 500° F. by an electric heater in one year is given by:

$$V_E=\pi r^2. \quad \text{(EQN. 21)}$$

The heat balance is given by:

$$Q_E=(\pi r_E^2)(s)(\rho c)(\Delta T). \quad \text{(EQN. 22)}$$

Thus, $r_E$ can be solved for and is found to be 10.4 ft. For an electric heater operated at 1000° F., the diameter of a cylinder heated to half that temperature for one year would be about 23 ft. Depending on the permeability profile in the injection wells, additional horizontal wells may be stacked above the one at the bottom of the formation and/or periods of electric heating may be extended. For a ten year heating period, the diameter of the region heated above 500° F. would be about 60 ft.

If all the steam were injected uniformly into the steam injectors over the 100 ft. interval for a period of one year, the equivalent volume of formation that could be heated to 500° F. would be give by:

$$Q_s=(\pi r_s^2)(s)(\rho c)(\Delta T). \quad \text{(EQN. 23)}$$

Solving for $r_s$ gives an $r_s$ of 107 ft. This amount of heat would be sufficient to heat about ¾ of the pattern to 500° F.

Tar Sands Oil Recovery Example

A STARS simulation was used in combination with experimental analysis to simulate an in situ heat treatment process of a tar sands formation. The experiments and simulations were used to determine oil recovery (measured by volume percentage (vol %) of oil in place (bitumen in place)) versus API gravity of the produced fluid as affected by pressure in the formation. The experiments and simulations also were used to determine recovery efficiency (percentage of oil (bitumen) recovered) versus temperature at different pressures.

FIG. 372 depicts oil recovery (volume percentage bitumen in place (vol % BIP)) versus API gravity (°) as determined by the pressure (MPa) in the formation. As shown in FIG. 372, oil recovery decreases with increasing API gravity and increasing pressure up to a certain pressure (about 2.9 MPa in this experiment). Above that pressure, oil recovery and API gravity decrease with increasing pressure (up to about 10 MPa in the experiment). Thus, it may be advantageous to control the pressure in the formation below a selected value to get higher oil recovery along with a desired API gravity in the produced fluid.

FIG. 373 depicts recovery efficiency (%) versus temperature (° C.) at different pressures. Curve 1650 depicts recovery efficiency versus temperature at 0 MPa. Curve 1652 depicts recovery efficiency versus temperature at 0.7 MPa. Curve 1654 depicts recovery efficiency versus temperature at 5 MPa. Curve 1656 depicts recovery efficiency versus temperature at 10 MPa. As shown by these curves, increasing the pressure reduces the recovery efficiency in the formation at pyrolysis temperatures (temperatures above about 300° C. in the experiment). The effect of pressure may be reduced by reducing the pressure in the formation at higher temperatures, as shown by curve 1658. Curve 1658 depicts recovery efficiency versus temperature with the pressure being 5 MPa up until about 380° C., when the pressure is reduced to 0.7 MPa. As shown by curve 1658, the recovery efficiency can be increased by reducing the pressure even at higher temperatures. The effect of higher pressures on the recovery efficiency is reduced when the pressure is reduced before hydrocarbons (oil) in the formation have been converted to coke.

Molten Salt Circulation System Simulation

A simulation was run using molten salt in a circulation system to heat an oil shale formation. The well spacing was 30 ft, and the treatment area was 5000 ft of formation surrounding a substantially horizontal portion of the piping. The overburden had a thickness of 984 ft. The piping in the formation includes an inner conduit positioned in an outer conduit. Adjacent to the treatment area, the outer conduit is a 4" schedule 80 pipe, and the molten salt flows through the annular region between the outer conduit and the inner conduit. Through the overburden of the formation, the molten salt flows through the inner conduit. A first fluid switcher in the piping changes the flow from the inner conduit to the annular region before the treatment area, and a second fluid switcher in the piping changes the flow from the annular region to the inner conduit after the treatment area.

FIG. 374 depicts time to reach a target reservoir temperature of 340° C. for different mass flow rates or different inlet temperatures. Curve 2028 depicts the case for an inlet molten salt temperature of 550° C. and a mass flow rate of 6 kg/s. The time to reach the target temperature was 1405 days. Curve 2030 depicts the case for an inlet molten salt temperature of 550° C. and a mass flow rate of 12 kg/s. The time to reach the target temperature was 1185 days. Curve 2032 depicts the case for an inlet molten salt temperature of 700° C. and a mass flow rate of 12 kg/s. The time to reach the target temperature was 745 days.

FIG. 375 depicts molten salt temperature at the end of the treatment area and power injection rate versus time for the cases where the inlet molten salt temperature was 550° C. Curve 2034 depicts molten salt temperature at the end of the treatment area for the case when the mass flow rate was 6 kg/s. Curve 2036 depicts molten salt temperature at the end of the treatment area for the case when the mass flow rate was 12 kg/s. Curve 2038 depicts power injection rate into the formation (W/ft) for the case when the mass flow rate was 6 kg/s. Curve 2040 depicts power injection rate into the formation (W/ft) for the case when the mass flow rate was 12 kg/s. The circled data points indicate when heating was stopped.

FIG. 376 and FIG. 377 depicts simulation results for 8000 ft heating portions of heaters positioned in the Grossmont formation of Canada for two different mass flow rates. FIG. 376 depicts results for a mass flow rate of 18 kg/s. Curve 2042 depicts heater inlet temperature of about 540° C. Curve 2044 depicts heater outlet temperature. Curve 2046 depicts heated volume average temperature. Curve 2048 depicts power injection rate into the formation. FIG. 377 depicts results for a mass flow rate of 12 kg/s. Curve 2042 depicts heater inlet temperature of about 540° C. Curve 2050 depicts heater outlet temperature. Curve 2052 depicts heated volume average temperature. Curve 2054 depicts power injection rate into the formation.

In this patent, certain U.S. patents, U.S. patent applications, and other materials (for example, articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims. In addition, it is to be understood that features described herein independently may, in certain embodiments, be combined.

What is claimed is:

1. A heating system for a subsurface formation, comprising:

a substantially u-shaped elongated electrical conductor located in the subsurface formation, wherein the electrical conductor extends between at least a first electrical contact at a first location on the surface of the formation and a second electrical contact at a second location on the surface of the formation; and a ferromagnetic conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

wherein the electrical conductor, when energized with time-varying electrical current, induces sufficient electrical current flow in the ferromagnetic conductor such that the ferromagnetic conductor resistively heats to a temperature of at least about 300° C.

2. The system of claim 1, wherein the ferromagnetic conductor is configured to provide heat to at least a portion of the subsurface formation.

3. The system of claim 1, wherein the ferromagnetic conductor is configured to resistively heat to a temperature of at least about 500° C.

4. The system of claim 1, wherein at least about 10 m of length of the ferromagnetic conductor is configured to resistively heat to the temperature of at least about 300° C.

5. The system of claim 1, wherein the ferromagnetic conductor has a thickness of at least 2.1 times the skin depth of the ferromagnetic material in the ferromagnetic conductor at 50° C. below the Curie temperature of the ferromagnetic material.

6. The system of claim 1, wherein the ferromagnetic conductor and the electrical conductor are configured in relation to each other such that electrical current does not flow from the electrical conductor to the ferromagnetic conductor, or vice versa.

7. The system of claim 1, wherein the ferromagnetic conductor has different materials along at least a portion of the length of the ferromagnetic conductor that are configured to provide different heat outputs along at least a portion of the length of the ferromagnetic conductor.

8. The system of claim 1, wherein the ferromagnetic conductor has different dimensions along at least a portion of the length of the ferromagnetic conductor that are configured to provide different heat outputs along at least a portion of the length of the ferromagnetic conductor.

9. The system of claim 1, further comprising a corrosion resistant material coating on at least a portion of the ferromagnetic conductor.

10. The system of claim 1, wherein the ferromagnetic conductor is between about 3 cm and about 13 cm in diameter.

11. The system of claim 1, wherein at least about 10 m of length of the ferromagnetic conductor is positioned in a hydrocarbon containing layer in the subsurface formation.

12. The system of claim 1, wherein the electrical conductor is configured to flow electrical current in one direction from the first electrical contact to the second electrical contact.

13. The system of claim 1, wherein the ferromagnetic conductor comprises a ferromagnetic tubular.

14. The system of claim 1, wherein the ferromagnetic conductor comprises two or more ferromagnetic layers, the ferromagnetic layers being separated by insulation layers, wherein the electrical conductor, when energized with time-varying electrical current, induces sufficient electrical current flow in each of the ferromagnetic layers such that the ferromagnetic layers resistively heat.

15. A method for heating a subsurface formation, comprising:

providing time-varying electrical current to a substantially u-shaped elongated electrical conductor located in the subsurface formation, wherein the electrical conductor extends between at least a first electrical contact at a first location on the surface of the formation and a second electrical contact at a second location on the surface of the formation;

inducing electrical current flow in a ferromagnetic conductor with the time-varying electrical current in the electrical conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor; and resistively heating the ferromagnetic conductor with the induced electrical current flow such that the ferromagnetic conductor resistively heats to a temperature of at least about 300° C.

16. The method of claim 15, further comprising allowing heat to transfer from the ferromagnetic conductor to at least a portion of the subsurface formation.

17. The method of claim 15, further comprising resistively heating the ferromagnetic conductor to a temperature of at least about 500° C.

18. The method of claim 15, further comprising resistively heating at least about 10 m of length of the ferromagnetic conductor to the temperature of at least about 300° C.

19. The method of claim 15, wherein the ferromagnetic conductor has a thickness of at least 2.1 times the skin depth of the ferromagnetic material in the ferromagnetic conductor at 50° C. below the Curie temperature of the ferromagnetic material.

20. The method of claim 15, wherein the ferromagnetic conductor and the electrical conductor are configured in relation to each other such that electrical current does not flow from the electrical conductor to the ferromagnetic conductor, or vice versa.

21. The method of claim 15, further comprising providing different heat outputs along at least a portion of the length of the ferromagnetic conductor.

22. The method of claim 15, further comprising applying the electrical current to the electrical conductor in one direction from the first electrical contact to the second electrical contact.

23. The method of claim 15, further comprising allowing heat to transfer from the ferromagnetic conductor to at least a portion of the subsurface formation such that hydrocarbons in the formation are mobilized.

24. The method of claim 15, further comprising allowing heat to transfer from the ferromagnetic conductor to at least a portion of the subsurface formation such that hydrocarbons in the formation are mobilized, and producing at least some of the mobilized hydrocarbons from the formation.

25. The method of claim 15, further comprising resistively heating at least one additional ferromagnetic conductor located in the formation, and providing heat from the ferromagnetic conductors such that heat from at least two of the ferromagnetic conductors is superpositioned in the formation and mobilizes hydrocarbons in the formation.

26. A heating system for a subsurface formation, comprising:

a substantially u-shaped elongated electrical conductor located in the subsurface formation, wherein the electrical conductor extends between at least a first electrical contact at a first location on the surface of the formation and a second electrical contact at a second location on the surface of the formation; and a ferromagnetic conductor, wherein the ferromagnetic conductor and the electrical conductor are configured in relation to each other such that electrical current does not flow from the electrical conductor to the ferromagnetic conductor, or vice versa, and wherein the ferromagnetic conductor at least partially surrounds and at least partially extends lengthwise around the electrical conductor;

wherein the electrical conductor, when energized with time-varying electrical current, induces sufficient electrical current flow in the ferromagnetic conductor such that the ferromagnetic conductor resistively heats.

27. A method for heating a subsurface formation, comprising:

providing time-varying electrical current to a substantially u-shaped elongated electrical conductor located in the subsurface formation, wherein the electrical conductor extends between at least a first electrical contact at a first location on the surface of the formation and a second electrical contact at a second location on the surface of the formation;

inducing electrical current flow in a ferromagnetic conductor with the time-varying electrical current in the electrical conductor, wherein the ferromagnetic conductor and the electrical conductor are configured in relation to each other such that electrical current does not flow from the electrical conductor to the ferromagnetic conductor, or vice versa, and wherein the ferromagnetic conductor at least partially surrounds and at least partially extends lengthwise around the electrical conductor; and resistively heating the ferromagnetic conductor with the induced electrical current flow such that the ferromagnetic conductor resistively heats.

28. A heating system for a subsurface formation, comprising:

a substantially u-shaped elongated electrical conductor located in the subsurface formation, wherein the electrical conductor extends between at least a first electrical contact at a first location on the surface of the formation and a second electrical contact at a second location on the surface of the formation; and a ferromagnetic conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

wherein the electrical conductor, when energized with time-varying electrical current, induces electrical current flow on the inside and outside surfaces of the ferromagnetic conductor such that the ferromagnetic conductor resistively heats.

29. A method for heating a subsurface formation, comprising:

providing time-varying electrical current to a substantially u-shaped elongated electrical conductor located in the subsurface formation, wherein the electrical conductor extends between at least a first electrical contact at a first location on the surface of the formation and a second electrical contact at a second location on the surface of the formation;

inducing electrical current flow on the inside and outside surfaces of a ferromagnetic conductor with the time-varying electrical current in the electrical conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor; and resistively heating the ferromagnetic conductor with the induced electrical current flow.

30. A heating system for a subsurface formation, comprising:

a substantially u-shaped elongated electrical conductor located in the subsurface formation, wherein the electrical conductor extends between at least a first electrical contact at a first location on the surface of the formation and a second electrical contact at a second location on the surface of the formation; and a ferromagnetic conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

wherein the electrical conductor, when energized with time-varying electrical current, induces sufficient electrical current flow in the ferromagnetic conductor such that the ferromagnetic conductor resistively heats; and wherein the ferromagnetic conductor is configured to have little or no induced current flow at temperatures at and above a selected temperature.

31. A method for heating a subsurface formation, comprising:

providing time-varying electrical current to a substantially u-shaped elongated electrical conductor located in the subsurface formation, wherein the electrical conductor extends between at least a first electrical contact at a first location on the surface of the formation and a second electrical contact at a second location on the surface of the formation;

inducing electrical current flow in a ferromagnetic conductor with the time-varying electrical current in the electrical conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor; and resistively heating the ferromagnetic conductor with the induced electrical current flow, wherein the ferromagnetic conductor has little or no resistive heating at temperatures at and above a selected temperature.

32. A system for heating a hydrocarbon containing formation, comprising:

a substantially u-shaped first elongated electrical conductor located in the subsurface formation, wherein the first electrical conductor extends between at least two electrical contacts; and a first ferromagnetic conductor, wherein the first ferromagnetic conductor at least partially surrounds and at least partially extends lengthwise around the first electrical conductor in a hydrocarbon containing layer in the subsurface formation, and wherein the first ferromagnetic conductor is electrically insulated from the first electrical conductor to inhibit electrical current flow between the first ferromagnetic conductor and the first electrical conductor;

wherein the first electrical conductor, when energized with time-varying electrical current, induces sufficient electrical current flow in the first ferromagnetic conductor such that the first ferromagnetic conductor resistively heats;

a substantially u-shaped second elongated electrical conductor located in the subsurface formation, wherein the second electrical conductor extends between at least two electrical contacts; and a second ferromagnetic conductor, wherein the second ferromagnetic conductor at least partially surrounds and at least partially extends lengthwise around the second electrical conductor in a hydrocarbon containing layer in the subsurface formation, and wherein the second ferromagnetic conductor is electrically insulated from the second electrical conductor to inhibit electrical current flow between the second ferromagnetic conductor and the second electrical conductor;

wherein the second electrical conductor, when energized with time-varying electrical current, induces sufficient electrical current flow in the second ferromagnetic conductor such that the second ferromagnetic conductor resistively heats; and wherein the first and second ferromagnetic conductors are configured to provide heat to the formation such that heat from the ferromagnetic conductors is superpositioned in the formation.

33. A method for heating a hydrocarbon containing formation, comprising:

providing time-varying electrical current to a substantially u-shaped elongated electrical conductor located in the formation;

inducing electrical current flow in a ferromagnetic conductor with the time-varying electrical current in the electrical conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

resistively heating the ferromagnetic conductor with the induced electrical current flow such that the ferromagnetic conductor resistively heats;

allowing heat to transfer from the ferromagnetic conductor to at least a part of the formation; and mobilizing at least some hydrocarbons in the part of the formation.

34. A heating system for a subsurface formation, comprising:

a first wellbore extending into the subsurface formation;

a second wellbore extending into the subsurface formation; and three or more heaters extending between the first wellbore and the second wellbore, at least one heater comprising:

an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

wherein the electrical conductor, when energized with time-varying electrical current, induces sufficient electrical current flow in the ferromagnetic conductor such that the ferromagnetic conductor resistively heats to a temperature of at least about 300° C.

35. A method for heating a subsurface formation, comprising:

providing time-varying electrical current to three or more heaters extending between a first wellbore and a second wellbore, the first and second wellbores extending into the subsurface formation, wherein at least one of the heaters comprises an elongated electrical conductor and a ferromagnetic conductor at least partially surrounding and at least partially extending lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

inducing electrical current flow in the ferromagnetic conductor with the time-varying electrical current in the electrical conductor; and resistively heating the ferromagnetic conductor with the induced electrical current flow such that the ferromagnetic conductor resistively heats to a temperature of at least about 300° C.

36. A heating system for a subsurface formation, comprising:

a first wellbore extending into the subsurface formation;

a second wellbore extending into the subsurface formation;

a third wellbore extending into the subsurface formation;

a first heater located in the first wellbore, a second heater located in the second wellbore, and a third heater located in the third wellbore, at least one heater comprising:

an elongated electrical conductor located in the subsurface formation, wherein the electrical conductor extends between at least a first electrical contact and a second electrical contact; and a ferromagnetic conductor, wherein the ferromagnetic conductor at least partially surrounds and at least partially extends lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

wherein the electrical conductor, when energized with time-varying electrical current, induces sufficient electrical current flow in the ferromagnetic conductor such that the ferromagnetic conductor resistively heats to a temperature of at least about 300° C.

37. A method for heating a subsurface formation, comprising:

providing time-varying electrical current to a first heater located in a first wellbore, a second heater located in a second wellbore, and a third heater located in a third wellbore, the first, second, and third wellbores extending into the subsurface formation, wherein at least one of the heaters comprises an elongated electrical conductor and a ferromagnetic conductor at least partially surrounding and extending lengthwise around the electrical conductor in a hydrocarbon containing layer in the subsurface formation, and wherein the ferromagnetic conductor is electrically insulated from the electrical conductor to inhibit electrical current flow between the ferromagnetic conductor and the electrical conductor;

inducing electrical current flow in the ferromagnetic conductor with the time-varying electrical current in the electrical conductor; and resistively heating the ferromagnetic conductor with the induced electrical current flow such that the ferromagnetic conductor resistively heats to a temperature of at least about 300° C.

38. A heating system for a subsurface formation, comprising:

a substantially u-shaped elongated electrical conductor located in the subsurface formation, wherein the electrical conductor extends between at least a first electrical contact at a first location on the surface of the formation and a second electrical contact at a second location on the surface of the formation;

an insulation layer at least partially surrounding the electrical conductor; and a ferromagnetic sheath at least partially surrounding the insulation layer, the ferromagnetic sheath and the electrical conductor being configured in relation to each other such that electrical current does not flow from the electrical conductor to the ferromagnetic sheath, or vice versa;

wherein the electrical conductor, when energized with time-varying electrical current, induces sufficient electrical current flow in the ferromagnetic sheath such that the ferromagnetic sheath resistively heats.

39. A method for heating a subsurface formation, comprising:

providing time-varying electrical current to a substantially u-shaped elongated electrical conductor located in the subsurface formation, wherein the electrical conductor extends between at least a first electrical contact at a first location on the surface of the formation and a second electrical contact at a second location on the surface of the formation;

inducing electrical current flow in a ferromagnetic sheath with the time-varying electrical current in the electrical conductor, wherein the ferromagnetic sheath at least partially surrounds an insulation layer that at least partially surrounds the electrical conductor, the ferromagnetic sheath and the electrical conductor being configured in relation to each other such that electrical current does not flow from the electrical conductor to the ferromagnetic sheath, or vice versa; and resistively heating the ferromagnetic sheath with the induced electrical current flow such that the ferromagnetic sheath resistively heats.

40. A heating system for a subsurface formation, comprising:

a first substantially u-shaped electrical conductor located in the subsurface formation, wherein the first electrical conductor extends between at least a first electrical contact at a first location on the surface of the formation and a second electrical contact at a second location on the surface of the formation;

a first insulation layer at least partially surrounding the first electrical conductor;

a first ferromagnetic sheath at least partially surrounding the first insulation layer, the first ferromagnetic sheath and the first electrical conductor being configured in relation to each other such that electrical current does not flow from the first electrical conductor to the first ferromagnetic sheath, or vice versa;

a second substantially u-shaped electrical conductor located in the subsurface formation, wherein the first electrical conductor extends between at least the first electrical contact and the second electrical contact;

a second insulation layer at least partially surrounding the second electrical conductor;

a second ferromagnetic sheath at least partially surrounding the second insulation layer, the second ferromagnetic sheath and the second electrical conductor being configured in relation to each other such that electrical current does not flow from the second electrical conductor to the second ferromagnetic sheath, or vice versa; and a third insulation layer located between the first ferromagnetic sheath and the second ferromagnetic sheath;

wherein the first and second electrical conductors, when energized with time-varying electrical current, induce sufficient electrical current flow in the first and second ferromagnetic sheaths, respectively, such that the ferromagnetic sheaths resistively heat.

41. A method for heating a subsurface formation, comprising:

providing time-varying electrical current to a first substantially u-shaped elongated electrical conductor located in the subsurface formation, wherein the first electrical conductor extends between at least a first electrical contact at a first location on the surface of the formation and a second electrical contact at a second location on the surface of the formation;

inducing electrical current flow in a first ferromagnetic sheath with the time-varying electrical current in the first electrical conductor, wherein the first ferromagnetic sheath at least partially surrounds a first insulation layer that at least partially surrounds the first electrical conductor, the first ferromagnetic sheath and the first electrical conductor being configured in relation to each other such that electrical current does not flow from the first electrical conductor to the first ferromagnetic sheath, or vice versa;

resistively heating the first ferromagnetic sheath with the induced electrical current flow such that the first ferromagnetic sheath resistively heats;

providing time-varying electrical current to a second substantially u-shaped elongated electrical conductor located in the subsurface formation, wherein the second electrical conductor extends between at least the first electrical contact and the second electrical contact;

inducing electrical current flow in a second ferromagnetic sheath with the time-varying electrical current in the second electrical conductor, wherein the second ferromagnetic sheath at least partially surrounds a second insulation layer that at least partially surrounds the second electrical conductor, the second ferromagnetic sheath and the second electrical conductor being configured in relation to each other such that electrical current does not flow from the second electrical conductor to the second ferromagnetic sheath, or vice versa; and resistively heating the second ferromagnetic sheath with the induced electrical current flow such that the second ferromagnetic sheath resistively heats;

wherein a third insulation layer is located between the first ferromagnetic sheath and the second ferromagnetic sheath.

42. A heating system for a subsurface formation, comprising:

a substantially u-shaped electrical conductor extending into the subsurface formation, wherein the electrical conductor extends between at least a first electrical contact at a first location on the surface of the formation and a second electrical contact at a second location on the surface of the formation; and a ferromagnetic conductor at least partially surrounding the electrical conductor in at least a portion of an overburden section of the formation, wherein the ferromagnetic conductor and the electrical conductor are configured in relation to each other such that electrical current does not flow from the electrical conductor to the ferromagnetic conductor, or vice versa, and wherein the ferromagnetic conductor comprises a plurality of straight, angled, or longitudinally spiral grooves or protrusions that increase the effective circumference of the ferromagnetic conductor;

wherein the straight, angled, or longitudinally spiral grooves or protrusions are configured to inhibit or reduce induction resistance heating in the ferromagnetic conductor.

43. A method for providing current to an electrical resistance heater in a subsurface formation while inhibiting heating in an overburden section of the subsurface formation, comprising:

providing time-varying electrical current to a substantially u-shaped electrical conductor extending through the overburden section of the formation into the subsurface formation, wherein the electrical conductor extends between at least a first electrical contact at a first location on the surface of the formation and a second electrical contact at a second location on the surface of the formation; and inducing electrical current flow in a ferromagnetic conductor at least partially surrounding the electrical conductor in at least a portion of the overburden section, wherein the ferromagnetic conductor and the electrical conductor are configured in relation to each other such that electrical current does not flow from the electrical conductor to the ferromagnetic conductor, or vice versa, and wherein the ferromagnetic conductor comprises a plurality of straight, angled, or longitudinally spiral grooves or protrusions that increase the effective circumference of the ferromagnetic conductor.

44. A heating system for a subsurface formation, comprising:

a ferromagnetic conductor extending into the subsurface formation, wherein the ferromagnetic conductor is configured to resistively heat when electrical current is applied to, or induced in, the ferromagnetic conductor, and wherein the ferromagnetic conductor resistively heats to a temperature of at least about 300° C.; and a plurality of straight, angled, or spiral grooves or protrusions located on at least one surface of the ferromagnetic conductor, wherein the grooves or protrusions increase the effective resistance of the ferromagnetic conductor.

45. A method for heating a subsurface formation, comprising:

applying, or inducing, electrical current in a ferromagnetic conductor extending into the subsurface formation;

resistively heating the ferromagnetic conductor with the electrical current to a temperature of at least about 300° C., wherein the ferromagnetic conductor comprises a plurality of straight, angled, or spiral grooves or protrusions located on at least one surface of the ferromagnetic conductor that increase the effective resistance of the ferromagnetic conductor; and allowing heat to transfer from the ferromagnetic conductor to at least a part of the formation.

* * * * *